US011482675B1

(12) United States Patent
Tasaki et al.

(10) Patent No.: US 11,482,675 B1
(45) Date of Patent: Oct. 25, 2022

(54) ORGANIC ELECTROLUMINESCENCE DEVICE AND ELECTRONIC APPARATUS

(71) Applicant: IDEMITSU KOSAN CO., LTD., Tokyo (JP)

(72) Inventors: Satomi Tasaki, Sodegaura (JP); Taro Yamaki, Sodegaura (JP); Hiroaki Itoi, Sodegaura (JP); Yuki Nakano, Sodegaura (JP); Yuichiro Kawamura, Sodegaura (JP); Ryoji Maeda, Sodegaura (JP); Kazuki Nishimura, Sodegaura (JP); Yongguk Lee, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 10 days.

(21) Appl. No.: 17/340,884

(22) Filed: Jun. 7, 2021

Related U.S. Application Data

(63) Continuation of application No. 17/285,753, filed as application No. PCT/JP2019/040711 on Oct. 16, 2019.

(30) Foreign Application Priority Data

Oct. 16, 2018 (JP) ............................ JP2018-194951
Sep. 13, 2019 (JP) ............................ JP2019-167062

(51) Int. Cl.

*H01L 51/00* (2006.01)
*H01L 51/50* (2006.01)
*C09K 11/06* (2006.01)
*H01L 51/52* (2006.01)

(52) U.S. Cl.

CPC .......... *H01L 51/0058* (2013.01); *C09K 11/06* (2013.01); *H01L 51/006* (2013.01);
(Continued)

(58) Field of Classification Search

CPC ............ H01L 51/0052; H01L 51/0058; H01L 51/006; H01L 51/0061; H01L 51/0067;
(Continued)

(56) References Cited

U.S. PATENT DOCUMENTS 10,727,430 B2 * 7/2020 Kim .................... H01L 51/0061
2011/0037057 A1 * 2/2011 LeCloux ............. C07D 307/87 257/40
(Continued)

FOREIGN PATENT DOCUMENTS

JP 2009-231801 A 10/2009
JP 2010-161060 A 7/2010
(Continued)

OTHER PUBLICATIONS

Computer-generated English-language translation of WO-2010071362-A2.*
(Continued)

*Primary Examiner* — Vu A Nguyen
(74) *Attorney, Agent, or Firm* — Foley & Lardner LLP

(57) ABSTRACT

An organic electroluminescence device comprising: an anode, a cathode, and an emitting region between the anode and the cathode, wherein the emitting region comprises a first emitting layer and a second emitting layer, the first emitting layer and the second emitting layer are directly adjacent to each other, the first emitting layer is between the anode and the second emitting layer, and one of the first emitting layer and the second emitting layer comprises a compound having at least one deuterium atom.

25 Claims, 1 Drawing Sheet

(52) U.S. Cl.
CPC ...... *H01L 51/0052* (2013.01); *H01L 51/0061* (2013.01); *H01L 51/0067* (2013.01); *H01L 51/0072* (2013.01); *H01L 51/0073* (2013.01); *C09K 2211/1007* (2013.01); *C09K 2211/1011* (2013.01); *C09K 2211/1018* (2013.01); *H01L 51/0054* (2013.01); *H01L 51/0055* (2013.01); *H01L 51/0056* (2013.01); *H01L 51/0059* (2013.01); *H01L 51/504* (2013.01); *H01L 51/5278* (2013.01); *H01L 2251/5384* (2013.01)

(58) Field of Classification Search
CPC ............ H01L 51/0072; H01L 51/0073; H01L 51/0054; H01L 51/0055; H01L 51/0056; H01L 51/0059; H01L 51/504; H01L 51/5278; H01L 51/5384; C09K 11/06; C09K 2211/1007; C09K 2211/1011; C09K 2211/1018
See application file for complete search history.

(56) References Cited

U.S. PATENT DOCUMENTS

| | | | |
|---|---|---|---|
| 2017/0338432 | A1 | 11/2017 | Adamovich et al. |
| 2019/0305227 | A1 | 10/2019 | Yoon et al. |

FOREIGN PATENT DOCUMENTS

| | | | | |
|---|---|---|---|---|
| JP | 2010-161356 | A | 7/2010 | |
| JP | 2011-241383 | A | 12/2011 | |
| JP | 2013-502743 | A | 1/2013 | |
| JP | 2013-503860 | A | 2/2013 | |
| JP | 2014-509067 | A | 4/2014 | |
| KR | 10-2017-0047653 | A | 5/2017 | |
| WO | WO-2010/071362 | A2 | 6/2010 | |
| WO | WO-2010071362 | A2 * | 6/2010 | ............ C07C 15/28 |
| WO | WO-2010/099534 | A2 | 9/2010 | |
| WO | WO-2010/135395 | A2 | 11/2010 | |
| WO | WO-2011/028216 | A1 | 3/2011 | |

OTHER PUBLICATIONS

International Preliminary Report on Patentability and Written Opinion dated Apr. 29, 2021 for corresponding International Patent Application No. PCT/JP2019/040711.
International Search Report dated Nov. 19, 2019 for corresponding International Patent Application No. PCT/JP2019/040711.

* cited by examiner

ORGANIC ELECTROLUMINESCENCE DEVICE AND ELECTRONIC APPARATUS

CROSS-REFERENCE TO RELATED APPLICATIONS

The present application is a continuation of U.S. patent application Ser. No. 17/285,753, filed on Apr. 15, 2021, which claims priority under 37 U.S.C. § 371 to International Patent Application No. PCT/JP2019/040711, filed Oct. 16,2019, which claims priority to and the benefit of Japanese Patent Application Nos. 2018-194951, filed on Oct. 16,2018, and 2019-167062, filed on Sep. 13,2019. The contents of these applications are hereby incorporated by reference in their entireties.

TECHNICAL FIELD

The invention relates to an organic electroluminescence device and an electronic apparatus.

BACKGROUND ART

When voltage is applied to an organic electroluminescence device (hereinafter, referred to as an organic EL device), holes and electrons are injected into an emitting layer from an anode and a cathode, respectively. Then, thus injected holes and electrons are recombined in the emitting layer, and excitons are formed therein.

The organic EL device includes the emitting layer between the anode and the cathode. Further, the organic EL device has a stacked structure including an organic layer such as a hole-injecting layer, a hole-transporting layer, an electron-injecting layer, and an electron-transporting layer in several cases.

Patent Documents 1 to 4 disclose deuterated aryl-anthracene compounds useful for electronic applications, and electronic devices in which the active layer contains such deuterated compound.

RELATED ART DOCUMENTS

Patent Documents

[Patent Document 1] WO 2010/099534 A1
[Patent Document 2] WO 2010/135395 A1
[Patent Document 3] WO 2011/028216 A1
[Patent Document 4] WO 2010/071362 A1

SUMMARY OF THE INVENTION

It is an object of the invention to provide a long-lifetime organic electroluminescence device and electronic apparatus using a deuterated compound.

According to an aspect of the invention, the following organic electroluminescence device is provided.

An organic electroluminescence device comprising:

an anode, a cathode, and an emitting region between the anode and the cathode, wherein the emitting region comprises a first emitting layer and a second emitting layer, the first emitting layer and the second emitting layer are directly adjacent to each other, the first emitting layer is between the anode and the second emitting layer, and one of the first emitting layer and the second emitting layer comprises a compound having at least one deuterium atom.

According to another aspect of the invention, an electronic apparatus equipped with the organic electroluminescence device is provided.

According to the invention, a long-lifetime organic electroluminescence device and electronic apparatus can be provided by using deuterated compounds.

MODE FOR CARRYING OUT THE INVENTION

Definition

Figure 1:
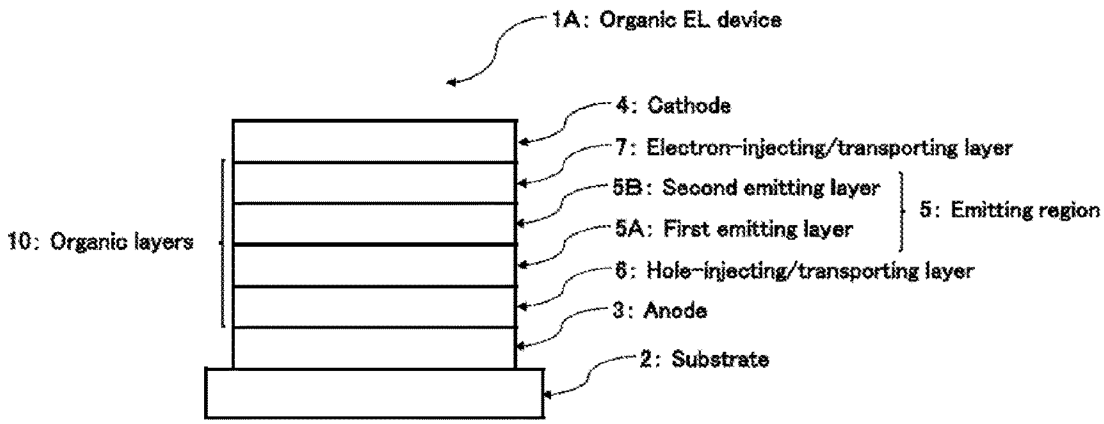
FIG. 1 shows a schematic configuration of an organic EL device according to a first aspect of the invention.

In this specification, a hydrogen atom means an atom including isotopes different in the number of neutrons, namely, a protium, a deuterium and a tritium.

In this specification, to a bondable position in which a symbol such as "R", or "D" representing a deuterium atom is not specified in a chemical formula, a hydrogen atom, that is, a protium atom, a deuterium atom, or a tritium atom is bonded thereto.

In this specification, a term "ring carbon atoms" represents the number of carbon atoms among atoms forming a subject ring itself of a compound having a structure in which atoms are bonded in a ring form (for example, a monocyclic compound, a fused ring compound, a cross-linked compound, a carbocyclic compound or a heterocyclic compound). When the subject ring is substituted by a substituent, the carbon contained in the substituent is not included in the number of ring carbon atoms. The same shall apply to the "ring carbon atoms" described below, unless otherwise noted. For example, a benzene ring has 6 ring carbon atoms, a naphthalene ring has 10 ring carbon atoms, a pyridine ring has 5 ring carbon atoms, and a furan ring has 4 ring carbon atoms. Further, for example, a 9,9-diphenylfluorenyl group has 13 ring carbon atoms, and a 9,9'-spirobifluorenyl group has 25 ring carbon atoms.

Further, when the benzene ring or the naphthalene ring is substituted by an alkyl group as a substituent, for example, the number of carbon atoms of the alkyl group is not included in the ring carbon atoms.

In this specification, a term "ring atoms" represents the number of atoms forming a subject ring itself of a compound having a structure in which atoms are bonded in a ring form (for example, a monocycle, a fused ring and a ring assembly) (for example, a monocyclic compound, a fused ring compound, a cross-linked compound, a carbocyclic compound or a heterocyclic compound). The term "ring atoms" does not include atoms which do not form the ring (for example, a hydrogen atom which terminates a bond of the atoms forming the ring) or atoms contained in a substituent when the ring is substituted by the substituent. The same shall apply to the "ring atoms" described below, unless otherwise noted. For example, a pyridine ring has 6 ring atoms, a quinazoline ring has 10 ring atoms, and a for an ring has 5 ring atoms. A hydrogen atom bonded with a carbon atom of the pyridine ring or the quinazoline ring or an atom forming the substituent is not included in the number of the ring atoms.

In this specification, a term "XX to YY carbon atoms" in an expression of "substituted or unsubstituted ZZ group including XX to YY carbon atoms" represents the number of carbon atoms when the ZZ group is unsubstituted. The number of carbon atoms of a substituent when the ZZ group is substituted is not included. Here, "YY" is larger than "XX", and "XX" and "YY" each mean an integer of 1 or more.

In this specification, a term "XX to YY atoms" in an expression of "substituted or unsubstituted ZZ group including XX to YY atoms" represents the number of atoms when the ZZ group is unsubstituted. The number of atoms of a substituent when the group is substituted is not included. Here, "YY" is larger than "XX", and "XX" and "YY" each mean an integer of 1 or more.

A term "unsubstituted" in the case of "substituted or unsubstituted ZZ group" means that the ZZ group is not substituted by a substituent, and a hydrogen atom is bonded therewith. Alternatively, a term "substituted" in the case of "substituted or unsubstituted ZZ group" means that one or more hydrogen atoms in the ZZ group are substituted by a substituent. Similarly, a term "substituted" in the case of "BB group substituted by an AA group" means that one or more hydrogen atoms in the BB group are substituted by the AA group.

Hereinafter, the substituent described herein will be described.

The number of the ring carbon atoms of the "unsubstituted aryl group" described herein is 6 to 50, preferably 6 to 30, and more preferably 6 to 18, unless otherwise specified.

The number of the ring carbon atoms of the "unsubstituted heterocyclic group" described herein is 5 to 50, preferably 5 to 30, and more preferably 5 to 18, unless otherwise specified.

The number of the carbon atoms of the "unsubstituted alkyl group" described herein is 1 to 50, preferably 1 to 20, and more preferably 1 to 6, unless otherwise specified.

The number of the carbon atoms of the "unsubstituted alkenyl group" described herein is 2 to 50, preferably 2 to 20, and more preferably 2 to 6, unless otherwise specified.

The number of the carbon atoms of the "unsubstituted alkynyl group" described herein is 2 to 50, preferably 2 to 20, and more preferably 2 to 6, unless otherwise specified.

The number of the ring carbon atoms of the "unsubstituted cycloalkyl group" described herein is 3 to 50, preferably 3 to 20, and more preferably 3 to 6, unless otherwise specified.

The number of the ring carbon atoms of the "unsubstituted arylene group" described herein is 6 to 50, preferably 6 to 30, and more preferably 6 to 18, unless otherwise specified.

The number of the ring atoms of the "unsubstituted divalent heterocyclic group" described herein is 5 to 50, preferably 5 to 30, and more preferably 5 to 18, unless otherwise specified.

The number of the carbon atoms of the "unsubstituted alkylene group" described herein is 1 to 50, preferably 1 to 20, and more preferably 1 to 6, unless otherwise specified.

Specific examples (specific example group G1) of the "substituted or unsubstituted aryl group" described herein include an unsubstituted aryl group and a substituted aryl group described below. (Here, a term "unsubstituted aryl group" refers to a case where the "substituted or unsubstituted aryl group" is the "unsubstituted aryl group," and a term "substituted aryl group" refers to a case where the "substituted or unsubstituted aryl group" is the "substituted aryl group". Hereinafter, a case of merely "aryl group" includes both the "unsubstituted aryl group" and the "substituted aryl group".

The "substituted aryl group" refers to a case where the "unsubstituted aryl group" has a substituent, and specific examples thereof include a group in which the "unsubstituted aryl group" has the substituent, and a substituted aryl group described below. It should be noted that examples of the "unsubstituted aryl group" and examples of the "substituted aryl group" listed herein are only one example, and the "substituted aryl group" described herein also includes a group in which a group in which "unsubstituted aryl group" has a substituent further has a substituent, and a group in which "substituted aryl group" further has a substituent, and the like.

An unsubstituted aryl group:
a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group, and
a perylenyl group.

A substituted aryl group:
an o-tolyl group,
a m-tolyl group,
a p-tolyl group,
a p-xylyl group,
a m-xylyl group,
an o-xylyl group,
a p-isopropyl phenyl group,
a m-isopropyl phenyl group,
an o-isopropyl phenyl group,
a p-t-butylphenyl group,
a m-t-butylphenyl group,
an o-t-butylphenyl group,
a 3,4,5-trimethylphenyl group,
a 9,9-dimethylfluorenyl group, a 9,9-diphenylfluorenyl group
a 9,9-di(4-methylphenyl)fluorenyl group,
a 9,9-di(4-isopropylphenyl)fluorenyl group,
a 9,9-di(4-t-butylphenyl)fluorenyl group,
a cyanophenyl group,
a triphenylsilylphenyl group,
a trimethylsilylphenyl group,
a phenylnaphthyl group, and
a naphthylphenyl group.

The "heterocyclic group" described herein is a ring group including at least one hetero atom in the ring atom. Specific examples of the hetero atom include a nitrogen atom, an oxygen atom, a sulfur atom, a silicon atom, a phosphorus atom and a boron atom.

The "heterocyclic group" described herein may be a monocyclic group, or a fused ring group.

The "heterocyclic group" described herein may be an aromatic heterocyclic group, or an aliphatic heterocyclic group.

Specific examples (specific example group G2) of the "substituted or unsubstituted heterocyclic group" include an unsubstituted heterocyclic group and a substituted heterocyclic group described below. (Here, the unsubstituted heterocyclic group refers to a case where the "substituted or unsubstituted heterocyclic group" is the "unsubstituted heterocyclic group," and the substituted heterocyclic group refers to a case where the "substituted or unsubstituted heterocyclic group" is the "substituted heterocyclic group". Hereinafter, the case of merely "heterocyclic group" includes both the "unsubstituted heterocyclic group" and the "substituted heterocyclic group".

The "substituted heterocyclic group" refers to a case where the "unsubstituted heterocyclic group" has a substituent, and specific examples thereof include a group in which the "unsubstituted heterocyclic group" has a substituent, and a substituted heterocyclic group described below. It should be noted that examples of the "unsubstituted heterocyclic group" and examples of the "substituted heterocyclic group" listed herein are merely one example, and the "substituted heterocyclic group" described herein also includes a group in which "unsubstituted heterocyclic group" which has a substituent further has a substituent, and a group in which "substituted heterocyclic group" further has a substituent, and the like.

An unsubstituted heterocyclic group including a nitrogen atom:
a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

An unsubstituted heterocyclic group including an oxygen atom:
a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

An unsubstituted heterocyclic group including a sulfur atom:
a thienyl group,
a thiazolyl group,
an isothiazolyl group,
a thiadiazolyl group,
a benzothiophenyl group,
an isobenzothiophenyl group,
a dibenzothiophenyl group,
a naphthobenzothiophenyl group,
a benzothiazolyl group,
a benzisothiazolyl group,
a phenothiazinyl group,
a dinaphthothiophenyl group,
an azadibenzothiophenyl group,
a diazadibenzothiophenyl group,
an azanaphthobenzothiophenyl group, and
a diazanaphthobenzothiophenyl group.

A substituted heterocyclic group including a nitrogen atom:
a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group, a biphenylyltriazinyl group, a diphenyltriazinyl group, a phenylquinazolinyl group, and a biphenylylquinazolinyl group.

A substituted heterocyclic group including an oxygen atom:

a phenyldibenzofuranyl group, a methyldibenzofuranyl group, a t-butyldibenzofuranyl group, and a monovalent residue of spiro[9H-xanthene-9,9'-[9H]fluorene].

A substituted heterocyclic group including a sulfur atom:

a phenyldibenzothiophenyl group, a methyldibenzothiophenyl group, a t-butyldibenzothiophenyl group, and a monovalent residue of spiro[9H-thioxantene-9,9'-[9H] fluorene].

A monovalent group derived from the following unsubstituted heterocyclic ring containing at least one of a nitrogen atom, an oxygen atom and a sulfur atom by removal of one hydrogen atom bonded to the ring atoms thereof, and a monovalent group in which a monovalent group derived from the following unsubstituted heterocyclic ring has a substituent by removal of one hydrogen atom bonded to the ring atoms thereof:

(XY-1)

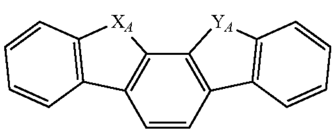

(XY-2)

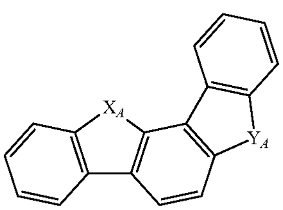

(XY-3)

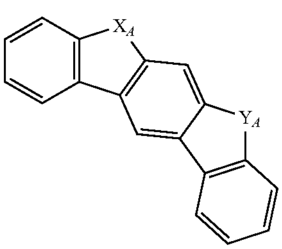

(XY-4)

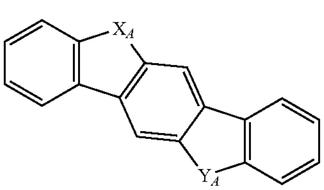

-continued (XY-5)

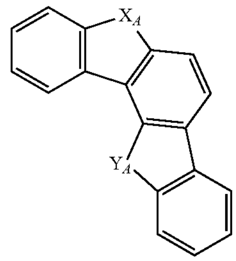

(XY-6)

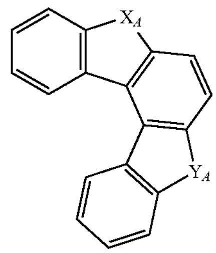

(XY-7)

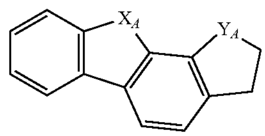

(XY-8)

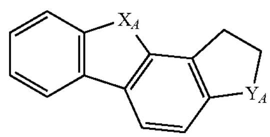

(XY-9)

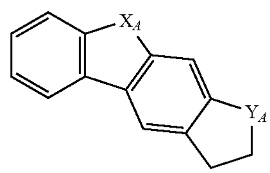

(XY-10)

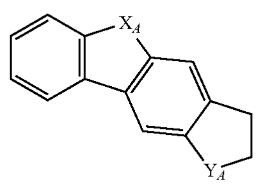

(XY-11)

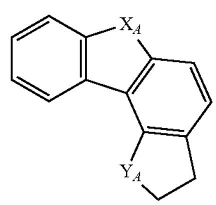

(XY-12)

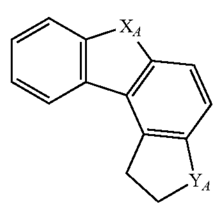

-continued (XY-13)

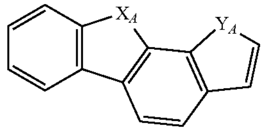

(XY-14)

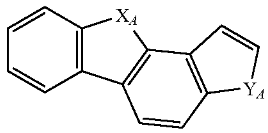

(XY-15)

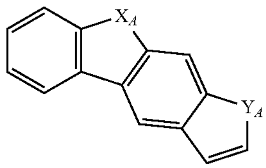

(XY-16)

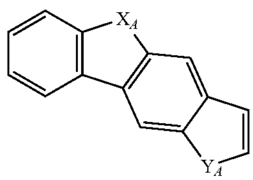

(XY-17)

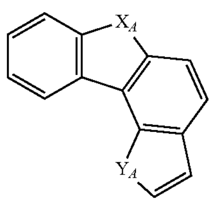

(XY-18)

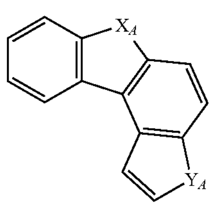

In the formulas (XY-1) to (XY-18), $X_A$ and $Y_A$ are independently an oxygen atom, a sulfur atom, NH or $CH_2$. However, at least one of $X_A$ and $Y_A$ is an oxygen atom, a sulfur atom or NH.

The heterocyclic ring represented by the formulas (XY-1) to (XY-18) becomes a monovalent heterocyclic group including a bond at an arbitrary position.

An expression "the monovalent group derived from the unsubstituted heterocyclic ring represented by the formulas (XY-1) to (XY-18) has a substituent" refers to a case where the hydrogen atom bonded with the carbon atom which constitutes a skeleton of the formulas is substituted by a substituent, or a state in which $X_A$ or $Y_A$ is NH or $CH_2$, and the hydrogen atom in the NH or $CH_2$ is replaced with a substituent.

Specific examples (specific example group G3) of the "substituted or unsubstituted alkyl group" include an unsubstituted alkyl group and a substituted alkyl group described below. (Here, the unsubstituted alkyl group refers to a case where the "substituted or unsubstituted alkyl group" is the "unsubstituted alkyl group," and the substituted alkyl group refers to a case where the "substituted or unsubstituted alkyl group" is the "substituted alkyl group"). Hereinafter, the case of merely "alkyl group" includes both the "unsubstituted alkyl group" and the "substituted alkyl group".

The "substituted alkyl group" refers to a case where the "unsubstituted alkyl group" has a substituent, and specific examples thereof include a group in which the "unsubstituted alkyl group" has a substituent, and a substituted alkyl group described below. It should be noted that examples of the "unsubstituted alkyl group" and examples of the "substituted alkyl group" listed herein are merely one example, and the "substituted alkyl group" described herein also includes a group in which "unsubstituted alkyl group" has a substituent further has a substituent, a group in which "substituted alkyl group" further has a substituent, and the like.

An unsubstituted alkyl group:

a methyl group,
an ethyl group,
a n-propyl group,
an isopropyl group,
a n-butyl group,
an isobutyl group,
a s-butyl group, and
a t-butyl group.

A substituted alkyl group:

a heptafluoropropyl group (including an isomer),
a pentafluoroethyl group,
a 2,2,2-trifluoroethyl group, and
a trifluoromethyl group.

Specific examples (specific example group G4) of the "substituted or unsubstituted alkenyl group" include an unsubstituted alkenyl group and a substituted alkenyl group described below. (Here, the unsubstituted alkenyl group refers to a case where the "substituted or unsubstituted alkenyl group" is the "unsubstituted alkenyl group," and the substituted alkenyl group refers to a case where the "substituted or unsubstituted alkenyl group" is the "substituted alkenyl group"). Hereinafter, the case of merely "alkenyl group" includes both the "unsubstituted alkenyl group" and the "substituted alkenyl group".

The "substituted alkenyl group" refers to a case where the "unsubstituted alkenyl group" has a substituent, and specific examples thereof include a group in which the "unsubstituted alkenyl group" has a substituent, and a substituted alkenyl group described below. It should be noted that examples of the "unsubstituted alkenyl group" and examples of the "substituted alkenyl group" listed herein are merely one example, and the "substituted alkenyl group" described herein also includes a group in which "unsubstituted alkenyl group" has a substituent further has a substituent, a group in which "substituted alkenyl group" further has a substituent, and the like.

An unsubstituted alkenyl group and a substituted alkenyl group:

a vinyl group,
an allyl group,
a 1-butenyl group,
a 2-butenyl group,
a 3-butenyl group,
a 1,3-butanedienyl group,
a 1-methylvinyl group,
a 1-methylallyl group,
a 1,1-dimethylallyl group,
a 2-methylallyl group, and
a 1,2-dimethylallyl group.

Specific examples (specific example group G5) of the "substituted or unsubstituted alkynyl group" include an unsubstituted alkynyl group described below. (Here, the unsubstituted alkynyl group refers to a case where the "substituted or unsubstituted alkynyl group" is the "unsubstituted alkynyl group"). Hereinafter, a case of merely "alkynyl group" includes both the "unsubstituted alkynyl group" and the "substituted alkynyl group".

The "substituted alkynyl group" refers to a case where the "unsubstituted alkynyl group" has a substituent, and specific examples thereof include a group in which the "unsubstituted alkynyl group" described below has a substituent.

An unsubstituted alkynyl group:
an ethynyl group.

Specific examples (specific example group G6) of the "substituted or unsubstituted cycloalkyl group" described herein include an unsubstituted cycloalkyl group and a substituted cycloalkyl group described below. (Here, the unsubstituted cycloalkyl group refers to a case where the "substituted or unsubstituted cycloalkyl group" is the "unsubstituted cycloalkyl group," and the substituted cycloalkyl group refers to a case where the "substituted or unsubstituted cycloalkyl group" is the "substituted cycloalkyl group"). Hereinafter, a case of merely "cycloalkyl group" includes both the "unsubstituted cycloalkyl group" and the "substituted cycloalkyl group".

The "substituted cycloalkyl group" refers to a case where the "unsubstituted cycloalkyl group" a the substituent, and specific examples thereof include a group in which the "unsubstituted cycloalkyl group" has a substituent, and a substituted cycloalkyl group described below. It should be noted that examples of the "unsubstituted cycloalkyl group" and examples of the "substituted cycloalkyl group" listed herein are merely one example, and the "substituted cycloalkyl group" described herein also includes a group in which "unsubstituted cycloalkyl group" has a substituent further has a substituent, a group in which "substituted cycloalkyl group" further has a substituent, and the like.

An unsubstituted aliphatic ring group:
a cyclopropyl group,
a cyclobutyl group,
a cyclopentyl group,
a cyclohexyl group,
a 1-adamantyl group,
a 2-adamantyl group,
a 1-norbomyl group, and
a 2-norbomyl group.

A substituted cycloalkyl group:
a 4-methylcyclohexyl group.

Specific examples (specific example group G7) of the group represented by —Si($R_{901}$)($R_{902}$)($R_{903}$) described herein include
—Si(G1)(G1)(G1),
—Si(G1)(G2)(G2),
—Si(G1)(G1)(G2),
—Si(G2)(G2)(G2),
—Si(G3)(G3)(G3),
—Si(G5)(G5)(G5) and
—Si(G6)(G6)(G6).

In which,

G1 is the "aryl group" described in the specific example group G1.

G2 is the "heterocyclic group" described in the specific example group G2.

G3 is the "alkyl group" described in the specific example group G3.

G5 is the "alkynyl group" described in the specific example group G5.

G6 is the "cycloalkyl group" described in the specific example group G6.

Specific examples (specific example group G8) of the group represented by —O—($R_{904}$) described herein include
—O(G1),
—O(G2),
—O(G3) and
—O(G6).

In which,

G1 is the "aryl group" described in the specific example group G1.

G2 is the "heterocyclic group" described in the specific example group G2.

G3 is the "alkyl group" described in the specific example group G3.

G6 is the "cycloalkyl group" described in the specific example group G6.

Specific examples (specific example group G9) of the group represented by —S—($R_{905}$) described herein include
—S(G1),
—S(G2),
—S(G3) and
—S(G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G10) of the group represented by —N($R_{906}$)($R_{907}$) described herein include
—N(G1)(G1),
—N(G2)(G2),
—N(G1)(G2),
—N(G3)(G3) and
—N(G6) (G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G11) of the "halogen atom" described herein include a fluorine atom, a chlorine atom, a bromine atom and an iodine atom.

Specific examples of the "alkoxy group" described herein include a group represented by —O(G3), where G3 is the "alkyl group" described in the specific example group G3. The number of carbon atoms of the "unsubstituted alkoxy group" are 1 to 50, preferably 1 to 30, and more preferably 1 to 18, unless otherwise specified.

Specific examples of the "alkylthio group" described herein include a group represented by —S(G3), where G3 is the "alkyl group" described in the specific example group G3. The number of carbon atoms of the "unsubstituted alkylthio group" are 1 to 50, preferably 1 to 30, and more preferably 1 to 18, unless otherwise specified.

Specific examples of the "aryloxy group" described herein include a group represented by —O(G1), where G1 is the "aryl group" described in the specific example group G1. The number of ring carbon atoms of the "unsubstituted aryloxy group" are 6 to 50, preferably 6 to 30, and more preferably 6 to 18, unless otherwise specified.

Specific examples of the "arylthio group" described herein include a group represented by —S(G1), where G1 is the "aryl group" described in the specific example group G1. The number of ring carbon atoms of the "unsubstituted arylthio group" are 6 to 50, preferably 6 to 30, and more preferably 6 to 18, unless otherwise specified.

Specific examples of the "aralkyl group" described herein include a group represented by —(G3)-(G1), where G3 is the "alkyl group" described in the specific example group G3, and G1 is the "aryl group" described in the specific example group G1. Accordingly, the "aralkyl group" is one embodiment of the "substituted alkyl group" substituted by the "aryl group". The number of carbon atoms of the "unsubstituted aralkyl group," which is the "unsubstituted alkyl group" substituted by the "unsubstituted aryl group," are 7 to 50, preferably 7 to 30, and more preferably 7 to 18, unless otherwise specified.

Specific example of the "aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, and a 2-β-naphthylisopropyl group.

The substituted or unsubstituted aryl group described herein is, unless otherwise specified, preferably a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, a 9,9-diphenylfluorenyl group, or the like.

The substituted or unsubstituted heterocyclic group described herein is, unless otherwise specified, preferably a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazole-9-yl group, a phenylcarbazol-9-yl group, a phenyltriazinyl group, a biphenylyltriazinyl group, diphenyltriazinyl group, a phenyldibenzofuranyl group, a phenyldibenzothiophenyl group, an indrocarbazolyl group, a pyrazinyl group, a pyridazinyl group, a quinazolinyl group, a cinnolinyl group, a phthalazinyl group, a quinoxalinyl group, a pyrrolyl group, an indolyl group, a pyrrolo[3,2,1-jk]carbazolyl group, a furanyl group, a benzofuranyl group, a thiophenyl group, a benzothiophenyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, an indro[3,2,1-jk]carbazolyl group, a dibenzothiophenyl group, or the like.

The dibenzofuranyl group and the dibenzothiophenyl group as described above are specifically any group described below, unless otherwise specified.

(XY-76)

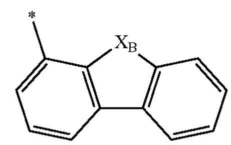

(XY-77)

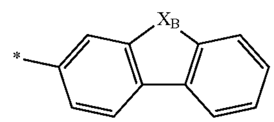

(XY-78)

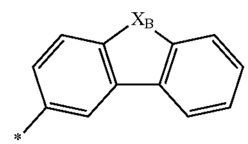

(XY-79)

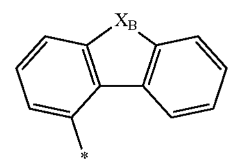

In the formulas (XY-76) to (XY-79), $X_B$ is an oxygen atom or a sulfur atom.

The substituted or unsubstituted alkyl group described herein is, unless otherwise specified, preferably a methyl group, an ethyl group, a propyl group, an isopropyl group, a n-butyl group, an isobutyl group, a t-butyl group, or the like.

The "substituted or unsubstituted arylene group" descried herein refers to a group in which the above-described "aryl group" is converted into divalence, unless otherwise specified. Specific examples (specific example group G12) of the "substituted or unsubstituted arylene group" include a group in which the "aryl group" described in the specific example group G1 is converted into divalence. Namely, specific examples (specific example group G12) of the "substituted or unsubstituted arylene group" refer to a group derived from the "aryl group" described in specific example group G1 by removal of one hydrogen atom bonded to the ring carbon atoms thereof.

Specific examples (specific example group G13) of the "substituted or unsubstituted divalent heterocyclic group" include a group in which the "heterocyclic group" described in the specific example group G2 is converted into divalence. Namely, specific examples (specific example group G13) of the "substituted or unsubstituted divalent heterocyclic group" refer to a group derived from the "heterocyclic group" described in specific example group G2 by removal of one hydrogen atom bonded to the ring atoms thereof.

Specific examples (specific example group G14) of the "substituted or unsubstituted alkylene group" include a group in which the "alkyl group" described in the specific example group G3 is converted into divalence. Namely, specific examples (specific example group G14) of the "substituted or unsubstituted alkylene group" refer to a group derived from the "alkyl group" described in specific example group G3 by removal of one hydrogen atom bonded to the carbon atoms constituting the alkane structure thereof.

The substituted or unsubstituted arylene group described herein is any group described below, unless otherwise specified.

(XY-20)

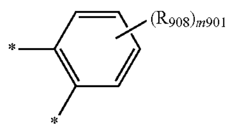

(XY-21)

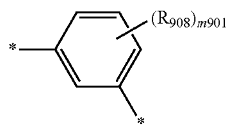

(XY-22)

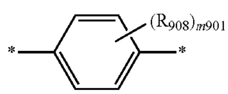

(XY-23)

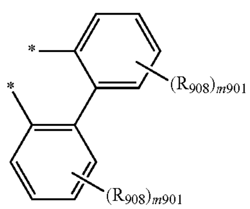

(XY-24)

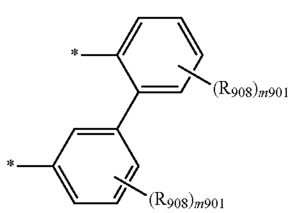

(XY-25)

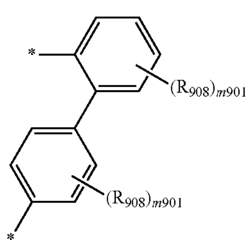

(XY-26)

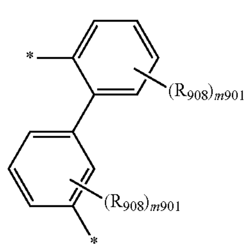

-continued (XY-27)

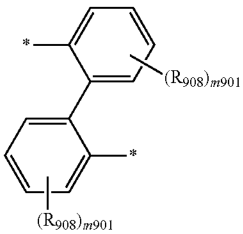

(XY-28)

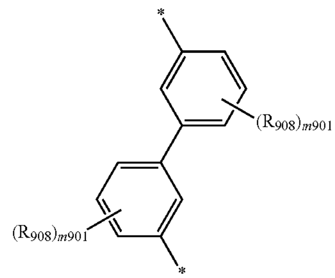

(XY-29)

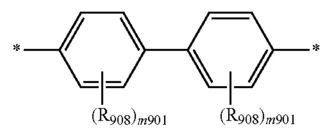

(XY-83)

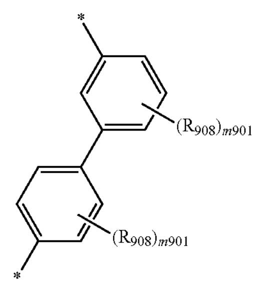

(XY-84)

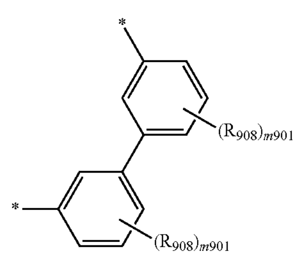

In the formulas (XY-20) to (XY-29), (XY-83) and (XY-84), $R_{908}$ is a substituent.

Then, m901 is an integer of 0 to 4, and when m901 is 2 or more, a plurality of $R_{908}$ may be the same with or different from each other.

(XY-30)

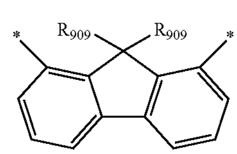

-continued (XY-31)

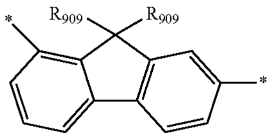

(XY-32)

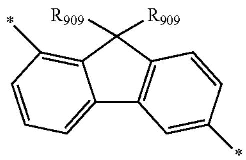

(XY-33)

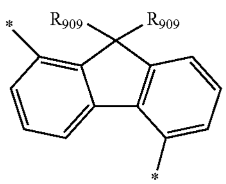

(XY-34)

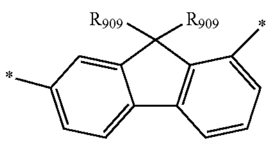

(XY-35)

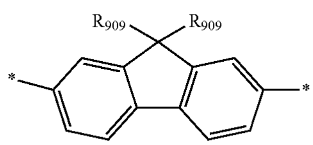

(XY-36)

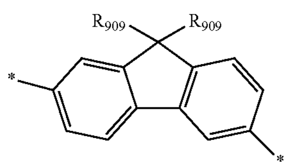

(XY-37)

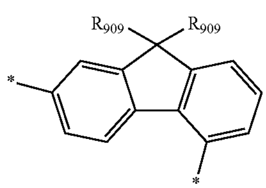

(XY-38)

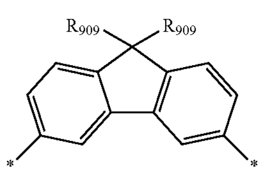

(XY-39)

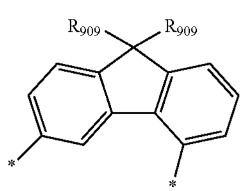

-continued (XY-40)

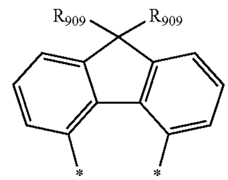

In the formulas (XY-30) to (XY-40), $R_{909}$ is independently a hydrogen atom or a substituent. Two of $R_{909}$ may form a ring by bonding with each other through a single bond.

(XY-41)

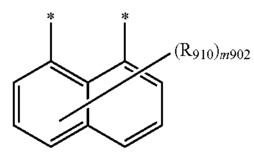

(XY-42)

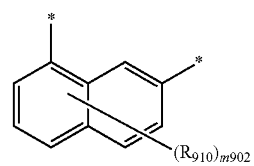

(XY-43)

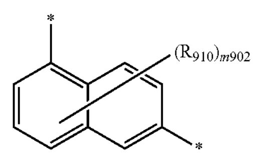

(XY-44)

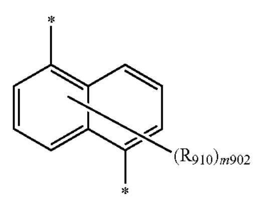

(XY-45)

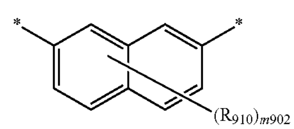

(XY-46)

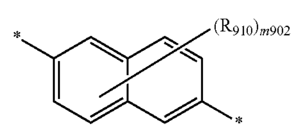

In the formulas (XY-41) to (XY-46), $R_{910}$ is a substituent.

Then, m902 is an integer of 0 to 6. When m902 is 2 or more, a plurality of $R_{910}$ may be the same with or different from each other.

The substituted or unsubstituted divalent heterocyclic group described herein is preferably any group described below, unless otherwise specified.

(XY-50)
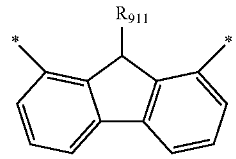
(XY-51)
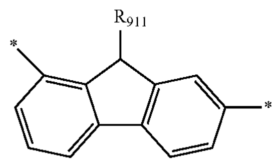
(XY-52)
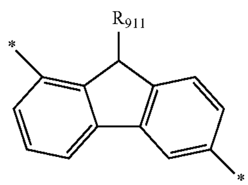
(XY-53)
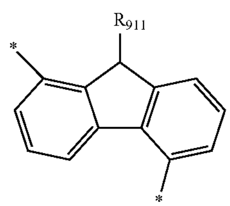
(XY-54)
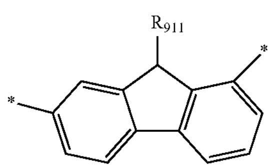
(XY-55)
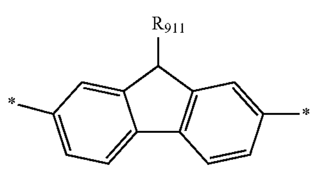
(XY-56)
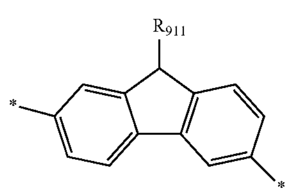
(XY-57)
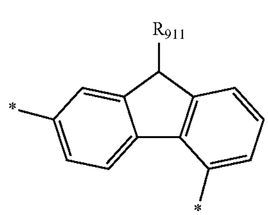
-continued
(XY-58)
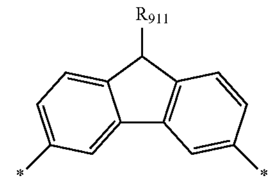
(XY-59)
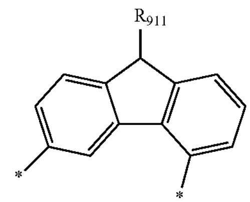
(XY-60)
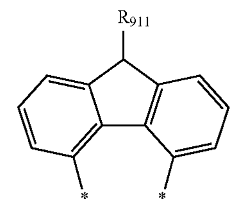
(XY-61)
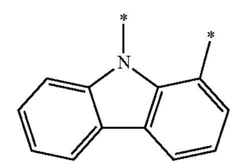
(XY-62)
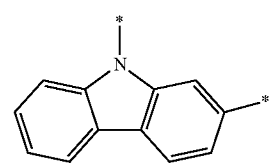
(XY-63)
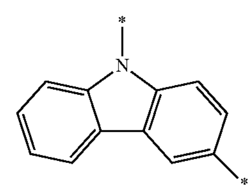
(XY-64)
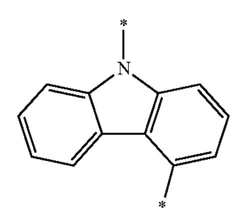
In the formulas (XY-50) to (XY-60), $R_{911}$ is a hydrogen atom or a substituent.
(XY-65)
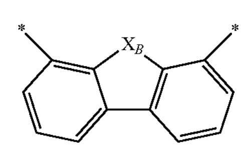

-continued (XY-66)

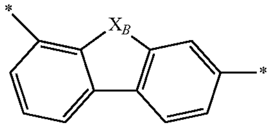

(XY-67)

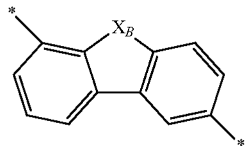

(XY-68)

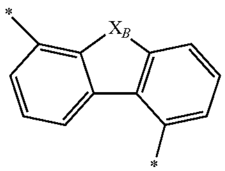

(XY-69)

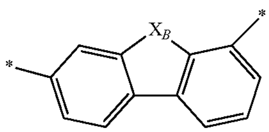

(XY-70)

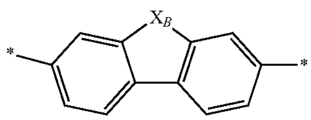

(XY-71)

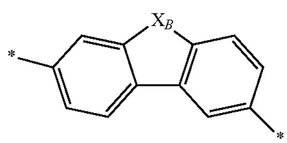

(XY-72)

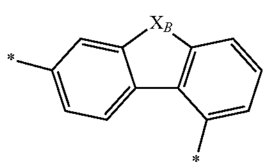

(XY-73)

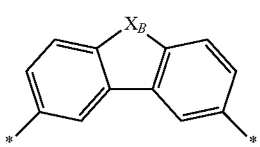

(XY-74)

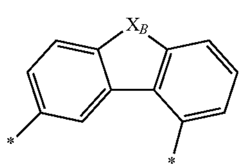

(XY-75)

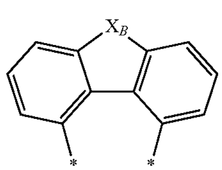

In the formulas (XY-65) to (XY-75), $X_B$ is an oxygen atom or a sulfur atom.

Herein, a case where "one or more sets of two or more groups adjacent to each other form a substituted or unsubstituted and saturated or unsaturated ring by bonding with each other" will be described by taking, as an example, a case of an anthracene compound represented by the following formula (XY-80) in which a mother skeleton is an anthracene ring.

(XY-80)

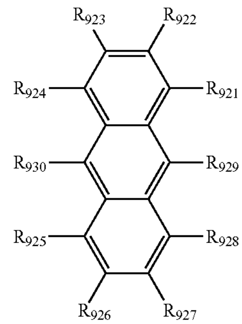

For example, two adjacent to each other into one set when "one or more sets of two or more groups adjacent to each other form the ring by bonding with each other" among $R_{921}$ to $R_{930}$ include $R_{921}$ and $R_{922}$, $R_{922}$ and $R_{923}$, $R_{923}$ and $R_{924}$, $R_{924}$ and $R_{930}$, $R_{930}$ and $R_{925}$, $R_{925}$ and $R_{926}$, $R_{926}$ and $R_{927}$, $R_{927}$ and $R_{928}$, $R_{928}$ and $R_{929}$, and $R_{929}$ and $R_{921}$.

The above-described "one or more sets" means that two or more sets of two groups adjacent to each other may simultaneously form the ring. For example, a case where $R_{921}$ and $R_{922}$ form a ring A by bonding with each other, and simultaneously $R_{925}$ and $R_{926}$ form a ring B by bonding with each other is represented by the following formula (XY-81).

(XY-81)

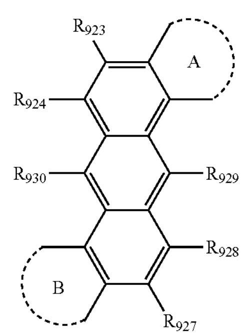

A case where "two or more groups adjacent to each other" form a ring means that, for example, $R_{921}$ and $R_{922}$ form a ring A by bonding with each other, and $R_{922}$ and $R_{923}$ form a ring C by bonding with each other. A case where the ring A and ring C sharing $R_{922}$ are formed, in which the ring A and the ring C are fused to the anthracene mother skeleton by three of $R_{921}$ to $R_{923}$ adjacent to each other, is represented by the following (XY-82).

(XY-82)

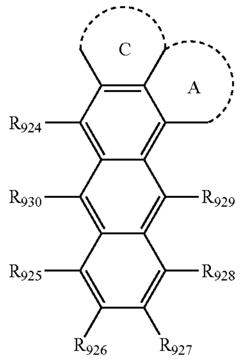

The rings A to C formed in the formulas (XY-81) and (XY-82) are a saturated or unsaturated ring.

A term "unsaturated ring" means an aromatic hydrocarbon ring or an aromatic heterocyclic ring. A term "saturated ring" means an aliphatic hydrocarbon ring or an aliphatic heterocyclic ring.

For example, the ring A formed by $R_{921}$ and $R_{922}$ being bonded with each other, represented by the formula (XY-81), means a ring formed by a carbon atom of the anthracene skeleton bonded with $R_{921}$, a carbon atom of the anthracene skeleton bonded with $R_{922}$, and one or more arbitrary elements. Specific examples include, when the ring A is formed by $R_{921}$ and $R_{922}$, a case where an unsaturated ring is formed of a carbon atom of an anthracene skeleton bonded with $R_{921}$, a carbon atom of the anthracene skeleton bonded with $R_{922}$, and four carbon atoms, in which a ring formed by $R_{921}$ and $R_{922}$ is formed into a benzene ring. Further, when a saturated ring is formed, the ring is formed into a cyclohexane ring.

Here, "arbitrary elements" are preferably a C element, a N element, an O element and a S element. In the arbitrary elements (for example, a case of the C element or the N element), the bond(s) that is(are) not involved in the formation of the ring may be terminated by a hydrogen atom, or may be substituted by an arbitrary substituent. When the ring contains the arbitrary elements other than the C element, the ring to be formed is a heterocyclic ring.

The number of "one or more arbitrary elements" forming the saturated or unsaturated ring is preferably 2 or more and 15 or less, more preferably 3 or more and 12 or less, and further preferably 3 or more and 5 or less.

As specific examples of the aromatic hydrocarbon ring, a structure in which the aryl group described in specific example group G1 is terminated with a hydrogen atom may be mentioned.

As specific examples of the aromatic heterocyclic ring, a structure in which the aromatic heterocyclic group described in specific example group G2 is terminated with a hydrogen atom may be mentioned.

As specific examples of the aliphatic hydrocarbon ring, a structure in which the cycloalkyl group described in specific example group G6 is terminated with a hydrogen atom may be mentioned.

When the above-described "saturated or unsaturated ring" has a substituent, the substituent is an "arbitrary substituent" as described below, for example. When the above-mentioned "saturated or unsaturated ring" has a substituent, specific examples of the substituent refer to the substituents described in above-mentioned "the substituent described herein".

In one embodiment of this specification, the substituent (hereinafter, referred to as an "arbitrary substituent" in several cases) in the case of the "substituted or unsubstituted" is a group selected from the group consisting of an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—Si($R_{901}$)($R_{902}$)($R_{903}$),
—O—($R_{904}$),
—S—($R_{905}$)
—N($R_{9013}$) ($R_{907}$)
wherein,
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of $R_{901}$ to $R_{907}$ exist, two or more of $R_{901}$ to $R_{907}$ may be the same with or different from each other,
a halogen atom, a cyano group, a nitro group,
an unsubstituted aryl group including 6 to 50 ring carbon atoms, and
an unsubstituted monovalent heterocyclic group including 5 to 50 ring atoms.

In one embodiment, the substituent in the case of "substituted or unsubstituted" is a group selected from the group consisting of an alkyl group including 1 to 50 carbon atoms,
an aryl group including 6 to 50 ring carbon atoms, and
a monovalent heterocyclic group including 5 to 50 ring atoms.

In one embodiment, the substituent in the case of "substituted or unsubstituted" is a group selected from the group consisting of an alkyl group including 1 to 18 carbon atoms,
an aryl group including 6 to 18 ring carbon atoms, and
a monovalent heterocyclic group including 5 to 18 ring atoms.

Specific examples of each group of the arbitrary substituent described above are as described above.

Herein, unless otherwise specified, the saturated or unsaturated ring (preferably substituted or unsubstituted and saturated or unsaturated five-membered or six-membered ring, more preferably a benzene ring) may be formed by the arbitrary substituents adjacent to each other.

Herein, unless otherwise specified, the arbitrary substituent may further have the substituent. Specific examples of the substituent that the arbitrary substituent further has include to the ones same as the arbitrary substituent described above.

[Organic Electroluminescence Device]

An organic electroluminescence device of the first aspect of the invention includes:

an anode,
a cathode, and
an emitting region between the anode and the cathode, wherein the emitting region includes a first emitting layer and a second emitting layer, the first emitting layer and the second emitting layer are directly adjacent to each other, the first emitting layer is between the anode and the second emitting layer, and one of the first emitting layer and the second emitting layer contains a compound having at least one deuterium atom.

Schematic configuration of the organic EL device according to a first aspect of the invention will be explained referring to FIG. 1.

An organic EL device 1A according to an aspect of the invention includes a substrate 2, an anode 3, a cathode 4, and organic layers 10 between the anode 3 and the cathode 4. The organic layers 10 include an emitting region 5, an organic thin film layer 6 between the anode 3 and the emitting region 5, and an organic thin film layer 7 between the emitting region 5 and the cathode 4.

The emitting region 5 includes a first emitting layer 5A on the anode side and a second emitting layer 5B on the cathode side, and the first emitting layer 5A and the second emitting layer are directly adjacent to each other.

One of the first emitting layer 5A and the second emitting layer 5B contains a compound having at least one deuterium atom.

The inventors found that the lifetime of an organic EL device can be increased when the emitting region includes an emitting layer which contains a compound having a deuterium atom.

In one embodiment, only one of the first emitting layer and the second emitting layer contains a compound having at least one deuterium atom, and the other substantially does not contain a compound having a deuterium atom.

Here, the expression "does not substantially contain a compound having a deuterium atom" means that no deuterium atom is contained in the compound, or deuterium atoms may be contained in the compound in an amount of the natural abundance ratio. The natural abundance ratio of deuterium atoms is, for example, 0.015% or less.

In other words, "contains a compound having at least one deuterium atom" here means that the emitting layer contains a compound having a deuterium atom in an amount that exceeds the natural abundance ratio thereof.

The presence of a deuterium atom in a compound is confirmed by mass spectrometry or $^{1}$H-NMR analysis. The bonding positions of a deuterium atom in the compound is identified by $^{1}$H-NMR analysis. Specifically, it can be confirmed by the following method.

The target compound is subjected to mass spectrometry, and if the molecular weight increases by 1 compared to the corresponding compound in which all hydrogen atoms are protium atoms, it can be confirmed that the compound contains one deuterium atom. In addition, the number of deuterium atoms in the molecule can be obtained from the integral value obtained by $^{1}$H-NMR analysis of the target compound, since a deuterium atom gives no signal in $^{1}$H-NMR analysis. In addition, the bonding position of the deuterium atom can be identified by assigning signals obtained from the result of $^{1}$H-NMR analysis.

The ratio of the film thickness of the emitting layer which contains a compound having a deuterium atom (film thickness T1) to the film thickness of the emitting layer which does not contain a compound having a deuterium atom (film thickness T2) is, for example, $0.05<(T1/(T1+T2))<0.9$. From the viewpoint of avoiding the use of a large amount of a compound having a deuterium atom (from the viewpoint of reducing cost), the ratio of the film thickness of the emitting layer which contains a compound having a deuterium atom (film thickness T1) to the film thickness of the emitting layer which does not contain a compound having a deuterium atom (film thickness T2) is $0.05<(T1/(T1+T2))<0.7$, preferably $0.05<(T1/(T1+T2))<0.6$, and more preferably $0.1<(T1/(T1+T2))<0.5$, and for example, $0.1<(T1/(T1+T2))<0.4$. From the viewpoint of prolonging lifetime, the ratio of the film thickness of the emitting layer which contains a compound having a deuterium atom (film thickness T1) to the film thickness of the emitting layer which does not contain a compound having a deuterium atom (film thickness T2) is preferably $0.1\leq(T1/(T1+T2))$, and more preferably $0.3\leq(T1/(T1+T2))$. Also, the ratio is preferably $(T1/(T1+T2))\leq0.9$. By taking lifetime and cost into consideration, the ratio is preferably $0.2\leq(T1/(T1+T2))\leq0.7$, and more preferably $0.2\leq(T1/(T1+T2))\leq0.5$.

In one embodiment, the ratio of the film thickness of the first emitting layer (film thickness T1) to the film thickness of the second emitting layer (film thickness T2) is, for example, $0.05<(T1/(T1+T2))<0.9$. The ratio of the thickness of the first emitting layer (film thickness T1) to the thickness of the second emitting layer (film thickness T2) is preferably $0.05<(T1/(T1+T2))<0.6$, more preferably $0.1<(T1/(T1+T2))<0.5$, and for example, $0.1<(T1/(T1+T2))<0.4$.

The film thickness of the emitting layer which contains a compound having a deuterium atom (film thickness T1) is preferably 2.5 nm or more, and more preferably 7.5 nm or more, from the viewpoint of increasing lifetime. Also, the thickness is preferably 22.5 nm or less. On the other hand, from the viewpoint of avoiding the use of a large amount of a compound having a deuterium atom (from the viewpoint of reducing cost), a smaller film thickness of the emitting layer which contains a compound having a hydrogen atom (film thickness T1) is preferable, and the thickness is preferably 17.5 nm or less. More preferably, the film thickness T1 is 12.5 nm or less. Still more preferably, the film thickness T1 is 10 nm or less. By taking lifetime and cost into consideration, the film thickness T1 is preferably 5 nm or more and 17.5 nm or less, and the film thickness T1 is more preferably 5 nm or more and 12.5 nm or less.

In one embodiment, the first emitting layer and the second emitting layer independently contain a host material and a dopant material. The dopant material is preferably a blue emitting dopant.

The compound having at least one deuterium atom may be a host material or a dopant material.

In one embodiment, the compound having at least one deuterium atom is a host material.

The content of the host material in the emitting layer is preferably 80% by mass or more and 99% by mass or less based on the mass of the entire emitting layer.

The content of the dopant material in the emitting layer is preferably 1% by mass or more and 20% by mass or less based on the mass of the entire emitting layer.

The number of deuterium atoms of the compound having at least one deuterium atom is preferably 1 to 100, and more preferably 1 to 80.

When the compound having at least one deuterium atom is a dopant material, the number of deuterium atoms thereof is preferably 1 to 100, and more preferably 1 to 80.

When the compound having at least one deuterium atom is a host material, the number of deuterium atoms thereof is preferably 1 to 50, more preferably 1 to 40.

In one embodiment, the compound having at least one deuterium atom is the host material, and the host material is a compound having at least one of an anthracene skeleton, a pyrene skeleton, a chrysene skeleton, and a fluorene skeleton.

In one embodiment, the compound having at least one deuterium atom is the host material, and the host material is a compound having an anthracene skeleton. The at least one deuterium atom may be any of the hydrogen atoms that constitute a compound having an anthracene skeleton.

In one embodiment, the compound having at least one deuterium atom is the host material, the host material is a compound having an anthracene skeleton, and at least one of hydrogen atoms bonded with a carbon atom constituting the anthracene skeleton is a deuterium atom.

In another embodiment, the compound having at least one deuterium atom is the host material, the host material is a compound having an anthracene skeleton, and at least one of hydrogen atoms bonded with a carbon atom other than carbon atoms constituting the anthracene skeleton is a deuterium atom. The carbon atoms other than carbon atoms constituting the anthracene skeleton is carbon atoms which constitute the so-called side chain structure.

The at least one deuterium atom may be bonded with both of the carbon atom constituting the anthracene skeleton and the carbon atom other than carbon atoms constituting the anthracene skeleton.

In one embodiment, the first emitting layer contains a compound having at least one deuterium atom.

In one embodiment, the first emitting layer contains a compound having at least one deuterium atom as a host material.

When two emitting layers are included in the emitting region, it is preferable that the first emitting layer on the anode side contains a compound having at least one deuterium atom. The compound having at least one deuterium atom may be one or both of a host material and a dopant material.

In one embodiment, the first emitting layer contains a compound having at least one deuterium atom, and the second emitting layer contains a compound having at least one of an anthracene skeleton, a pyrene skeleton, a chrysene skeleton, and a fluorene skeleton.

In this case, the material for the second emitting layer is preferably a compound having an anthracene skeleton which does not contain a deuterium atom, a pyrene skeleton which does not contain a deuterium atom, a chrysene skeleton which does not contain a deuterium atom, or a fluorene skeleton which does not contain a deuterium atom.

In one embodiment, the chemical structure when deuterium atoms of the host material of the first emitting layer is replaced with protium atoms is the same as the chemical structure of the host material of the second emitting layer.

In one embodiment, the dopant material of the first emitting layer is the same as the dopant material of the second emitting layer.

In one embodiment, at least one of the first emitting layer and the second emitting layers is an emitting layer containing one kind or two or more kinds of host materials.

When the emitting layer containing two or more kinds of host materials contains a host material having a deuterium atom, only one of the host materials may be a compound having a deuterium atom and the others may be a compound which does not contain a deuterium atom, or all of the host materials may be compounds having a deuterium atom.

In one embodiment, the first emitting layer does not contain a metal complex.

In one embodiment, the second emitting layer does not contain a metal complex.

Specific examples of the "metal complexes" include phosphorescent metal complexes such as iridium complexes. The "phosphorescent metal complex" functions as a phosphorescent dopant material.

In one embodiment, the first emitting layer and/or the second emitting layer do not contain a phosphorescent dopant material. In this case, the first emitting layer and/or the second emitting layer are emitting layers which emit fluorescence.

In one embodiment, the first emitting layer and/or the second emitting layer do not contain a phosphorescent metal complex.

In one embodiment, the first emitting layer and/or the second emitting layer do not contain an iridium complex.

Specific examples of the dopant material suitable for the organic EL device of an aspect of the invention will be described later.

In the organic EL device according to a second aspect of the invention, the emitting region further includes a third emitting layer;

the second emitting layer and the third emitting layer are directly adjacent to each other, and the third emitting layer is between the cathode and the second emitting layer.

In one embodiment, the emitting region further includes a third emitting layer, the second emitting layer and the third emitting layer are directly adjacent to each other, the third emitting layer is between the cathode and the second emitting layer, and the second emitting layer contains a compound having at least one deuterium atom.

A schematic configuration of an organic EL device according to a second aspect of the invention will be described referring to FIG. 2.

Figure 2:
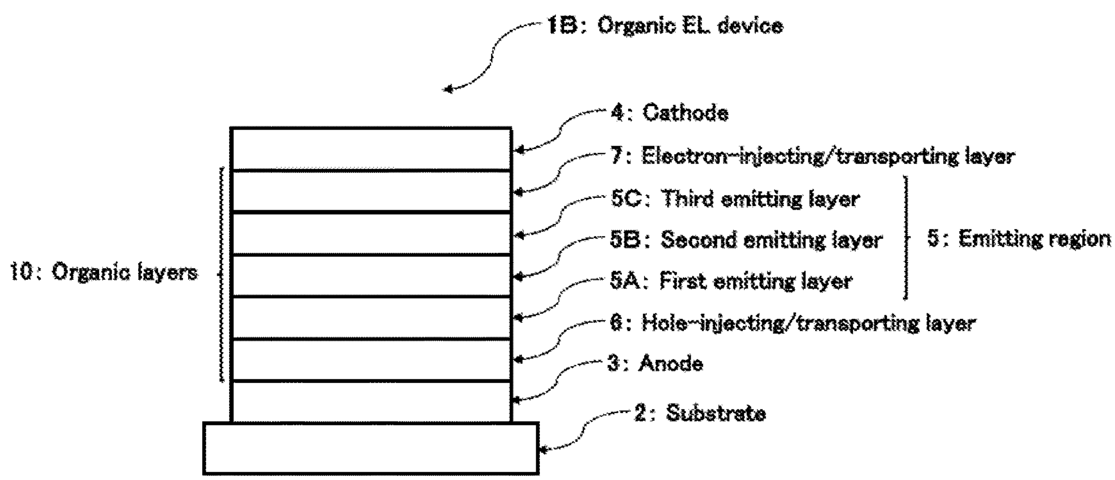
FIG. 2 shows a schematic configuration of an organic EL device according to a second aspect of the invention.

An organic EL device 1B according to a second aspect of the invention shown in FIG. 2 includes a substrate 2, an anode 3, a cathode 4, and organic layers 10 between the anode 3 and the cathode 4. The organic layers 10 include an emitting region 5, a hole-injecting/transporting layer 6 between the anode 3 and the emitting region 5, and an electron-injecting/transporting layer 7 between the emitting region 5 and the cathode 4.

The emitting region 5 includes a first emitting layer 5A on the anode side and a second emitting layer 5B on the cathode side, and the first emitting layer 5A and the second emitting layer are directly adjacent to each other.

One of the first emitting layer 5A and the second emitting layer 5B contains a compound having at least one deuterium atom.

The emitting region 5 includes a third emitting layer 5C on the cathode side of the second emitting layer 5B, and the third emitting layer 5C is directly adjacent to the second emitting layer 5B.

The second emitting layer 5B contains a compound having at least one deuterium atom.

The emitting region 5 of the organic EL device 1B according to the second aspect of the invention includes the first, second, and third emitting layers (5A, 5B, 5C) directly adjacent to each other, and has a configuration in which the second emitting layer (5B) containing a material having at least one deuterium atom is disposed between two other emitting layers (5A, 5C) directly adjacent to the second emitting layer (5B). By having this structure of the emitting region 5, the compound having at least one deuterium atom can be placed in the region not adjacent to the peripheral layers such as a hole-transporting layer and an electron-transporting layer. As a result, even if the interface between these peripheral layers and the adjacent layers (i.e., the emitting layers (5A, 5C)) is degraded, the layer containing the compound having at least one deuterium atom (i.e., the emitting layer (5B)) can be expected to avoid degradation.

An organic EL device according to a third aspect of the invention further includes a third emitting layer and a fourth emitting layer between the second emitting layer and the cathode, the third emitting layer and the fourth emitting layer are directly adjacent to each other, the fourth emitting layer is between the third emitting layer and the cathode, and one of the third emitting layer and the fourth emitting layer contains a compound having at least one deuterium atom.

In one embodiment of the organic EL device according to the third aspect of the invention, the organic electroluminescence device further includes a third emitting layer and a fourth emitting layer, the third emitting layer and the fourth emitting layer are directly adjacent to each other, the fourth emitting layer is between the third emitting layer and the cathode, and one of the third emitting layer and the fourth emitting layer contains a compound having at least one deuterium atom, and the organic electroluminescence device further contains a charge-generating layer between the second emitting layer and the third emitting layer.

A schematic configuration of an organic EL device according to the third aspect of the invention will be described referring to FIG. 3.

Figure 3:
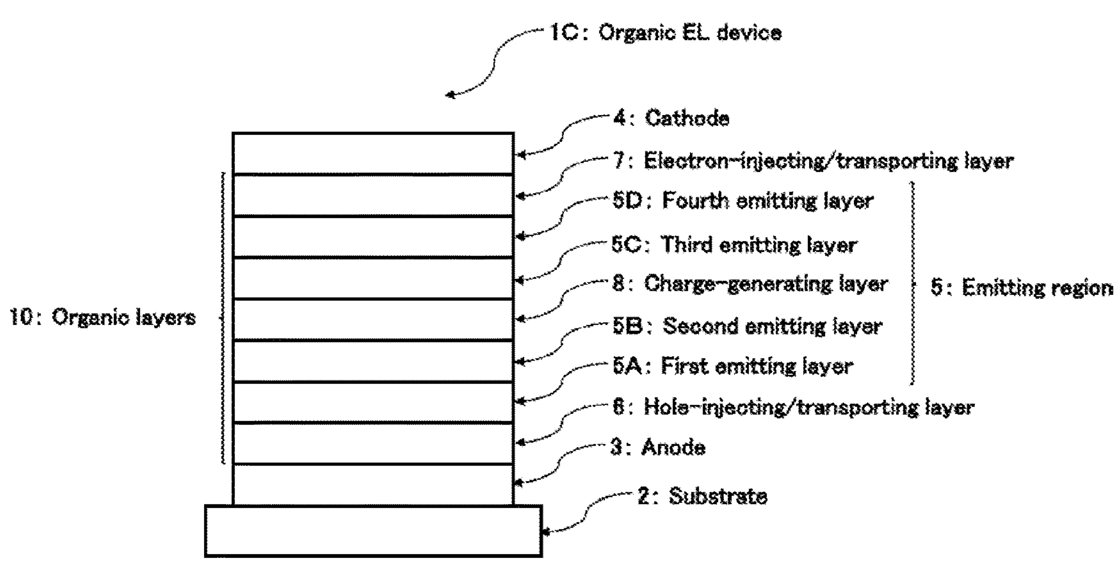
FIG. 3 shows a schematic configuration of an organic EL device according to a third aspect of the invention.

An organic EL device 1C according to a third aspect of the invention shown in FIG. 3 includes a substrate 2, an anode 3, a cathode 4, and organic layers 10 between the anode 3 and the cathode 4. The organic layers 10 include an emitting region 5, a hole-injecting/transporting layer between the anode 3 and the emitting region 5, and an electron-injecting/transporting layer between the emitting region 5 and the cathode 4.

The emitting region 5 includes a first emitting layer 5A on the anode side and a second emitting layer 5B on the cathode side, and the first emitting layer 5A and the second emitting layer are directly adjacent to each other.

The emitting region 5 further includes a third emitting layer 5C and a fourth emitting layer 5D. The fourth emitting layer 5D is located on the cathode 4 side of the third emitting layer 5C. The third emitting layer 5C and the fourth emitting layer 5D are directly adjacent to each other. Although FIG. 3 shows the case where the set of the third emitting layer 5C and the fourth emitting layer 5D are on the cathode 4 side, either of the set of the first emitting layer 5A and the second emitting layer 5B, and the set of the third emitting layer 5C and the fourth emitting layer 5D may be on the cathode 4 side.

One of the first emitting layer 5A and the second emitting layer 5B contains a compound having at least one deuterium atom, and one of the third emitting layer 5C and the fourth emitting layer 5D contains a compound having at least one deuterium atom.

In one embodiment of the third aspect of the invention, shown in FIG. 3, the organic EL device 1C further includes a charge-generating layer 9 between the second emitting layer 5B and the third emitting layer 5C.

The emitting region 5 of the organic EL device 1C according to the third aspect of the invention includes the first and second emitting layers (5A, 5B) directly adjacent to each other and the third and fourth emitting layers (5C, 5D) directly adjacent to each other, and one of the first and second emitting layers (5A, 5B) and one of the third and fourth emitting layers (5C, 5D) contains a compound having at least one deuterium atom. The emitting region 5 has a so-called tandem type configuration with two sets of emitting layers having a stacked structure. By such a tandem type structure that the emitting region 5 has, it is expected to result in high brightness and long lifetime of the device. In addition, a white emitting device of a simple structure can be manufactured.

In one embodiment, the first host material is a compound represented by the following formula (1).

(1)

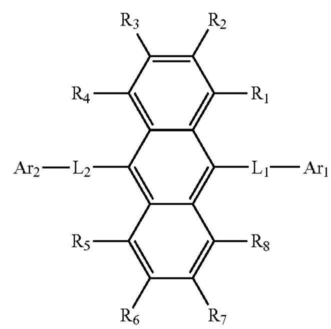

In the formula (1), $R_1$ to $R_8$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

adjacent two or more of $R_1$ to $R_4$, and adjacent two or more of $R_5$ to $R_8$ do not form a ring by bonding with each other;

$L_1$ and $L_2$ are independently a single bond, a substituted or unsubstituted arylene group including 6 to 30 ring carbon atoms, or a substituted or unsubstituted divalent heterocyclic group including 5 to 30 ring atoms;

$Ar_1$ and $Ar_2$ are independently a substituted or unsubstituted aryl group including 6 to 50 ring carbon atoms, or a substituted or unsubstituted monovalent heterocyclic group including 5 to 50 ring atoms;

at least one hydrogen atom selected from the following is a deuterium atom:

hydrogen atoms of $R_1$ to $R_8$ in the case where they are hydrogen atoms, and hydrogen atoms possessed by one or more groups selected from $R_1$ to $R_8$ which are not hydrogen atoms, $L_1$ which is not a single bond, b which is not a single bond, and $Ar_1$ and $Ar_2$.

The compound represented by the formula (1) has one or more deuterium atoms in any position in the molecule.

In the formula (1), at least one of $R_1$ to $R_8$ is a deuterium atom, or at least one hydrogen atom possessed by one or more groups selected from $R_1$ to $R_8$ which are not hydrogen atoms, $L_1$ which is not a single bond, b which is not a single bond, $Ar_1$, and $Ar_2$ is a deuterium atom. Alternatively, at least one of $R_1$ to $R_8$ is a deuterium atom, as well as at least one hydrogen atom possessed by one or more groups selected from $R_1$ to $R_8$ which are not hydrogen atoms, $L_1$ which is not a single bond, b which is not a single bond, $Ar_1$, and $Ar_2$ is a deuterium atom.

In an organic EL device according to an aspect of the invention, based on the total amount of a compound represented by the formula (1) and a compound having the same structure as the compound represented by the formula (1) except that only protium atoms are contained as hydrogen atoms (hereinafter also referred to as a "protium compound"), the content proportion of the latter in the emitting layer is preferably 99 mol % or less. The proportion of the protium compound is confirmed by mass spectrometry.

All of $R_1$ to $R_8$ may be deuterium atoms, or some (e.g. one or two) of $R_1$ to $R_8$ may be deuterium atoms.

$R_1$ to $R_8$ which are not deuterium atoms are preferably protium atoms.

A first aspect of the compound represented by the formula (1) is a compound represented by the following formula (1 A).

(1A)

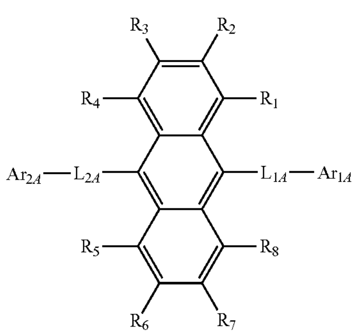

In the formula (1A), $R_1$ to $R_8$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})$ $(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of $R_{901}$ to $R_{907}$ are present, the two or more of each of $R_{901}$ to $R_{907}$ may be the same as or different from each other.

At least one of $R_1$ to $R_8$ is a deuterium atom.

Adjacent two or more of $R_1$ to $R_4$, and adjacent two or more of $R_5$ to $R_8$ do not form a ring by bonding with each other.

$L_{1A}$ and $L_{2A}$ are independently a single bond, a substituted or unsubstituted phenylene group, a substituted or unsubstituted naphthylene group, a substituted or unsubstituted biphenyldiyl group, a substituted or unsubstituted terphenylene group, a substituted or unsubstituted anthrylene group, or a substituted or unsubstituted phenanthrylene group.

An $Ar_{1A}$ and $Ar_{2A}$ are independently a substituted or unsubstituted phenyl group, a substituted or unsubstituted naphthyl group, a substituted or unsubstituted biphenyl group, a substituted or unsubstituted terphenyl group, a substituted or unsubstituted anthryl group, or a substituted or unsubstituted phenanthryl group.

The substituent when $L_{1A}$, $L_{2A}$, $Ar_{1A}$, and $Ar_{2A}$ have a substituent is an alkyl group including 1 to 50 carbon atoms, an alkenyl group including 2 to 50 carbon atoms, an alkynyl group including 2 to 50 carbon atoms, a cycloalkyl group including 3 to 50 ring carbon atoms, an alkylsilyl group including 1 to 50 carbon atoms, a halogen atom, or a cyano group.

All of $R_1$ to $R_8$ may be deuterium atoms, or some (e.g. one or two) of $R_1$ to $R_8$ may be deuterium atoms.

$R_1$ to $R_8$ which are not deuterium atoms are preferably hydrogen atoms (protium atoms).

In one embodiment, at least one hydrogen atom possessed by one or more selected from the group consisting of $L_{1A}$ and $L_{2A}$ is a deuterium atom. Specifically, in one embodiment, one or more selected from the group consisting of $L_{1A}$ and $L_{2A}$ is an unsubstituted phenylene group in which at least one of the hydrogen atom is a deuterium atom, an unsubstituted naphthylene group in which at least one of the hydrogen atom is a deuterium atom, an unsubstituted biphenyldiyl group in which at least one of the hydrogen atom is a deuterium atom, an unsubstituted terphenylene group in which at least one of the hydrogen atom is a deuterium atom, an unsubstituted anthrylene group in which at least one of the hydrogen atom is a deuterium atom, or an unsubstituted phenanthrylene group in which at least one of the hydrogen atom is a deuterium atom.

In one embodiment, $L_{1A}$ and $L_{2A}$ are independently a single bond, a substituted or unsubstituted phenylene group, or a substituted or unsubstituted naphthylene group. Preferably, at least one of $L_{1A}$ and $L_{2A}$ is a single bond.

In one embodiment, at least one hydrogen atom possessed by one or more selected from the group consisting of $Ar_{1A}$ and $Ar_{2A}$ is deuterium atom. Specifically, in one embodiment, one or more selected from the group consisting of $Ar_{1A}$ and $Ar_{2A}$ is an unsubstituted phenyl group in which at least one of the hydrogen atoms is a deuterium atom, an unsubstituted naphthyl group in which at least one of the hydrogen atoms is a deuterium atom, an unsubstituted biphenyl group in which at least one of the hydrogen atoms is a deuterium atom, an unsubstituted terphenyl group in which at least one of the hydrogen atoms is a deuterium atom, an unsubstituted anthryl group in which at least one of the hydrogen atoms is a deuterium atom, or an unsubstituted phenanthryl group in which at least one of the hydrogen atoms is a deuterium atom.

In one embodiment, $Ar_{1A}$ and $Ar_{2A}$ are independently a substituted or unsubstituted phenyl group, a substituted or unsubstituted naphthyl group, or a substituted or unsubstituted phenanthryl group.

The compound represented by the formula (1 A) within the scope of the invention can be synthesized in accordance with the synthetic methods described in Examples by using known alternative reactions or raw materials tailored to the target compound.

Specific examples of the compound represented by the formula (1 A) include the following compounds. In the following specific examples, "D" represents a deuterium atom.

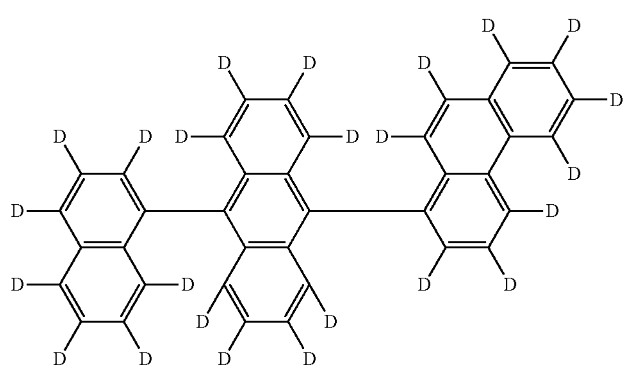

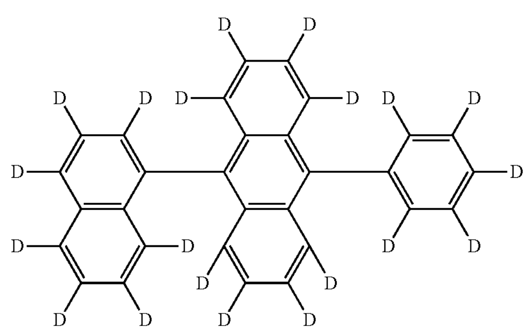

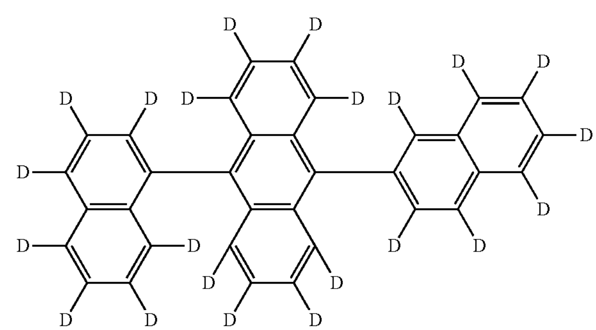

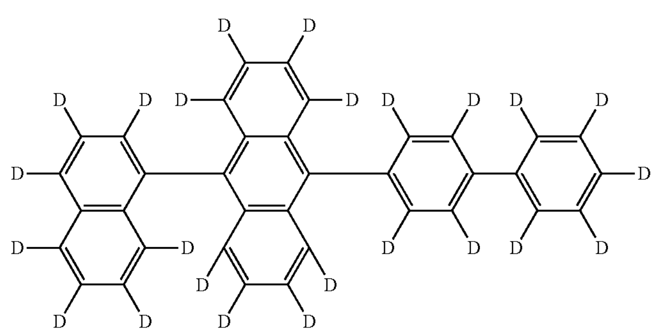

-continued
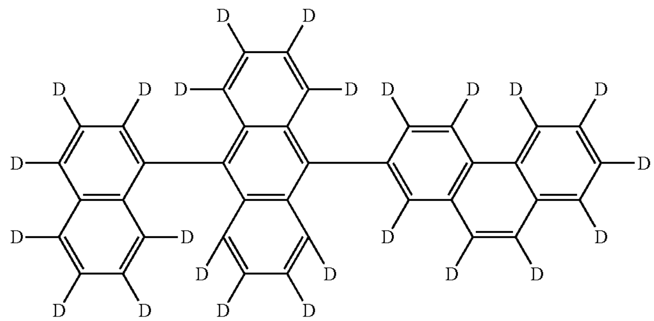
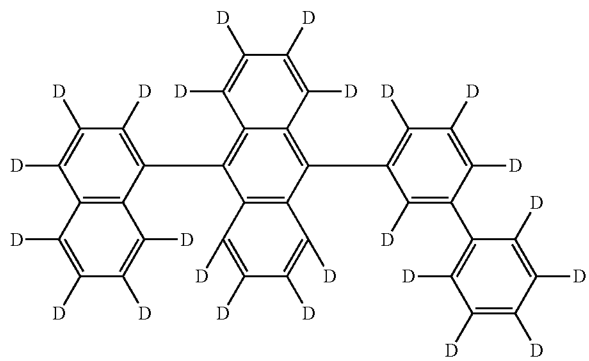
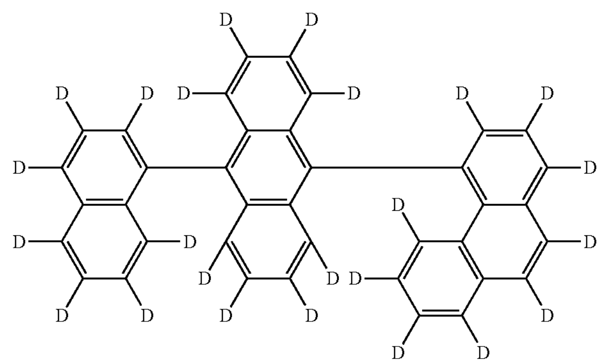
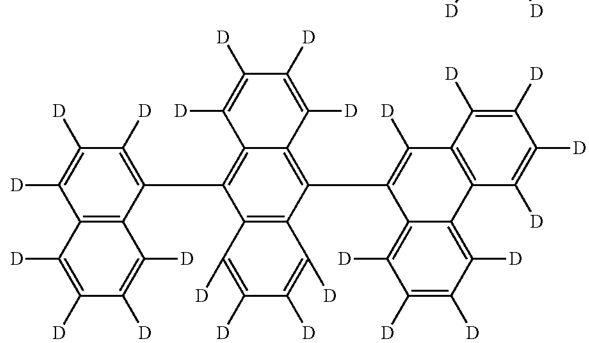
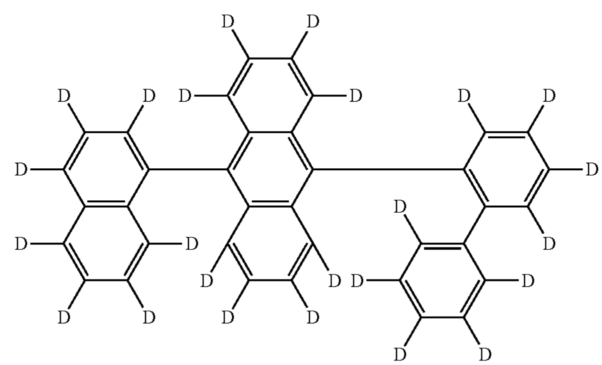
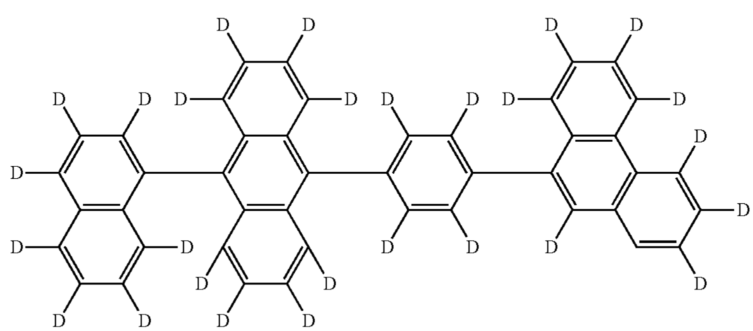
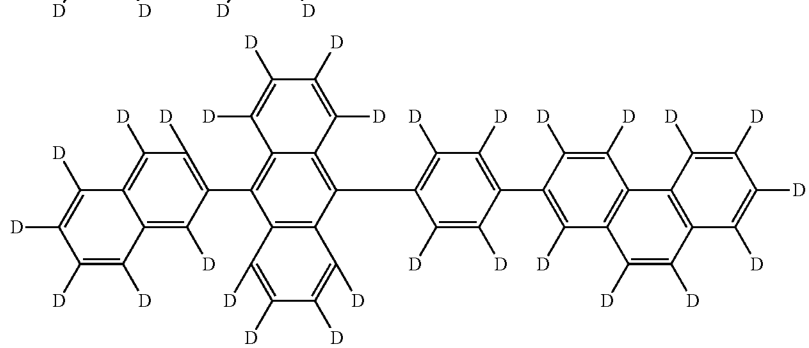

-continued
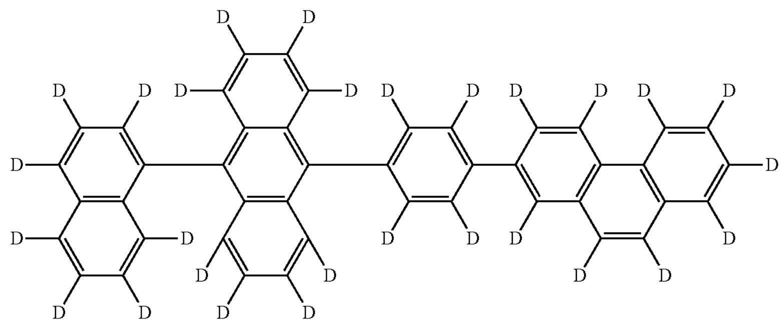
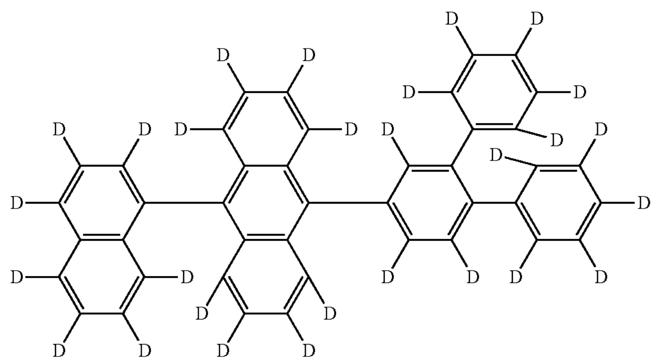
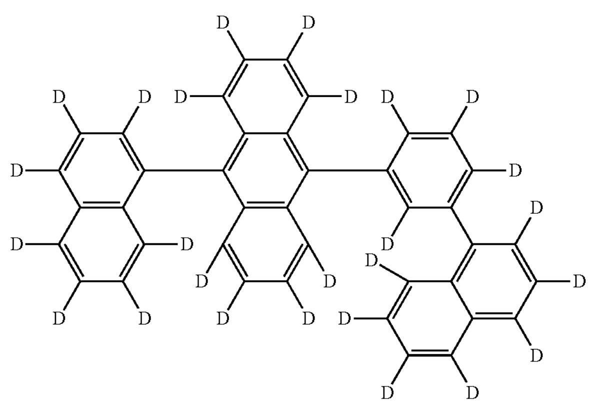
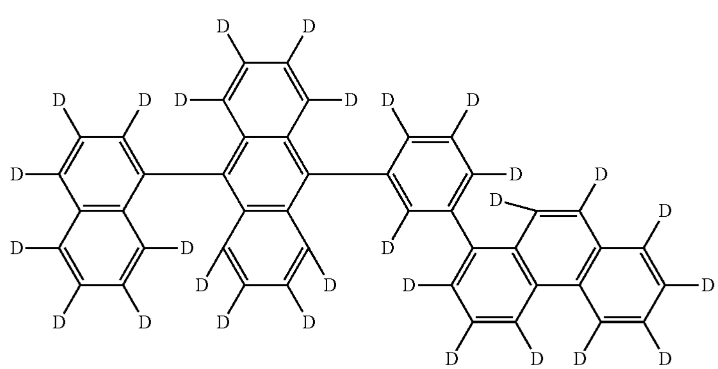

-continued
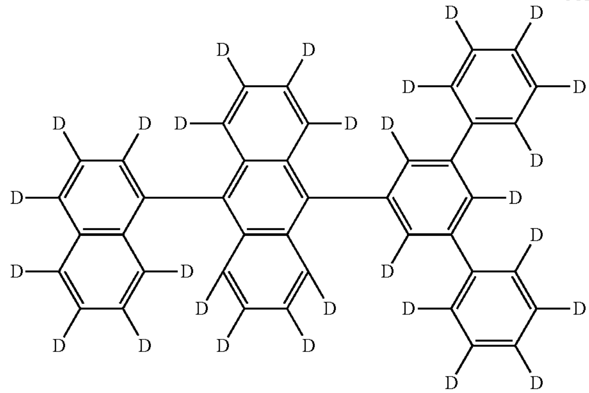
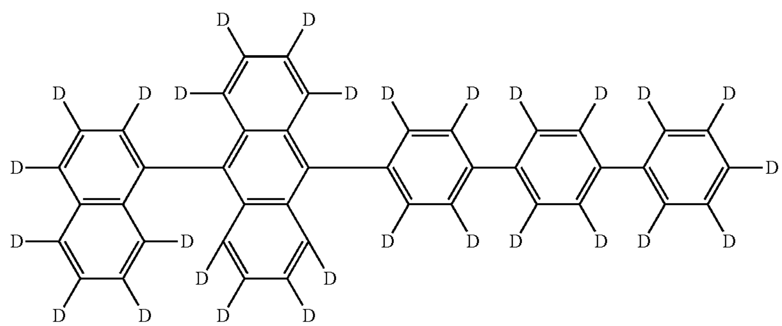
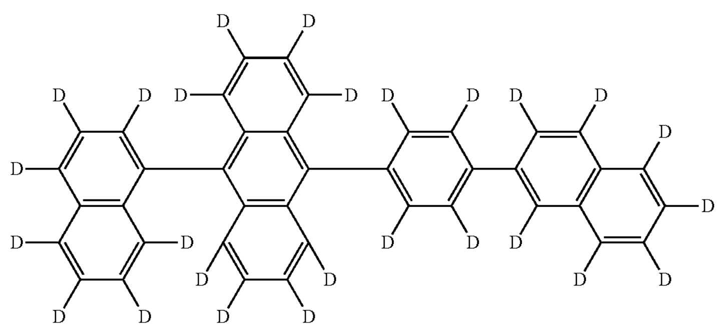
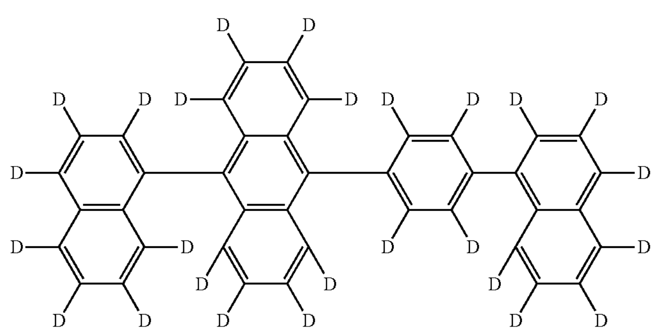

-continued
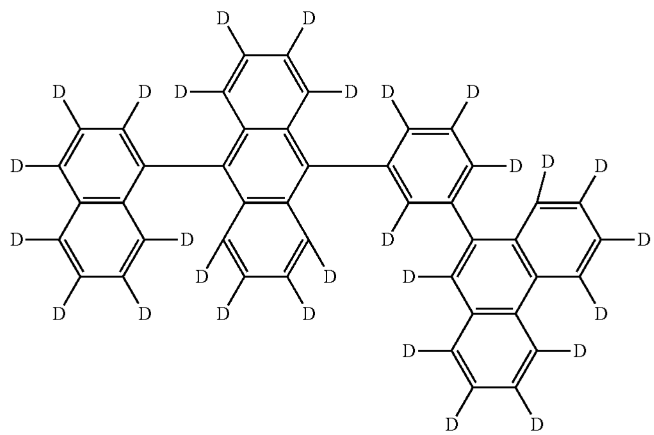
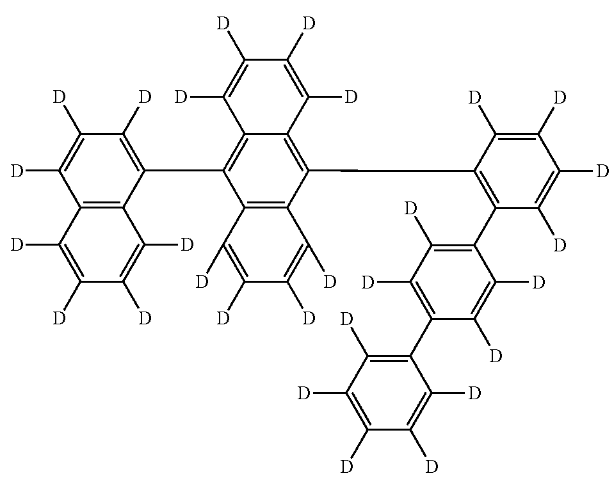
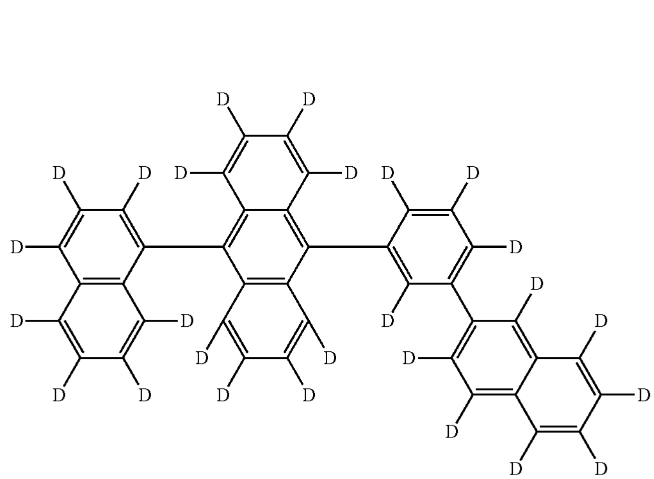

-continued
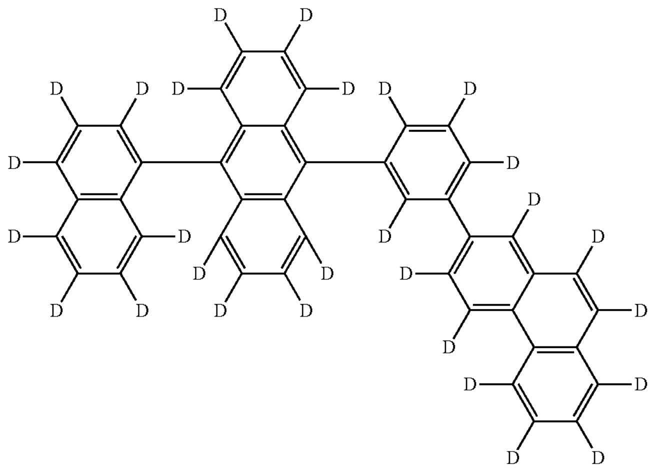
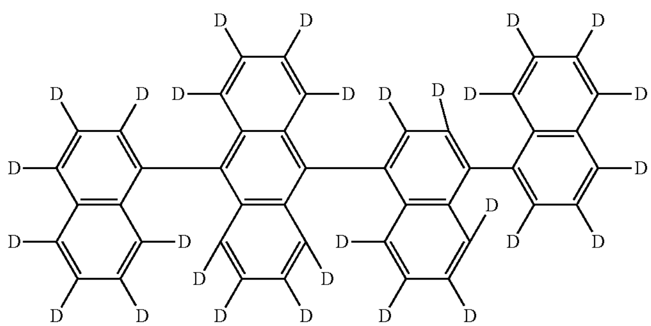
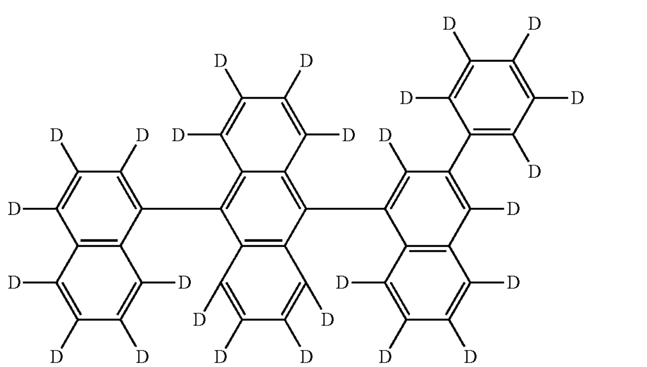
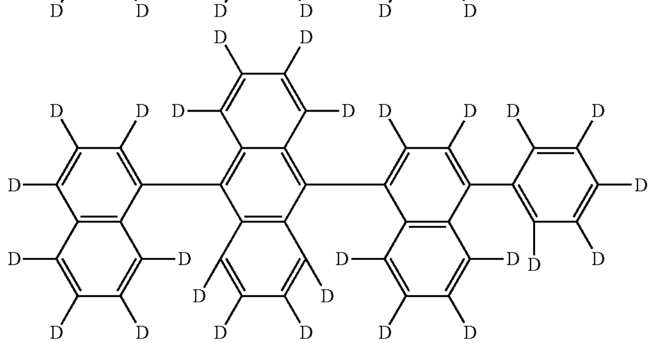

-continued
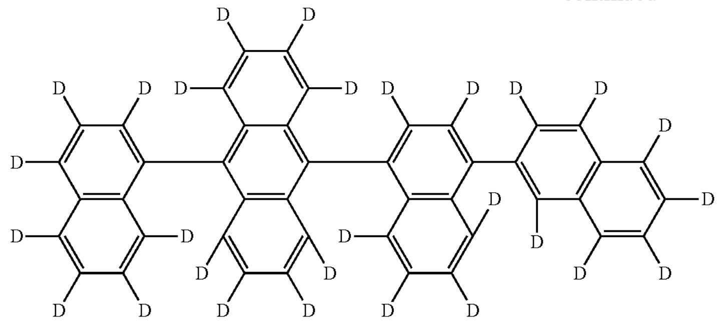
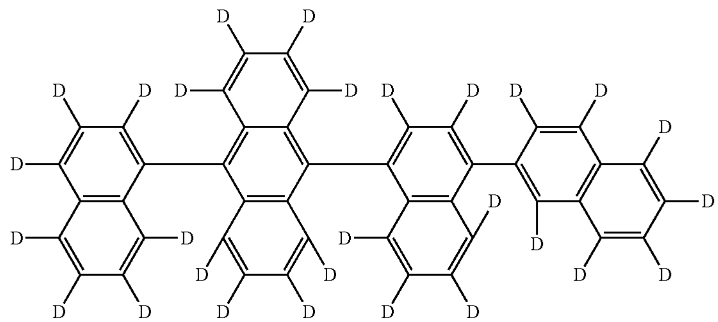
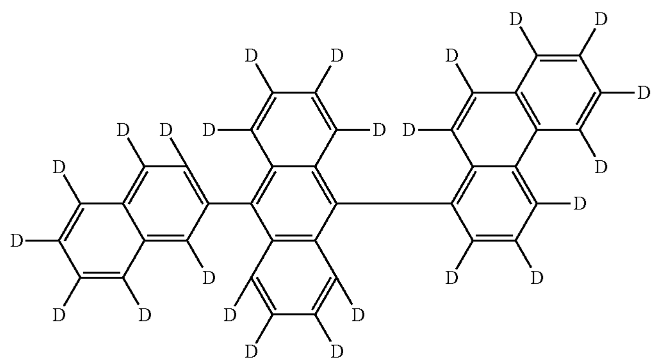
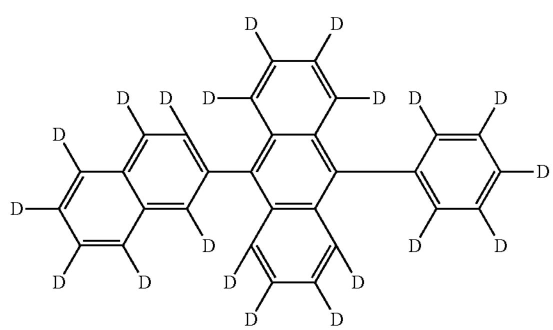
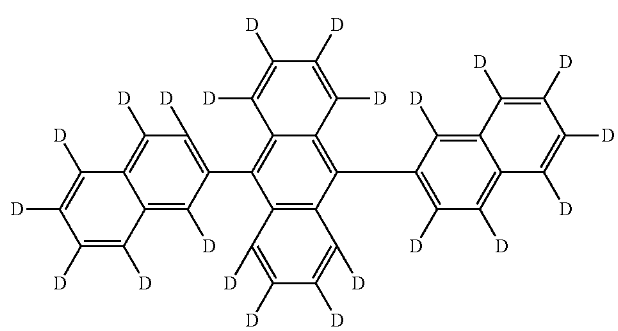
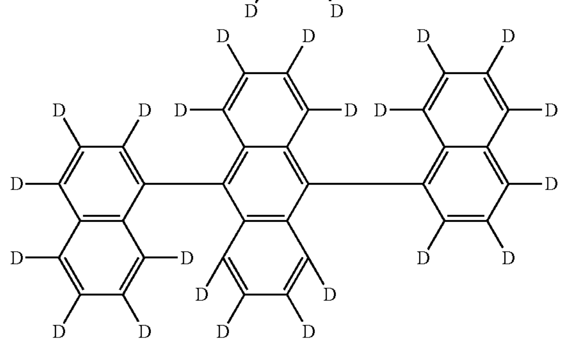

-continued
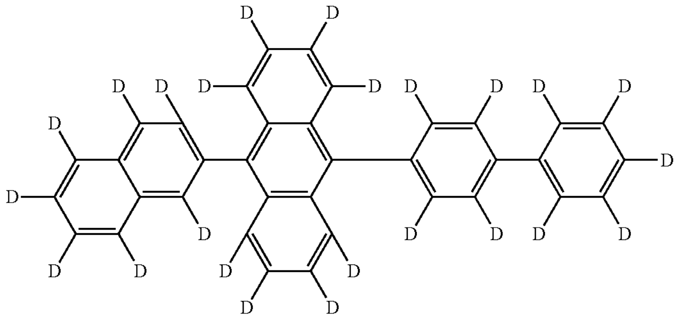
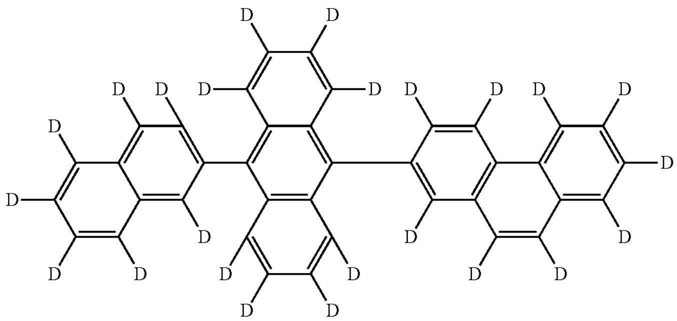
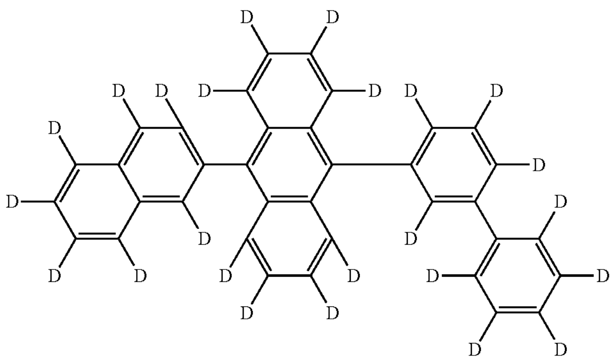
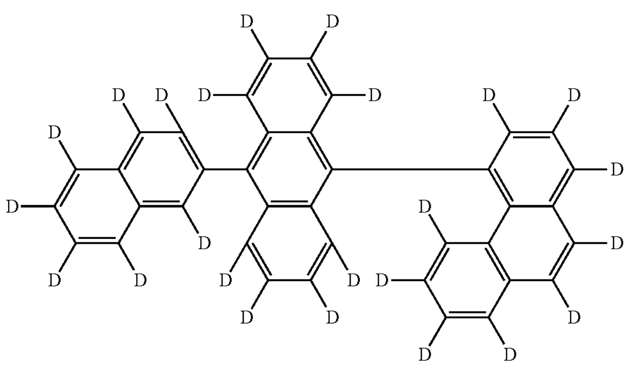
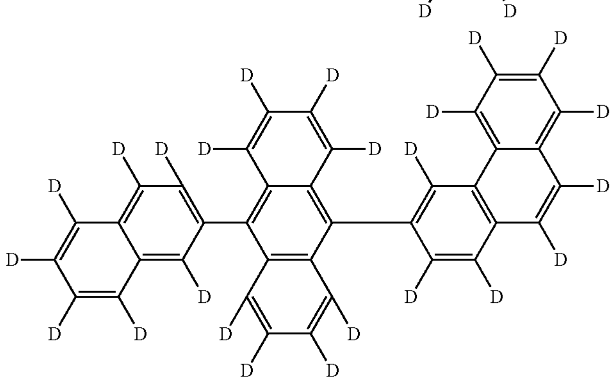

-continued
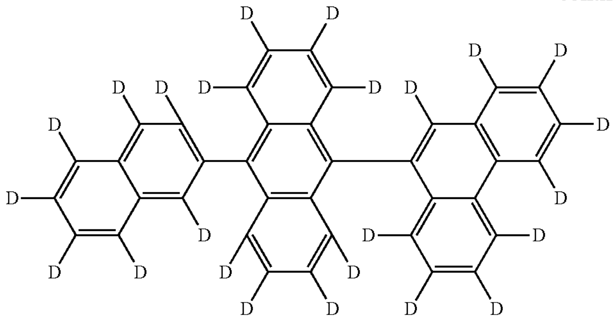
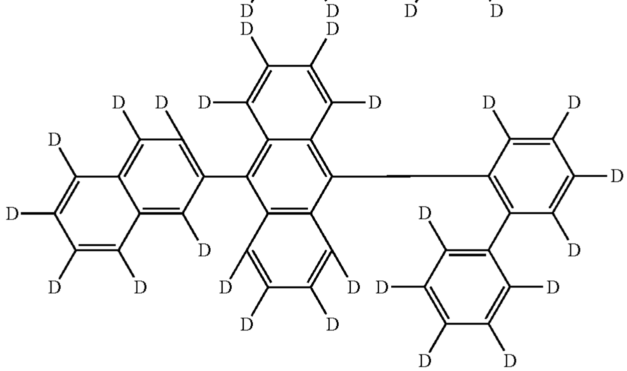
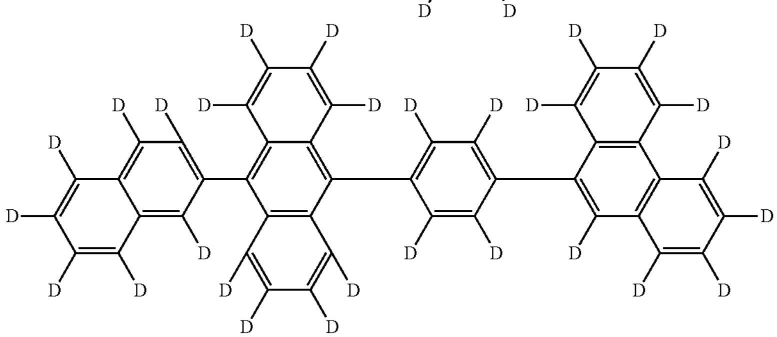
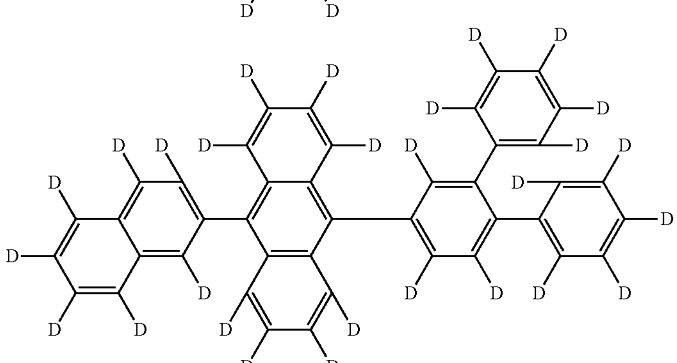
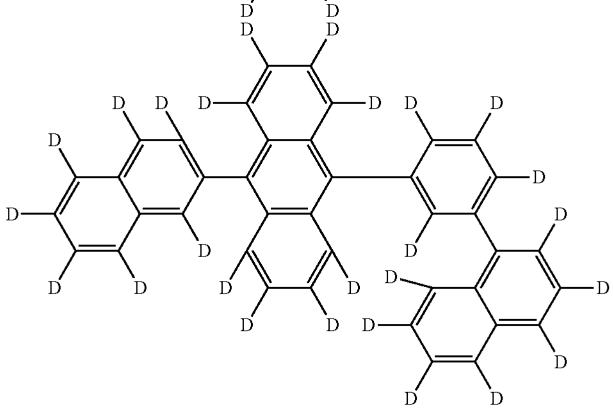

-continued
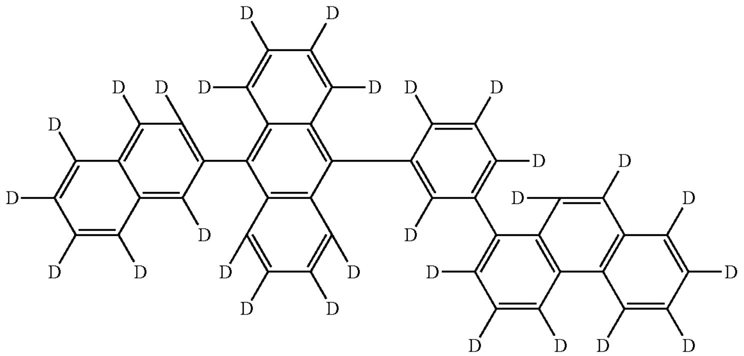
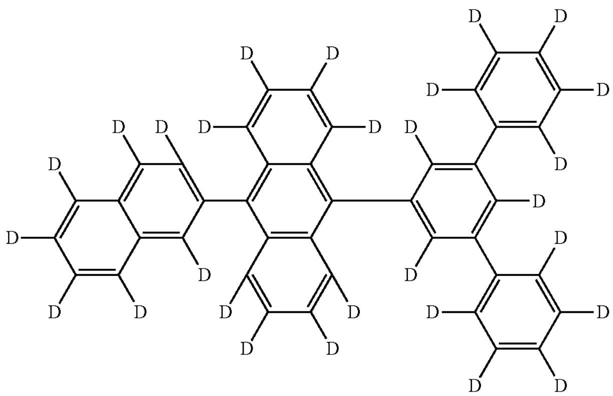
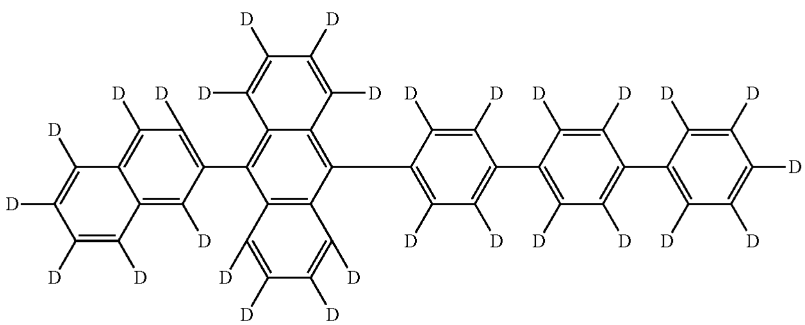
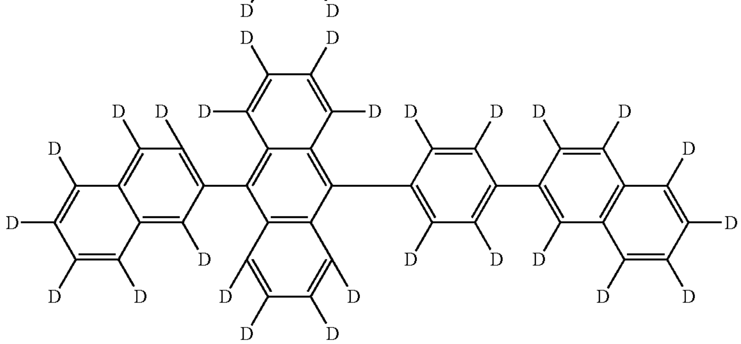
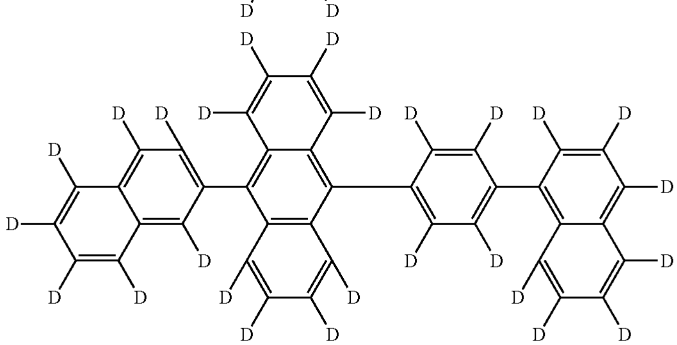

-continued
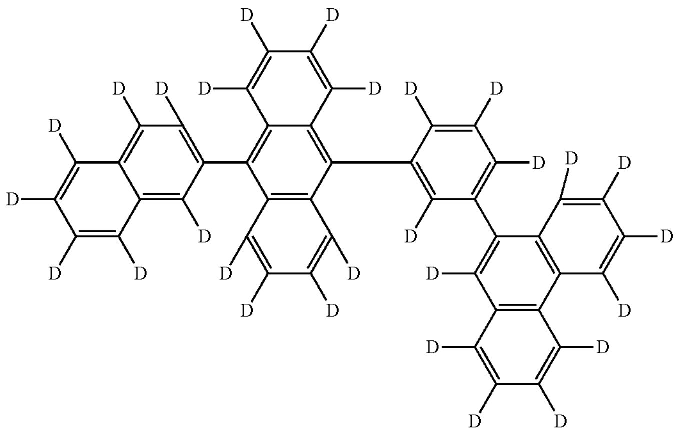
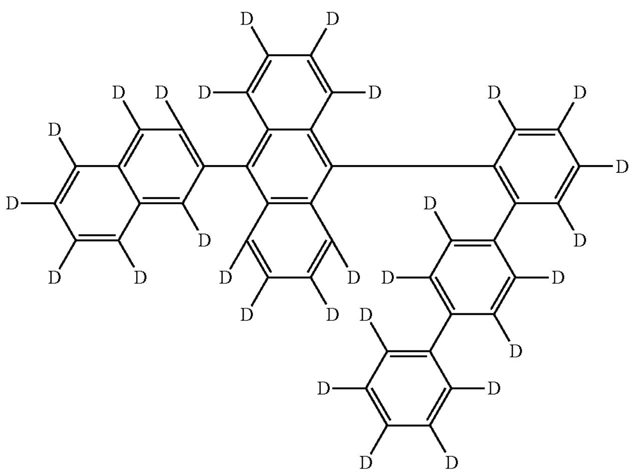
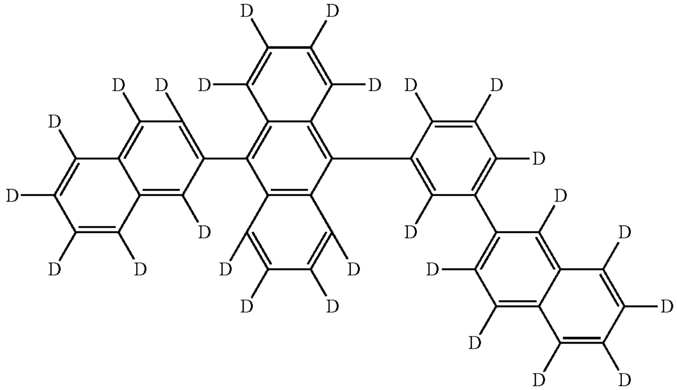

-continued
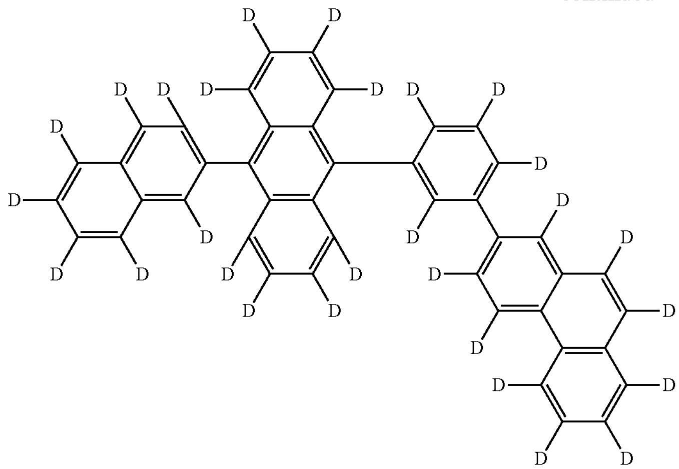
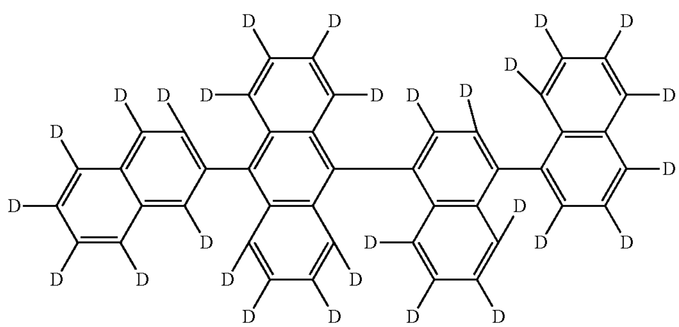
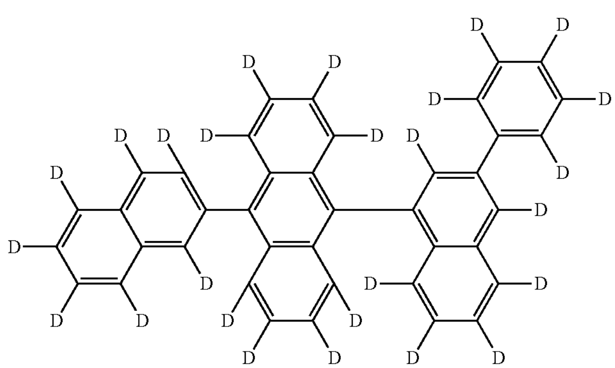
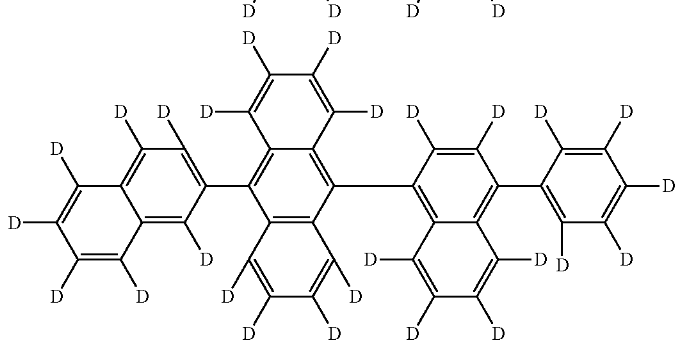

-continued
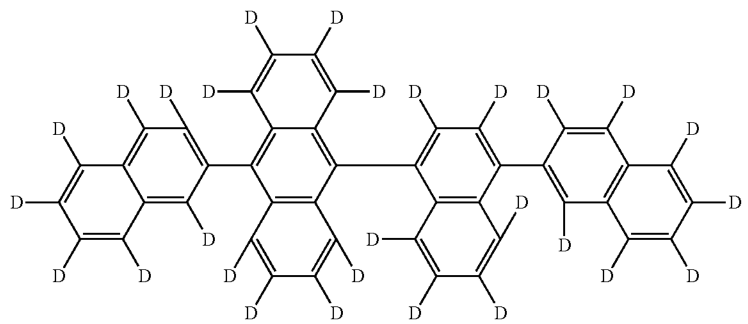
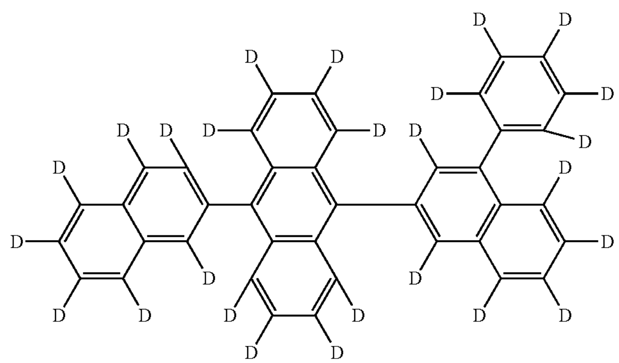
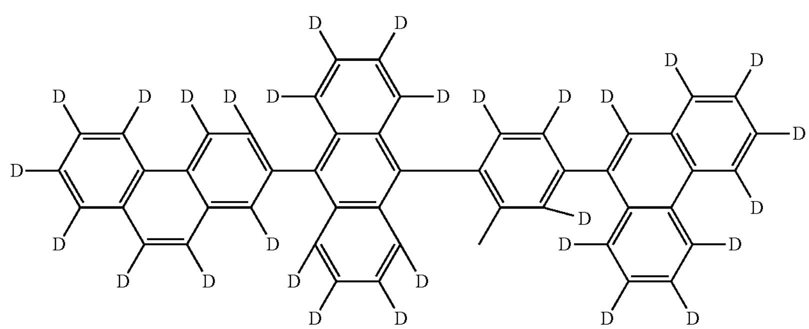
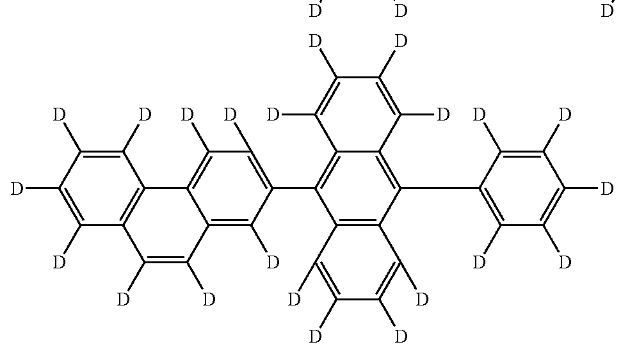
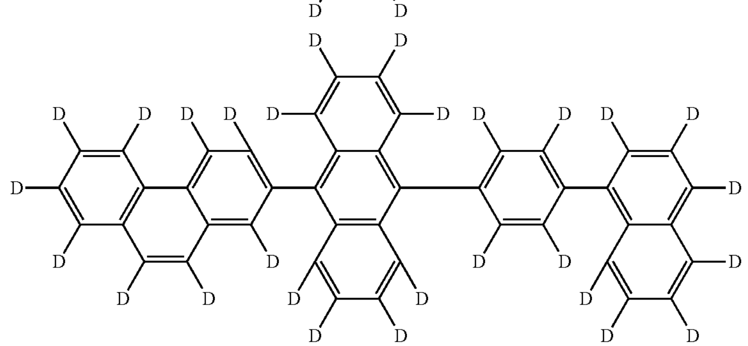

-continued
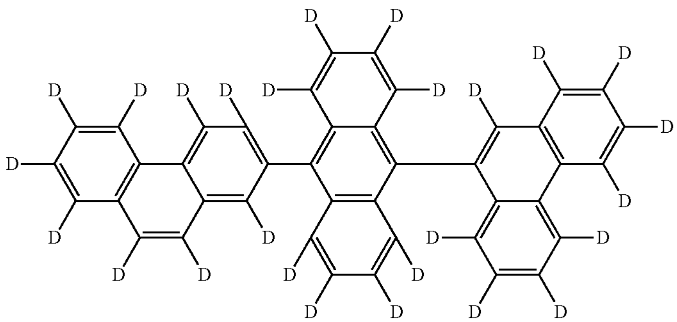
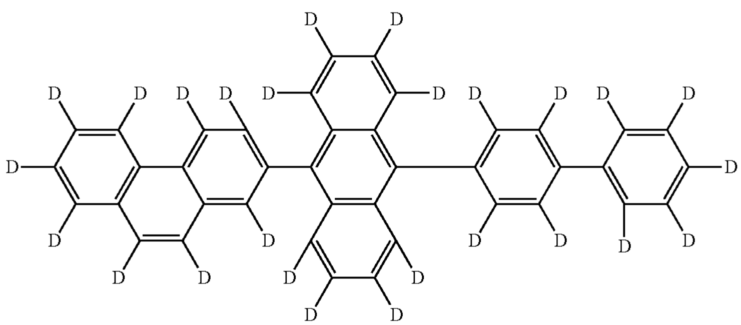
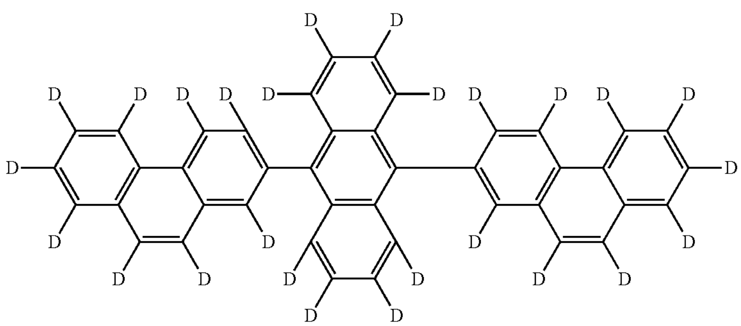
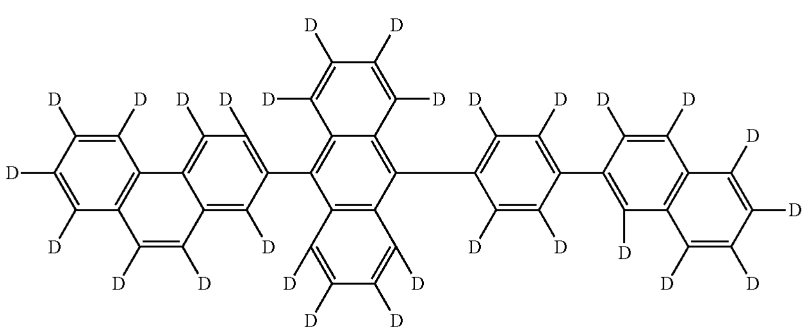
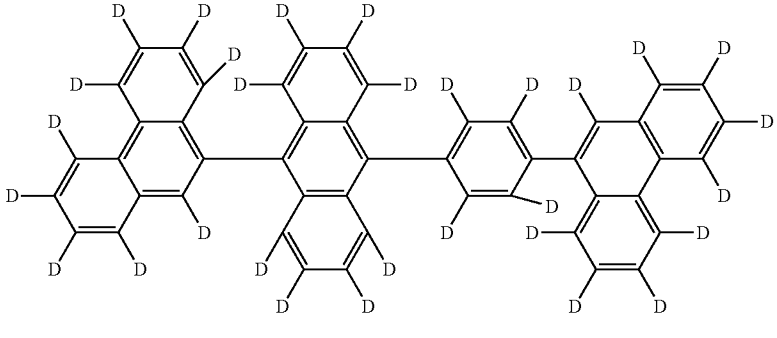

-continued
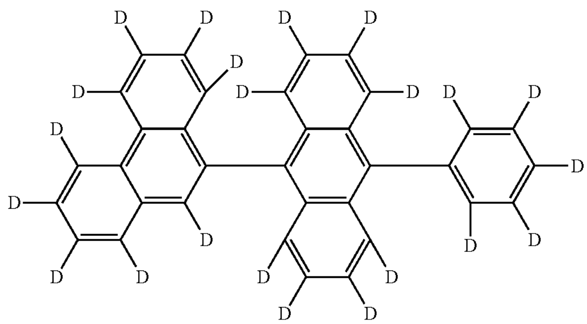
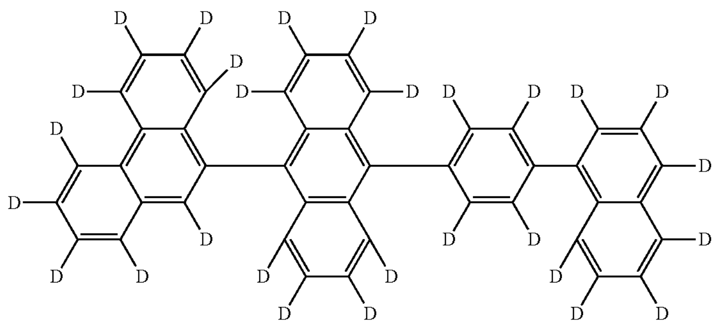
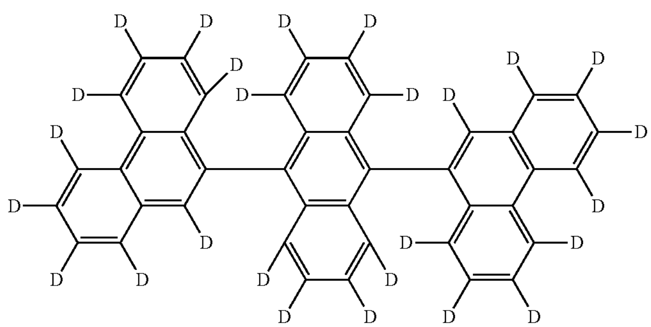
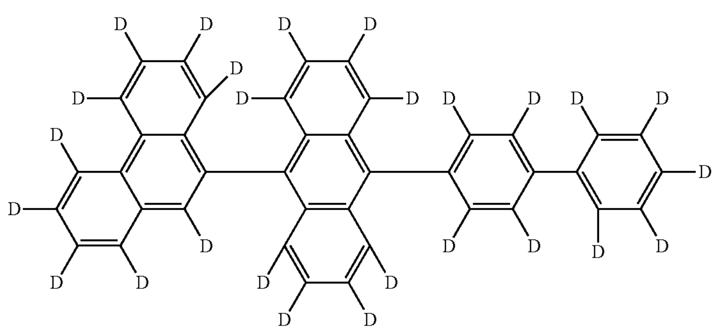
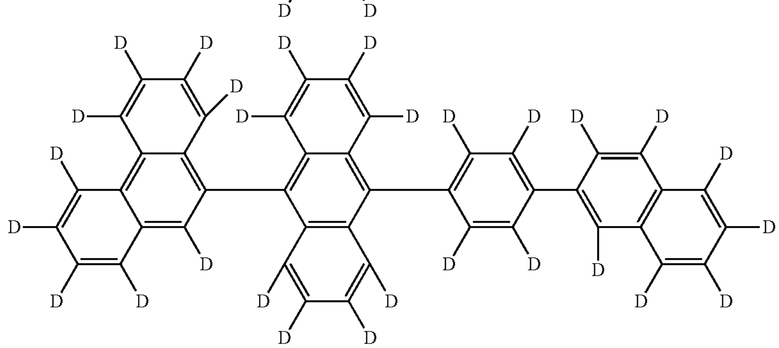

-continued
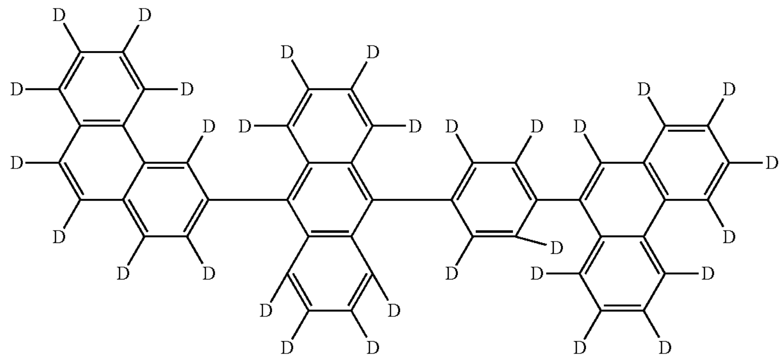
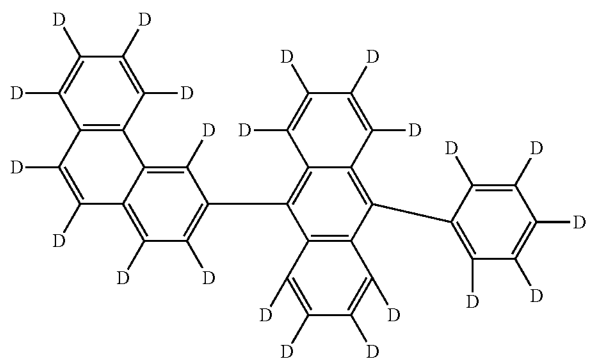
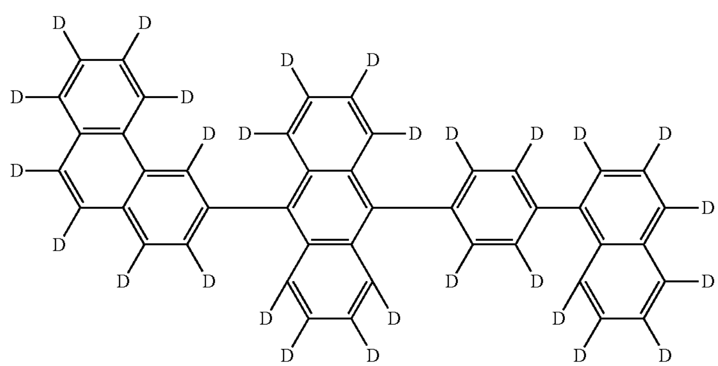
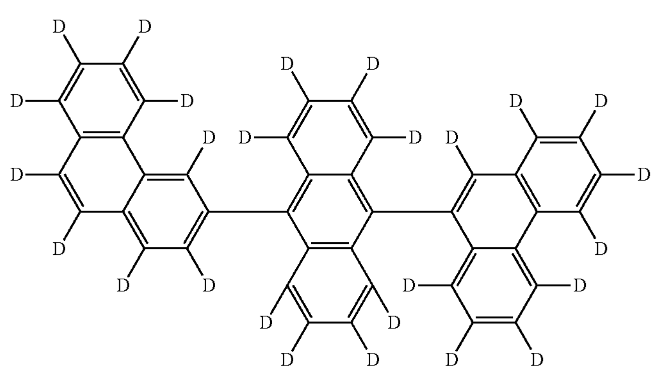

-continued
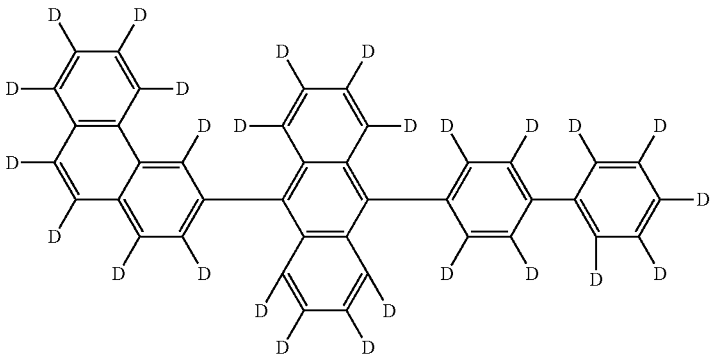
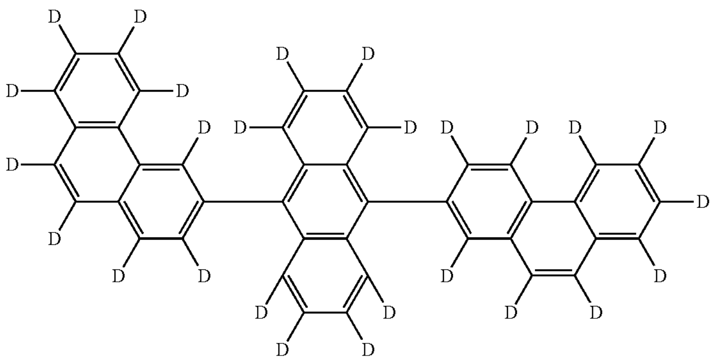
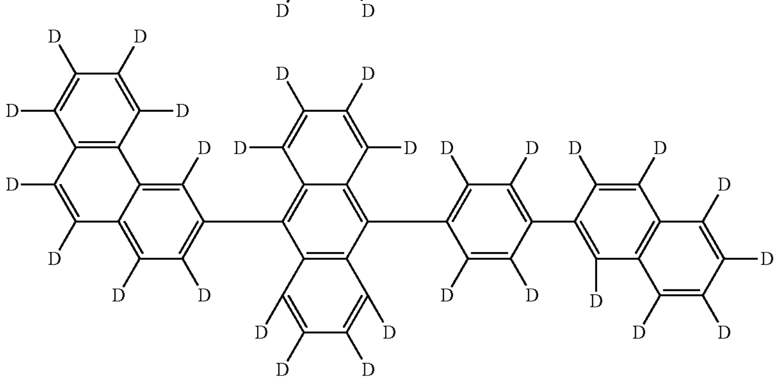
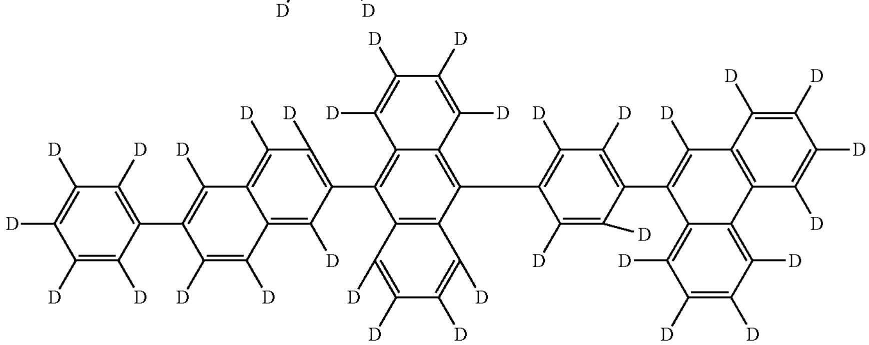
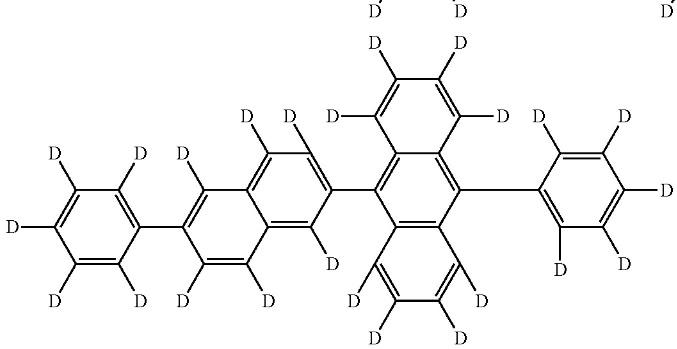

-continued
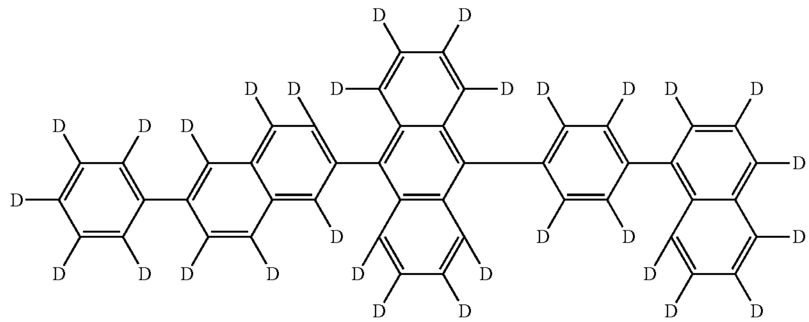
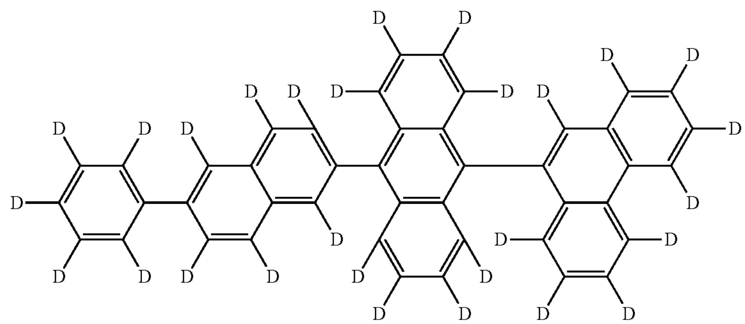
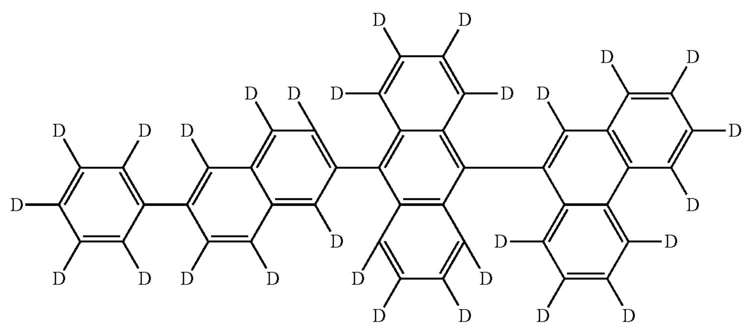
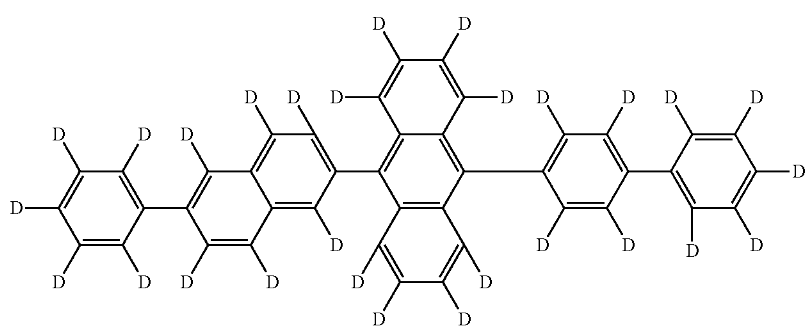
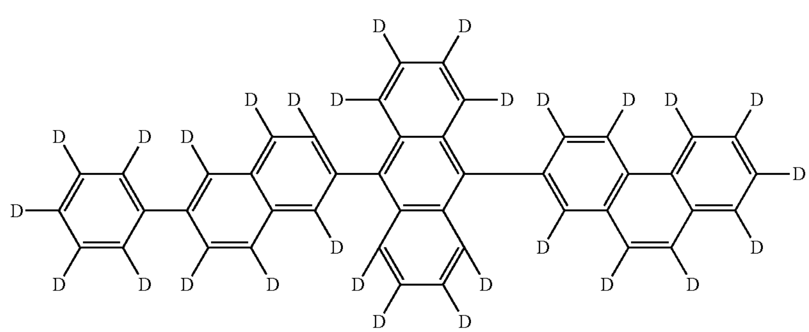

-continued
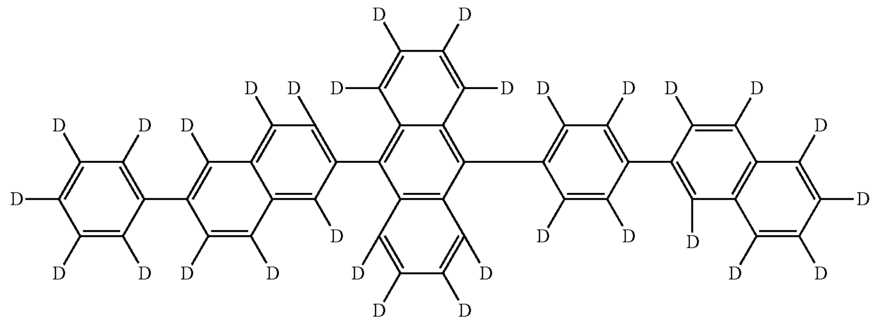
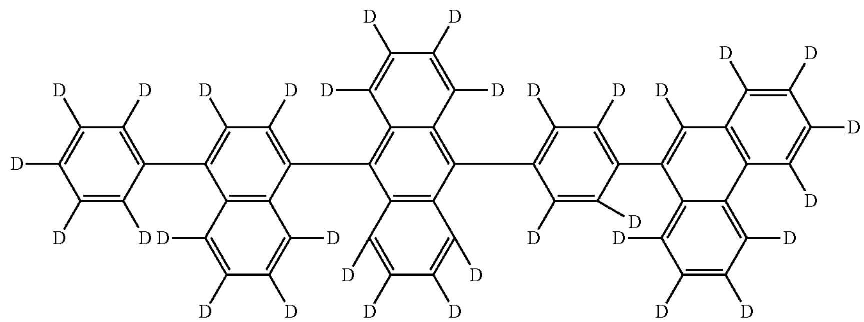
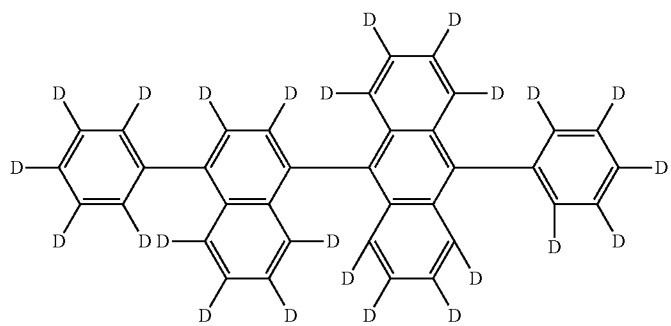
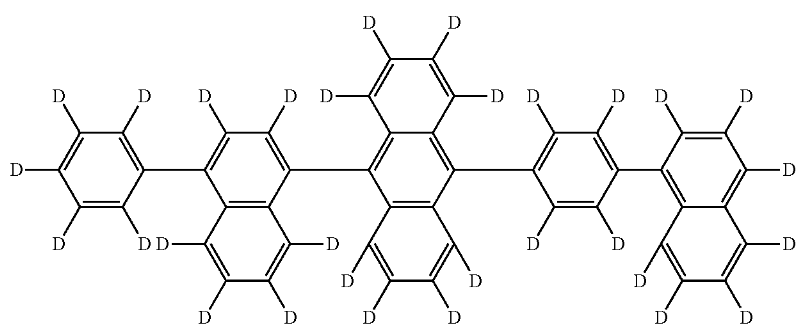
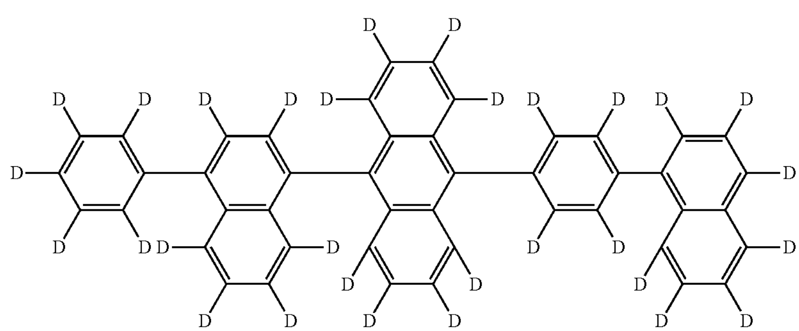

-continued
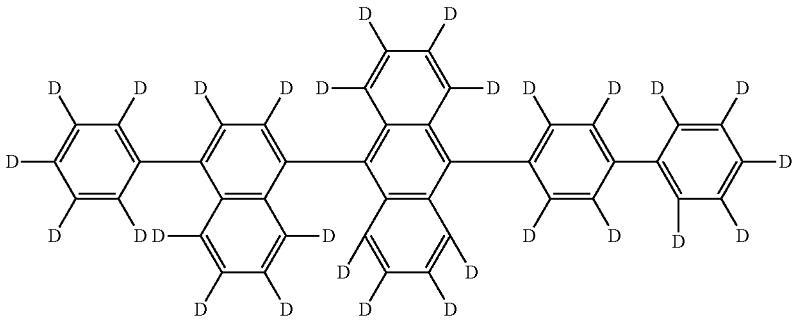
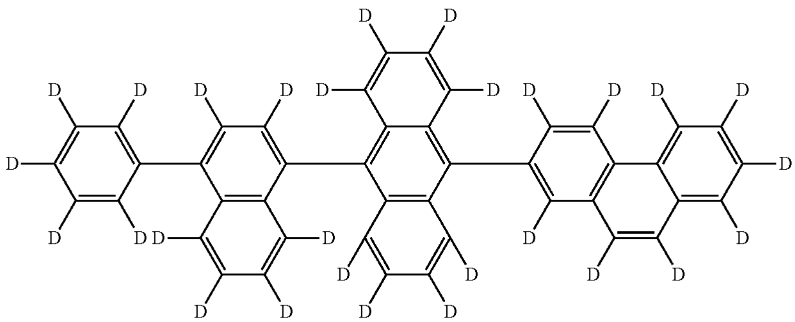
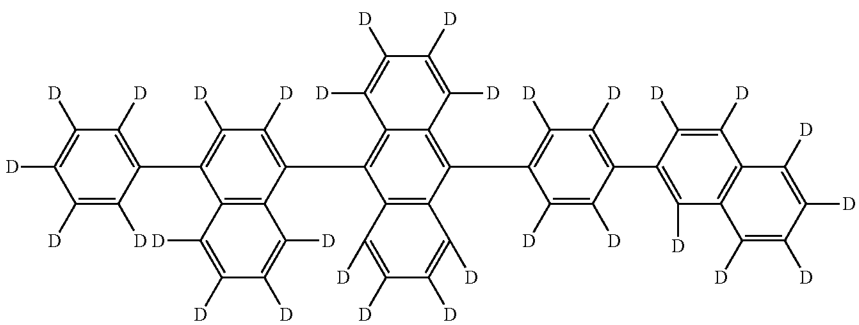
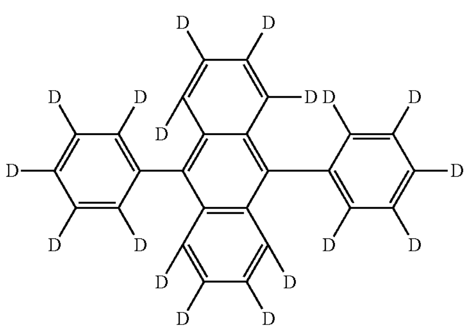
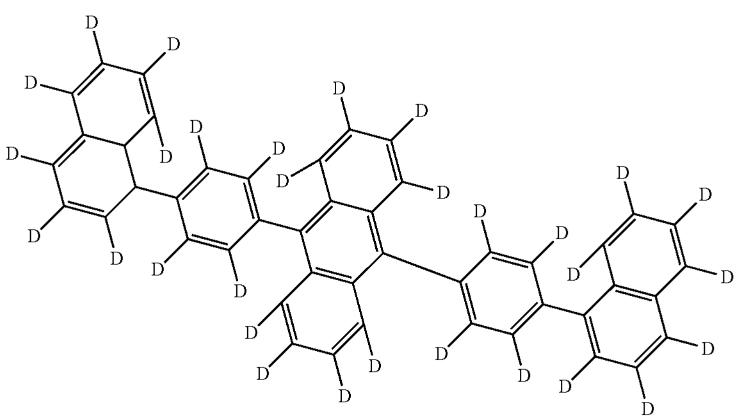

-continued
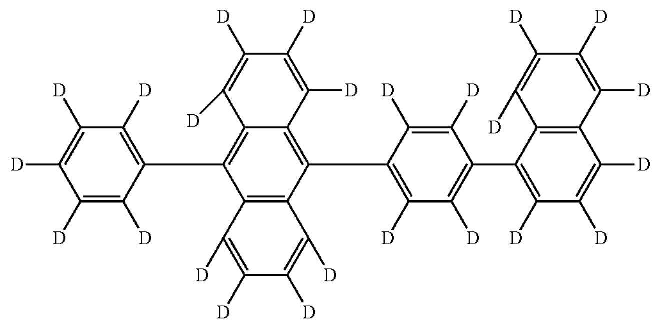
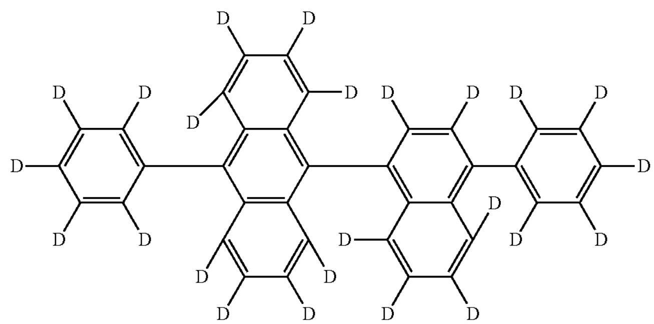
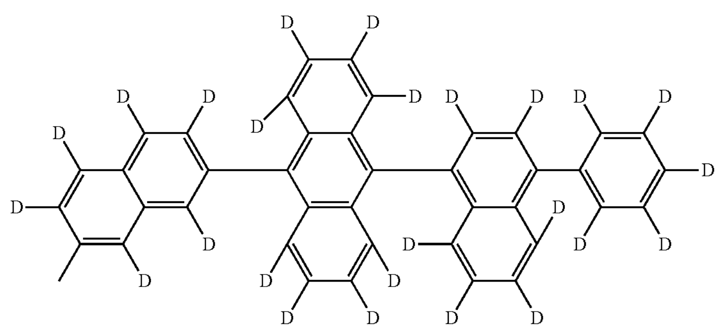
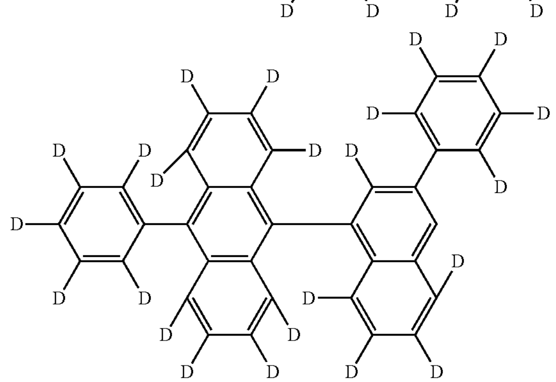
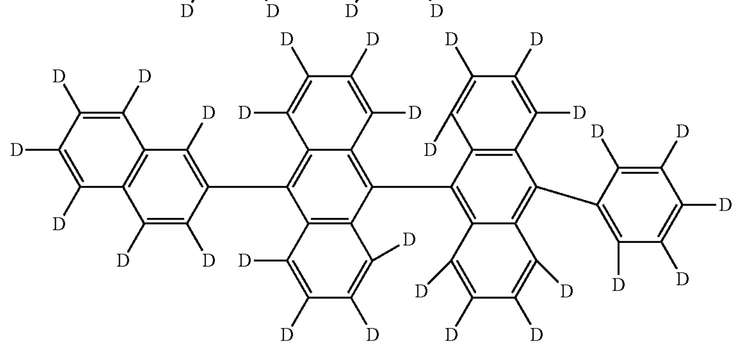

-continued
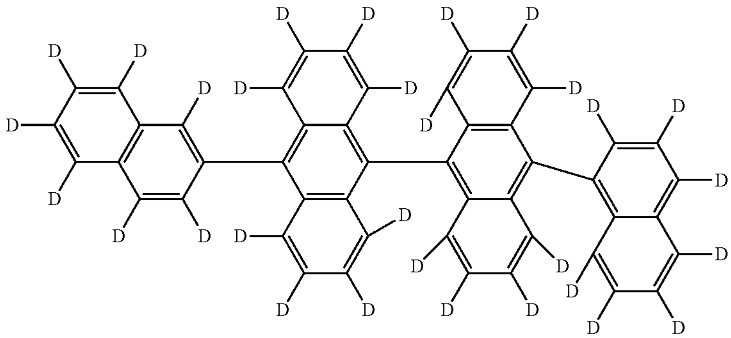
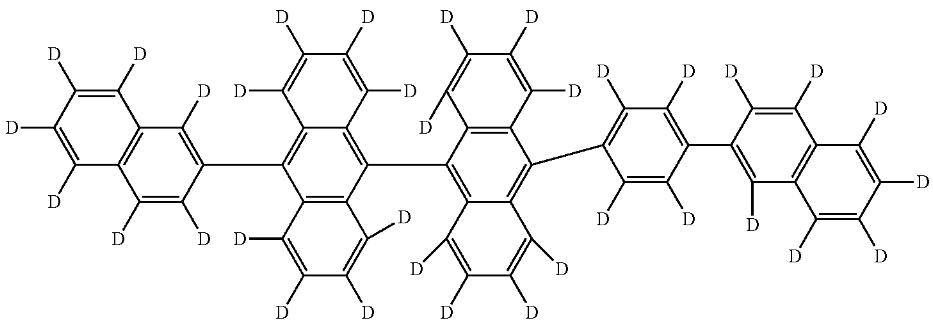
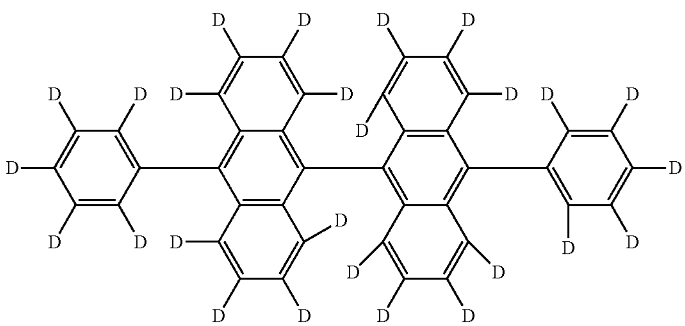
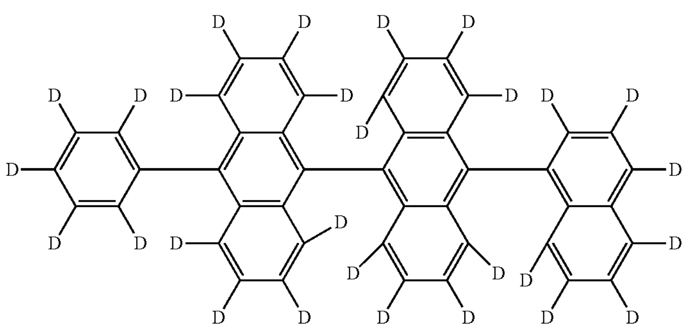
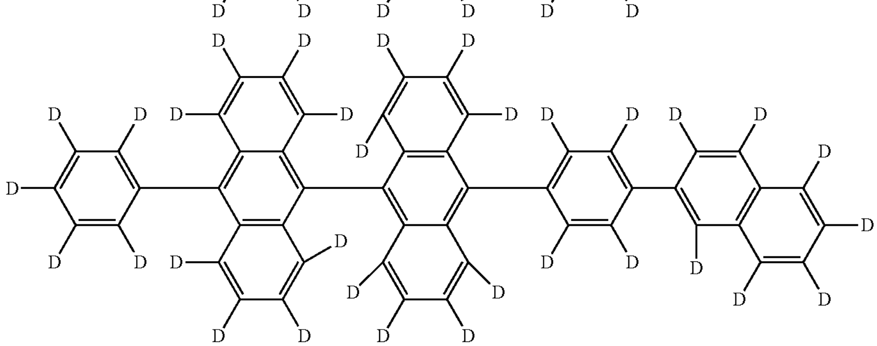

-continued
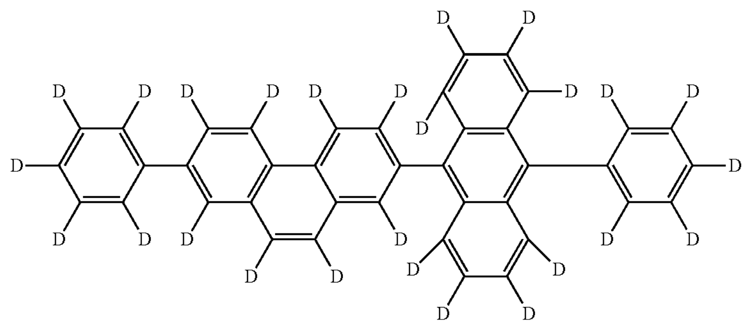
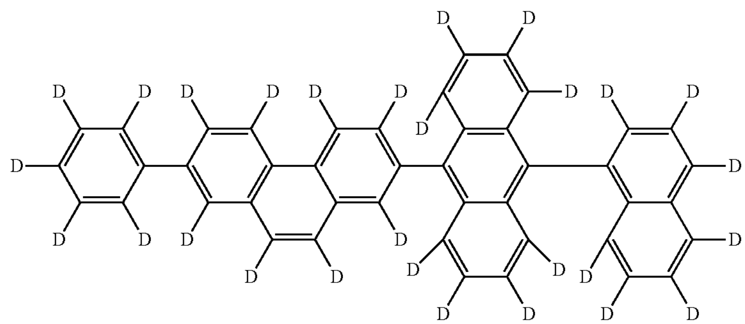
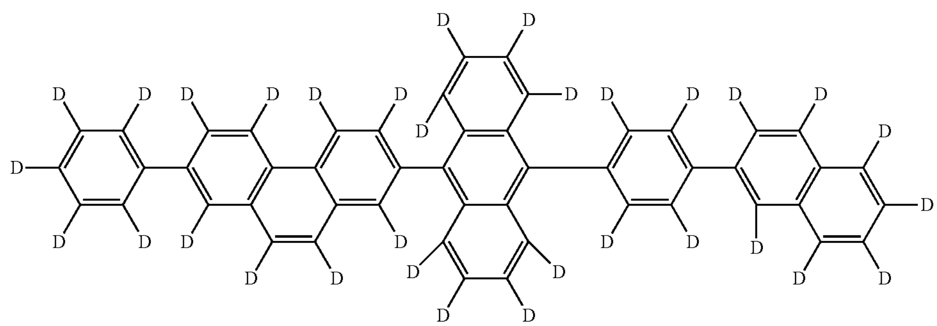
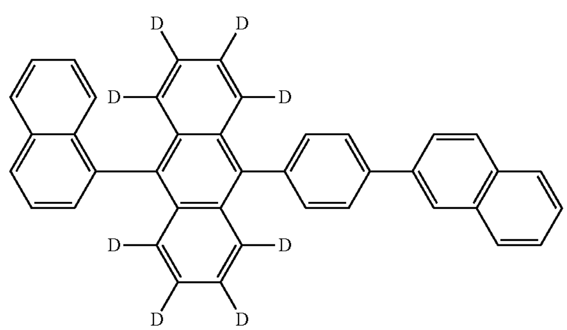
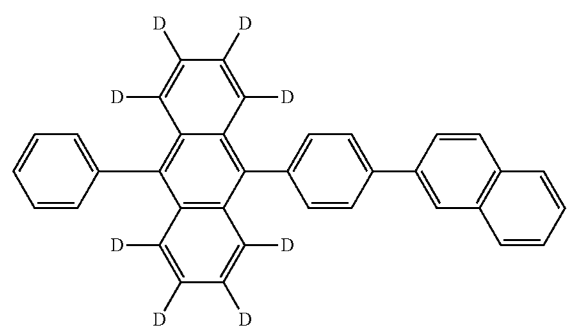
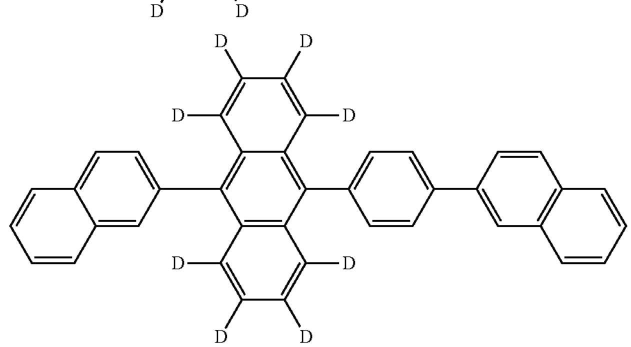
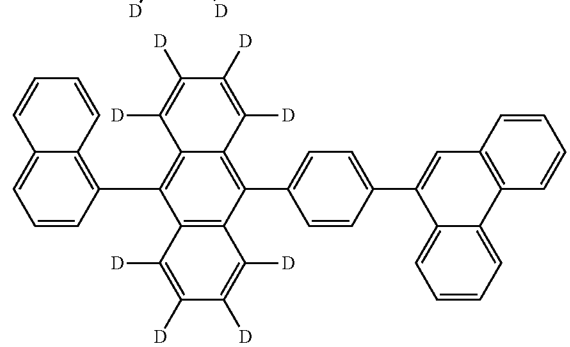

-continued
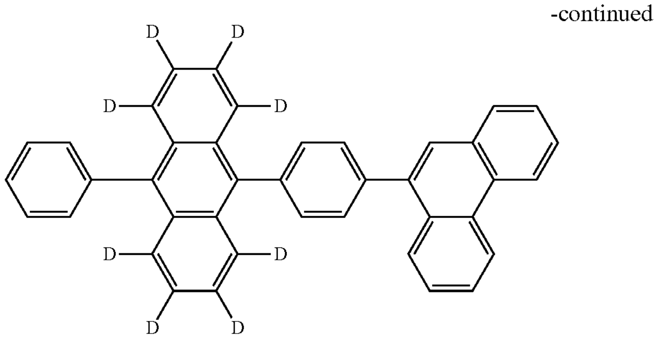
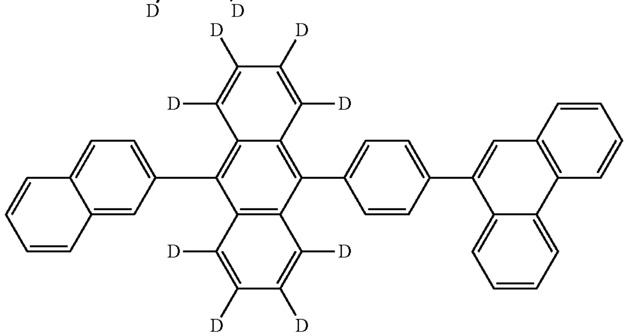
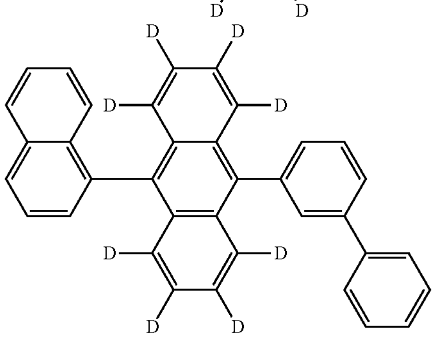
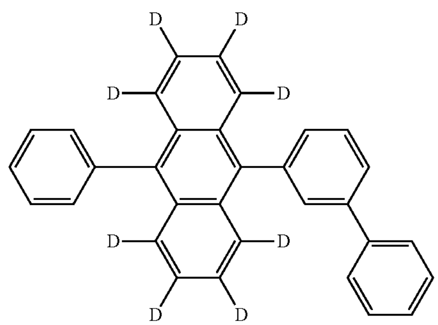
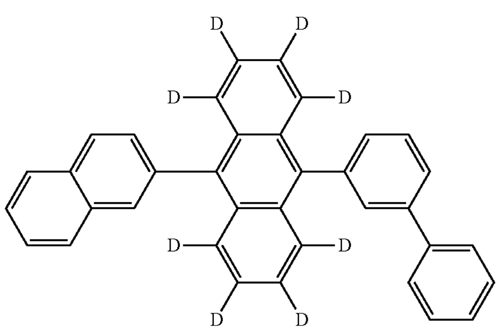
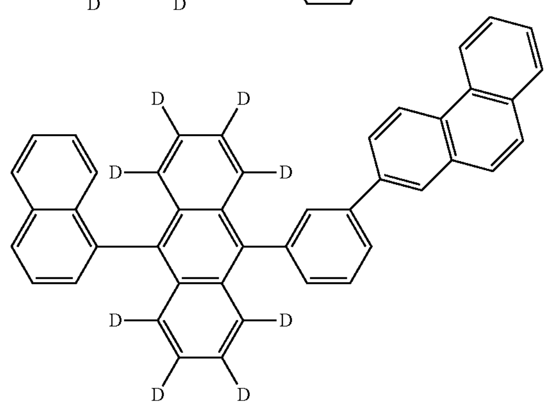
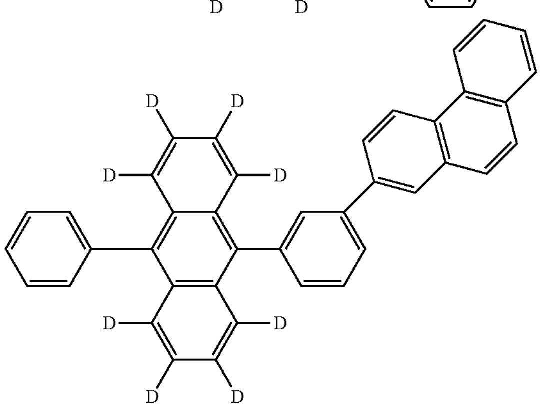
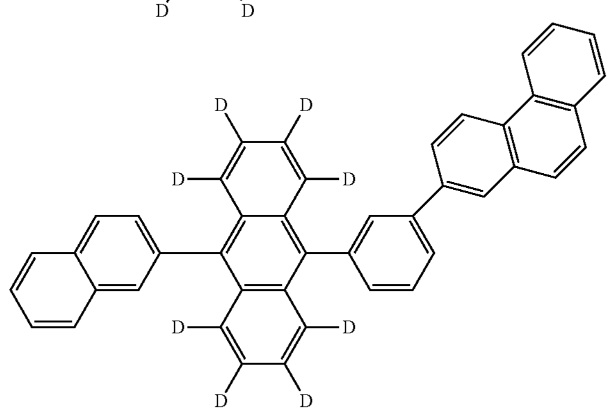

-continued
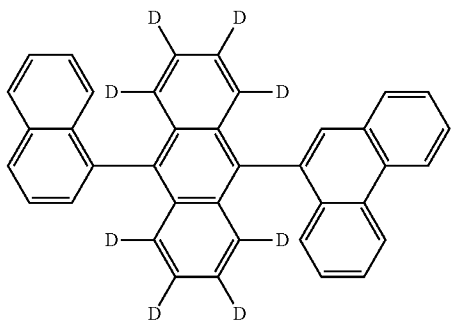
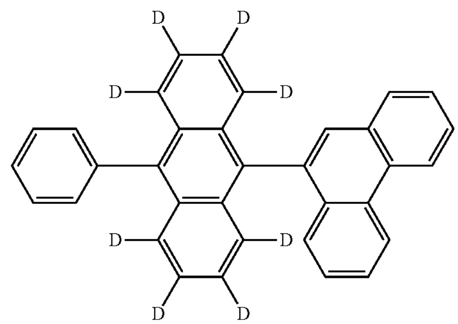
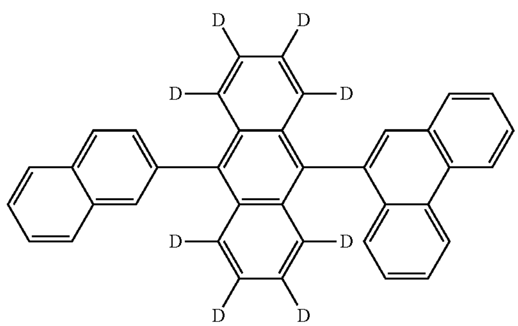
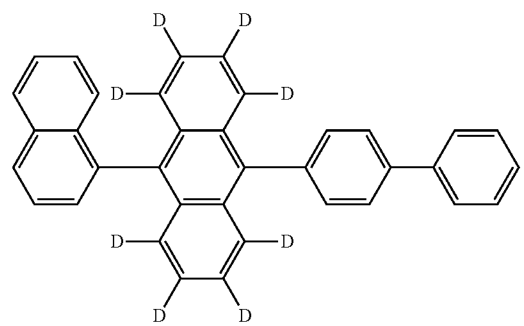
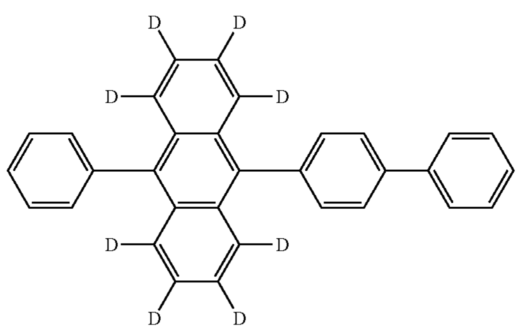
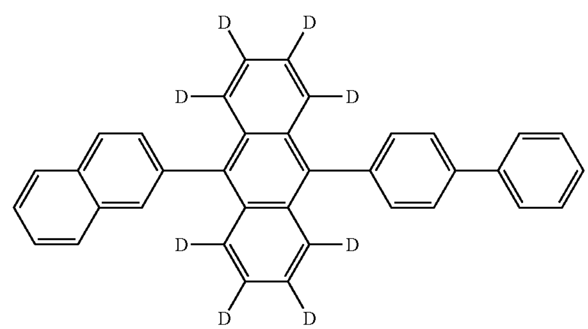
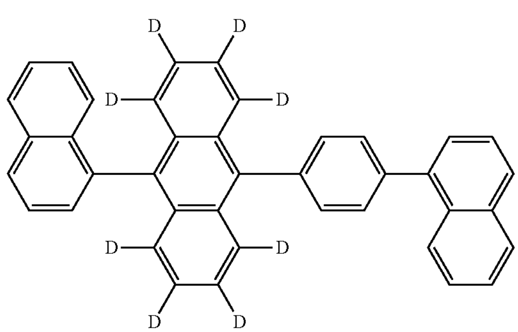
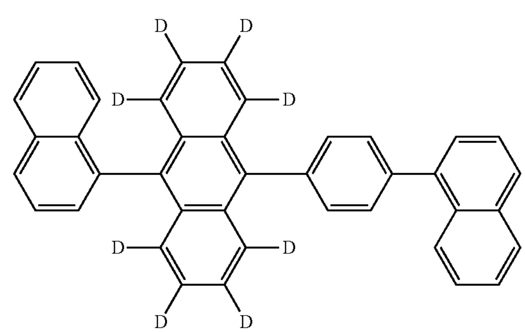
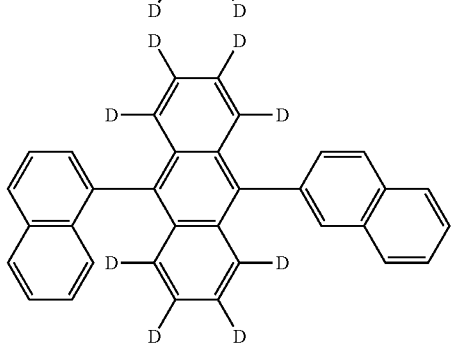
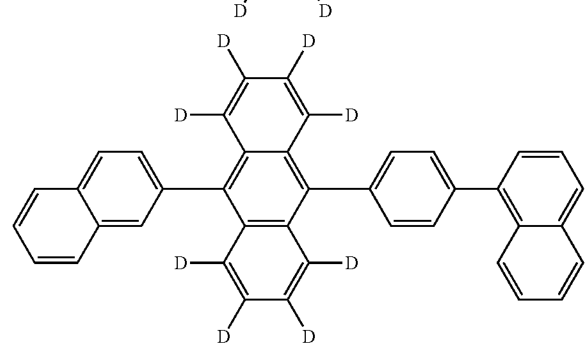

-continued
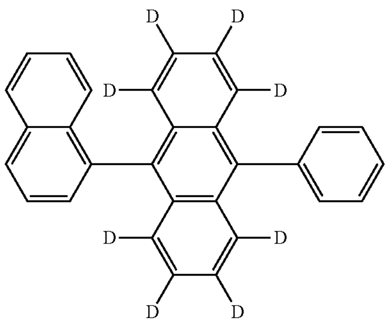
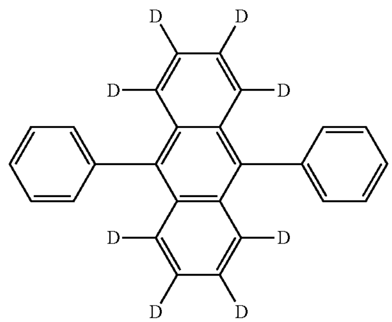
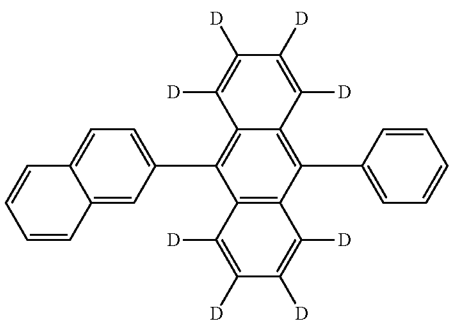
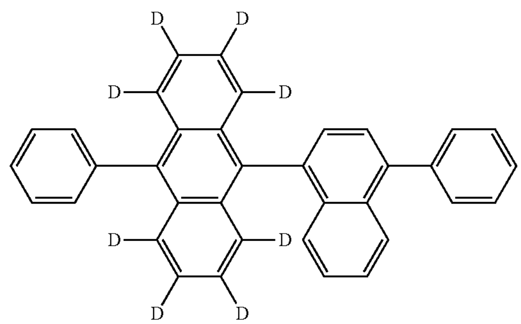
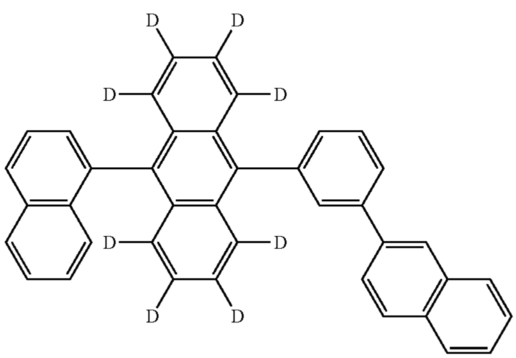
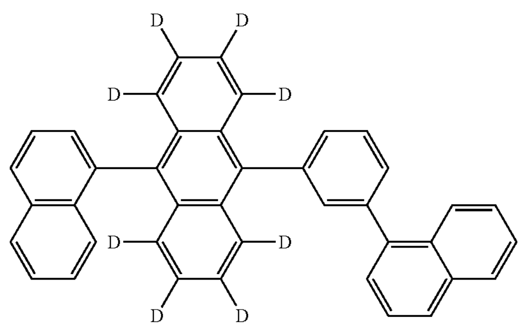
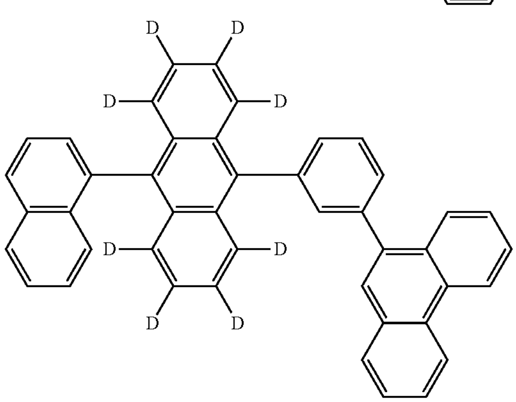
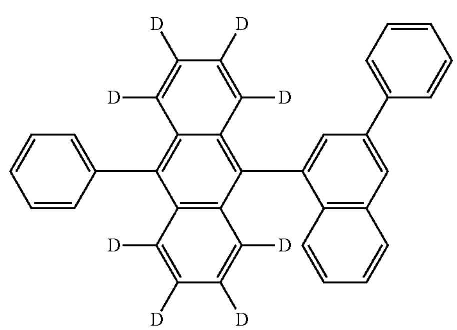
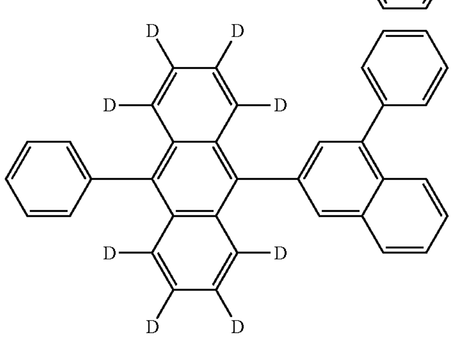
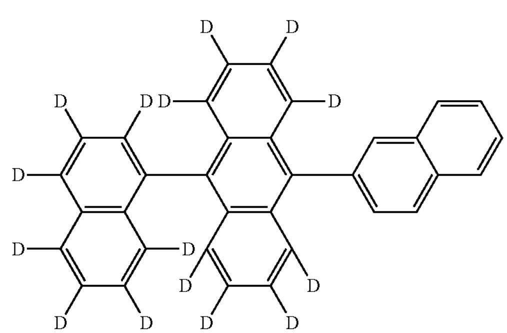

-continued
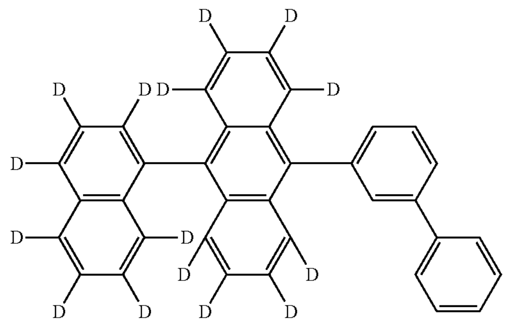
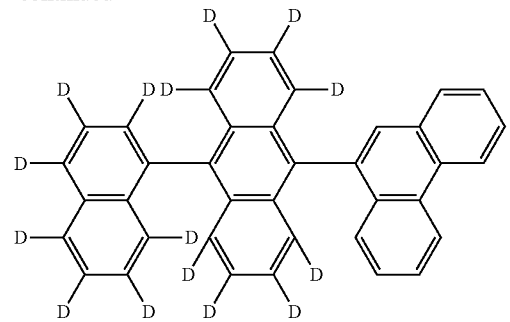
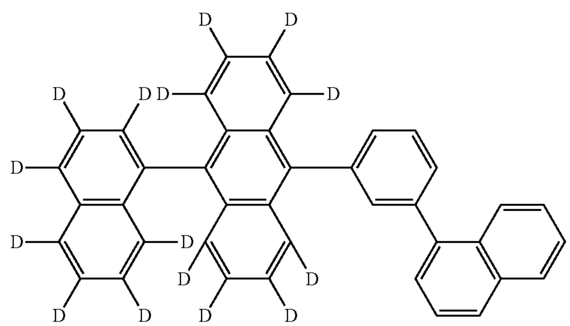
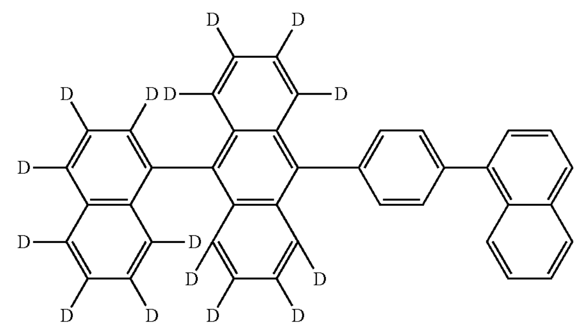
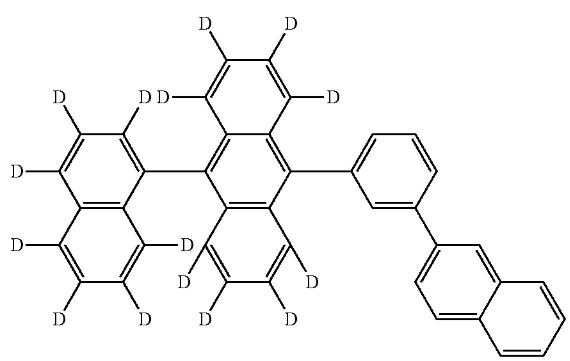
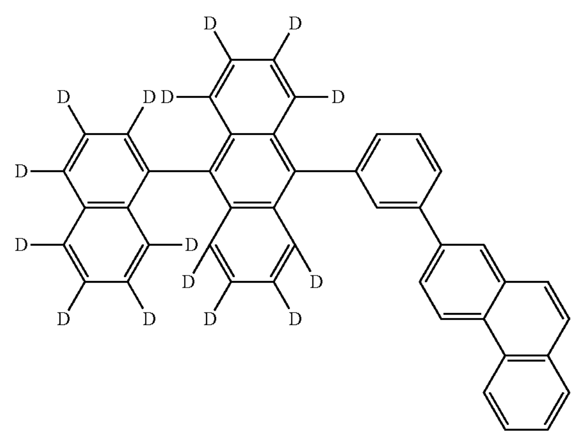
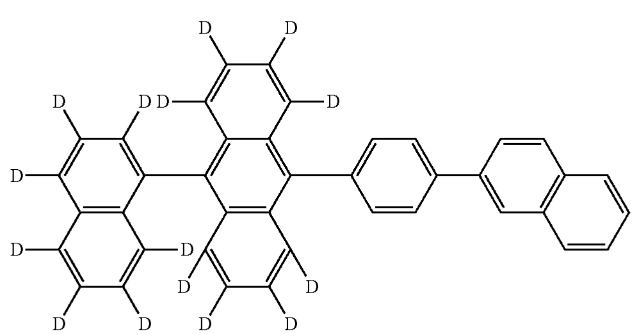

-continued
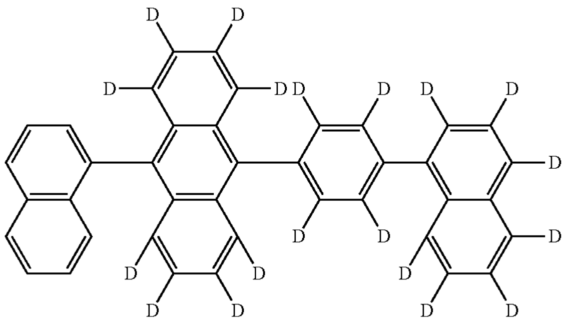
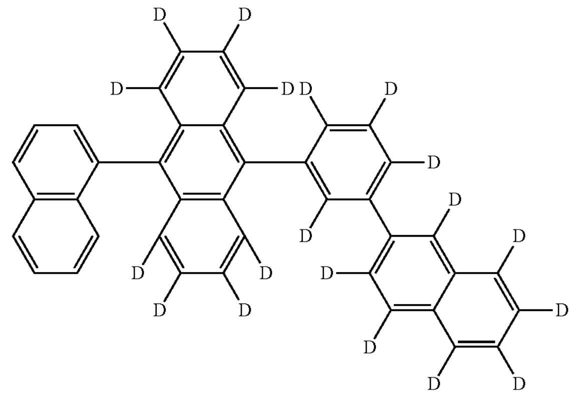
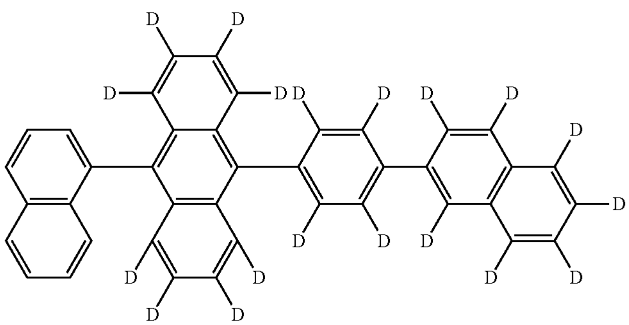
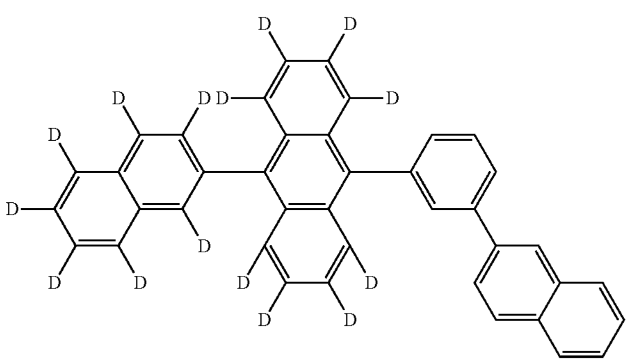
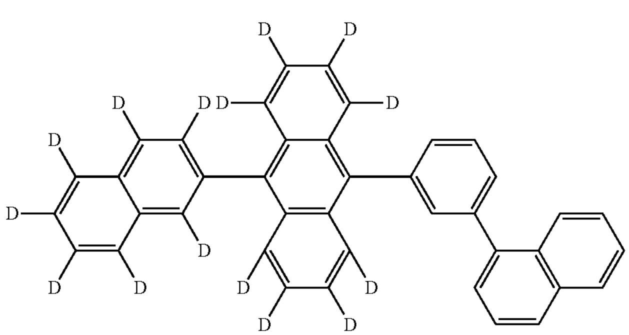

-continued

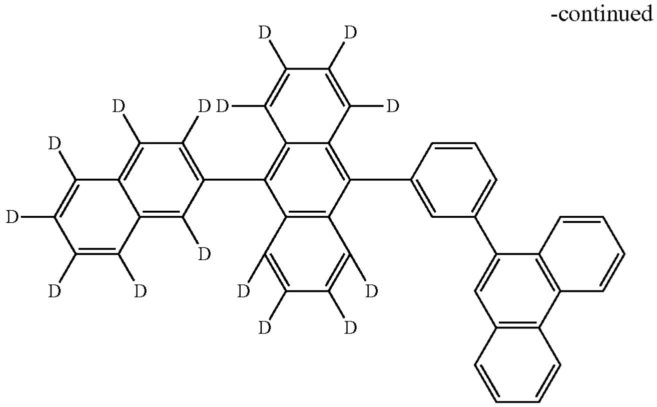

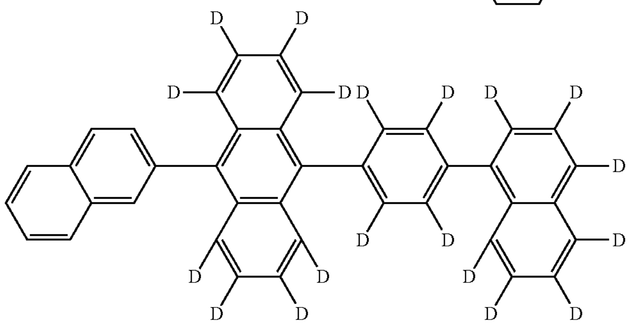

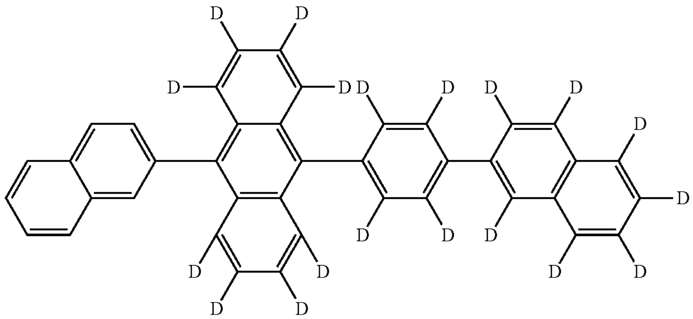

A second aspect of the compound represented by the formula (1) is a compound represented by the following formula (1B).

(1B)

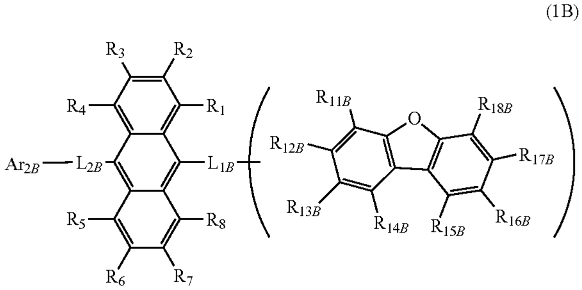

In the formula (1B), $R_1$ to $R_8$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of $R_{901}$ to $R_{907}$ are present, the two or more of each of $R_{901}$ to $R_{907}$ may be the same as or different from each other.

At least one of $R_1$ to $R_8$ is a deuterium atom.

Adjacent two or more of $R_1$ to $R_4$, and adjacent two or more of $R_5$ to $R_8$ do not form a ring by bonding with each other.

$L_{1B}$ and $L_{2B}$ are independently
a single bond,
a substituted or unsubstituted arylene group including 6 to 30 ring carbon atoms, or
a substituted or unsubstituted divalent heterocyclic group including 5 to 30 ring atoms.

$Ar_{2B}$ is
a substituted or unsubstituted aryl group including 6 to 50 ring carbon atoms, or
a substituted or unsubstituted monovalent heterocyclic group including 5 to 50 ring atoms.

One of $R_{11B}$ to $R_{18B}$ is a single bond which bonds with $L_{1B}$.

$R_{11B}$ to $R_{18B}$ which are not a single bond which bonds with $L_{1B}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$) ($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms.

$R_{901}$ to $R_{907}$ are as defined in $R_1$ to $R_8$.

Adjacent two or more of $R_{11B}$ to $R_{18B}$ do not form a ring by bonding with each other.

All of $R_1$ to $R_8$ may be deuterium atoms, or some (e.g. one or two) of $R_1$ to $R_8$ may be deuterium atoms.

$R_1$ to $R_8$ that are not deuterium atom are preferably hydrogen atoms (protium atoms).

In one embodiment, at least one hydrogen atom of one or more selected from the group consisting of $L_{1B}$ and $L_{1B}$ is a deuterium atom. Specifically, in one embodiment, one or more selected from the group consisting of $L_{1B}$ and $L_{1B}$ is an unsubstituted arylene group including 6 to 30 ring carbon atoms in which at least one of the hydrogen atoms is a deuterium atom, or an unsubstituted divalent heterocyclic group including 5 to 30 ring atoms in which at least one of the hydrogen atoms is a deuterium atom.

In one embodiment, $L_{1B}$ and $L_{1B}$ are independently a single bond, or a substituted or unsubstituted arylene group including 6 to 14 ring carbon atoms. Preferably, at least one of $L_{1B}$ and $L_{1B}$ is a single bond.

In one embodiment, $R_{11B}$ to $R_{18B}$ which are not a single bond which bonds with $L_{1B}$ are hydrogen atoms.

In one embodiment, at least one of $R_{11B}$ to $R_{18B}$ which are not a single bond which bonds with $L_{1B}$ is a deuterium atom.

In one embodiment, at least one hydrogen atom possessed by $Ar_{2B}$ is a deuterium atom. Specifically, in one embodiment, $Ar_{2B}$ is an unsubstituted aryl group including 6 to 50 ring carbon atoms in which at least one of the hydrogen atoms is a deuterium atom, or an unsubstituted monovalent heterocyclic group including 5 to 50 ring atoms in which at least one of the hydrogen atoms is a deuterium atom.

$Ar_{2B}$ is preferably a substituted or unsubstituted aryl group including 6 to 50 ring carbon atoms, and more preferably selected from the groups represented by each of the following formulas (a1B) to (a4B).

(a1B)

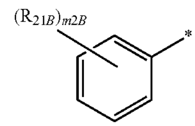

(a2B)

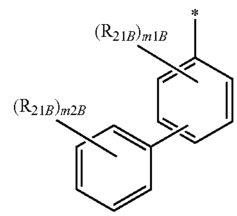

(a3B)

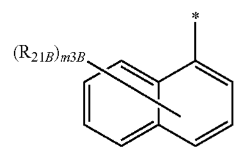

(a4B)

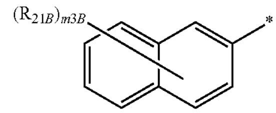

In the formulas (a1B) to (a4B), "*" is a single bond which bonds with $L_{2B}$.

$R_{21B}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$) ($R_{907}$),
a substituted or unsubstituted aryl group including 6 to 50 ring carbon atoms, or
a substituted or unsubstituted monovalent heterocyclic group including 5 to 50 ring atoms.

$R_{901}$ to $R_{907}$ are as defined in the formula (1).

m1B is an integer of 0 to 4.

m2B is an integer of 0 to 5.

m3B is an integer of 0 to 7.

When m1B to m3B are each 2 or more, a plurality of $R_{21B}$'S may be the same as or different from each other.

When m1B to m3B are each 2 or more, a plurality of adjacent $R_{21B}$'S form a substituted or unsubstituted, saturated or unsaturated ring by bonding with each other, or do not form a substituted or unsubstituted saturated or unsaturated ring.

$L_{1B}$ and $L_{2B}$ are preferably independently a single bond, or a substituted or unsubstituted arylene group including 6 to 14 ring carbon atoms. Preferably, at least one of $L_{1B}$ and $L_{1B}$ is a single bond.

In one embodiment, the compound represented by the formula (1B) is a compound represented by the following formula (1B-1).

(1B-1)

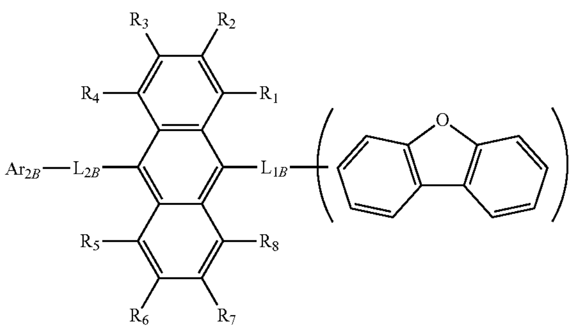

In the formula (1B-1), $R_1$ to $R_8$, $Ar_{2B}$, $L_{1B}$ and $L_{2B}$ are as defined in the formula (1B).

In one embodiment, the compound represented by the formula (1B) is a compound represented by the following formula (1B-2).

(1B-2)

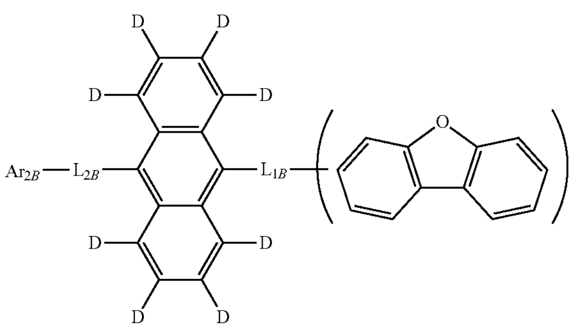

In the formula (1B-2), $Ar_{2B}$, $L_{1B}$, and $L_{1B}$ are as defined in the formula (1B).

The compound represented by the formula (1B) can be synthesized in accordance with the synthetic methods described in Examples by using known alternative reactions or raw materials tailored to the target compound.

Specific examples of the compound represented by the formula (1B) are shown below. In the following specific examples, "D" represents a deuterium atom.

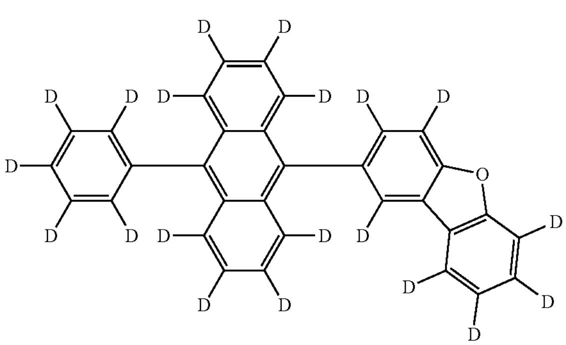

-continued

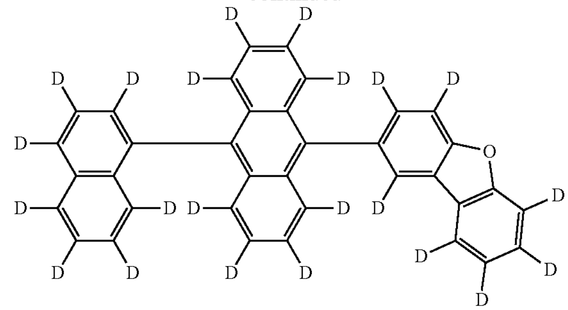

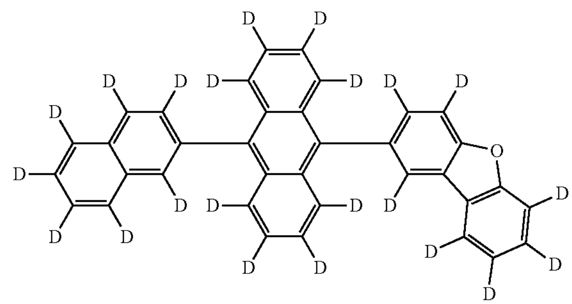

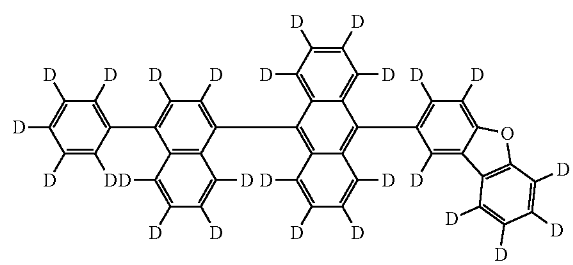

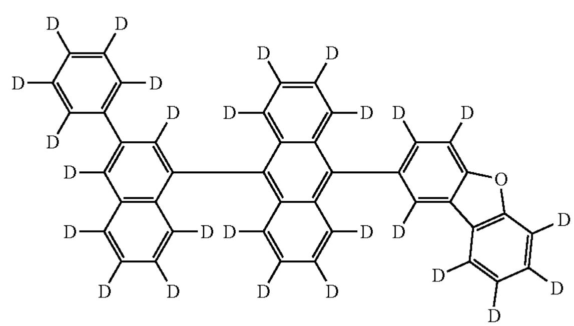

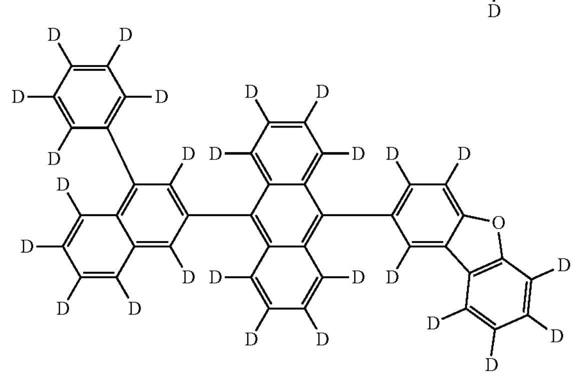

-continued
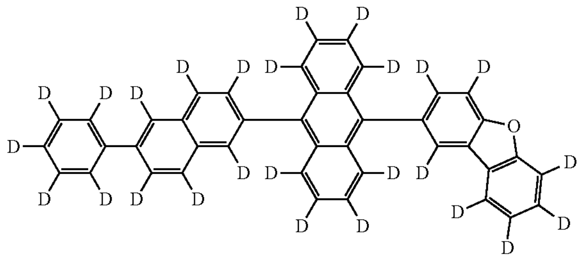
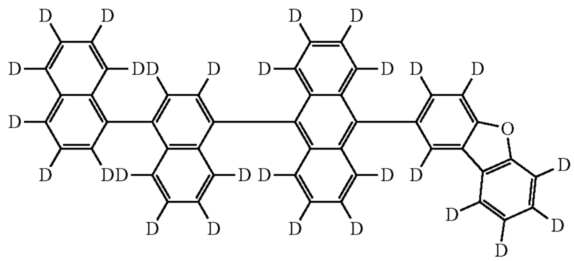
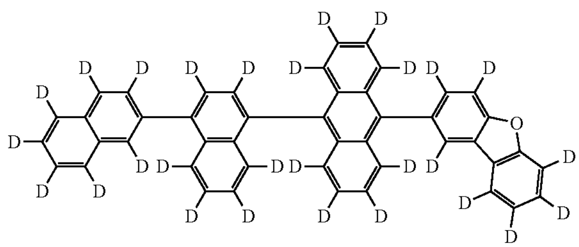
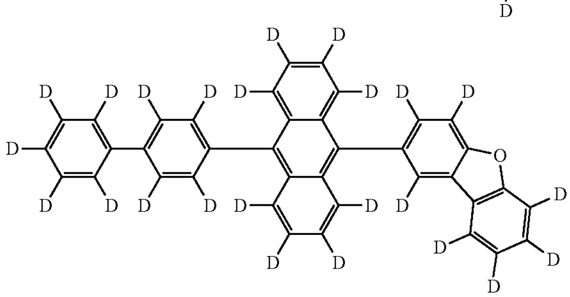
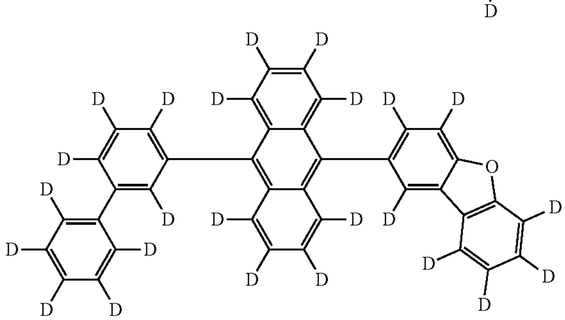
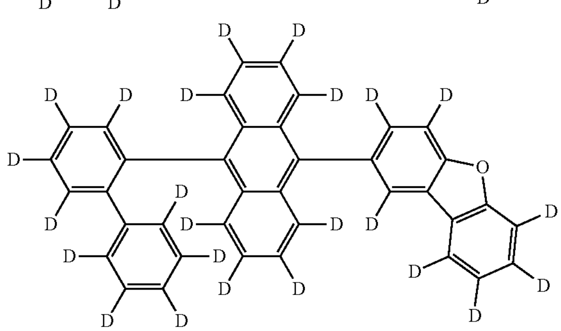
-continued
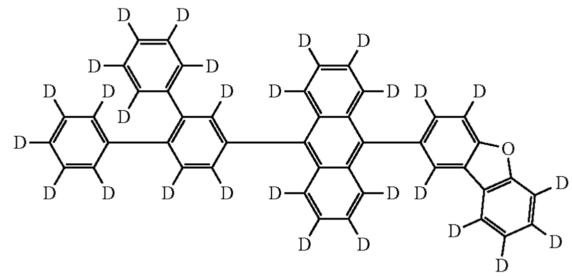
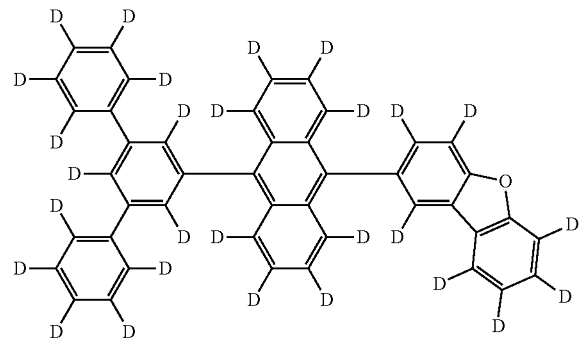
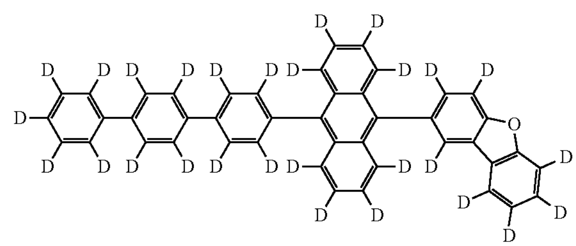
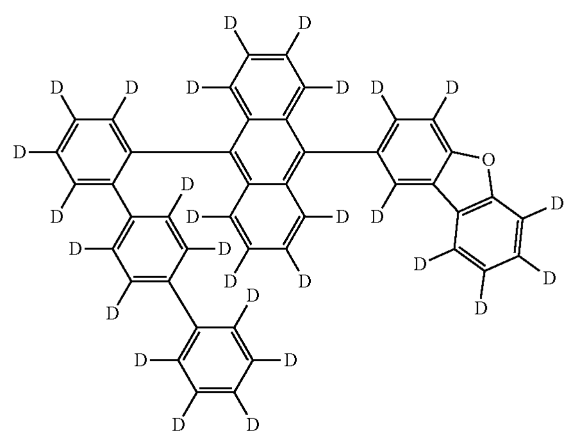
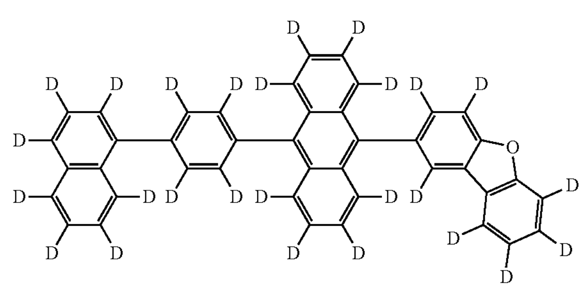

-continued
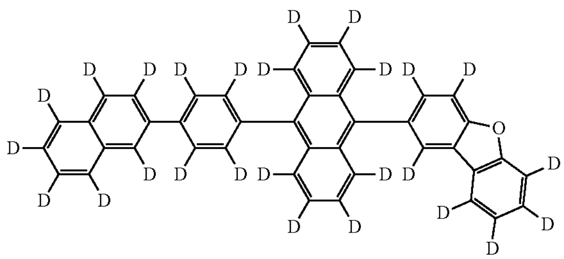
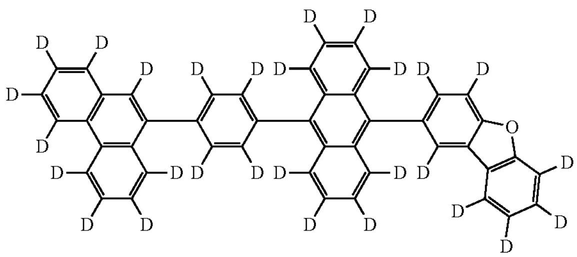
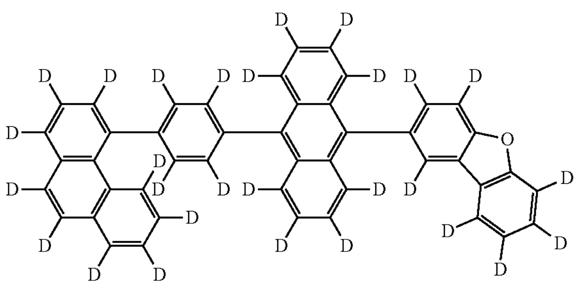
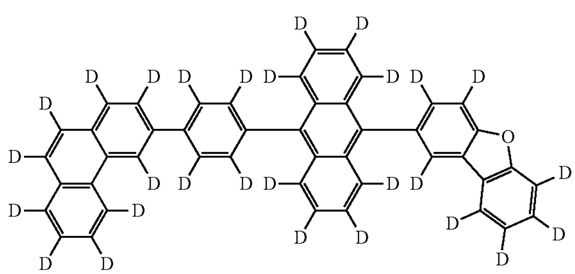
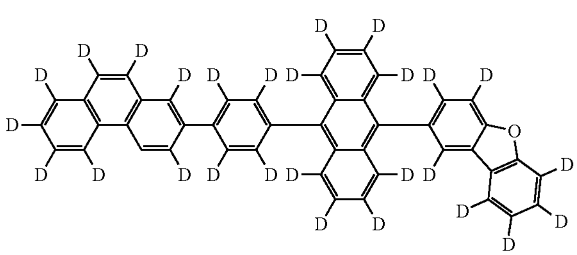
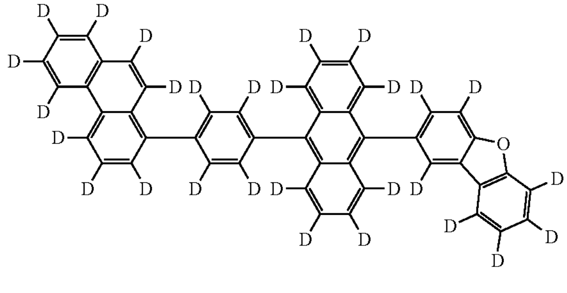
-continued
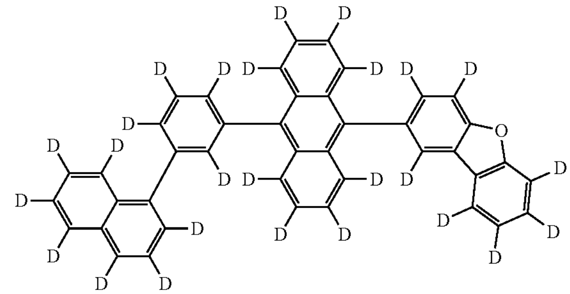
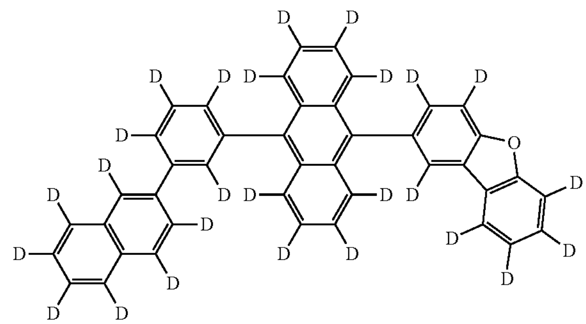
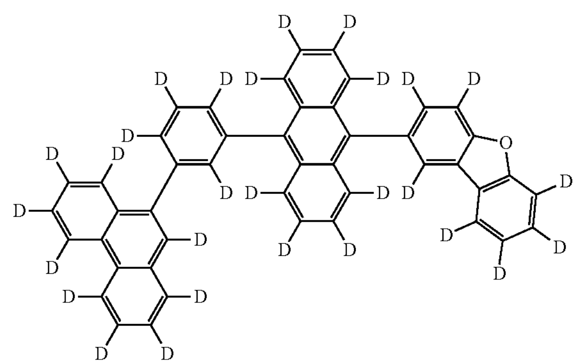
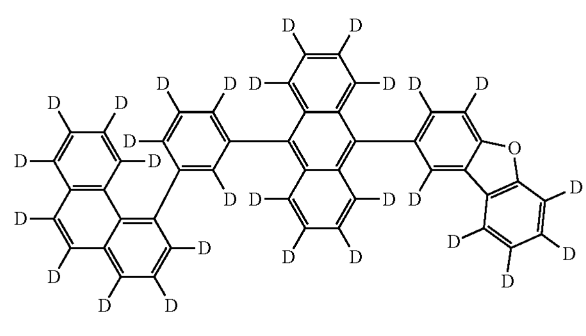
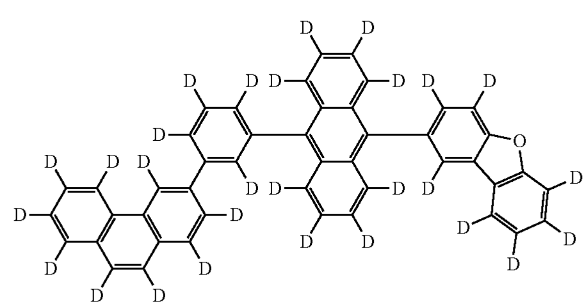

-continued
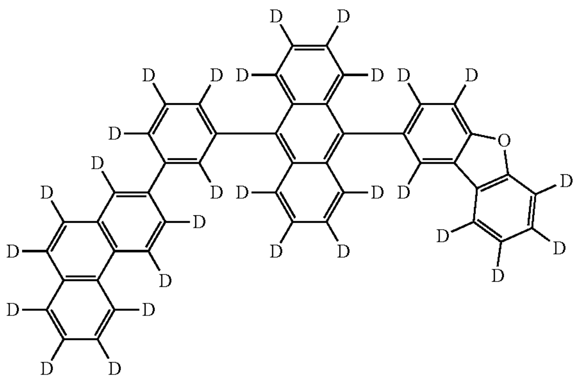
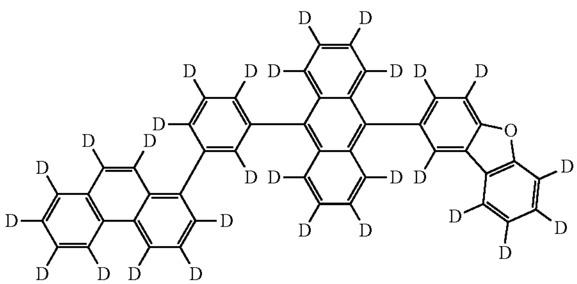
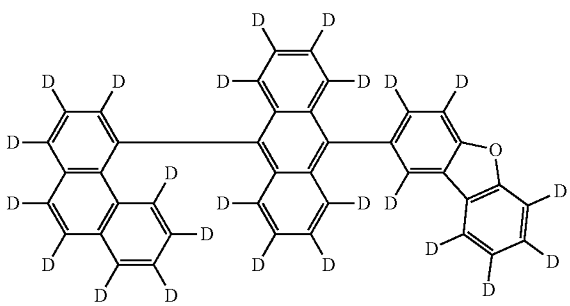
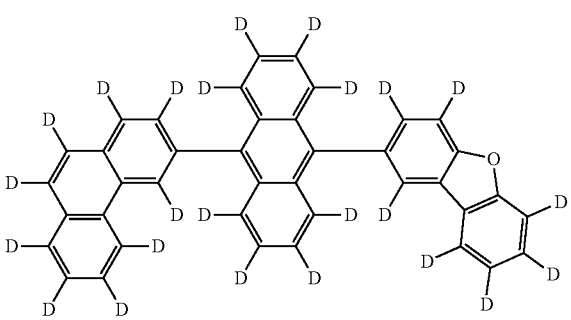
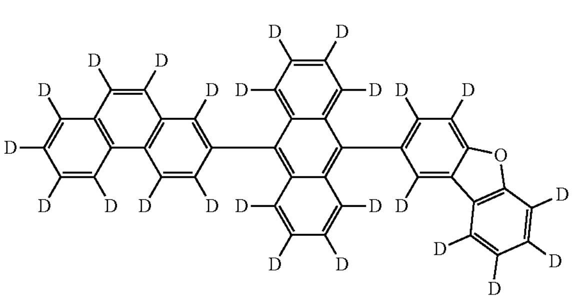
-continued
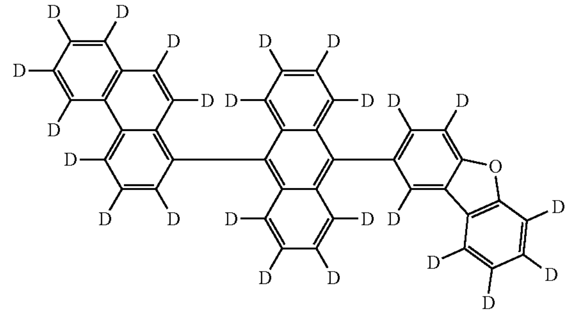
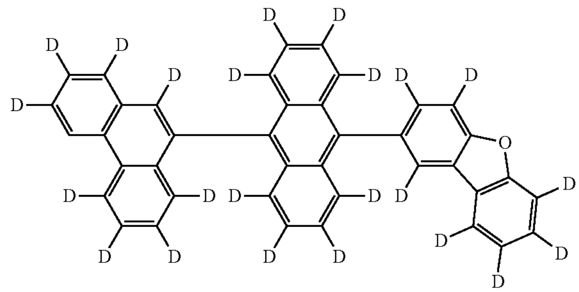
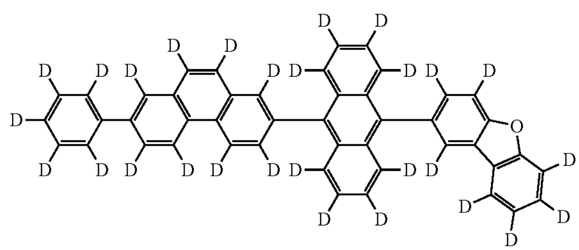
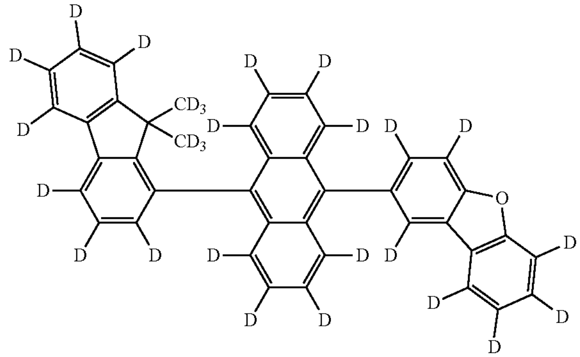
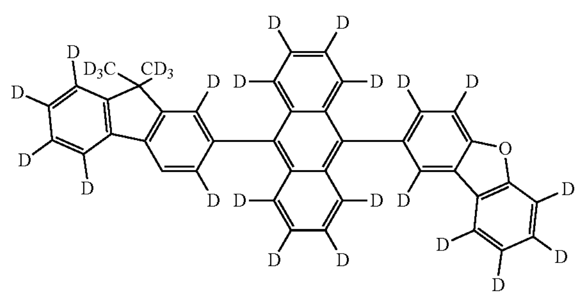

-continued
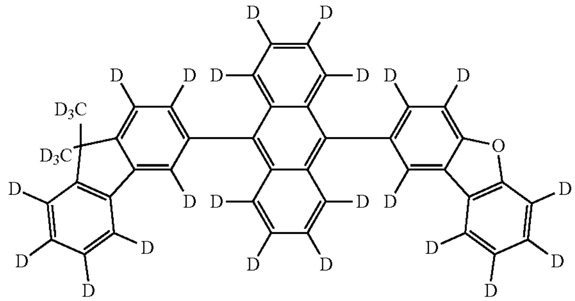
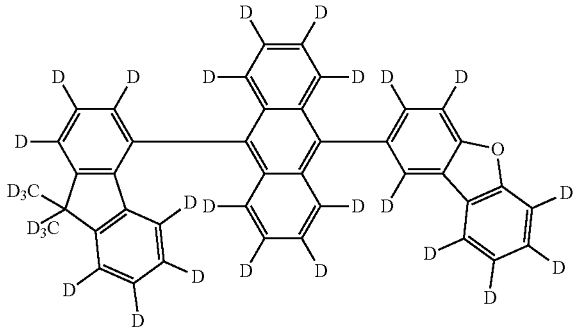
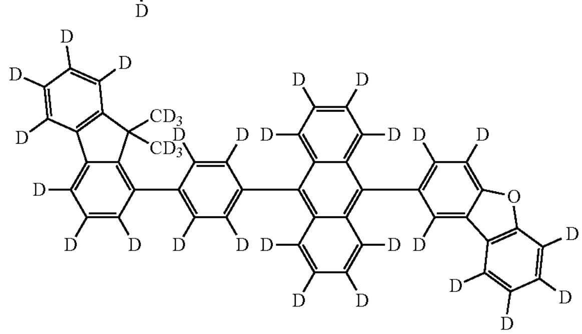
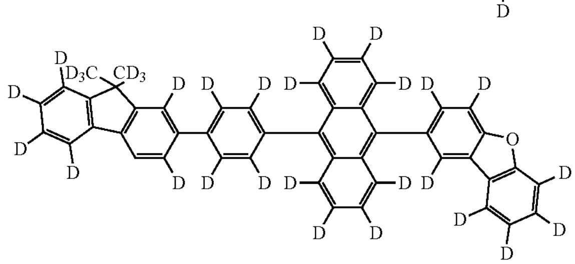
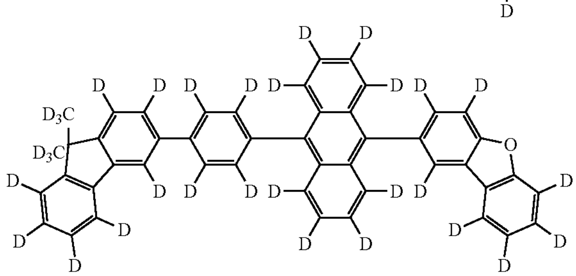
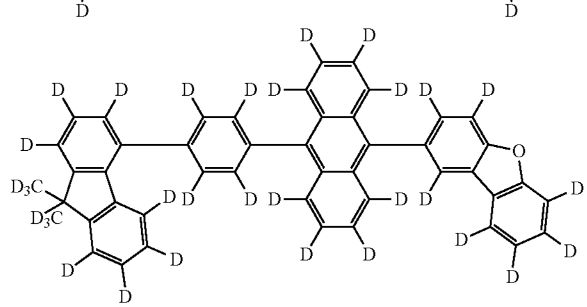
-continued
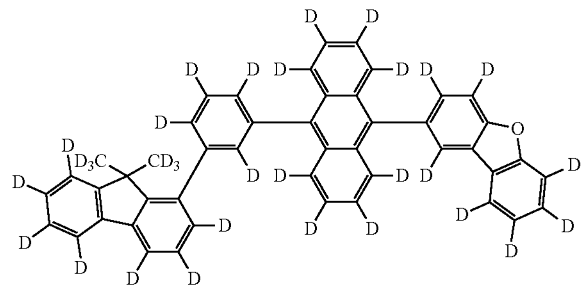
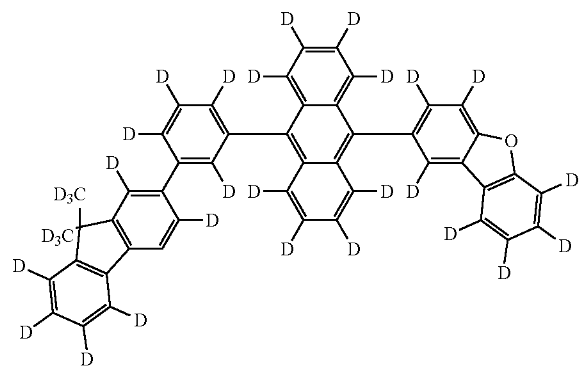
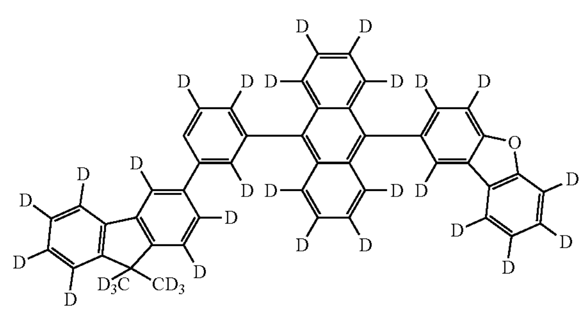
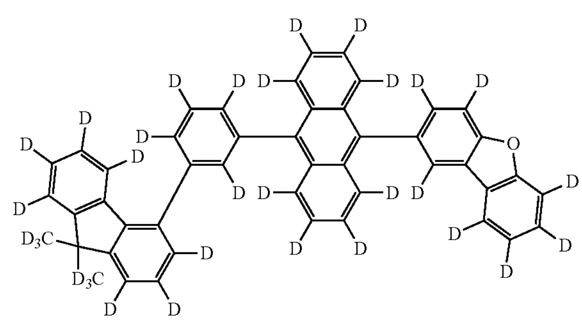
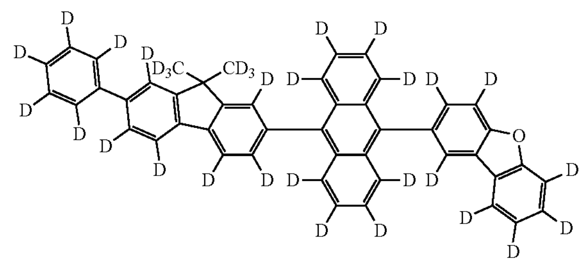

-continued
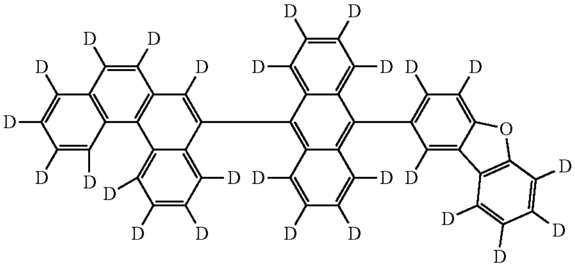
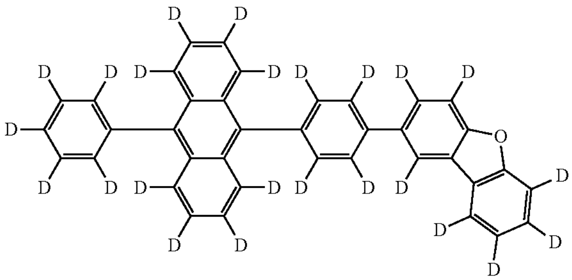
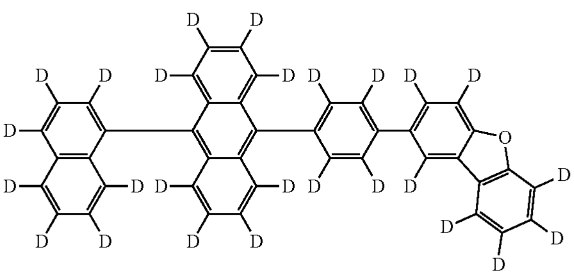
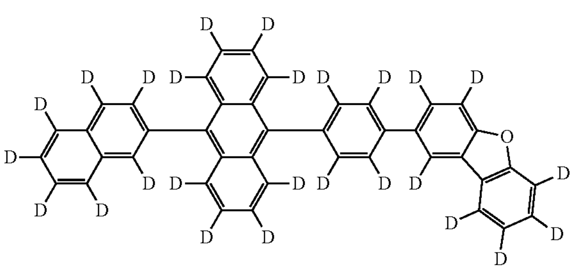
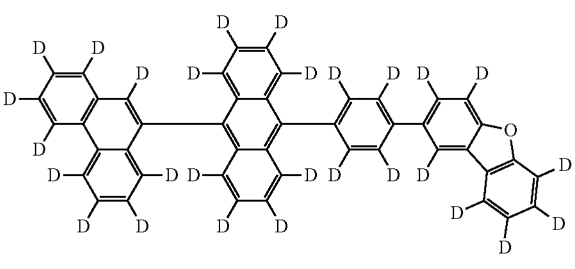
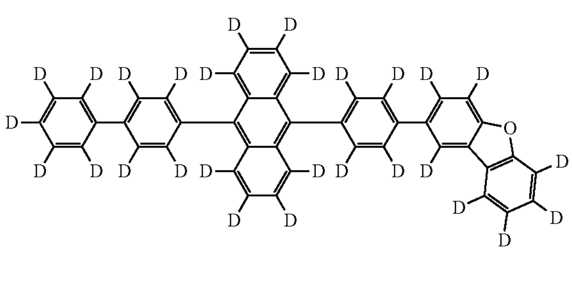
-continued
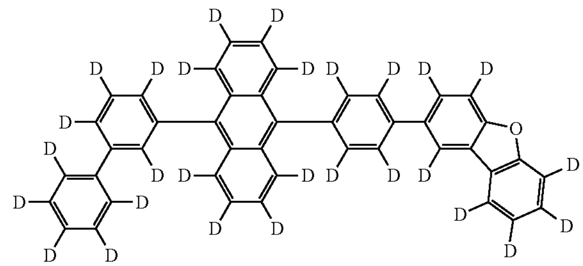
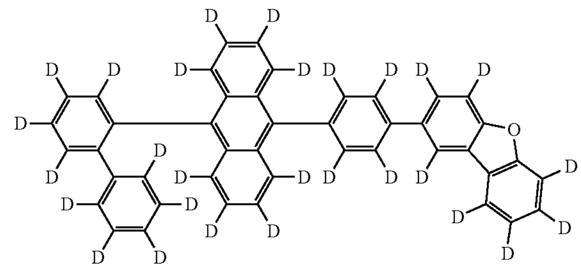
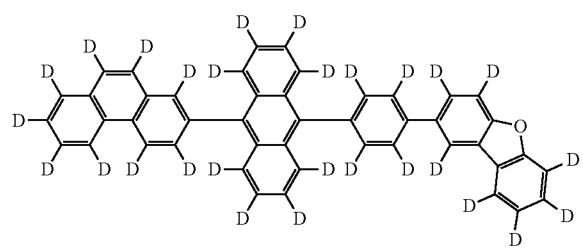
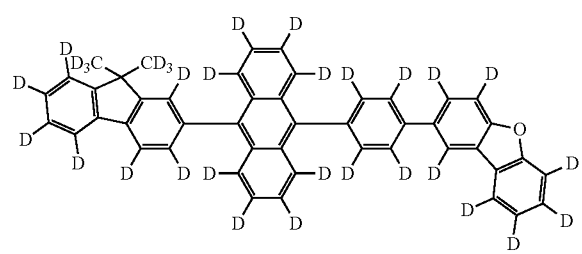
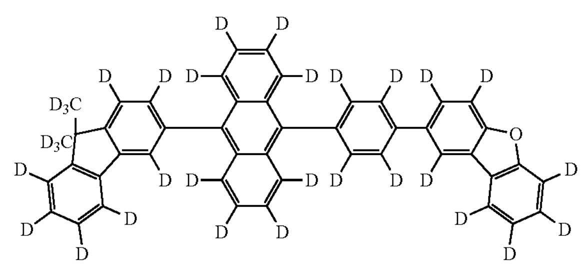
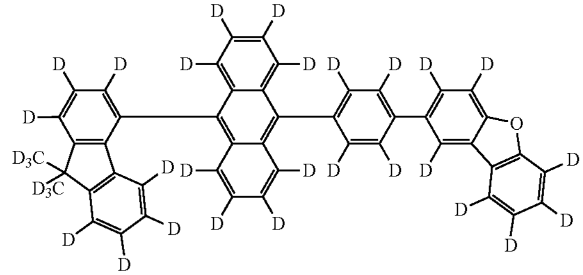

-continued
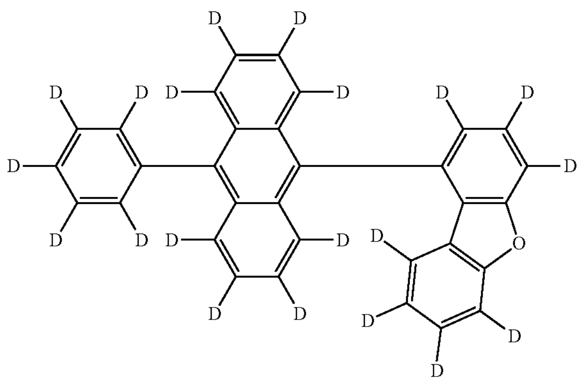
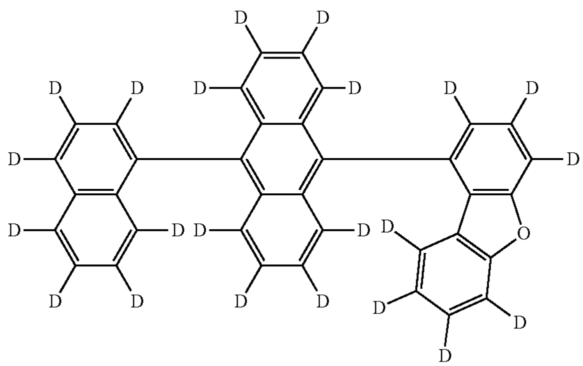
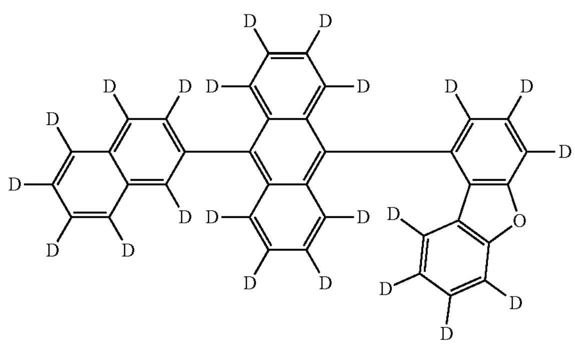
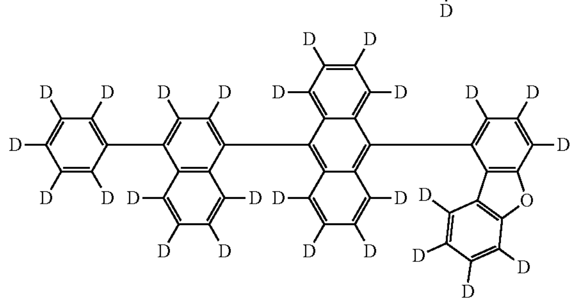
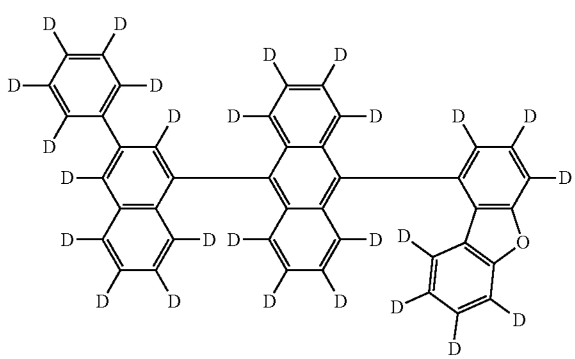
-continued
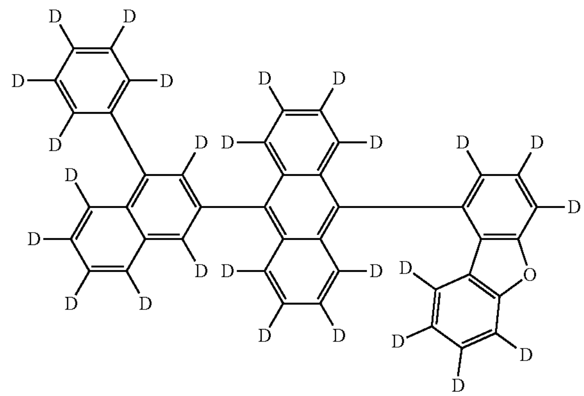
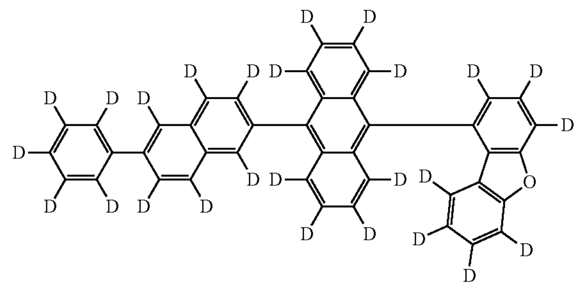
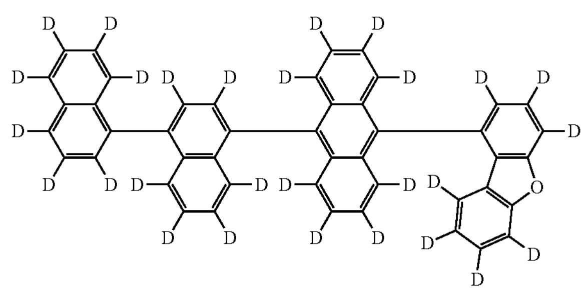
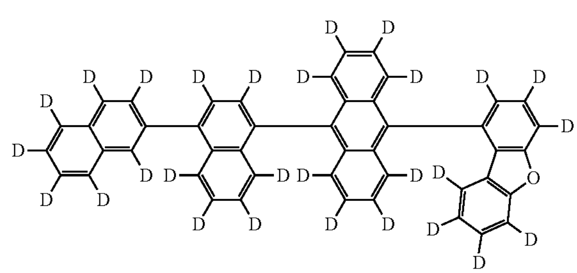
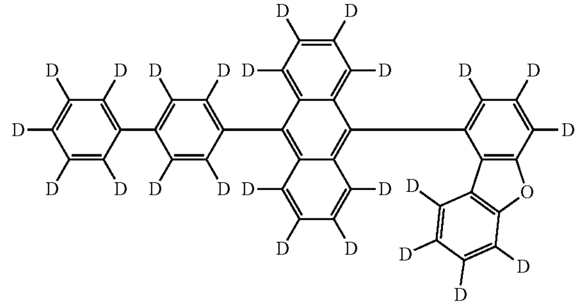

-continued
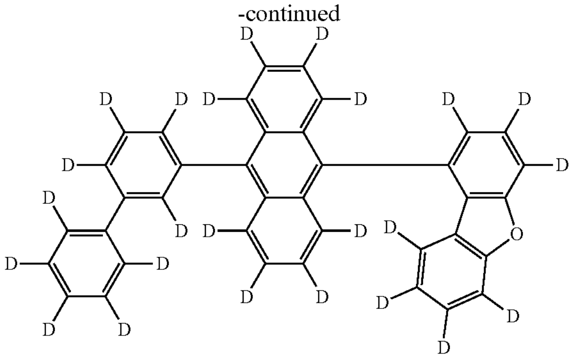
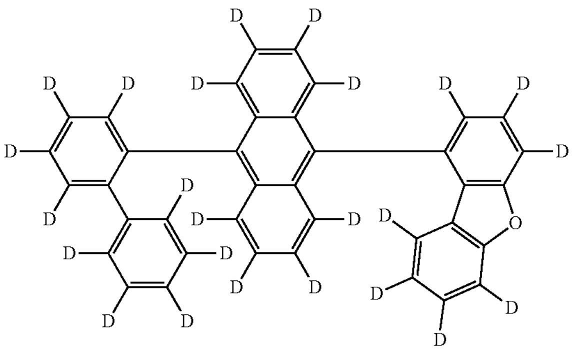
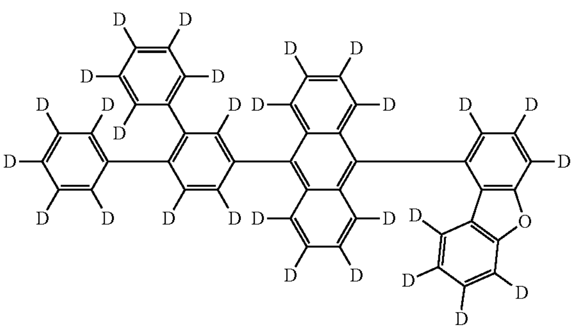
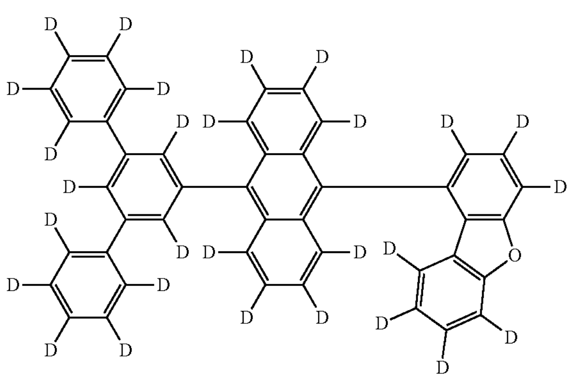
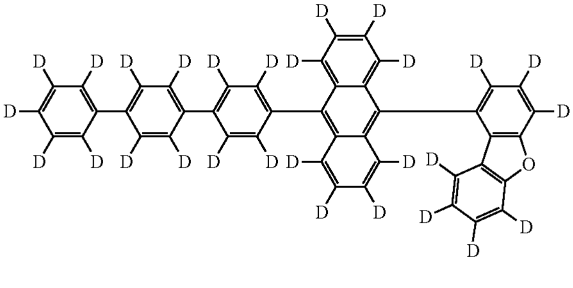
-continued
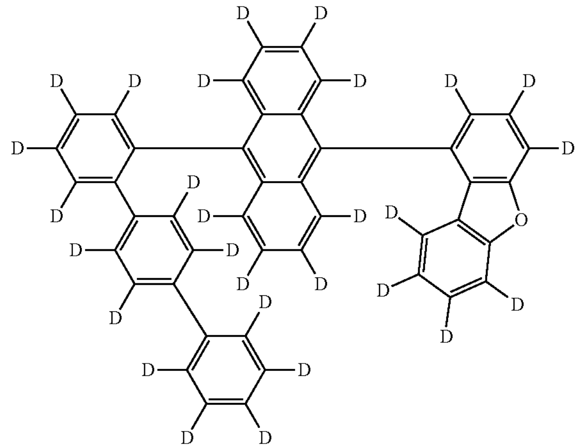
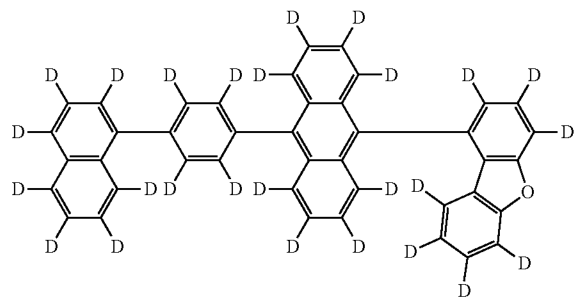
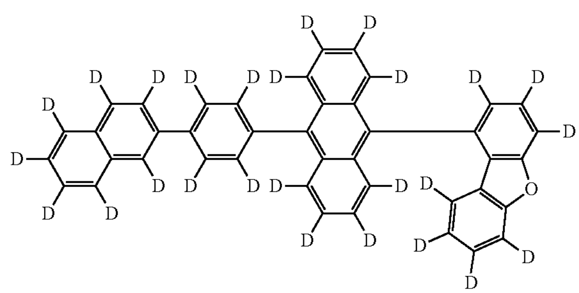
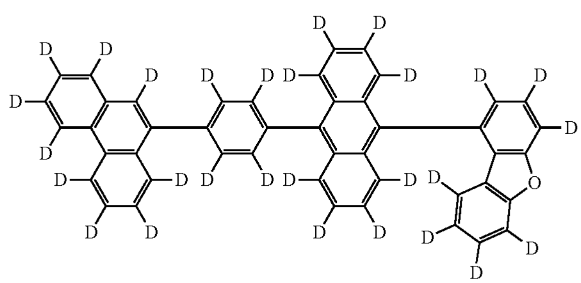
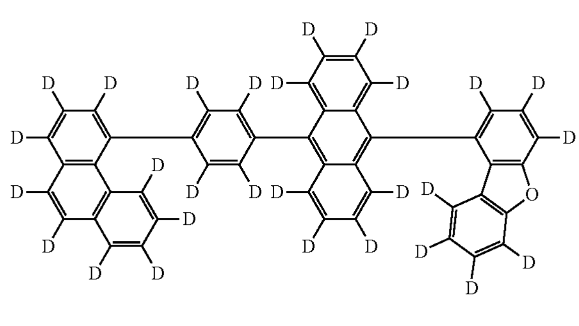

-continued
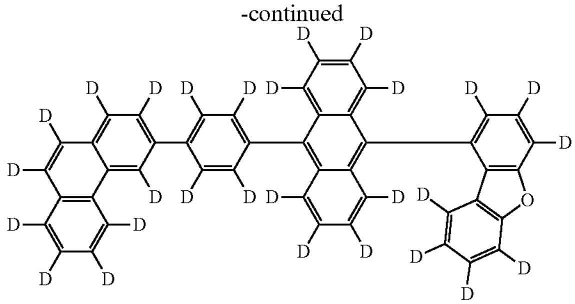
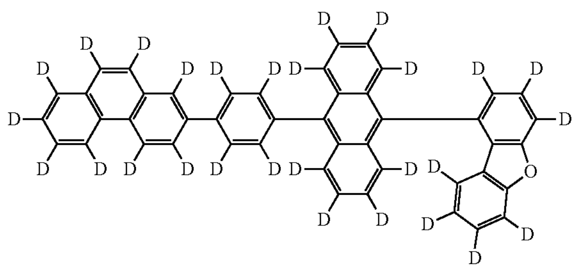
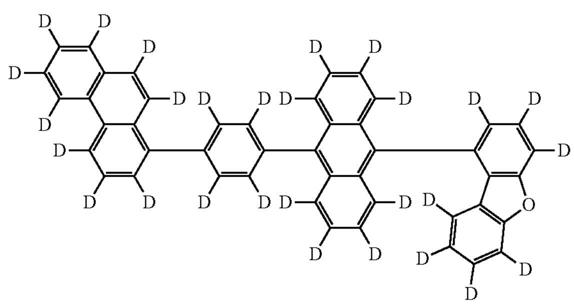
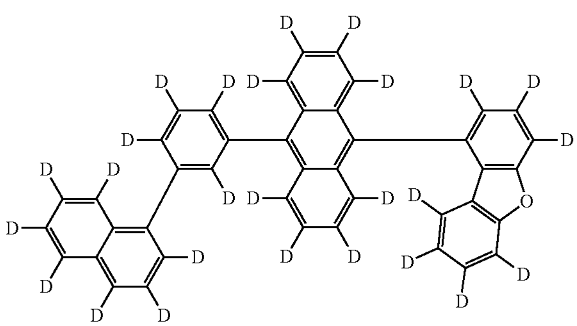
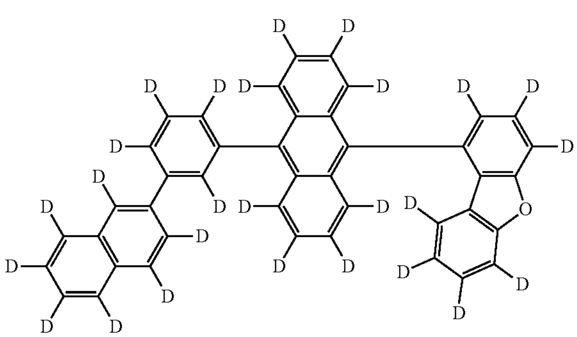
-continued
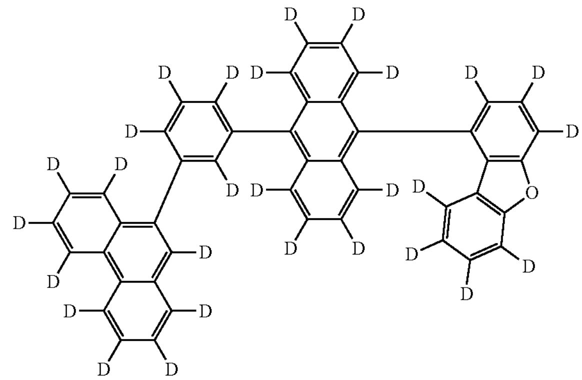
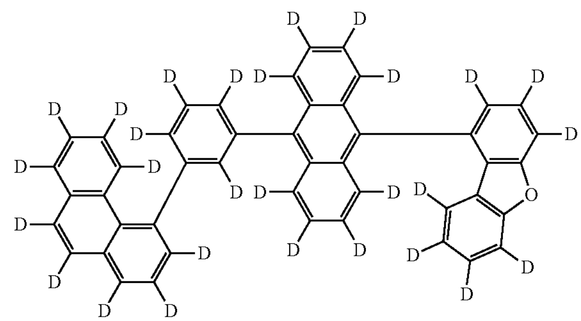
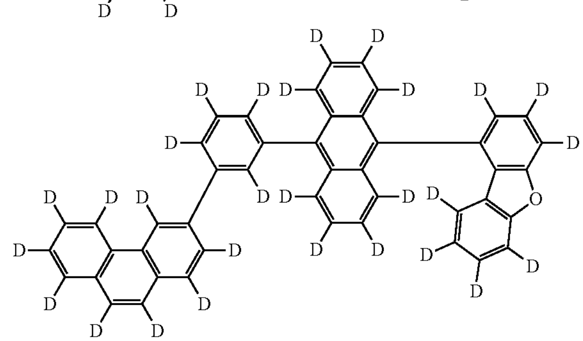
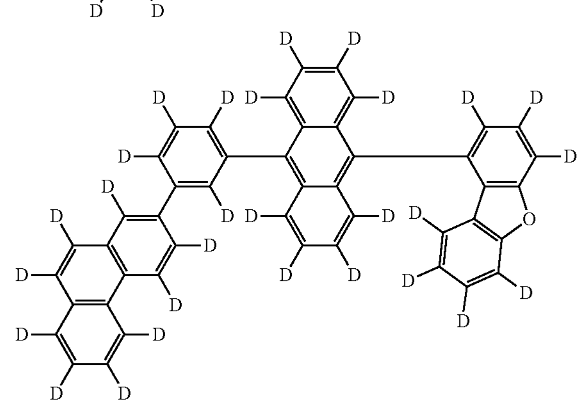
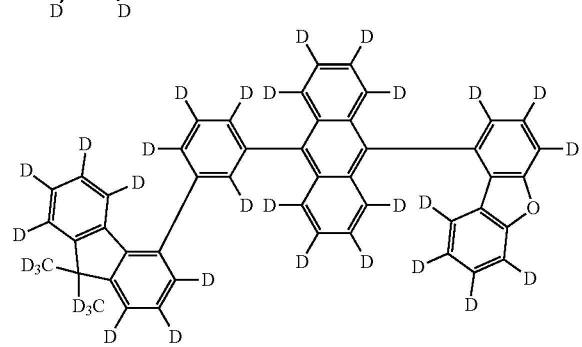

-continued
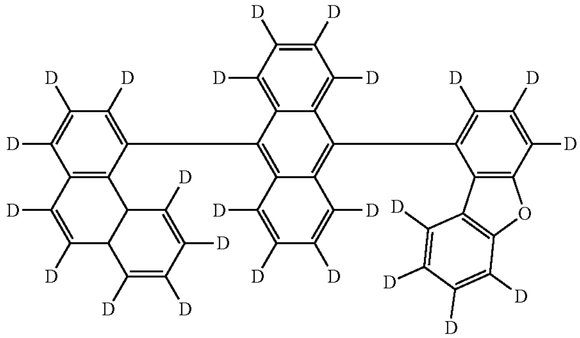
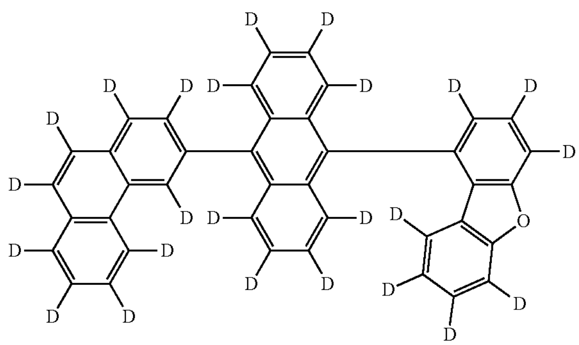
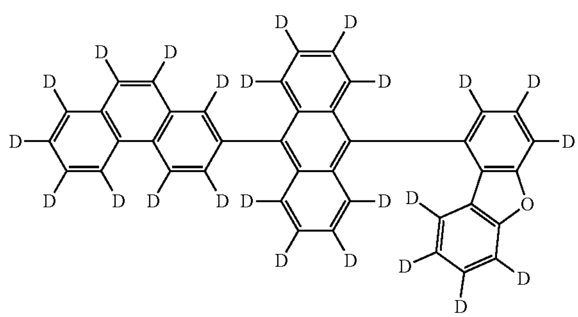
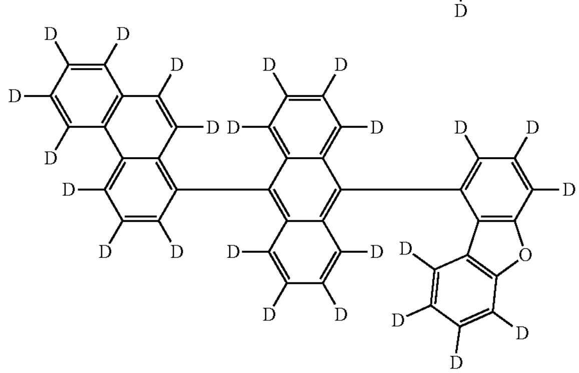
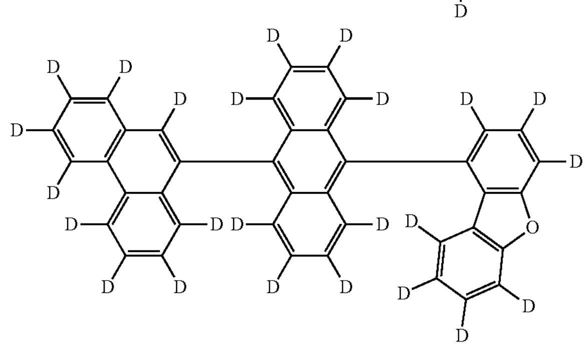
-continued
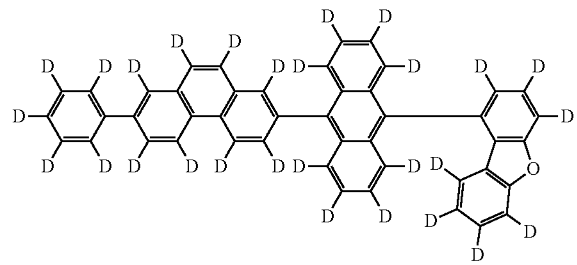
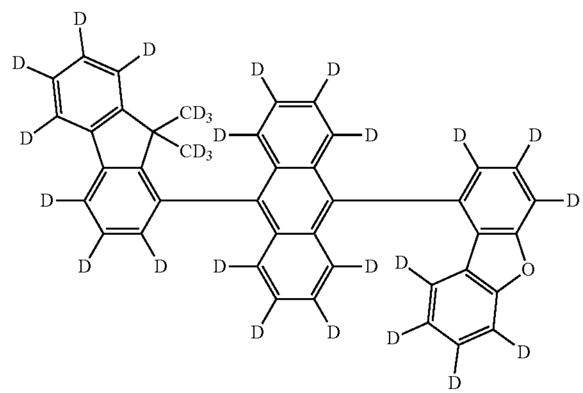
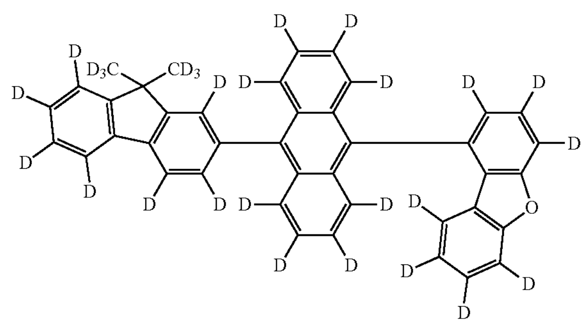
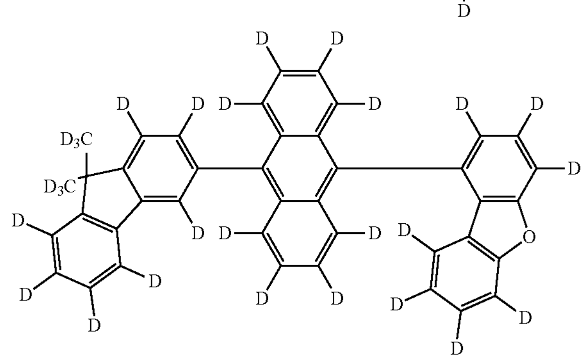
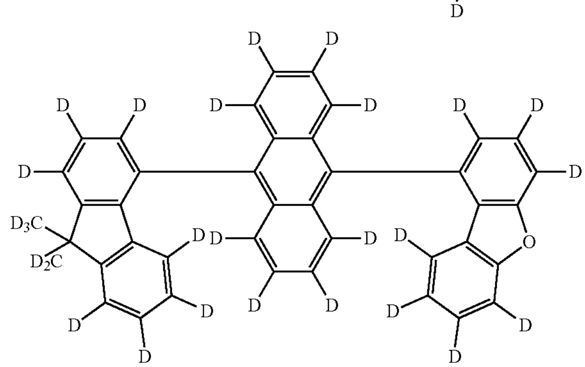

-continued
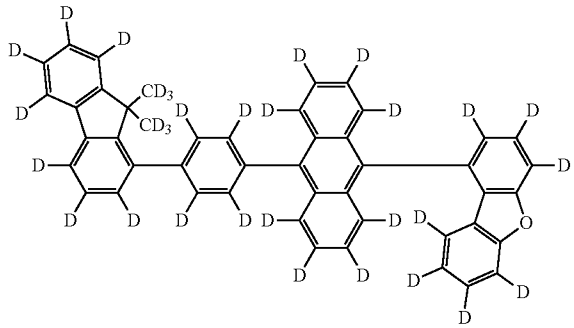
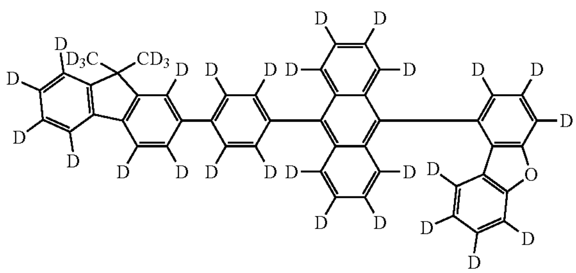
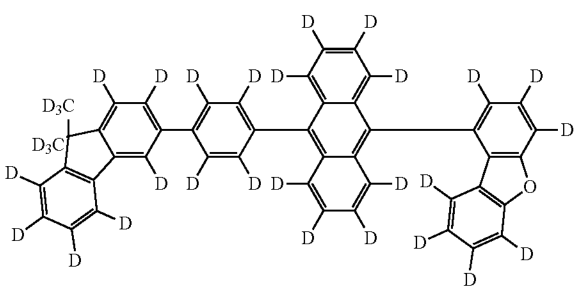
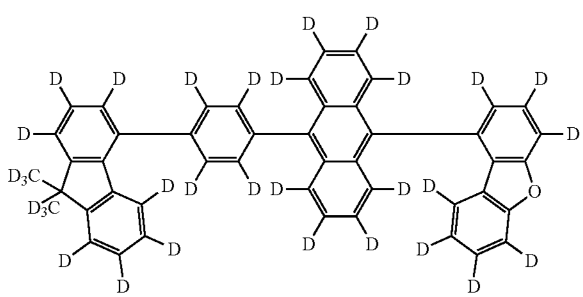
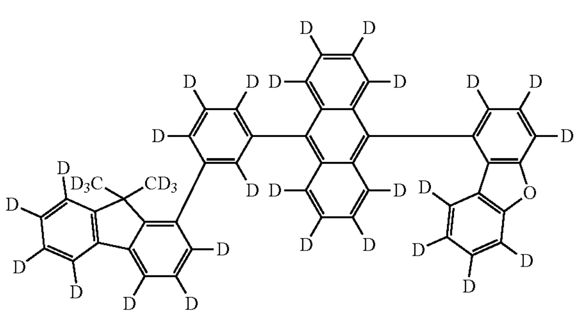
-continued
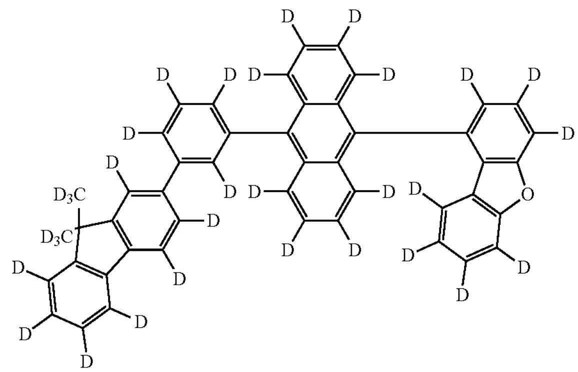
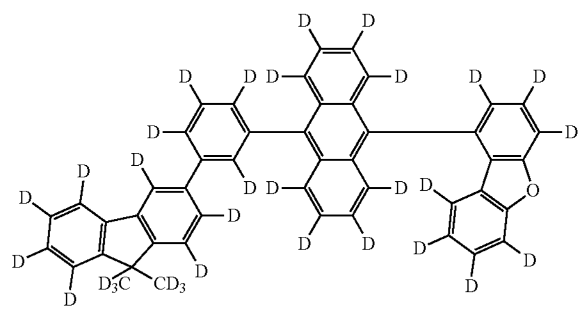
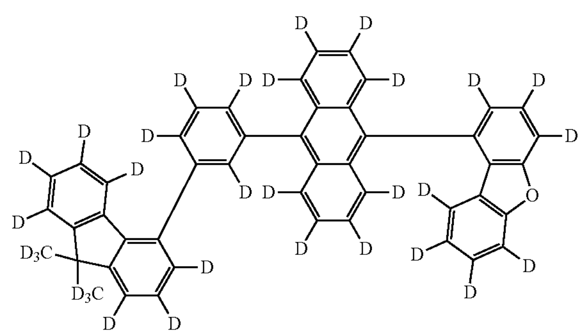
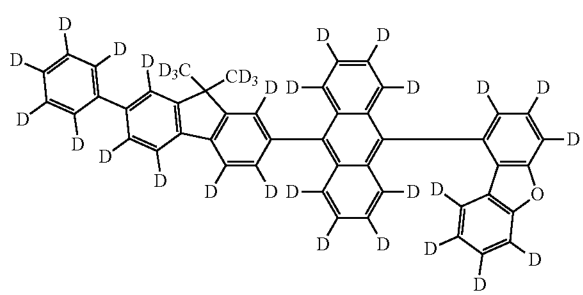
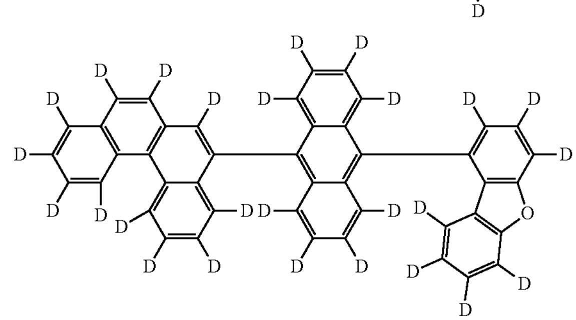

-continued
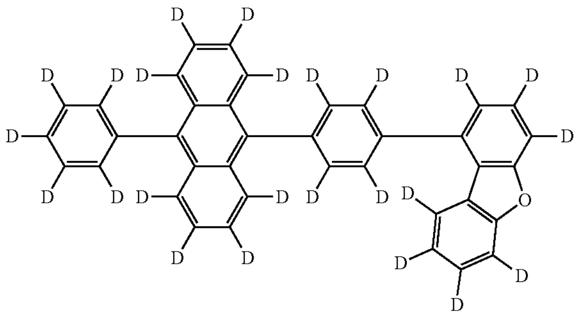
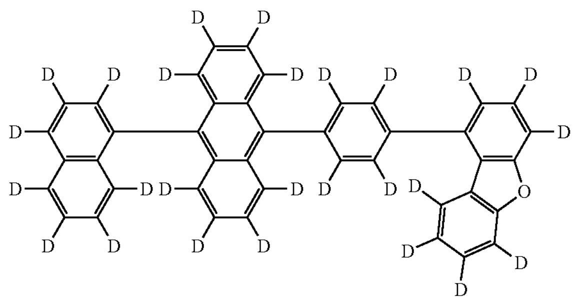
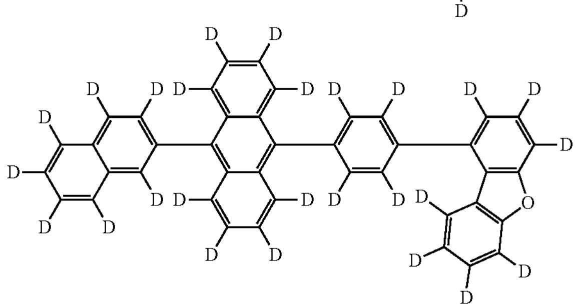
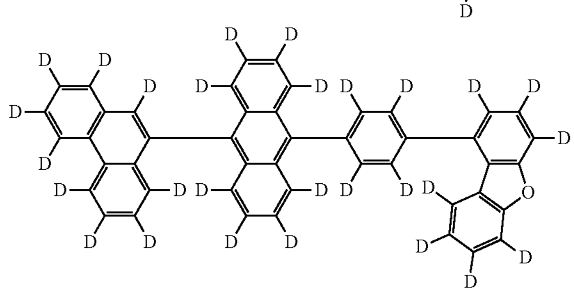
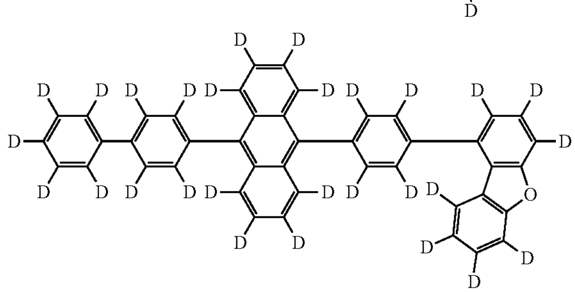
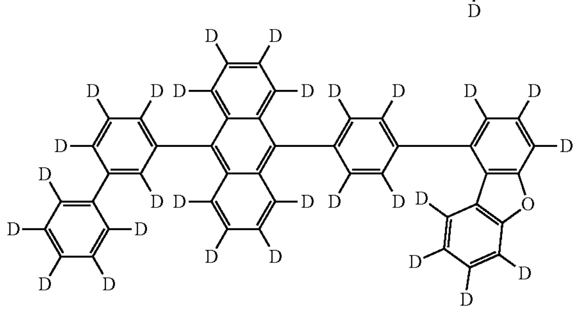
-continued
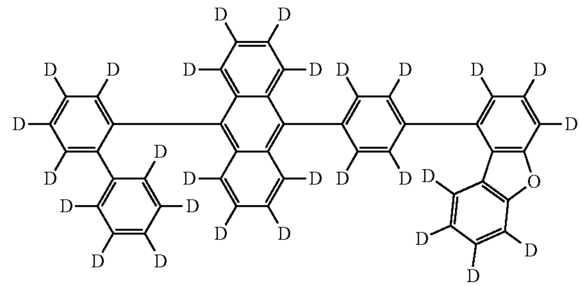
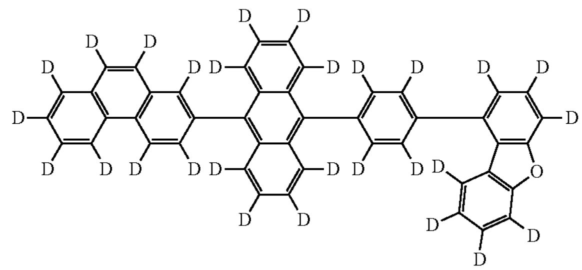
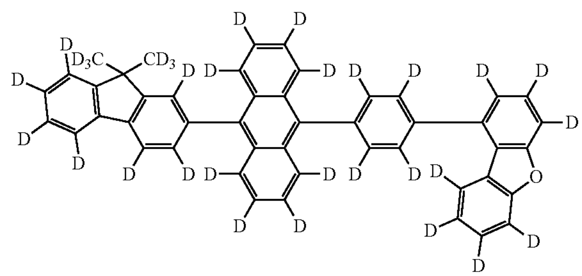
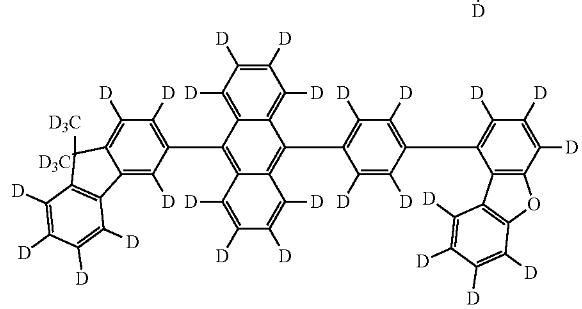
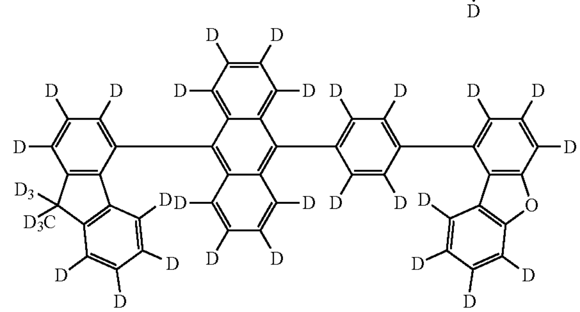
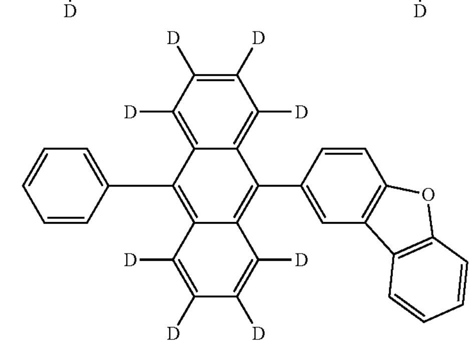

-continued
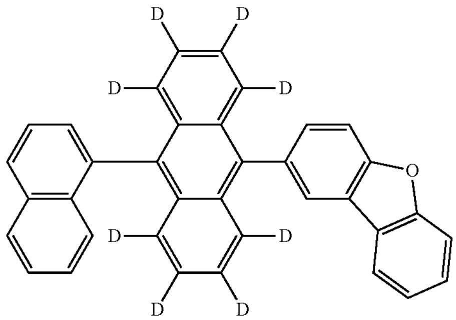
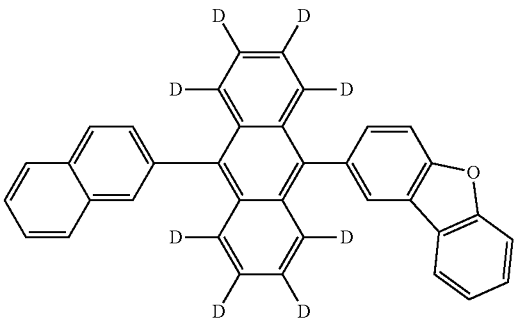
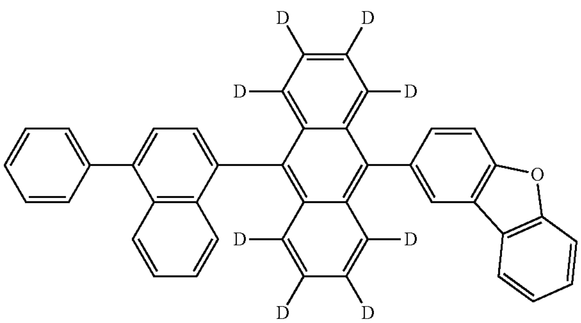
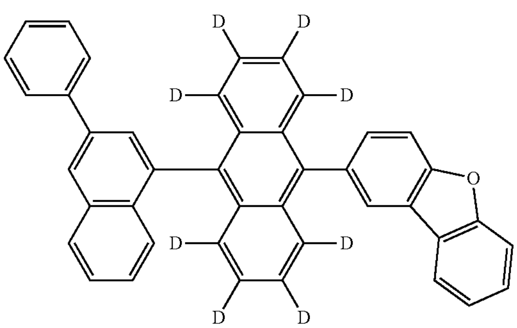
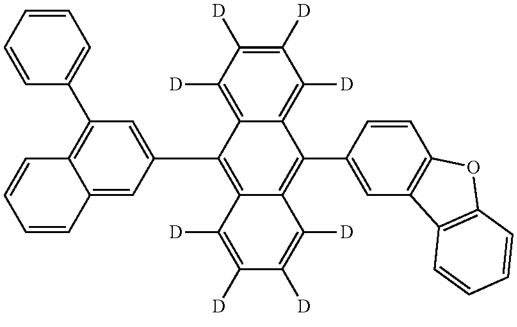
-continued
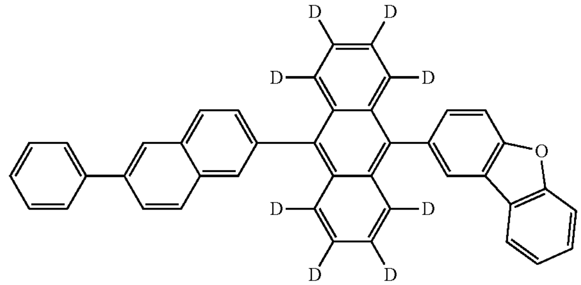
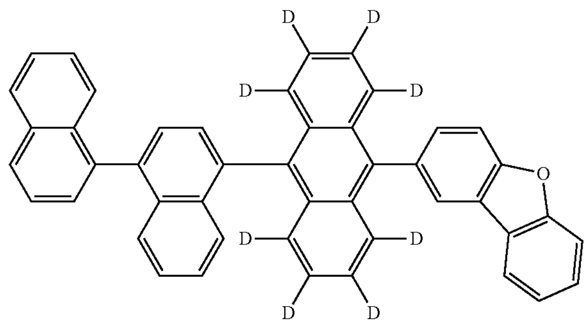
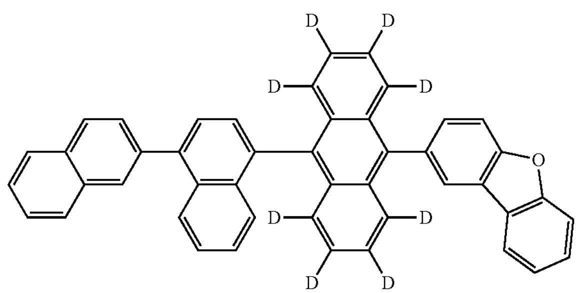
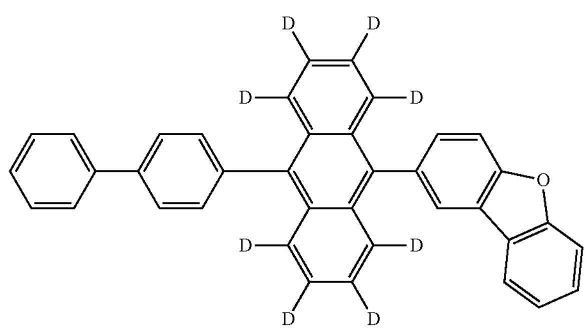
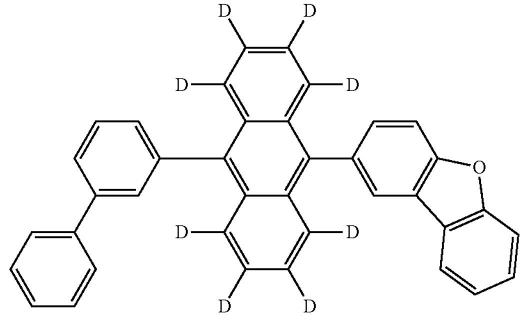

-continued
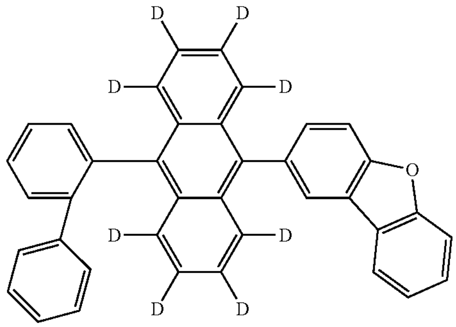
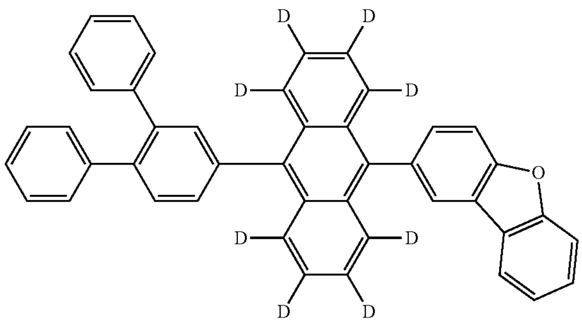
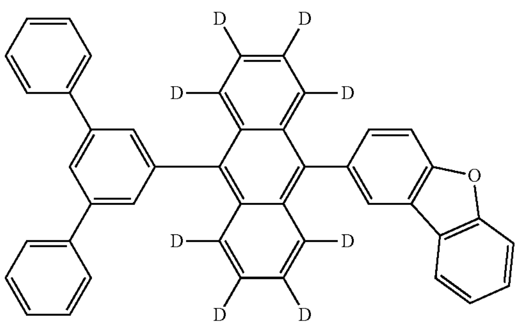
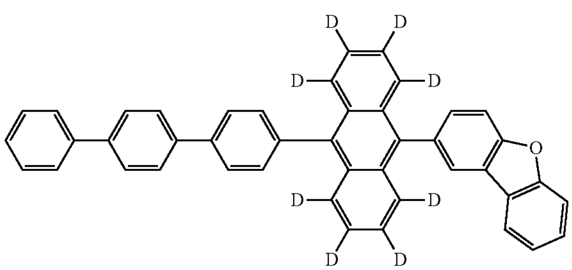
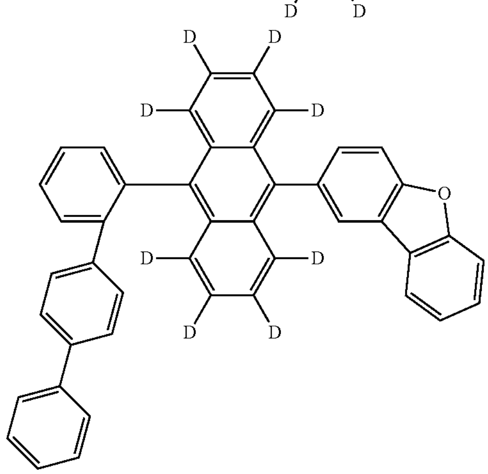
-continued
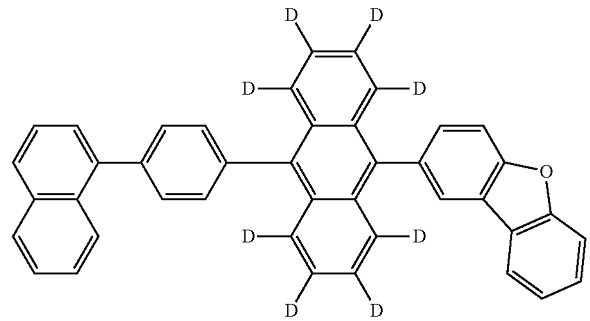
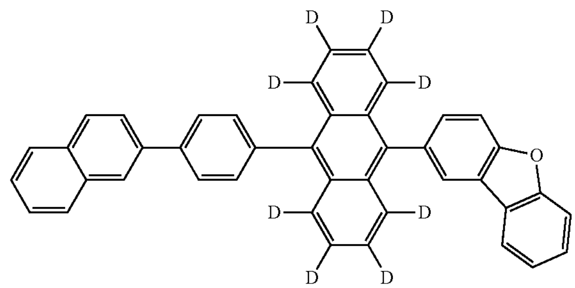
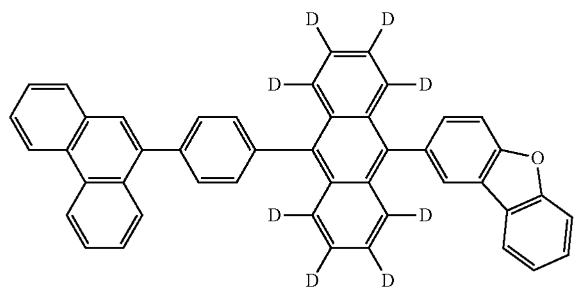
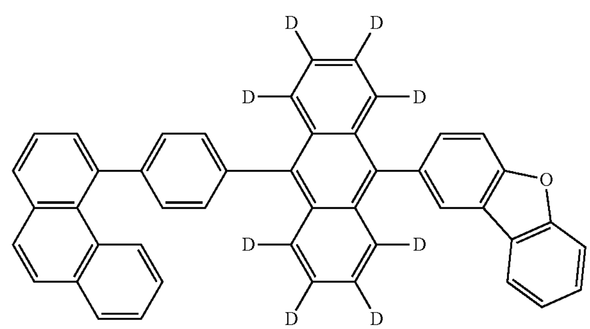
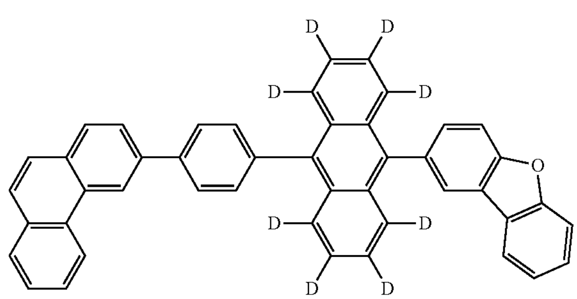

-continued
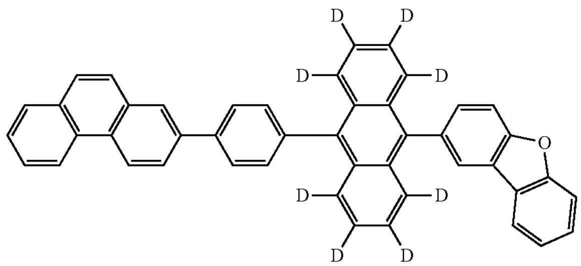
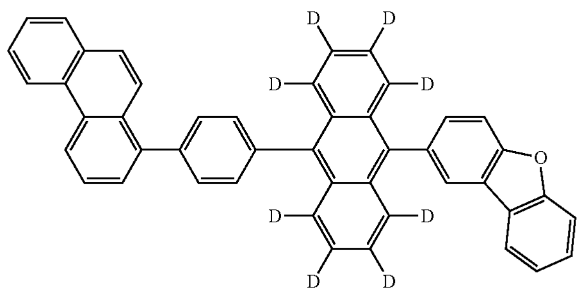
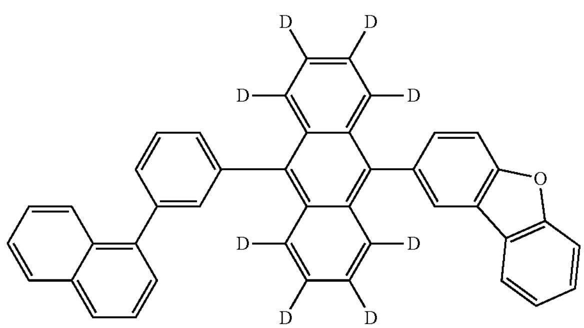
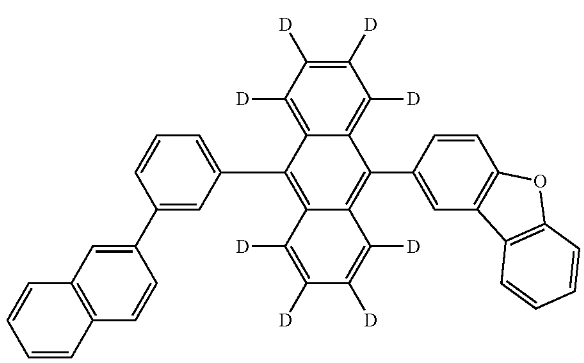
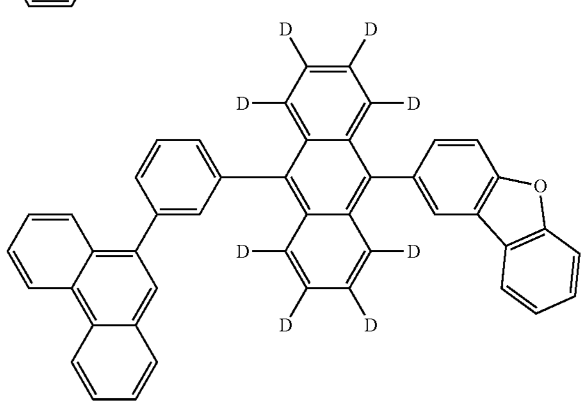
-continued
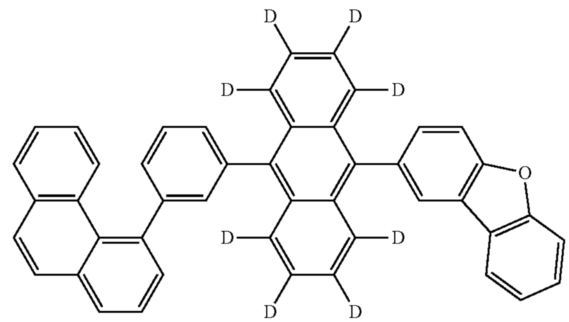
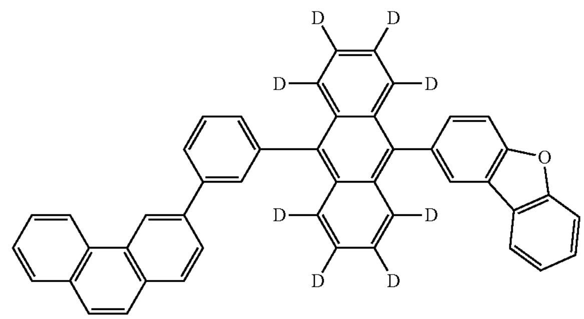
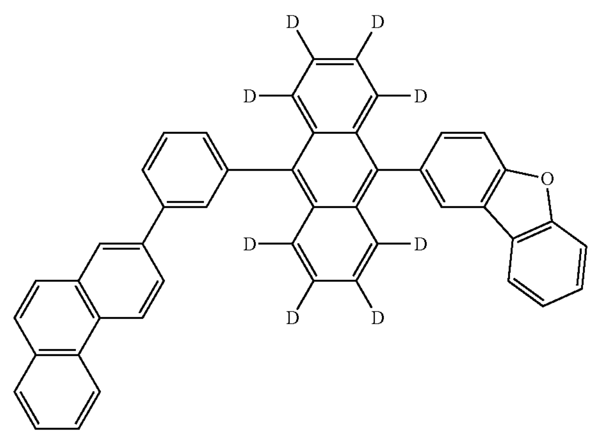
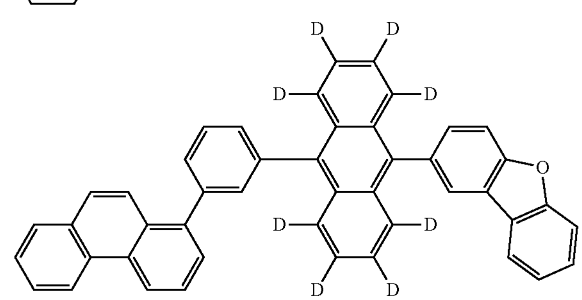
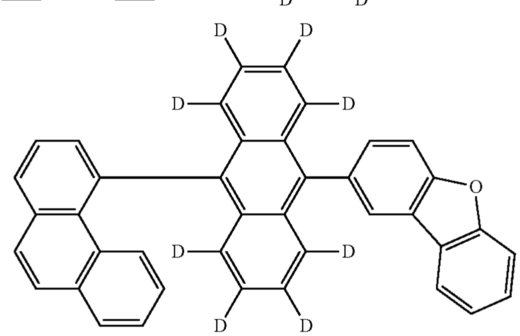

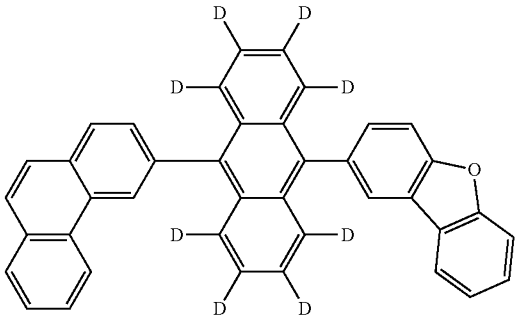
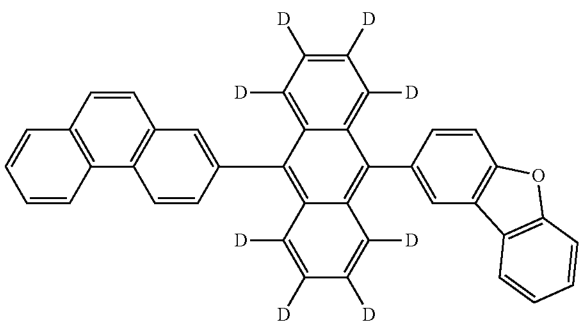
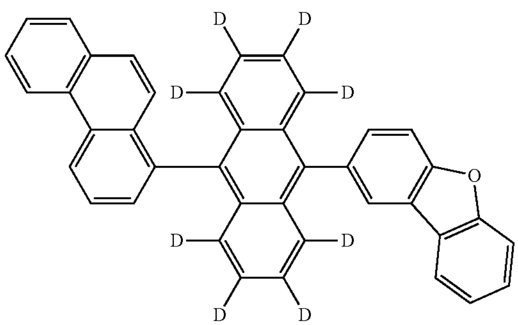
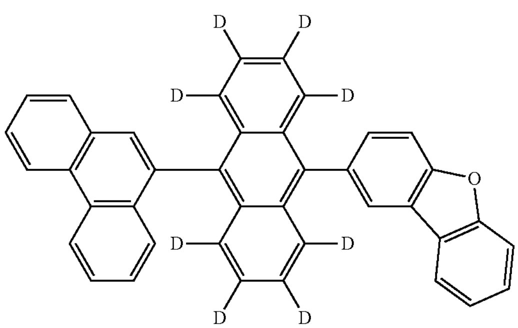
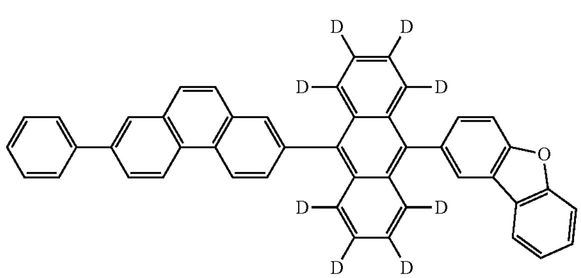
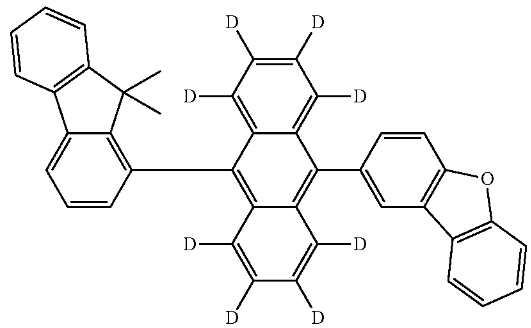
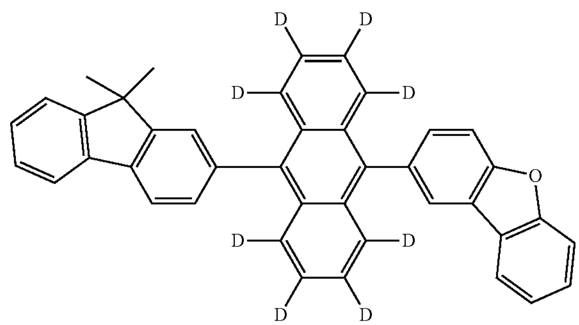
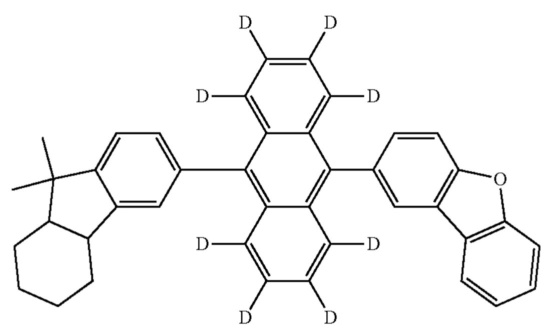
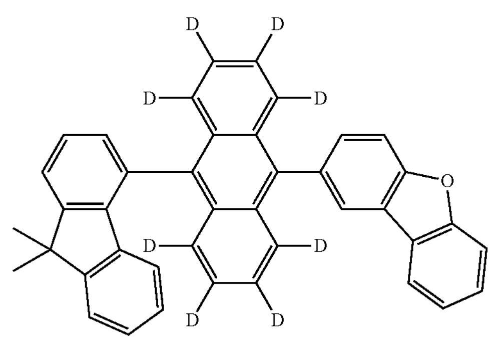
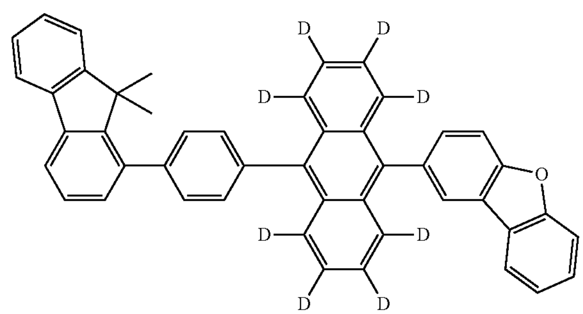

-continued
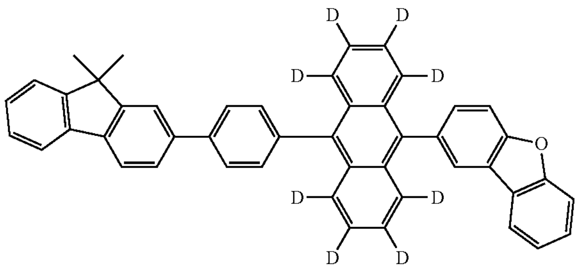
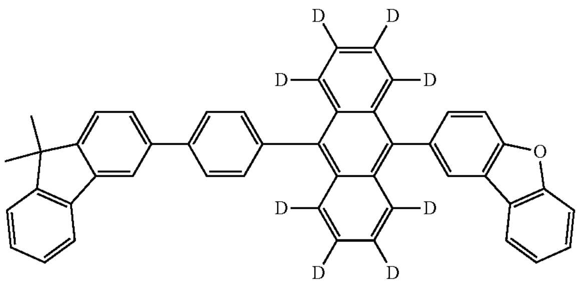
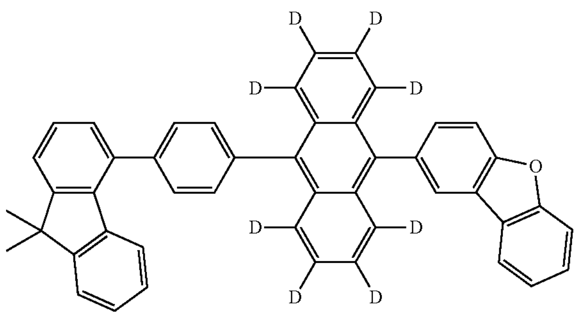
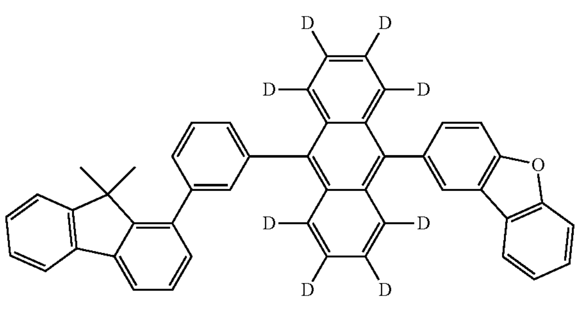
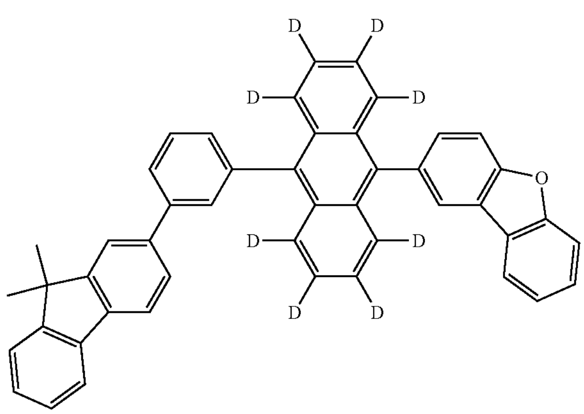
-continued
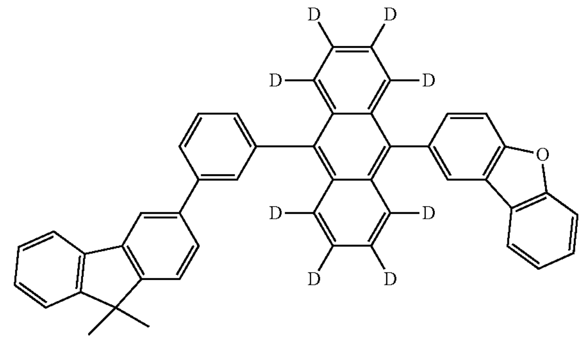
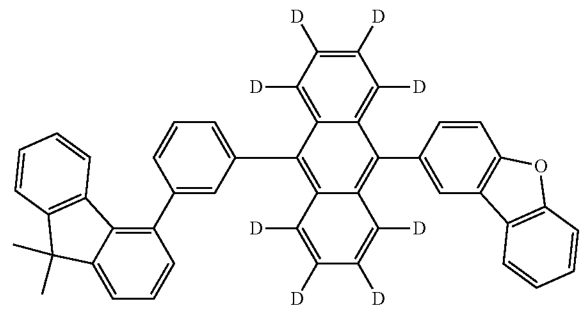
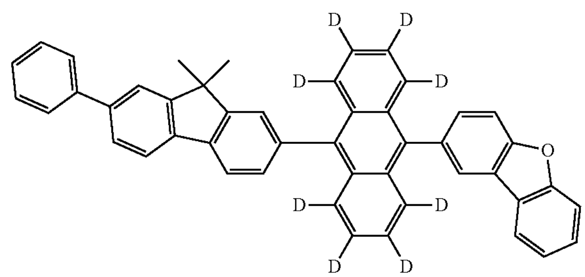
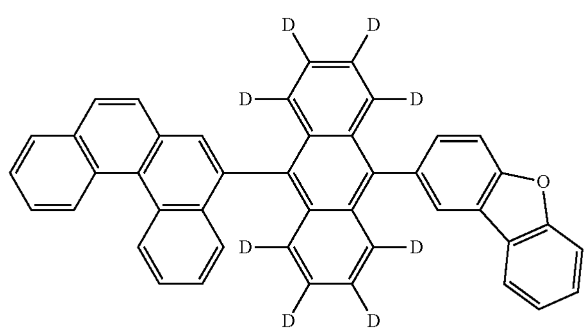
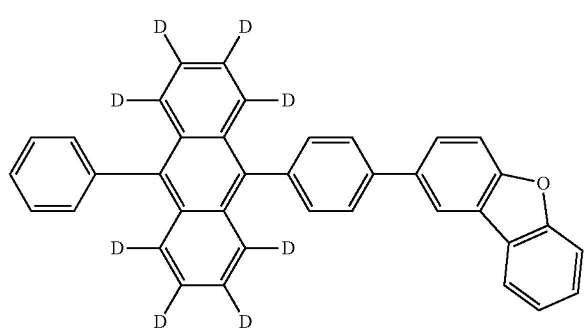

-continued
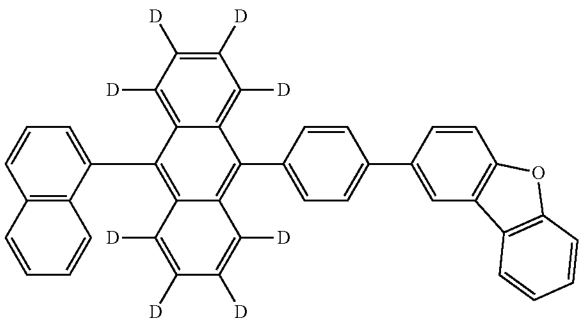
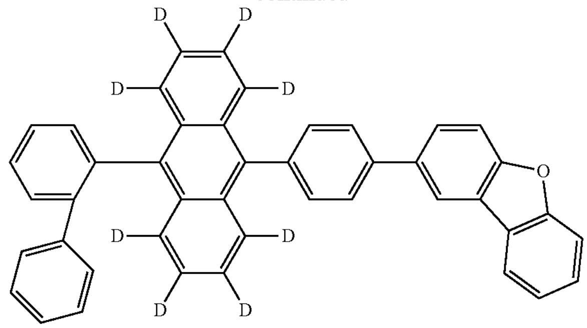
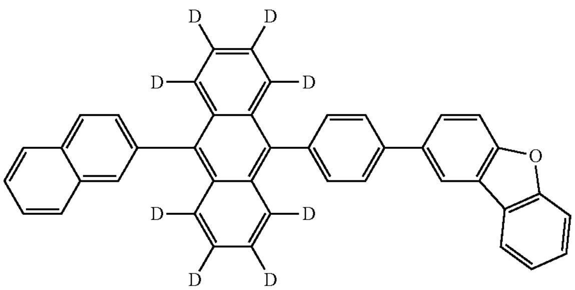
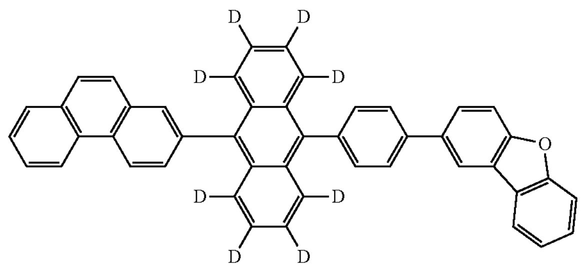
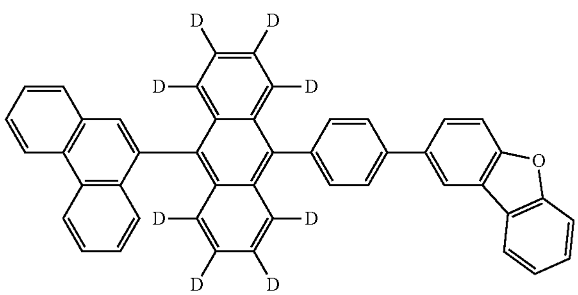
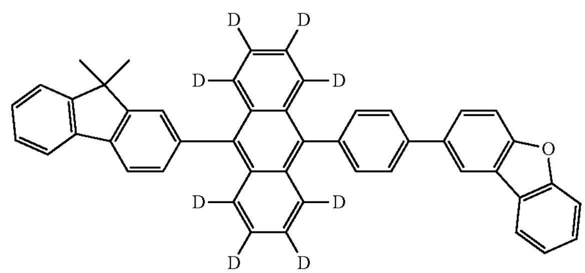
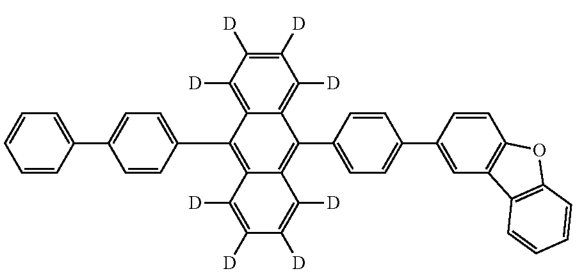
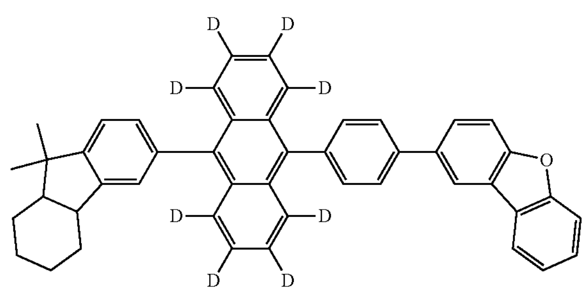
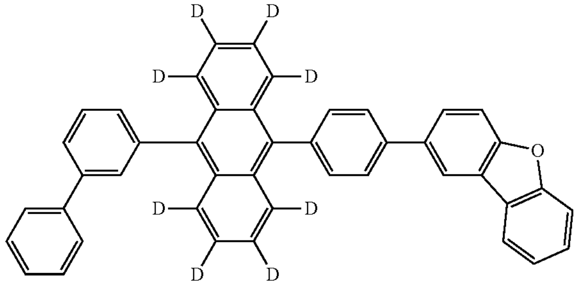
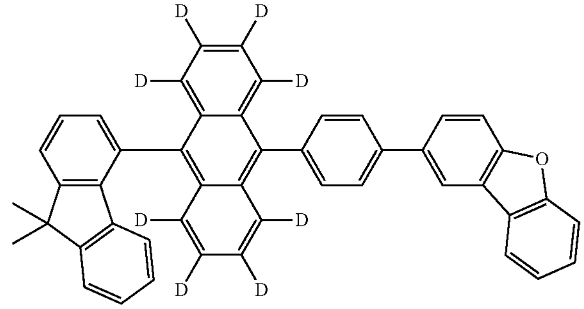

-continued
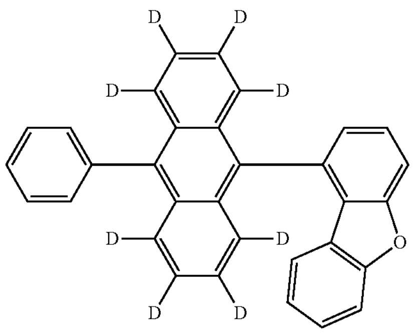
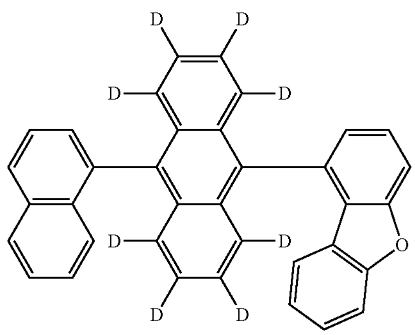
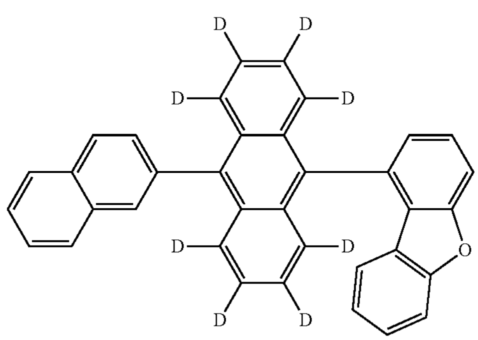
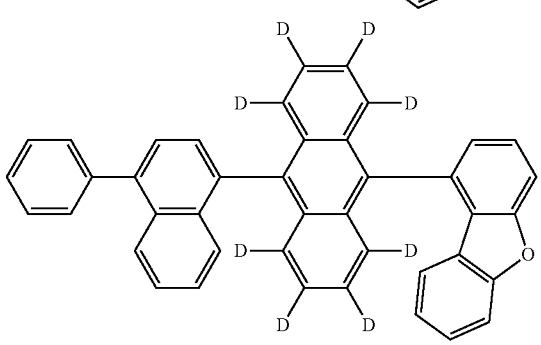
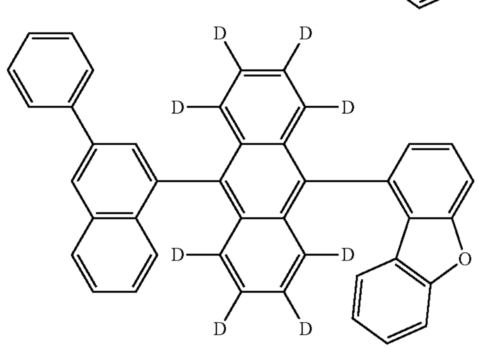
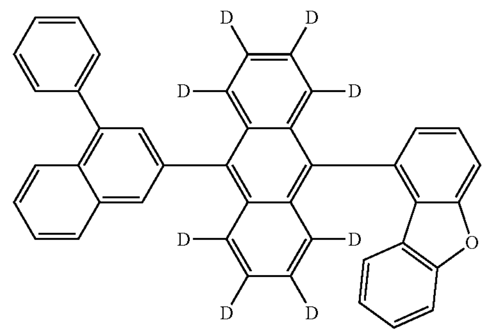
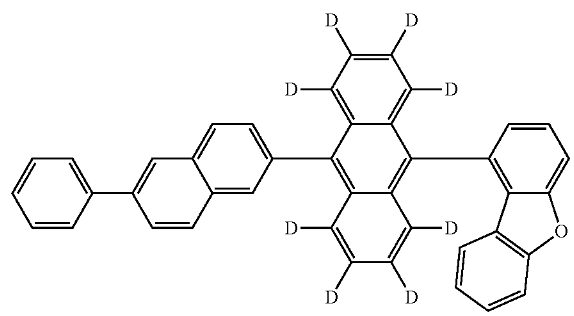
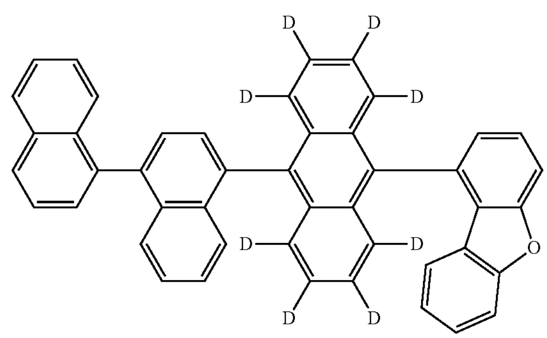
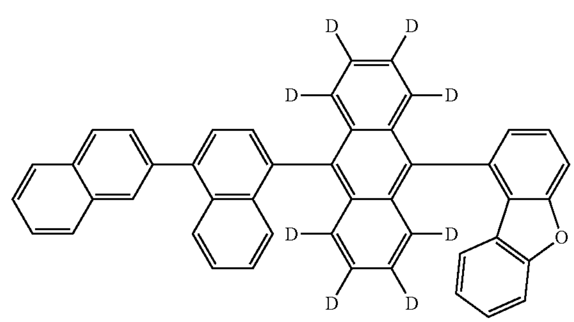
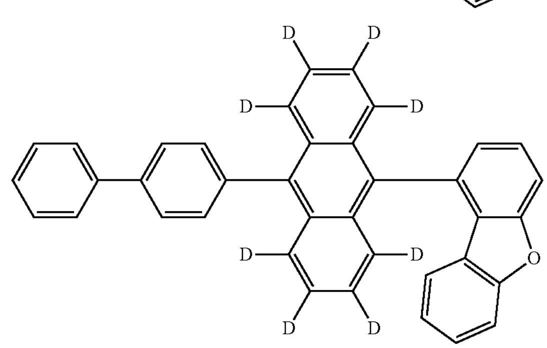

-continued
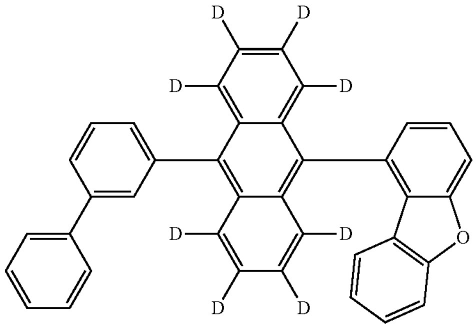
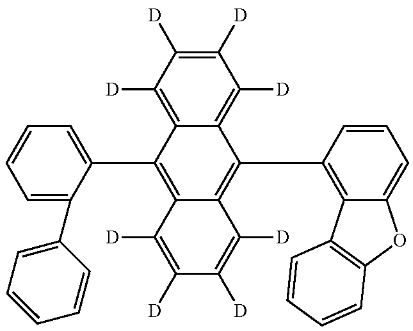
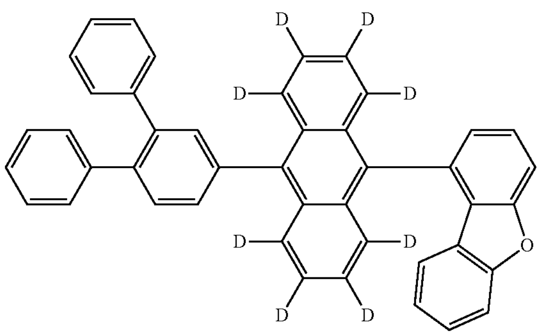
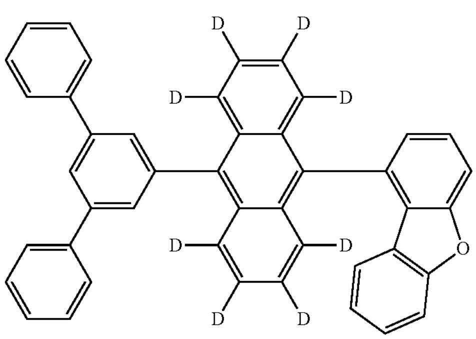
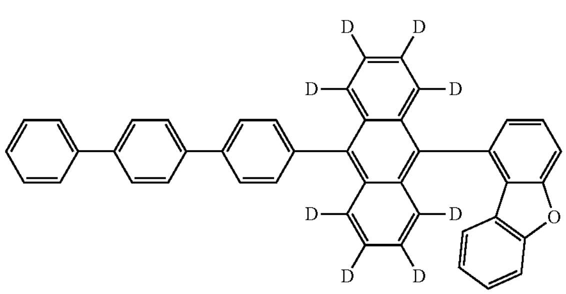
-continued
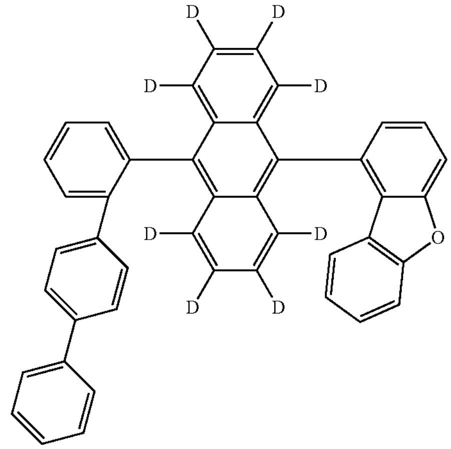
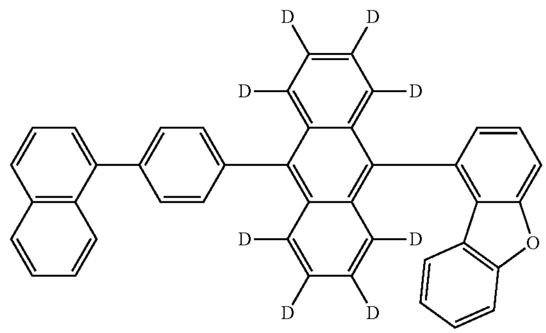
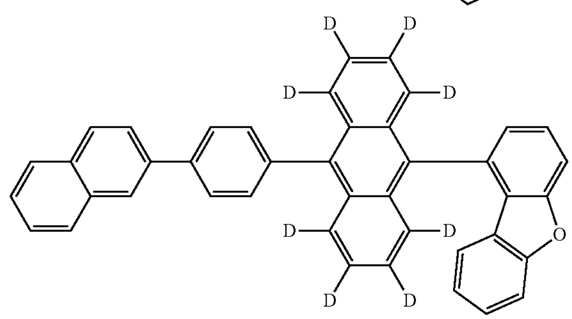
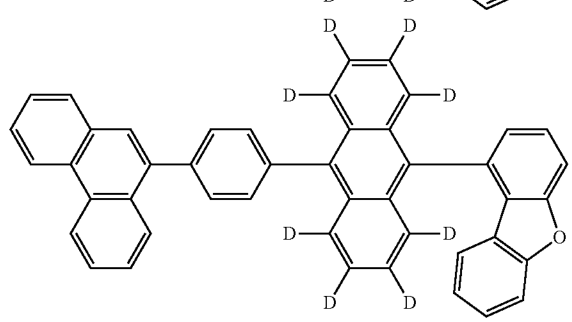
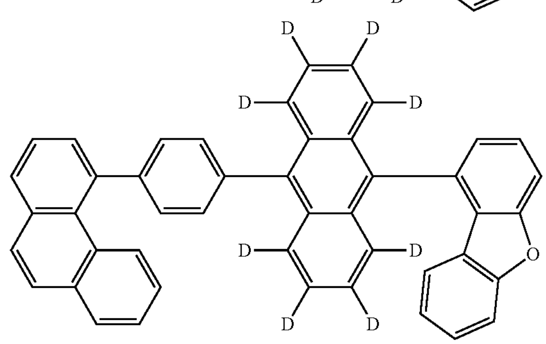

-continued
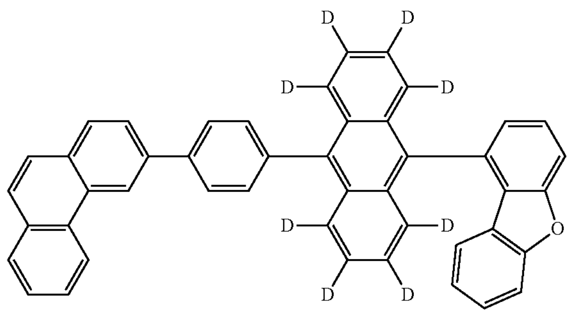
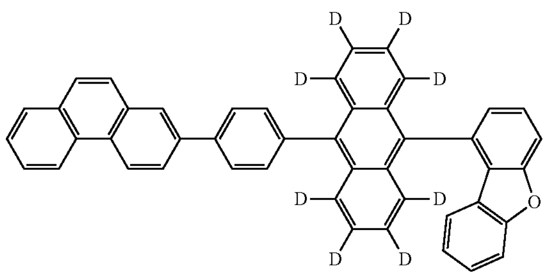
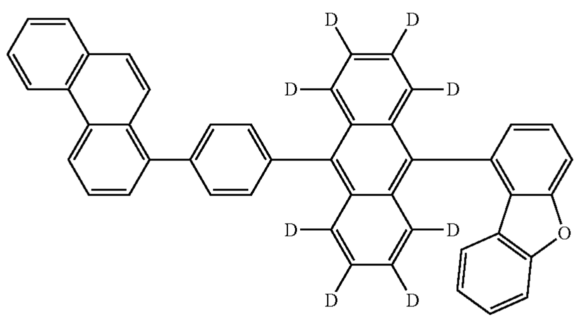
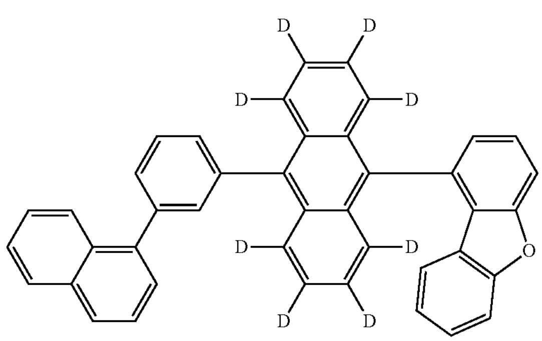
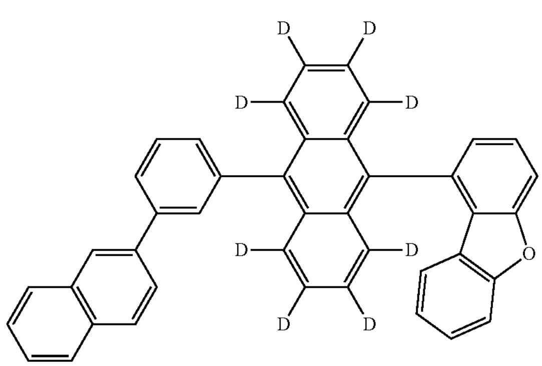
-continued
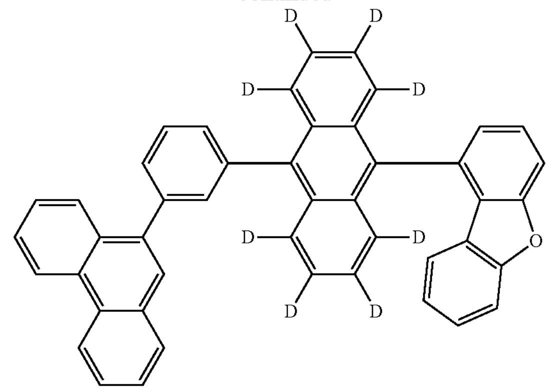
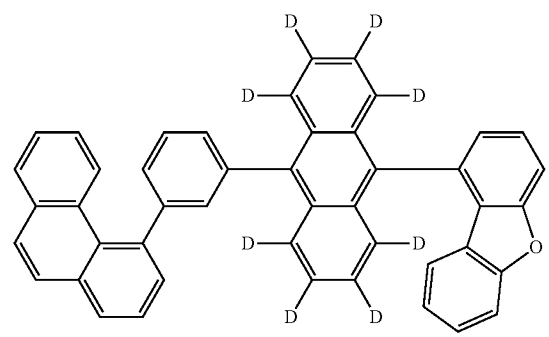
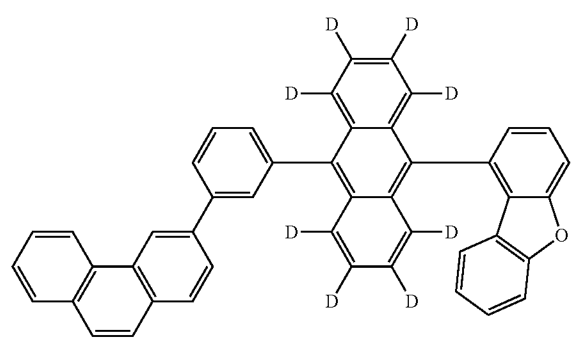
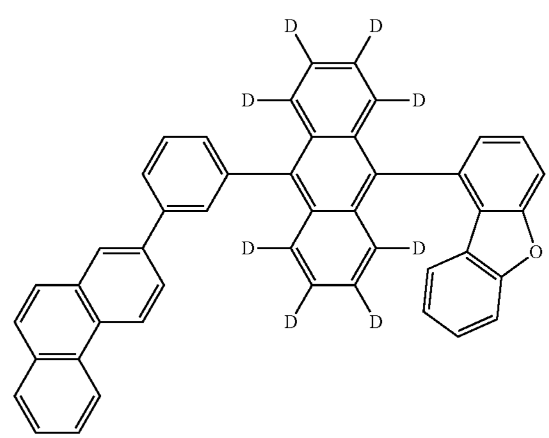

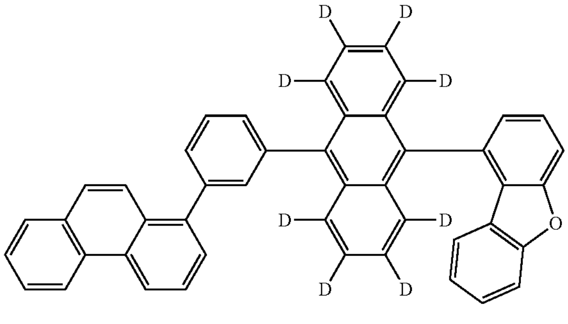
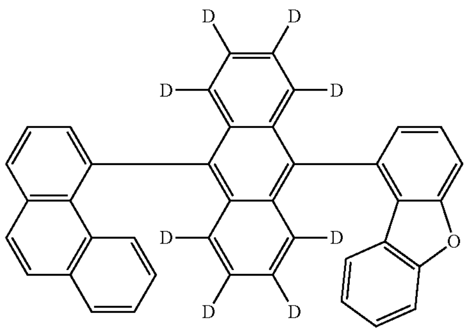
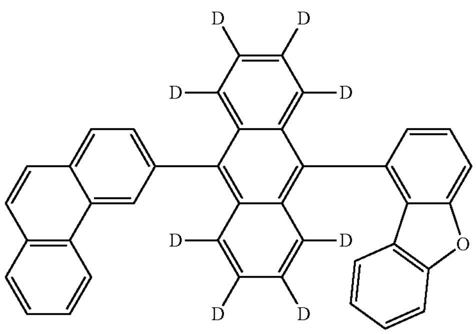
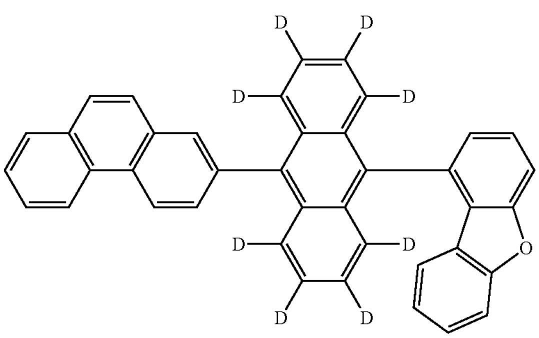
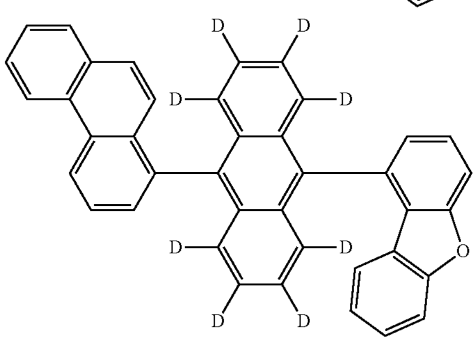
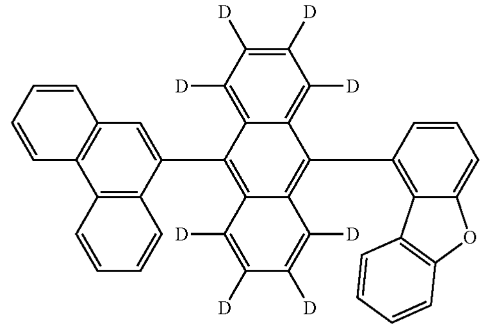
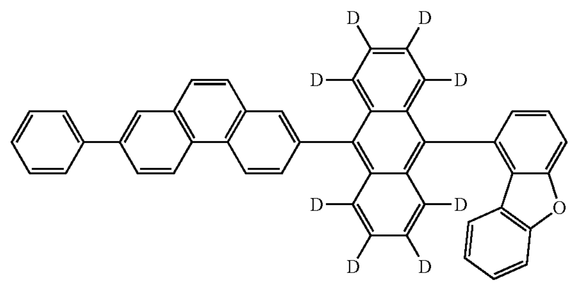
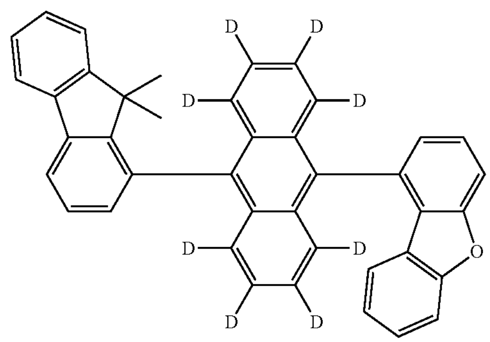
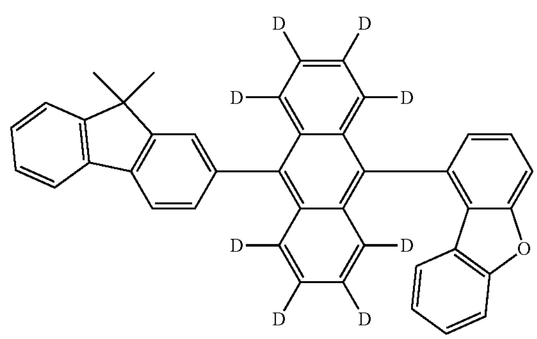
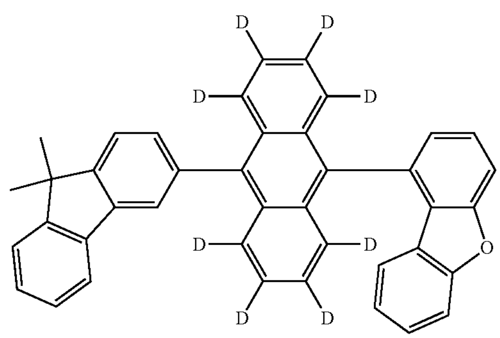

-continued
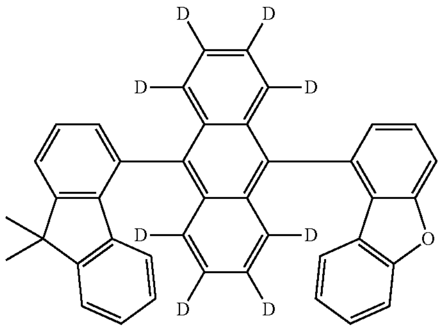
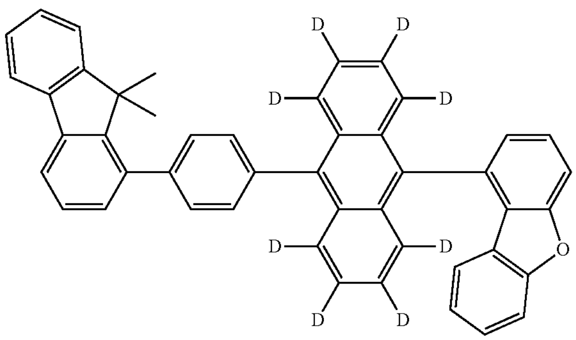
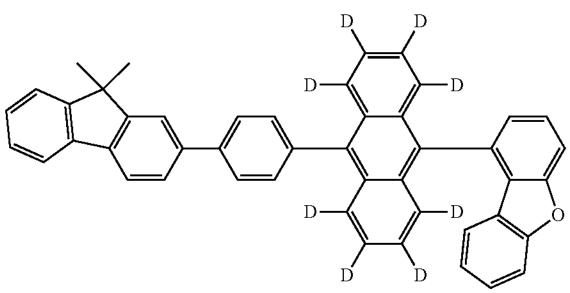
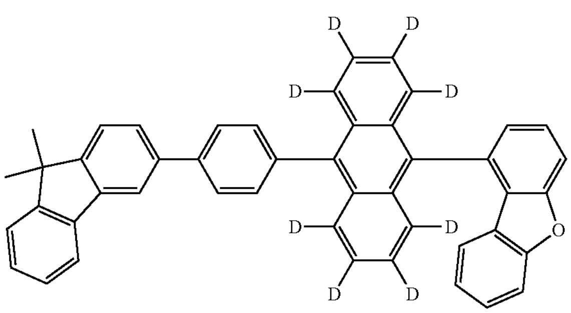
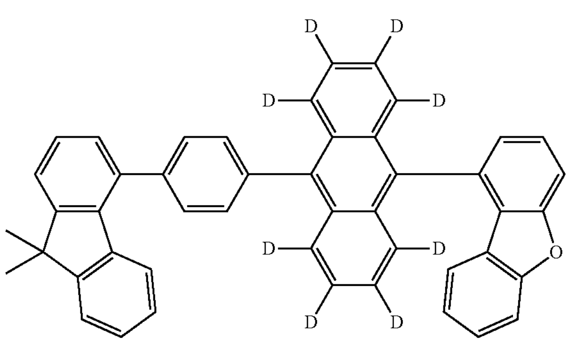
-continued
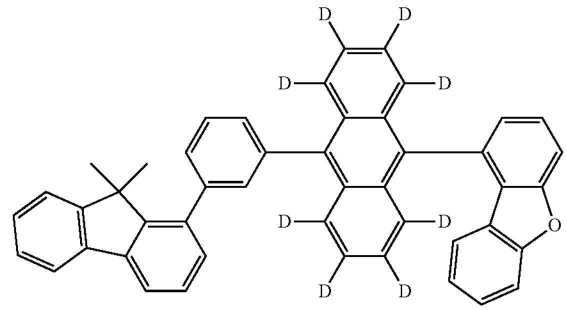
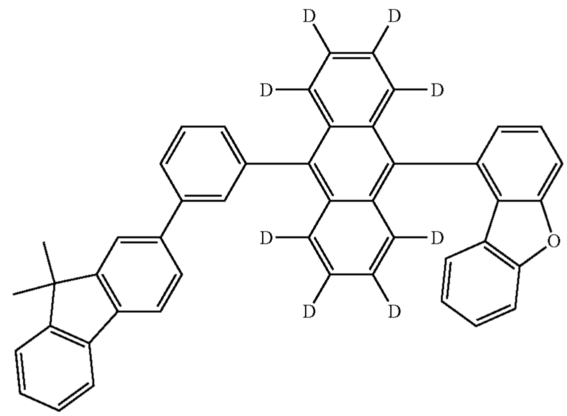
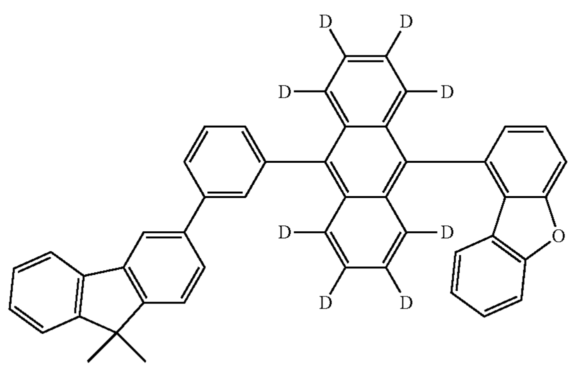
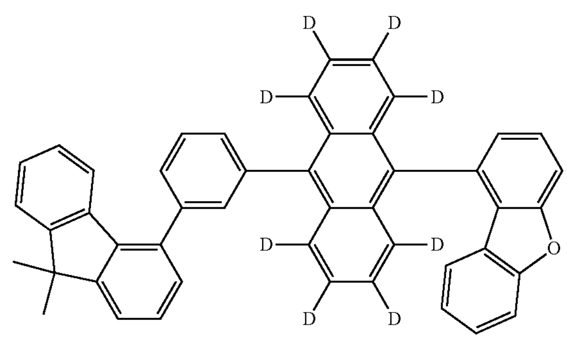
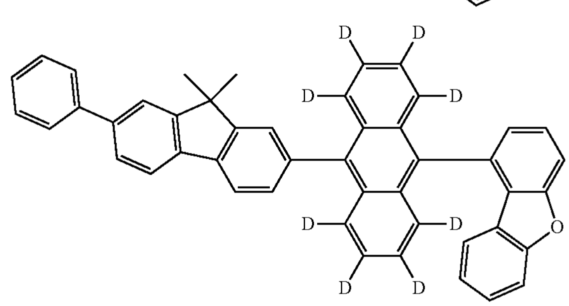

-continued
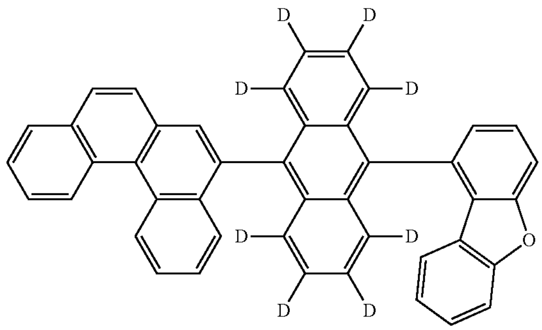
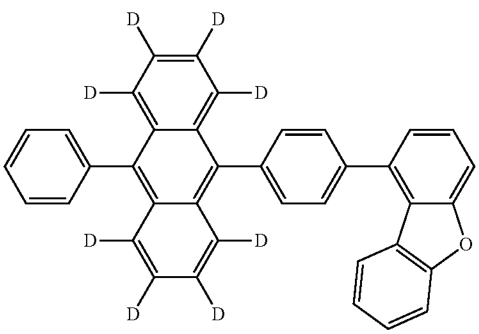
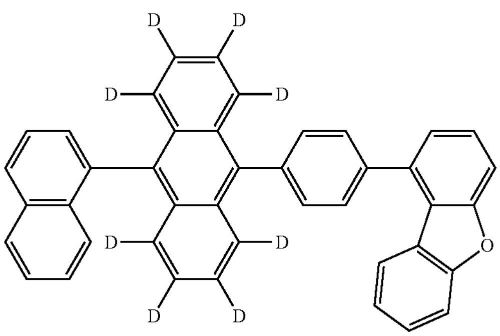
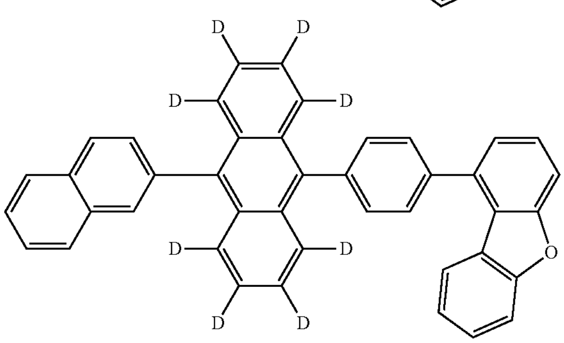
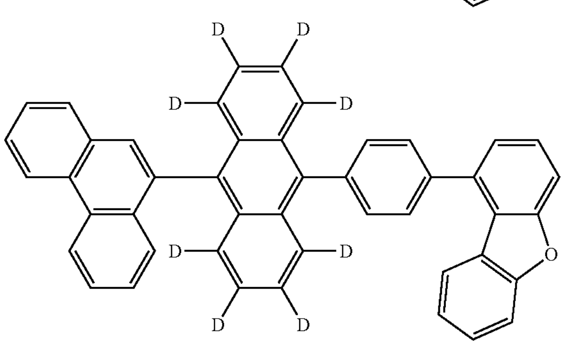
-continued
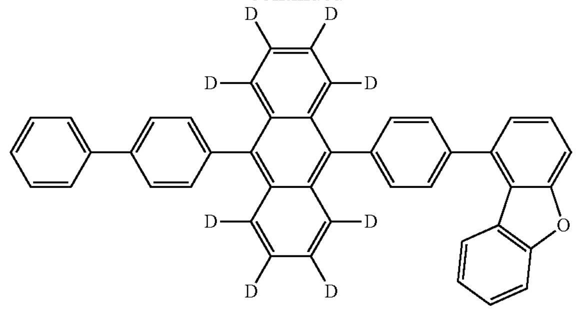
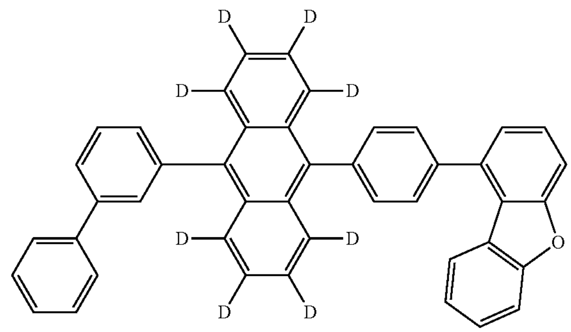
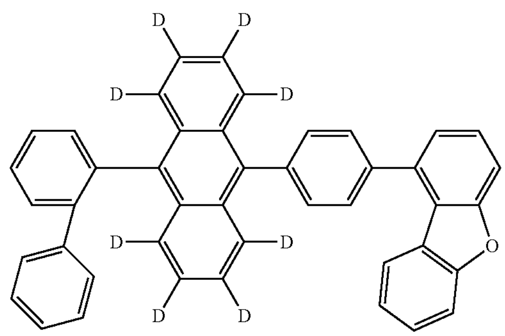
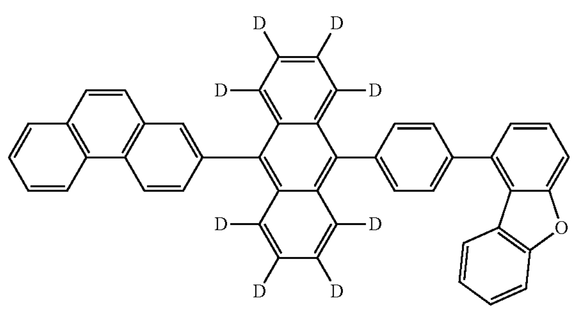
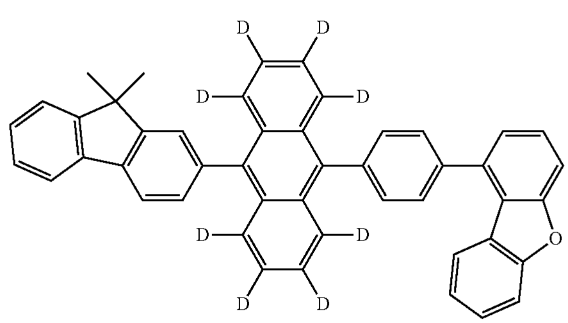

-continued
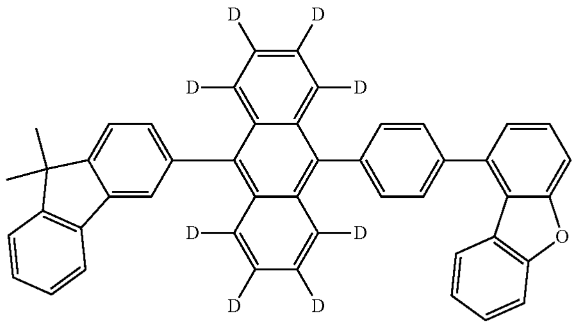
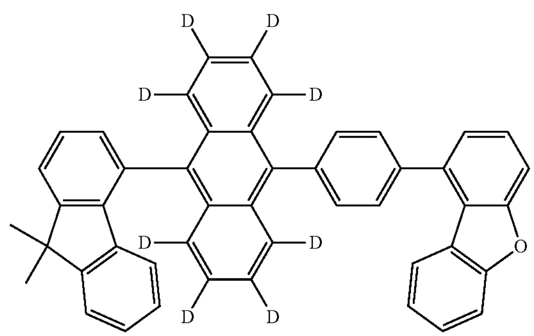
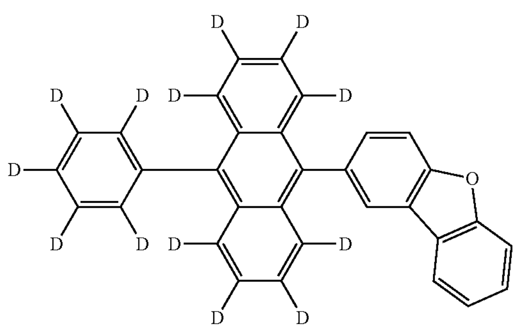
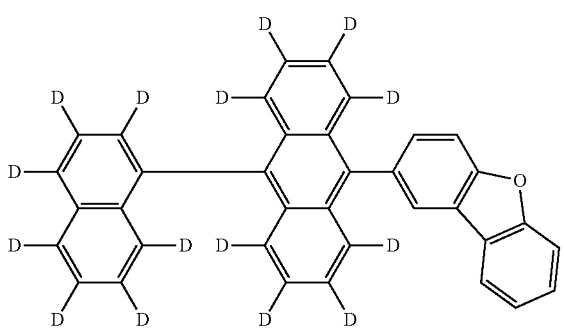
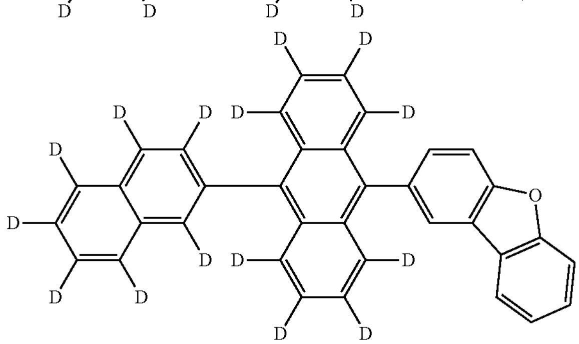
-continued
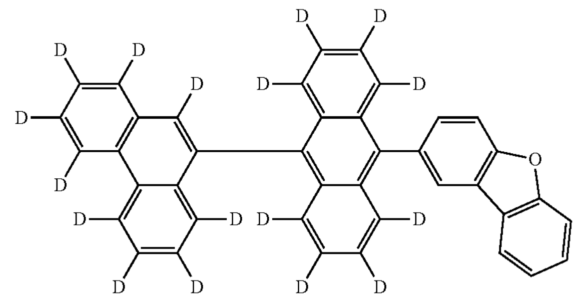
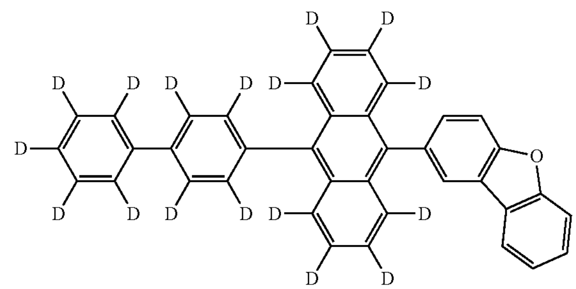
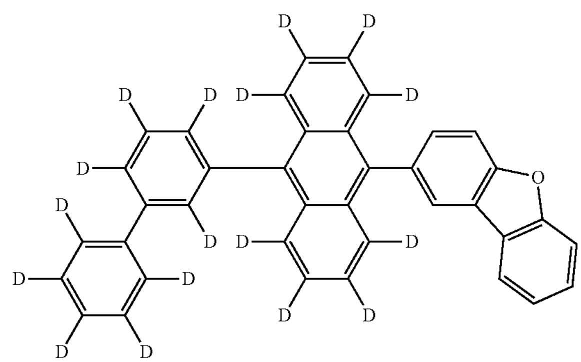
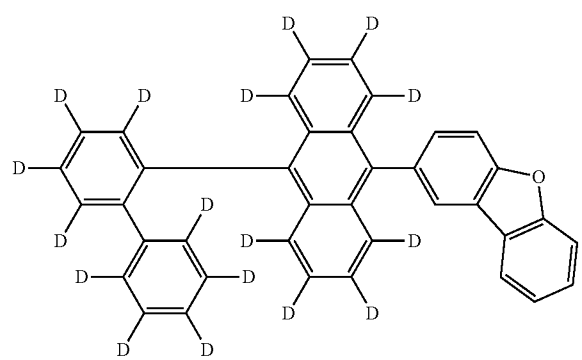
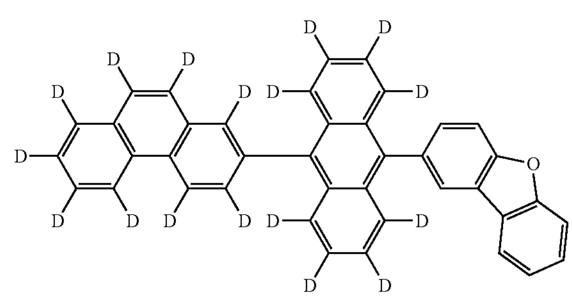

-continued
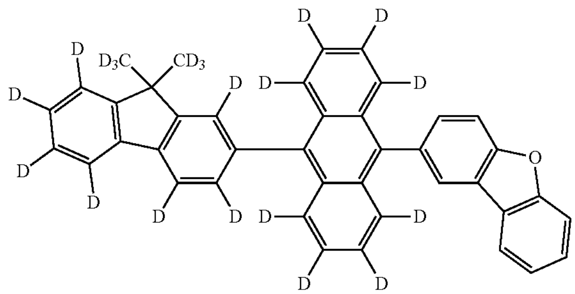
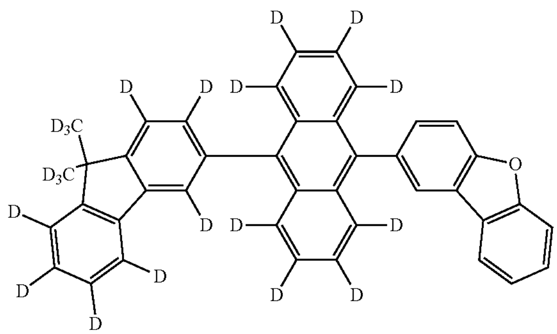
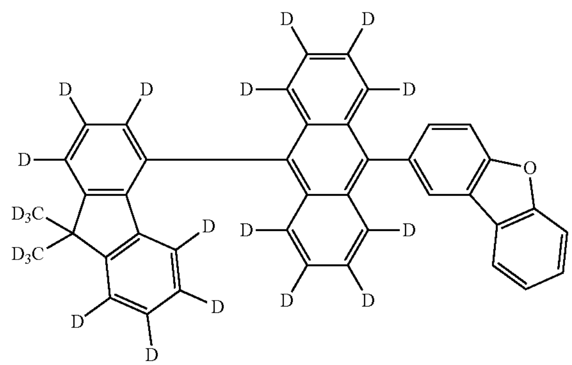
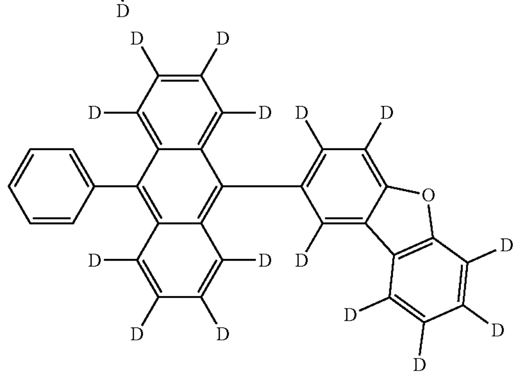
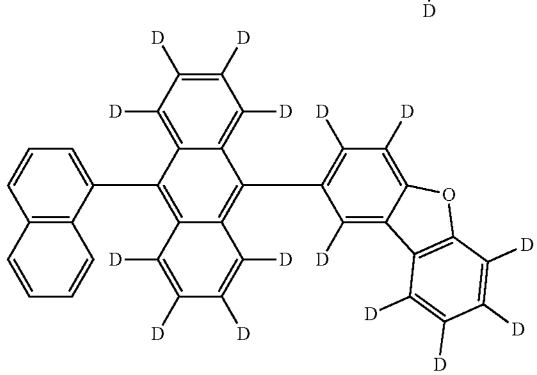
-continued
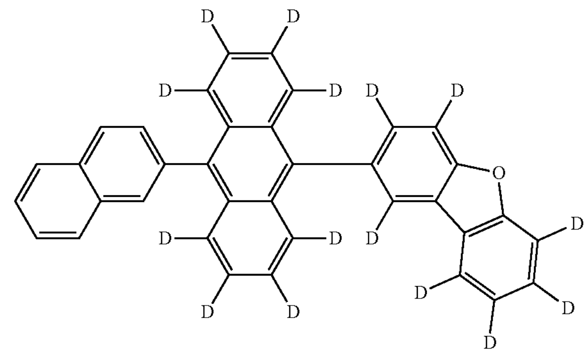
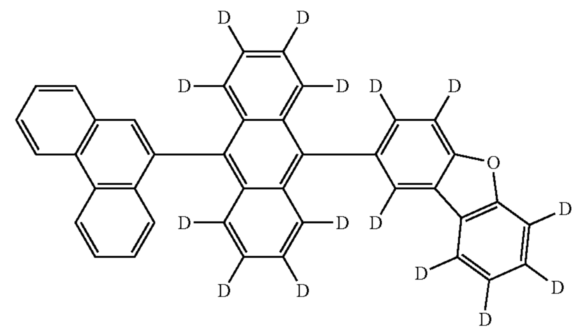
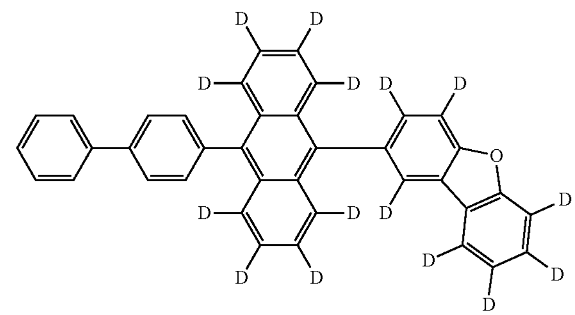
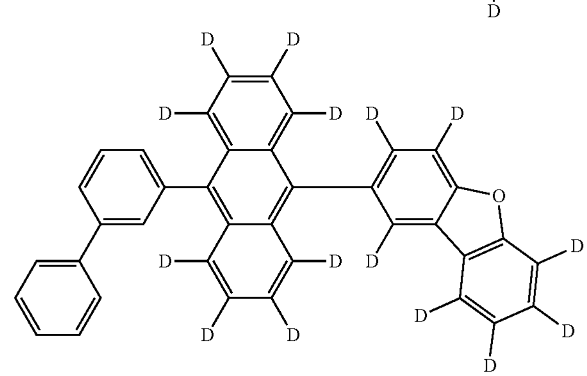
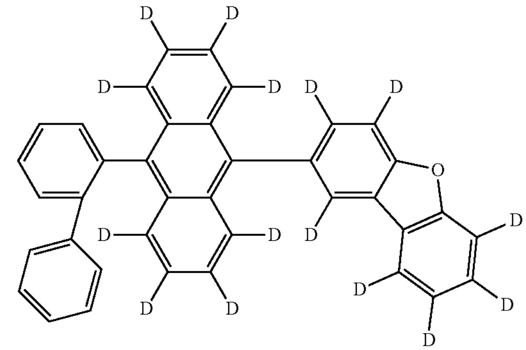

-continued
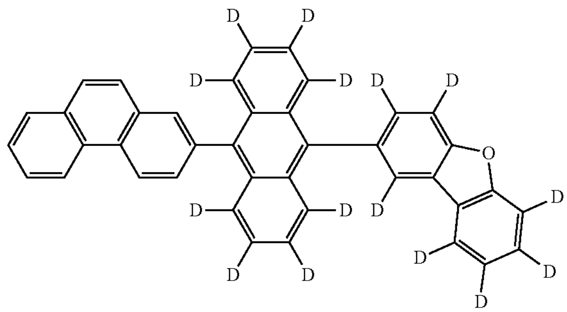
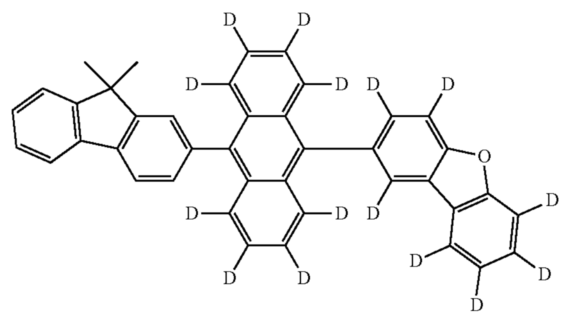
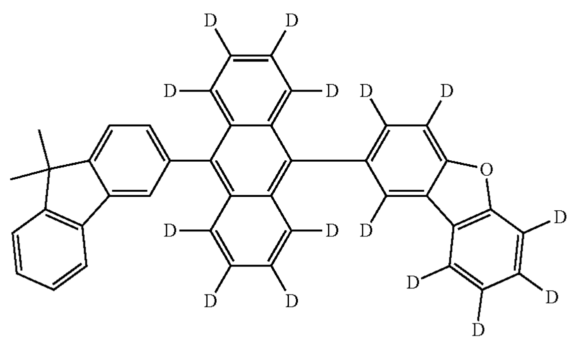
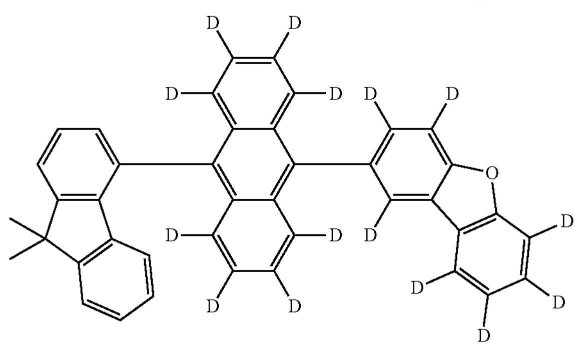
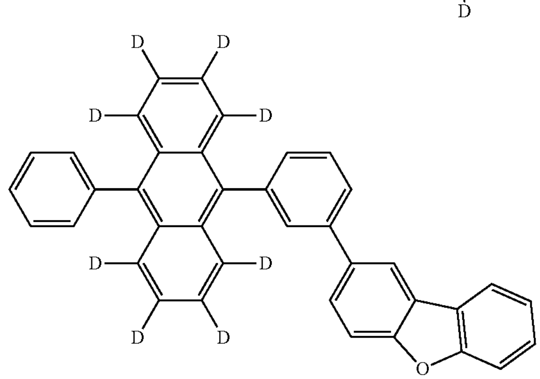
-continued
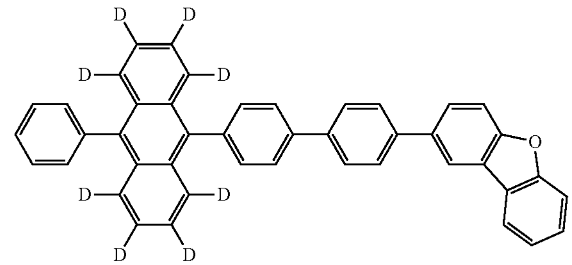
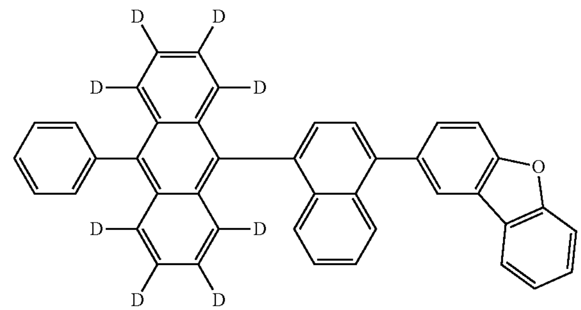
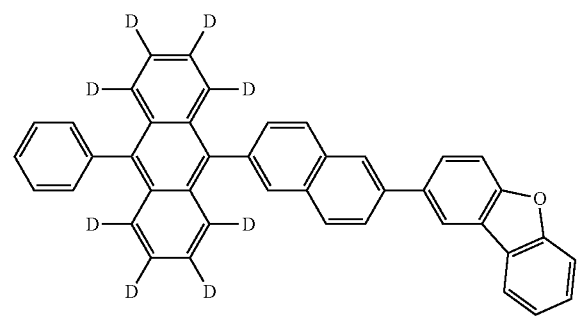
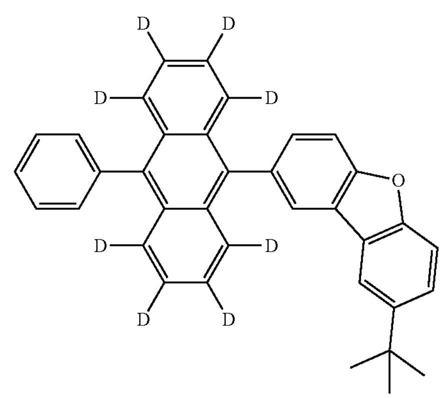
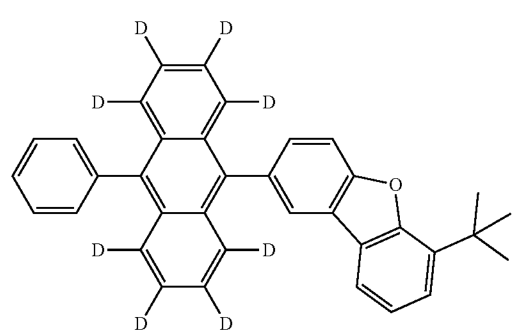

-continued
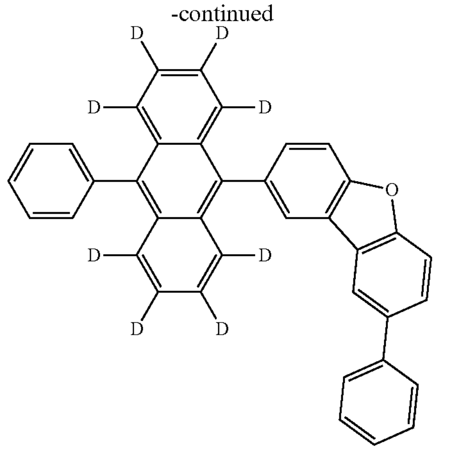
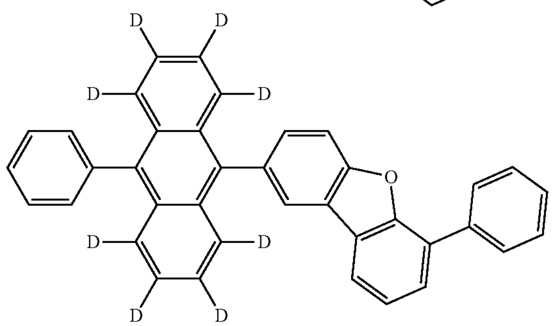
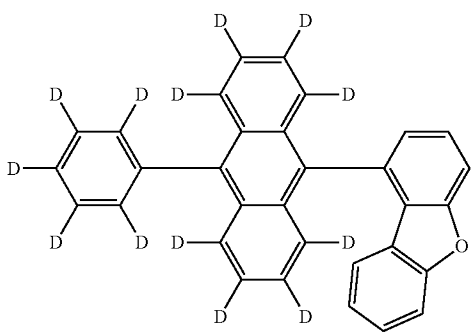
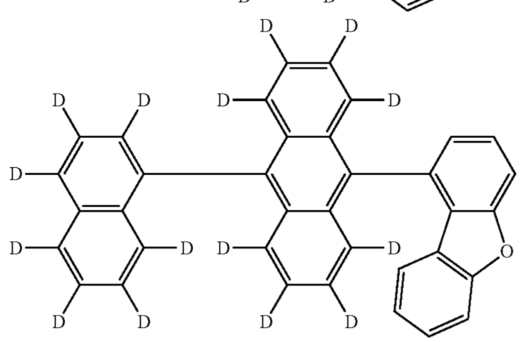
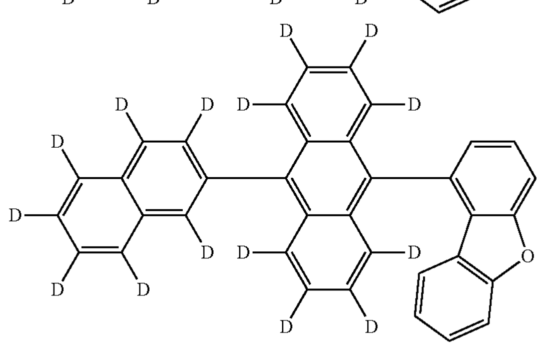
-continued
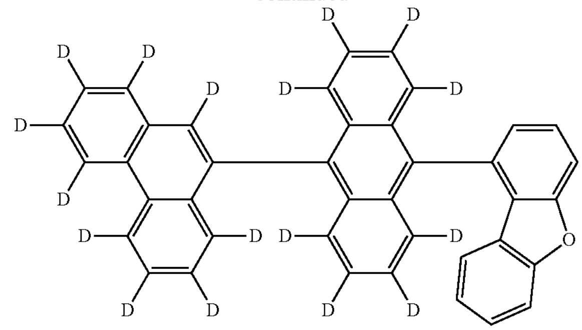
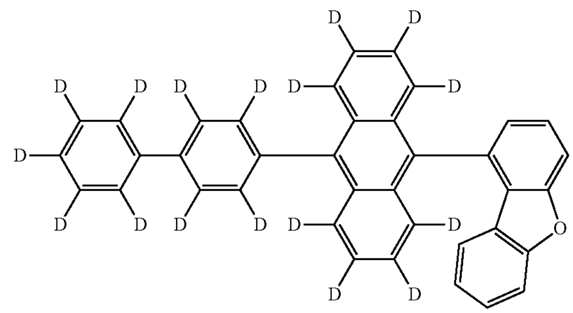
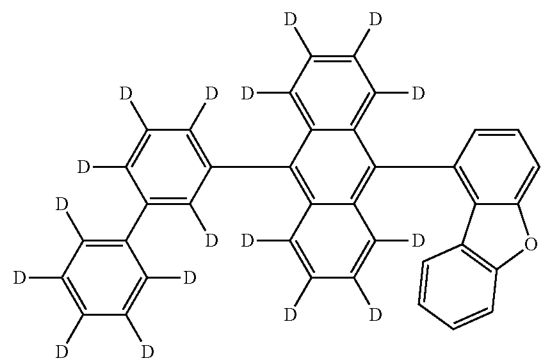
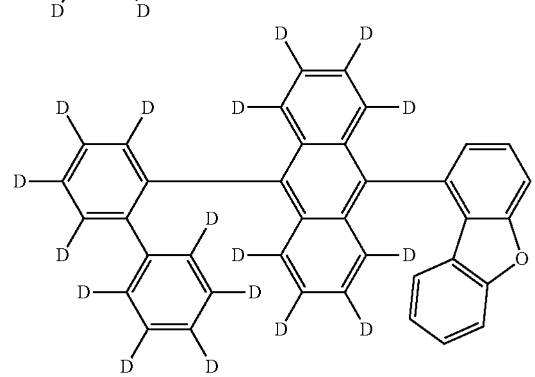
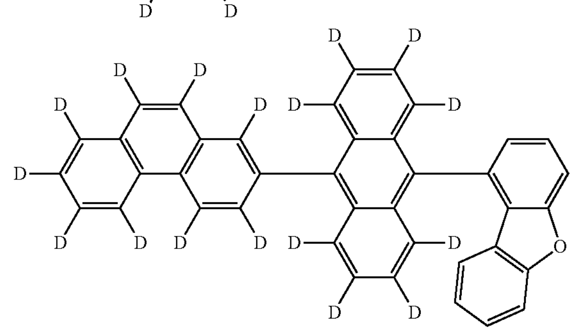

-continued
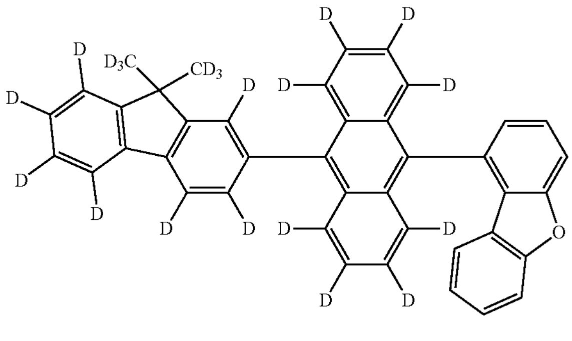
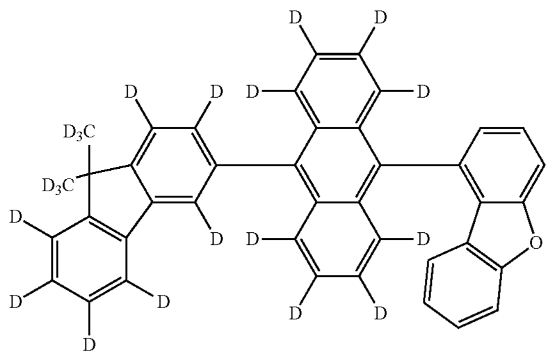
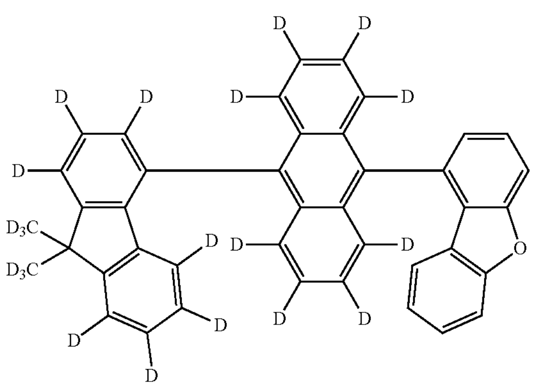
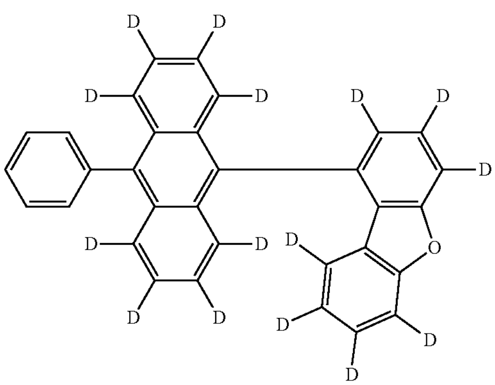
-continued
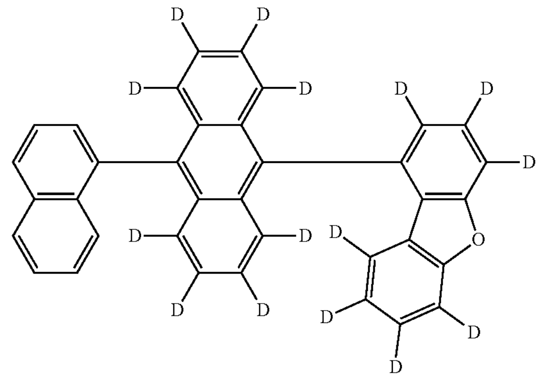
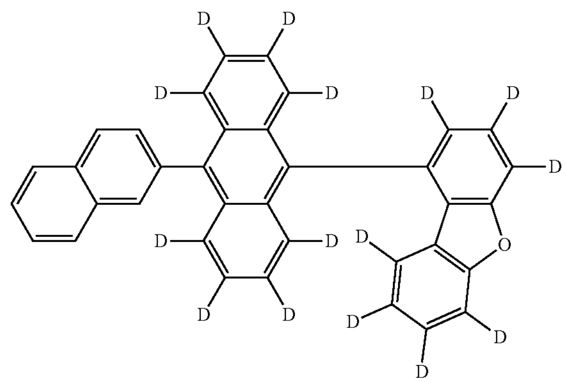
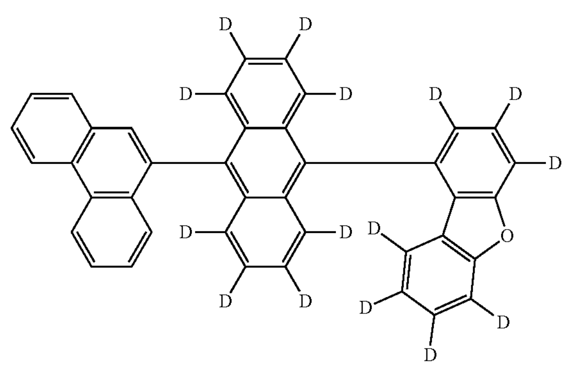
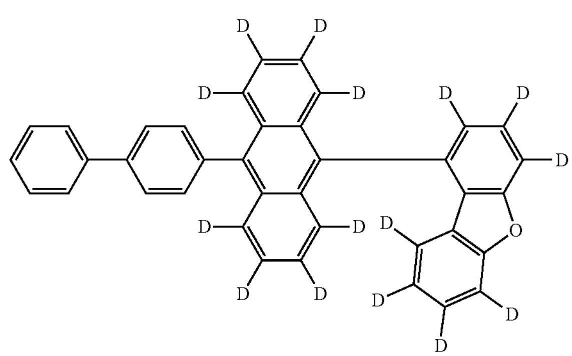

-continued
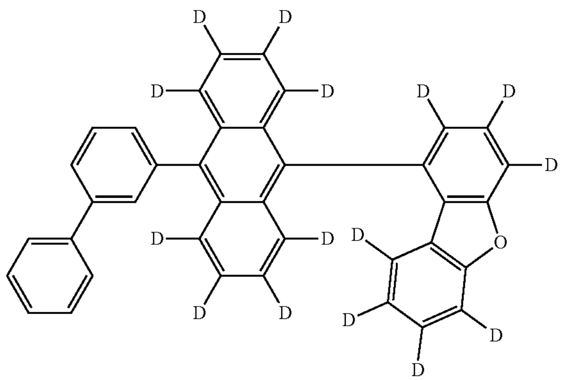
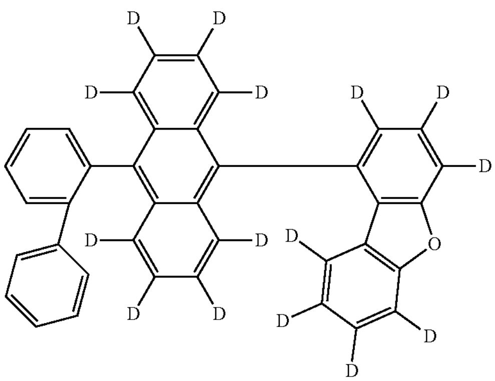
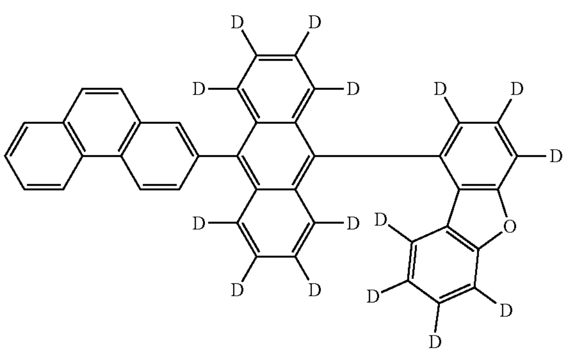
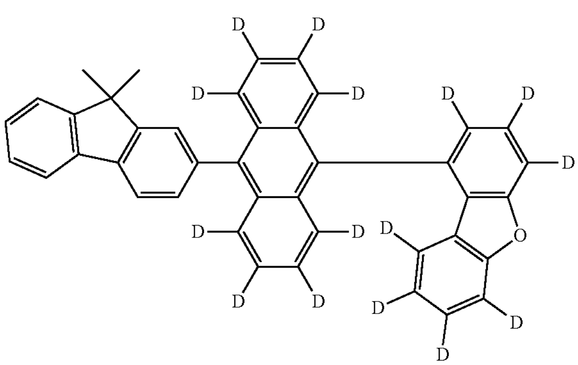
-continued
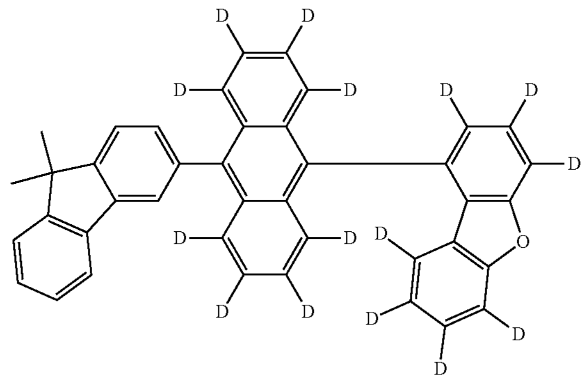
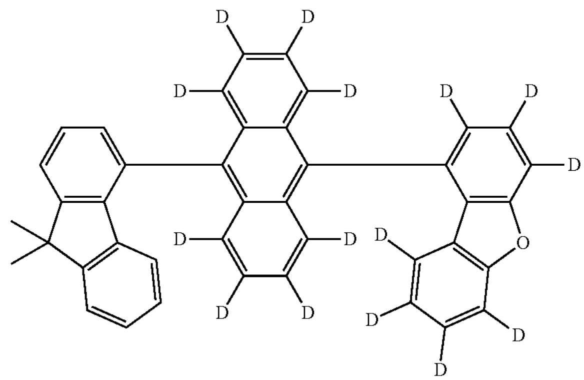
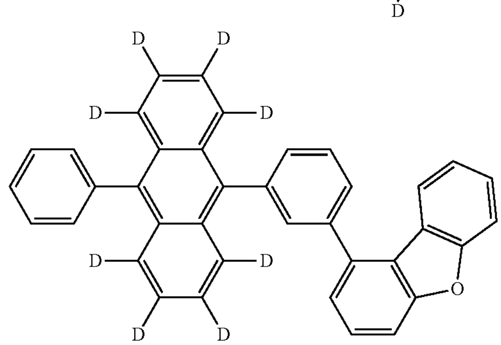
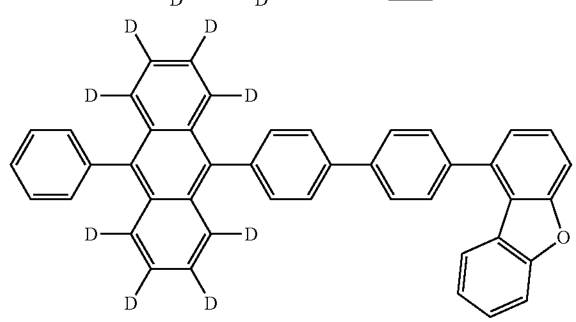
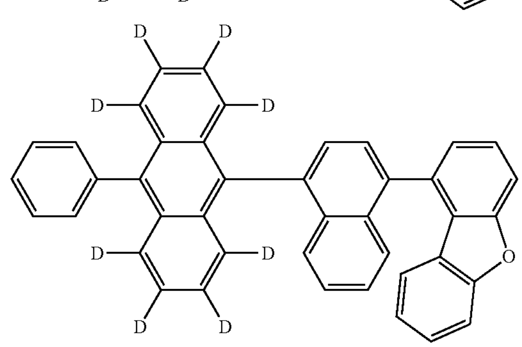

-continued

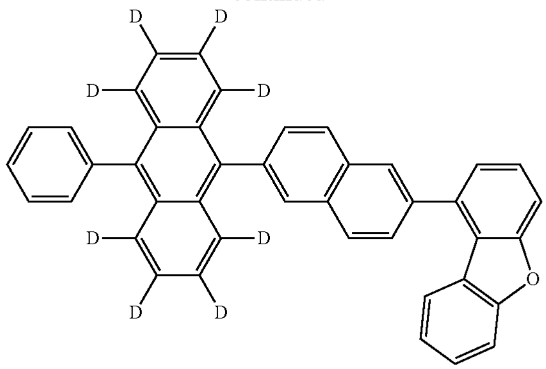

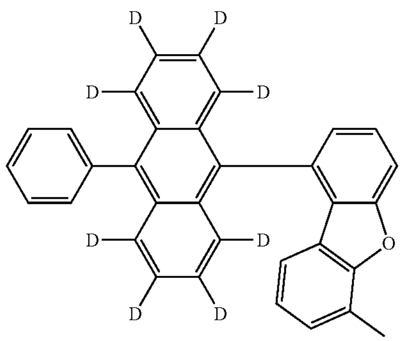

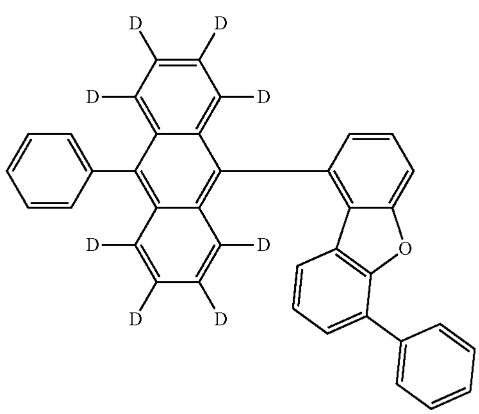

A third aspect of the compound represented by the formula (1) is a compound represented by the following formula (1C).

(1C)

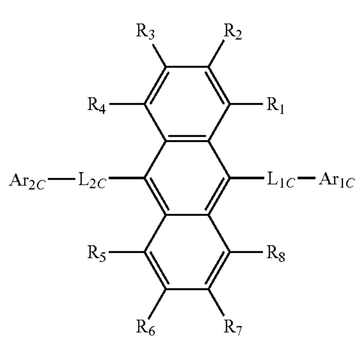

In the formula (1C), $R_1$ to $R_8$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of $R_{901}$ to $R_{907}$ are present, the two or more of each of $R_{901}$ to $R_{907}$ may be the same as or different from each other At least one of $R_1$ to $R_8$ is a deuterium atom.

Adjacent two or more of $R_1$ to $R_4$, and adjacent two or more of $R_5$ to $R_8$ do not form a ring by bonding with each other.

$L_{1C}$ and $L_{2C}$ are independently a single bond, a substituted or unsubstituted arylene group including 6 to 30 ring carbon atoms, or a substituted or unsubstituted divalent heterocyclic group including 5 to 30 ring atoms.

$Ar_{2C}$ is a substituted or unsubstituted aryl group including 6 to 50 ring carbon atoms, or a substituted or unsubstituted monovalent heterocyclic group including 5 to 50 ring atoms.

$Ar_{1C}$ is a monovalent group represented by the following formula (2C), (3C) or (4C).

(2C)

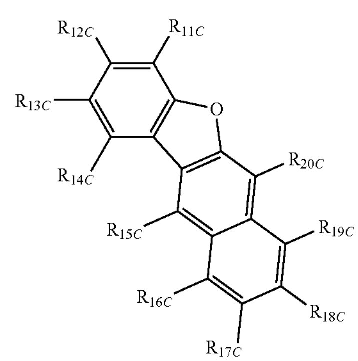

-continued (3C)

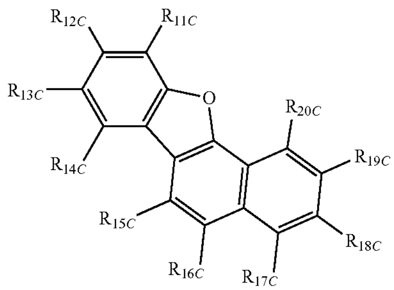

(4C)

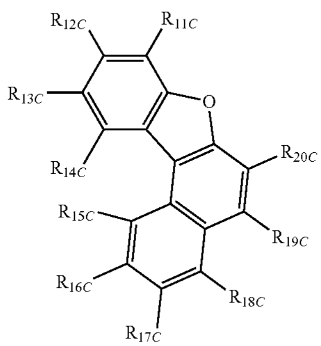

In the formulas (2C) to (4C), one or more sets of adjacent two of $R_{15C}$ to $R_{20C}$ form a substituted or unsubstituted, saturated or unsaturated ring by bonding with each other, or do not form a substituted or unsubstituted, saturated or unsaturated ring.

In the case when one or more sets of adjacent two of $R_{15C}$ to $R_{20C}$ do not form a substituted or unsubstituted, saturated or unsaturated ring by bonding with each other, one of $R_{11C}$ to $R_{20C}$ is a single bond which bonds with $L_{1C}$.

In the case when one or more sets of adjacent two of $R_{15C}$ to $R_{20C}$ form a substituted or unsubstituted, saturated or unsaturated ring by bonding with each other, one of $R_{15C}$ to $R_{20C}$ and $R_{11C}$ to $R_{14C}$ which do not form the substituted or unsubstituted, saturated or unsaturated ring is a single bond which bonds with $L_{1C}$.

$R_{11C}$ to $R_{20C}$ which do not form the substituted or unsubstituted, saturated or unsaturated ring, and which is not a single bond which bonds with $L_{1C}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})$ $(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1C).

All of $R_1$ to $R_8$ may be deuterium atoms, or some (e.g. one or two) of $R_1$ to $R_8$ may be deuterium atoms.

$R_1$ to $R_8$ which are not deuterium atoms are preferably hydrogen atoms (protium atoms).

In one embodiment, at least one hydrogen atom possessed by one or more selected from the group consisting of $L_{1C}$ and $L_{2C}$ is a deuterium atom. Specifically, in one embodiment, one or more selected from the group consisting of $L_{1C}$ and $L_{2C}$ is an unsubstituted arylene group including 6 to 30 ring carbon atoms in which at least one of the hydrogen atoms is a deuterium atom, or an unsubstituted divalent heterocyclic group including 5 to 30 ring atoms in which at least one of the hydrogen atoms is a deuterium atom.

In one embodiment, be and be are independently a single bond, or a substituted or unsubstituted arylene group including 6 to 14 ring carbon atoms. Preferably, at least one of be and be is a single bond.

In one embodiment, any of $R_{11C}$ to $R_{14C}$ in the formulas (2C) to (4C) is a single bond which bonds with $L_{1C}$.

In one embodiment, one or more sets of two adjacent of $R_{15C}$ to $R_{20C}$ in the formulas (2C) to (4C) do not form a substituted or unsubstituted, saturated or unsaturated ring by bonding with each other.

In one embodiment, $R_{11C}$ to $R_{20C}$ in the formulas (2C) to (4C), which are not a single bond which bonds with $L_{1C}$ and do not contribute to ring formation, are preferably hydrogen atoms.

In one embodiment, at least one of $R_{11C}$ to $R_{20C}$ in the formulas (2C) to (4C), which are not a single bond which bonds with $L_{1C}$ and do not contribute to ring formation, is a deuterium atom.

In one embodiment, at least one hydrogen atom possessed by $Ar_{2C}$ is a deuterium atom. Specifically, in one embodiment, $Ar_{2C}$ is an unsubstituted aryl group including 6 to 50 ring carbon atoms in which at least one of the hydrogen atoms is a deuterium atom, or an unsubstituted monovalent heterocyclic group including 5 to 50 ring atoms in which at least one of the hydrogen atoms is a deuterium atom.

$Ar_{2C}$ is preferably a substituted or unsubstituted aryl group including 6 to 50 ring carbon atoms, and more preferably selected from the groups represented by each of the following formulas (a1C) to (a4C).

(a1C)

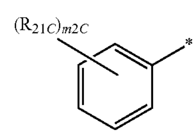

(a2C)

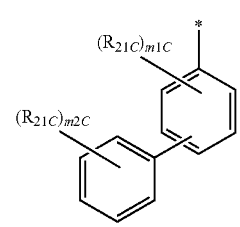

(a3C)

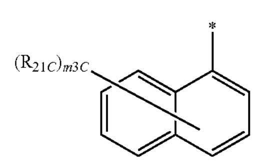

-continued (a4C)

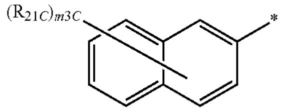

In the formulas (a1C) to (a4C), "*" is a single bond which bonds with $L_{2C}$.

$R_{21C}$ is a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})$ $(R_{907})$, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1C), m1C is an integer of 0 to 4.

m2C is an integer of 0 to 5.

m3C is an integer of 0 to 7.

When m1C to m3C are each 2 or more, a plurality of $R_{21}$CS may be the same as or different from each other.

When m1C to m3C are each 2 or more, a plurality of adjacent $R_{21}$CS form a substituted or unsubstituted, saturated or unsaturated ring by bonding with each other, or do not form a substituted or unsubstituted, saturated or unsaturated ring.

$L_{1C}$ and $L_{2C}$ are preferably independently a single bond, or a substituted or unsubstituted arylene group including 6 to 14 ring carbon atoms. Preferably, at least one of $L_{1C}$ and $L_{2C}$ is a single bond.

In one embodiment, the compound represented by the formula (1C) is a compound represented by any one of the following formulas (1C-1) to (1C-3).

(1C-1)

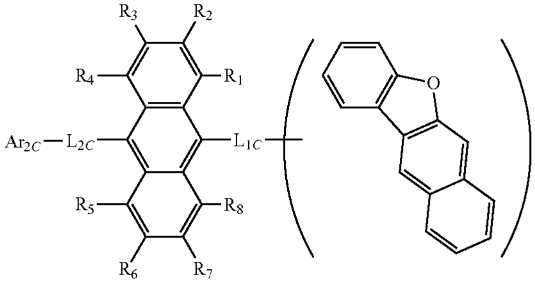

-continued (1C-2)

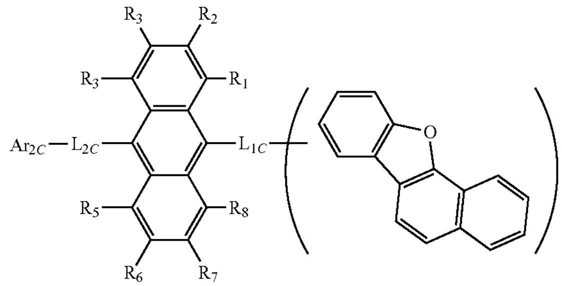

(1C-3)

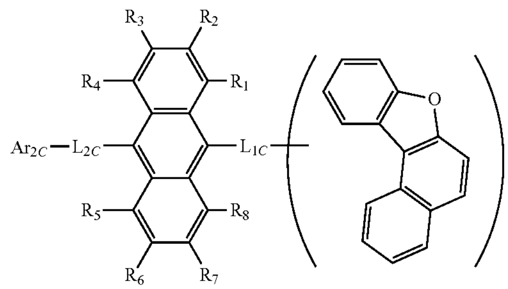

In the formula (1C-1) to (1C-3), $R_1$ to $R_8$, $Ar_{2C}$, $L_{1C}$, and be are as defined in the formula (1C).

In one embodiment, the compound represented by the formula (1C) is a compound represented by any one of the following formulas (1C-11) to (1C-13).

(1C-11)

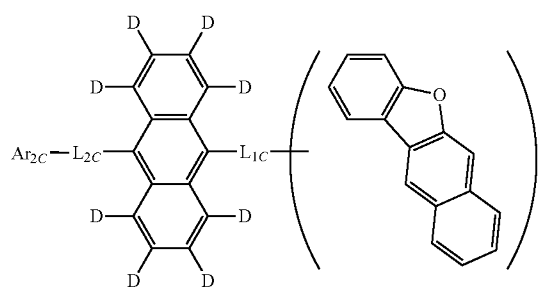

(1C-12)

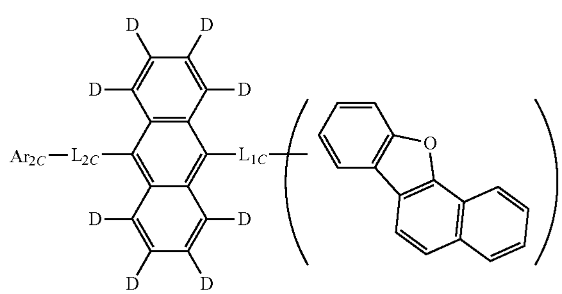

-continued (1C-13)

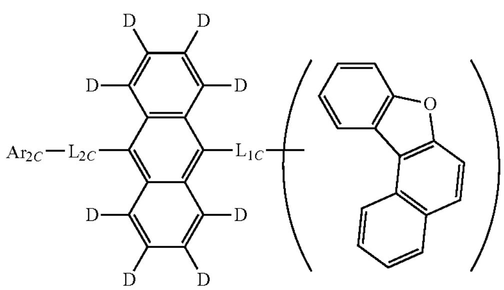

In the formula (1C-11) to (1C-13), $Ar_{2C}$, $L_{1C}$, and be are as defined in the formula (1C).

The compound represented by the formula (1C) can be synthesized in accordance with the synthetic methods described in Examples by using known alternative reactions or raw materials tailored to the target compound.

Specific examples of the compound represented by the formula (1C) are shown below. In the following specific examples, "D" represents a deuterium atom.

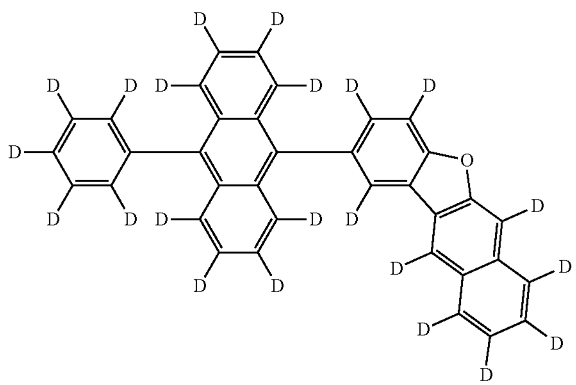

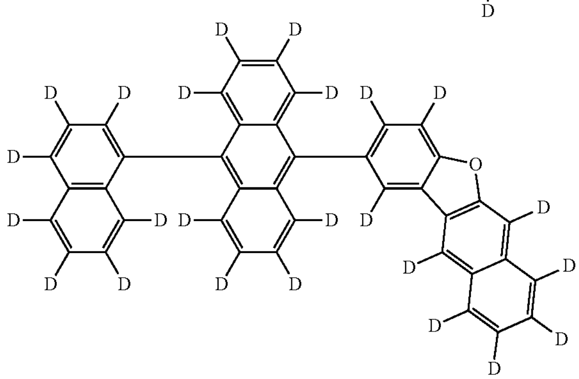

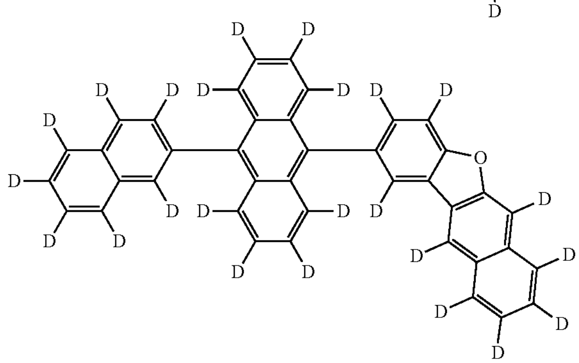

-continued

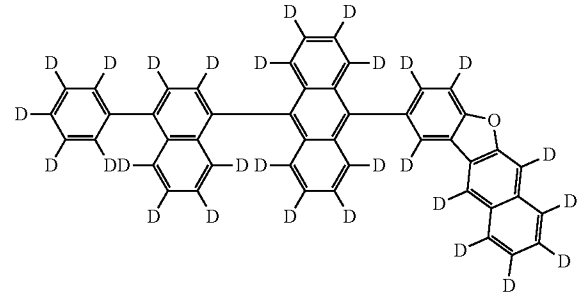

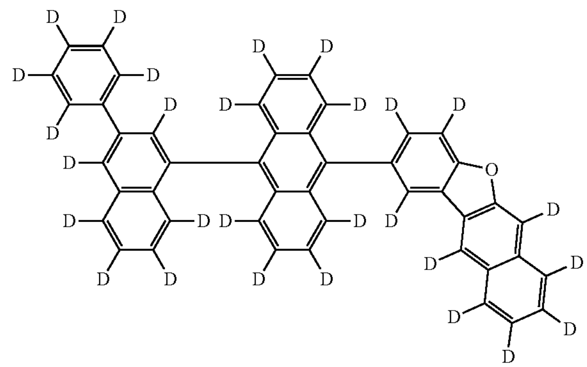

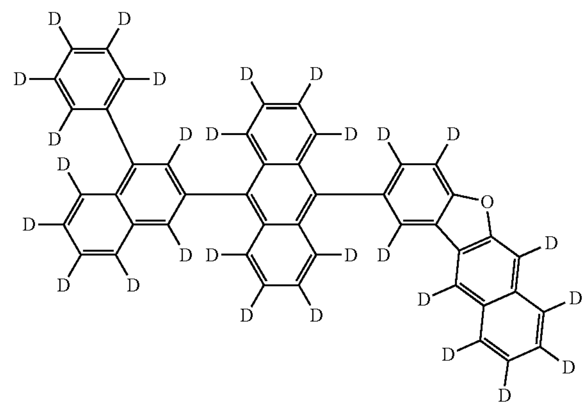

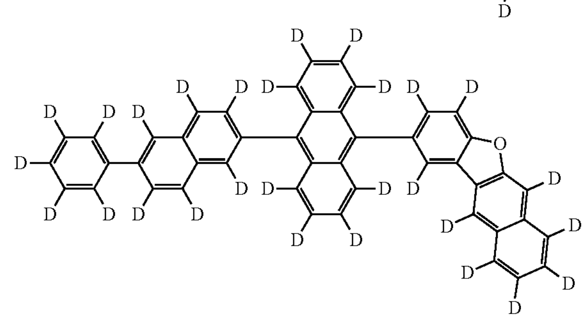

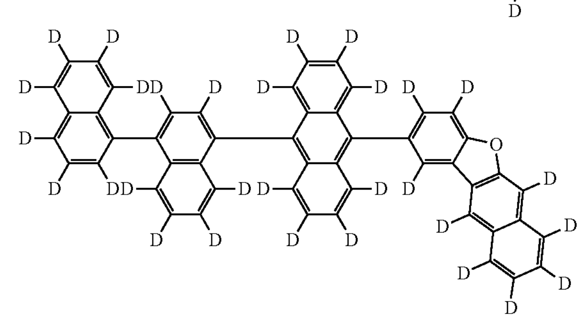

-continued
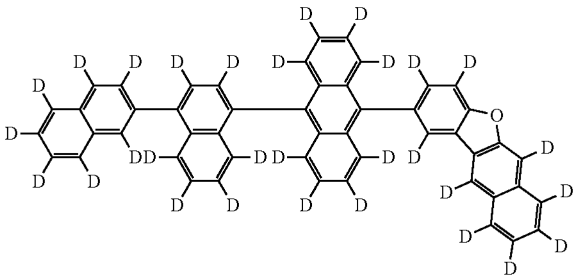
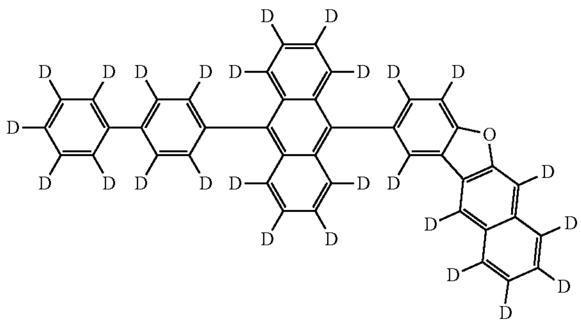
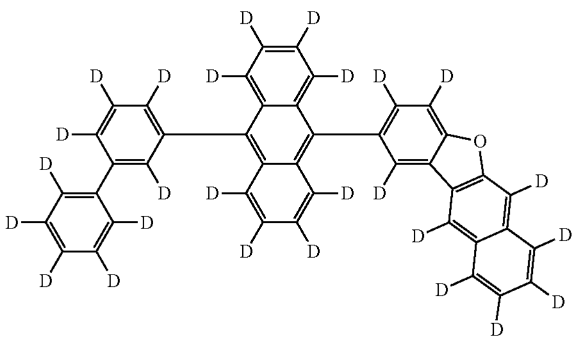
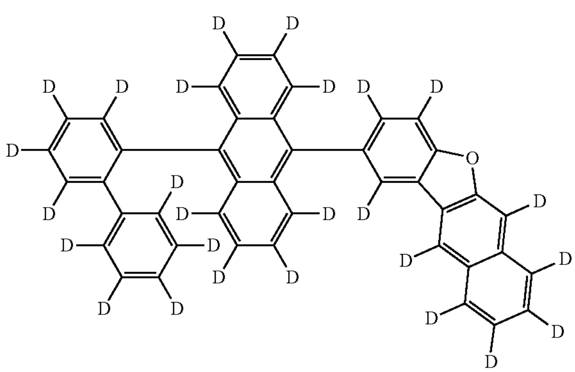
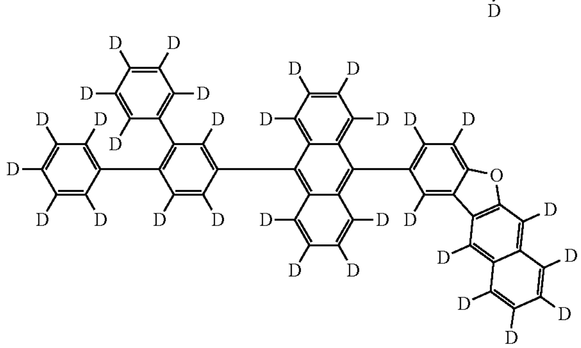
-continued
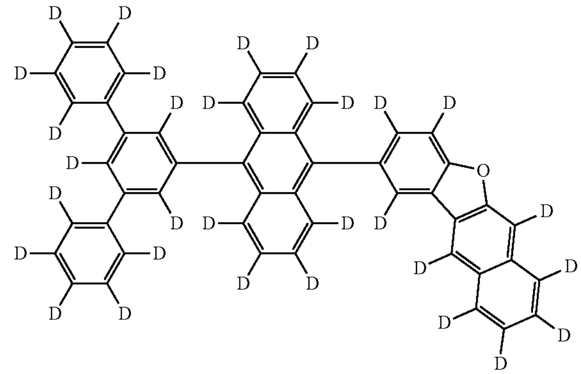
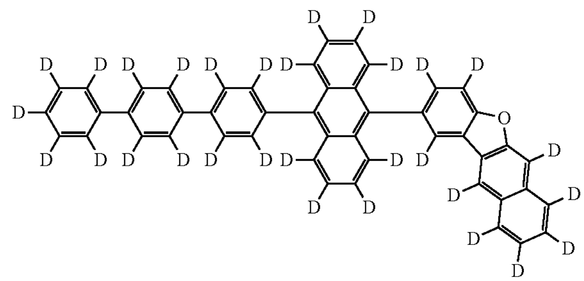
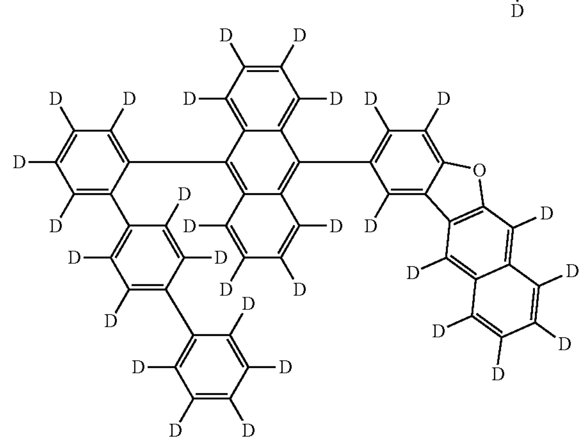
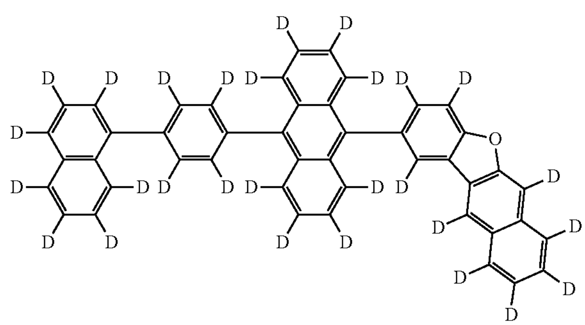
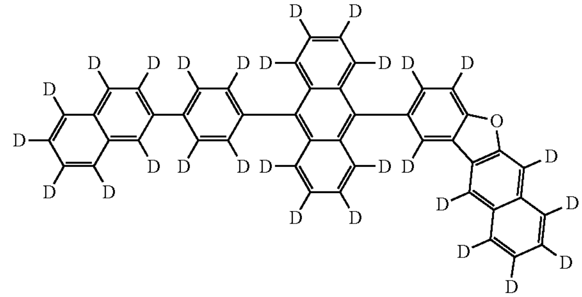

-continued
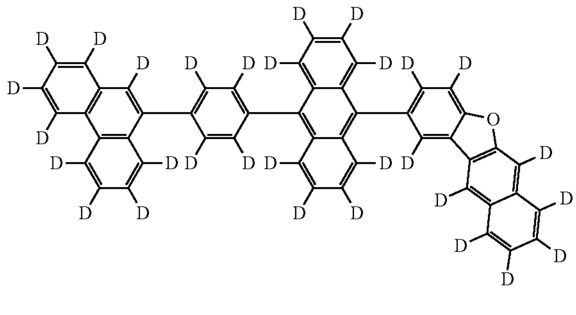
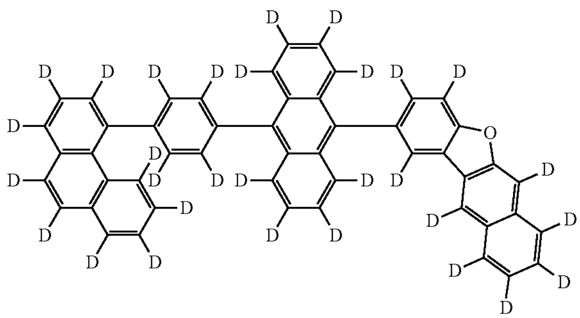
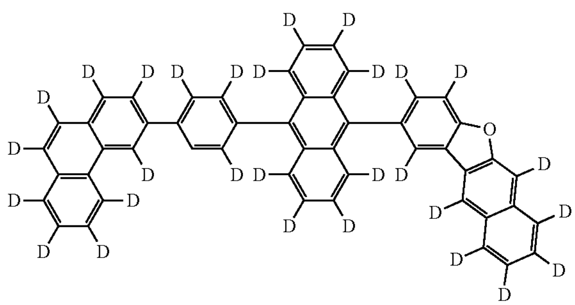
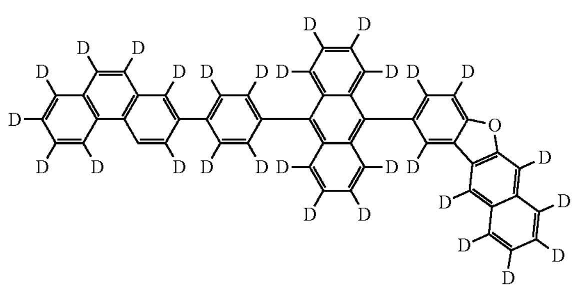
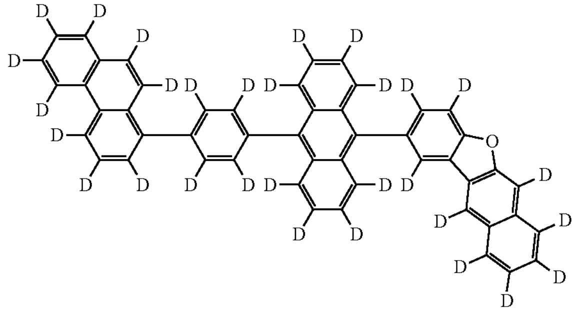
-continued
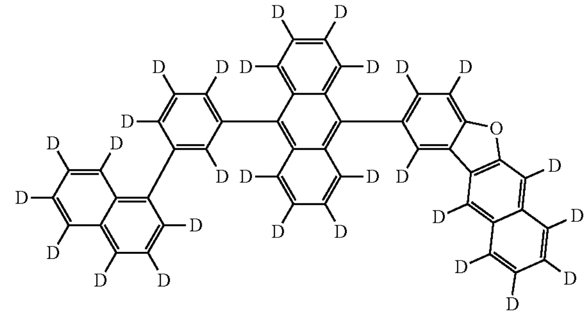
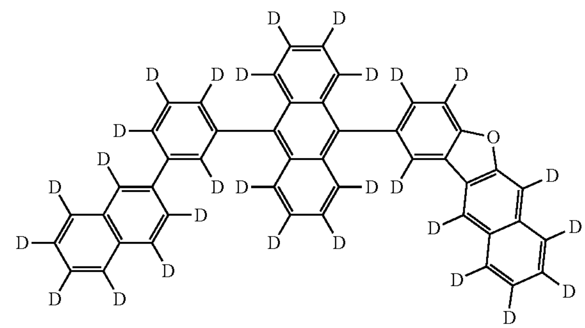
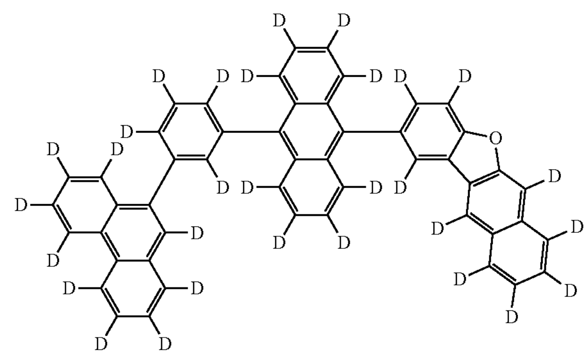
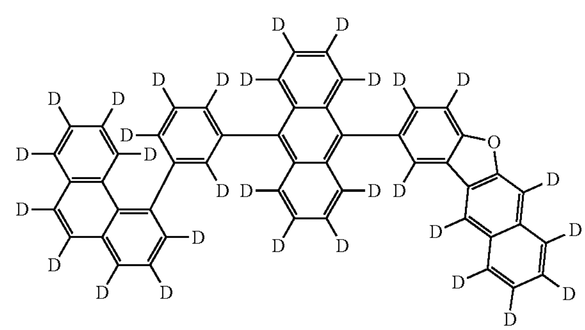
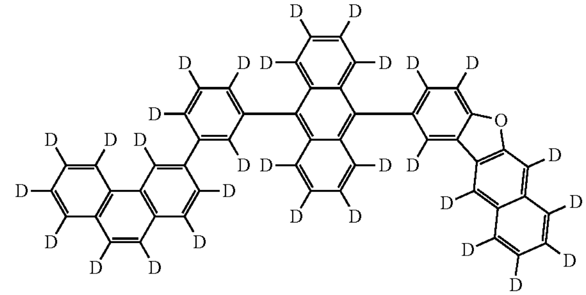

-continued
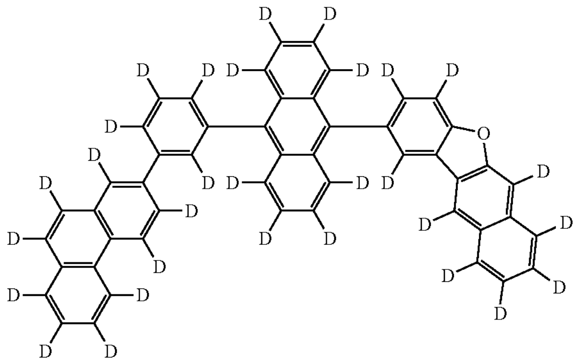
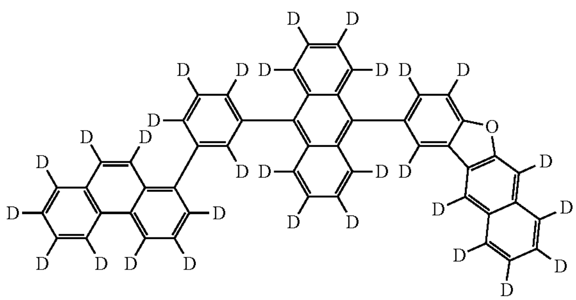
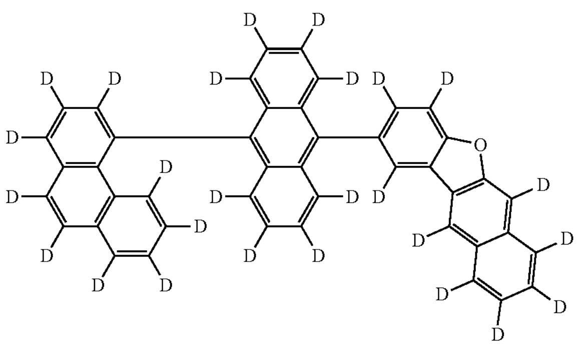
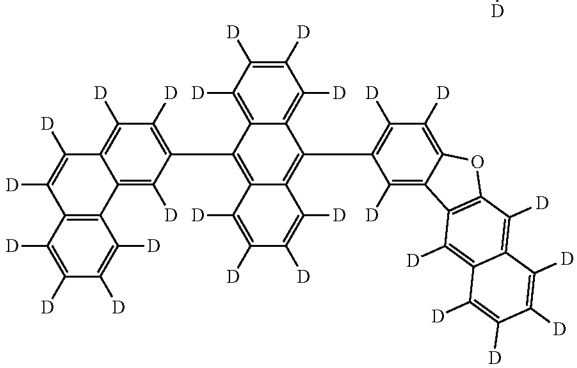
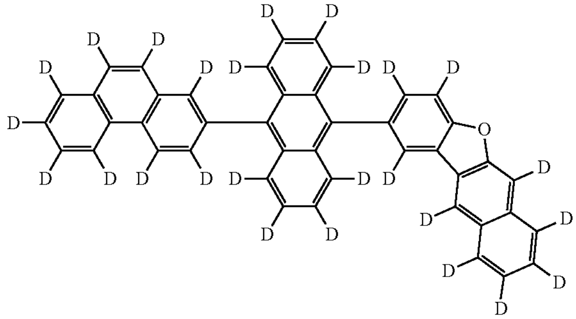
-continued
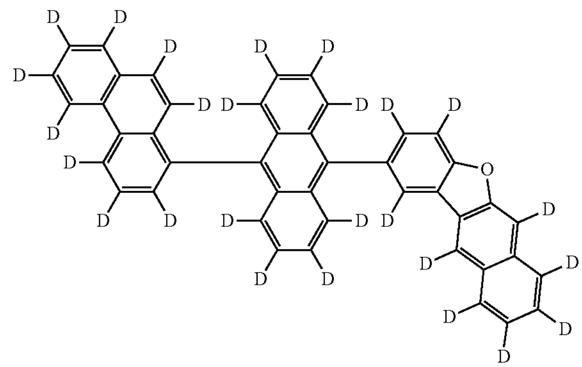
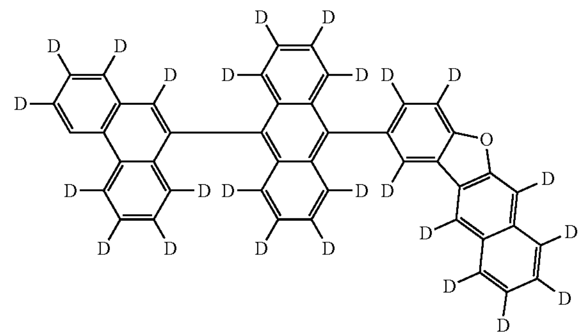
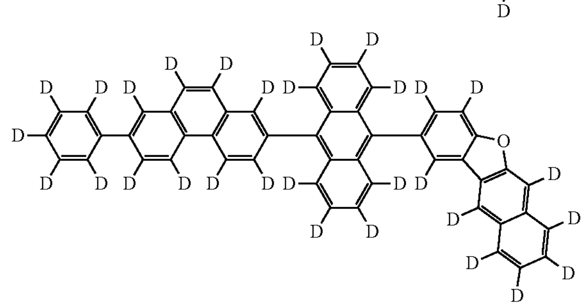
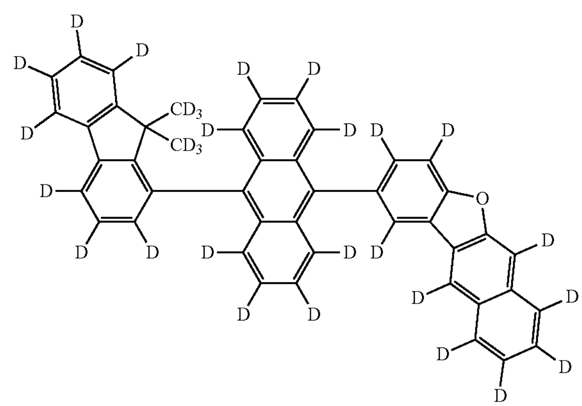
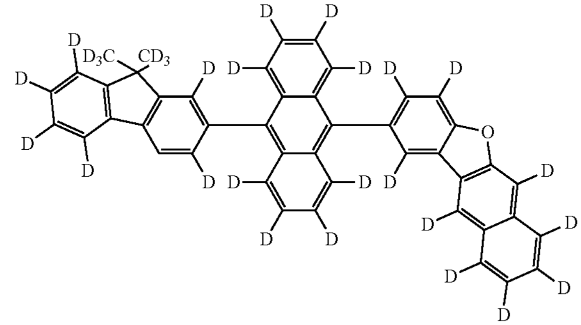

-continued
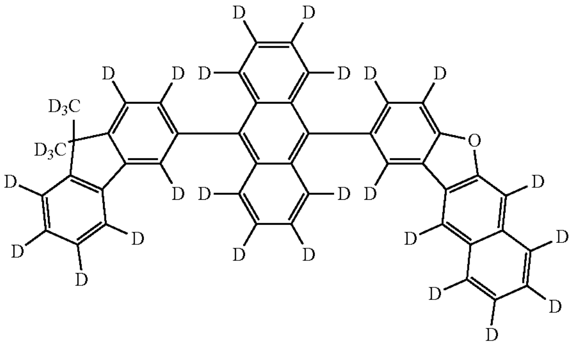
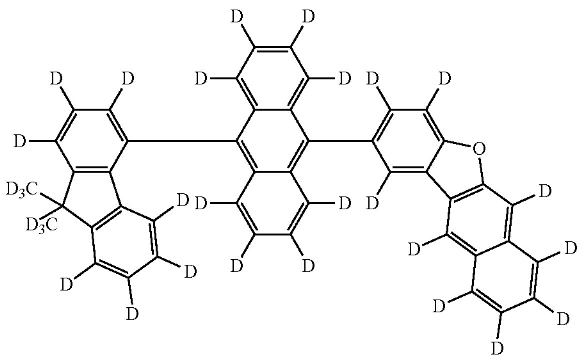
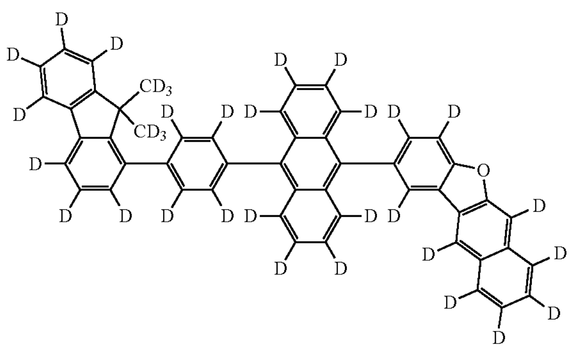
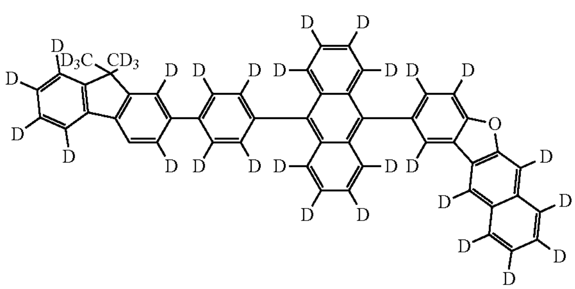
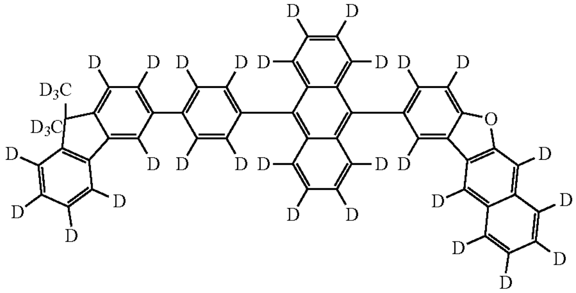
-continued
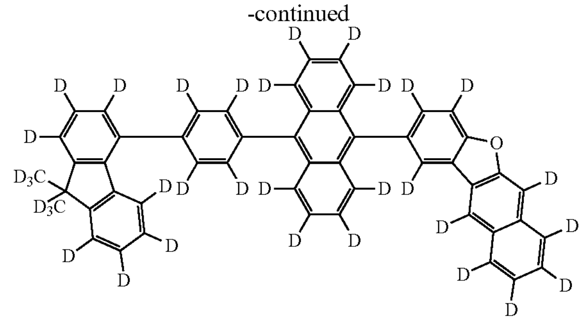
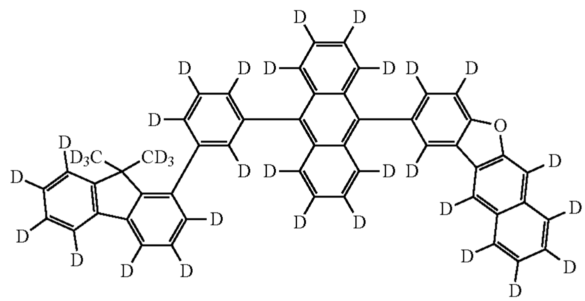
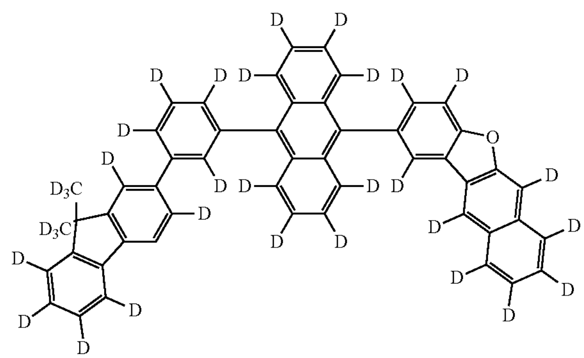
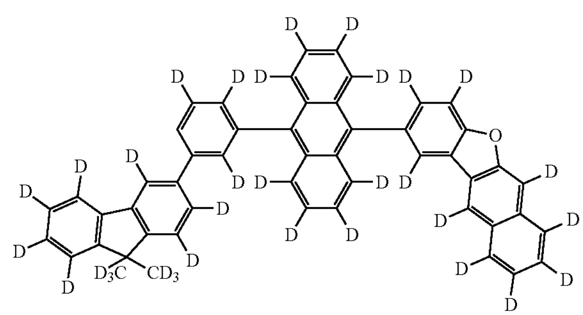
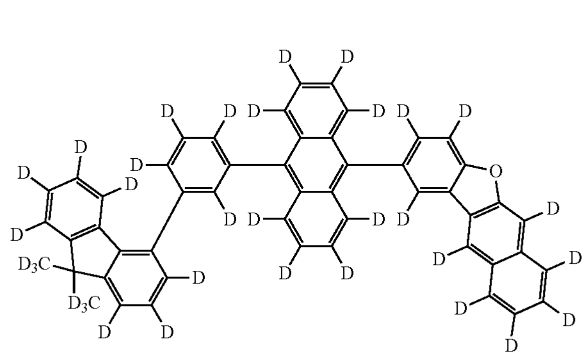

-continued
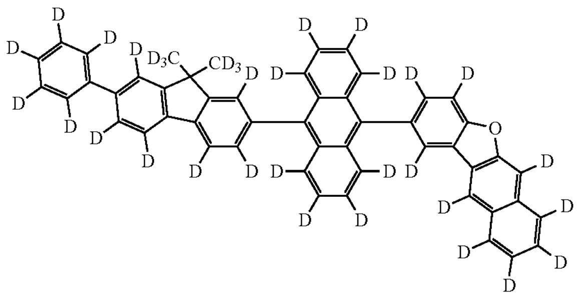
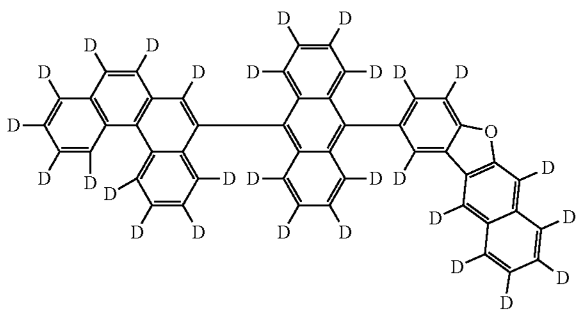
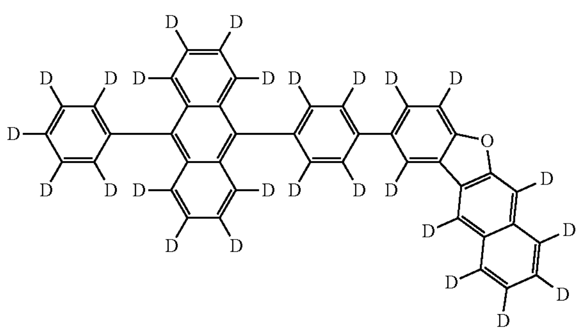
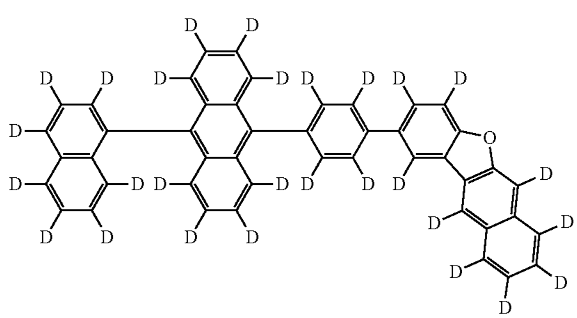
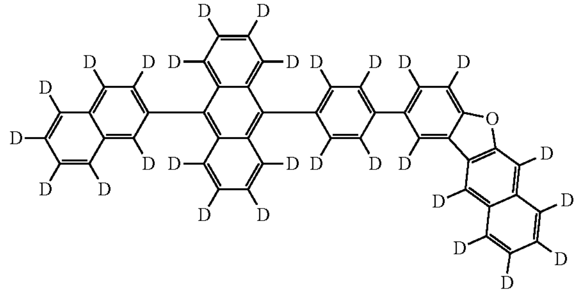
-continued
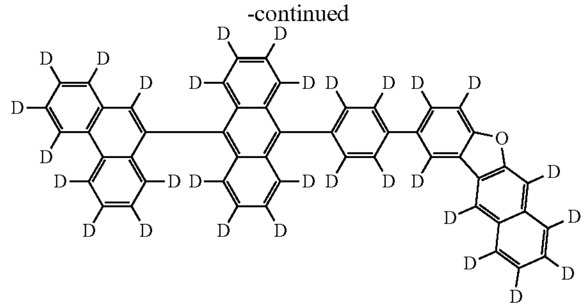
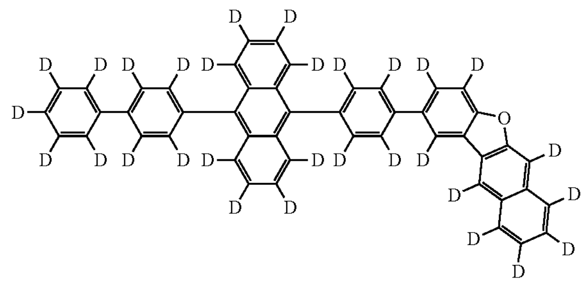
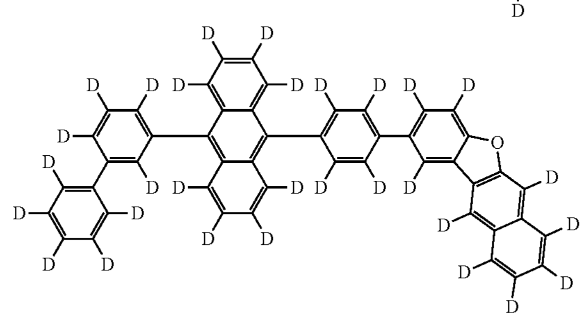
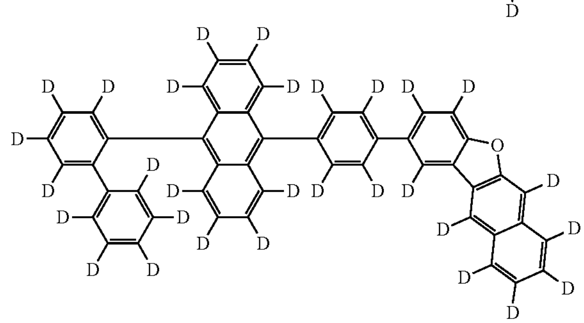
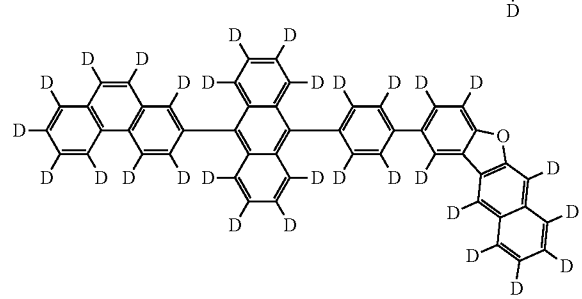
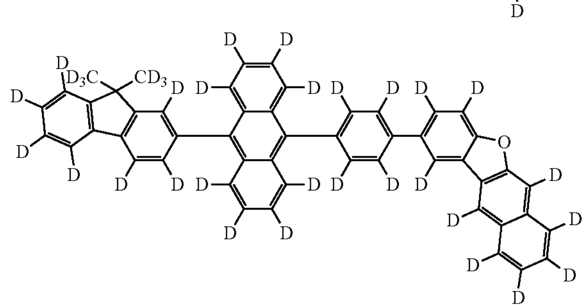

-continued
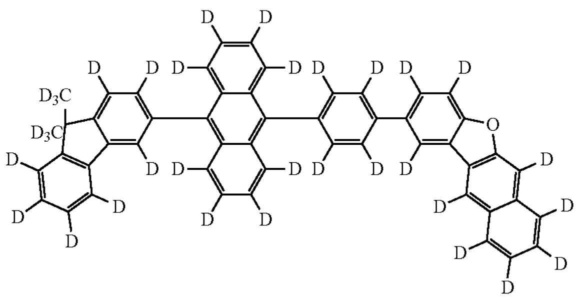
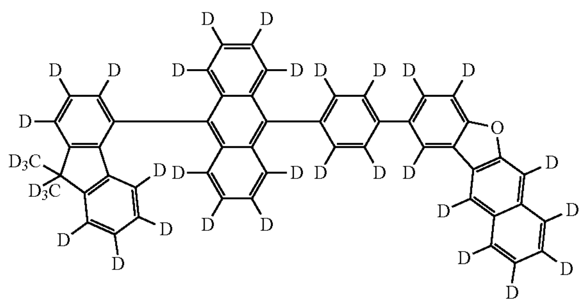
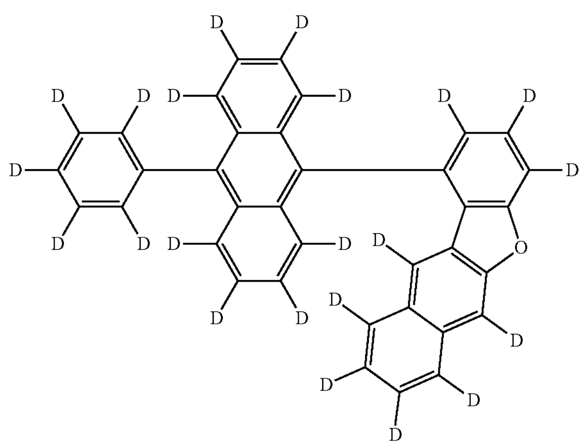
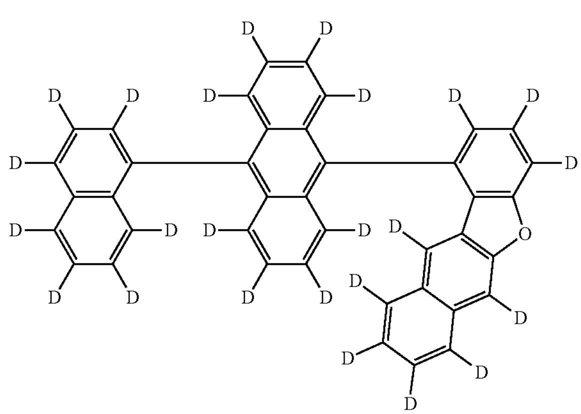
-continued
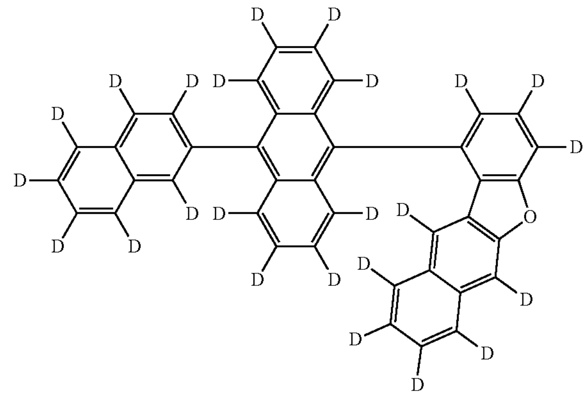
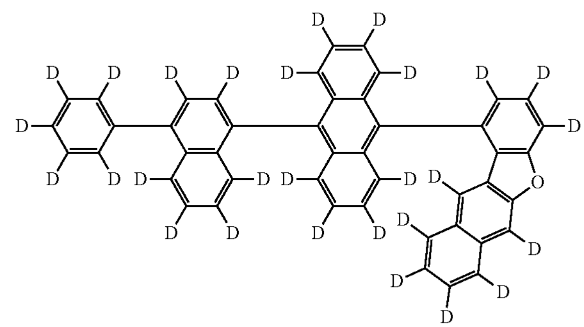
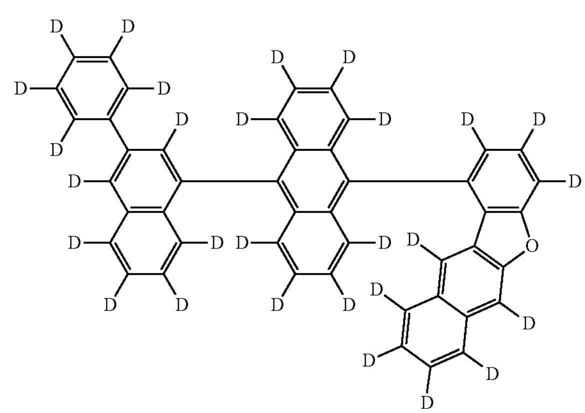
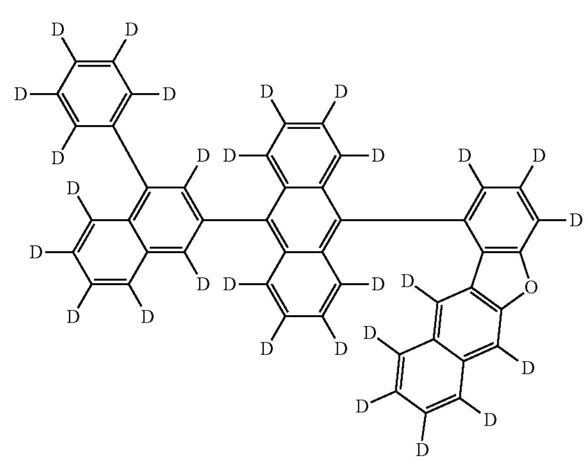

-continued
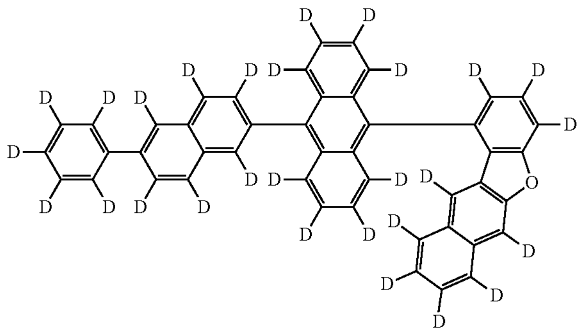
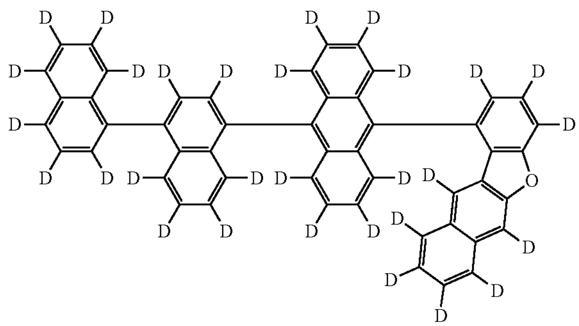
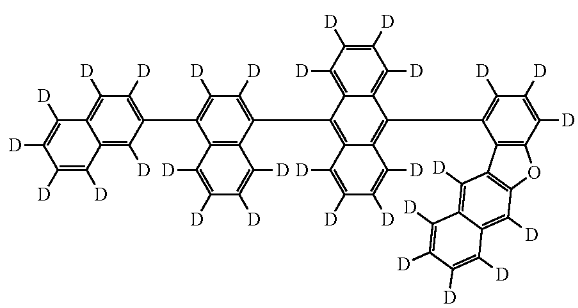
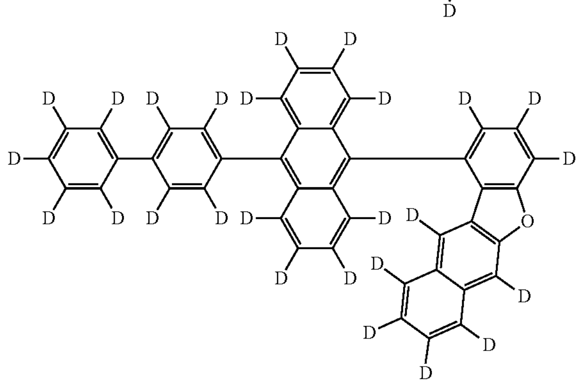
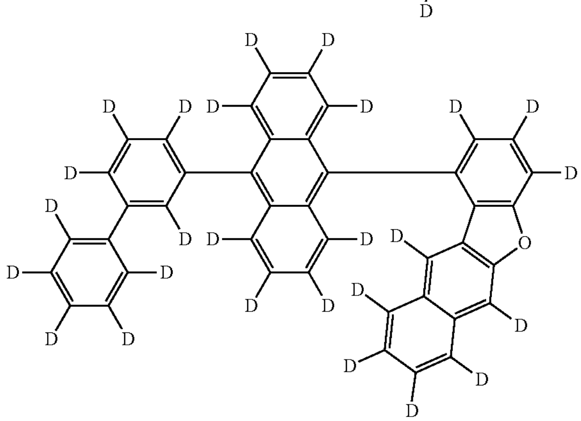
-continued
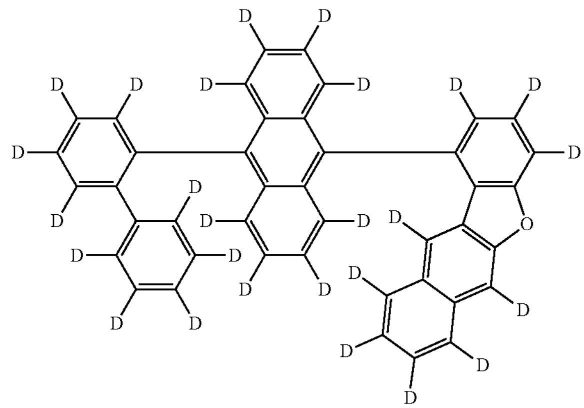
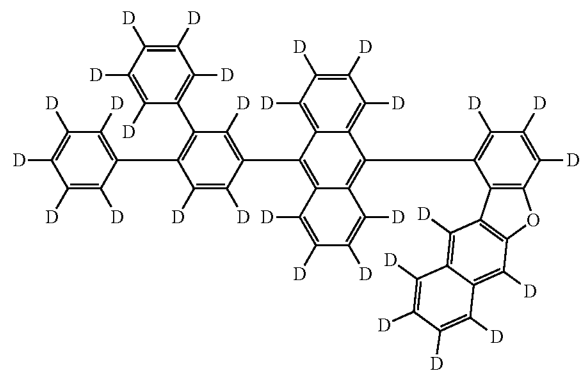
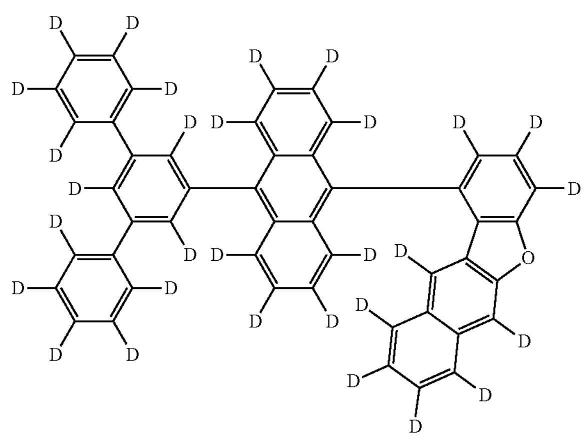
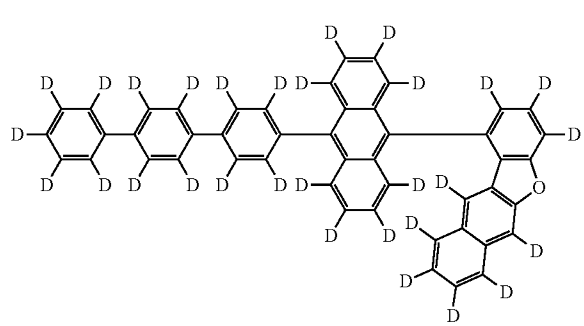

-continued
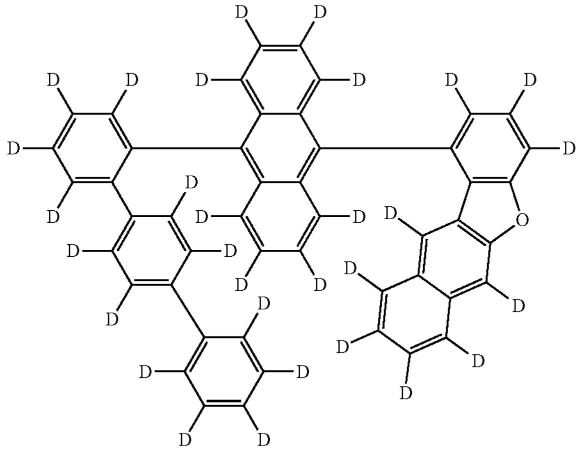
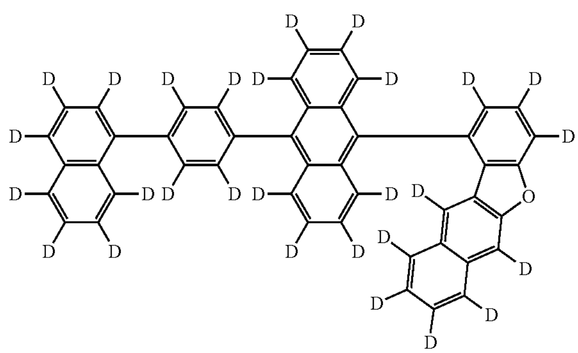
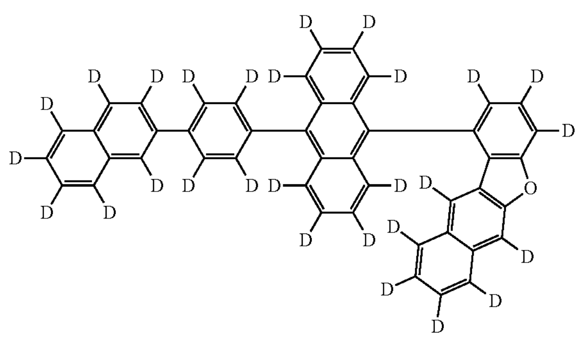
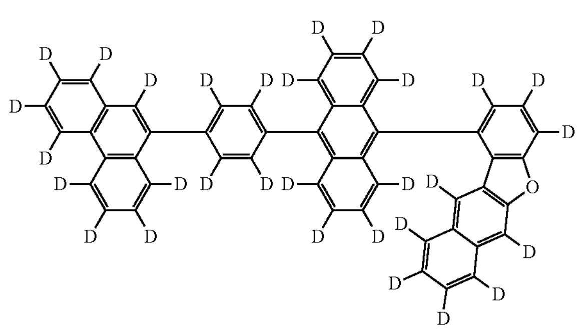
-continued
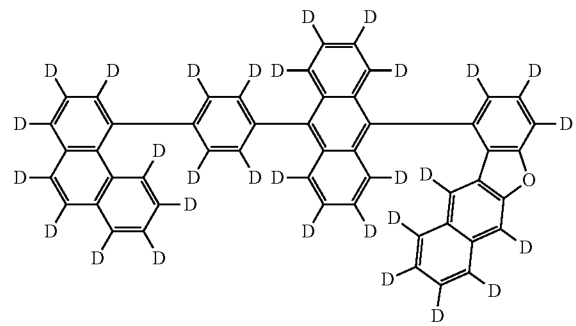
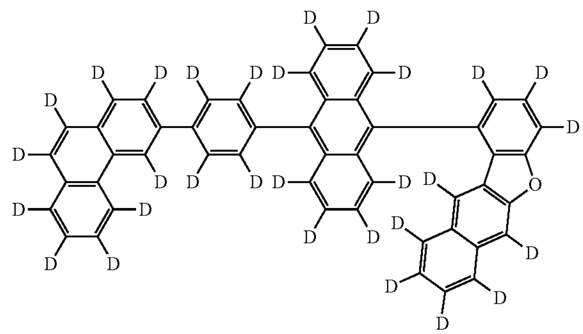
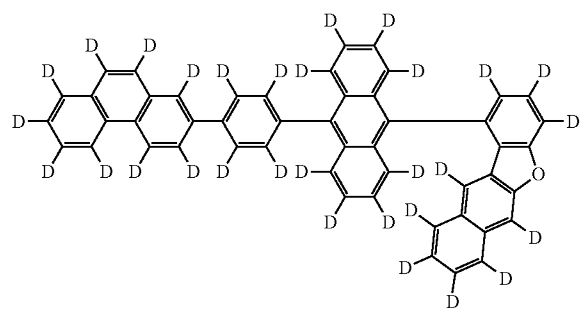
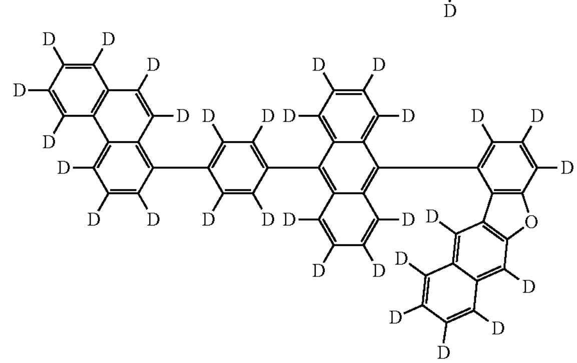
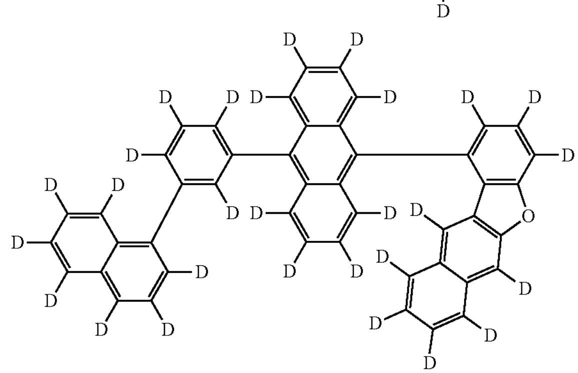

-continued
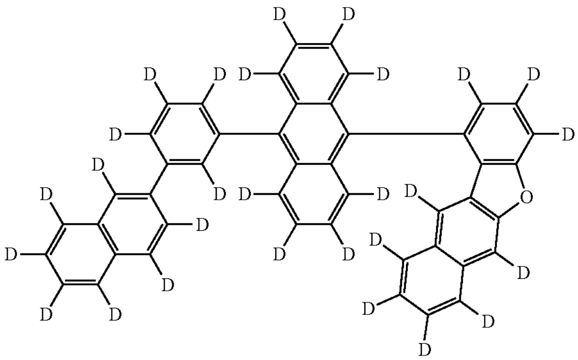
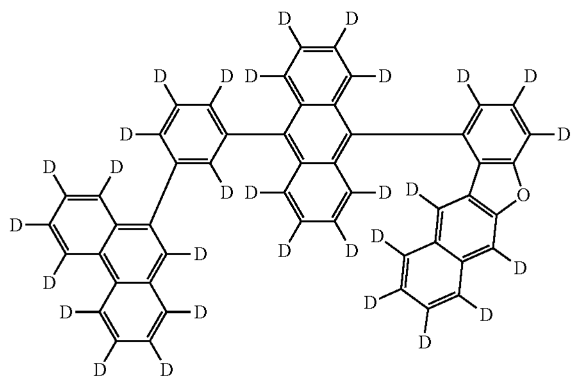
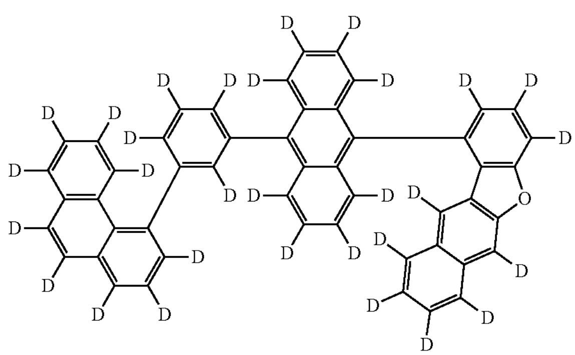
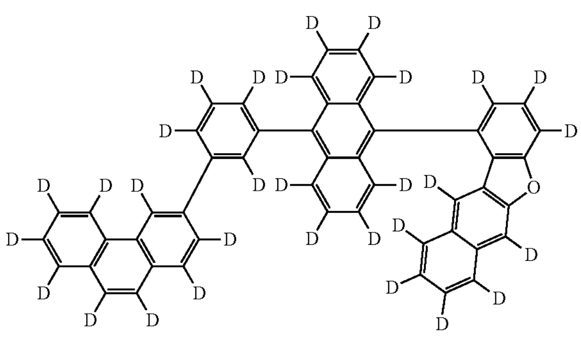
-continued
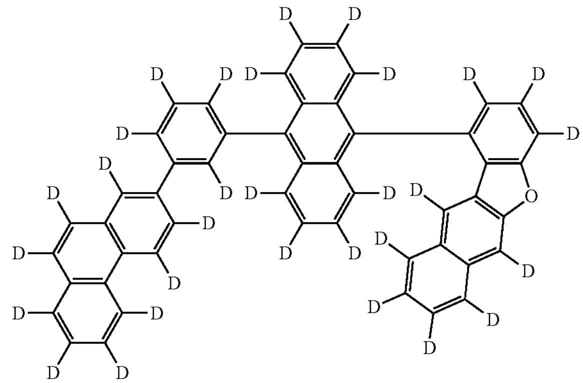
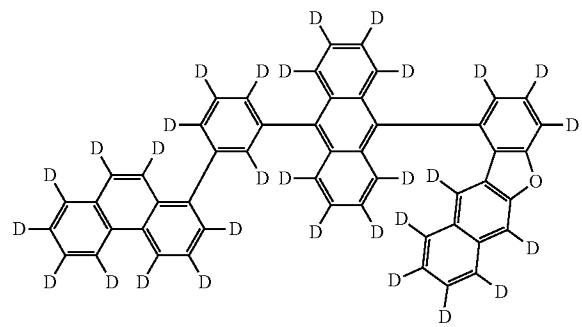
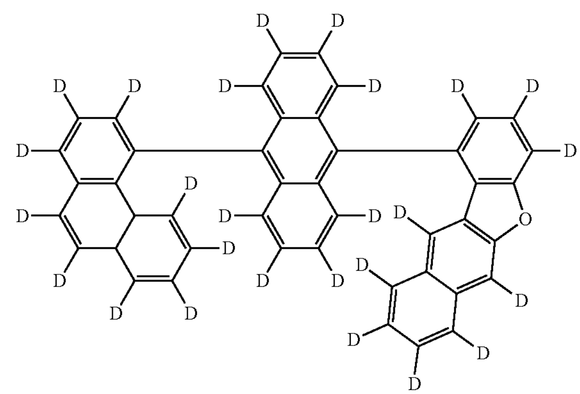
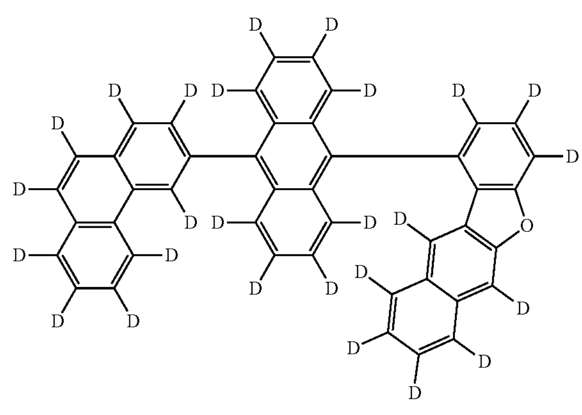

-continued
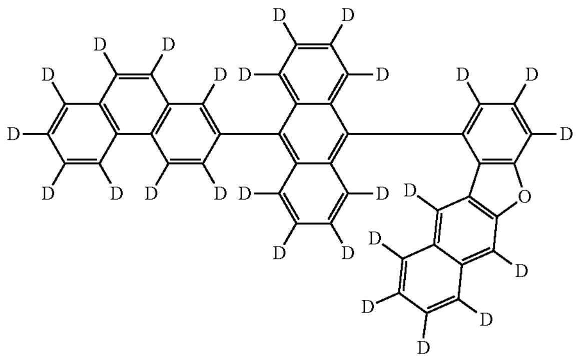
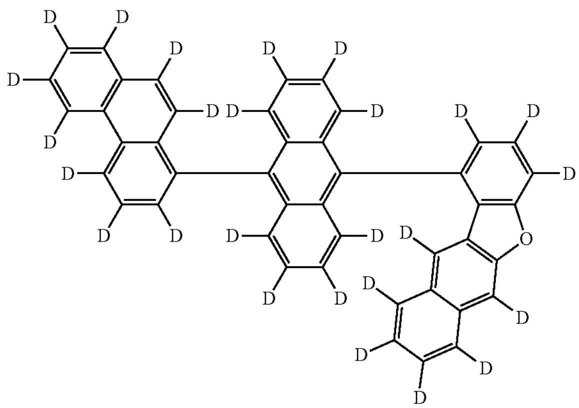
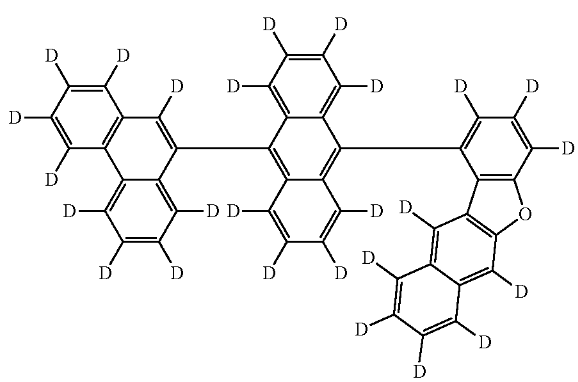
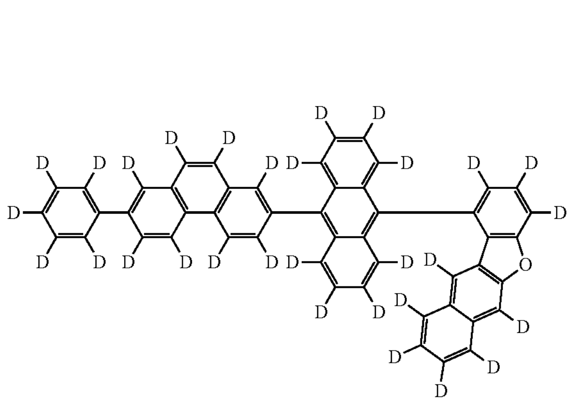
-continued
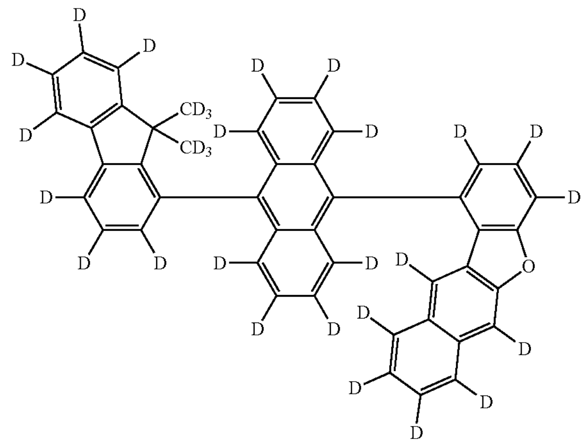
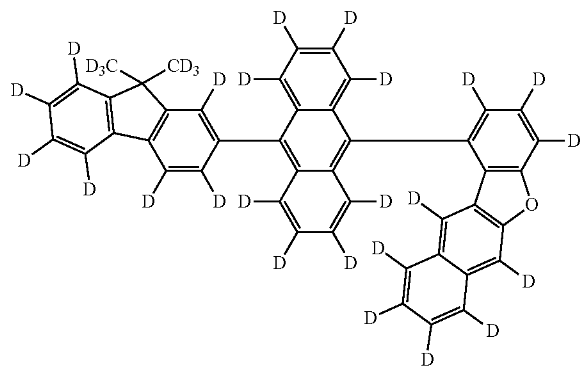
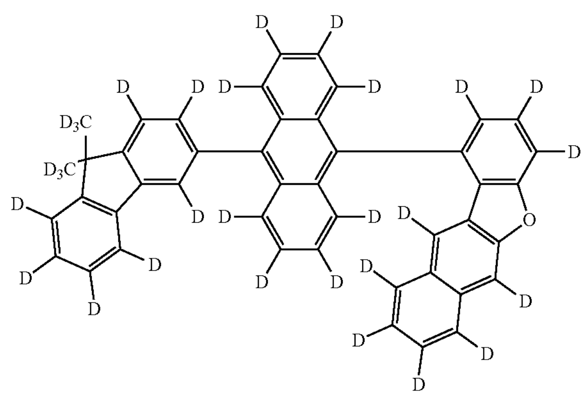
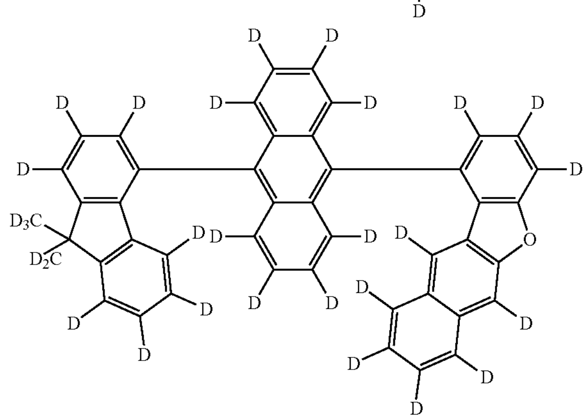

-continued
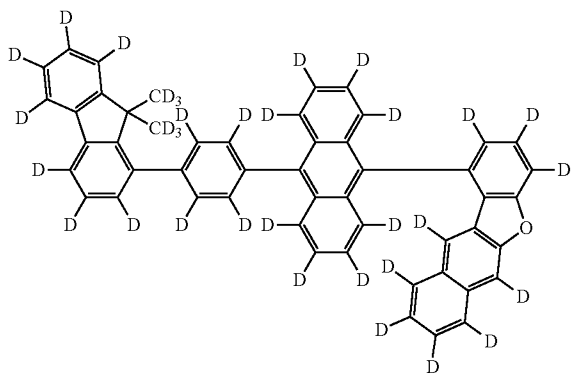
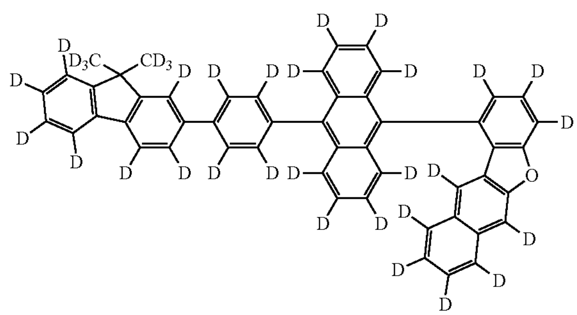
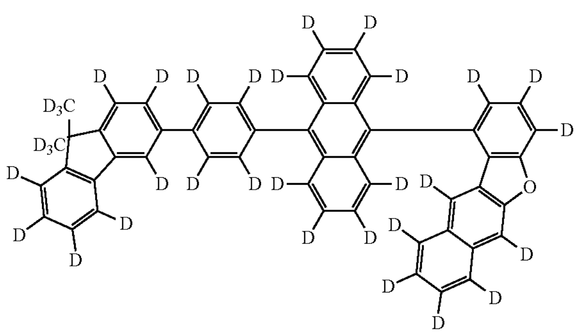
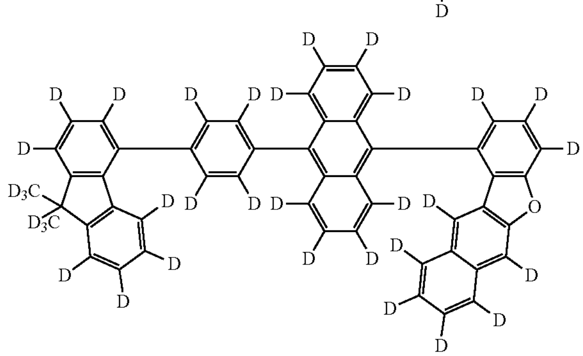
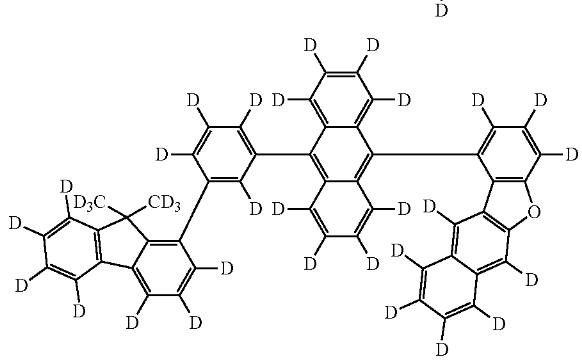
-continued
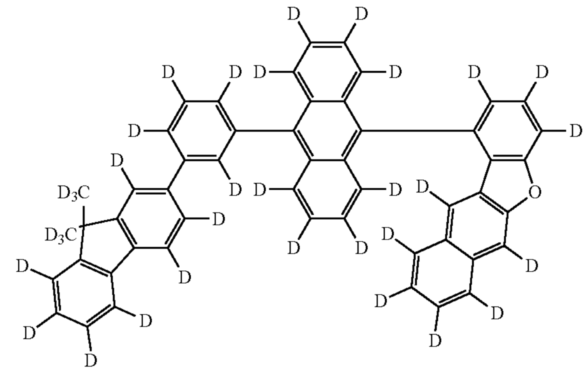
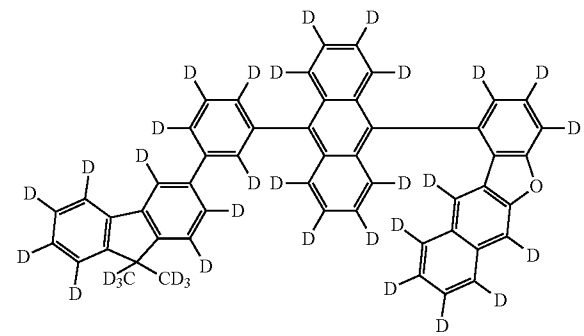
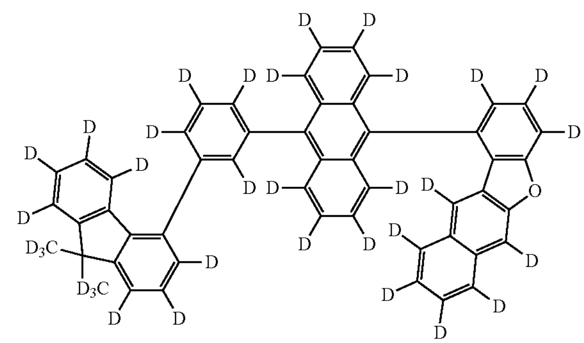
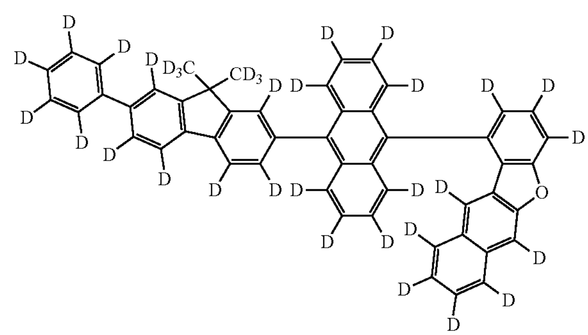
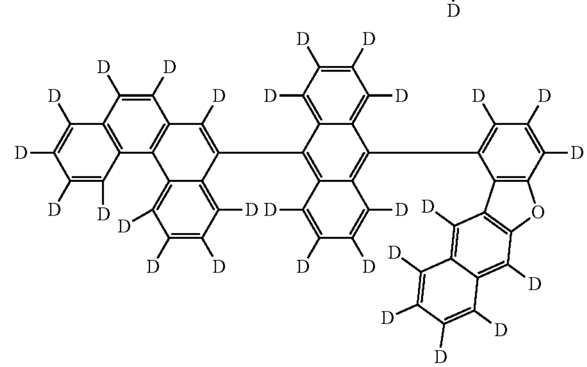

-continued
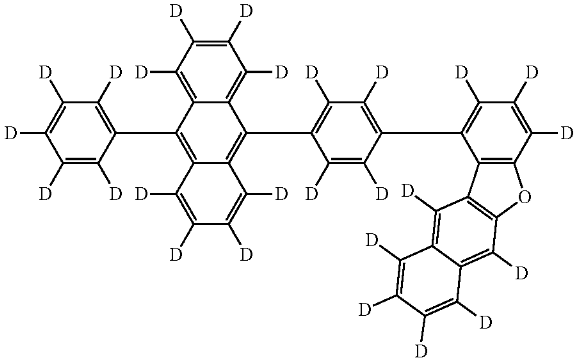
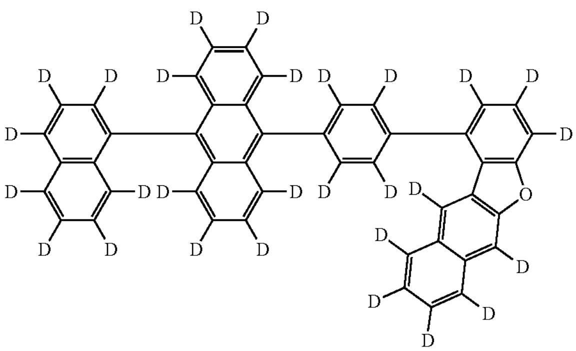
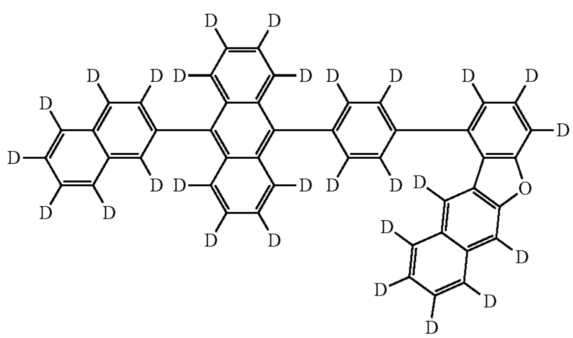
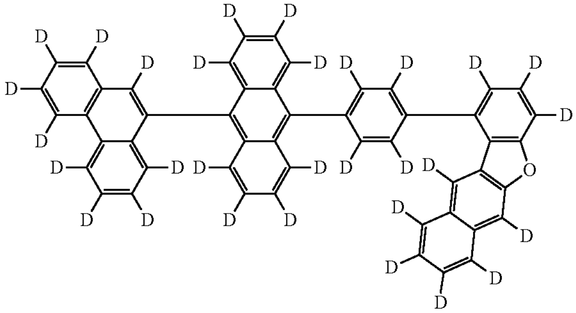
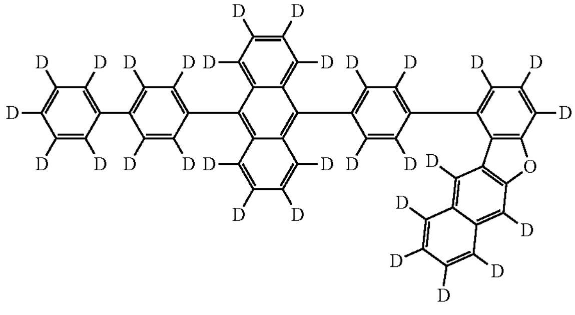
-continued
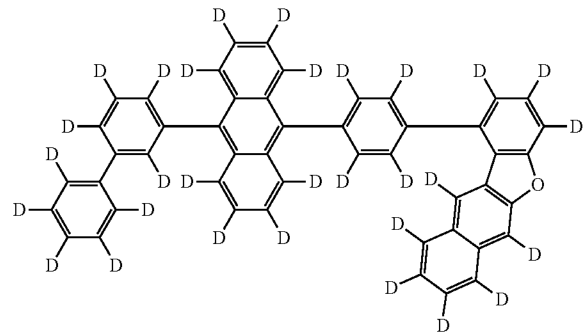
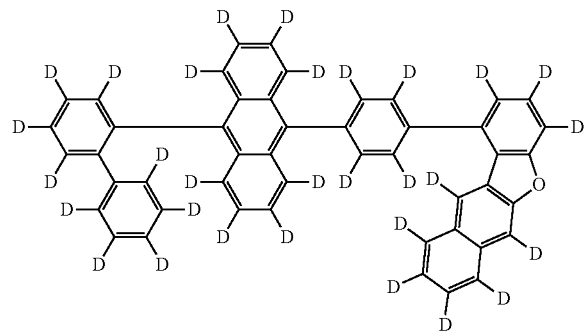
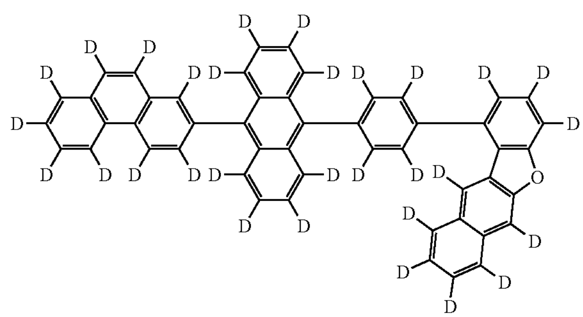
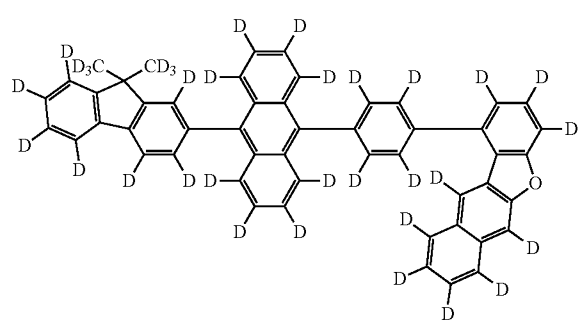
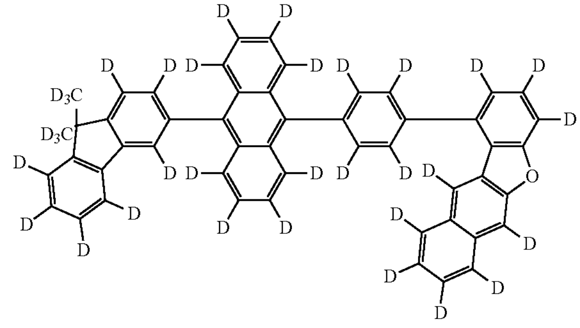

-continued
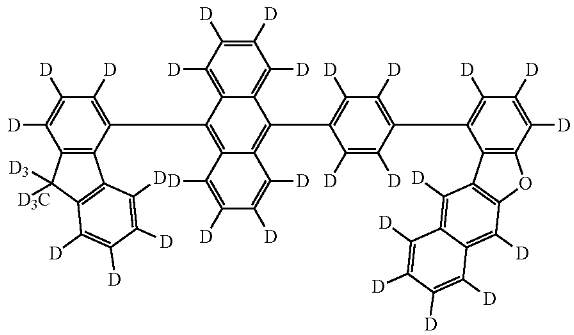
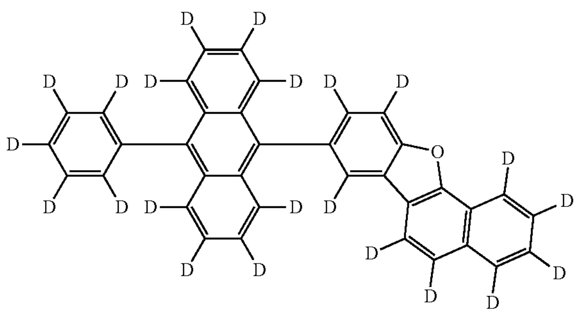
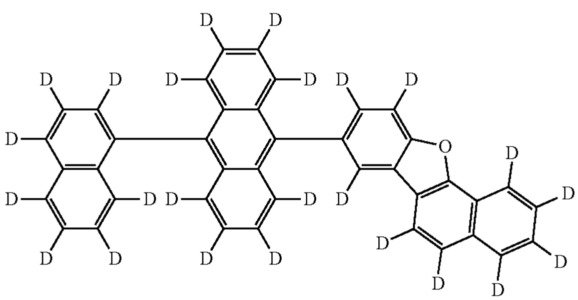
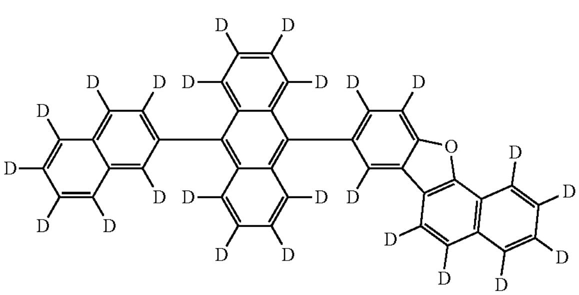
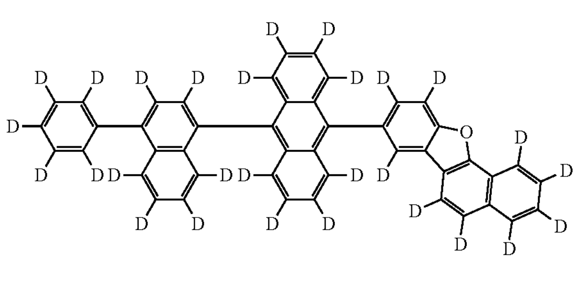
-continued
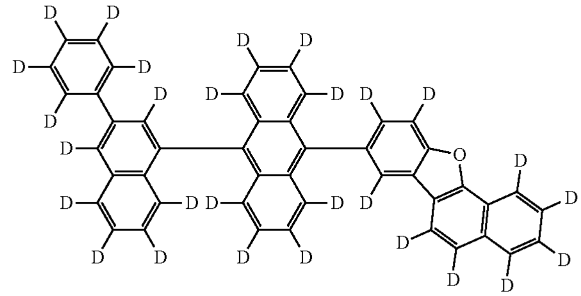
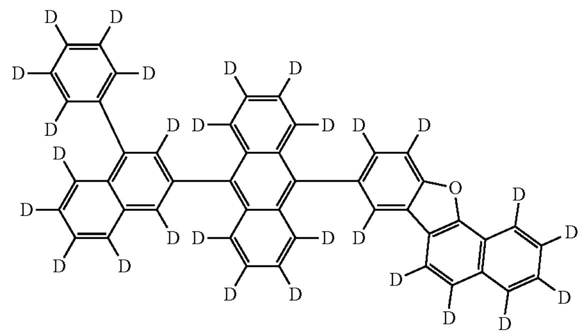
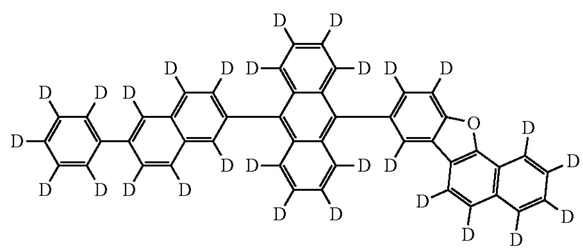
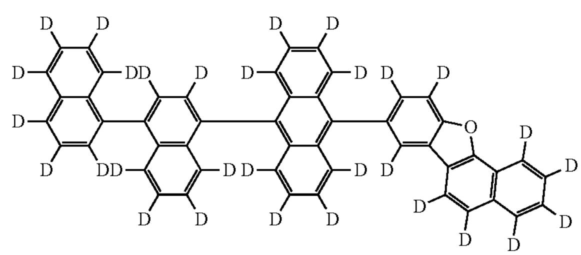
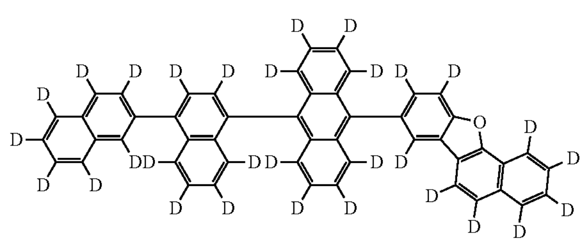
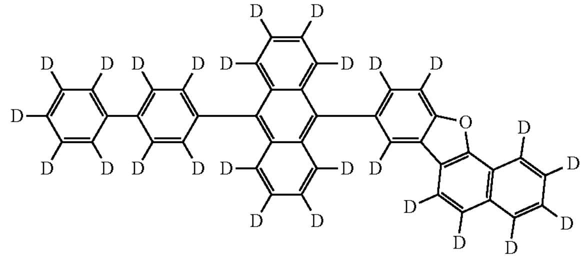

-continued
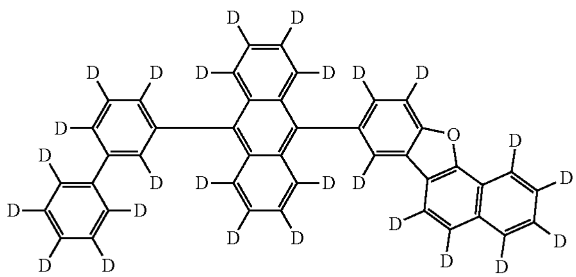
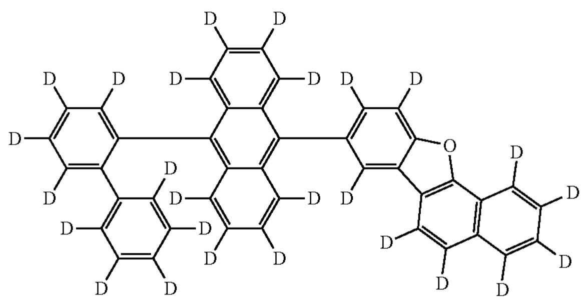
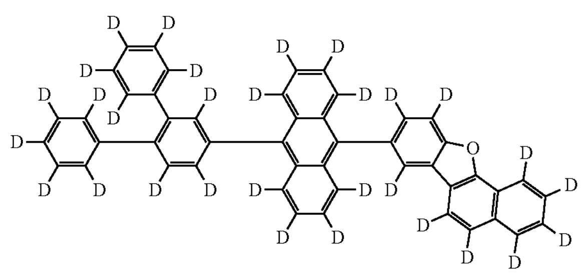
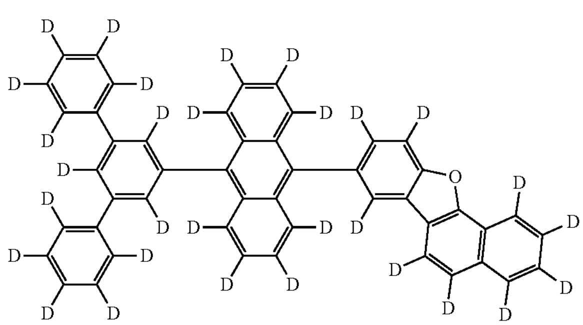
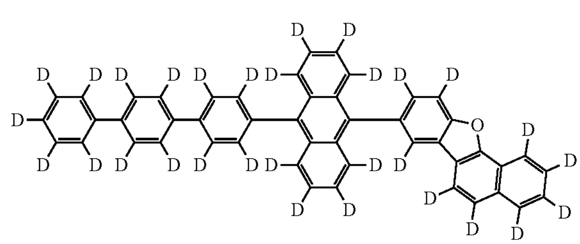
-continued
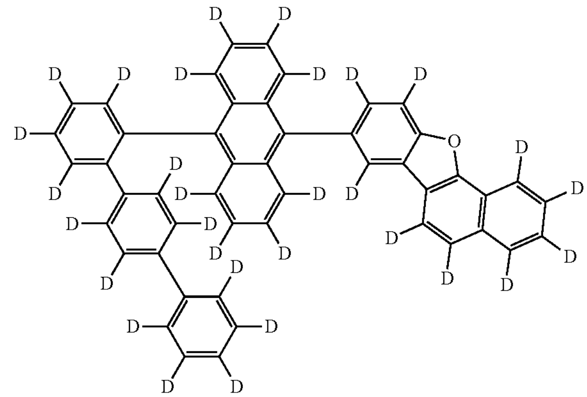
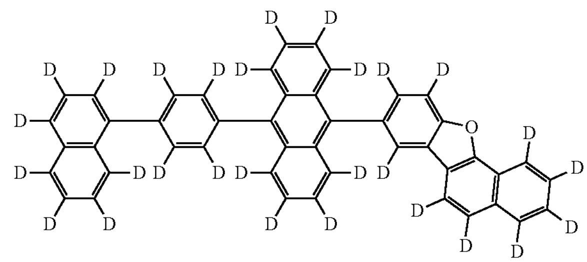
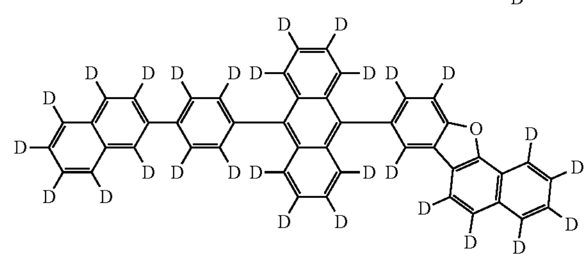
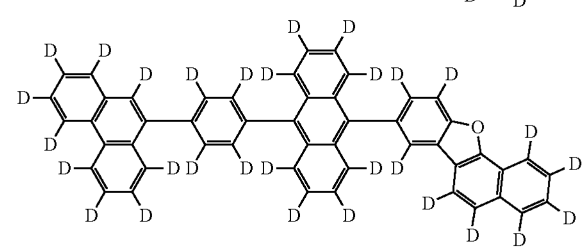
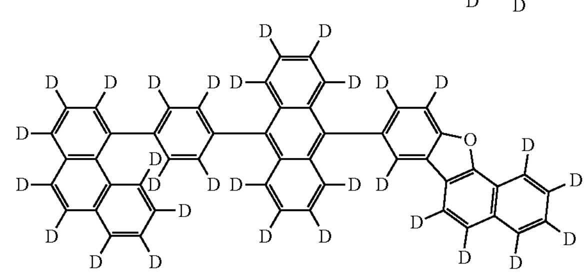
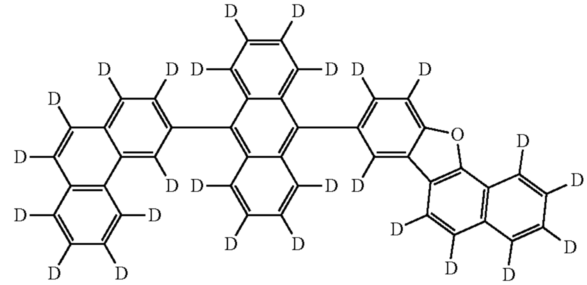

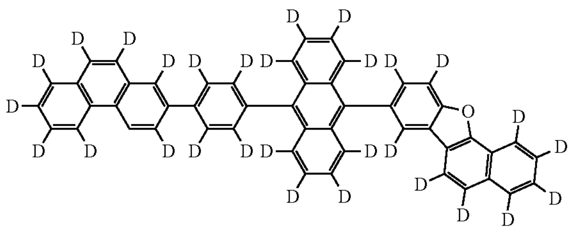
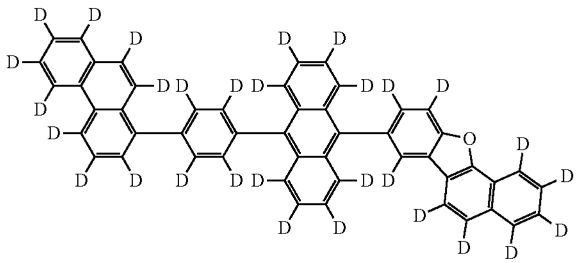
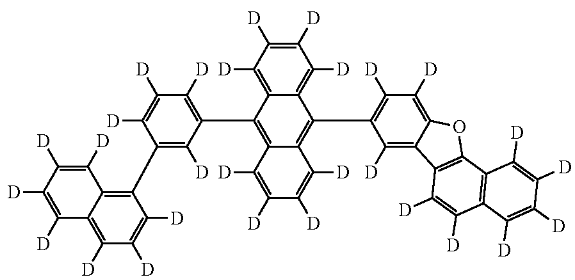
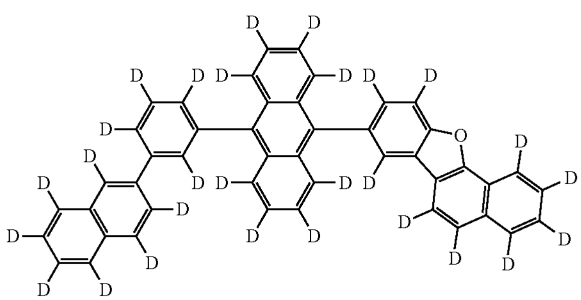
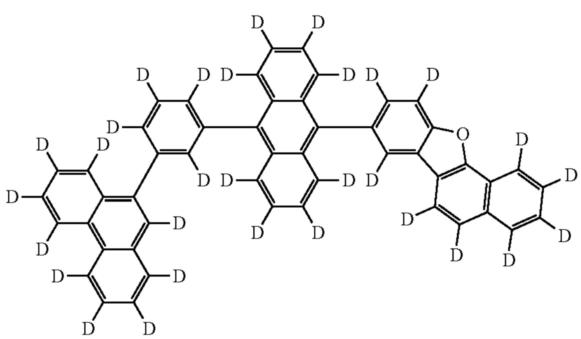
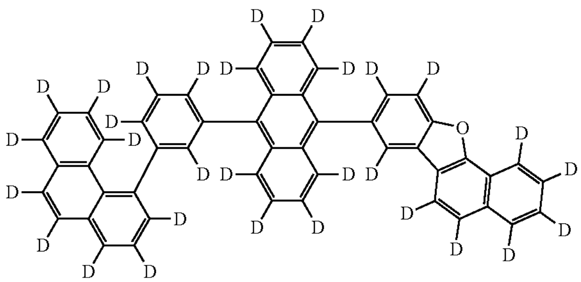
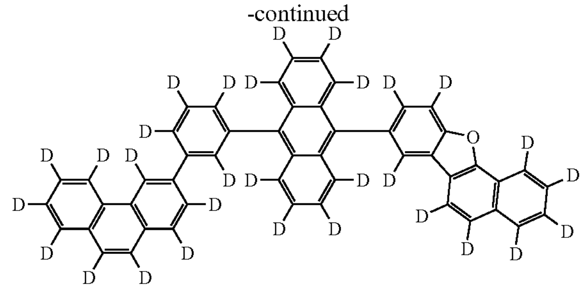
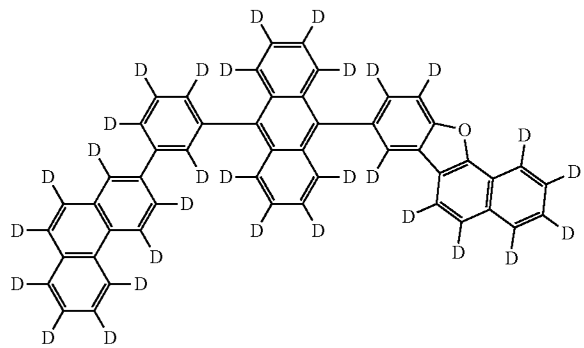
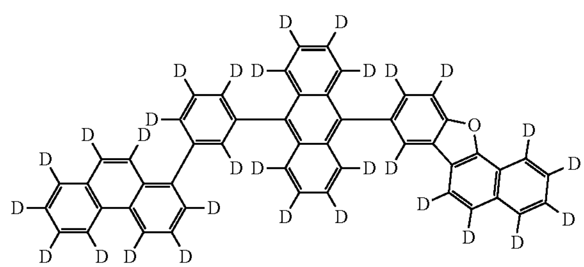
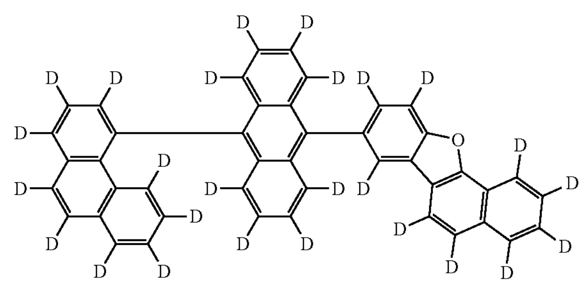
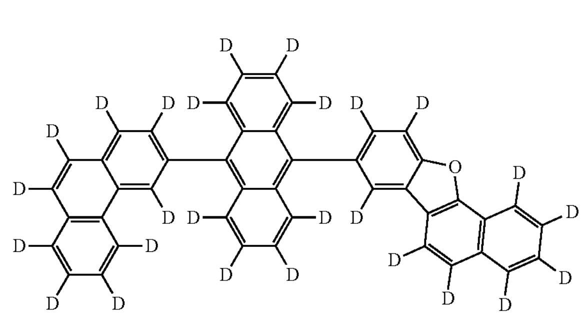

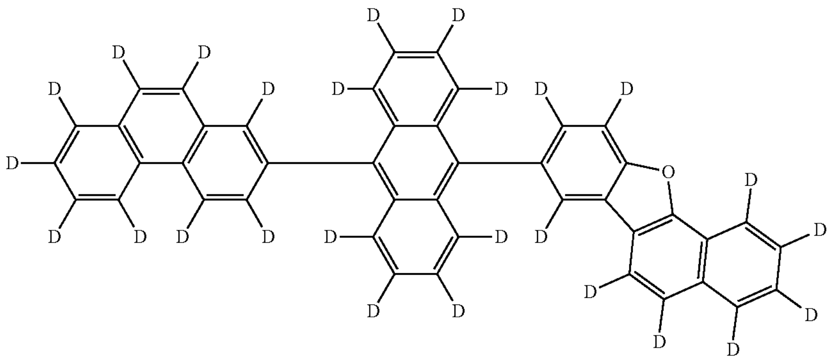
D
O
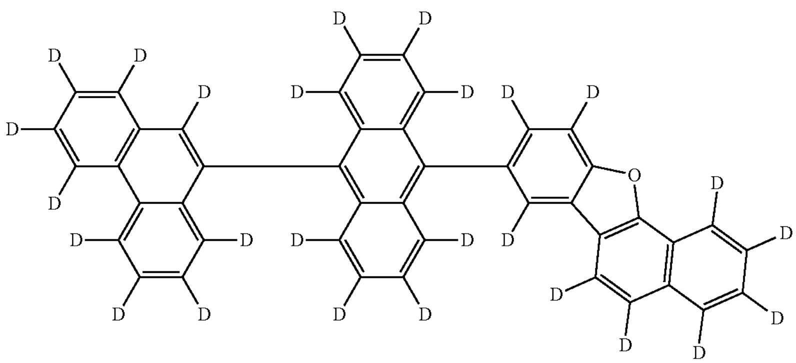
D
O
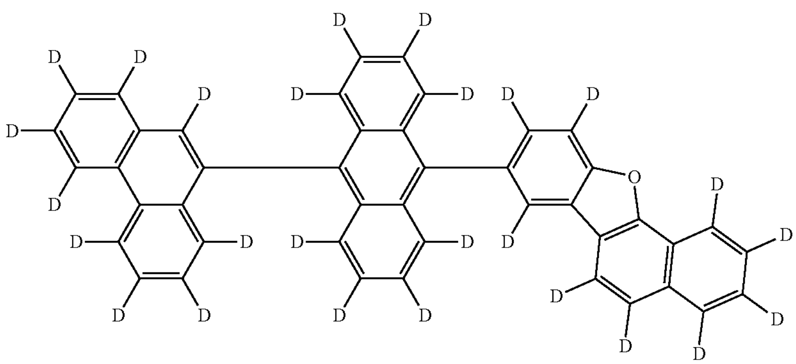
D
O
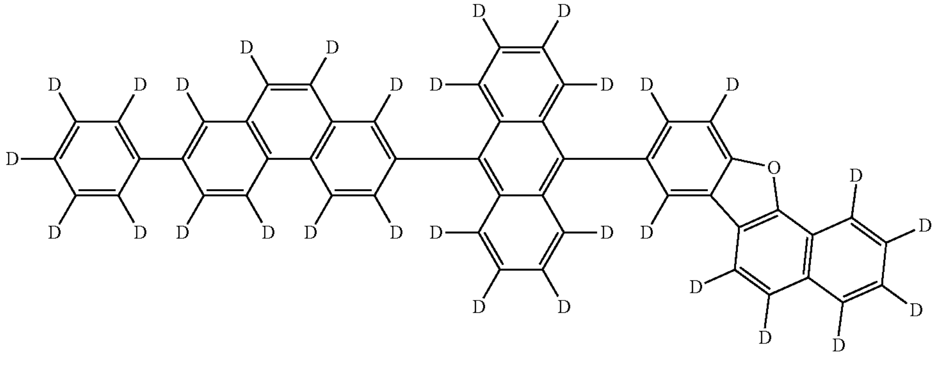
D
O

-continued
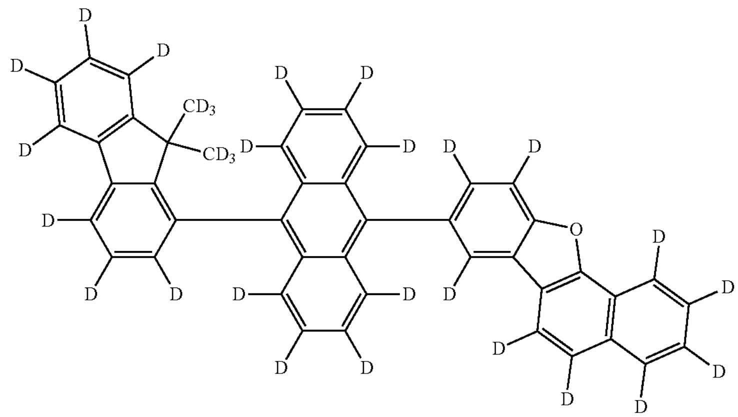
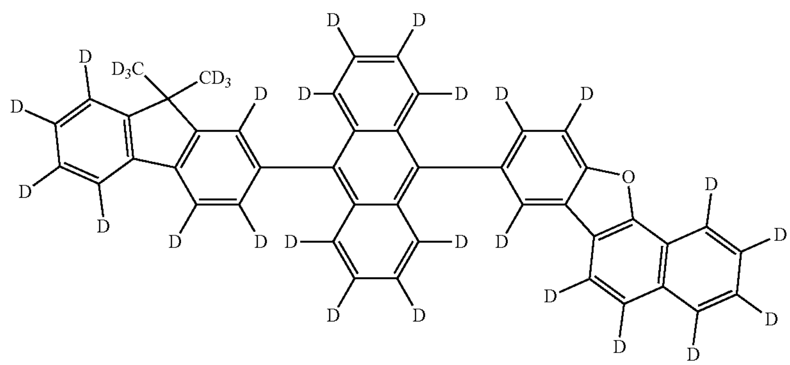
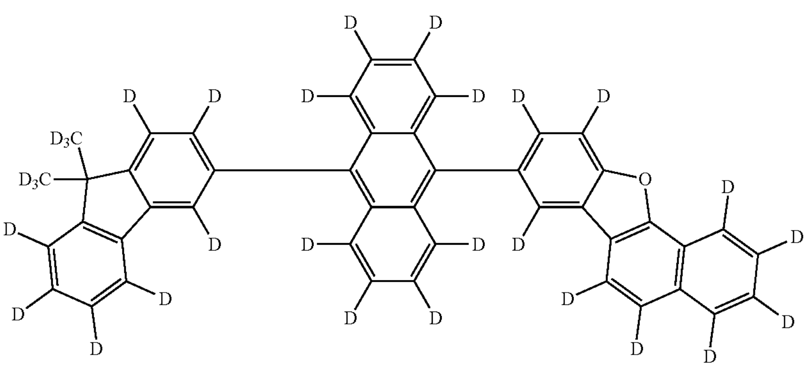
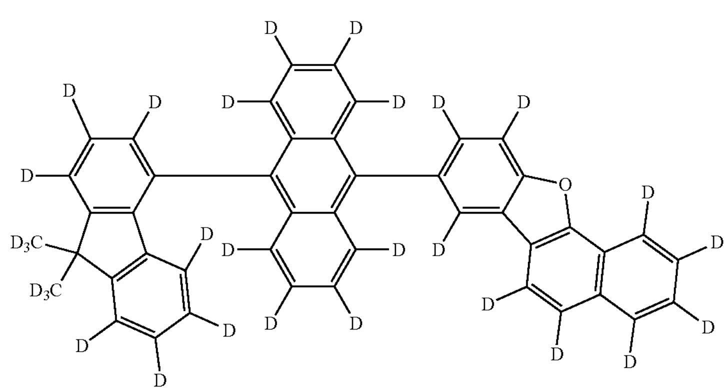

-continued
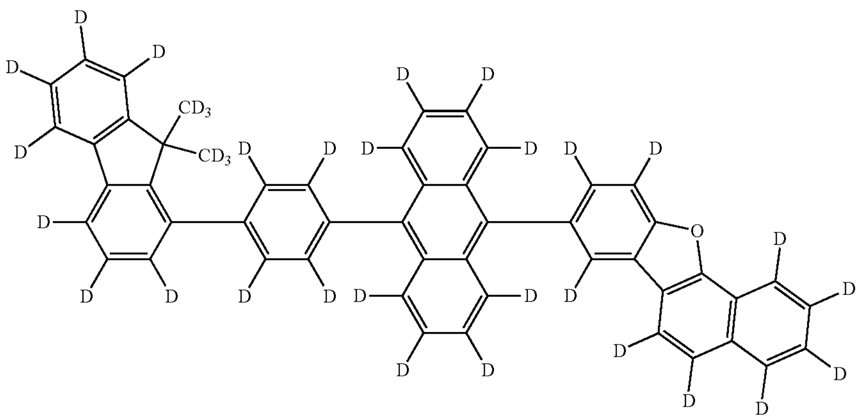
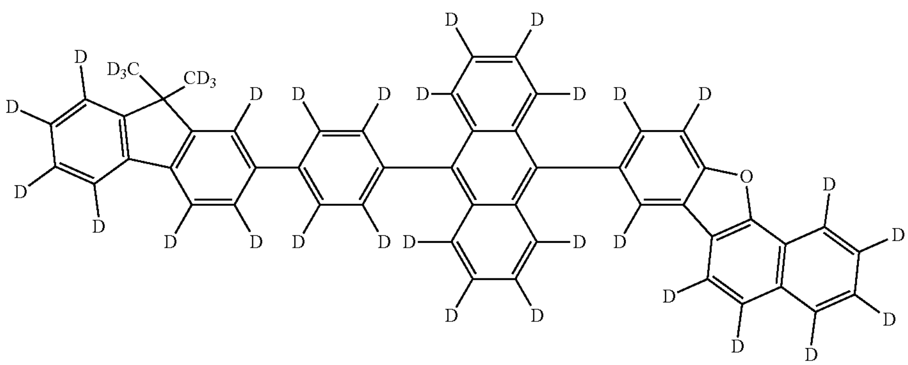
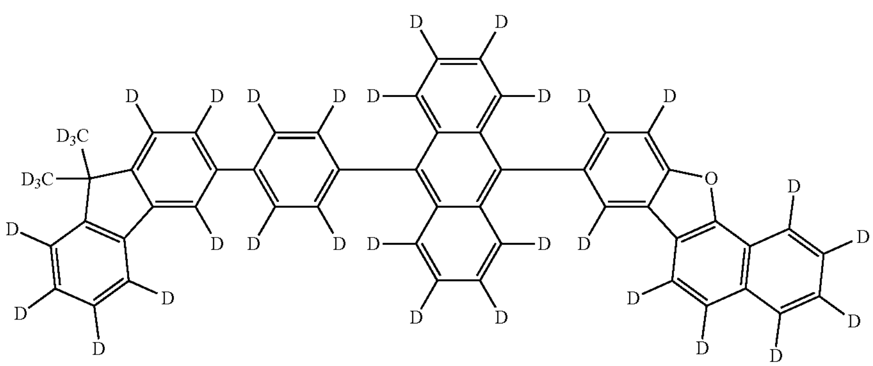
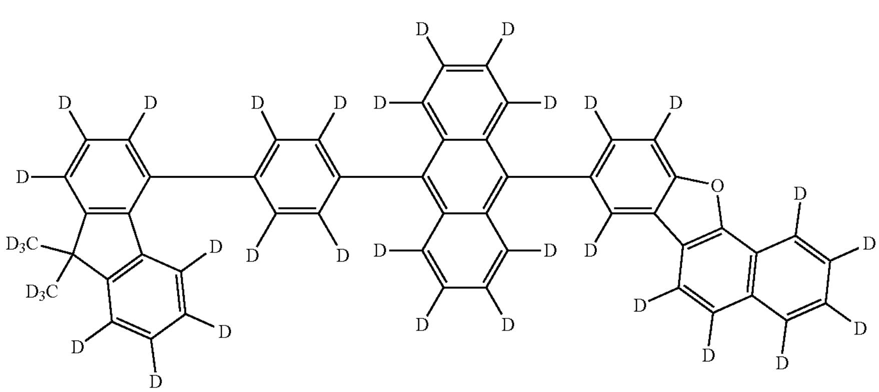

-continued
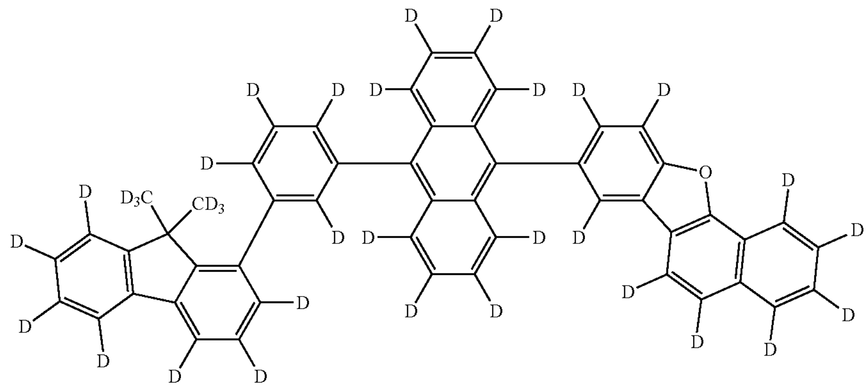
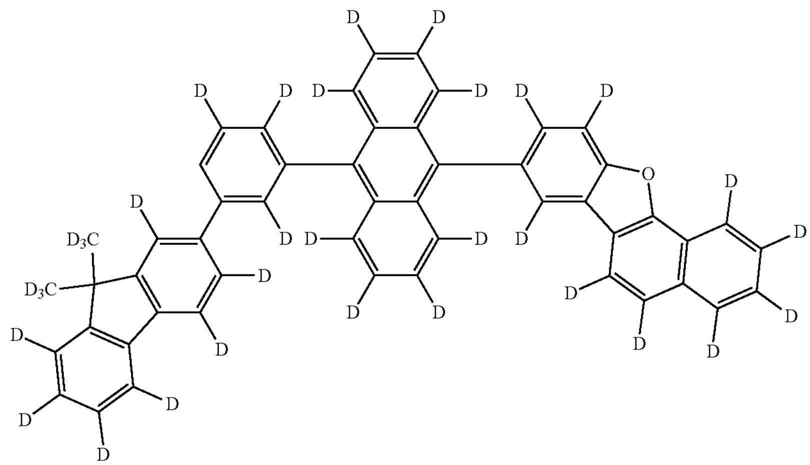
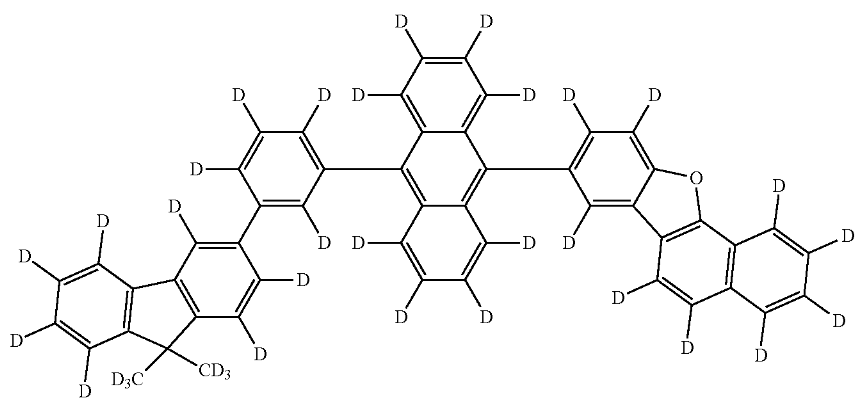
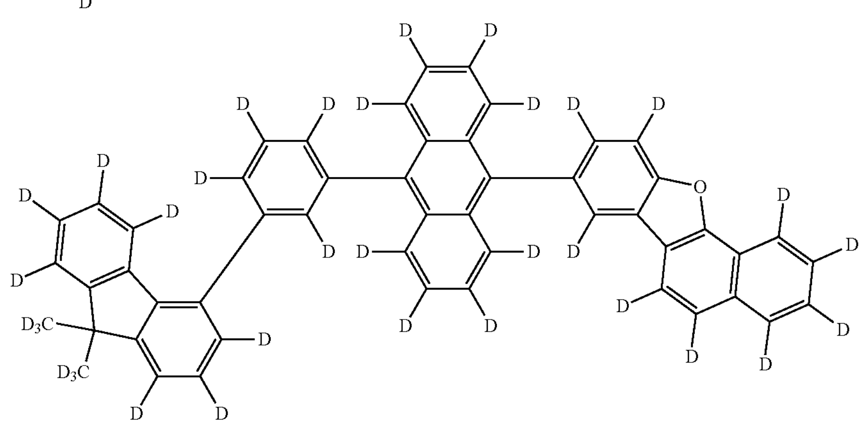

-continued
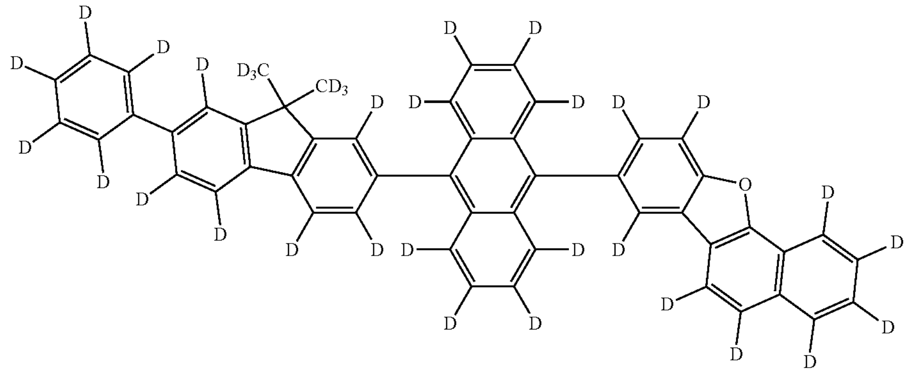
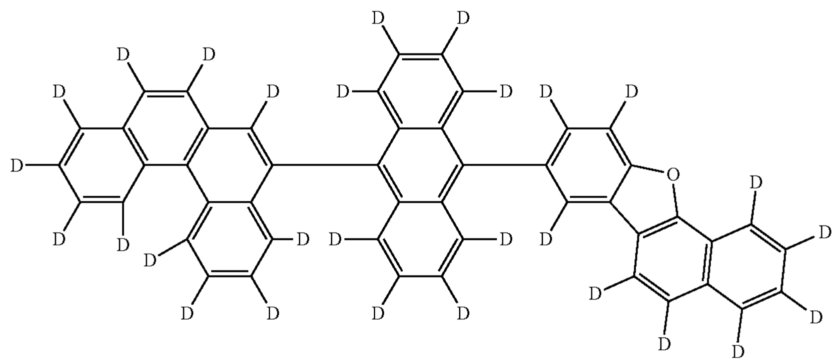
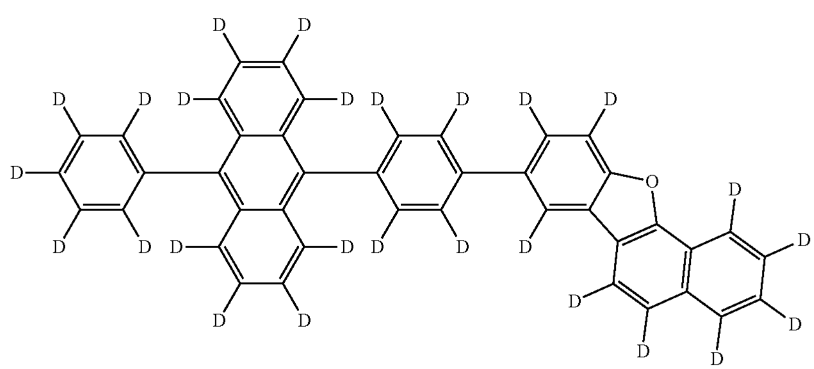
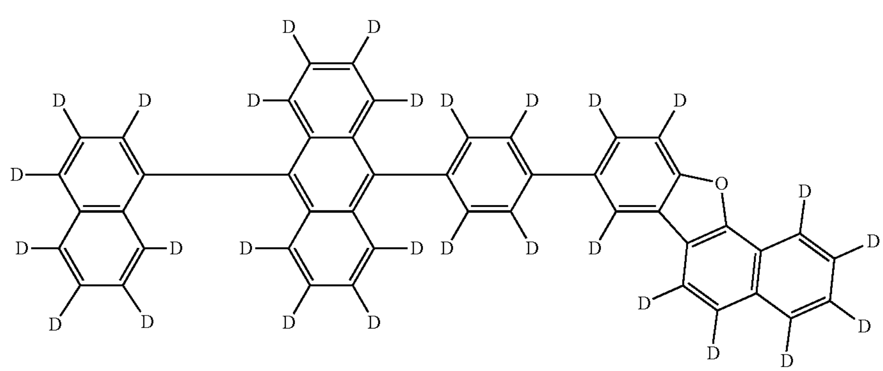

-continued
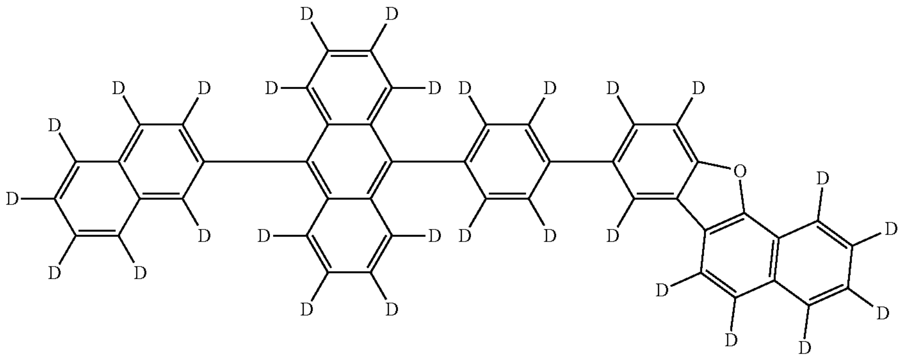
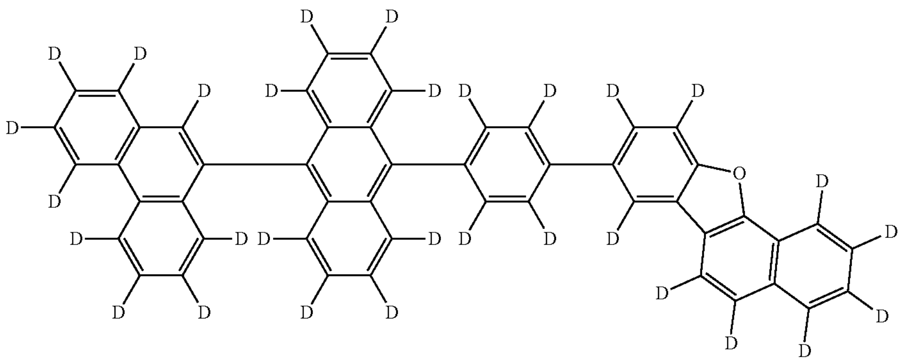
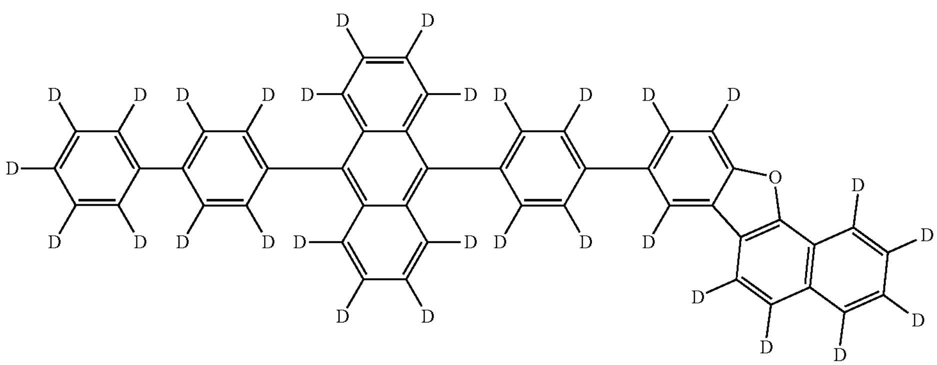
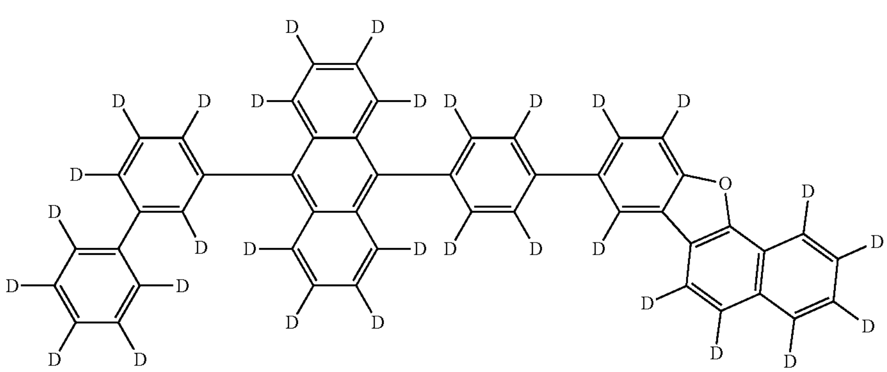

-continued
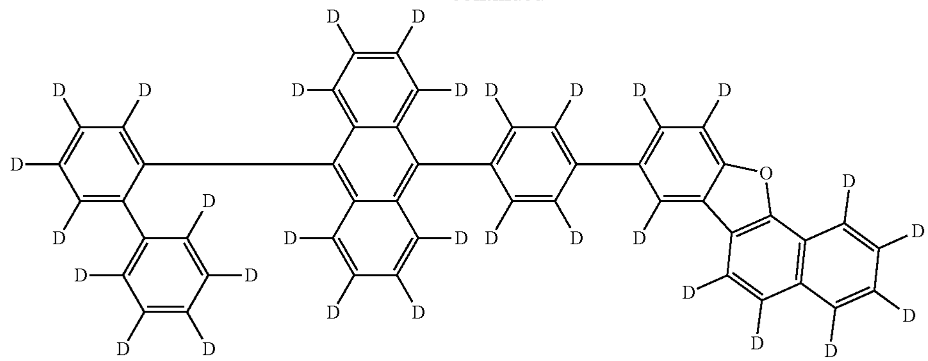
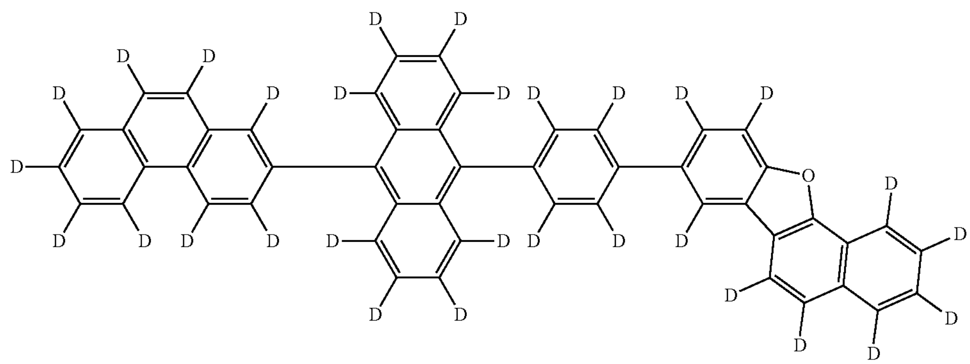
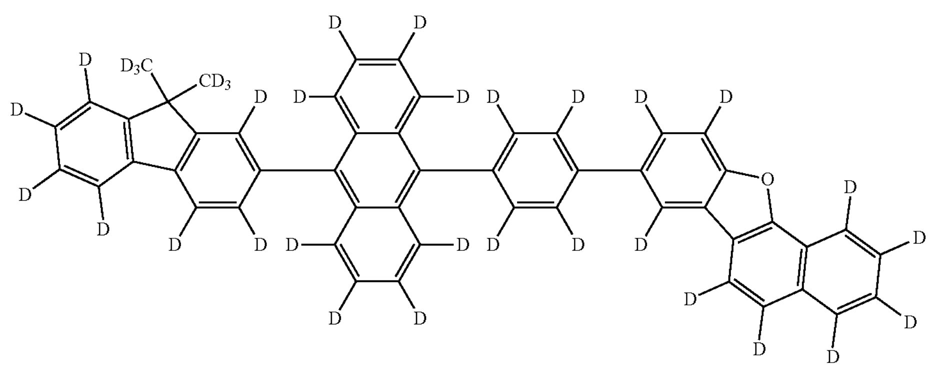
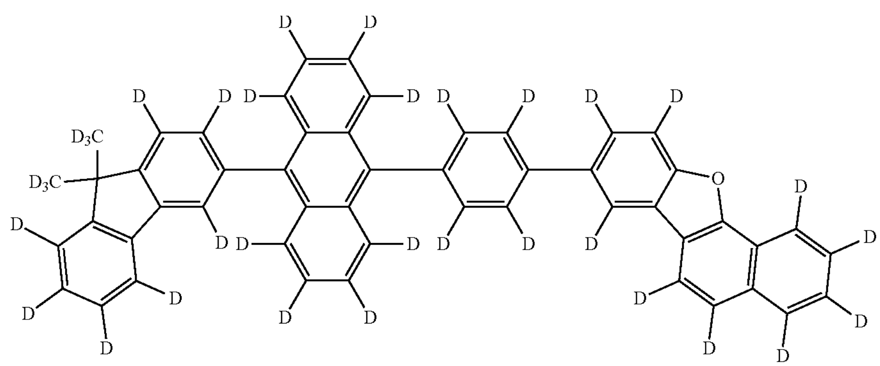

-continued
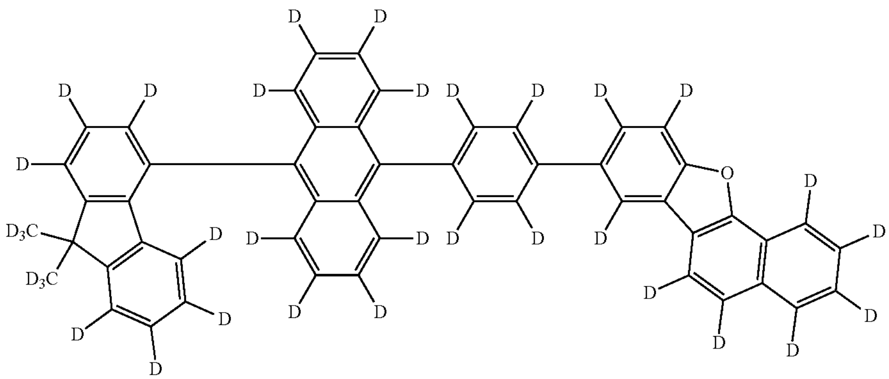
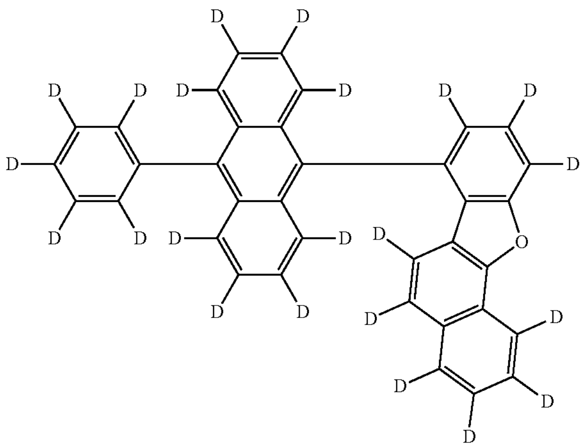
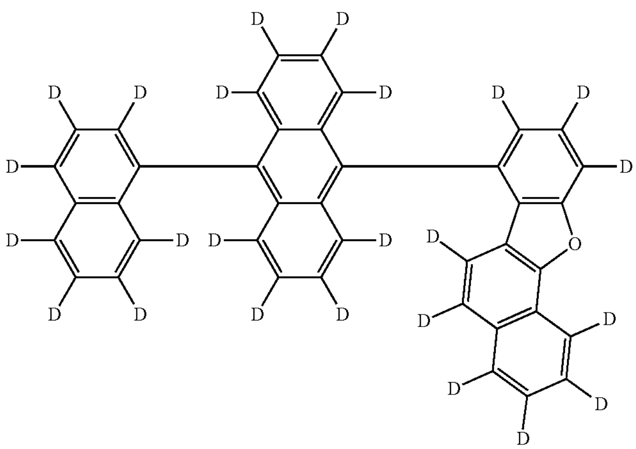
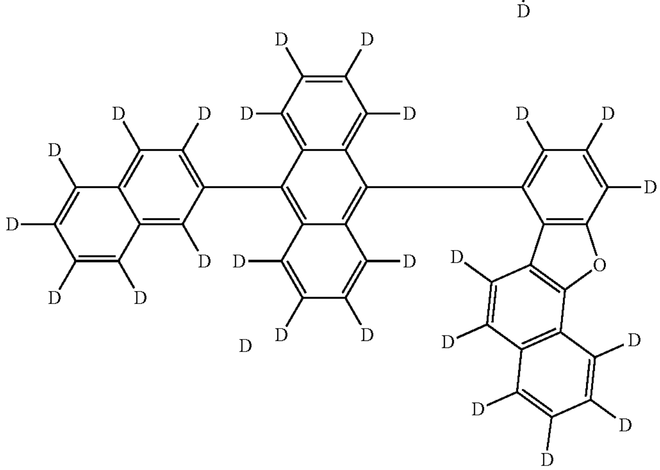

-continued
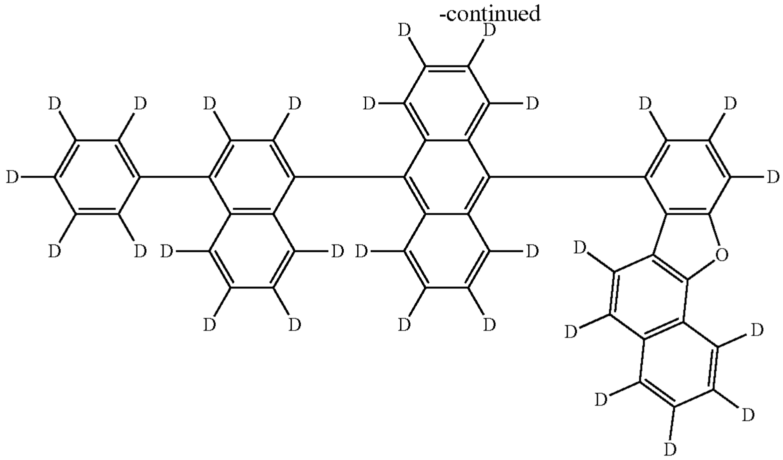
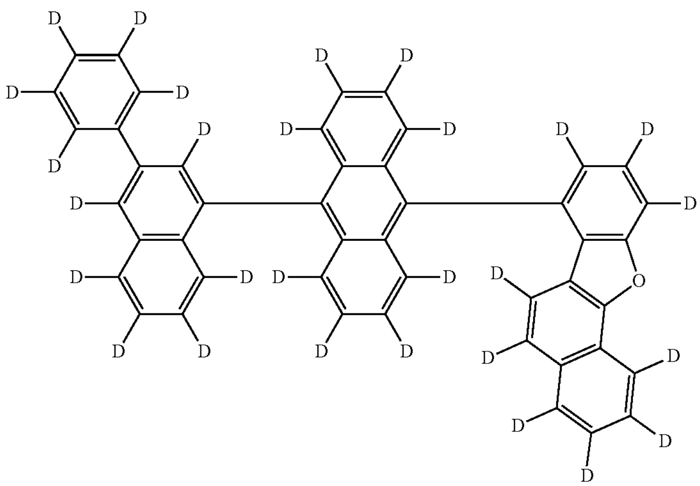
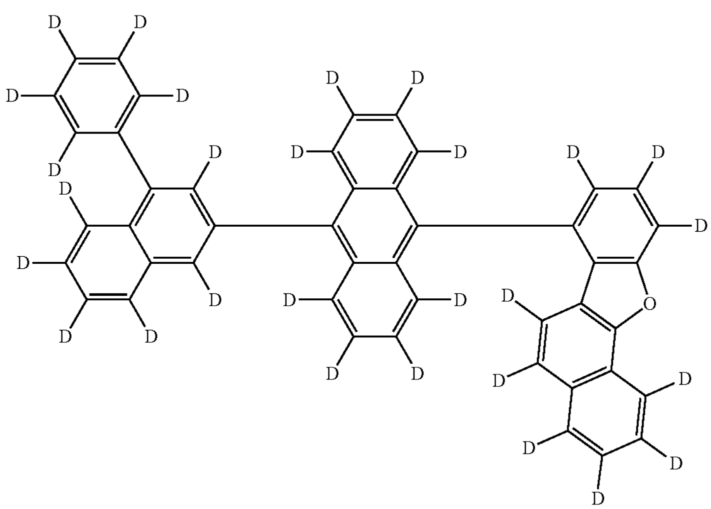

-continued
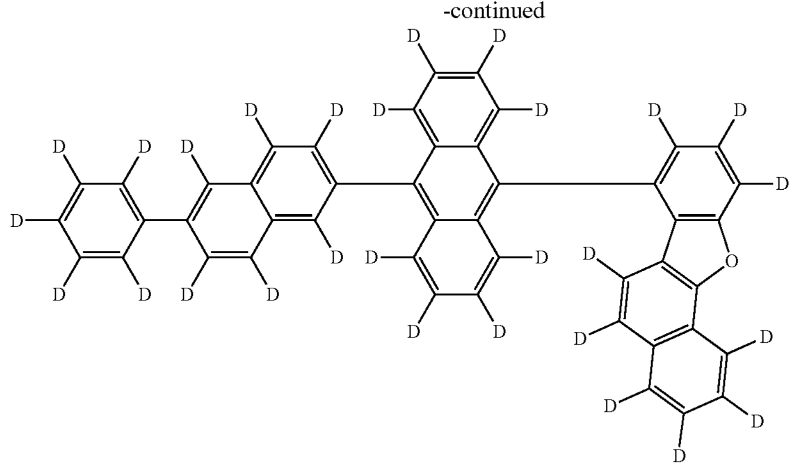
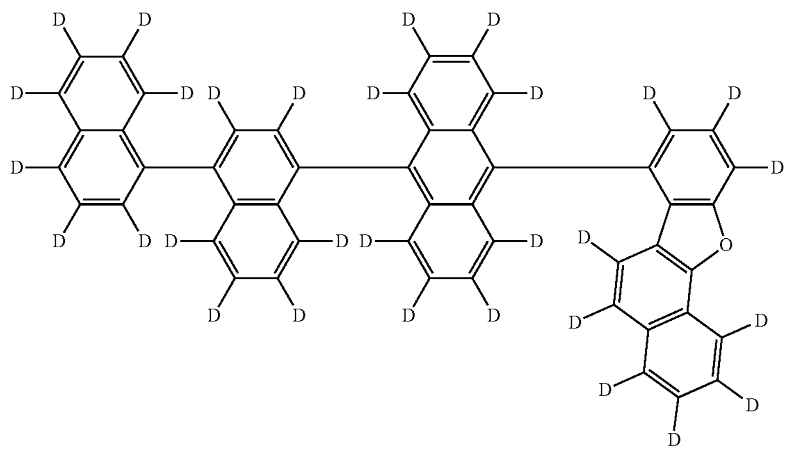
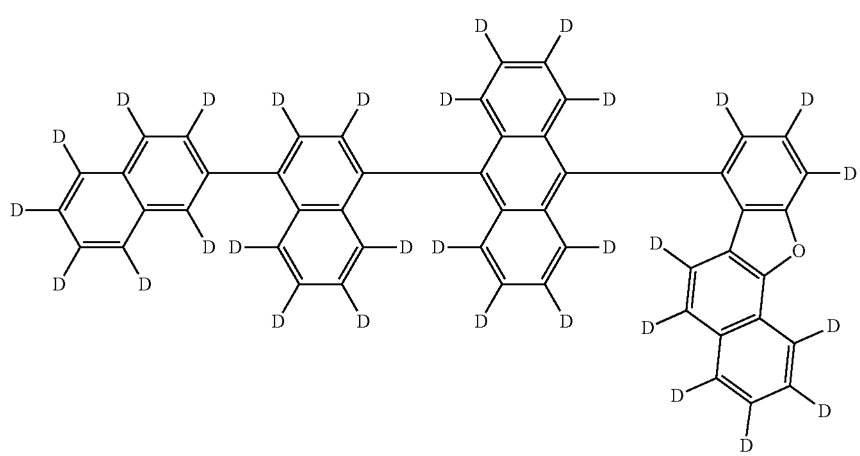

-continued
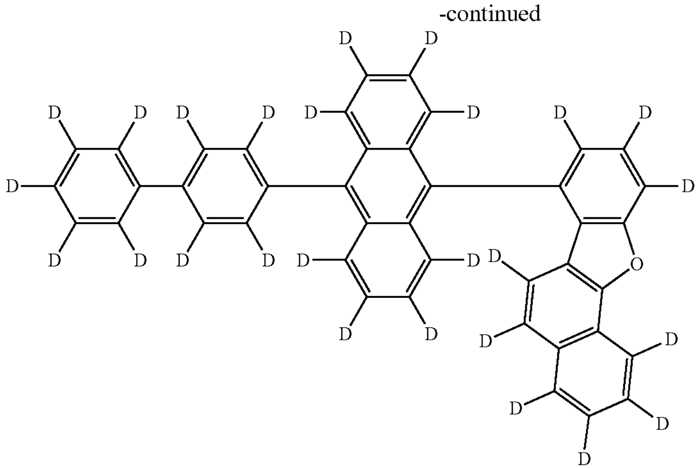
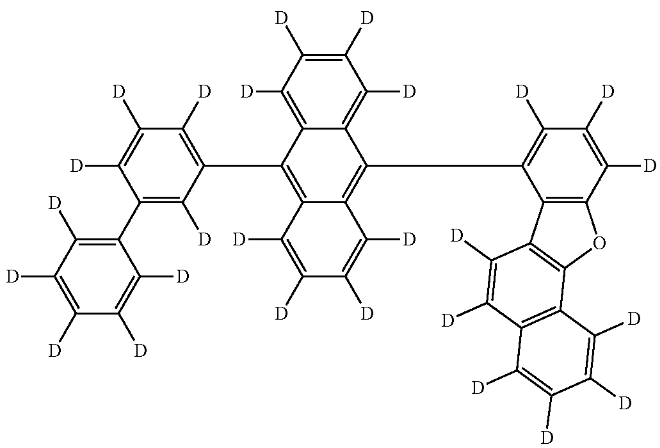
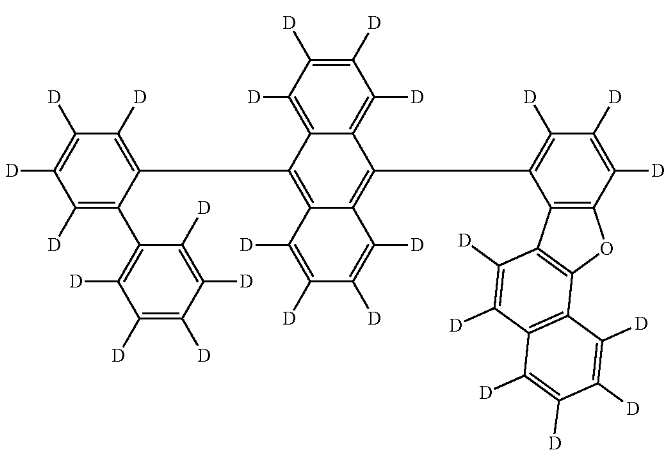

-continued
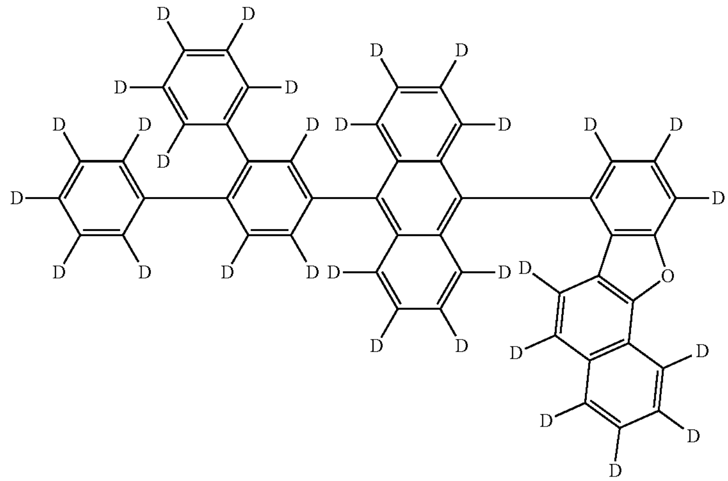
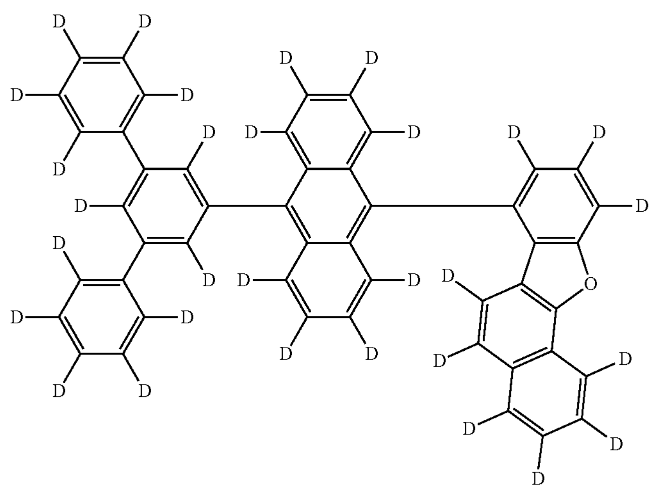
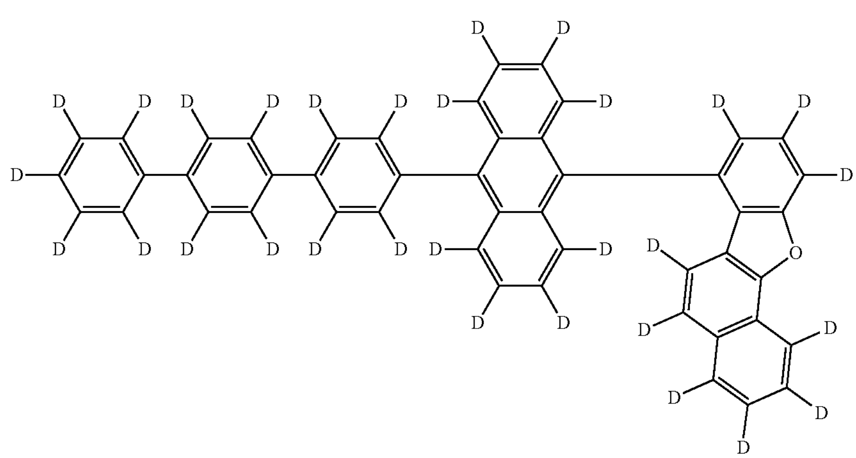

-continued
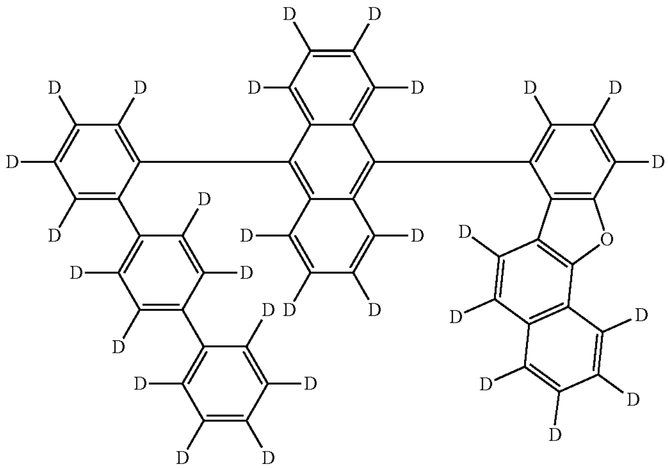
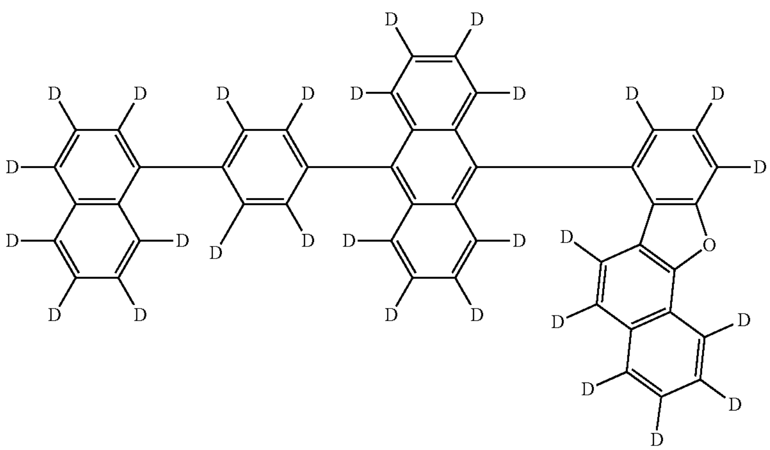
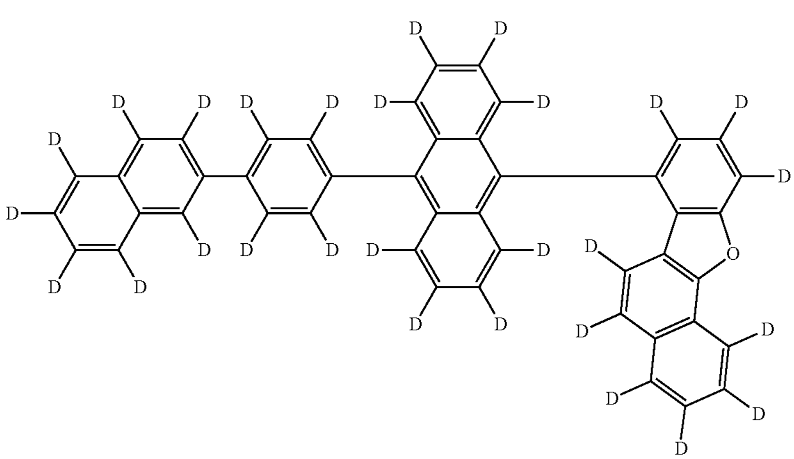

-continued
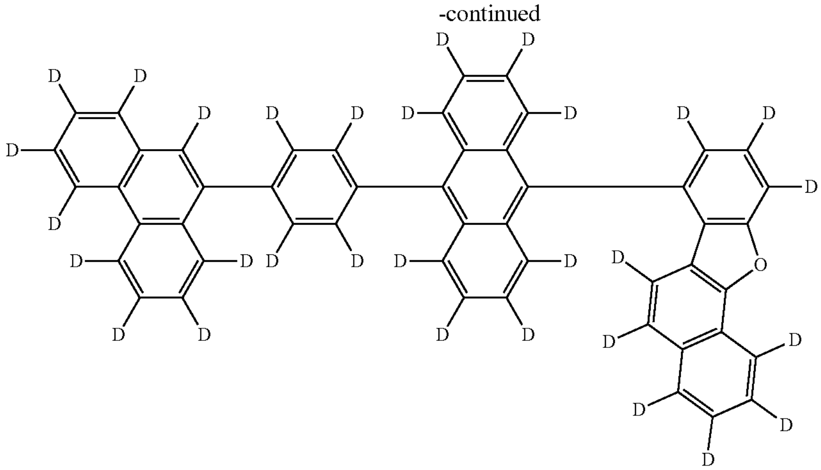
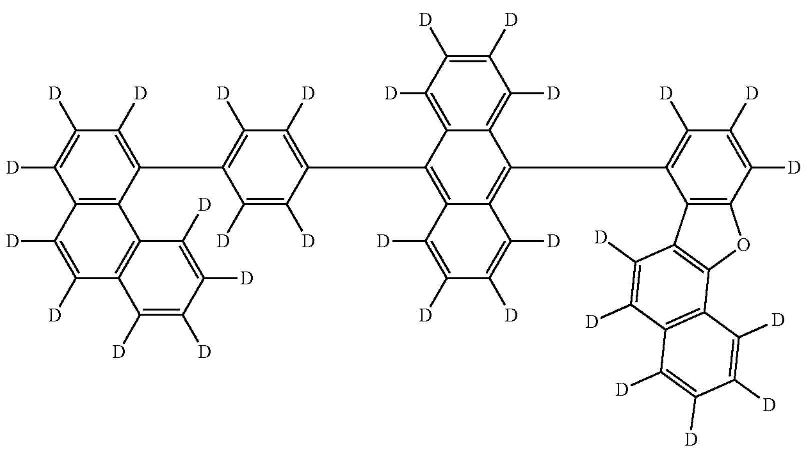
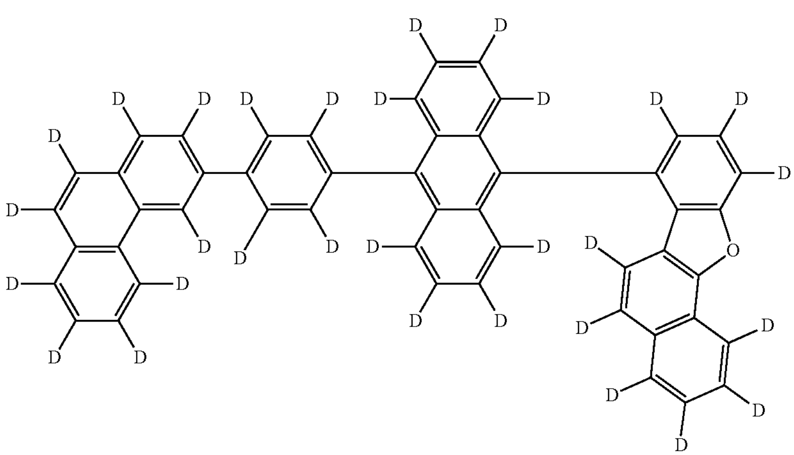

-continued
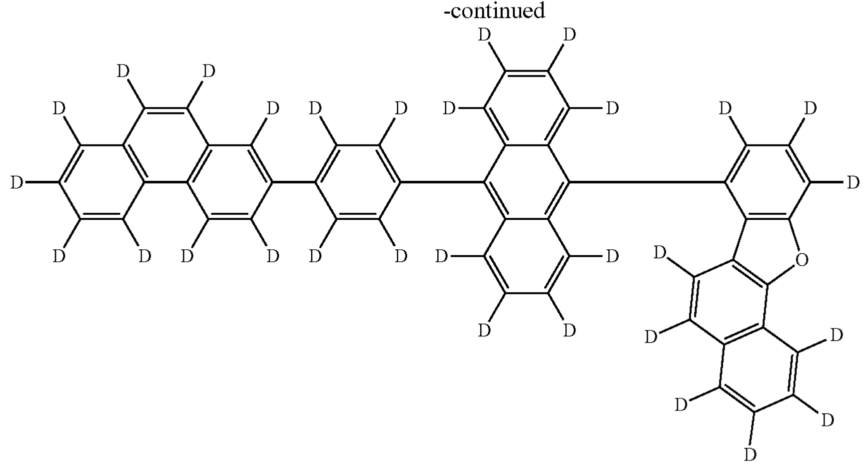
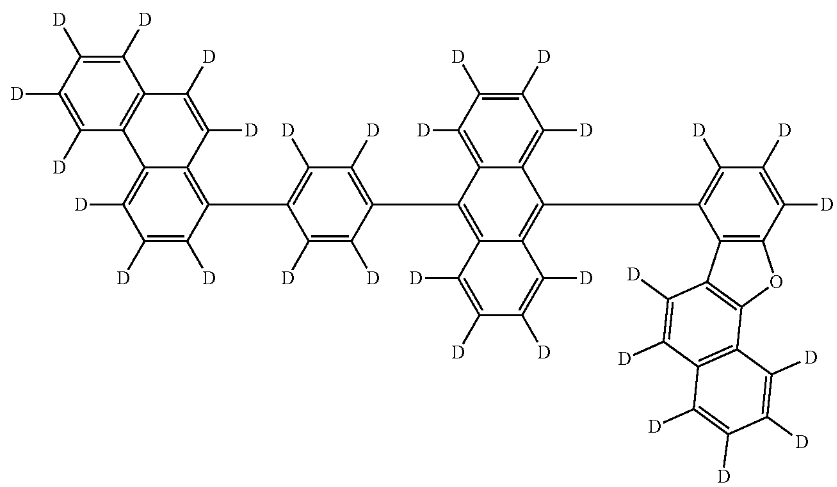
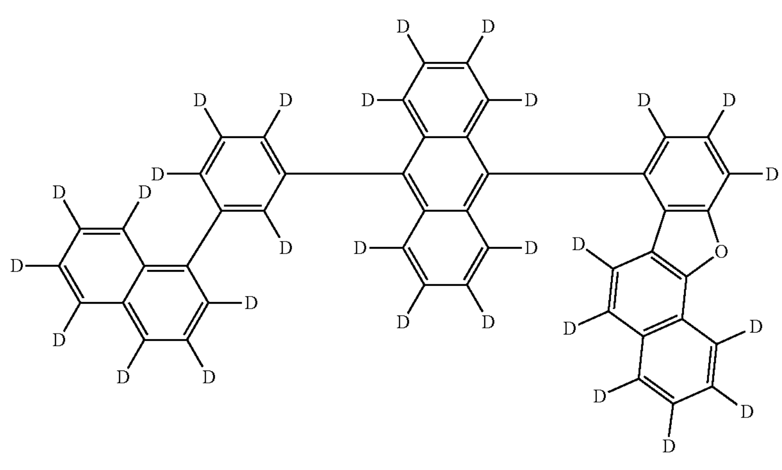

-continued
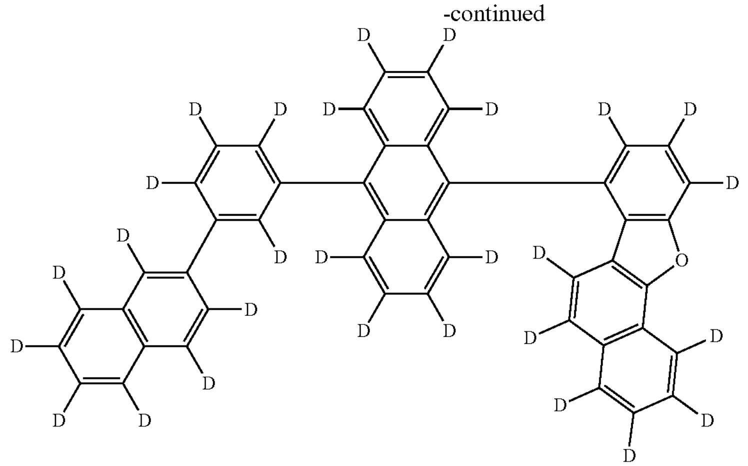
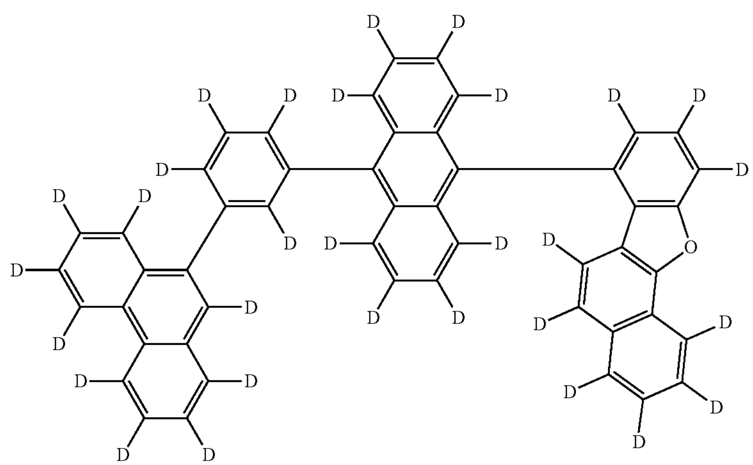
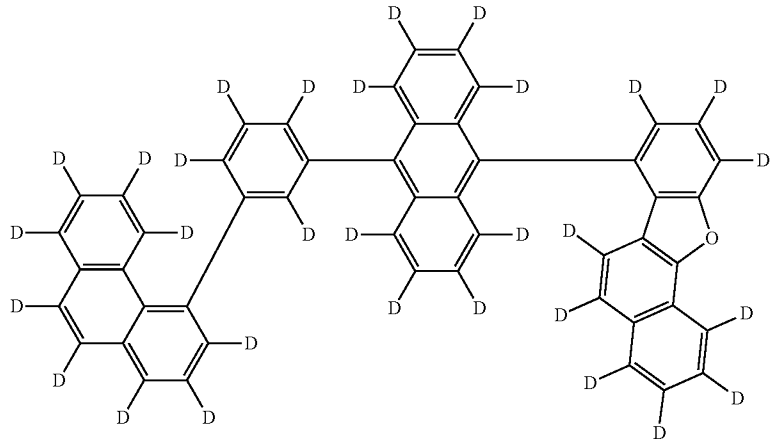

-continued
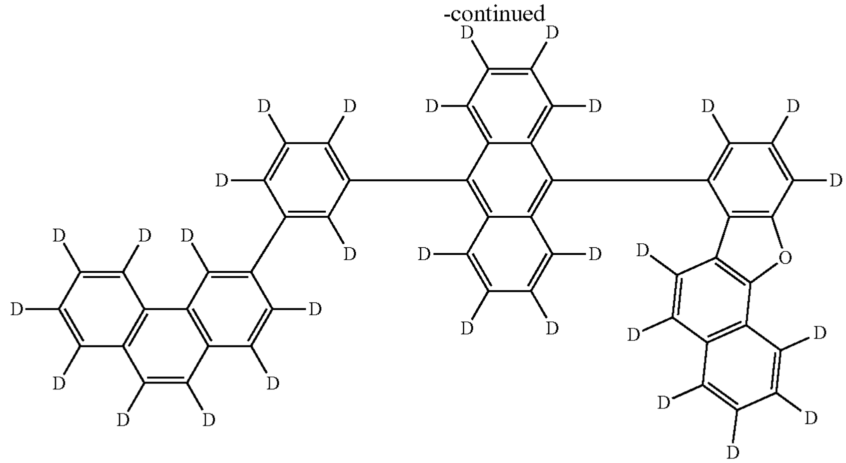
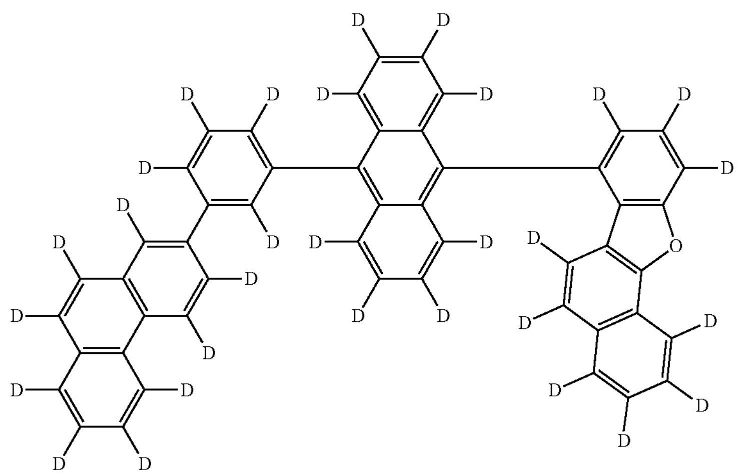
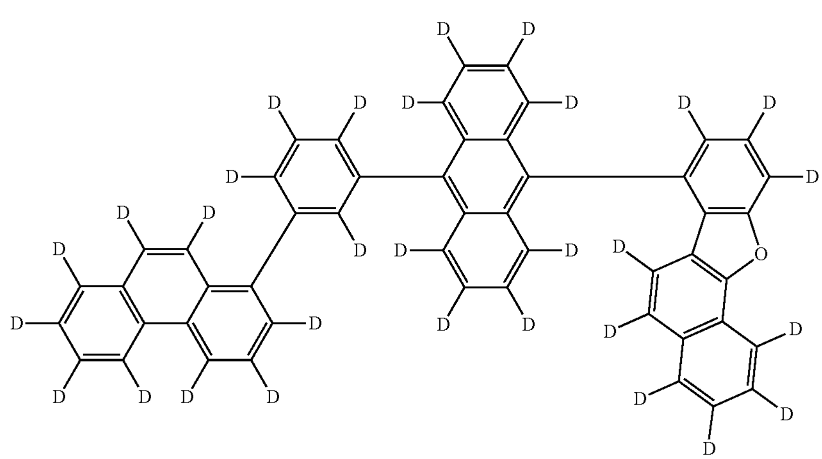

-continued
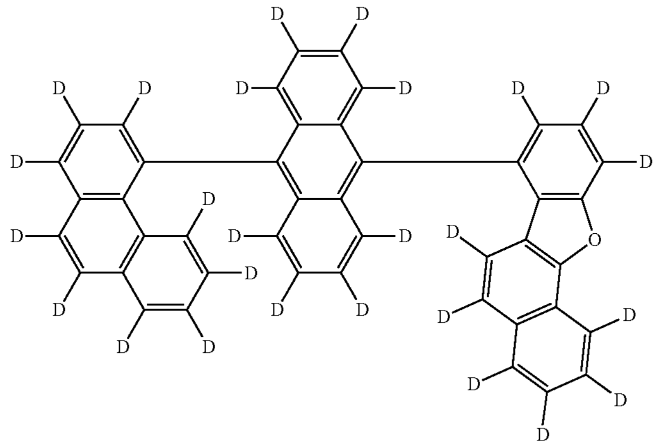
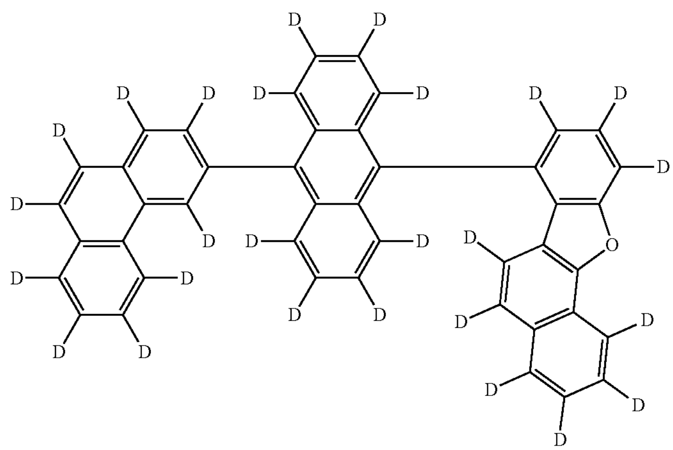 [SMILES: [2H]c1c([2H])c(-c2c3c([2H])c([2H])c([2H])c([2H])c3c(-c3c([2H])c([2H])c4c([2H])c([2H])c5c([2H])c([2H])c([2H])c([2H])c5c4c3[2H])c3c([2H])c([2H])c([2H])c([2H])c23)c2c(oc3c4c([2H])c([2H])c([2H])c([2H])c4c([2H])c([2H])c32)c1[2H]]
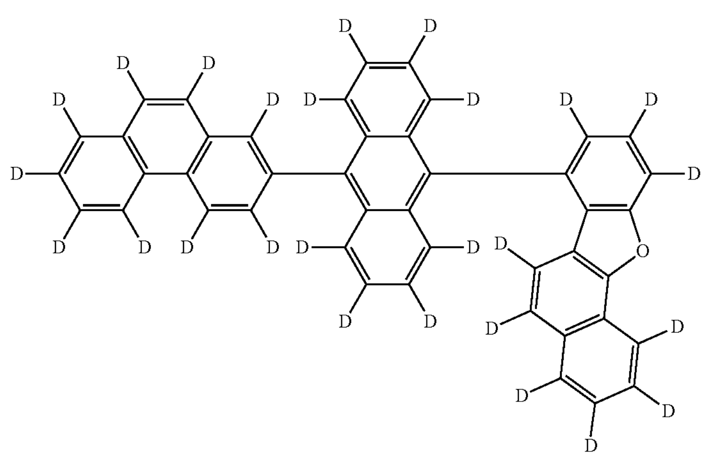

-continued
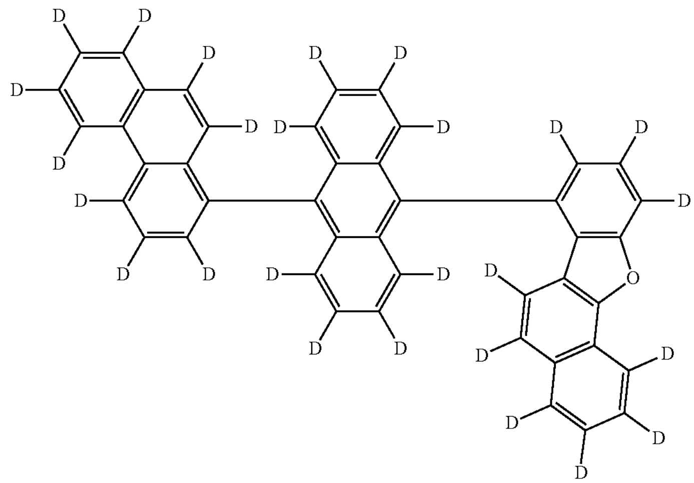
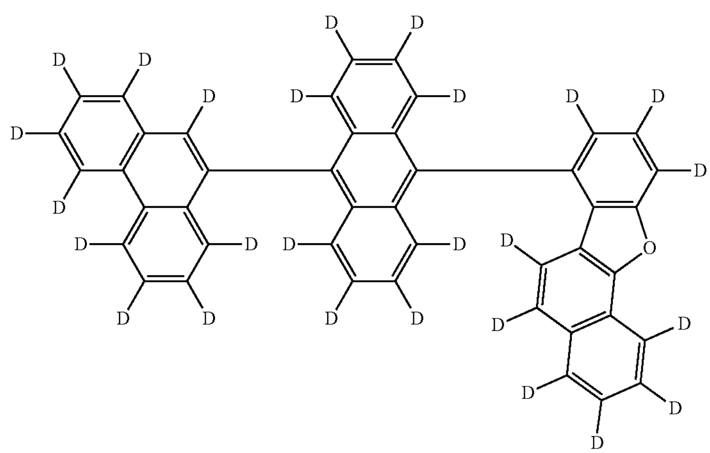
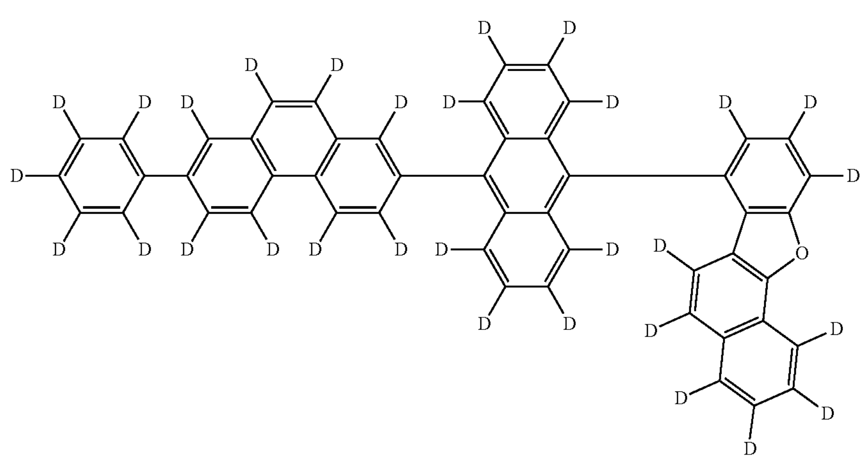

-continued
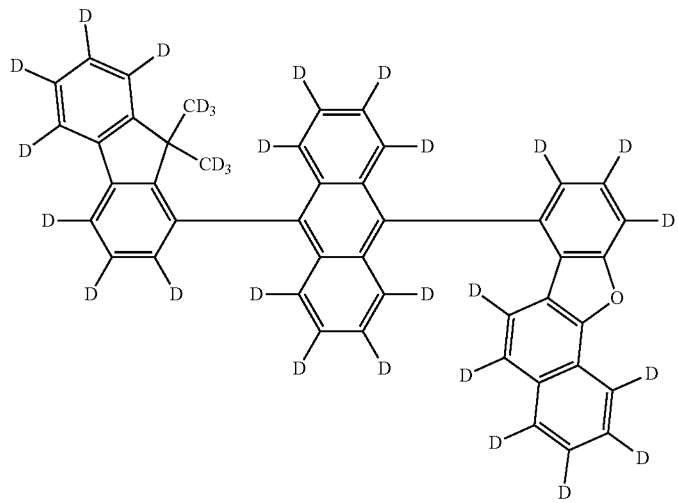
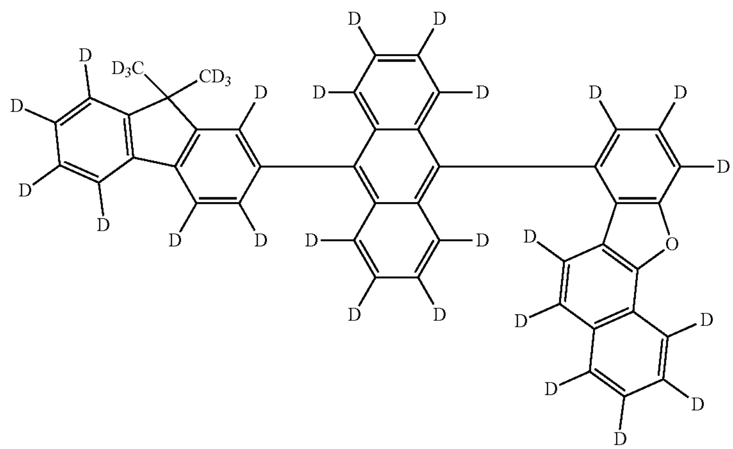
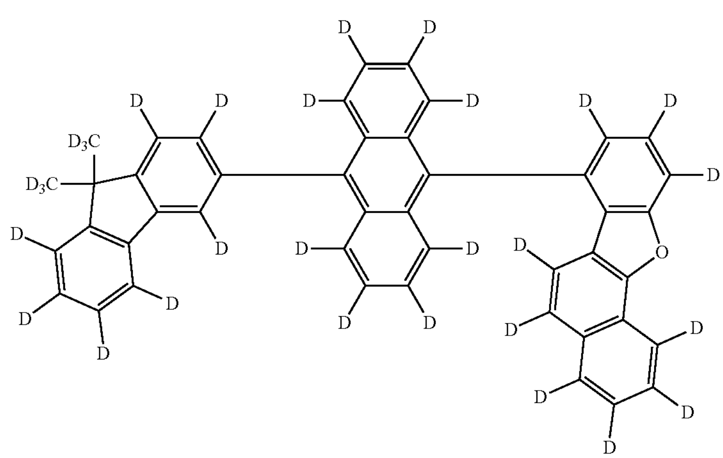

-continued
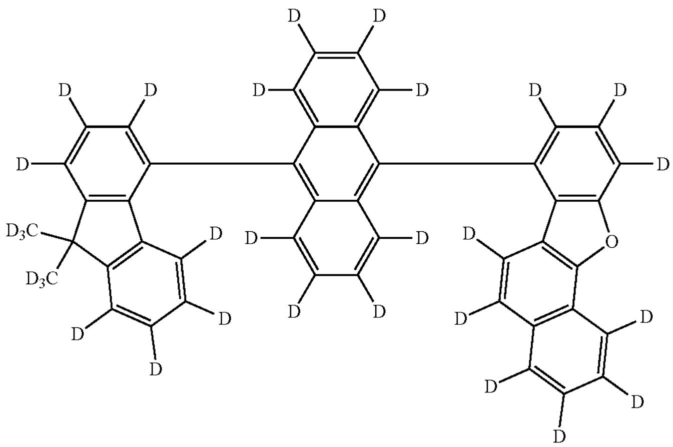
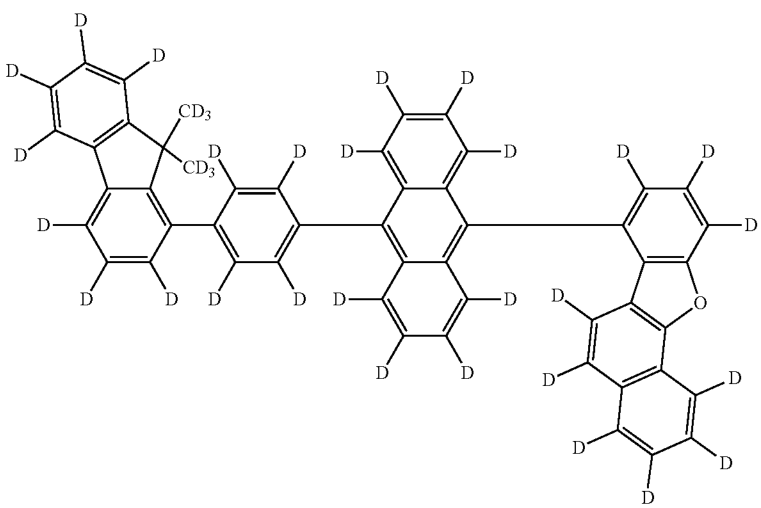
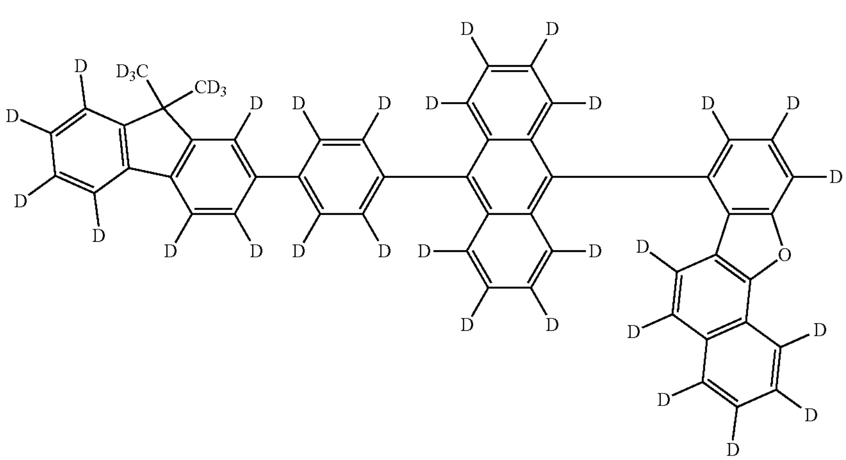

-continued
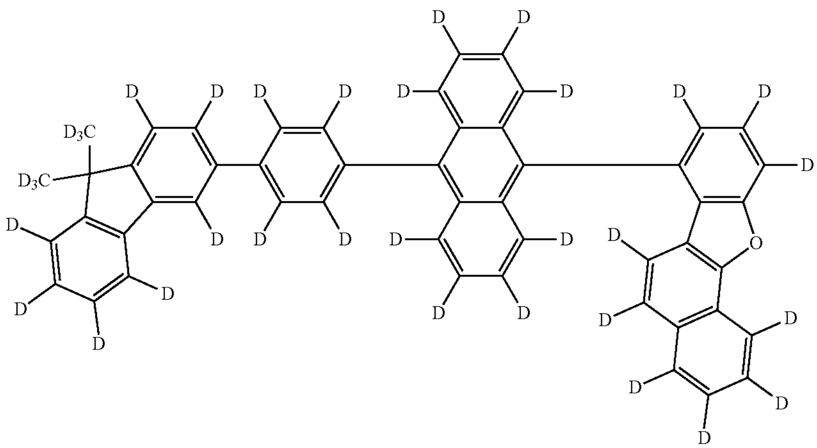
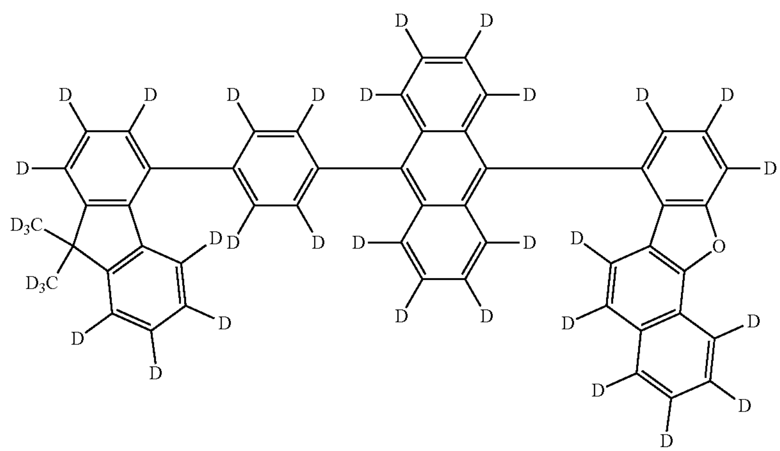
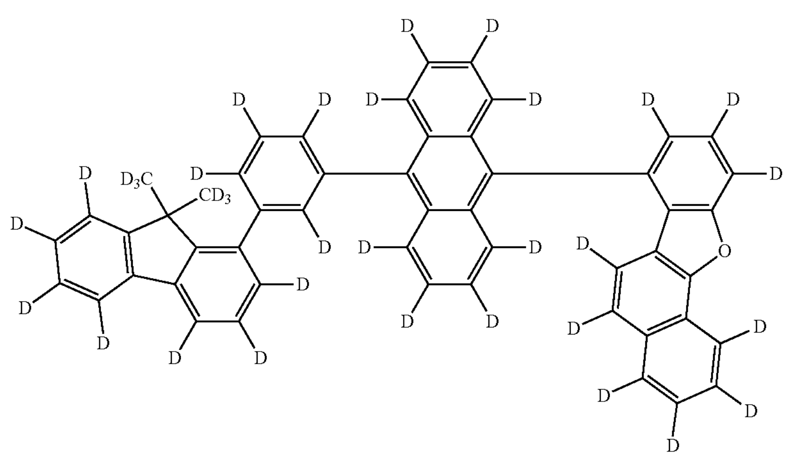

-continued
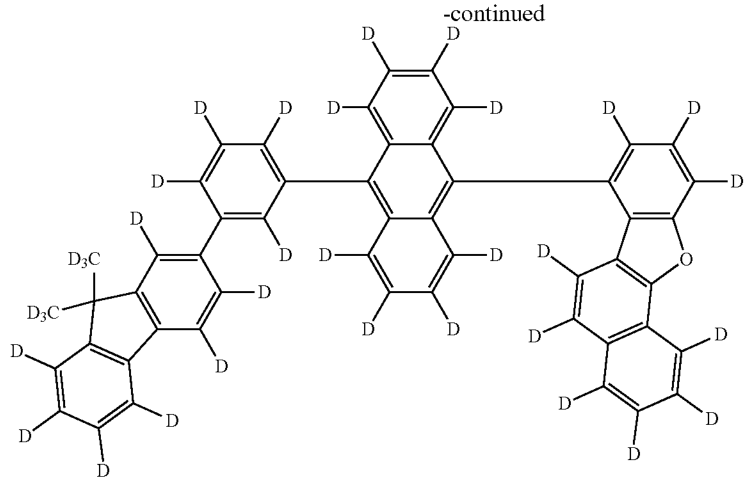
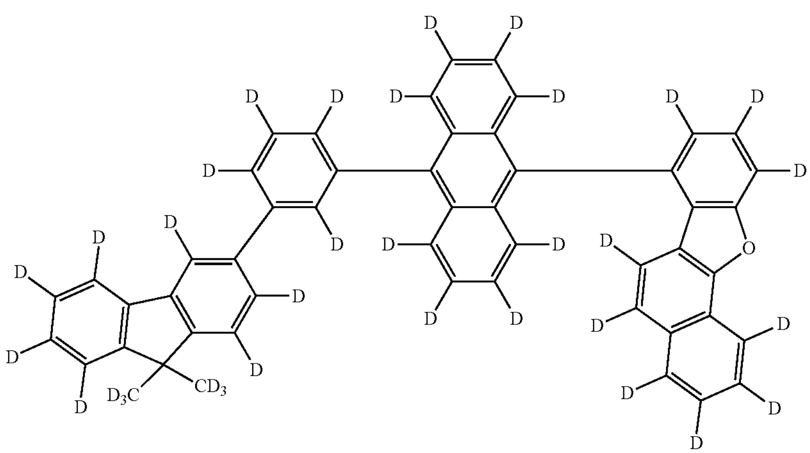
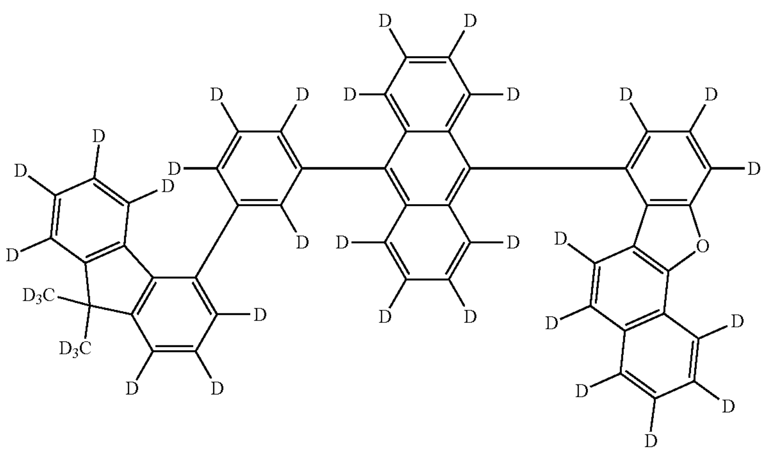

-continued
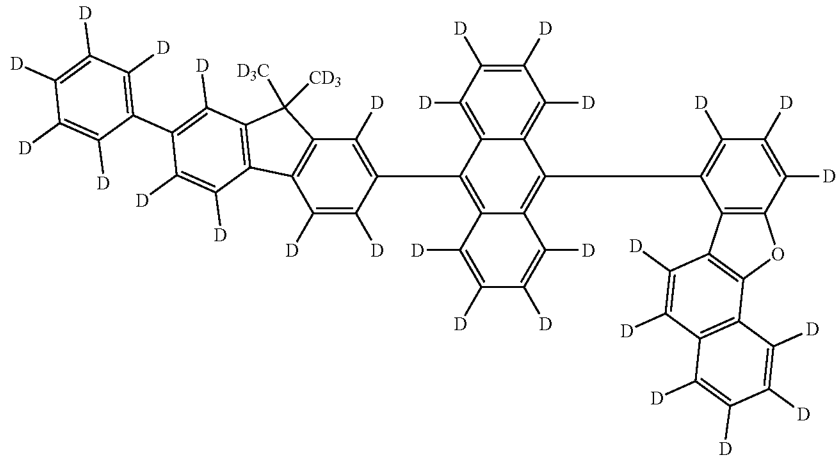
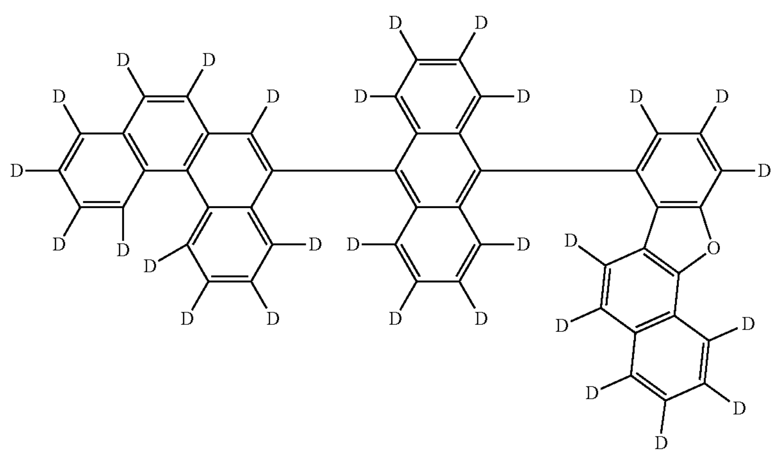
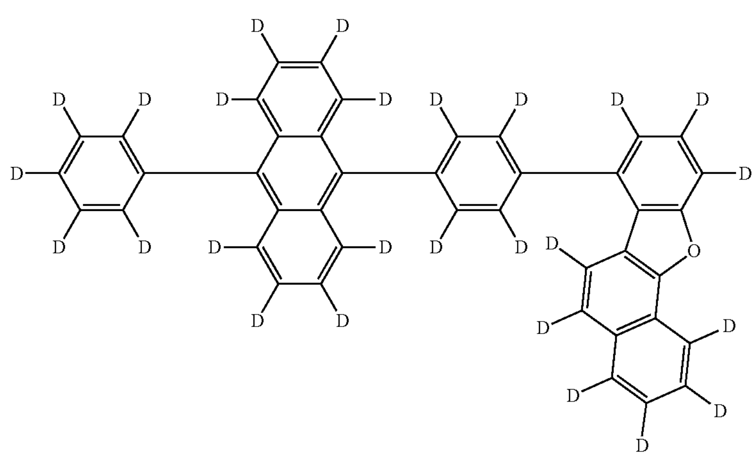

-continued
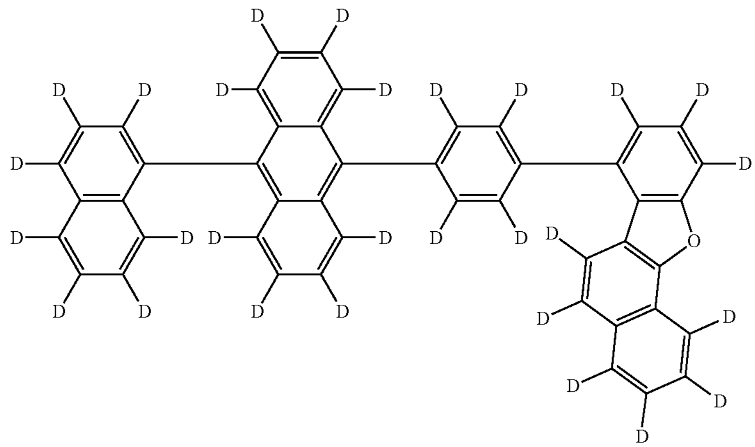
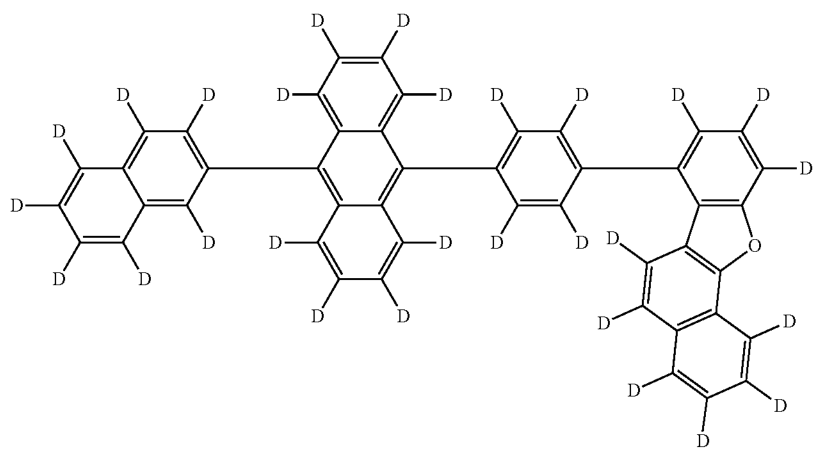
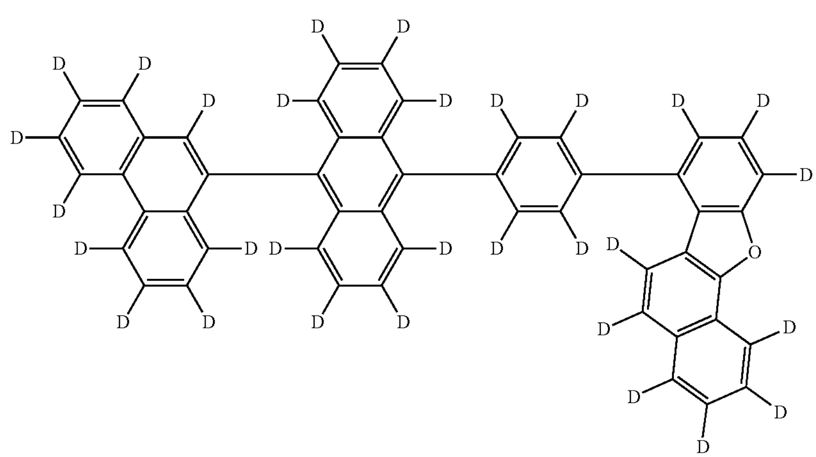

-continued
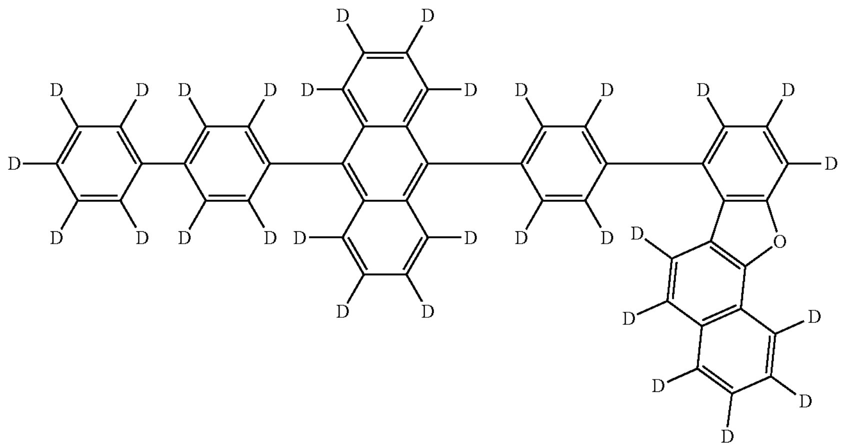
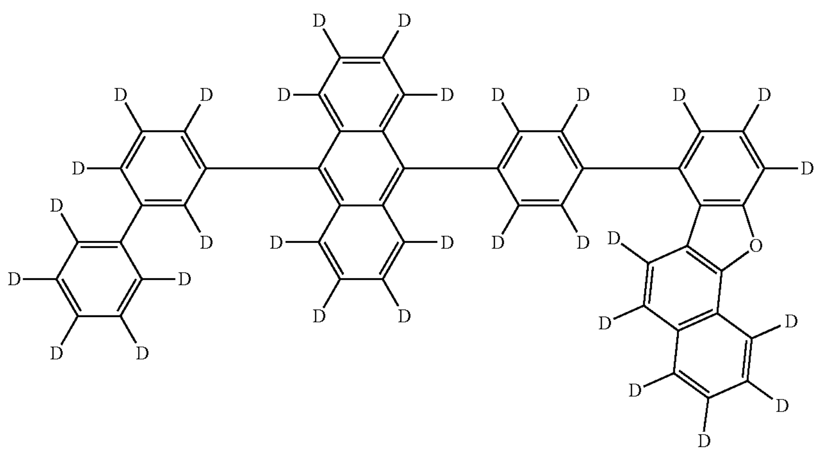
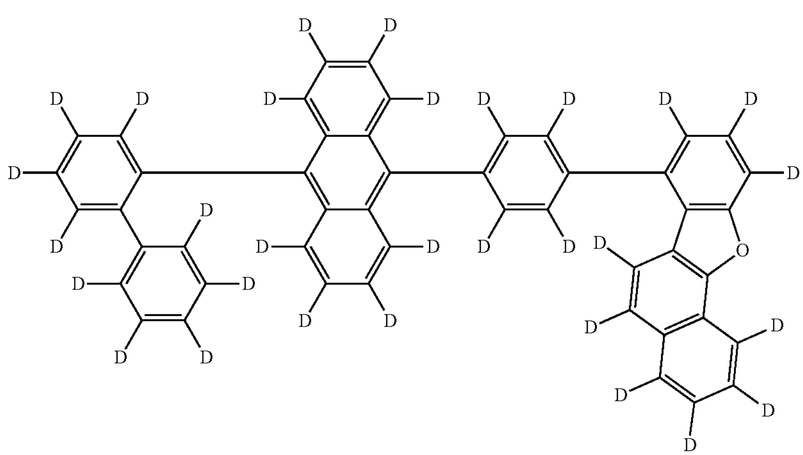

-continued
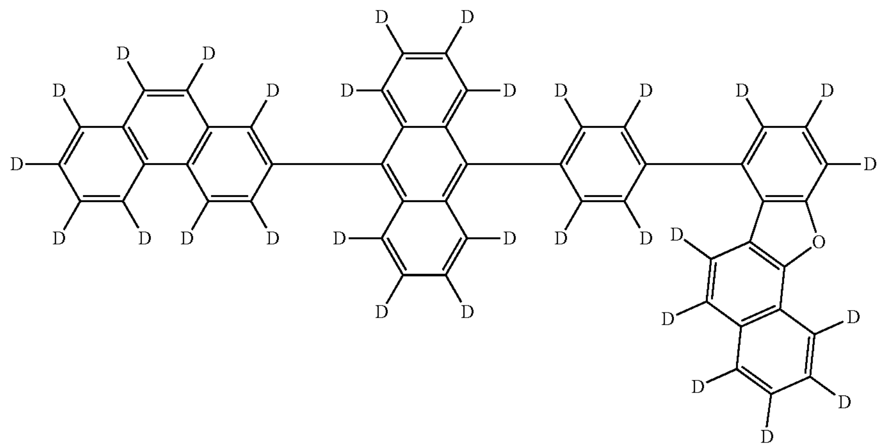
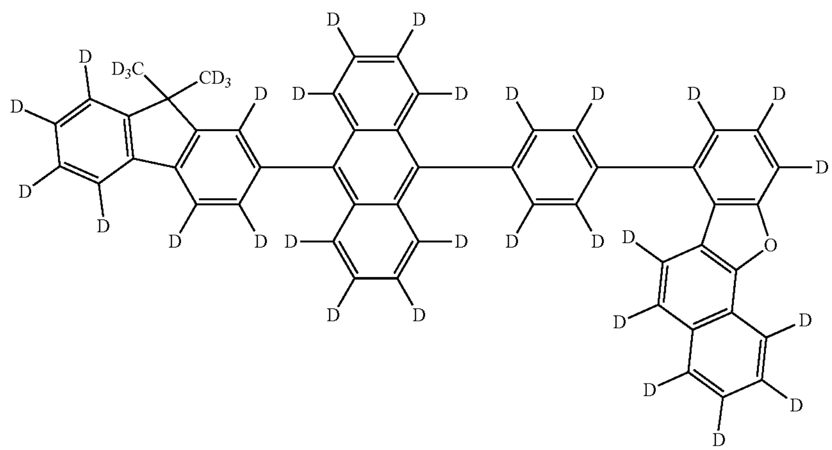
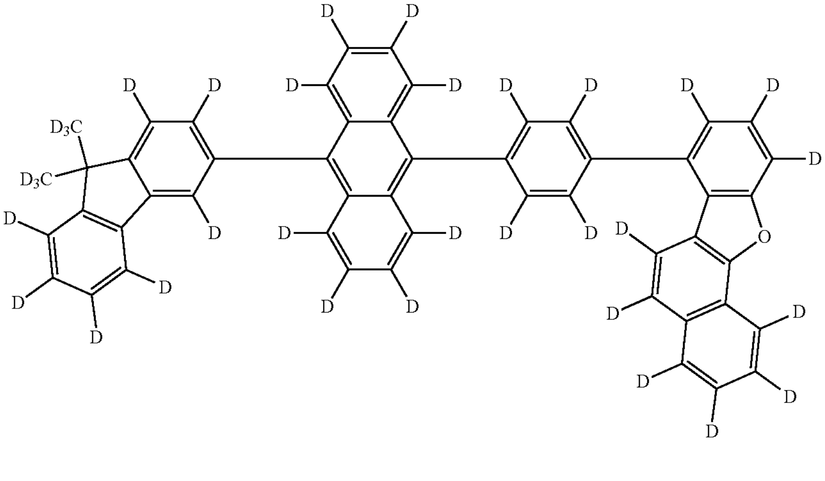

-continued
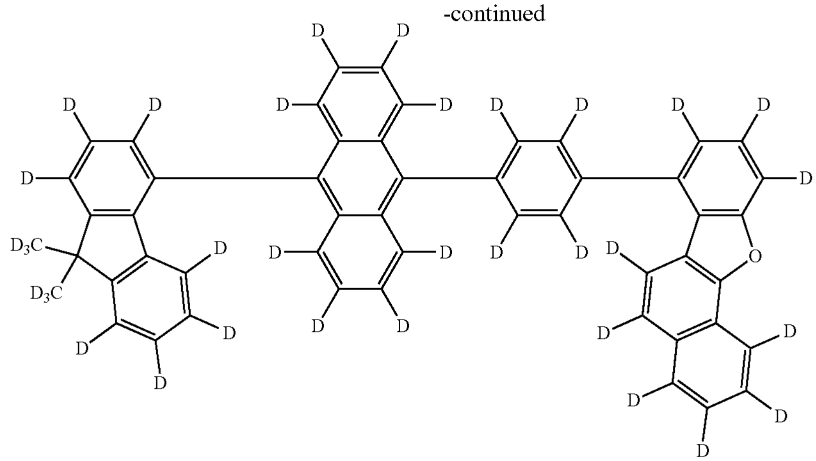
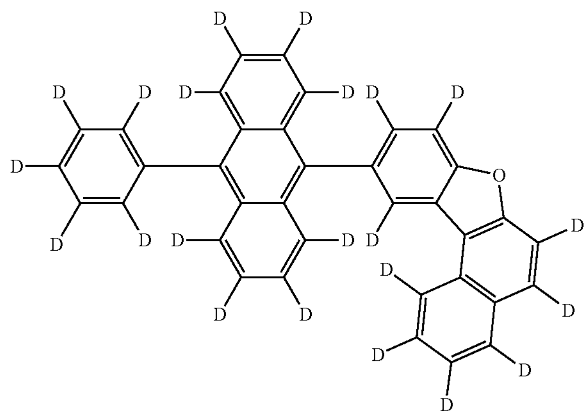
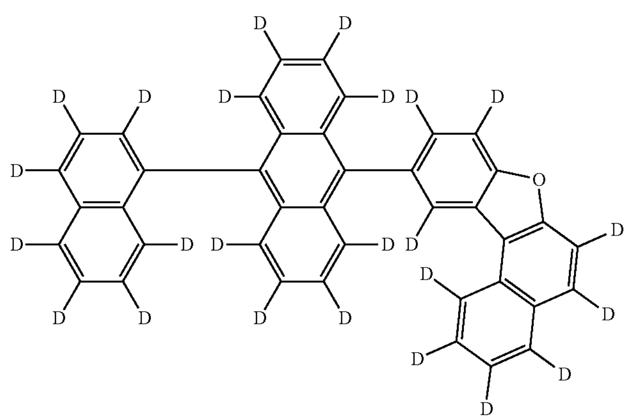
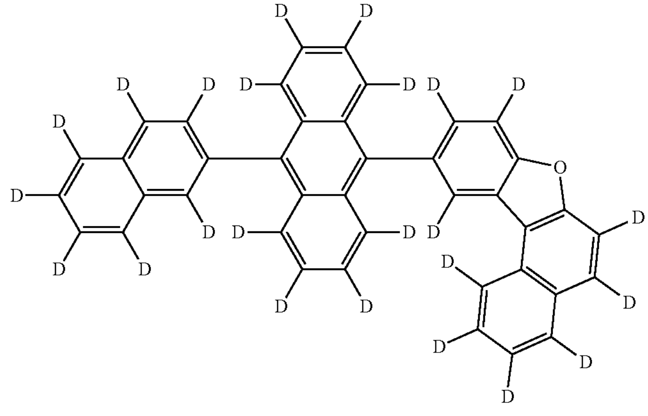

-continued
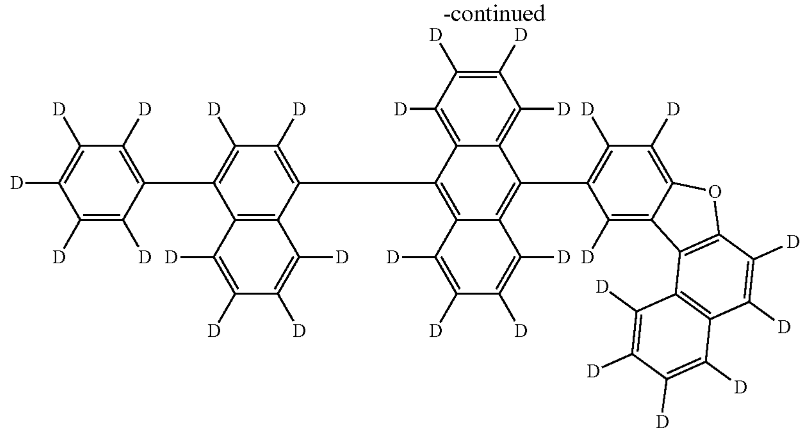
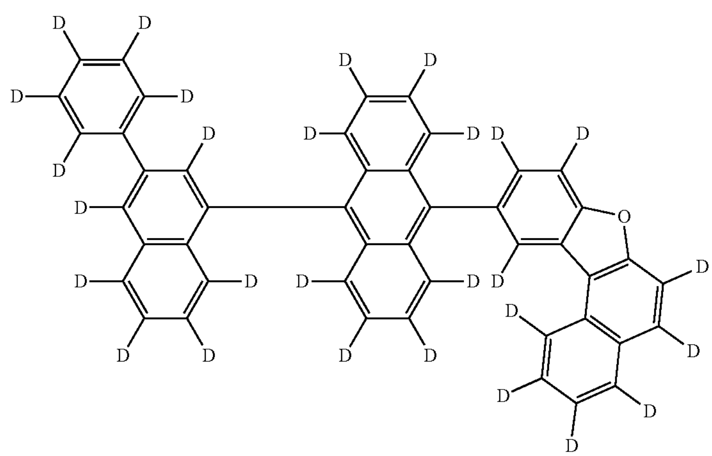
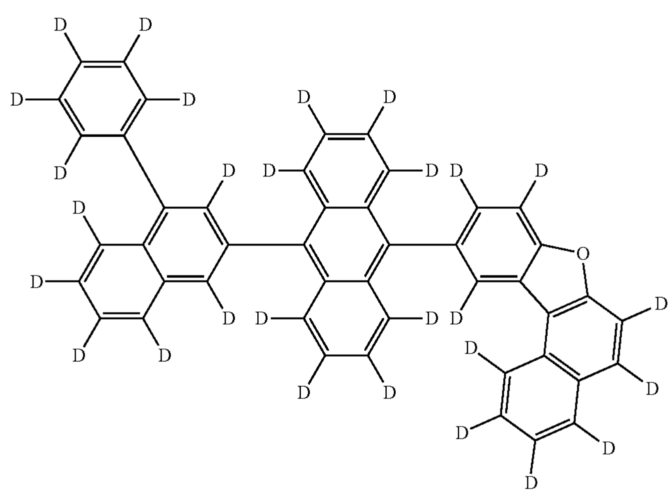

-continued
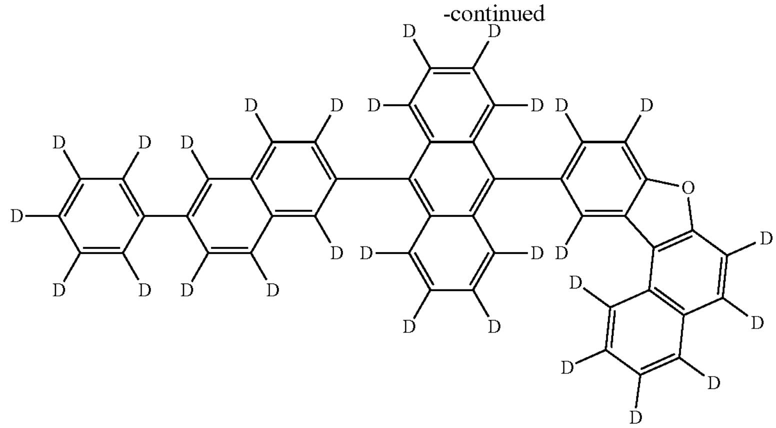
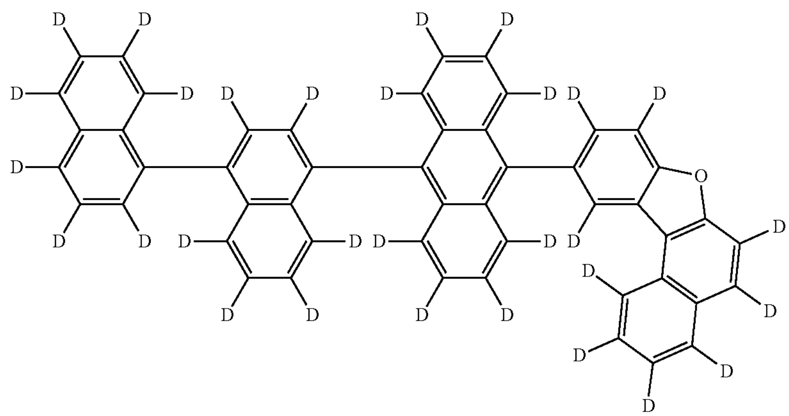
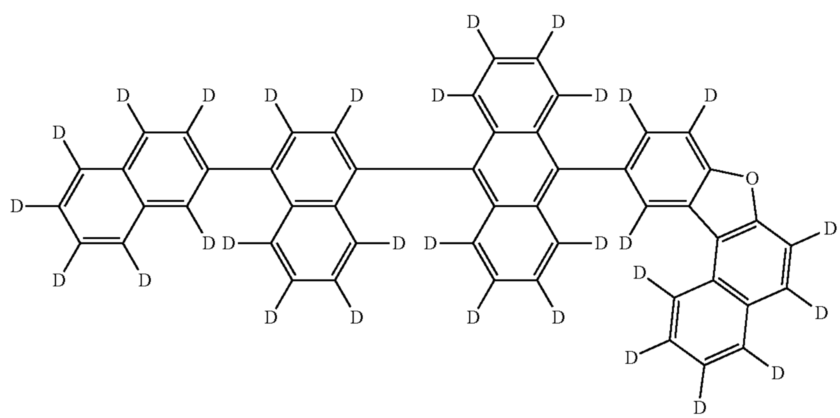
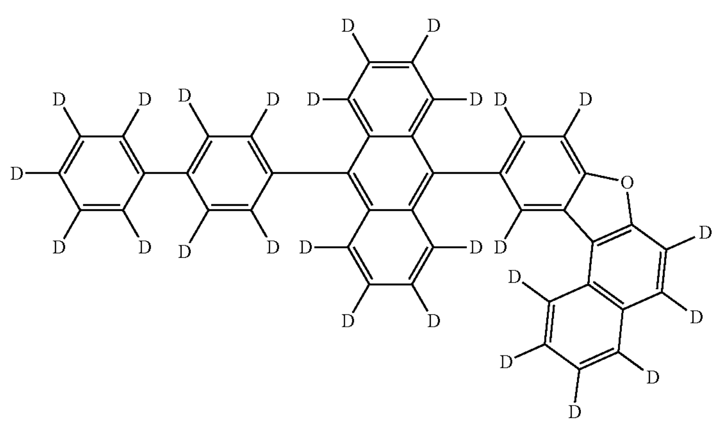

-continued
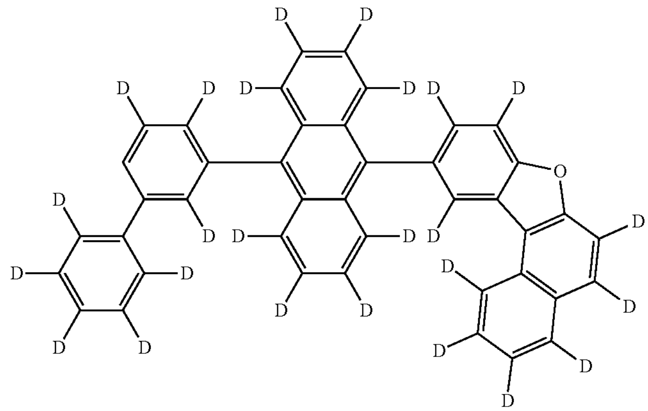
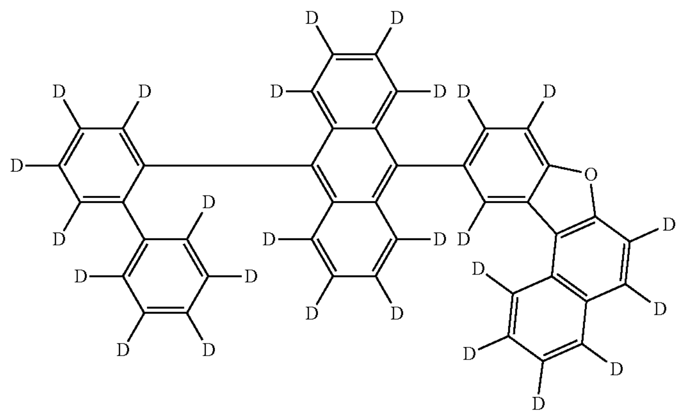
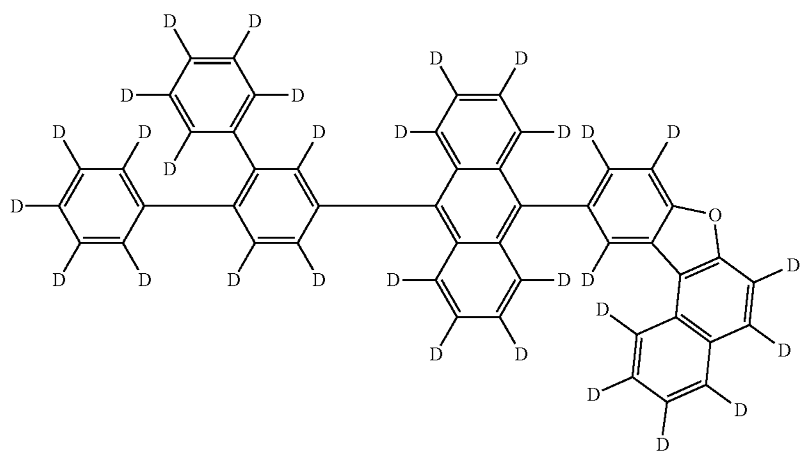
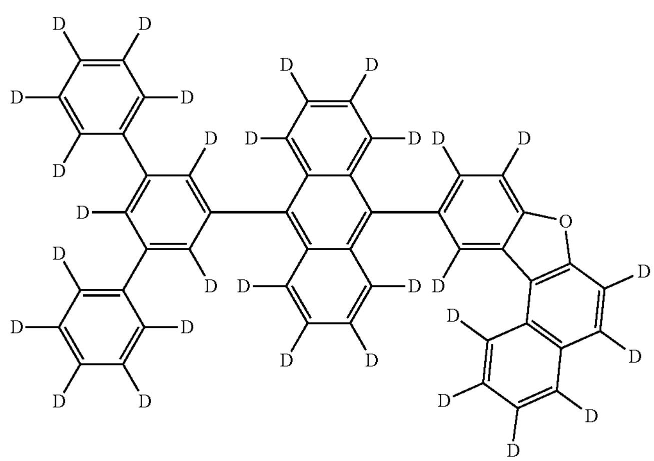

-continued
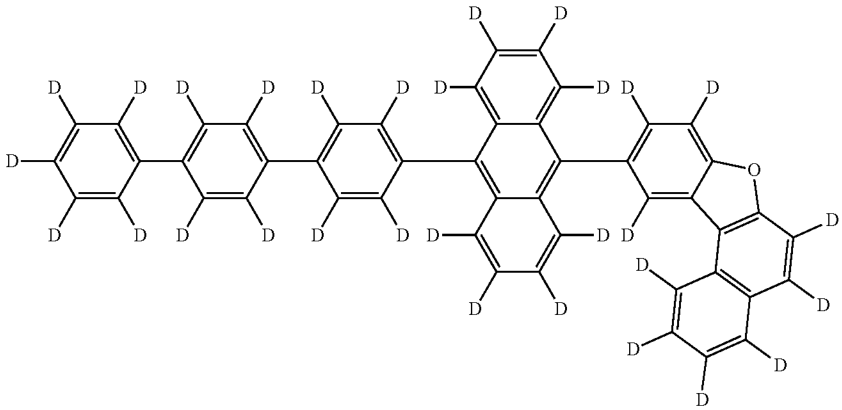
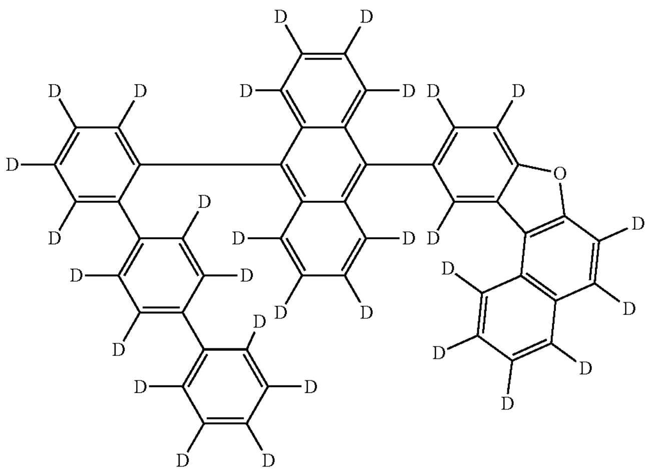
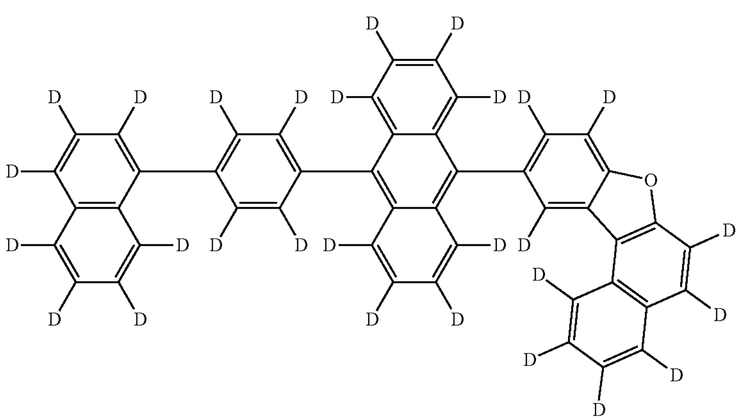
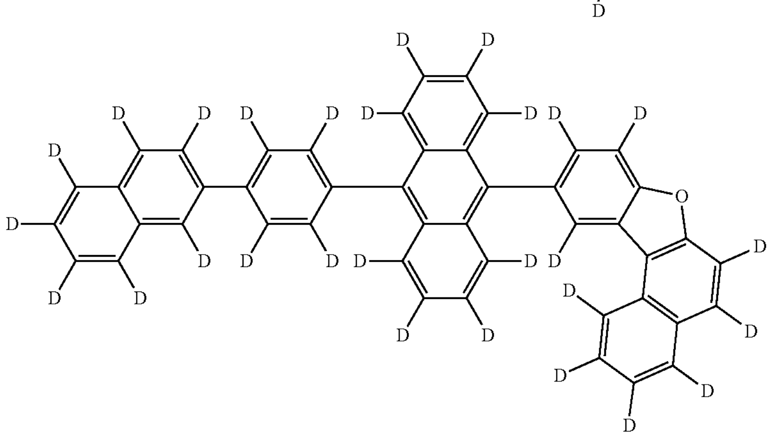

-continued
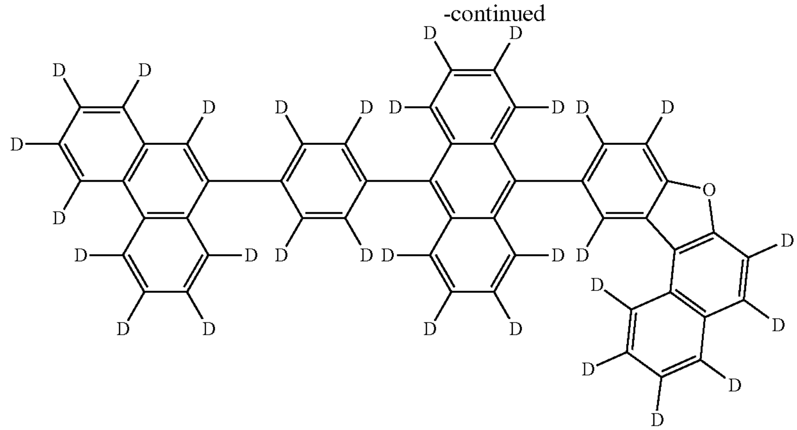
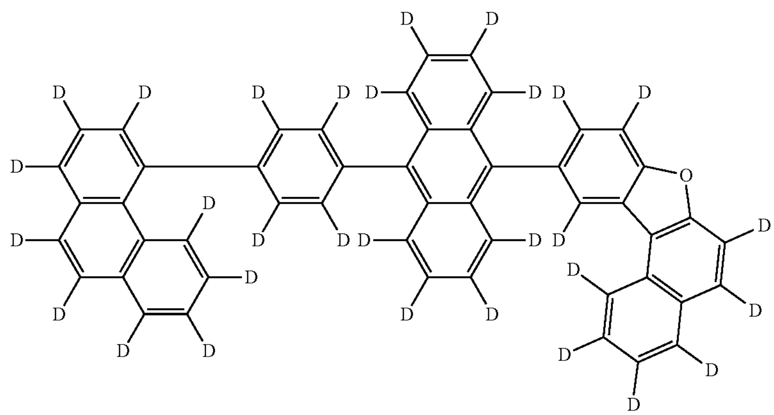
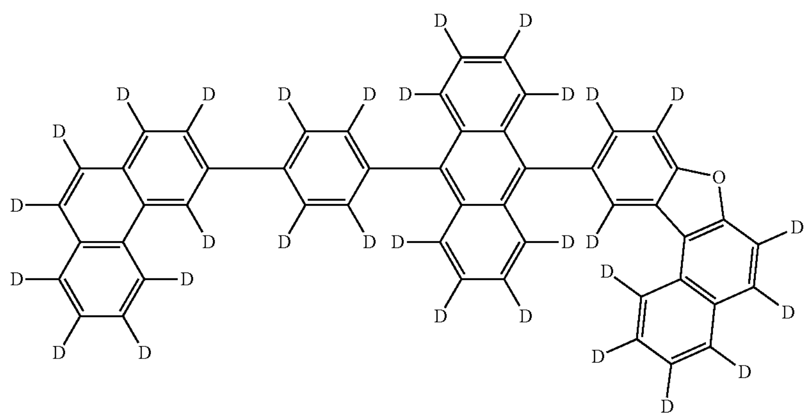
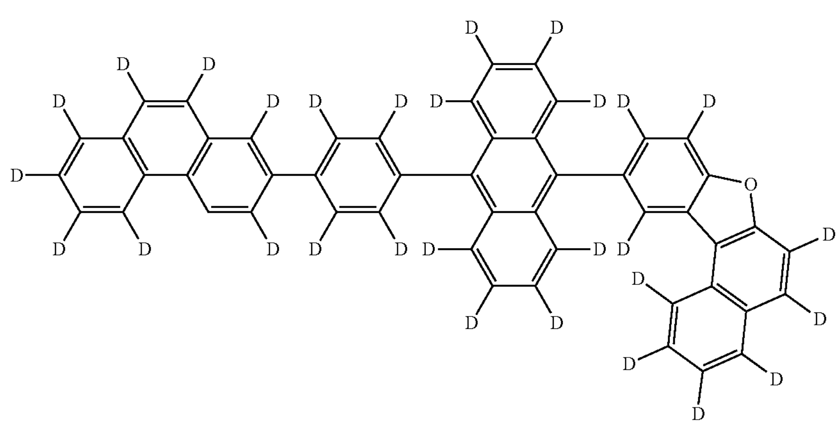

-continued
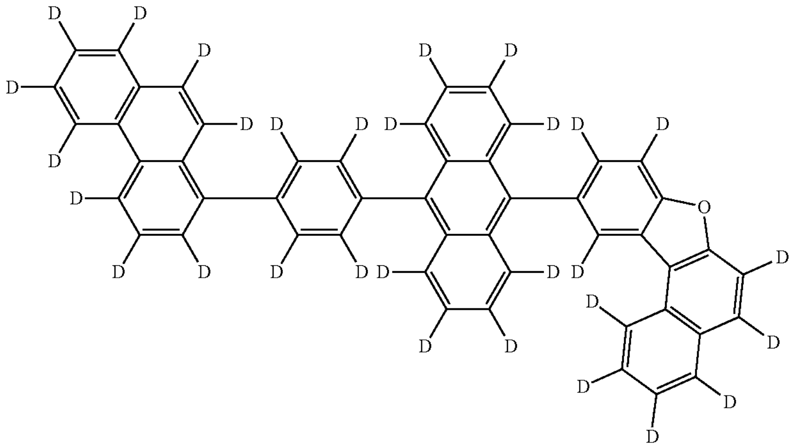
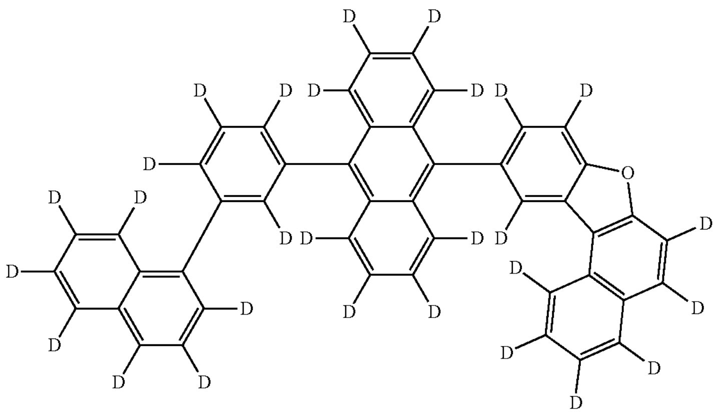
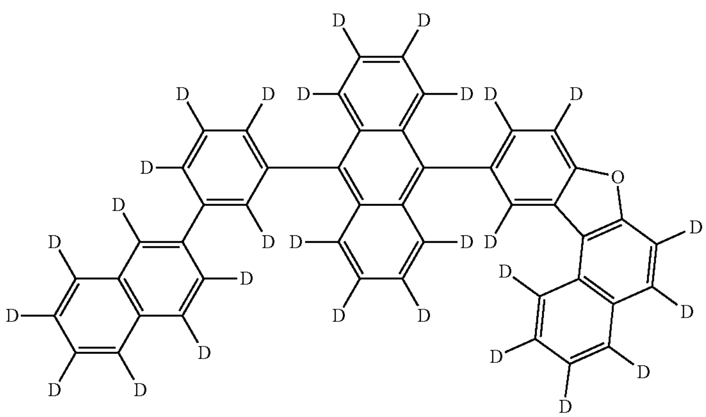
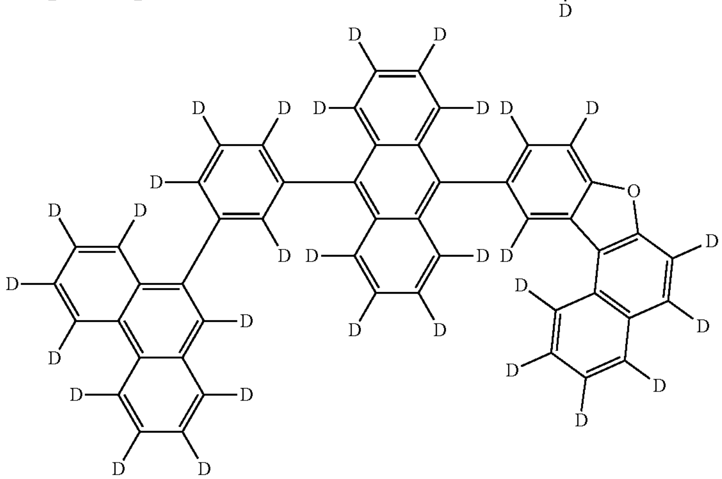

-continued
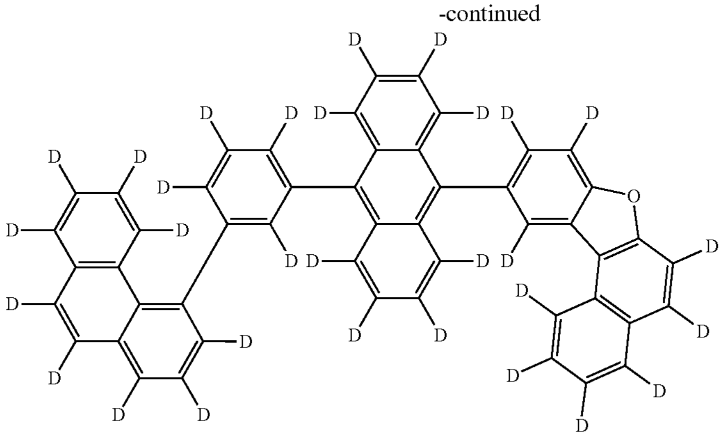
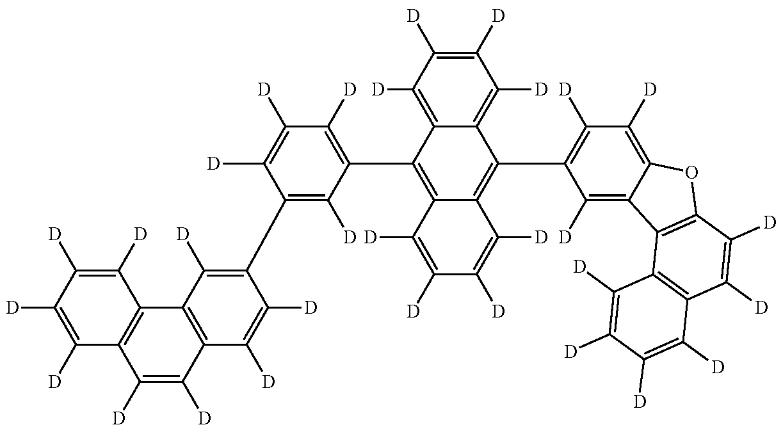
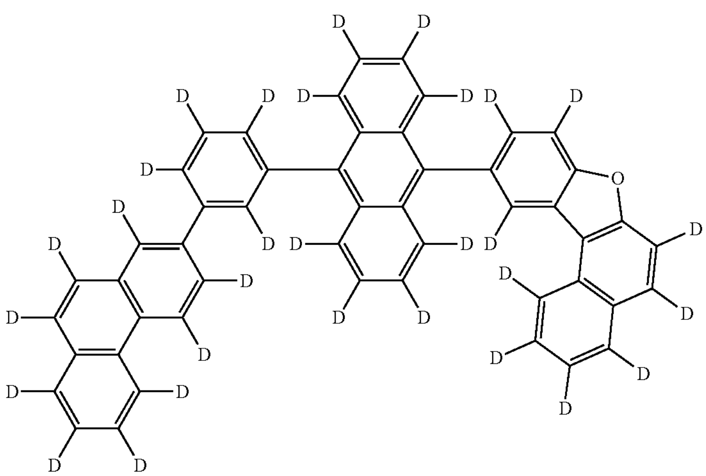
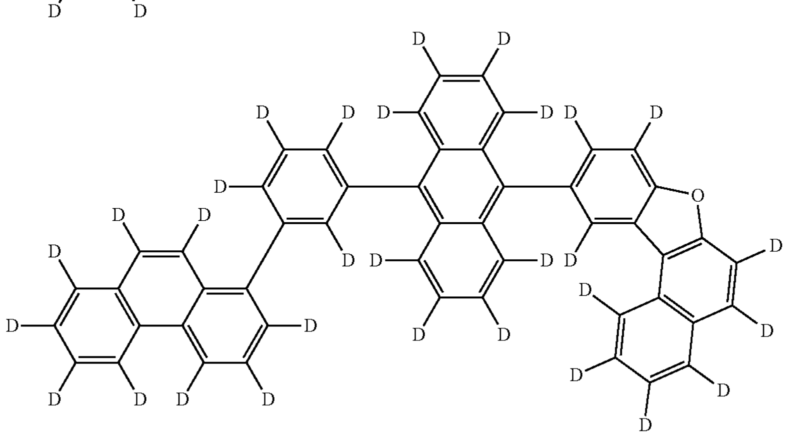

-continued
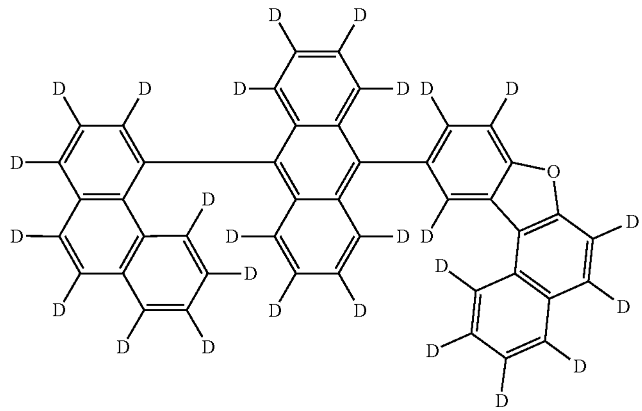
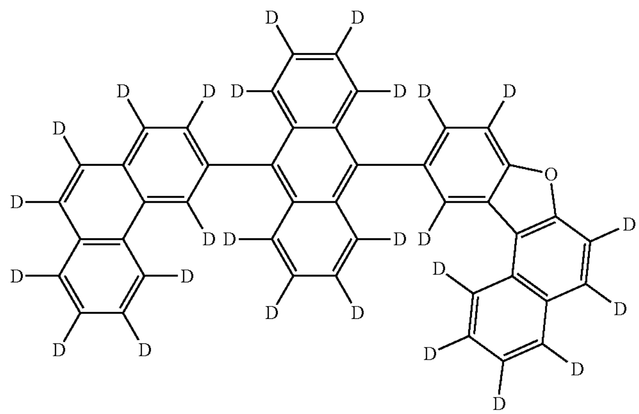
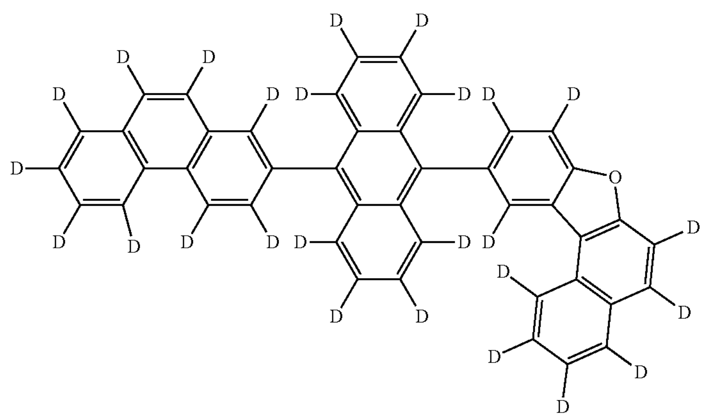
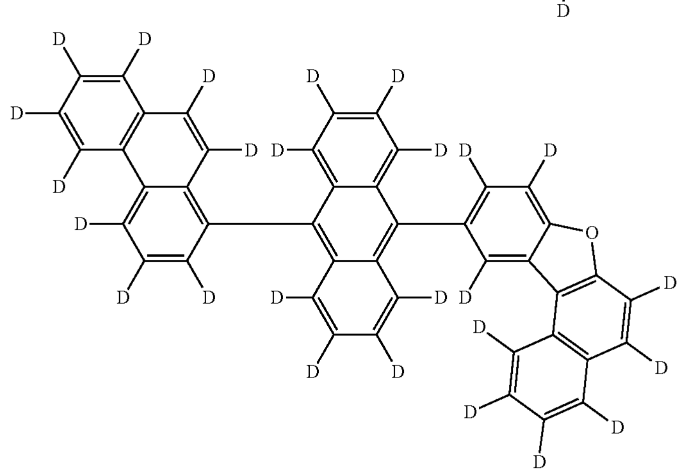

-continued
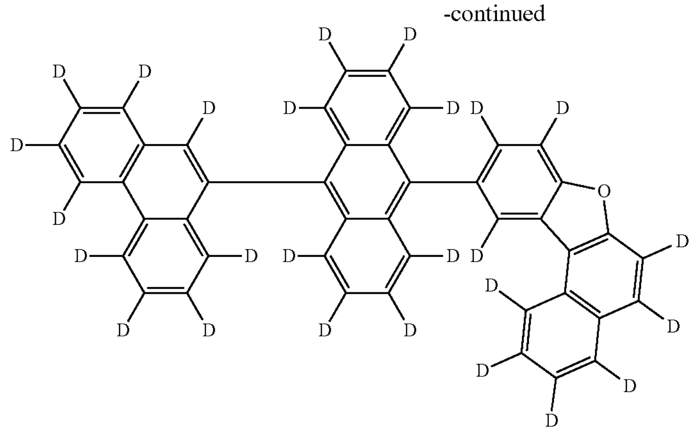
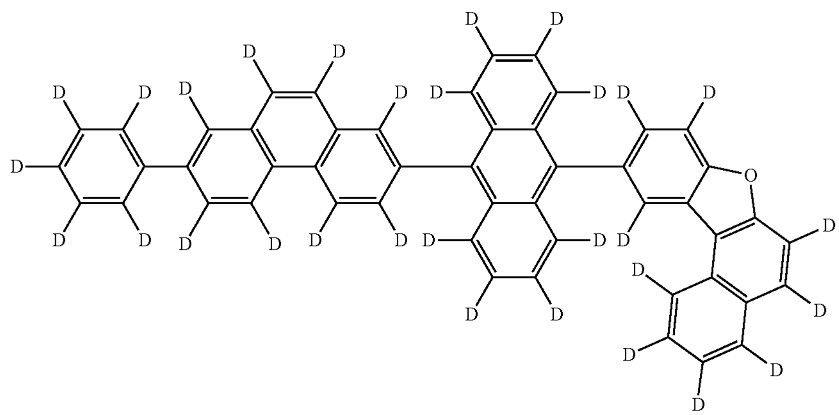
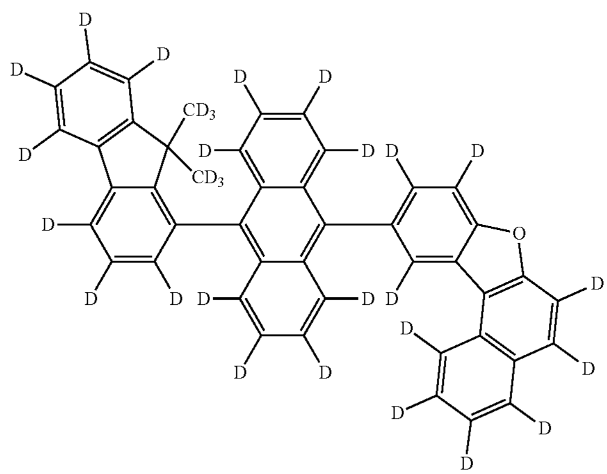
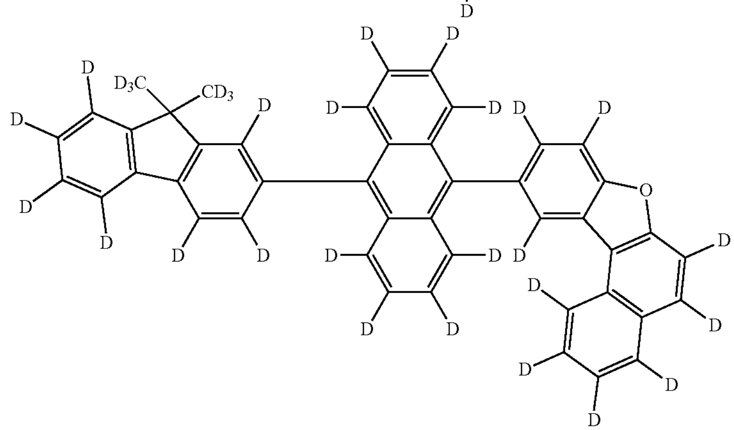

-continued
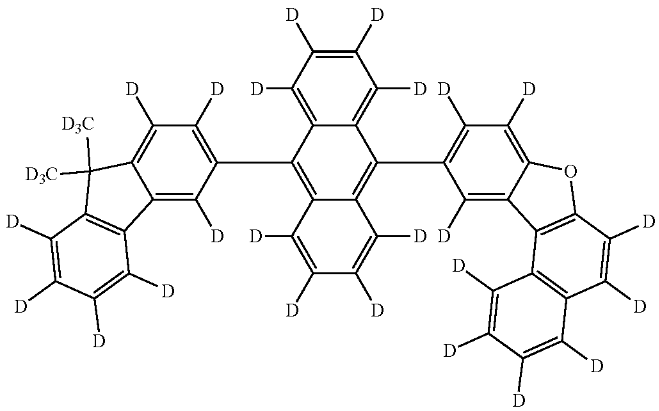
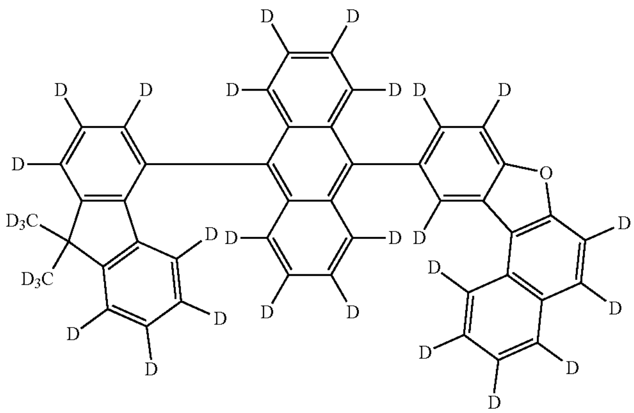
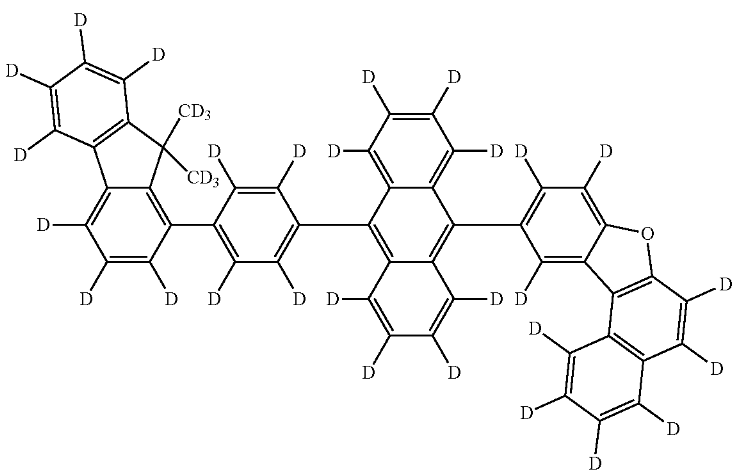
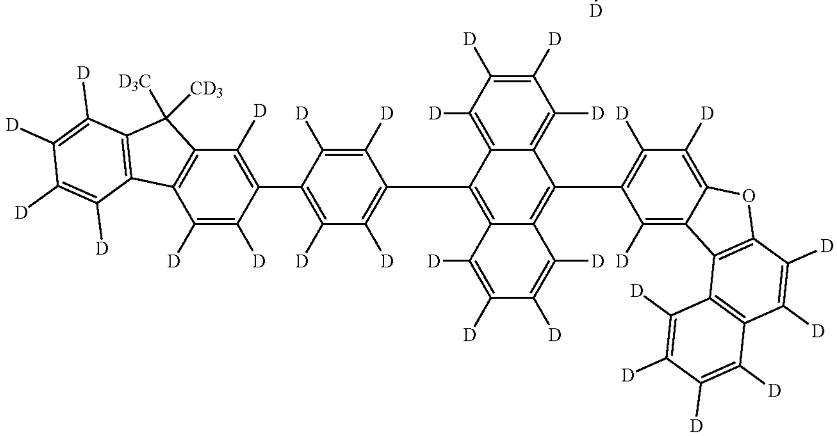

-continued
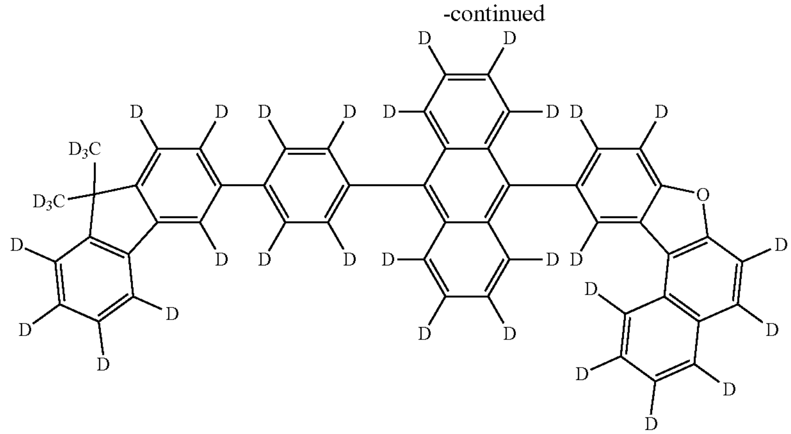
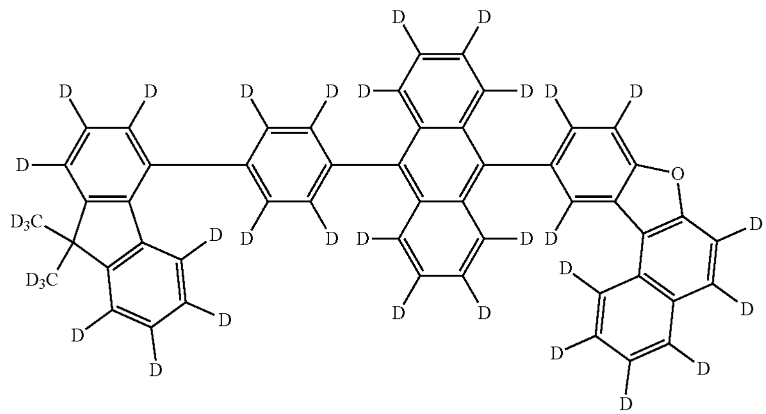
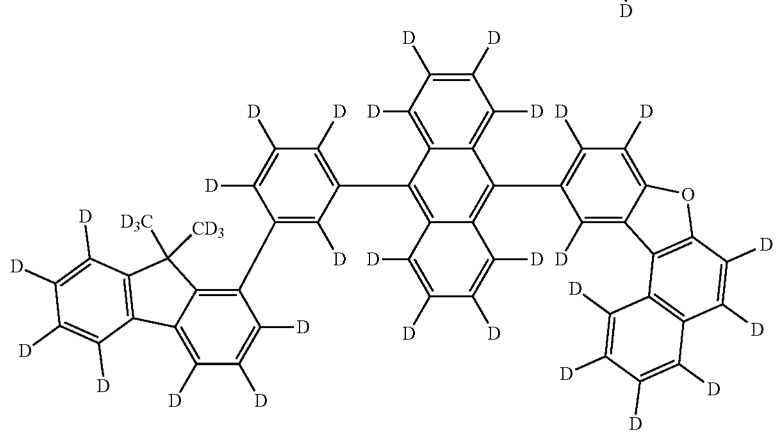
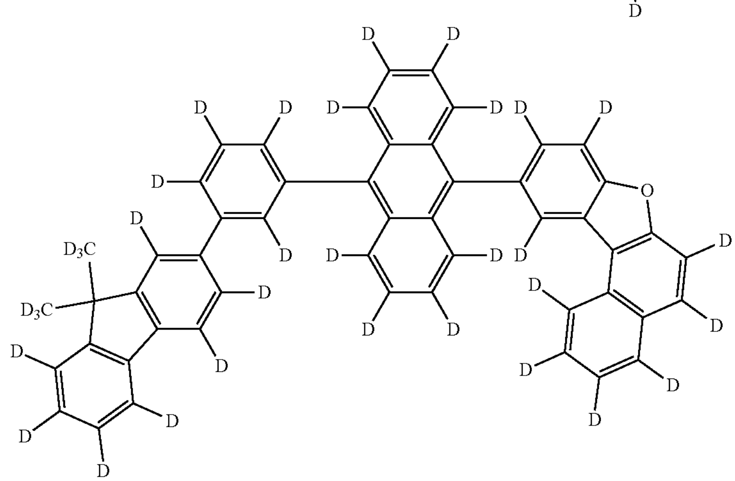

-continued
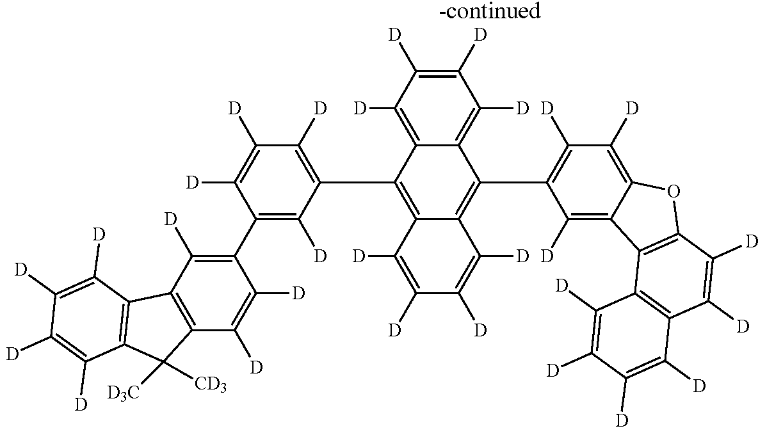
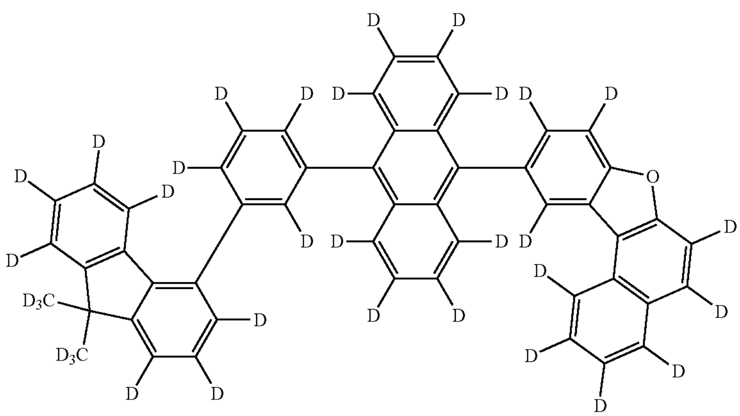
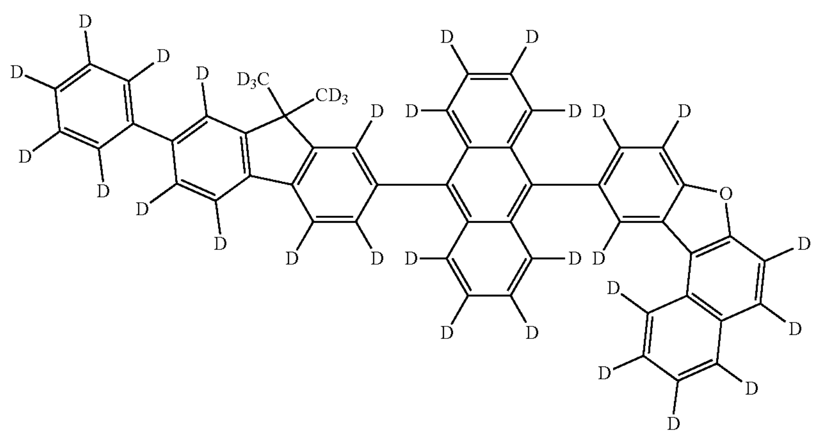
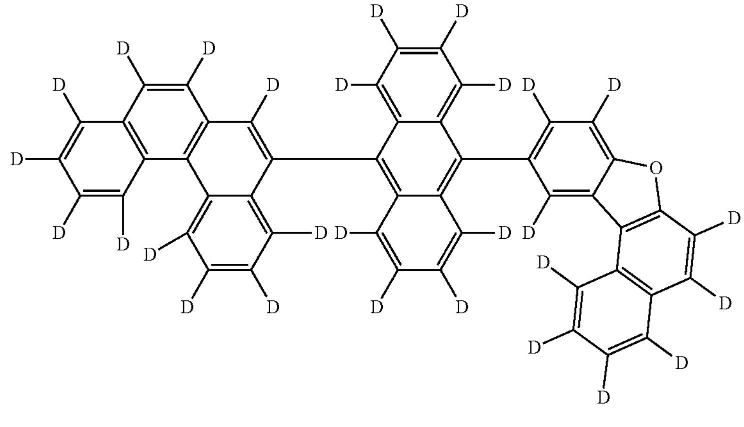

-continued
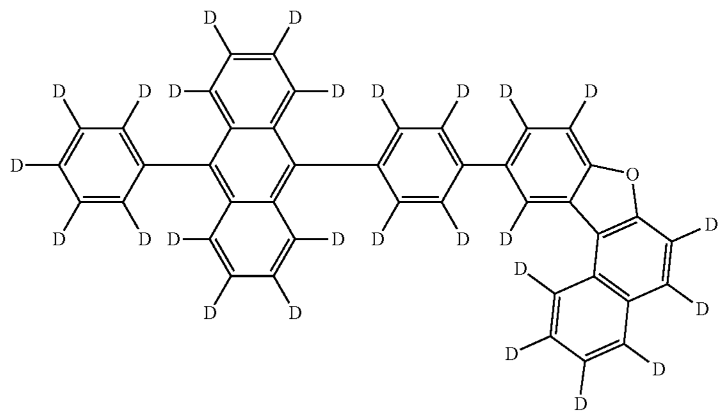
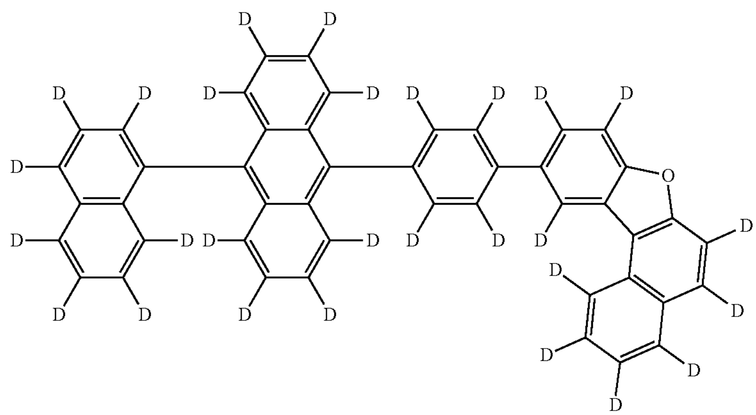
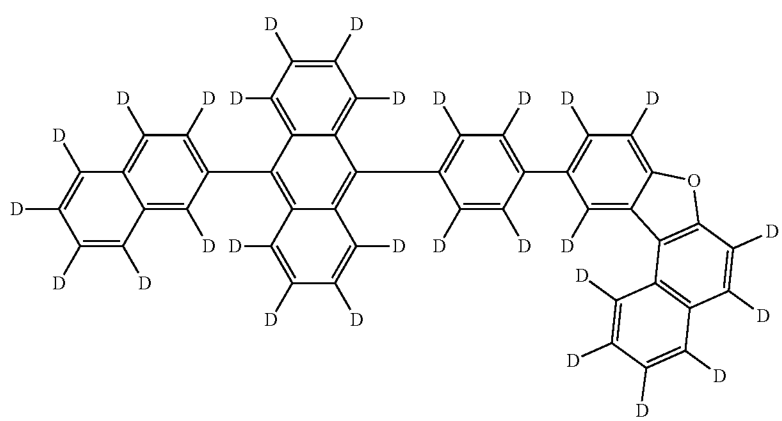
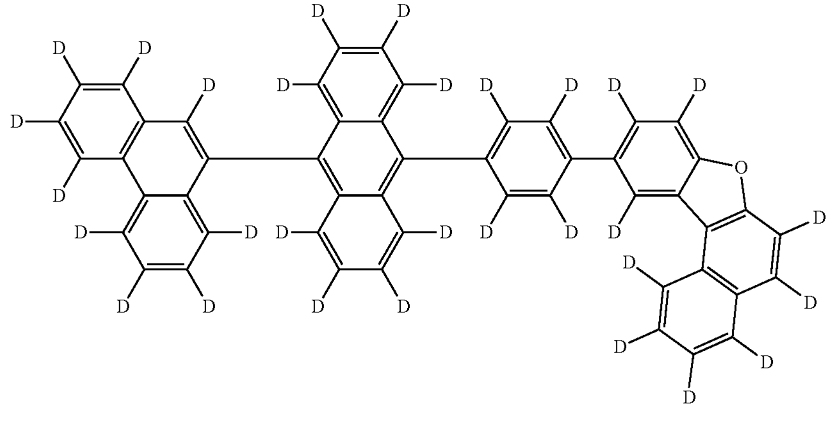

-continued
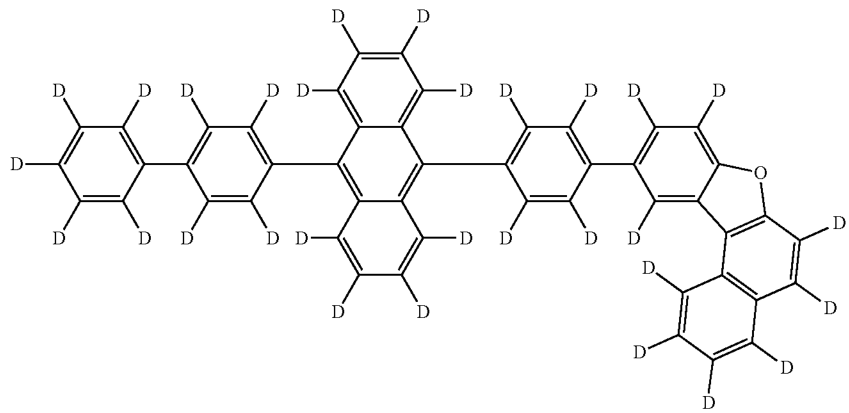
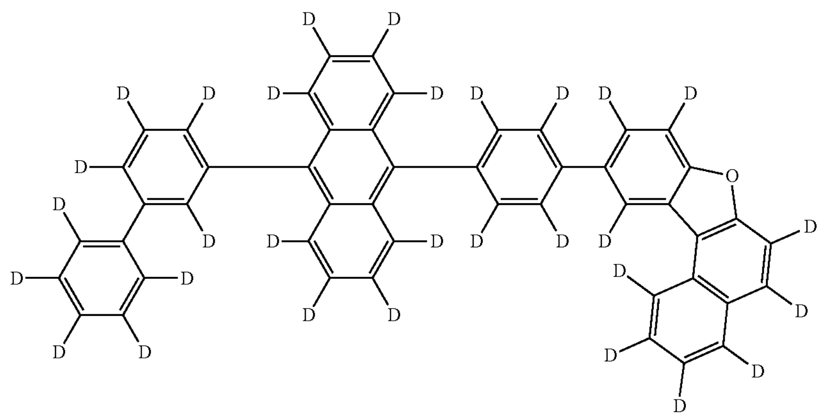
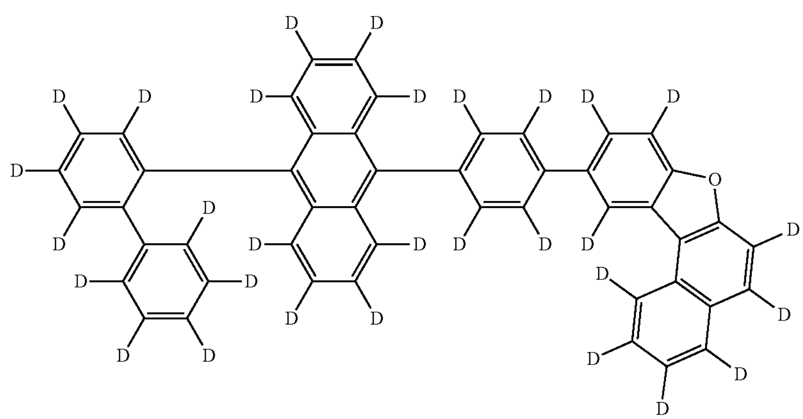
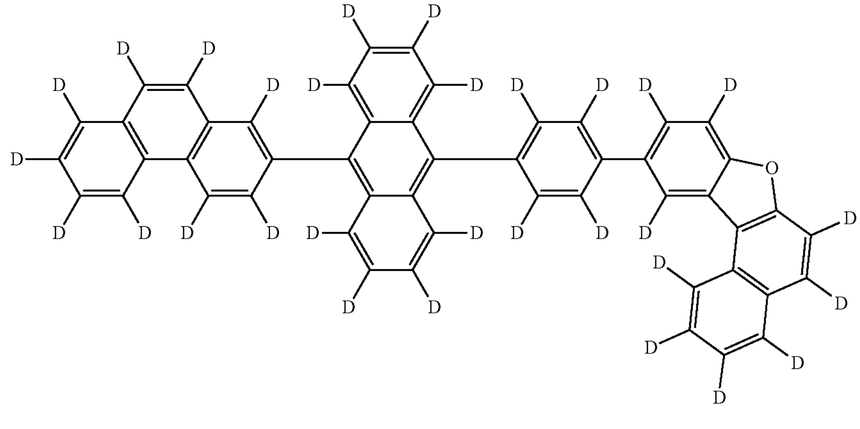

-continued
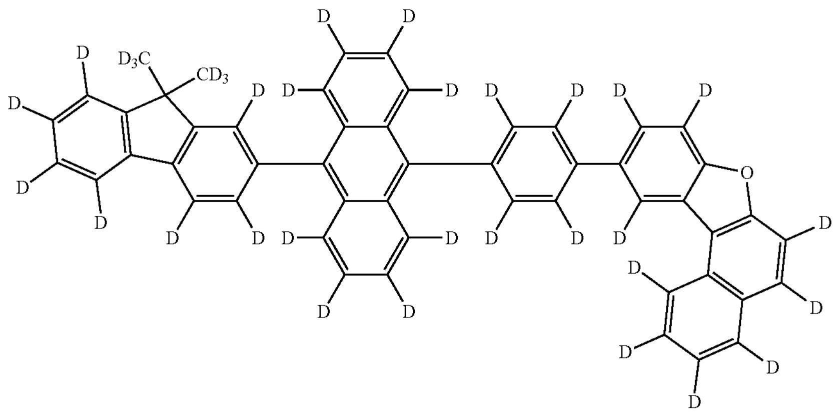
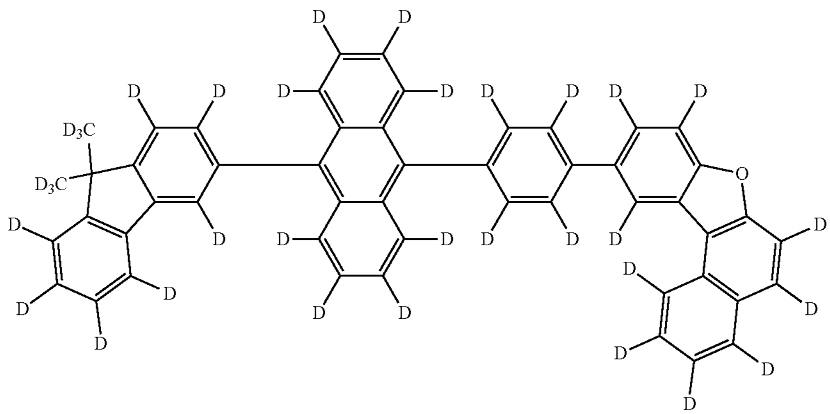
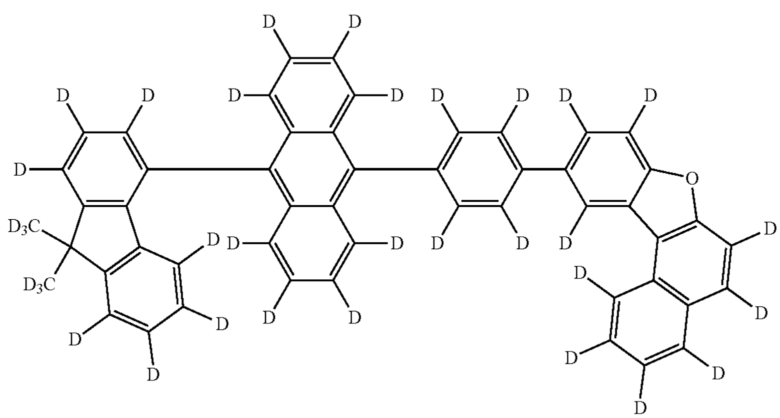
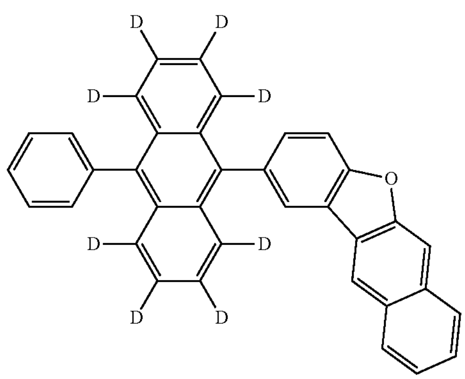
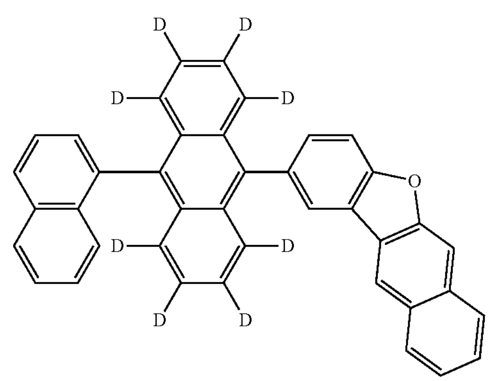

-continued
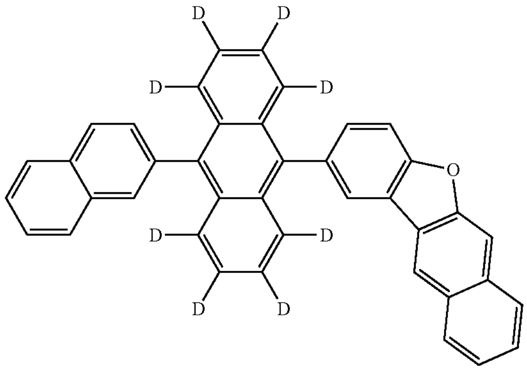
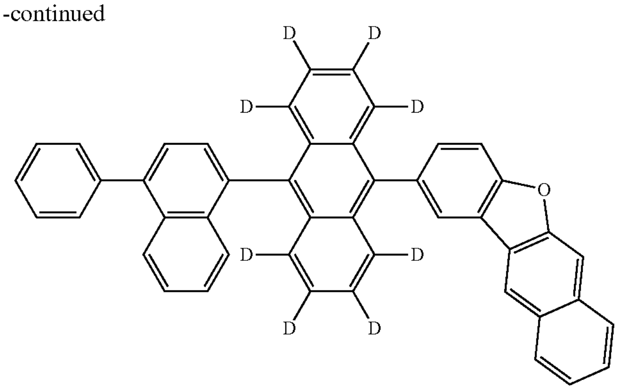
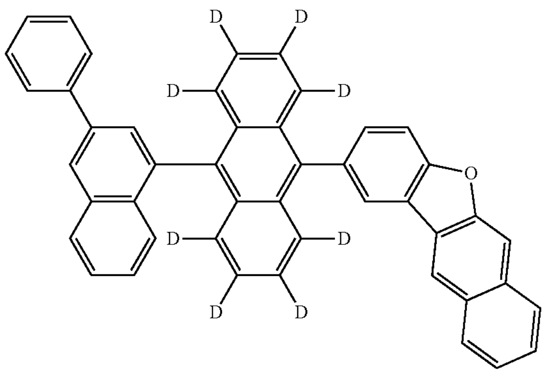
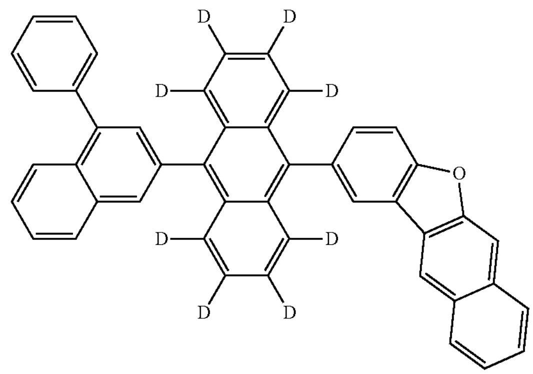
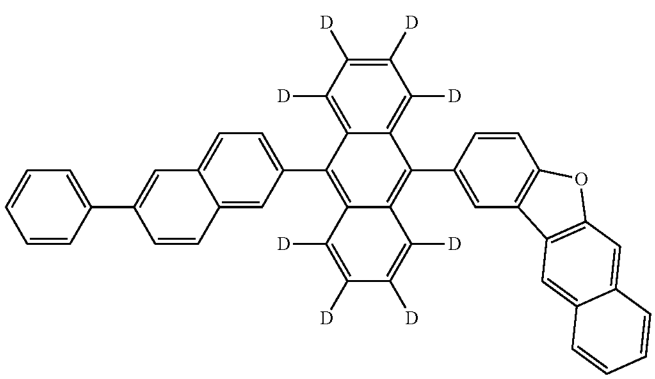
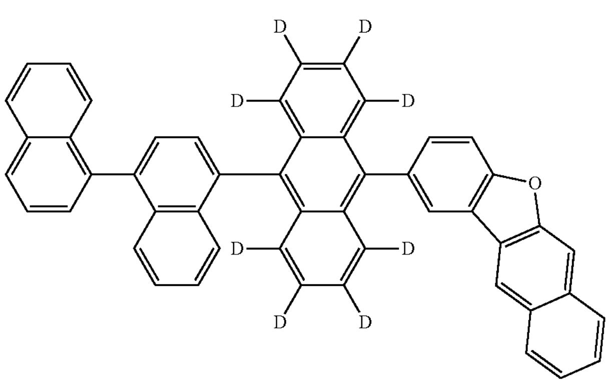

-continued
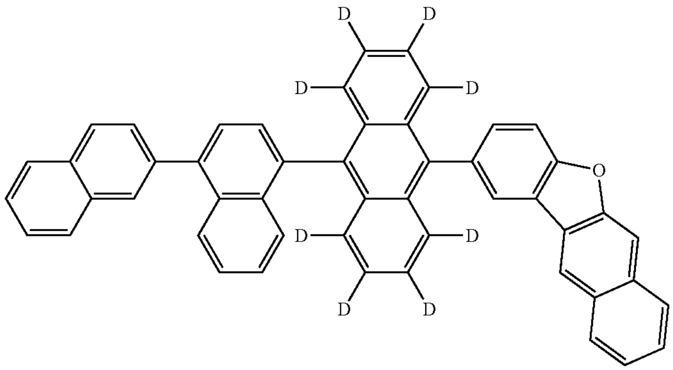
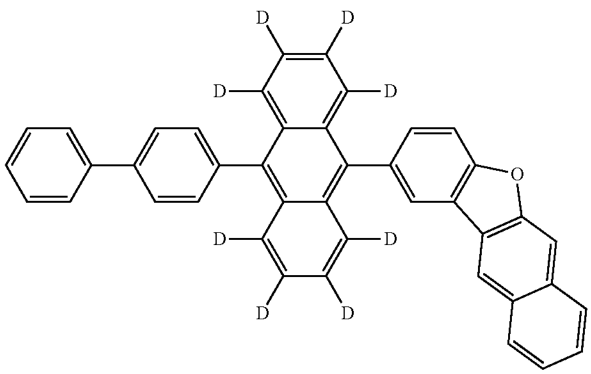
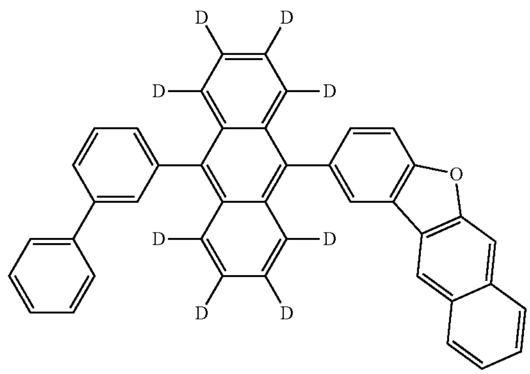
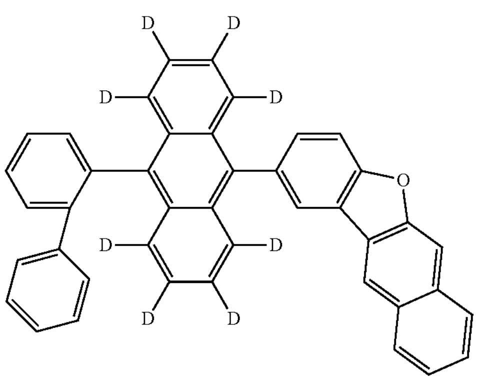
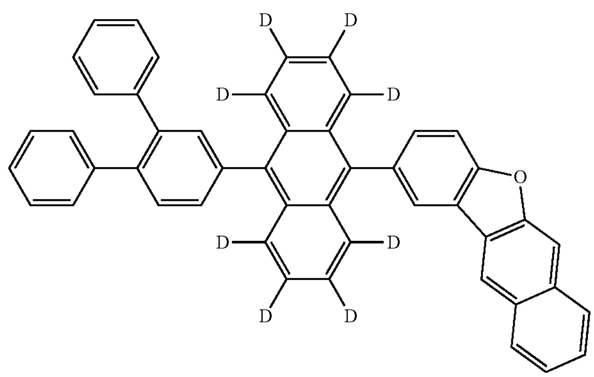
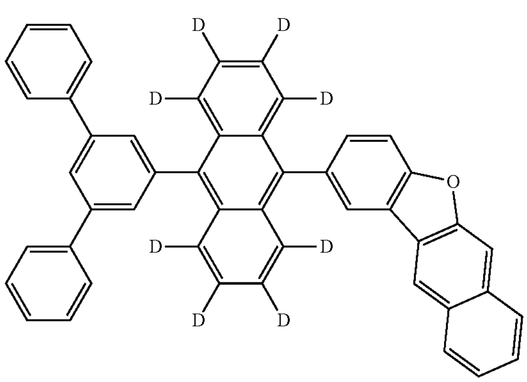

-continued
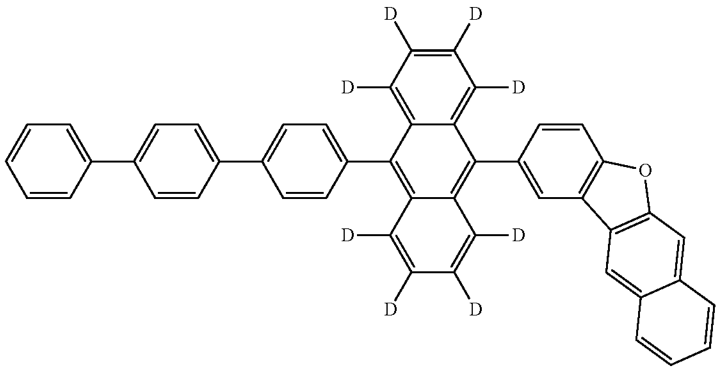
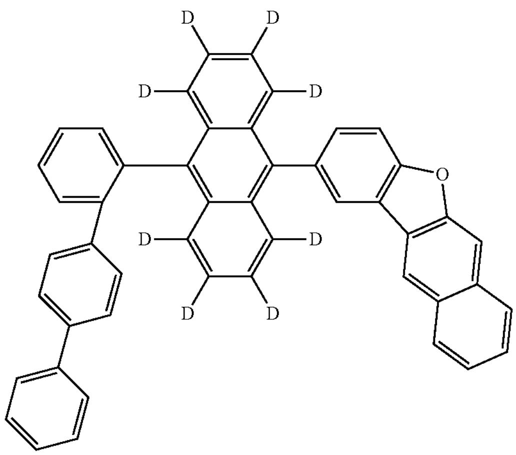
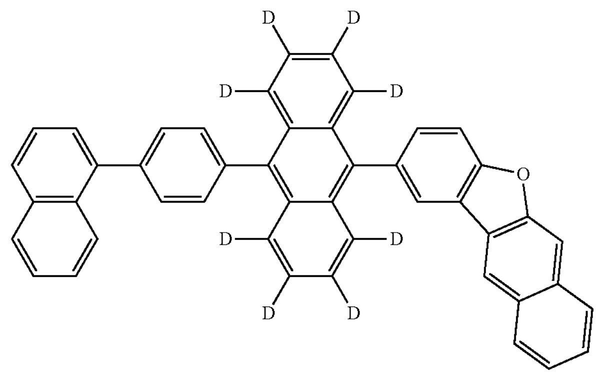
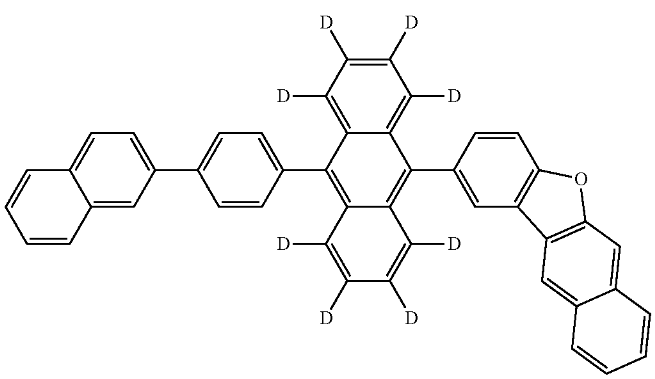
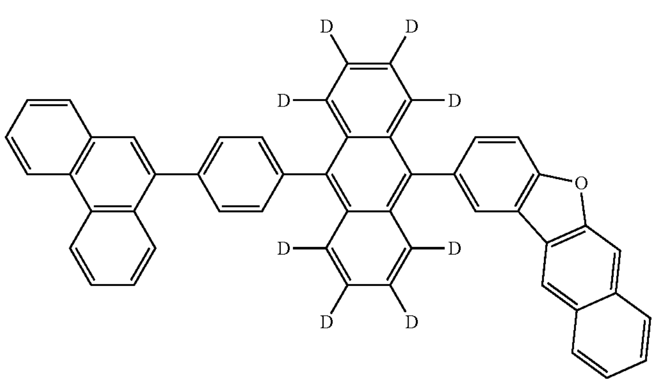

-continued
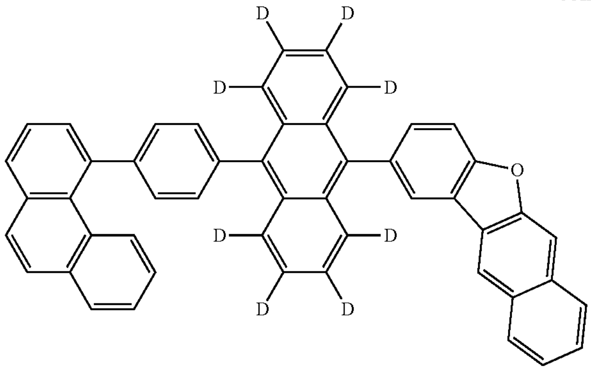
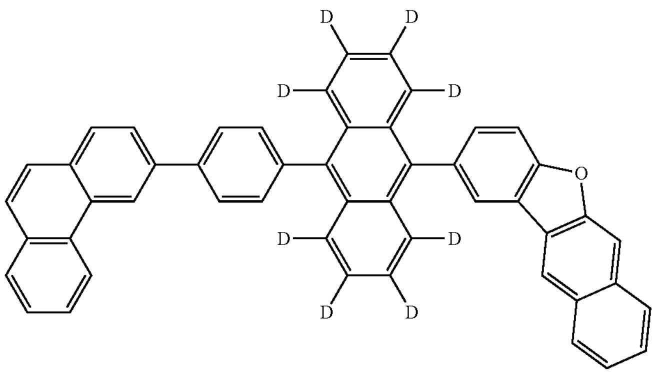
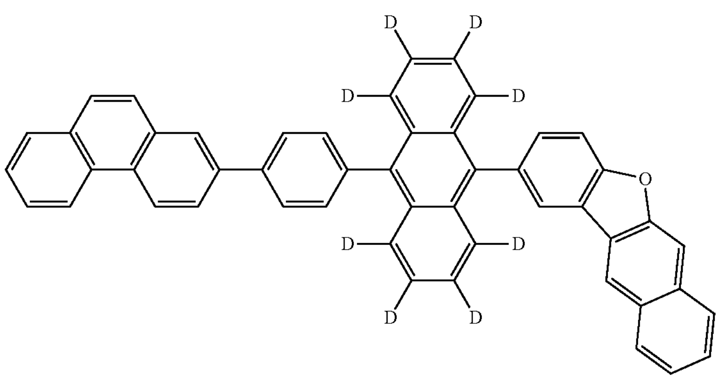
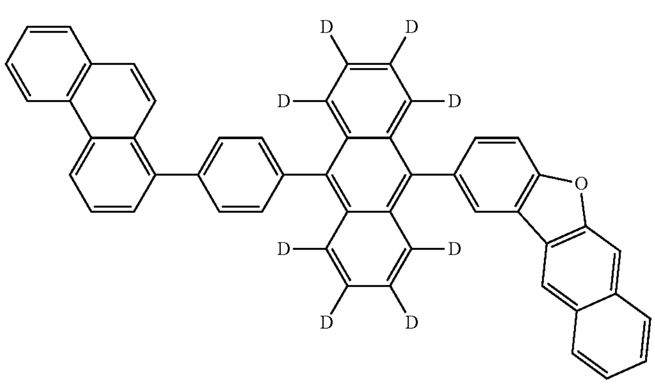

-continued
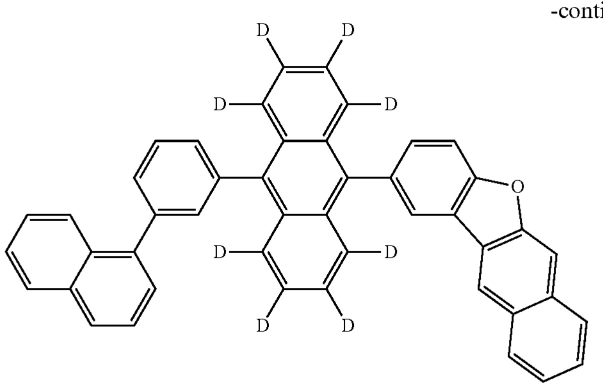
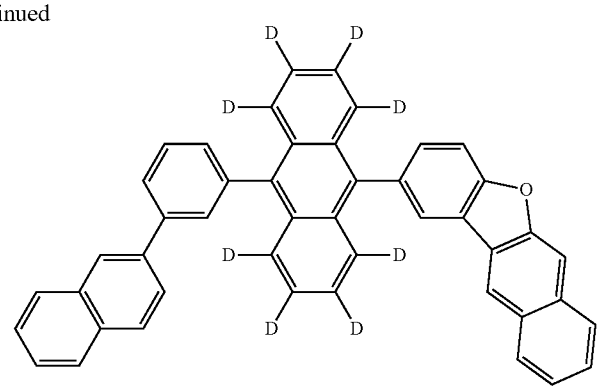
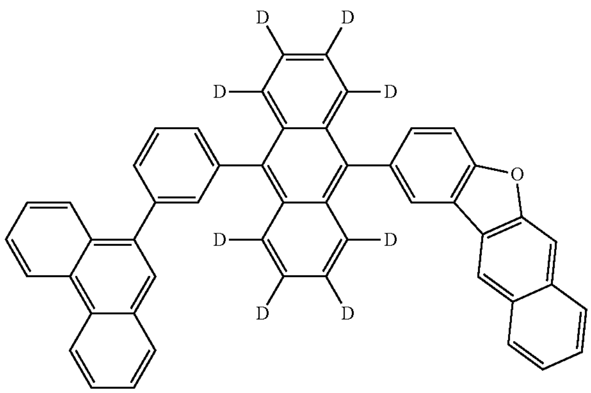
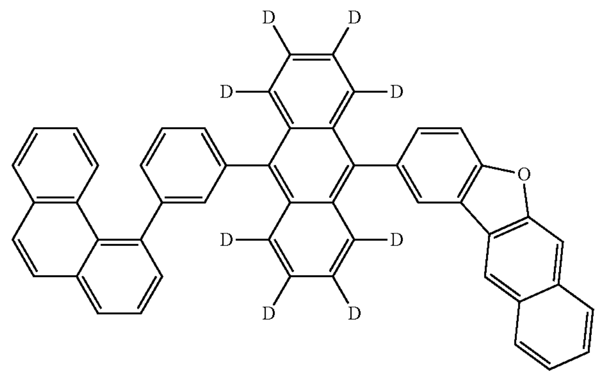
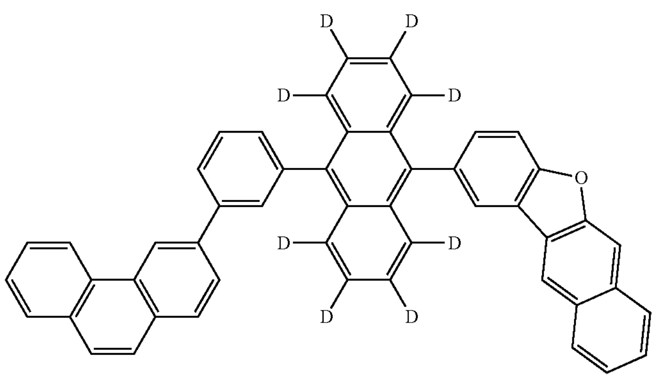
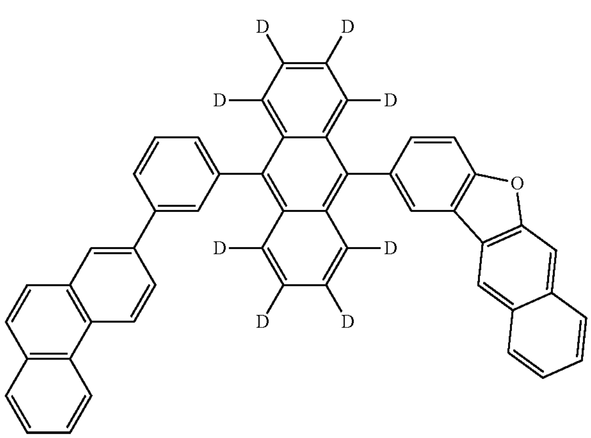

-continued
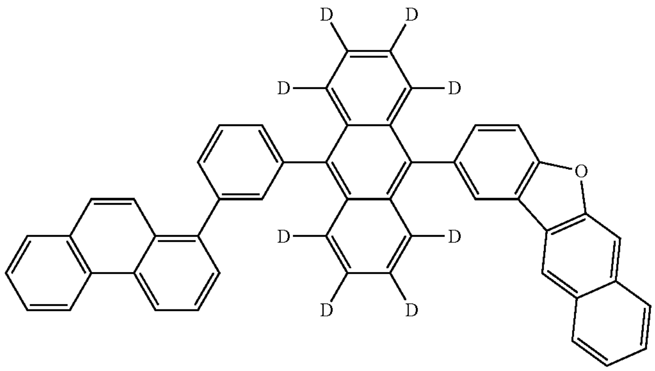
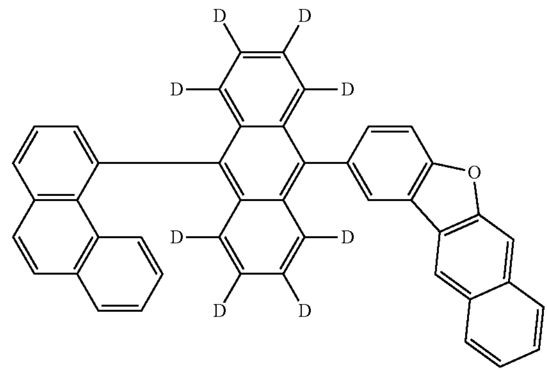
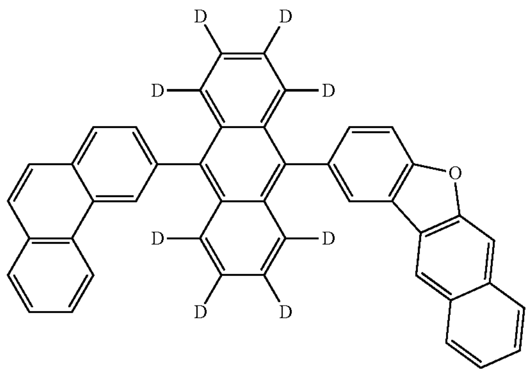
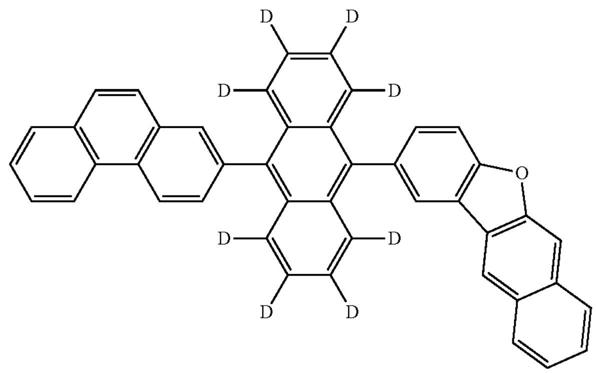
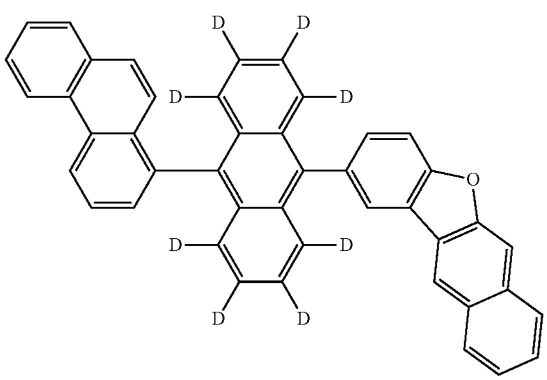
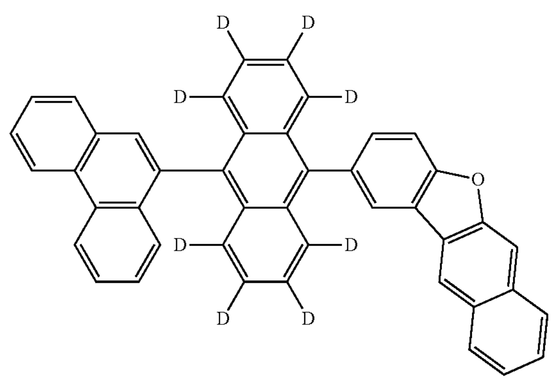
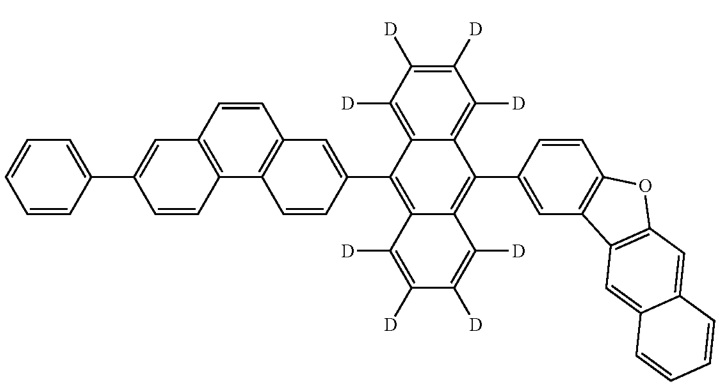

-continued
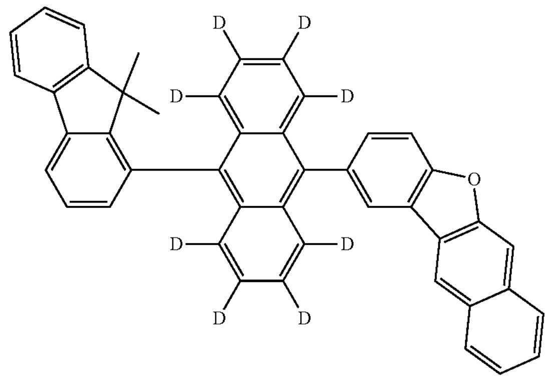
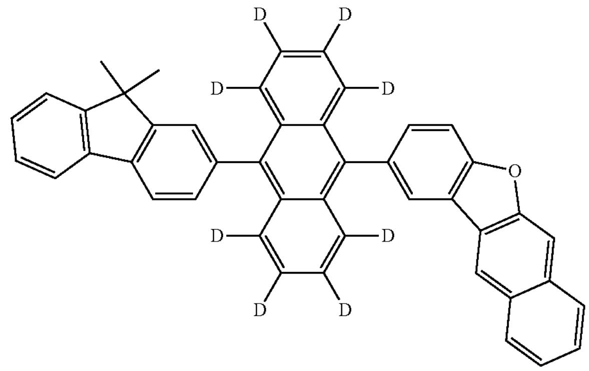
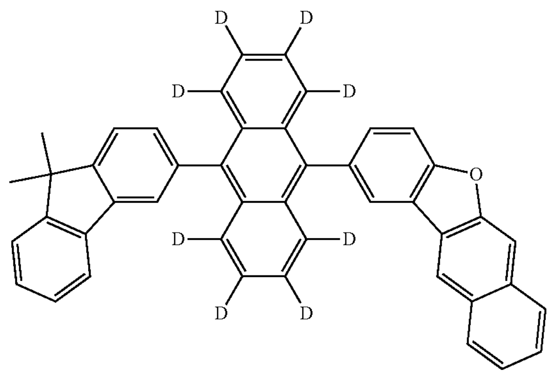
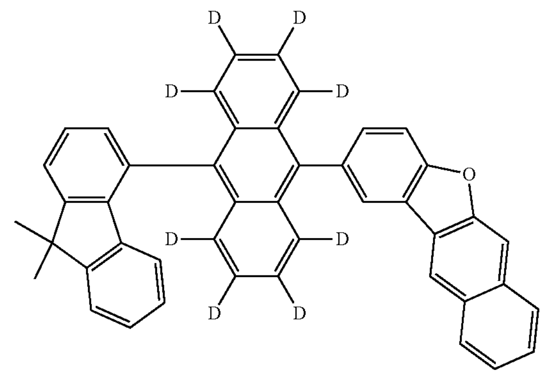
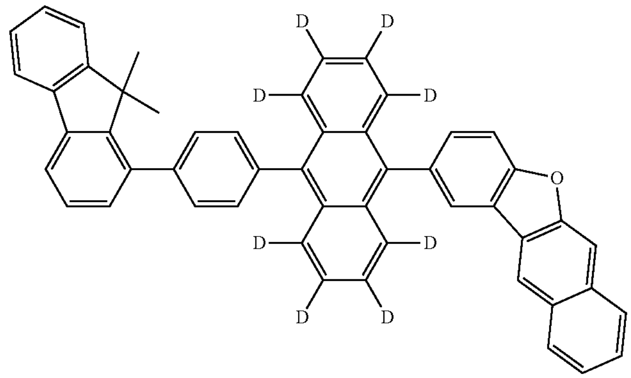
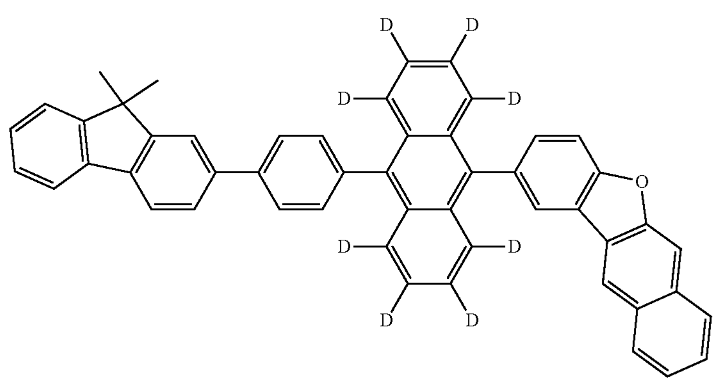

-continued
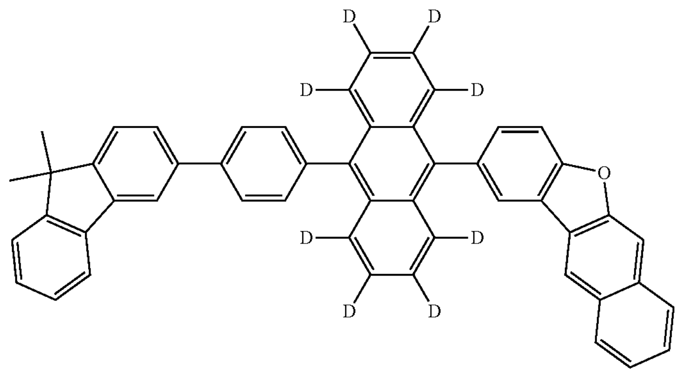
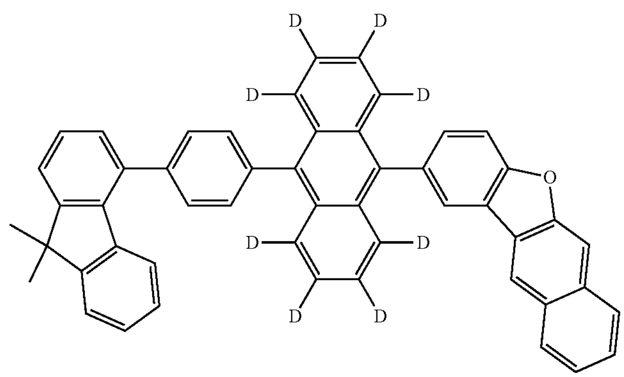
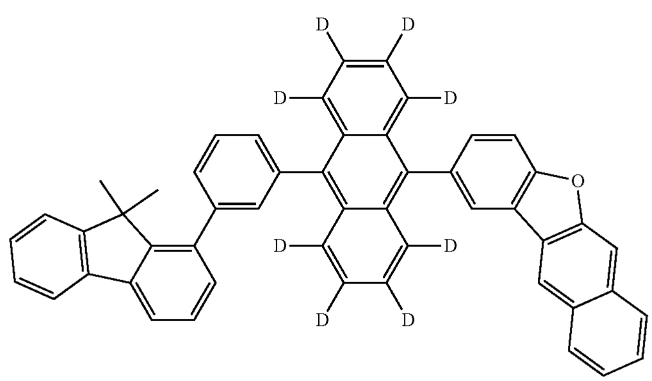
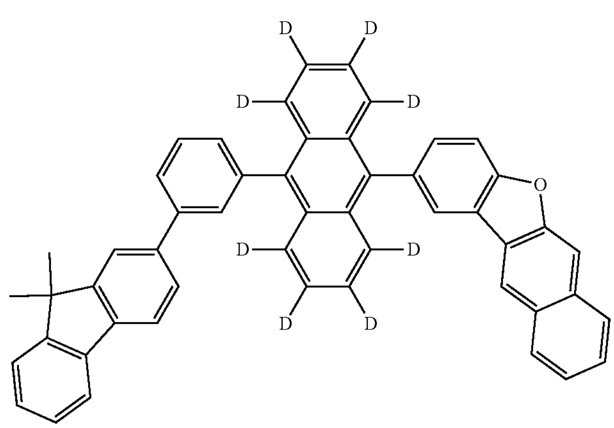

-continued
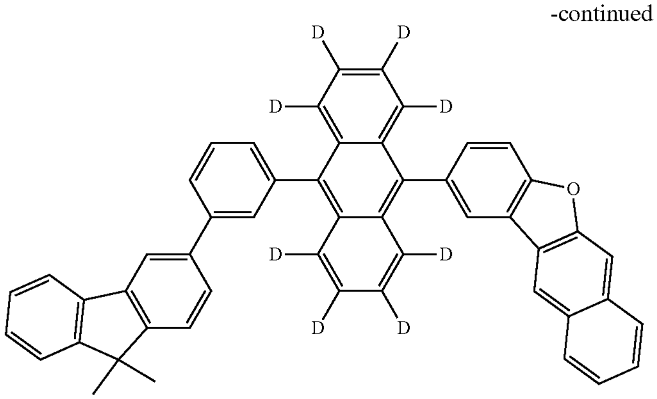
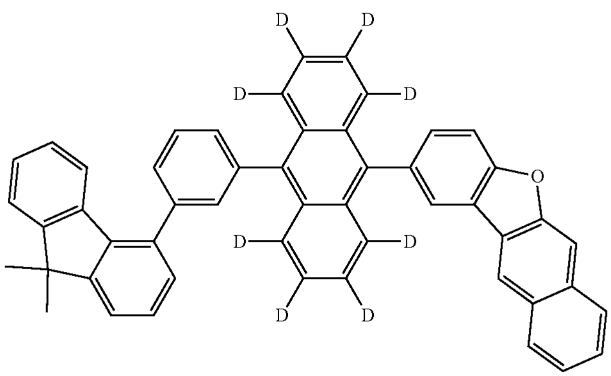
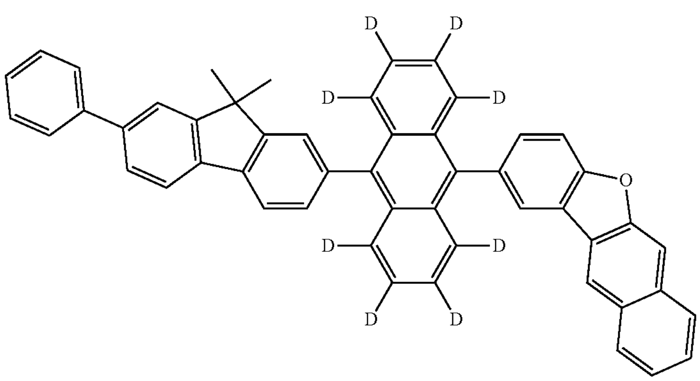
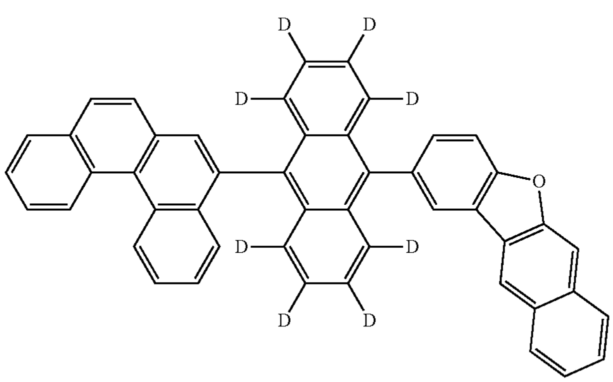

-continued
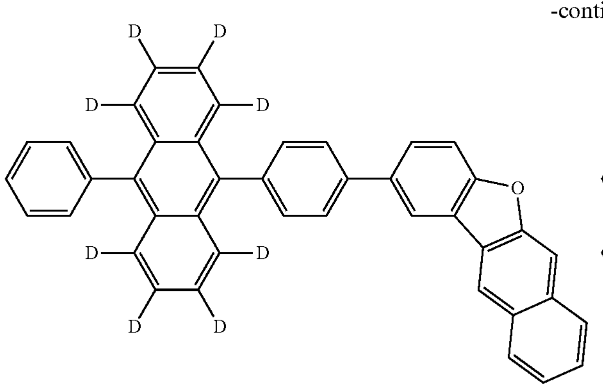
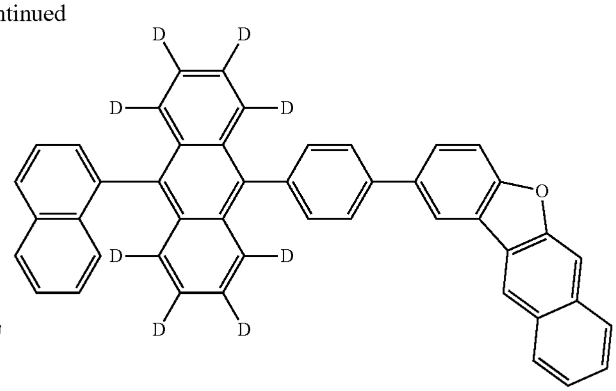
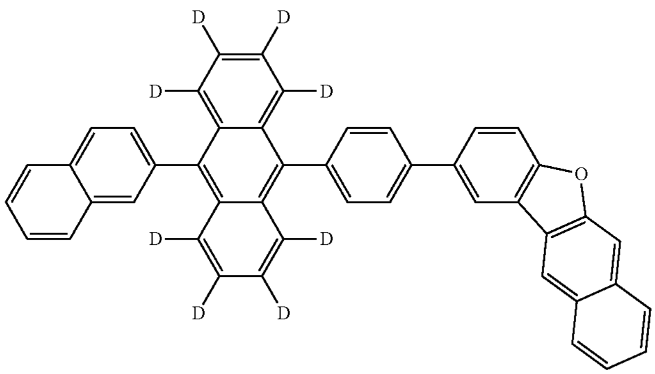
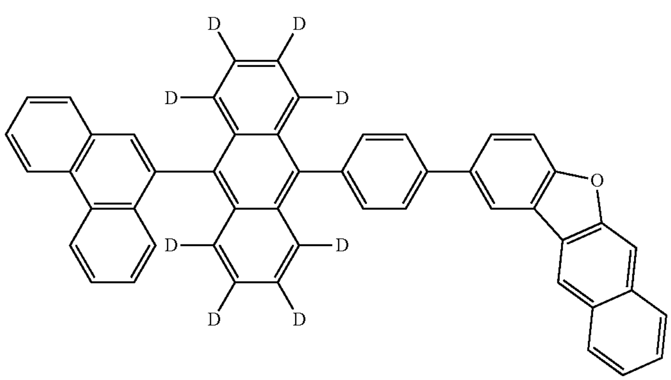
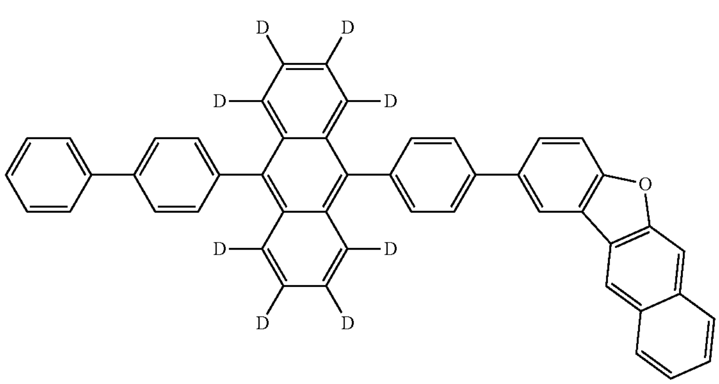

-continued
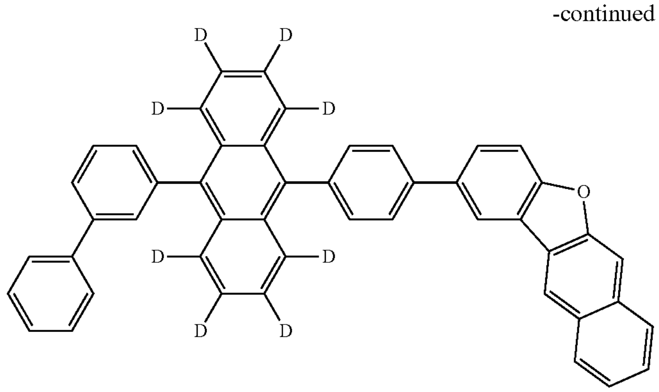
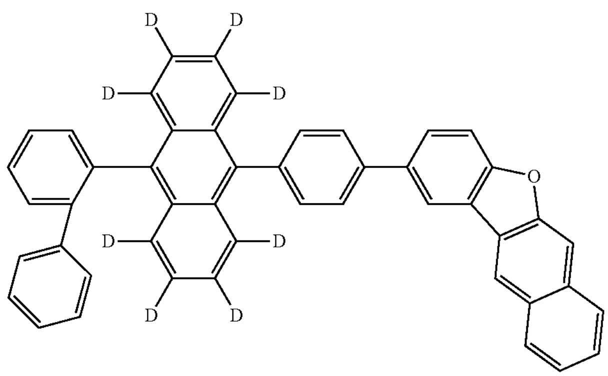
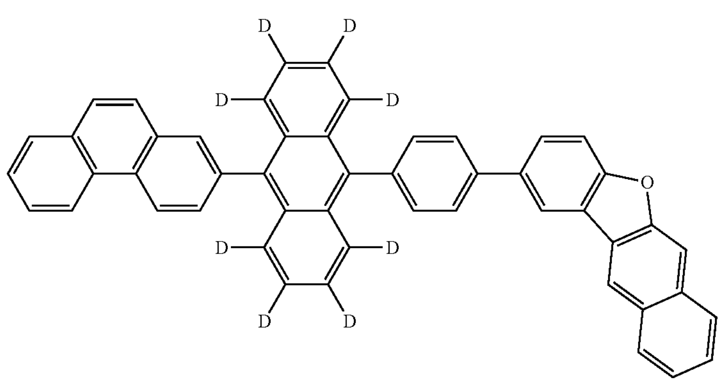
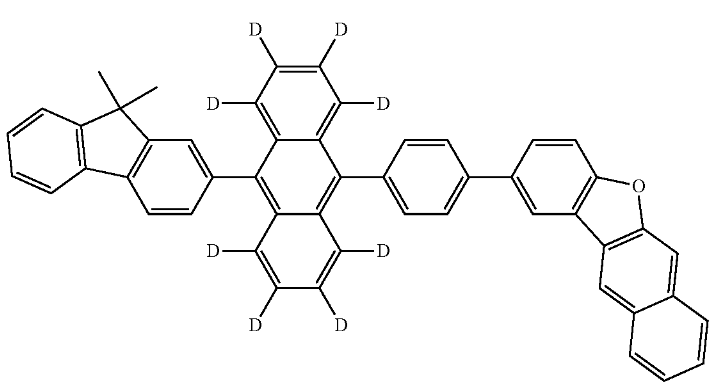

-continued
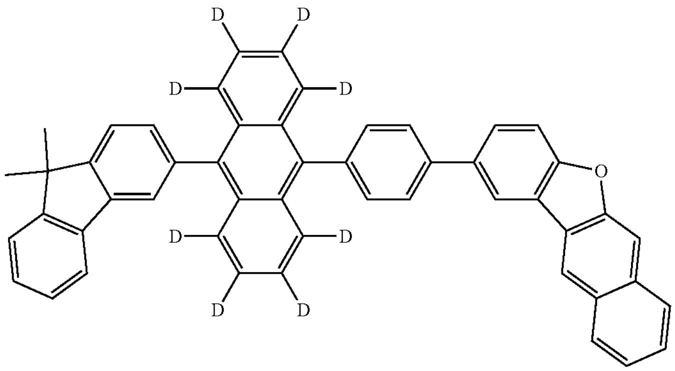
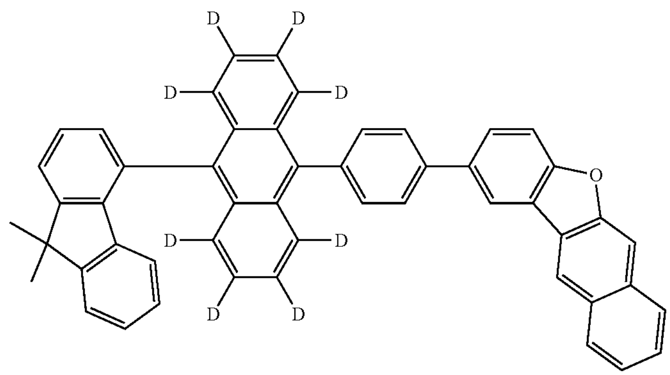
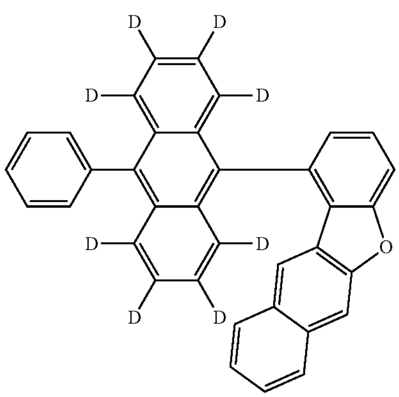
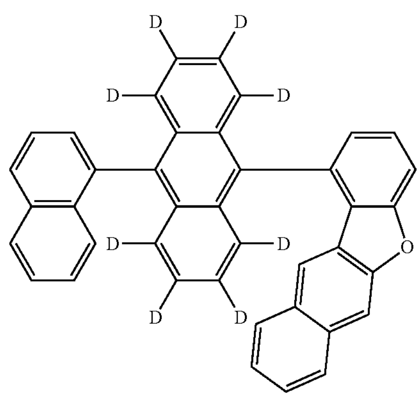
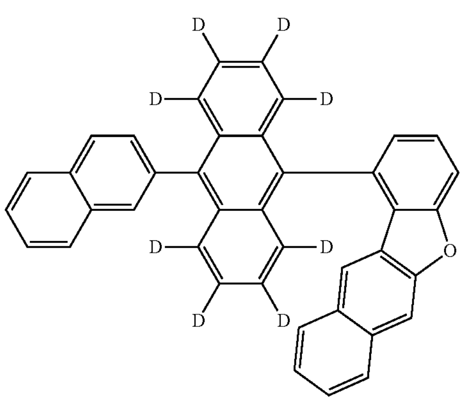
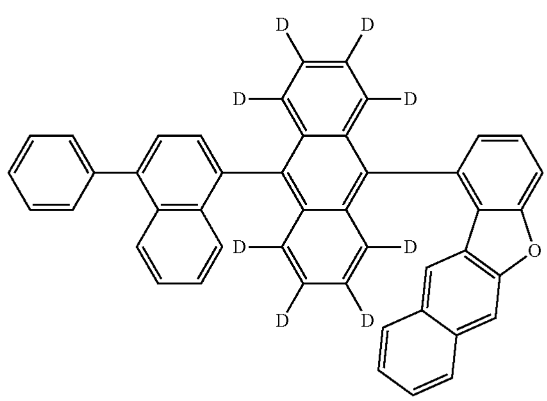

-continued
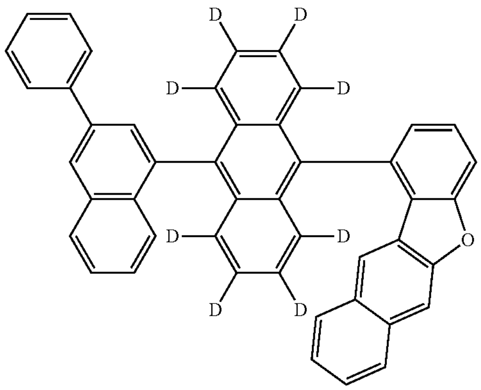
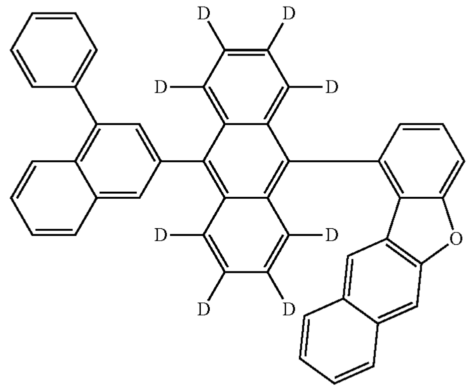
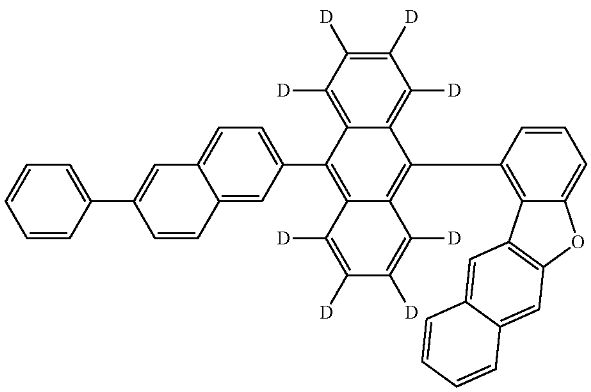
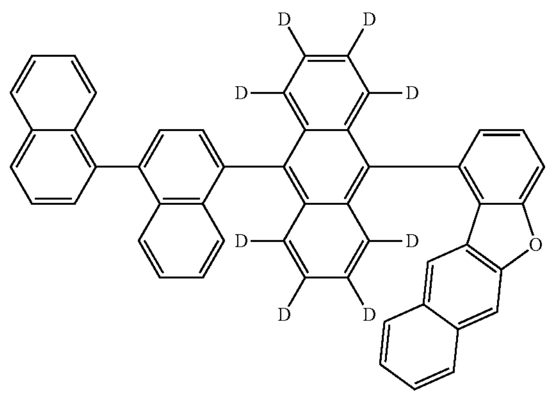
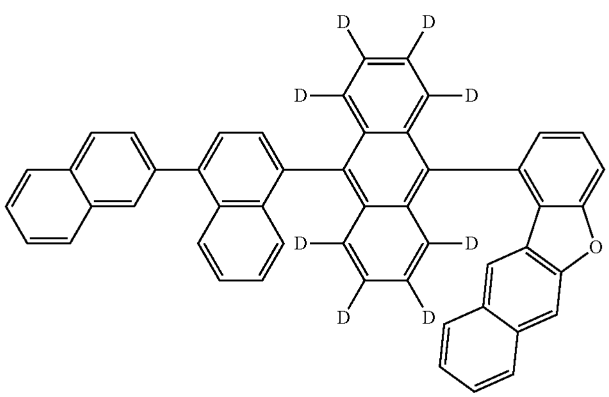
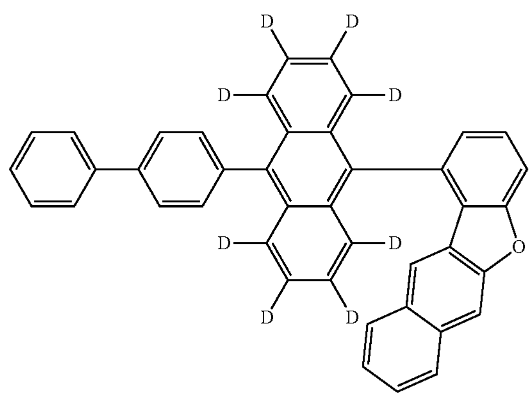
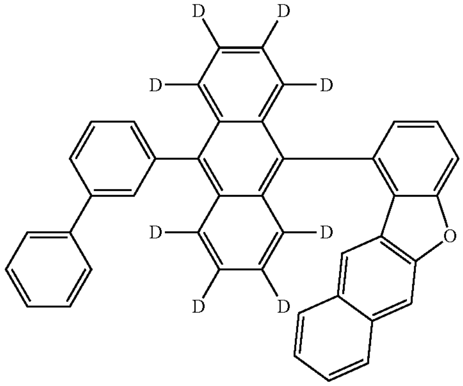
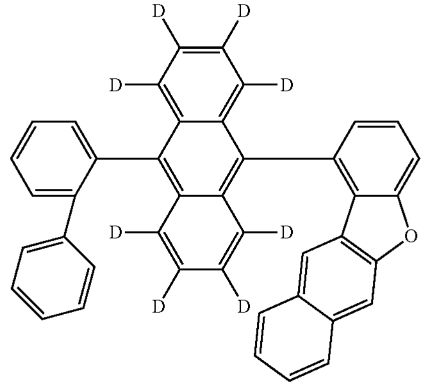

-continued
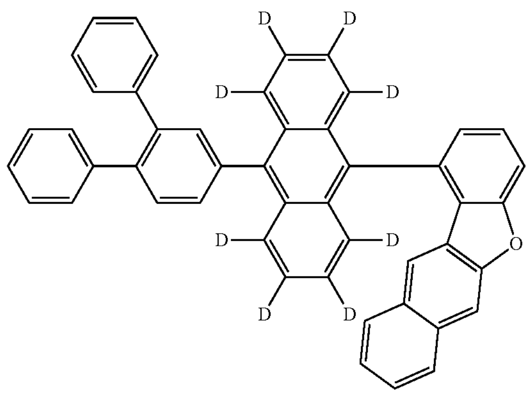
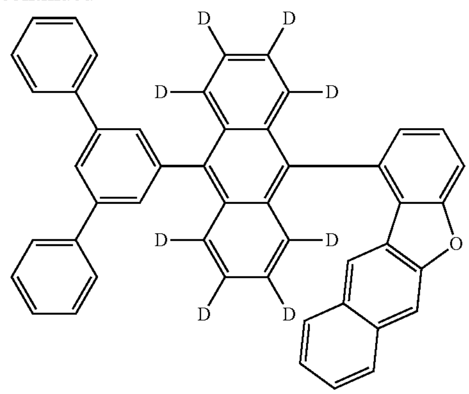
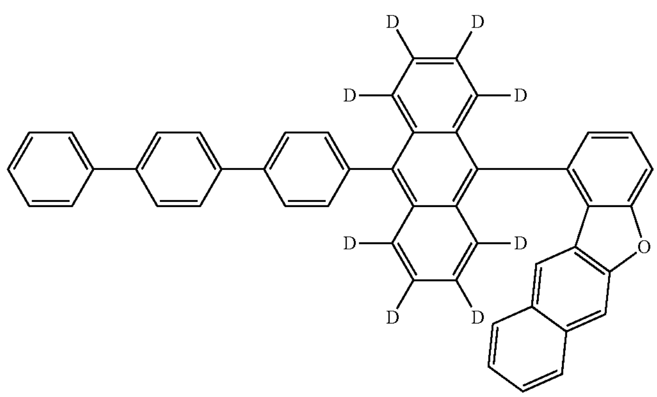
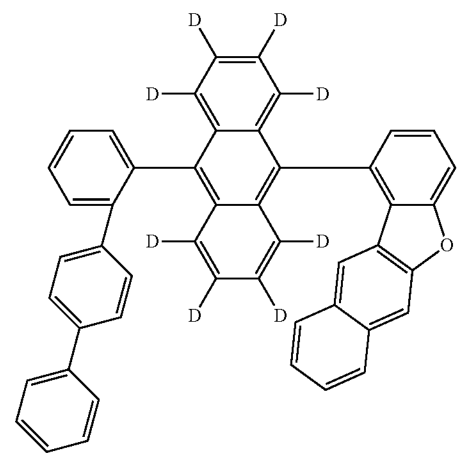
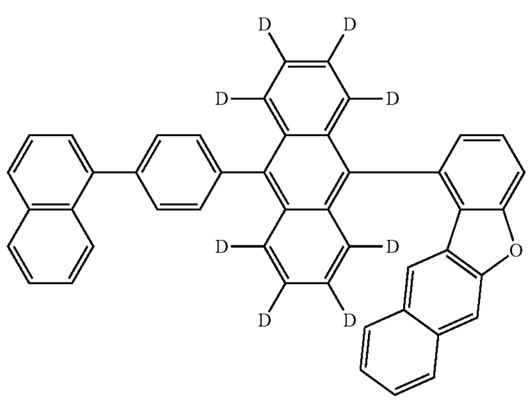
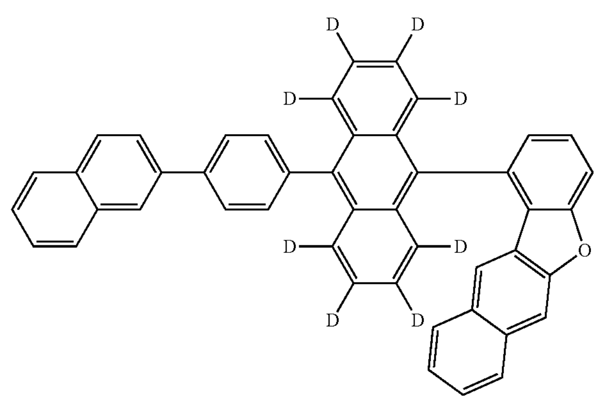
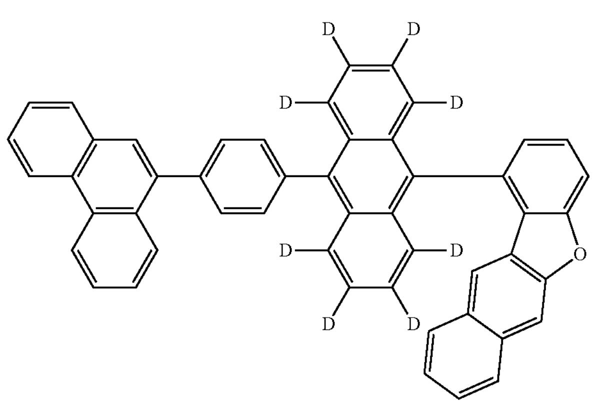
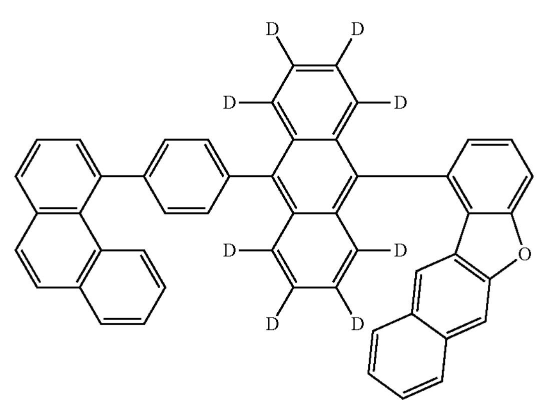

-continued
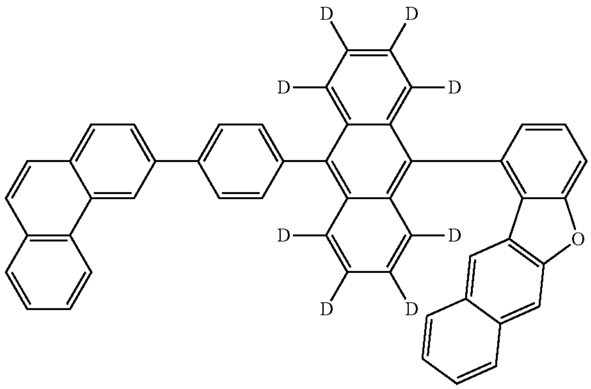
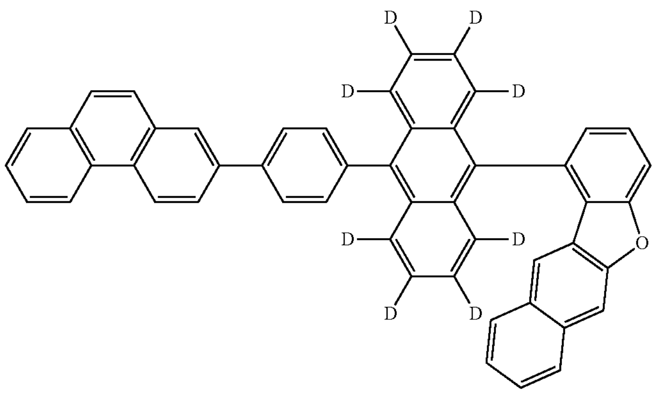
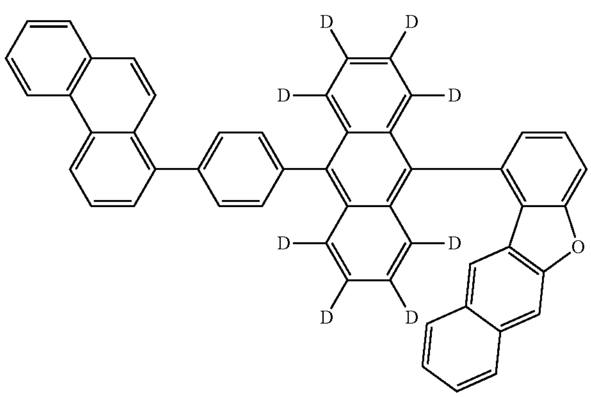
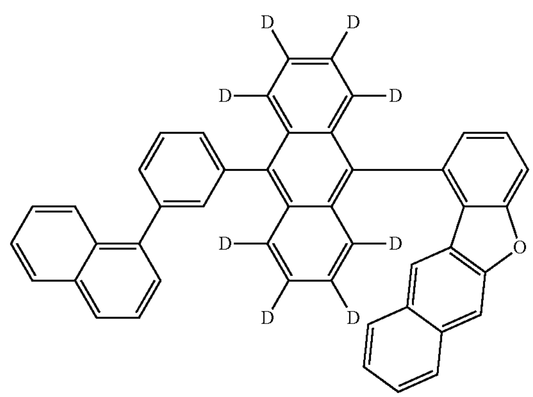
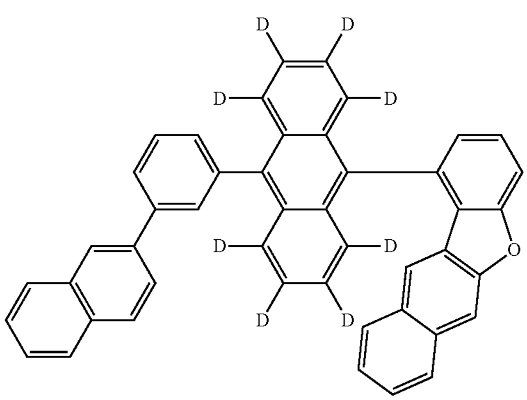
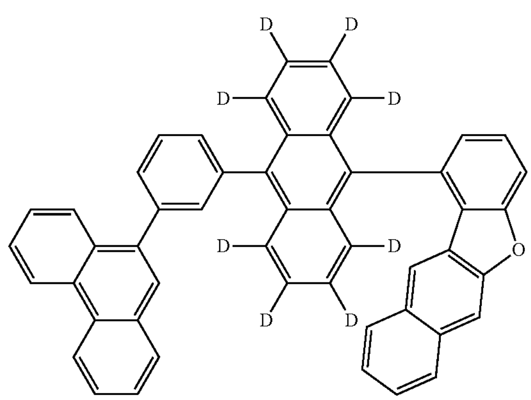

-continued
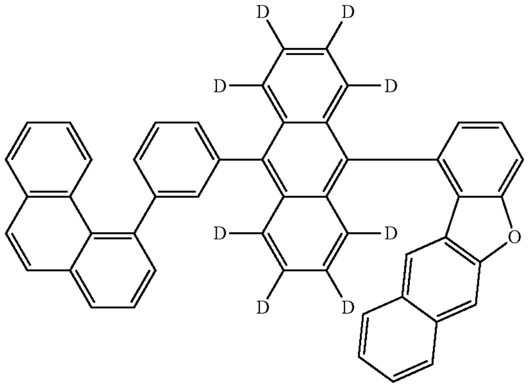
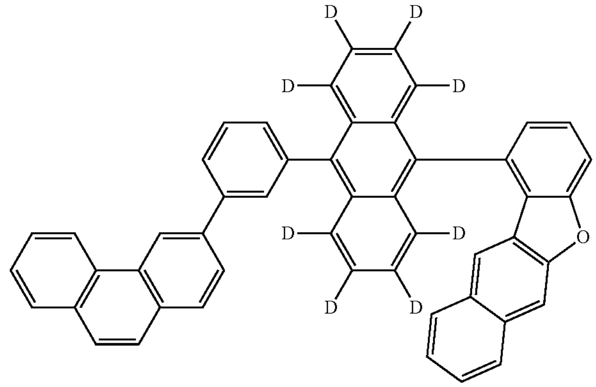
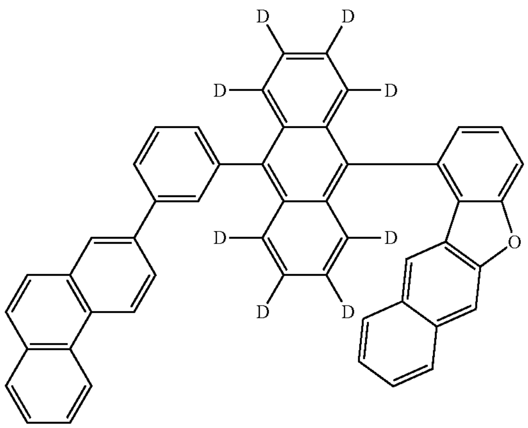
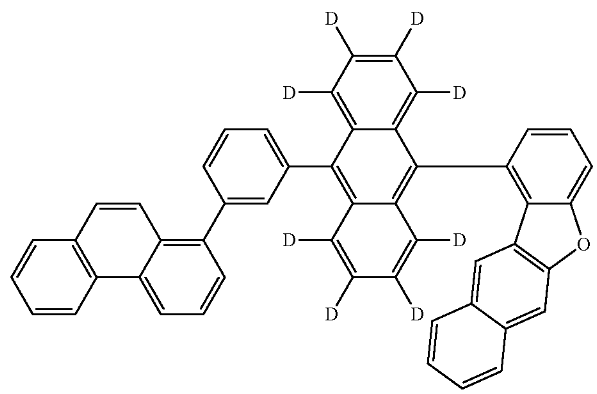
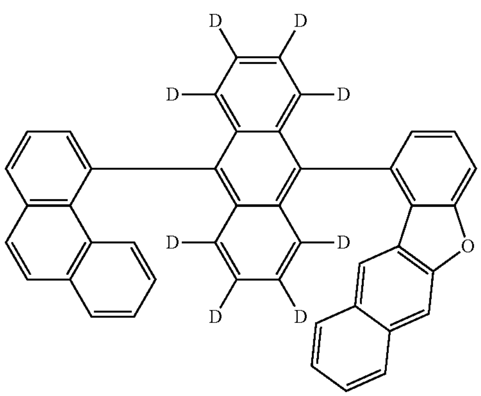
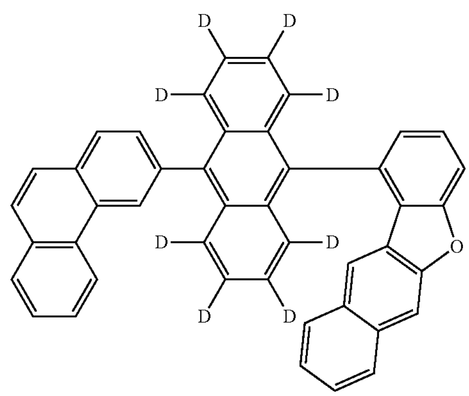
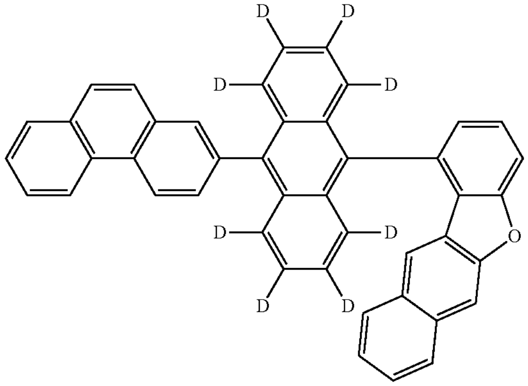
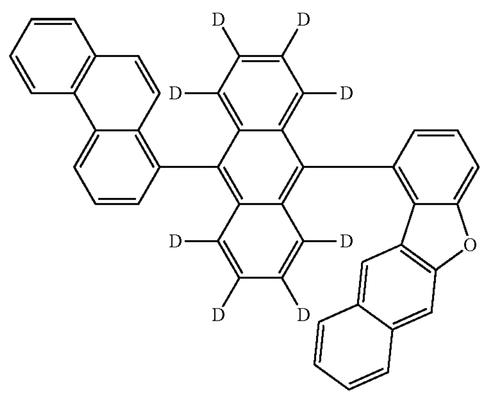

-continued
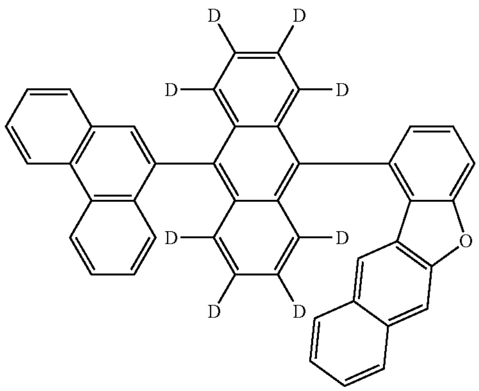
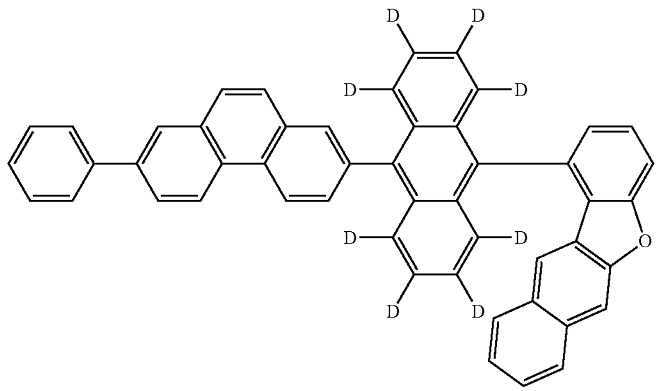
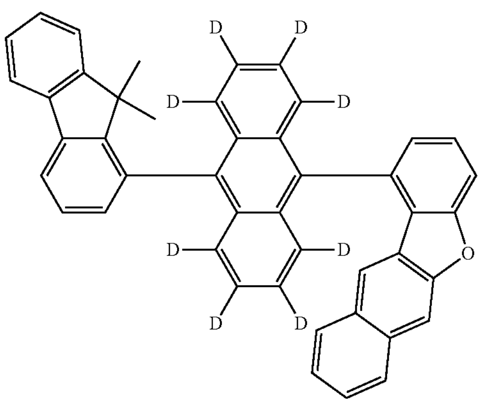
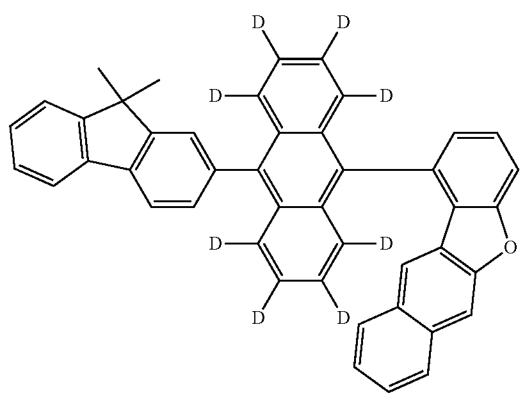
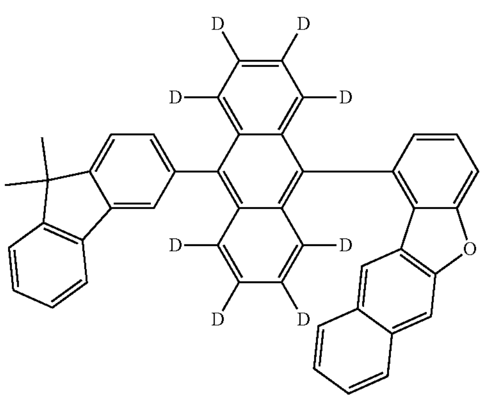
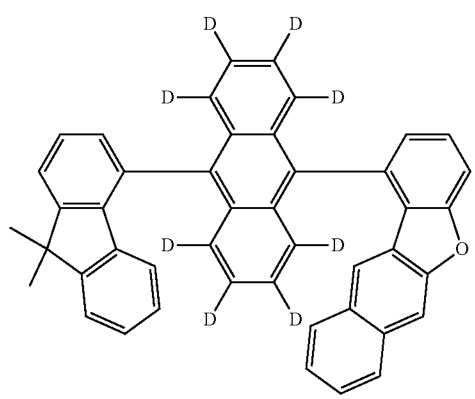
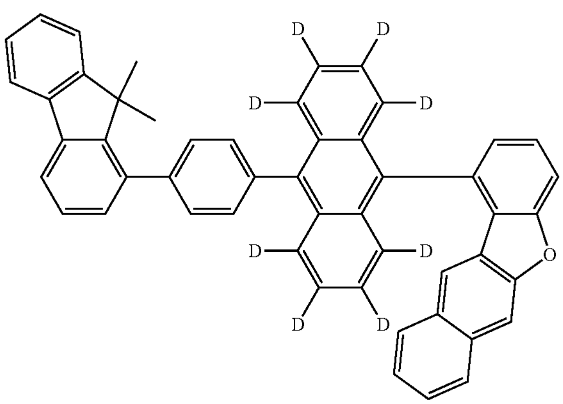

-continued
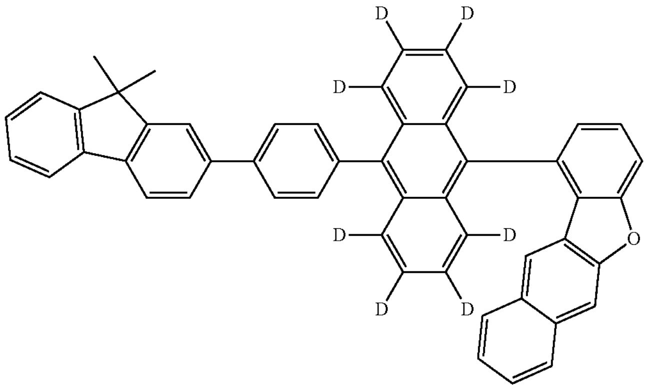
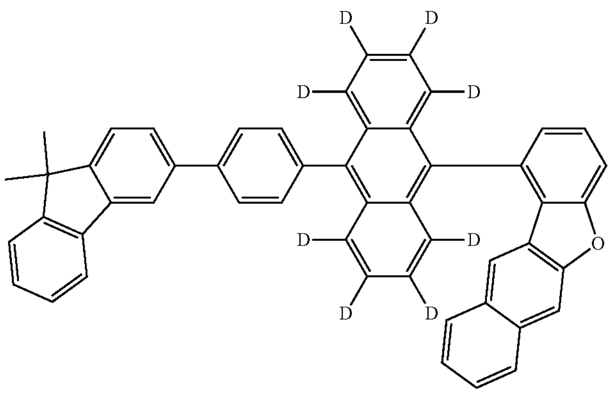
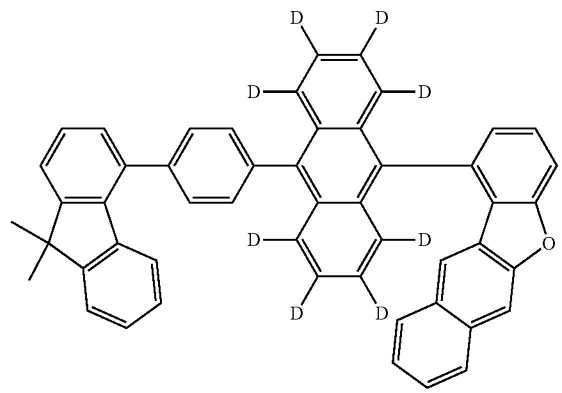
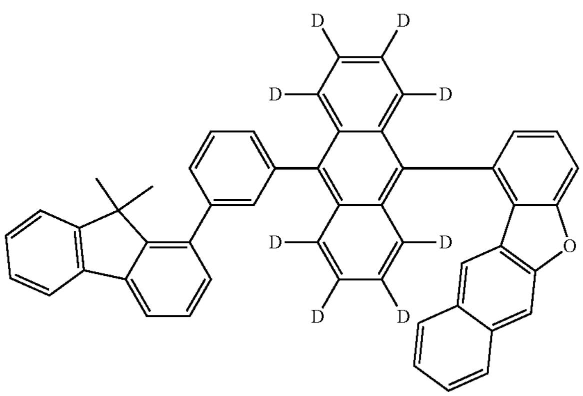
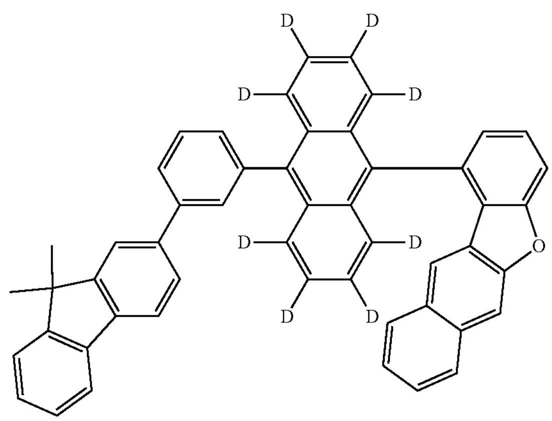
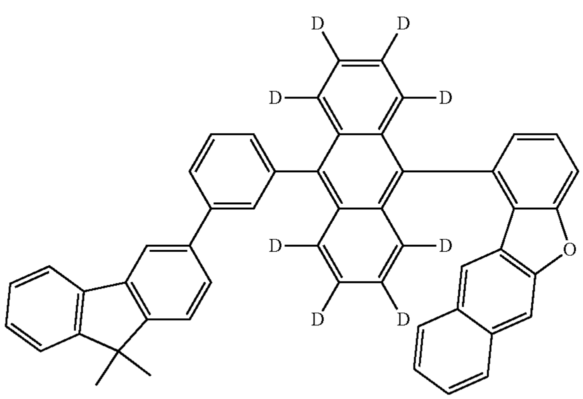
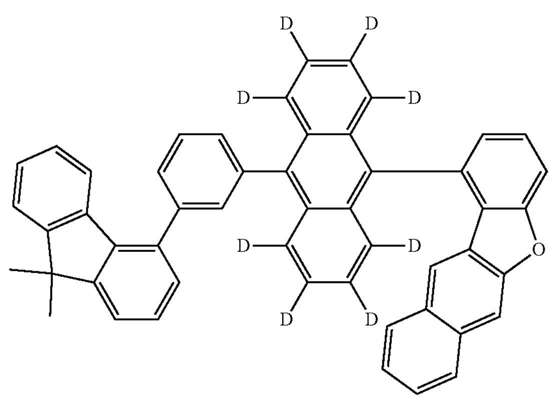

-continued
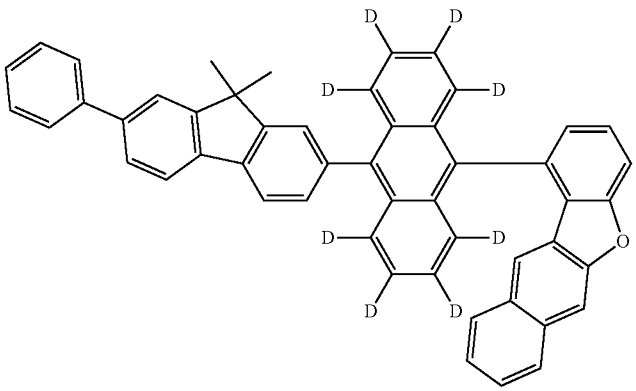
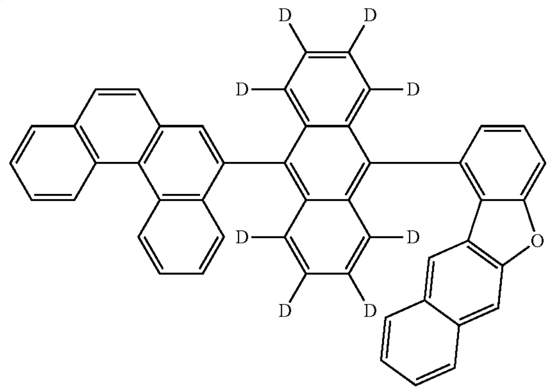
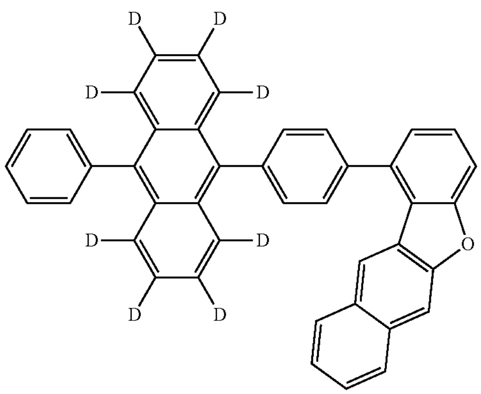
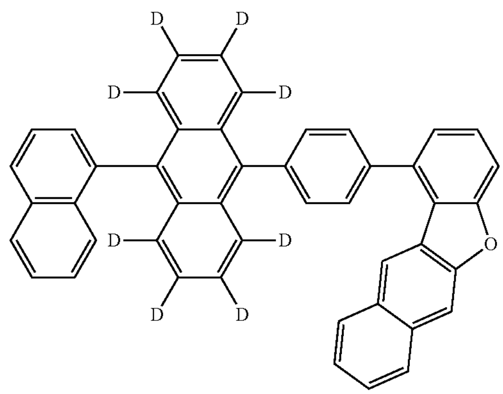
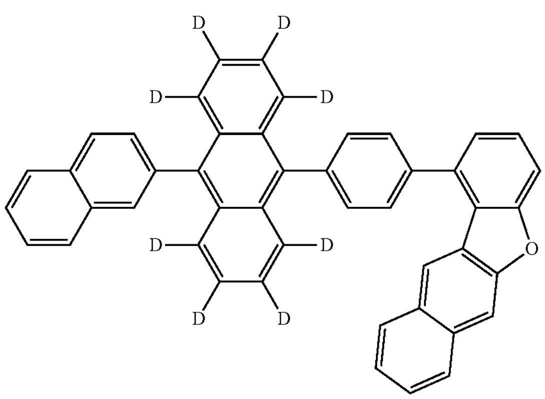
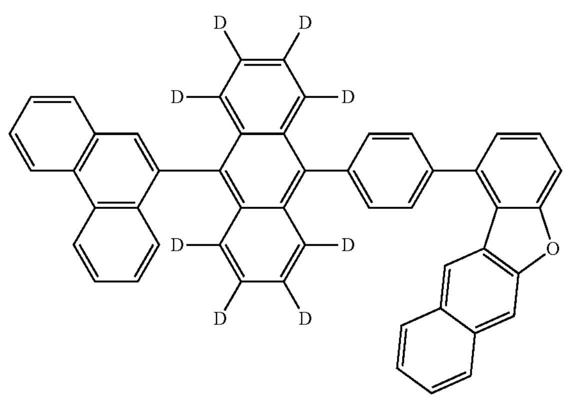
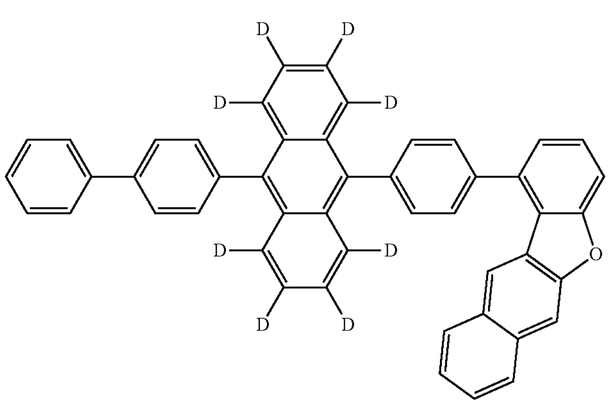
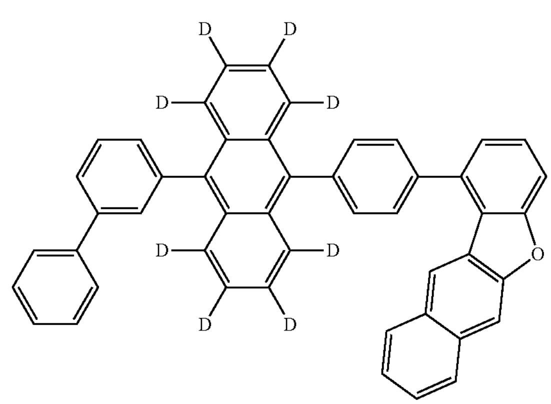

-continued
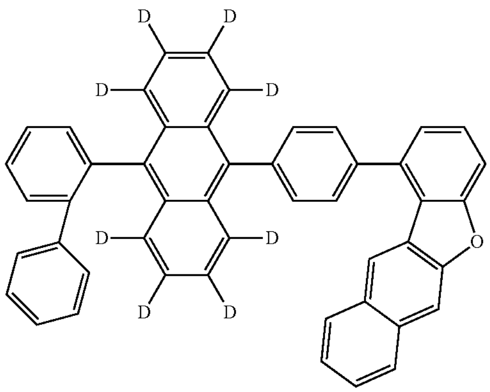
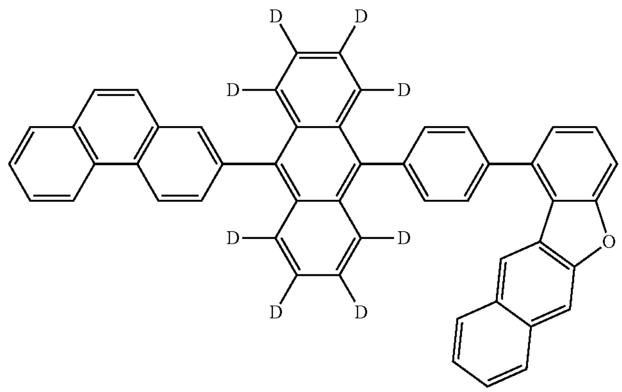
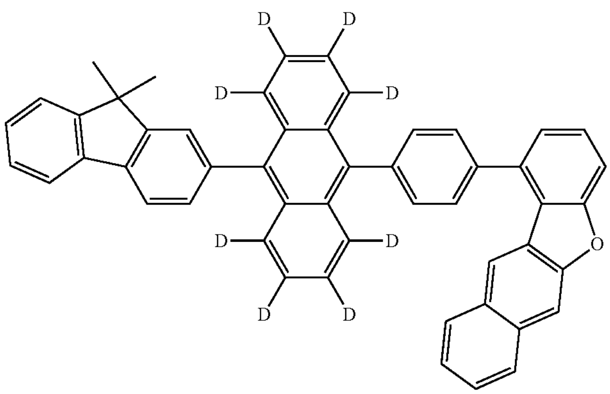
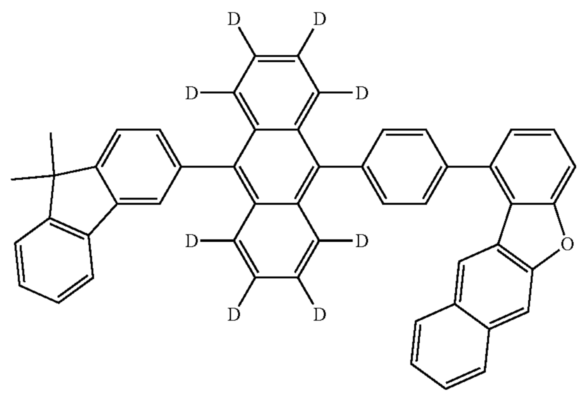
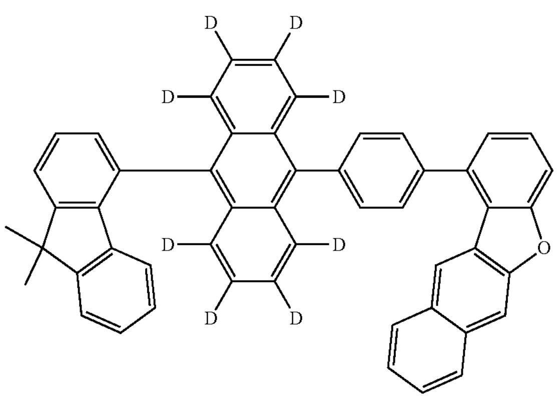
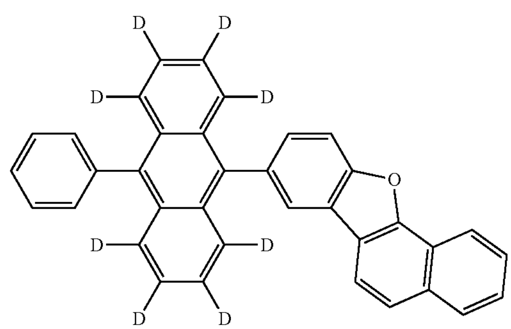
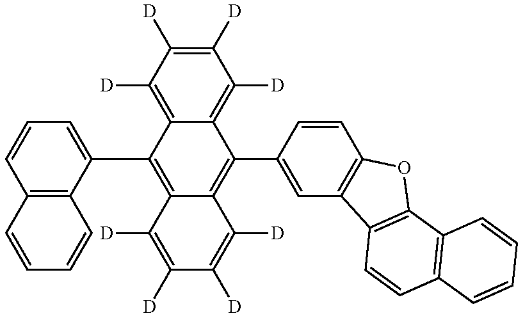
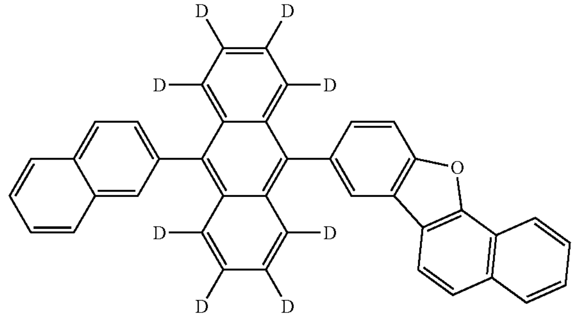

-continued
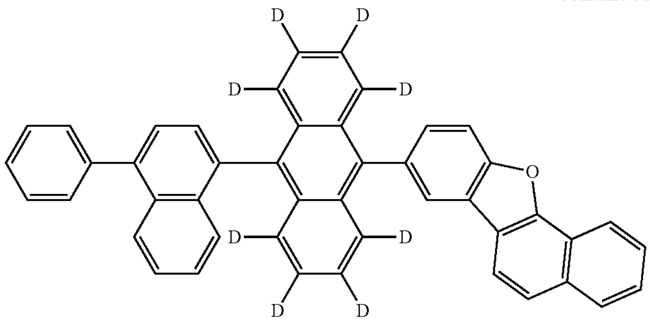
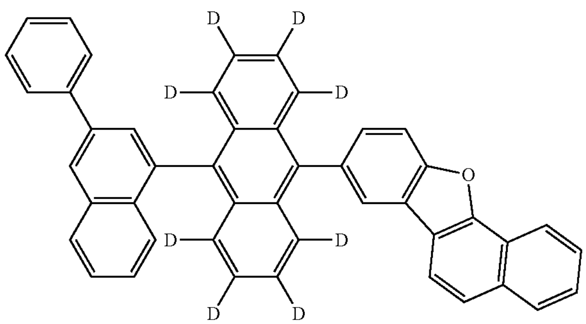
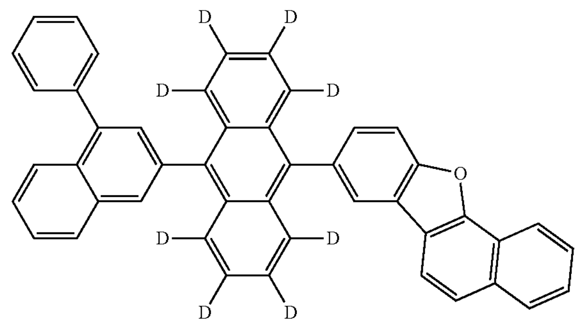
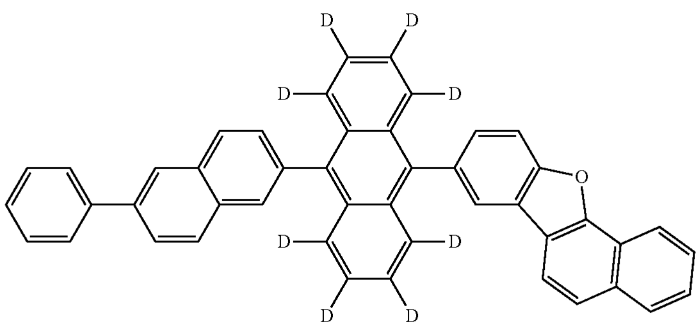
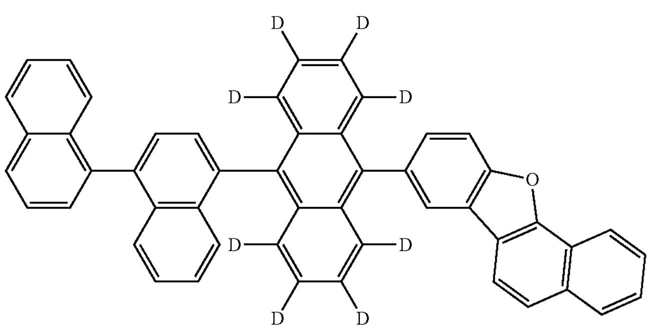
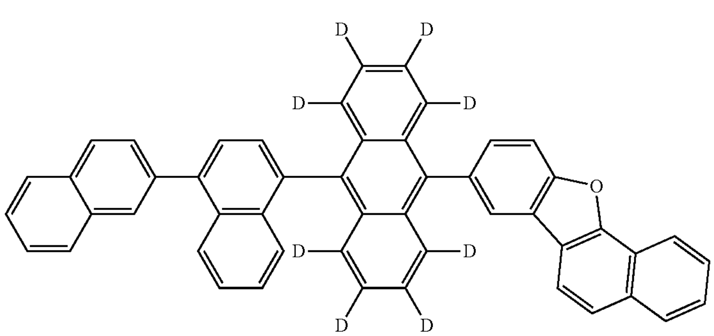

-continued
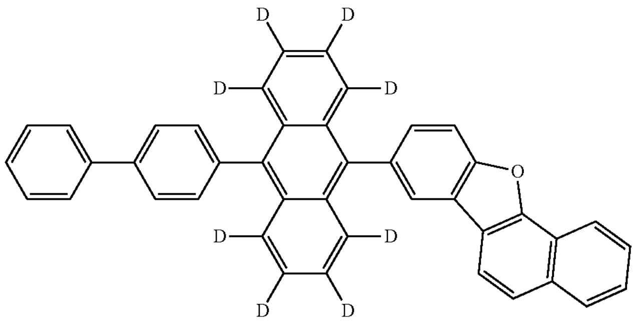
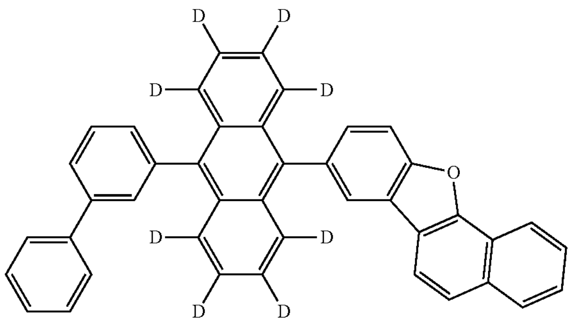
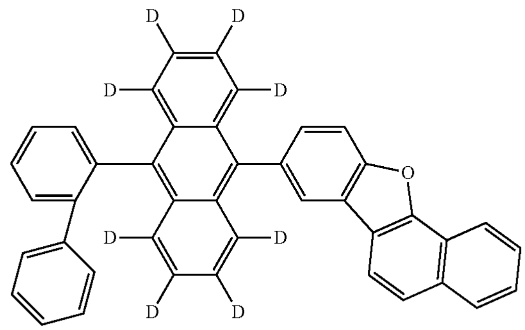
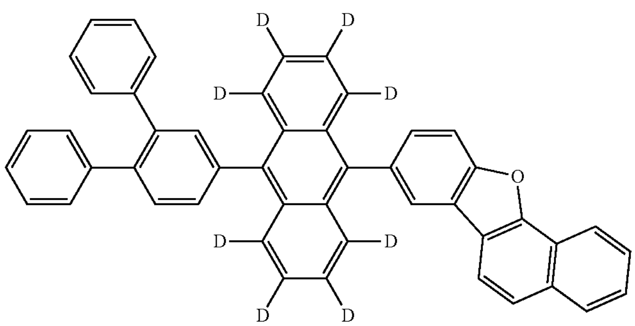
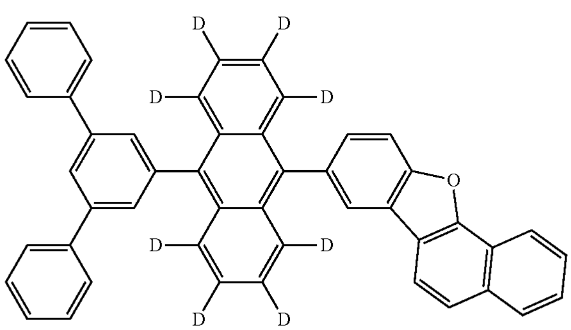
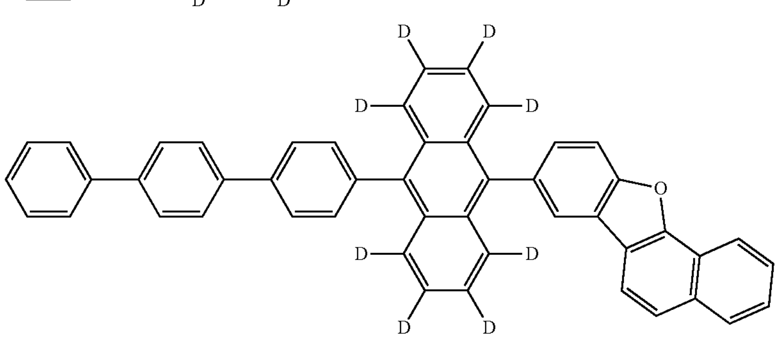

-continued
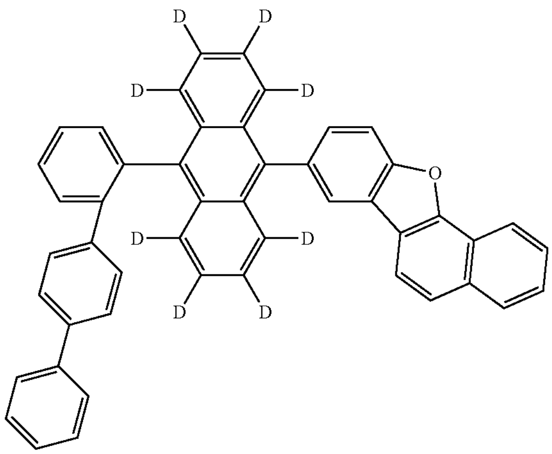
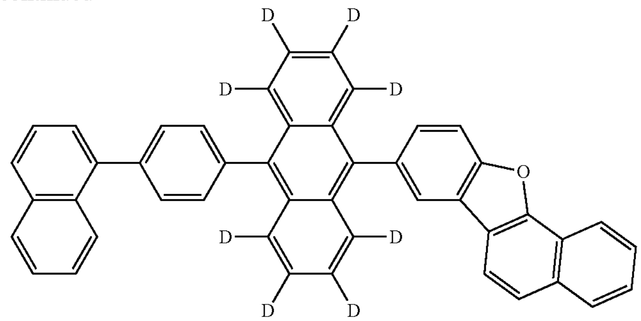
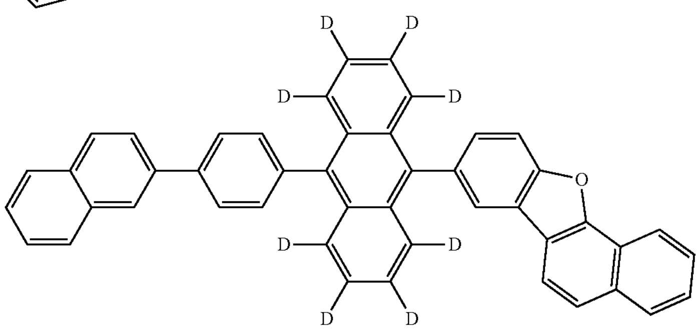
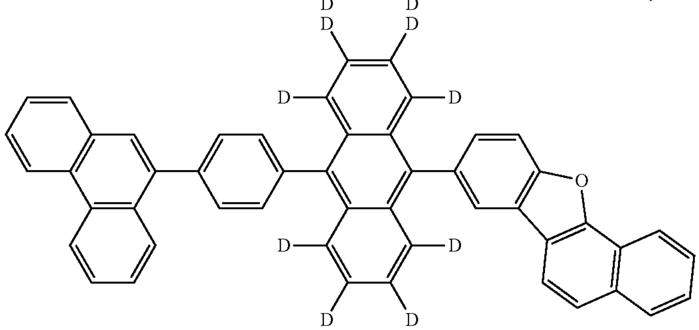
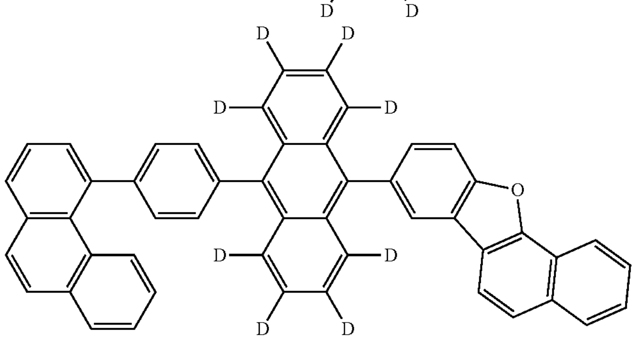
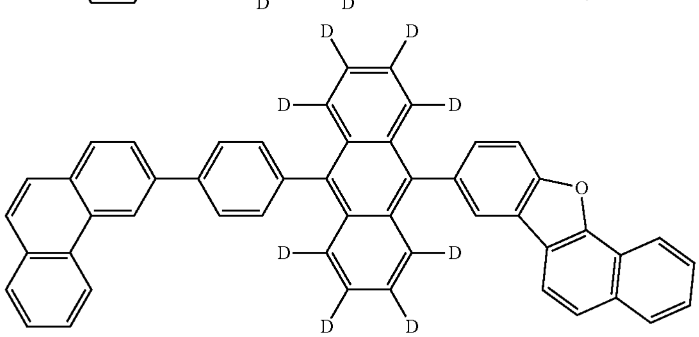

-continued
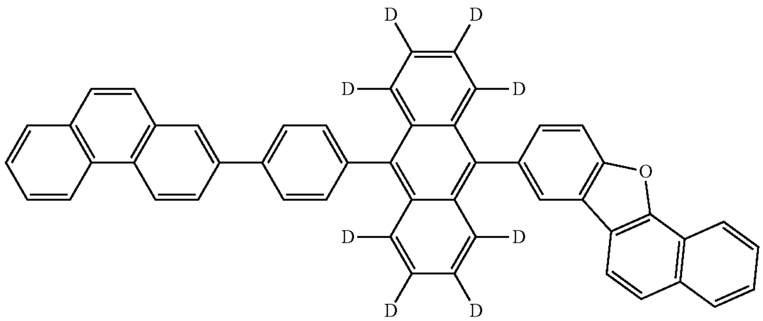
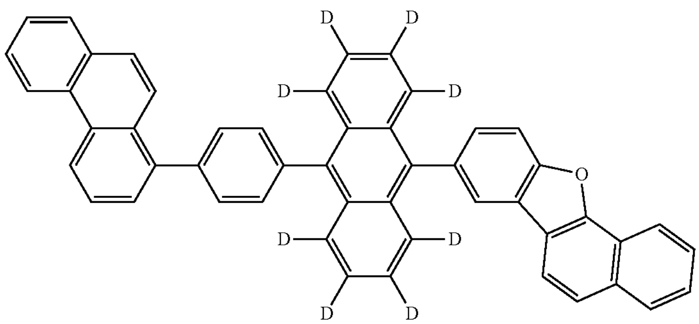
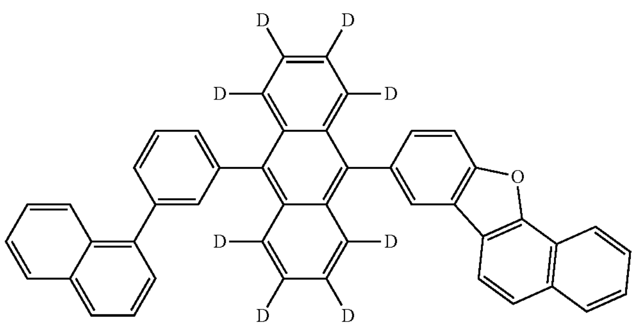
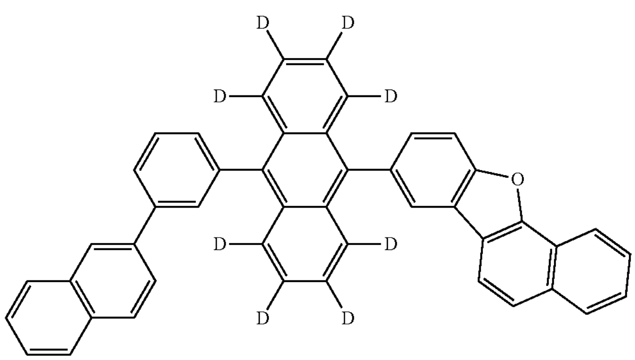
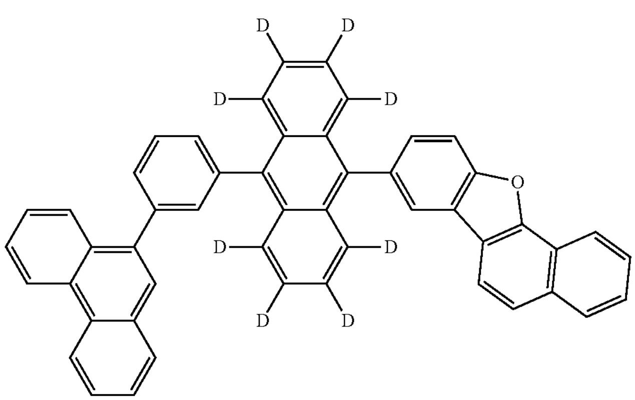

-continued
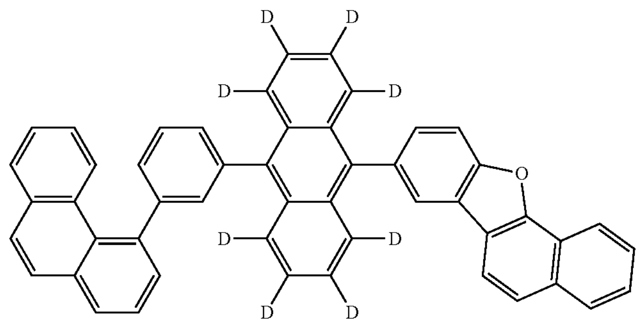
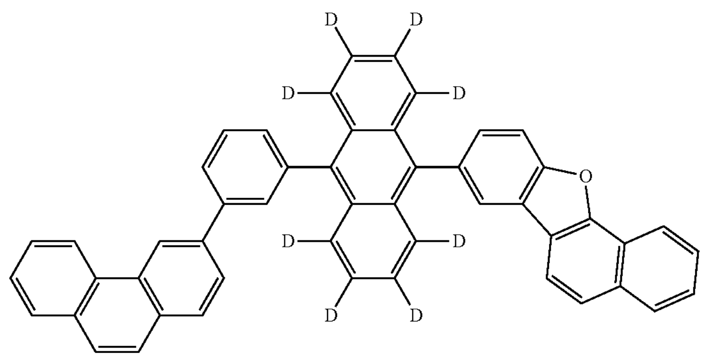
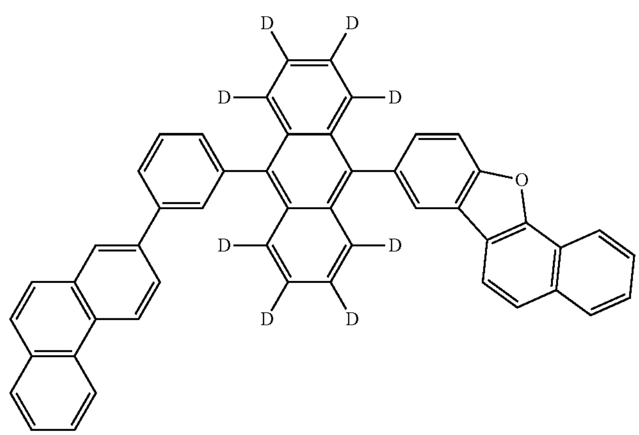
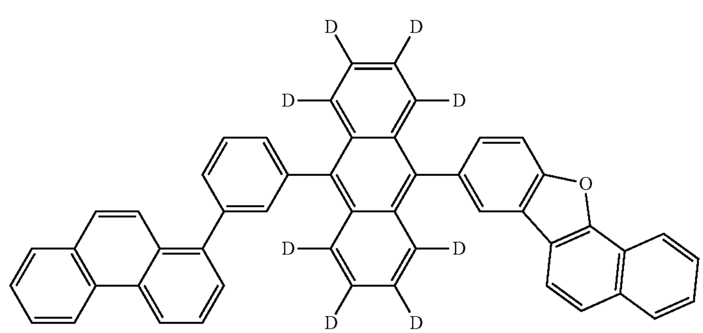

-continued
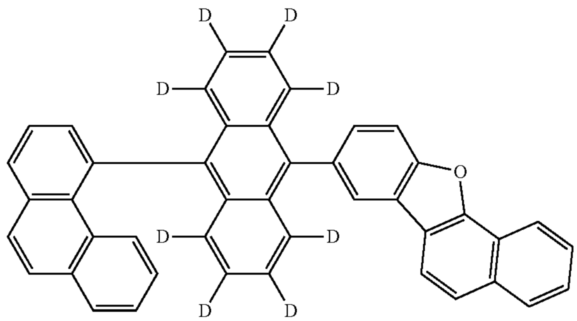
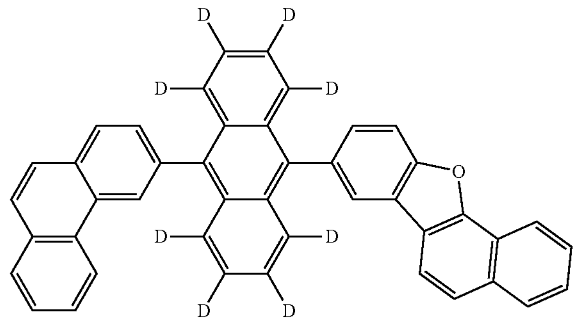
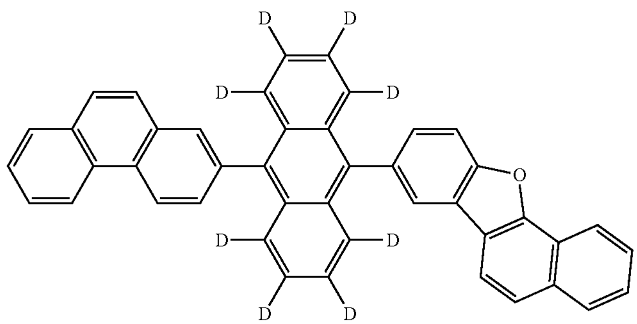
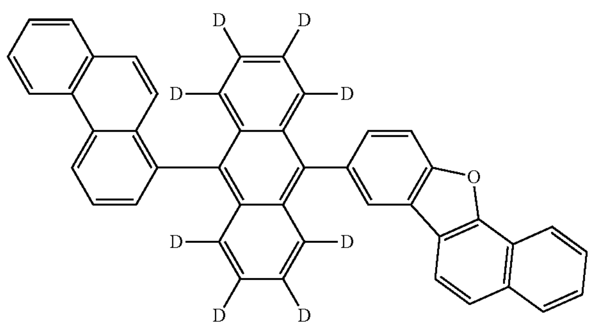
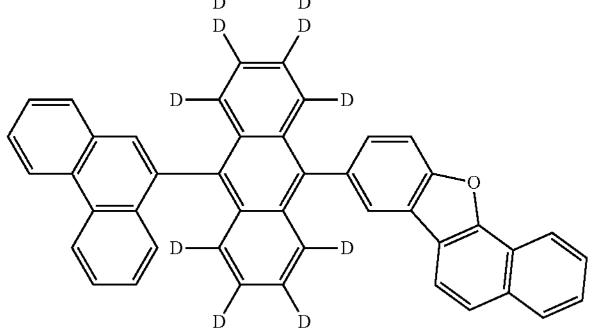
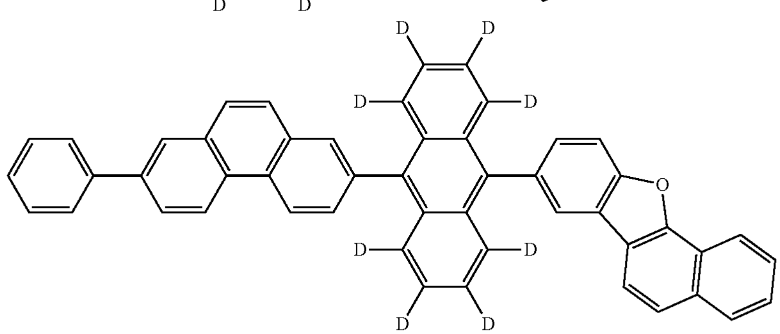

-continued
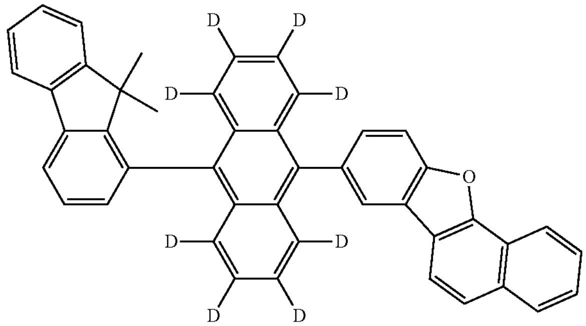
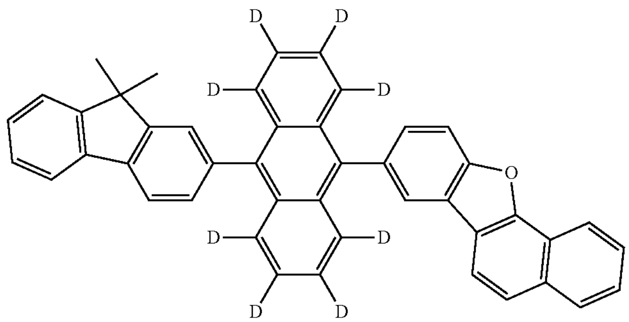
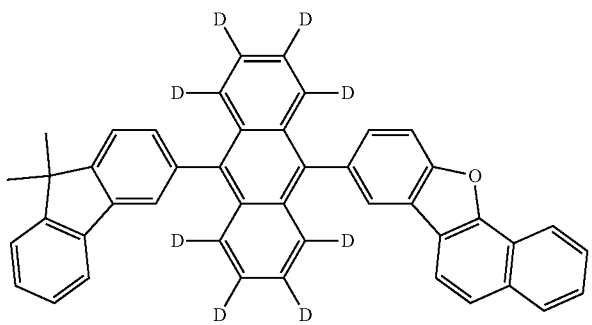
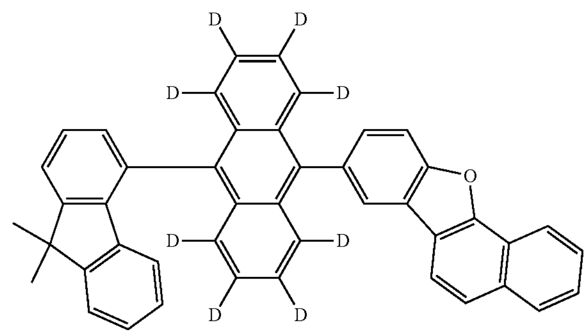
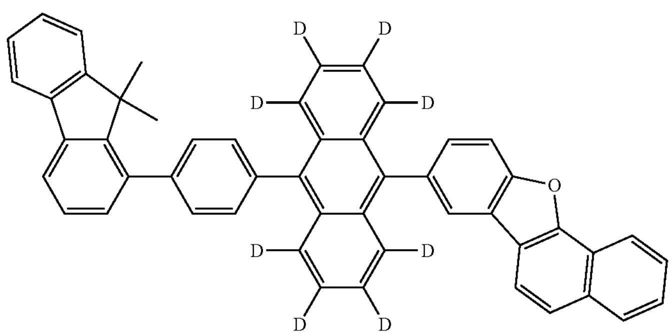
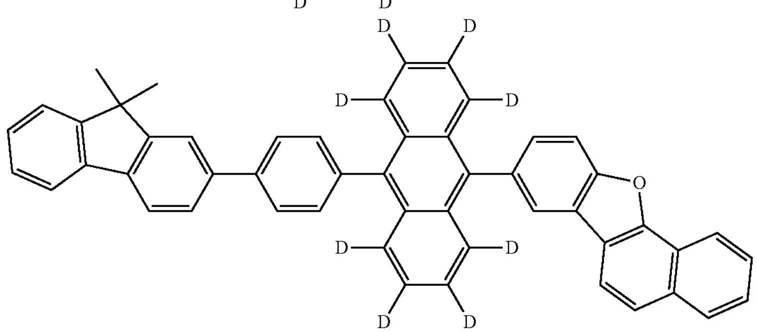

-continued
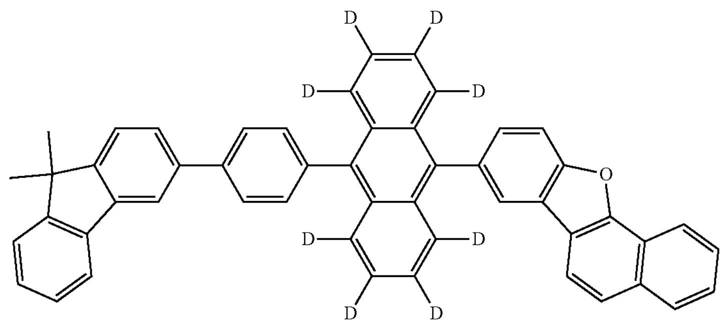
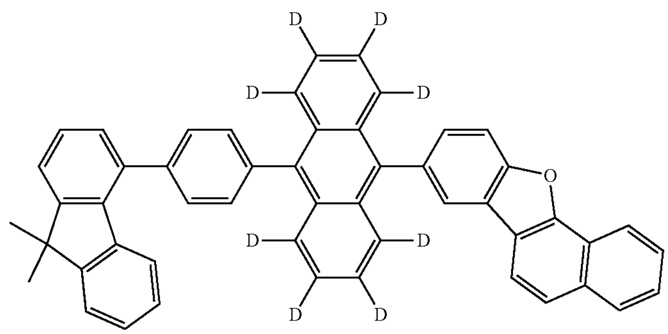
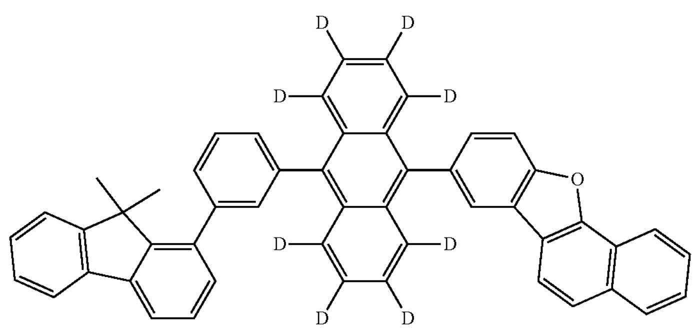
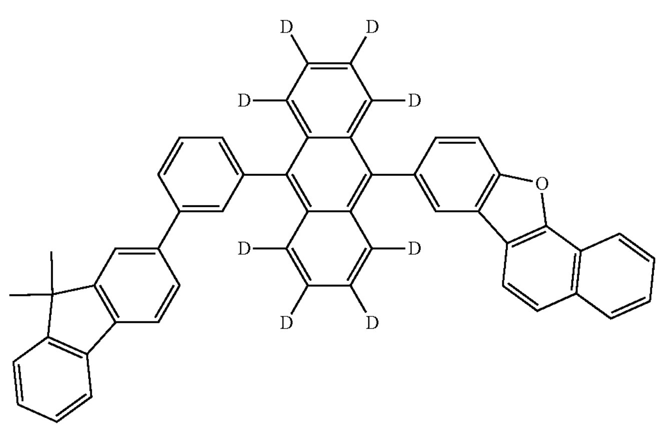

-continued
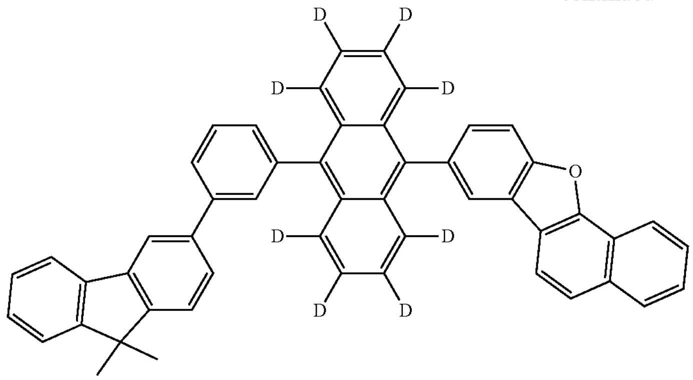
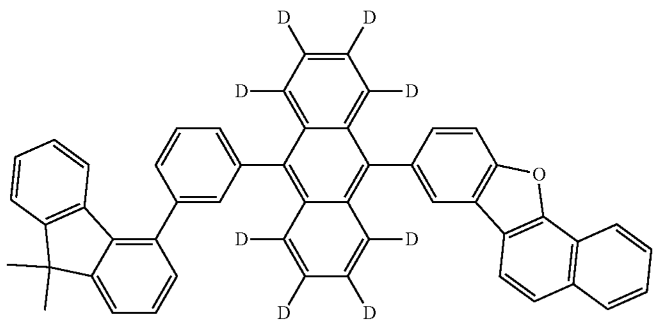 [SMILES: [2H]c1c([2H])c([2H])c2c(-c3ccc4oc5c6ccccc6ccc5c4c3)c3c([2H])c([2H])c([2H])c([2H])c3c(-c3cccc(-c4cccc5c4-c4ccccc4C5(C)C)c3)c2c1[2H]]
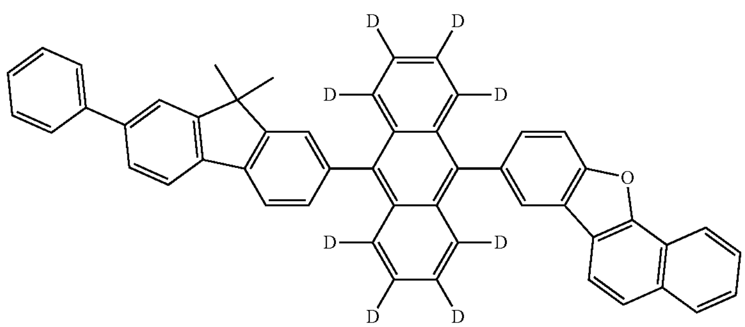
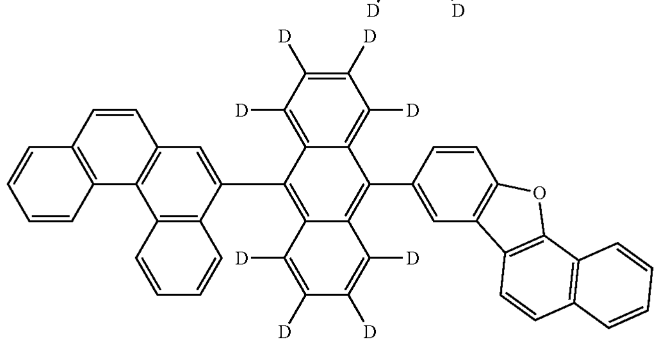
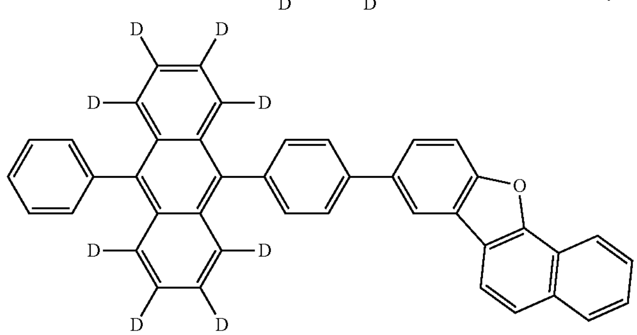

-continued
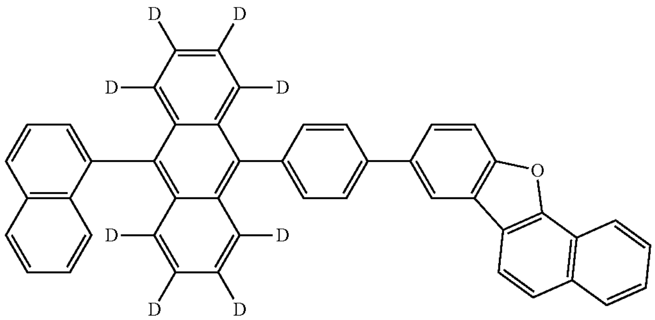
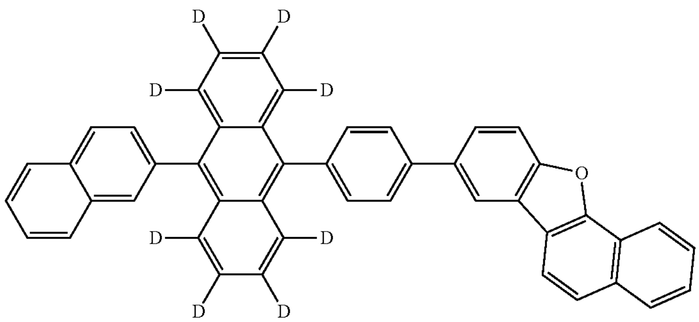
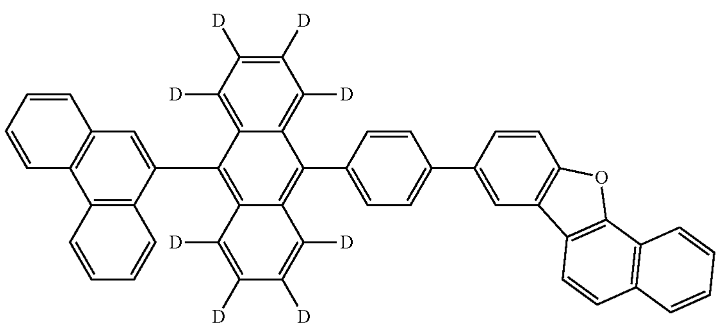
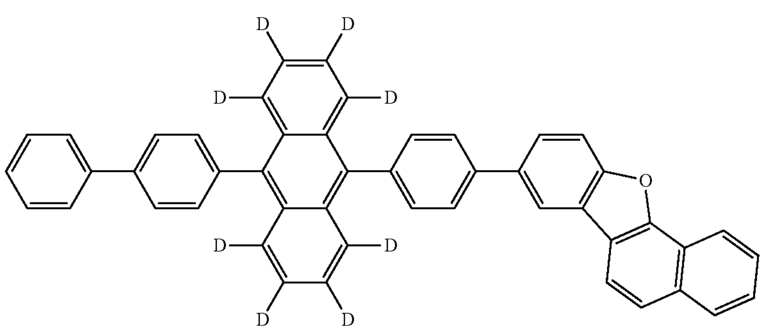
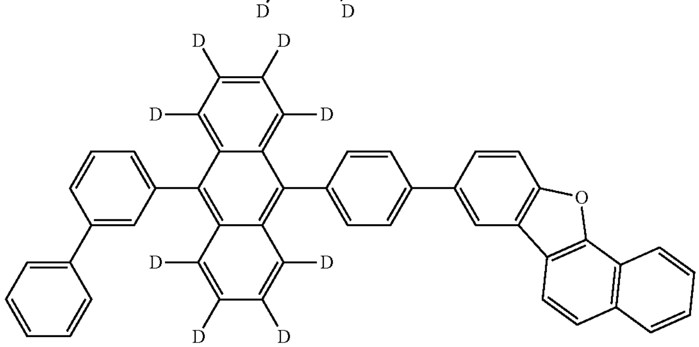

-continued
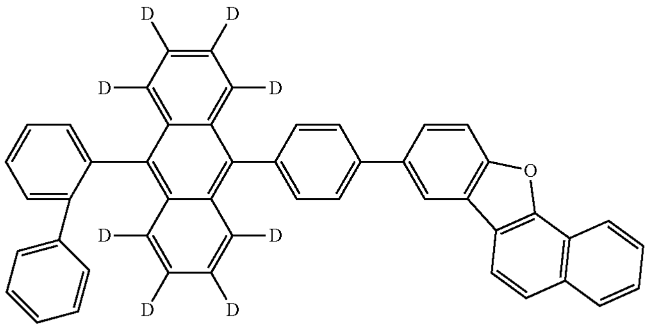
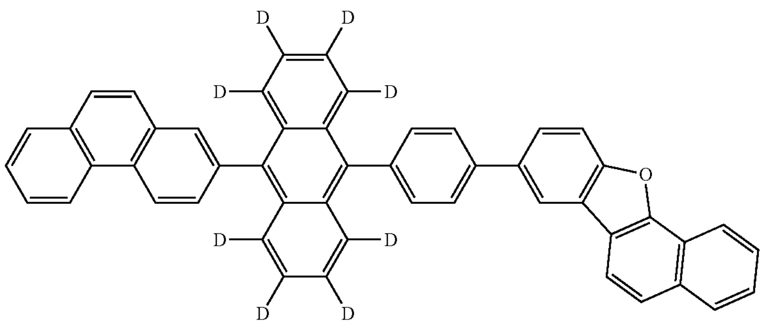
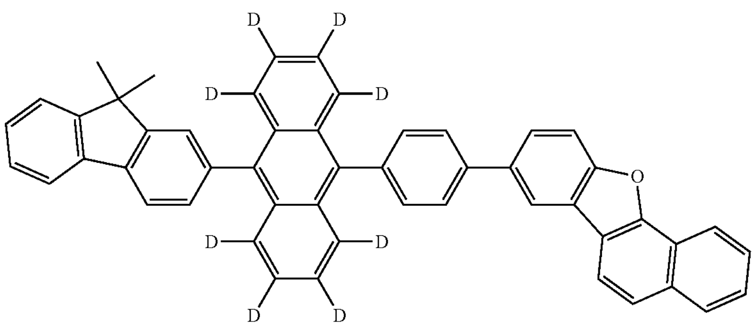
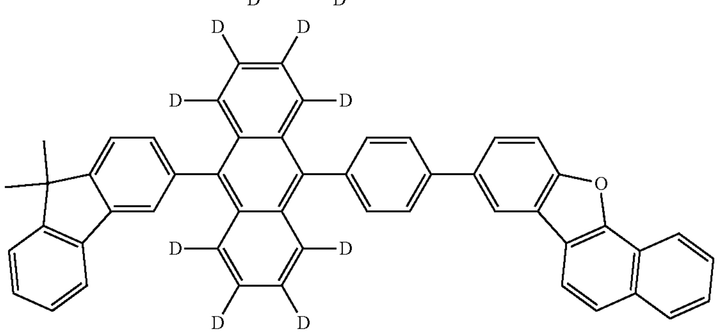
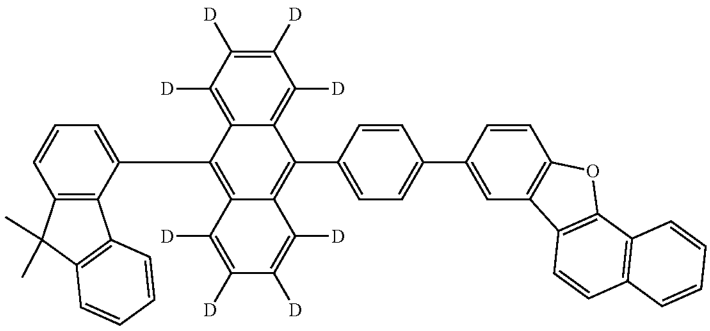
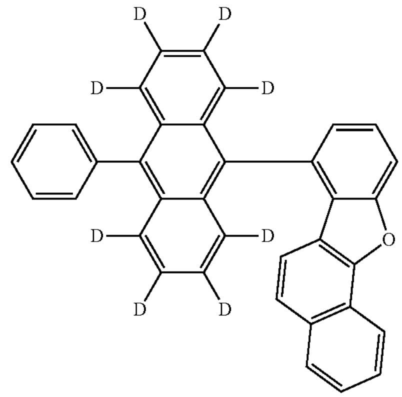

-continued
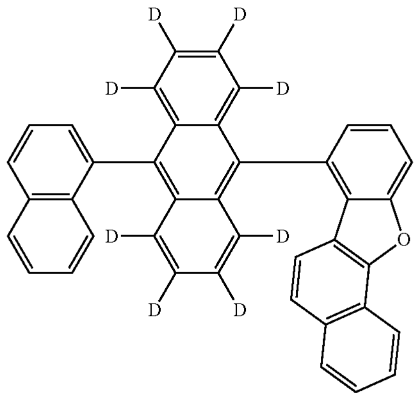
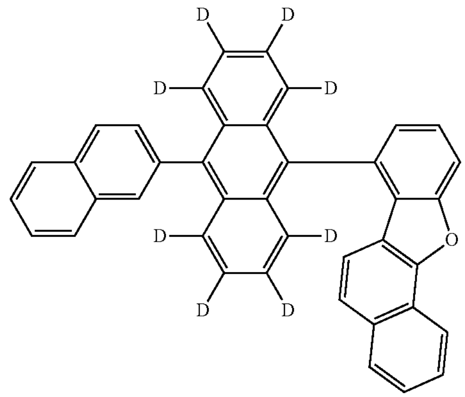
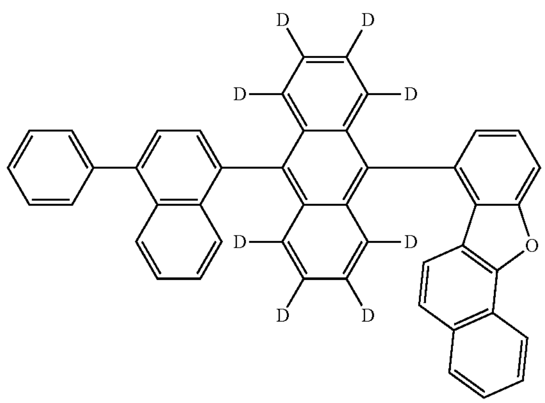
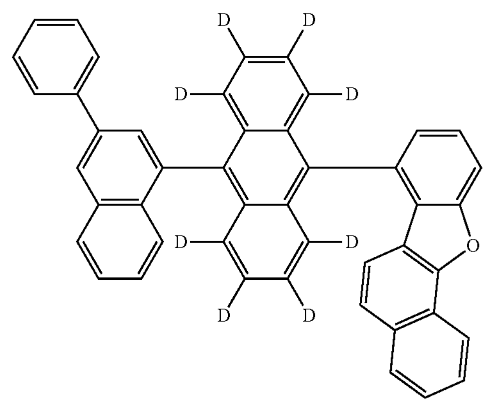
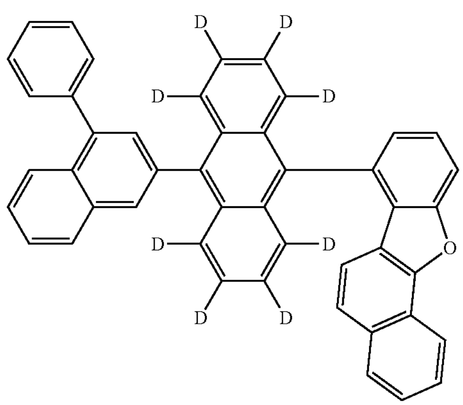
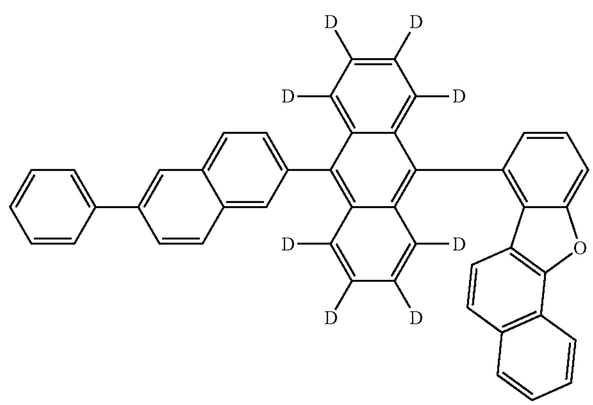
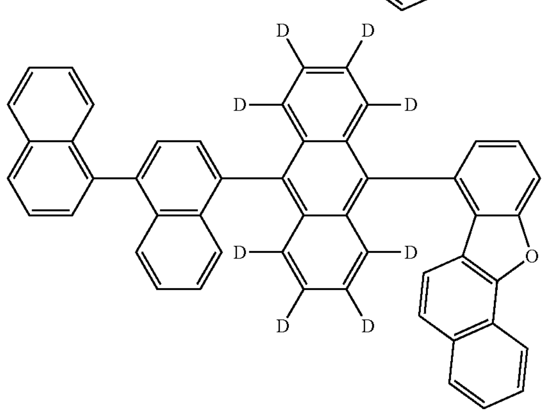
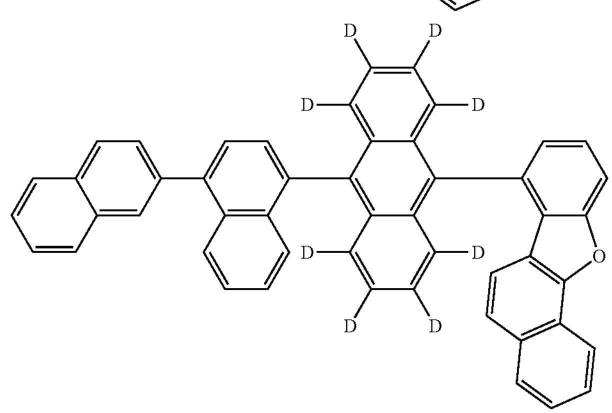

-continued
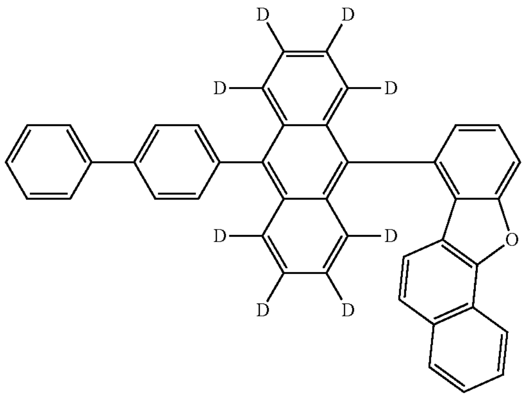
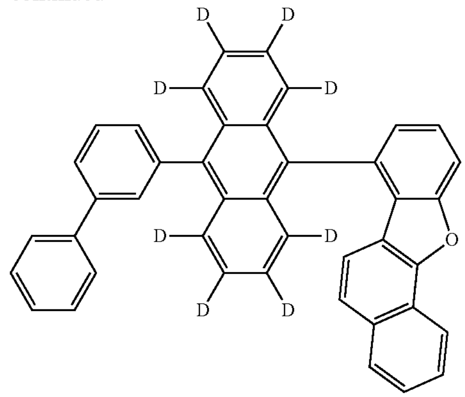
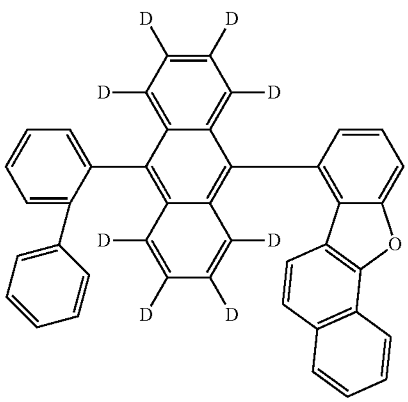
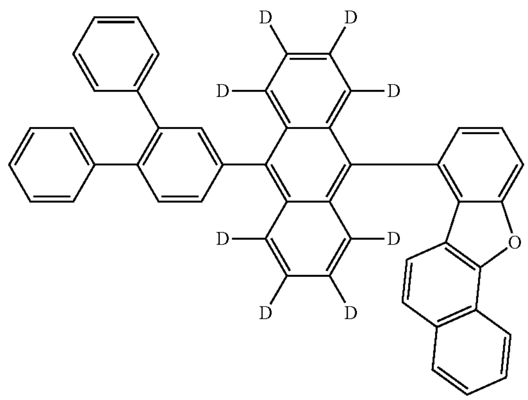
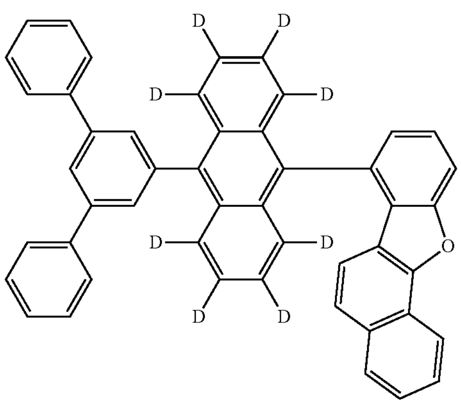
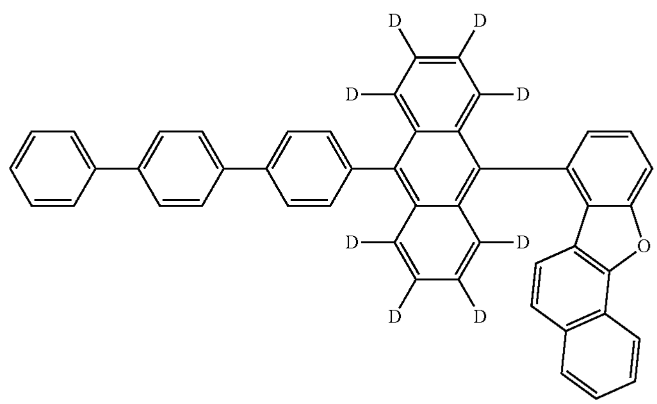
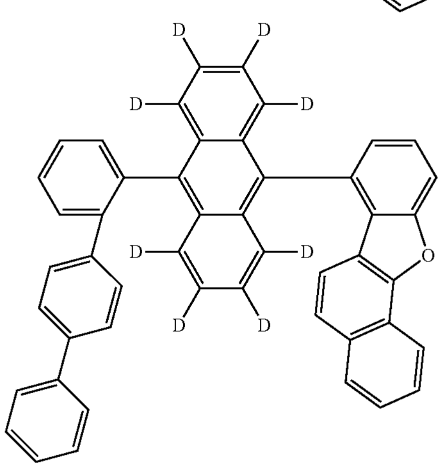
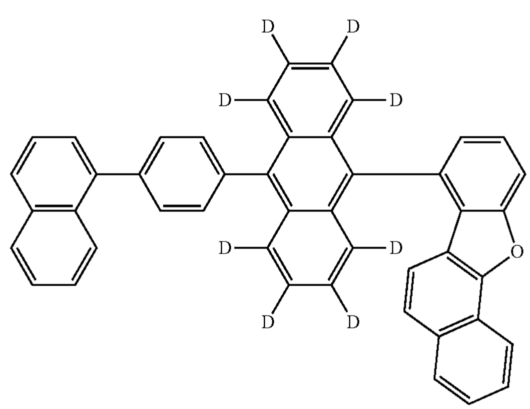

-continued
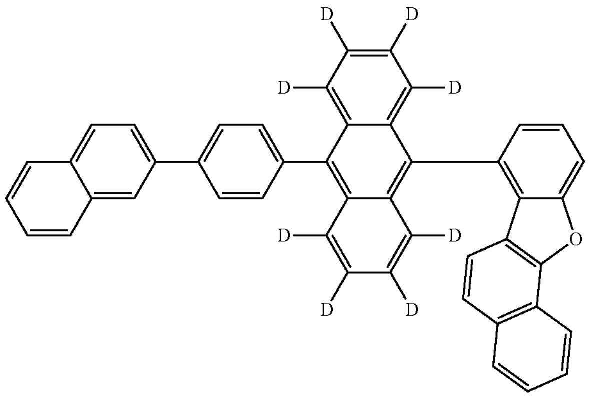
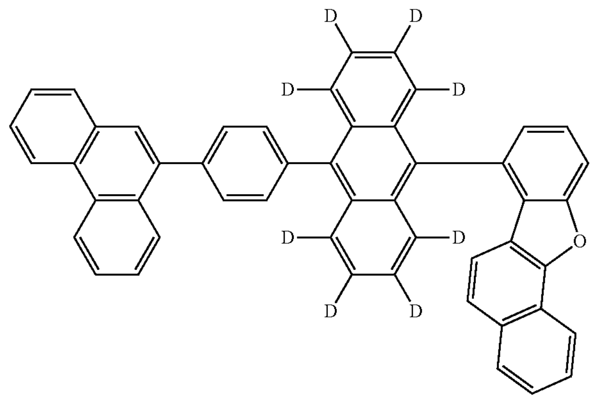
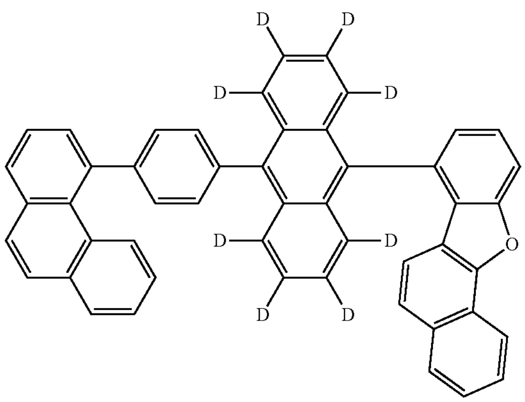
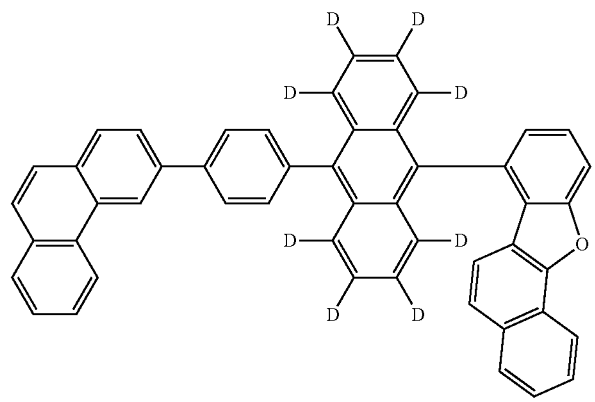
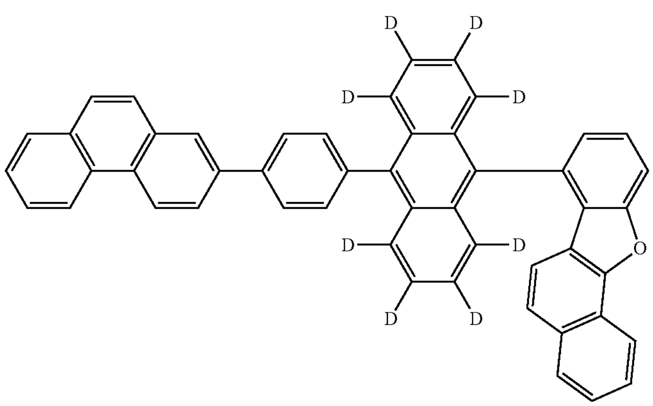
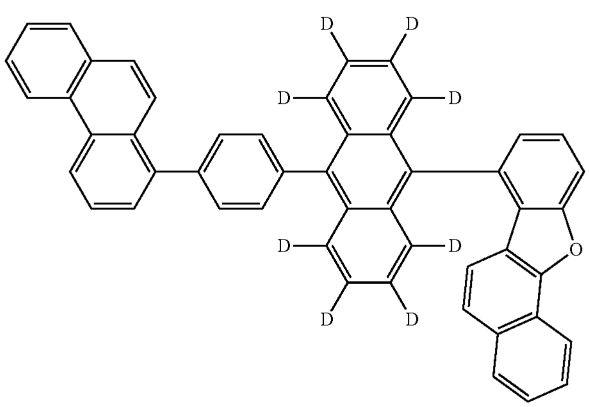
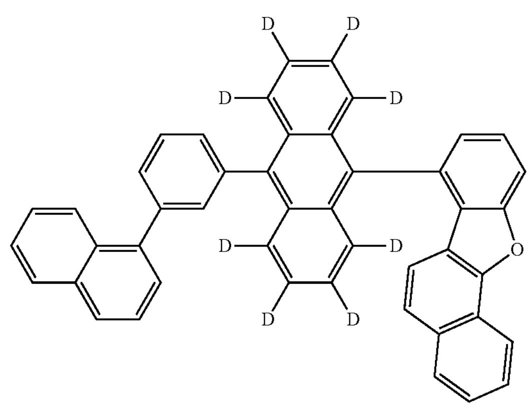

-continued
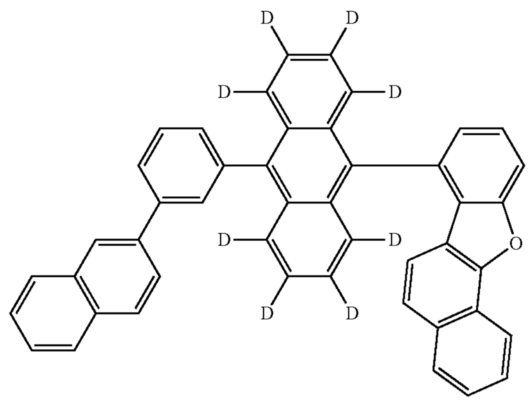
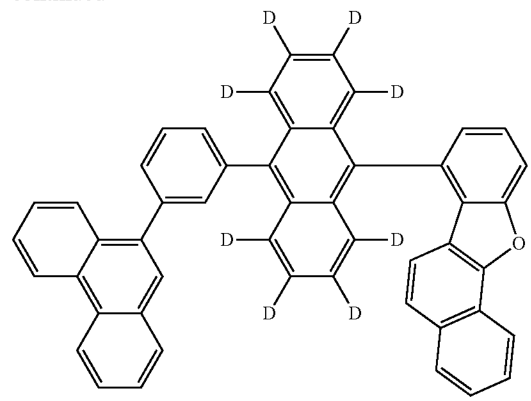
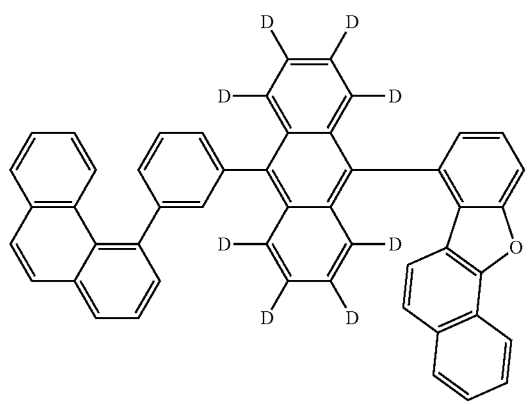
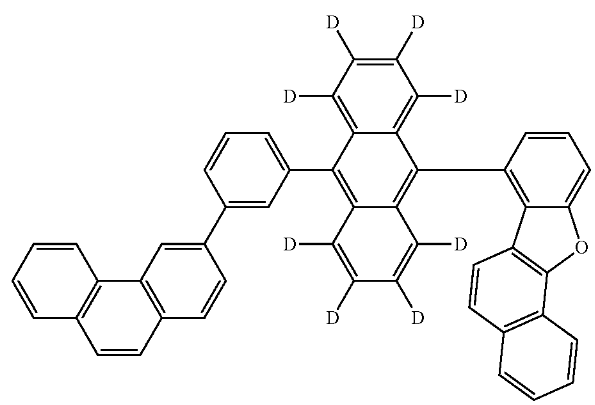
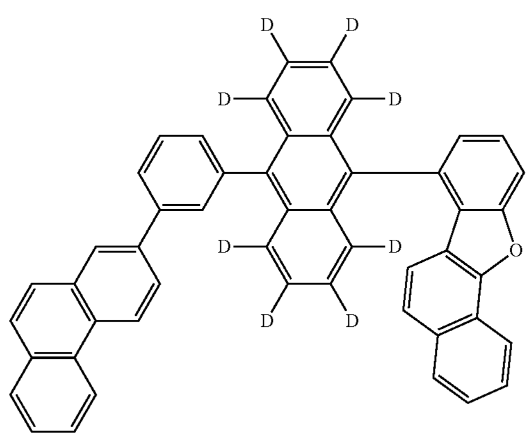
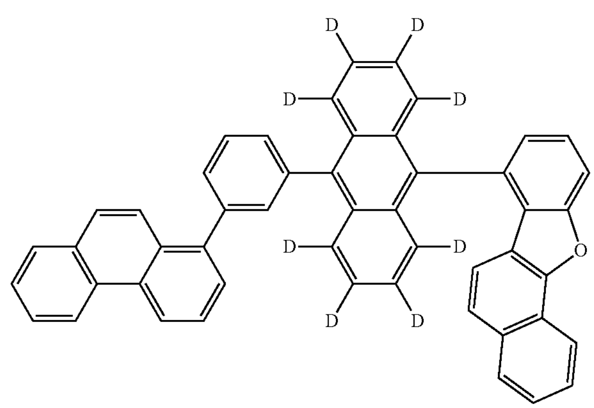
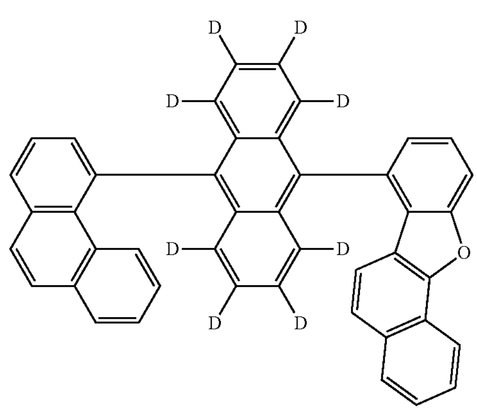
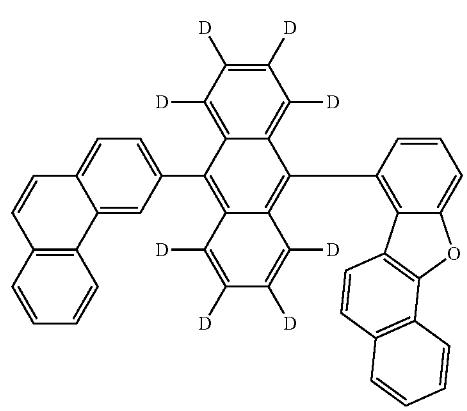

-continued
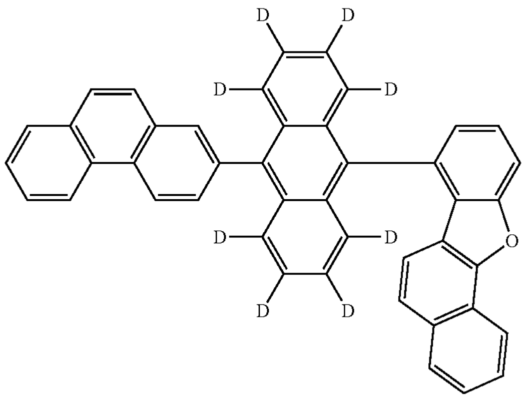
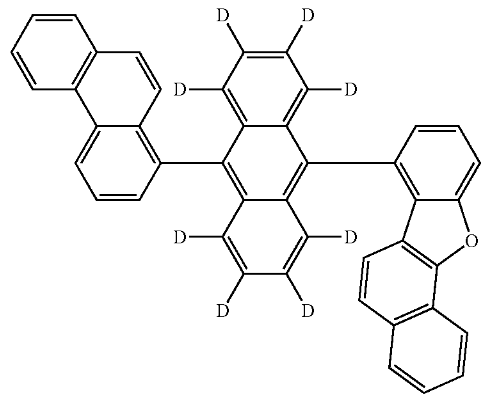
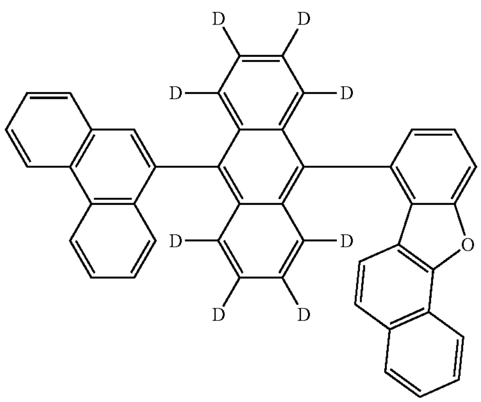
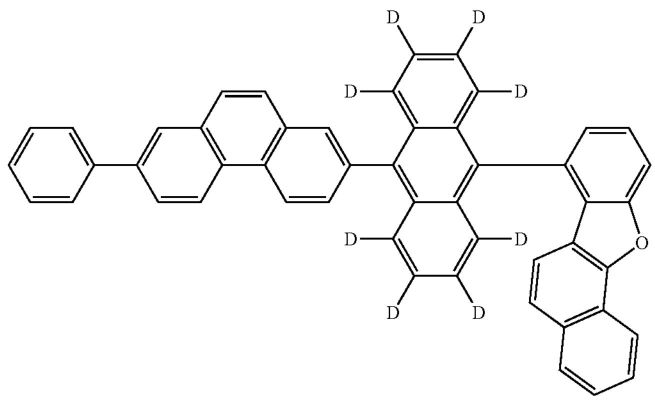
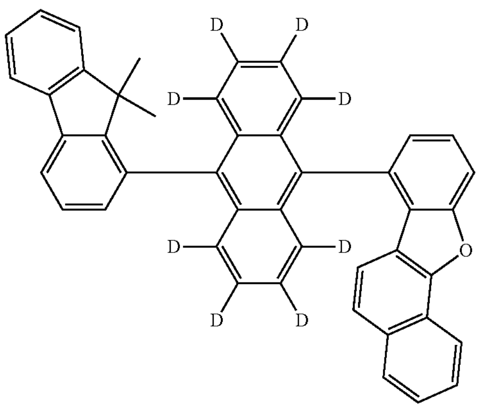
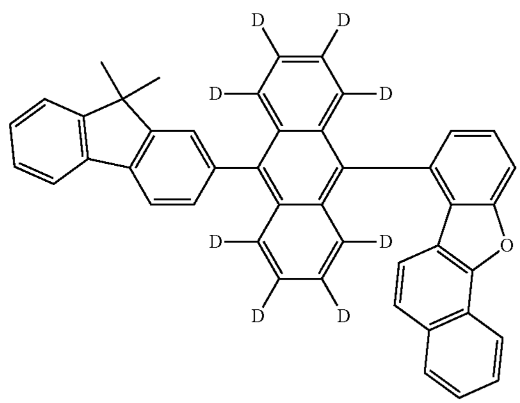
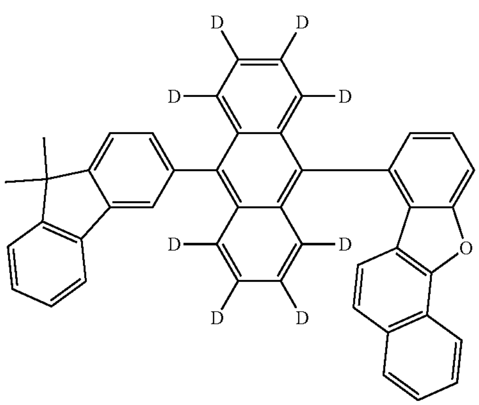
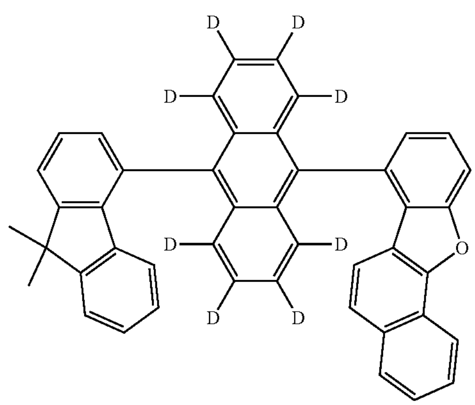

-continued
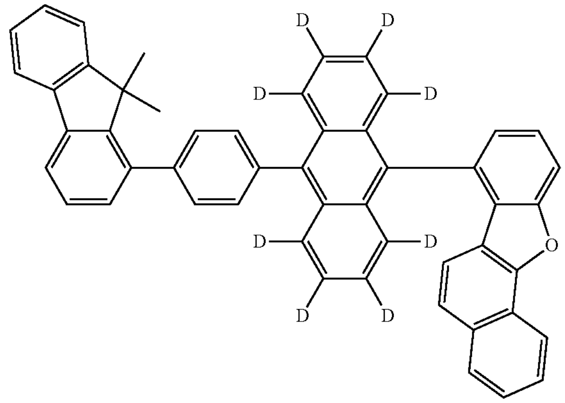
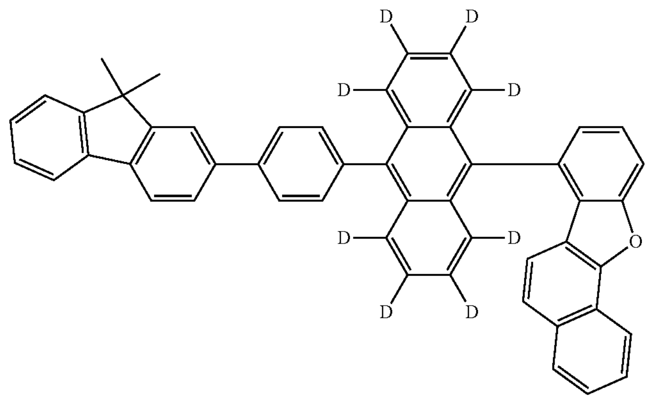
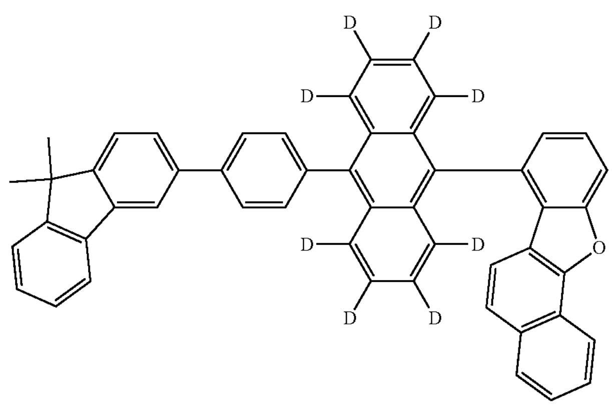
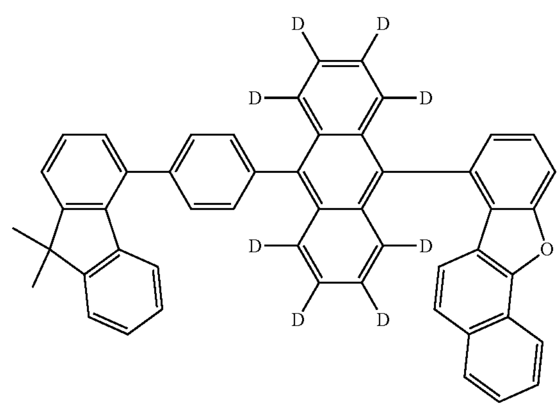
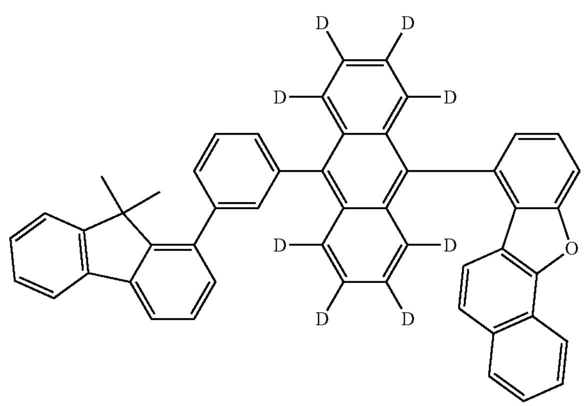
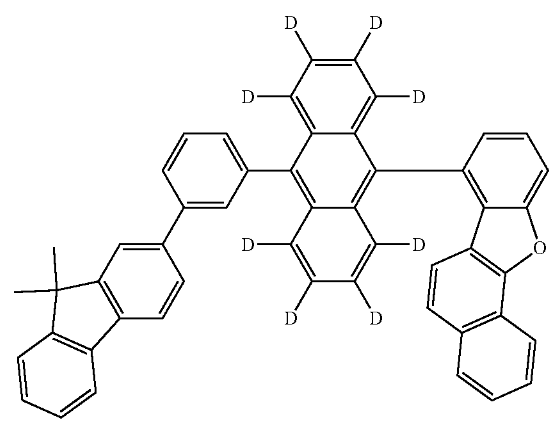

-continued
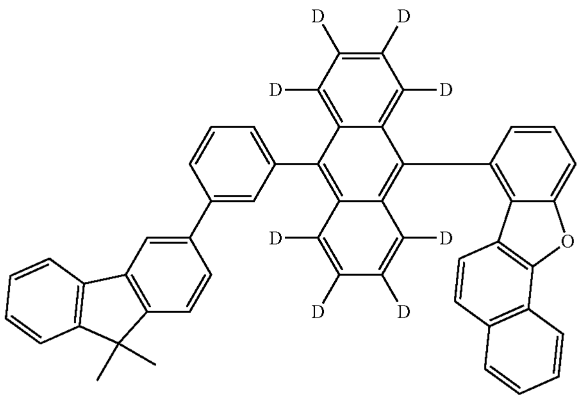
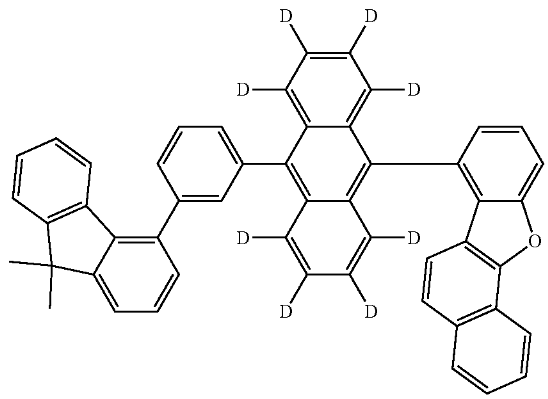
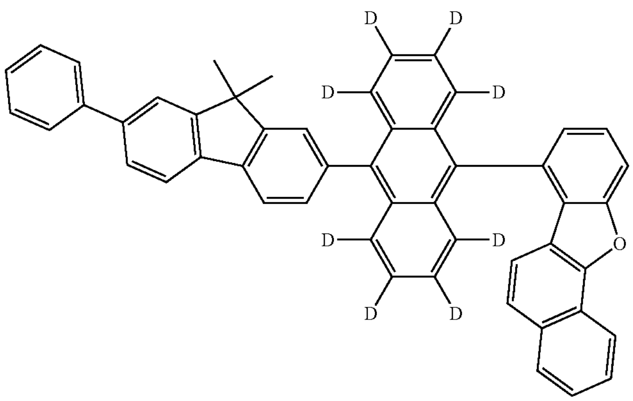
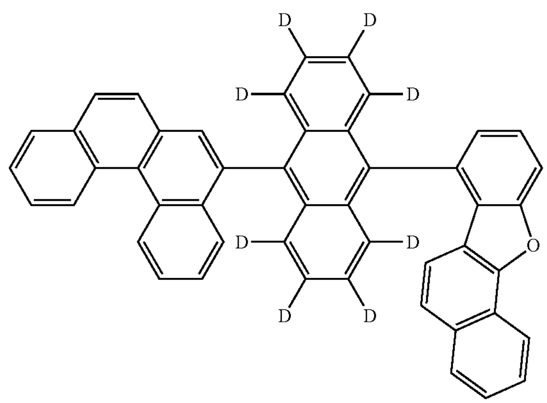
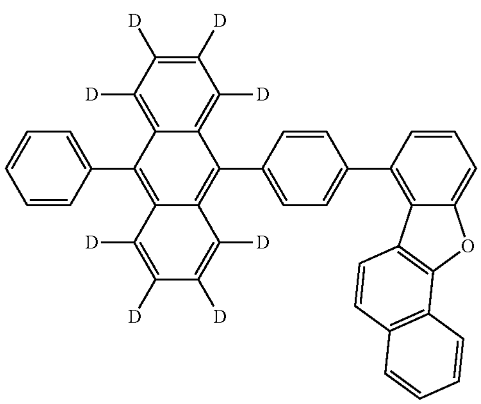
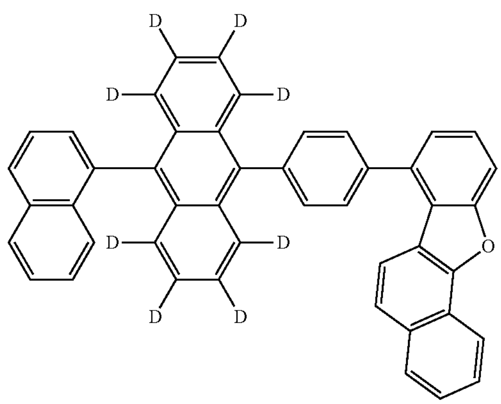
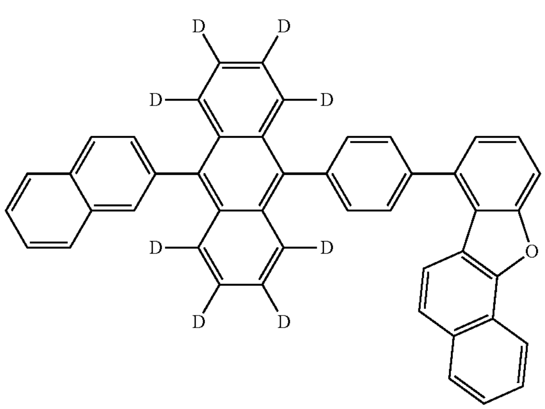
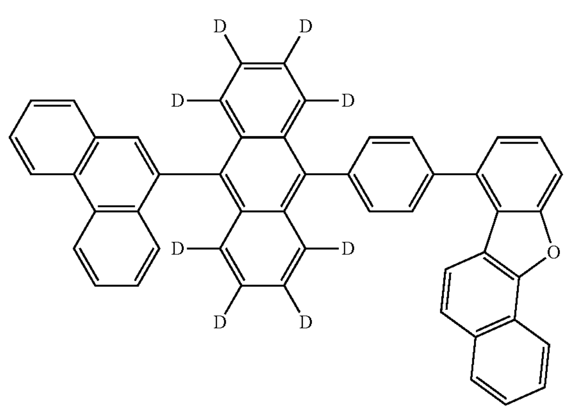

-continued
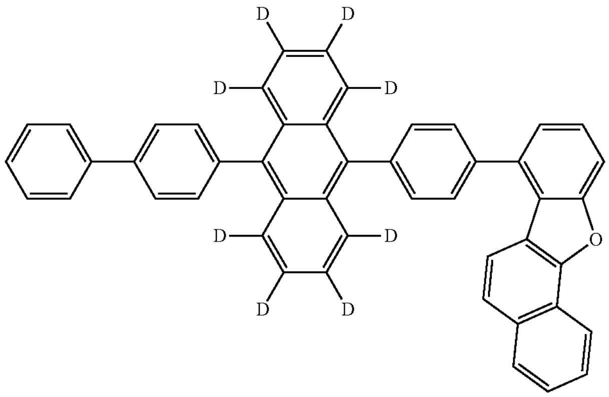
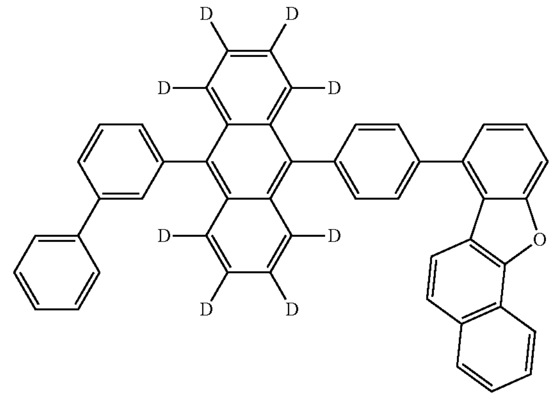
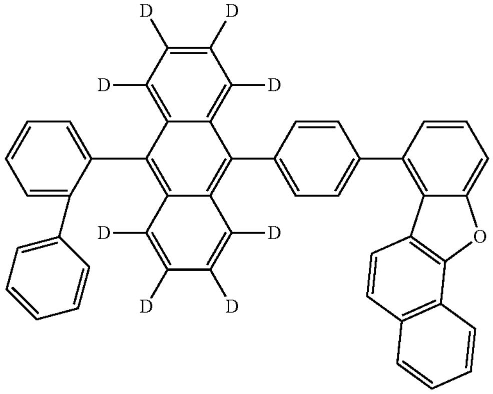
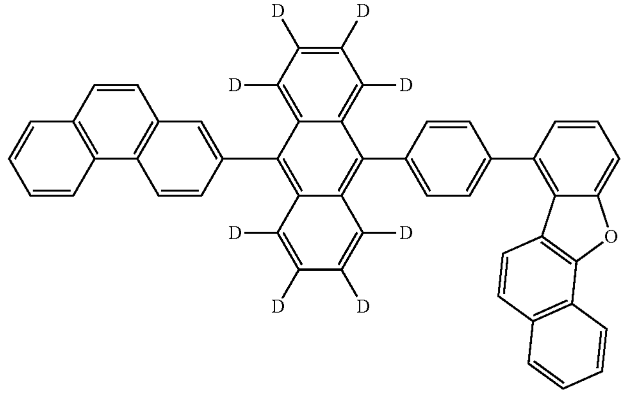
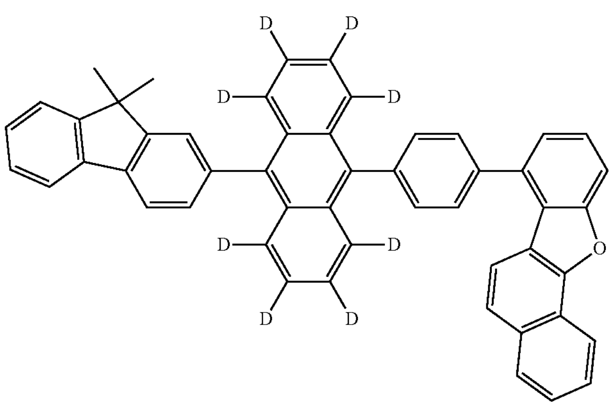
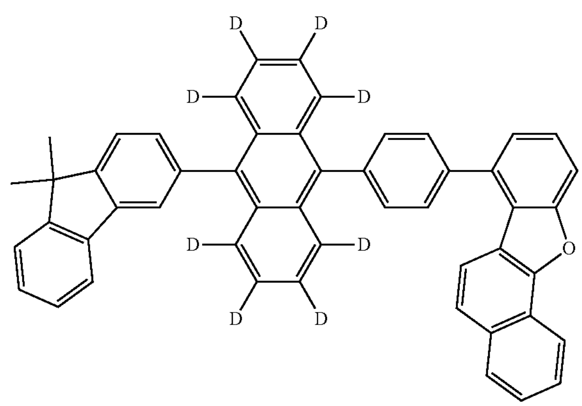
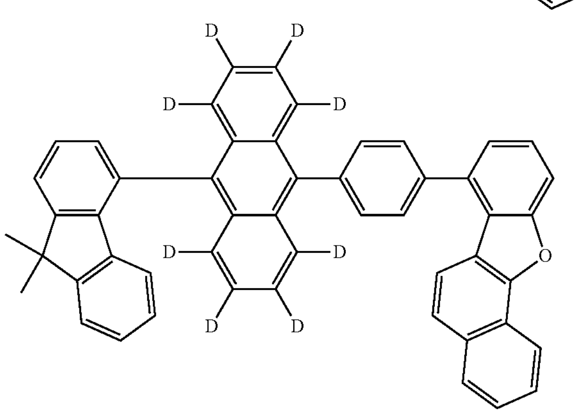
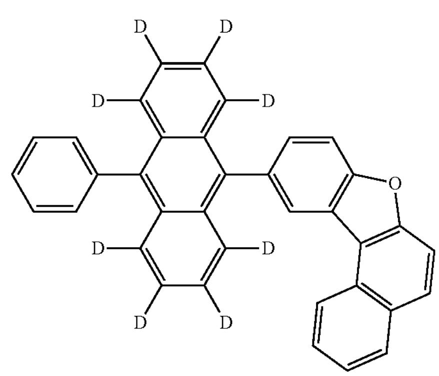

-continued
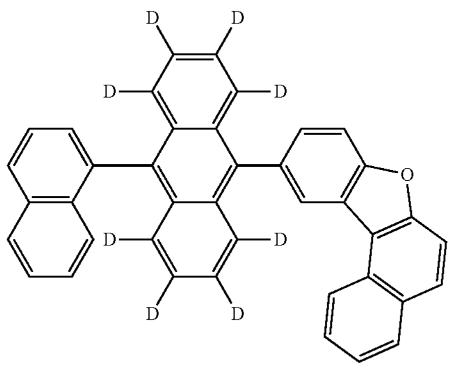
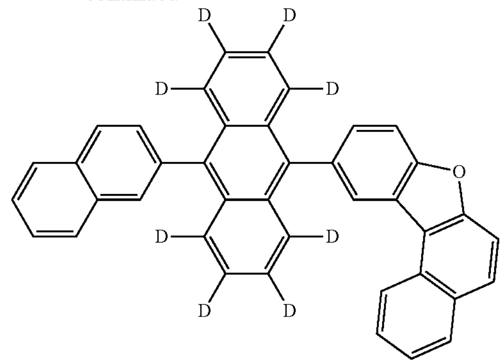
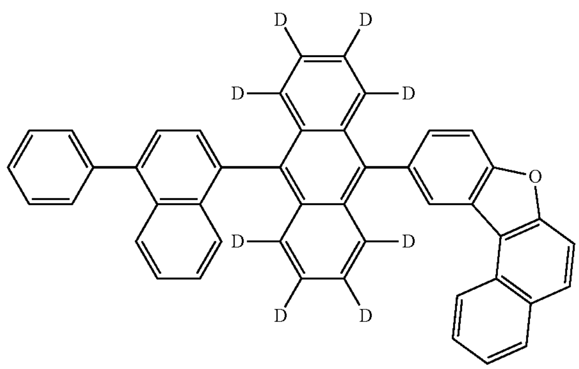
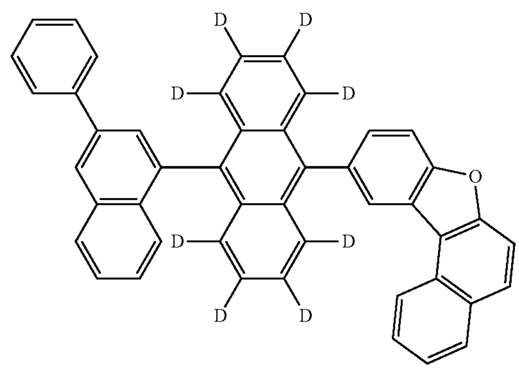
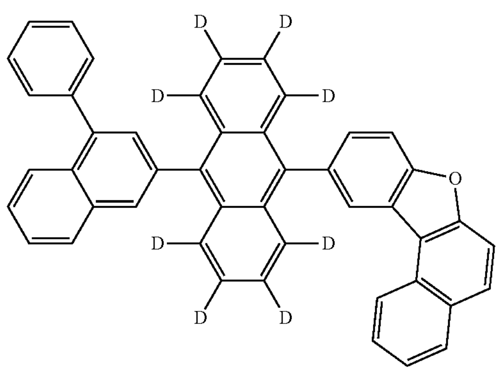
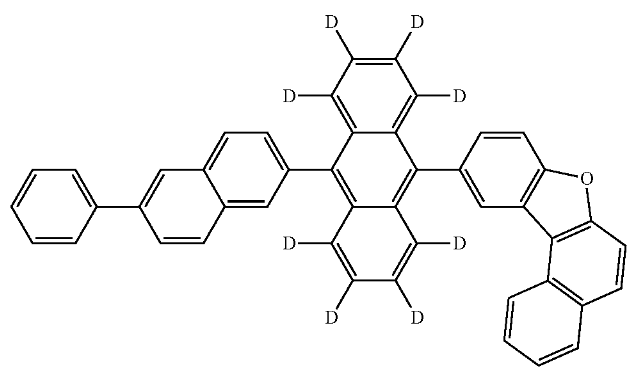
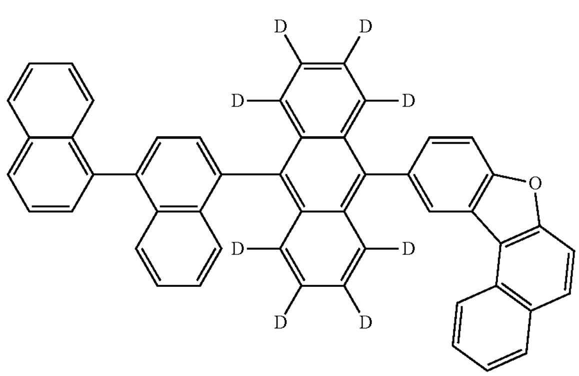

-continued
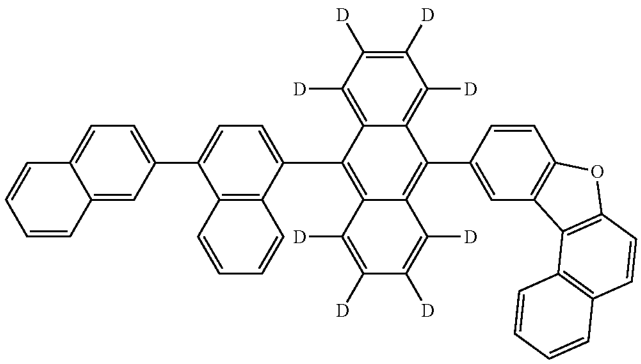
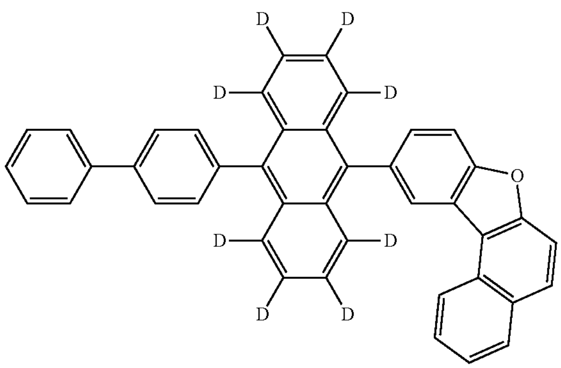
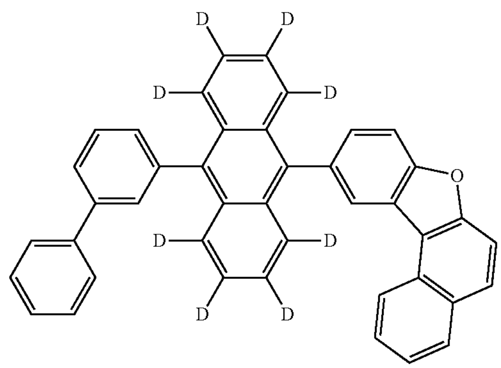
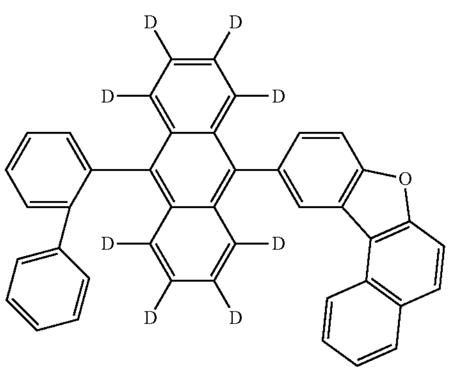
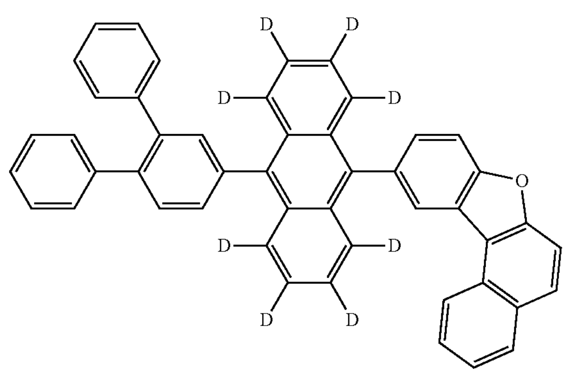
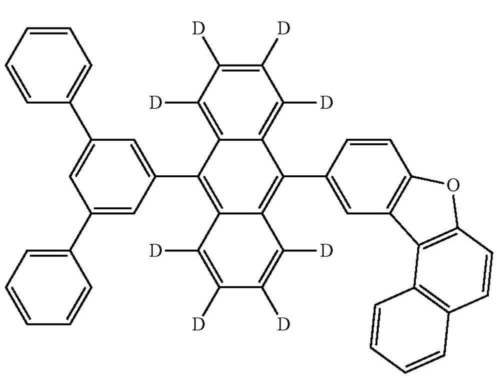
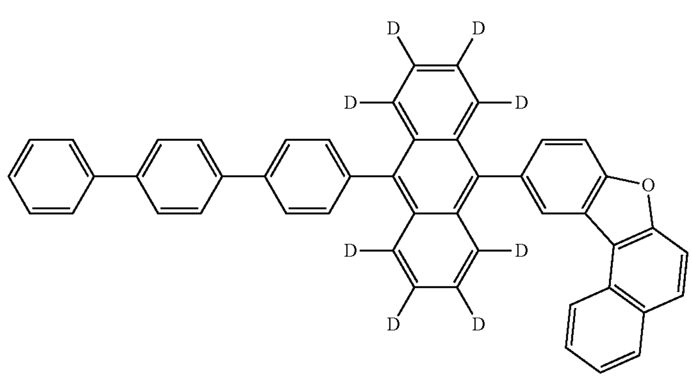

-continued
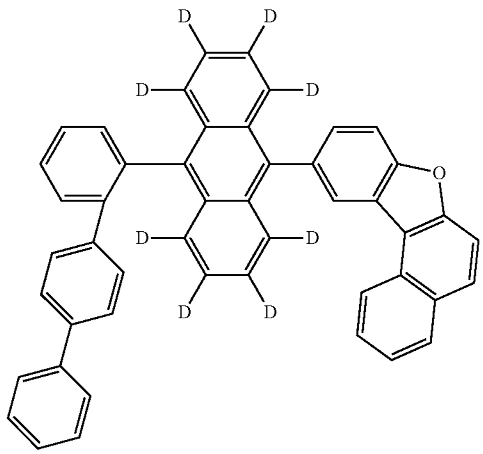
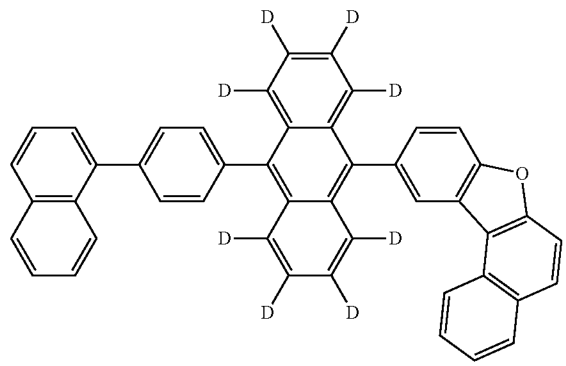
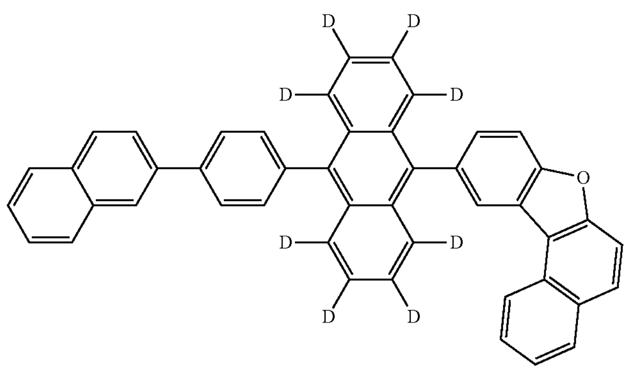
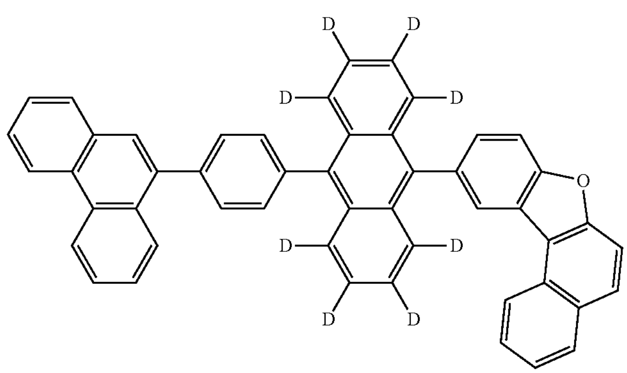
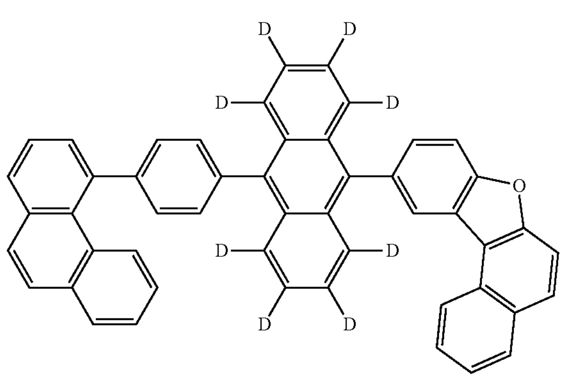

-continued
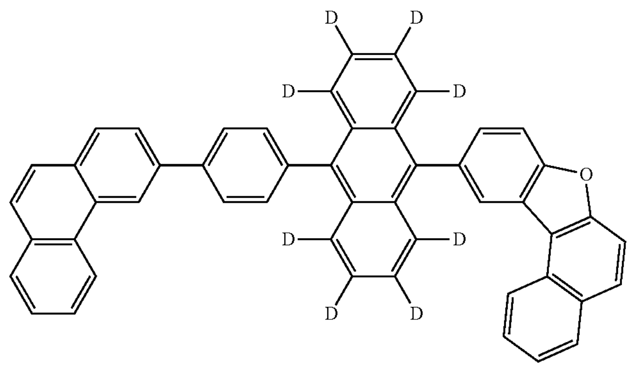
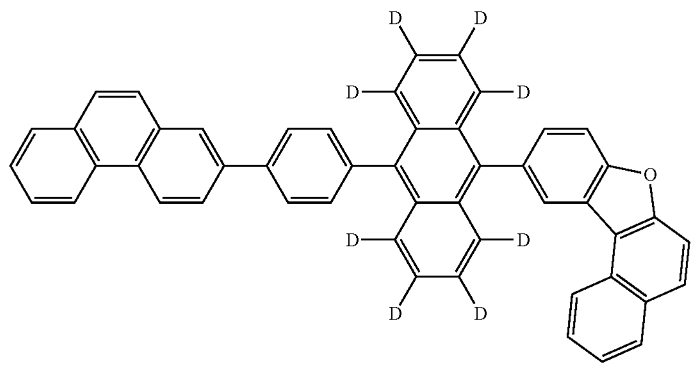
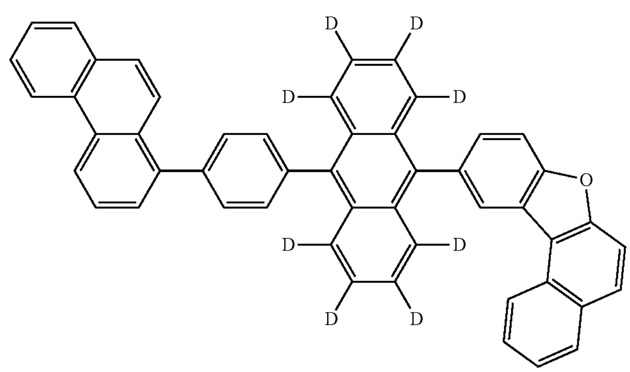
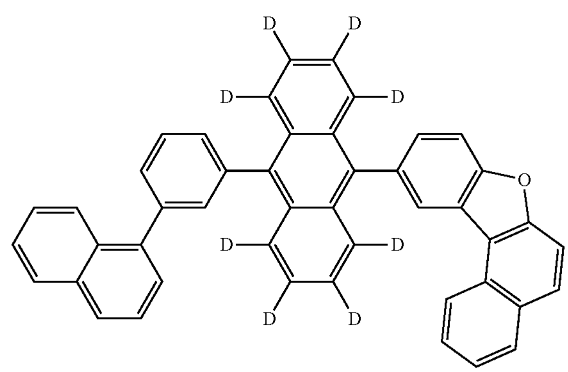
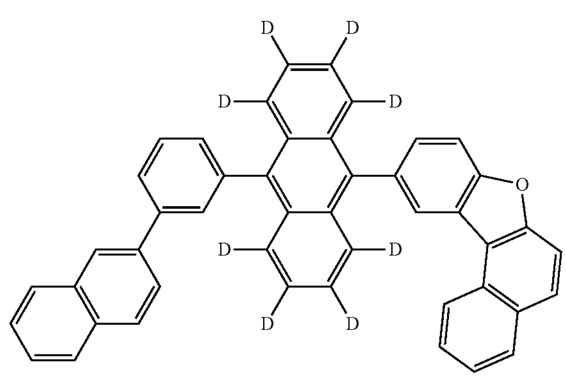
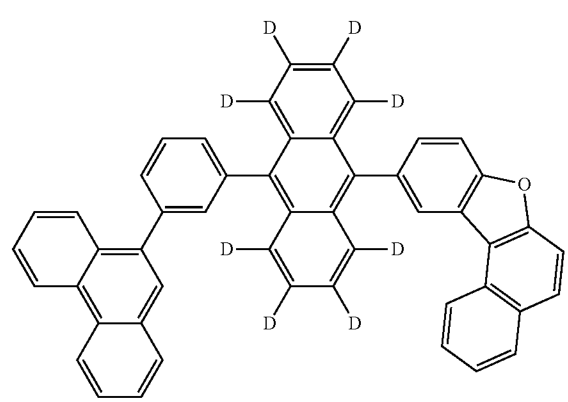

-continued
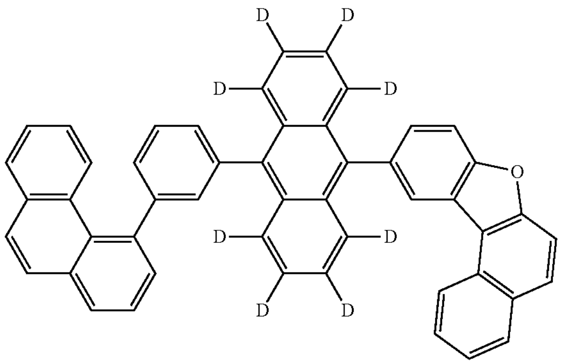
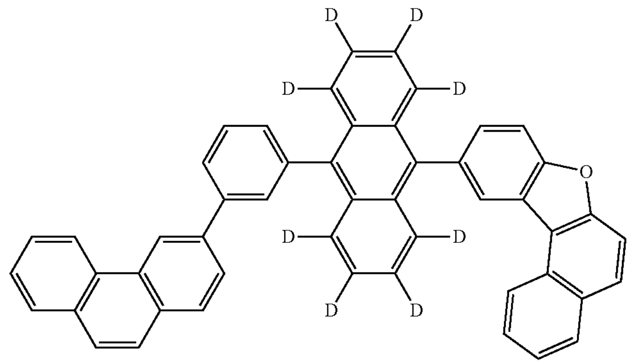
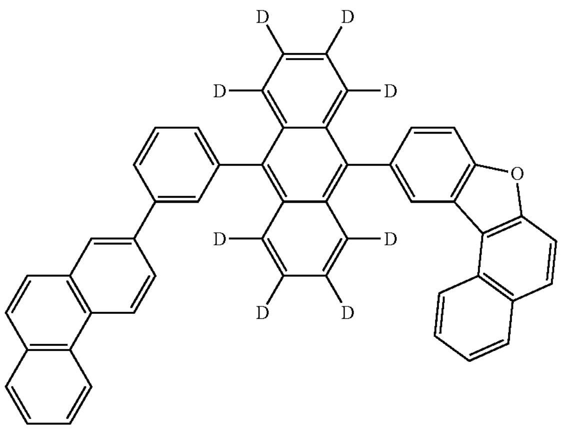
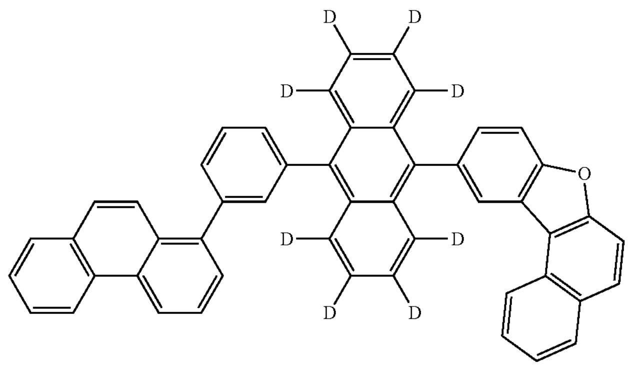
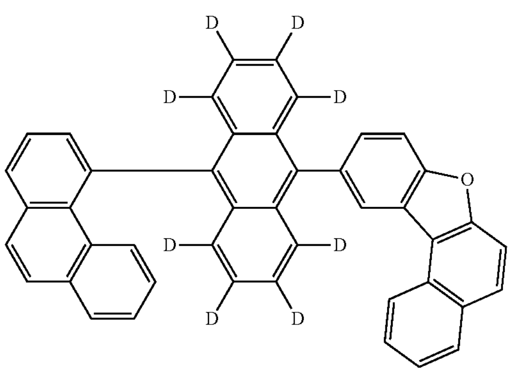
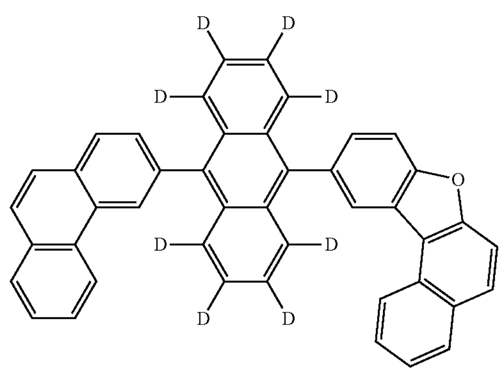
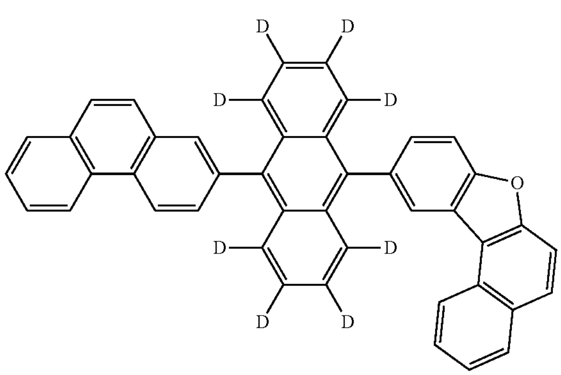
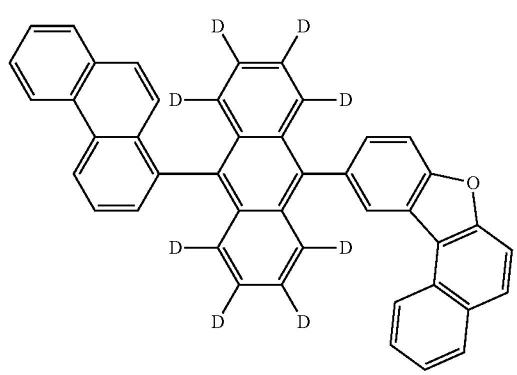

-continued
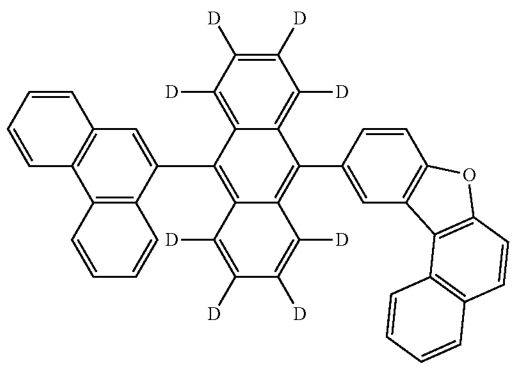
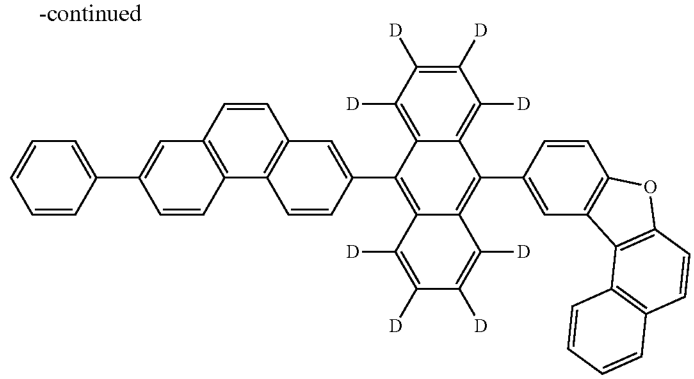
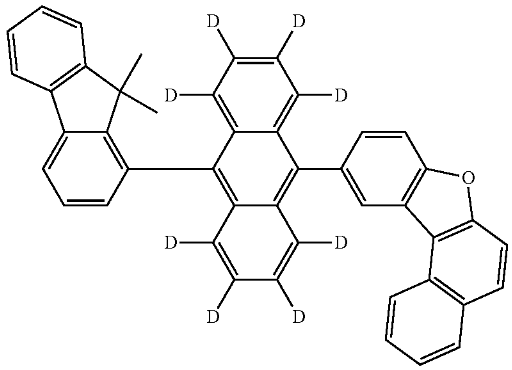
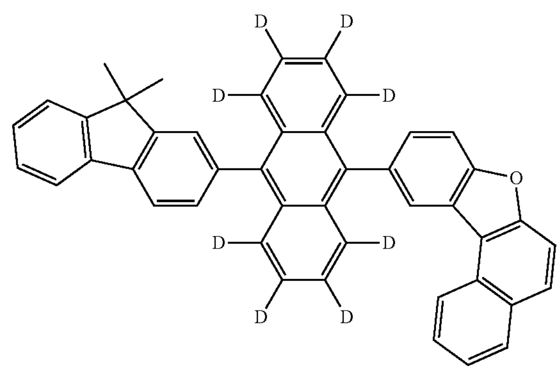
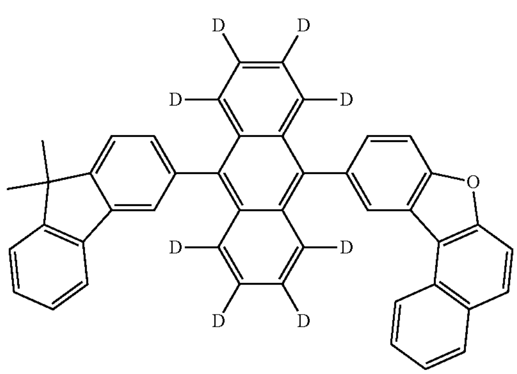
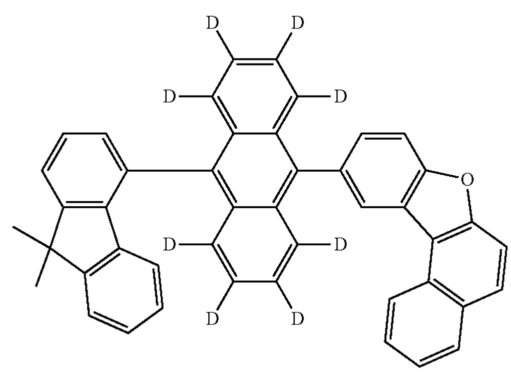
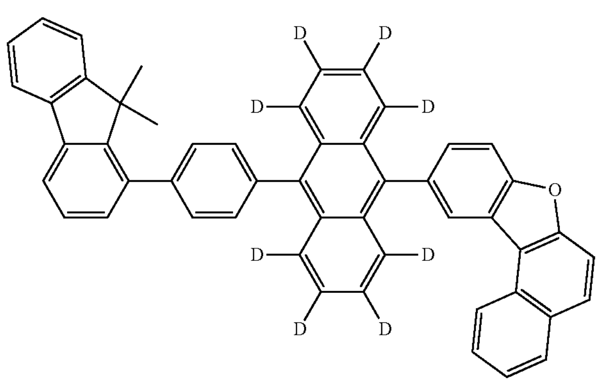

-continued
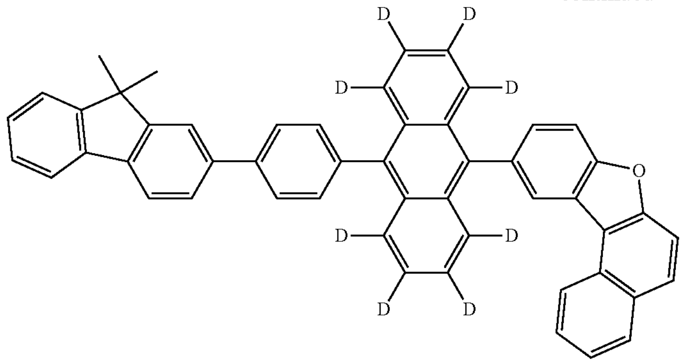
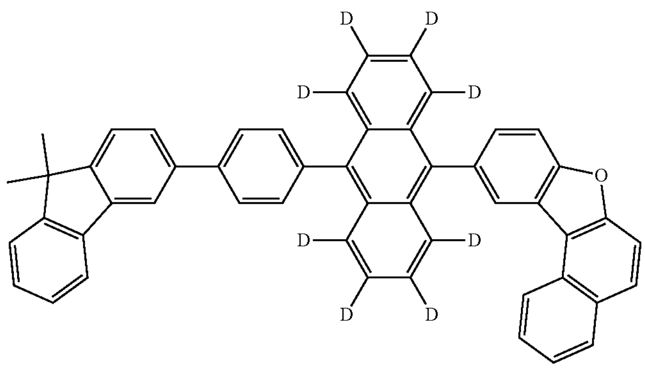
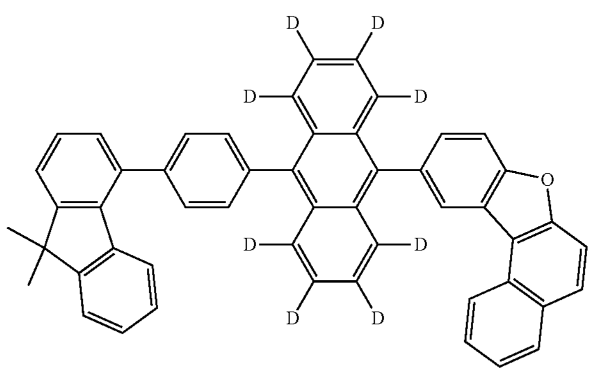
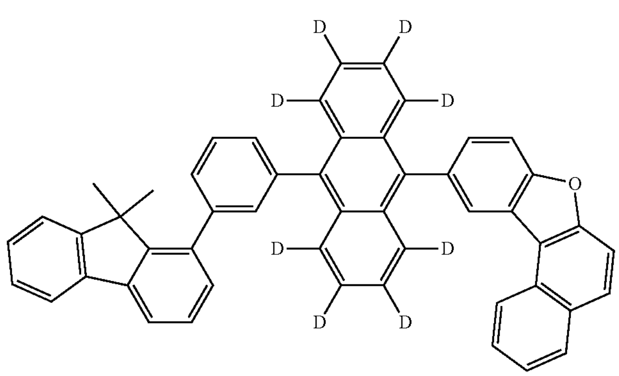
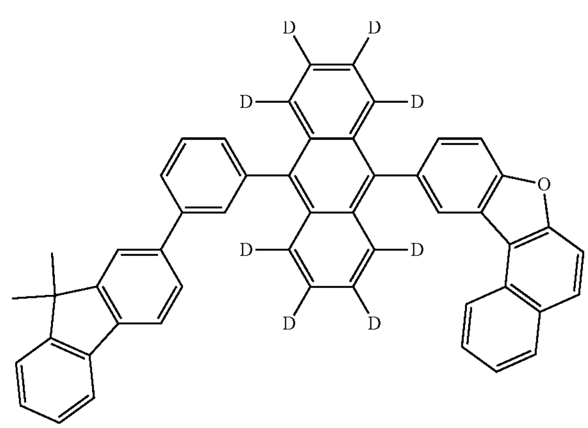

-continued
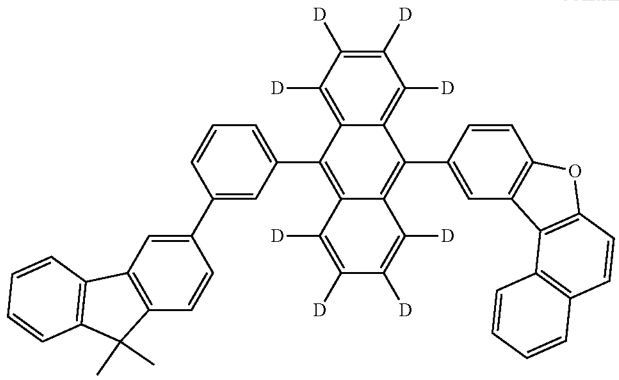
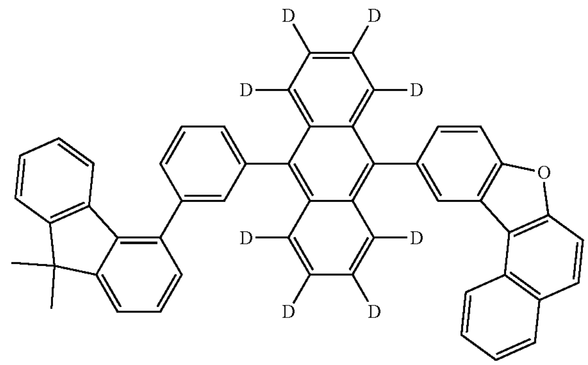
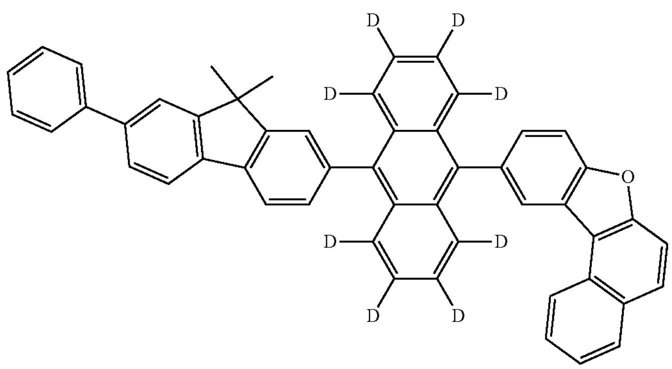
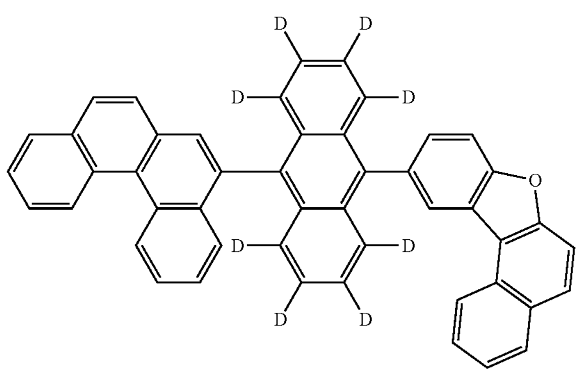
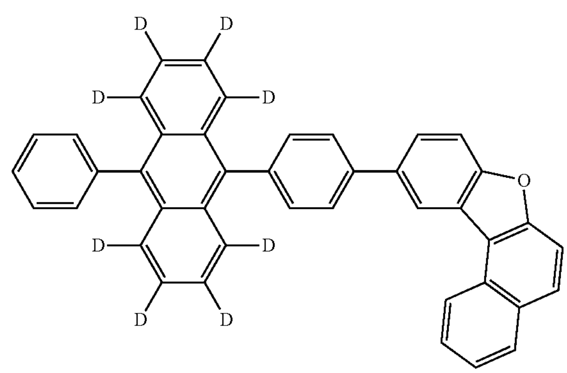
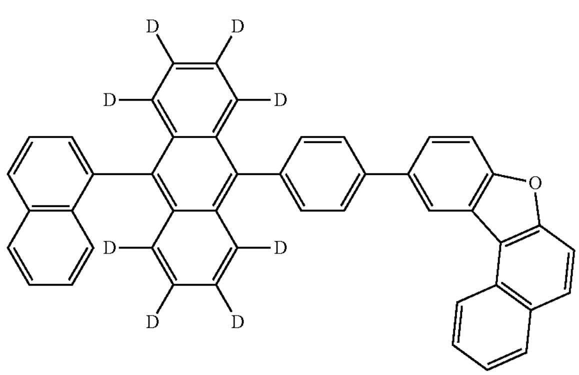

-continued
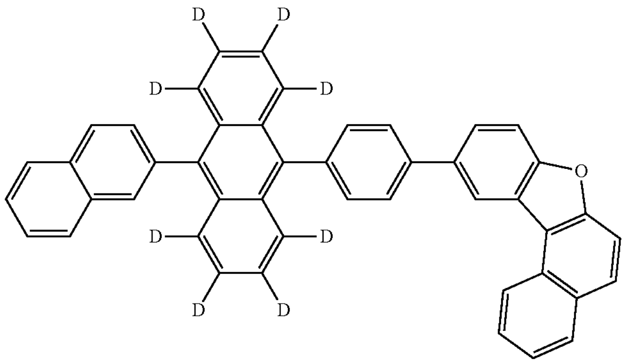
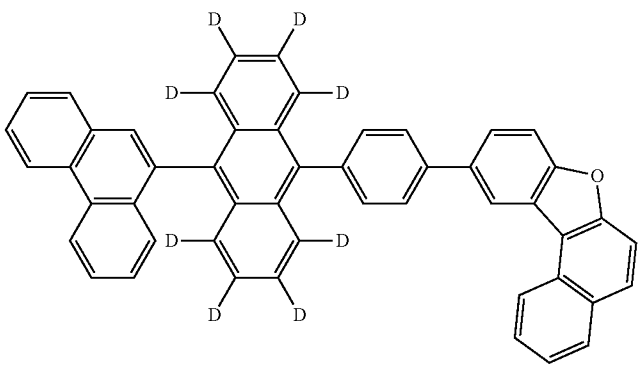
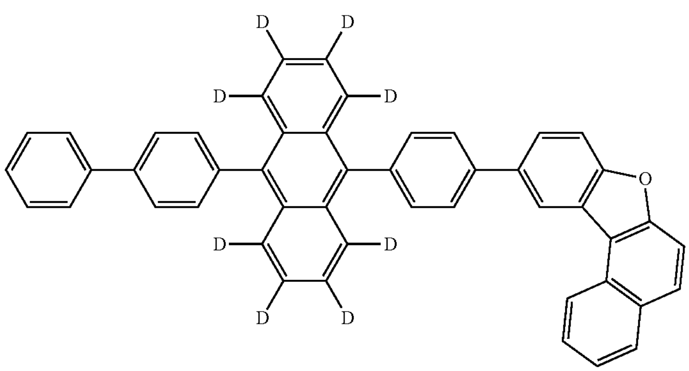
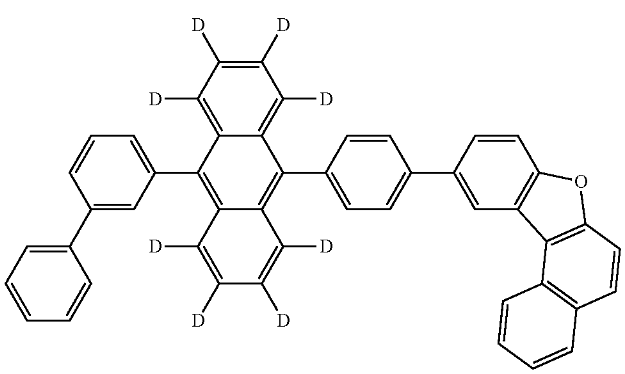
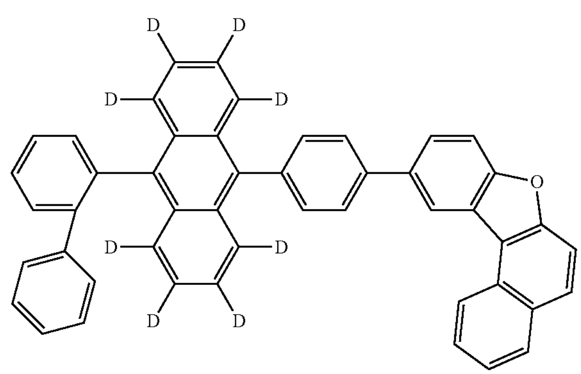

-continued
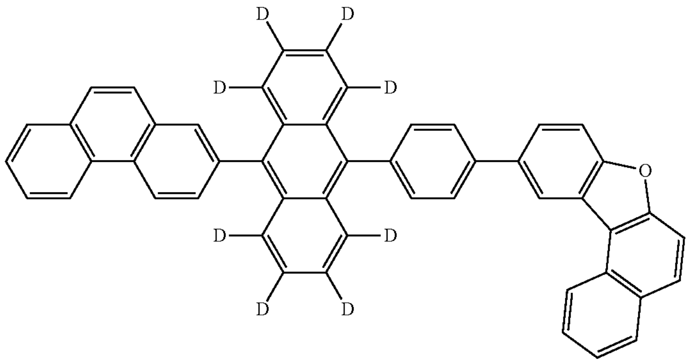
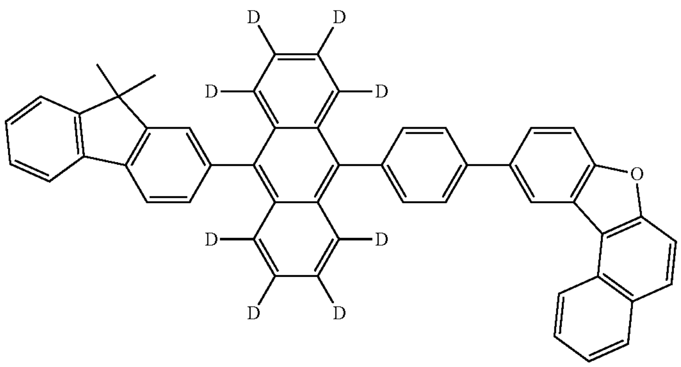
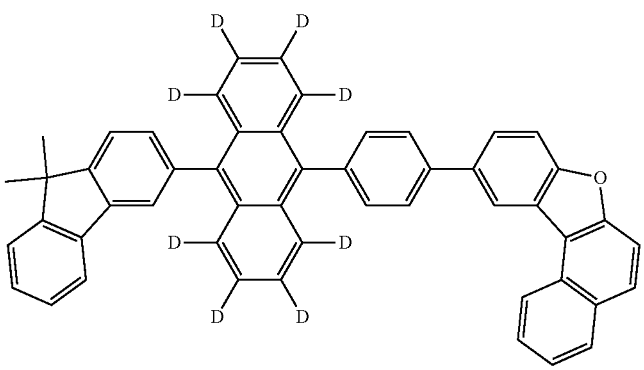
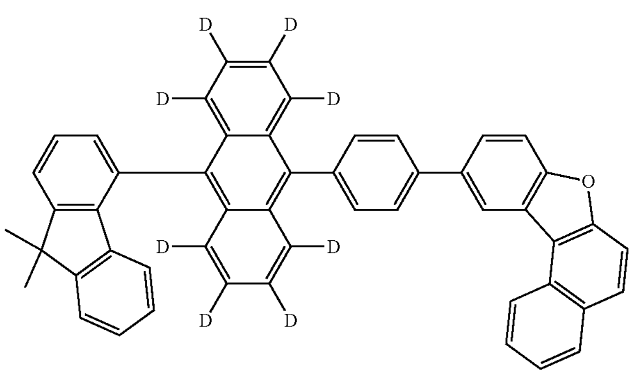

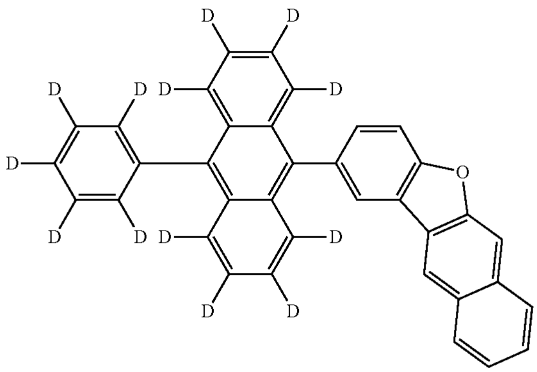
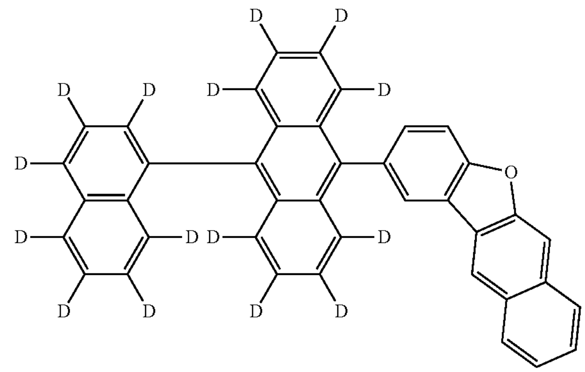
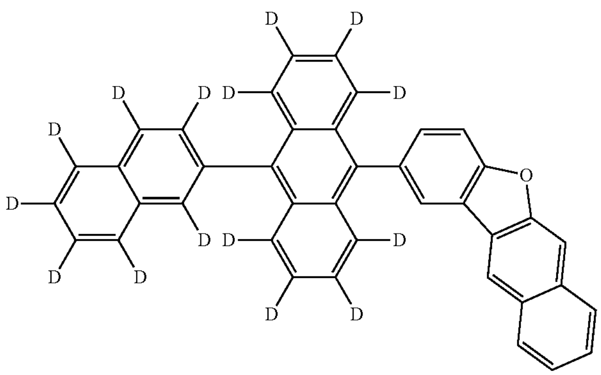
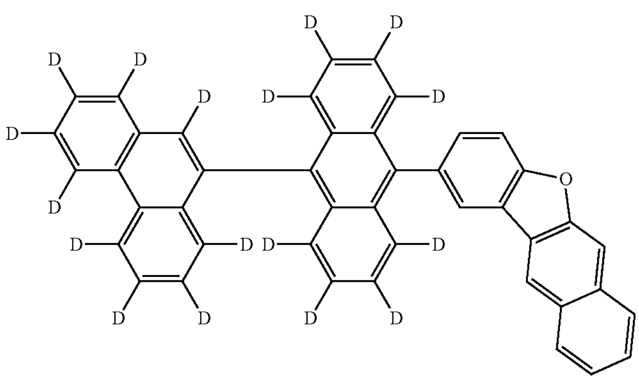
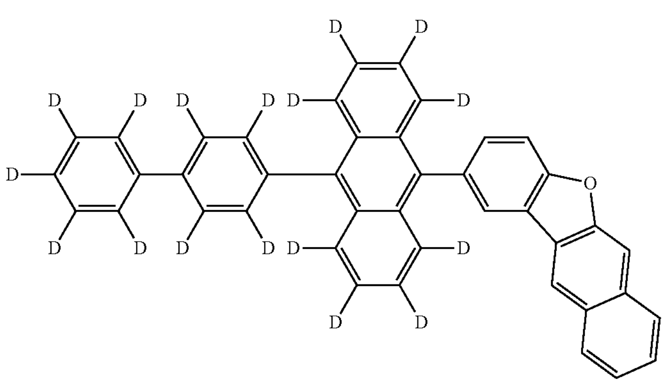

-continued
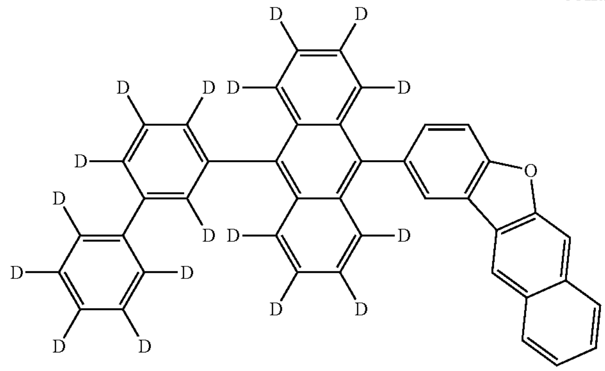
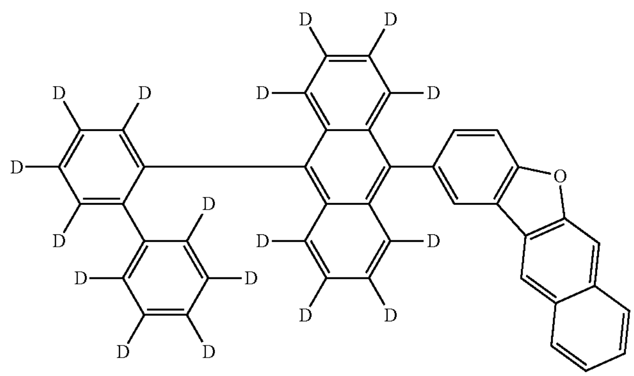
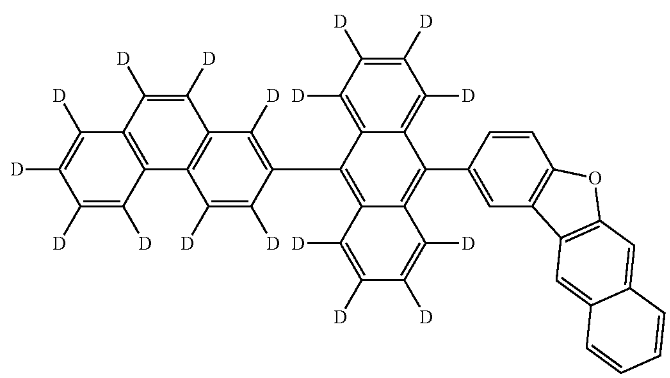
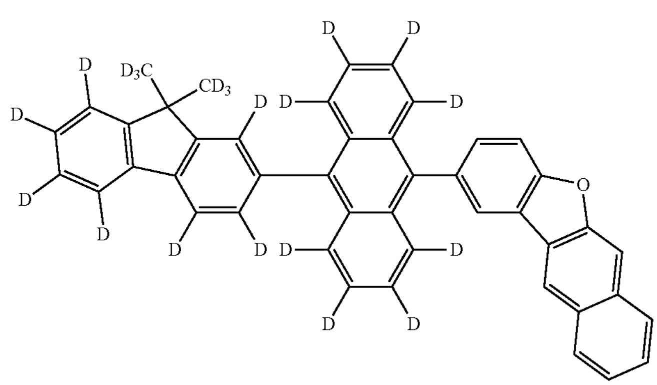

-continued
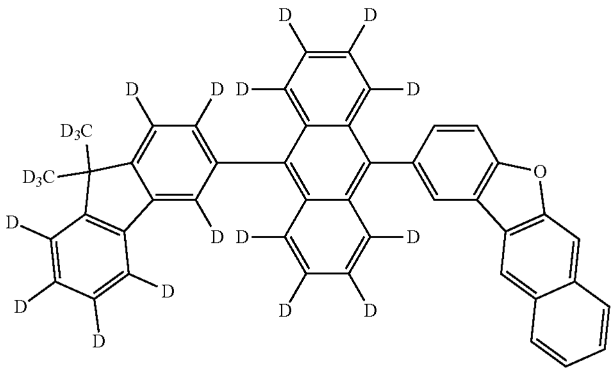
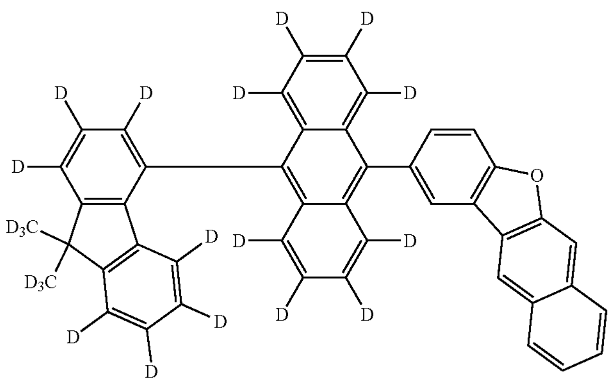
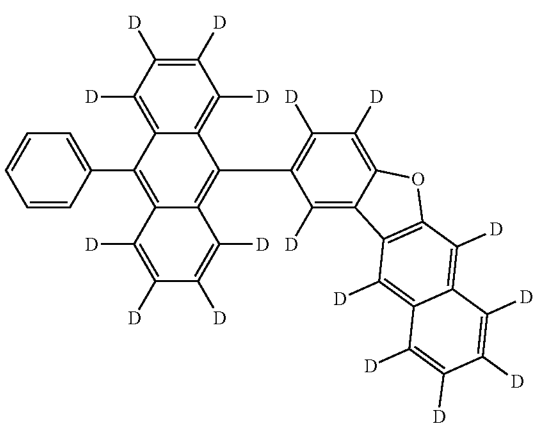
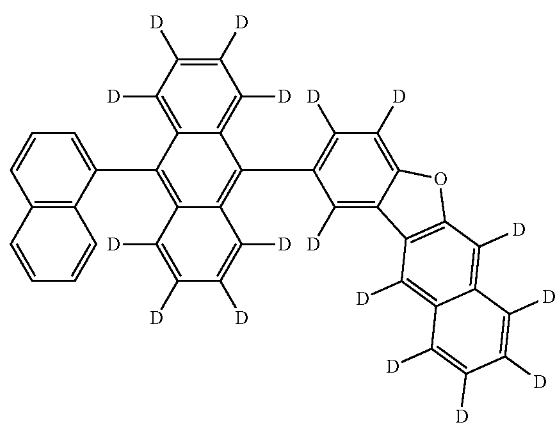
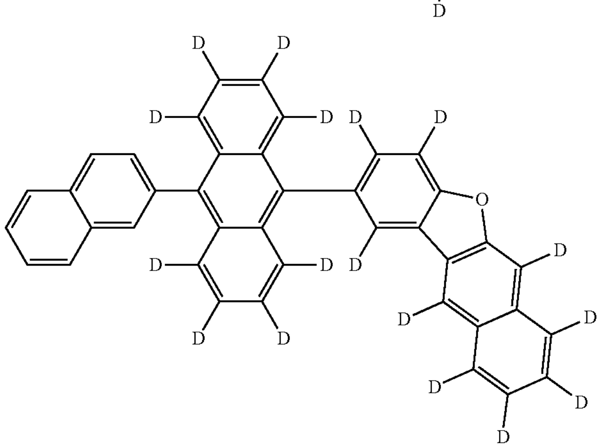

-continued
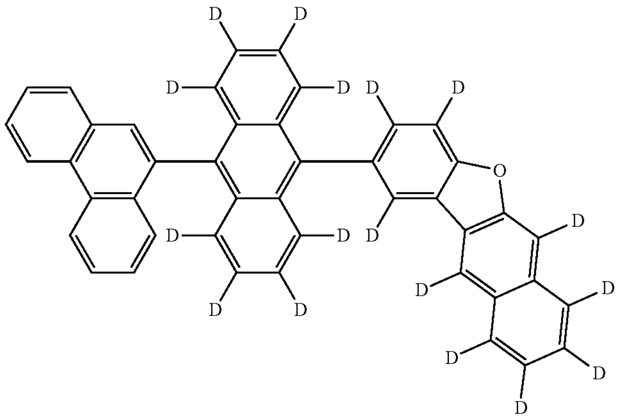
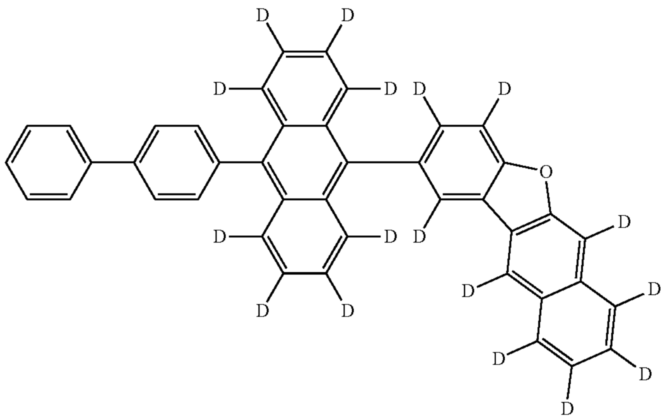
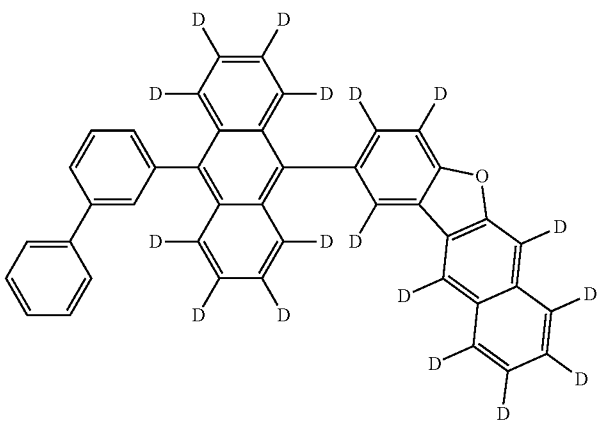
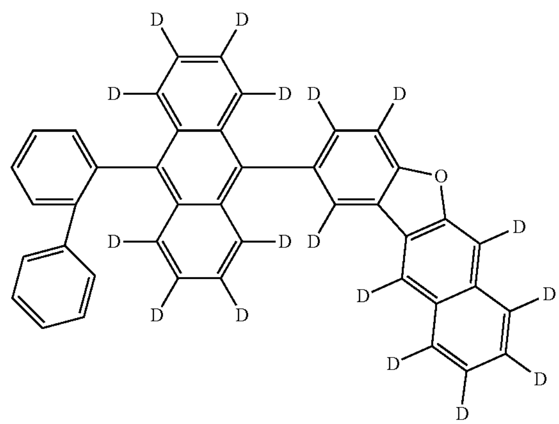
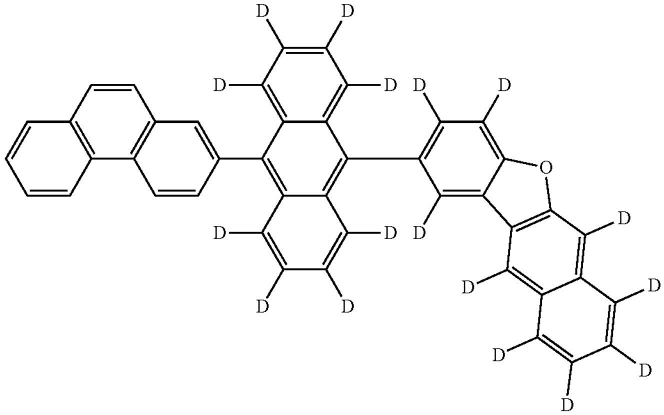

-continued
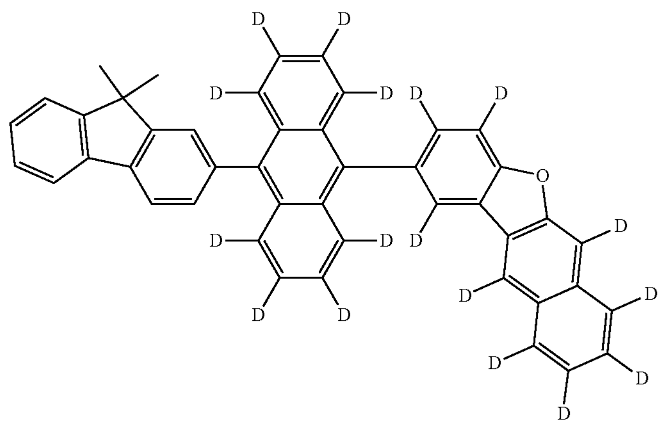
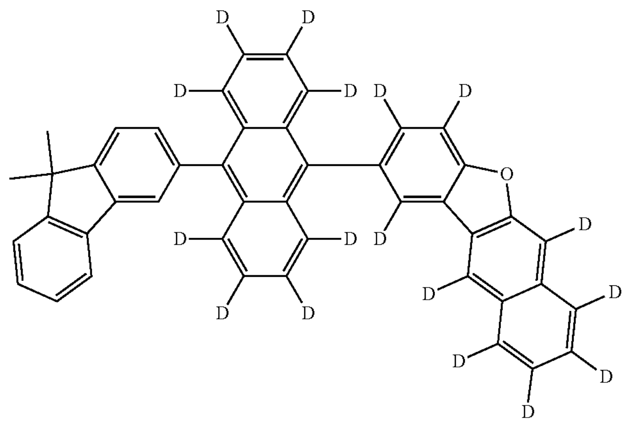
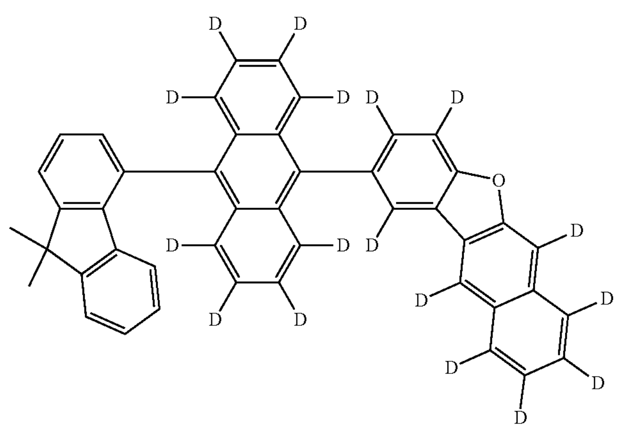
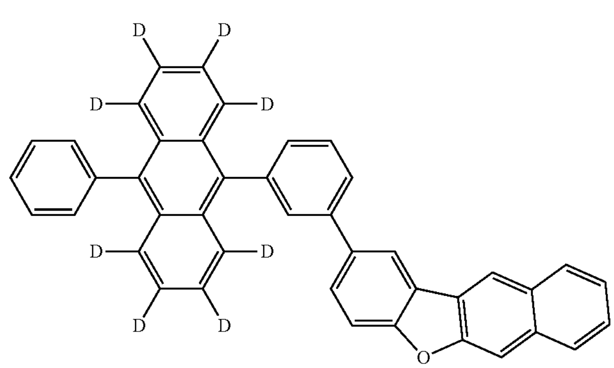

-continued
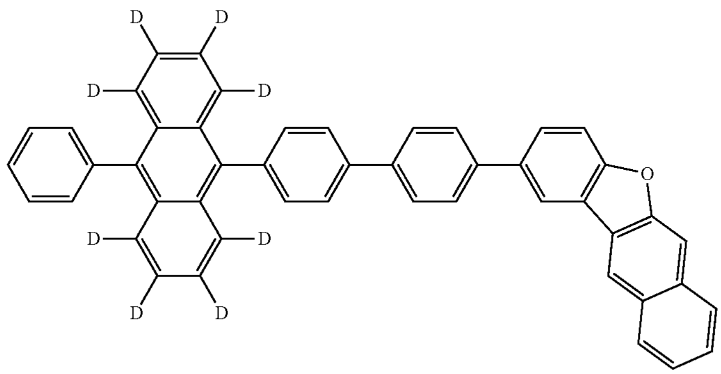
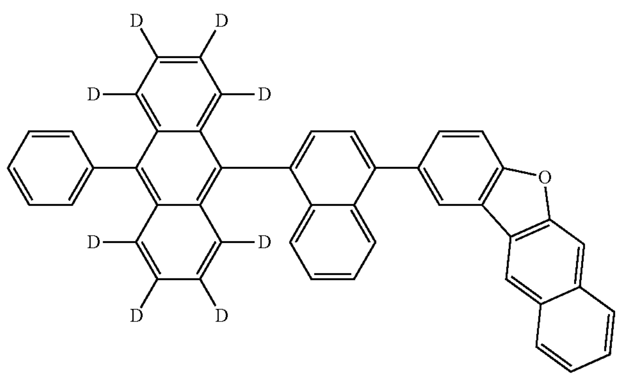
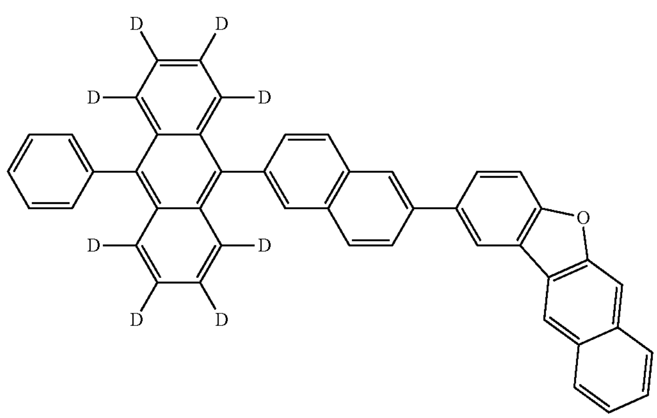
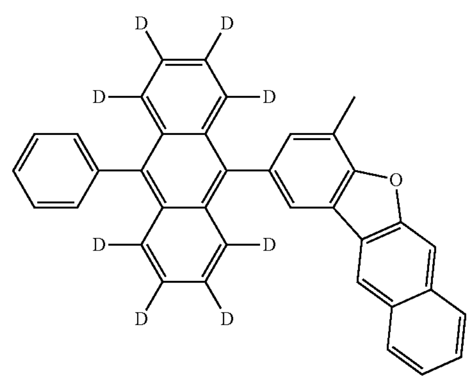
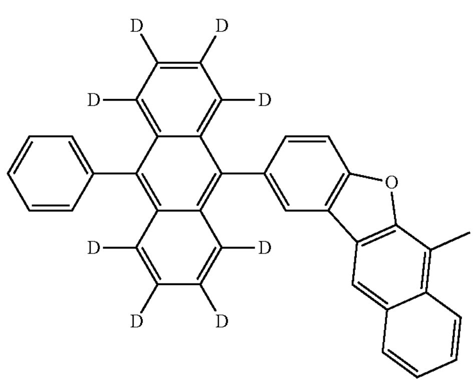
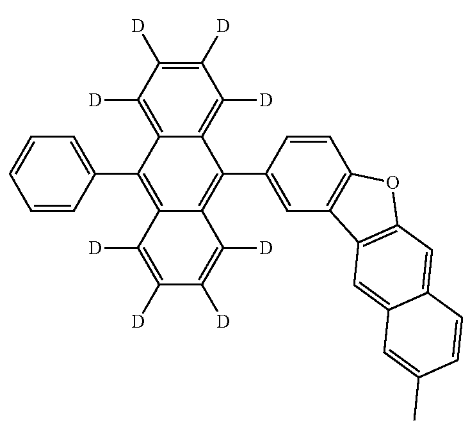

-continued
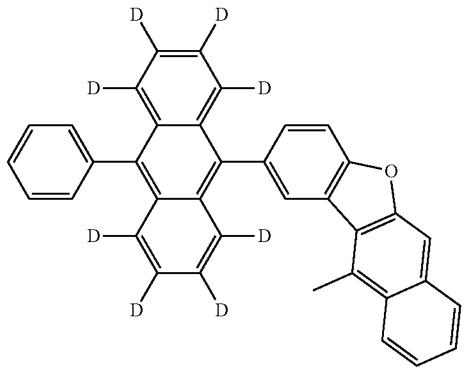
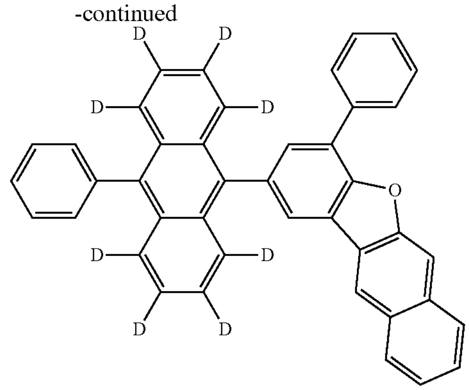
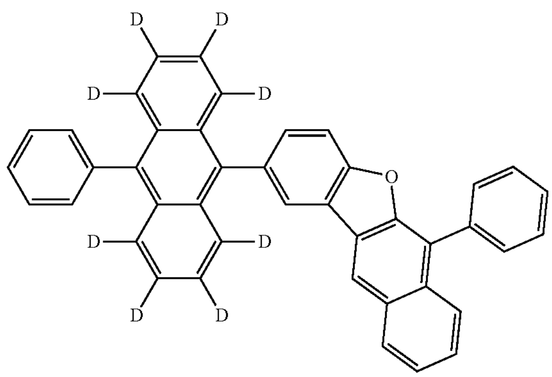
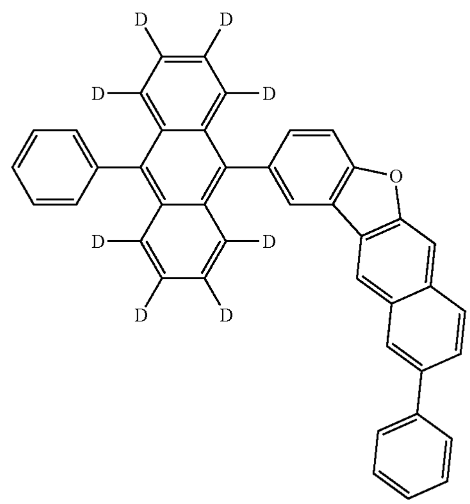
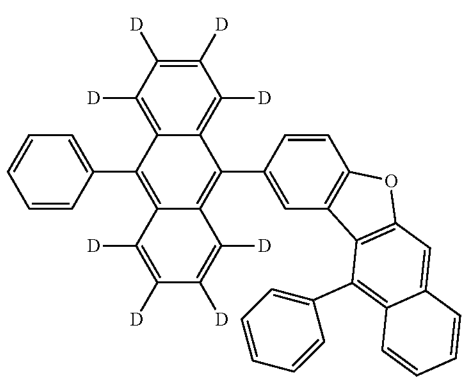
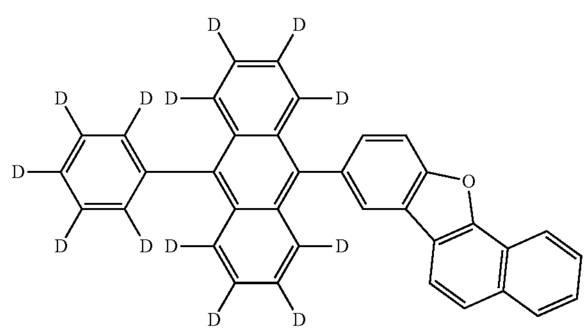
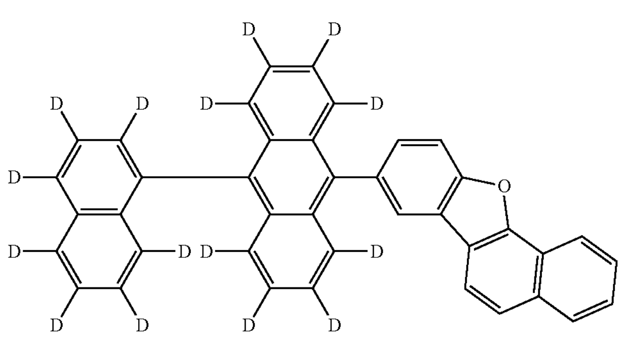

-continued
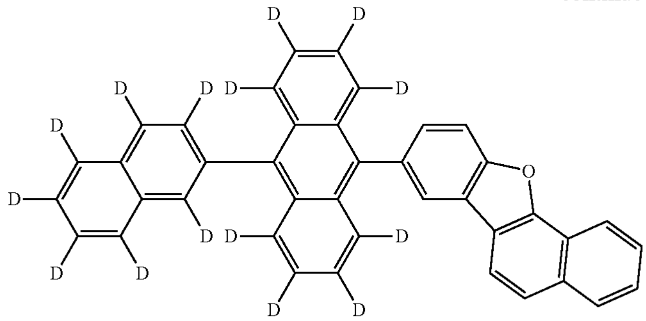
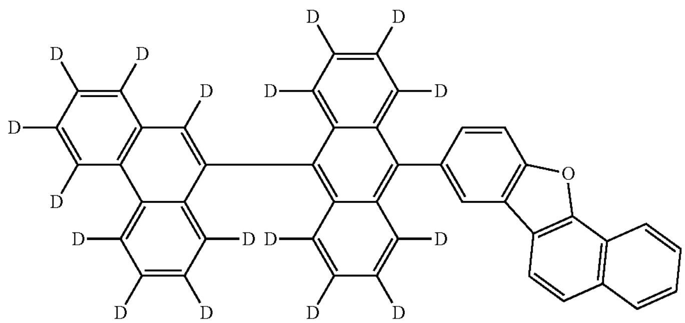
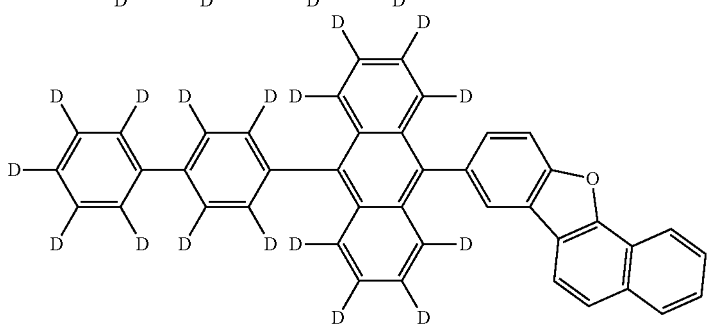
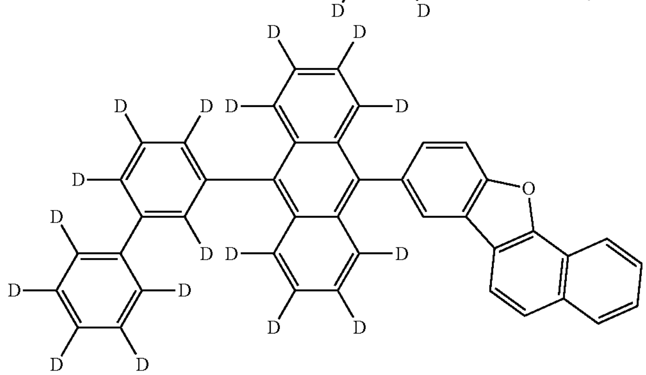
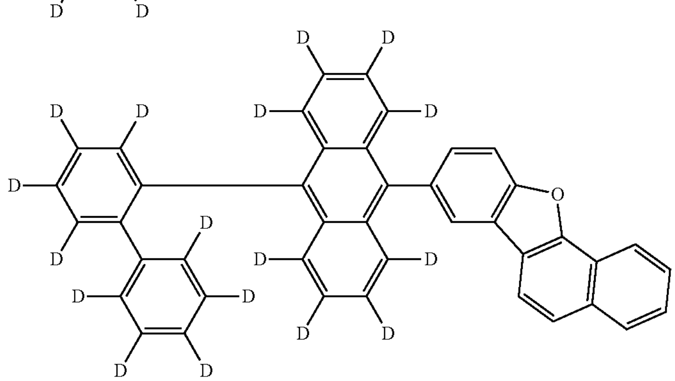

-continued
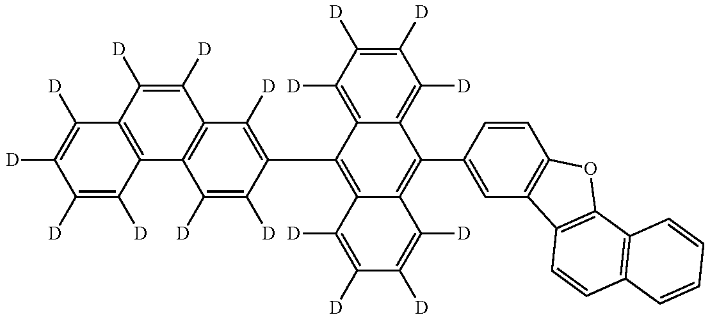
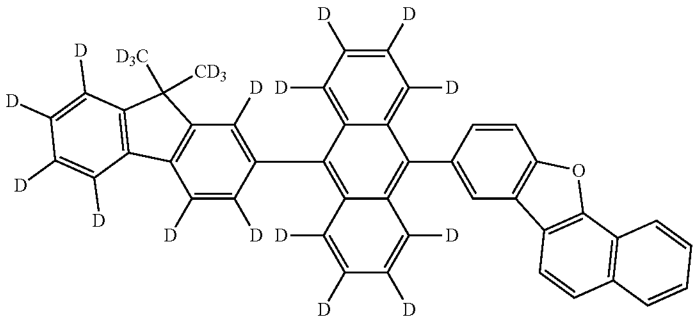
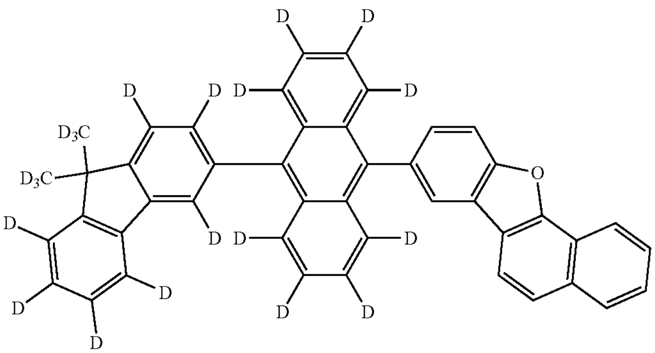
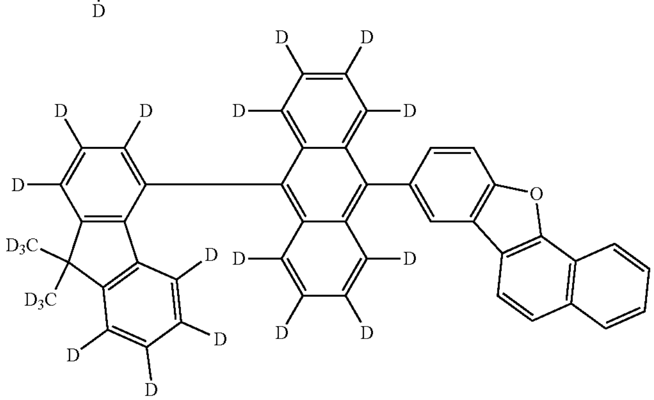
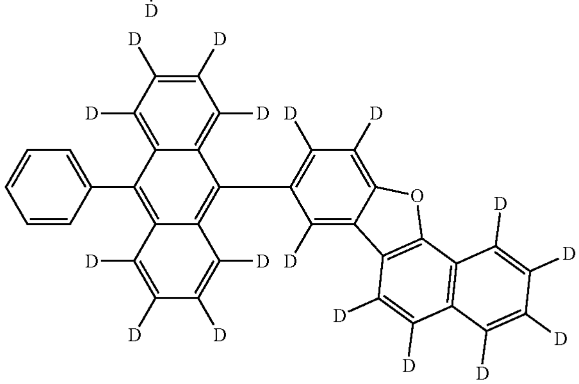
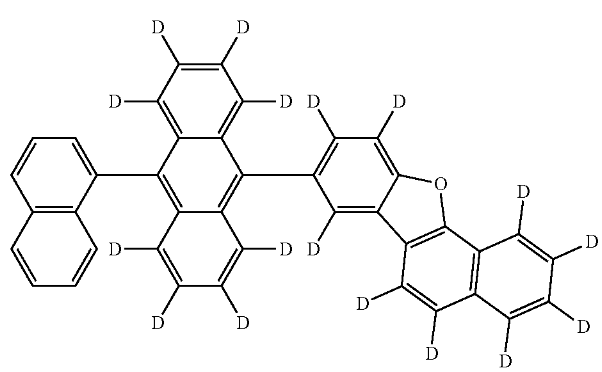

-continued
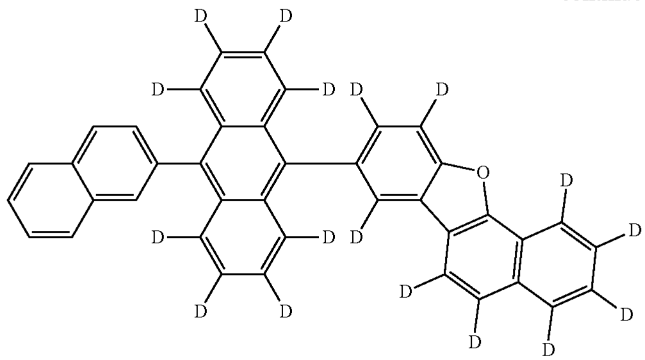
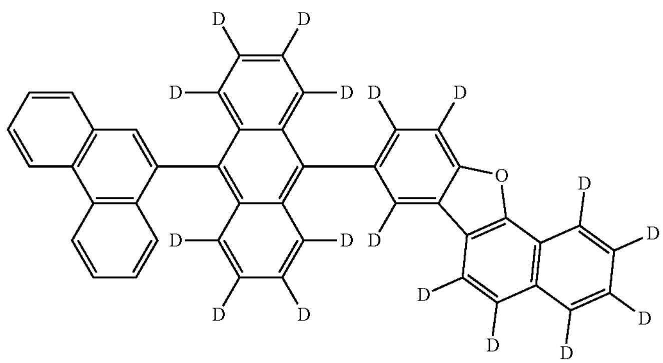
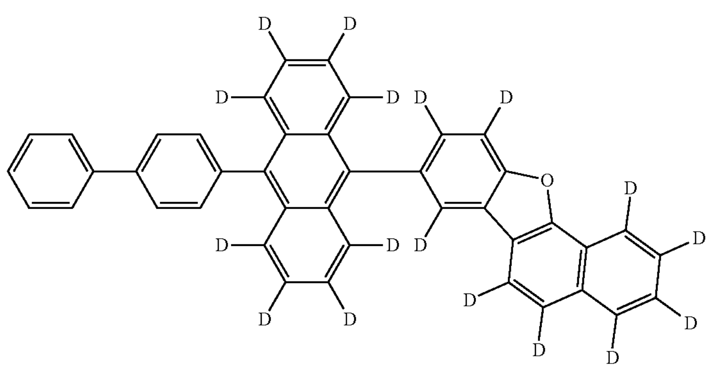
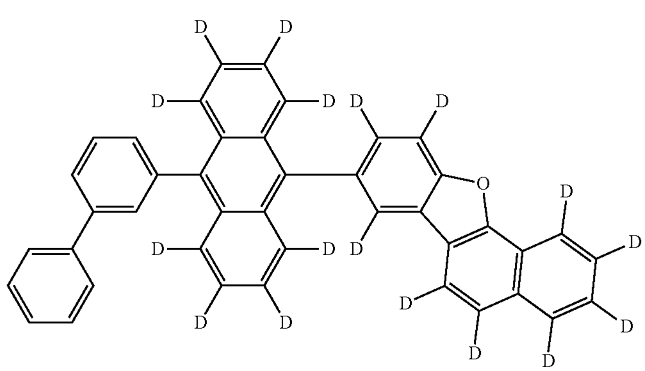

-continued
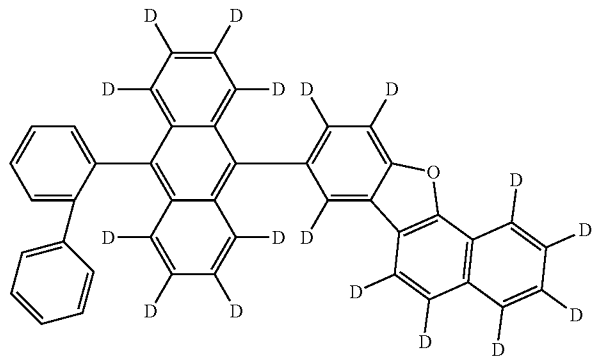
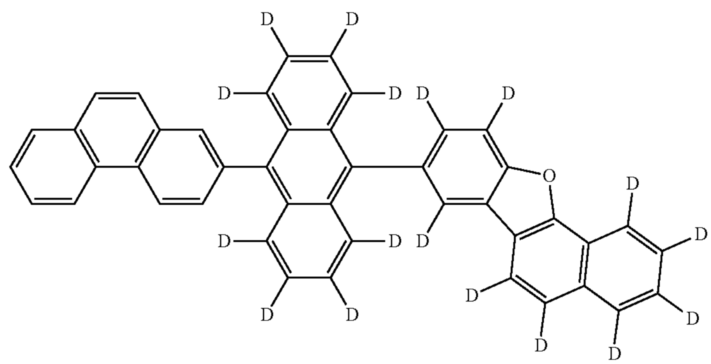
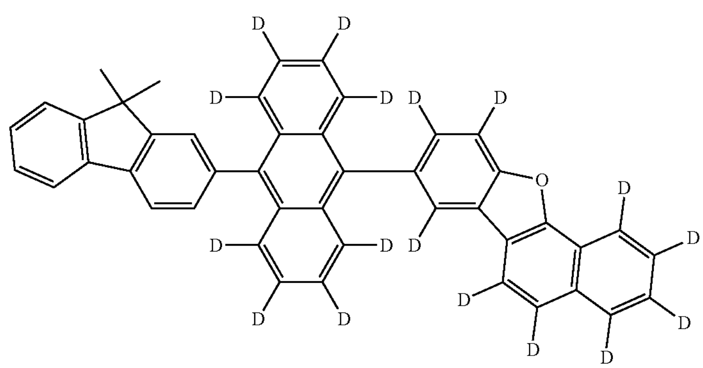
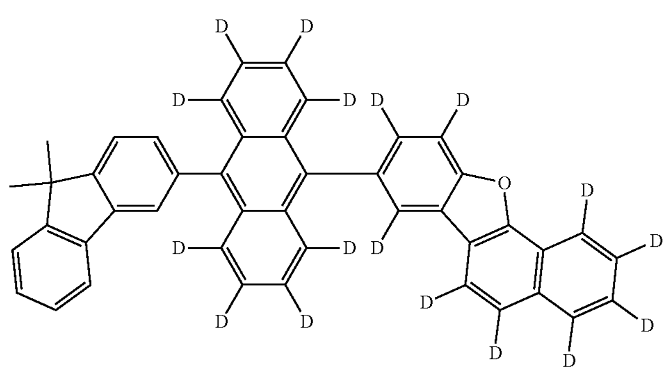

-continued
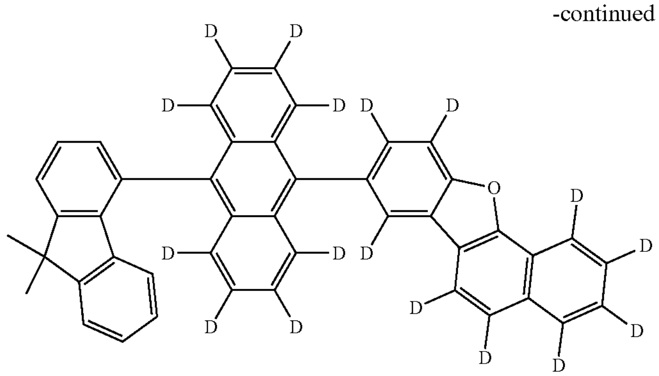
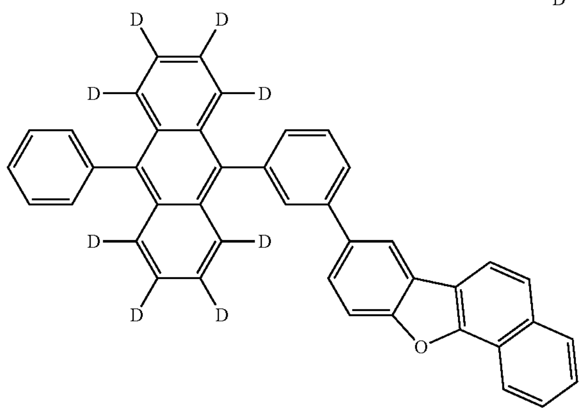
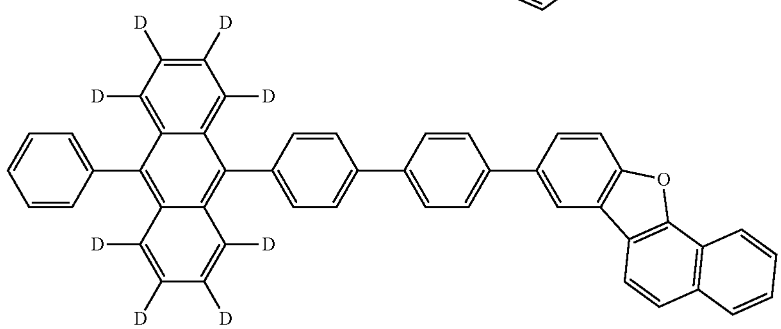
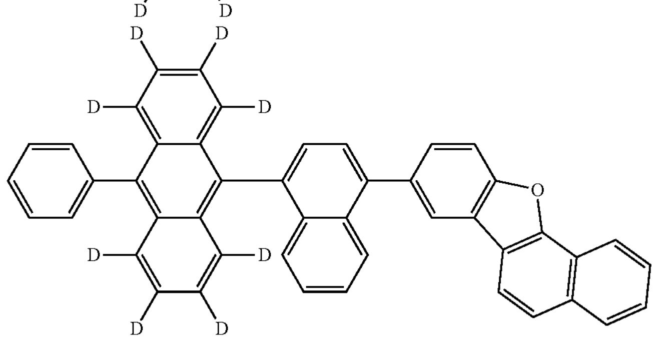
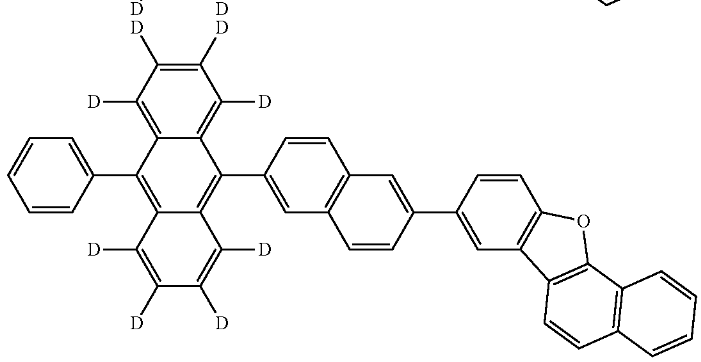

-continued
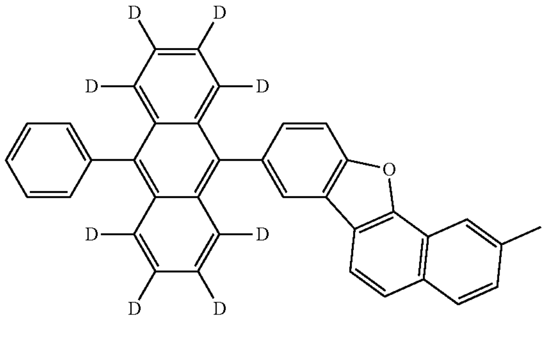
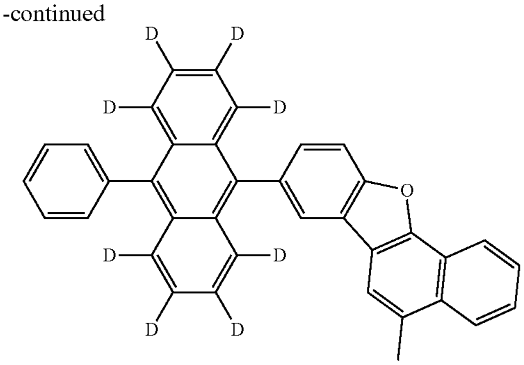
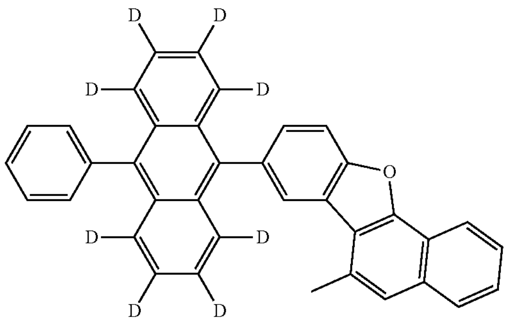
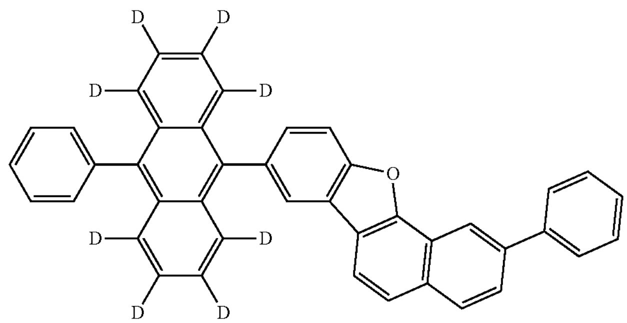
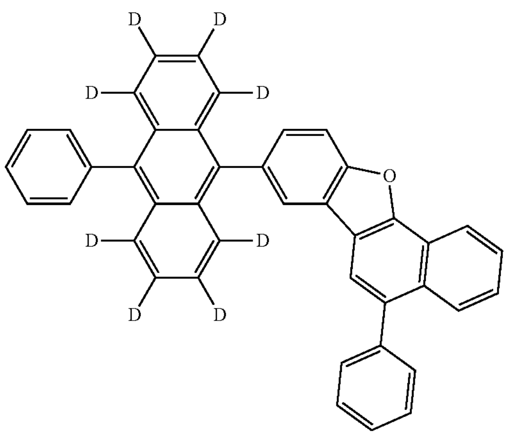
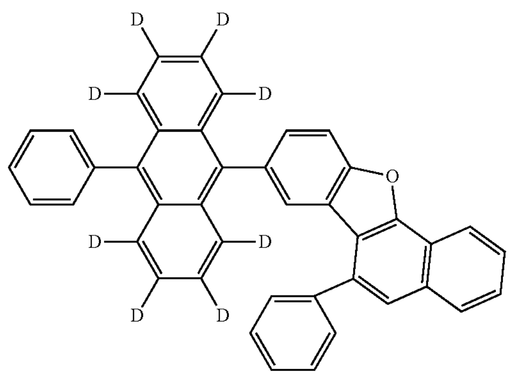
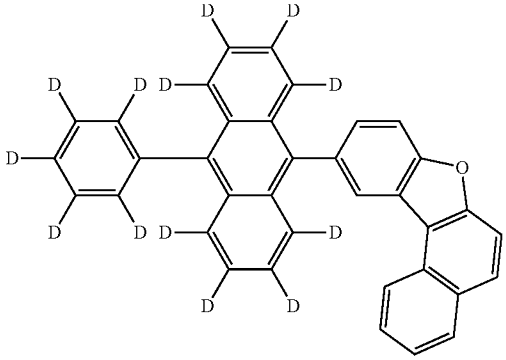
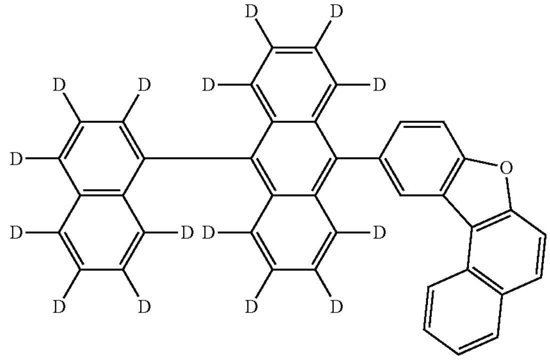

-continued
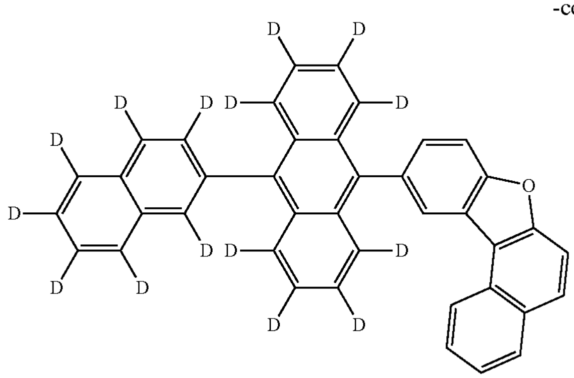
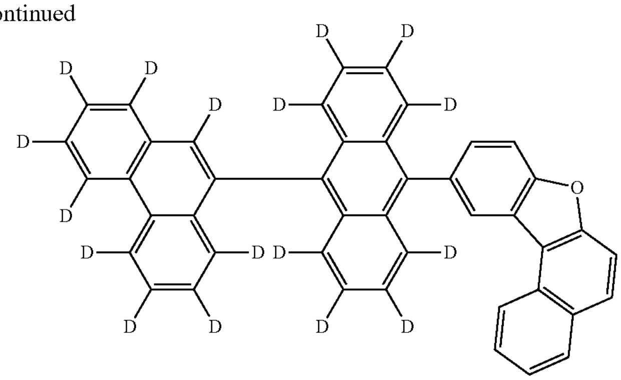
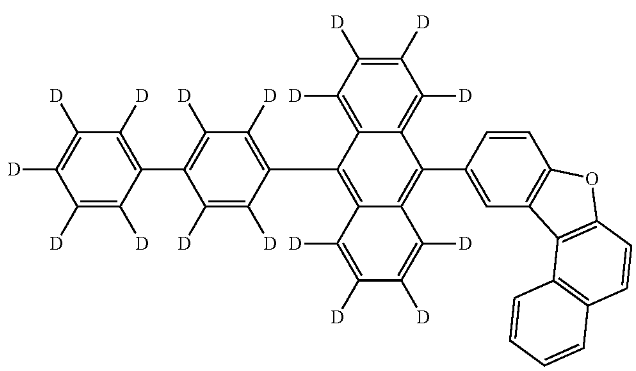
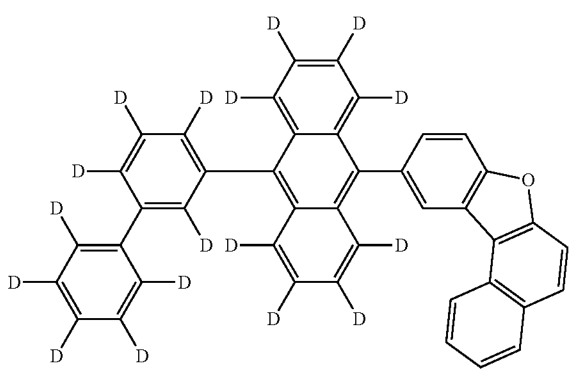
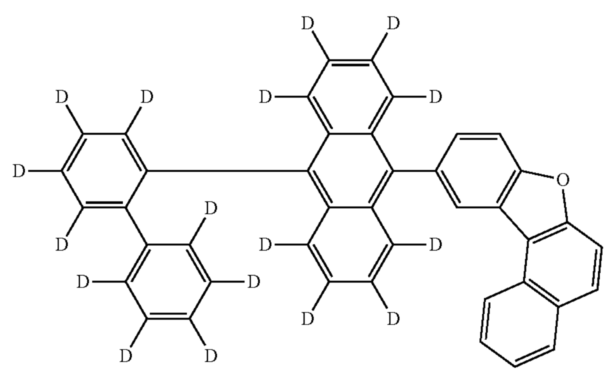
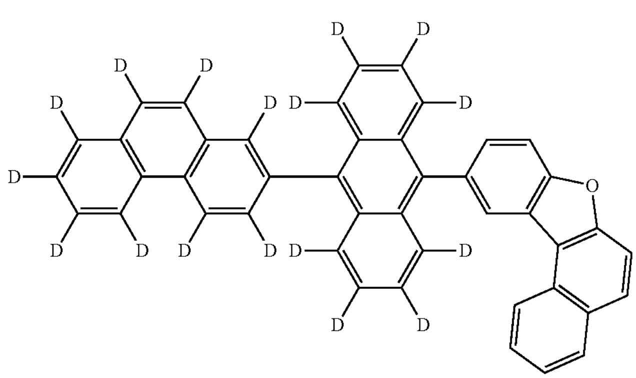

-continued
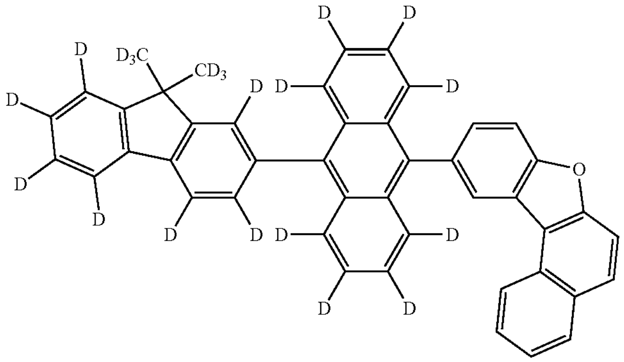
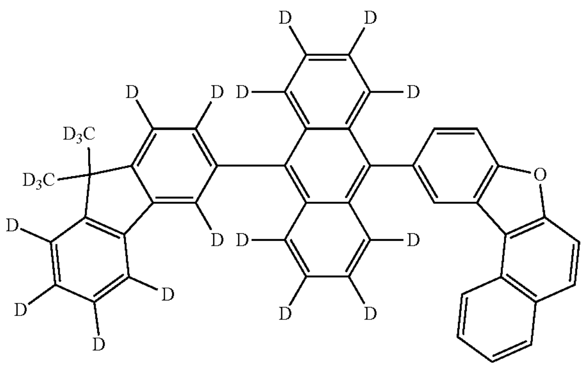
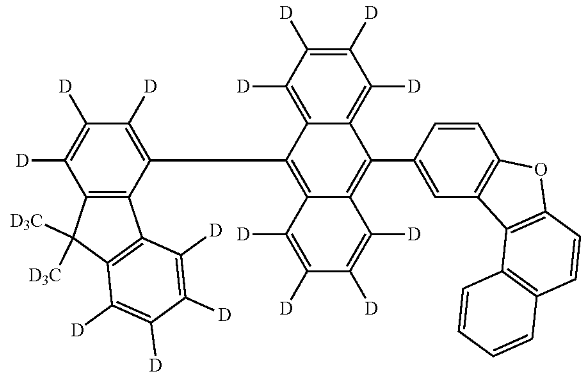
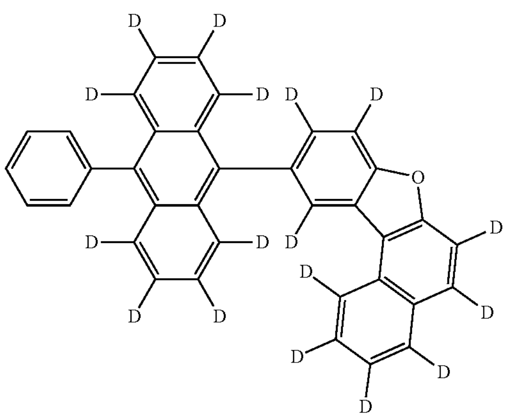
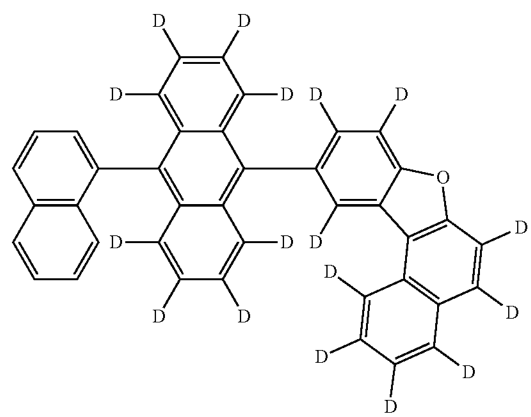
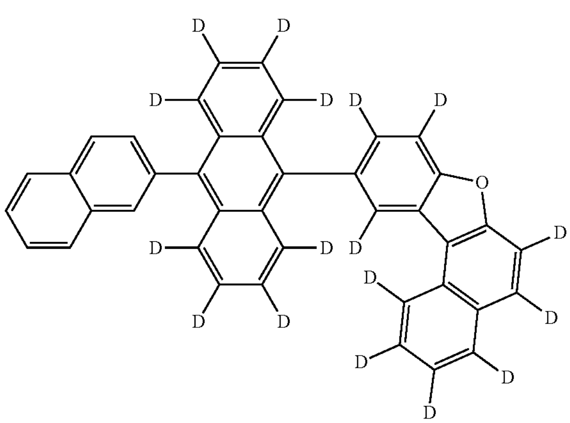
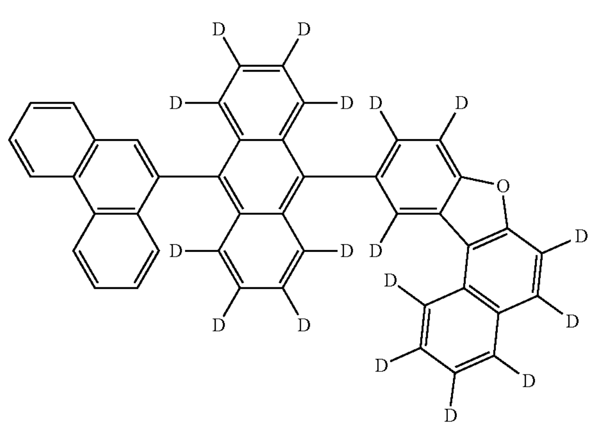

-continued
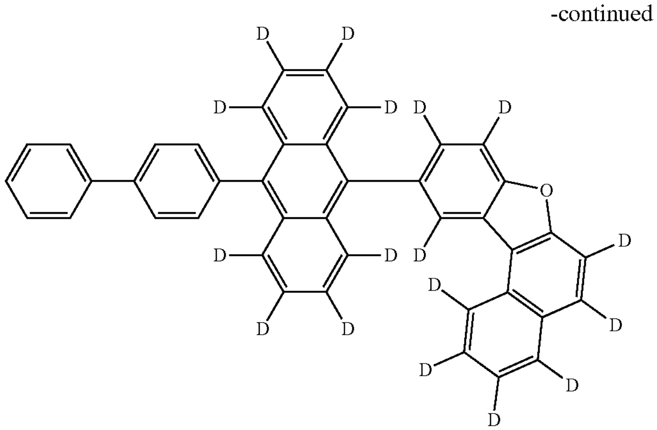
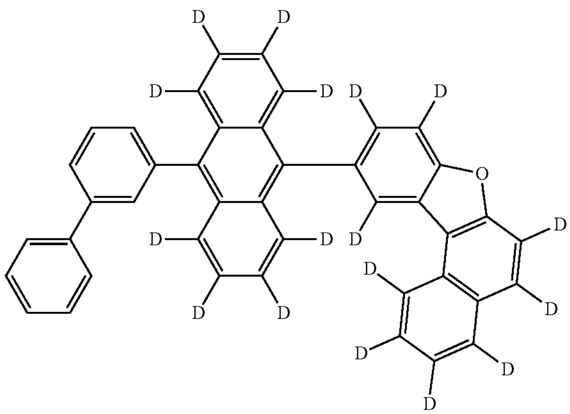
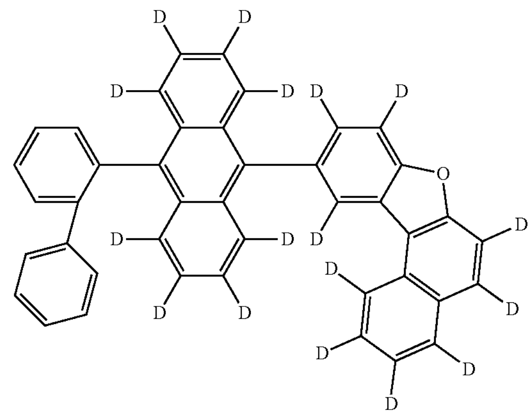
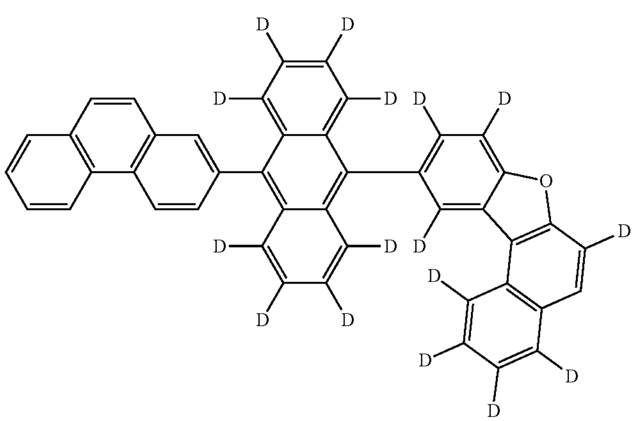
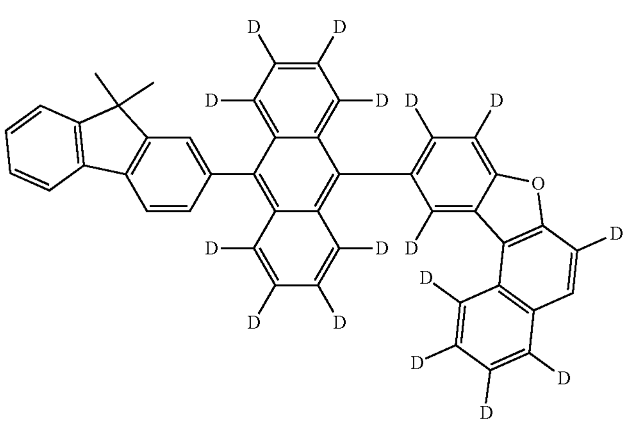

-continued
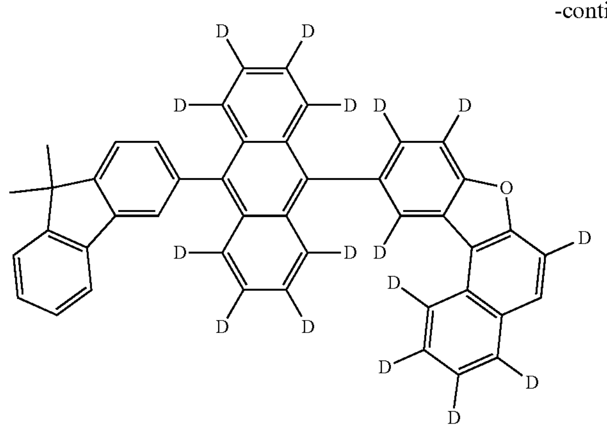
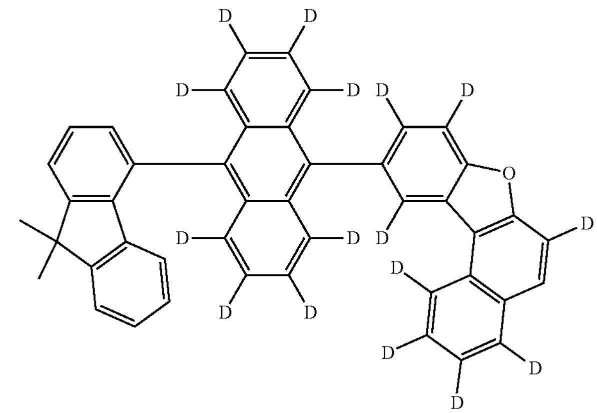
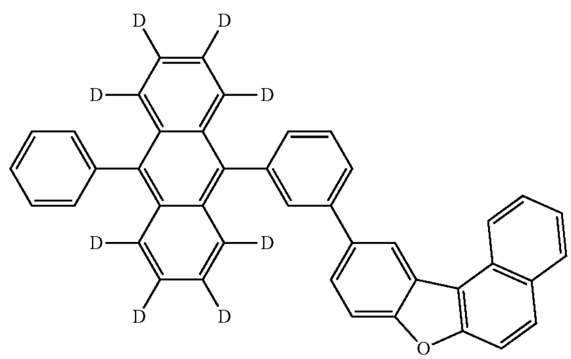
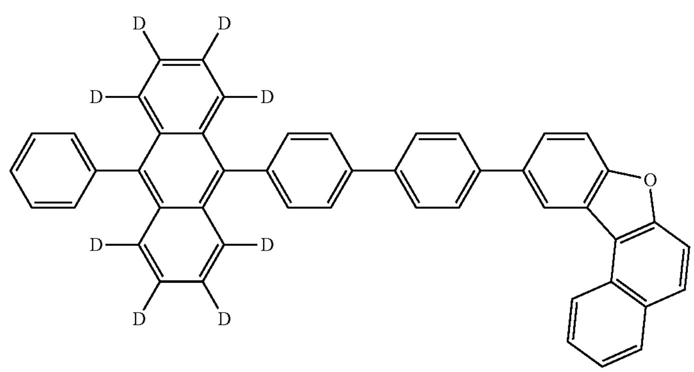
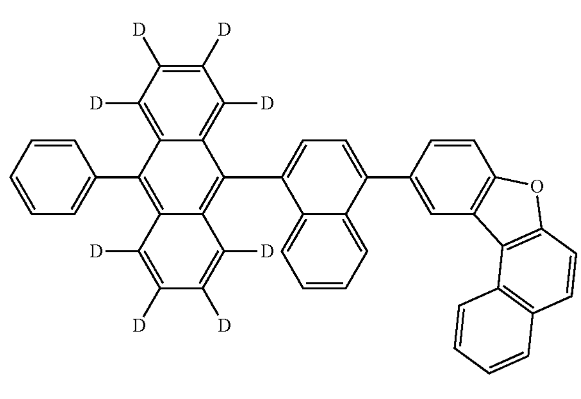
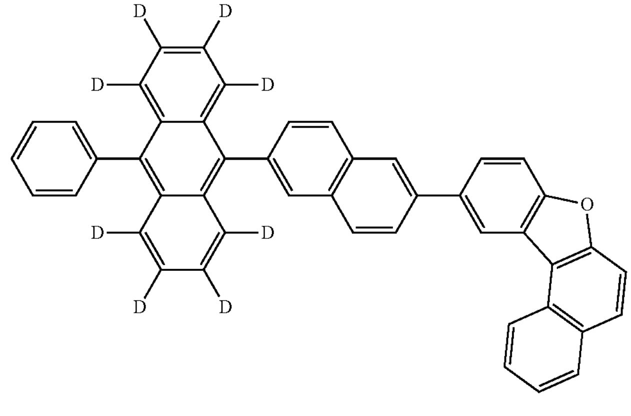

-continued
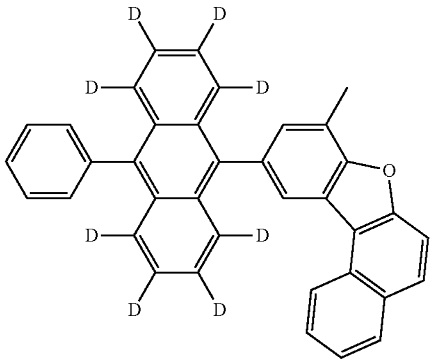
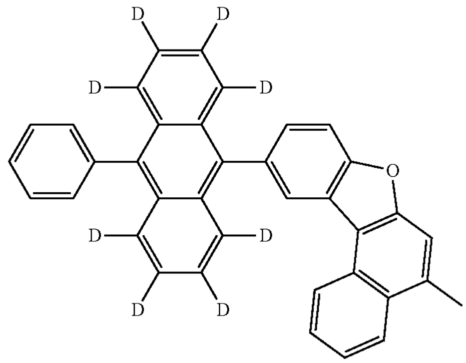
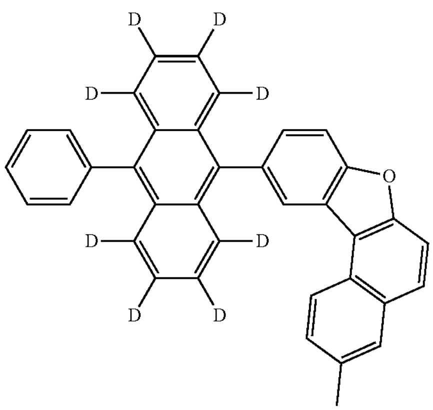
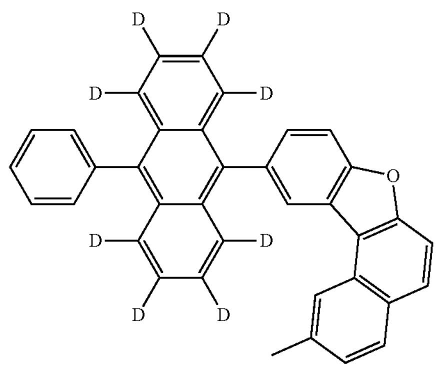
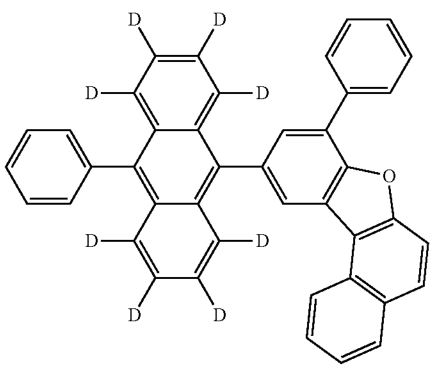
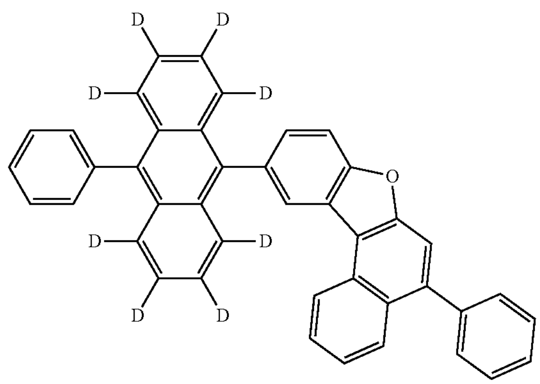
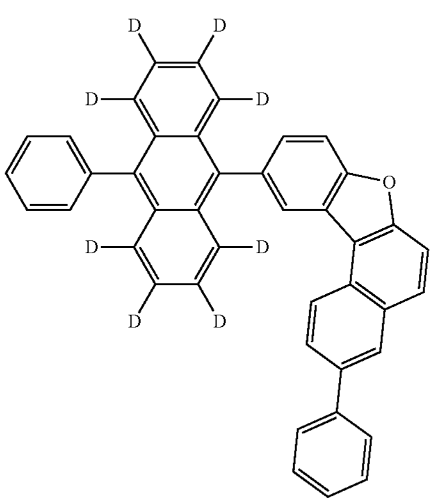
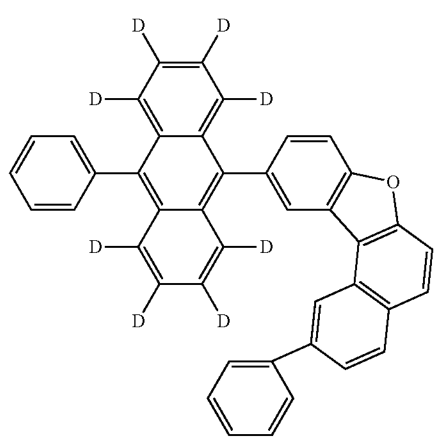

The dopant material is not particularly limited, but preferably does not include a phosphorescent dopant material as described above.

Examples of the dopant materials include compounds represented by each of the following formulas (11), (21), (31), (41), (51), (61), (71), (81), and (91), and the like. Preferably, the dopant material is a compound represented by the following formula (11).

(Compound Represented by the Formula (11))

A compound represented by the formula (11) will be described.

(11)

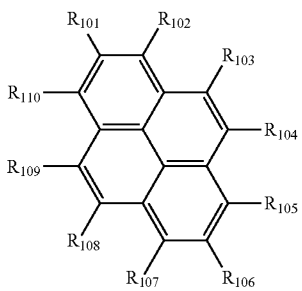

In the formula (11), one or more sets of adjacent two or more of $R_{101}$ to $R_{110}$ form a substituted or unsubstituted, saturated or unsaturated ring by bonding with each other, or do not form a substituted or unsubstituted, saturated or unsaturated ring.

At least one of $R_{101}$ to $R_{110}$ is a monovalent group represented by the following formula (12).

$R_{101}$ to $R_{110}$ which do not form a substituted or unsubstituted, saturated or unsaturated ring, and are not a monovalent group represented by the following formula (12) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

(12)

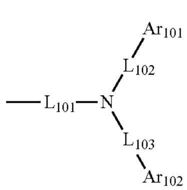

In the formula (12), $Ar_{101}$ and $Ar_{102}$ are independently a substituted or unsubstituted aryl group including 6 to 50 ring carbon atoms, or a substituted or unsubstituted monovalent heterocyclic group including 5 to 50 ring atoms.

$L_{101}$ to $L_{103}$ are independently a single bond, a substituted or unsubstituted arylene group including 6 to 30 ring carbon atoms, or a substituted or unsubstituted divalent heterocyclic group including 5 to 30 ring atoms.

In the formula (11), it is preferable that two of $R_{101}$ to $R_{110}$ be groups represented by the formula (12).

In one embodiment, the compound represented by the formula (11) is a compound represented by the following formula (13).

(13)

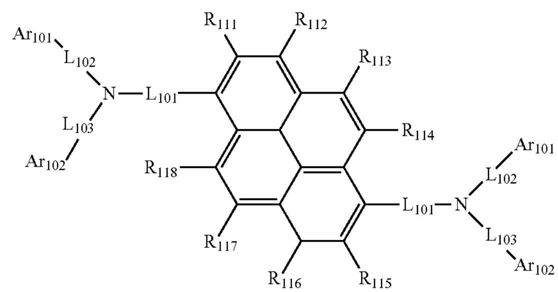

In the formula (13), $R_{111}$ to $R_{118}$ is the same as $R_{101}$ to $R_{110}$ in the formula (11) which are not a monovalent group represented by the formula (12). $Ar_{101}$, $Ar_{102}$, $L_{101}$, $L_{102}$, and $L_{103}$ are as defined in the formula (12).

In the formula (11), $L_{101}$ is preferably a single bond, and $L_{102}$ and $L_{103}$ are preferably single bonds.

In one embodiment, the compound represented by the formula (11) is a compound represented by the following formula (14) or (15).

(14)

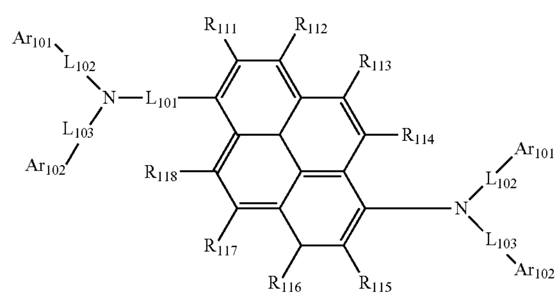

In the formula (14), $R_{111}$ to $R_{118}$ are as defined in the formula (13). $Ar_{101}$, $Ar_{102}$, $L_{102}$, and $L_{103}$ are as defined in the formula (12).

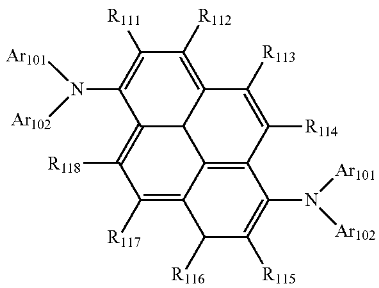

(15)

In the formula (15), $R_{111}$ to $R_{118}$ are as defined in the formula (13). $Ar_{101}$ and $Ar_{102}$ are as defined in the formula (12).

In the formula (12) in the formula (11), at least one of $Ar_{101}$ and $Ar_{102}$ is preferably a group represented by the following formula (16).

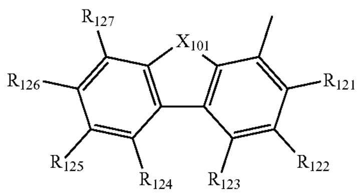

(16)

In the formula (16), $X_{101}$ represents an oxygen atom or a sulfur atom.

one or more sets of adjacent two or more of $R_{121}$ to $R_{127}$ form a substituted or unsubstituted, saturated or unsaturated ring by bonding with each other, or do not form a substituted or unsubstituted, saturated or unsaturated ring.

$R_{121}$ to $R_{127}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

Preferably, $X_{101}$ is an oxygen atom.

At least one of $R_{121}$ to $R_{127}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

In the formula (11) (formula (12)), it is preferable that $Ar_{101}$ be a group represented by the formula (16), and that $Ar_{102}$ be a substituted or unsubstituted aryl group including 6 to 50 ring carbon atoms.

In one embodiment, the compound represented by the formula (11) is a compound represented by the following formula (17).

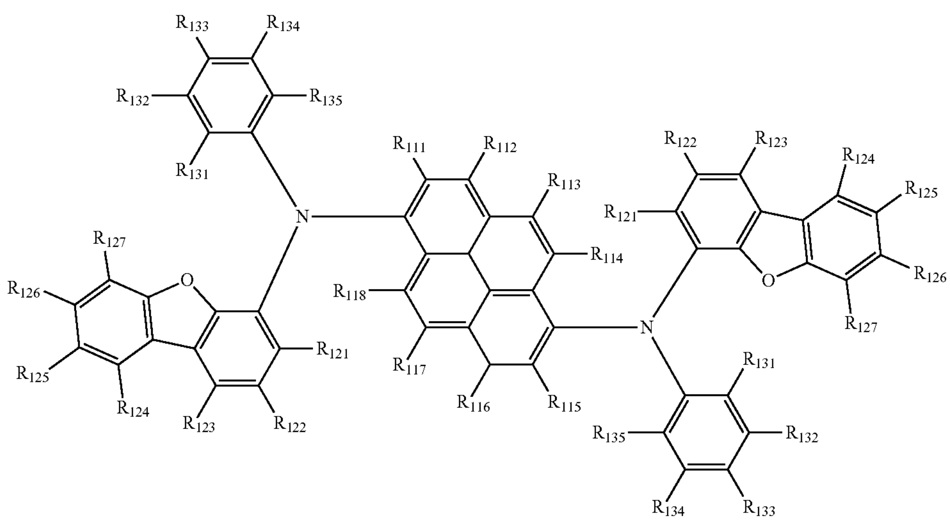

(17)

In the formula (17), $R_{111}$ to $R_{118}$ are as defined in the formula (13). $R_{121}$ to $R_{127}$ is as defined in the formula (16).

$R_{131}$ to $R_{135}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

Specific examples of the compound represented by the formula (11) include, for example, compounds shown below. In the following specific examples, "Me" represents a methyl group.

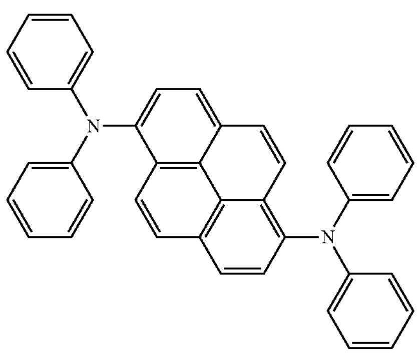

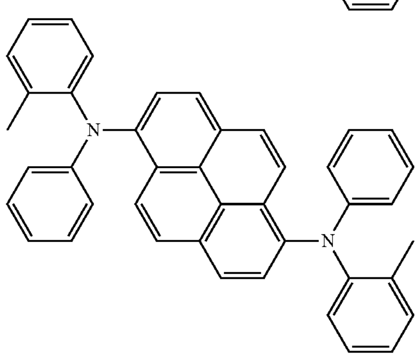

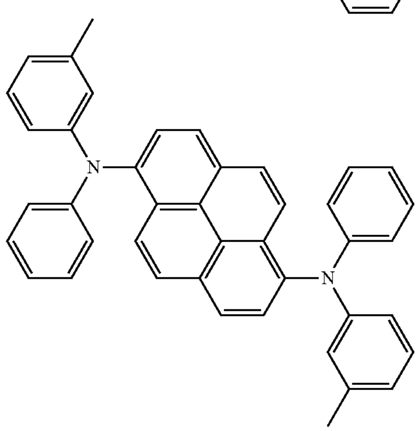

-continued

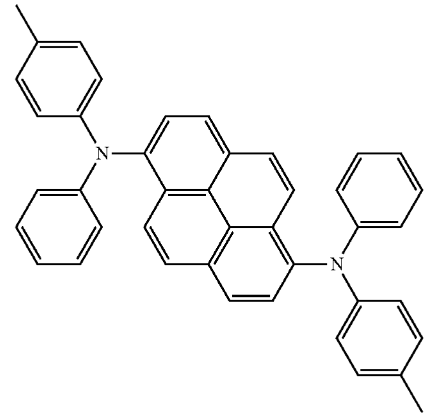

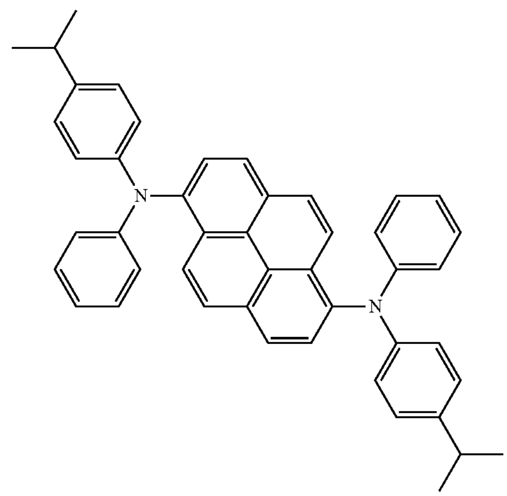

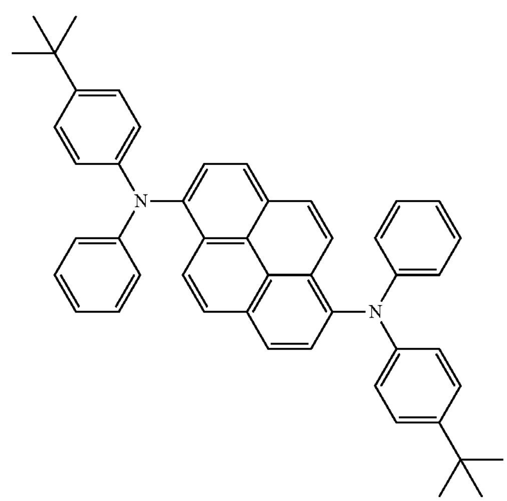

-continued
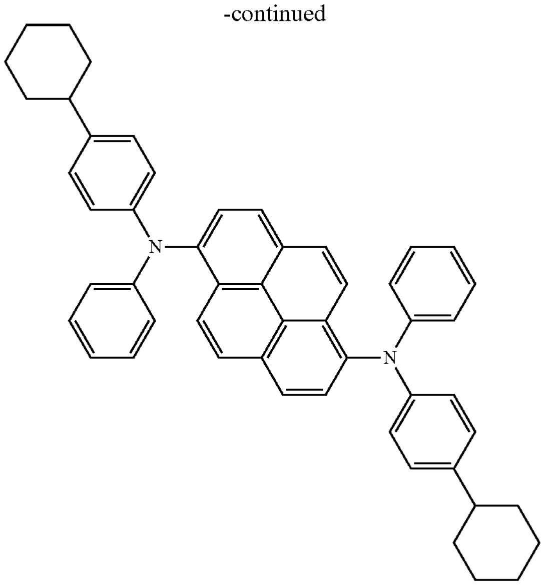
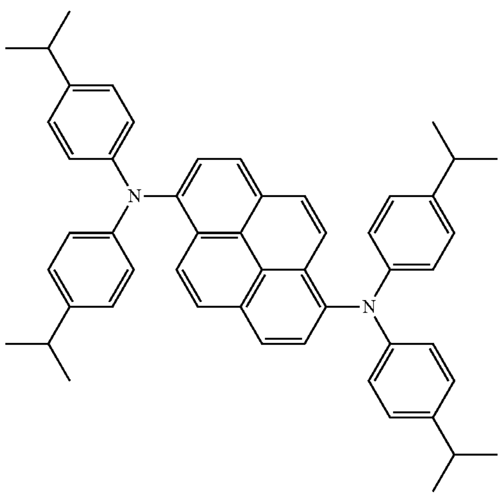
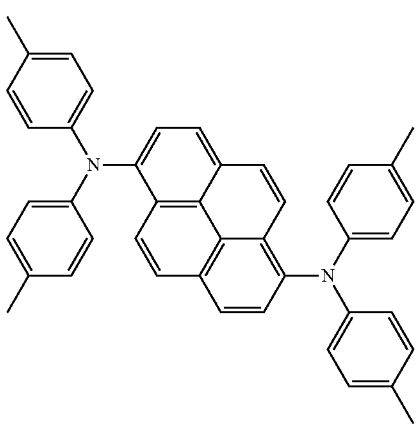
-continued
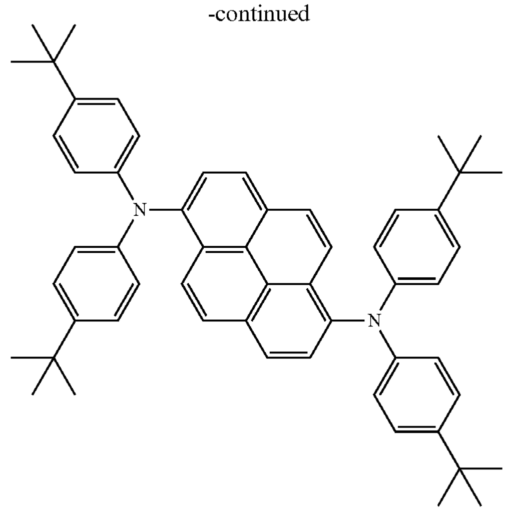
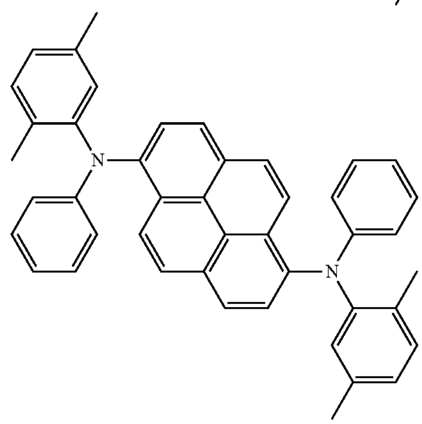
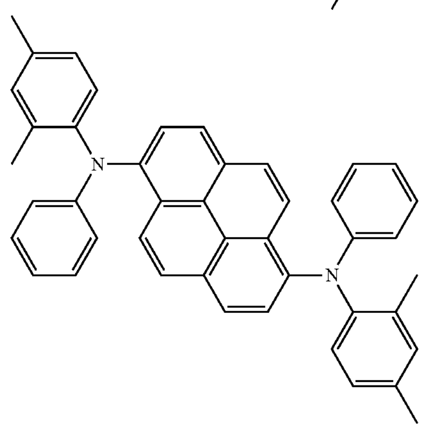
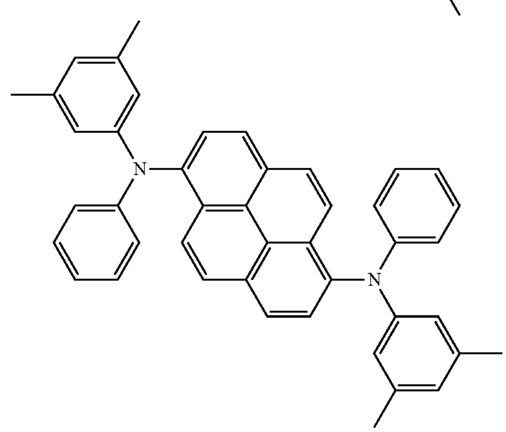

-continued
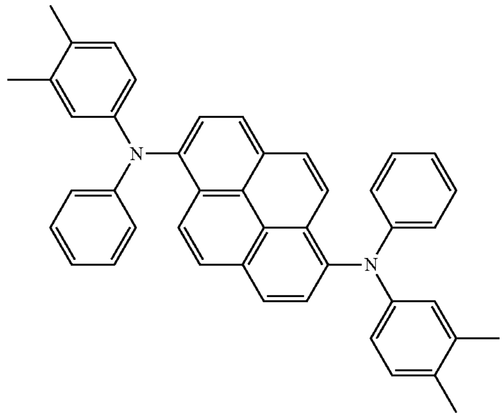
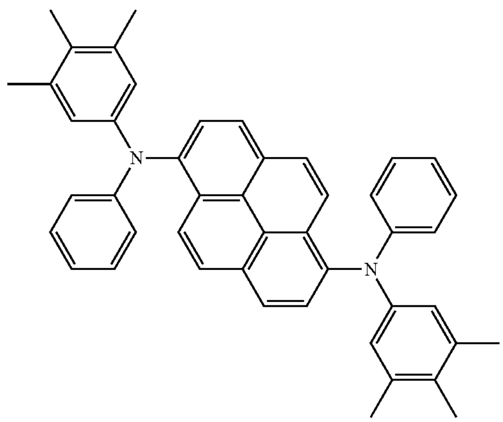
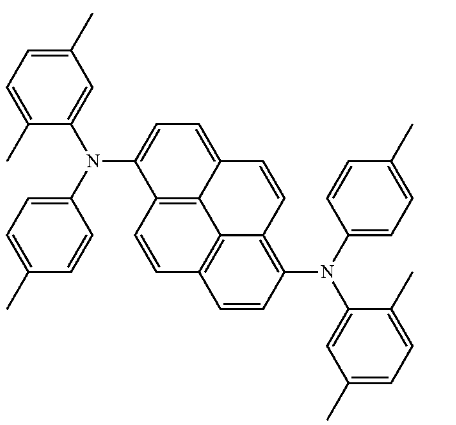
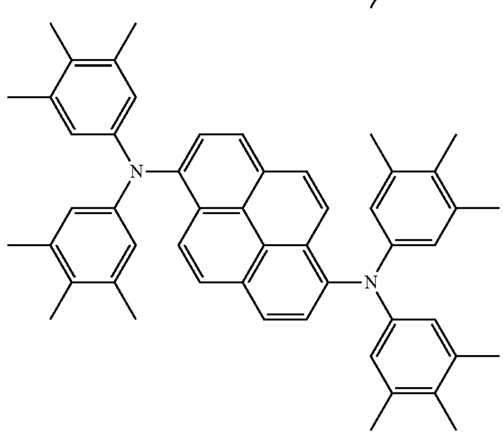
-continued
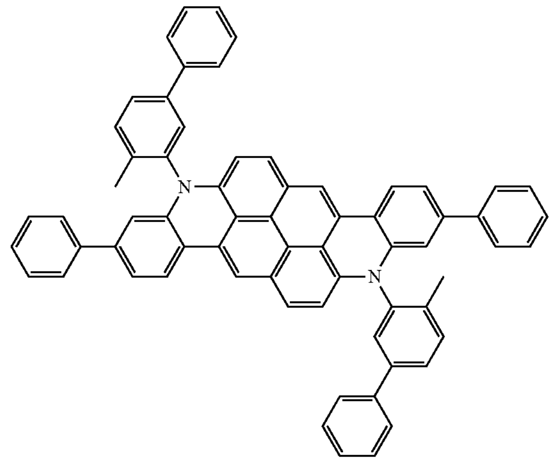
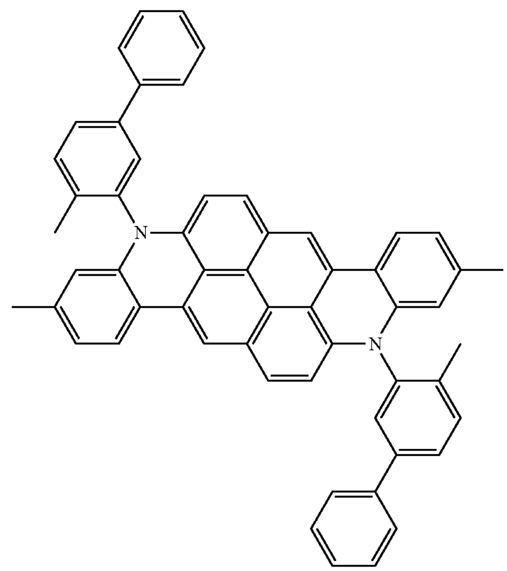
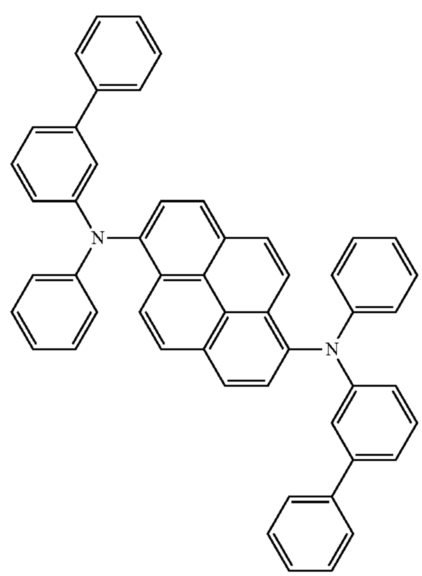

-continued
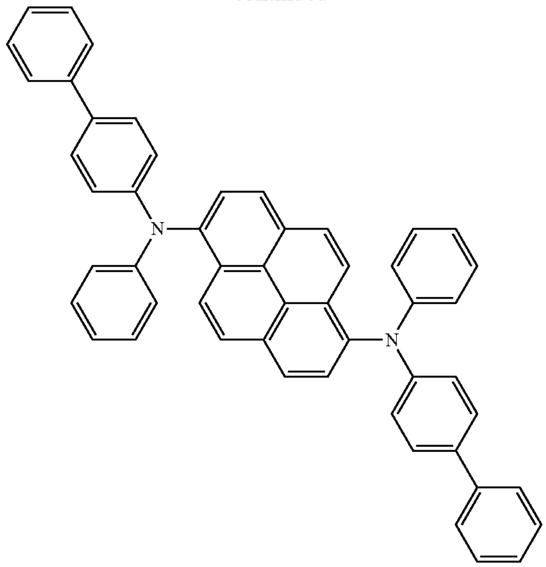
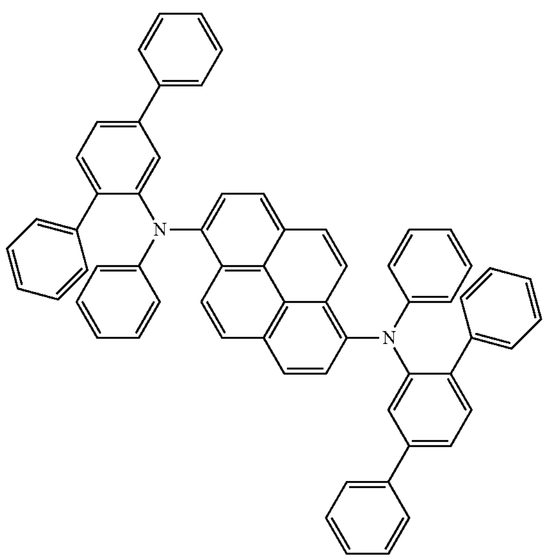
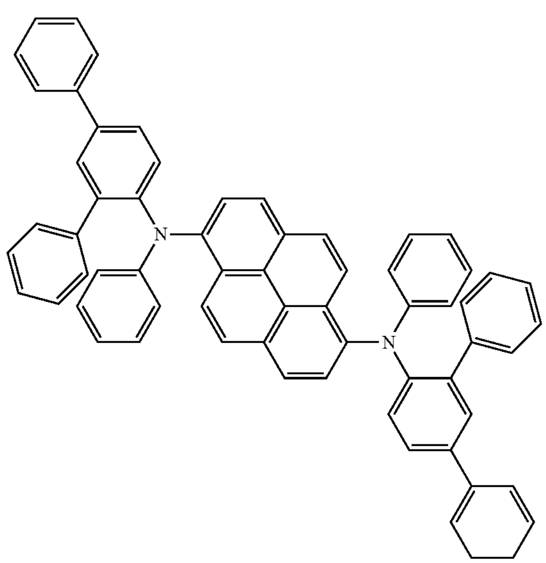
-continued
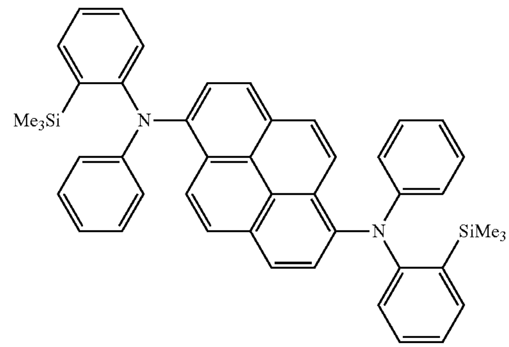
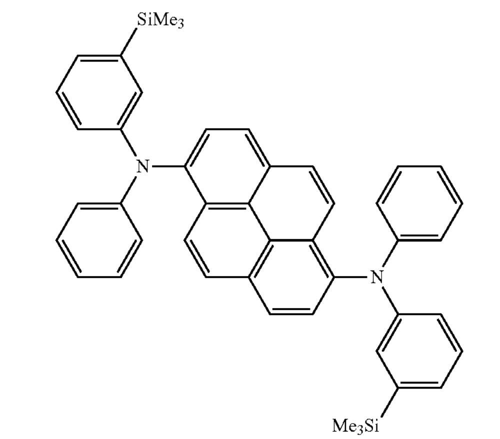
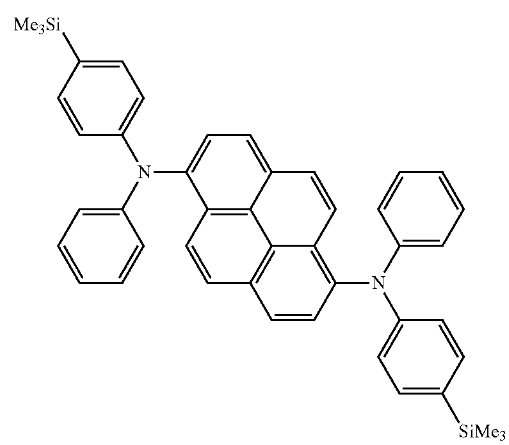
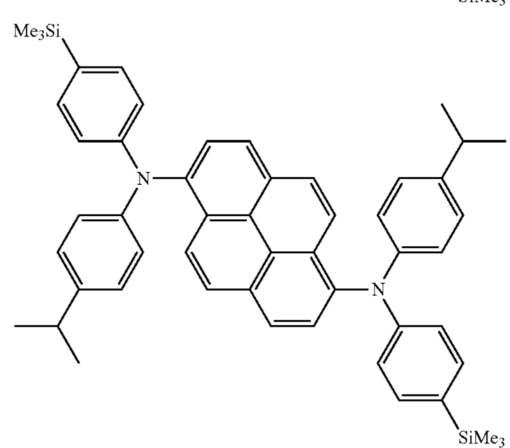

-continued
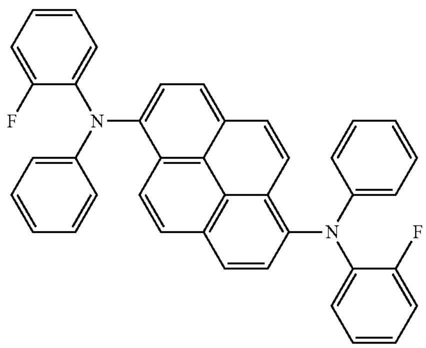
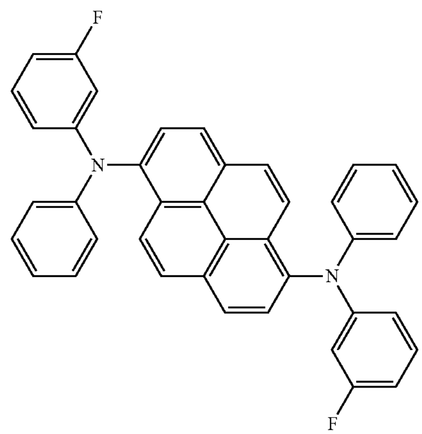
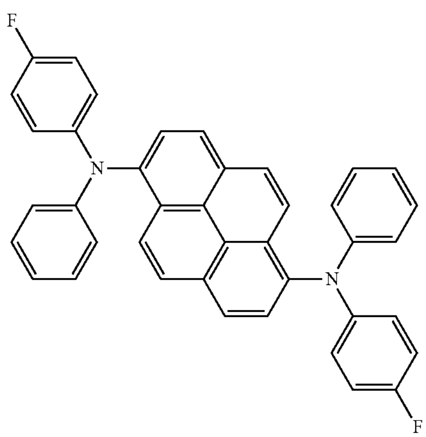
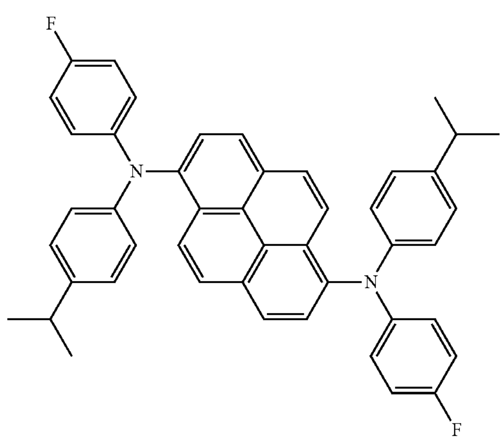
-continued
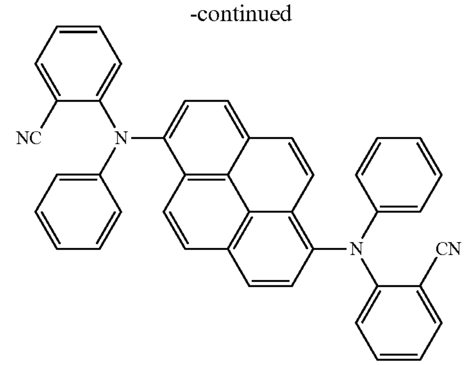
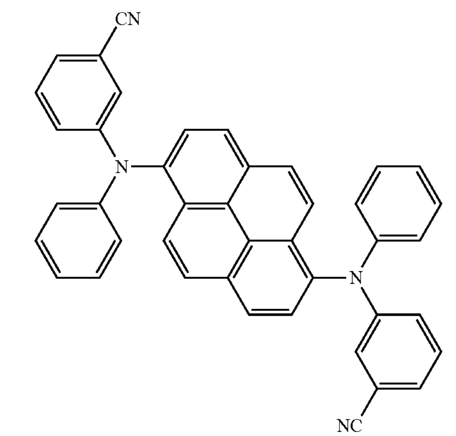
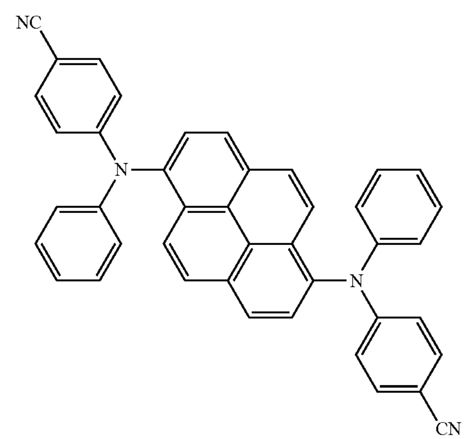
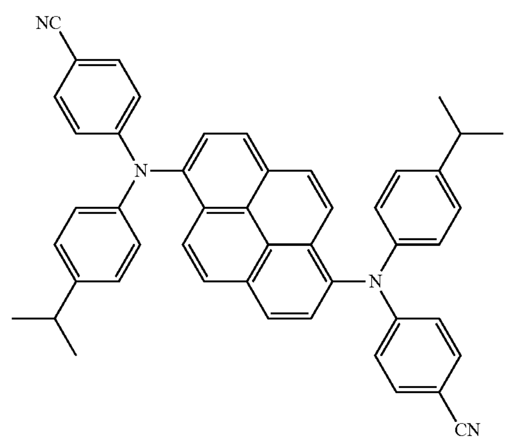

-continued
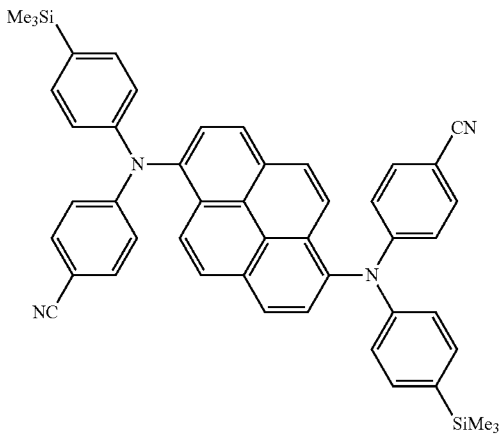
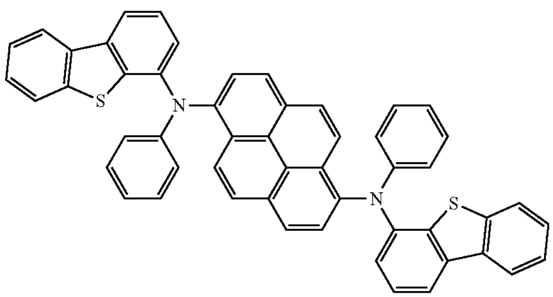
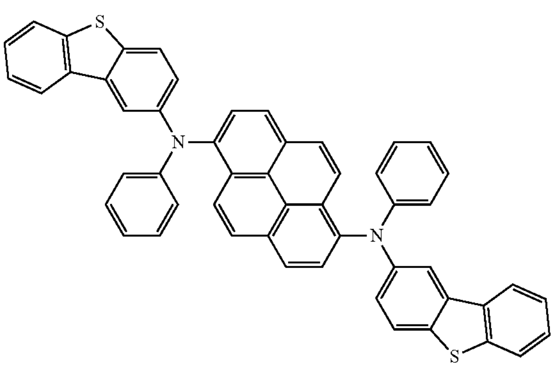
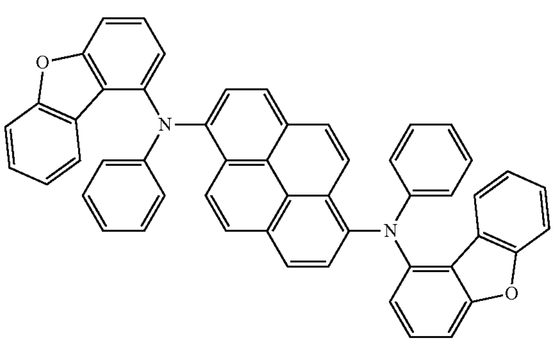
-continued
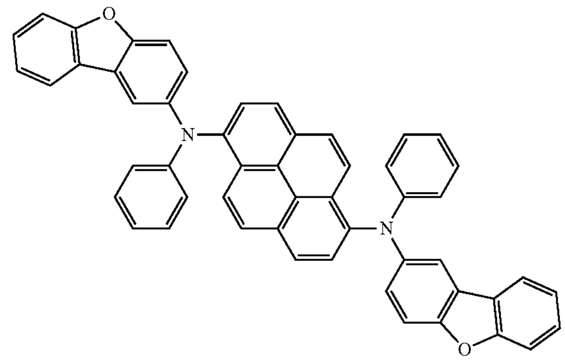
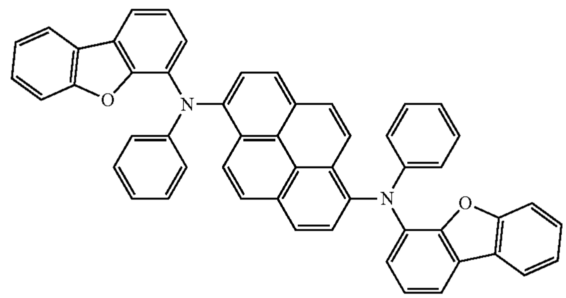
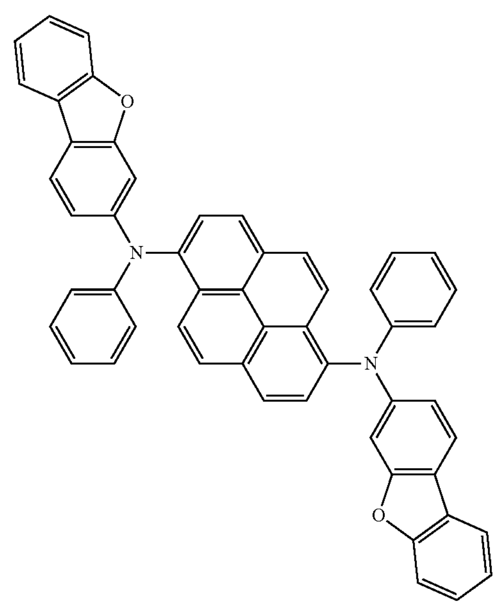
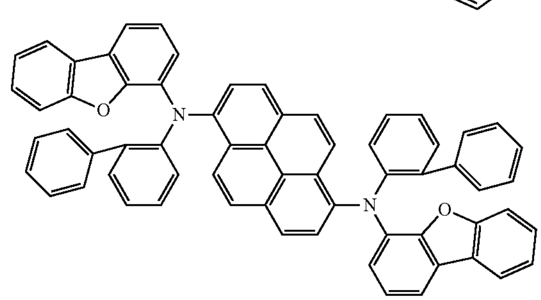

-continued
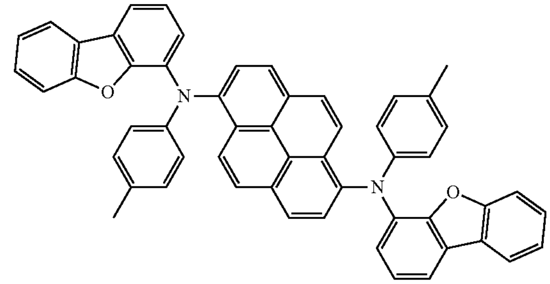
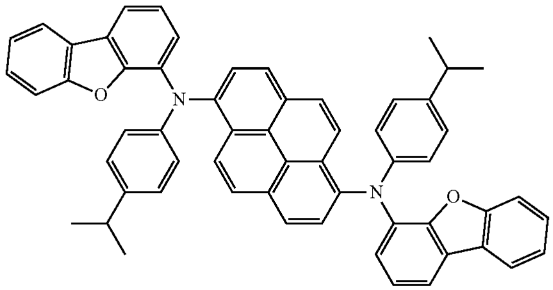
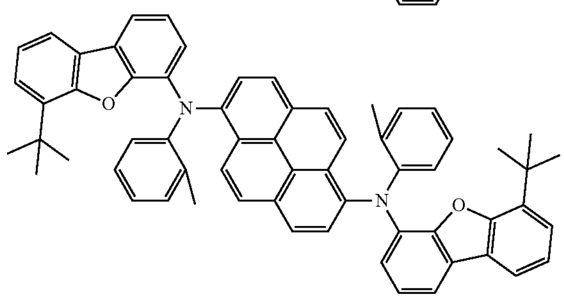
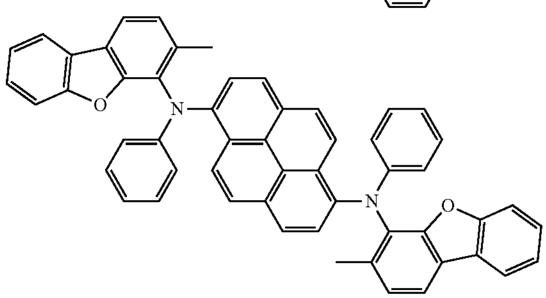
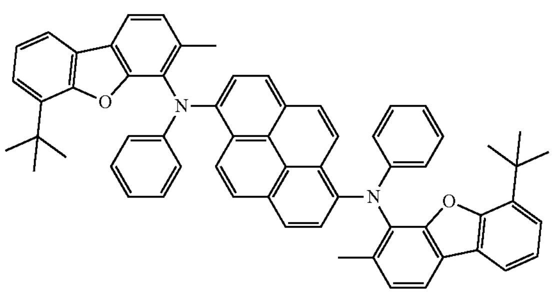
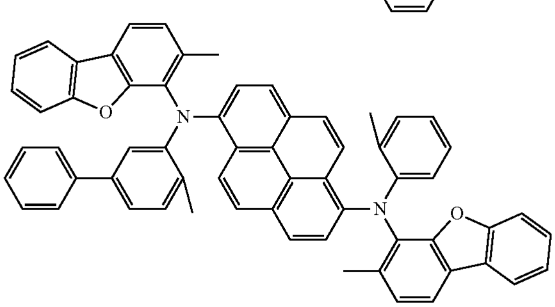
-continued
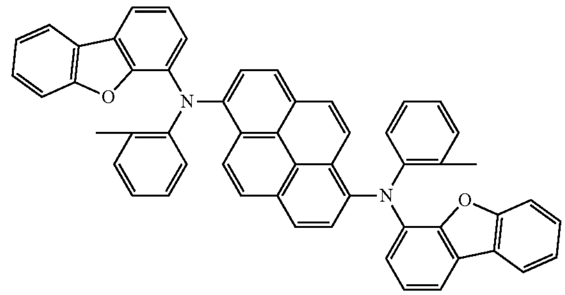
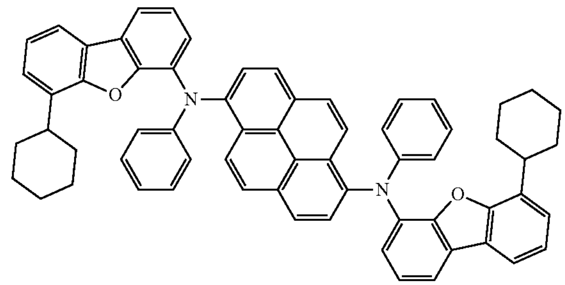
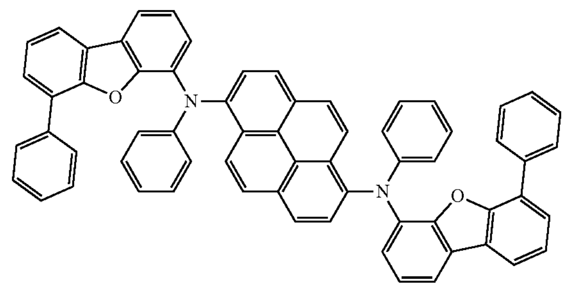
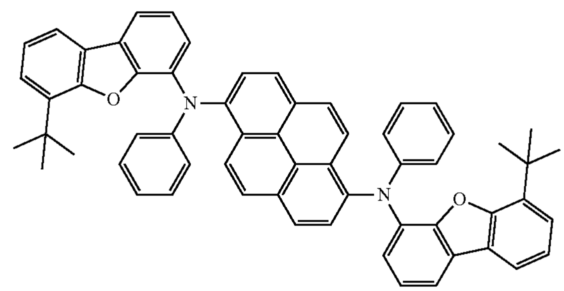
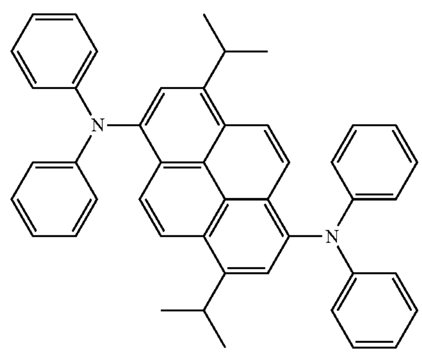

-continued
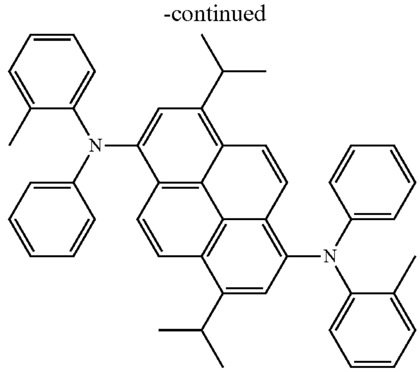
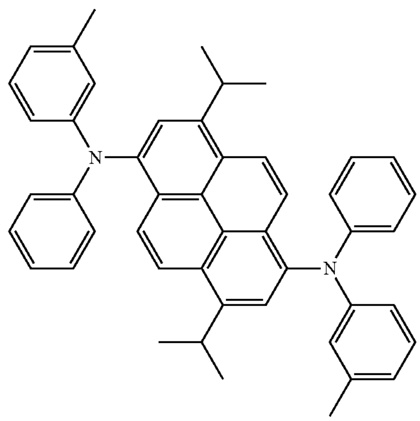
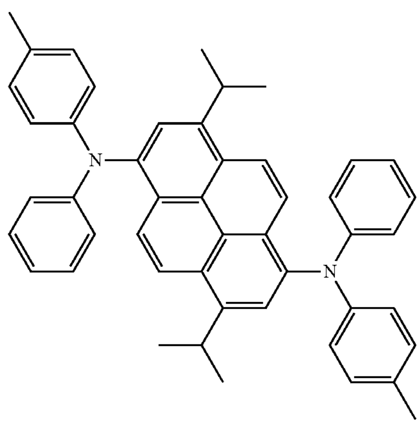
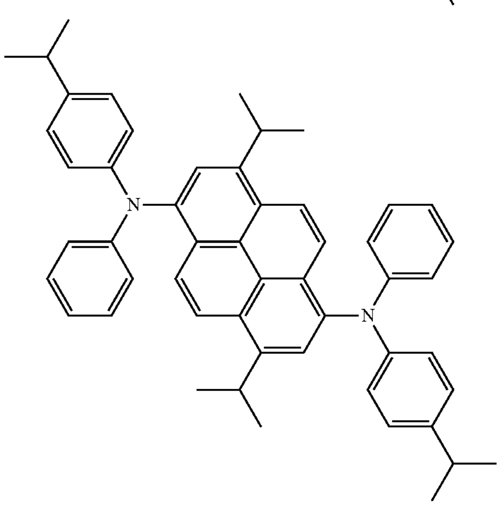
-continued
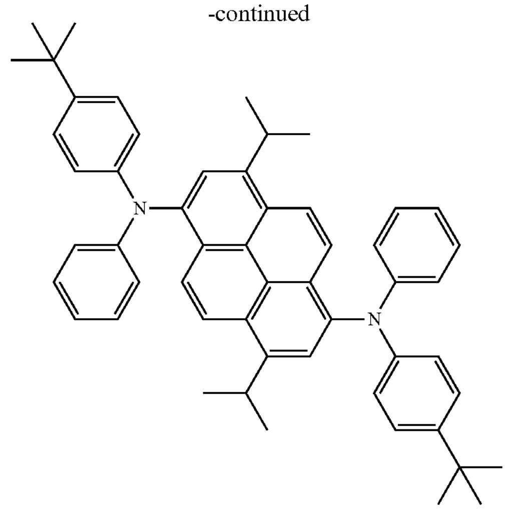
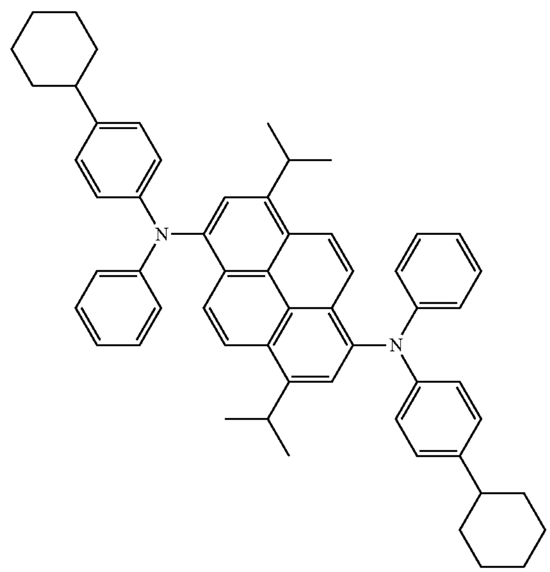
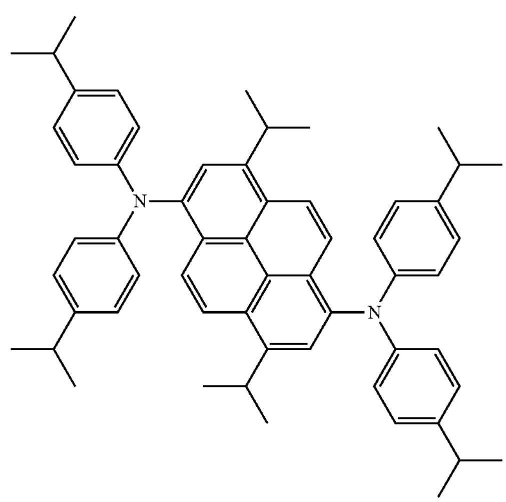

-continued
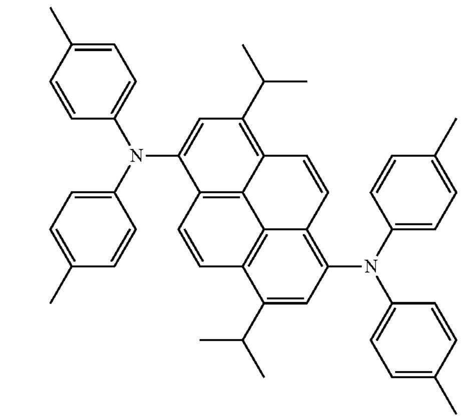
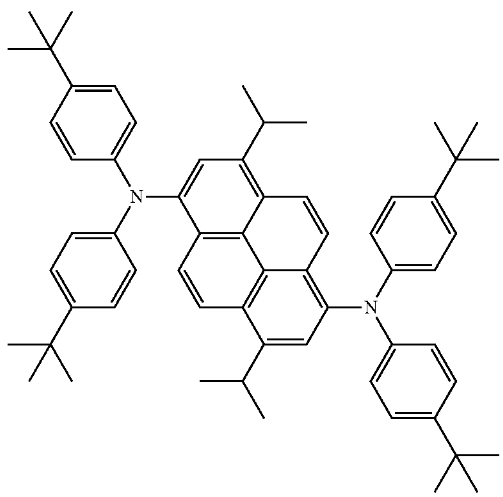
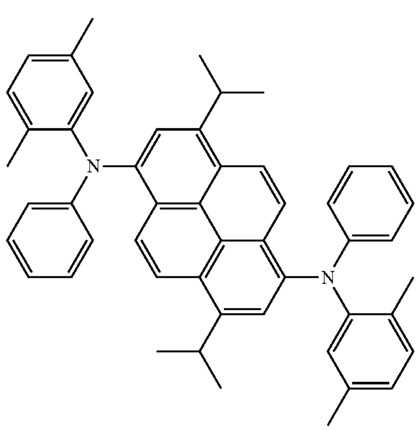
-continued
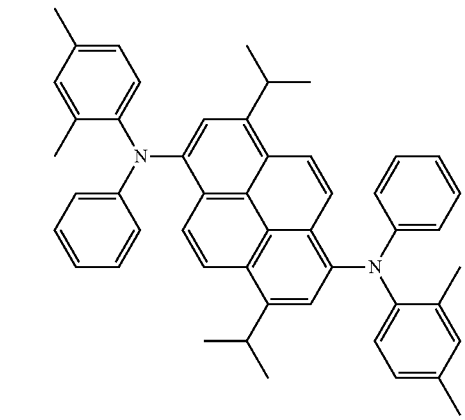
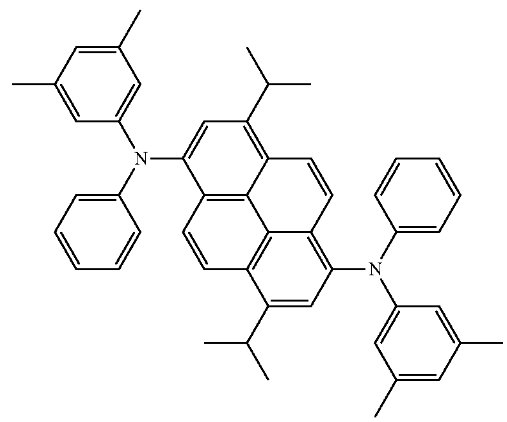
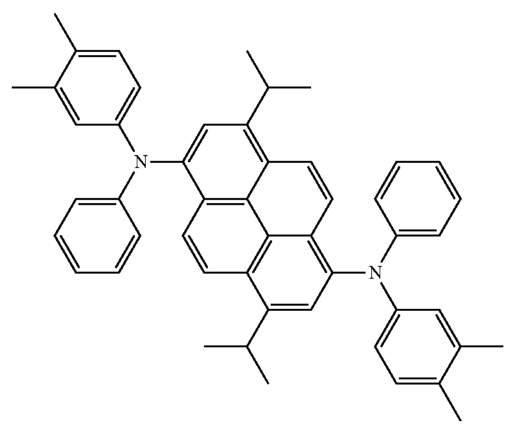
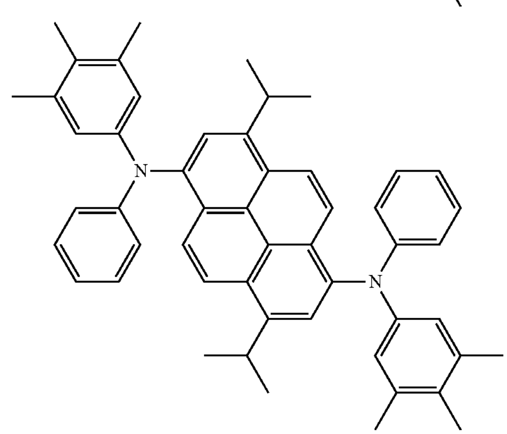

-continued
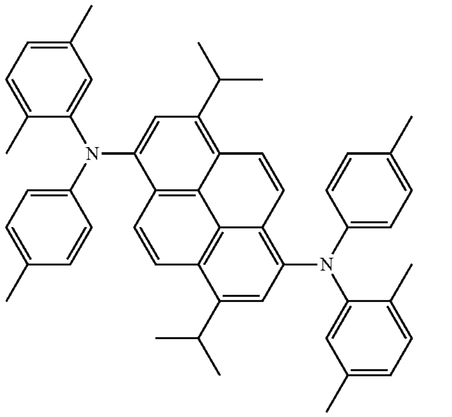
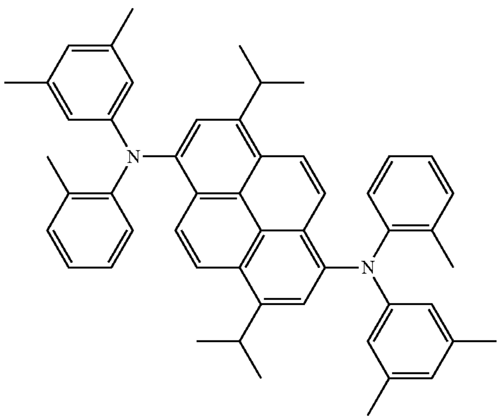
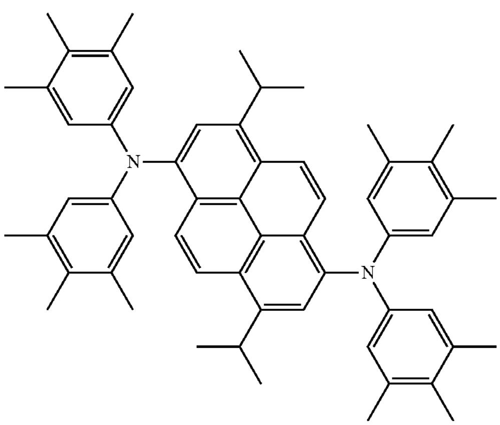
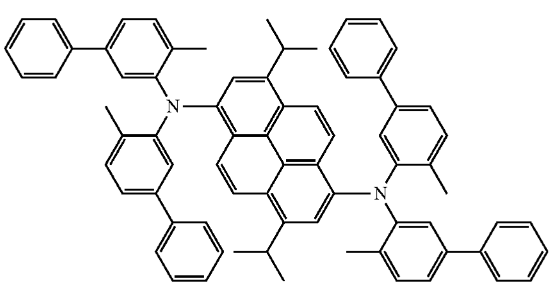
-continued
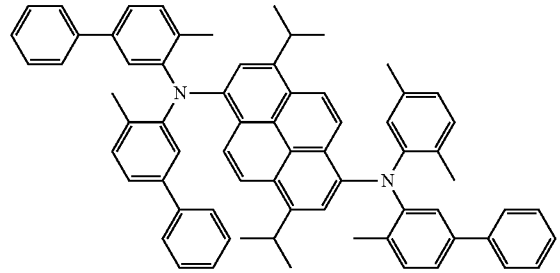
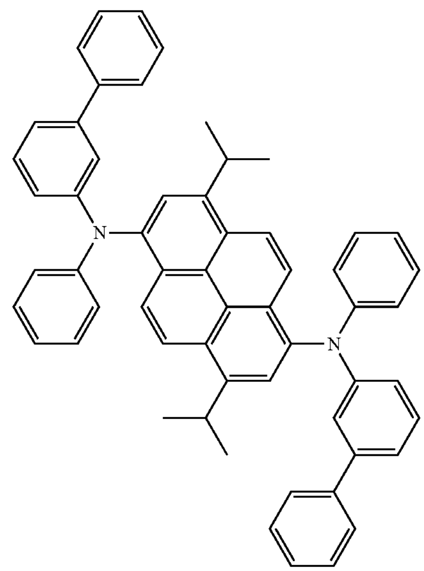
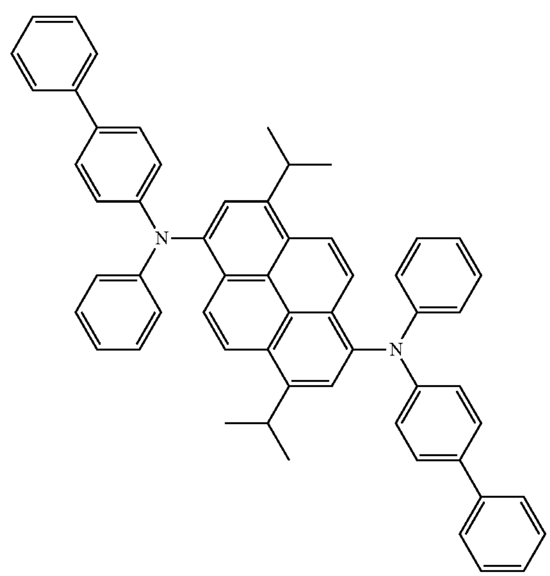

-continued
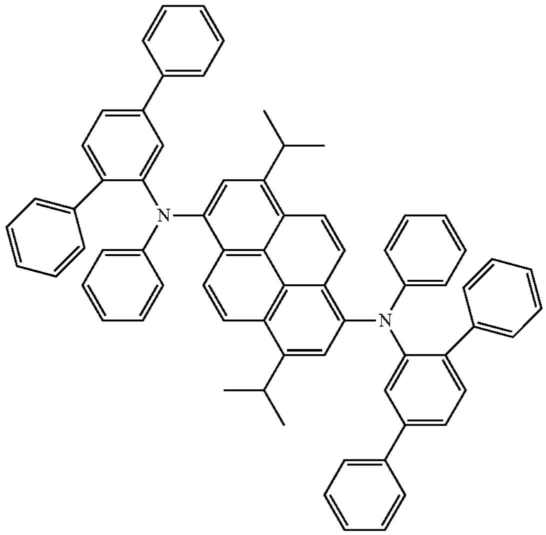
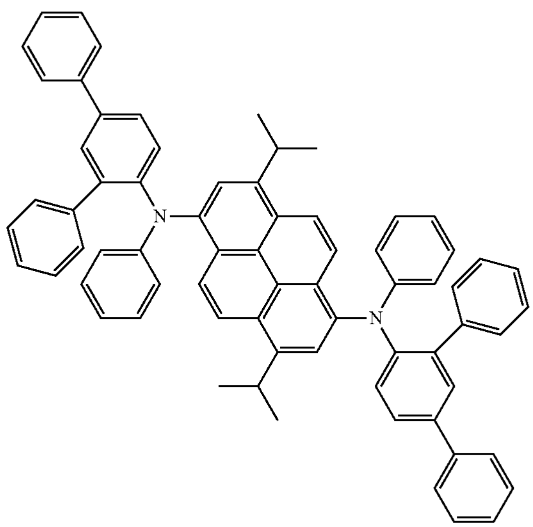
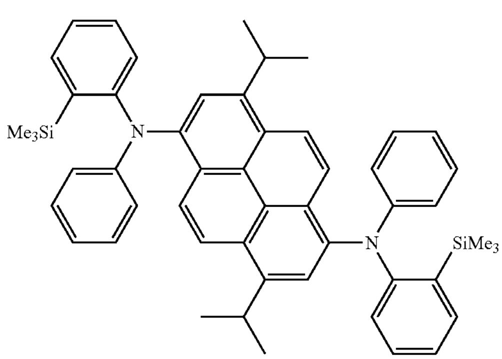
-continued
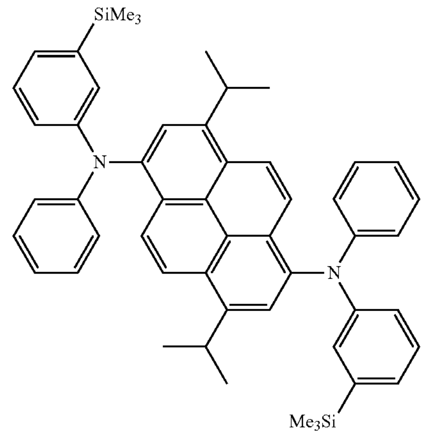
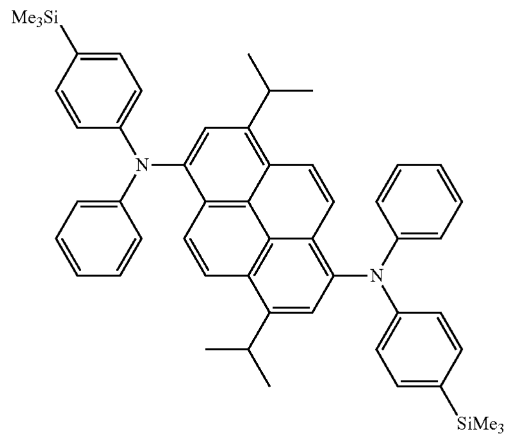
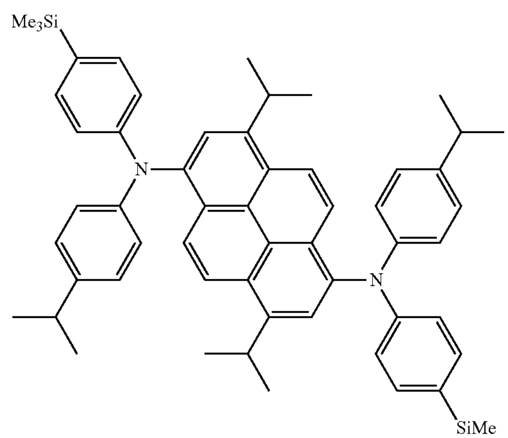
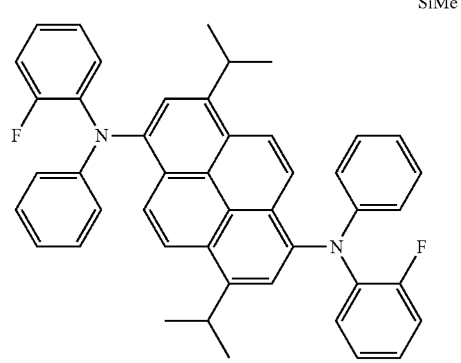

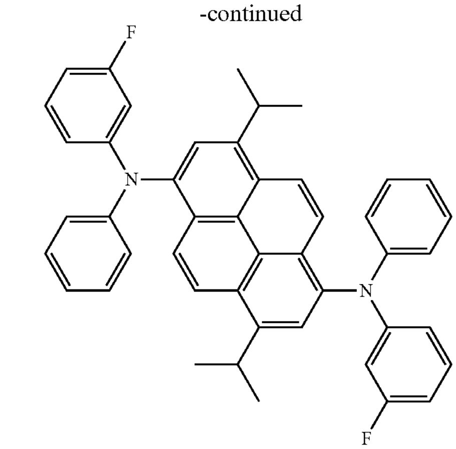
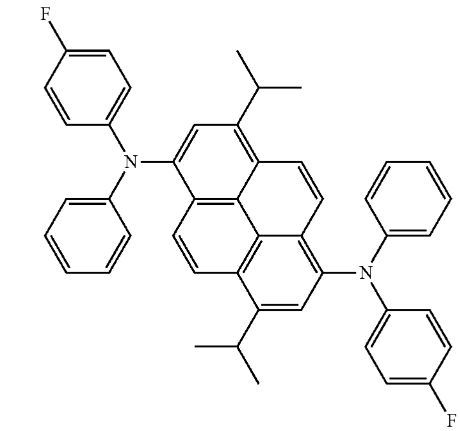
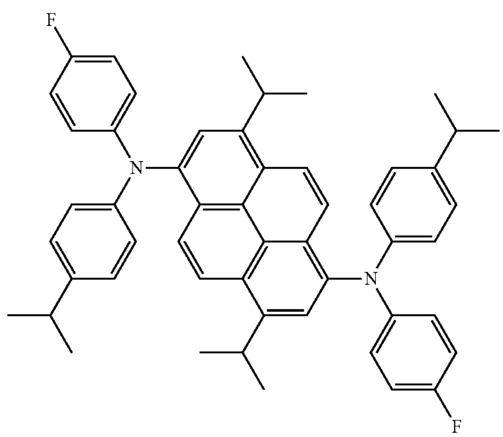
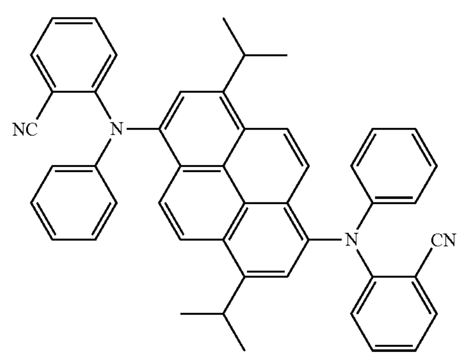
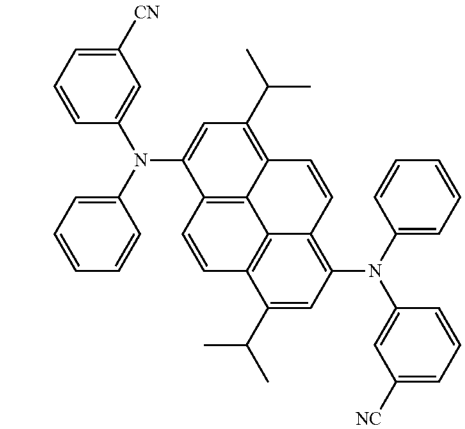
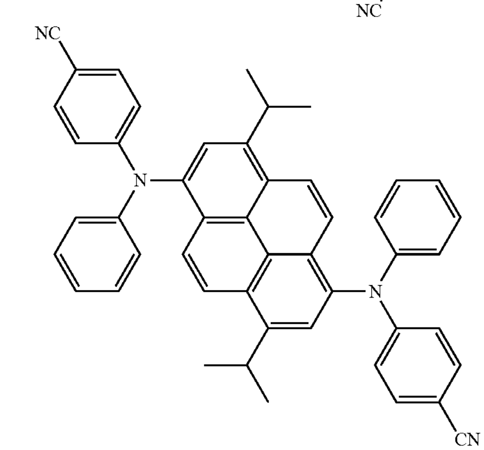
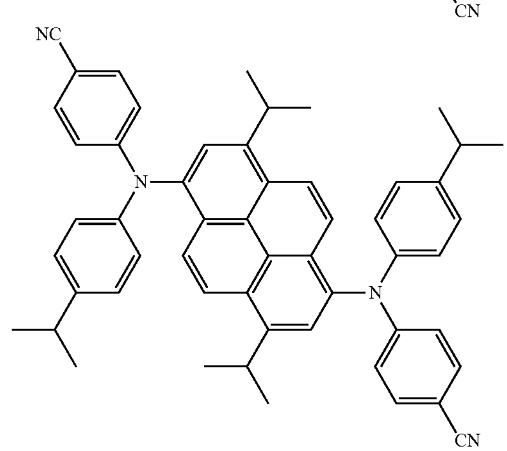
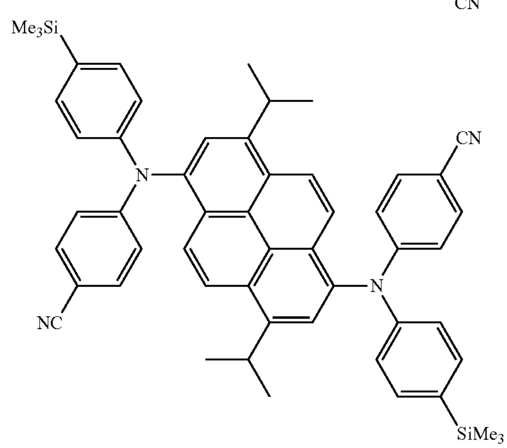

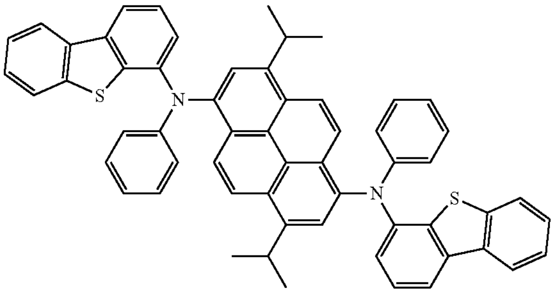
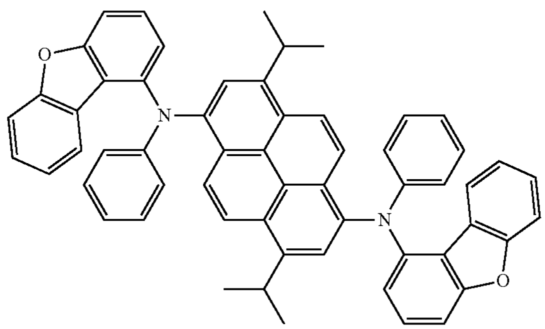
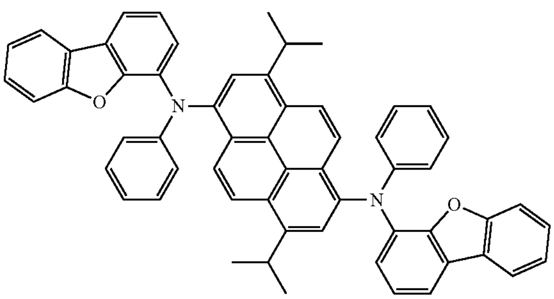
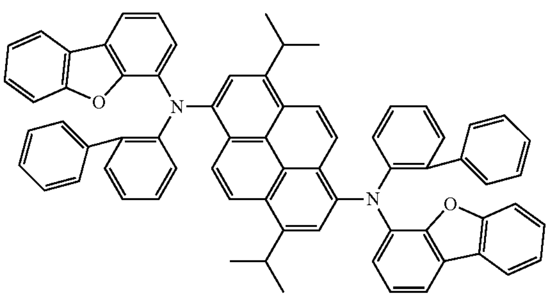
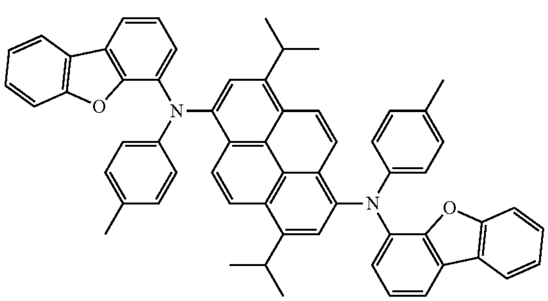
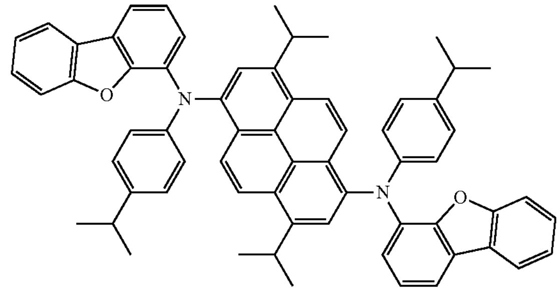
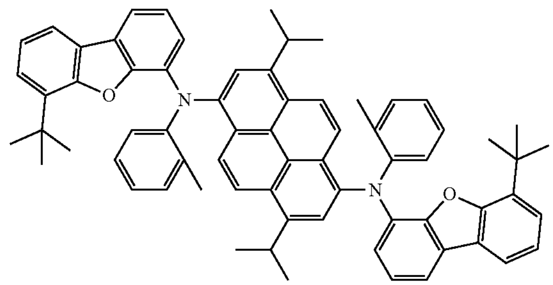
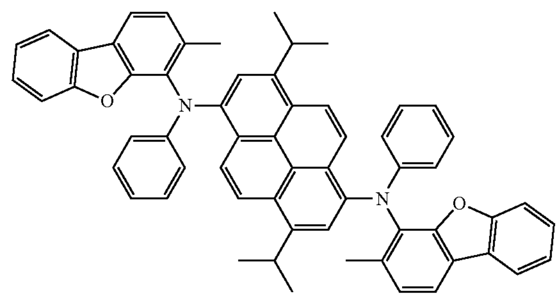
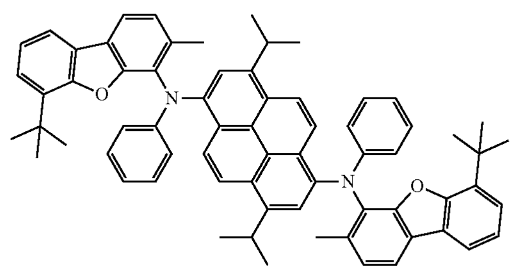
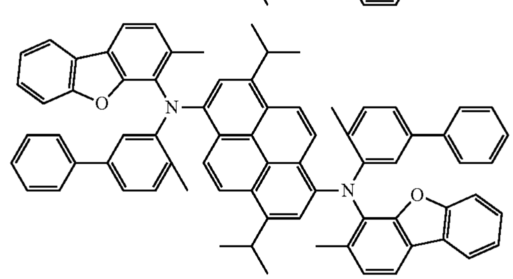
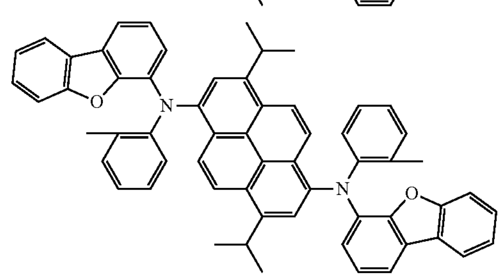

-continued
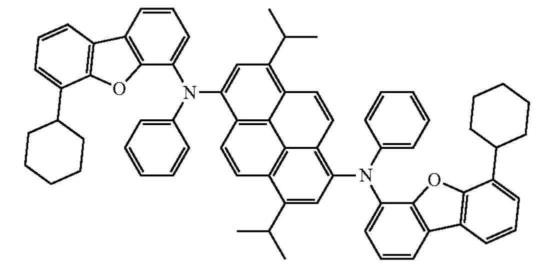
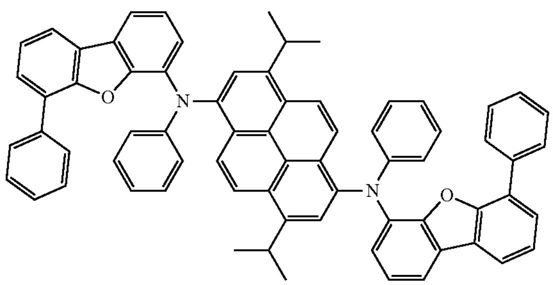
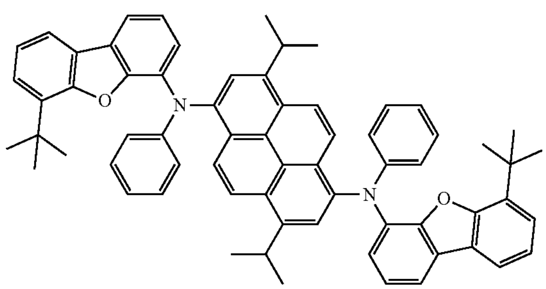
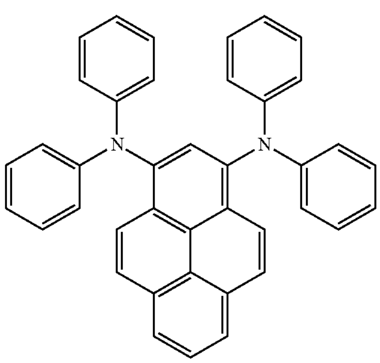
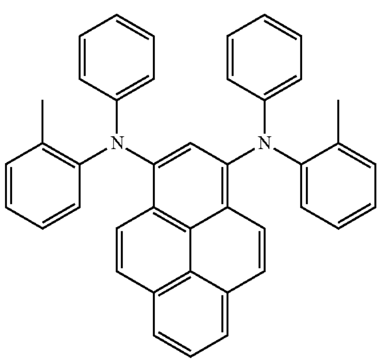
-continued
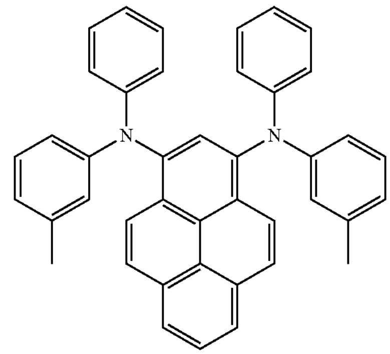
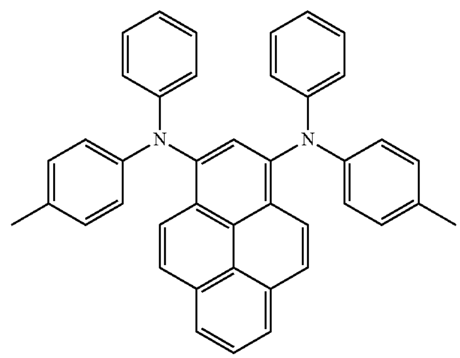
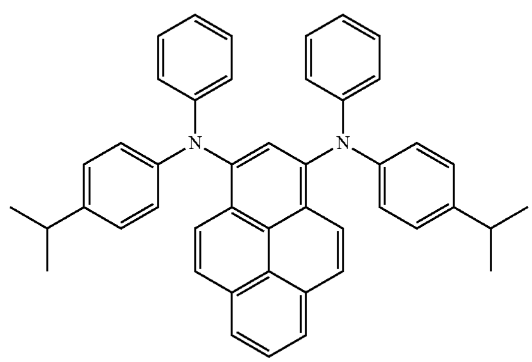
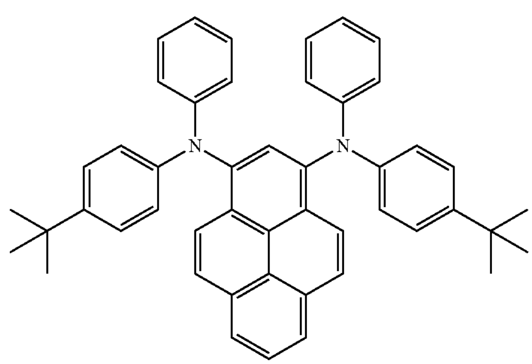

-continued
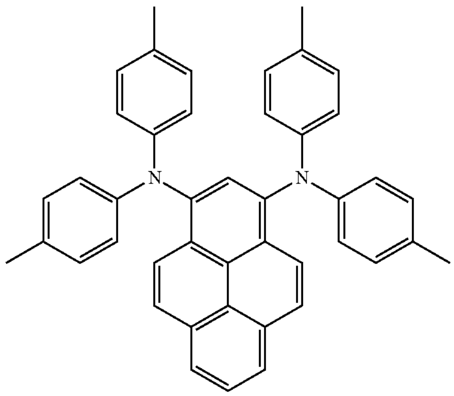
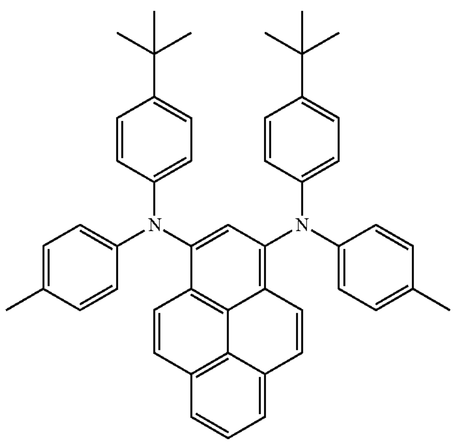
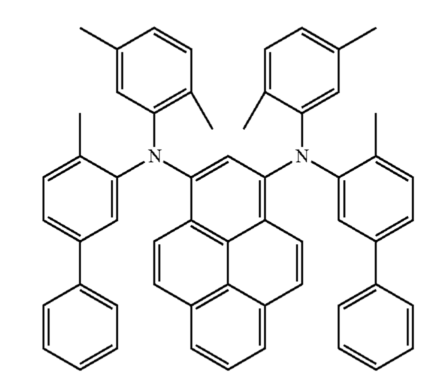
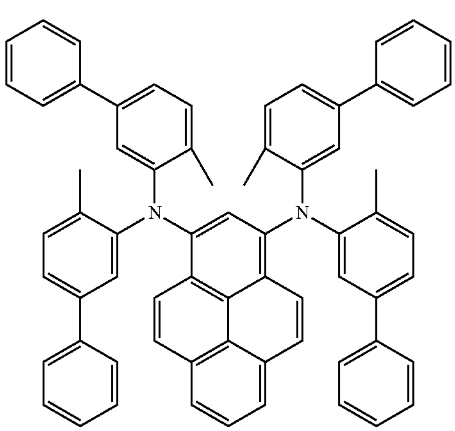
-continued
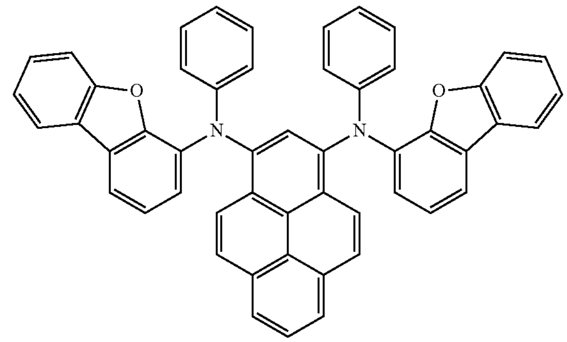
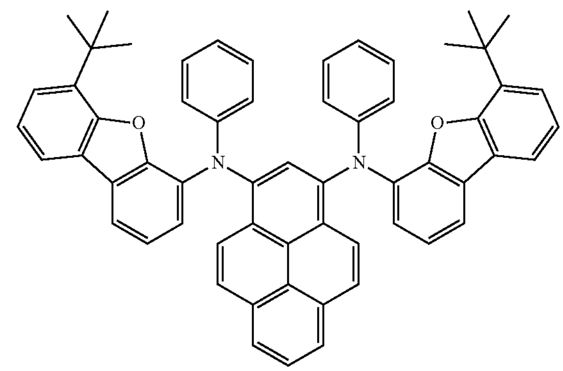
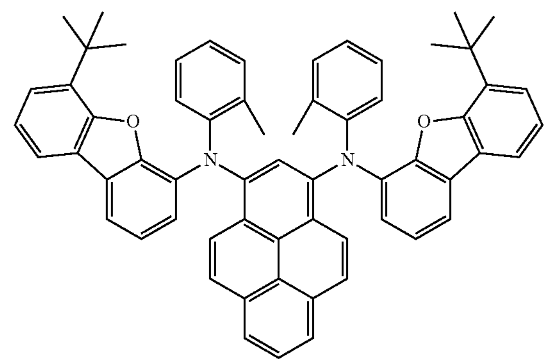
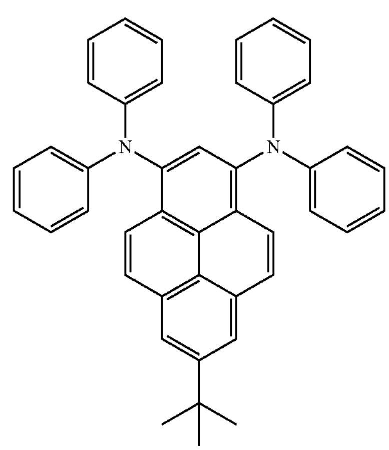

-continued
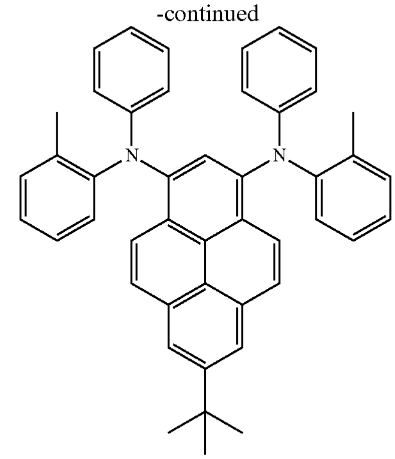
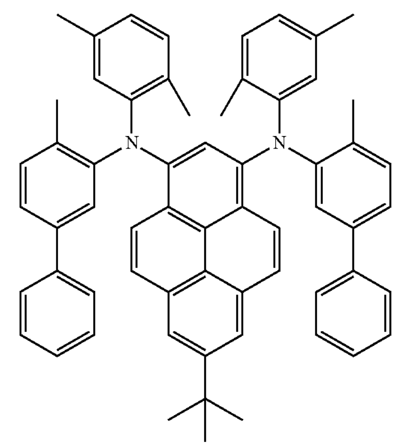
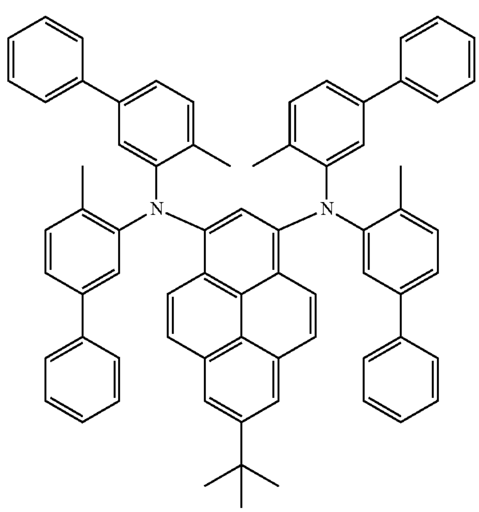
-continued
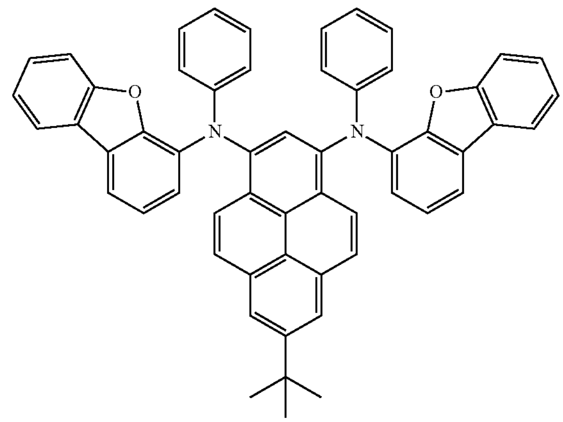
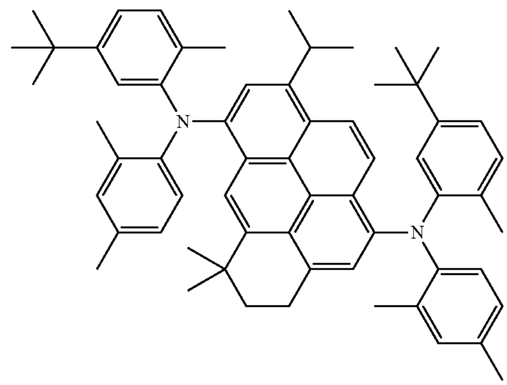
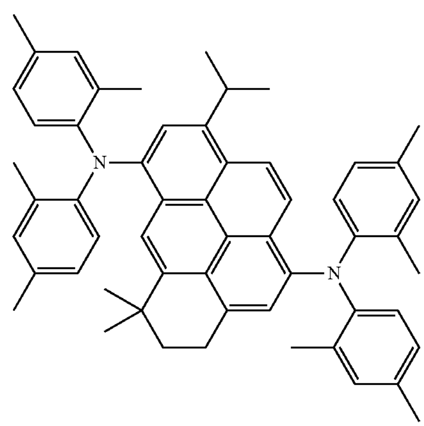
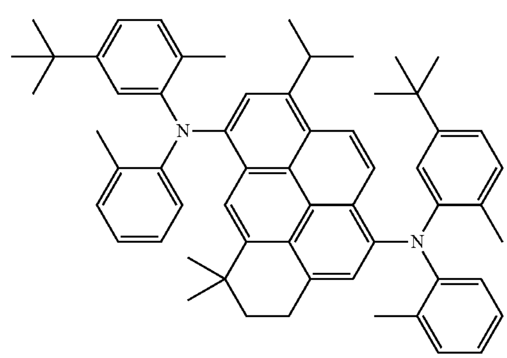

-continued
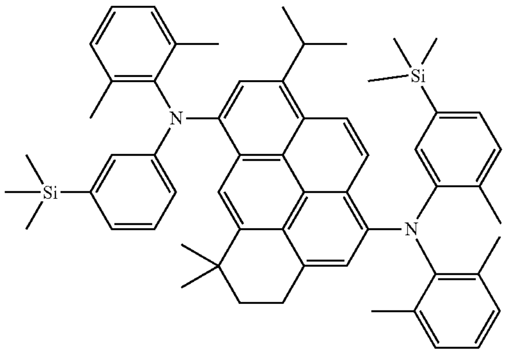
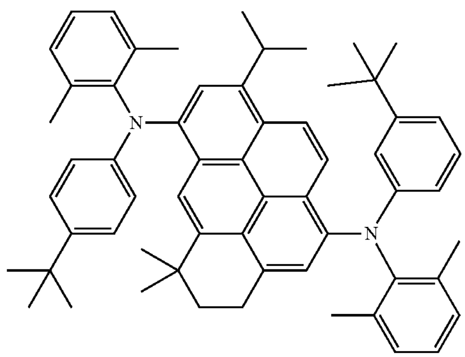
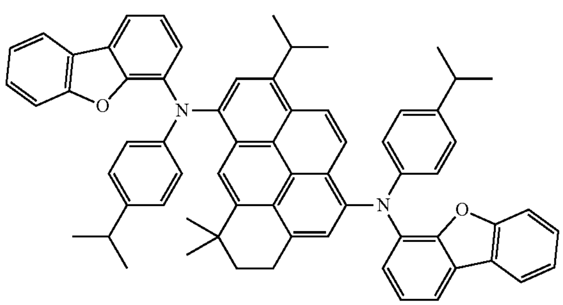
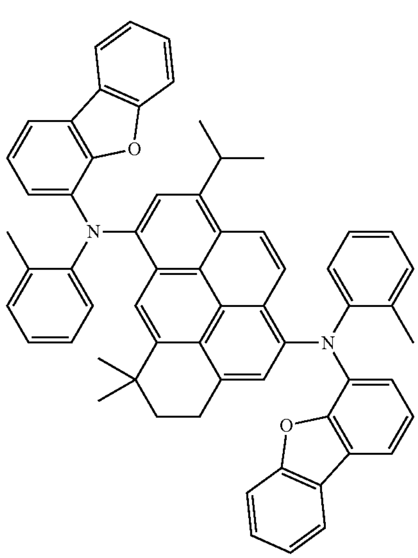
-continued
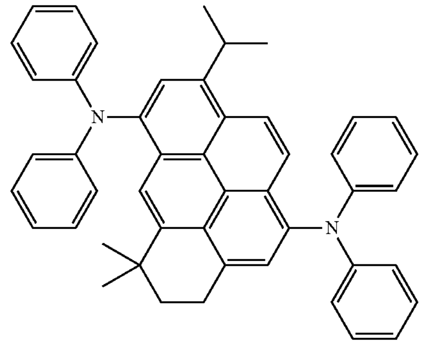
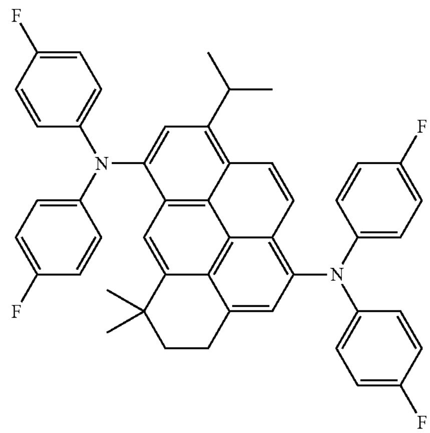
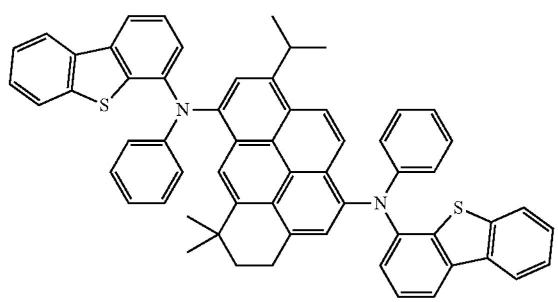
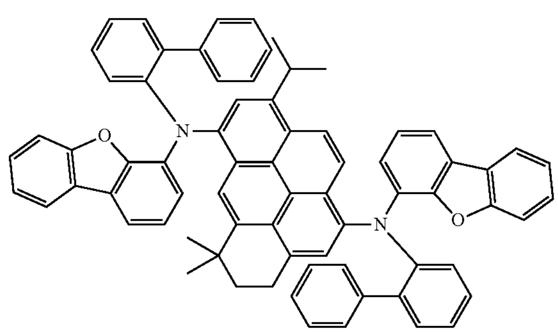

-continued

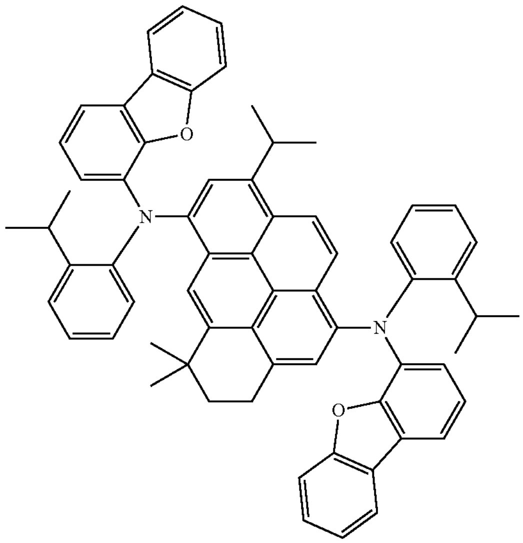

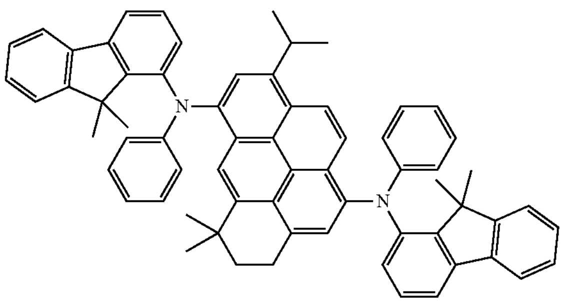

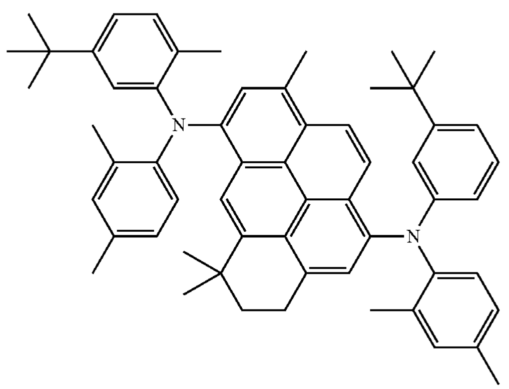

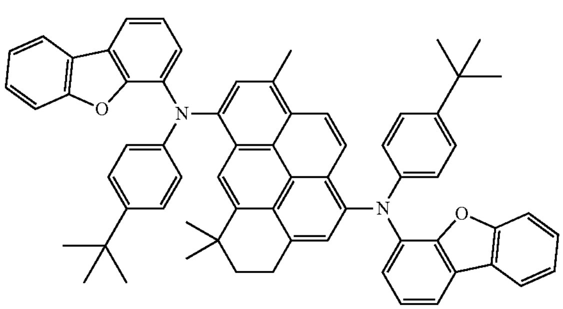

-continued

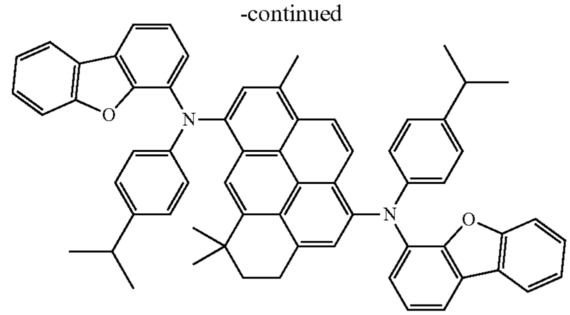

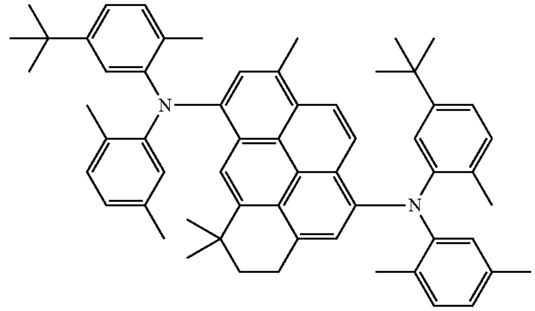 [SMILES: Cc1ccc(C)c(N(c2cc(C(C)(C)C)ccc2C)c2cc(C)c3ccc4c(N(c5cc(C)ccc5C)c5cc(C(C)(C)C)ccc5C)cc5c6c(cc2c3c46)C(C)(C)CC5)c1]

(Compound Represented by the Formula (21))

A compound represented by the formula (21) will be described.

(21)

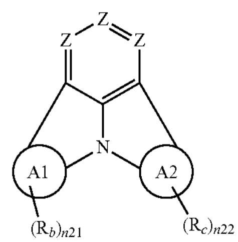

In the formula (21),

Z's are independently $CR_a$ or N.

Ring A1 and ring A2 are independently a substituted or unsubstituted aromatic hydrocarbon ring including 6 to 50 ring carbon atoms, or a substituted or unsubstituted heterocyclic ring including 5 to 50 ring atoms.

When a plurality of $R_a$'s are present, one or more sets of adjacent two or more of the plurality of $R_a$'s form a substituted or unsubstituted, saturated or unsaturated ring by bonding with each other, or do not form a substituted or unsubstituted, saturated or unsaturated ring.

When a plurality of $R_b$'s are present, one or more sets of adjacent two or more of the plurality of $R_b$'s form a substituted or unsubstituted, saturated or unsaturated ring by bonding with each other, or do not form a substituted or unsubstituted, saturated or unsaturated ring.

When a plurality of $R_c$'s are present, one or more sets of adjacent two or more of the plurality of $R_c$'s form a substituted or unsubstituted, saturated or unsaturated ring by bonding with each other, or do not form a substituted or unsubstituted, saturated or unsaturated ring.

n21 and n22 are independently an integer of 0 to 4.

$R_3$ to $R_c$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

The "aromatic hydrocarbon rings" for the ring A1 and the ring A2 each have the same structure as the compound in which a hydrogen atom is introduced into the "aryl group" described above. The "aromatic hydrocarbon rings" for the ring A1 and the ring A2 each include two carbon atoms on the central fused bicyclic structure of the formula (21) as ring atoms. Specific examples of the "substituted or unsubstituted aromatic hydrocarbon rings including 6 to 50 ring carbon atoms" include compounds in which the hydrogen atom is introduced into the "aryl group" described in the specific example group G1, and the like.

The "heterocyclic rings" for the ring A1 and the ring A2 each have the same structure as the compound in which a hydrogen atom is introduced into the "heterocyclic group" described above. The "heterocyclic ring" of the ring A1 and the ring A2 contains two carbon atoms on the central fused bicyclic structure of the formula (21) as ring atoms. Specific examples of the "substituted or unsubstituted heterocyclic ring including 5 to 50 ring atoms" include compounds in which the hydrogen atom is introduced into the "heterocyclic group" described in the specific example group G2, and the like.

$R_b$ is bonded with either carbon atom, which forms aromatic hydrocarbon ring of the ring A1, or with either atom, which forms heterocyclic ring of the ring A1.

$R_c$ is bonded with either carbon atom, which forms aromatic hydrocarbon ring of the ring A2, or with either atom, which forms heterocyclic ring of the ring A2.

It is preferable that at least one (preferably two) of $R_a$ to $R_c$ be a group represented by the following formula (21a).

$$-L_{201}-Ar_{201} \quad (21a)$$

In the formula (21a), $L_{201}$ is a single bond, a substituted or unsubstituted arylene group including 6 to 30 ring carbon atoms, or a substituted or unsubstituted divalent heterocyclic group including 5 to 30 ring atoms.

$Ar_{201}$ is a substituted or unsubstituted aryl group including 6 to 50 ring carbon atoms, a substituted or unsubstituted monovalent heterocyclic group including 5 to 50 ring atoms, or a group represented by the following formula (21 b).

(21b)

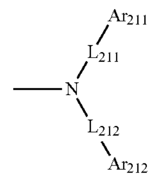

In the formula (21b), $L_{211}$ and $L_{212}$ are independently a single bond, a substituted or unsubstituted arylene group including 6 to 30 ring carbon atoms, or a substituted or unsubstituted divalent heterocyclic group including 5 to 30 ring atoms.

$Ar_{211}$ and $Ar_{212}$ form a substituted or unsubstituted, saturated or unsaturated ring by bonding with each other, or do not form a substituted or unsubstituted, saturated or unsaturated ring.

$Ar_{211}$ and $Ar_{212}$ which do not form a substituted or unsubstituted, saturated or unsaturated ring are independently a substituted or unsubstituted aryl group including 6 to 50 ring carbon atoms, or a substituted or unsubstituted monovalent heterocyclic group including 5 to 50 ring atoms.

In one embodiment, the compound represented by the formula (21) is a compound represented by the following formula (22).

(22)

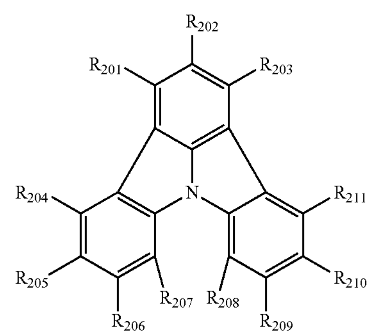

In the formula (22), one or more sets of adjacent two or more of $R_{201}$ to $R_{211}$ form a substituted or unsubstituted, saturated or unsaturated ring by bonding with each other, or do not form a substituted or unsubstituted, saturated or unsaturated ring.

$R_{201}$ to $R_{211}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

It is preferable that at least one (preferably two) of $R_{201}$ to $R_{211}$ be a group represented by the formula (21a). Preferably, $R_{204}$ and $R_{211}$ are groups represented by the formula (21a).

In one embodiment, the compound represented by the formula (21) is a compound in which a structure represented by the following formula (21-1) or (21-2) is bonded with the ring A1. In one embodiment, the compound represented by the formula (22) is a compound in which a structure represented by the following formula (21-1) or (21-2) is bonded with the ring with which $R_{204}$ to $R_{207}$ are bonded.

(21-1)

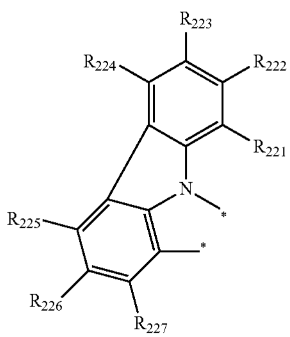

(21-2)

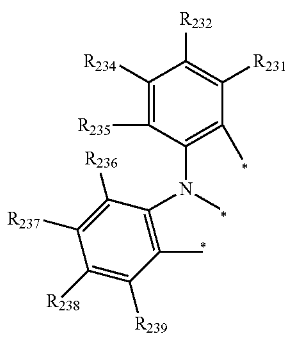

In the formula (21-1), the two of "*" are respectively bonded with the ring carbon atoms of the aromatic hydrocarbon ring or the ring atoms of the heterocyclic ring of the ring A1 in the formula (21), or with either $R_{204}$ to $R_{207}$ in the formula (22).

The three of "*" in the formula (21-2) are respectively bonded with the ring carbon atoms of the aromatic hydrocarbon ring or the ring atoms of the heterocyclic ring of the ring A1 in the formula (22), or with either $R_{204}$ to $R_{207}$ in the formula (22).

One or more sets of adjacent two or more of $R_{221}$ to $R_{227}$ and $R_{231}$ to $R_{239}$ form a substituted or unsubstituted, saturated or unsaturated ring by bonding with each other, or do not form a substituted or unsubstituted, saturated or unsaturated ring.

$R_{221}$ to $R_{227}$ and $R_{231}$ to $R_{239}$ which do not form a substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

In one embodiment, the compound represented by the formula (21) is a compound represented by the following formula (21-3), formula (21-4), or formula (21-5).

(21-3)

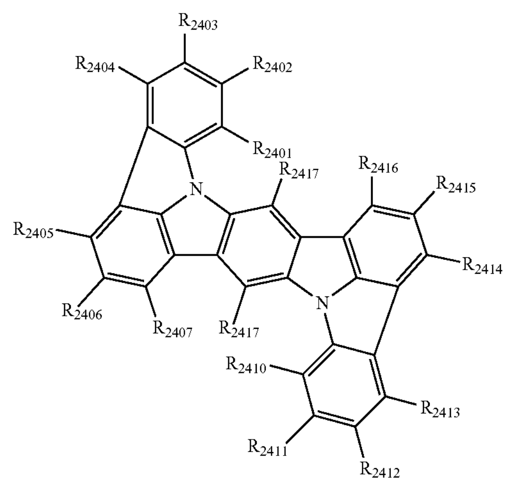

(21-4)

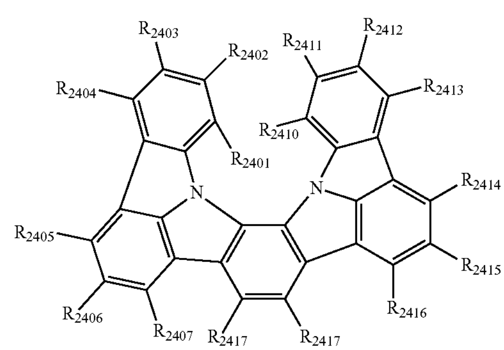

-continued (21-5)

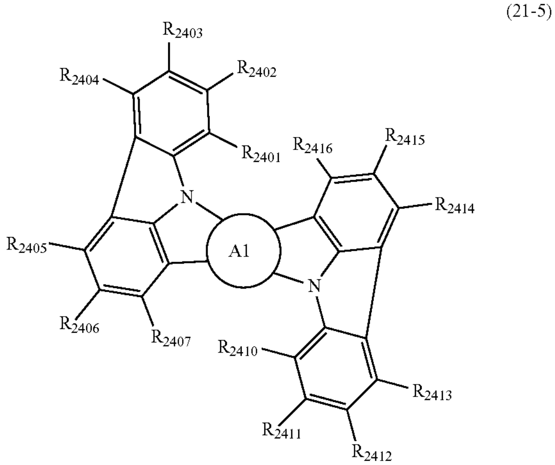

In the formula (21-3), formula (21-4), and formula (21-5), the ring A1 is as defined in the formula (21).

$R_{2401}$ to $R_{2407}$ are the same as $R_{221}$ to $R_{227}$ in the formula (21-1) and (21-2). $R_{2410}$ to $R_{2417}$ are the same as $R_{201}$ to $R_{211}$ in the formula (22).

In one embodiment, the substituted or unsubstituted aromatic hydrocarbon ring including 6 to 50 ring carbon atoms of the ring A1 in the formula (21-5) is a substituted or unsubstituted naphthalene ring or a substituted or unsubstituted fluorene ring.

In one embodiment, the substituted or unsubstituted heterocyclic ring including 5 to 50 ring atoms of the ring A1 in the formula (21-5) is a substituted or unsubstituted dibenzofuran ring, a substituted or unsubstituted carbazole ring, or a substituted or unsubstituted dibenzothiophene ring.

In one embodiment, the compound represented by the formula (21) or formula (22) is selected from the group consisting of compounds represented by each of the following formulas (21-6-1) to (21-6-7).

(21-6-1)

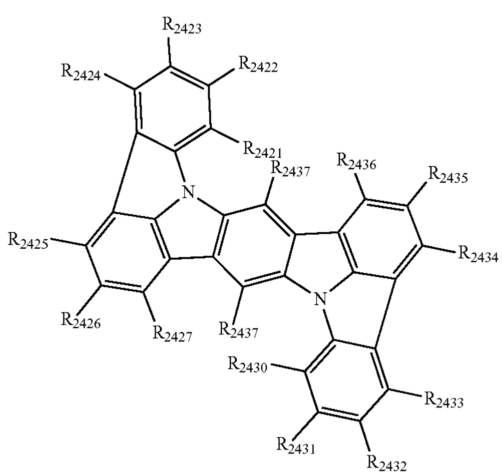

-continued (21-6-2)

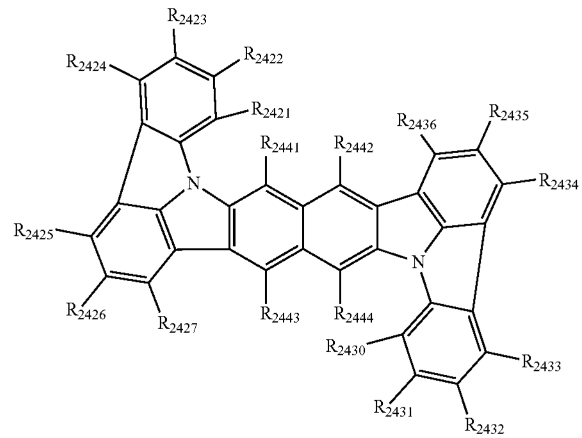

(21-6-3)

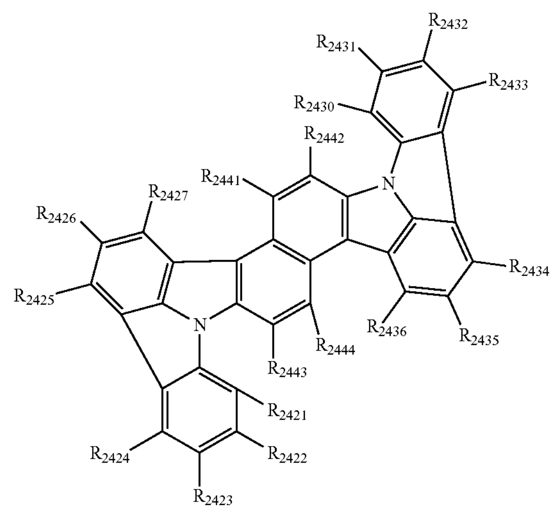

(21-6-3)

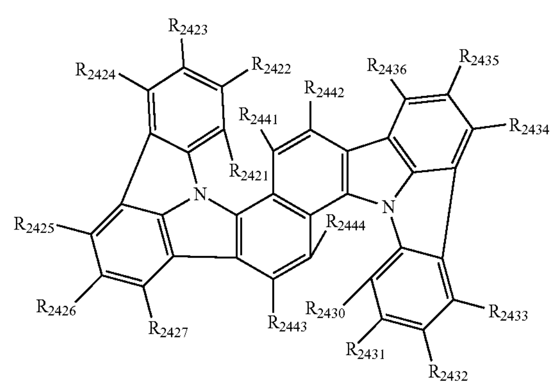

-continued (21-6-5)

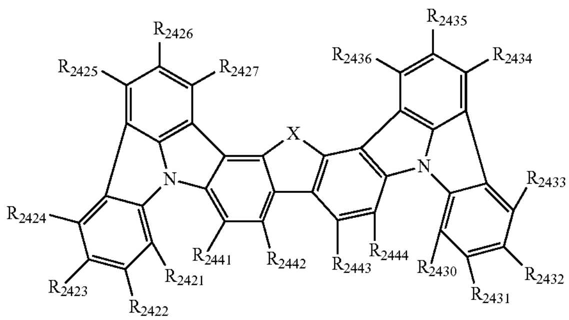

(21-6-6)

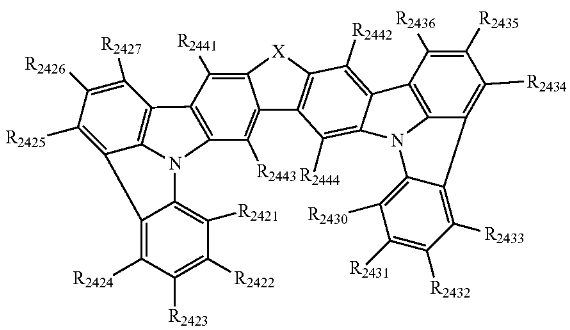

(21-6-7)

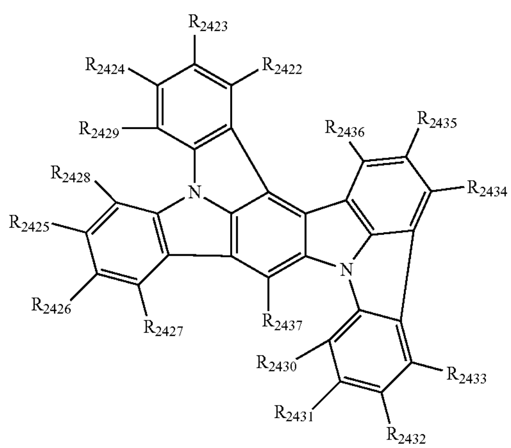

In the formulas (21-6-1) to (21-6-7), $R_{2421}$ to $R_{2427}$ is the same as $R_{221}$ to $R_{227}$ in the formulas (21-1) and (21-2). $R_{2430}$ to $R_{2437}$ and $R_{2441}$ to $R_{2444}$ are the same as $R_{201}$ to $R_{211}$ in the formula (22).

X is O, $NR_{901}$, or $C(R_{902})(R_{903})$.

$R_{901}$ to $R_{903}$ are as defined in the formula (1).

In one embodiment, in the compound represented by the formula (22), one or more sets of adjacent two or more of $R_{201}$ to $R_{211}$ form a substituted or unsubstituted, saturated or unsaturated ring by bonding with each other. This embodiment will be described in detail below as the formula (25).

(Compound Represented by the Formula (25))

A compound represented by the formula (25) will be described.

(25)

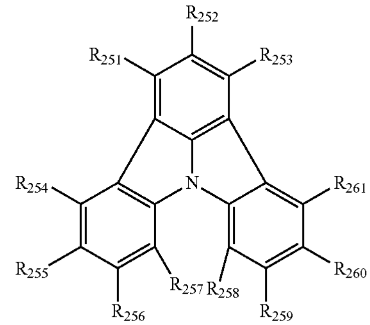

In the formula (25), two or more of the sets selected from the group consisting of $R_{251}$ and $R_{252}$, $R_{252}$ and $R_{253}$, $R_{254}$ and $R_{255}$, $R_{255}$ and $R_{256}$, $R_{256}$ and $R_{257}$, $R_{258}$ and $R_{259}$, $R_{259}$ and $R_{260}$, and $R_{260}$ and $R_{261}$ form a substituted or unsubstituted, saturated or unsaturated ring by bonding with each other;

provided that a set of $R_{251}$ and $R_{252}$ and a set of $R_{252}$ and $R_{253}$; a set of $R_{254}$ and $R_{255}$ and a set of $R_{255}$ and $R_{256}$; a set of $R_{255}$ and $R_{256}$ and a set of $R_{256}$ and $R_{257}$; a set of $R_{258}$ and $R_{259}$ and a set of $R_{259}$ and $R_{260}$; and a set of $R_{259}$ and $R_{260}$ and a set of $R_{260}$ and $R_{261}$ do not form rings at the same time.

The two or more rings formed by $R_{251}$ to $R_{261}$ may be the same as or different from each other.

$R_{251}$ to $R_{261}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—($R_{904}$),

—S—($R_{905}$),

—$N(R_{9013})$ ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

In the formula (25), $R_n$ and $R_{n+1}$ (n represents an integer selected from 251,252,254 to 256, and 258 to 260) form a substituted or unsubstituted, saturated or unsaturated ring, together with the two ring carbon atoms with which $R_n$ and $R_{n+1}$ are bonded, by bonding with each other. The ring is preferably composed of atoms selected from C atom, O atom, S atom, and N atom, and the number of atoms is preferably 3 to 7, and more preferably 5 or 6.

The number of ring structures described above in the compound represented by the formula (25) is, for example, 2,3, or 4. The two or more ring structures may be present on the same benzene ring of the mother skeleton in the formula (25), respectively, or may be present on the different benzene rings. For example, when the compound has three ring structures, a ring structure may be present in each of the three benzene rings in the formula (25) one by one.

Examples of the above-mentioned ring structure in the compound represented by the formula (25) include structures represented by each of the following formulas (251) to (260), and the like.

(251)

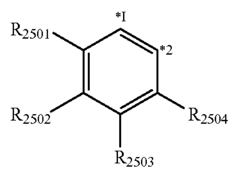

(252)

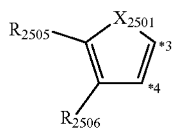

(253)

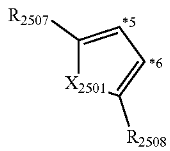

(254)

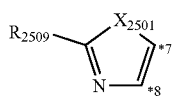

(255)

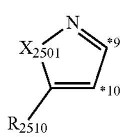

(256)

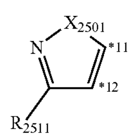

(257)

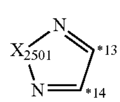

In the formula (251) to (257), each of *1 and *2, *3 and *4, *5 and *6, *7 and *8, *9 and *10, *11 and *12, and *13 and *14 represents the two ring carbon atoms with which $R_n$ and $R_{n+1}$ are bound, and ring carbon atoms with which $R_n$ is bonded may be any of the two ring carbon atoms represented by *1 and *2, *3 and *4, *5 and *6, *7 and *8, *9 and *10, *11 and *12, and *13 and *14.

$X_{2501}$ is $C(R_{2512})$ $(R_{2513})$, $NR_{2514}$, O, or S.

One or more sets of adjacent two or more of $R_{2501}$ to $R_{2506}$ and $R_{2512}$ to $R_{2513}$ form a substituted or unsubstituted, saturated or unsaturated ring by bonding with each other, or do not form a substituted or unsubstituted, saturated or unsaturated ring.

$R_{2501}$ to $R_{2514}$ which do not form the substituted or unsubstituted, saturated or unsaturated ring are the same as $R_{251}$ to $R_{261}$.

(258)

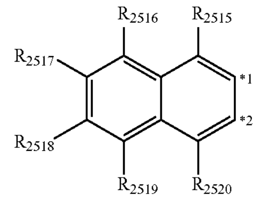

(259)

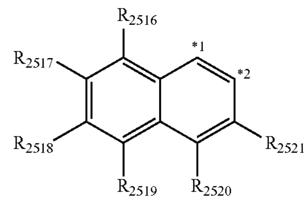

(260)

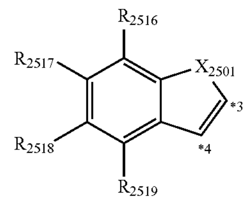

In the formulas (258) to (260), *1 and *2, and *3 and *4 each represent the two ring carbon atoms with which $R_n$ and $R_{n+1}$ are bonded, and ring carbon atoms with which $R_n$ is bonded may be either two ring carbon atoms represented by *1 and *2, or *3 and *4.

$X_{2501}$ is $C(R_{2512})$ $(R_{2513})$, $NR_{2514}$, O, or S.

One or more sets of adjacent two or more of $R_{2515}$ to $R_{2525}$ form a substituted or unsubstituted, saturated or unsaturated ring by bonding with each other, or do not form a substituted or unsubstituted, saturated or unsaturated ring.

$R_{2515}$ to $R_{252}$: and $R_{2522}$ to $R_{2525}$ which do not form a substituted or unsubstituted, saturated or unsaturated ring are the same as $R_2SI$ to $R_{231}$.

In the formula (25), at least one of $R_{252}$, $R_{254}$, $R_{255}$, $R_{230}$, and $R_{231}$ (preferably at least one of $R_{252}$, $R_{255}$, and $R_{230}$, and more preferably $R_{252}$) is preferably a group which does not form a ring structure.

Preferably, (i) the substituent when the ring formed by $R_n$ and $R_{n+1}$ in the formula (25) has a substituent, (ii) $R_{251}$ to $R_{231}$ which do not form a ring structure in the formula (25), and (iii) $R_{2501}$ to $R_{2514}$ and $R_{2515}$ to $R_{2525}$ in the formulas (251) to (260) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms,

—$N(R_{906})$ $(R_{907})$, a substituted or unsubstituted aryl group including 6 to 50 ring carbon atoms, a substituted or unsubstituted monovalent heterocyclic group including 5 to 50 ring atoms, or any of the groups selected from the following groups.

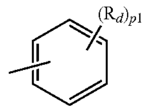

(261)

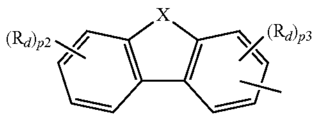

(262)

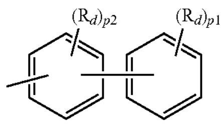

(263)

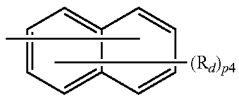

(264)

In the formulas (261) to (264), $R_d$'s are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

X is C($R_{901}$)($R_{902}$), $NR_{903}$, O, or S.

$R_{901}$ to $R_{907}$ are as defined in the formula (1).

p1 's are independently an integer of 0 to 5, p2's are independently an integer of 0 to 4, p3 is an integer of 0 to 3, and p4 is an integer of 0 to 7.

In one embodiment, the compound represented by the formula (25) is a compound represented by any of the following formulas (25-1) to (25-6).

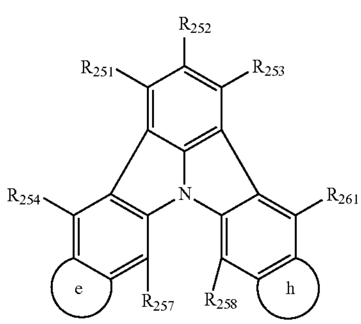

(25-1)

-continued

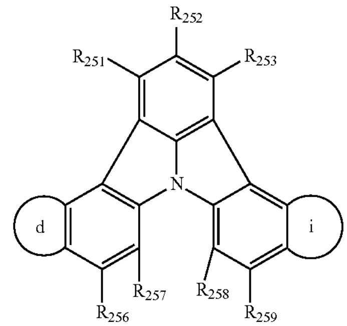

(25-2)

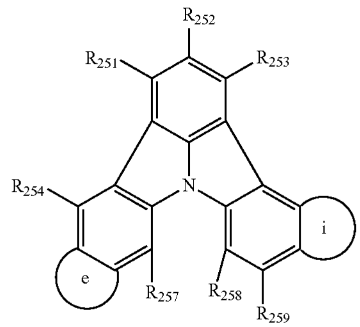

(25-3)

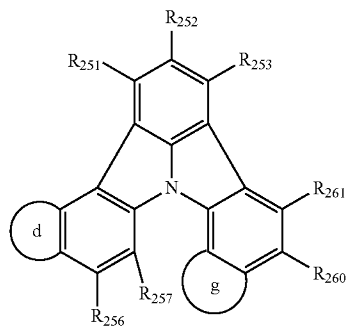

(25-4)

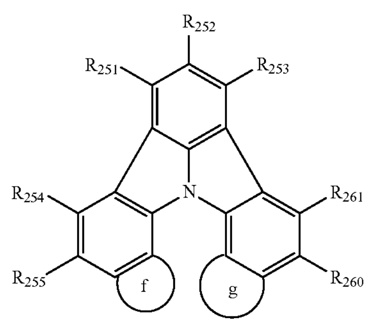

(25-5)

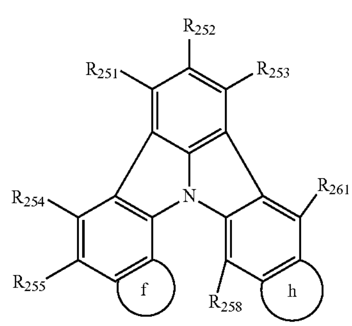

(25-6)

In the formulas (25-1) to (25-6), rings d to i are independently a substituted or unsubstituted, saturated or unsaturated ring; and $R_{251}$ to $R_{261}$ are the same as in the formula (25).

In one embodiment, the compound represented by the formula (25) is a compound represented by any of the following formulas (25-7) to (25-12).

(25-7)

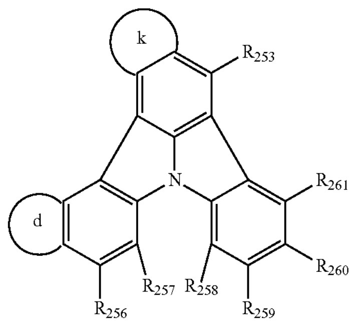

(25-8)

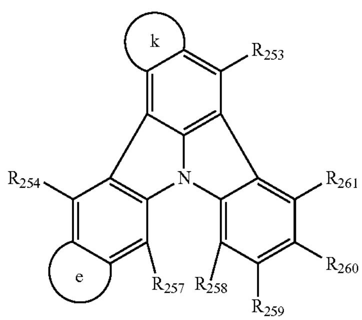

(25-9)

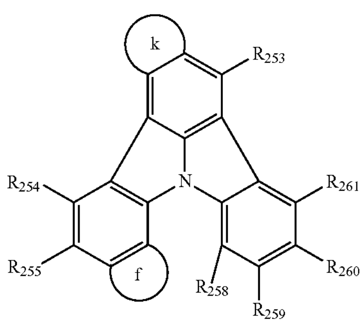

(25-10)

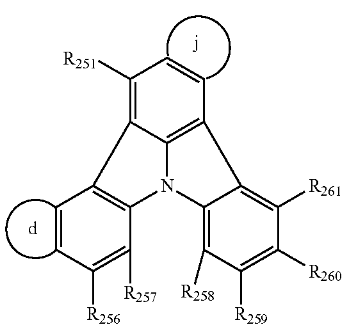

-continued (25-11)

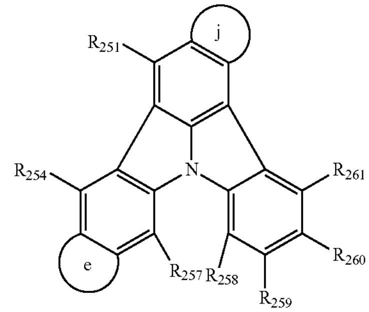

(25-12)

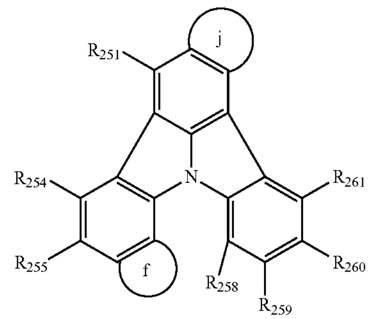

In the formulas (25-7) to (25-12), rings d to f, k, and j are independently a substituted or unsubstituted, saturated or unsaturated ring; and $R_{251}$ to $R_{261}$ are the same as in the formula (25).

In one embodiment, the compound represented by the formula (25) is a compound represented by any of the following formulas (25-13) to (25-21).

(25-13)

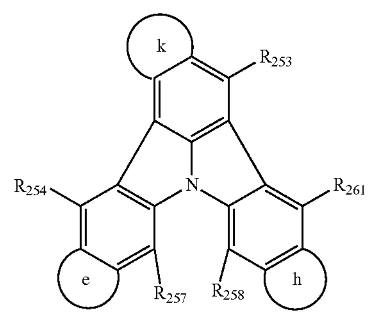

(25-14)

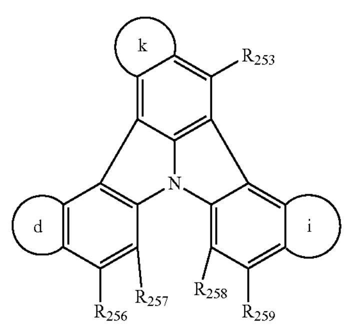

-continued (25-15)

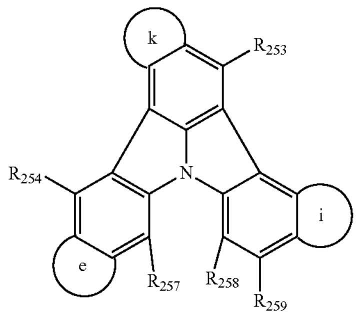

(25-16)

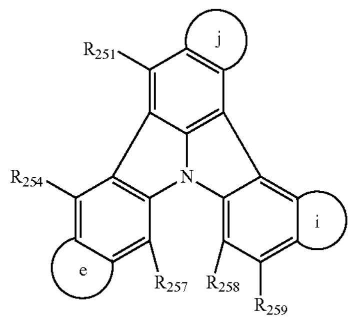

(25-17)

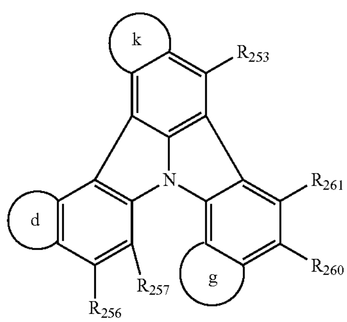

(25-18)

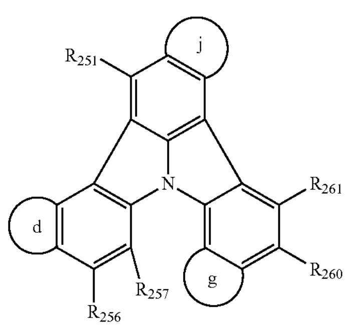

(25-19)

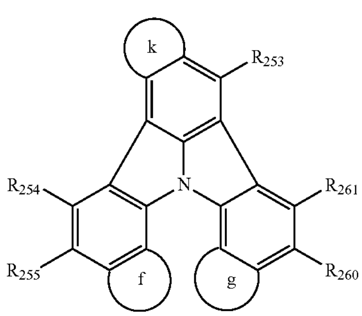

-continued (25-20)

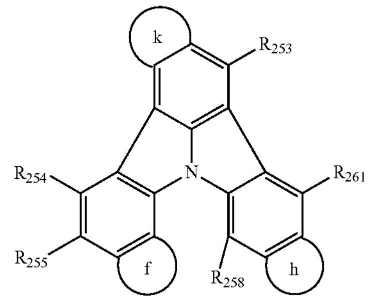

(25-21)

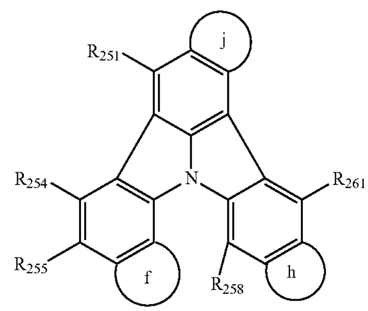

In the formulas (25-13) to (25-21), rings d to k are independently a substituted or unsubstituted, saturated or unsaturated ring; and $R_{251}$ to $R_{261}$ are the same as in the formula (25).

Examples of the substituent when the ring g or h further has a substituent include, for example, a substituted or unsubstituted alkyl group including 1 to 50 carbon atoms, a substituted or unsubstituted aryl group including 6 to 50 ring carbon atoms, or the group represented by the formula (261), (263), or (264).

In one embodiment, the compound represented by the formula (25) is a compound represented by any of the following formulas (25-22) to (25-25).

(25-22)

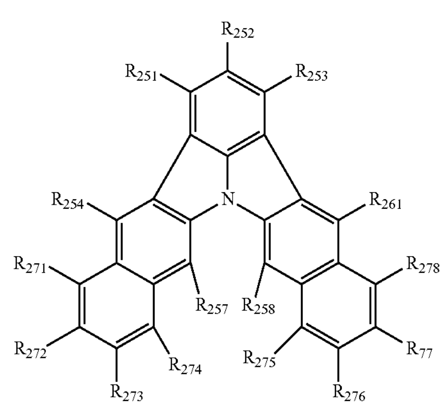

-continued (25-23)

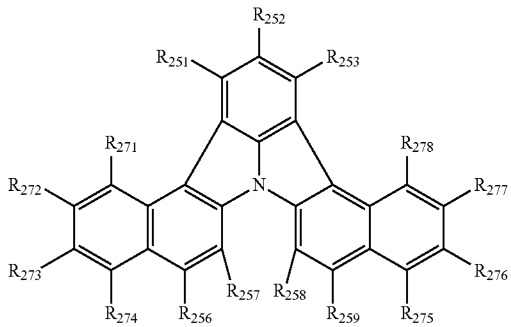

(25-24)

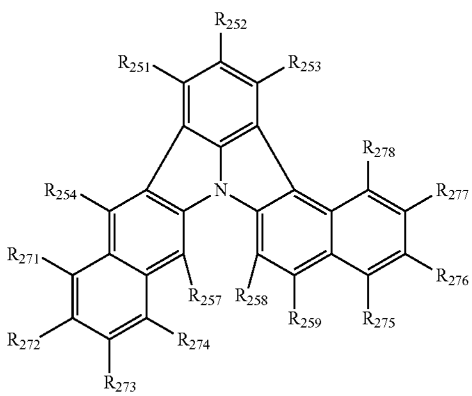

(25-25)

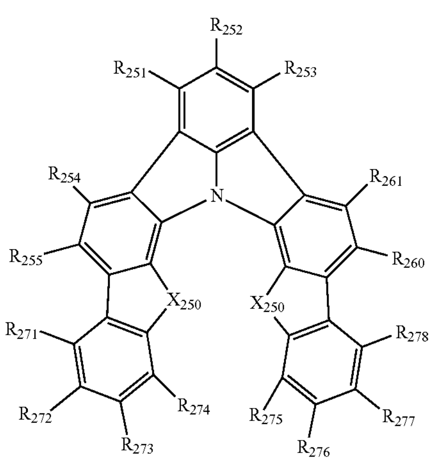

In the formulas (25-22) to (25-25), $X_{250}$'s are independently $C(R_{901})(R_{902})$, $NR_{903}$, O, or S. $R_{251}$ to $R_{261}$, and $R_{271}$ to $R_{278}$ are the same as $R_{251}$ to $R_{261}$ in the formula (25). $R_{901}$ to $R_{903}$ are as defined in the formula (1).

In one embodiment, the compound represented by the formula (25) is a compound represented by the following formula (25-26).

(25-26)

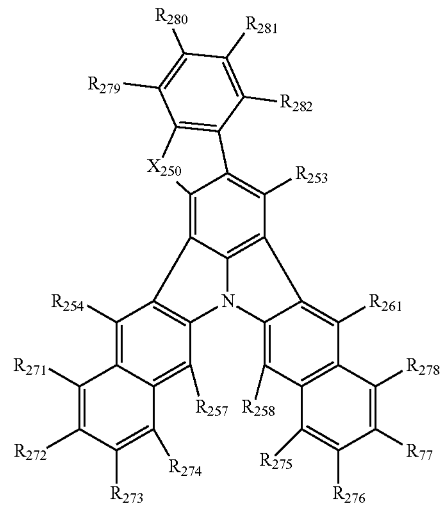

In the formula (25-26), $X_{250}$ is $C(R_{901})$ $(R_{902})$, $NR_{903}$, O, or S. $R_{253}$, $R_{254}$, $R_{257}$, $R_{258}$, $R_{261}$, and $R_{271}$ to $R_{282}$ are the same as $R_{251}$ to $R_{261}$ in the formula (25). $R_{901}$ to $R_{903}$ are as defined in the formula (1).

Examples of the compound represented by the formula (21) include, for example, compounds shown below as specific examples. In the following specific examples, "Me" represents a methyl group.

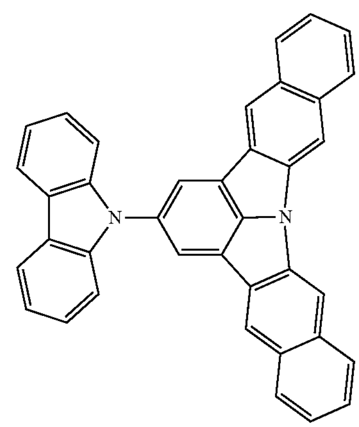

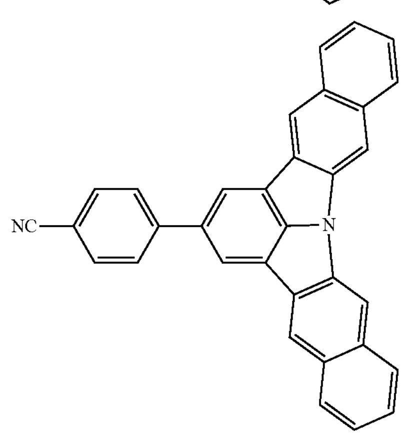

-continued
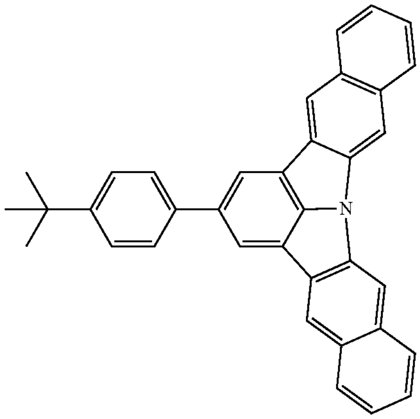
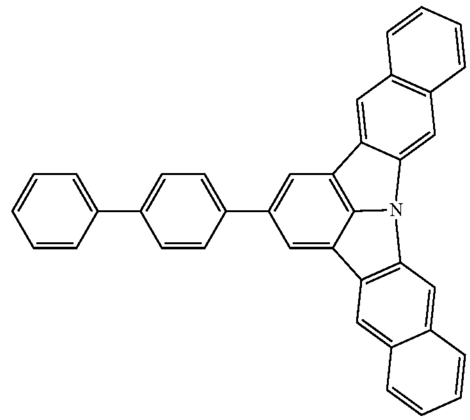
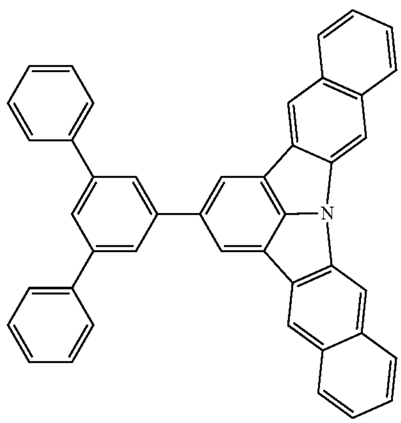
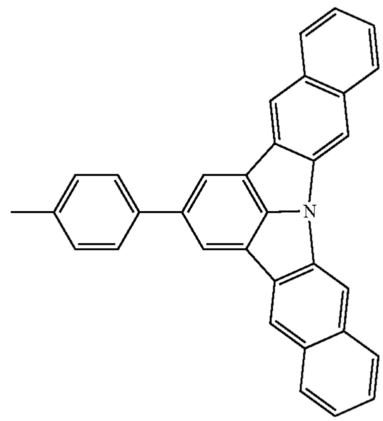
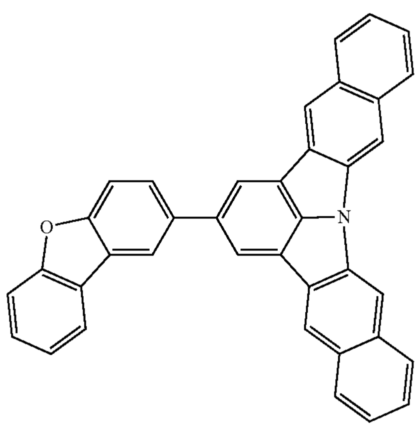
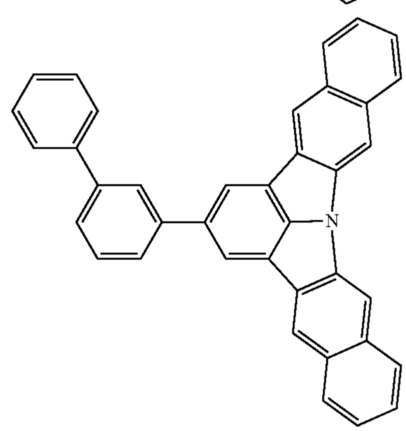
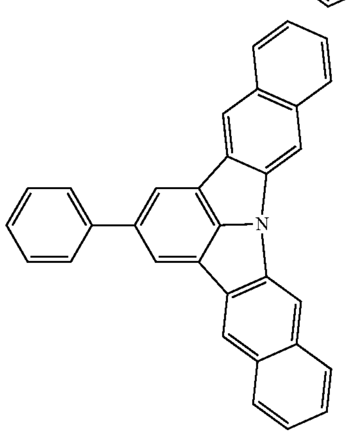
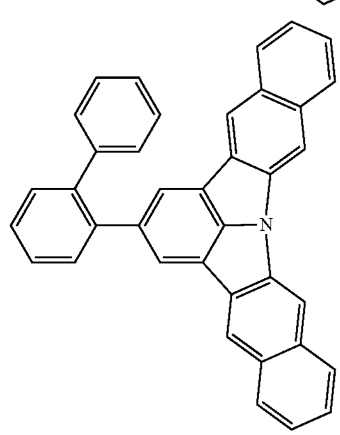
-continued -continued
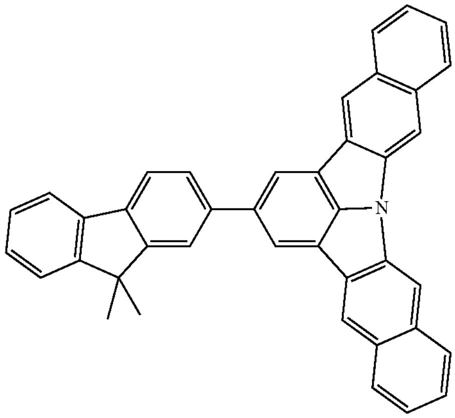
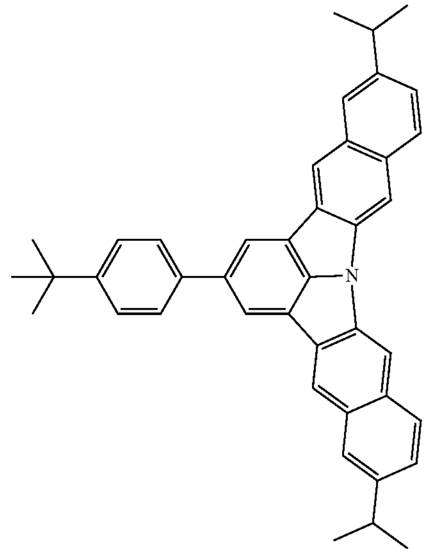
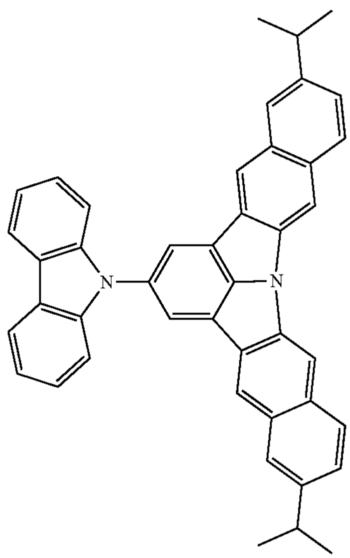
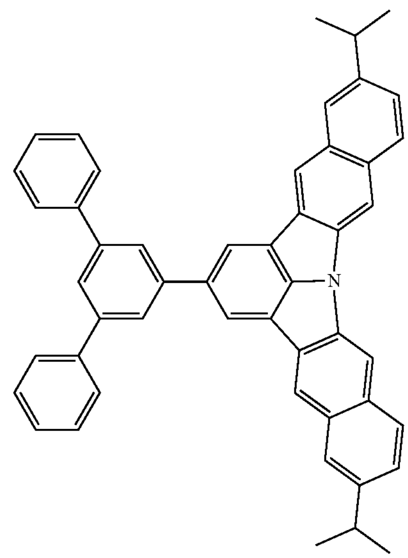
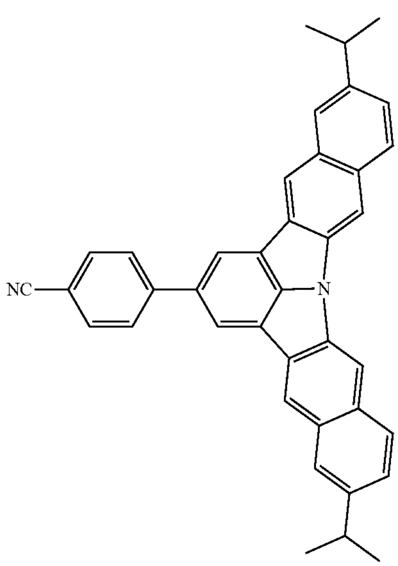
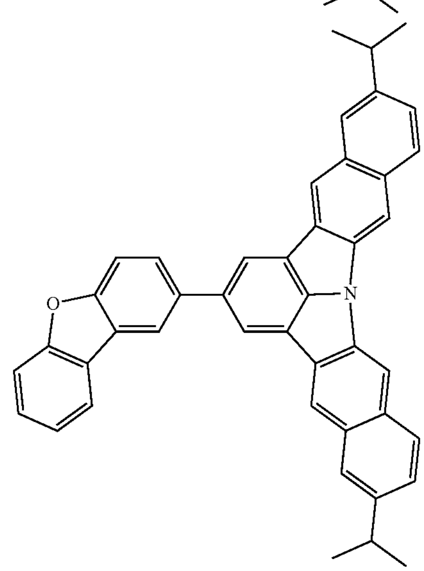

-continued
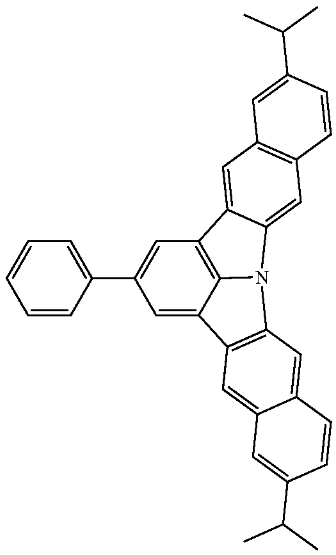
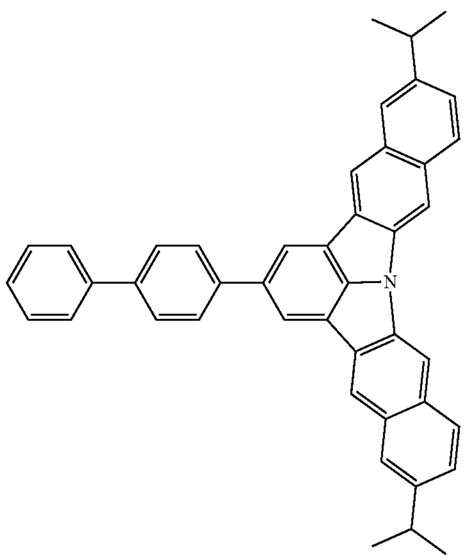
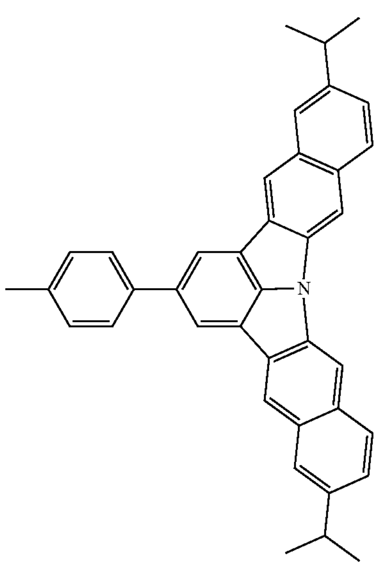
-continued
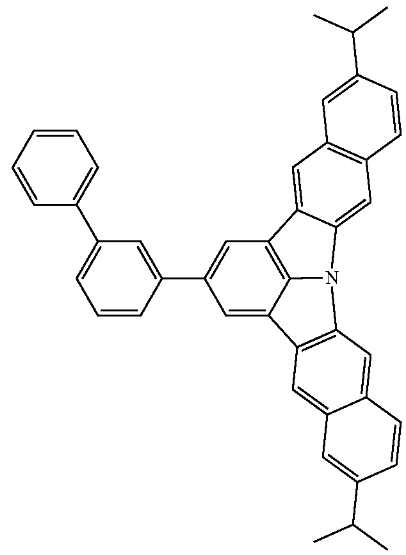
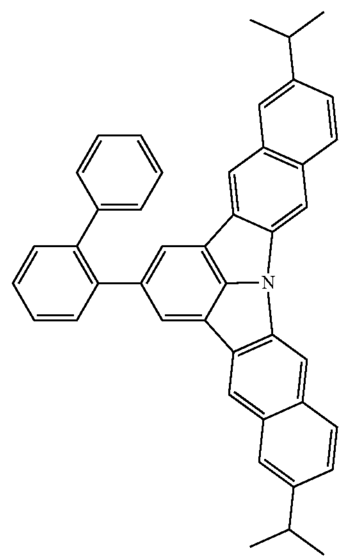
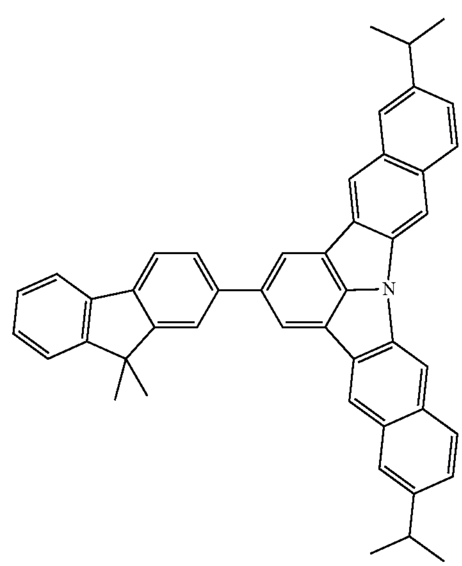

-continued
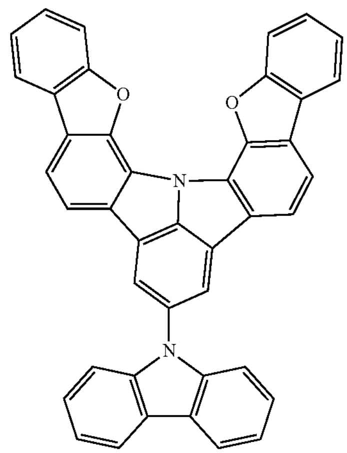
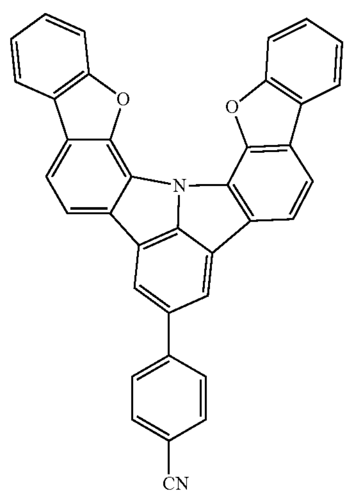
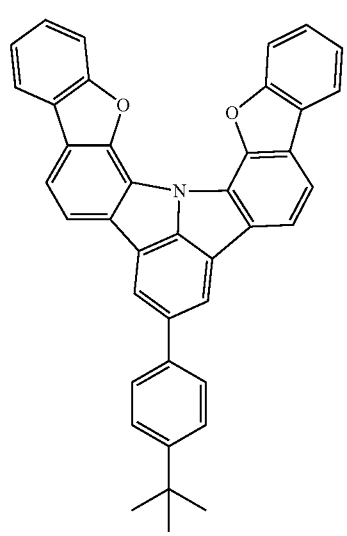
-continued
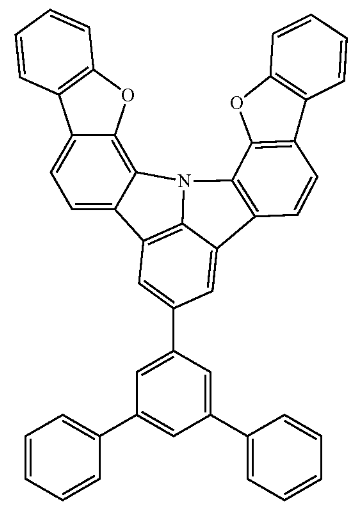
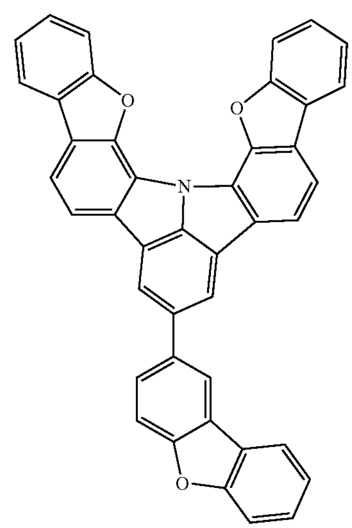
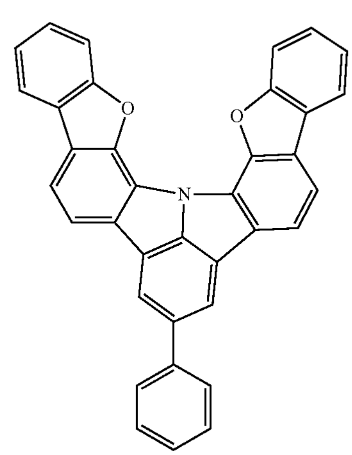

-continued
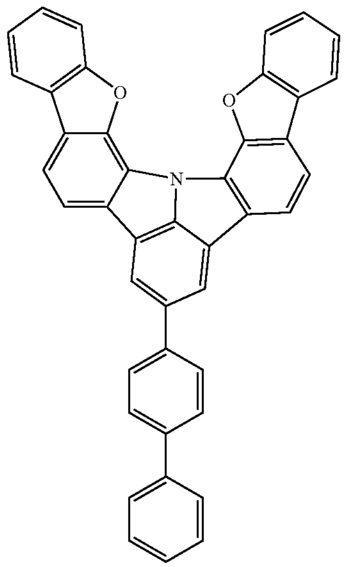
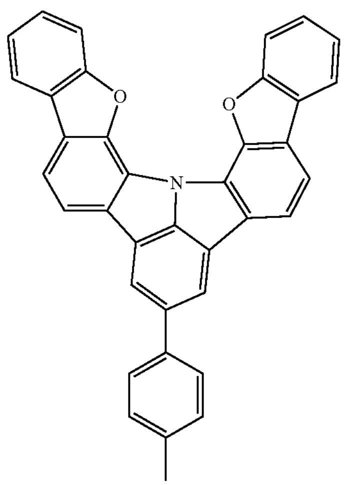
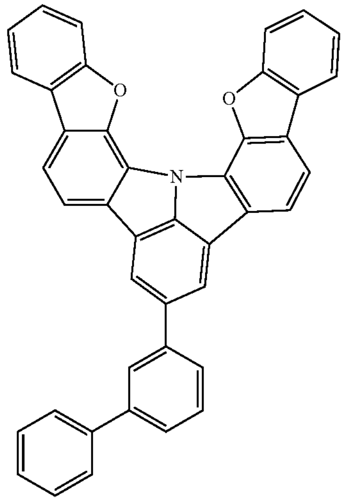
-continued
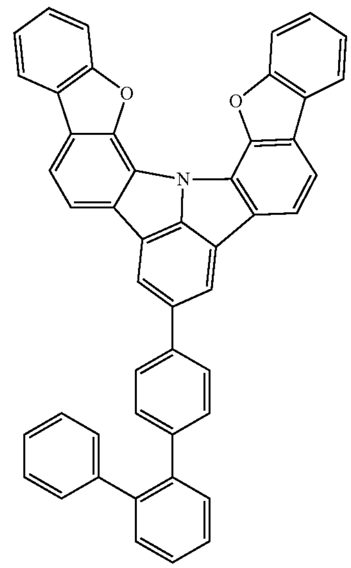
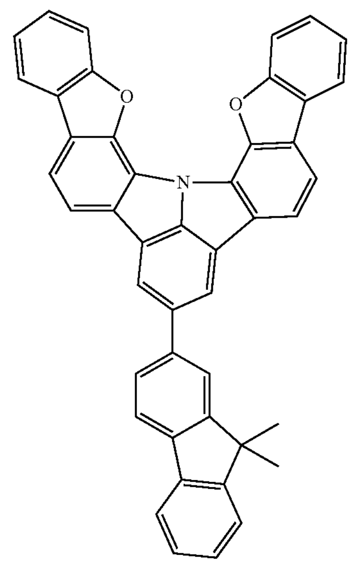
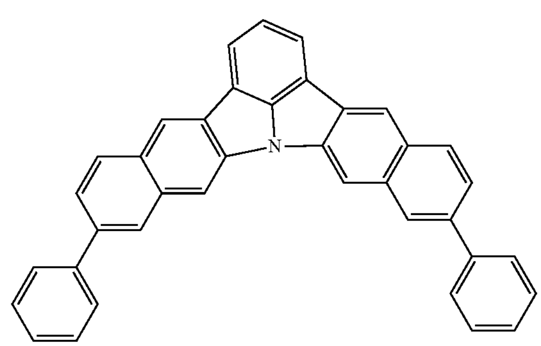

-continued
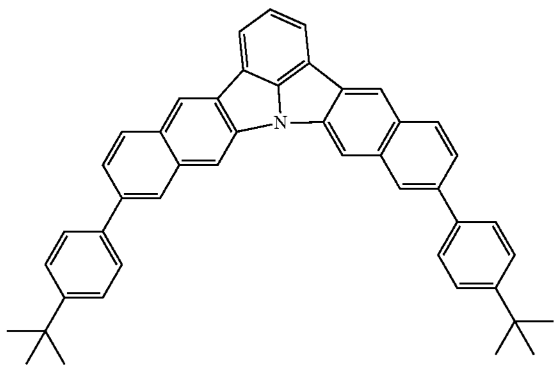
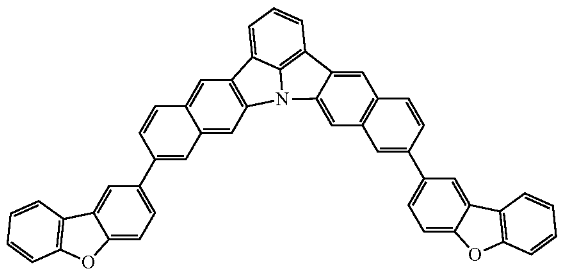
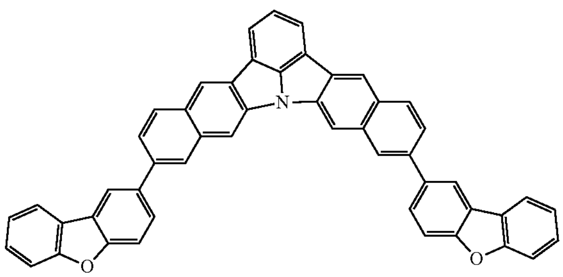
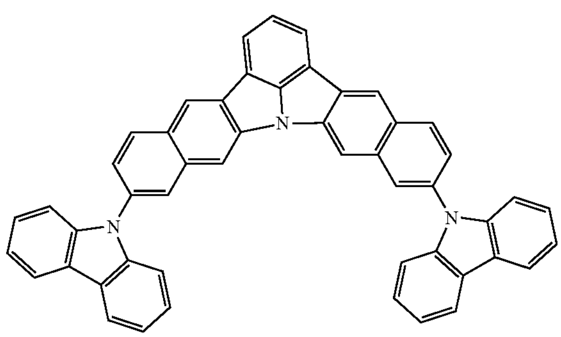
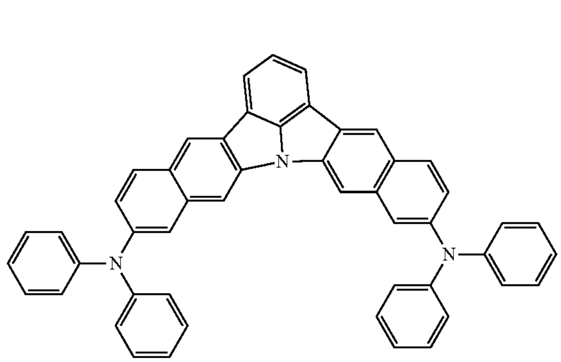
-continued
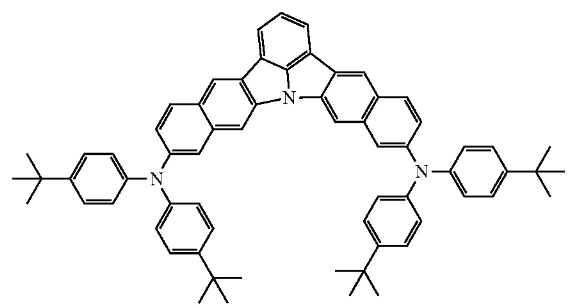
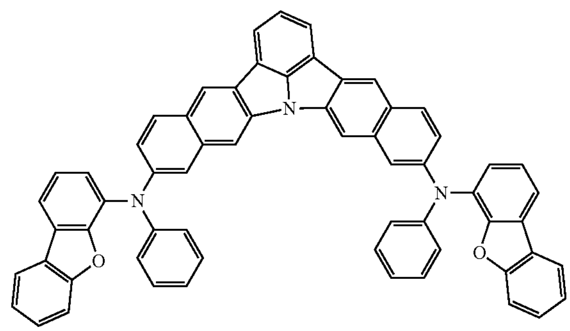
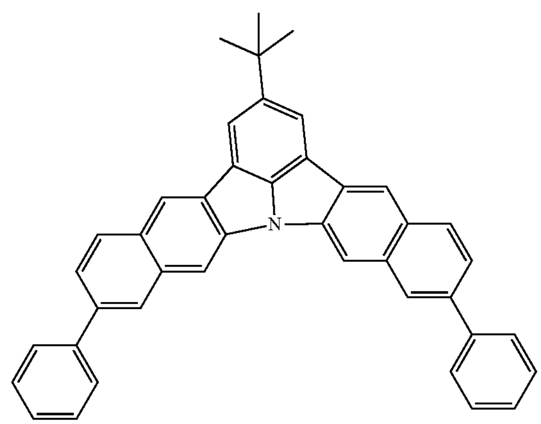
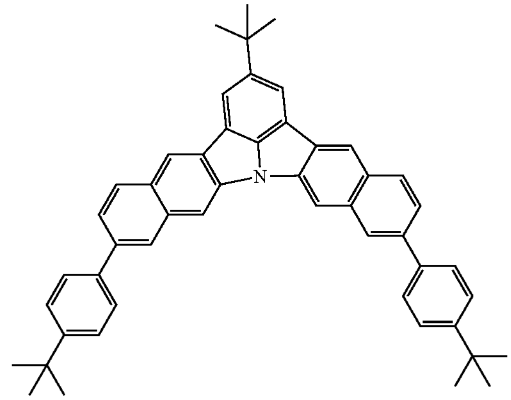

-continued
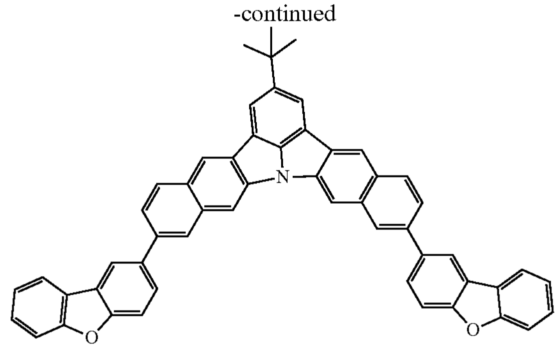
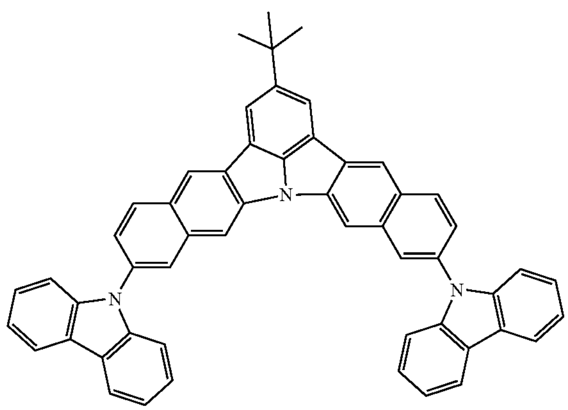
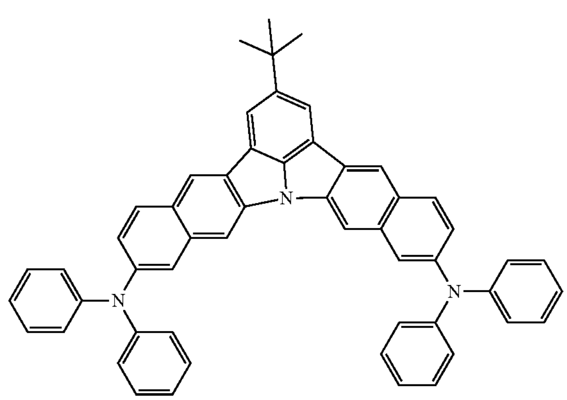
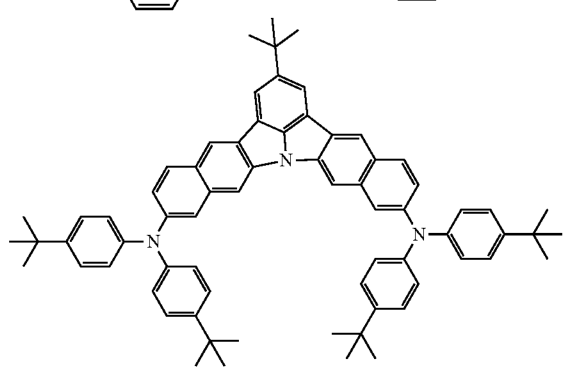
-continued
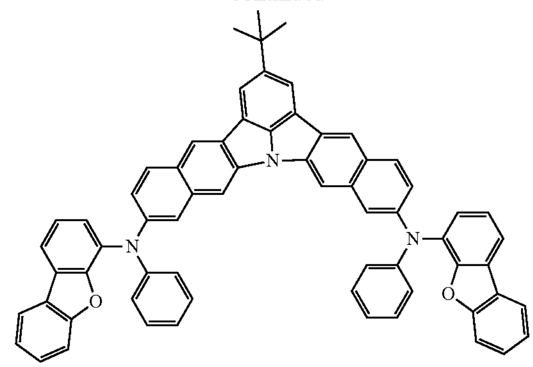
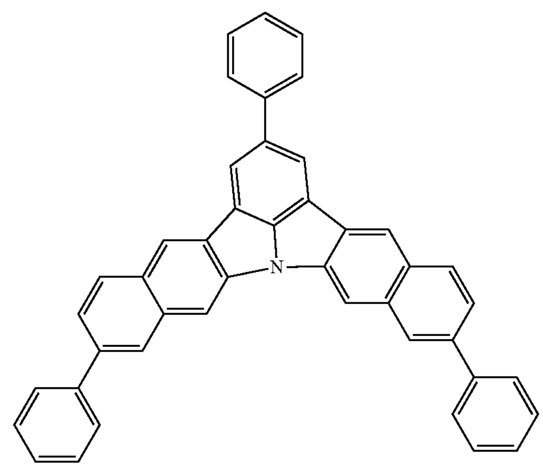
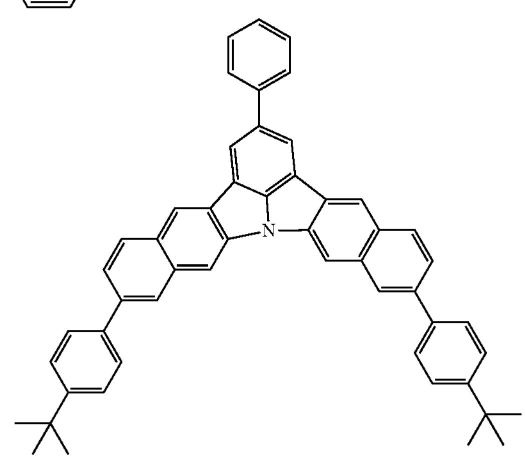
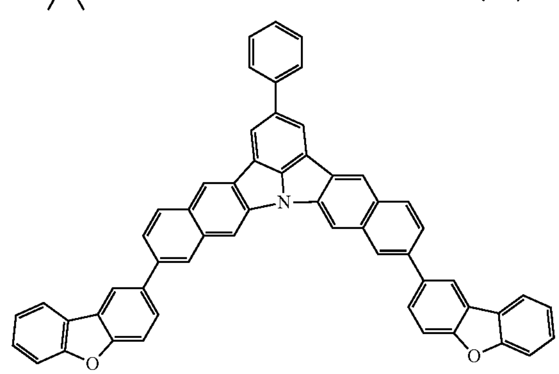

-continued
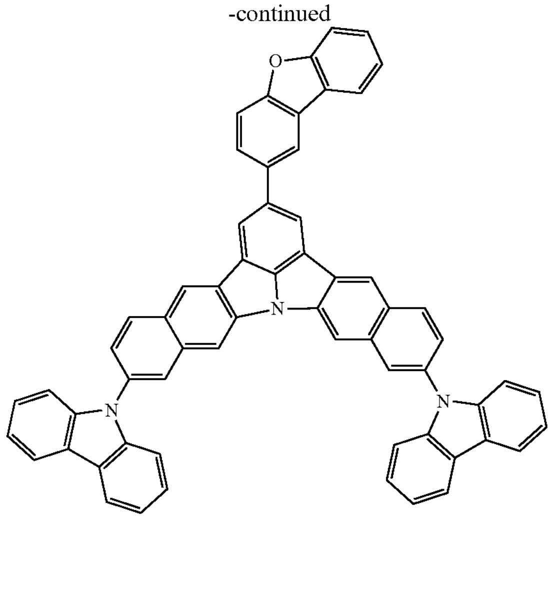
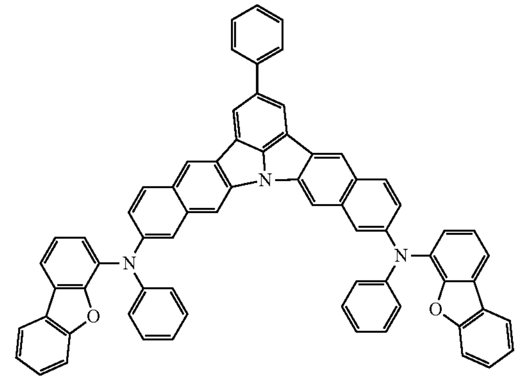
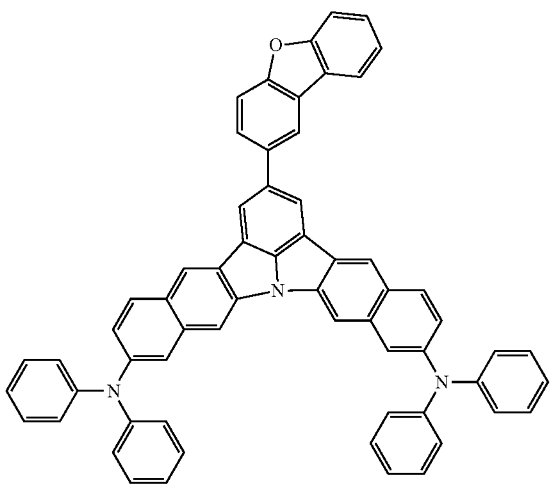
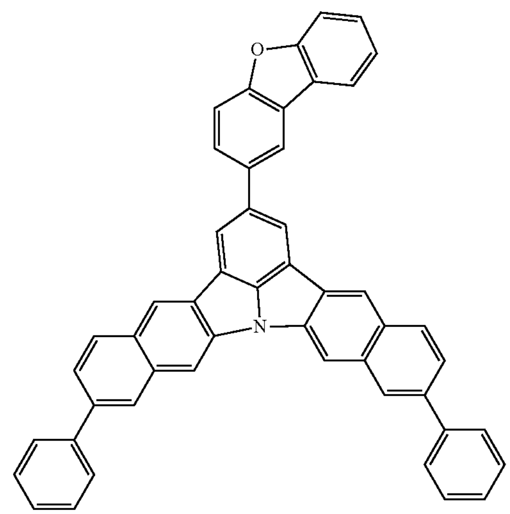
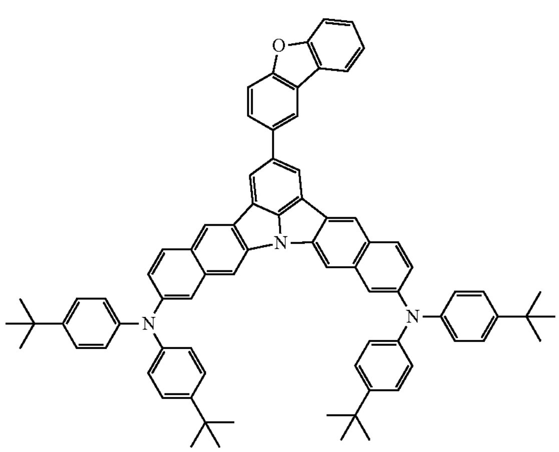
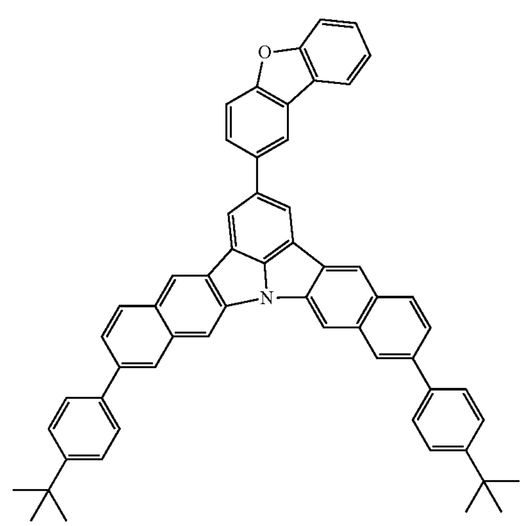

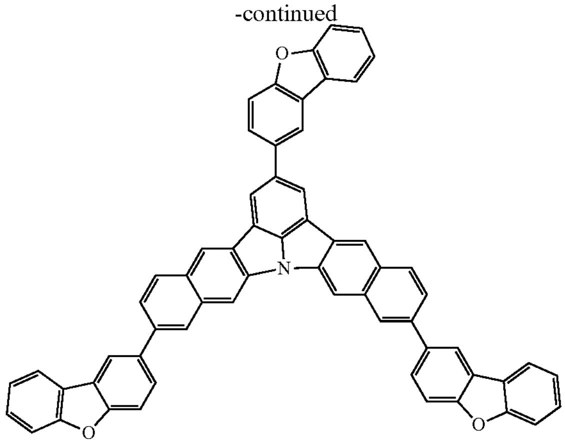
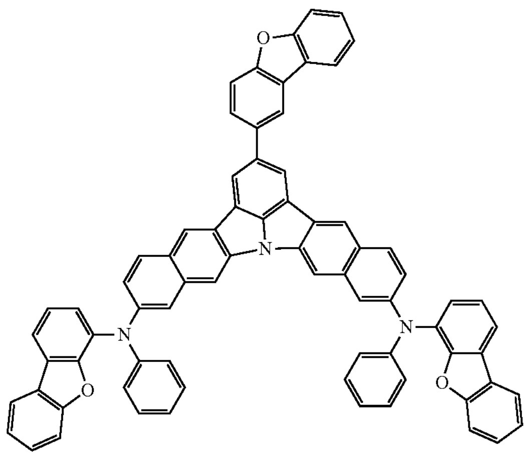
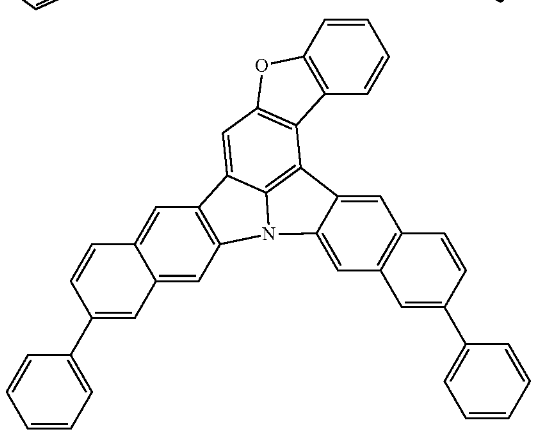
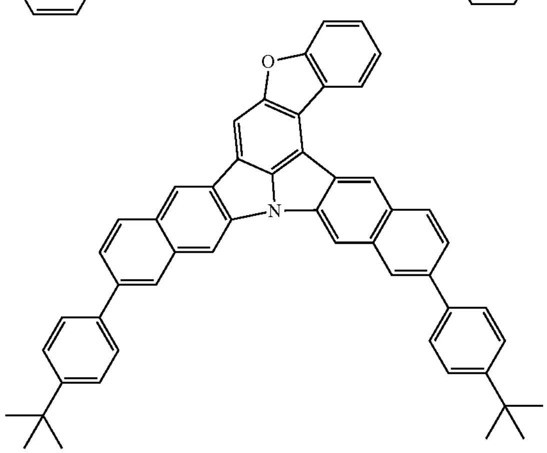
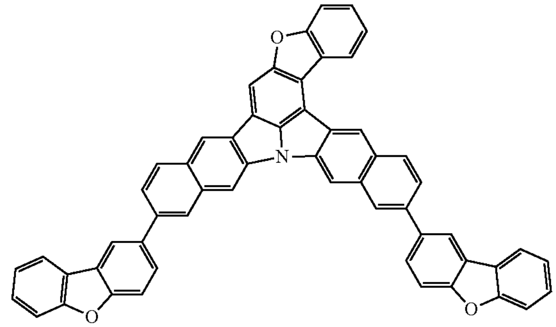
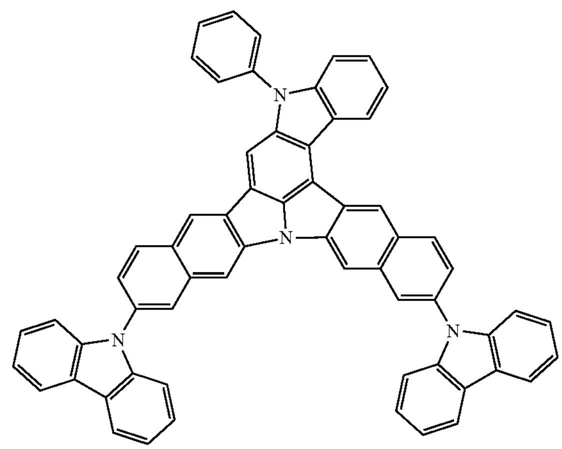
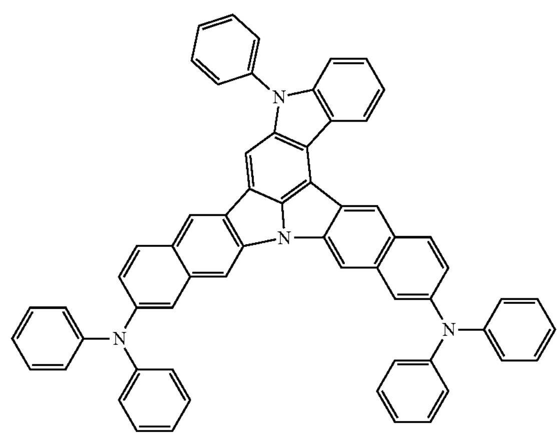
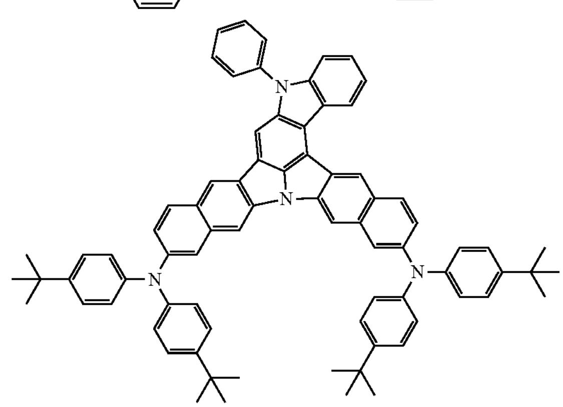

-continued
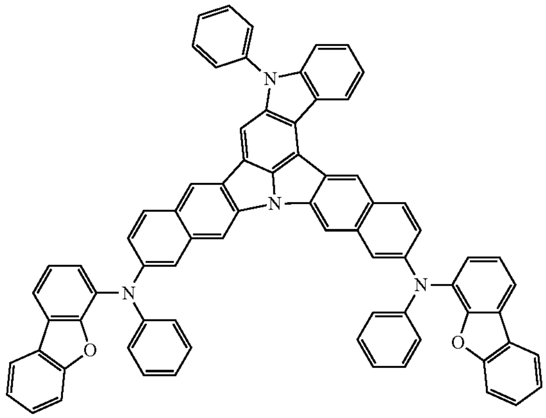
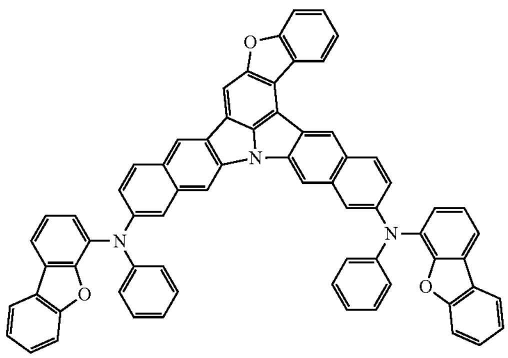
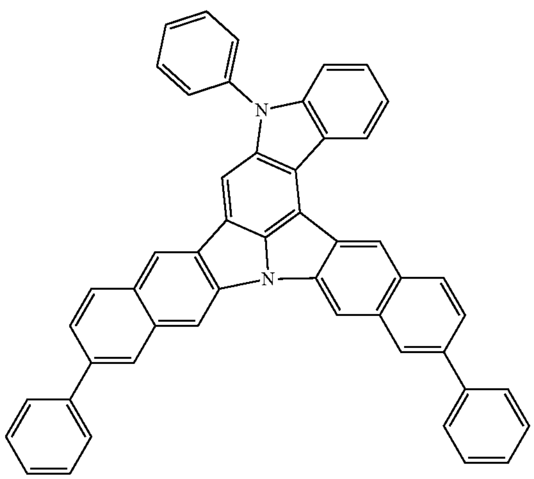
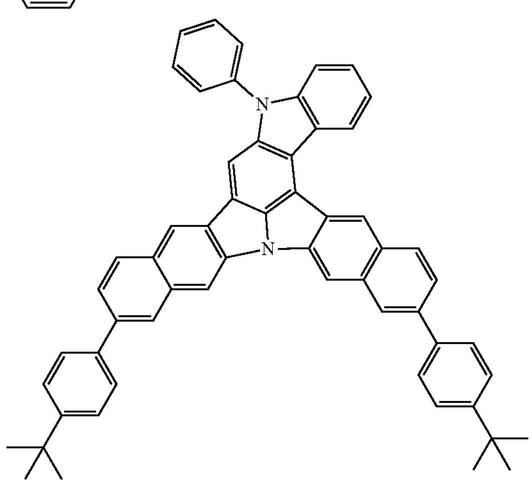
-continued
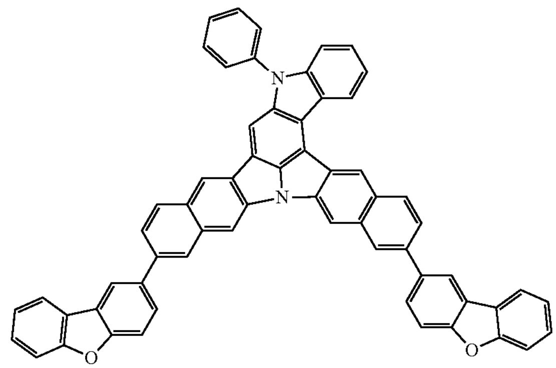
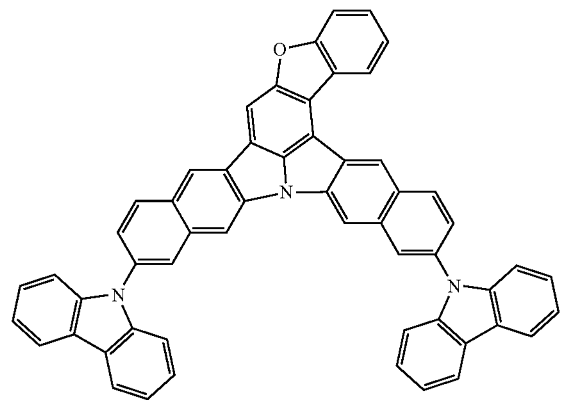
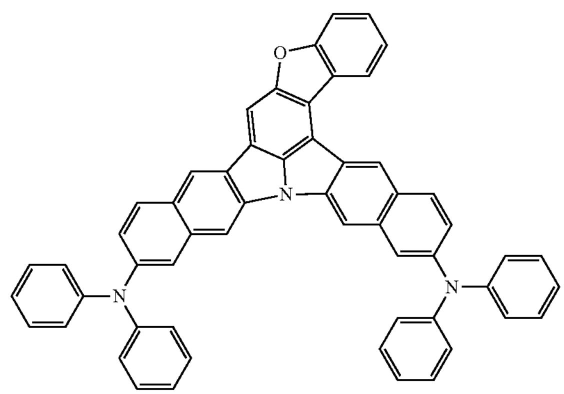
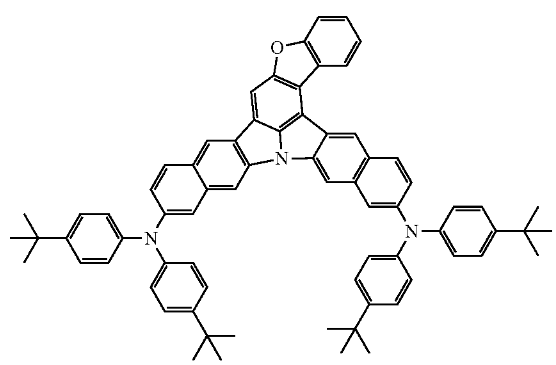

-continued
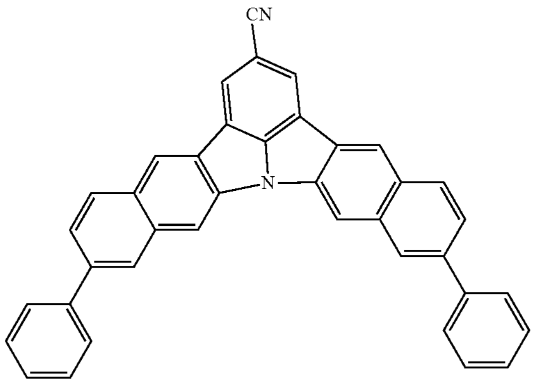
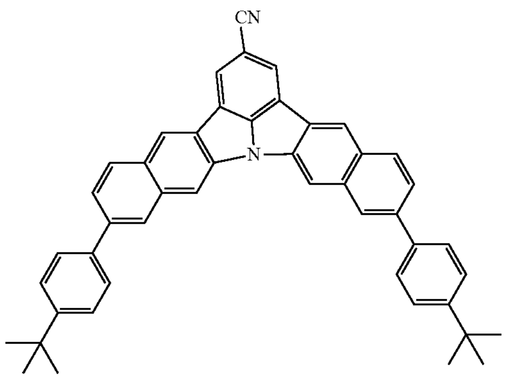
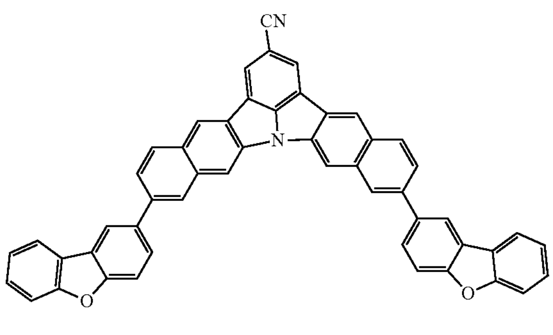
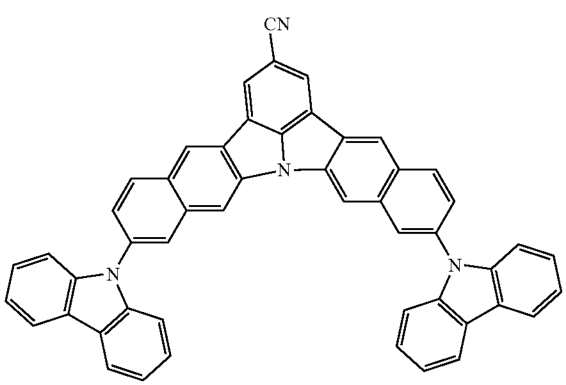
-continued
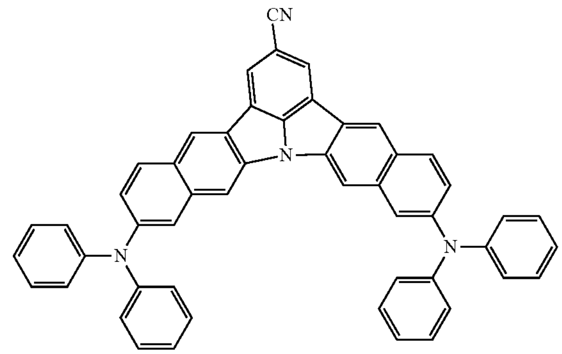
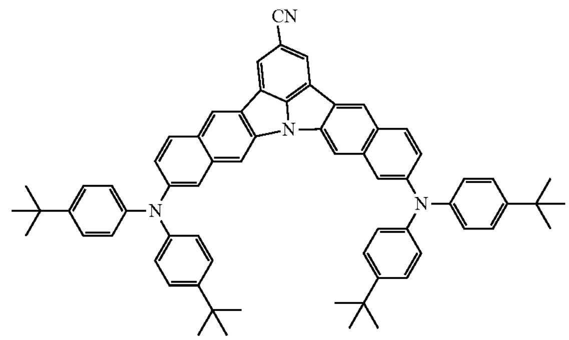
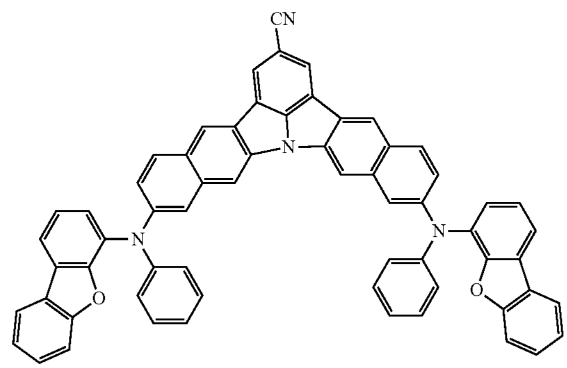
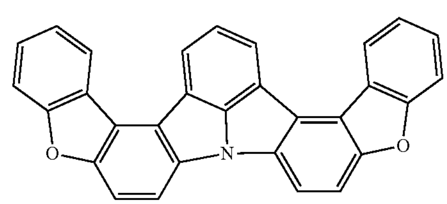
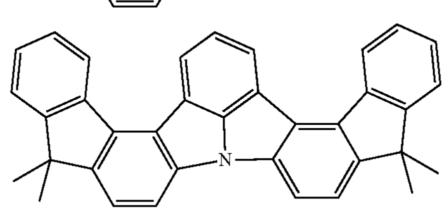
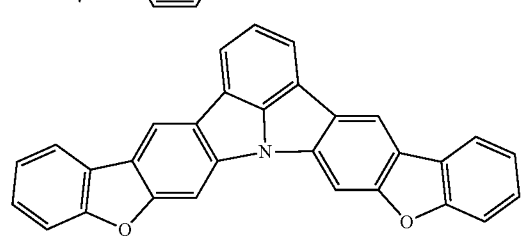

-continued
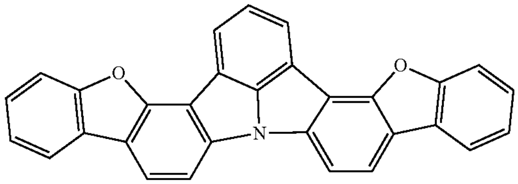
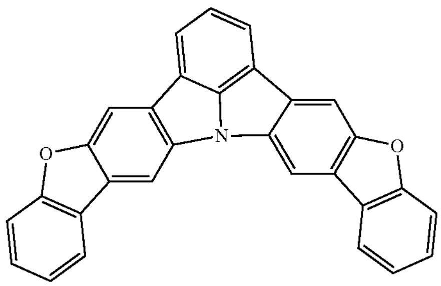
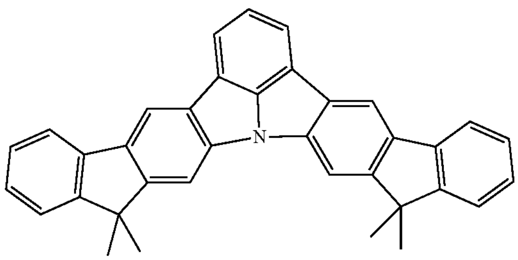
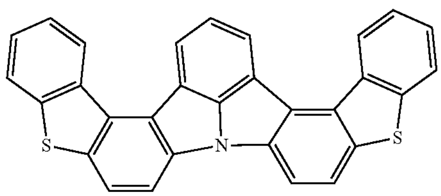
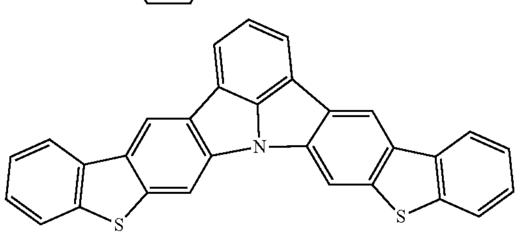
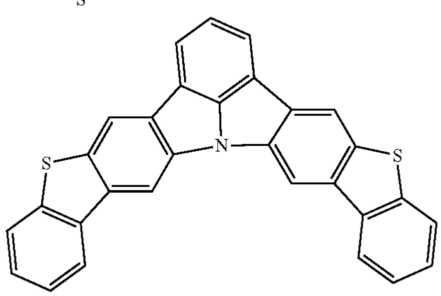
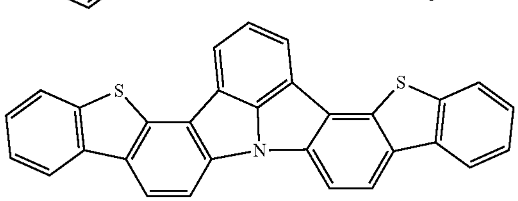
-continued
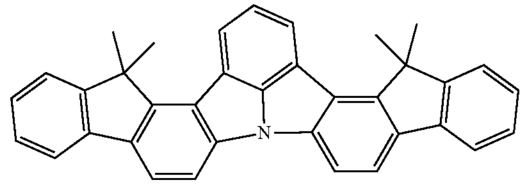
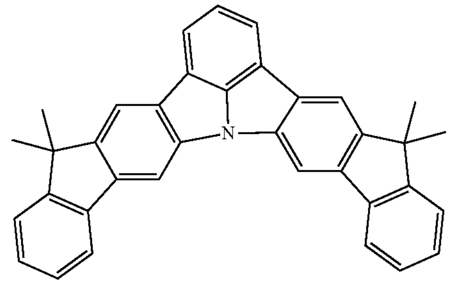
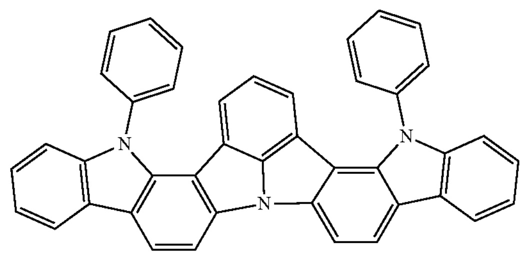
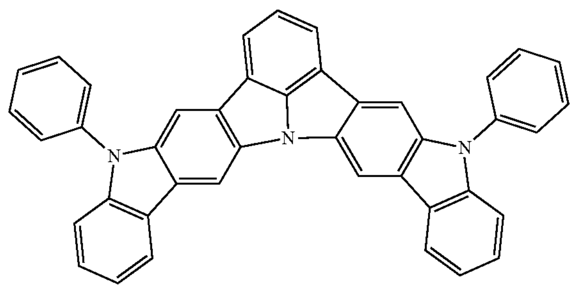
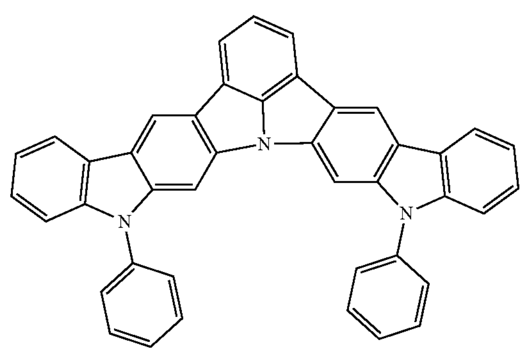
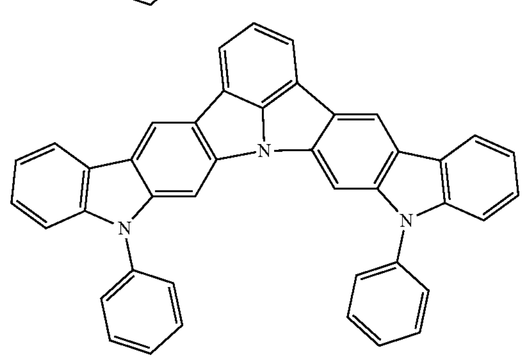

-continued
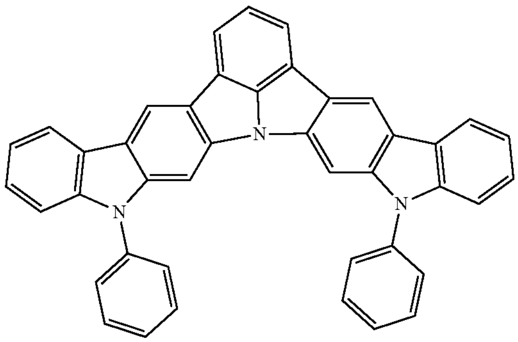
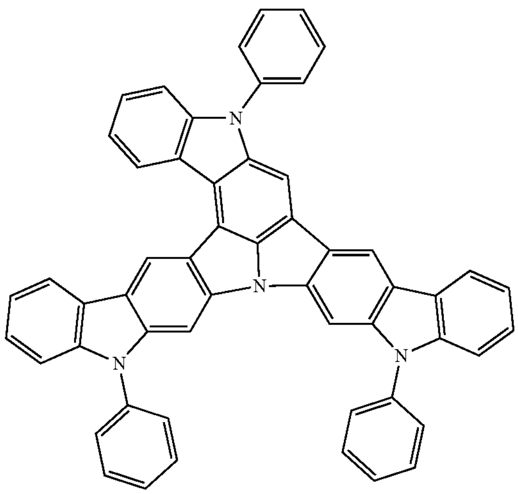
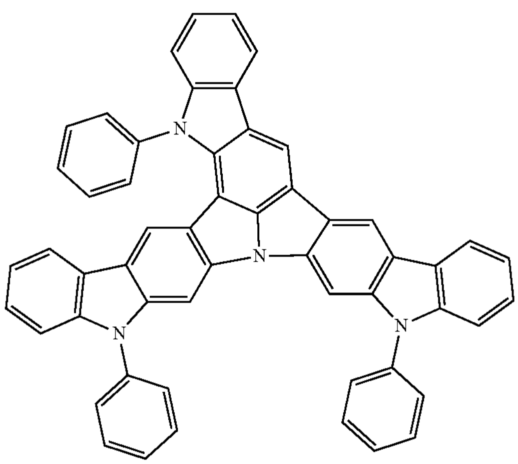
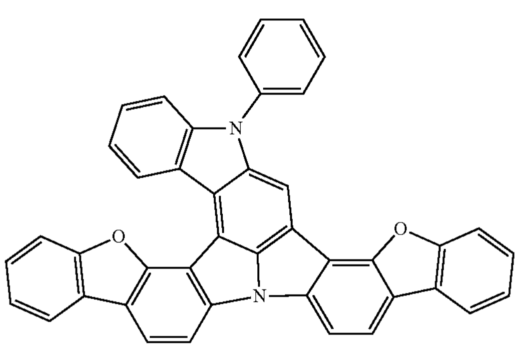
-continued
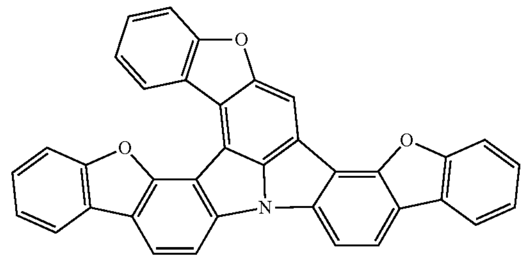
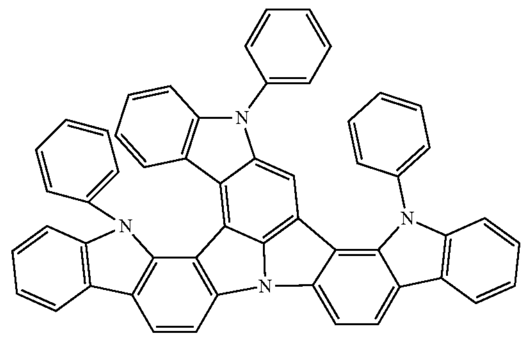
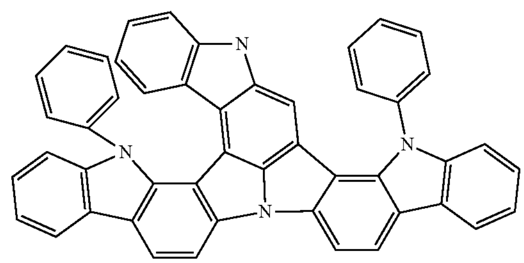
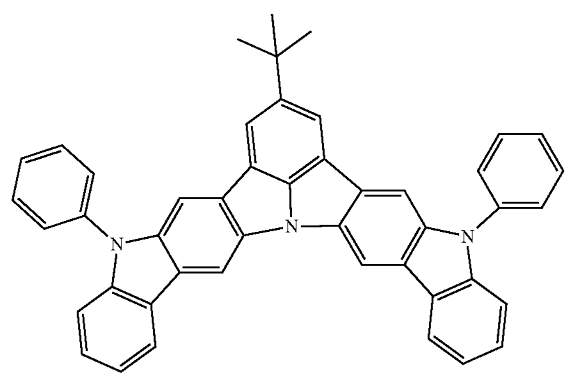
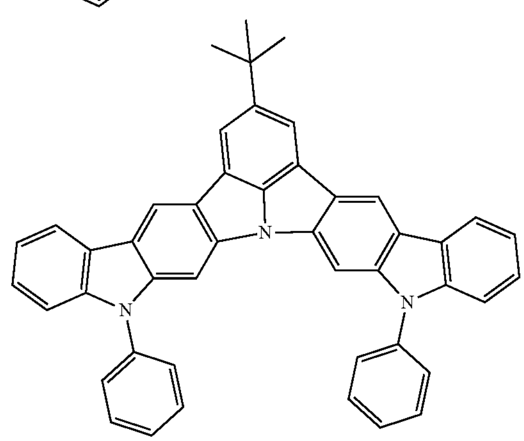

-continued
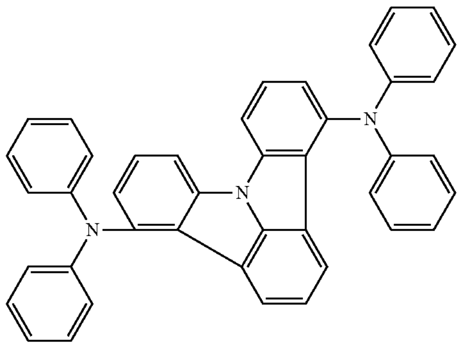
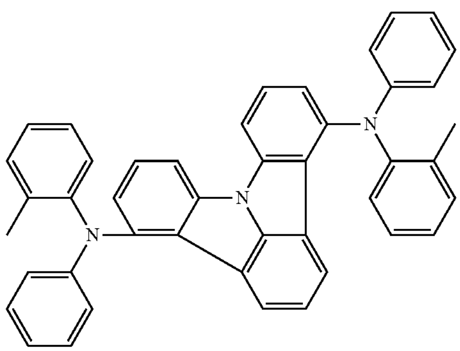
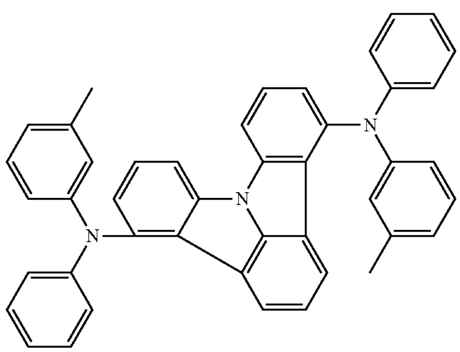
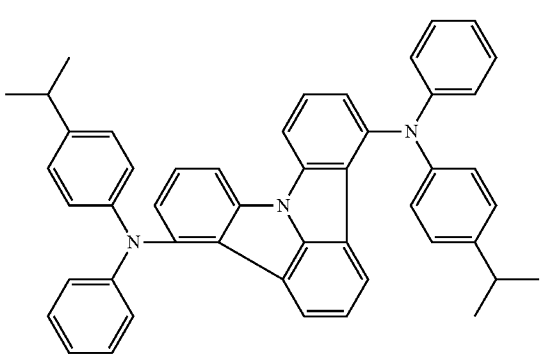
-continued
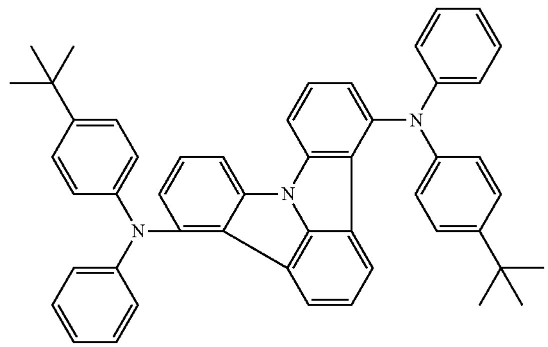
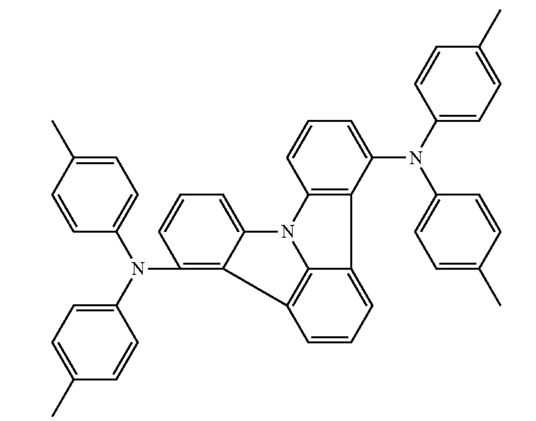
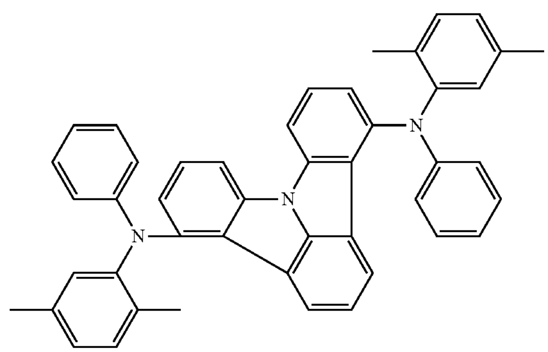
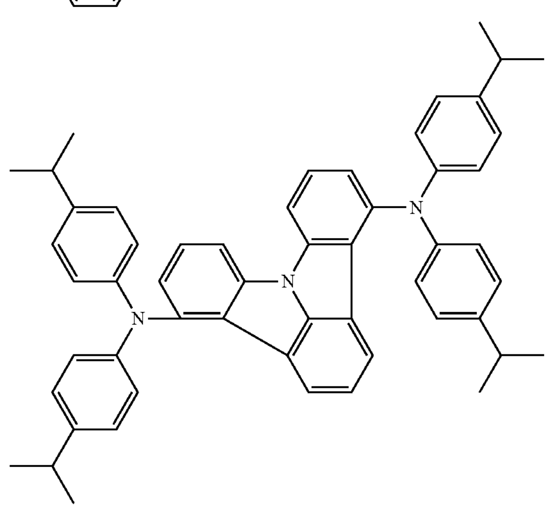

-continued
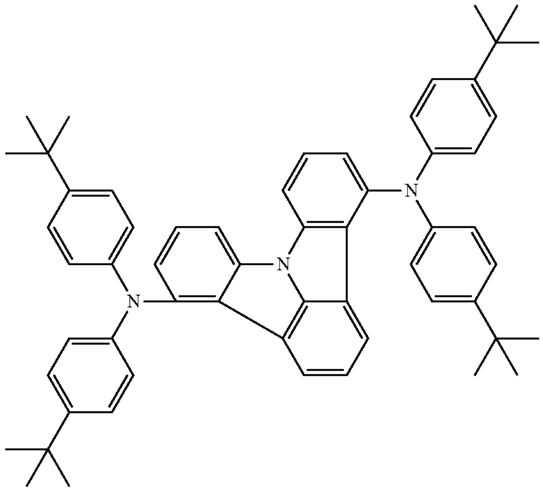
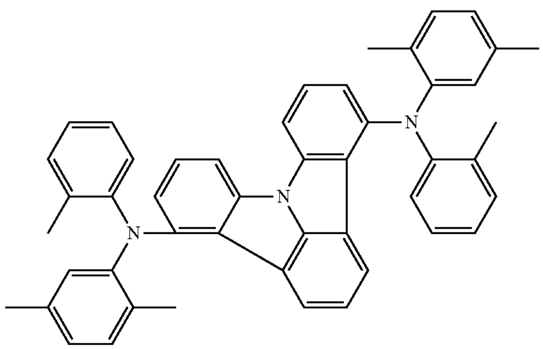
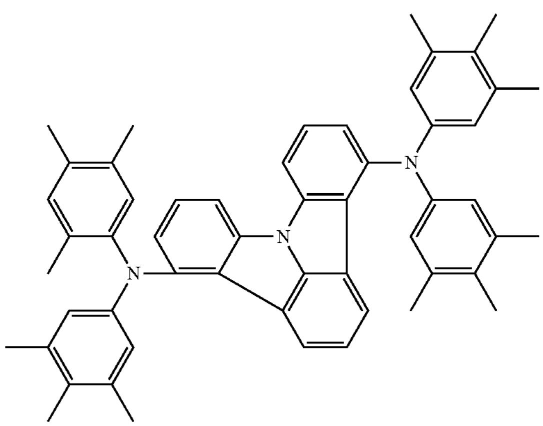
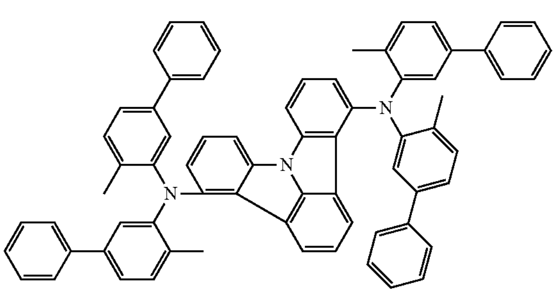
-continued
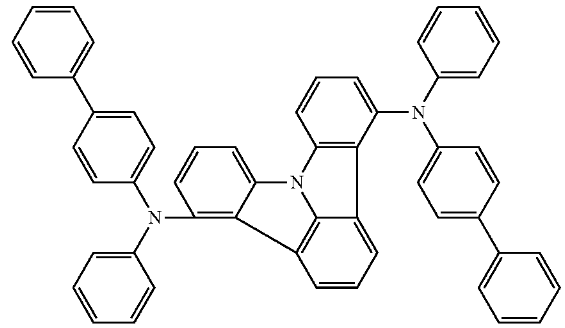
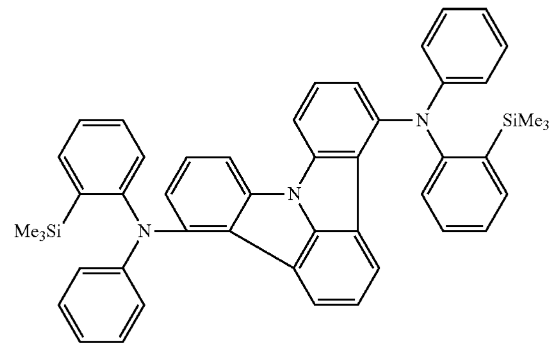
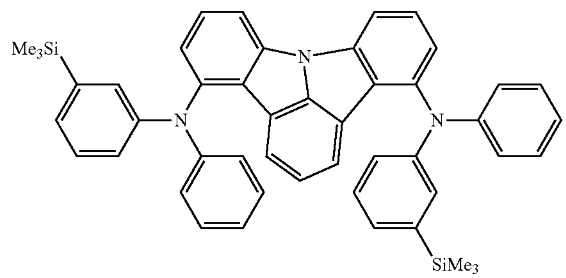
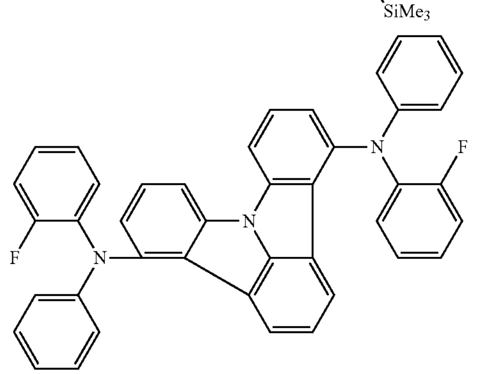
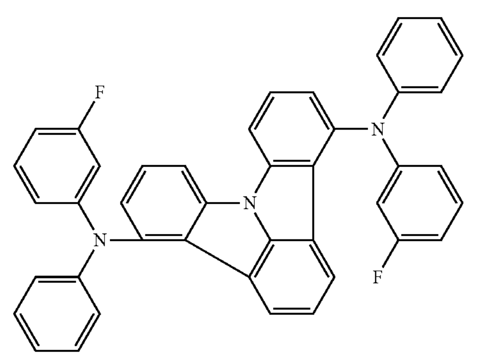

-continued
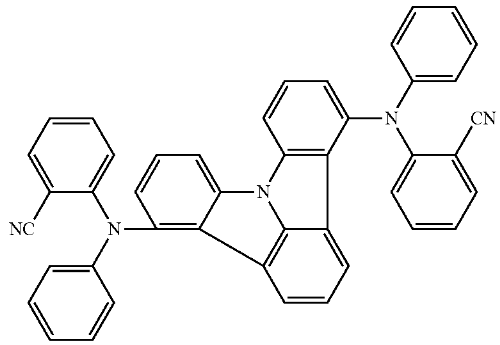
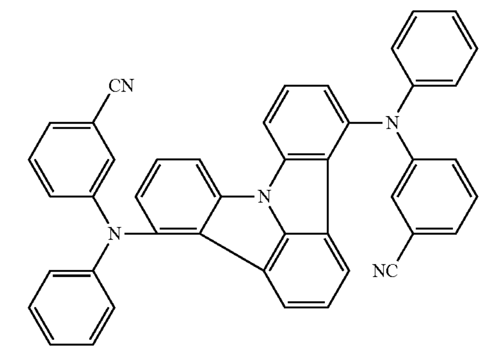
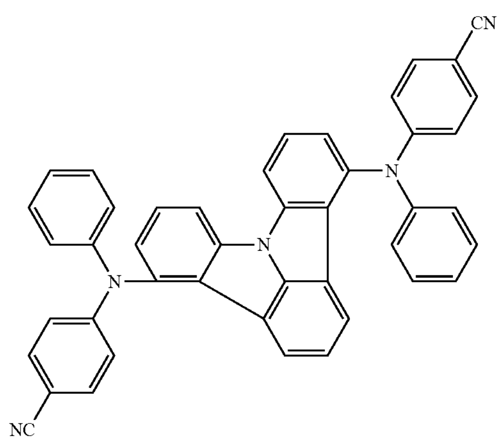
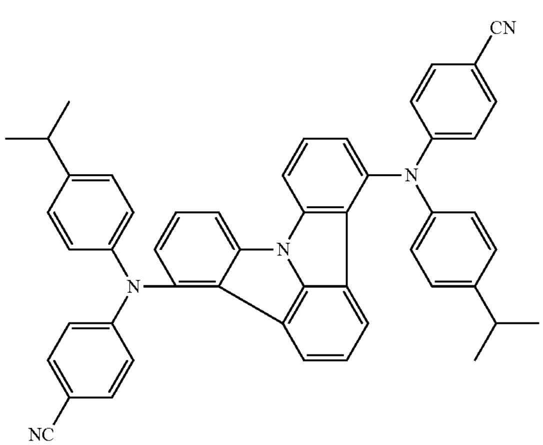
-continued
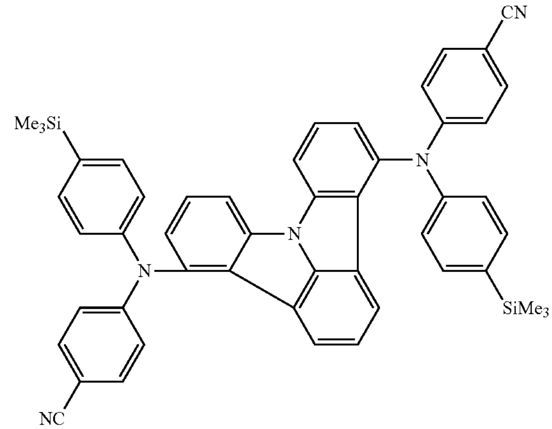
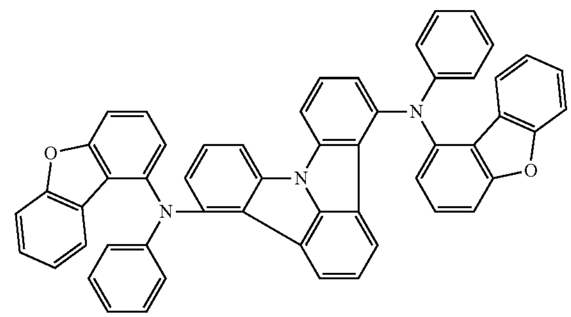
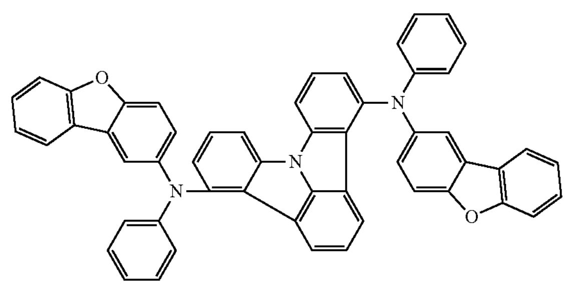
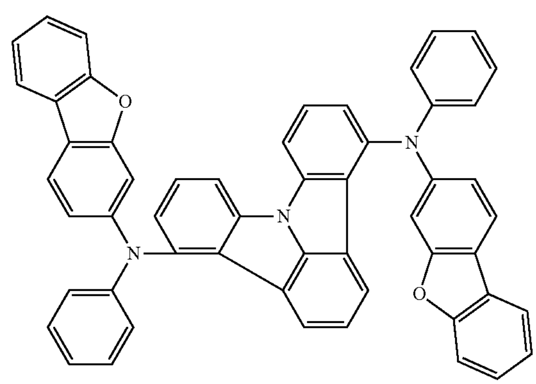

-continued
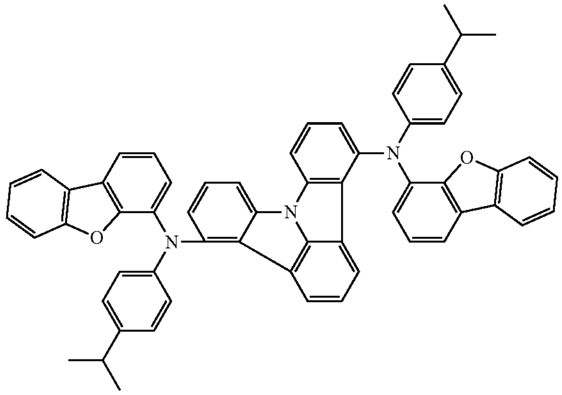
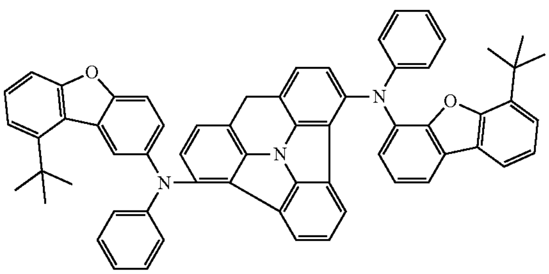
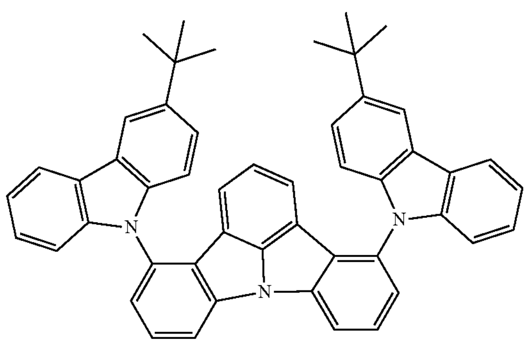
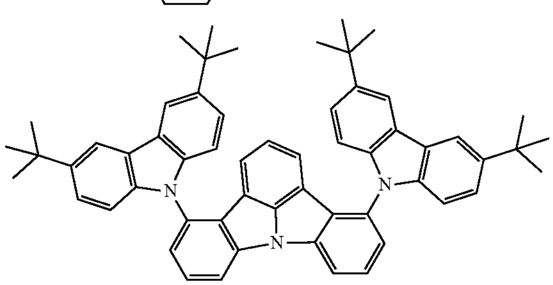
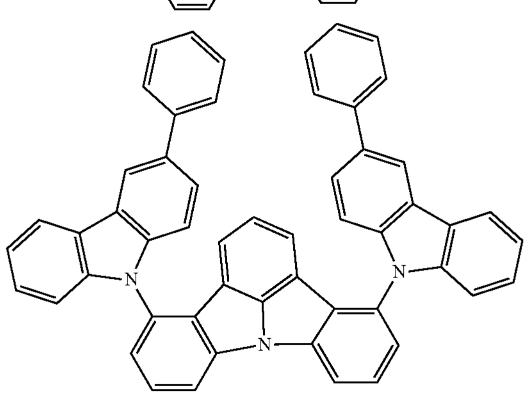
-continued
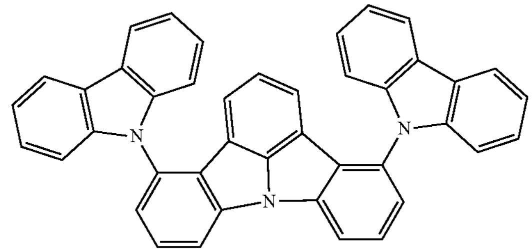
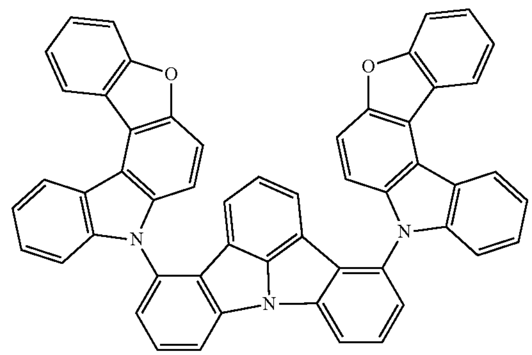
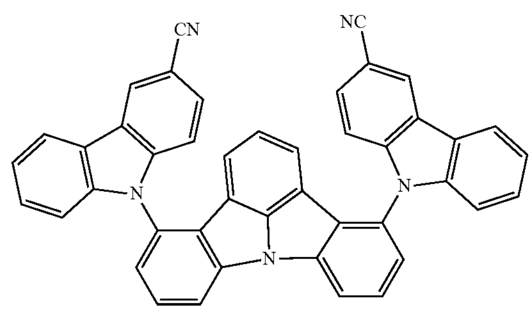
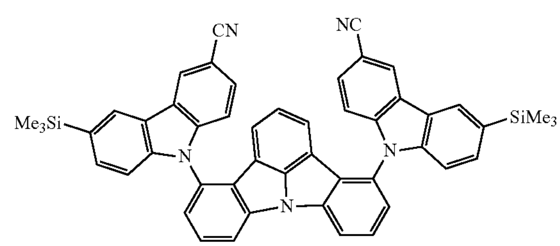
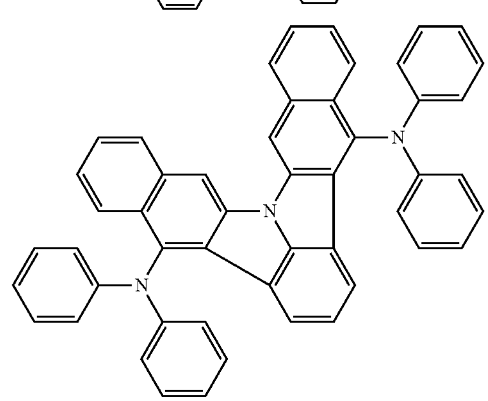

-continued
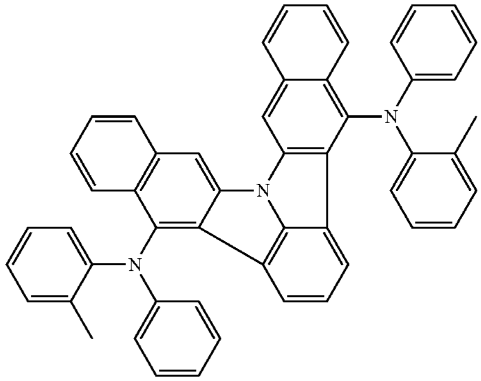
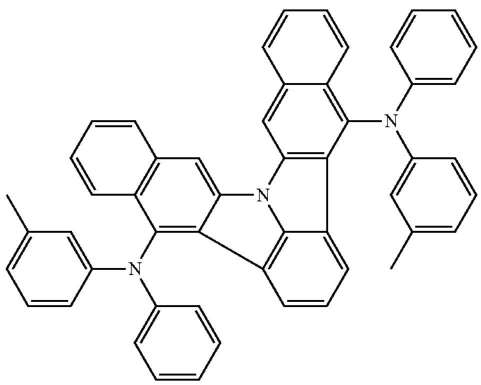
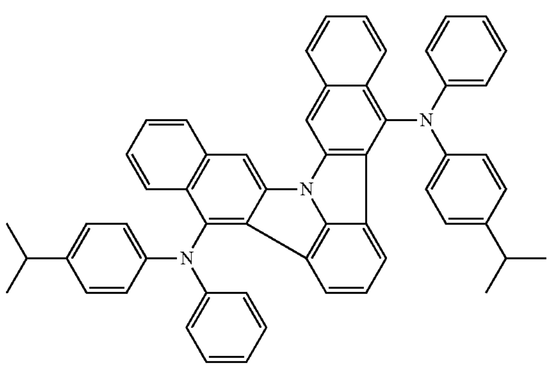
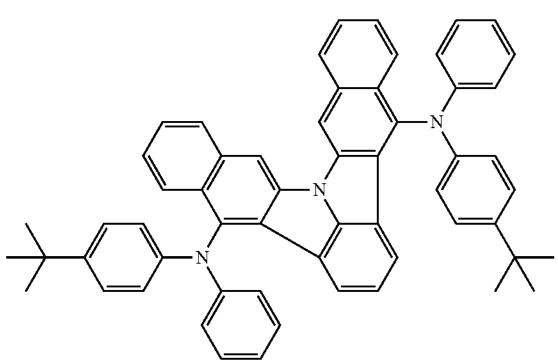
-continued
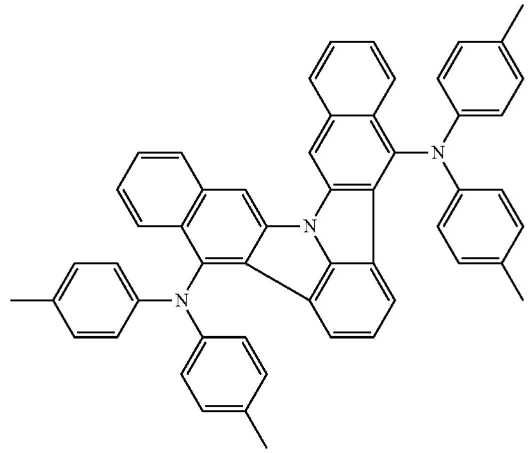
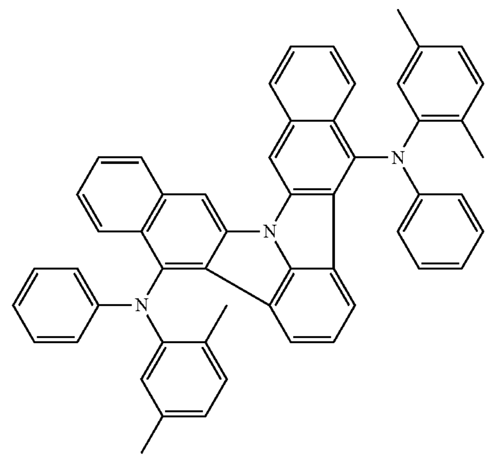
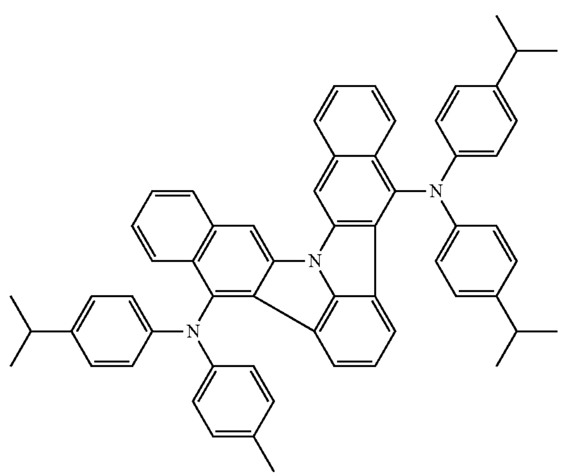

-continued
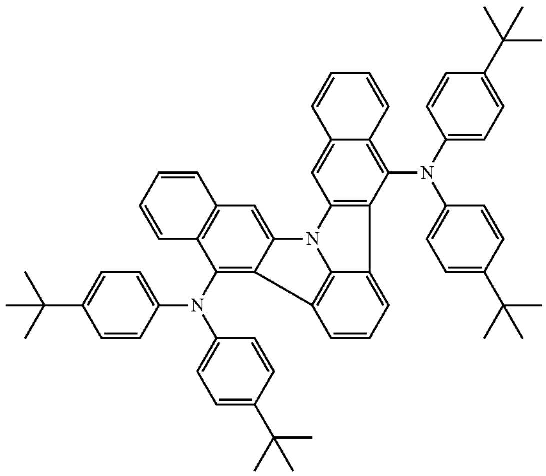
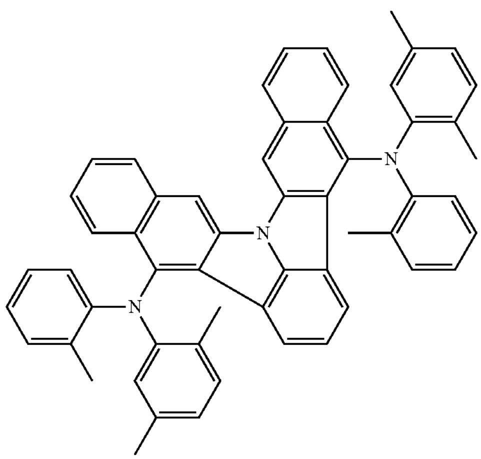
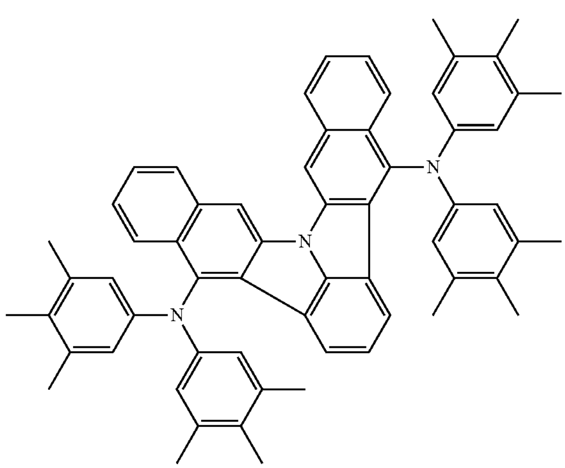
-continued
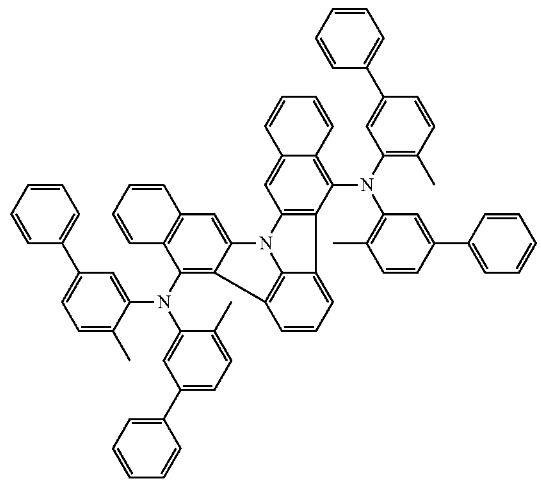
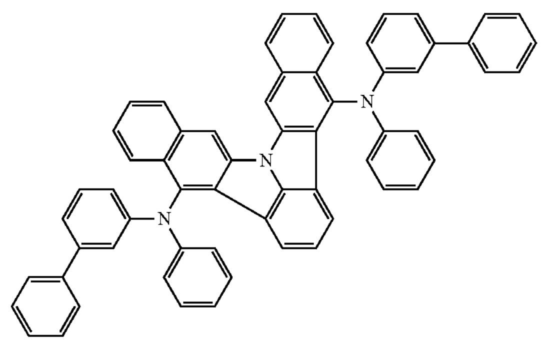
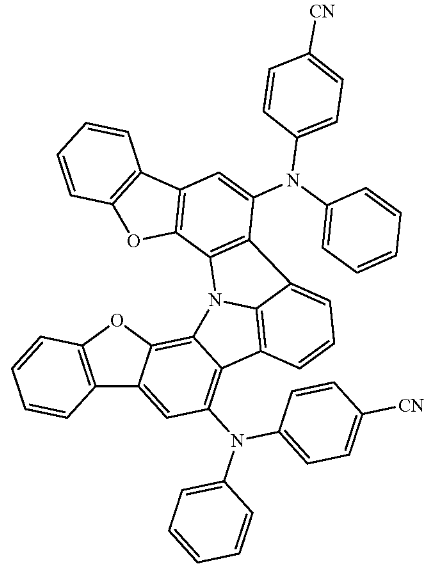

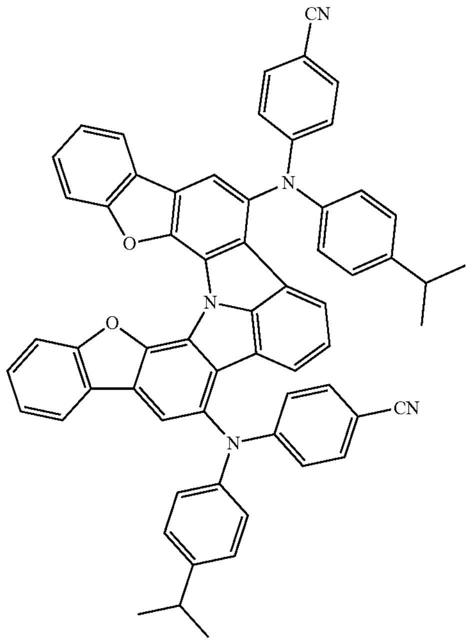
CN
N
O
O
N
N
CN
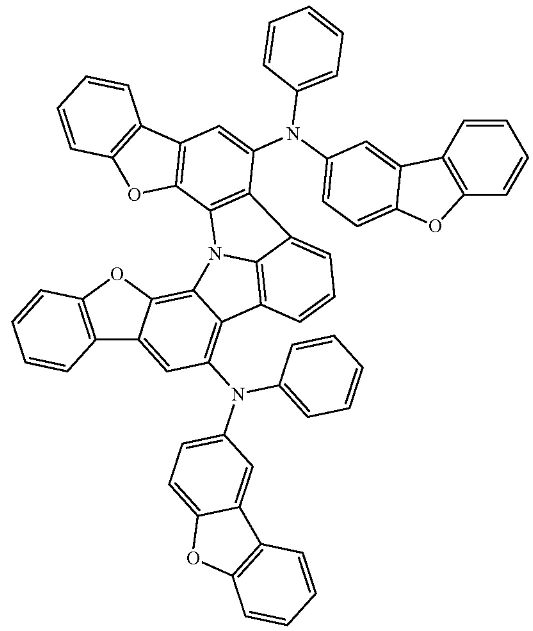
N
O
N
O
N
O
O
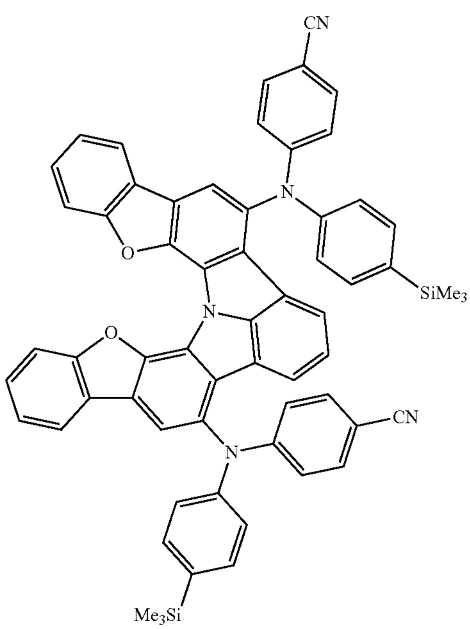
CN
N
O
SiMe3
N
O
N
CN
Me3Si
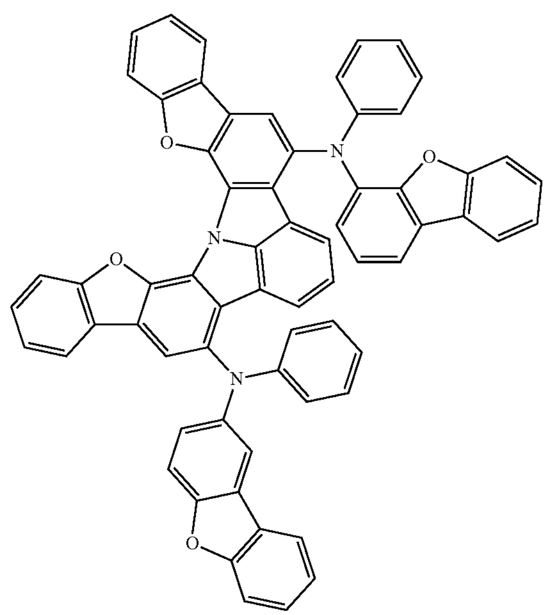
O
N
O
N
O
N
O -continued
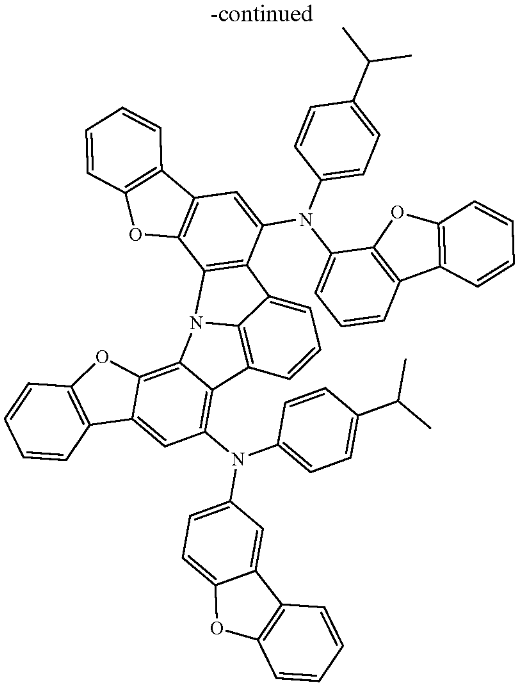
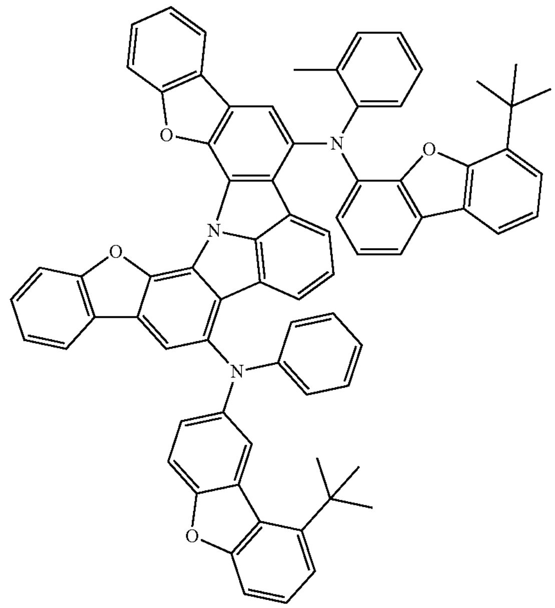
-continued
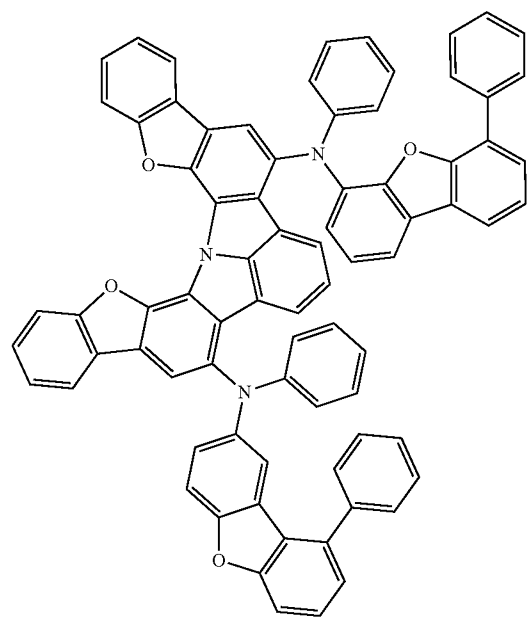
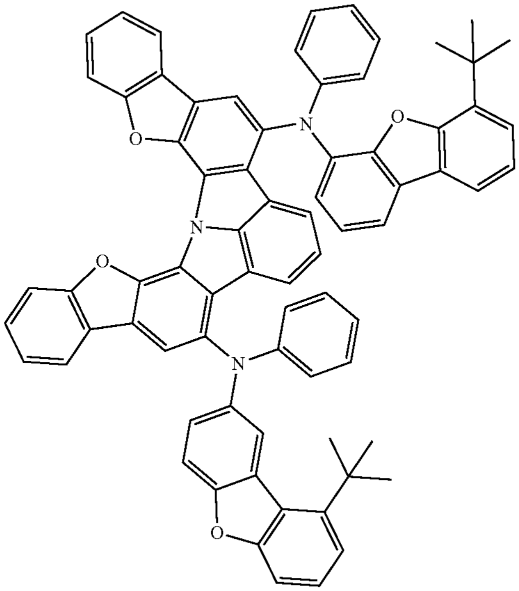
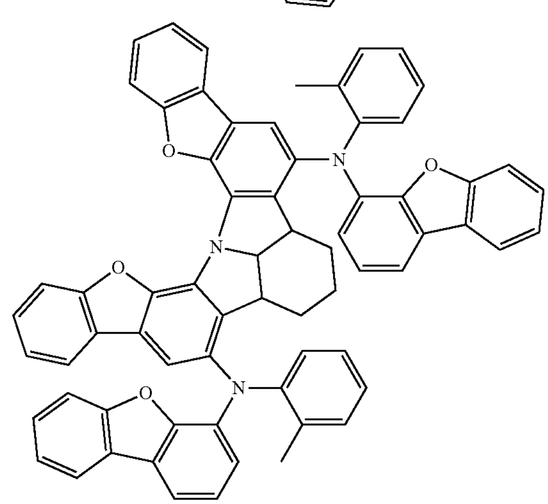

-continued
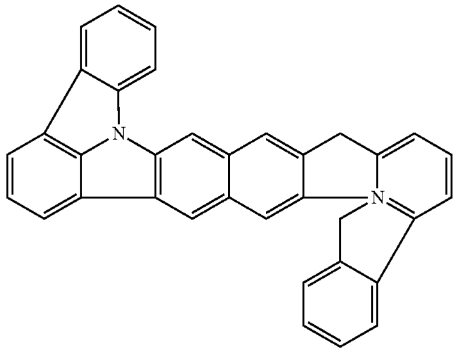
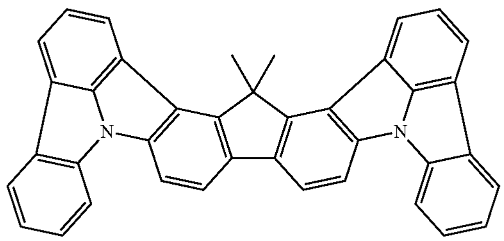
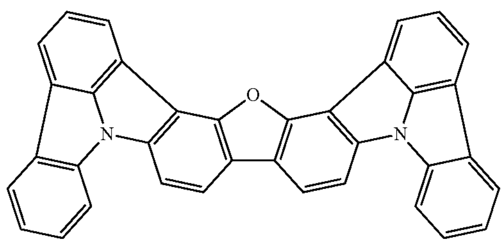
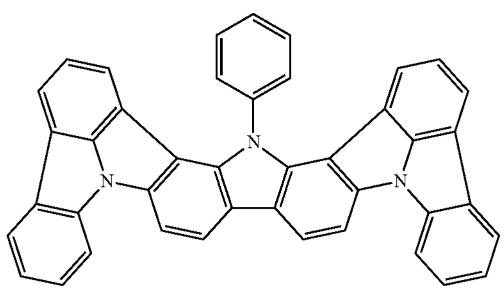
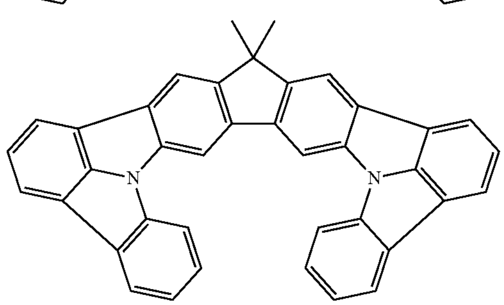
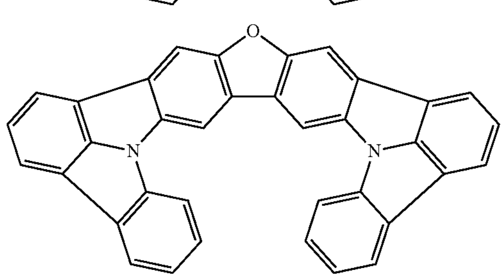
-continued
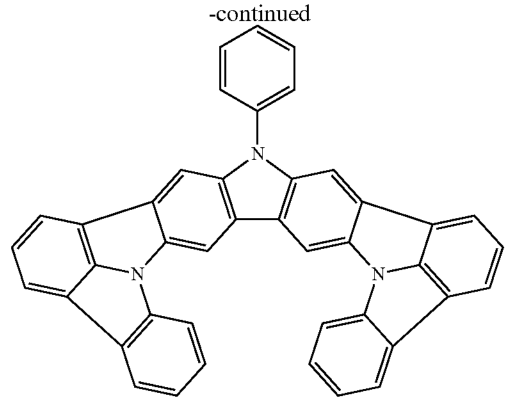
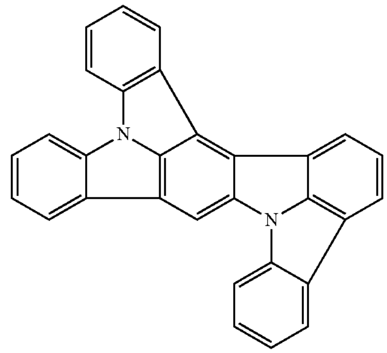
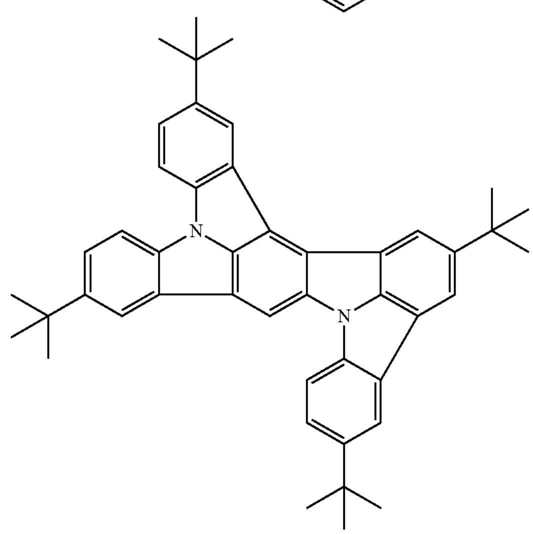
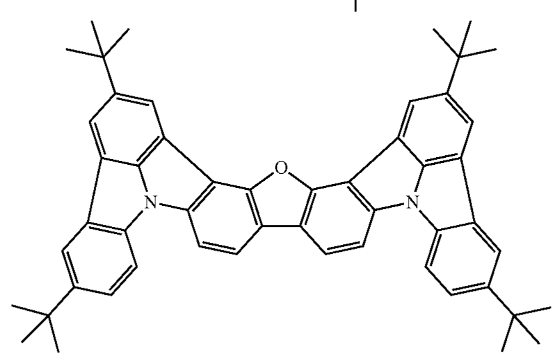
(Compound Represented by the Formula (31))
A compound represented by the formula (31) will be described. The compound represented by the formula (31) is a compound corresponding to the compound represented by the formula (21-3) described above.

(31)

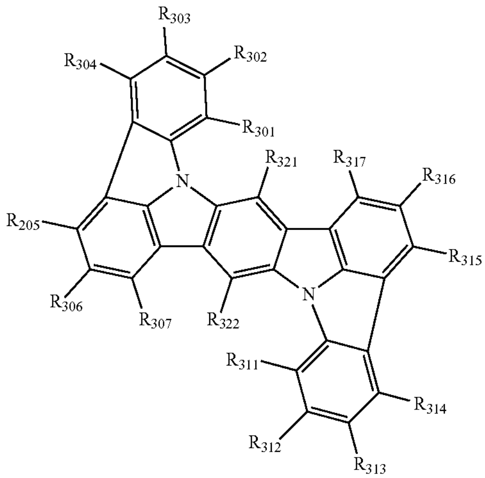

In the formula (31), one or more sets of adjacent two or more of $R_{301}$ to $R_{307}$ and $R_{311}$ to $R_{317}$ form a substituted or unsubstituted, saturated or unsaturated ring, or do not form a substituted or unsubstituted, saturated or unsaturated ring;

$R_{301}$ to $R_{307}$ and $R_{311}$ to $R_{317}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{321}$ and $R_{322}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

The "set of adjacent two or more of $R_{301}$ to $R_{307}$ and $R_{311}$ to $R_{317}$" includes, for example, sets of $R_{301}$ and $R_{302}$, $R_{302}$ and $R_{303}$, $R_{303}$ and $R_{304}$, $R_{305}$ and $R_{306}$, and $R_{306}$ and $R_{307}$, and a set of $R_{301}$, $R_{302}$ and $R_{303}$, and the like.

In one embodiment, at least one, with preferably two, of $R_{301}$ to $R_{307}$ and $R_{311}$ to $R_{317}$ are a group represented by —N($R_{906}$)($R_{907}$).

In one embodiment, $R_{301}$ to $R_{307}$ and $R_{311}$ to $R_{317}$ are independently a hydrogen atom, a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (32).

(32)

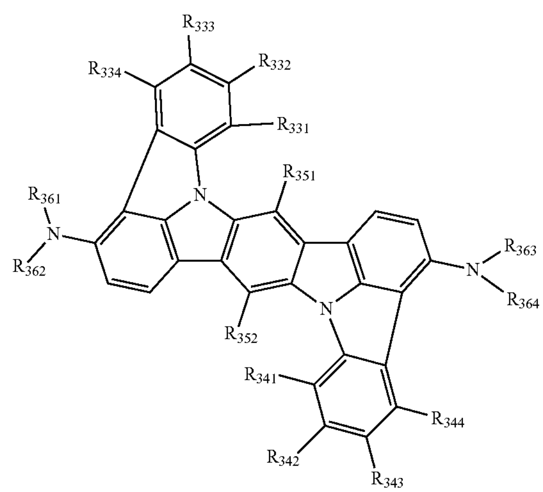

In the formula (32), one or more sets of adjacent two or more of $R_{331}$ to $R_{334}$ and $R_{341}$ to $R_{344}$ form a substituted or unsubstituted, saturated or unsaturated ring, or do not form a substituted or unsubstituted, saturated or unsaturated ring;

$R_{331}$ to $R_{334}$ and $R_{341}$ to $R_{344}$ which do not form the substituted or unsubstituted, saturated or unsaturated ring, and $R_{351}$ and $R_{352}$ are independently a hydrogen atom, a substituted or unsubstituted aryl group including 6 to 50 ring carbon atoms, or a substituted or unsubstituted monovalent heterocyclic group including 5 to 50 ring atoms.

$R_{361}$ to $R_{364}$ are independently a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (33).

(33)

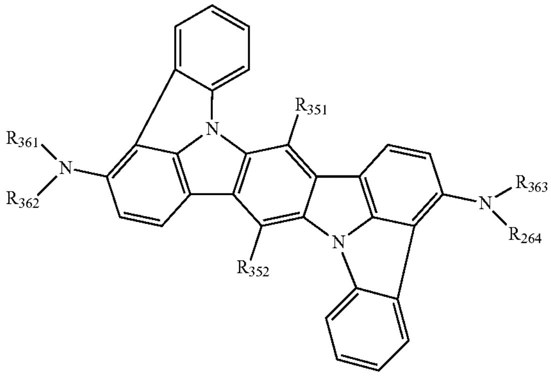

In the formula (33), $R_{351}$, $R_{352}$, and $R_{361}$ to $R_{364}$ are as defined in the formula (32).

In one embodiment, $R_{361}$ to $R_{364}$ in the formulas (32) and (33) are independently a substituted or unsubstituted aryl group including 6 to 50 ring carbon atoms (preferably a phenyl group).

In one embodiment, $R_{321}$ and $R_{322}$ in the formula (31) and $R_{351}$ and $R_{352}$ in the formulas (32) and (33) are hydrogen atoms.

In one embodiment, the substituent in the case of "substituted or unsubstituted" in the formulas (31) to (33) is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

Specific examples of the compound represented by the formula (31) include the following compounds.

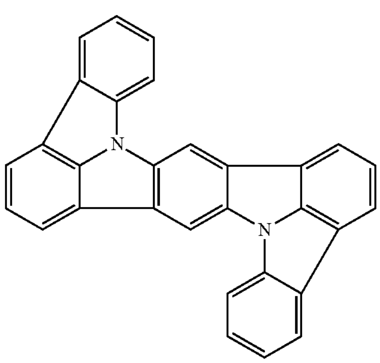

-continued

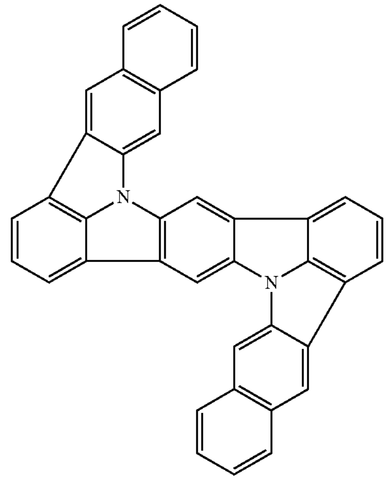

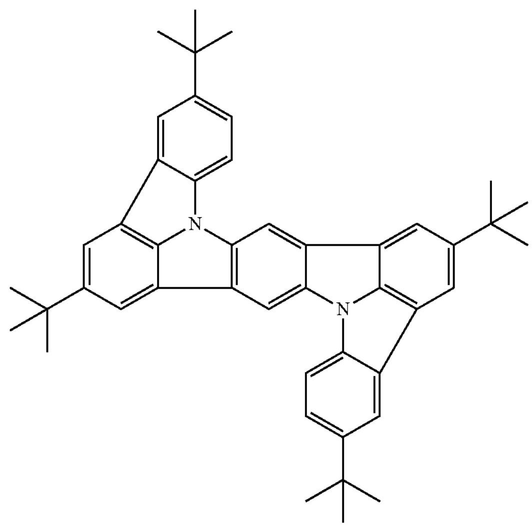

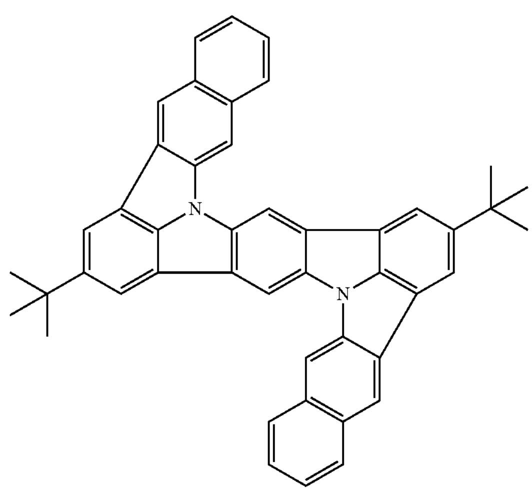

-continued
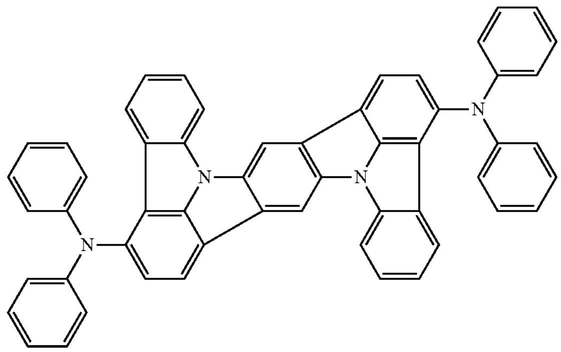
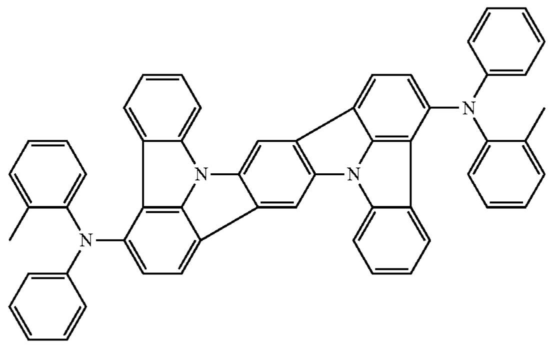
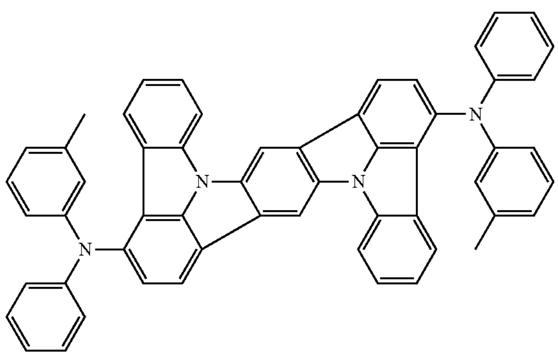
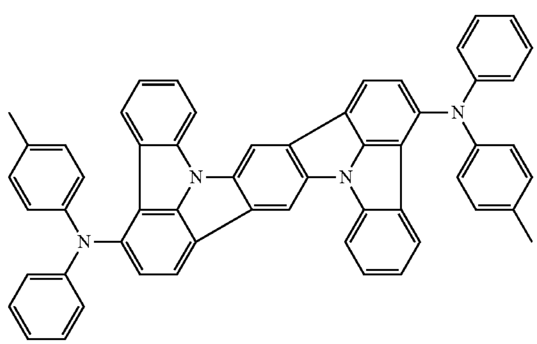
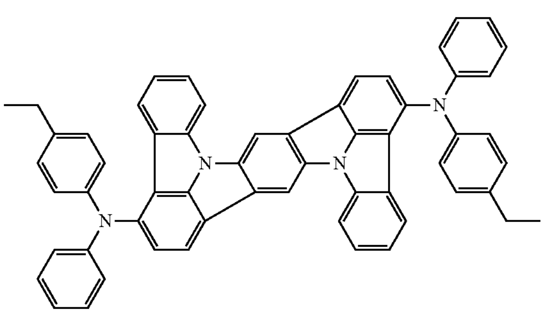
-continued
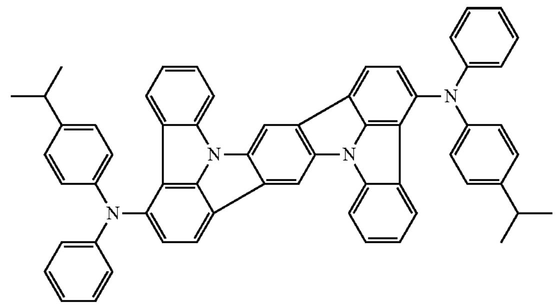
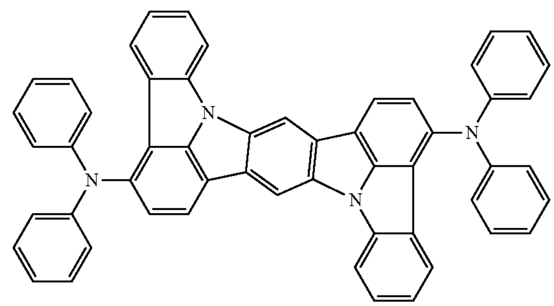
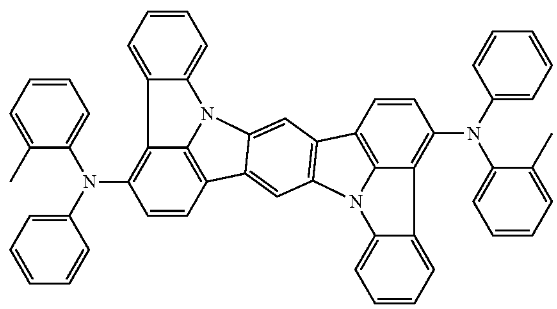
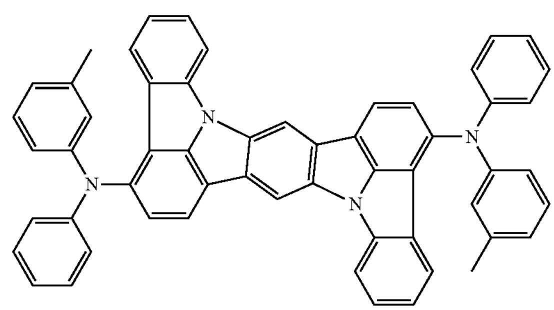
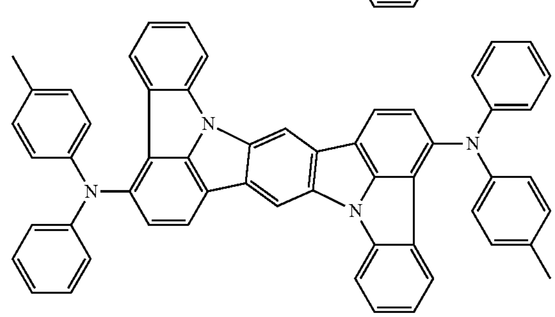

-continued
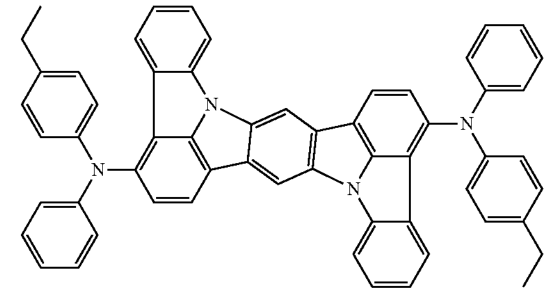
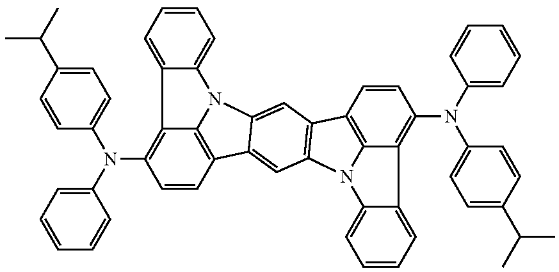
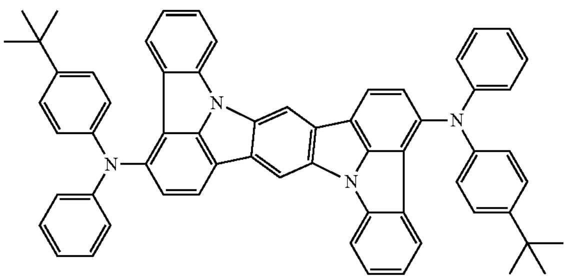
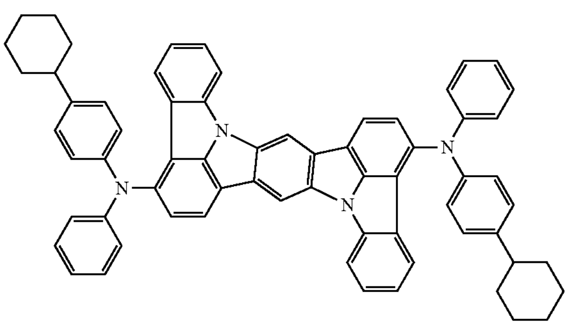
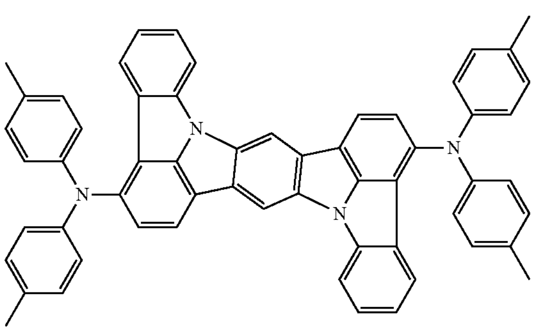
-continued
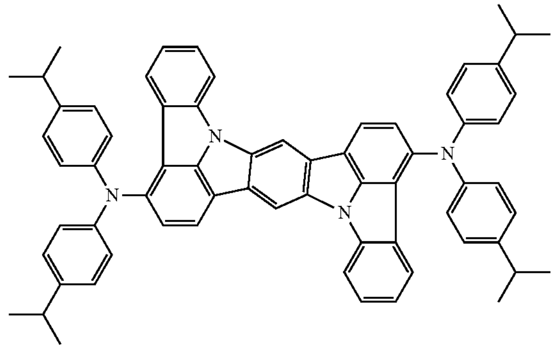
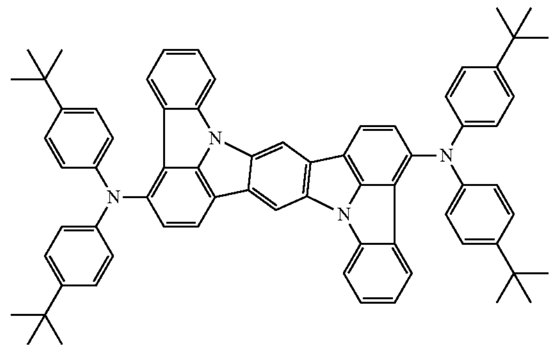
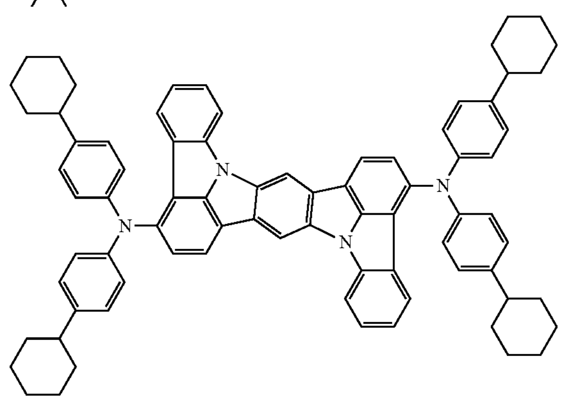
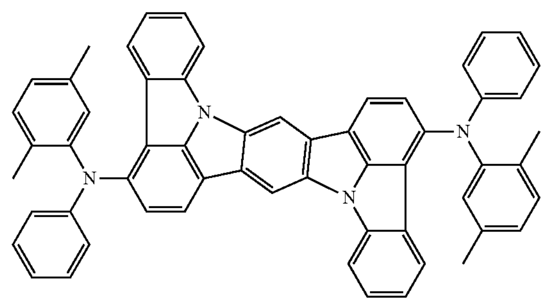
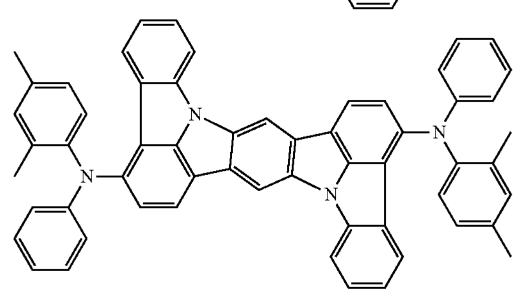

-continued
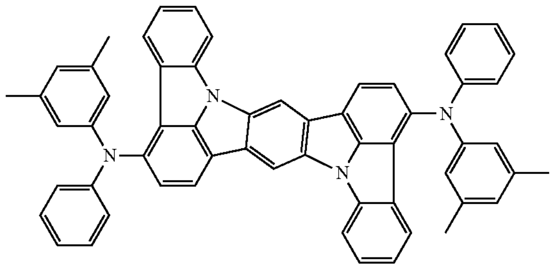
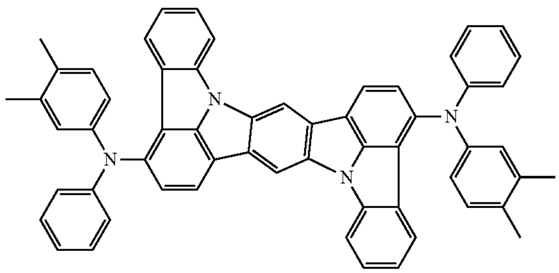
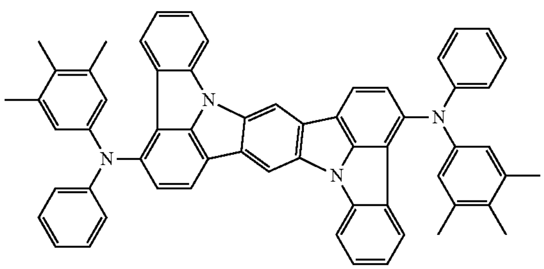
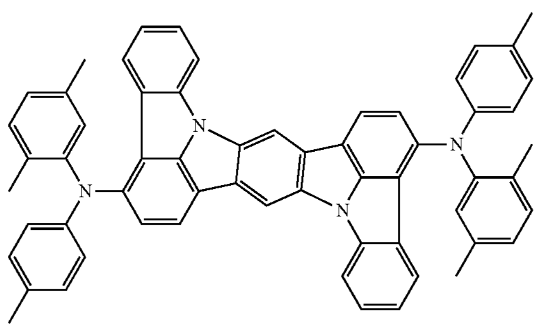
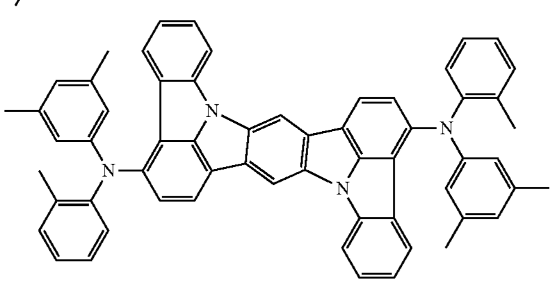
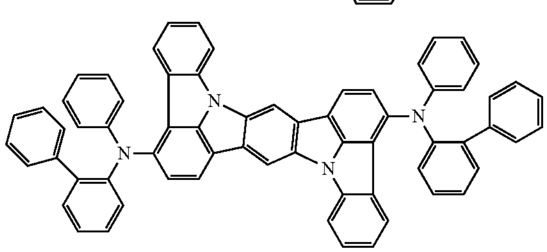
-continued
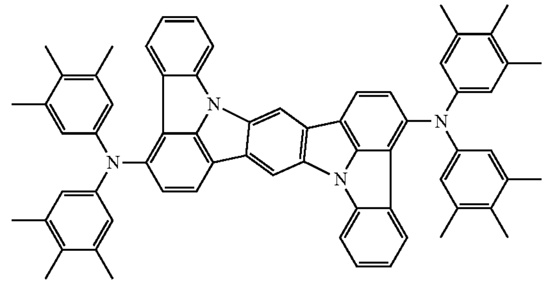
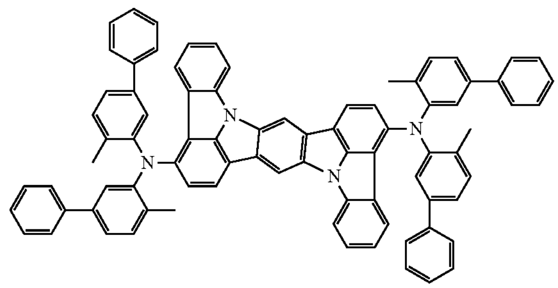
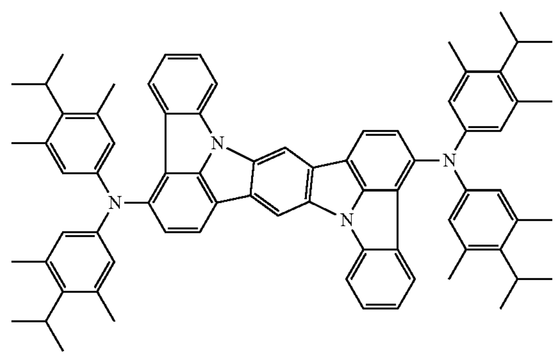
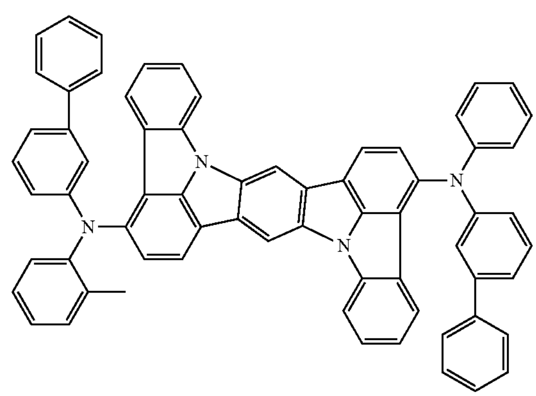
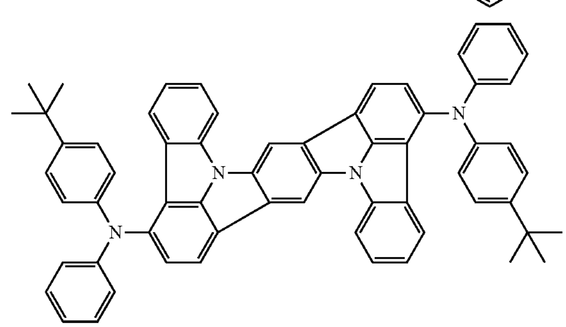

-continued
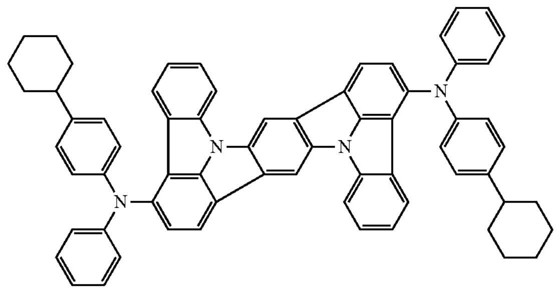
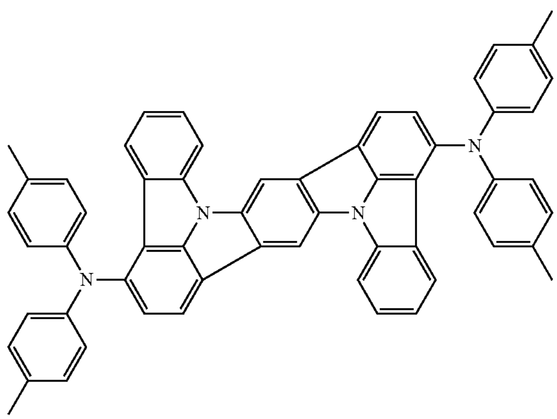
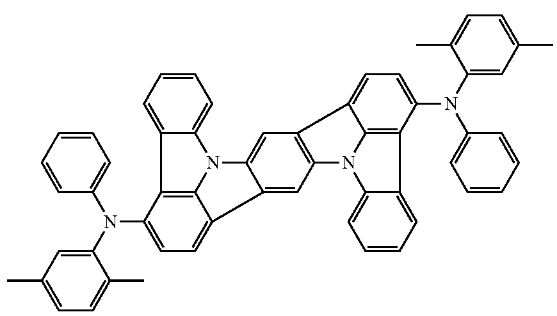
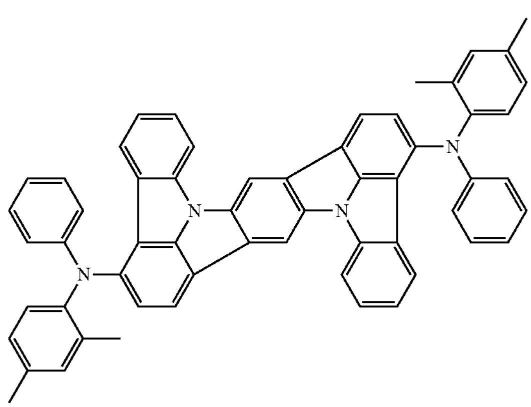
-continued
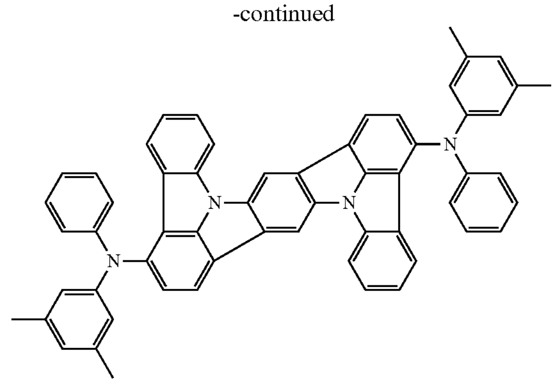
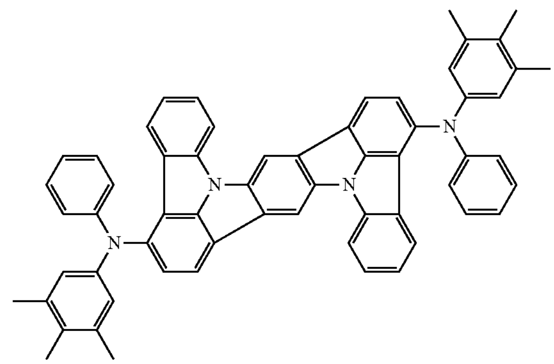
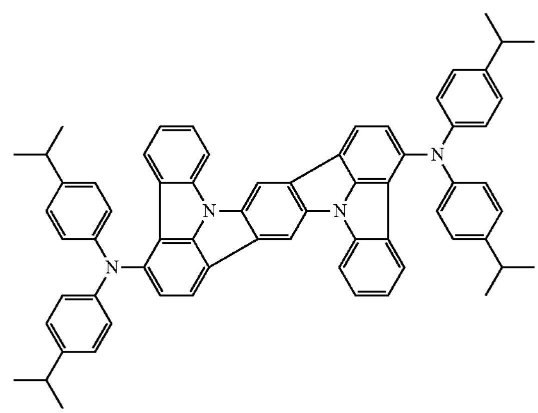
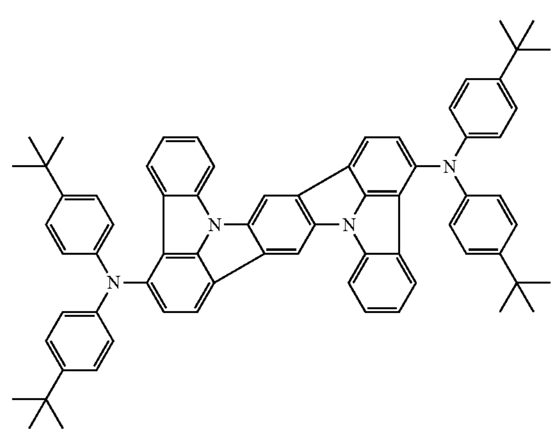

-continued
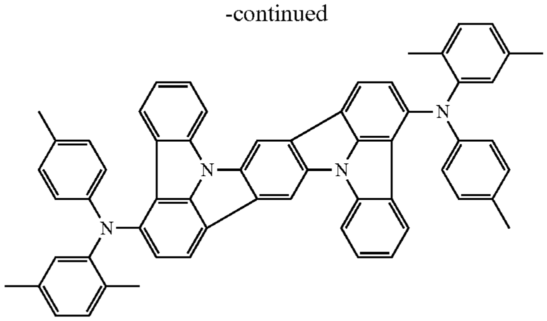
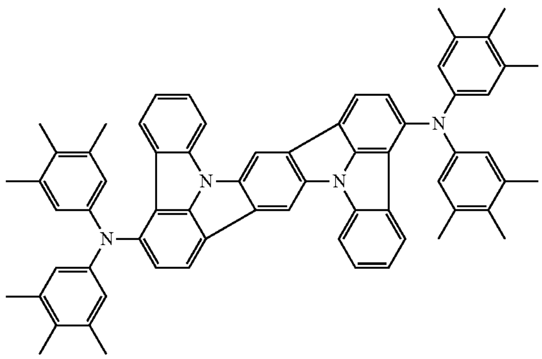
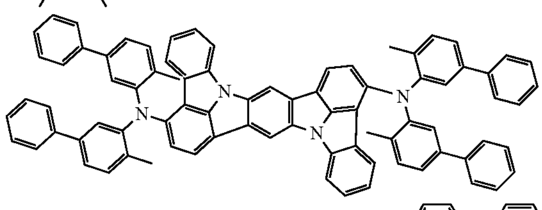
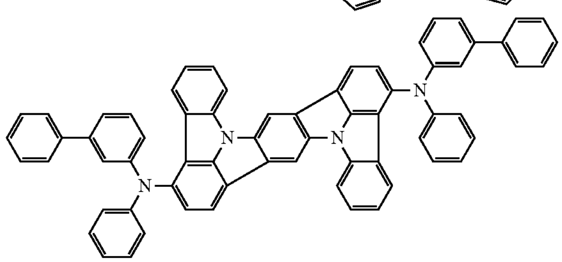
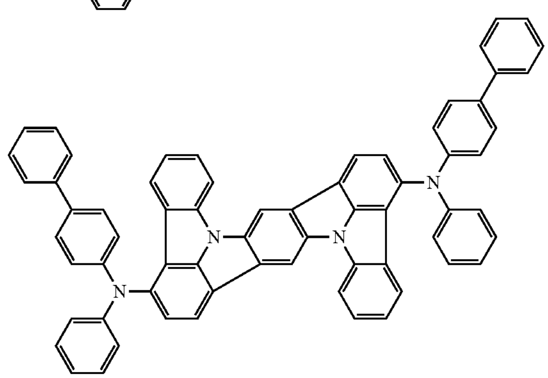
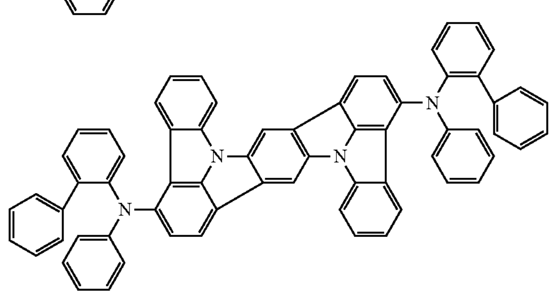
-continued
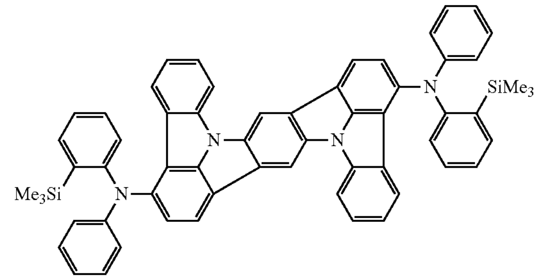
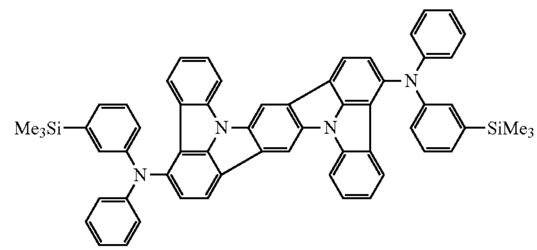
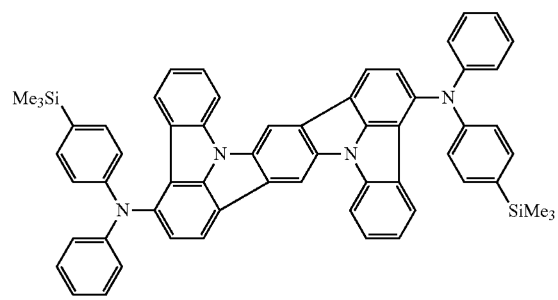
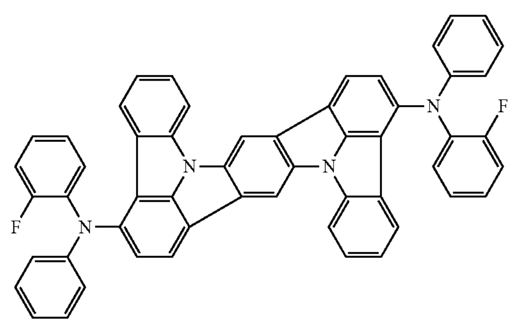
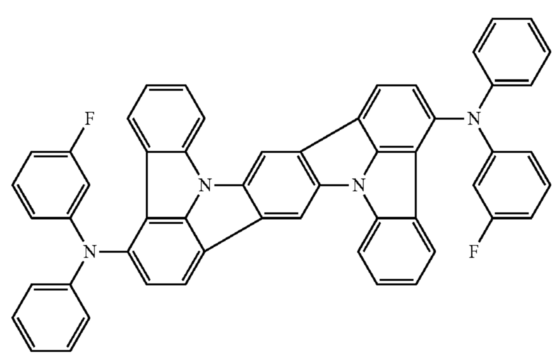

-continued
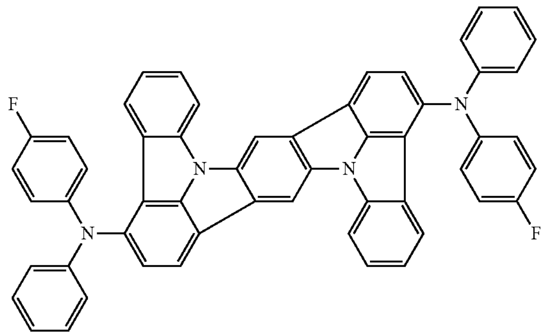
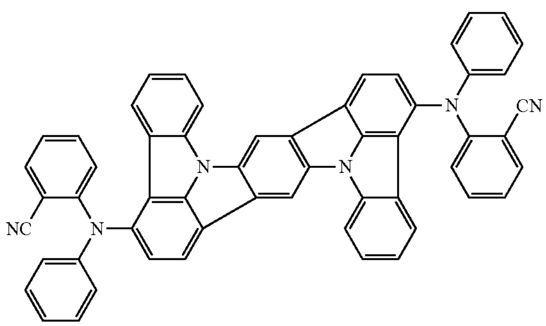
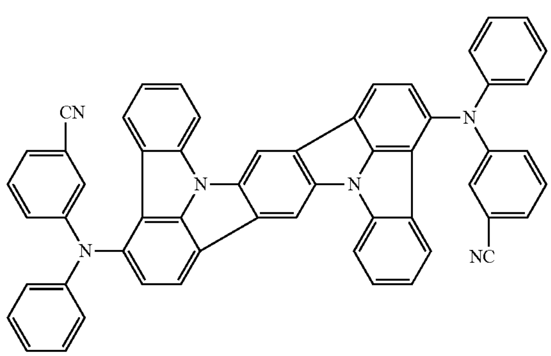
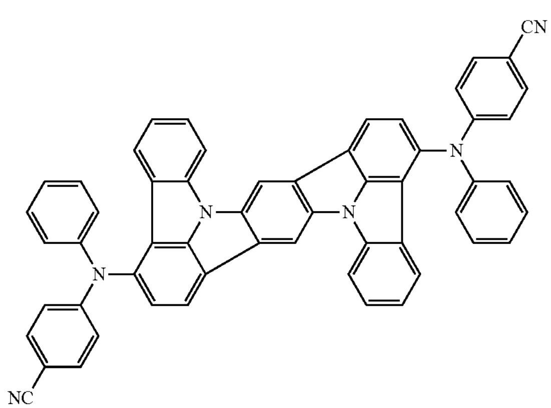
-continued
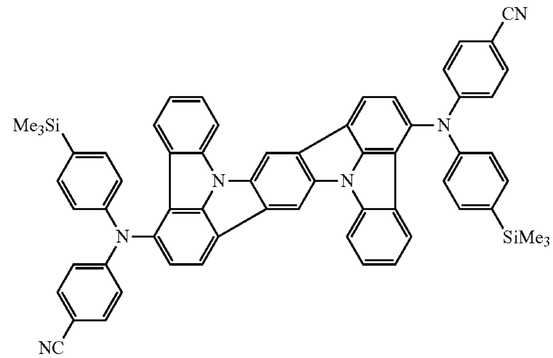
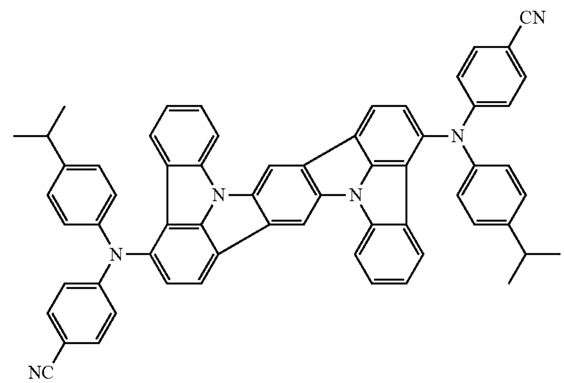
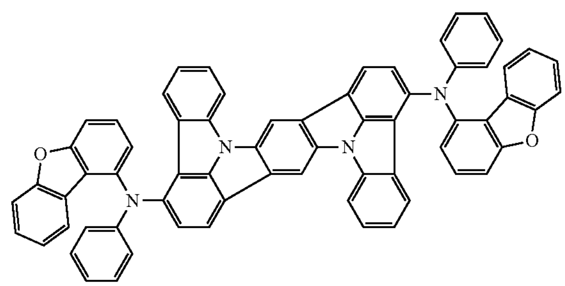
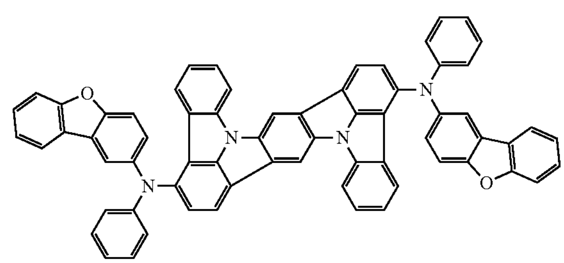
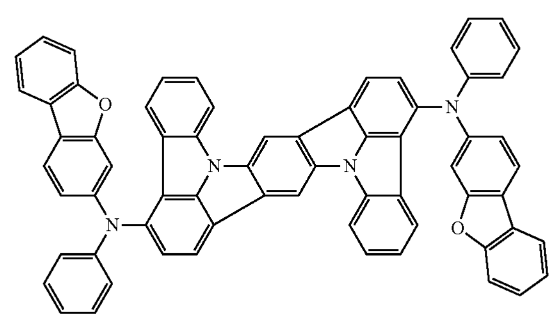

-continued
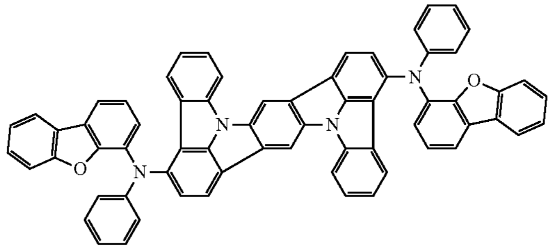
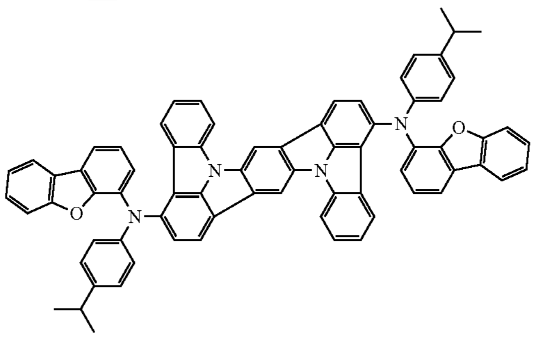
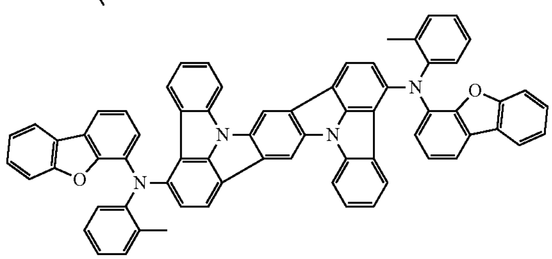
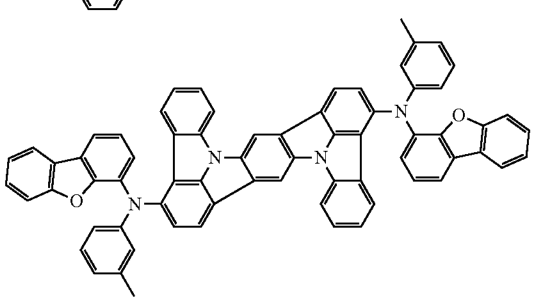
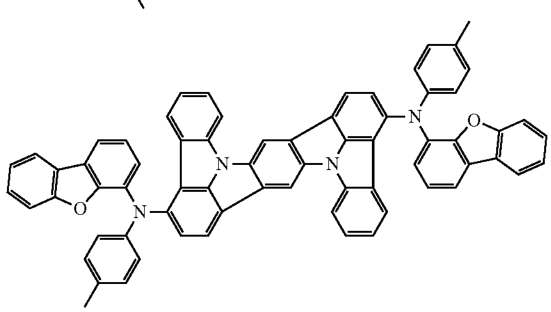
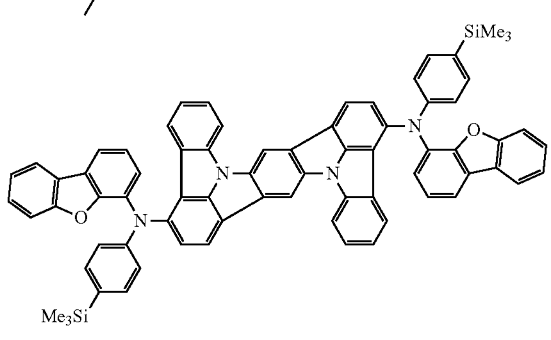
-continued
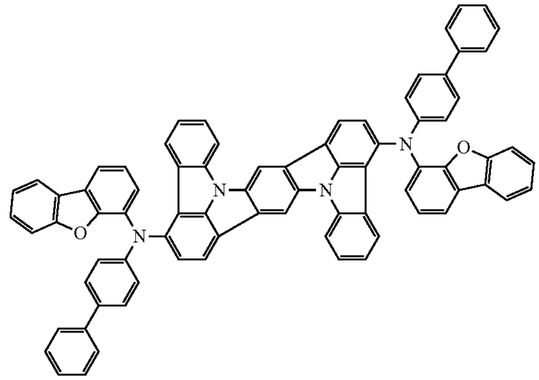
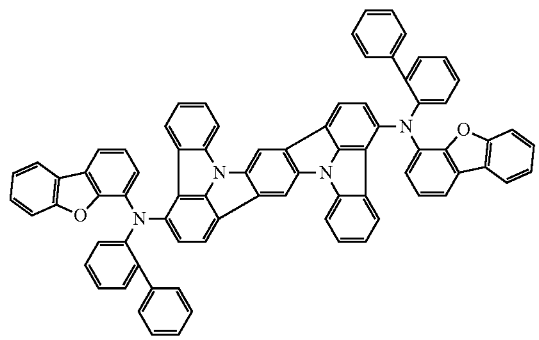
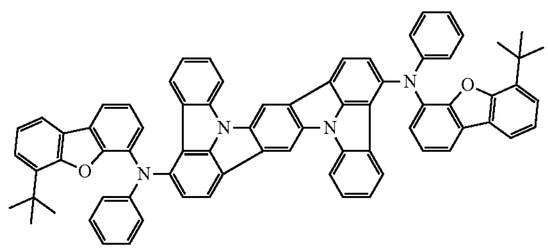
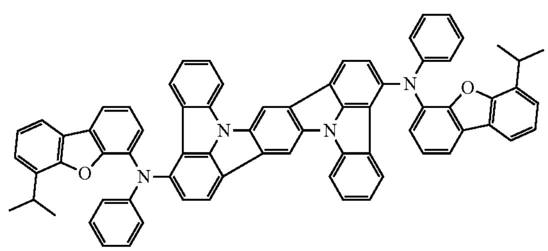
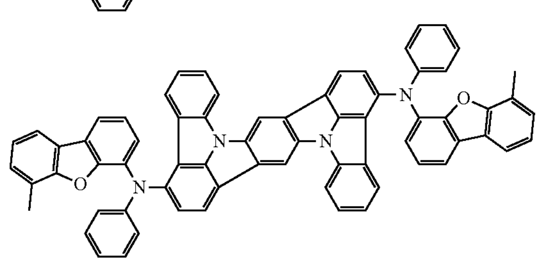
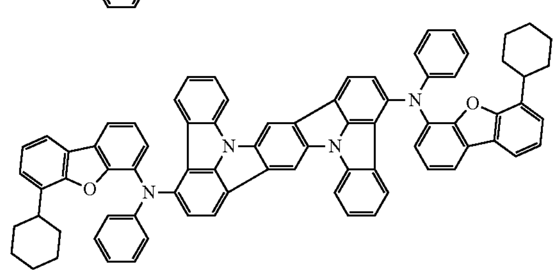

-continued
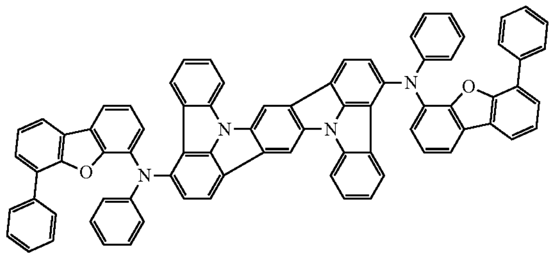
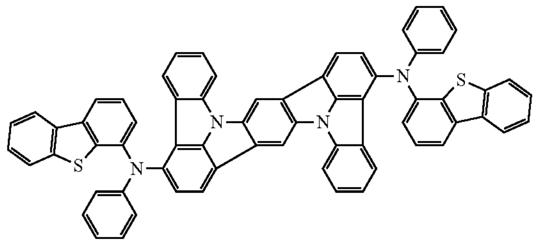
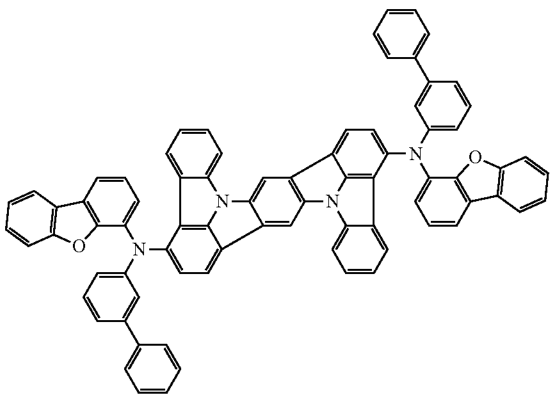
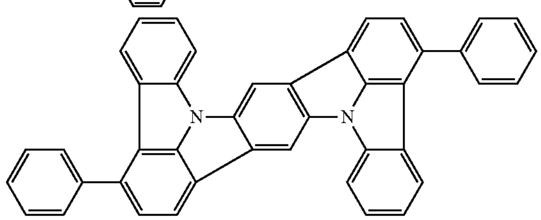
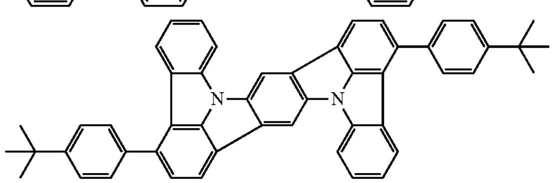
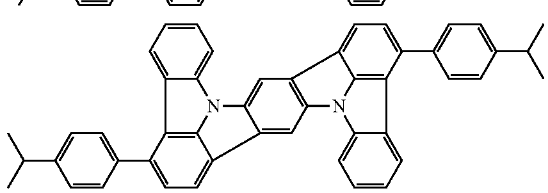
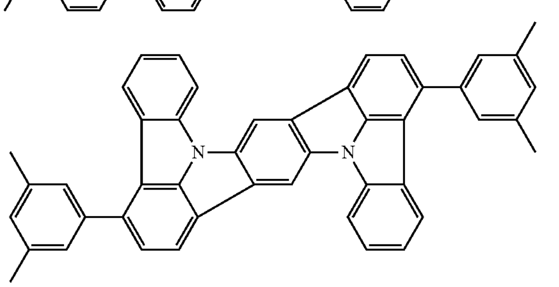
-continued
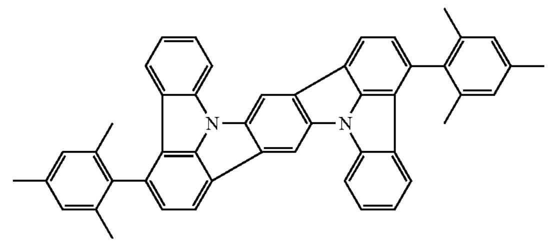
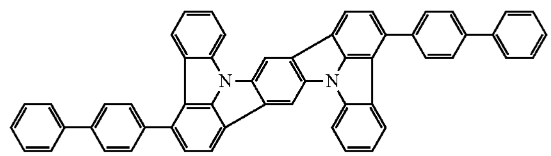
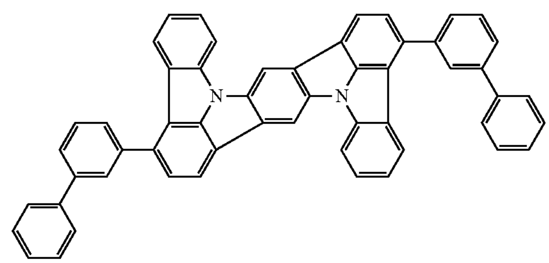
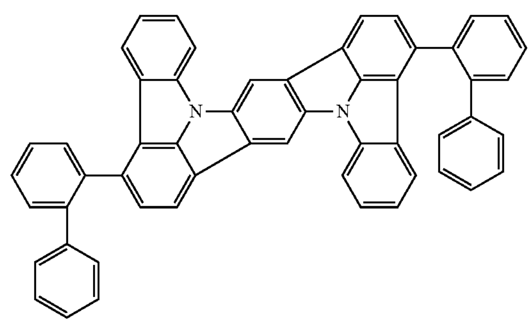
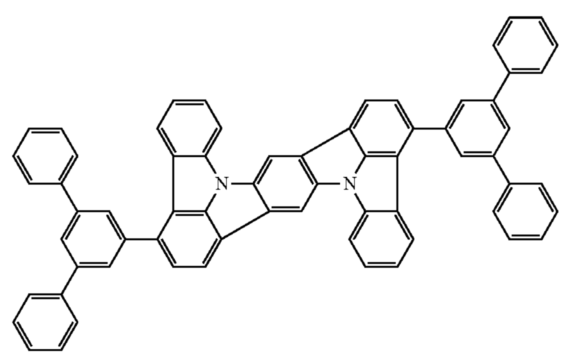
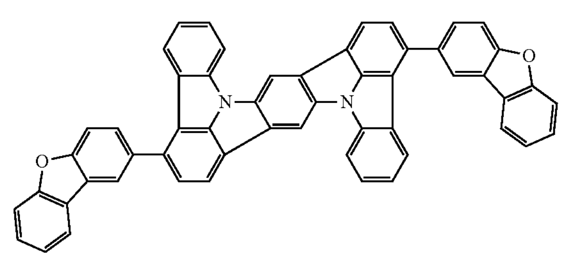

-continued

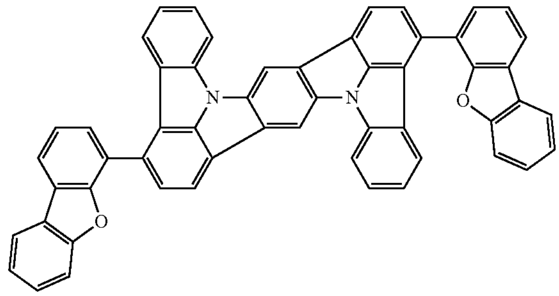

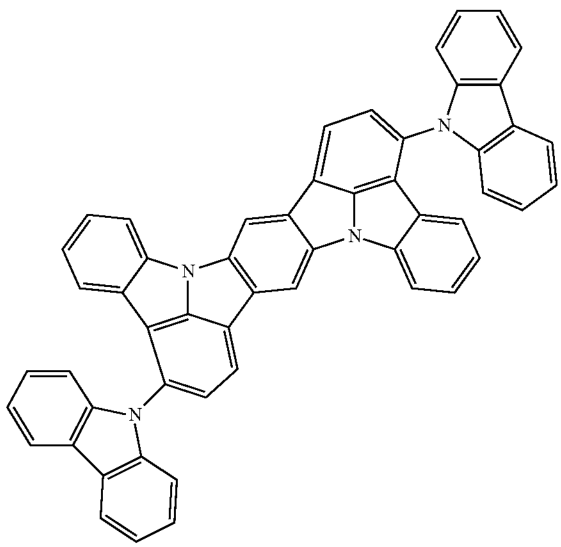

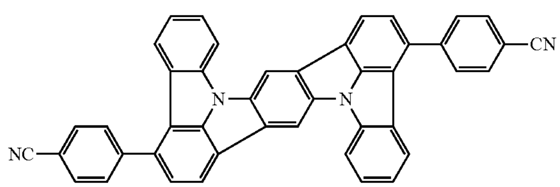

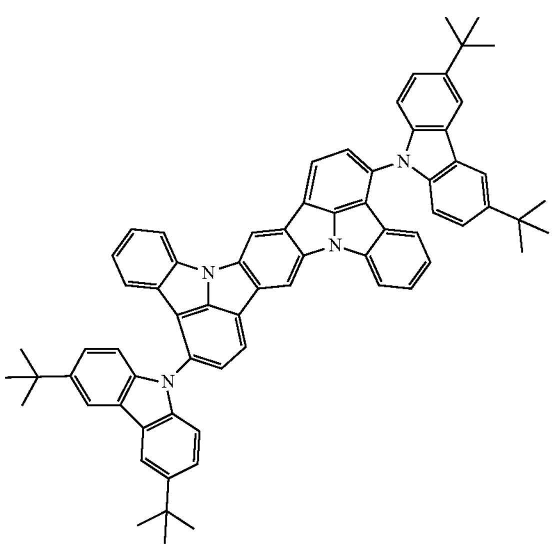

-continued

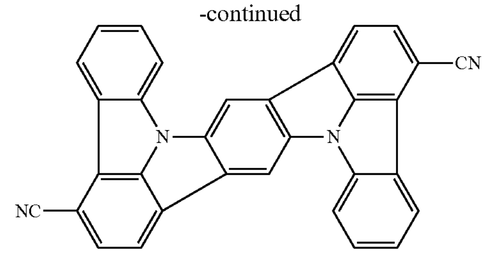

(Compound Represented by the Formula (41))

A compound represented by the formula (41) will be described.

(41)

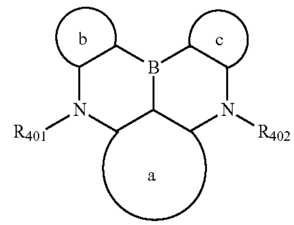

In the formula (41), ring a, ring b and ring c are independently a substituted or unsubstituted aromatic hydrocarbon ring including 6 to 50 ring carbon atoms, or a substituted or unsubstituted heterocyclic ring including 5 to 50 ring atoms.

$R_{401}$ and $R_{402}$ independently form a substituted or unsubstituted heterocyclic ring by bonding with the ring a, the ring b, or the ring c, or do not form a substituted or unsubstituted heterocyclic ring.

$R_{401}$ and $R_{402}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The ring a, the ring b, and the ring c are a ring (a substituted or unsubstituted aromatic hydrocarbon ring including 6 to 50 ring carbon atoms, or a substituted or unsubstituted heterocyclic ring including 5 to 50 ring atoms) fused to the central fused bicyclic structure composed of a B atom and two N atoms in the formula (41).

The “aromatic hydrocarbon ring” for the ring a, the ring b, and the ring c has the structure same as the compound in which a hydrogen atom is introduced into the “aryl group” described above. The “aromatic hydrocarbon ring” for the ring a contains three carbon atoms on the central fused bicyclic structure in the formula (41) as ring atoms. The “aromatic hydrocarbon ring” for the ring b and the ring c contains two carbon atoms on the central fused bicyclic structure in the formula (41) as ring atoms. Specific examples of the “substituted or unsubstituted aromatic hydrocarbon ring including 6 to 50 ring carbon atoms”

include compounds in which the hydrogen atom is introduced into the "aryl group" described in the specific example group G1, and the like.

The "heterocyclic ring" for the ring a, the ring b, and the ring c has the structure same as the compound in which a hydrogen atom is introduced into the "heterocyclic group" described above. The "heterocyclic ring" for the ring a contains three carbon atoms on the central fused bicyclic structure in the formula (41) as ring atoms. The "heterocyclic ring" for the ring b and the ring c contains two carbon atoms on the central fused bicyclic structure in the formula (41) as the ring atoms. Specific examples of the "substituted or unsubstituted heterocyclic ring including 5 to 50 ring atoms" include compounds in which the hydrogen atom is introduced into the "heterocyclic group" described in the specific example group G2, and the like.

$R_{401}$ and $R_{402}$ may independently form a substituted or unsubstituted heterocyclic ring by bonding with the ring a, the ring b, or the ring c. The heterocyclic ring in this case contains the nitrogen atom on the central fused bicyclic structure in the formula (41). The heterocyclic ring in this case may contain a hetero atom other than the nitrogen atom. The expression "$R_{401}$ and $R_{402}$ being bonded with the ring a, the ring b, or the ring c" specifically means that the atoms forming the ring a, the ring b, or the ring c are bonded with the atoms forming $R_{401}$ and $R_{402}$. For example, $R_{401}$ may be bonded with the ring a to form a fused bicyclic (or a fused tricyclic or more polycyclic) nitrogen-containing heterocyclic ring in which the ring containing $R_{401}$ is fused with the ring a. Specific examples of the nitrogen-containing heterocyclic ring include a compound corresponding to a fused heterocyclic group composed of two or more rings which contains nitrogen in the specific example group G2.

The same applies when $R_{401}$ is bonded with the ring b, when $R_{402}$ is bonded with the ring a, and when $R_{402}$ is bonded with the ring c.

In one embodiment, the ring a, the ring b, and the ring c in the formula (41) are independently a substituted or unsubstituted aromatic hydrocarbon ring including 6 to 50 ring carbon atoms.

In one embodiment, the ring a, the ring b, and the ring c in the formula (41) are independently a substituted or unsubstituted benzene ring or a substituted or unsubstituted naphthalene ring.

In one embodiment, $R_{401}$ and $R_{402}$ in the formula (41) are independently a substituted or unsubstituted aryl group including 6 to 50 ring carbon atoms, or a substituted or unsubstituted monovalent heterocyclic group including 5 to 50 ring atoms, and preferably a substituted or unsubstituted aryl group including 6 to 50 ring carbon atoms.

In one embodiment, the compound represented by the formula (41) is a compound represented by the following formula (42).

(42)

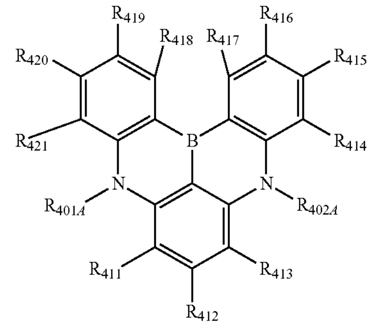

In the formula (42), $R_{401A}$ forms a substituted or unsubstituted heterocyclic ring by bonding with one or more selected from the group consisting of $R_{411}$ and $R_{421}$, or does not form a substituted or unsubstituted heterocyclic ring. $R_{402A}$ forms a substituted or unsubstituted heterocyclic ring by bonding with one or more selected from the group consisting of $R_{413}$ and $R_{414}$, or does not form a substituted or unsubstituted heterocyclic ring.

$R_{401A}$ and $R_{402A}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

One or more sets of adjacent two or more of $R_{411}$ to $R_{421}$ form a substituted or unsubstituted, saturated or unsaturated ring by bonding with each other, or do not form a substituted or unsubstituted, saturated or unsaturated ring.

$R_{411}$ to $R_{421}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

$R_{401A}$ and $R_{402A}$ in the formula (42) are groups corresponding to $R_{401}$ and $R_{402}$ in the formula (41).

For example, $R_{401A}$ and $R_{411}$ may be bonded with each other to form a fused bicyclic (or fused tricyclic or more polycyclic) nitrogen-containing heterocyclic ring in which a benzene ring corresponding to the ring a is fused with a ring containing them. Specific examples of the nitrogen-containing heterocyclic ring include a compound corresponding to a fused bicyclic or more polycyclic heterocyclic group which contains nitrogen in the specific example group G2. The same applies when $R_{401A}$ and $R_{412}$ are bonded with each other, when $R_{402A}$ and $R_{413}$ are bonded with each other, and when $R_{402A}$ and $R_{414}$ are bonded with each other.

One or more sets of adjacent two or more of $R_{411}$ to $R_{421}$ may form a substituted or unsubstituted, saturated or unsaturated ring by bonding with each other. For example, $R_{411}$ and $R_{412}$ may form a structure in which a benzene ring, an indole ring, a pyrrole ring, a benzofuran ring, a benzothiophene ring, and the like are fused to a 6-membered ring with which they are bonded, and the formed fused ring is a naphthalene ring, a carbazole ring, an indole ring, a dibenzofuran ring, or a dibenzothiophene ring.

In one embodiment, $R_{411}$ to $R_{421}$ which do not contribute to ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ which do not contribute to ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ which do not contribute to ring formation are independently a hydrogen atom, or a substituted or unsubstituted alkyl group including 1 to 50 carbon atoms.

In one embodiment, $R_{411}$ to $R_{421}$ which do not contribute to ring formation are independently a hydrogen atom, or a substituted or unsubstituted alkyl group including 1 to 50 carbon atoms, and at least one of $R_{411}$ to $R_{421}$ is a substituted or unsubstituted alkyl group including 1 to 50 carbon atoms.

In one embodiment, the compound represented by the formula (42) is a compound represented by the following formula (43).

(43)

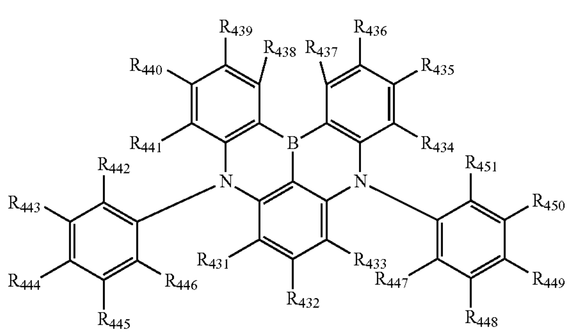

In the formula (43), $R_{431}$ forms a substituted or unsubstituted heterocyclic ring by bonding with $R_{446}$, or does not form a substituted or unsubstituted heterocyclic ring. $R_{433}$ forms a substituted or unsubstituted heterocyclic ring by bonding with $R_{447}$, or does not form a substituted or unsubstituted heterocyclic ring. $R_{434}$ forms a substituted or unsubstituted heterocyclic ring by bonding with $R_{451}$, or does not form a substituted or unsubstituted heterocyclic ring. $R_{441}$ forms a substituted or unsubstituted heterocyclic ring by bonding with $R_{442}$, or does not form a substituted or unsubstituted heterocyclic ring.

One or more sets of adjacent two or more of $R_{431}$ to $R_{451}$ form a substituted or unsubstituted, saturated or unsaturated ring by bonding with each other, or do not form a substituted or unsubstituted, saturated or unsaturated ring.

$R_{431}$ to $R_{451}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

$R_{431}$ may form a substituted or unsubstituted heterocyclic ring by bonding with $R_{446}$. For example, $R_{431}$ and $R_{446}$ may be bonded with each other to form a fused tricyclic or more polycyclic nitrogen-containing heterocyclic ring in which the benzene ring with which $R_{46}$ is bonded, the ring containing N, and the benzene ring corresponding to the ring a are fused to each other. Specific examples of the nitrogen-containing heterocyclic ring include a compound corresponding to fused tricyclic or more polycyclic heterocyclic group which contains nitrogen in the specific example group G2. The same applies when $R_{433}$ and $R_{447}$ are bonded with each other, when $R_{434}$ and $R_{451}$ are bonded with each other, and when $R_{441}$ and $R_{442}$ are bonded with each other.

In one embodiment, $R_{431}$ to $R_{451}$ which do not contribute to ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ which do not contribute to ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ which do not contribute to ring formation are independently a hydrogen atom, or a substituted or unsubstituted alkyl group including 1 to 50 carbon atoms.

In one embodiment, $R_{431}$ to $R_{451}$ which do not contribute to ring formation are independently a hydrogen atom, or a substituted or unsubstituted alkyl group including 1 to 50 carbon atoms, and at least one of $R_{431}$ to $R_{451}$ is a substituted or unsubstituted alkyl group including 1 to 50 carbon atoms.

In one embodiment, the compound represented by the formula (43) is a compound represented by the following formula (43A).

(43A)

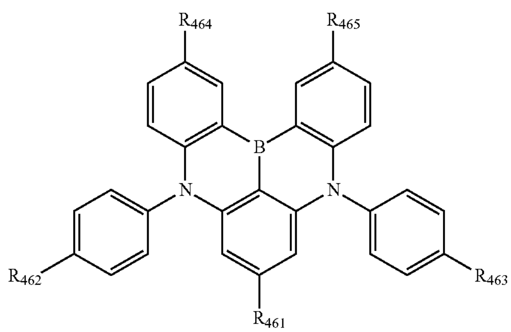

In the formula (43A), $R_{461}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

$R_{462}$ to $R_{465}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms.

In one embodiment, the compound represented by the formula (43) is a compound represented by the following formula (43B).

(43B)

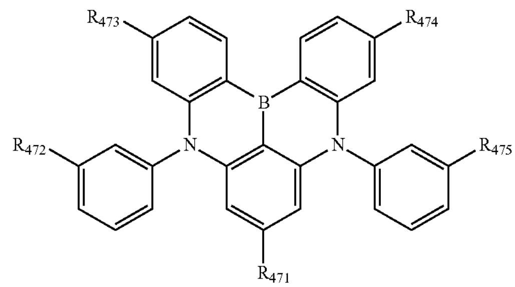

In the formula (43B), $R_{471}$ and $R_{472}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$)($R_{907}$), or a substituted or unsubstituted aryl group including 6 to 50 ring carbon atoms.

$R_{473}$ to $R_{475}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$) ($R_{907}$), or a substituted or unsubstituted aryl group including 6 to 50 ring carbon atoms.

$R_{906}$ and $R_{907}$ are as defined in the formula (1).

In one embodiment, the compound represented by the formula (43) is a compound represented by the following formula (43B').

(43B')

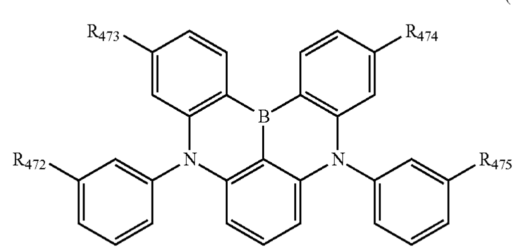

In the formula (43B'), $R_{472}$ to $R_{475}$ are as defined in the formula (43B).

In one embodiment, at least one of $R_{471}$ to $R_{475}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$)($R_{907}$), or a substituted or unsubstituted aryl group including 6 to 50 ring carbon atoms.

In one embodiment, $R_{472}$ is a hydrogen atom, a substituted or unsubstituted alkyl group including 1 to 50 carbon atoms, —N($R_{906}$) ($R_{907}$), or a substituted or unsubstituted aryl group including 6 to 50 ring carbon atoms.

$R_{471}$ and $R_{473}$ to $R_{475}$ are independently a substituted or unsubstituted alkyl group including 1 to 50 carbon atoms, —N($R_{906}$) ($R_{907}$), or a substituted or unsubstituted aryl group including 6 to 50 ring carbon atoms.

In one embodiment, the compound represented by the formula (43) is a compound represented by the following formula (43C).

(43C)

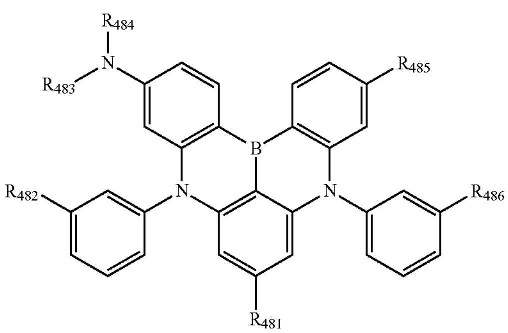

In the formula (43C), $R_{481}$ and $R_{482}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

$R_{483}$ to $R_{486}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, the compound represented by the formula (43) is a compound represented by the following formula (43C').

(43C')

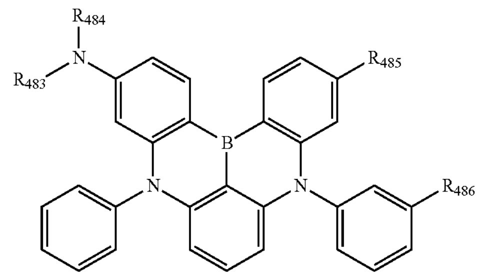

In the formula (43C'), $R_{483}$ to $R_{486}$ are as defined in the formula (43C).

In one embodiment, $R_{481}$ to $R_{486}$ are independently a substituted or unsubstituted alkyl group including 1 to 50 carbon atoms, or a substituted or unsubstituted aryl group including 6 to 50 ring carbon atoms.

In one embodiment, $R_{481}$ to $R_{486}$ are independently a substituted or unsubstituted aryl group including 6 to 50 ring carbon atoms.

In the compound represented by the formula (41), for example, an intermediate is prepared by first bonding the ring a, the ring b, and the ring c cia linking groups (a group containing N—$R_1$ and a group containing N—$R_2$) (first reaction), and a final product can be prepared by bonding the ring a, the ring b, and the ring c cia a linking group (a group containing B) (second reaction). In the first reaction, an amination reaction such as a Buchwald-Hartwig reaction or the like can be applied. In the second reaction, a tandem hetero-Friedel-Crafts reaction or the like can be applied.

Hereinafter, specific examples of the compound represented by the formula (41) will be described, but are illustrative only, and the compound represented by the formula (41) is not limited to the following specific examples. In the following specific examples, "Me" represents a methyl group, and "tBu" represents a tert-butyl group.

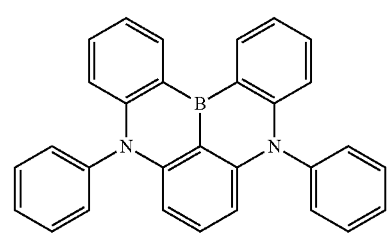

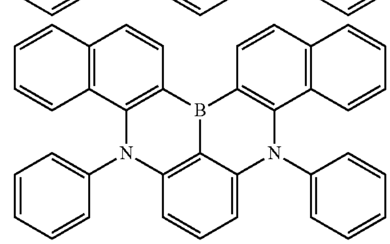

-continued
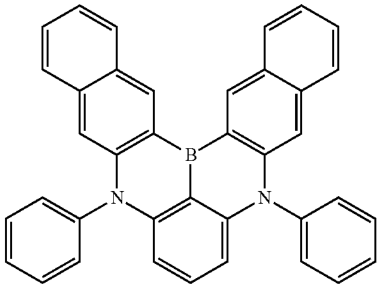
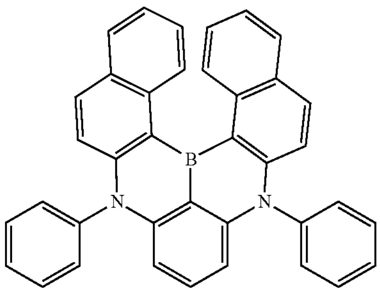
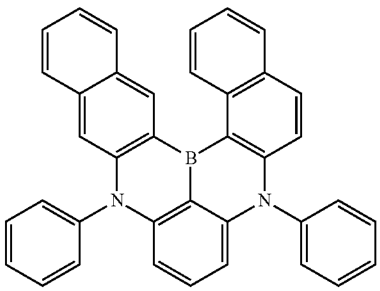
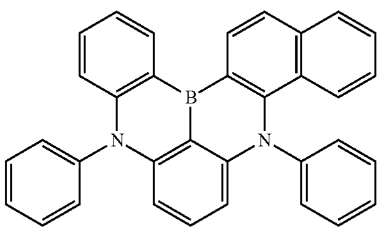
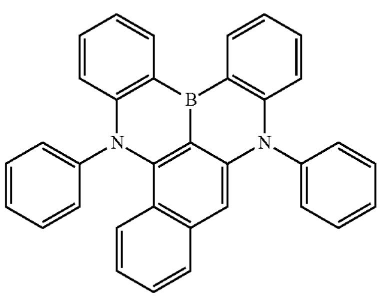
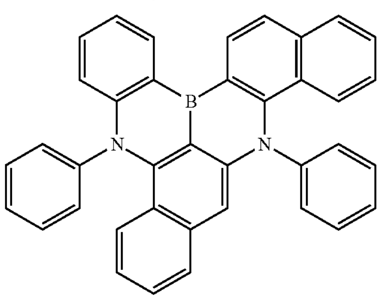
-continued
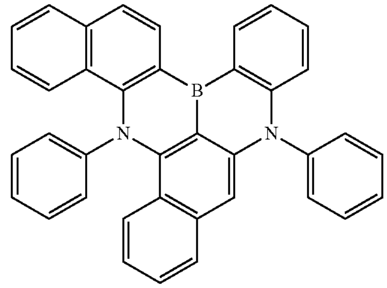
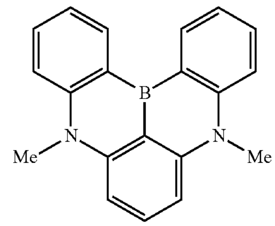
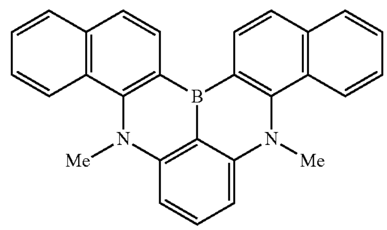
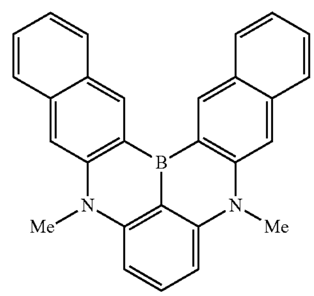
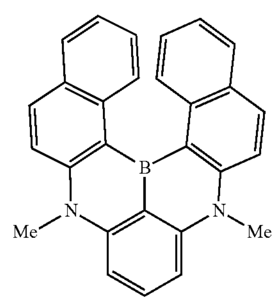
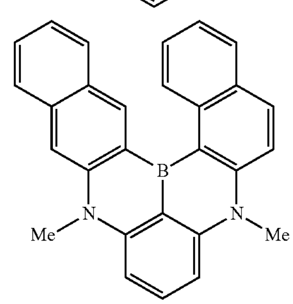

-continued
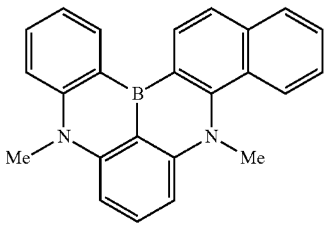
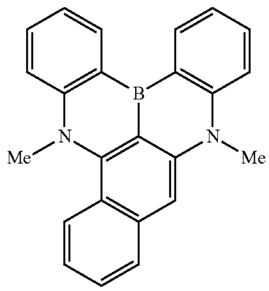
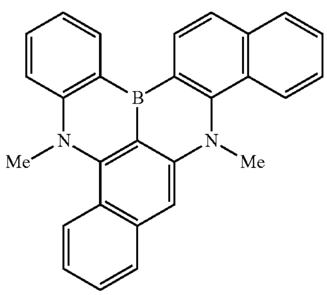
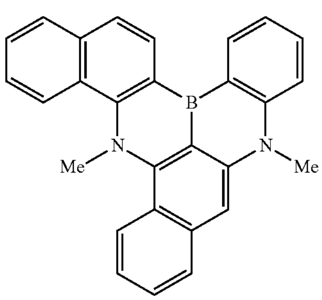
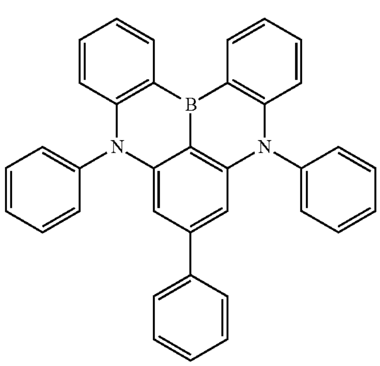
-continued
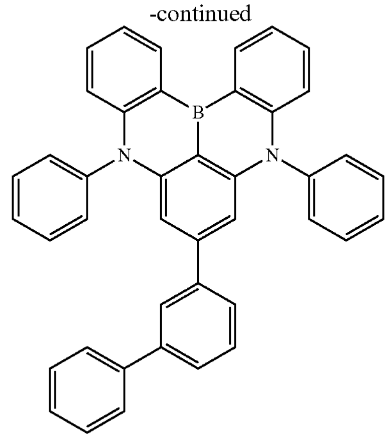
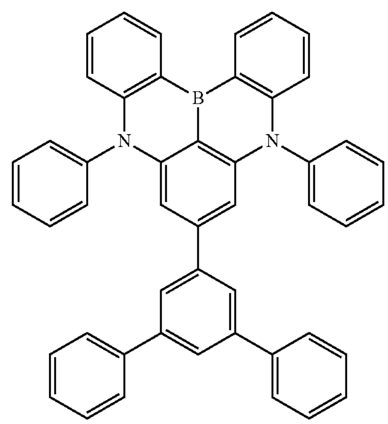
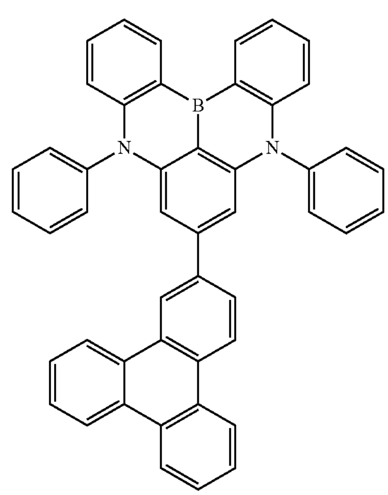

-continued
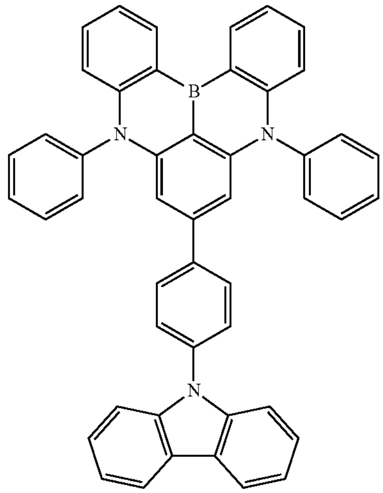
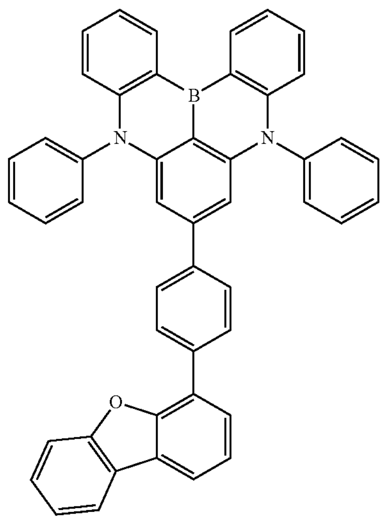
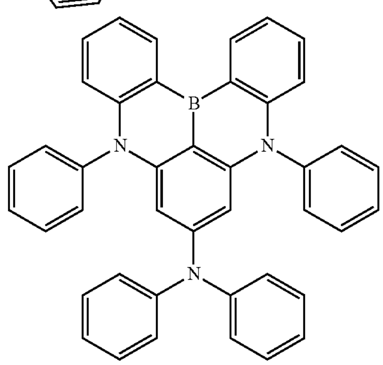
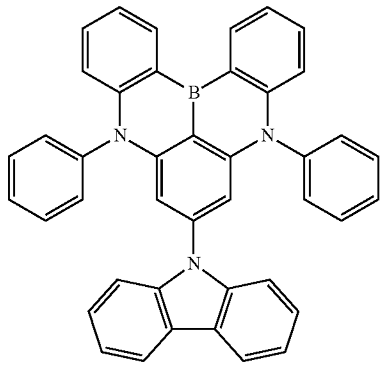
-continued
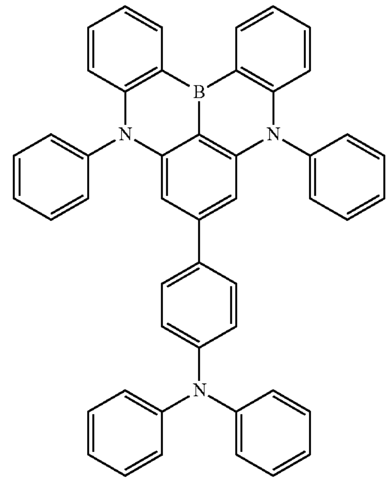
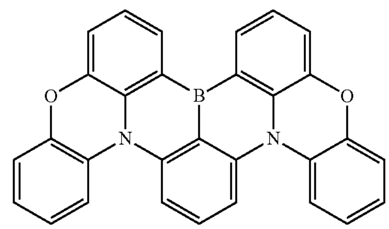
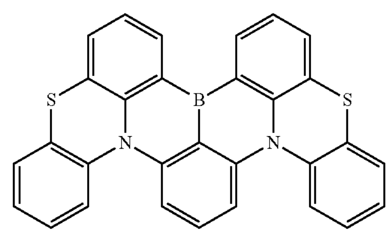
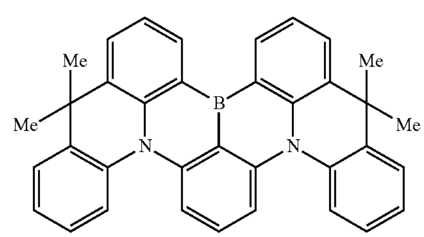
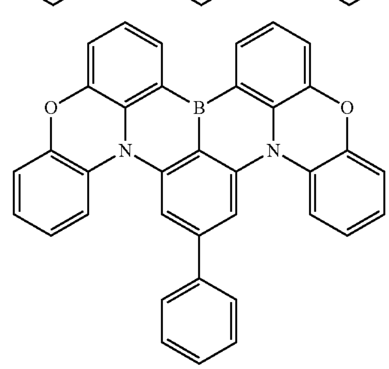

-continued
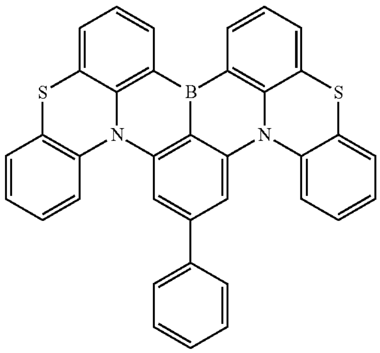
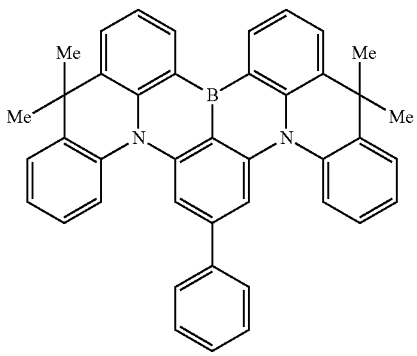
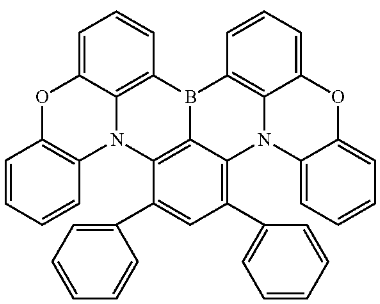
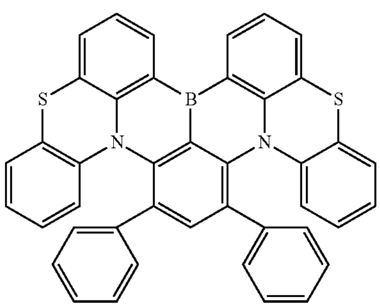
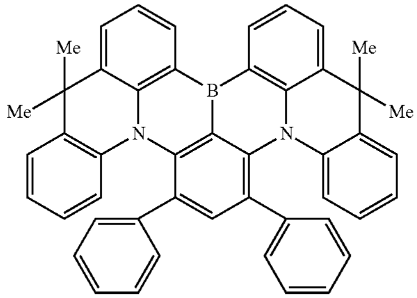
-continued
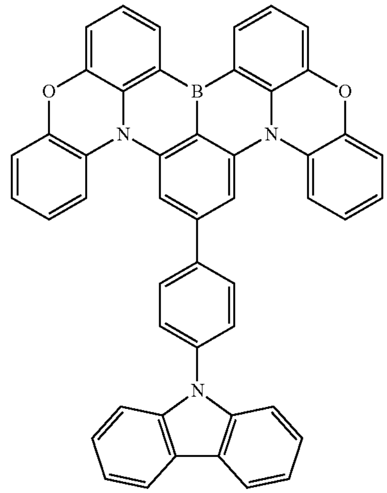
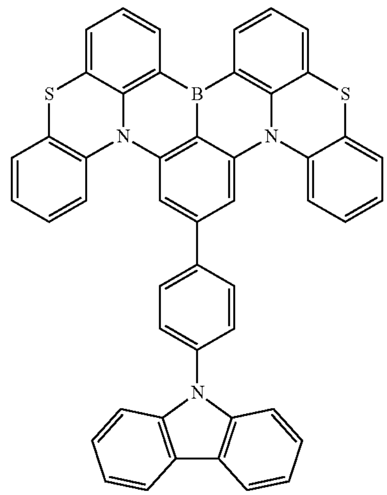
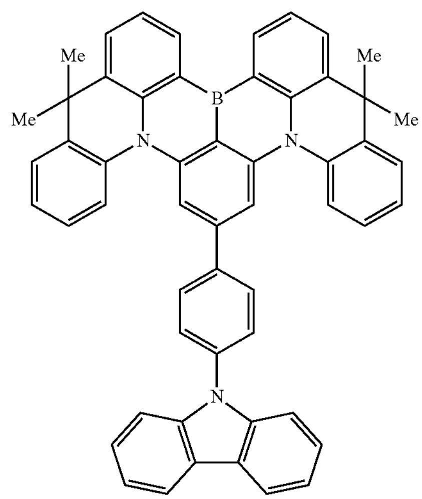
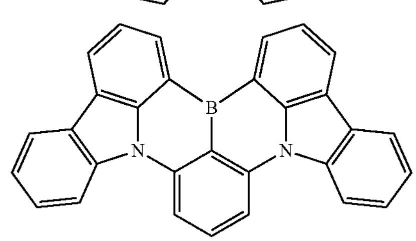

-continued
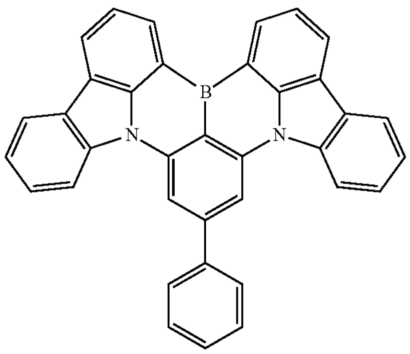
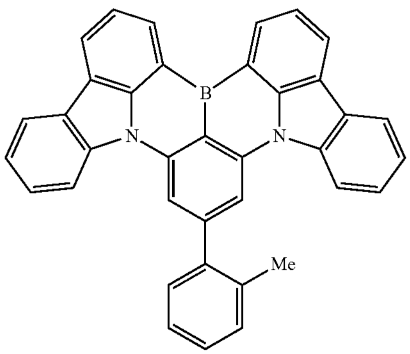
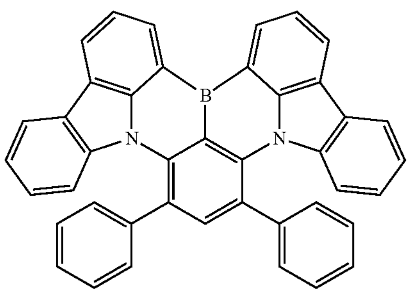
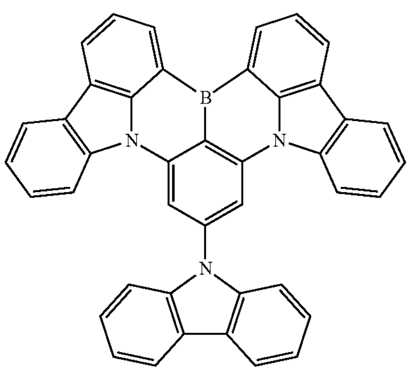
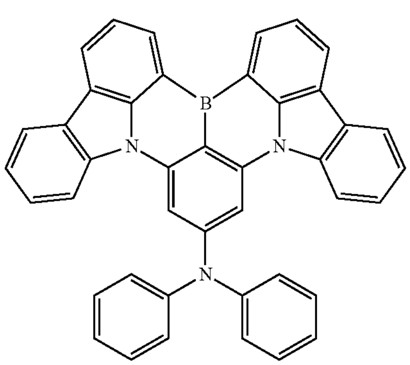
-continued
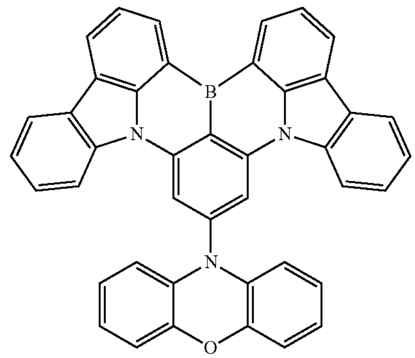
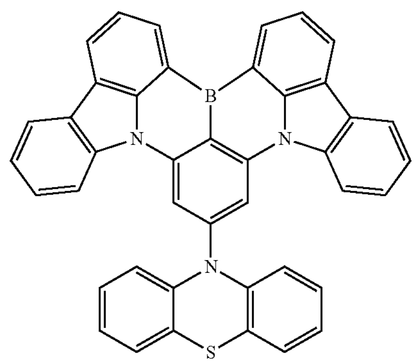
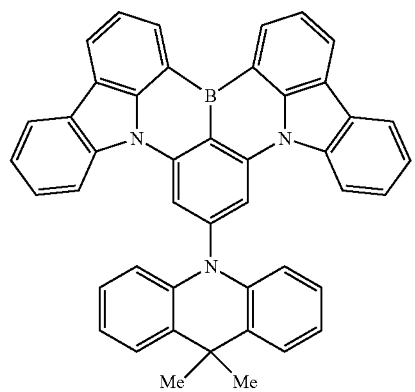
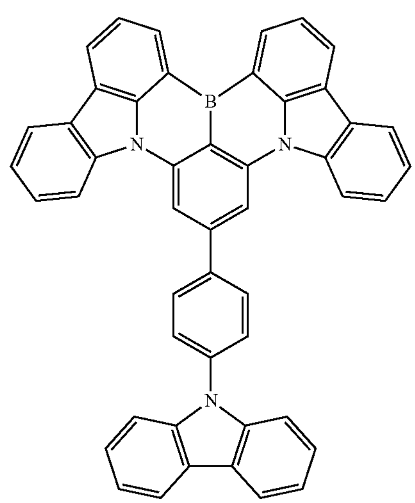

-continued
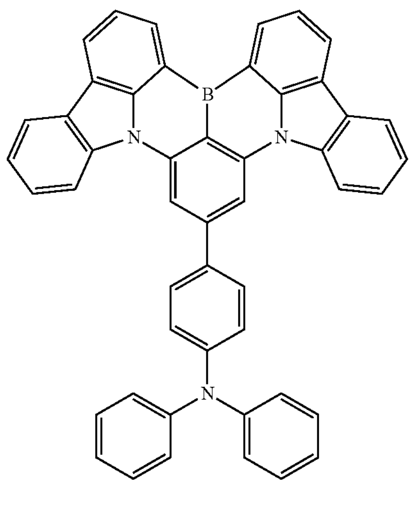
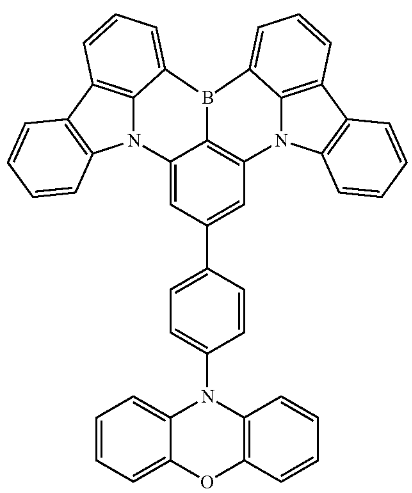
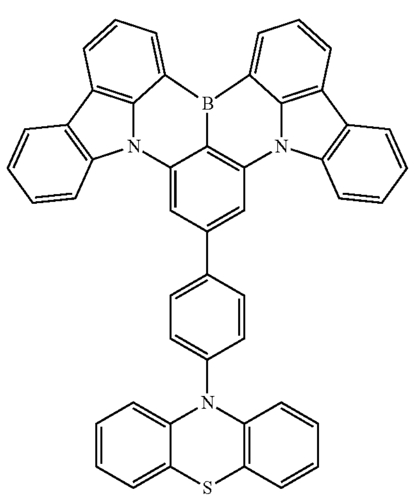
-continued
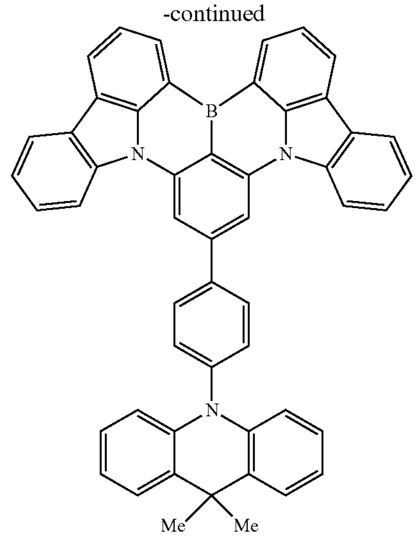
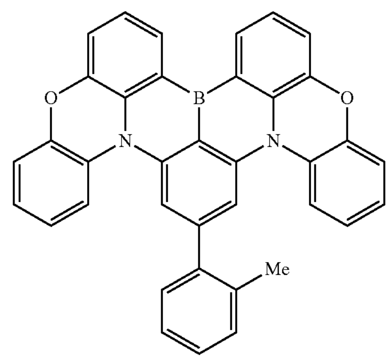
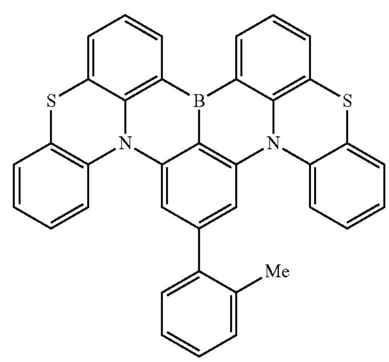
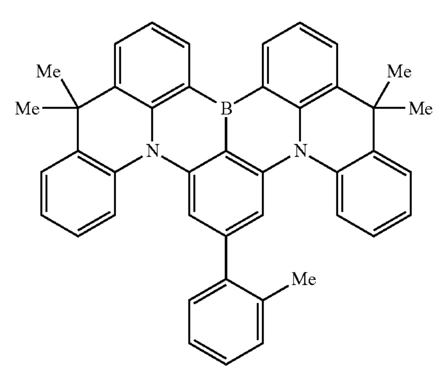

-continued
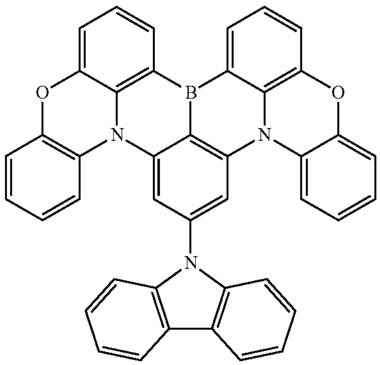
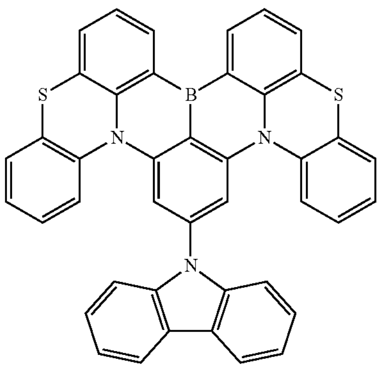
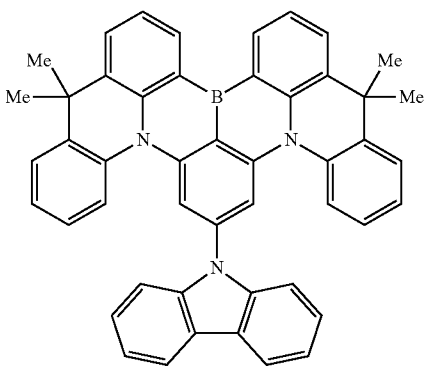
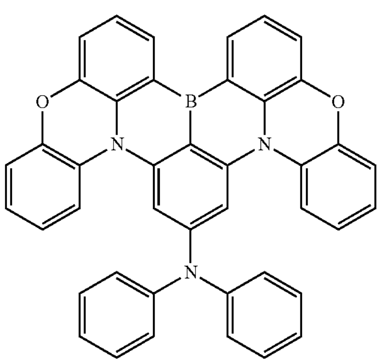
-continued
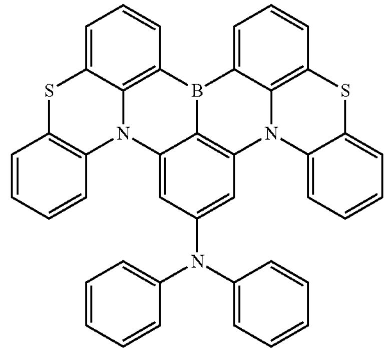
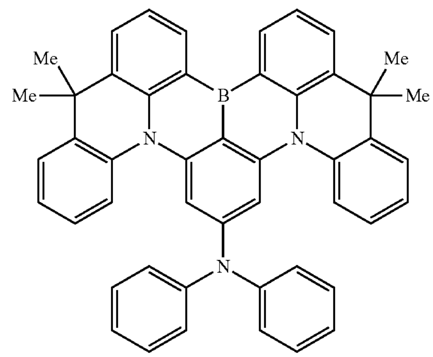
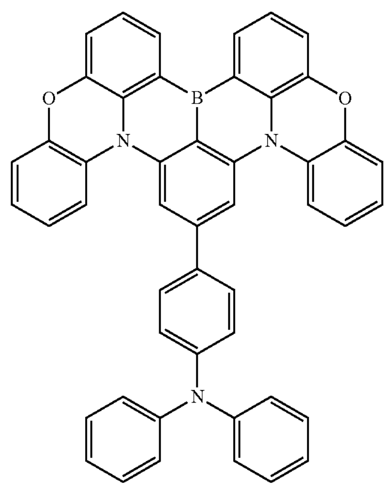
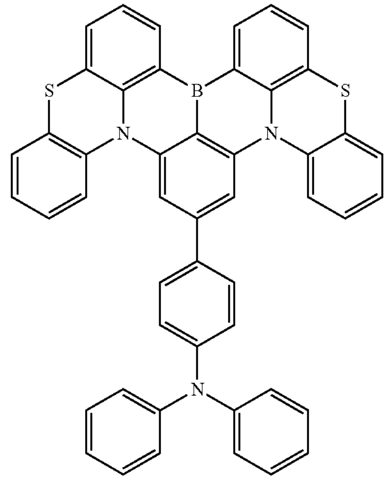

-continued
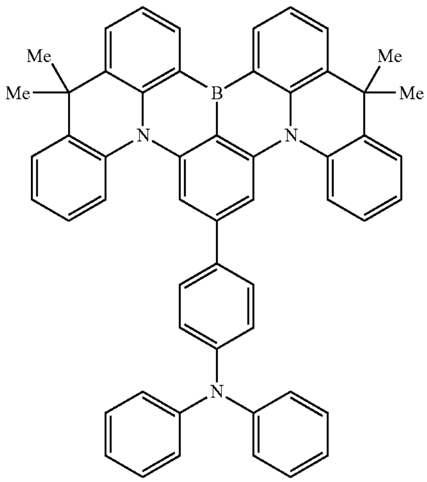
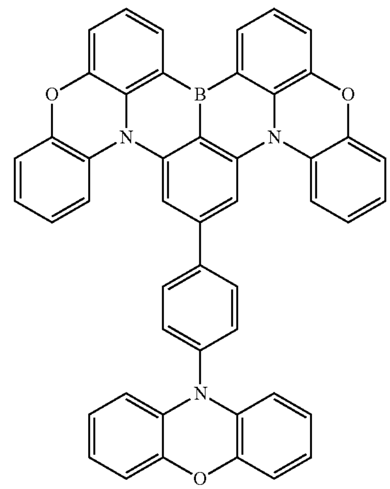
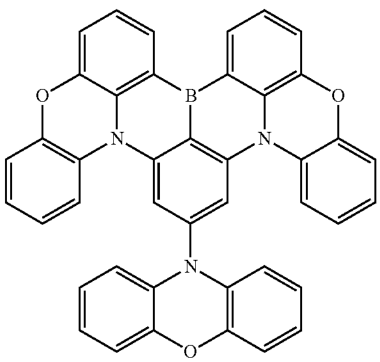
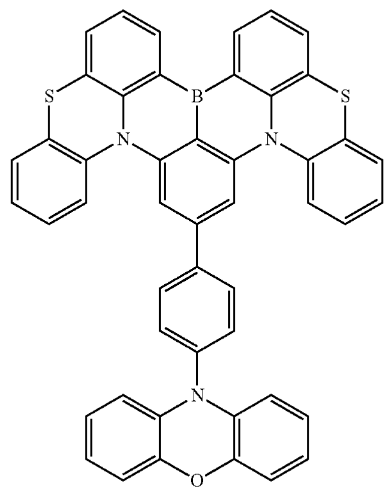
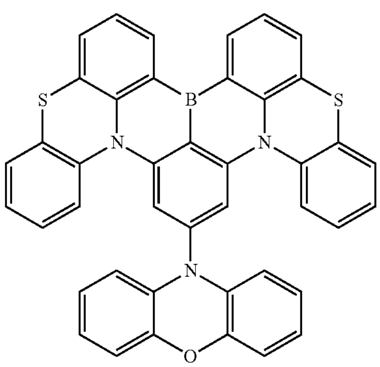
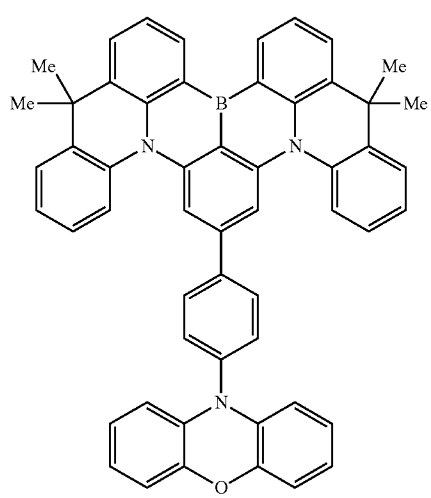
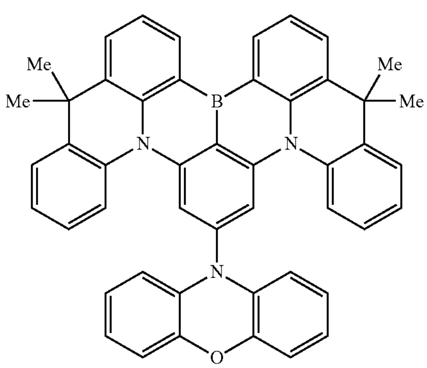

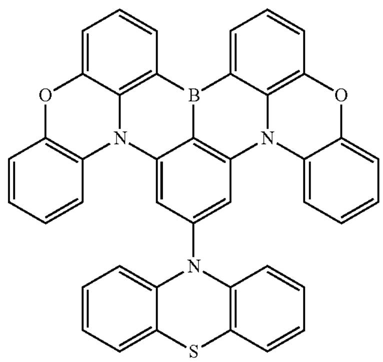
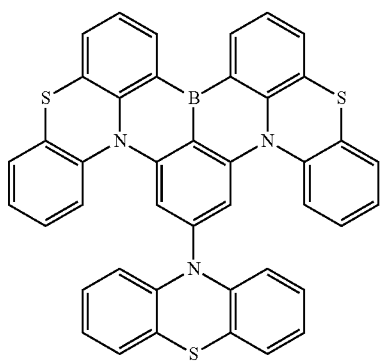
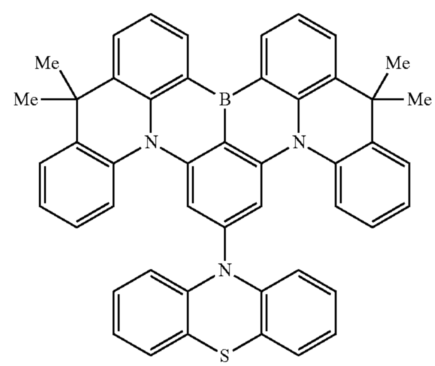
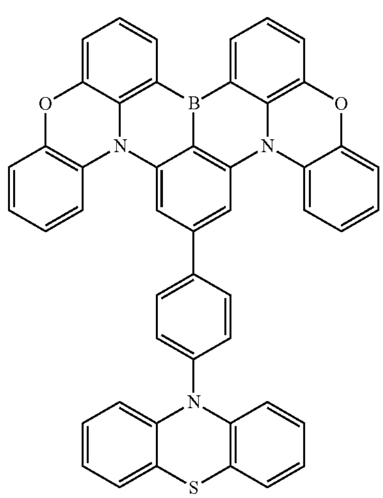
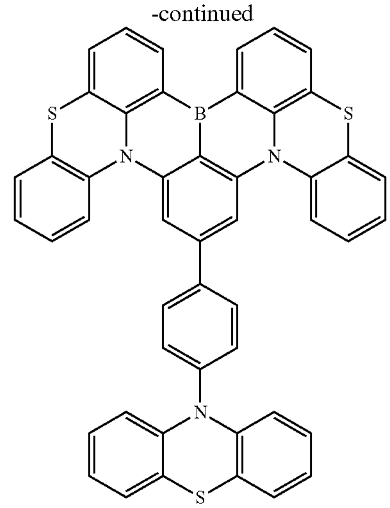
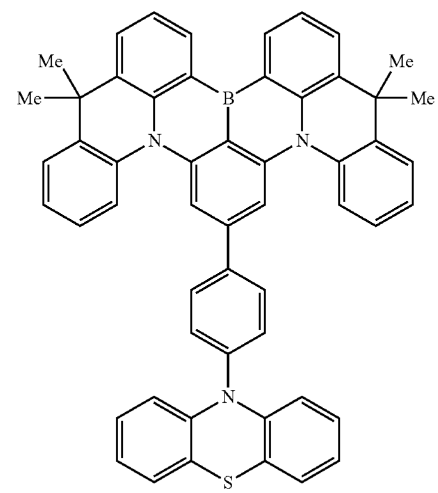
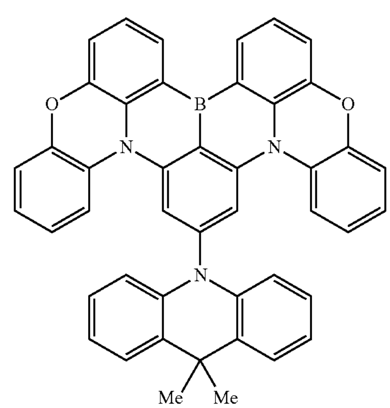

-continued
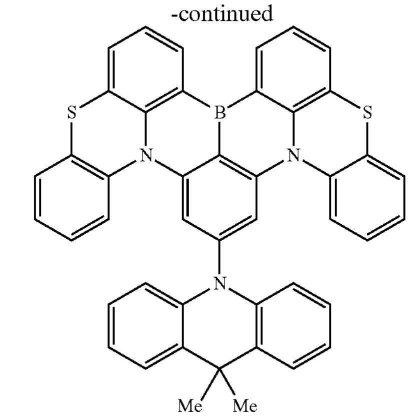
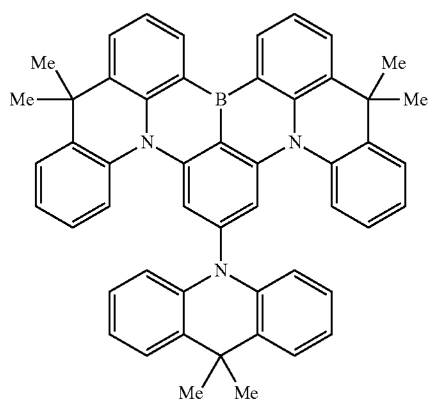
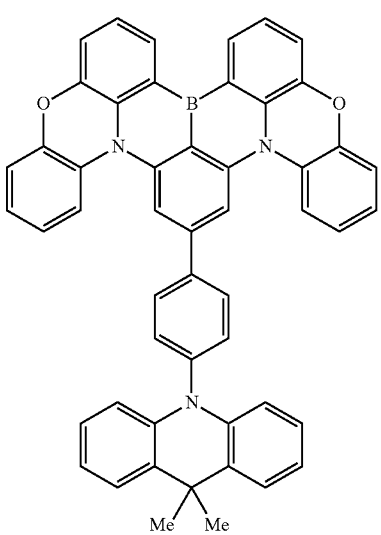
-continued
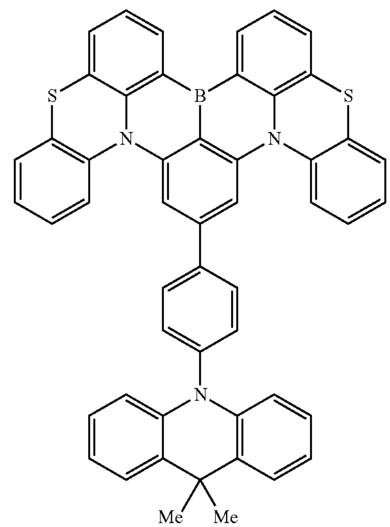
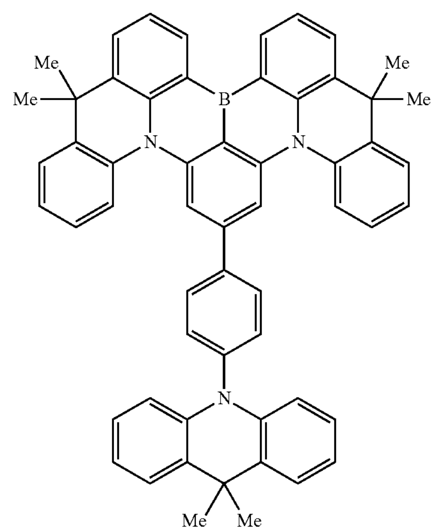
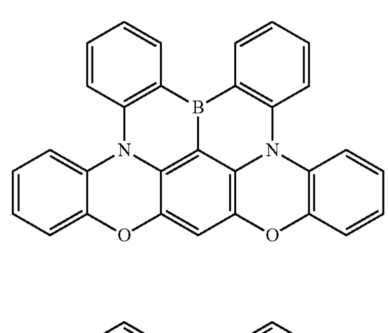
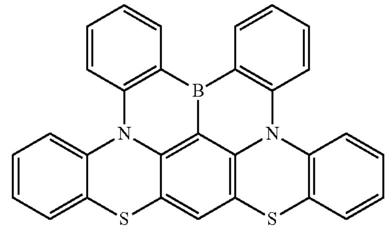

-continued
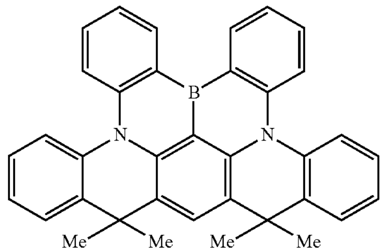
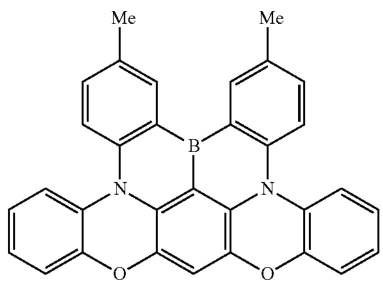
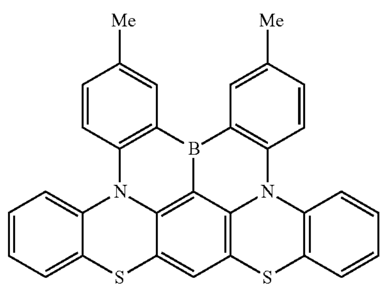
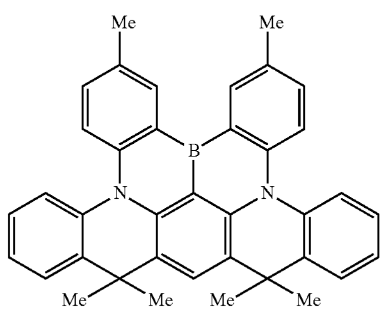
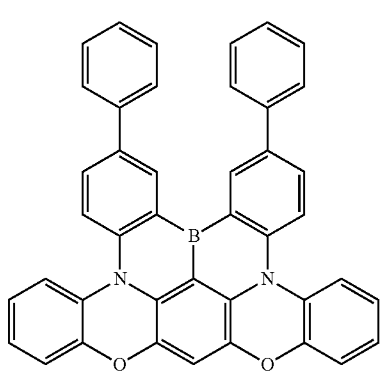
-continued
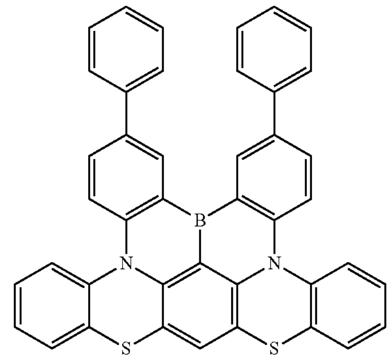
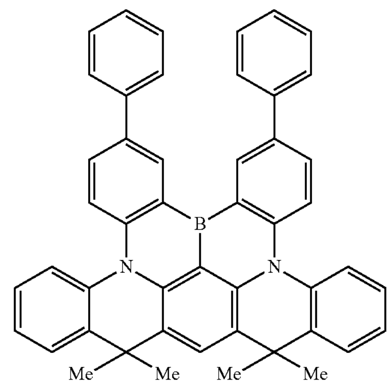
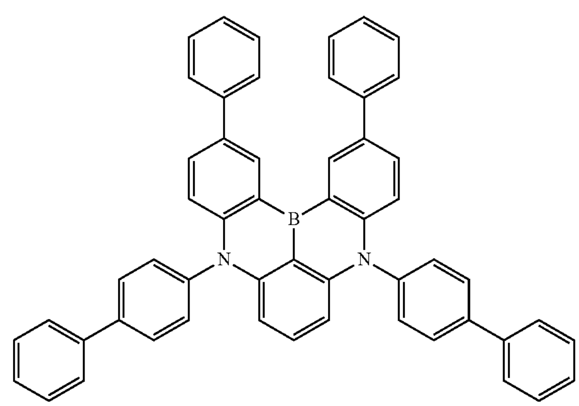
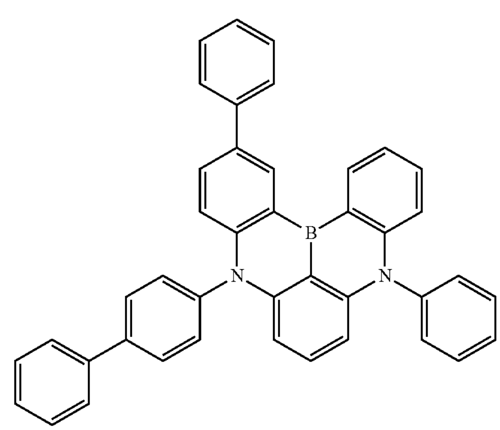

-continued
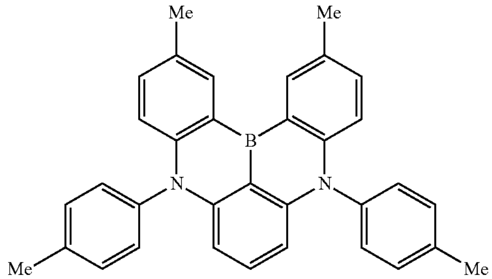
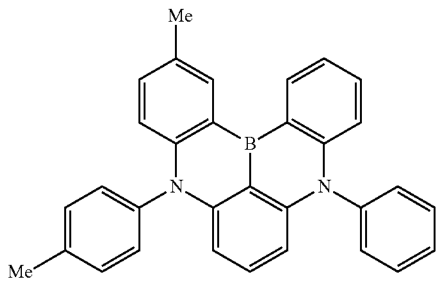
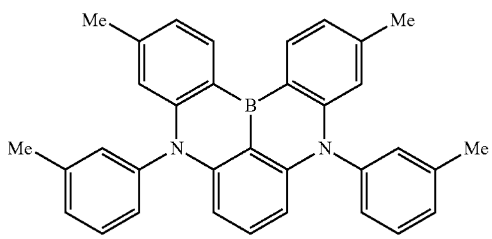
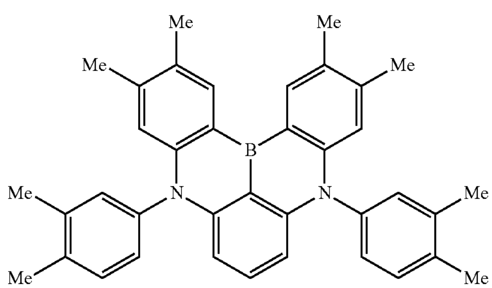
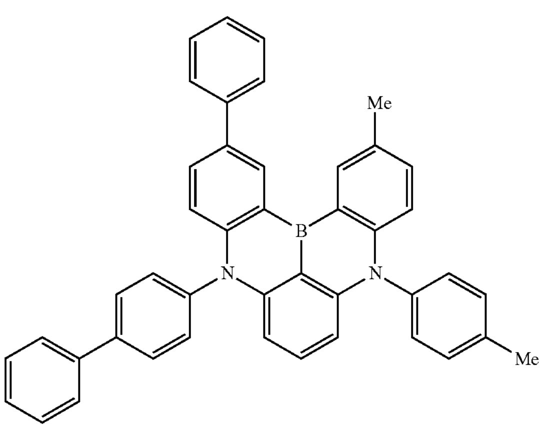
-continued
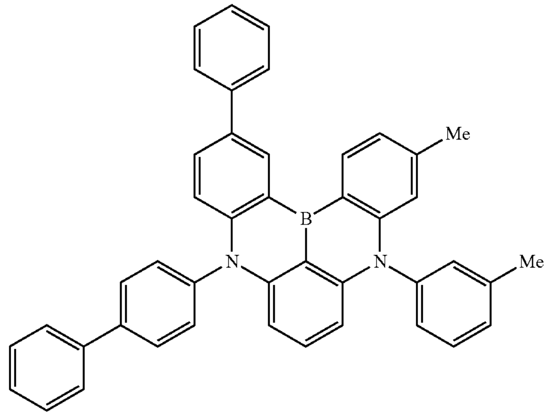
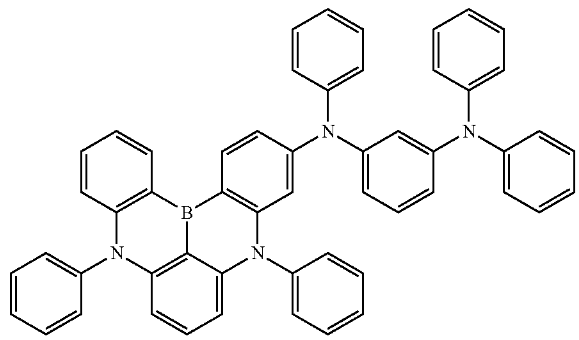
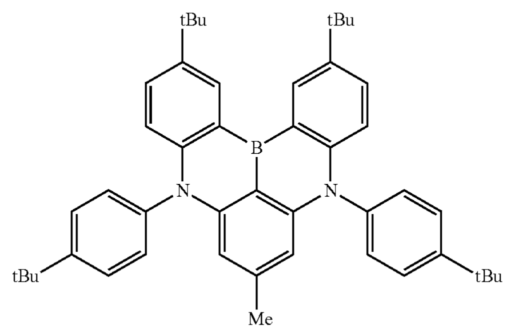
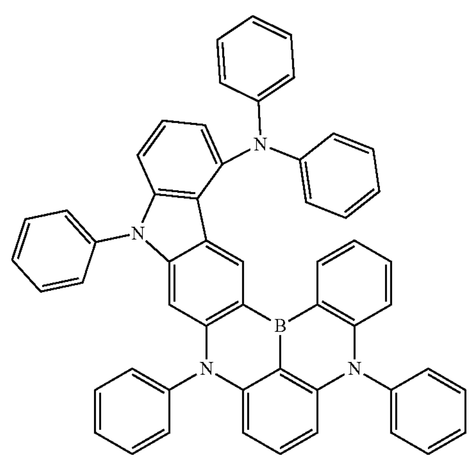

-continued
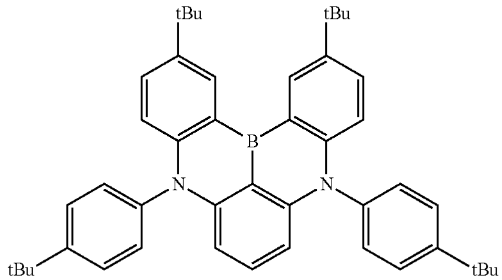
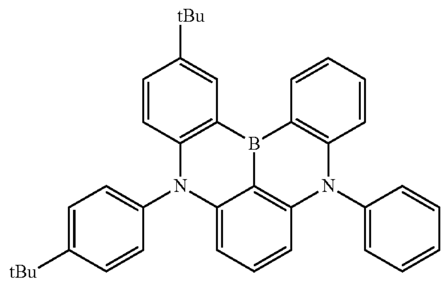
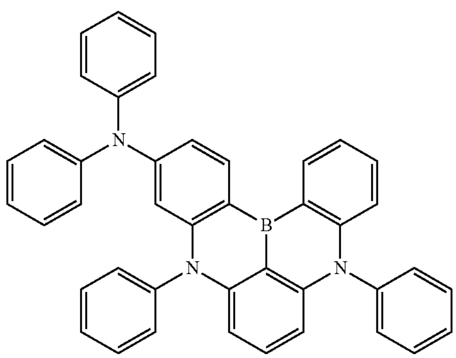
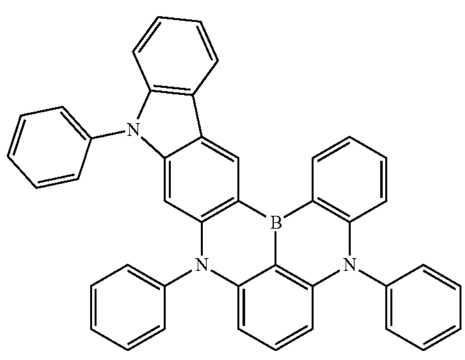
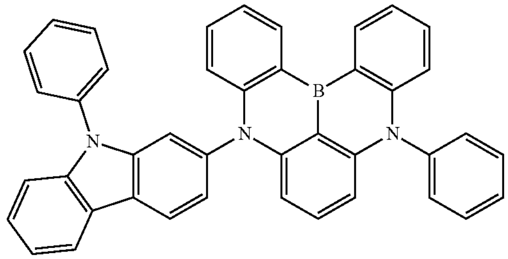
-continued
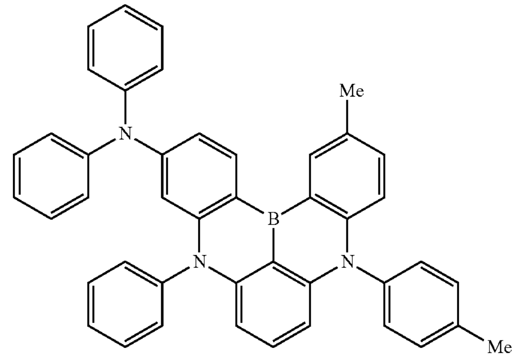
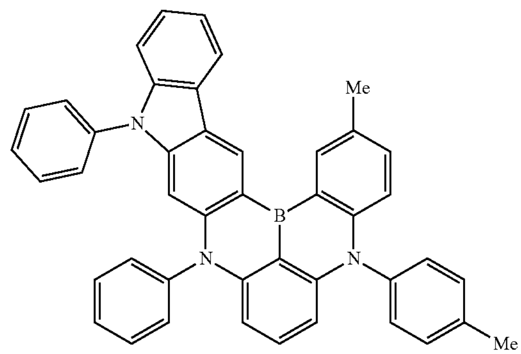
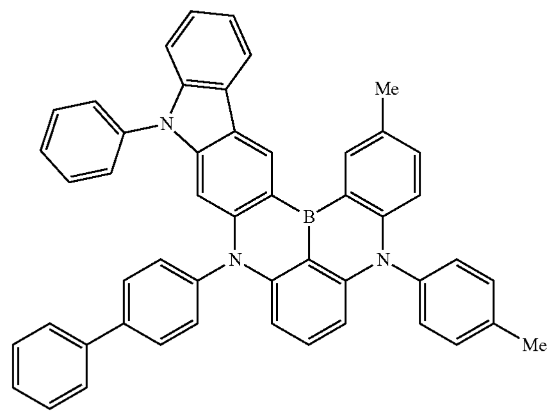
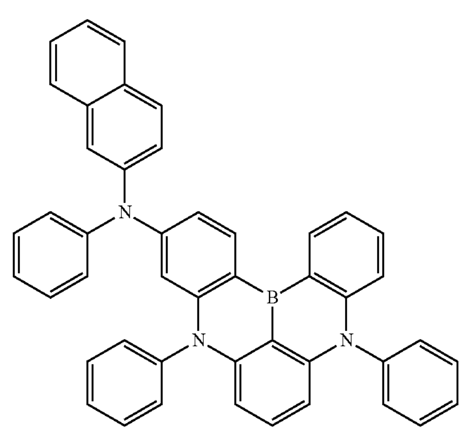

-continued
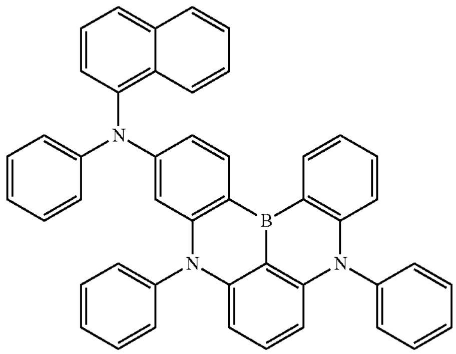
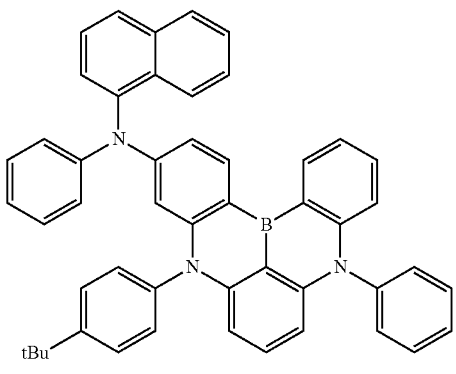
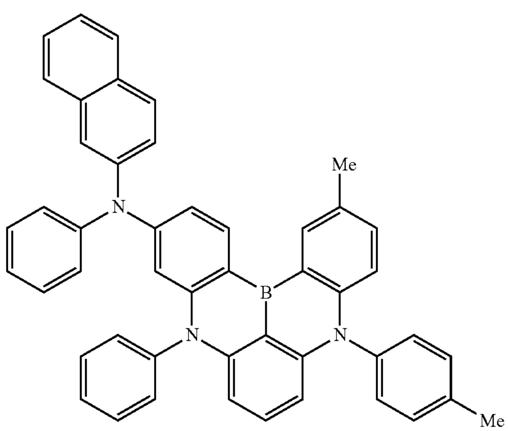
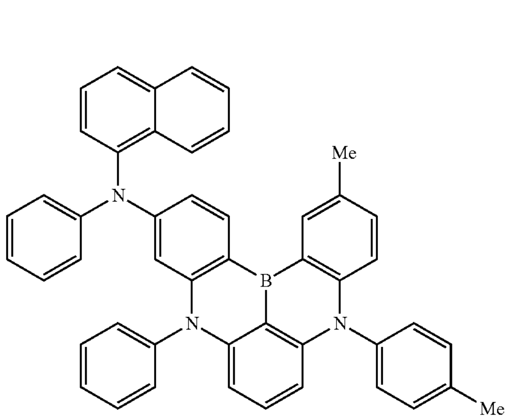
-continued
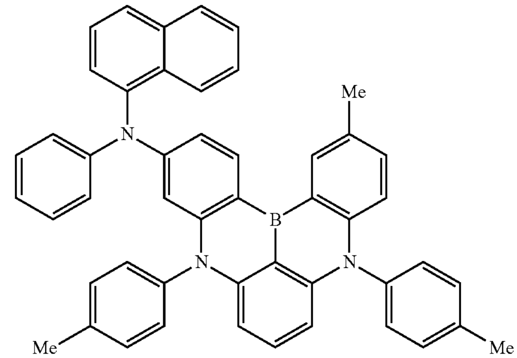
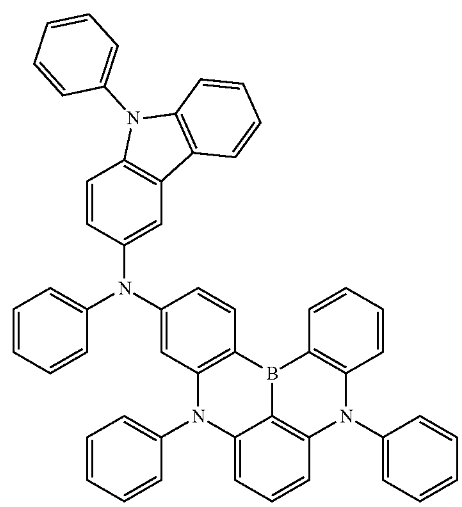
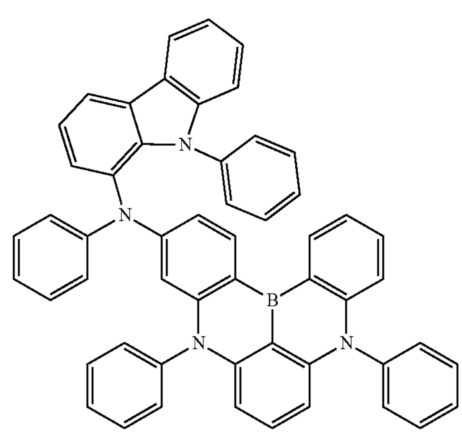

-continued
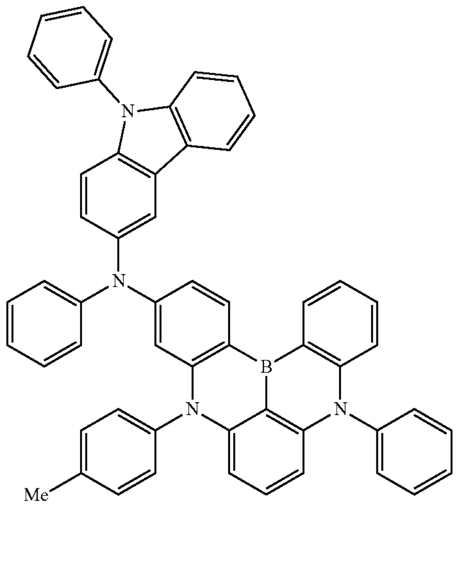
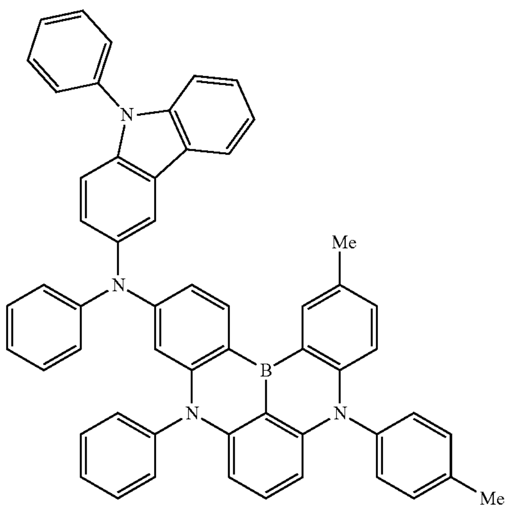
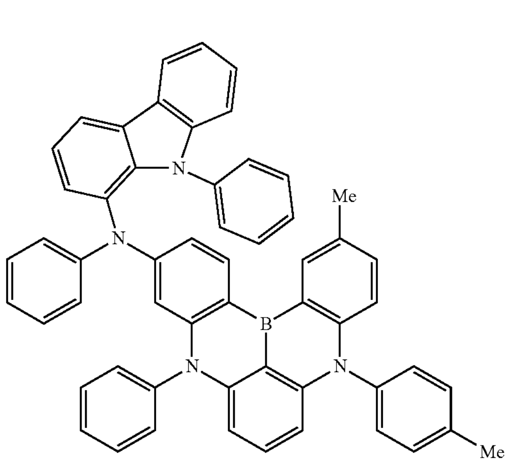
-continued
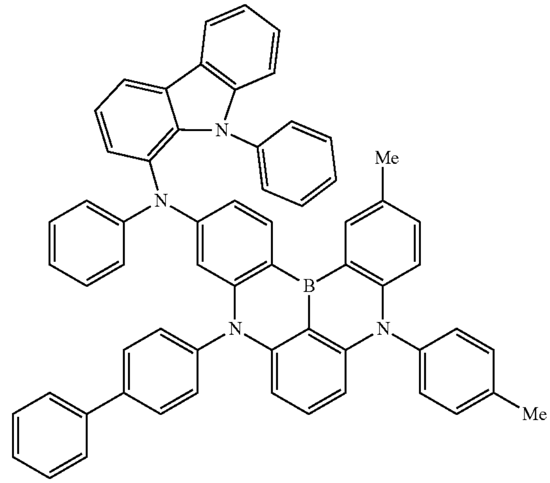
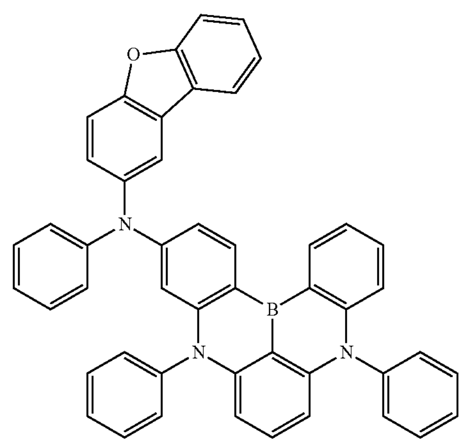
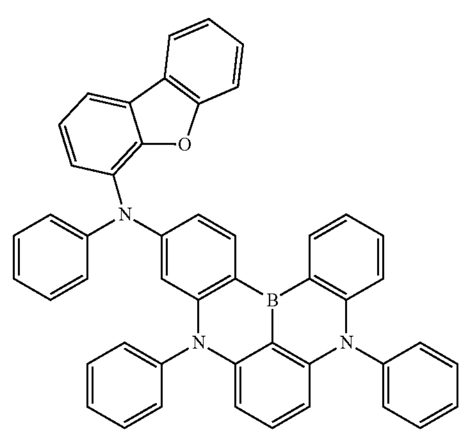

-continued
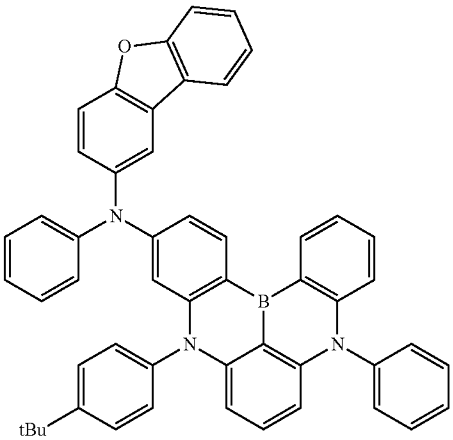
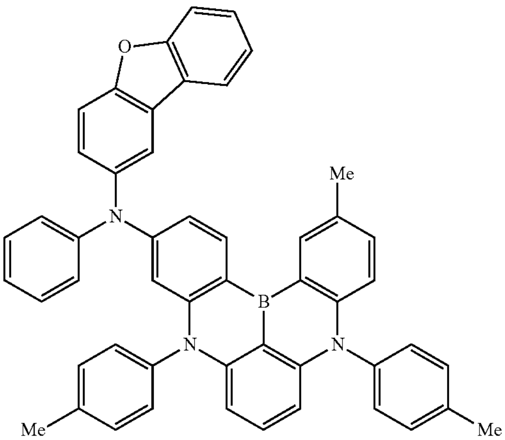
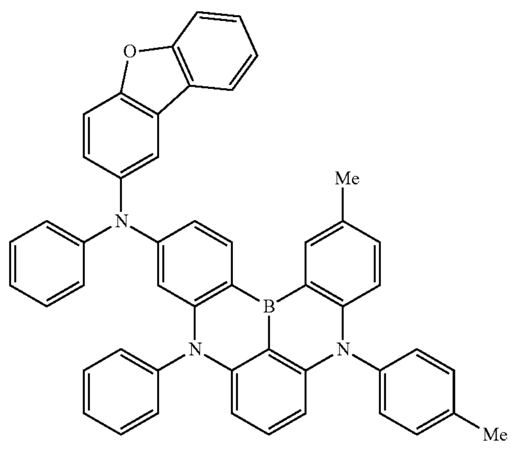
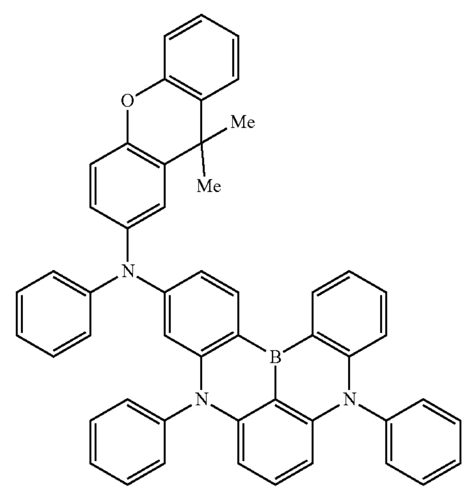
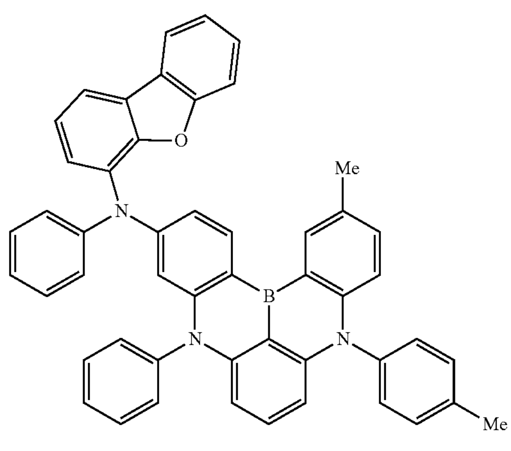
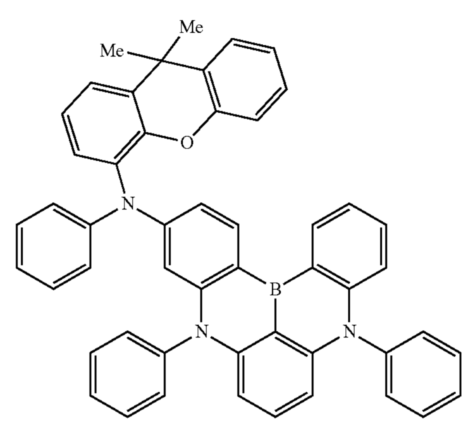
-continued -continued
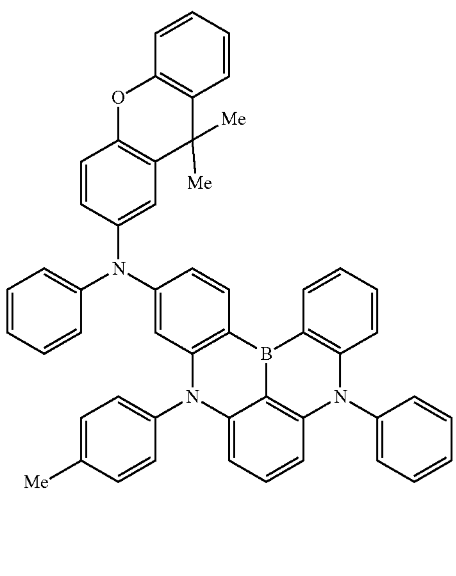
-continued
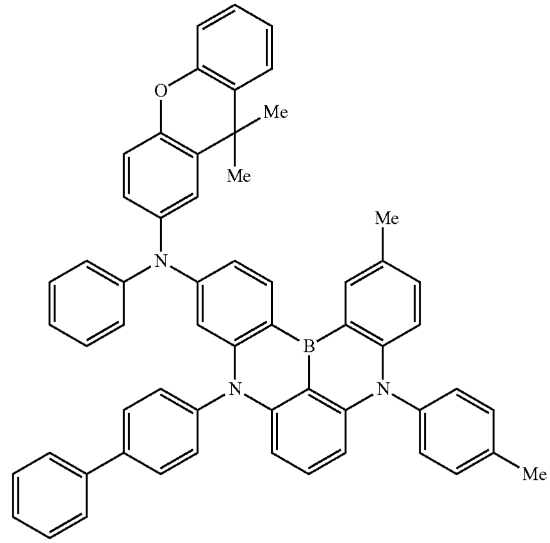
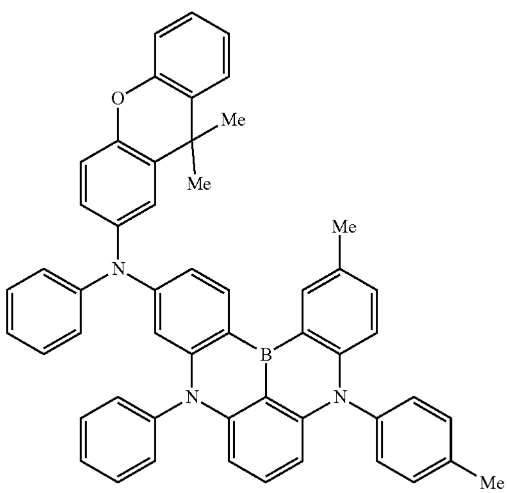
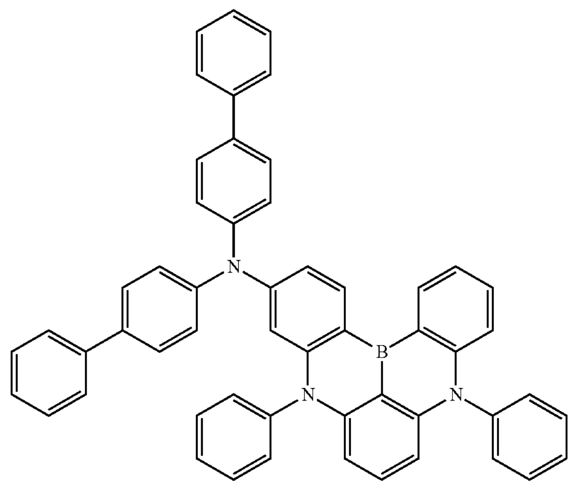
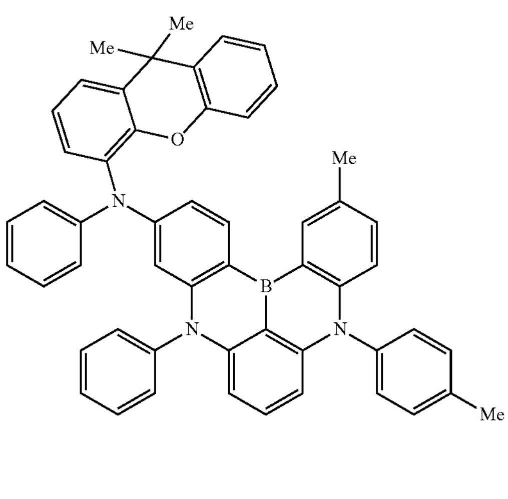
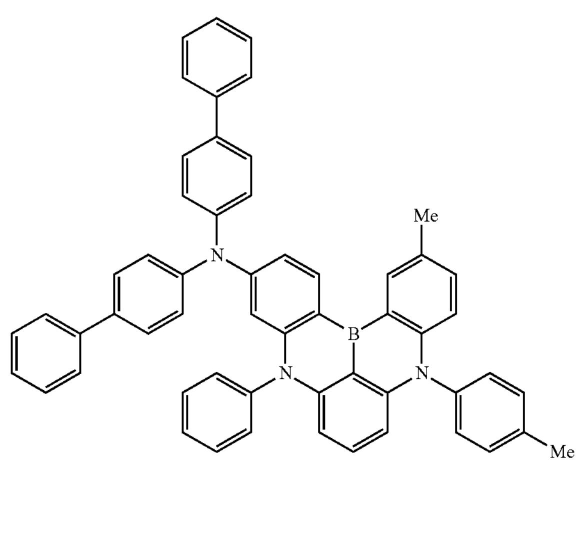

-continued
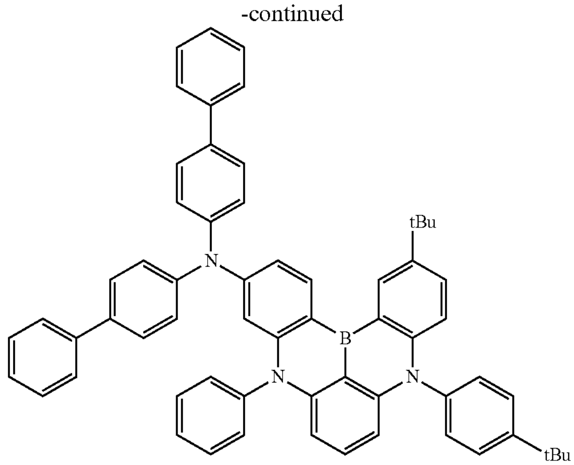
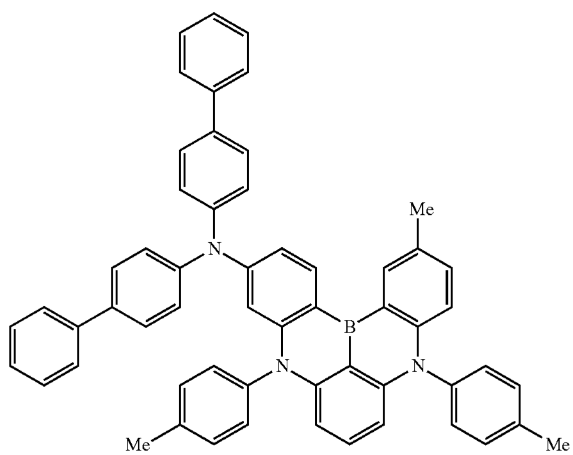
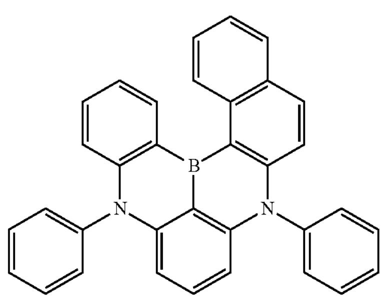
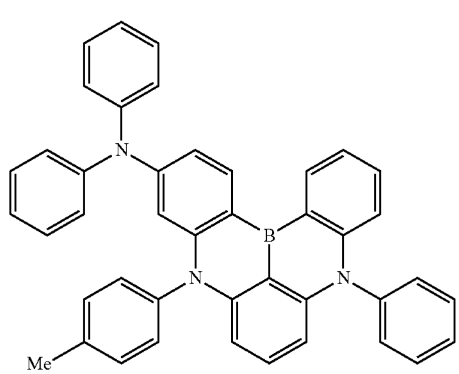
-continued
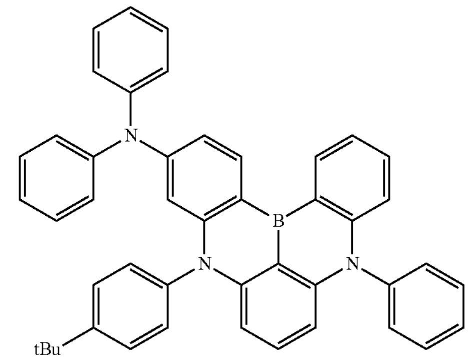
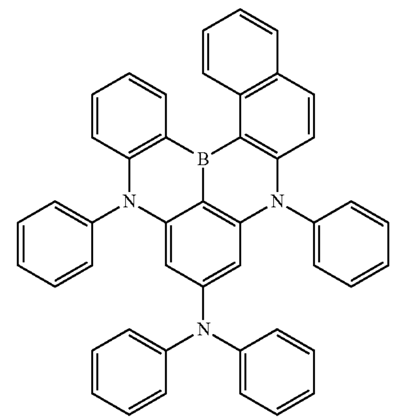
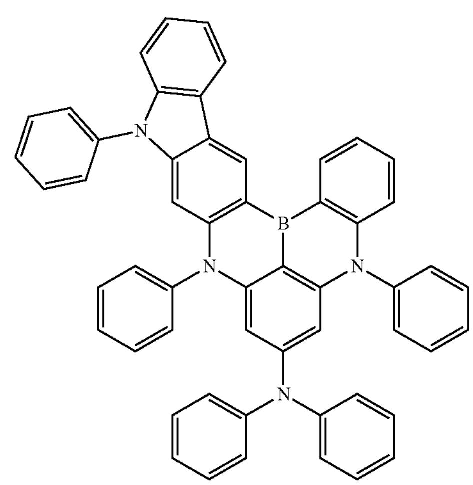
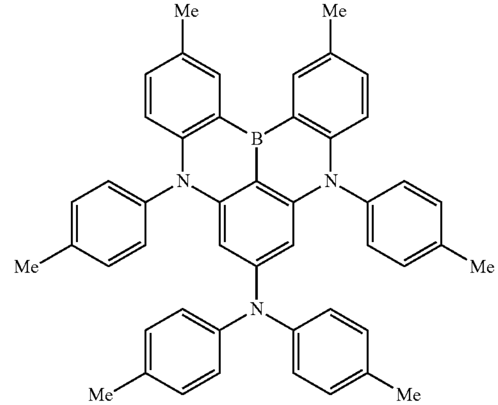

-continued
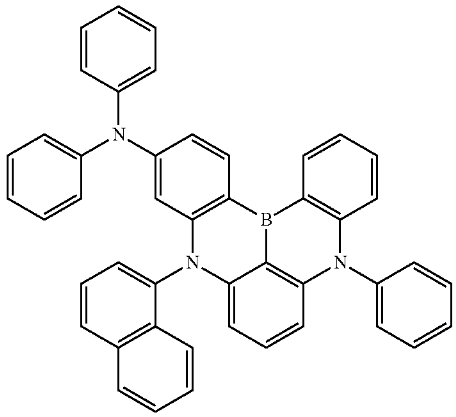
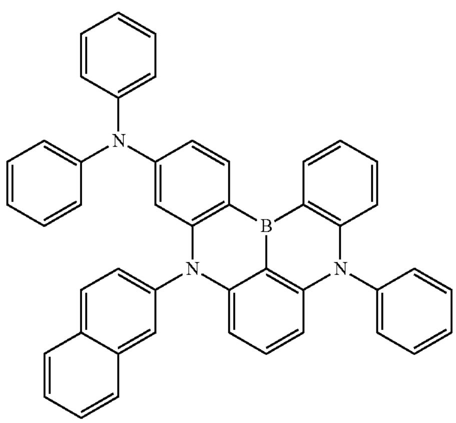
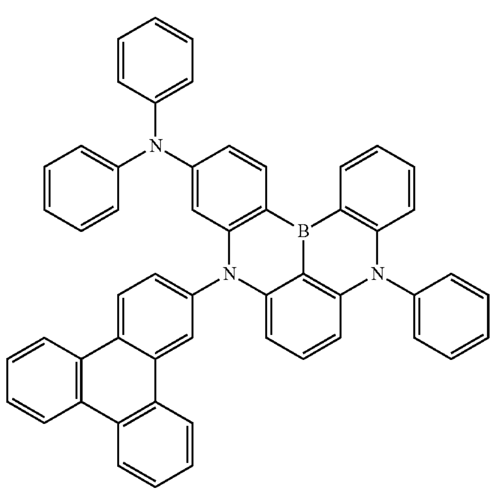
-continued
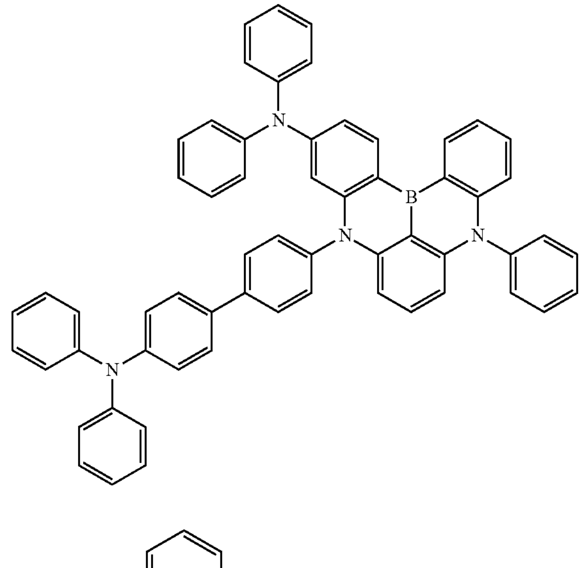
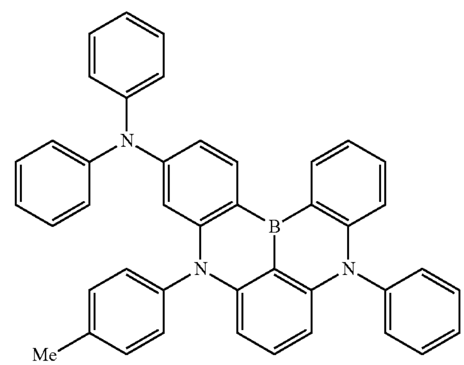
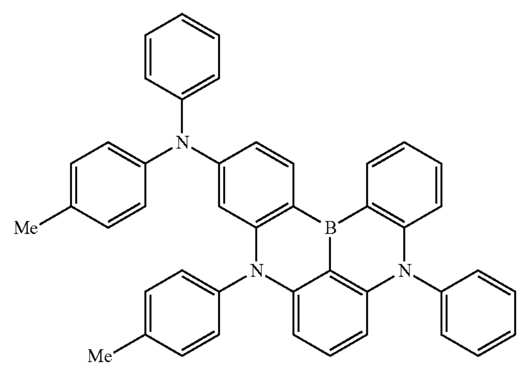
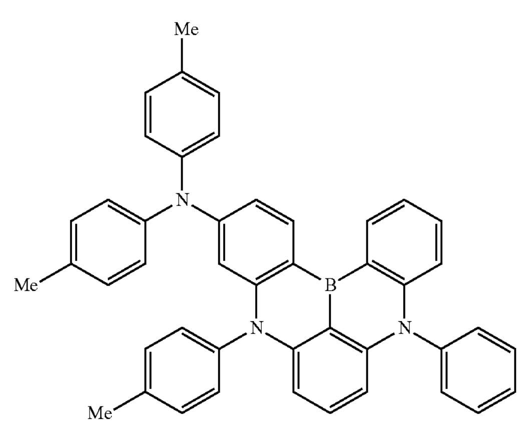

-continued
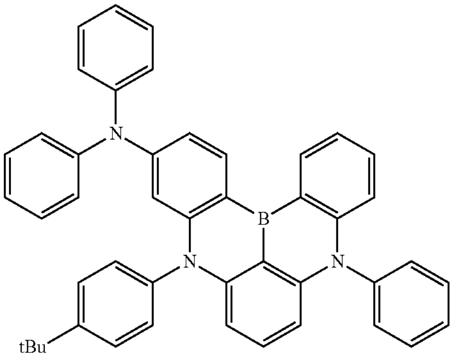
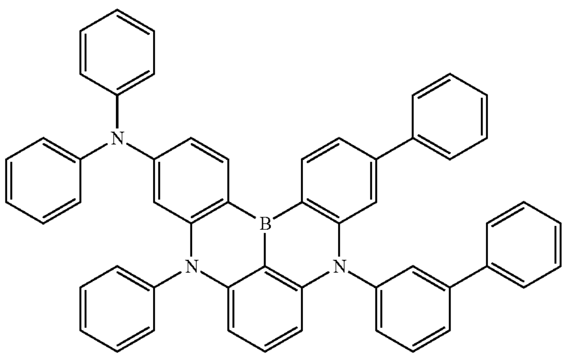
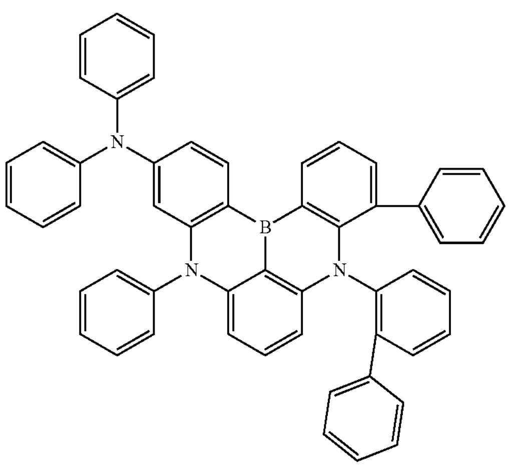
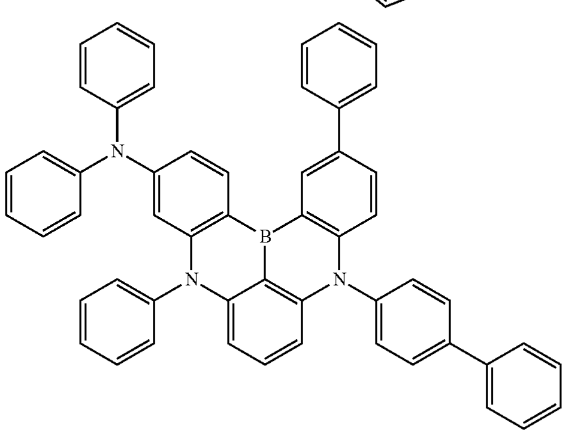
-continued
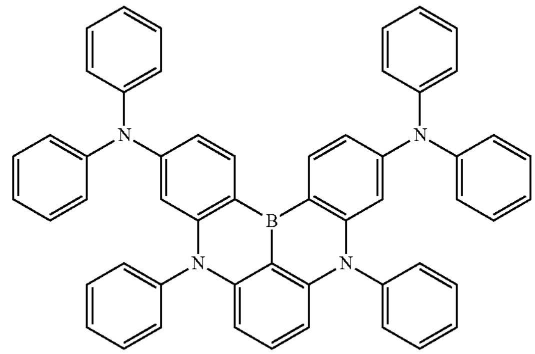
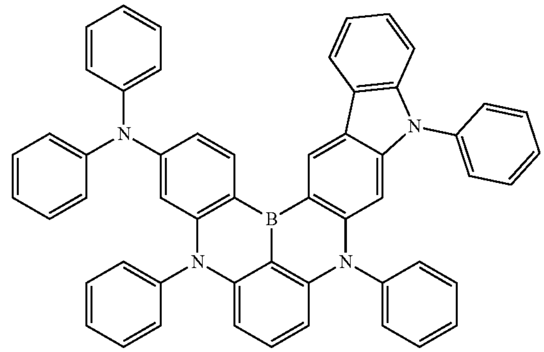
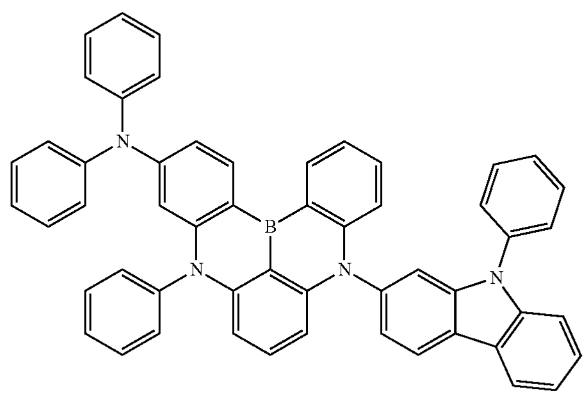
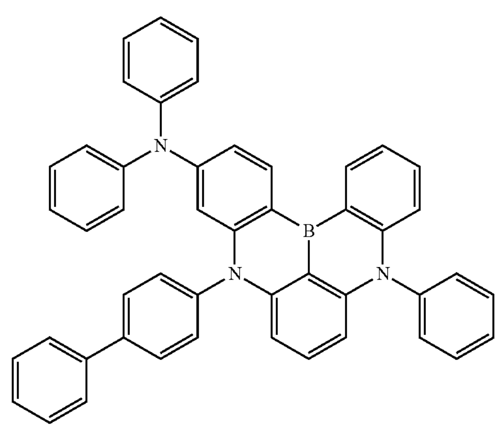

-continued
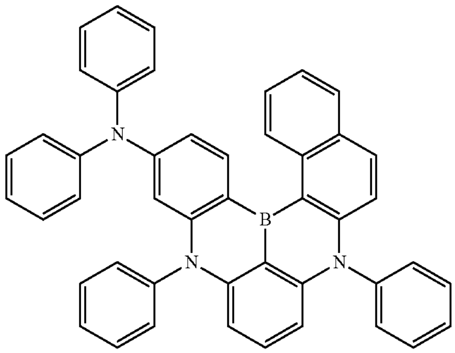
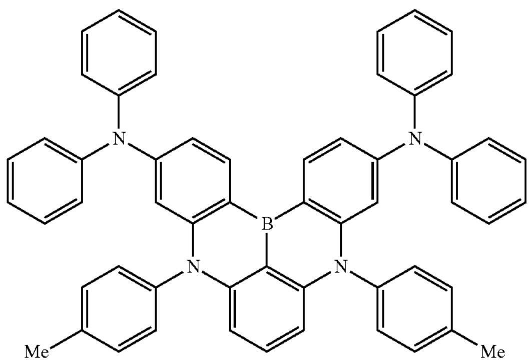
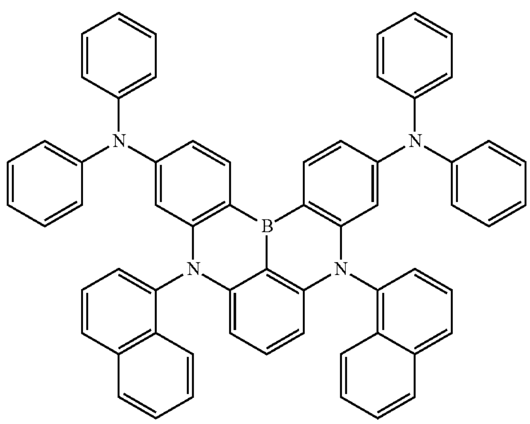
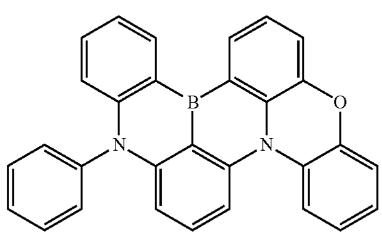
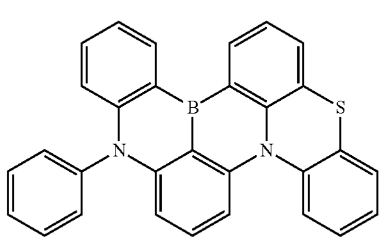
-continued
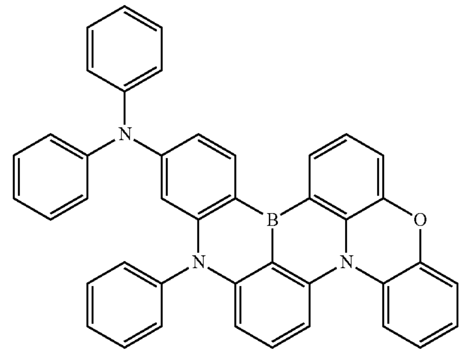
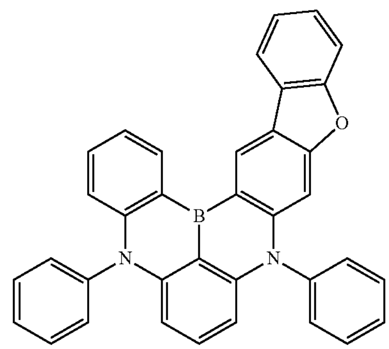
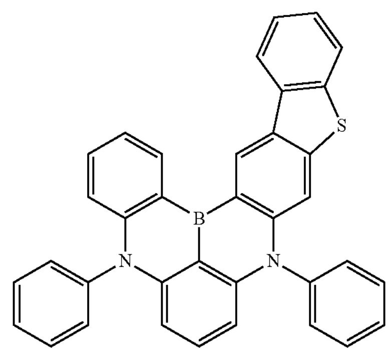
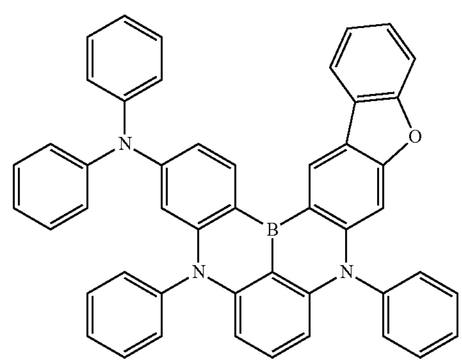
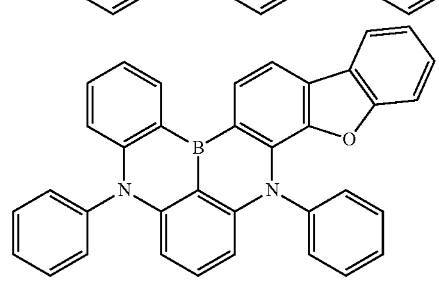

-continued

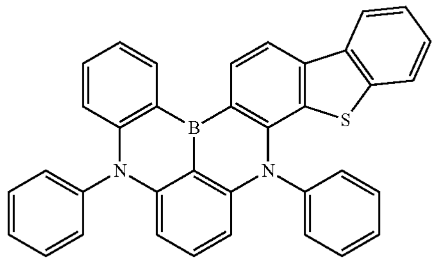

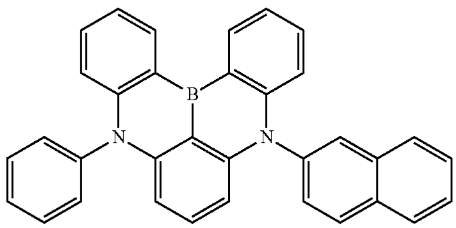

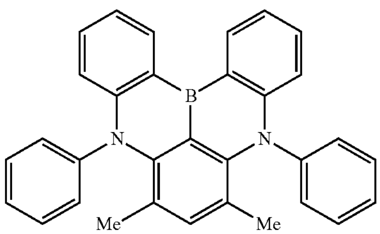

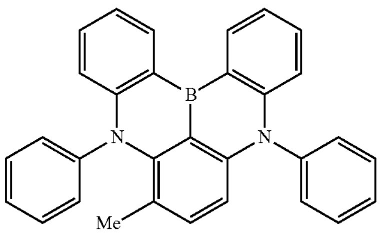

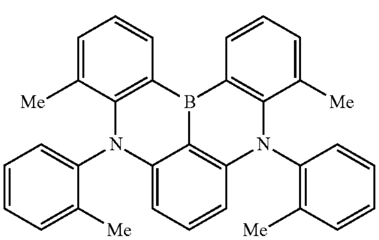

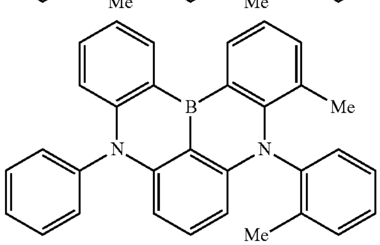

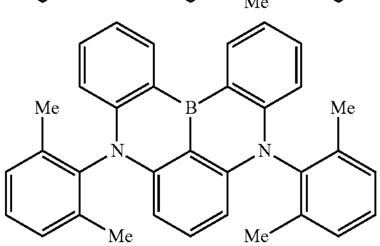

-continued

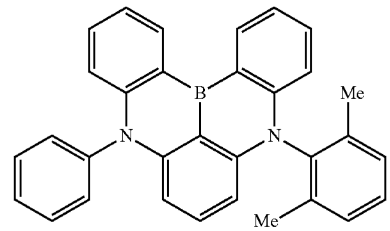

(Compound Represented by the Formula (51))

A compound represented by formula (51) will be described.

(51)

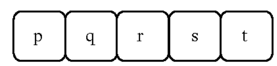

(52)

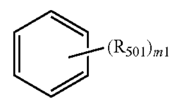

(53)

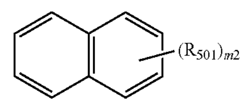

(54)

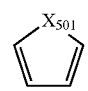

(55)

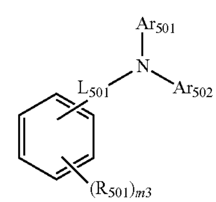

(56)

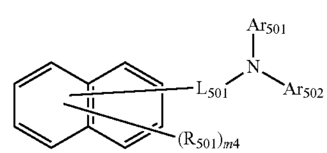

In the formula (51), a ring r is a ring represented by the formula (52) or formula (53) which is fused with an adjacent ring at an arbitrary position.

A ring q and a ring s are independently a ring represented by the formula (54) which is fused with an adjacent ring at an arbitrary position.

A ring p and a ring t are independently a structure represented by the formula (55) or the formula (56) which is fused with an adjacent ring at an arbitrary position.

When a plurality of $R_{501}$'s are present, the plurality of adjacent $R_{501}$'s form a substituted or unsubstituted, saturated or unsaturated ring by bonding with each other, or do not form a substituted or unsubstituted saturated or unsaturated ring.

$X_{501}$ is an oxygen atom, a sulfur atom, or $NR_{502}$.

$R_{501}$ and $R_{502}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{9013}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

$Ar_{501}$ and $Ar_{502}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

$L_{501}$ is a substituted or unsubstituted alkylene group including 1 to 50 carbon atoms, a substituted or unsubstituted alkenylene group including 2 to 50 carbon atoms, a substituted or unsubstituted alkynylene group including 2 to 50 carbon atoms, a substituted or unsubstituted cycloalkylene group including 3 to 50 ring carbon atoms, a substituted or unsubstituted arylene group including 6 to 50 ring carbon atoms, or a substituted or unsubstituted divalent heterocyclic group including 5 to 50 ring atoms.

m1's are independently an integer of 0 to 2, m2's are independently an integer of 0 to 4, m3's are independently an integer of 0 to 3, and m4's are independently an integer of 0 to 5. When a plurality of $R_{501}$'s are present, the plurality of $R_{501}$'s may be the same as or different from each other.

In the formula (51), each ring of the ring p to the ring t is fused with the adjacent ring by sharing two carbon atoms. The fused position and fused direction are not limited, and the fusion can be performed in arbitrary position and direction.

In one embodiment, in the formula (52) or formula (53) of the ring r, $R_{501}$ is a hydrogen atom.

In one embodiment, the compound represented by the formula (51) is represented by any of the following formulas (51-1) to (51-6).

(51-1)

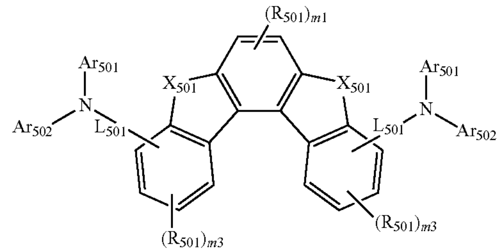

(51-2)

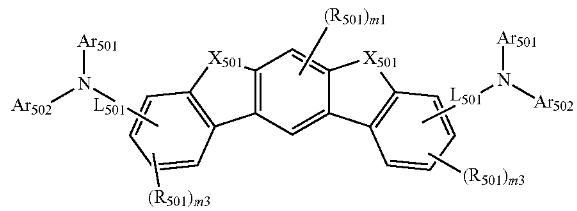

(51-3)

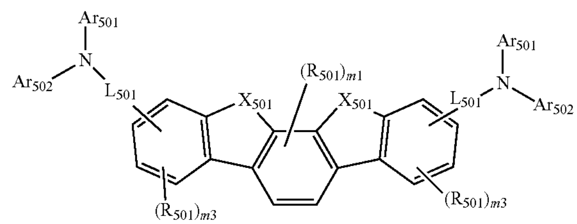

(51-4)

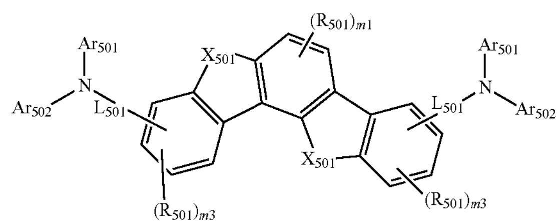

(51-5)

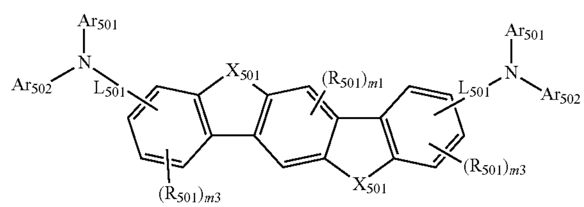

(51-6)

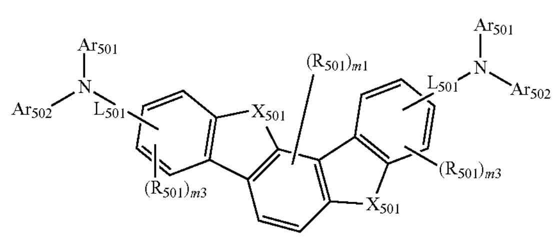

In the formulas (51-1) to (51-6), $R_{501}$, $X_{501}$, $Ar_{501}$, $Ar_{502}$, $L_{501}$, m1, and m3 are as defined in the formula (51).

In one embodiment, the compound represented by the formula (51) is a compound represented by any of the following formulas (51-11) to (51-13).

(51-11)
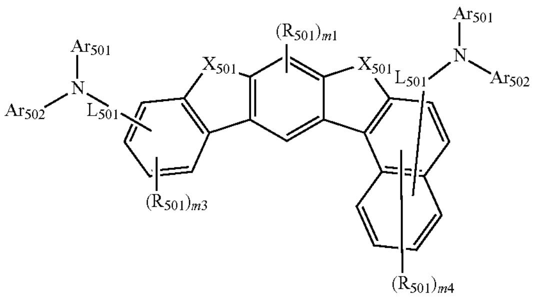
(51-12)
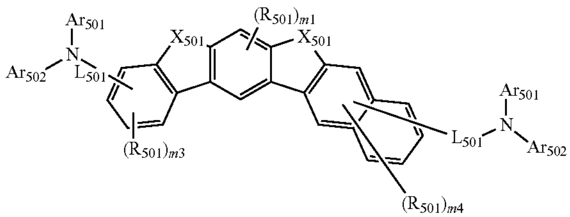
-continued
(51-13)
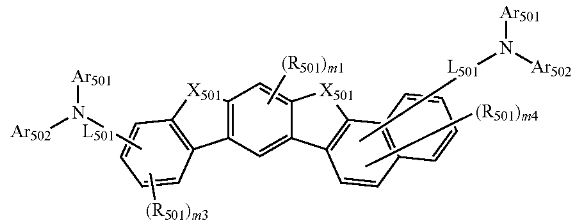
In the formulas (51-11) to (51-13), $R_{501}$, $X_{501}$, $Ar_{501}$, $Ar_{502}$, $L_{501}$, m1, m3, and m4 are as defined in the formula (51).
In one embodiment, the compound represented by the formula (51) is a compound represented by any of the following formulas (51-21) to (51-25).
(51-21)
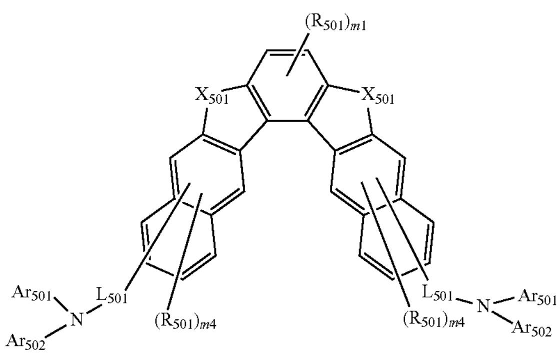
(51-22)
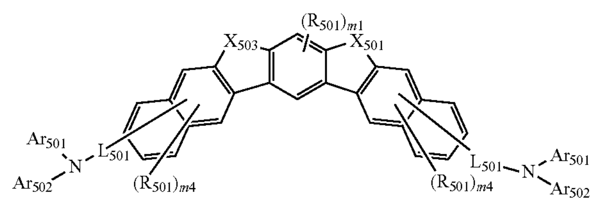
(51-23)
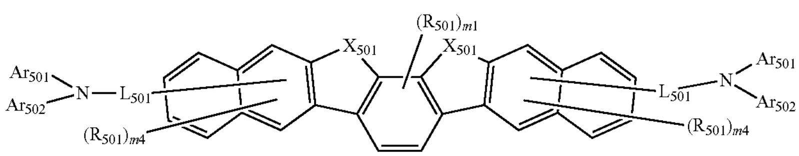
(51-24)
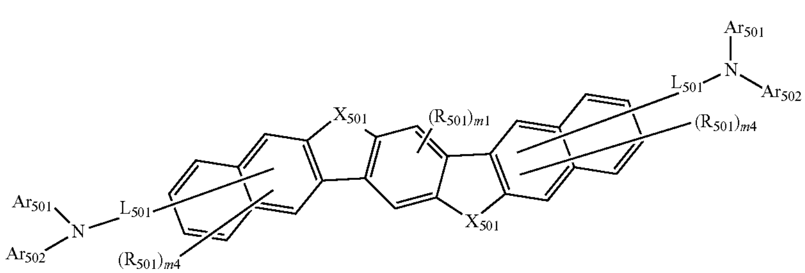

-continued (51-25)

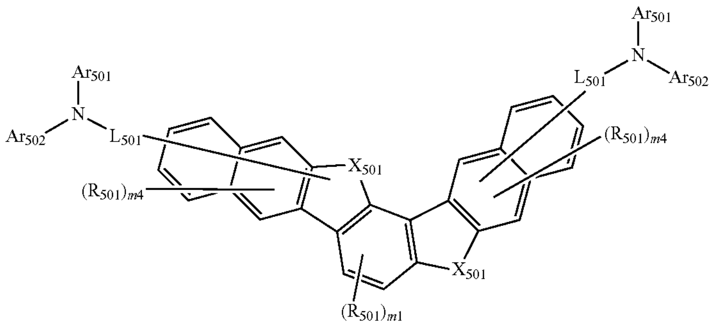

In the formulas (51-21) to (51-25), $R_{501}$, $X_{501}$, $Ar_{501}$, $Ar_{502}$, $L_{501}$, m1, and m4 are as defined in the formula (51).

In one embodiment, the compound represented by the formula (51) is a compound represented by any of the following formulas (51-31) to (51-33).

(51-31)

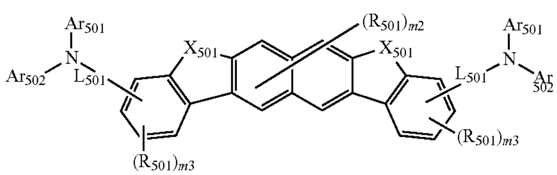

(51-32)

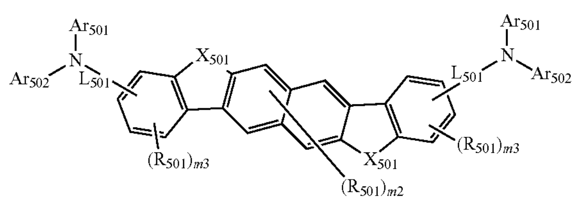

(51-33)

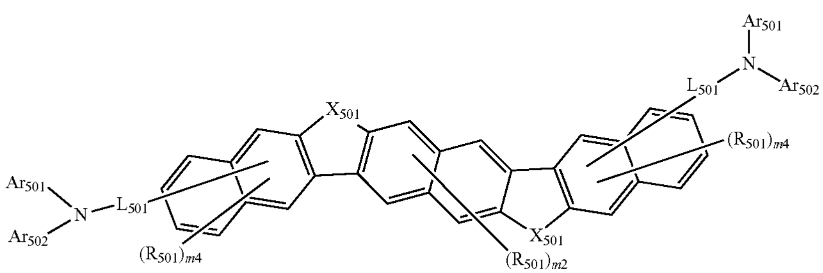

In the formulas (51-31) to (51-33), $R_{501}$, $X_{501}$, $Ar_{501}$, $Ar_{502}$, $L_{501}$, and m2 to m4 are as defined in the formula (51).

In one embodiment, $Ar_{501}$ and $Ar_{502}$ are independently a substituted or unsubstituted aryl group including 6 to 50 ring carbon atoms.

In one embodiment, one of $Ar_{501}$ and $Ar_{502}$ is a substituted or unsubstituted aryl group including 6 to 50 ring carbon atoms and the other is a substituted or unsubstituted monovalent heterocyclic group including 5 to 50 ring atoms.

Specific examples of the compound represented by the formula (51) include the following compounds. In the following specific examples, "Me" represents a methyl group.

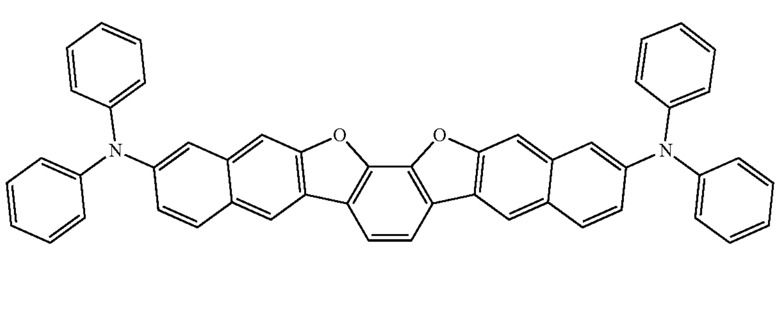

-continued
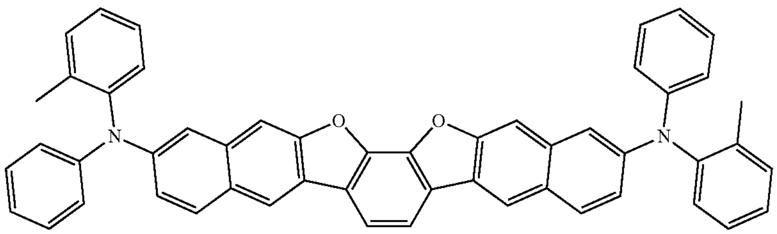
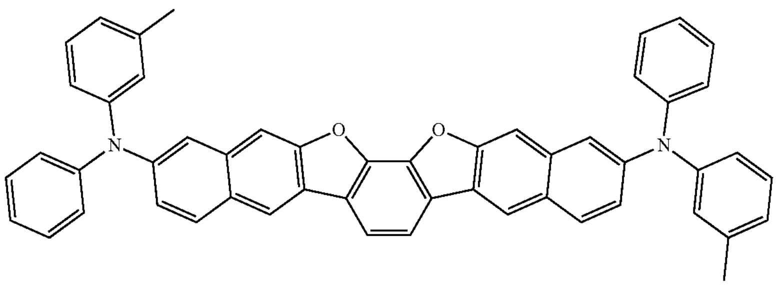
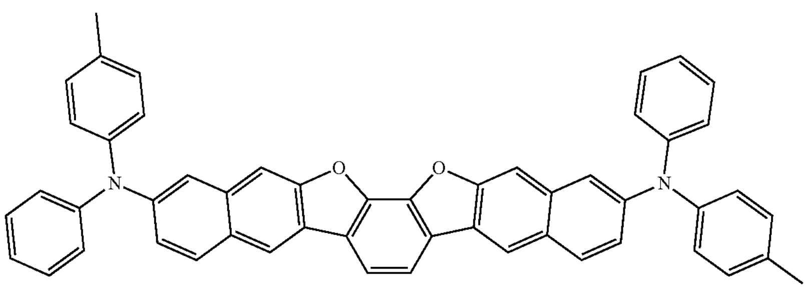
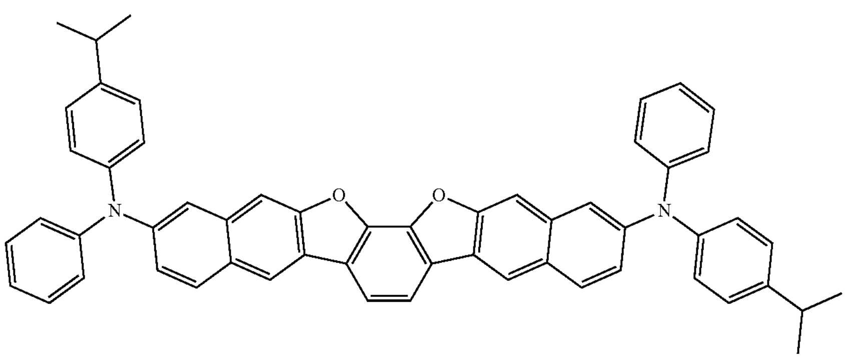
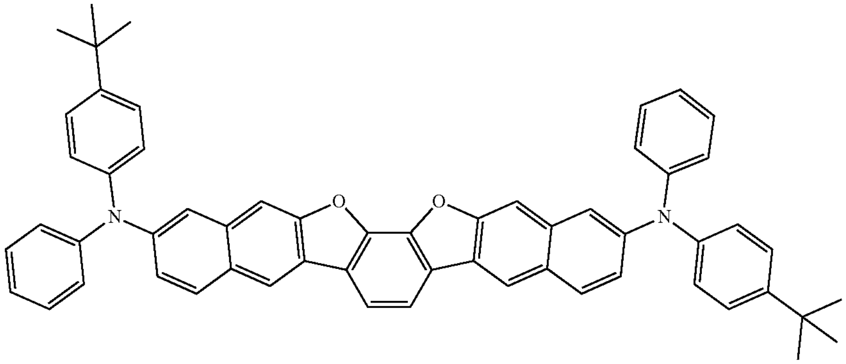

-continued
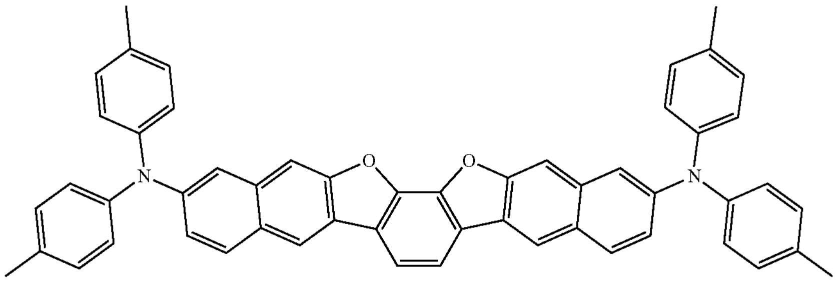
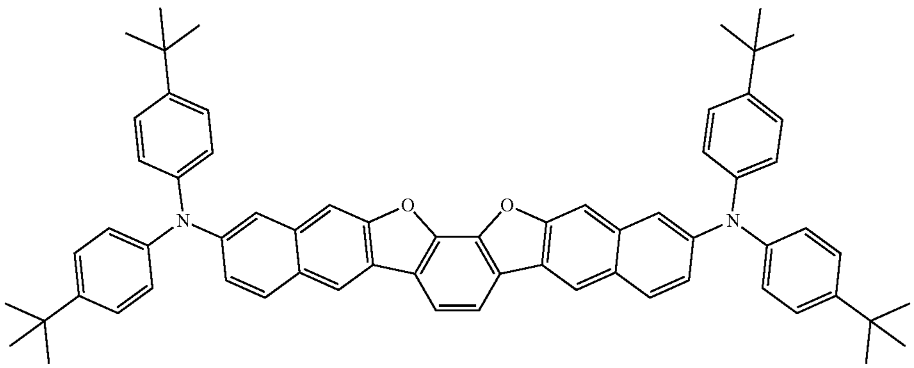
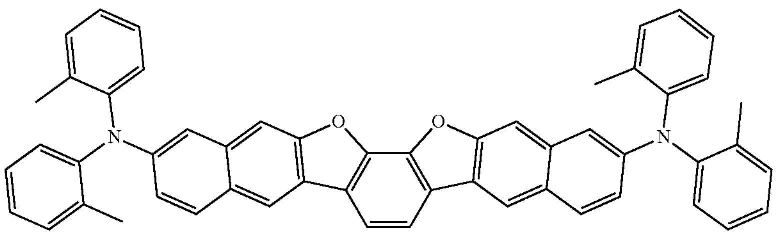
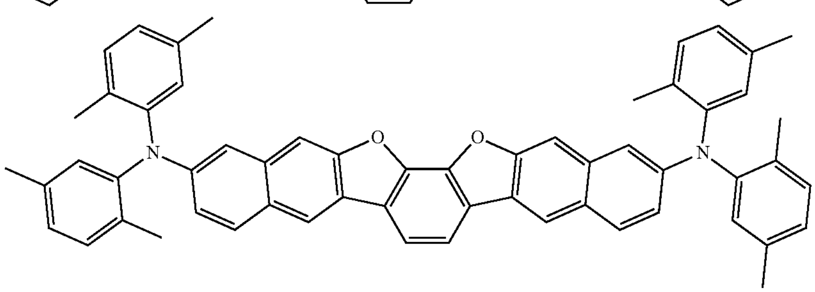
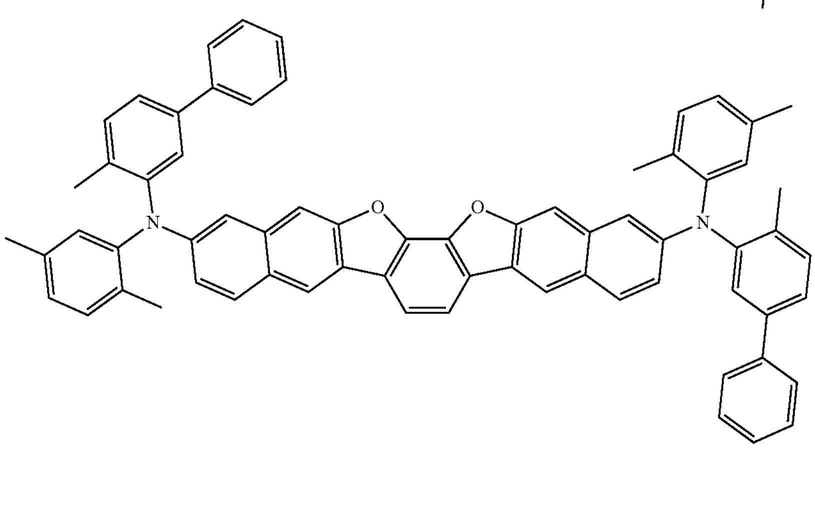

-continued
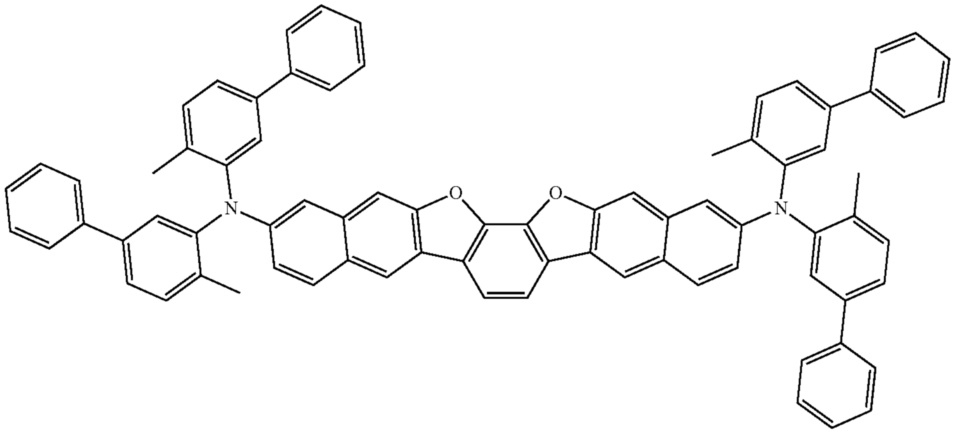
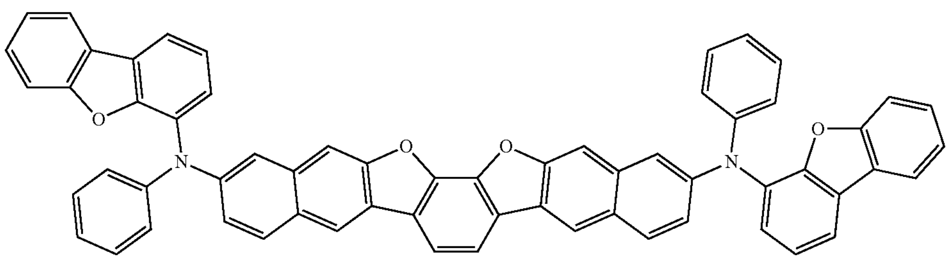
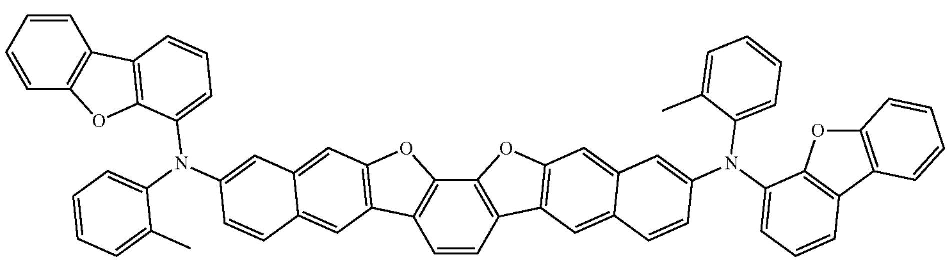
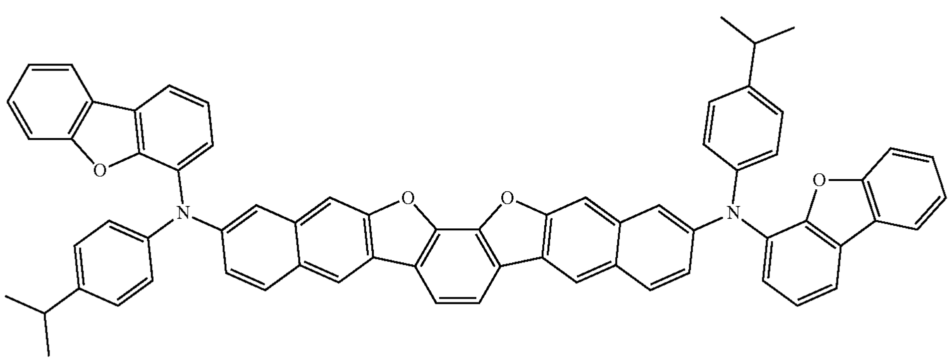
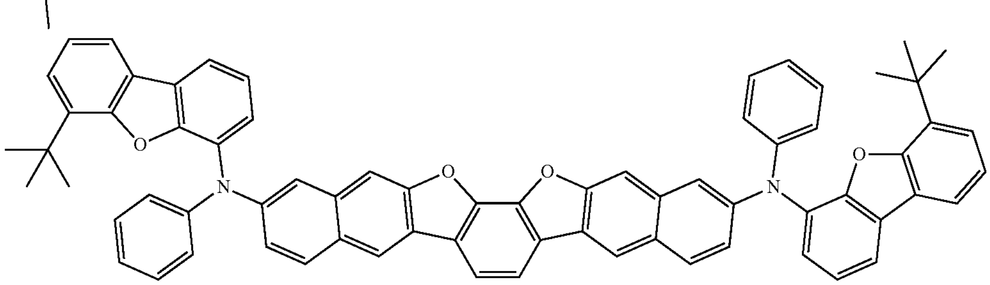

-continued
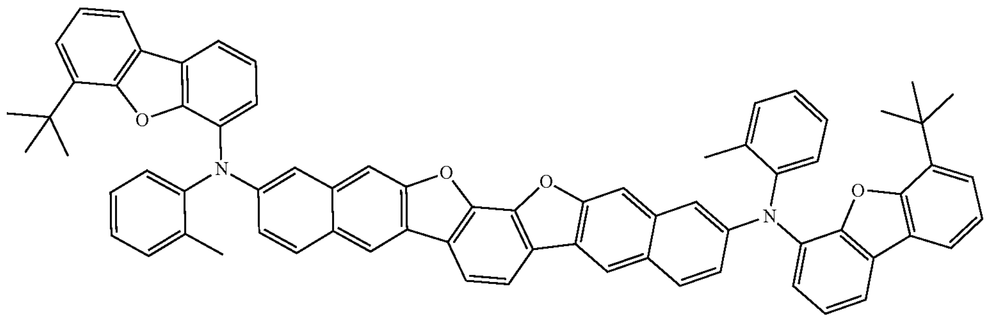
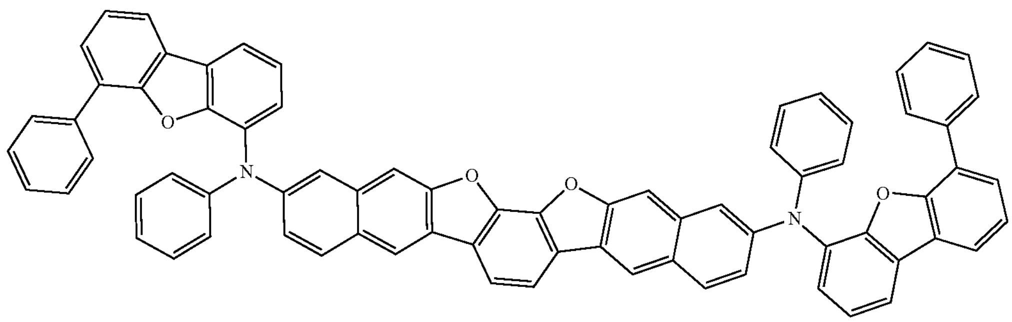
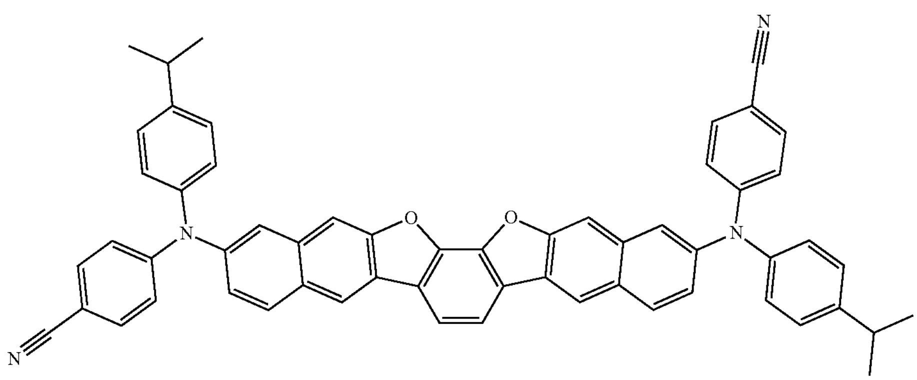
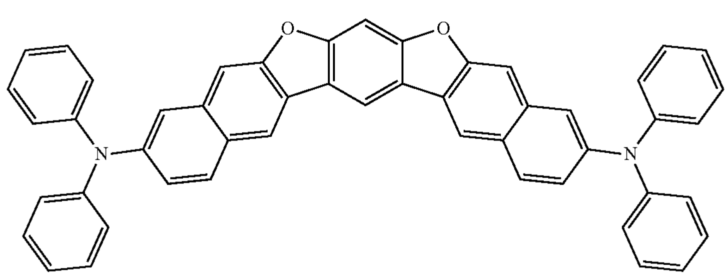
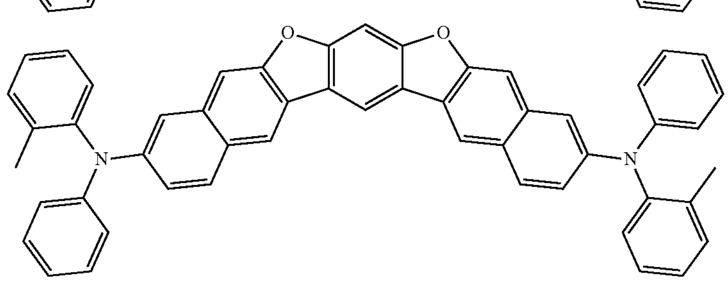

-continued
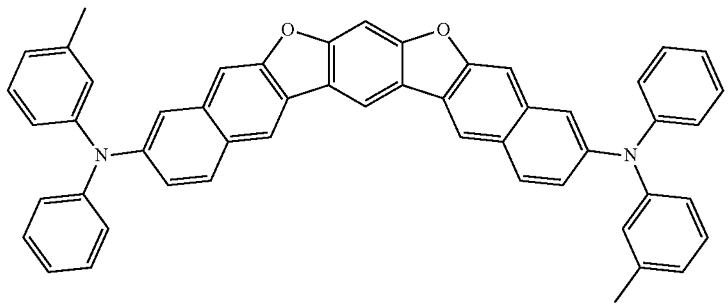
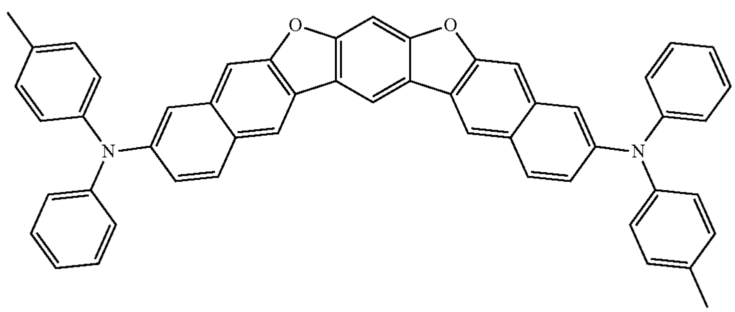
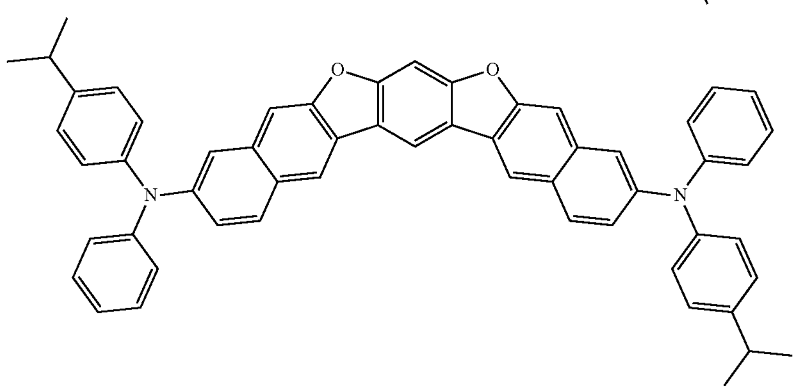
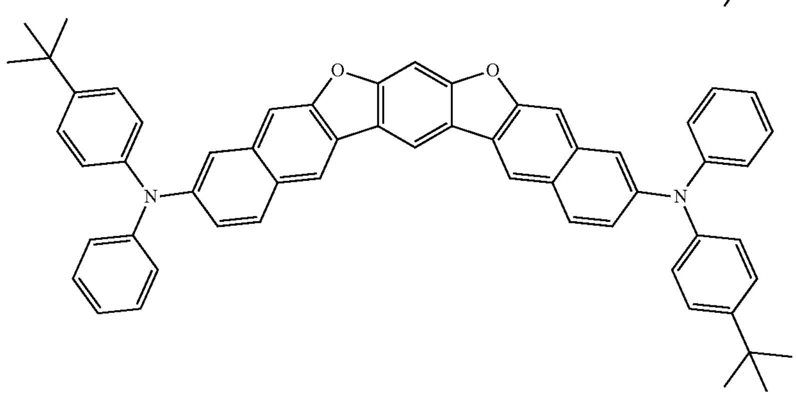
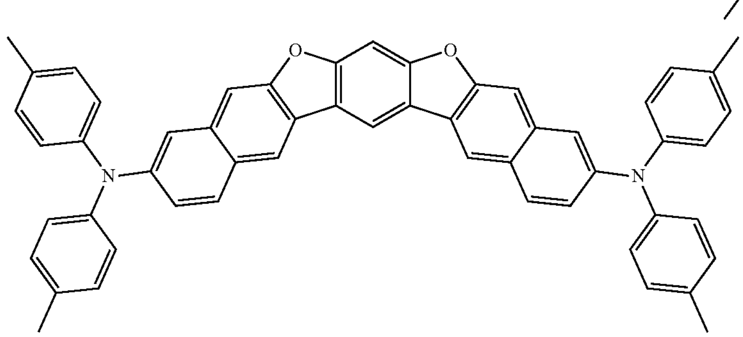

-continued
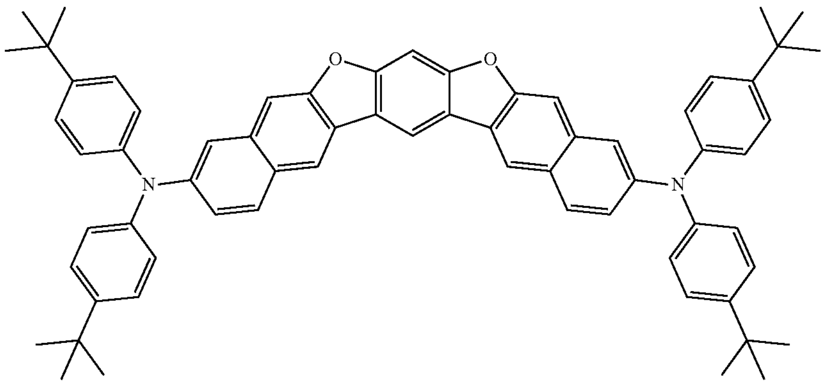
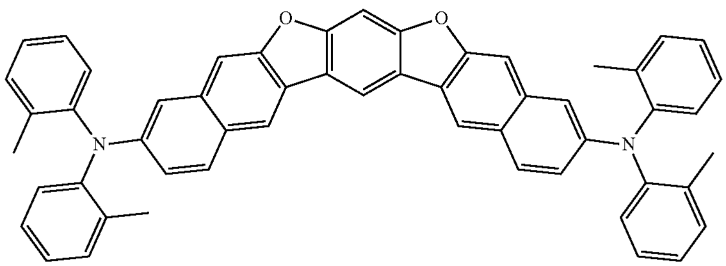
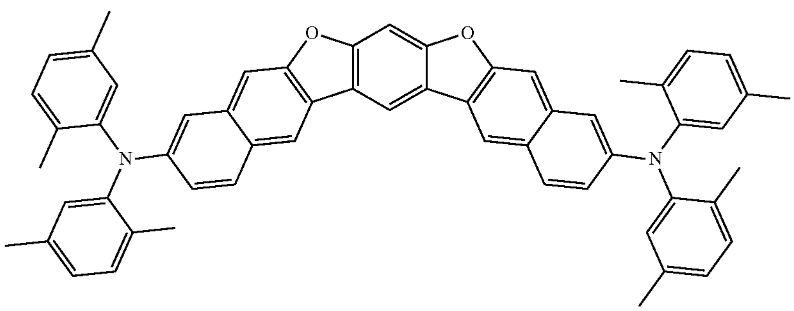
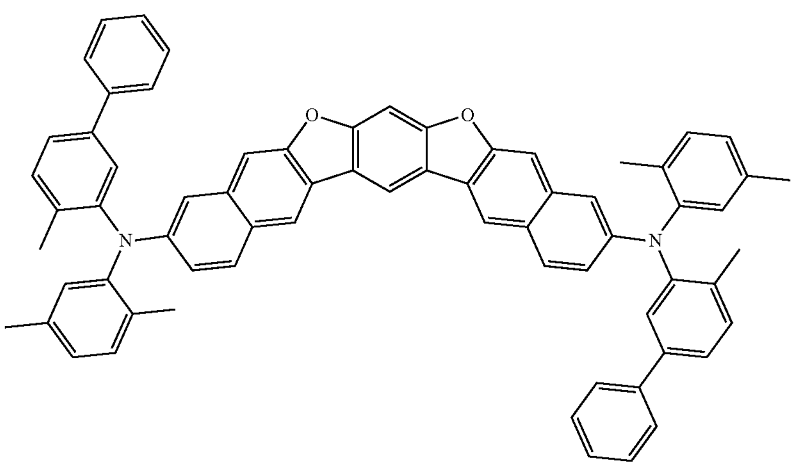

-continued
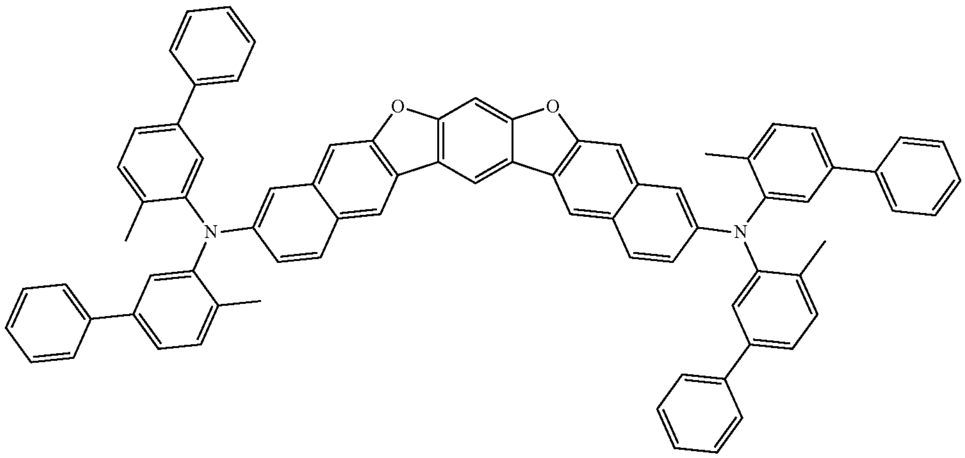
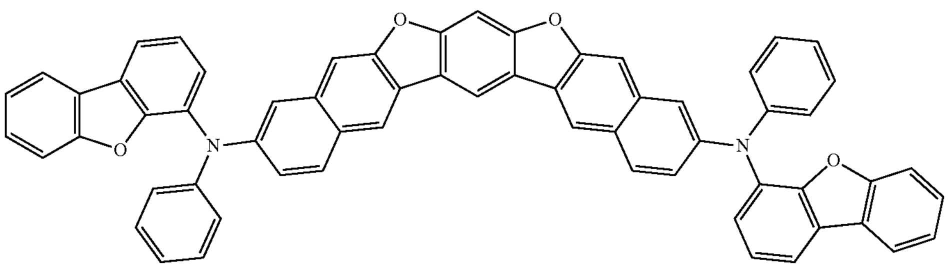
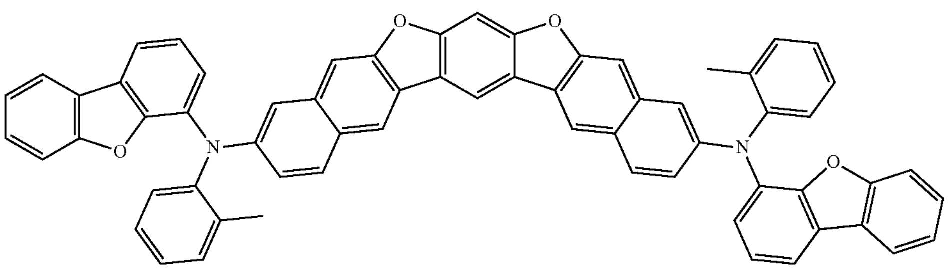
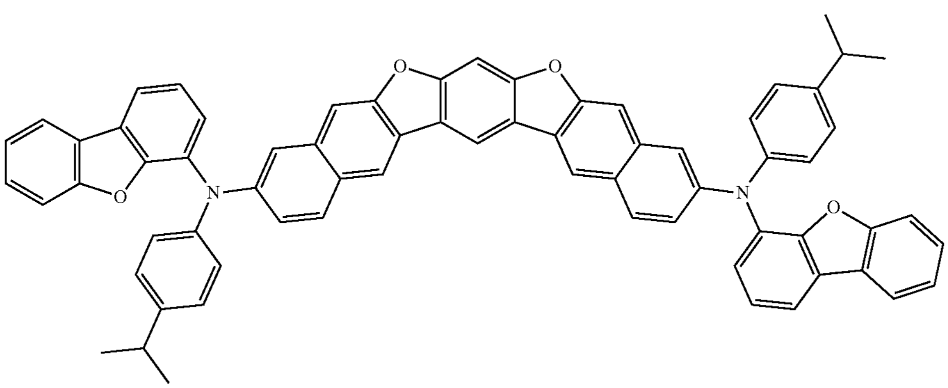
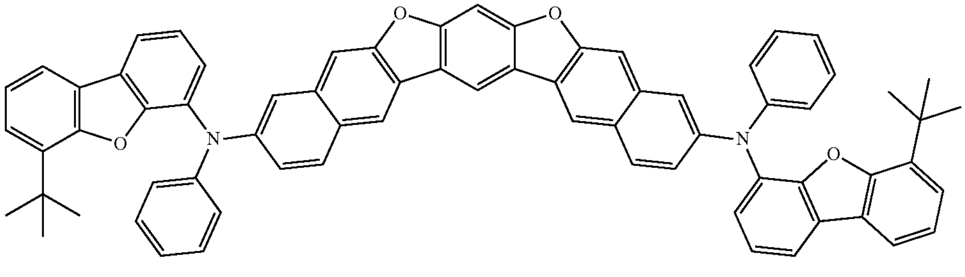

-continued
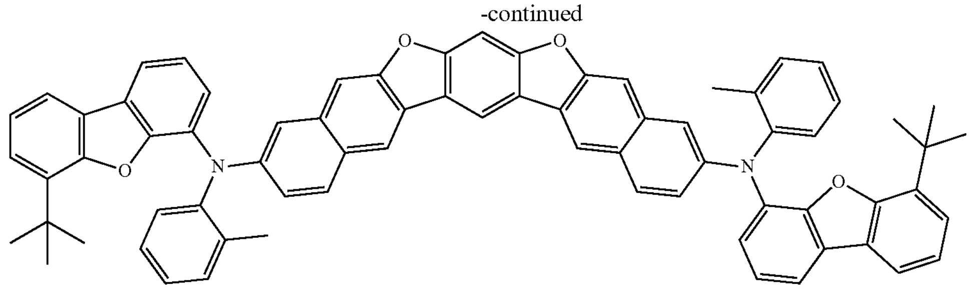
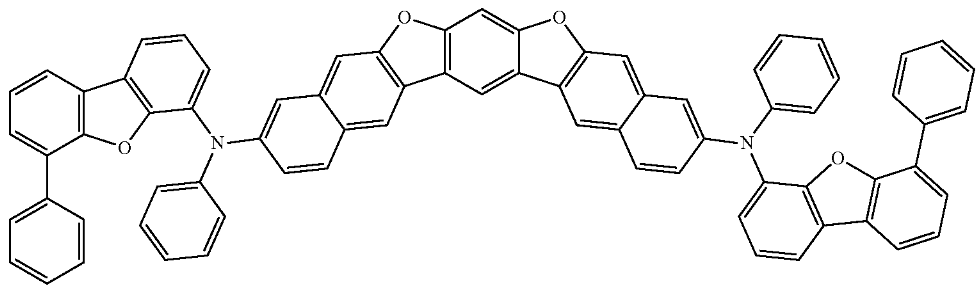
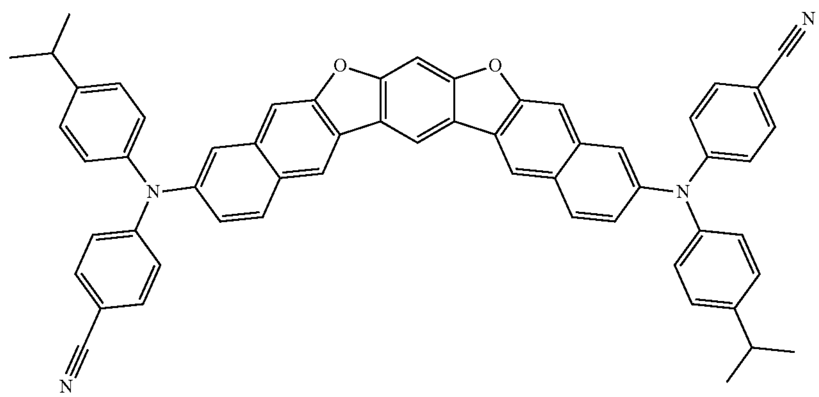
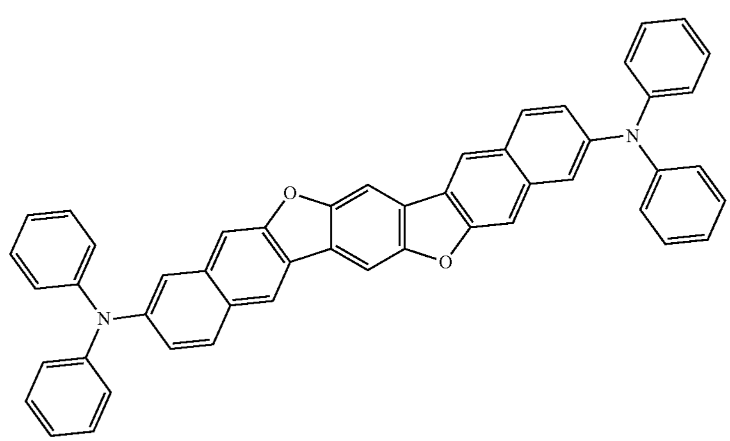

-continued
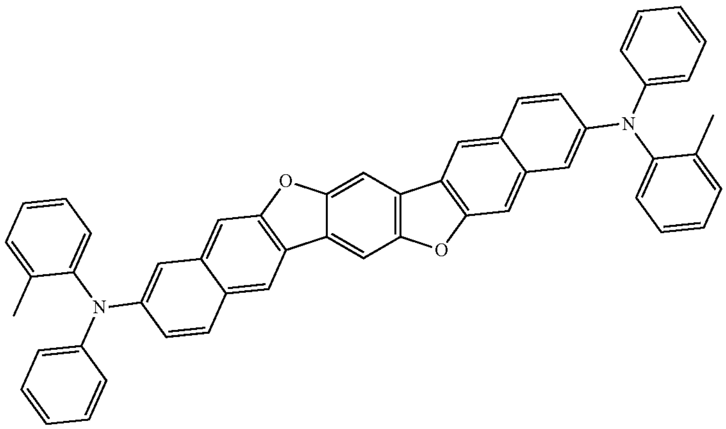
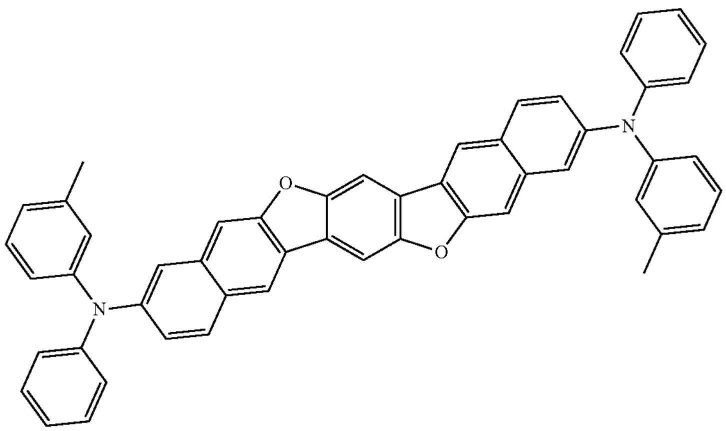
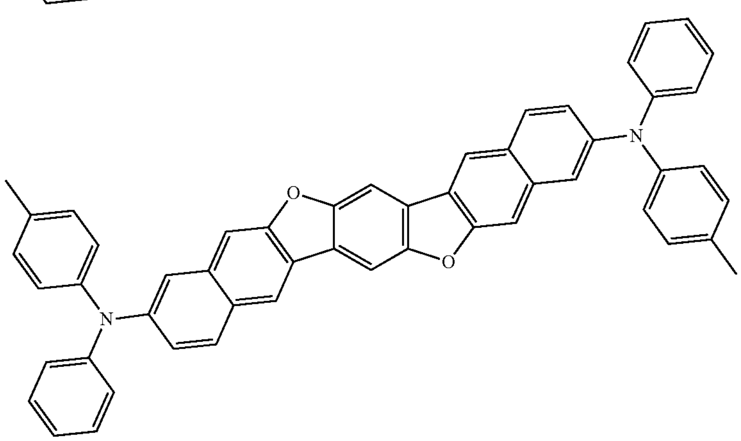
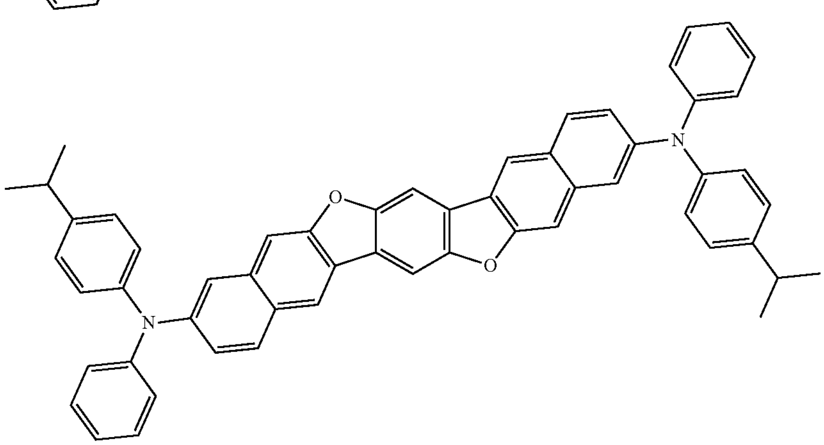

-continued
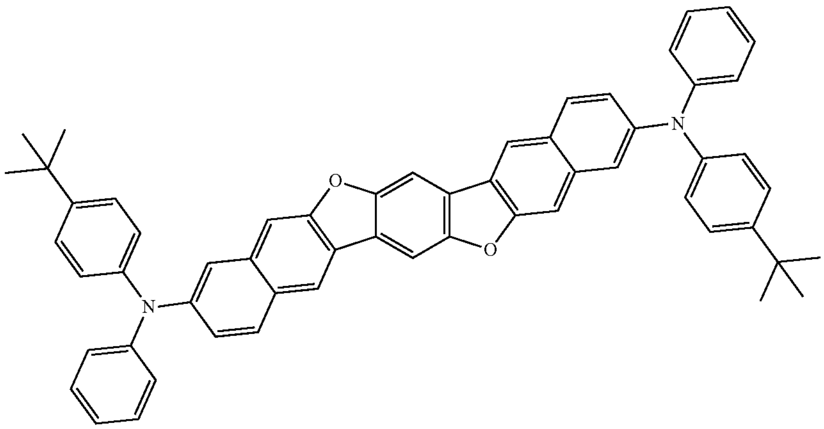
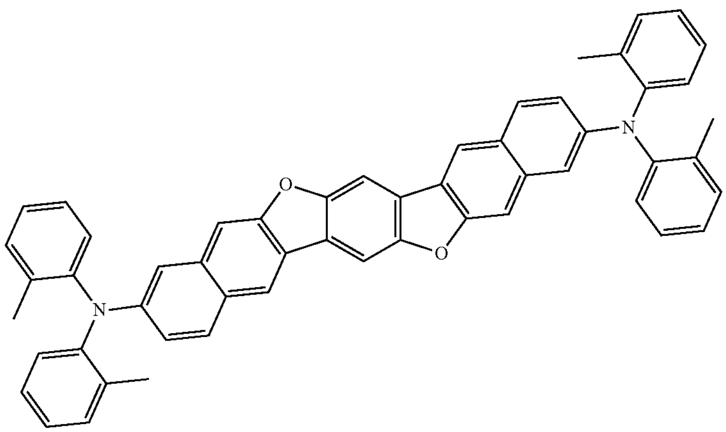
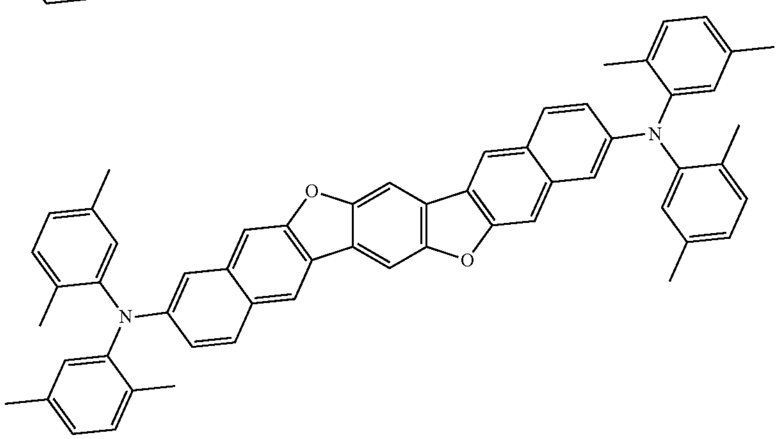
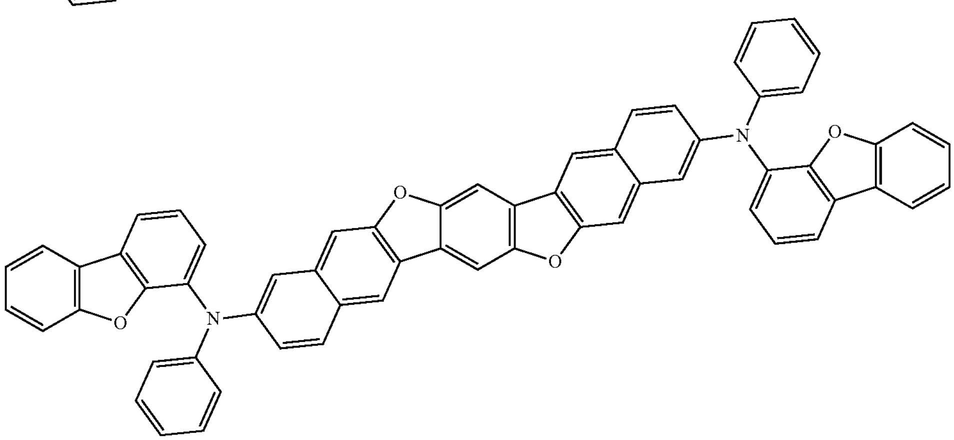

-continued
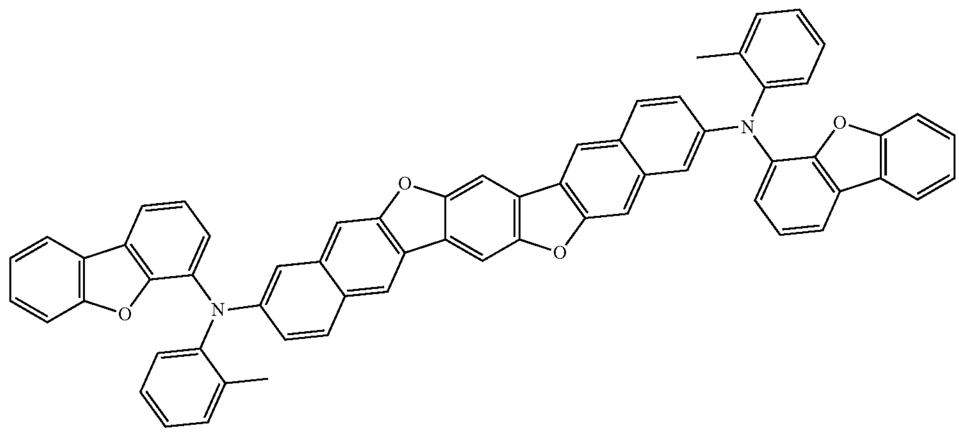
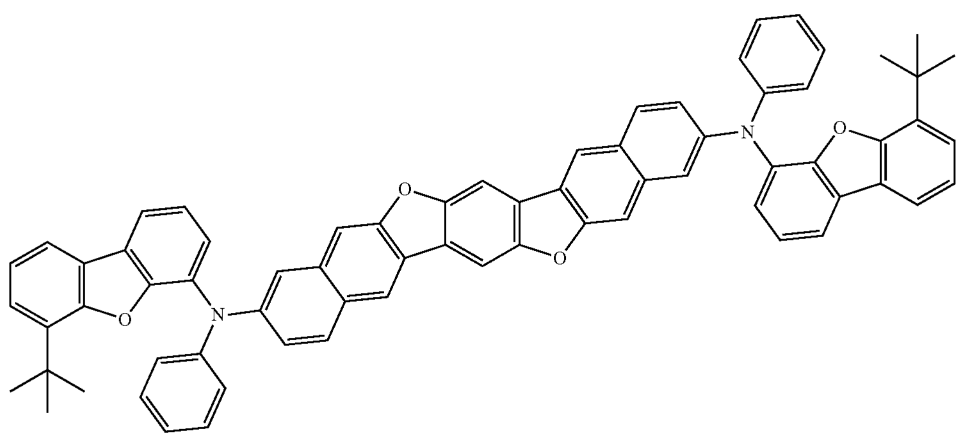
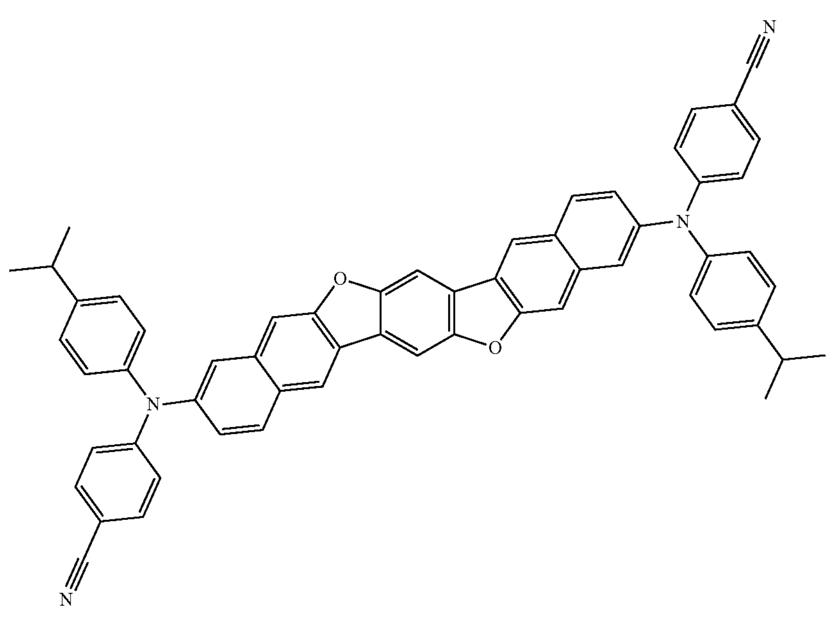

-continued
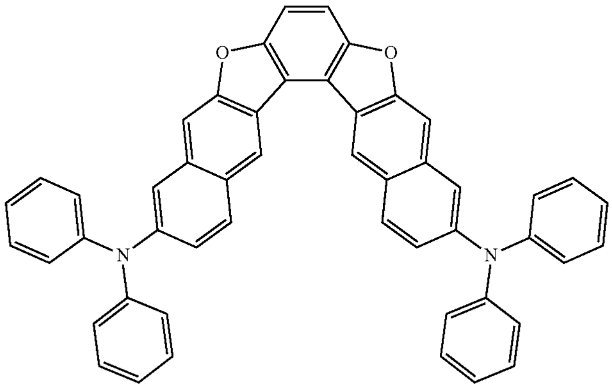
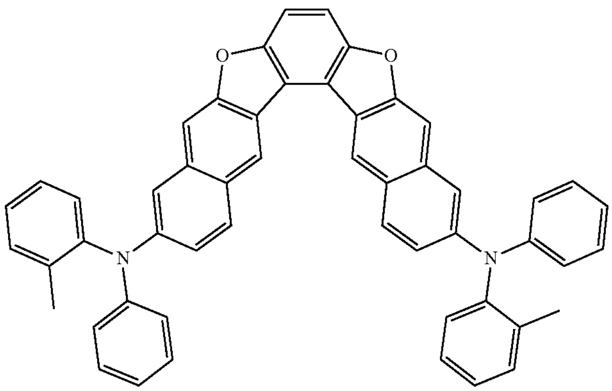
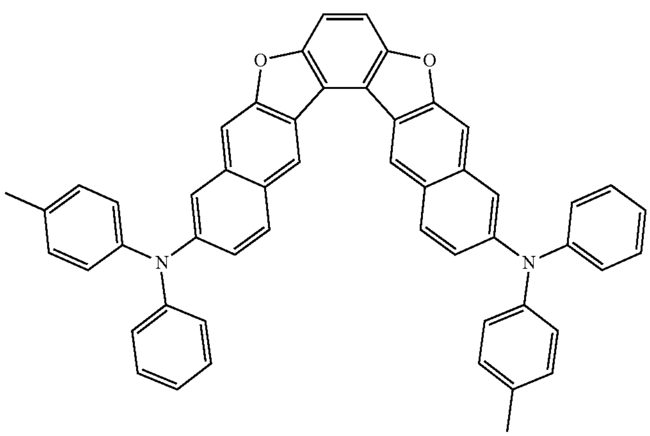
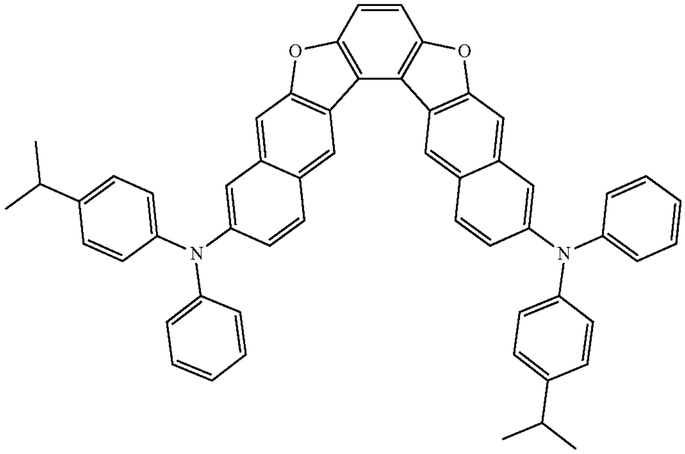

-continued
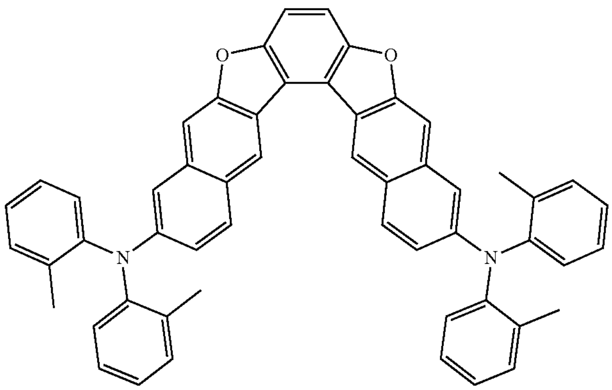
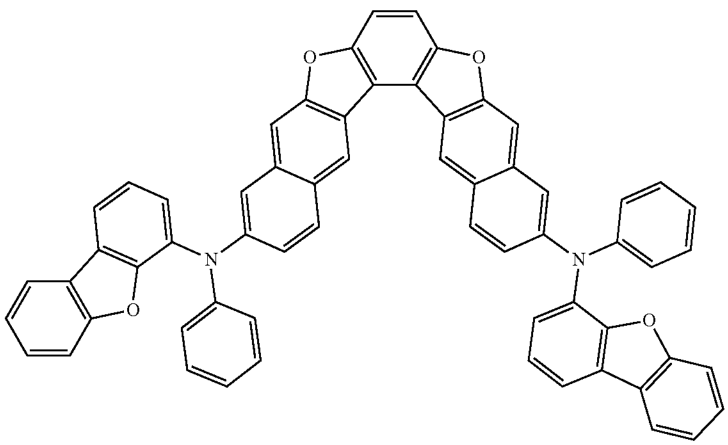
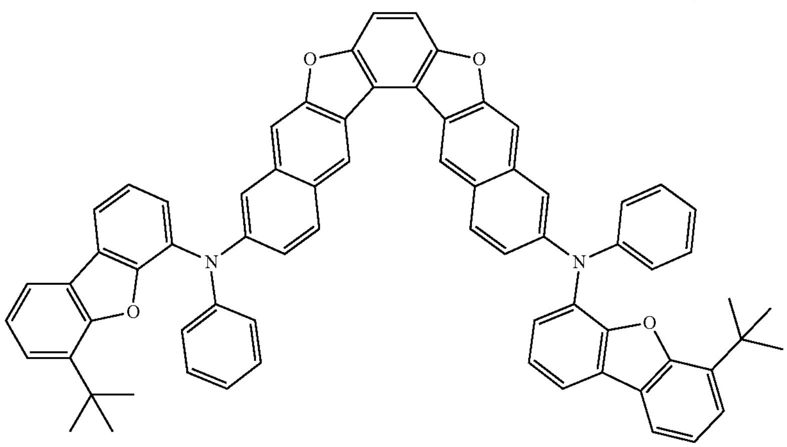
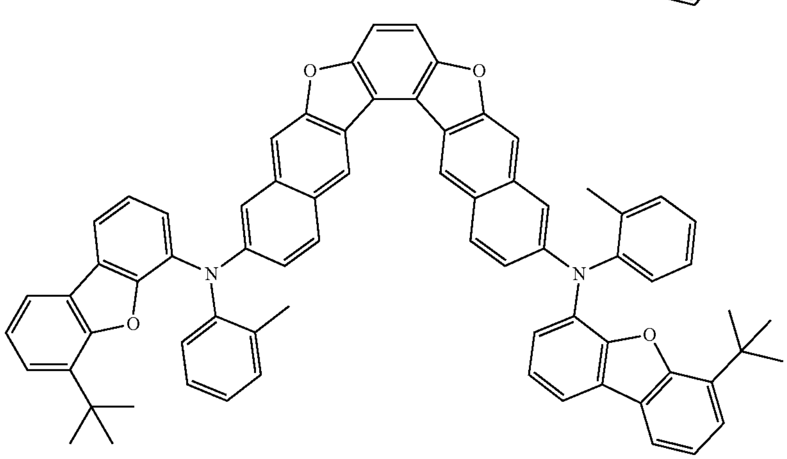

-continued
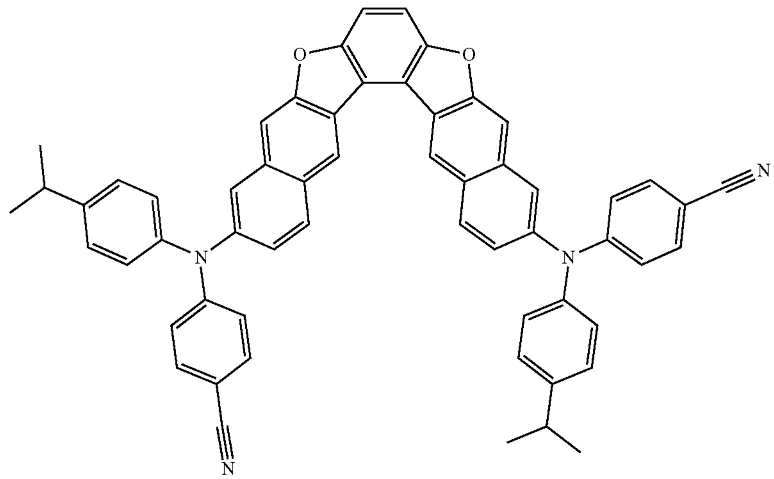
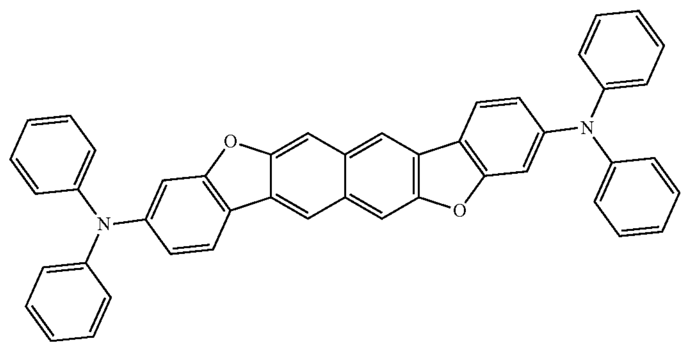
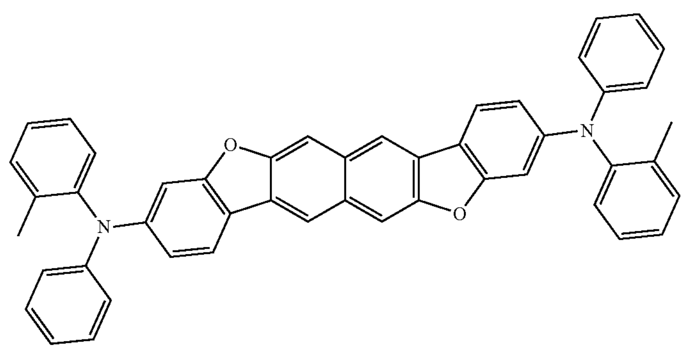
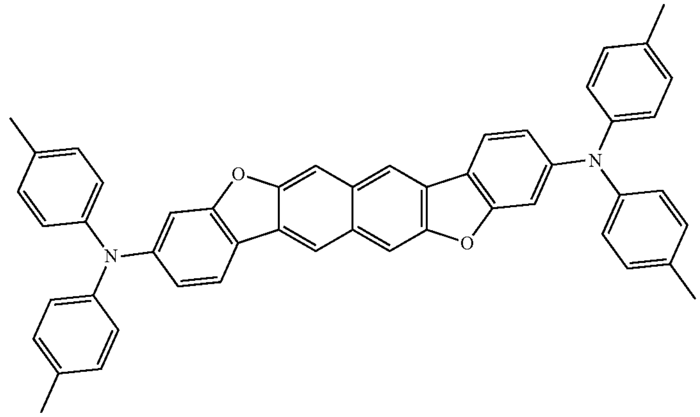

-continued
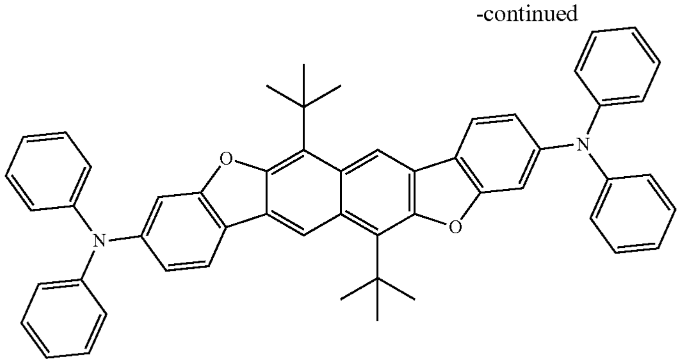
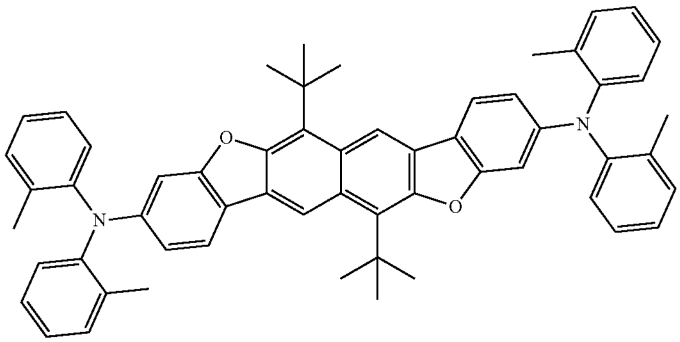
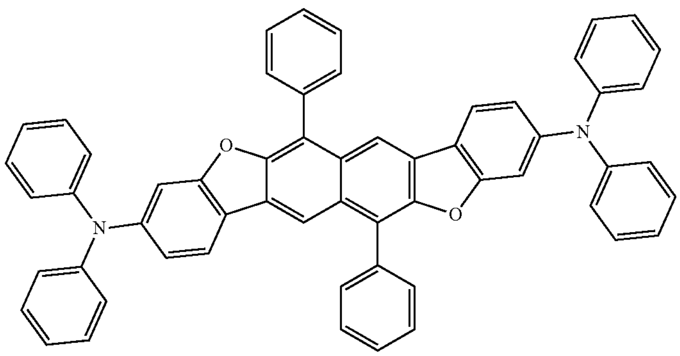
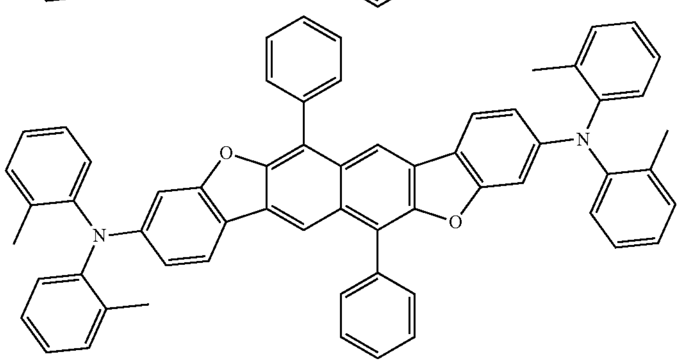
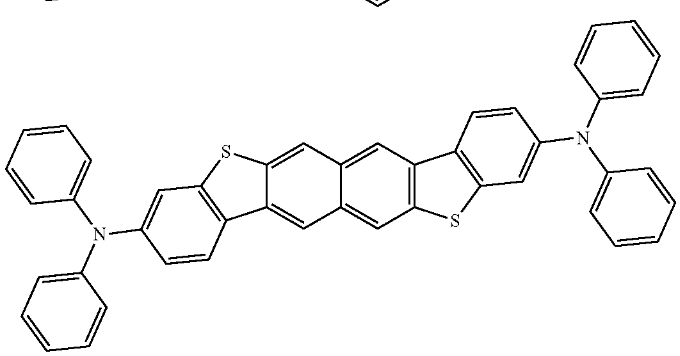

-continued
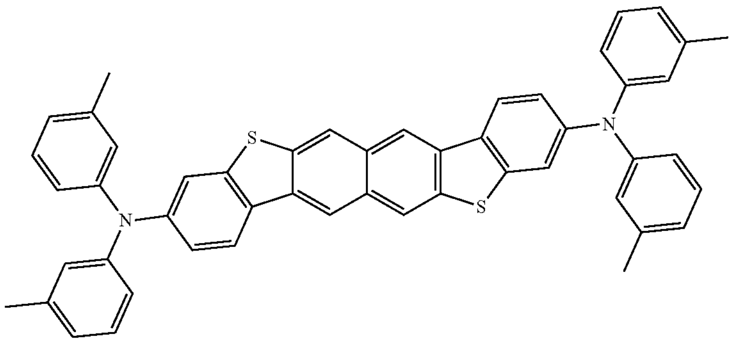
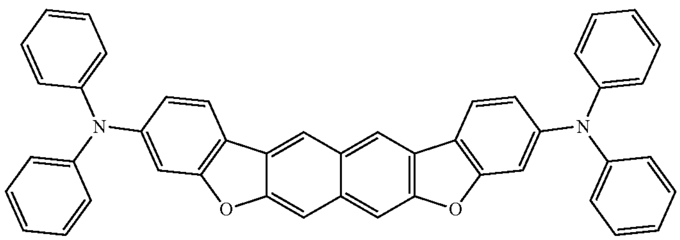
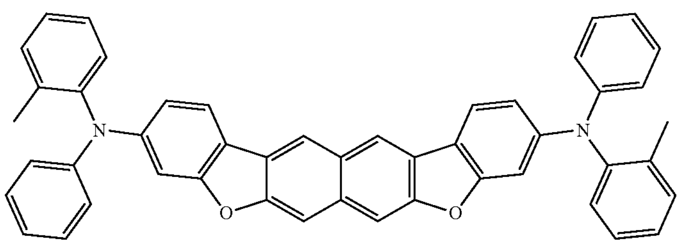
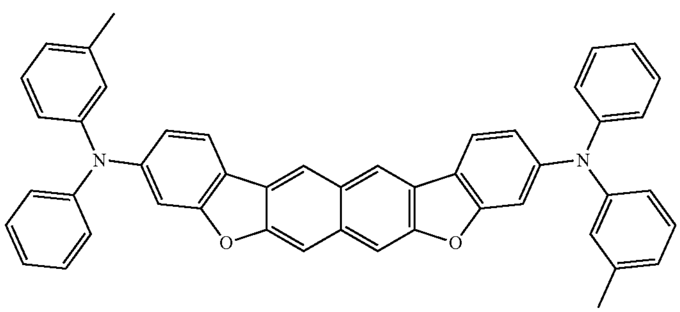
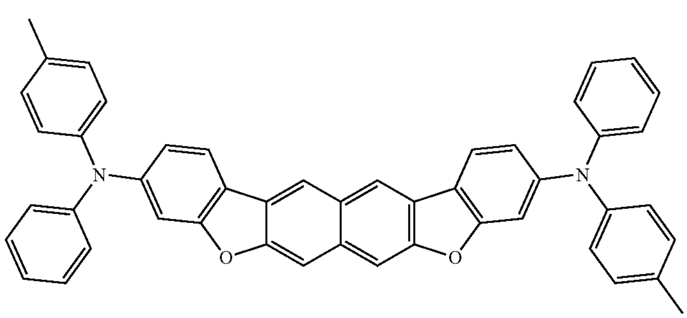

-continued
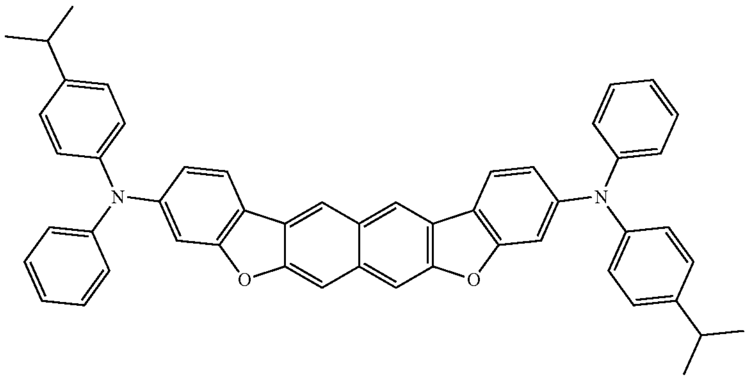
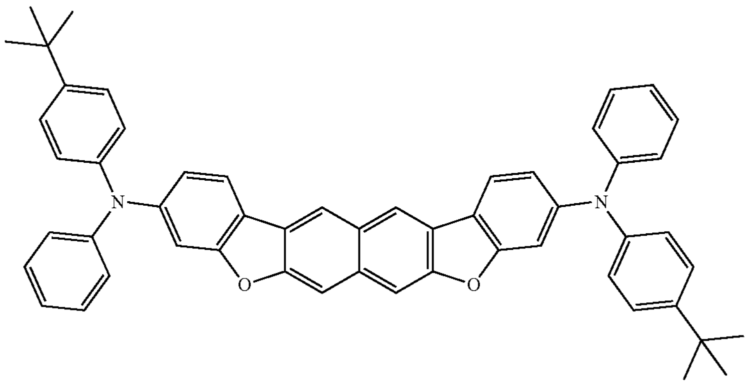
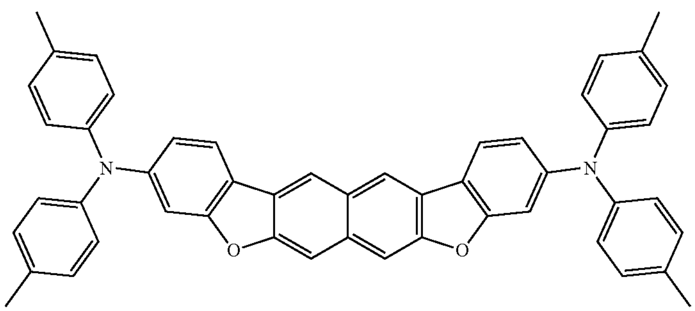
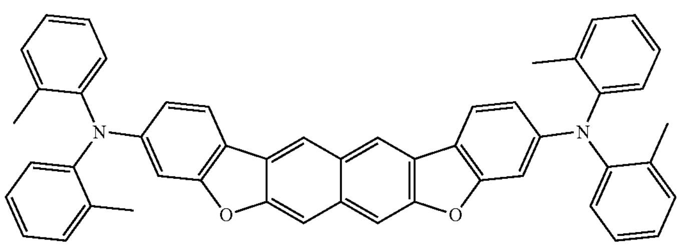
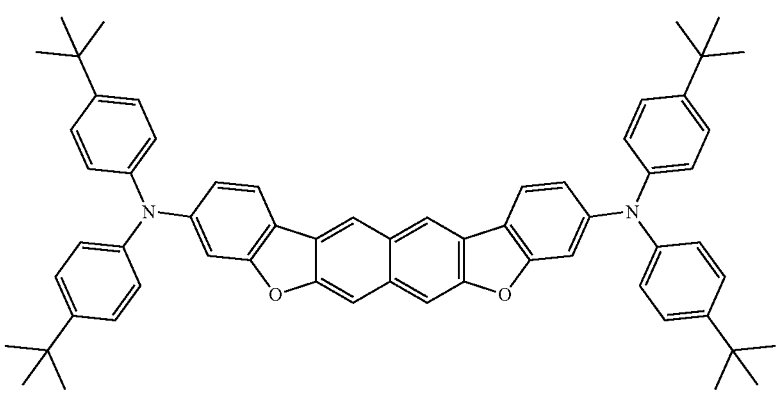

-continued
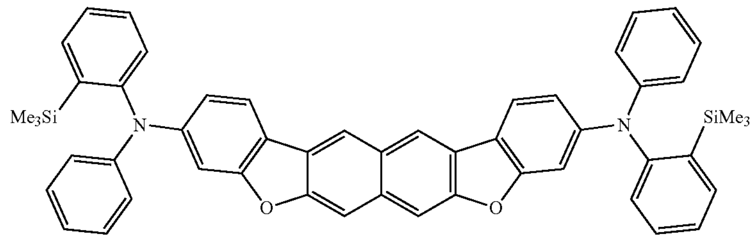
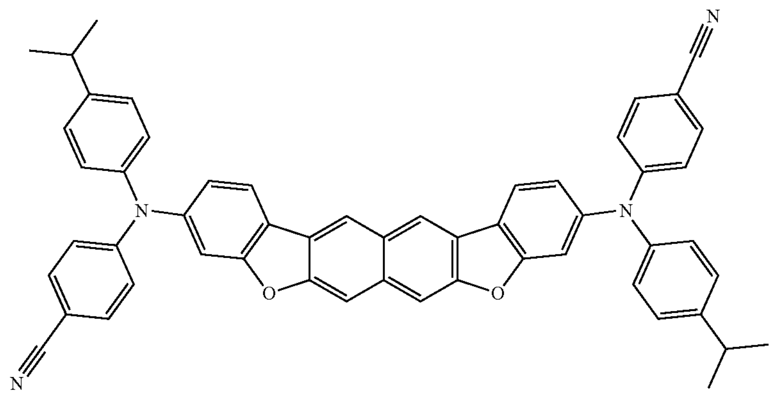
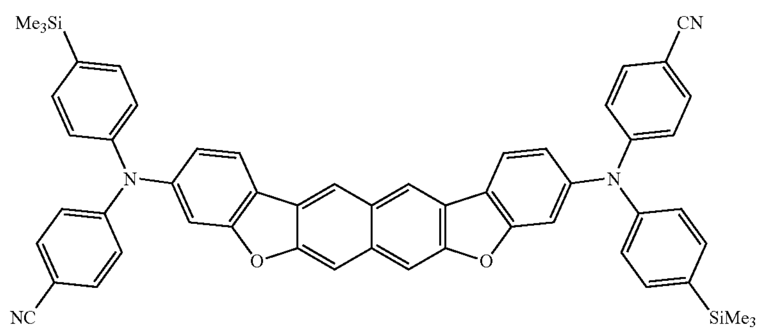
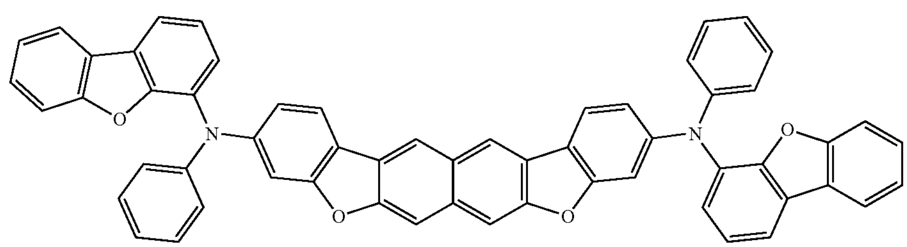
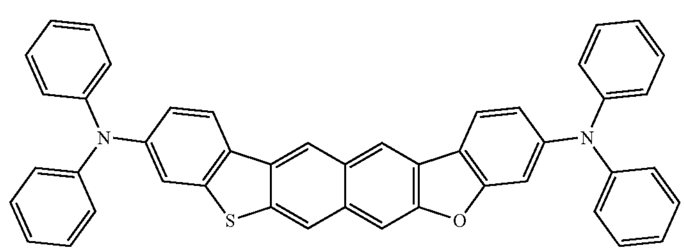

-continued
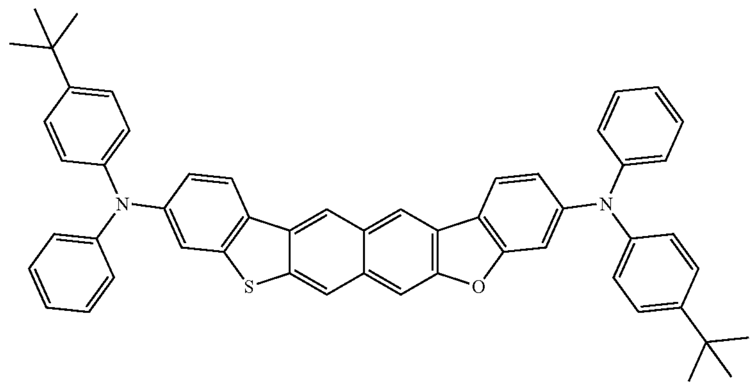
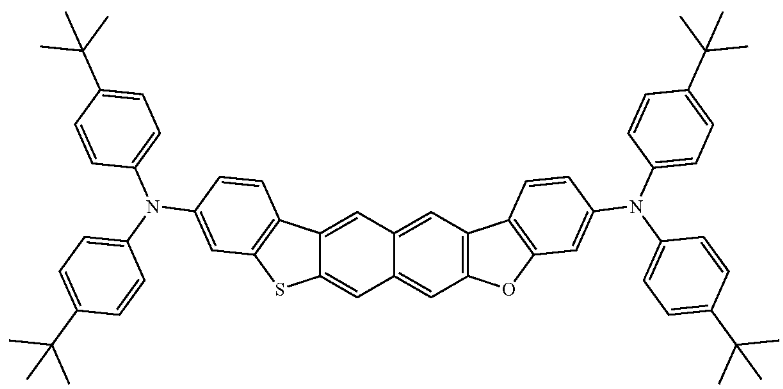
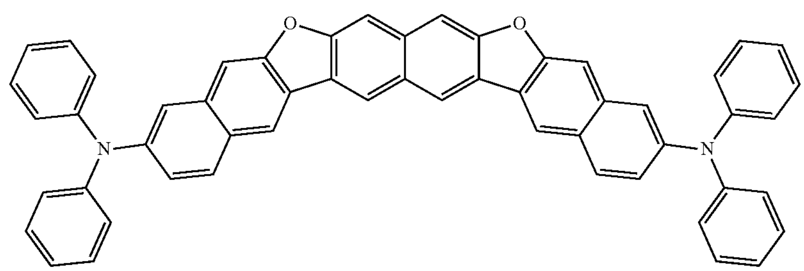
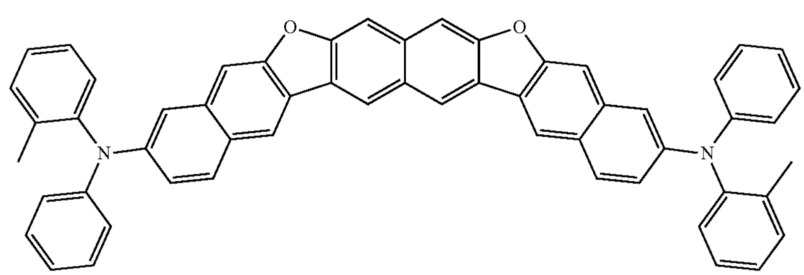
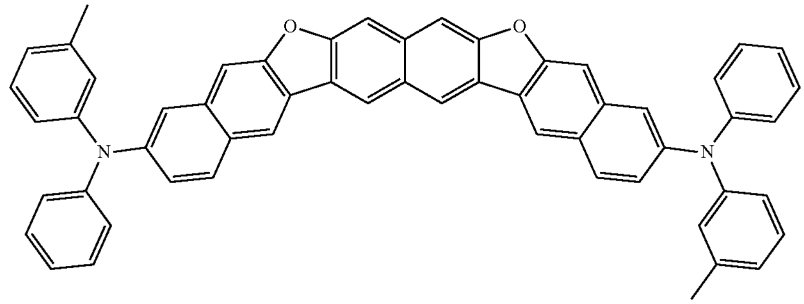

-continued
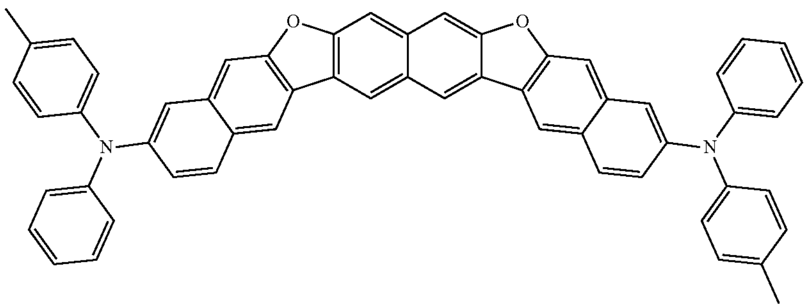
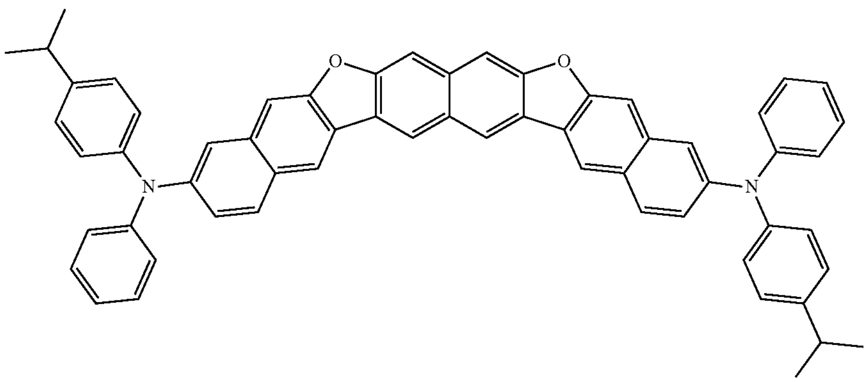
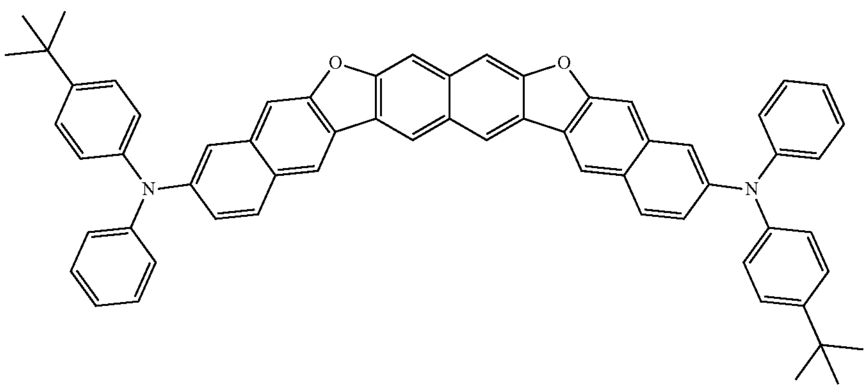
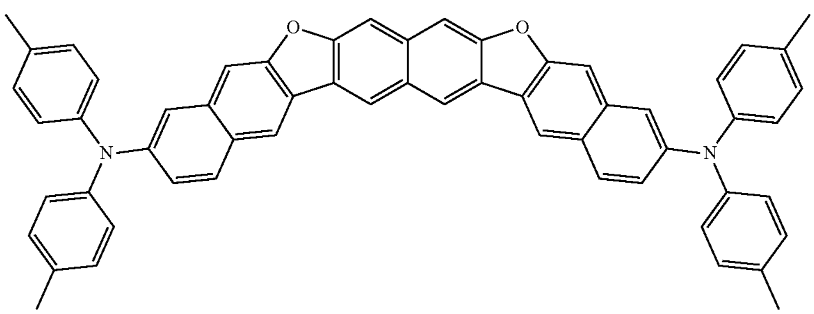
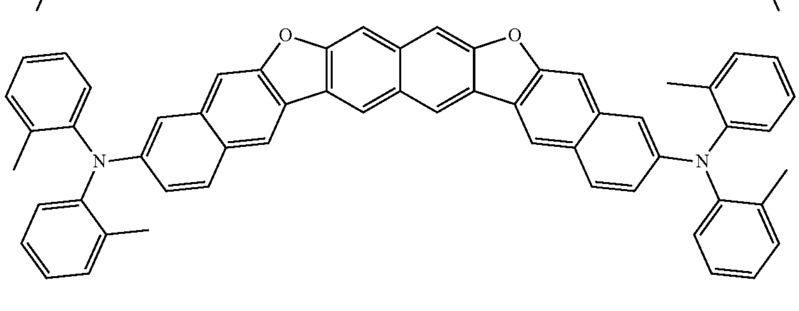

-continued

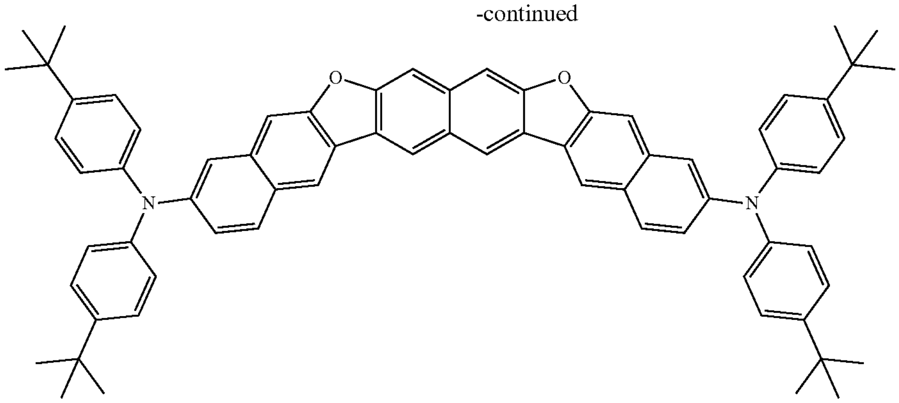

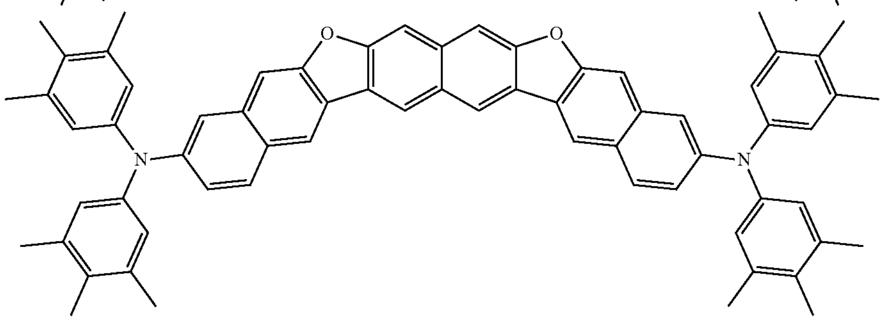

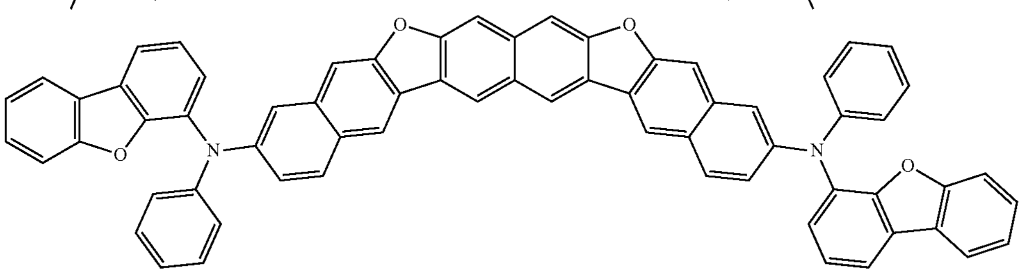

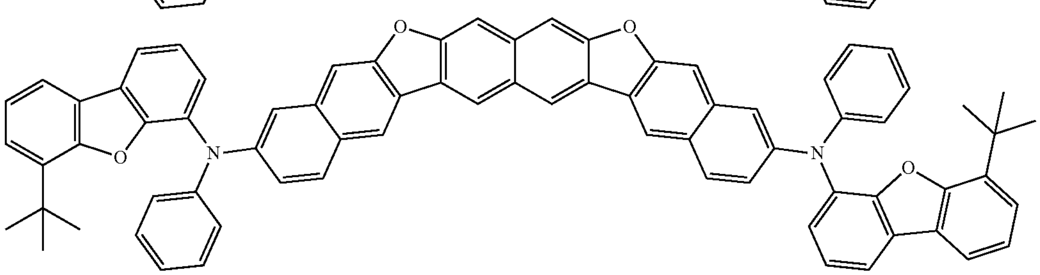

(Compound Represented by the Formula (61))

A compound represented by the formula (61) will be described.

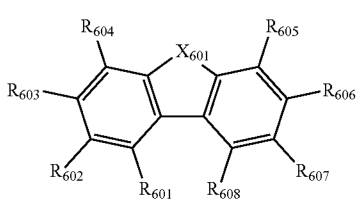

(61)

In the formula (61), at least one set of $R_{601}$ and $R_{602}$, $R_{602}$ and $R_{602}$, and $R_{602}$ and $R_{604}$ forms a divalent group represented by the following formula (62) by bonding with each other.

At least one set of $R_{605}$ and $R_{602}$, $R_{602}$ and $R_{602}$, and $R_{602}$ and $R_{602}$ forms a divalent group represented by the following formula (63) by bonding with each other.

(62)

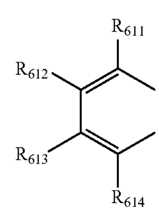

-continued (63)

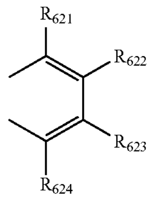

At least one of $R_{601}$ to $R_{604}$ which do not form a divalent group represented by the formula (62), and $R_{611}$ to $R_{614}$ is a monovalent group represented by the following formula (64).

At least one of $R_{605}$ to $R_{602}$ which do not form a divalent group represented by the formula (63), and $R_{621}$ to $R_{624}$ is a monovalent group represented by the following formula (64).

$X_{601}$ is an oxygen atom, a sulfur atom, or $NR_{609}$.

$R_{601}$ to $R_{608}$ which do not form a divalent group represented by any of the formulas (62) and (63) and which are not a monovalent group represented by the formula (64), $R_{611}$ to $R_{614}$ and $R_{621}$ to $R_{624}$ which are not a monovalent group represented by the formula (64), and $R_{609}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})$ $(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

(64)

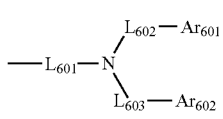

In the formula (64), $Ar_{601}$ and $Ar_{602}$ are independently a substituted or unsubstituted aryl group including 6 to 50 ring carbon atoms, or a substituted or unsubstituted monovalent heterocyclic group including 5 to 50 ring atoms.

$L_{601}$ to $L_{603}$ are independently a single bond, a substituted or unsubstituted arylene group including 6 to 30 ring carbon atoms, a substituted or unsubstituted divalent heterocyclic group including 5 to 30 ring atoms, or a divalent linking group formed by bonding two to four of these.

In the formula (61), the positions in which the divalent group represented by the formula (62) and the divalent group represented by the formula (63) are formed are not particularly limited, and these groups can be formed in any possible position of $R_{601}$ to $R_{608}$.

In one embodiment, the compound represented by the formula (61) is a compound represented by any of the following formulas (61-1) to (61-6).

(61-1)

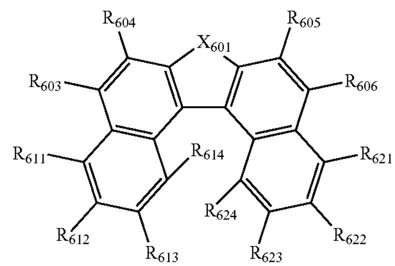

(61-2)

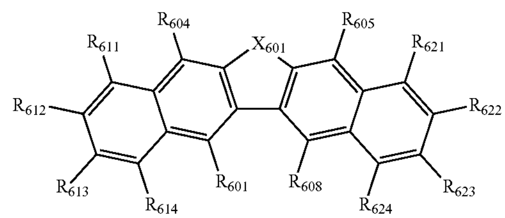

(61-3)

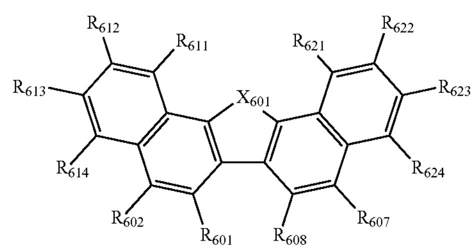

(61-4)

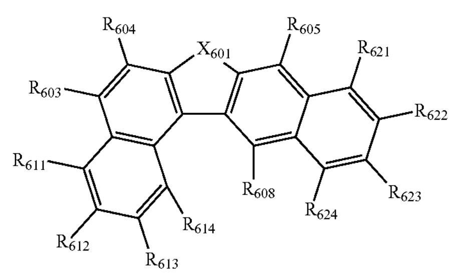

(61-5)

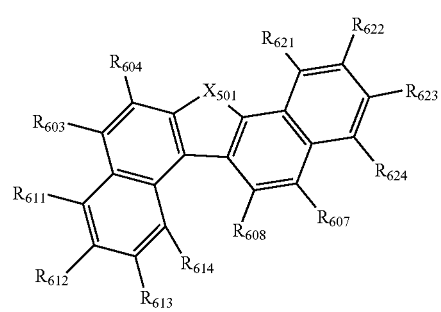

-continued (61-6)

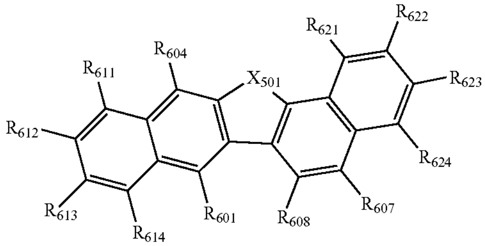

In the formulas (61-1) to (61-6), $X_{601}$ is as defined in the formula (61).

At least two of $R_{601}$ to $R_{624}$ are a monovalent group represented by the formula (64).

$R_{601}$ to $R_{624}$ which are not a monovalent group represented by the formula (64) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

In one embodiment, the compound represented by the formula (61) is a compound represented by any of the following formulas (61-7) to (61-18).

(61-7)

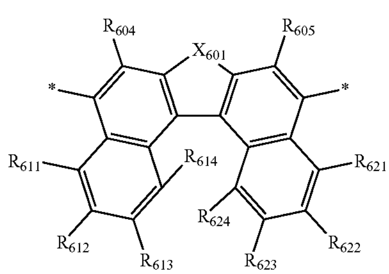

(61-8)

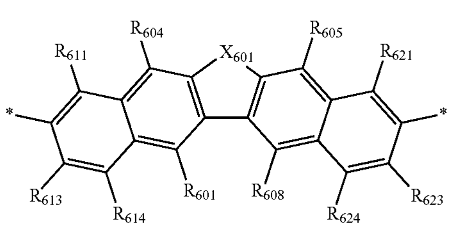

-continued (61-9)

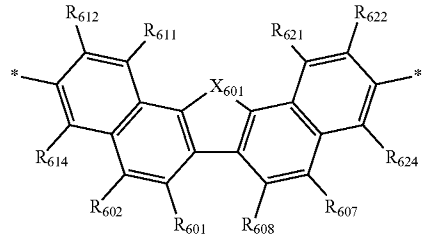

(61-10)

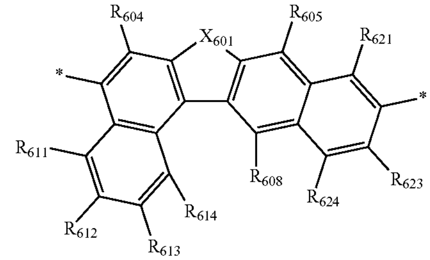

(61-11)

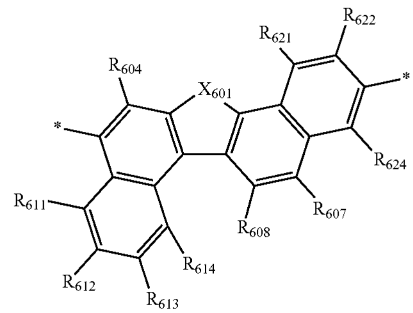

(61-12)

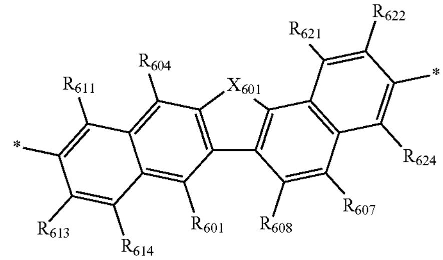

(61-13)

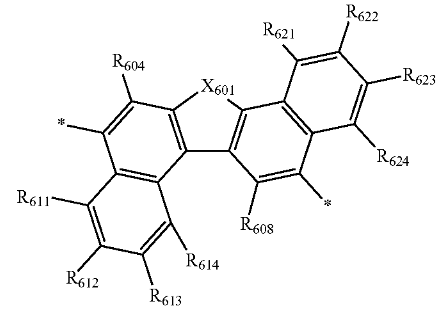

-continued (61-14)

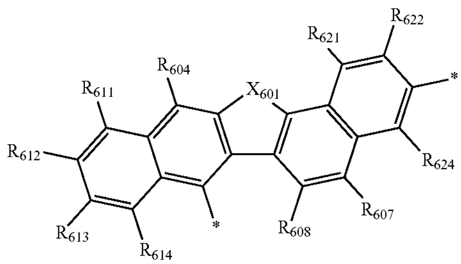

(61-15)

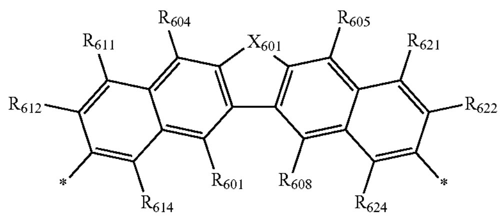

(61-16)

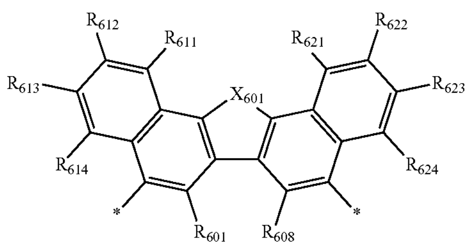

(61-17)

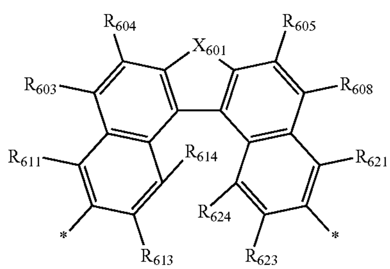

(61-18)

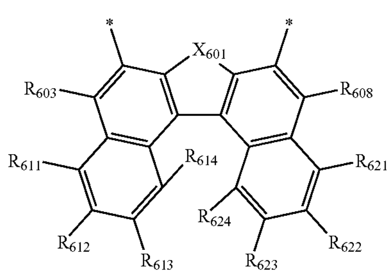

In the formulas (61-7) to (61-18), $X_{601}$ is as defined in the formula (61); "*" is a single bond which bonds with a monovalent group represented by the formula (64); and $R_{601}$ to $R_{624}$ are the same as $R_{601}$ to $R_{624}$ which are not a monovalent group represented by the formula (64).

$R_{601}$ to $R_{608}$ which do not form a divalent group represented by any of the formulas (62) and (63) and which are not a monovalent group represented by the formula (64), and $R_{611}$ to $R_{614}$ and $R_{621}$ to $R_{624}$ which are not a monovalent group represented by the formula (64) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The monovalent group represented by the formula (64) is preferably represented by the following formula (65) or (66).

(65)

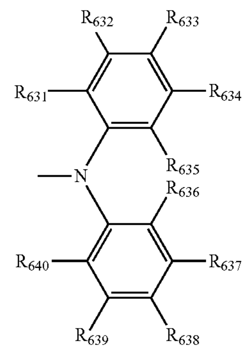

In the formula (65), $R_{631}$ to $R_{640}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

(66)

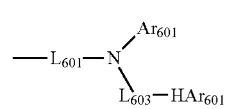

In the formula (66), $Ar_{601}$, $L_{601}$, and $L_{603}$ are as defined in the formula (64). $HAr_{601}$ is a structure represented by the following formula (67).

(67)

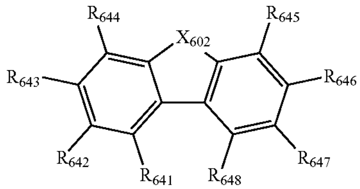

In the formula (67), $X_{602}$ is an oxygen atom or a sulfur atom.

Any one of $R_{641}$ to $R_{648}$ is a single bond which bonds with $L_{603}$.

$R_{1341}$ to $R_{648}$ which are not a single bond are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

Specific examples of the compound represented by the formula (61) include the following compounds, in addition to compounds described in NO 2014/104144 A1. In the following specific examples, "Me" represents a methyl group.

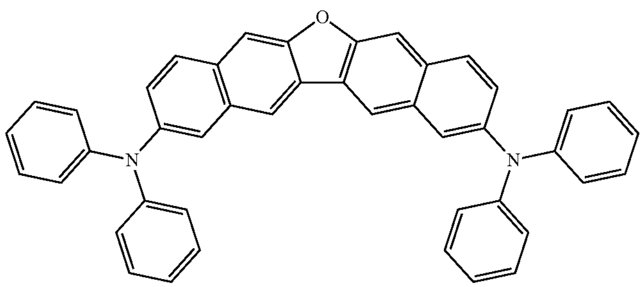

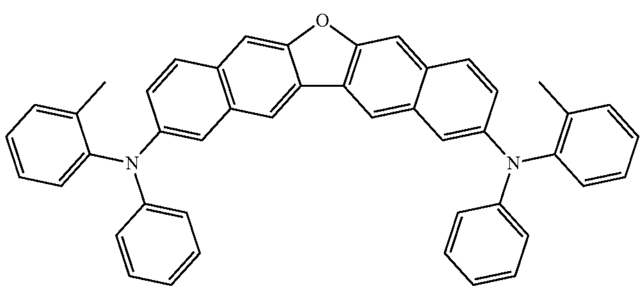

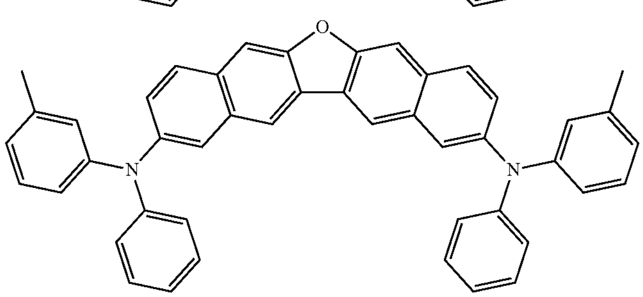

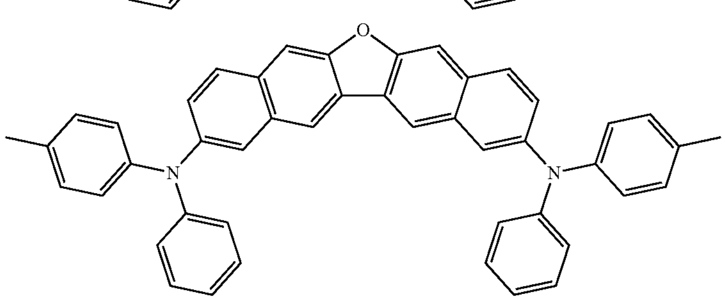

-continued
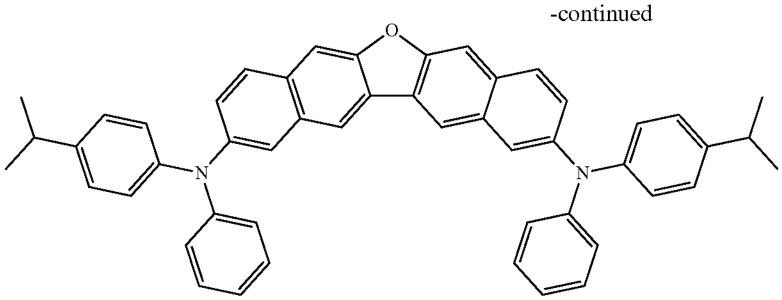
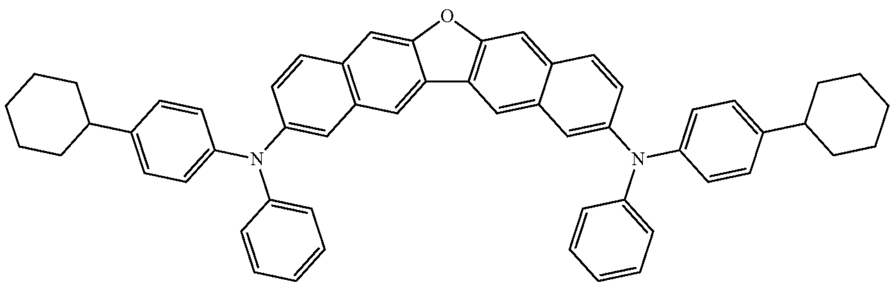
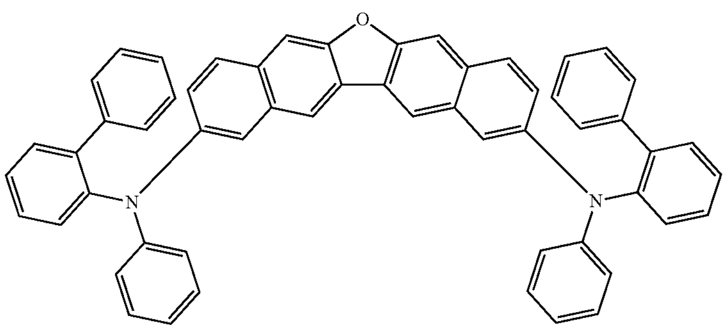
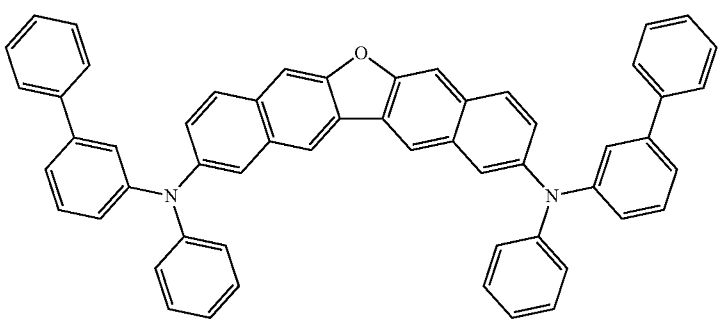
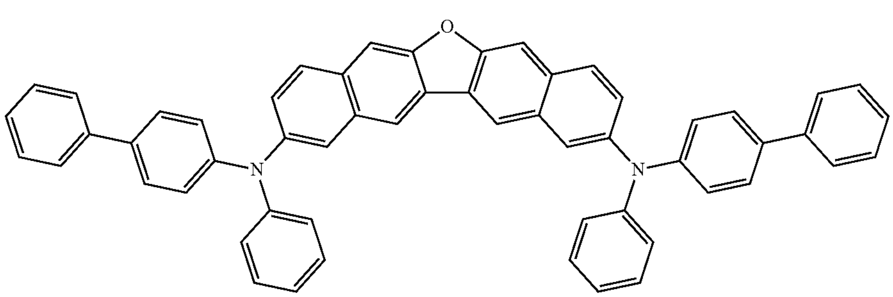

-continued
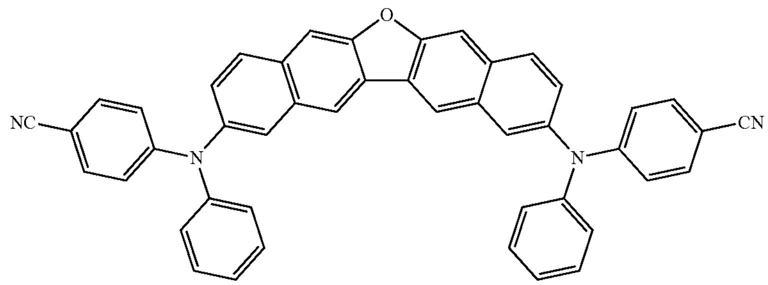
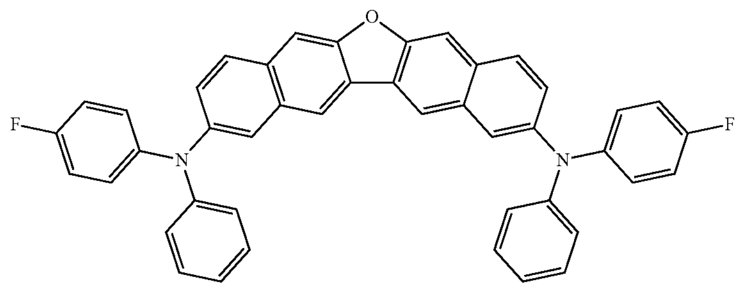
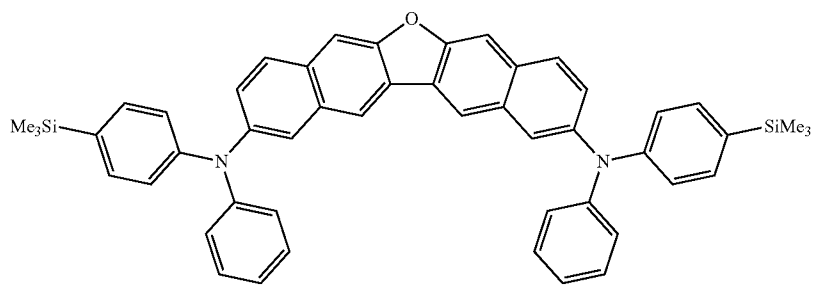
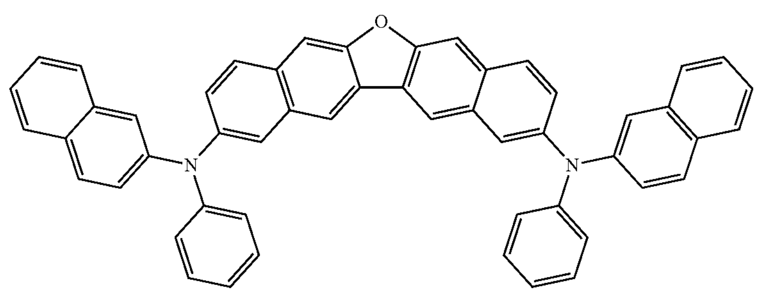
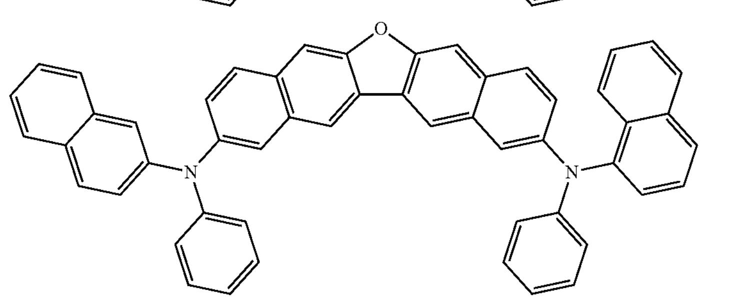
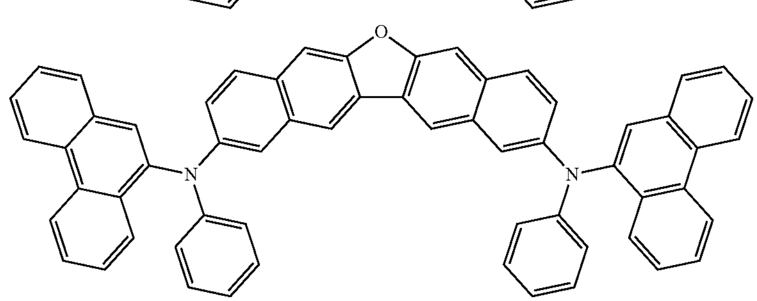

-continued
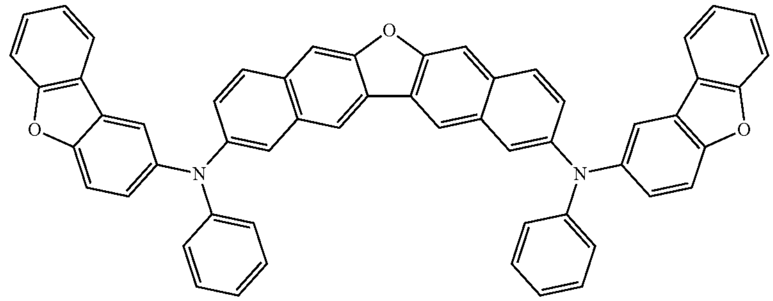
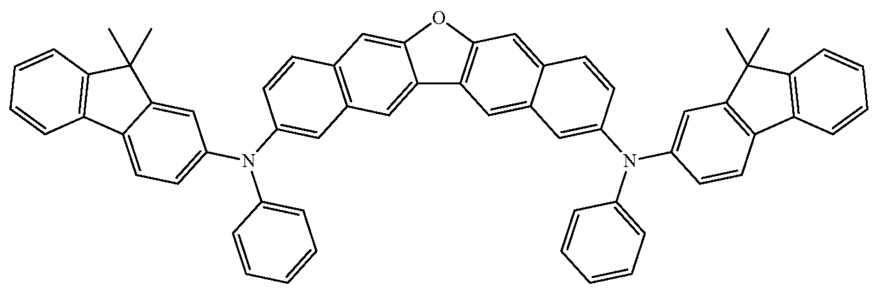
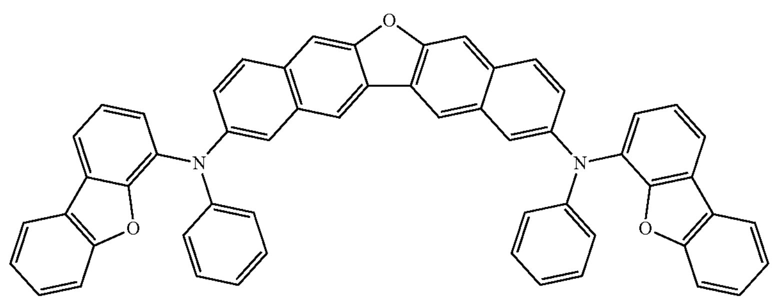
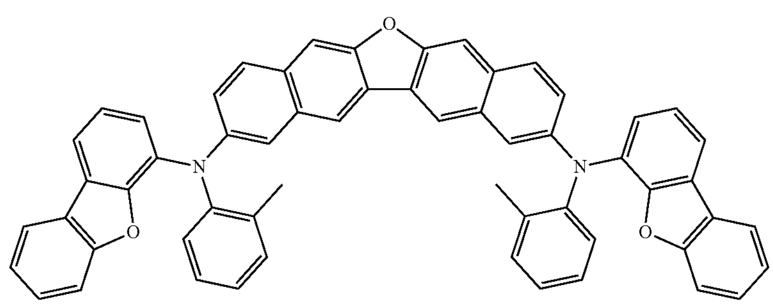
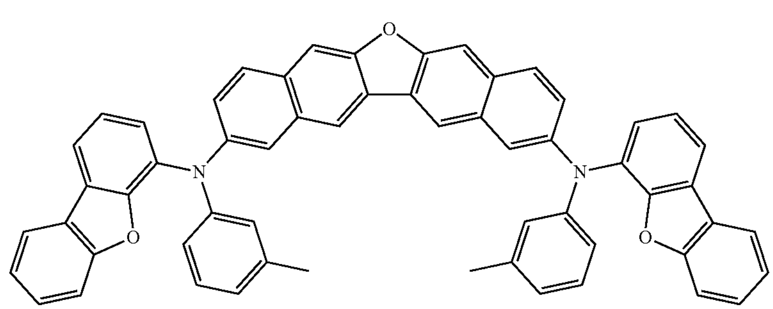

-continued
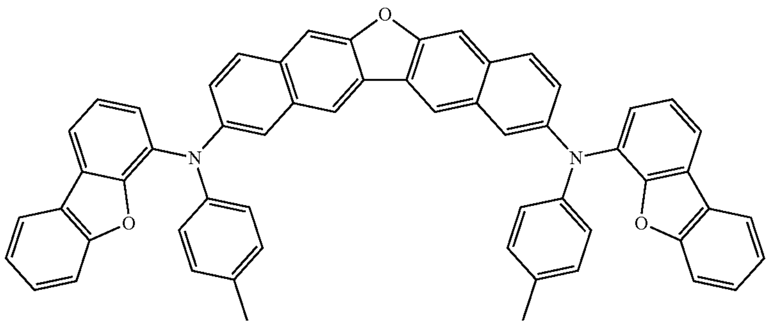
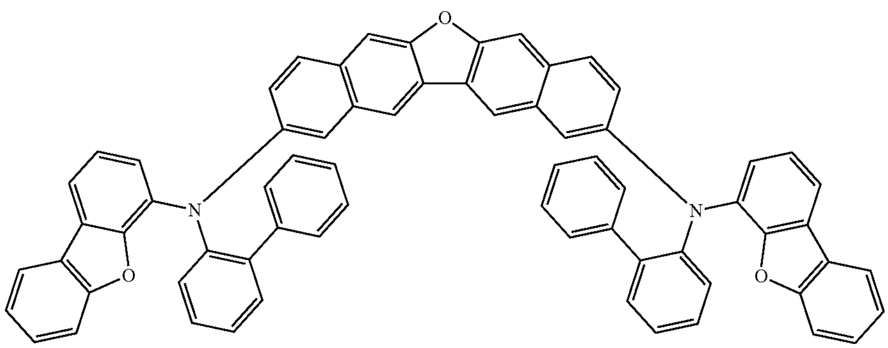
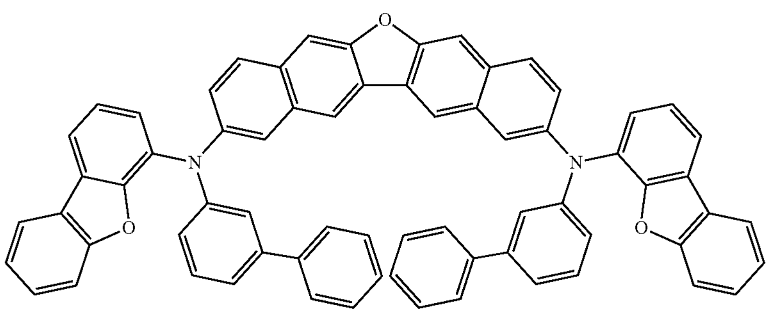
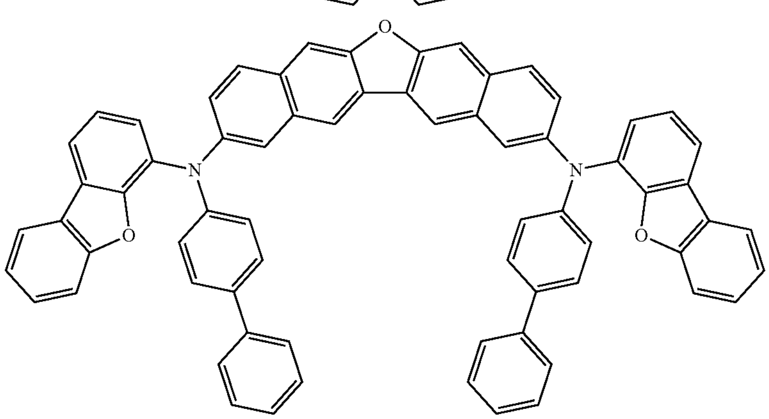
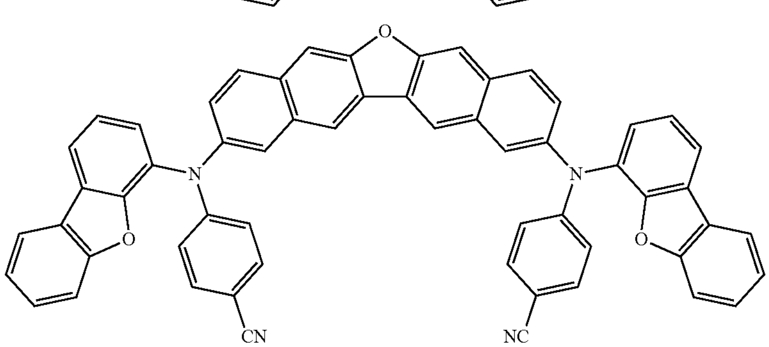

-continued
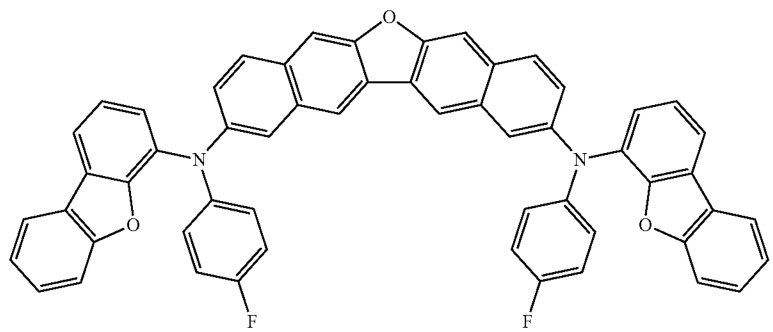
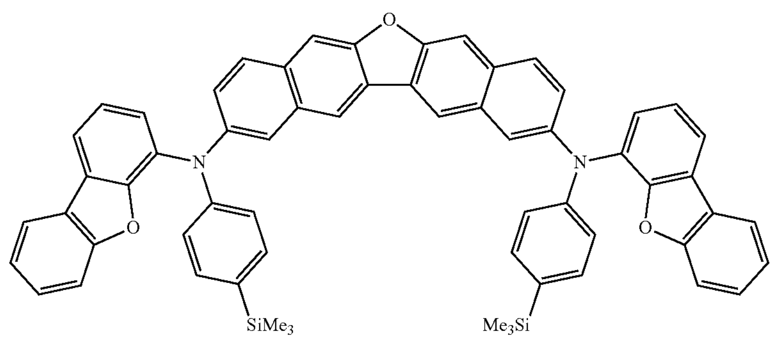
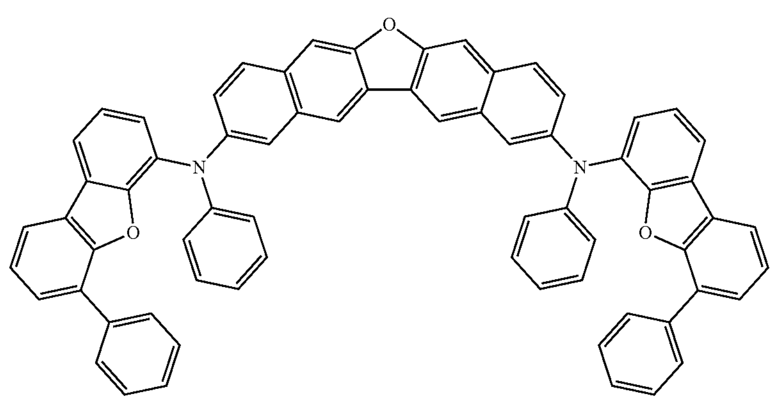
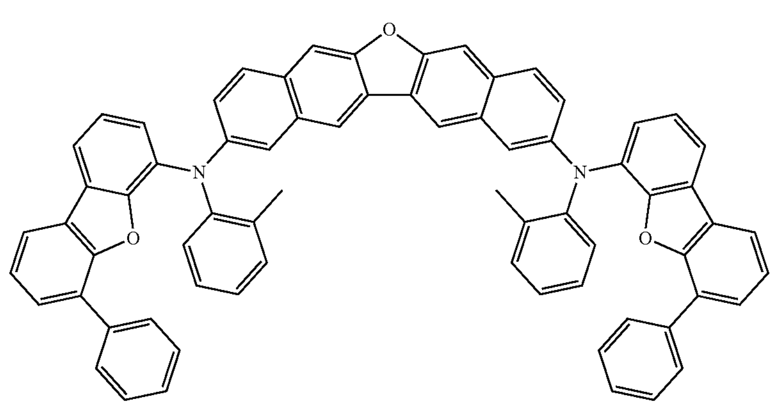

-continued
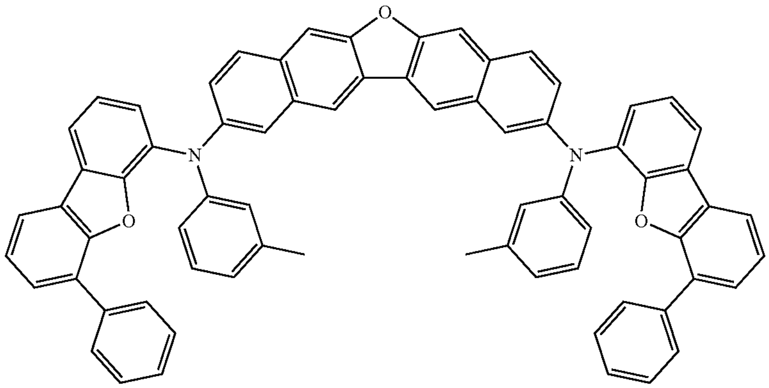
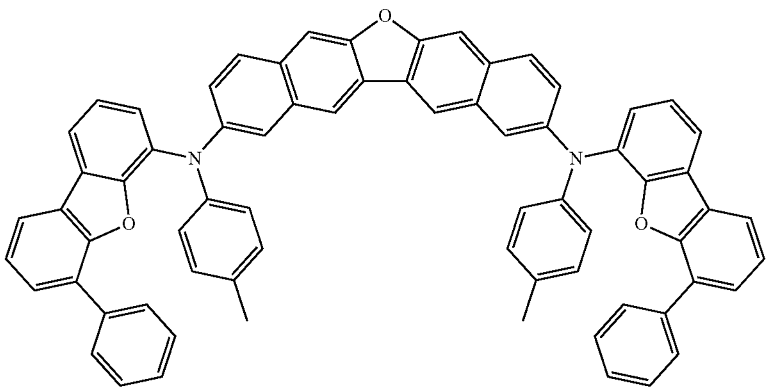
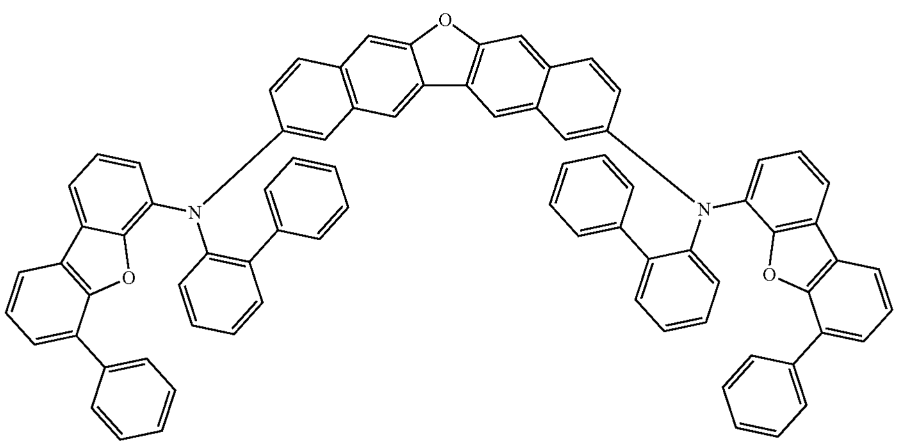
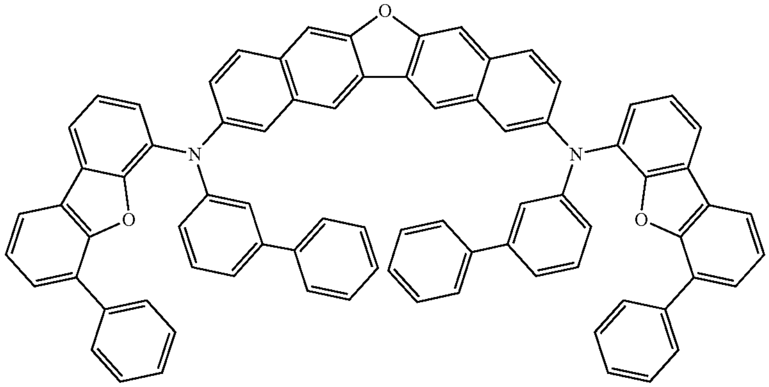

-continued
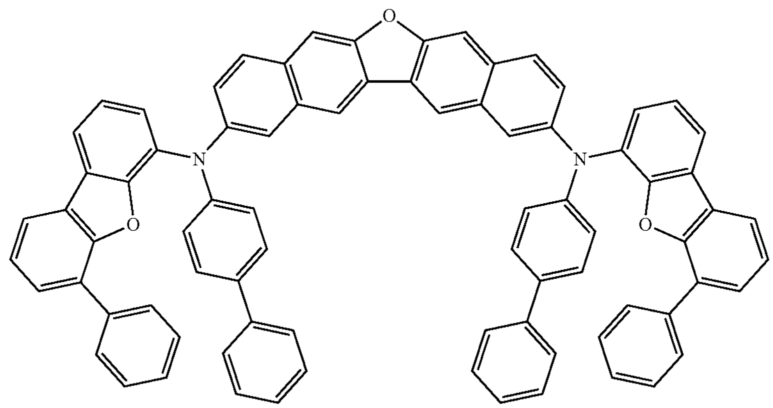
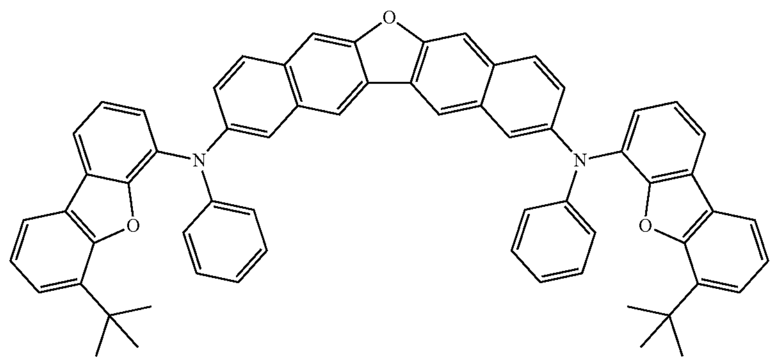
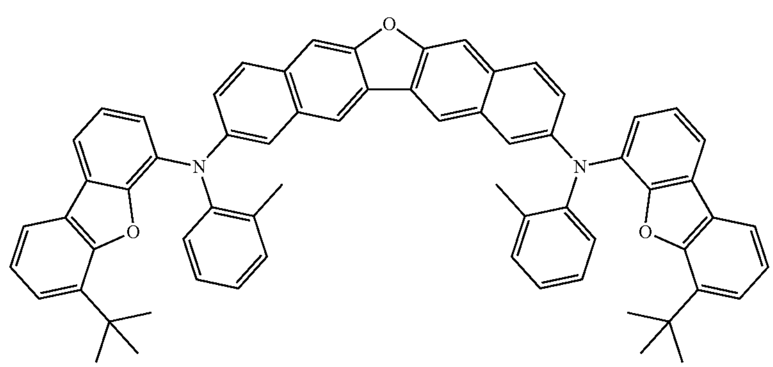
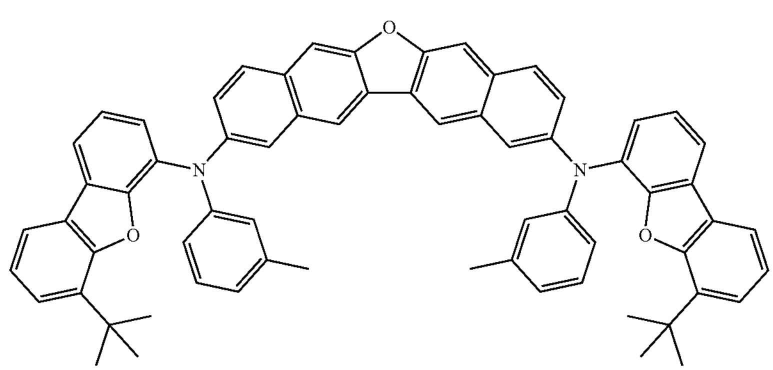

-continued
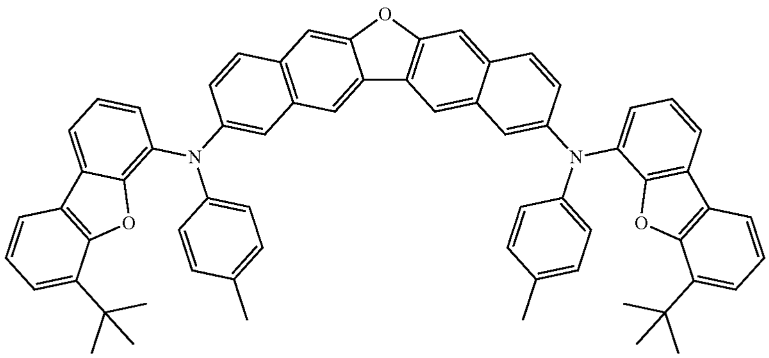
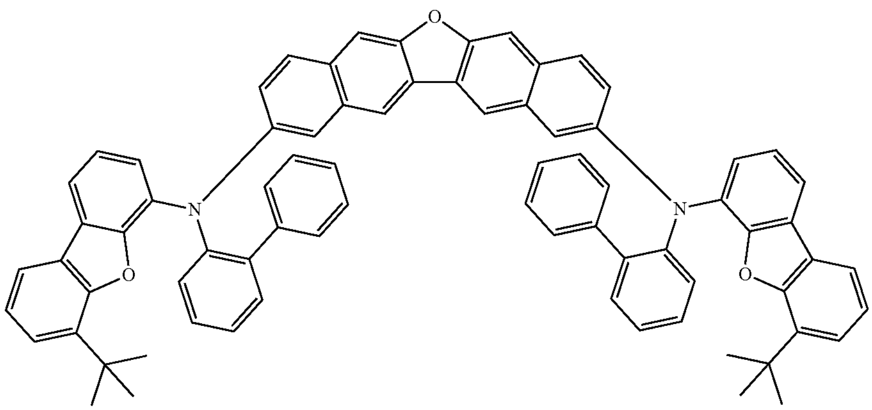
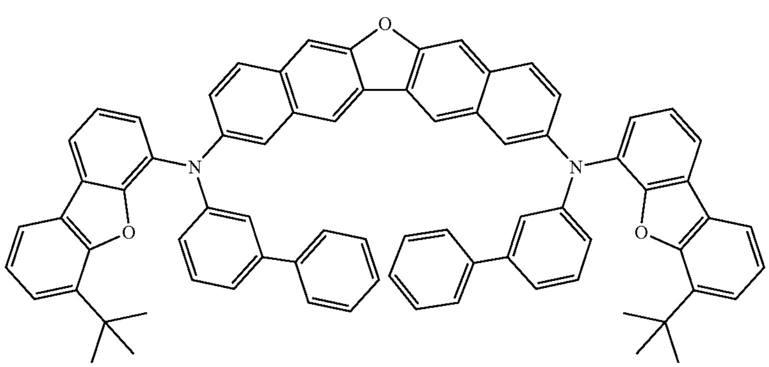
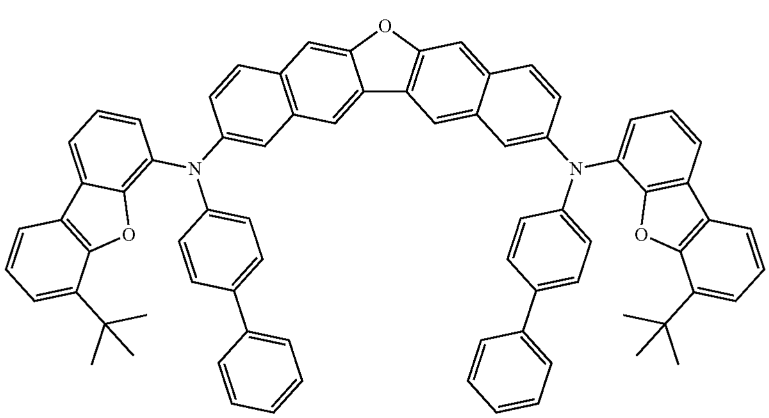

-continued
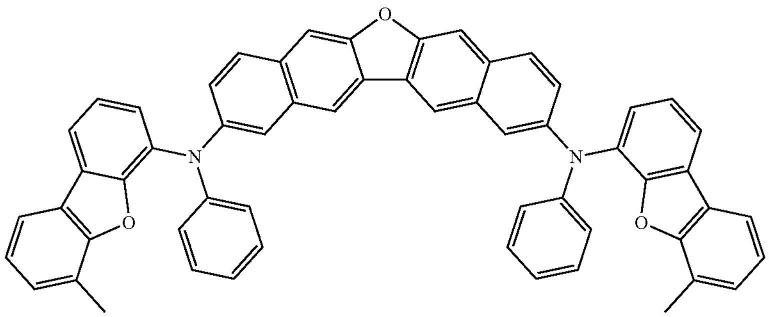
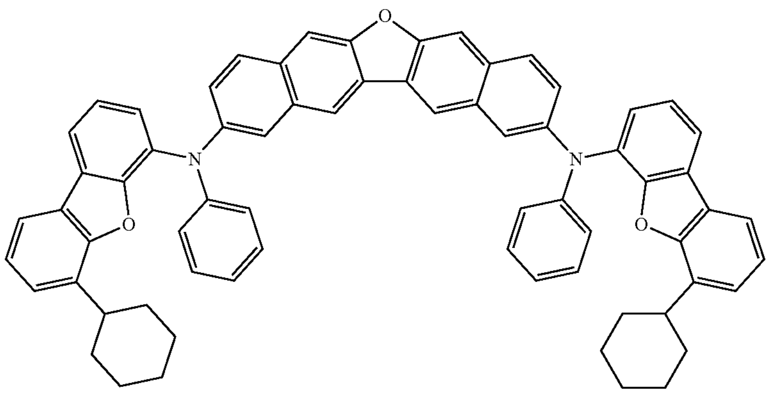
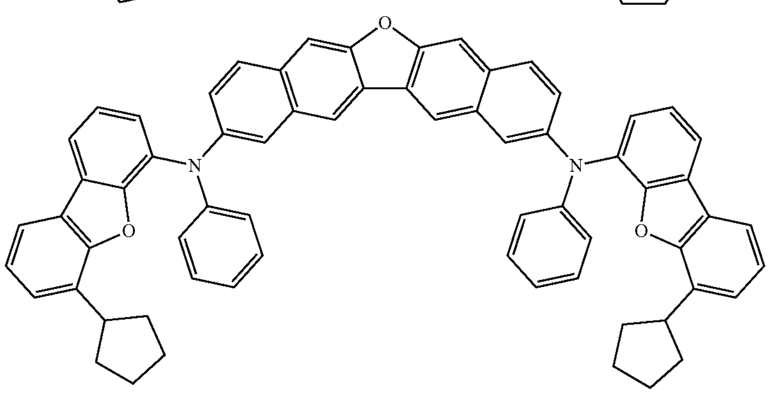
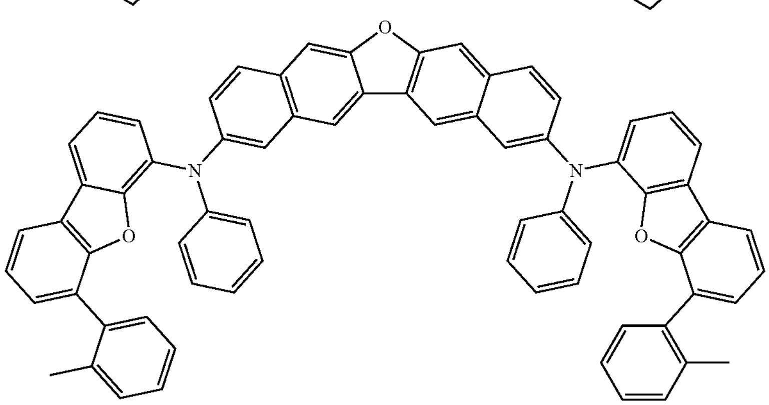
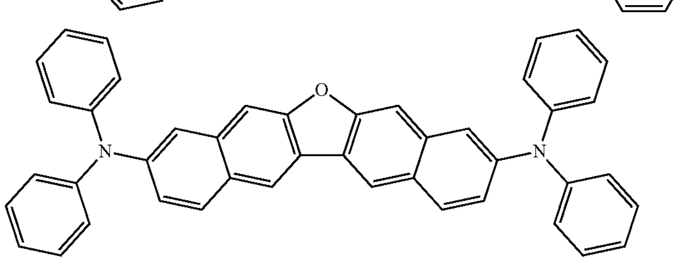

-continued
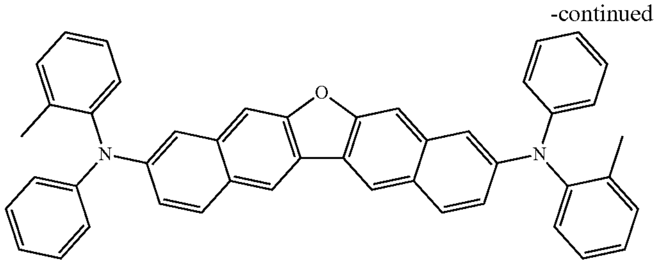
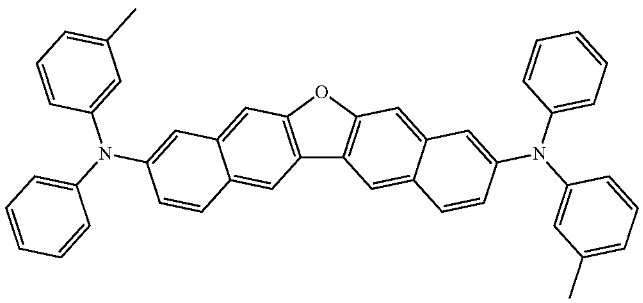
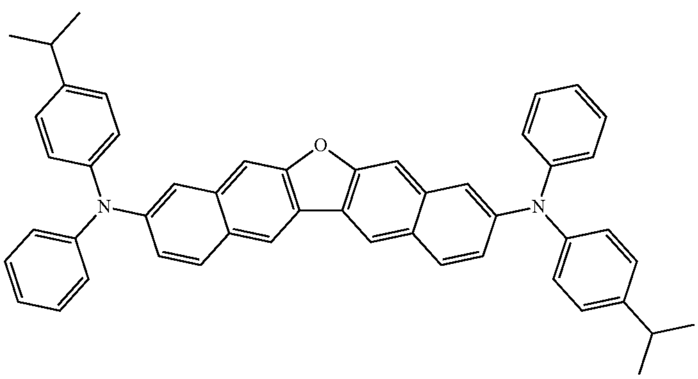
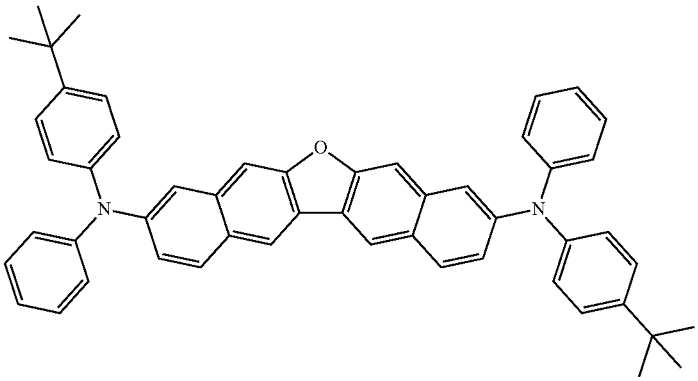
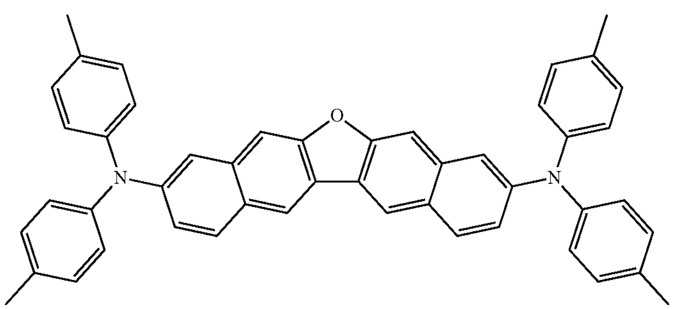

-continued
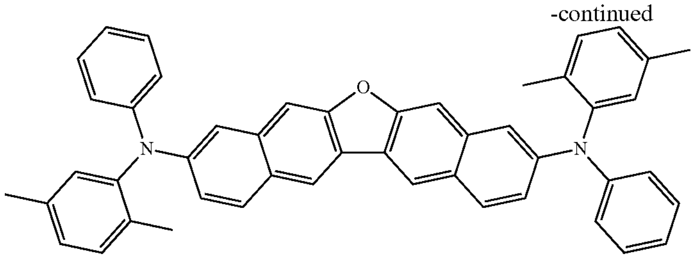
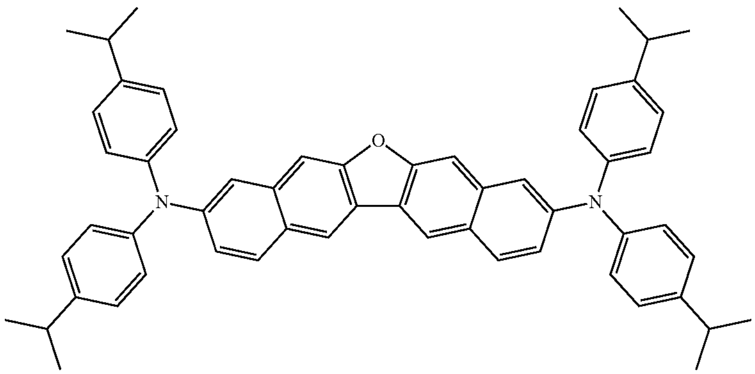
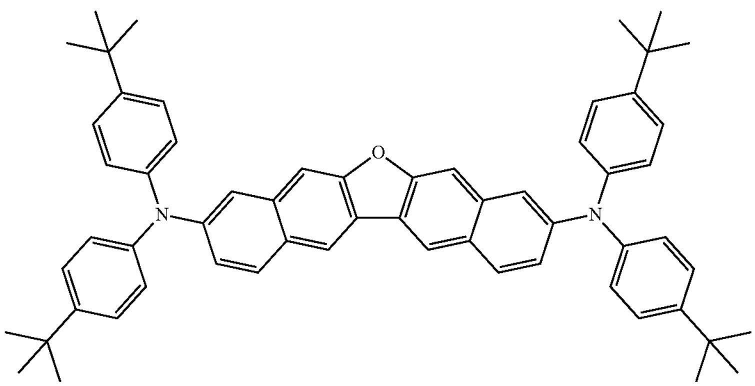
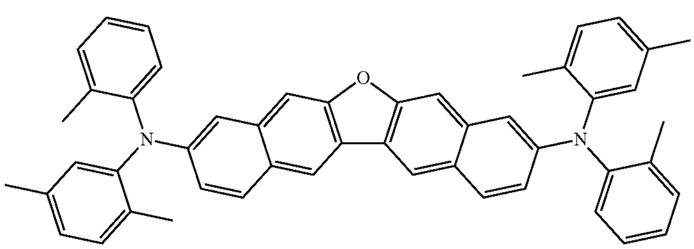
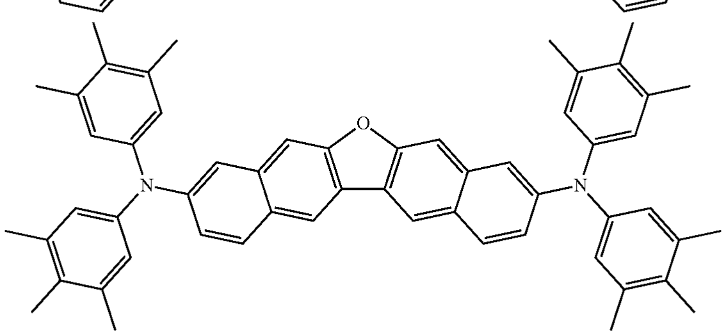

-continued
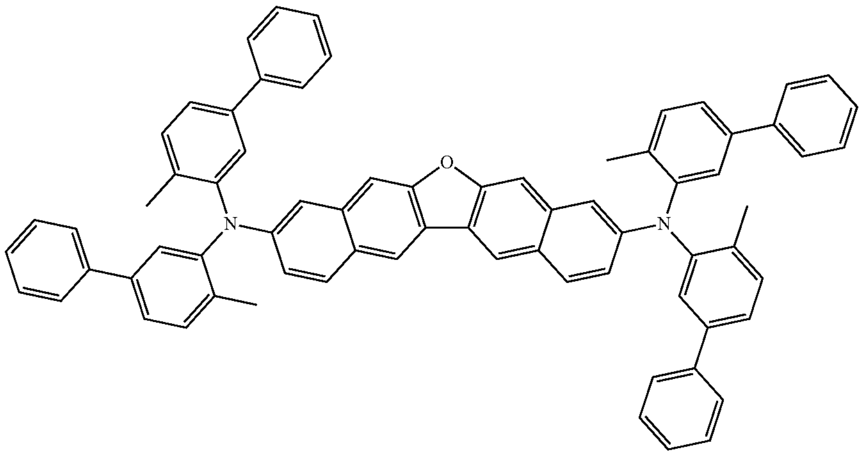
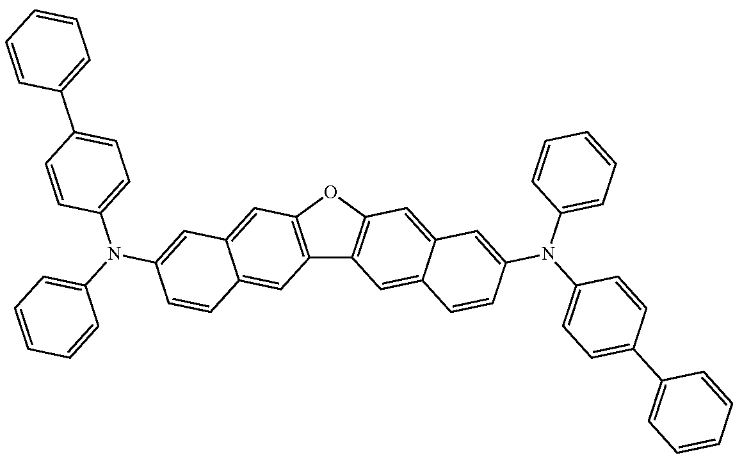
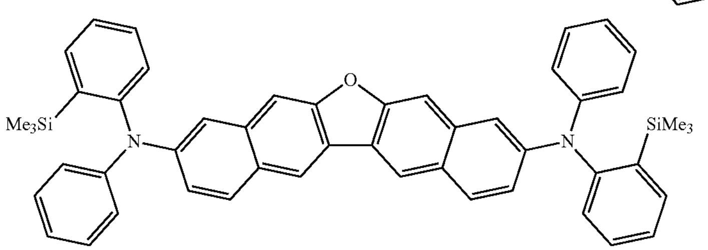
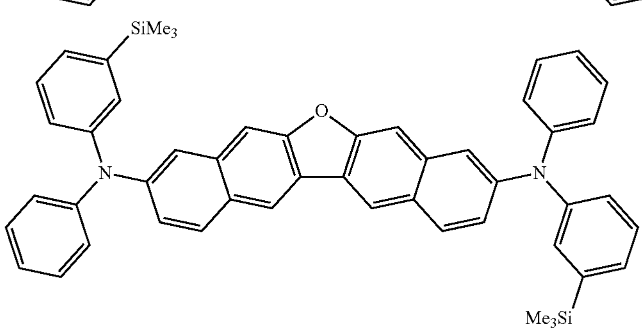
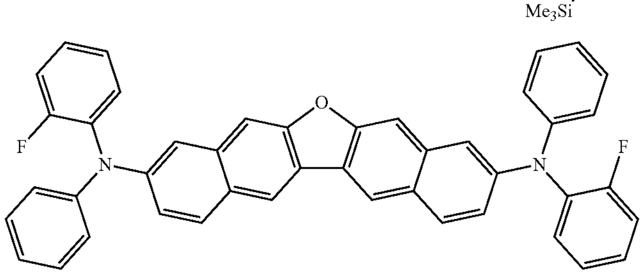

-continued
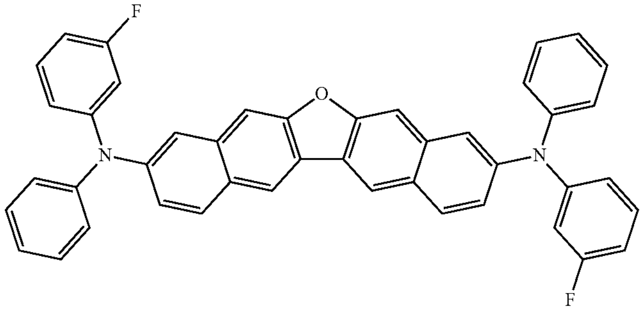
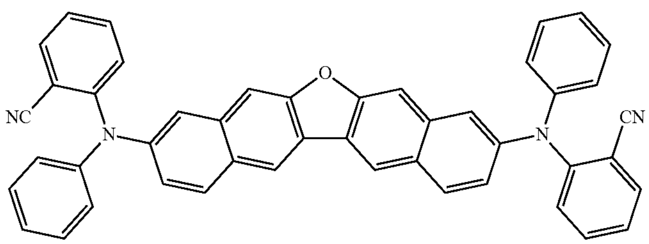
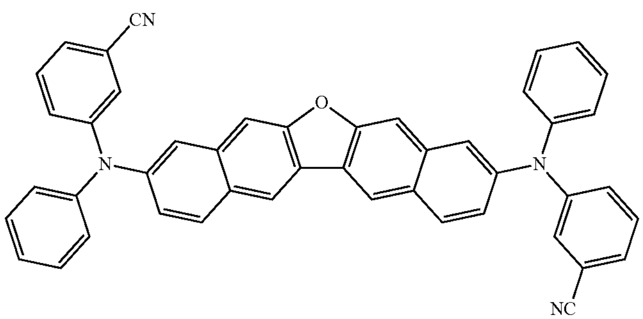
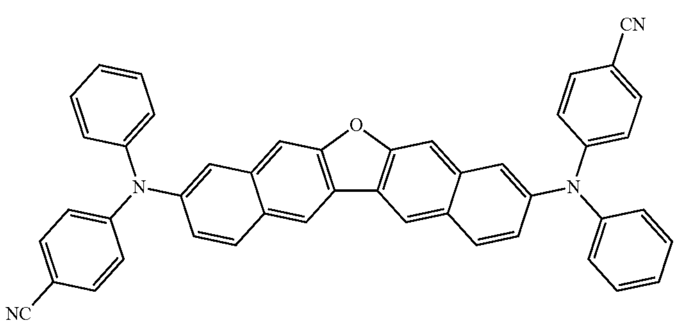
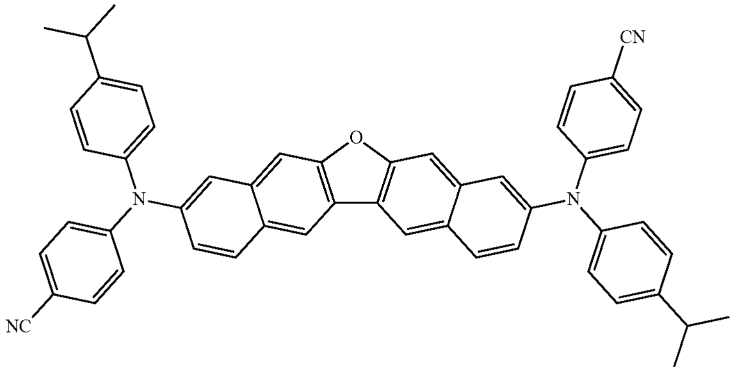

-continued
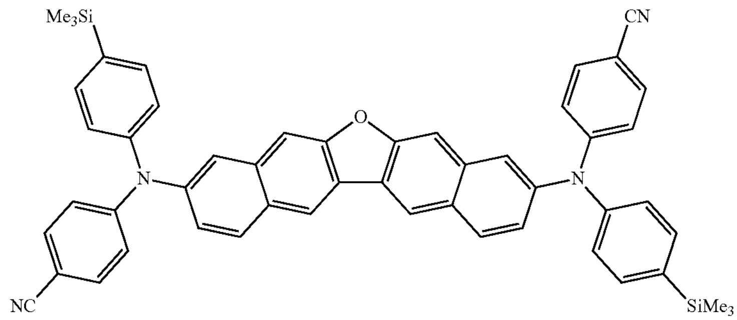
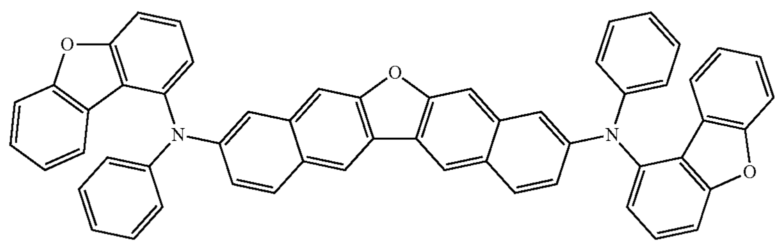
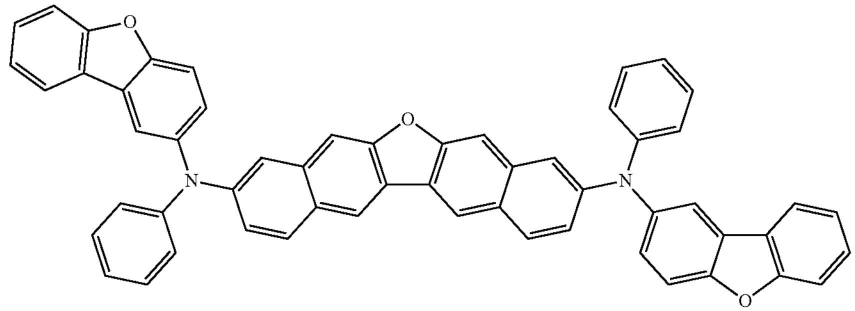
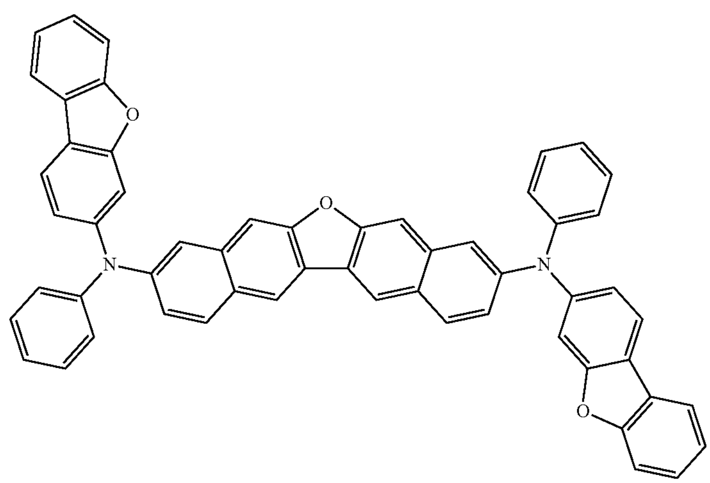
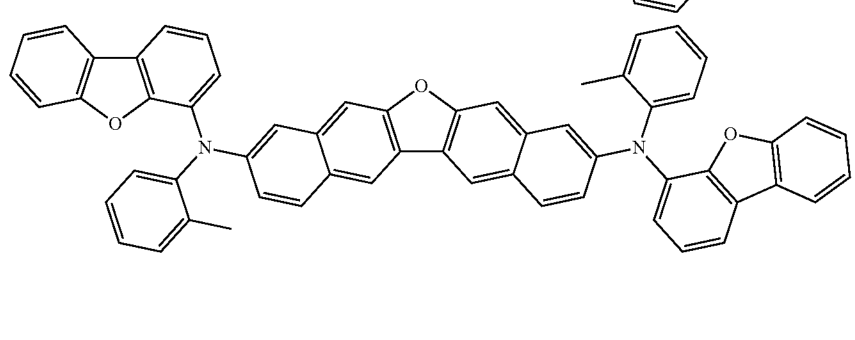

-continued
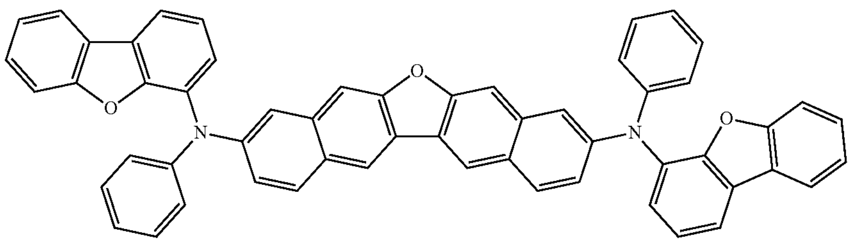
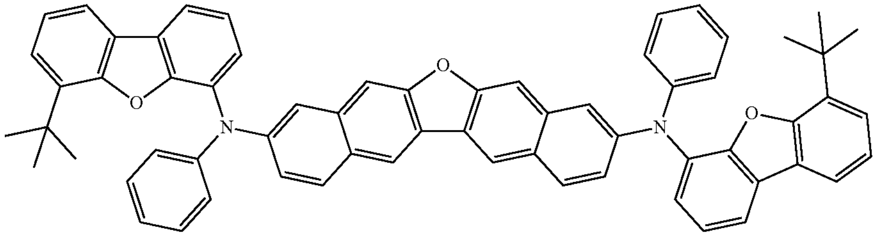
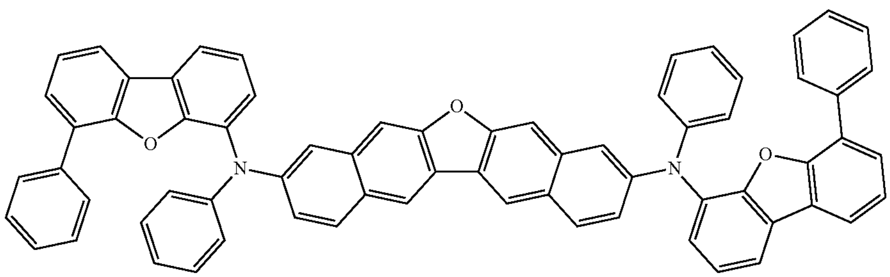
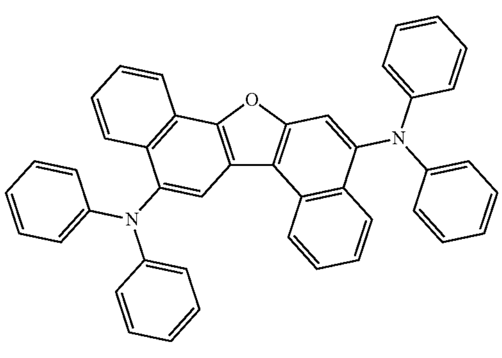
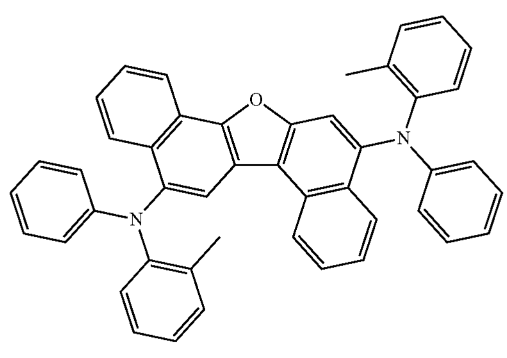
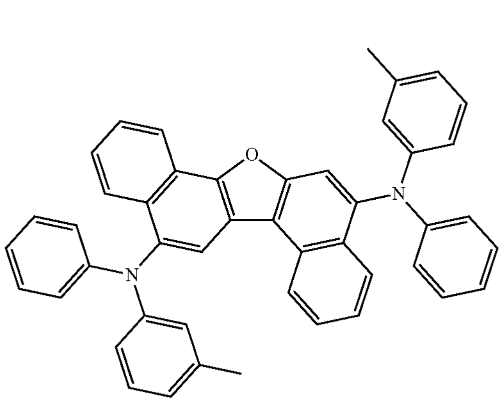
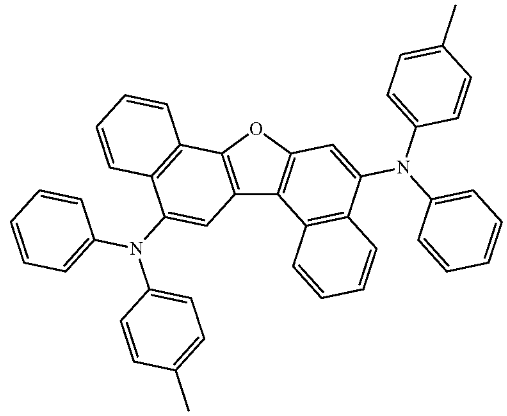

-continued
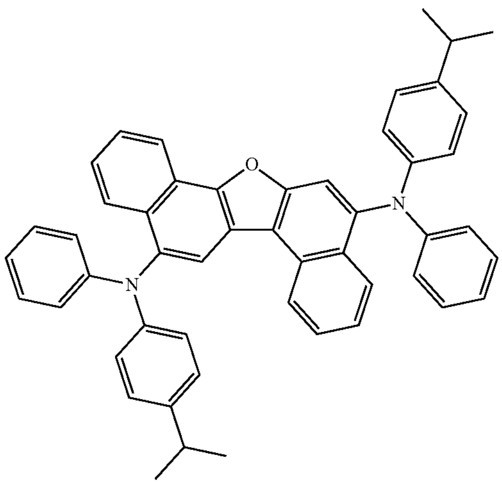
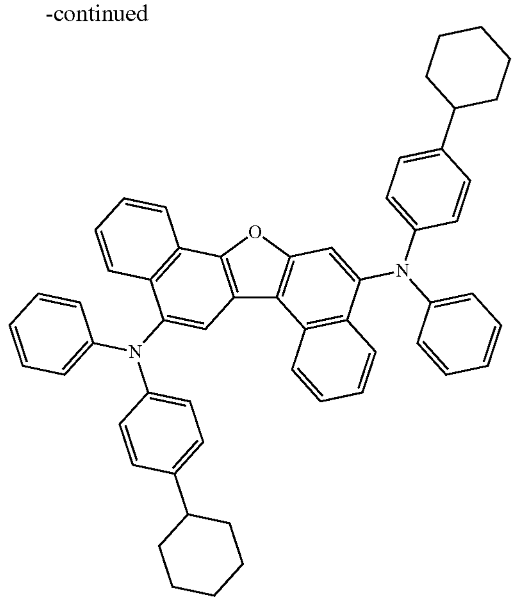
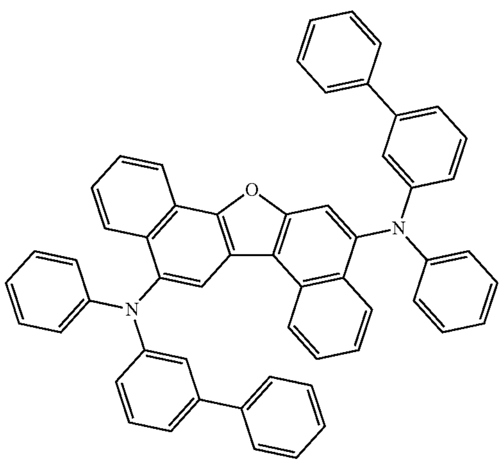
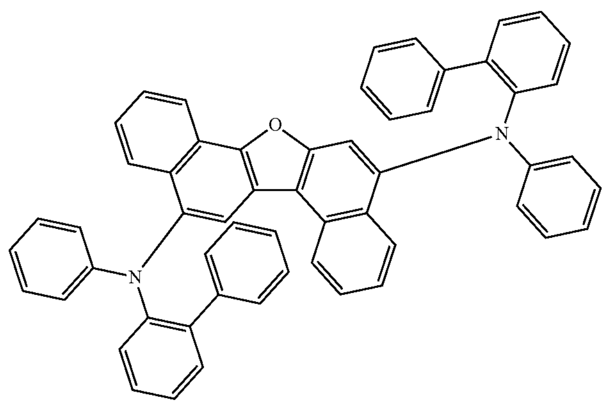
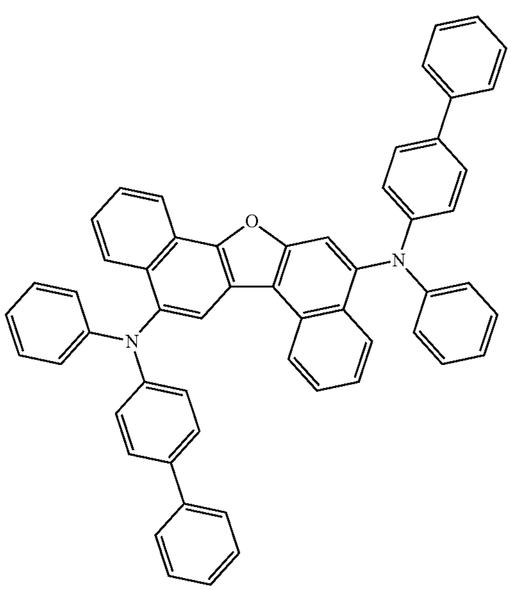
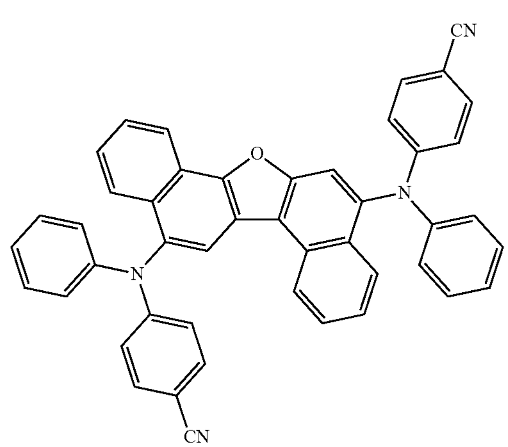

-continued
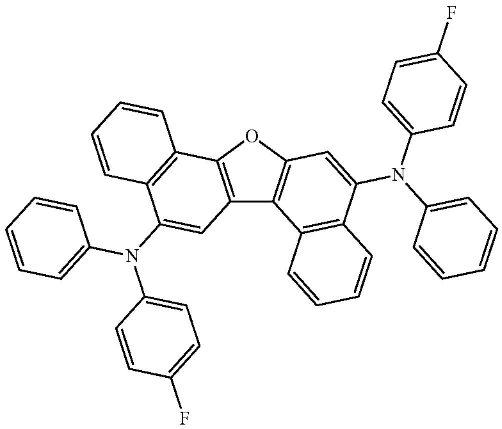
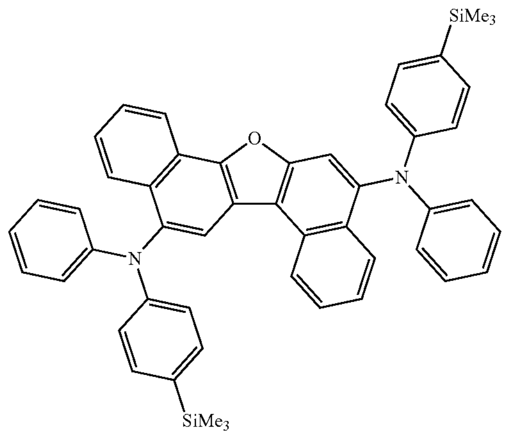
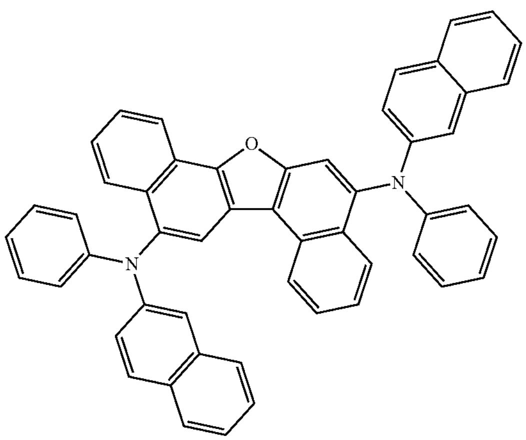
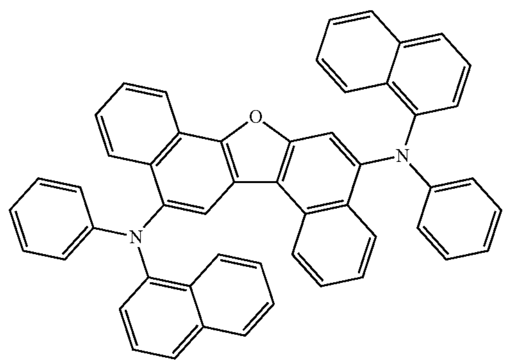
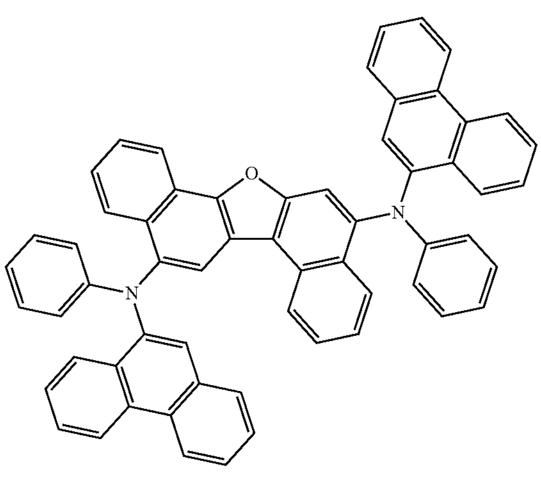
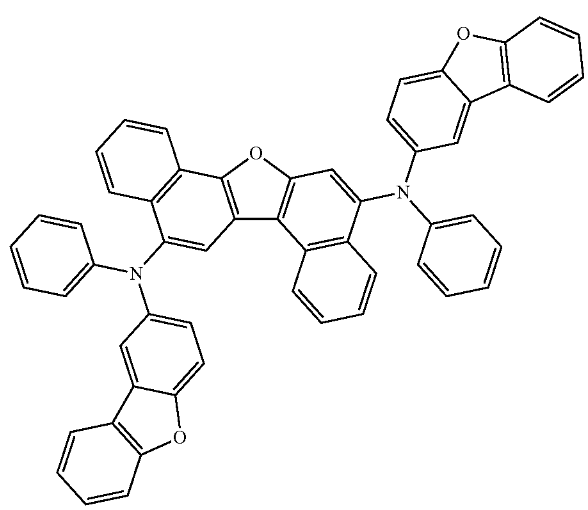

-continued
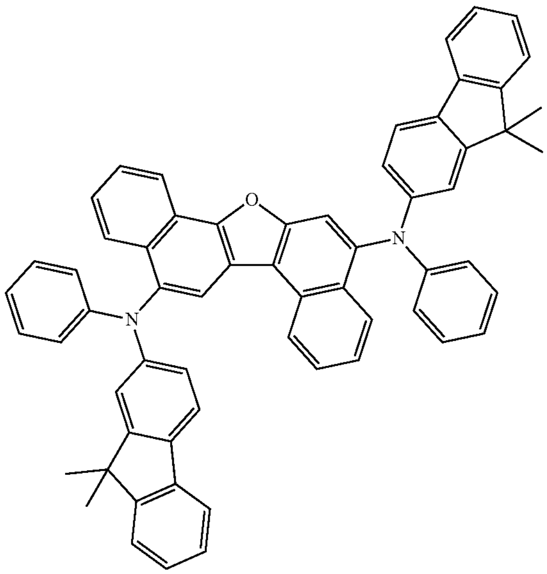
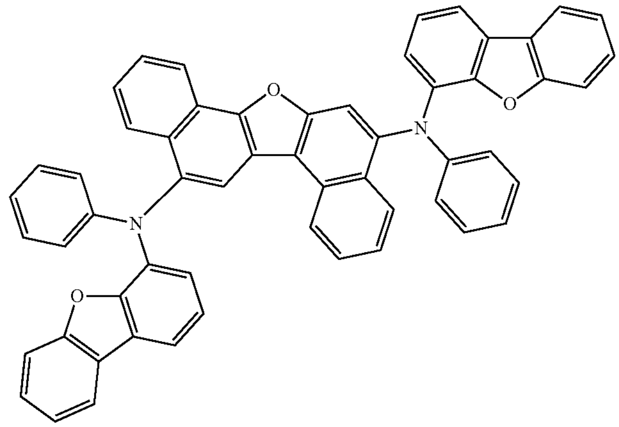
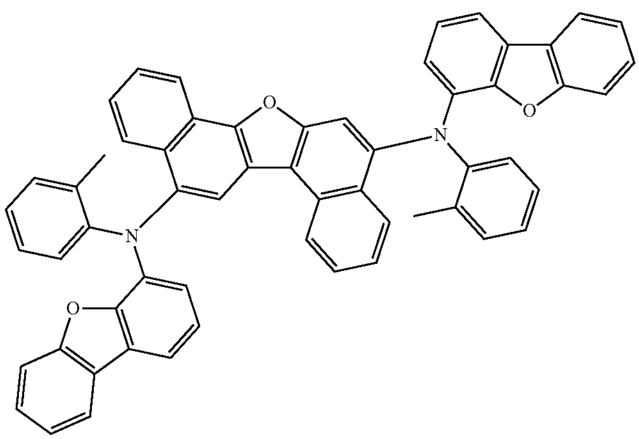
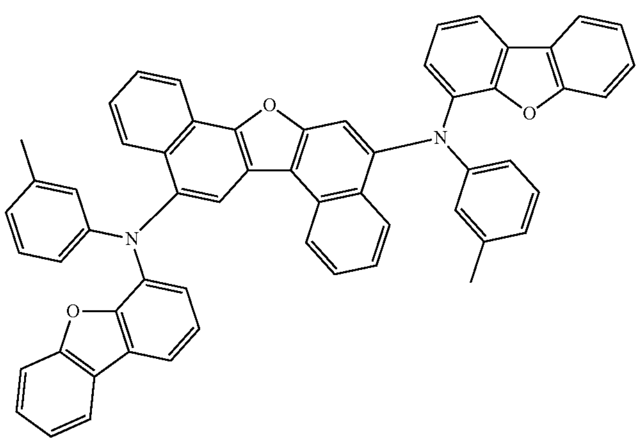

-continued
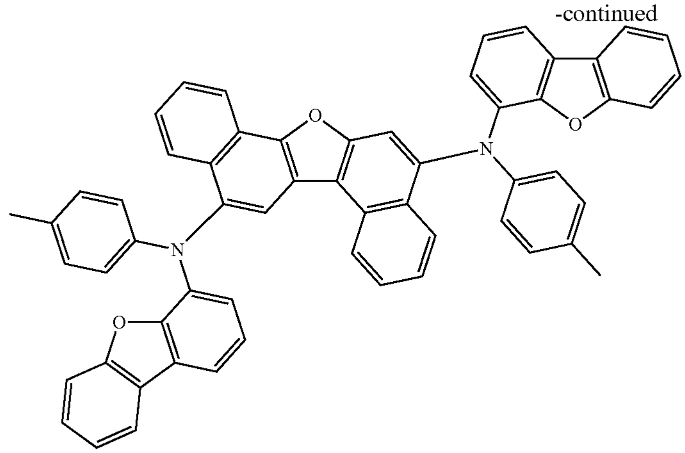
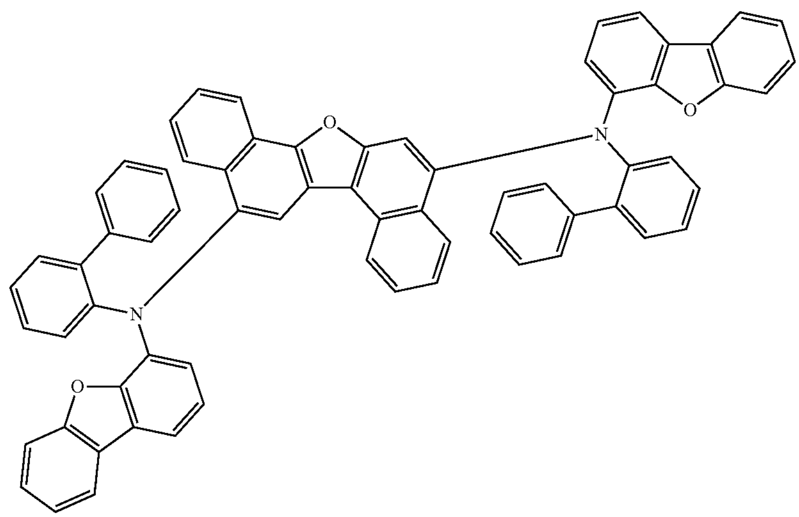
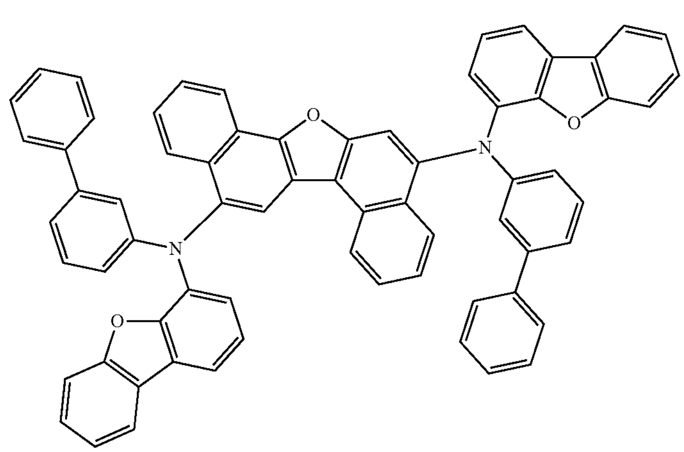

-continued
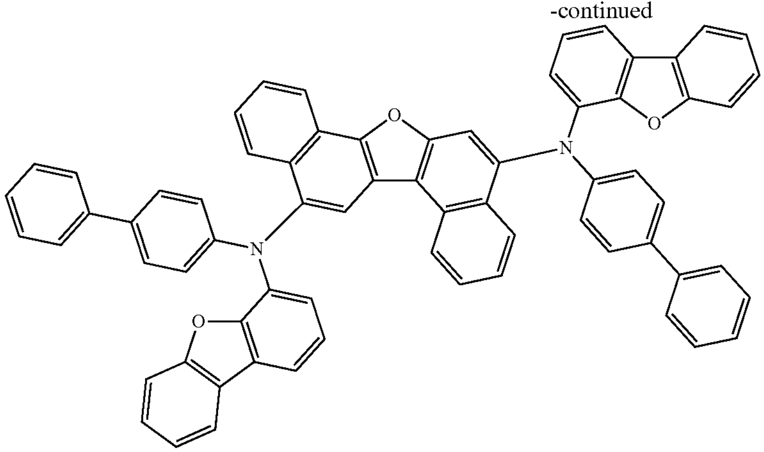
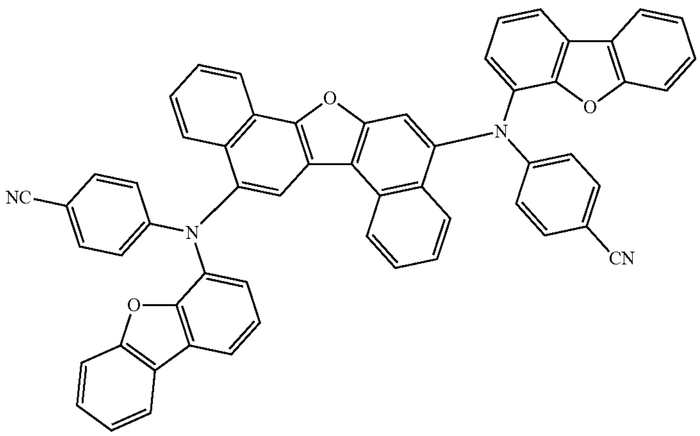
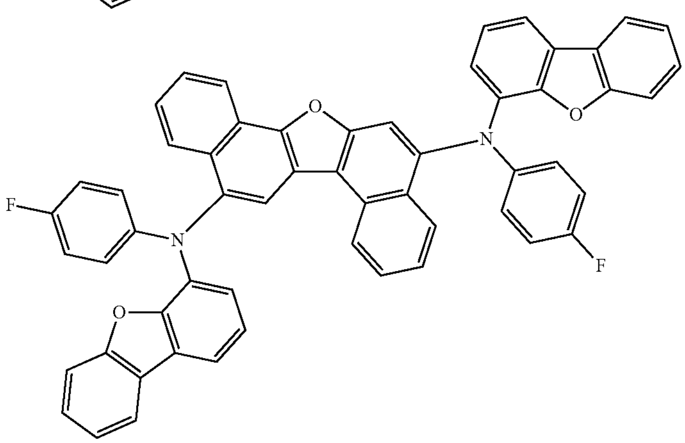
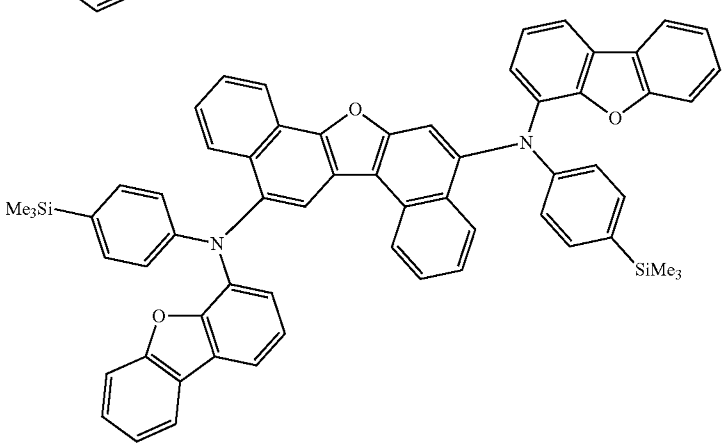

-continued
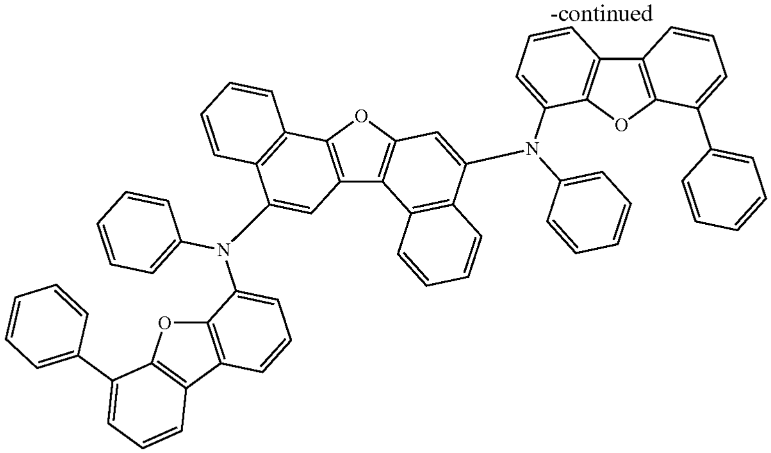
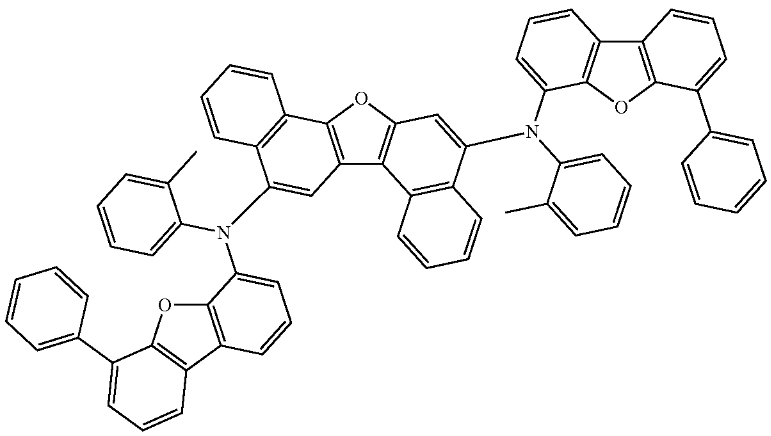
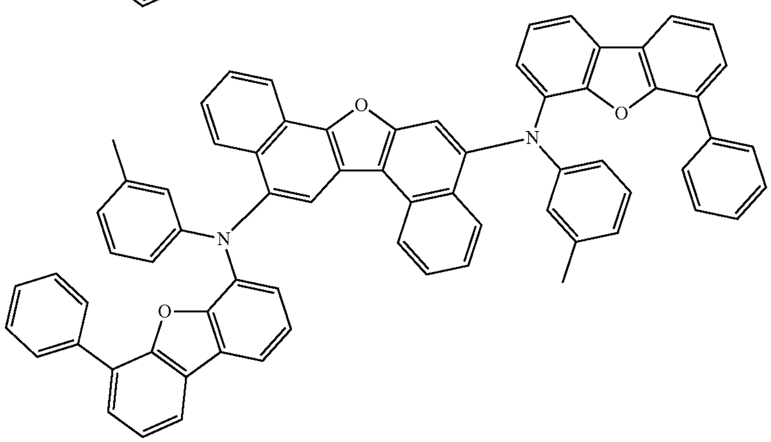
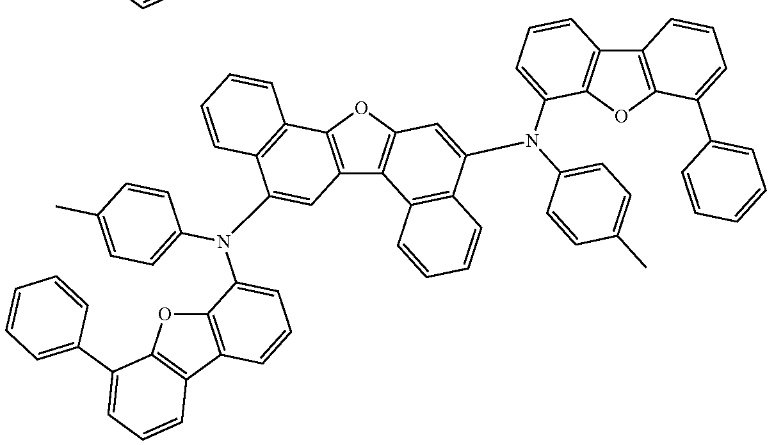

-continued
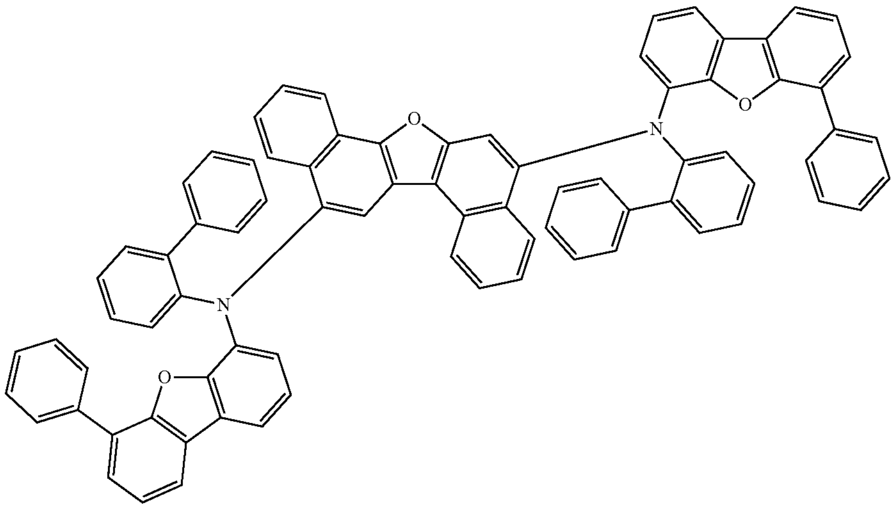
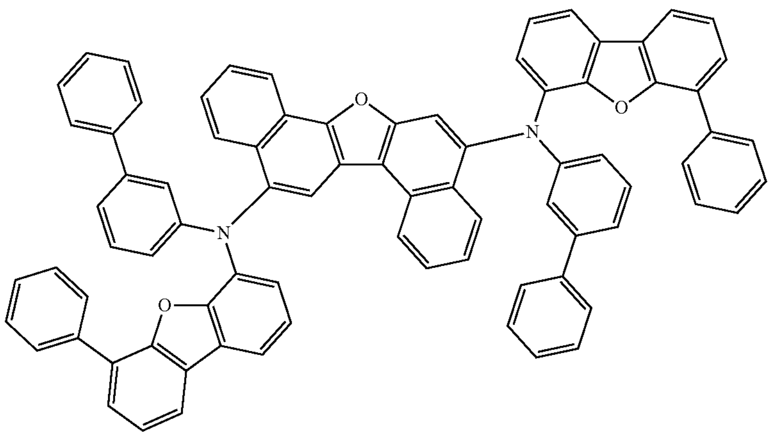
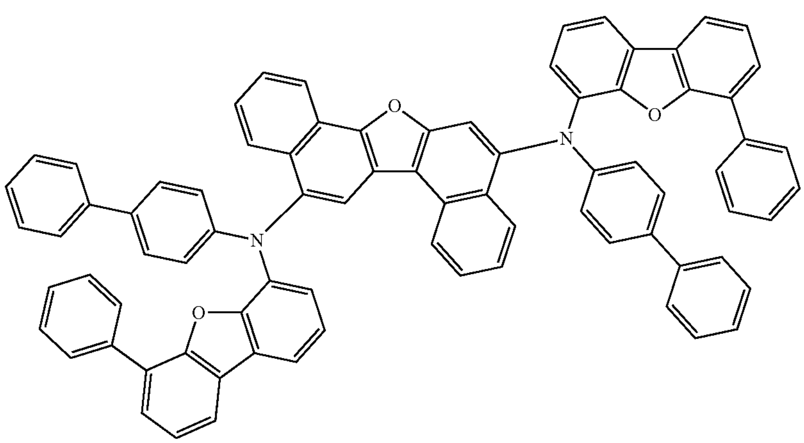

-continued
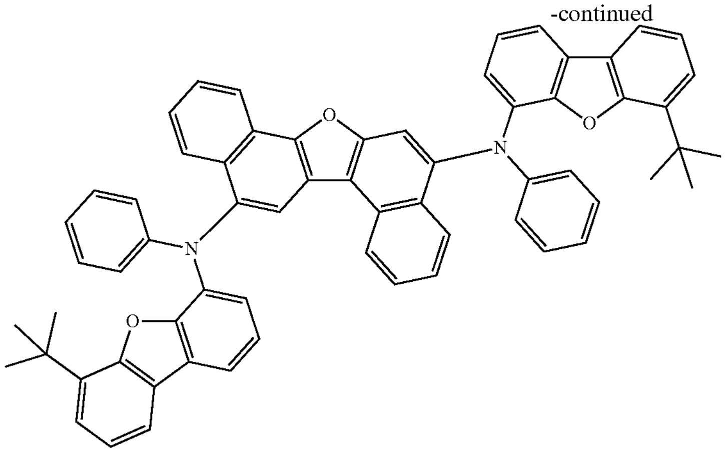
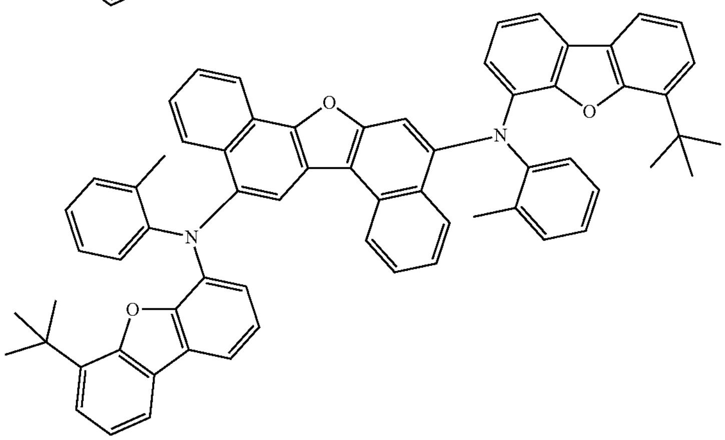
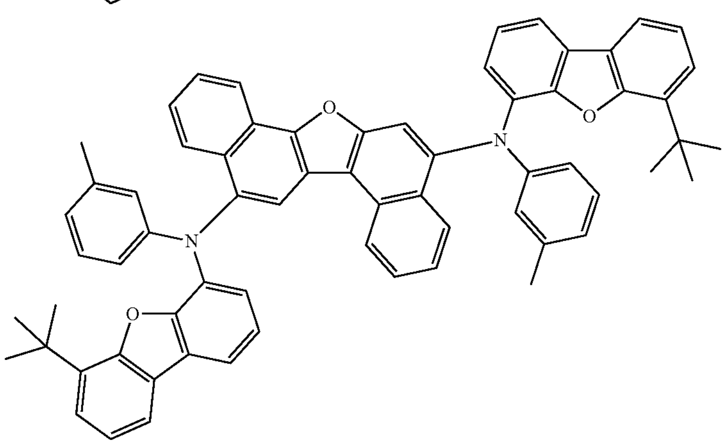
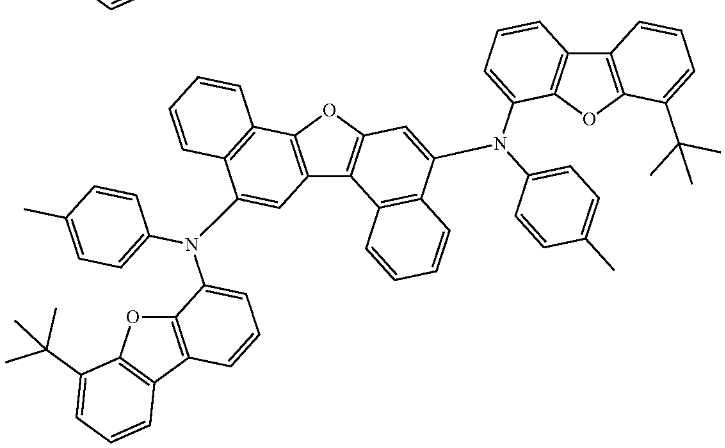

-continued
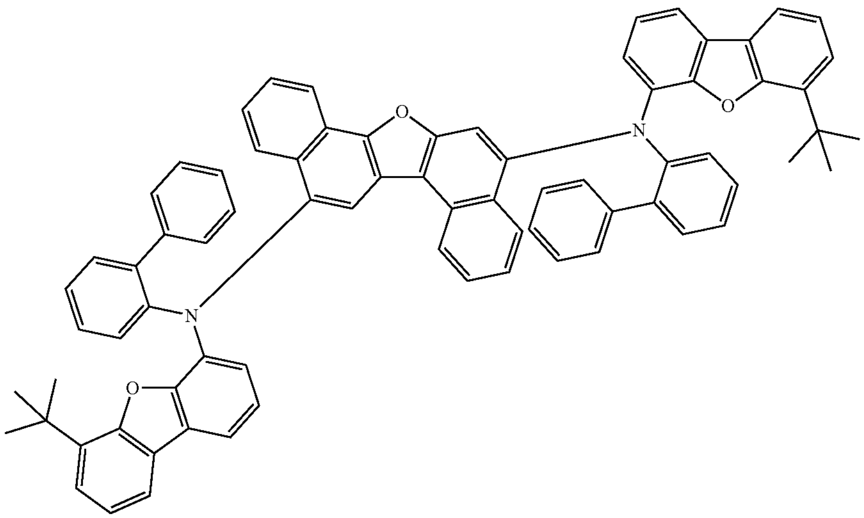
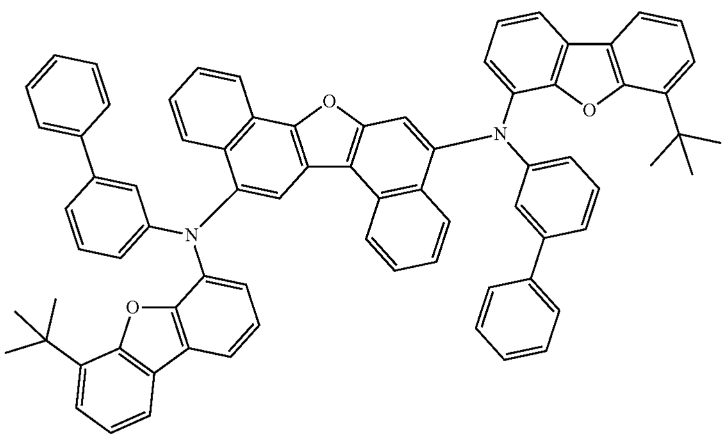
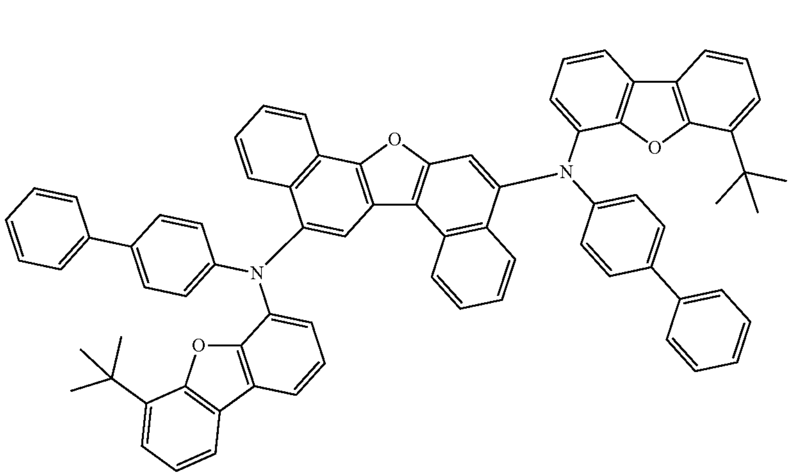

-continued
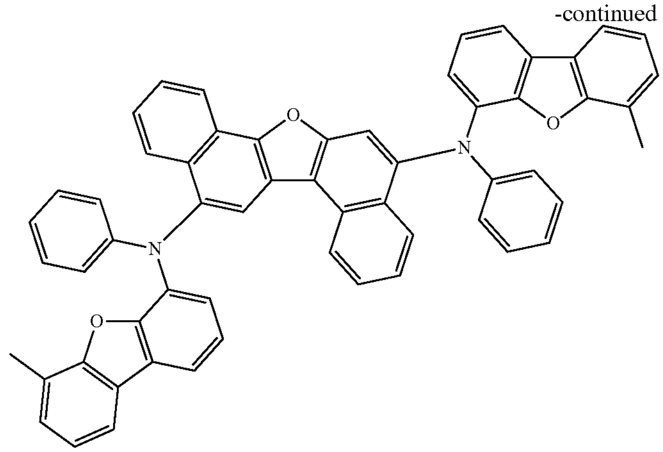
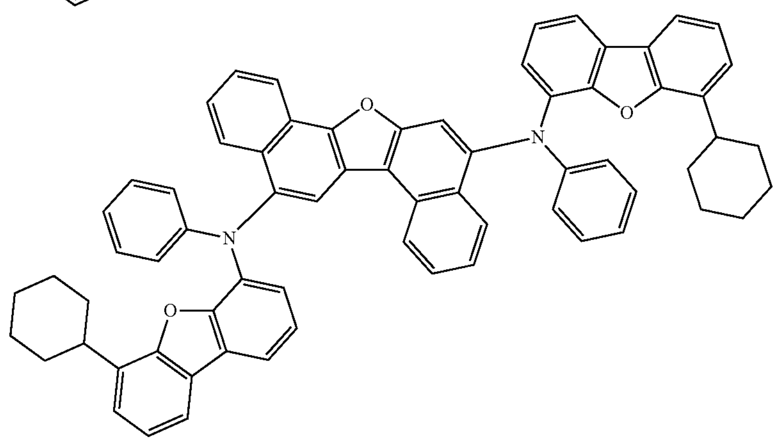
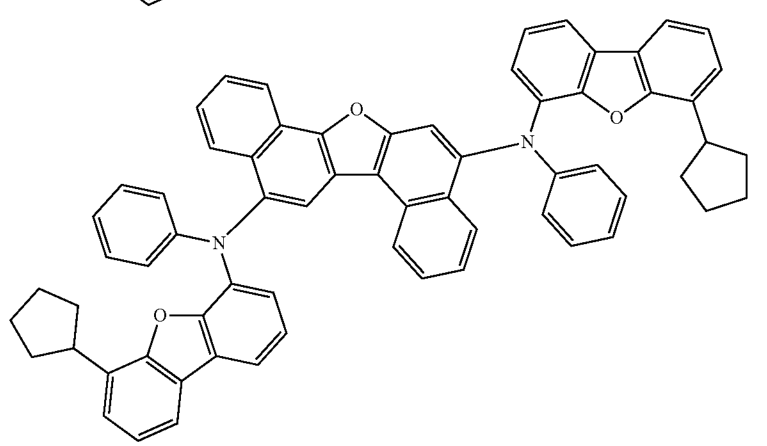
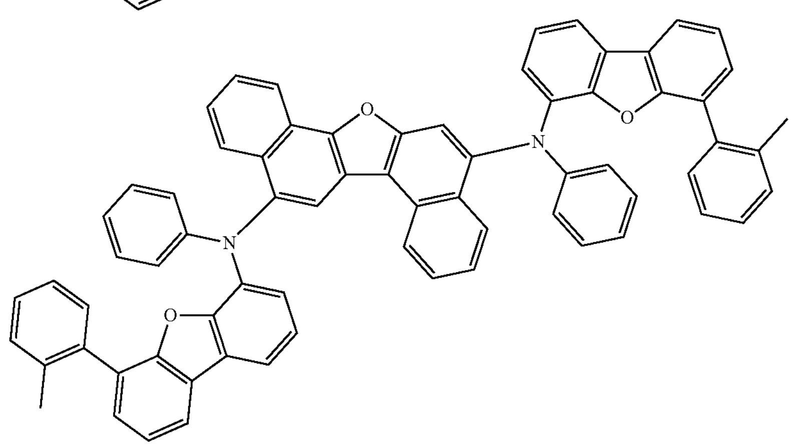

-continued
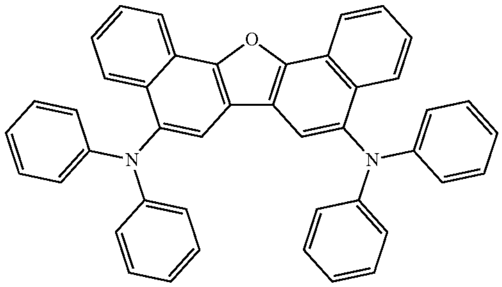
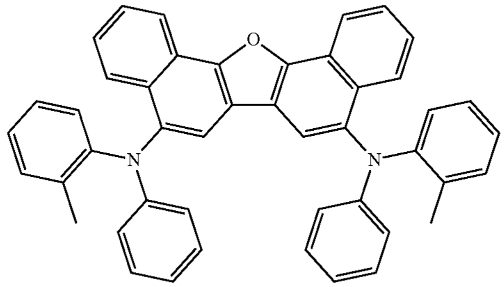
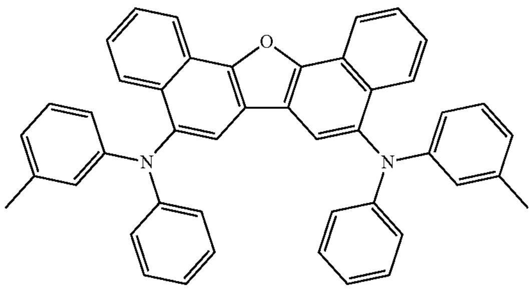
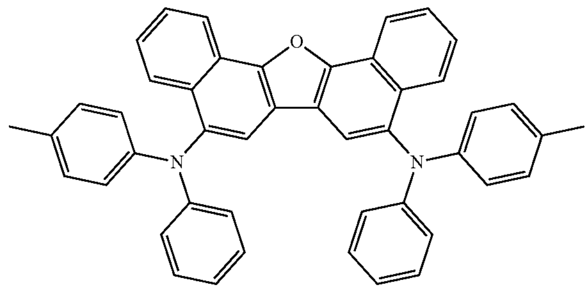
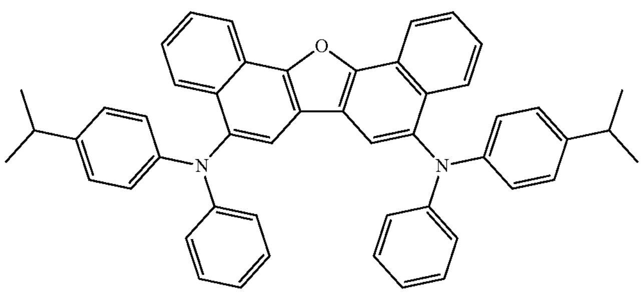
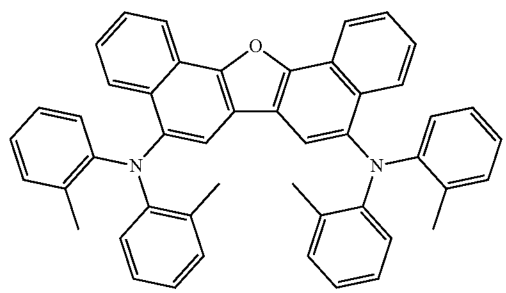
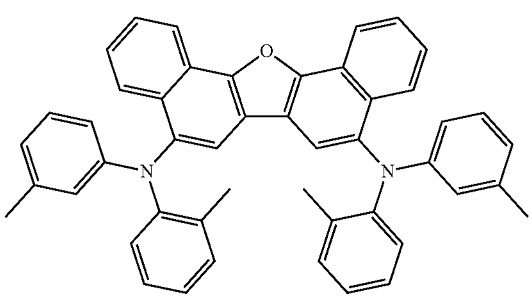
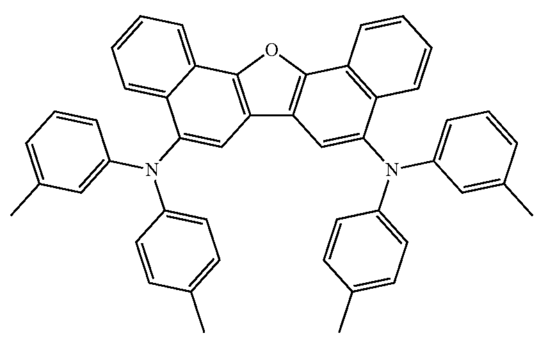
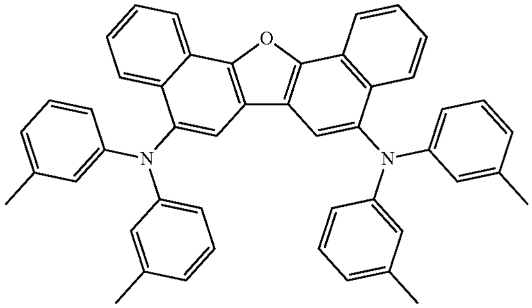
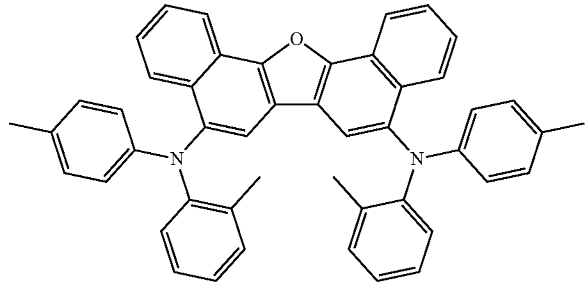

-continued
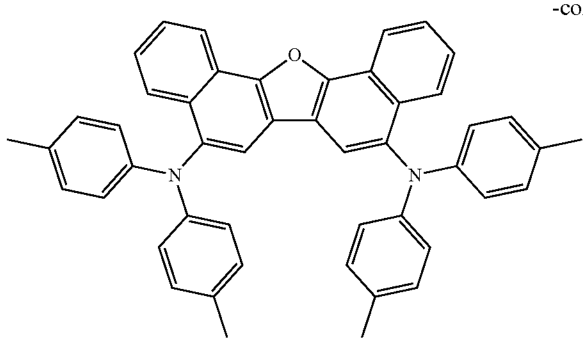
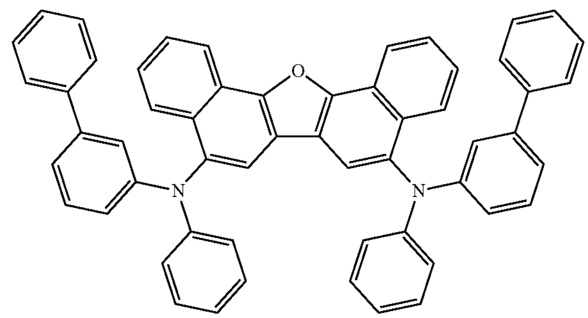
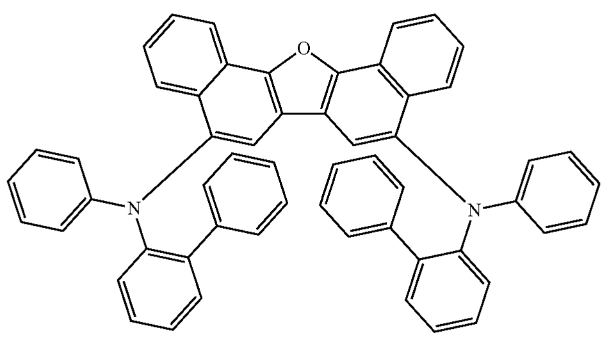
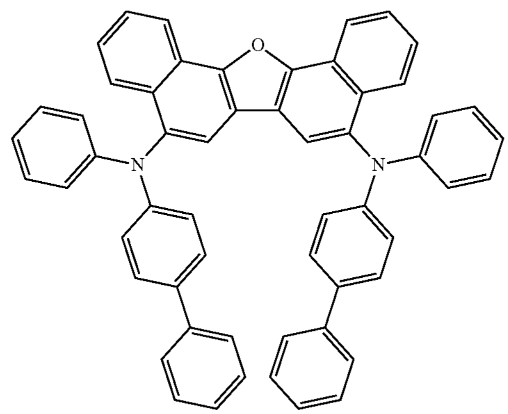
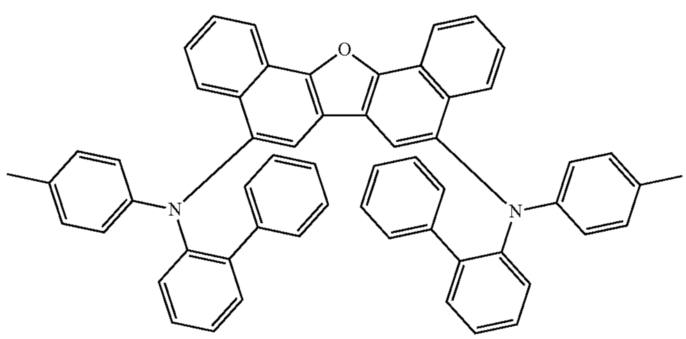
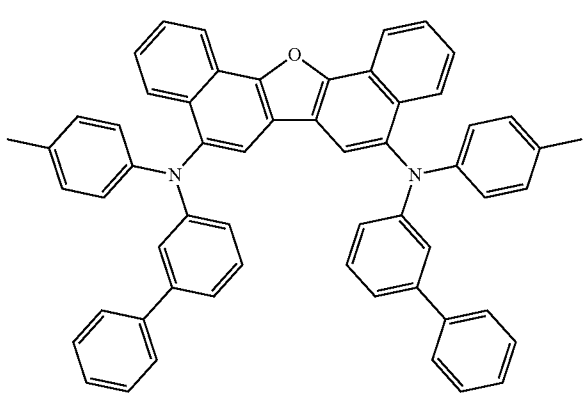
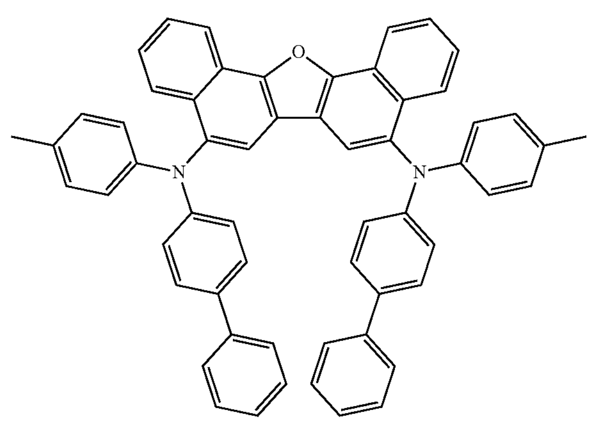

-continued
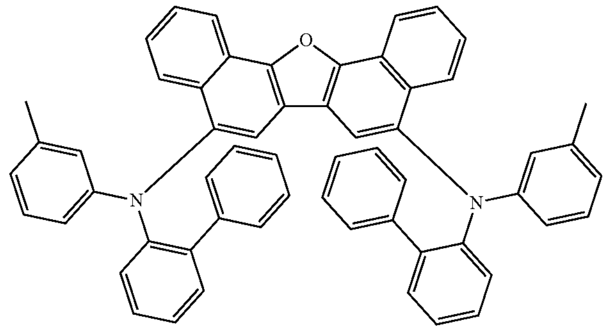
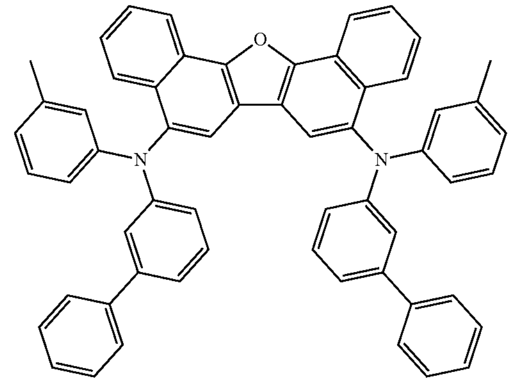
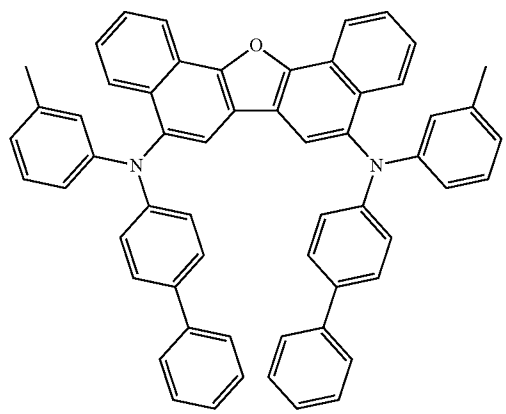
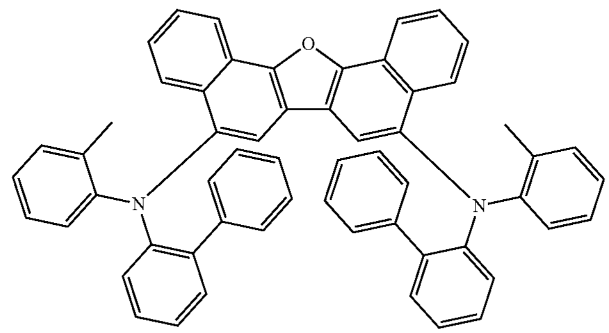
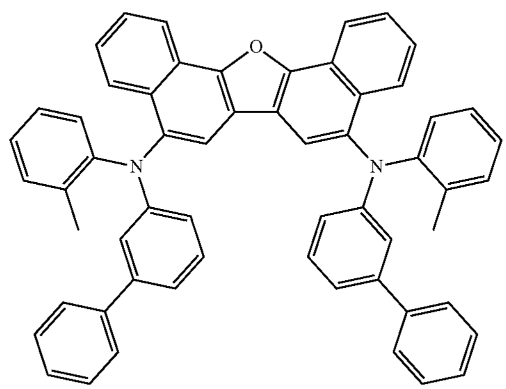
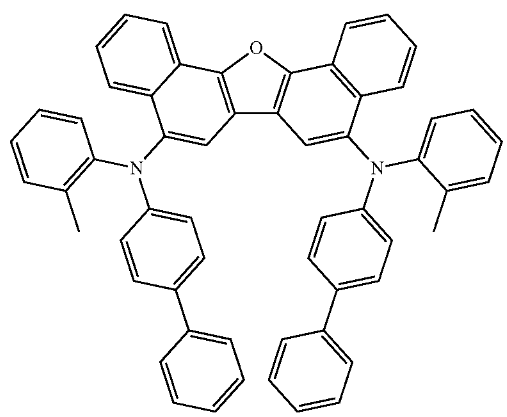
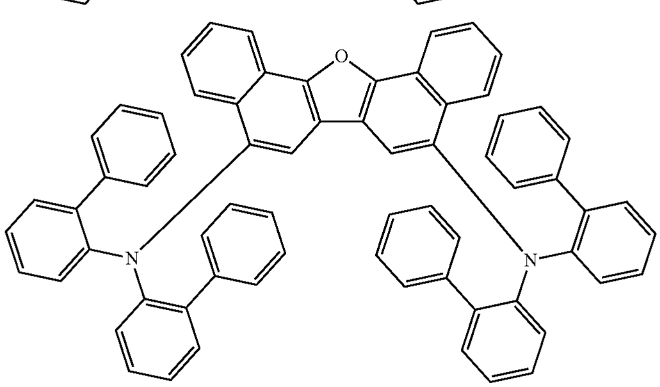

-continued
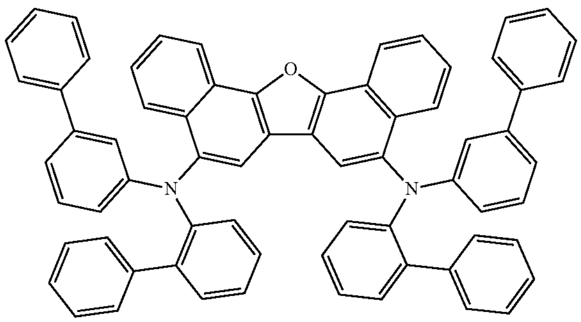
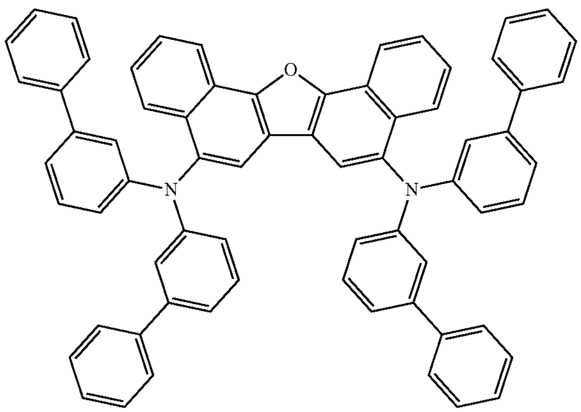
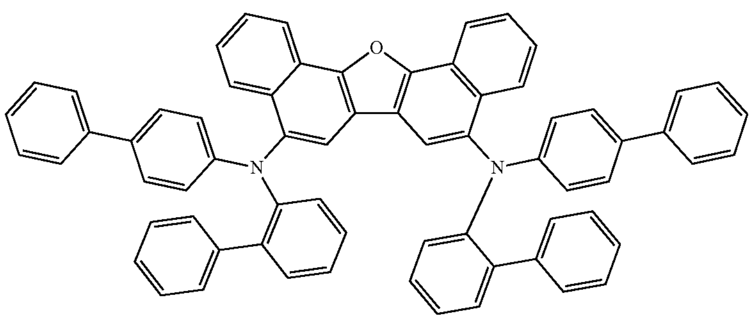
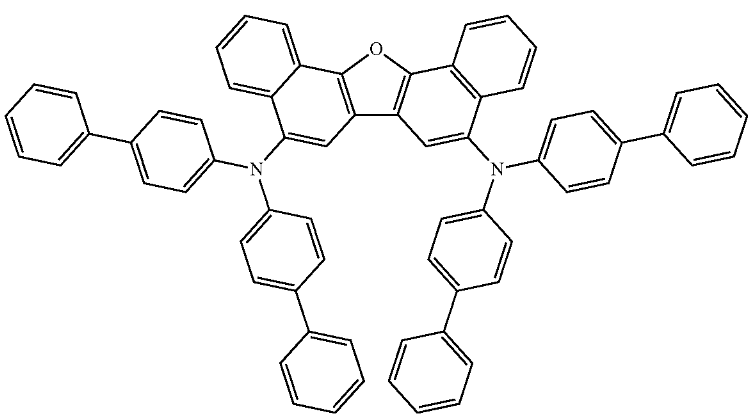
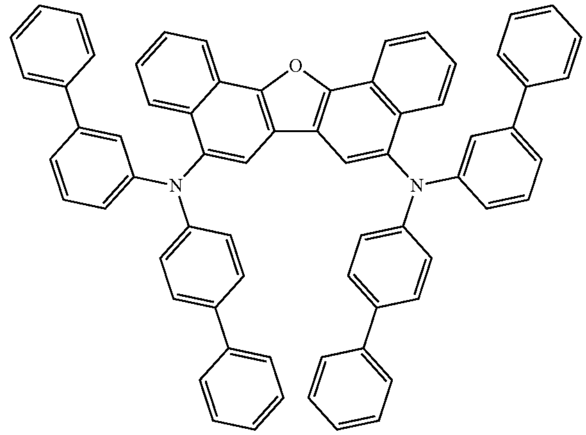

-continued
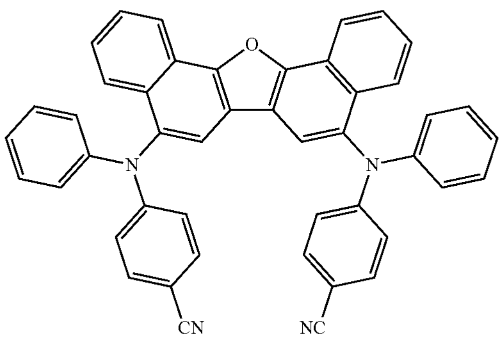
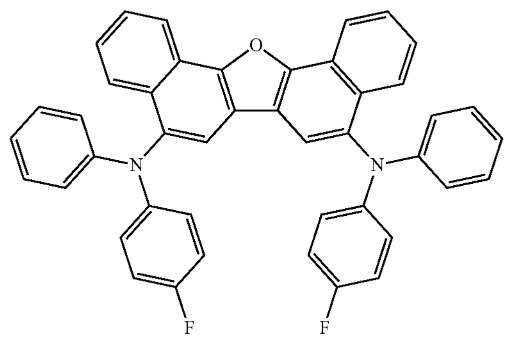
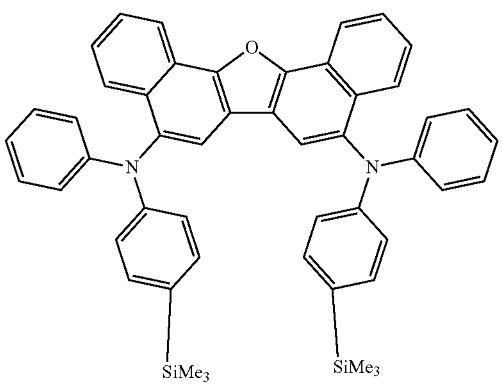
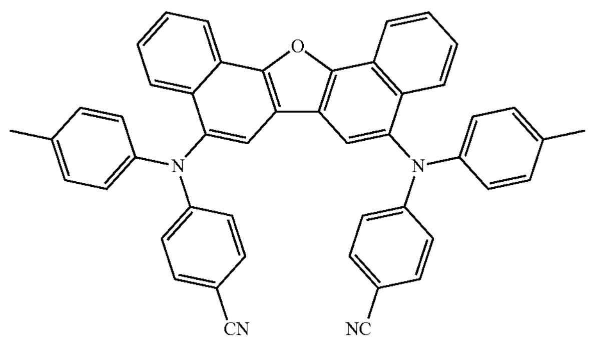
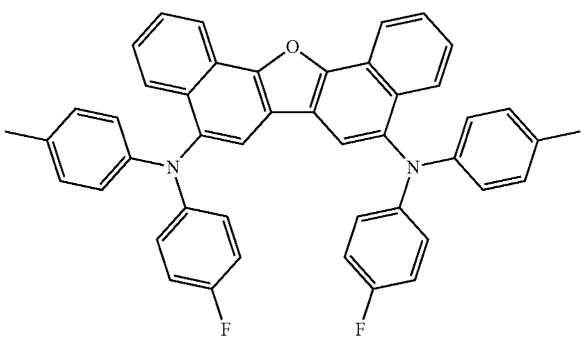
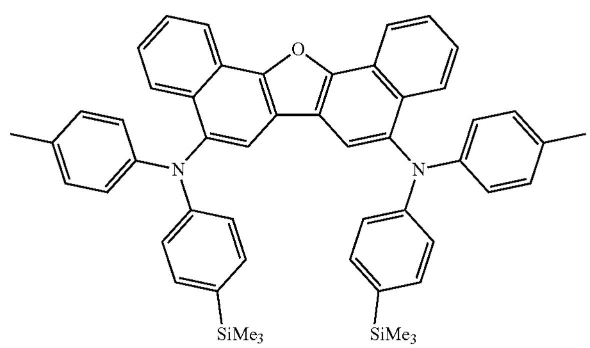
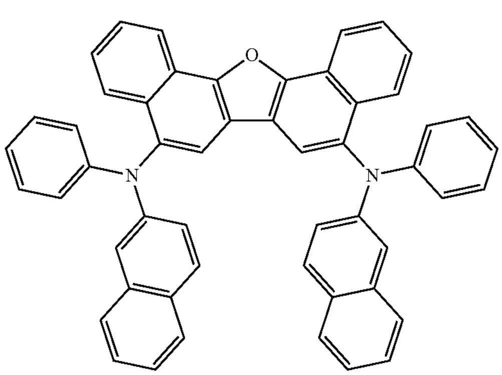
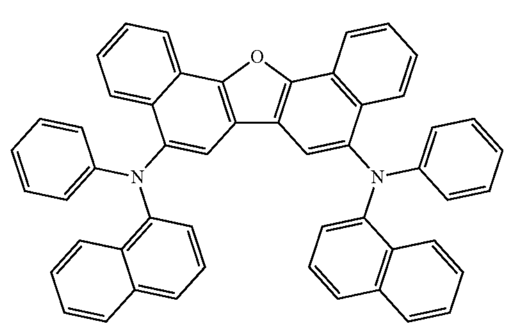

-continued
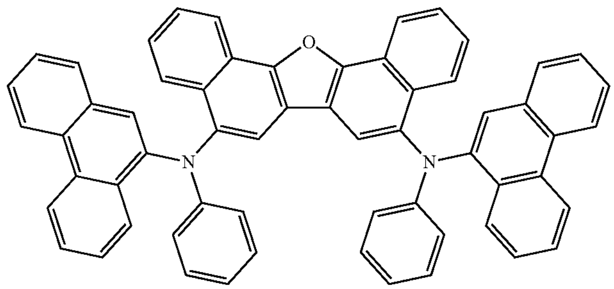
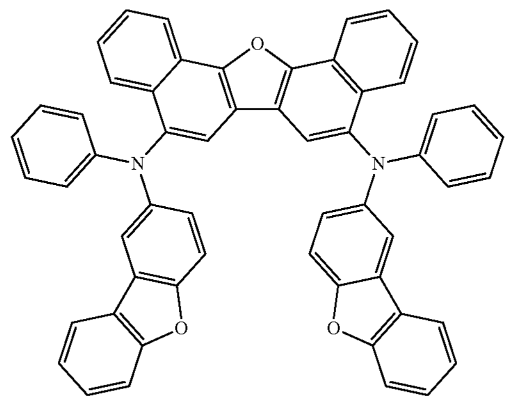
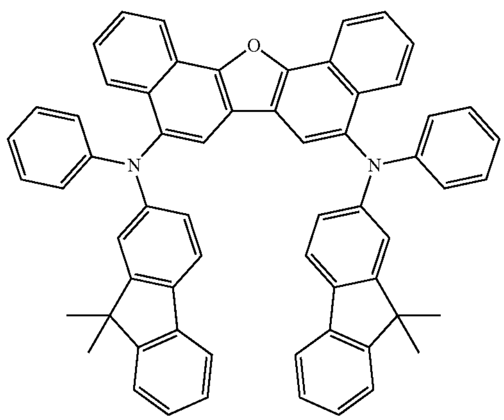
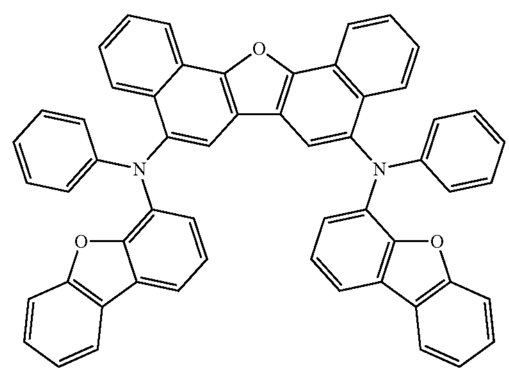
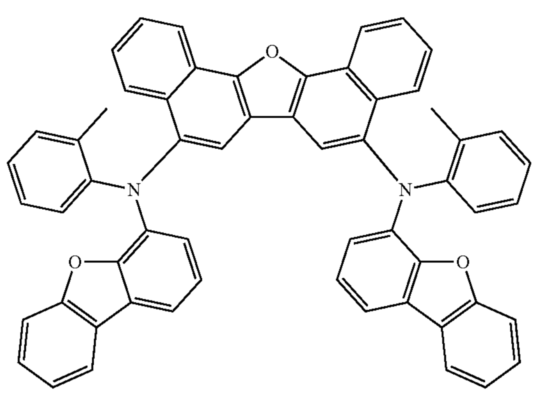
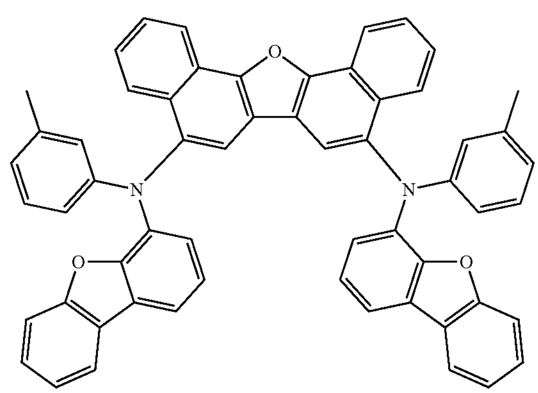
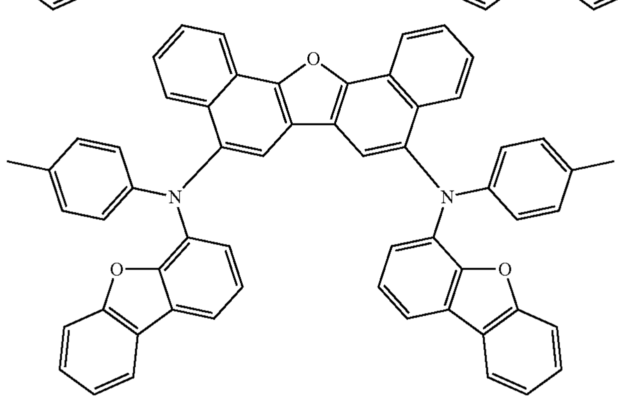

-continued
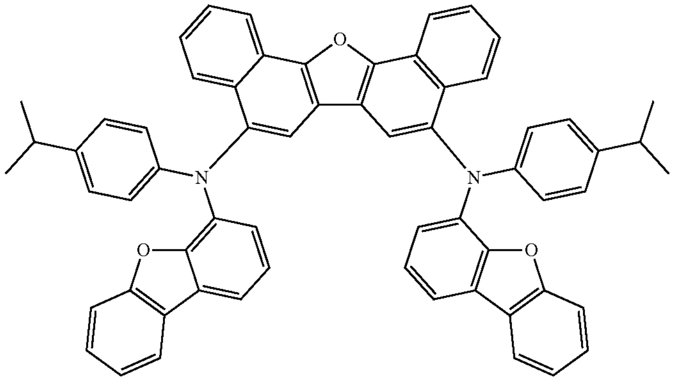
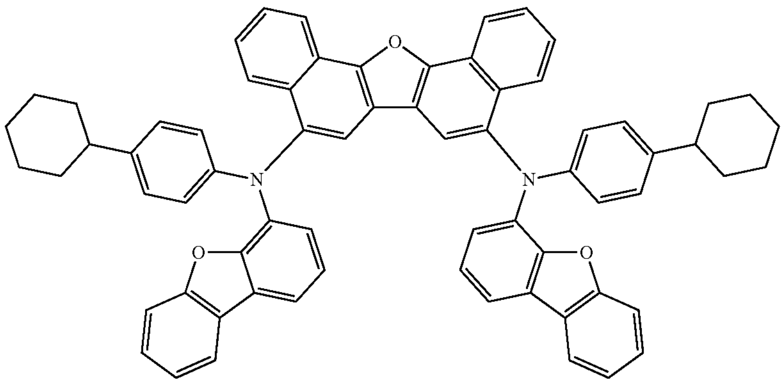
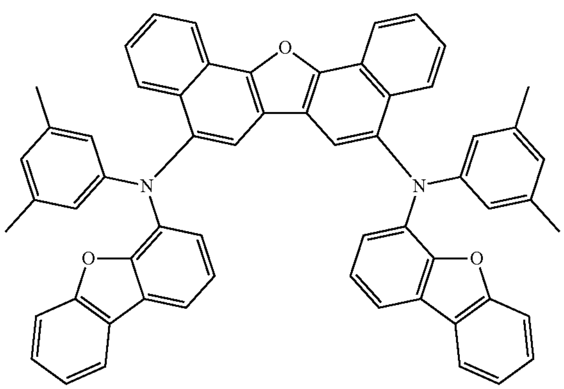
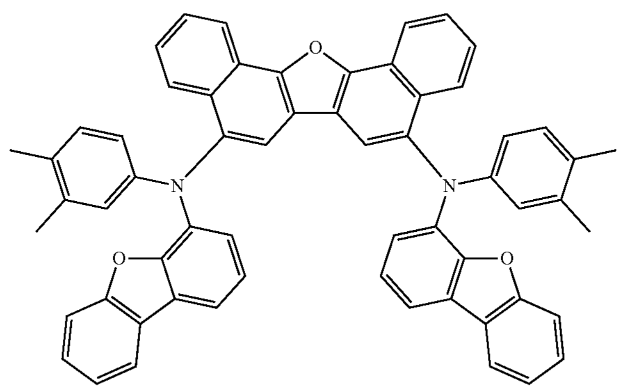
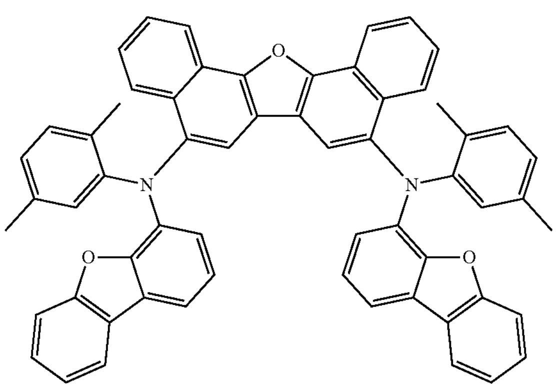

-continued
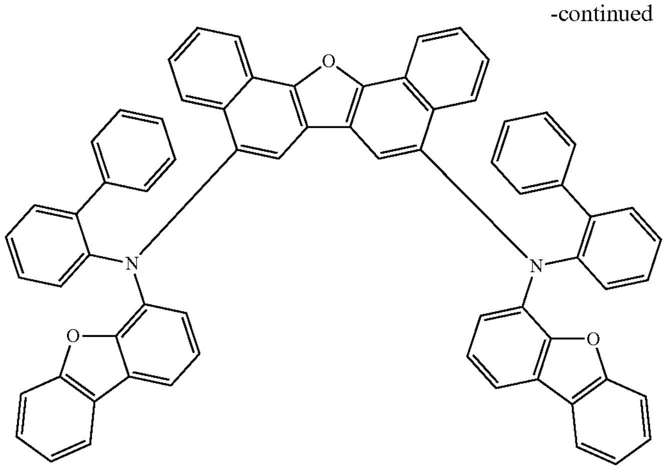
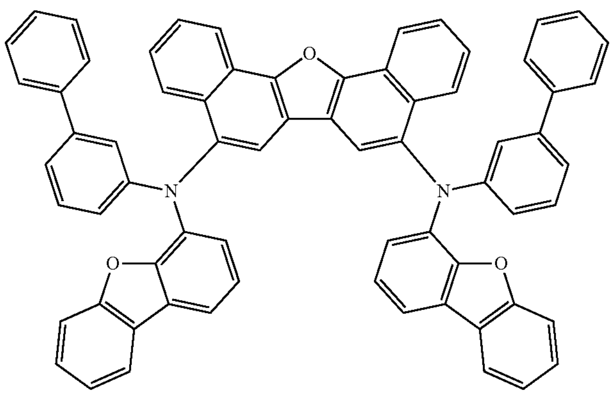
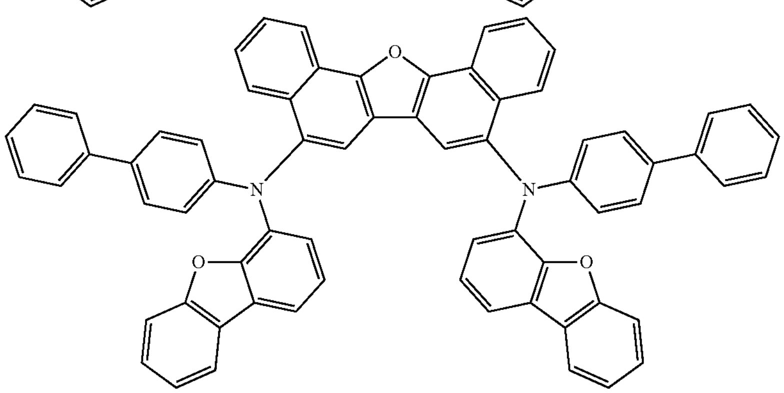
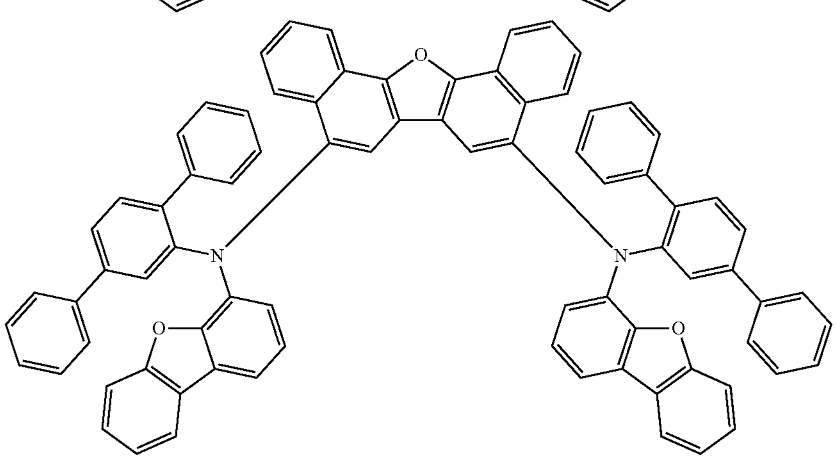

-continued
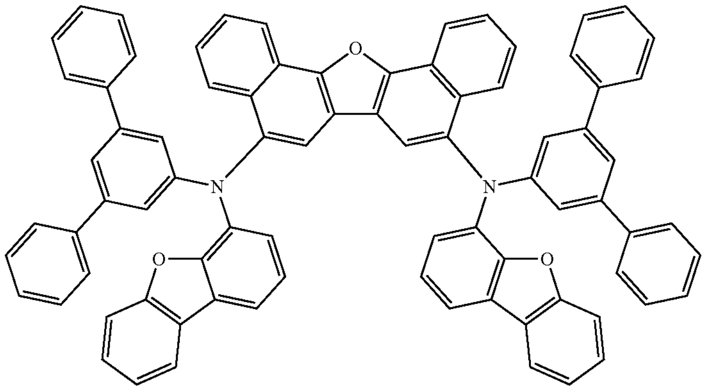
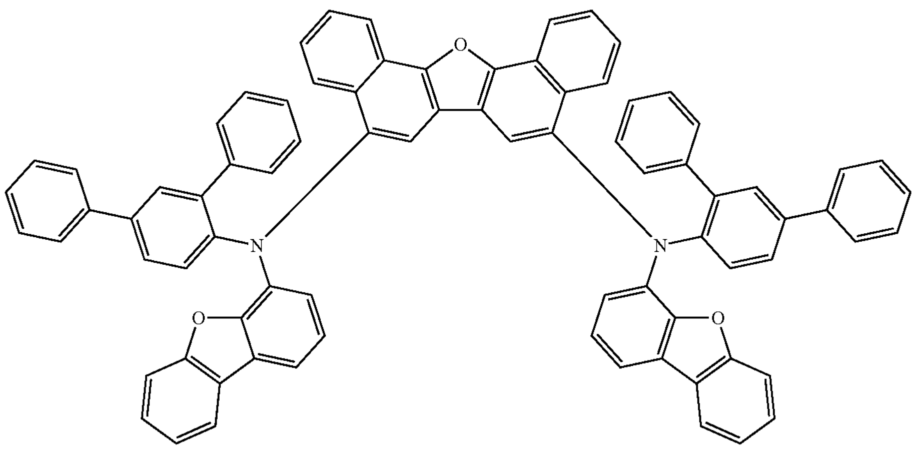
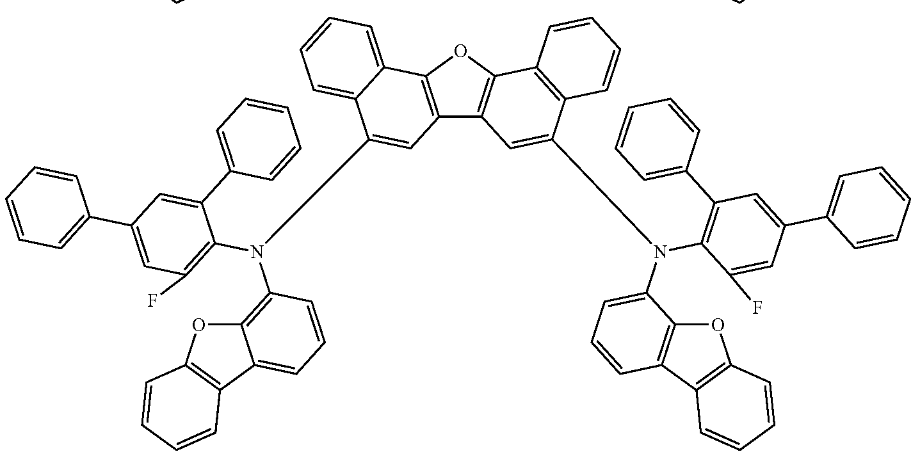
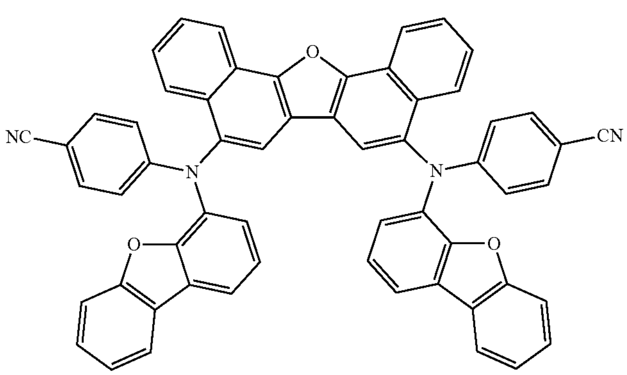

-continued
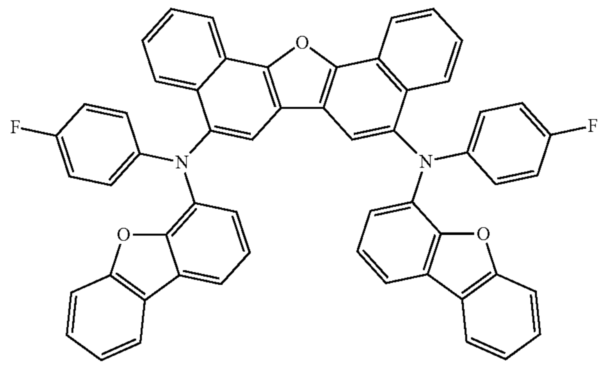
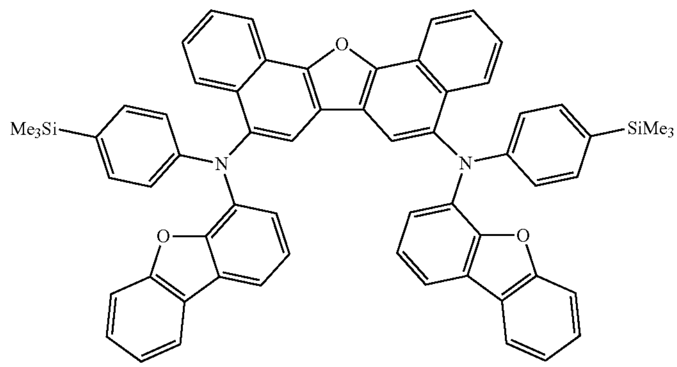
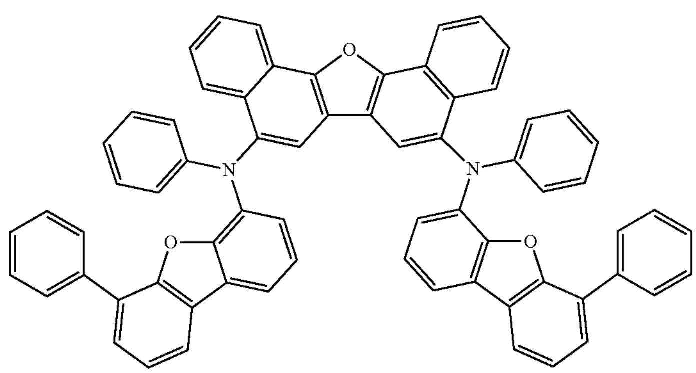
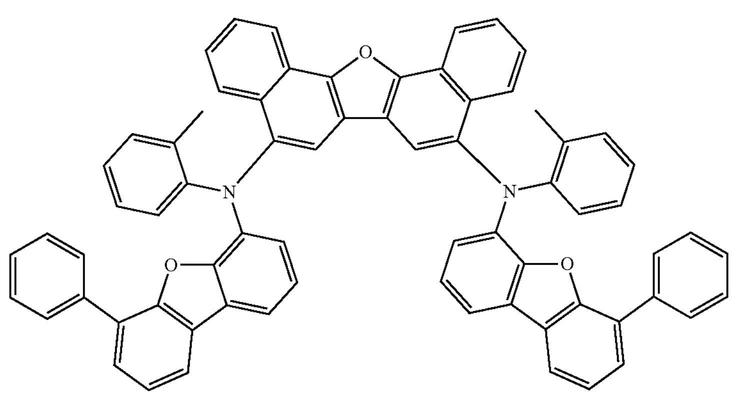

-continued
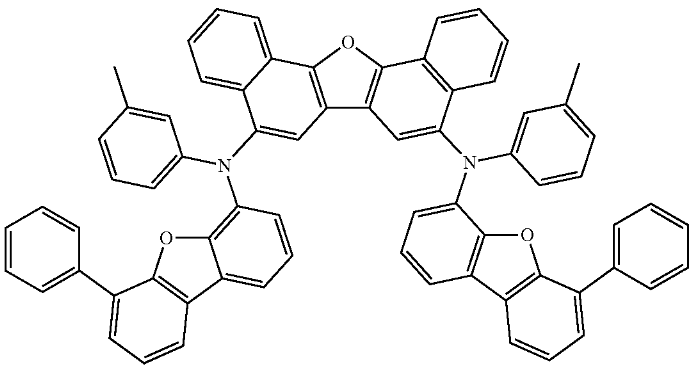
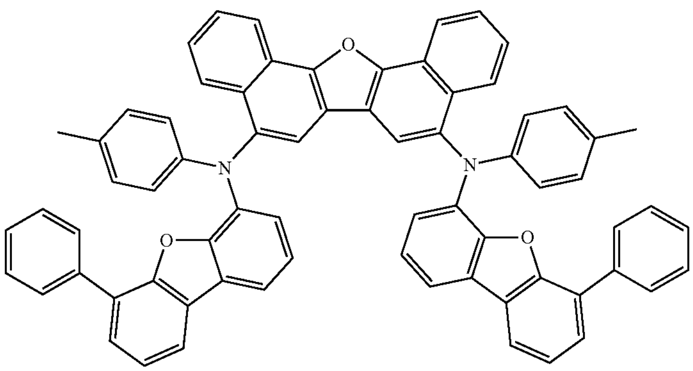
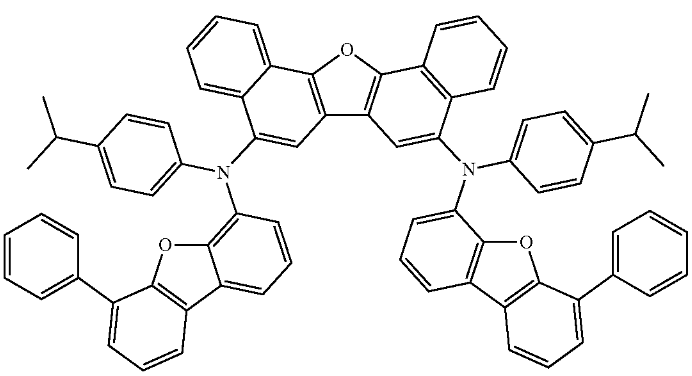
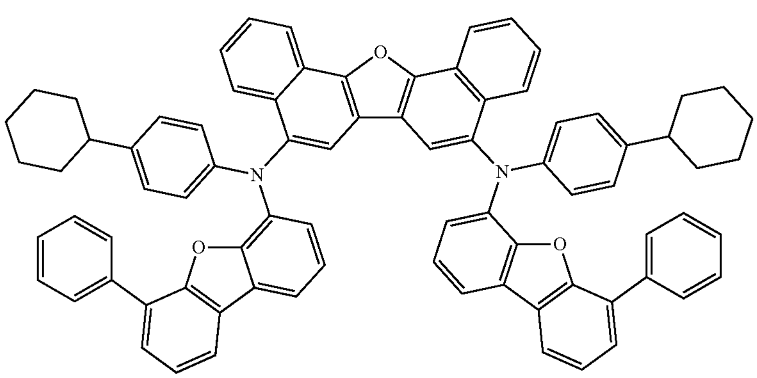

-continued
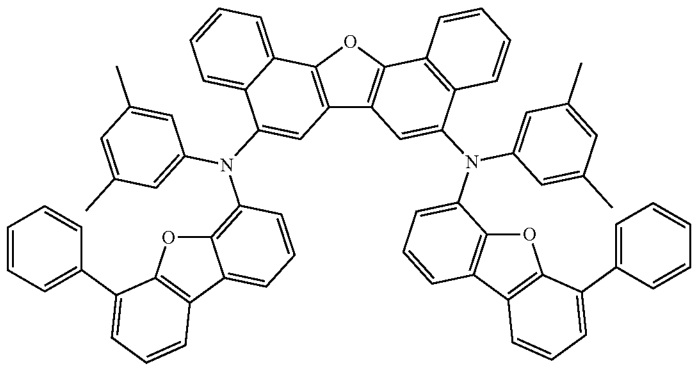
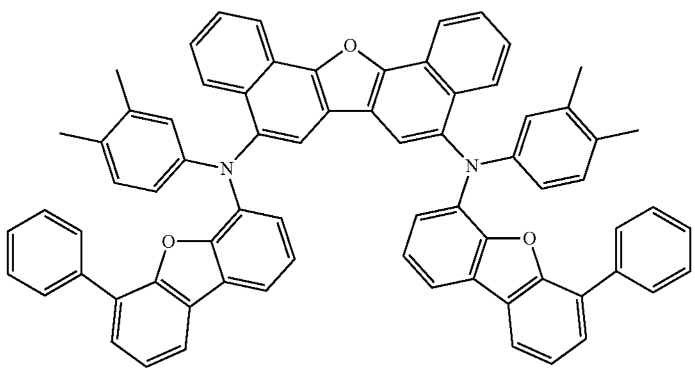
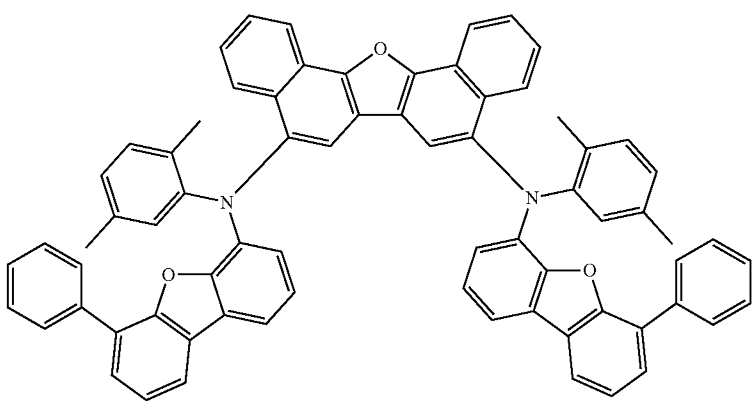
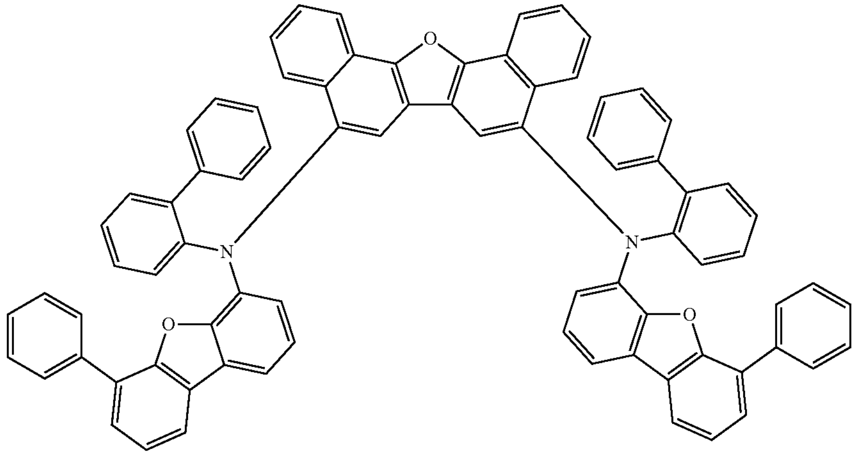

-continued
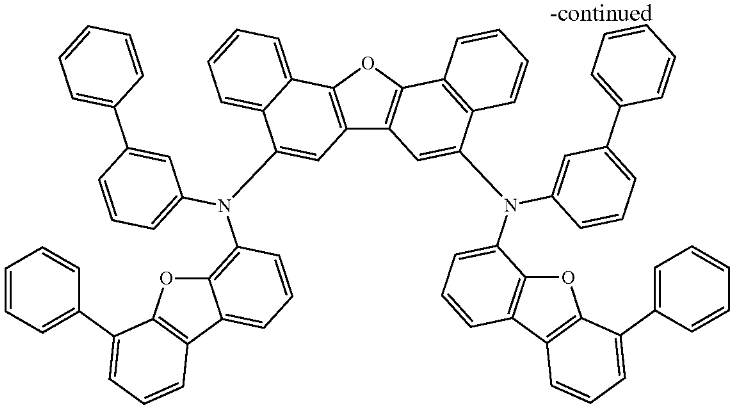
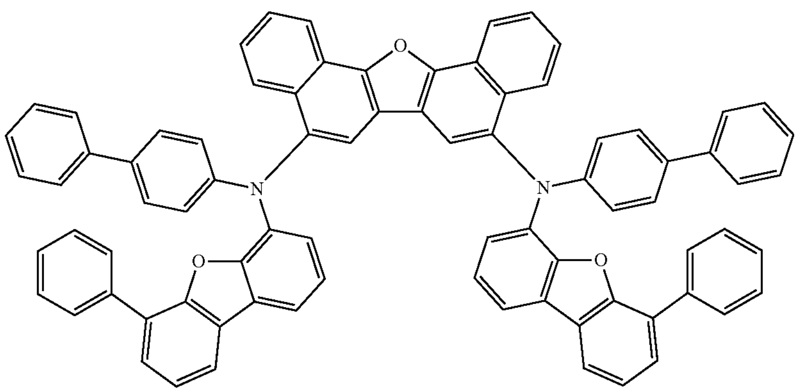
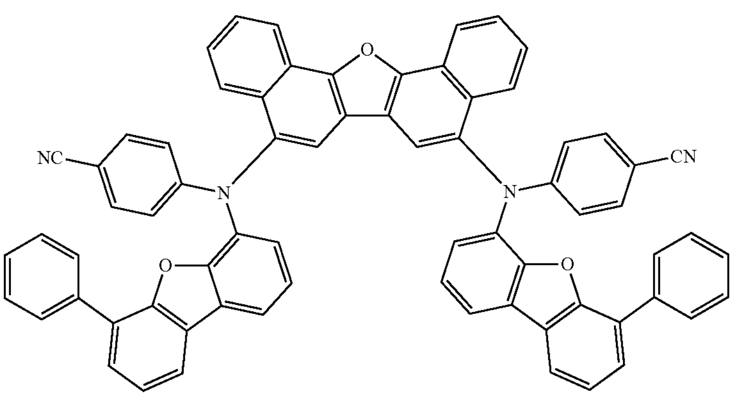
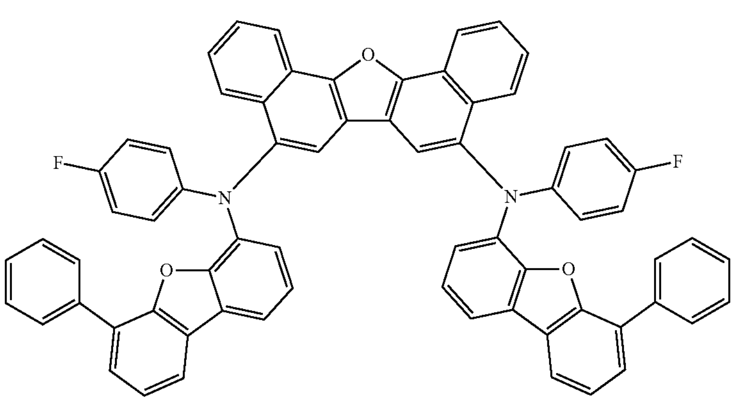

-continued
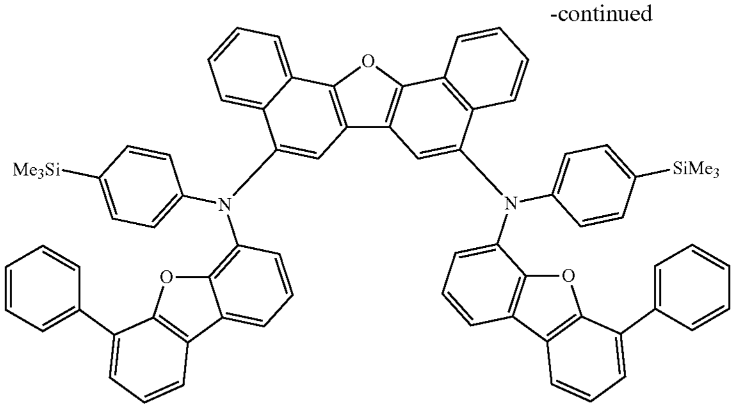
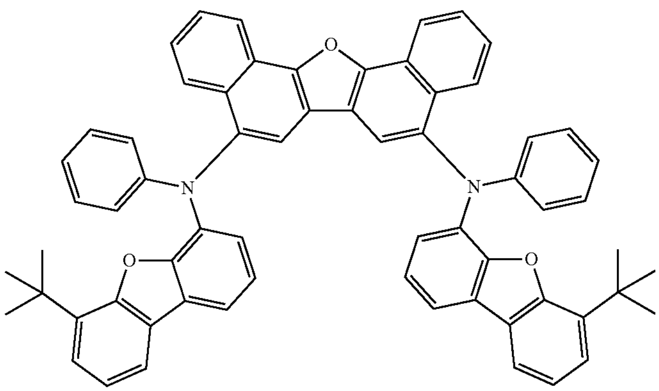
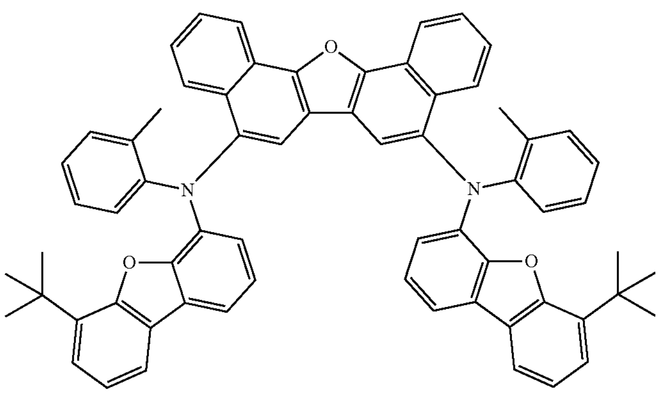
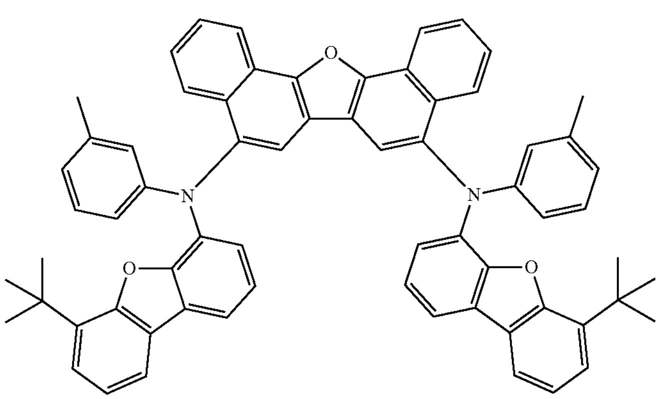

-continued
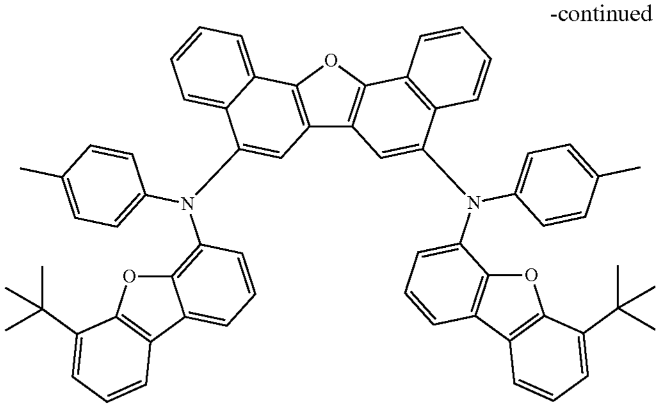
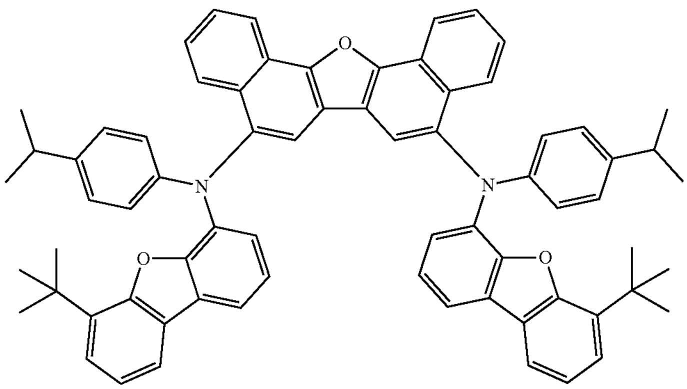
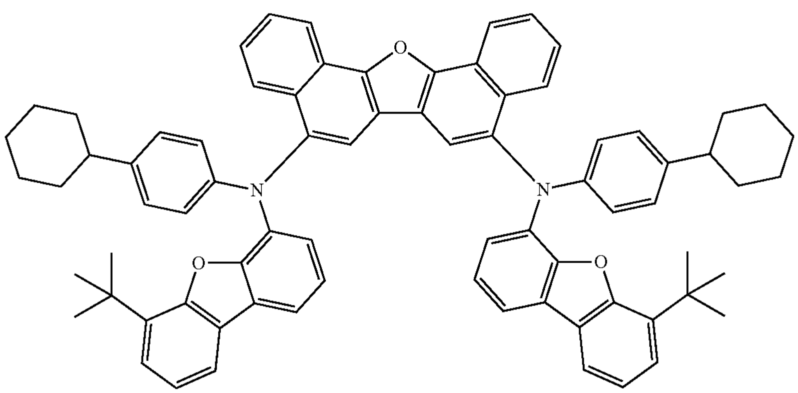
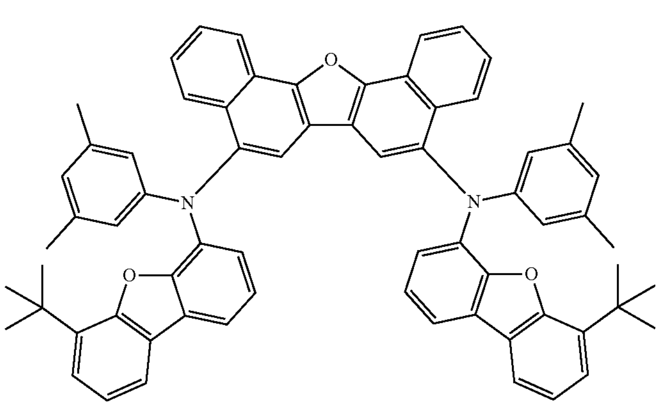

-continued
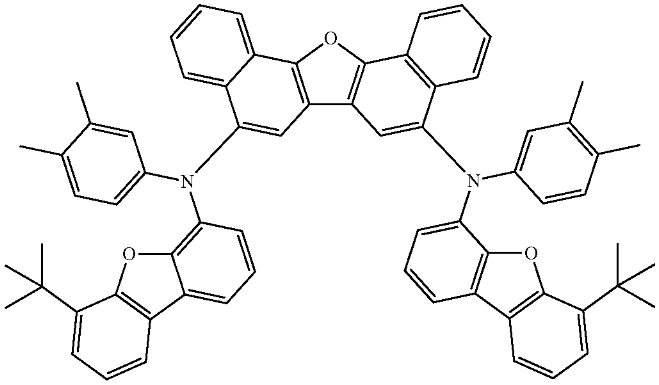
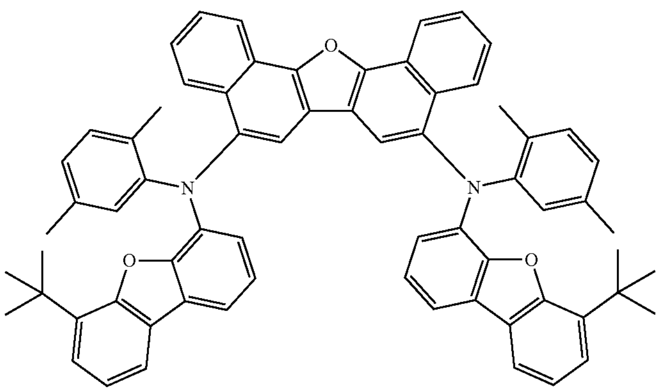
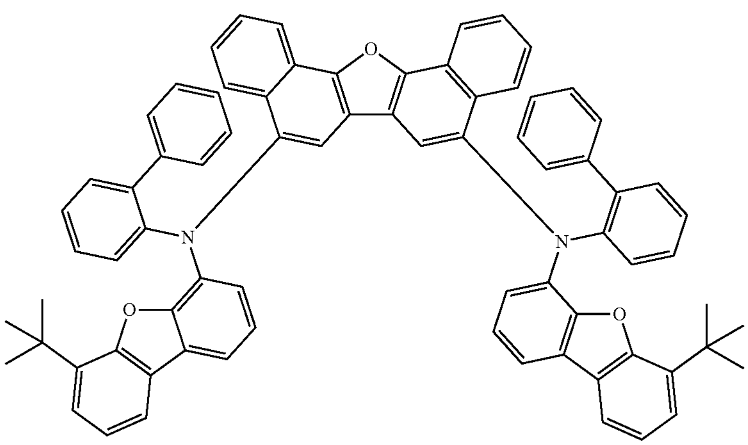
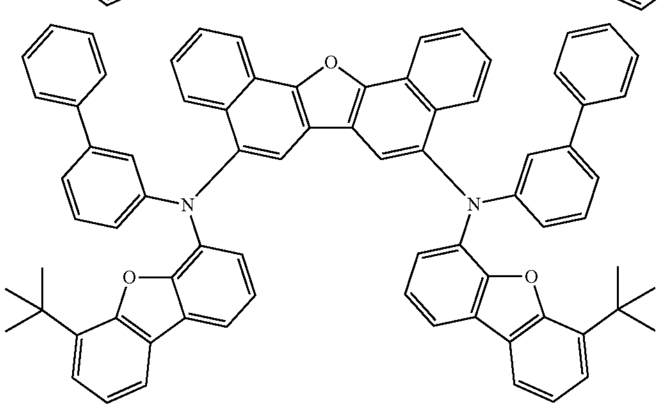

-continued
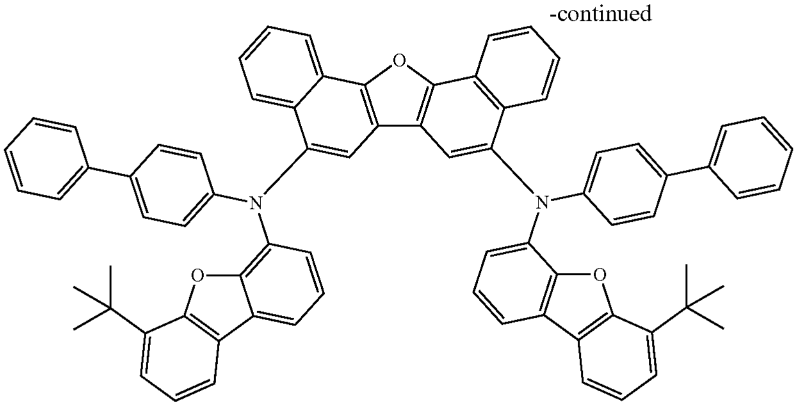
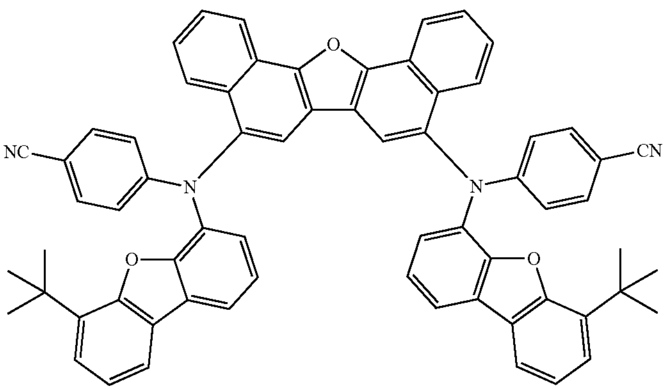
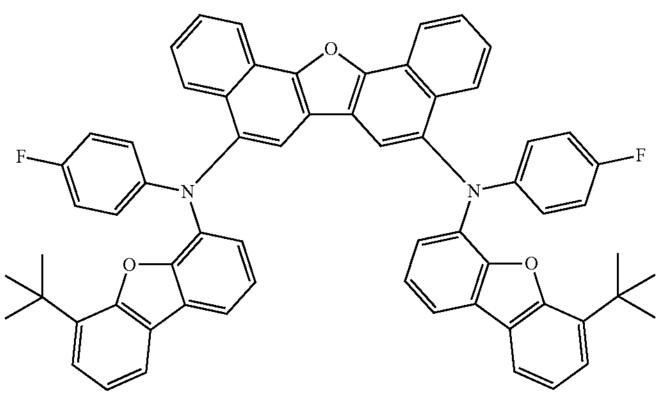
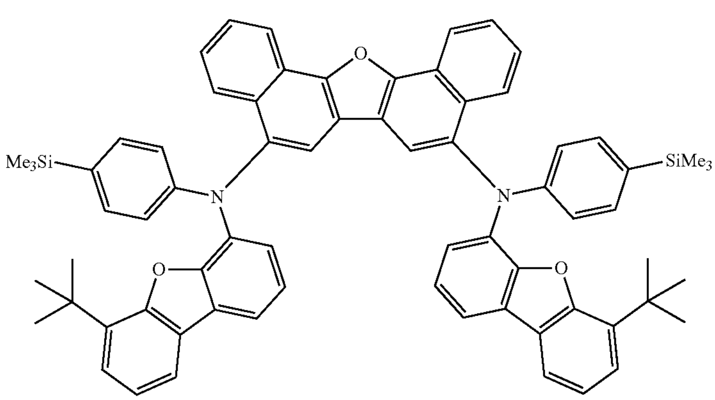

-continued
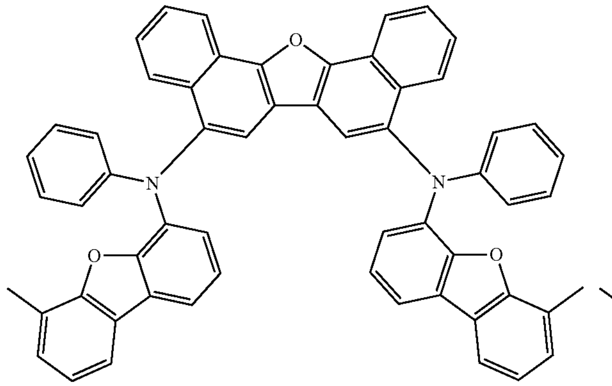
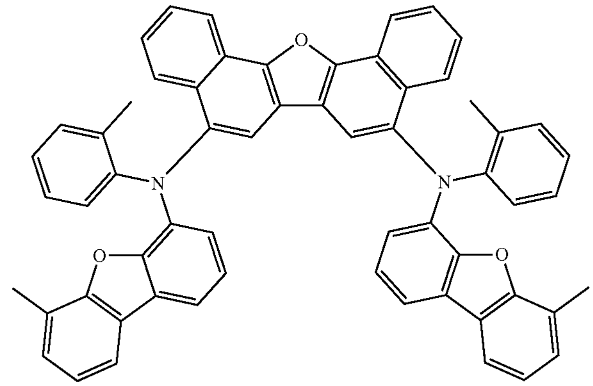
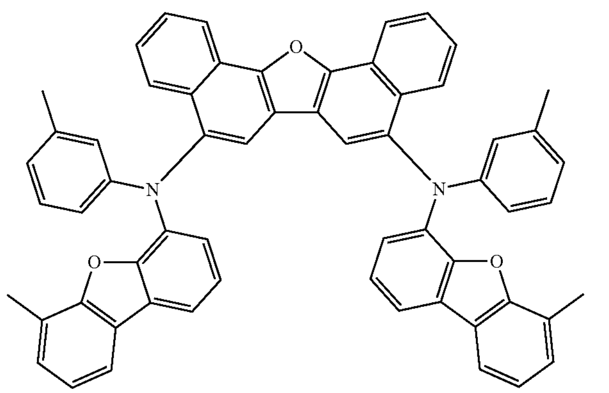
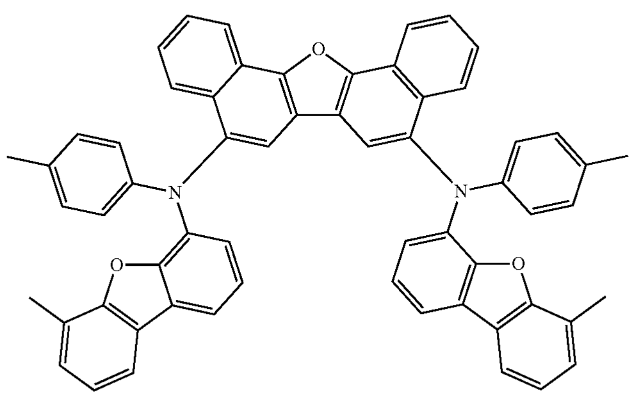
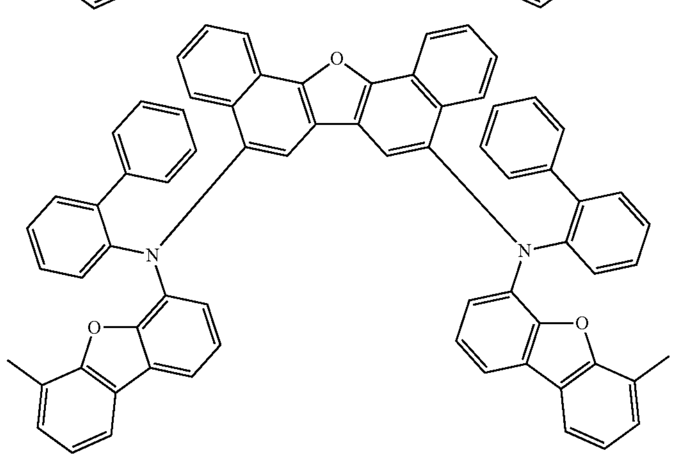

-continued
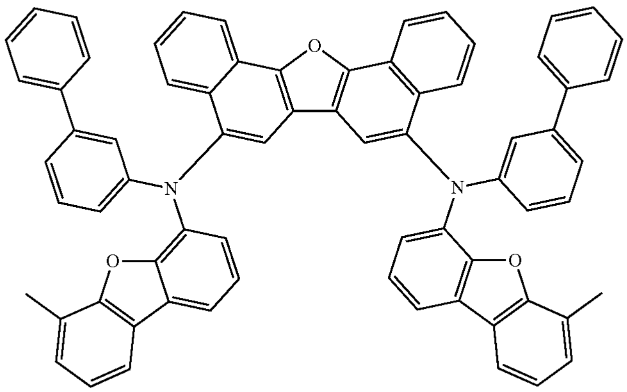
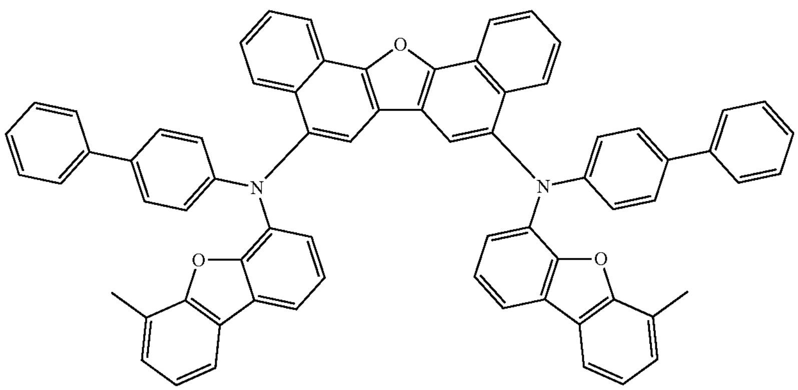
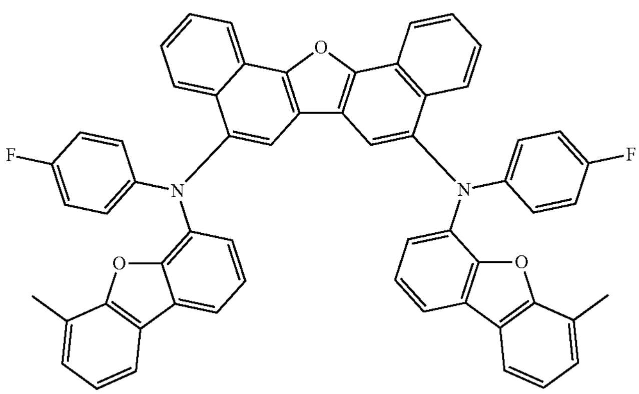
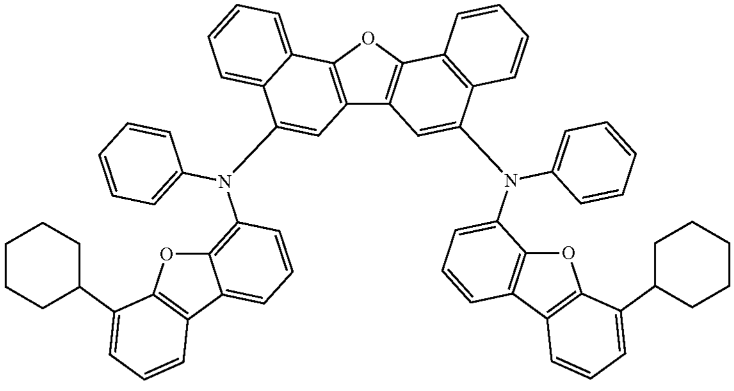

-continued
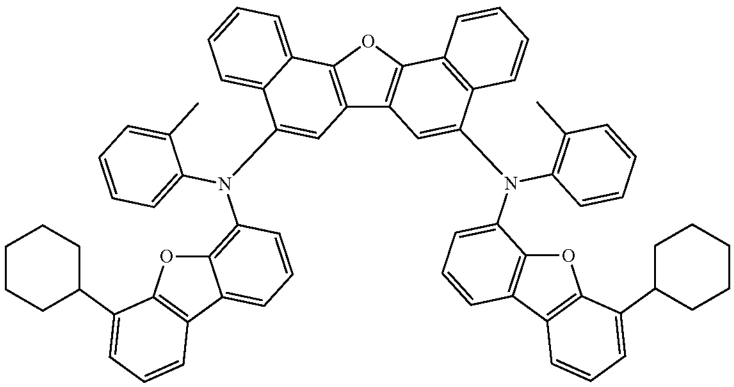
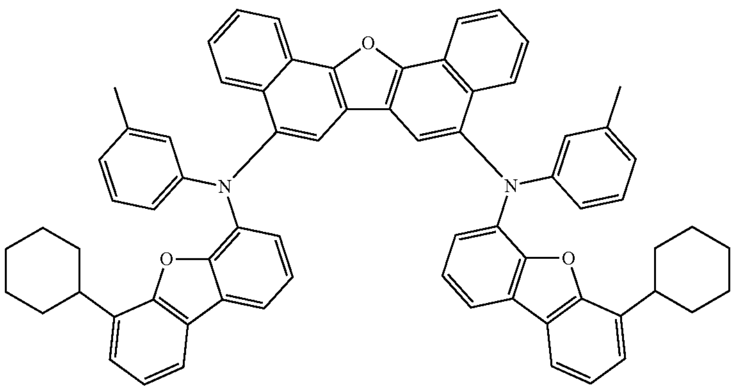
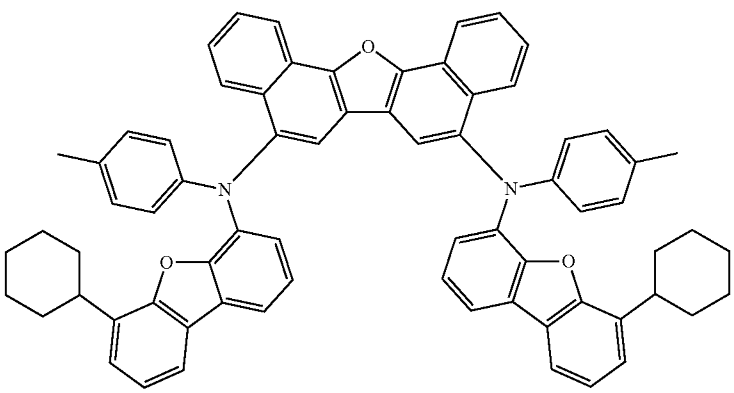
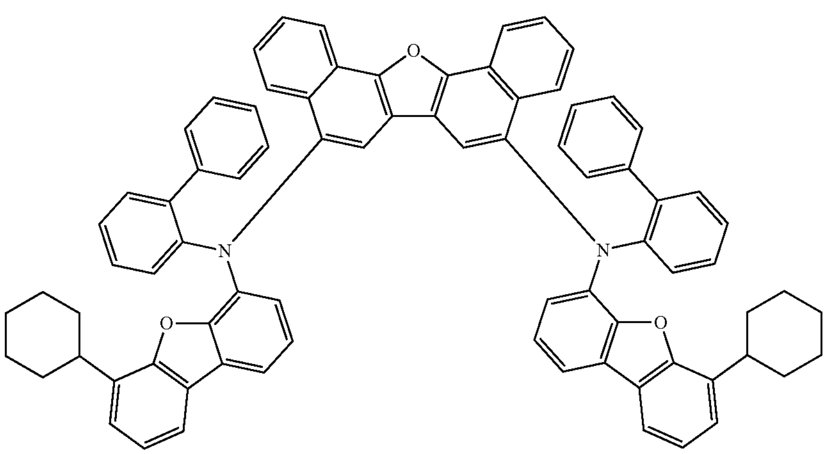

-continued
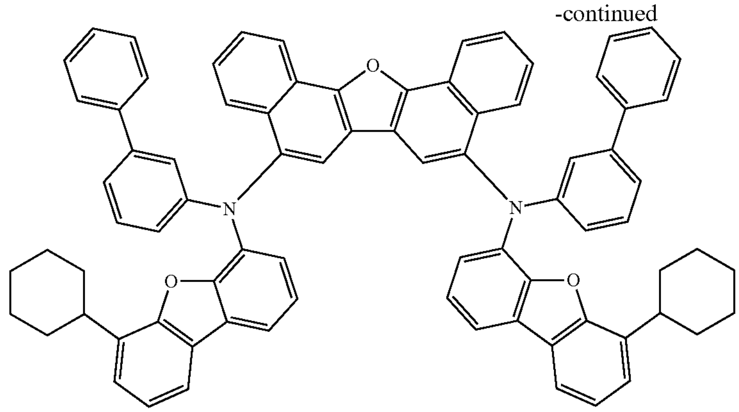
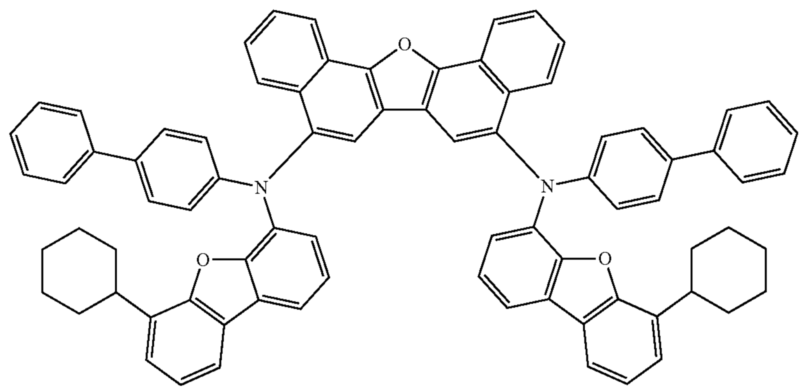
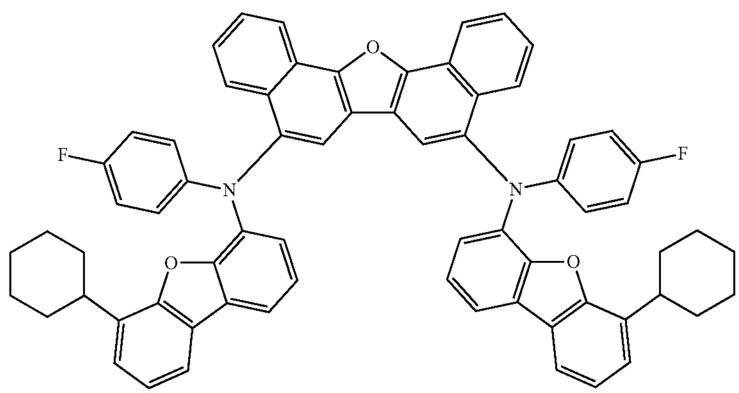
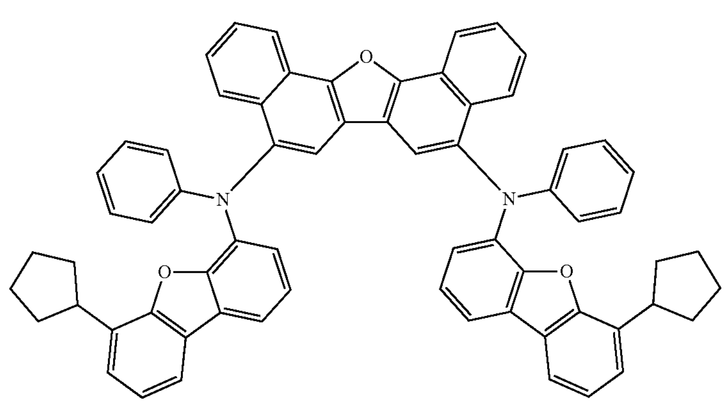

-continued
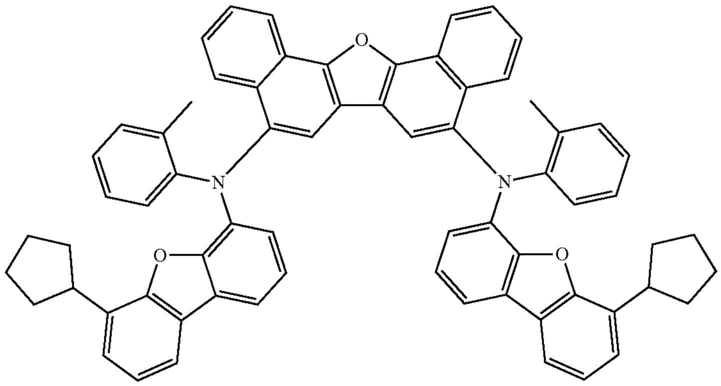
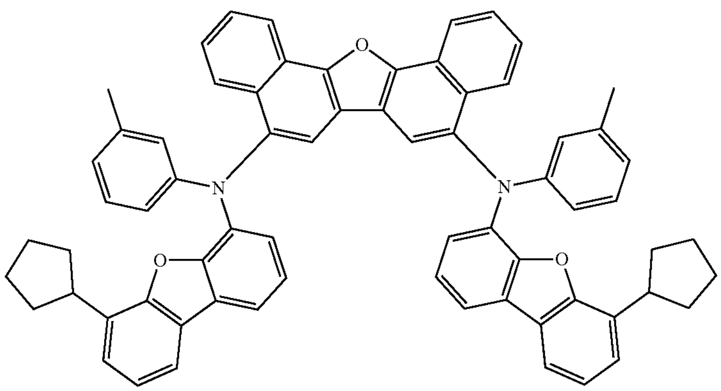
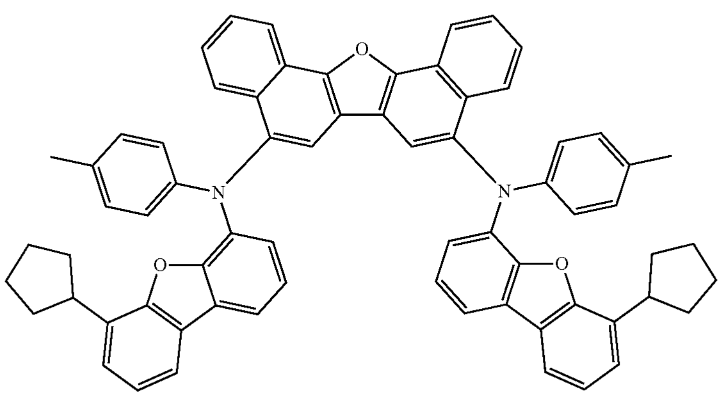
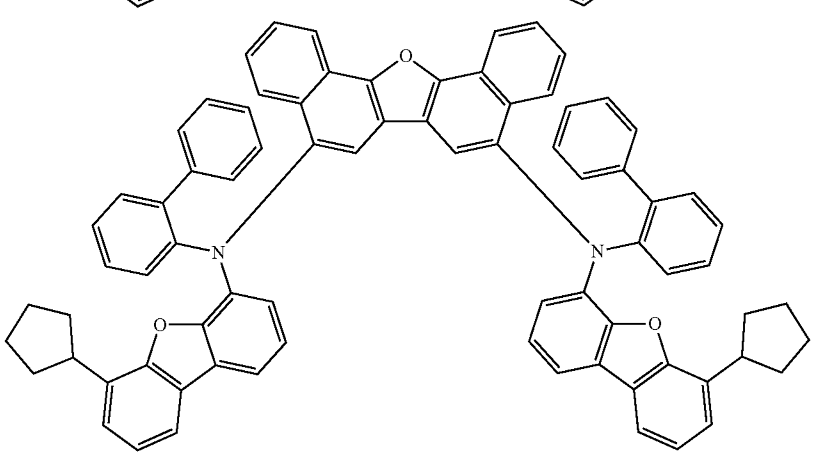

-continued
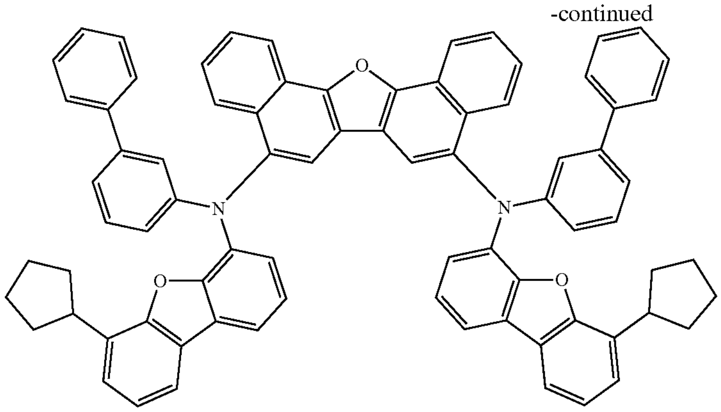
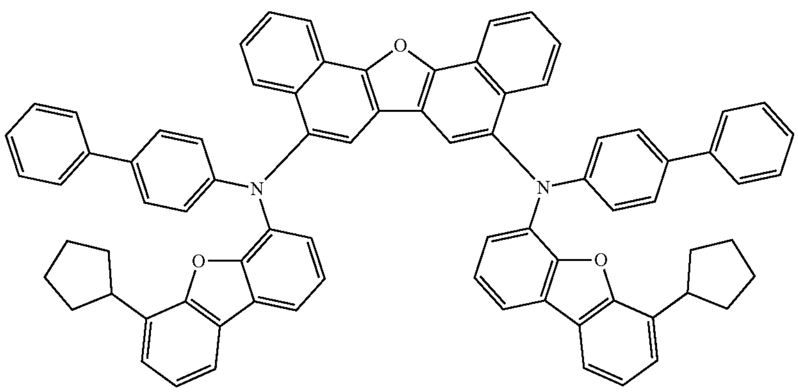
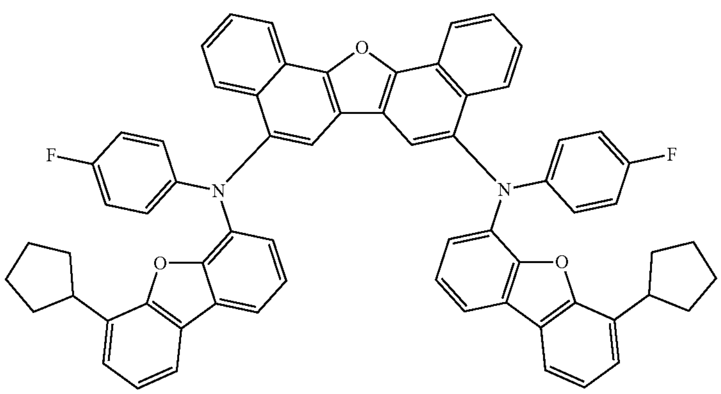
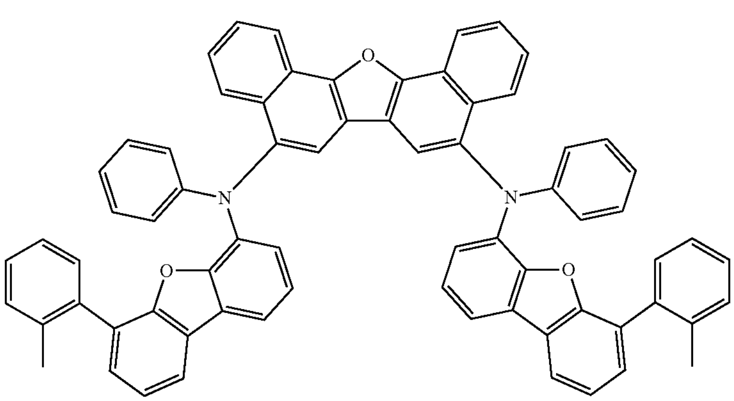

-continued
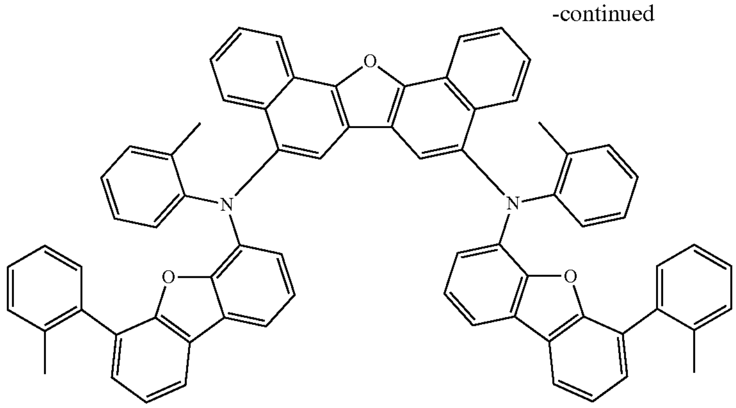
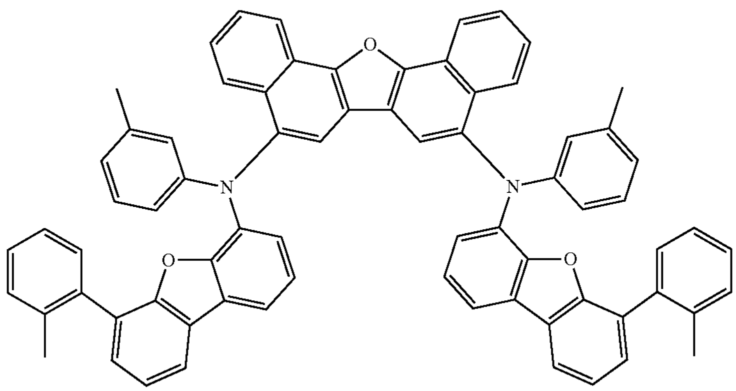
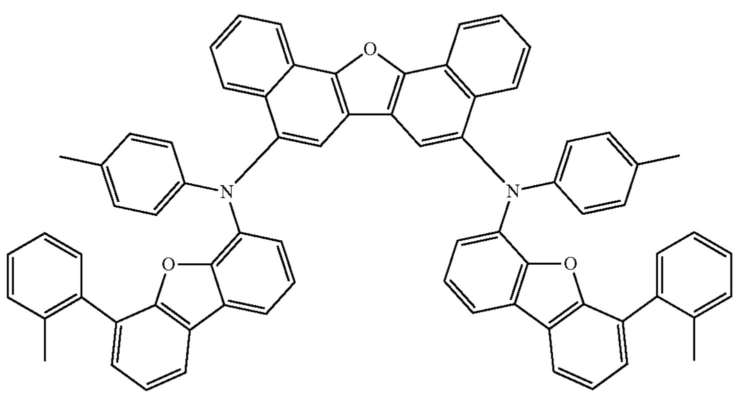
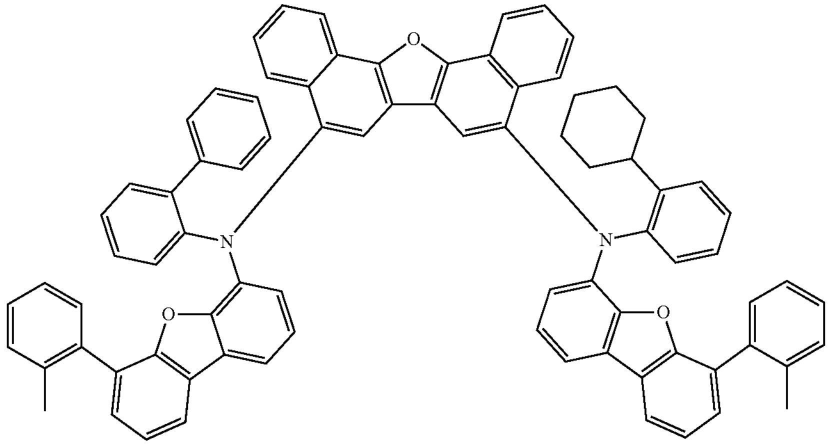

-continued
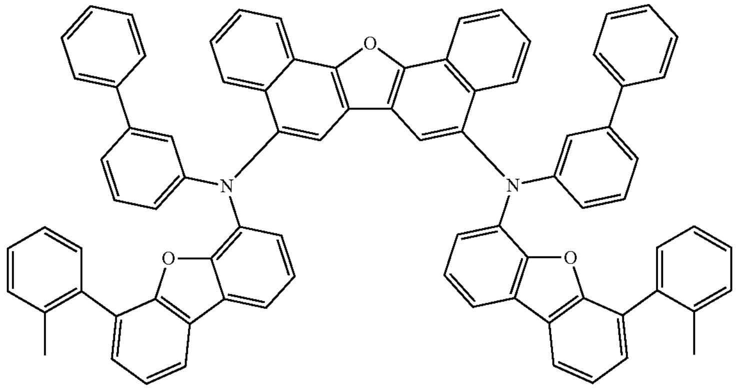
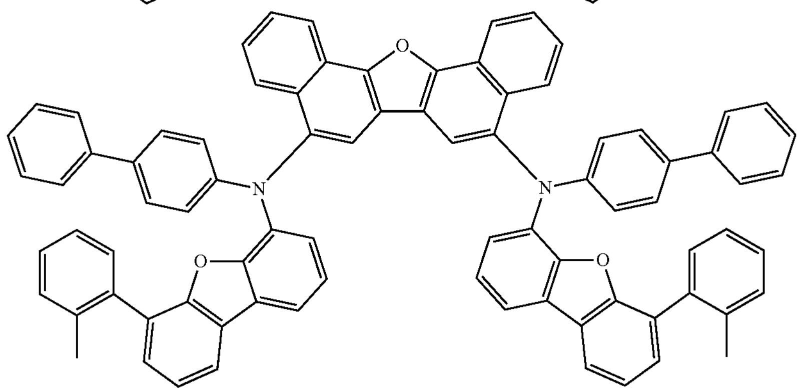
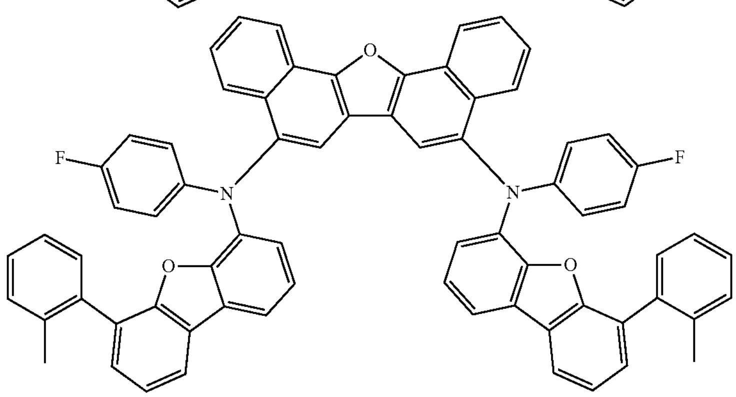
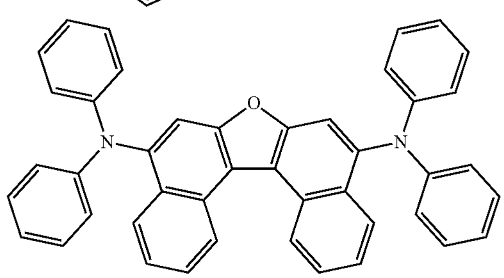
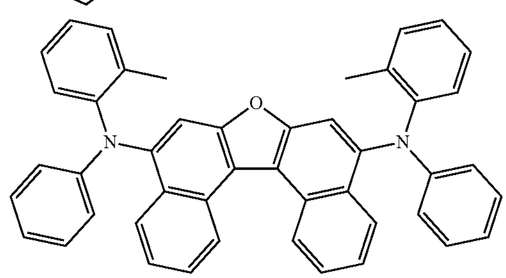
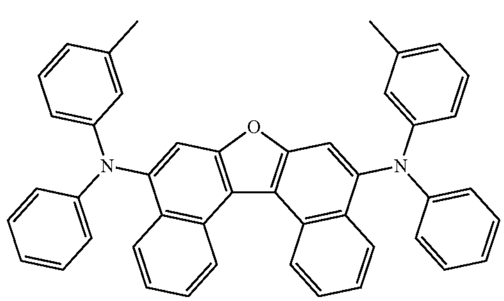
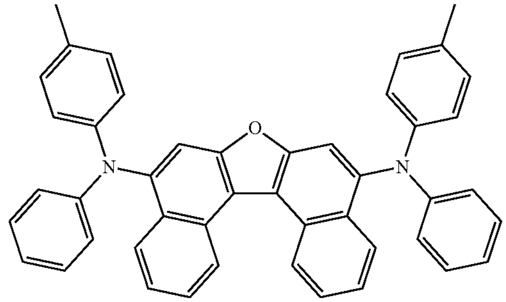

-continued
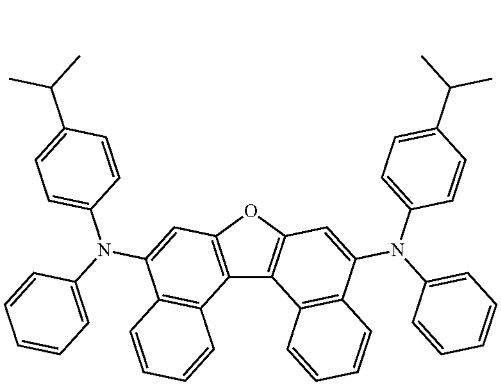
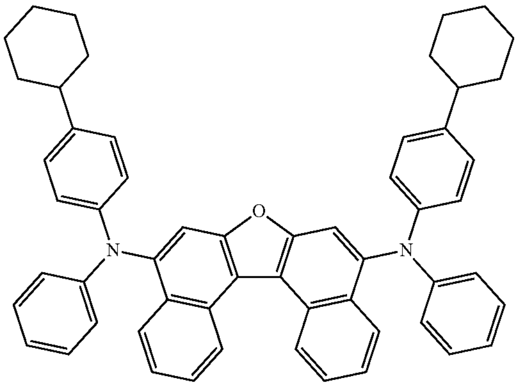
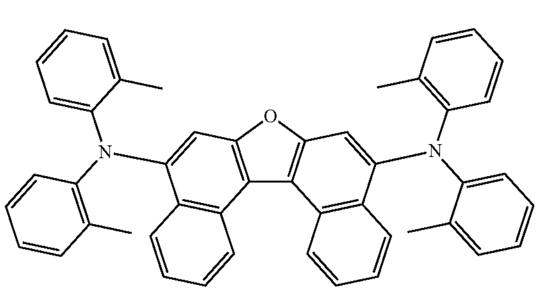
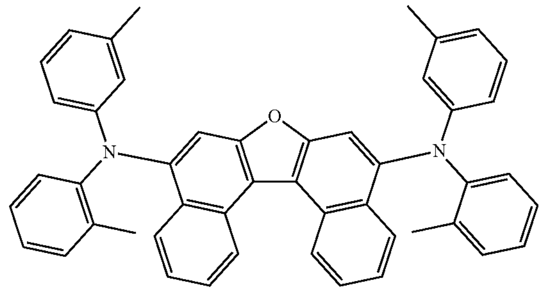
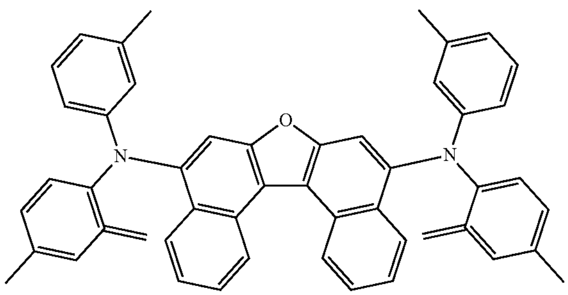
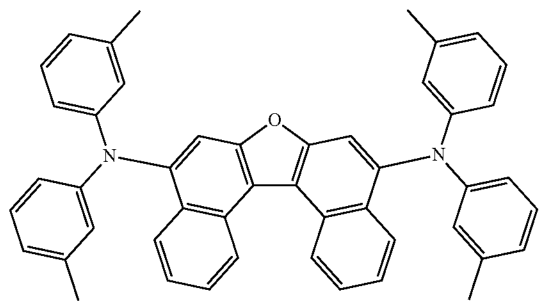
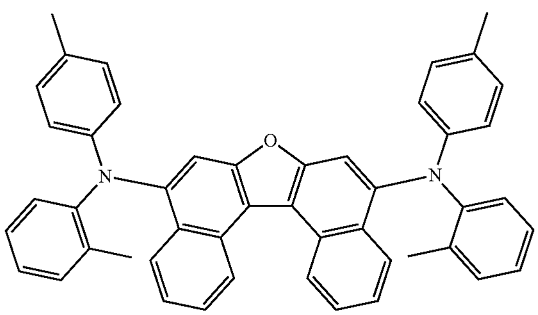
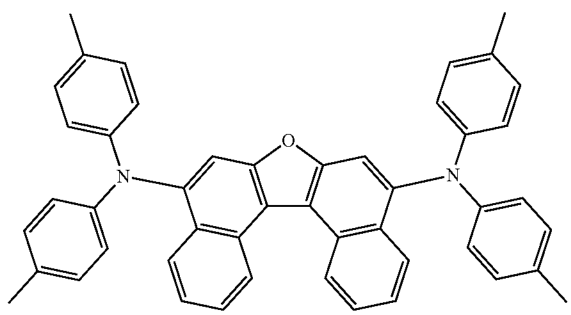
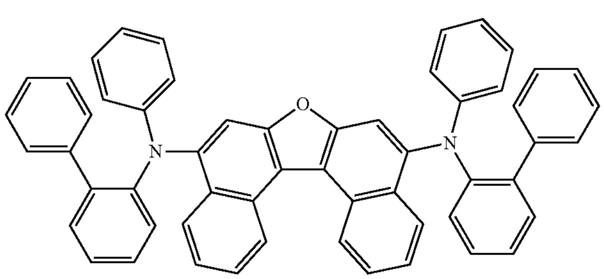
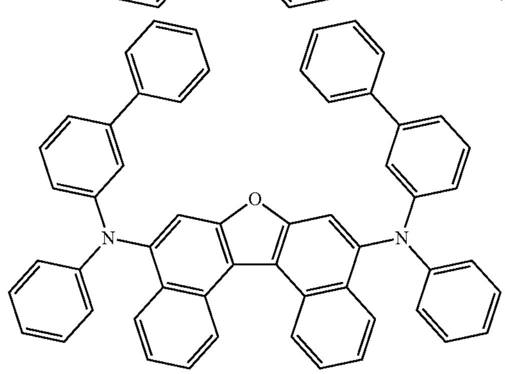

-continued
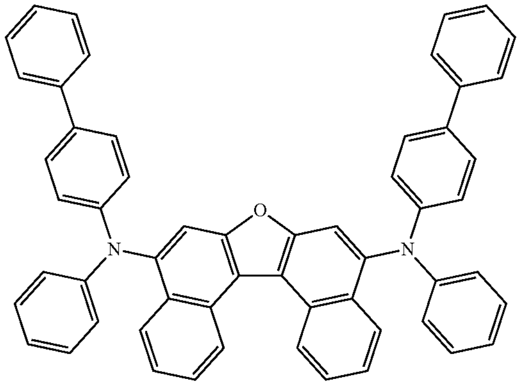
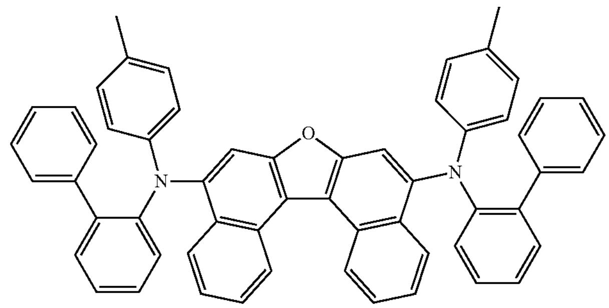
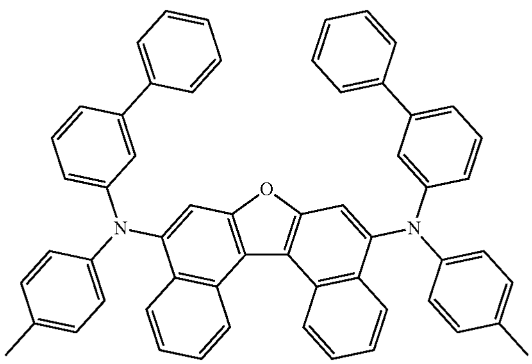
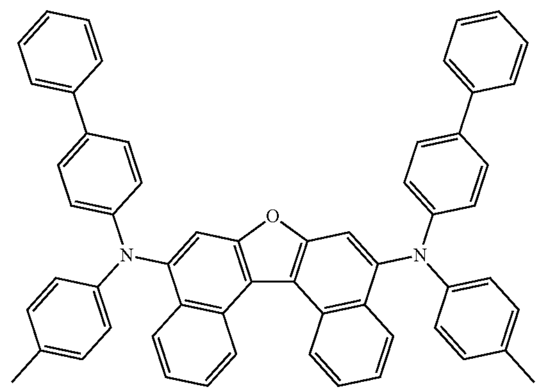
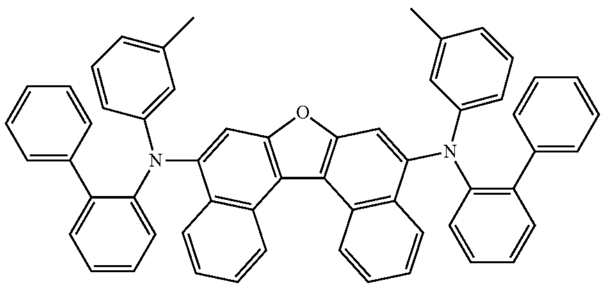
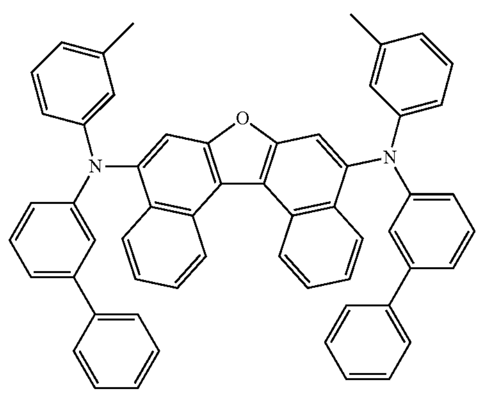
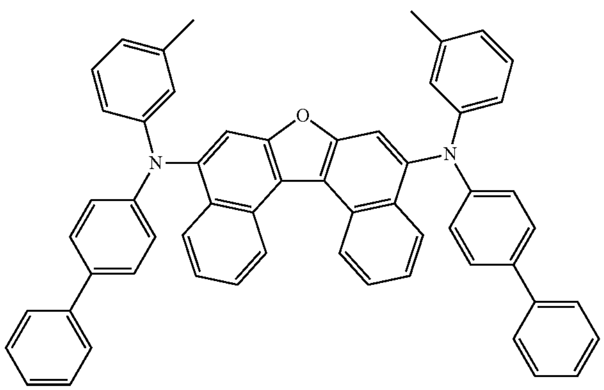

-continued
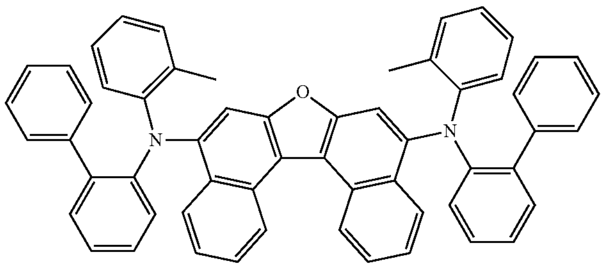
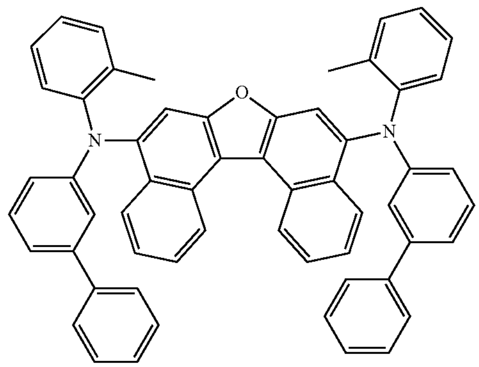
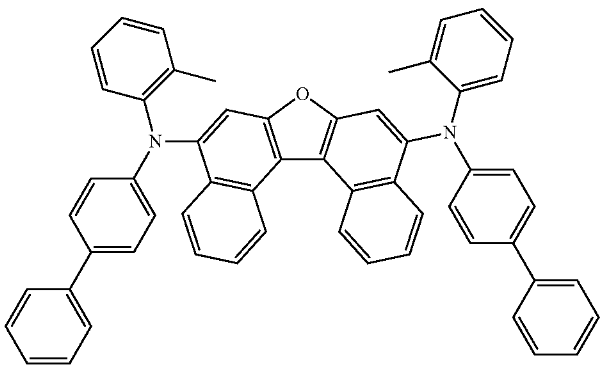
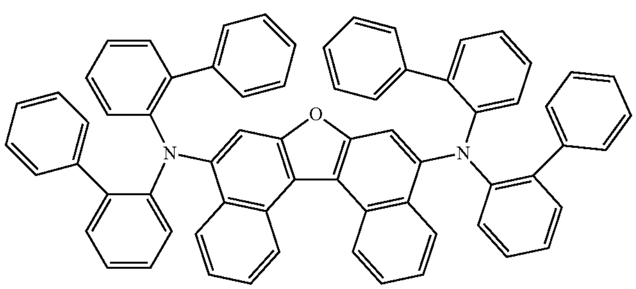
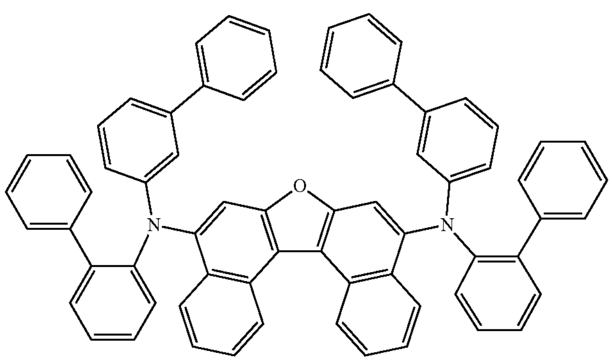

-continued
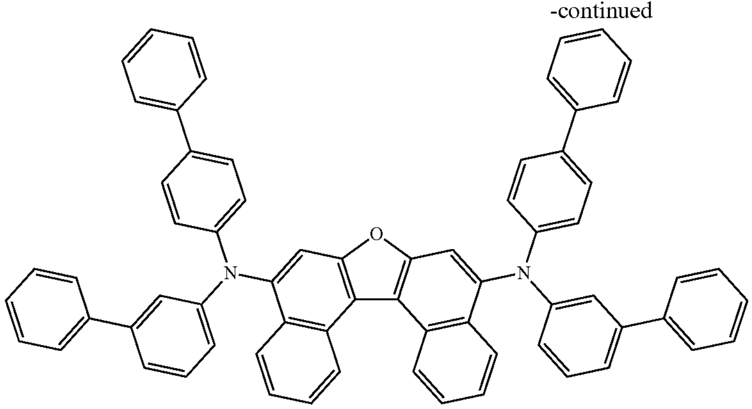
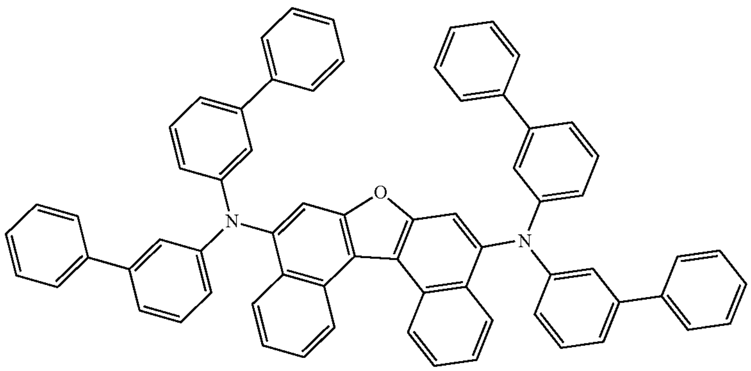
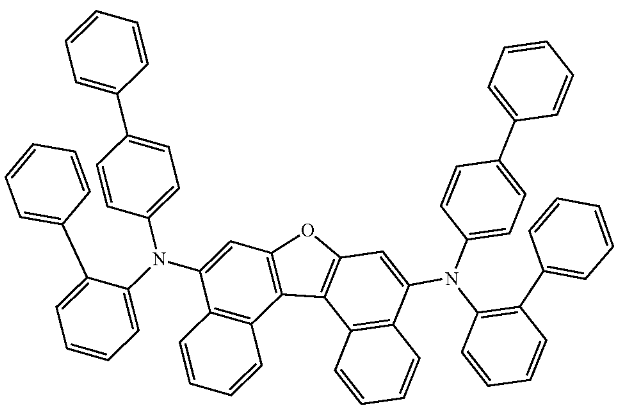
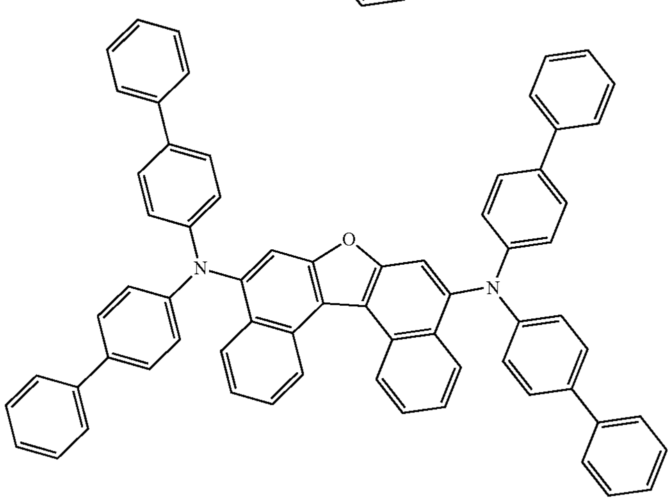

-continued
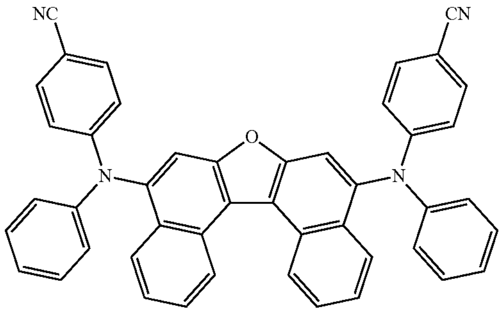
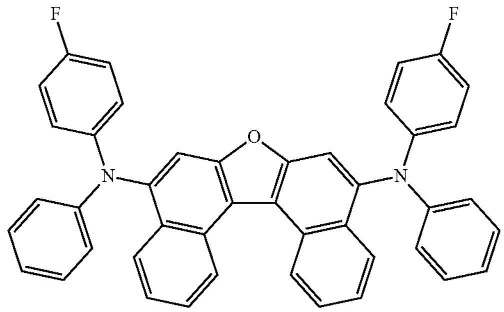
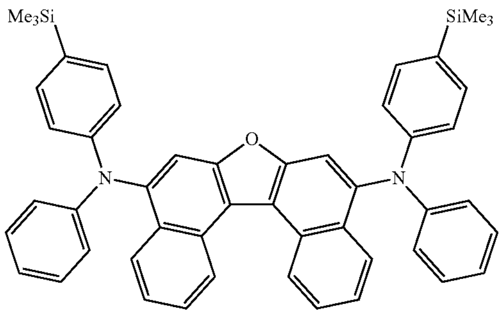
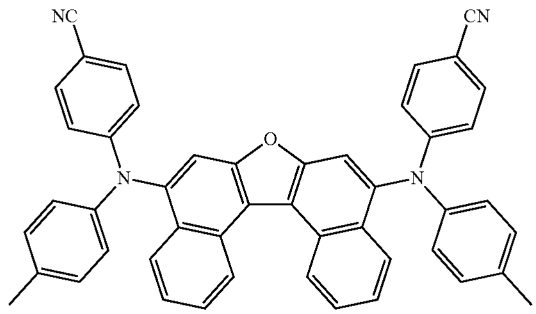
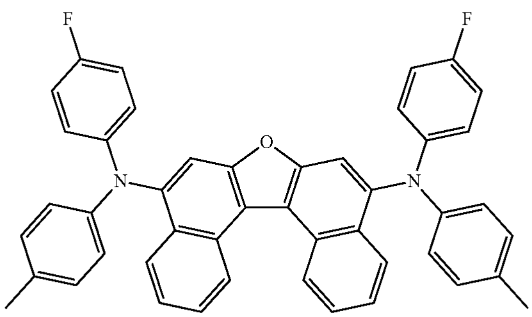
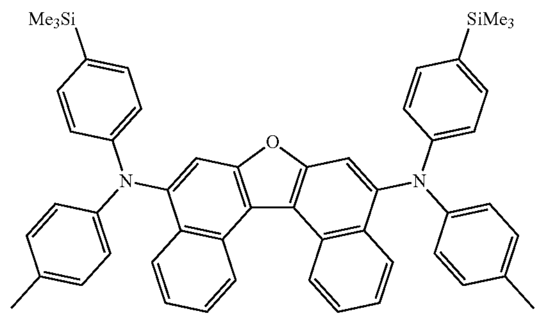
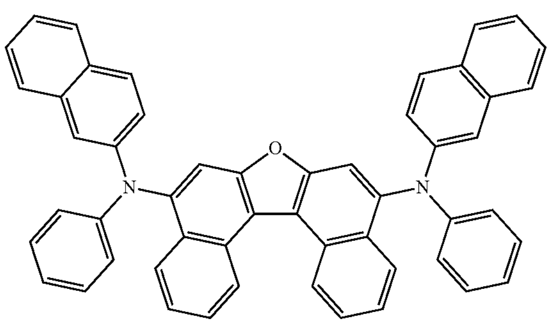
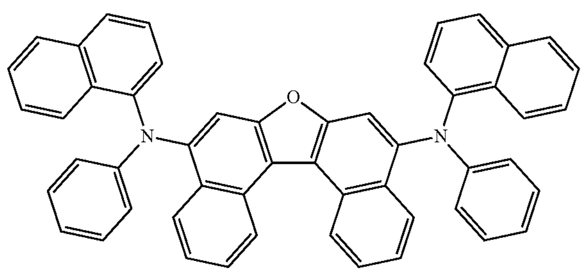
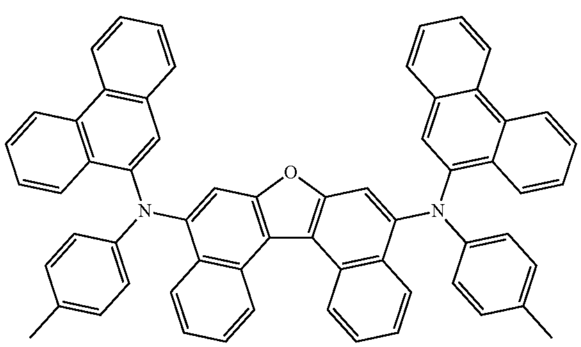

-continued
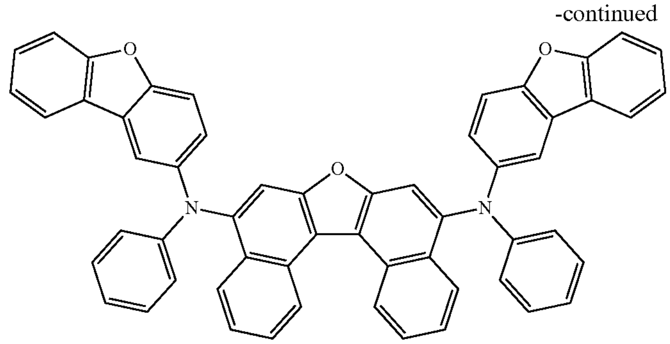
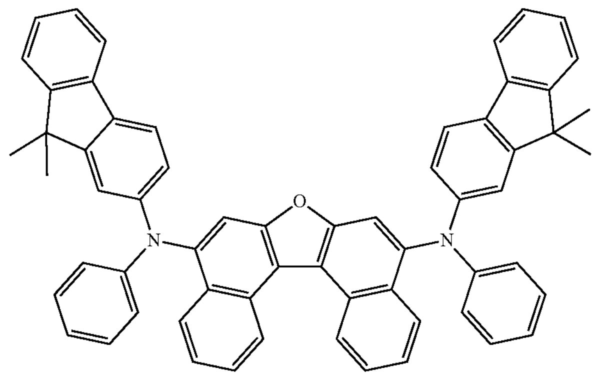
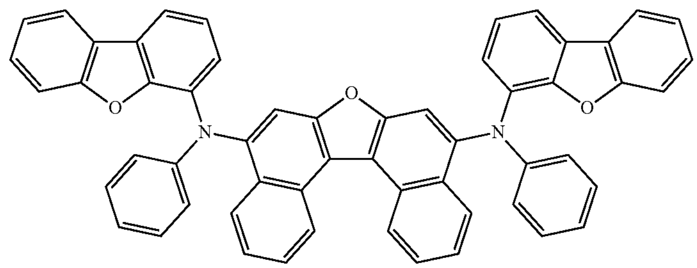
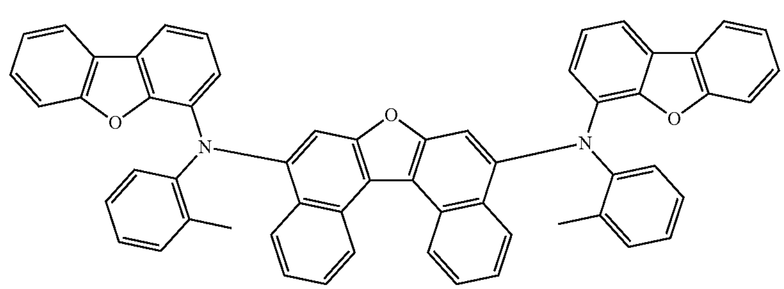
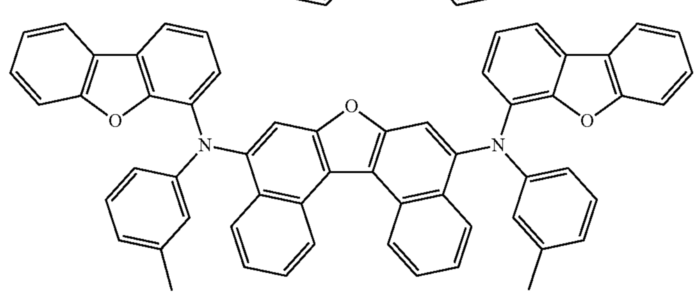

-continued
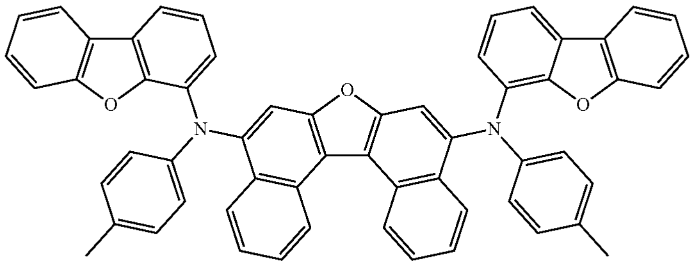
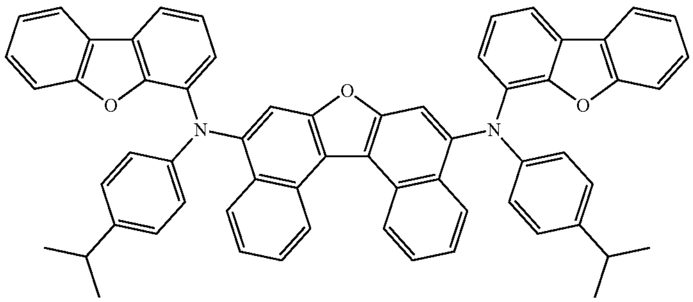
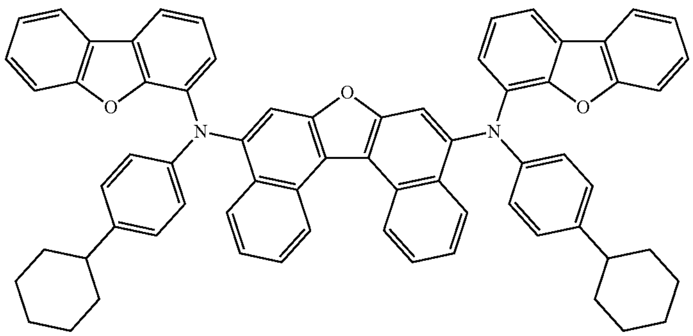
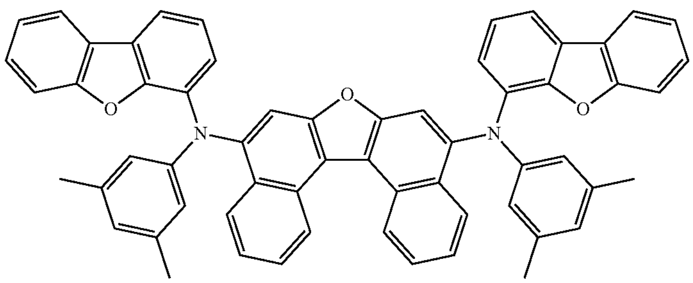
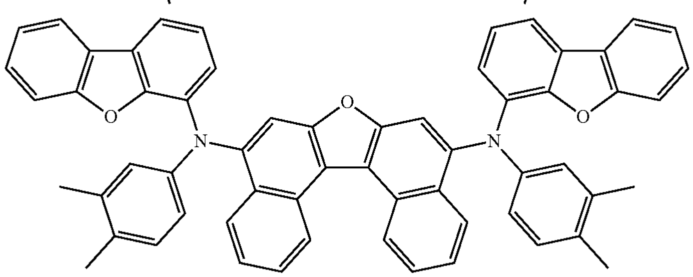
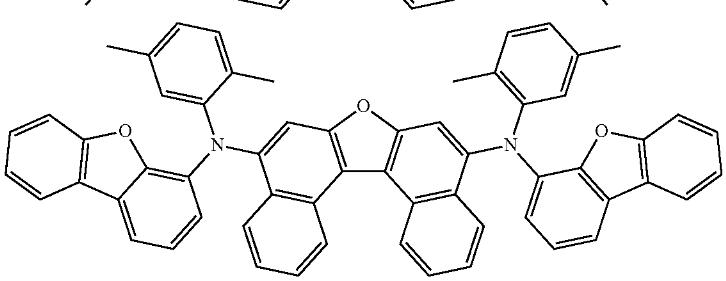

-continued
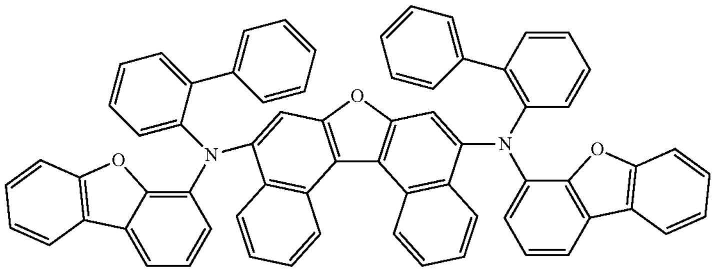
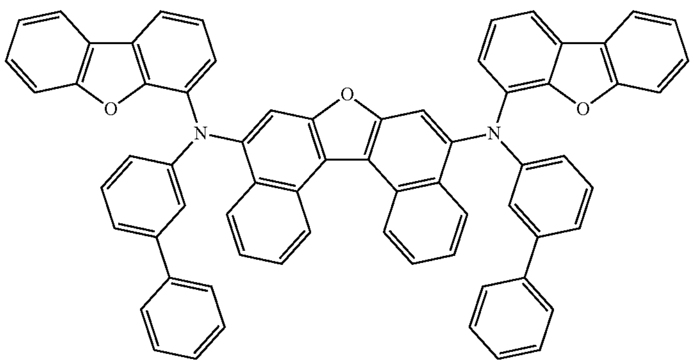
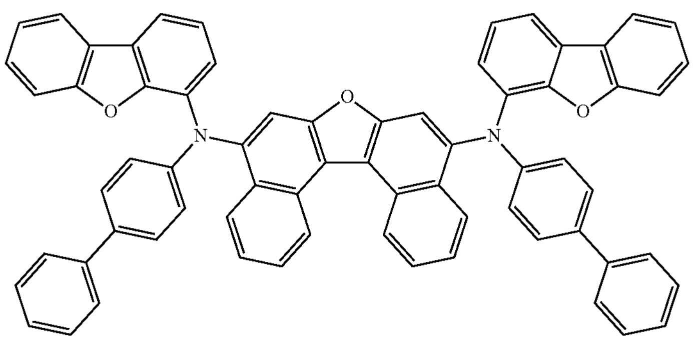
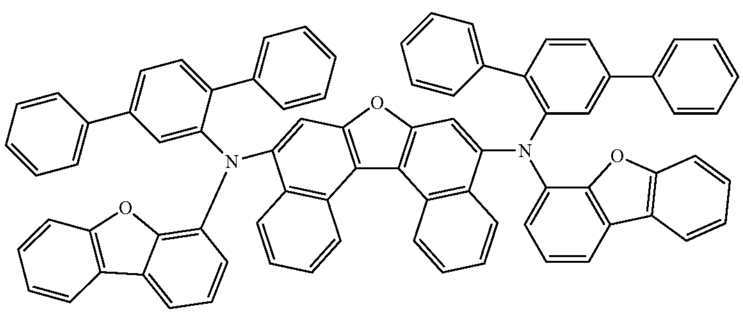
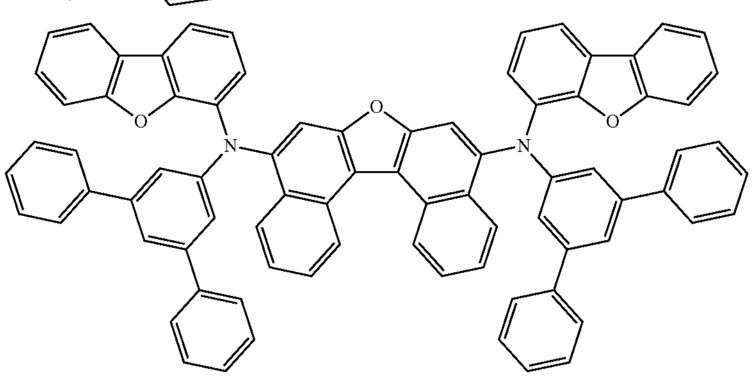

-continued
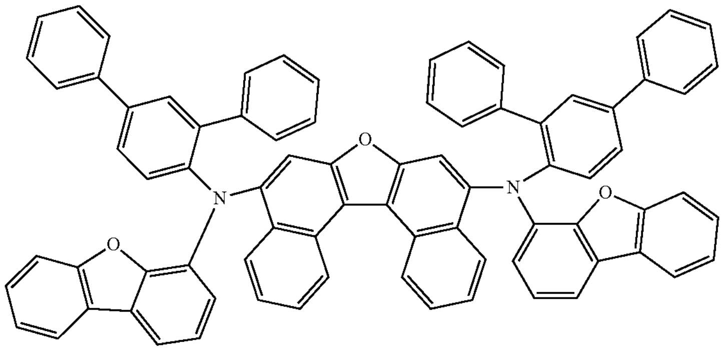
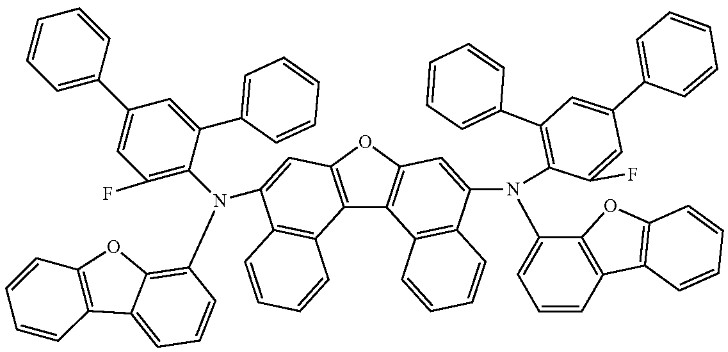
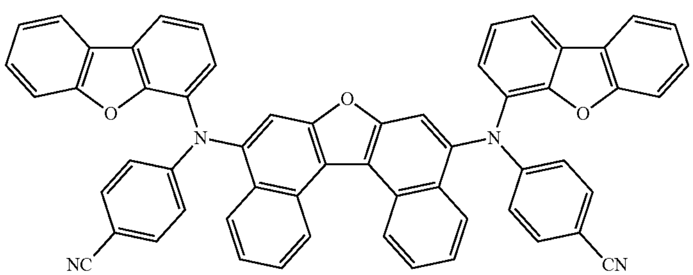
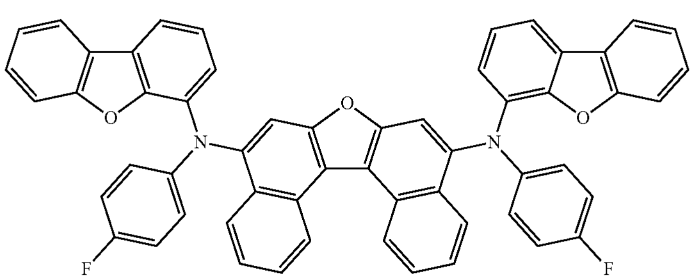
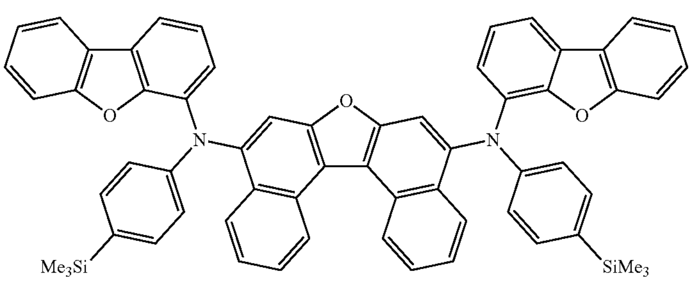

-continued
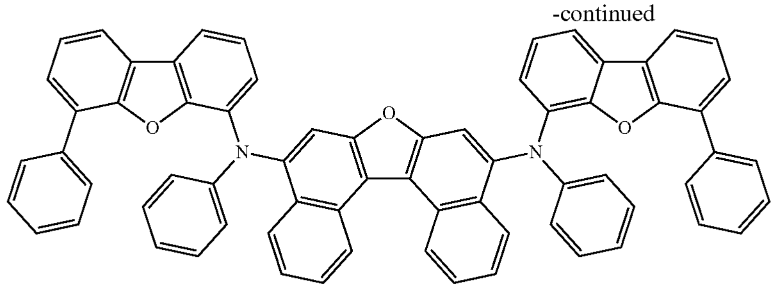
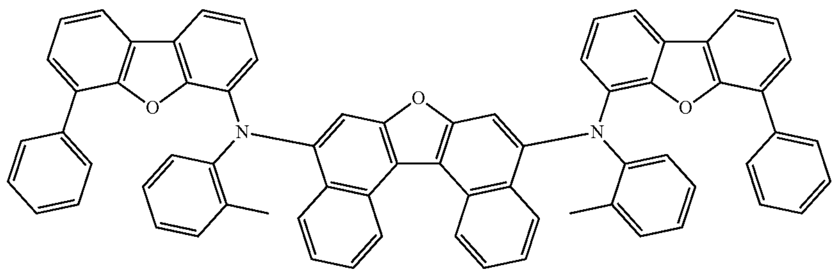
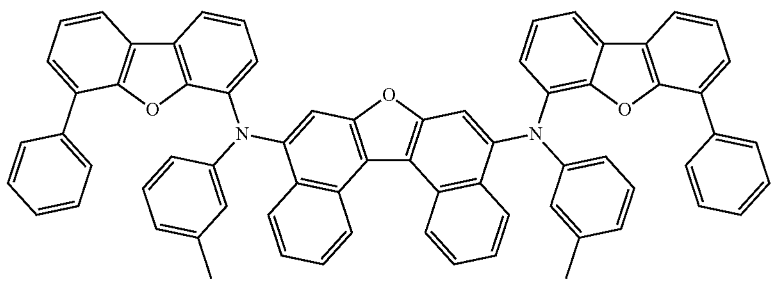
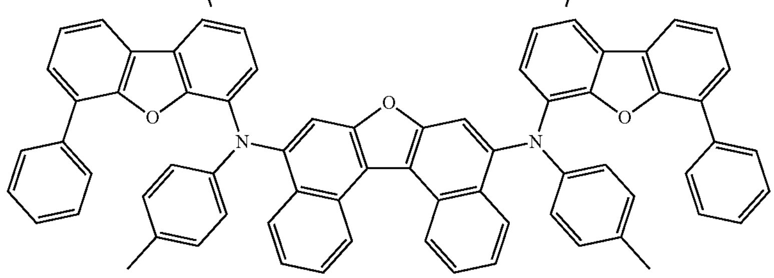
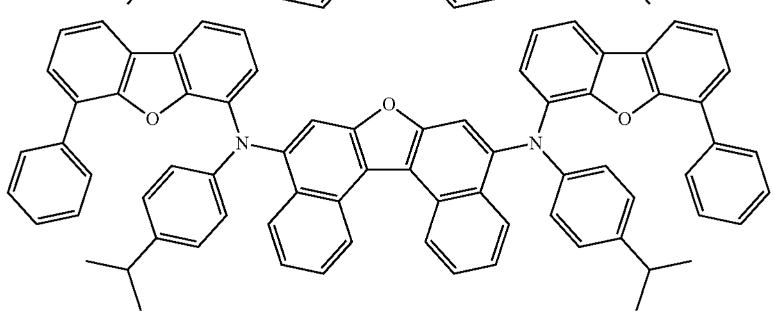
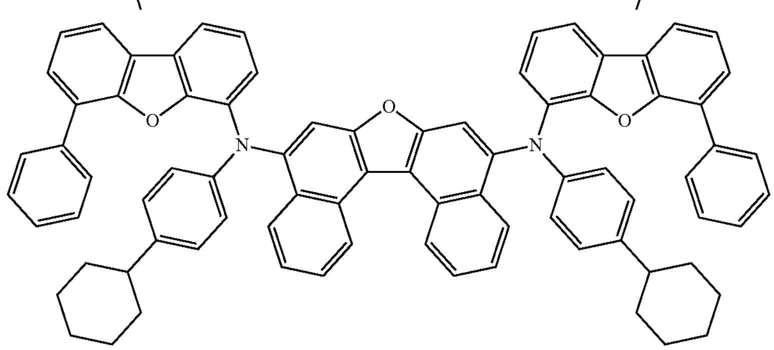

-continued
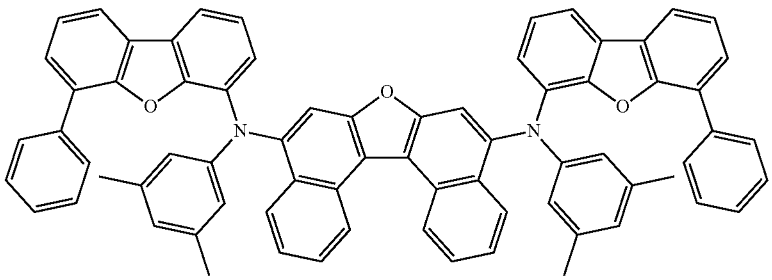
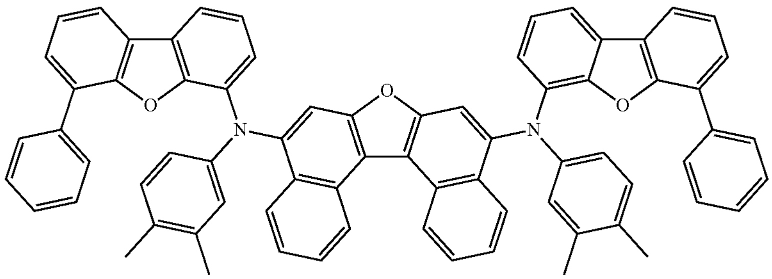
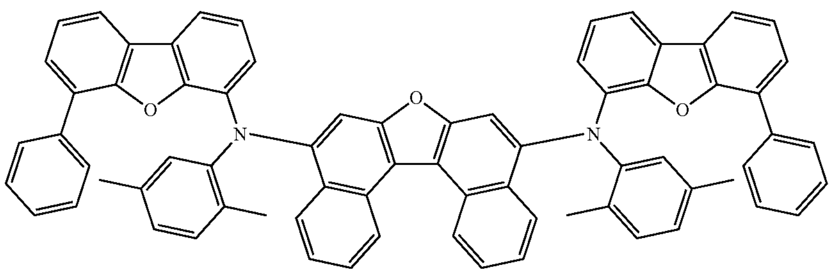
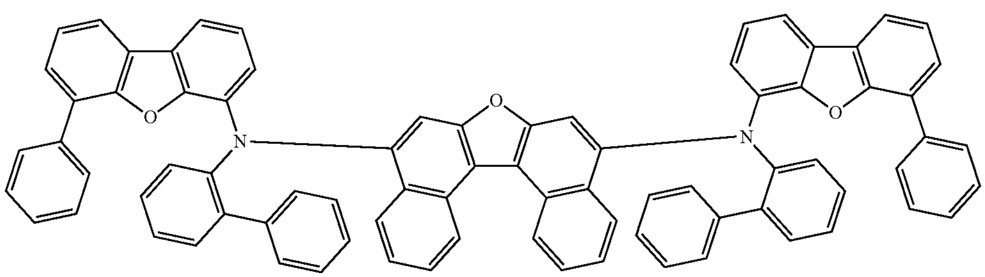
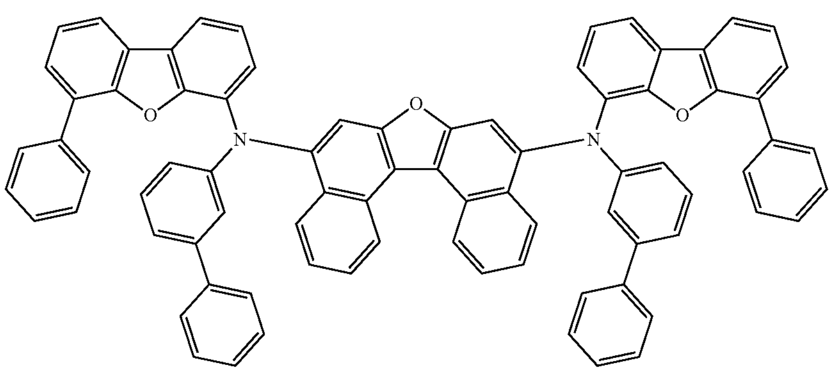

-continued
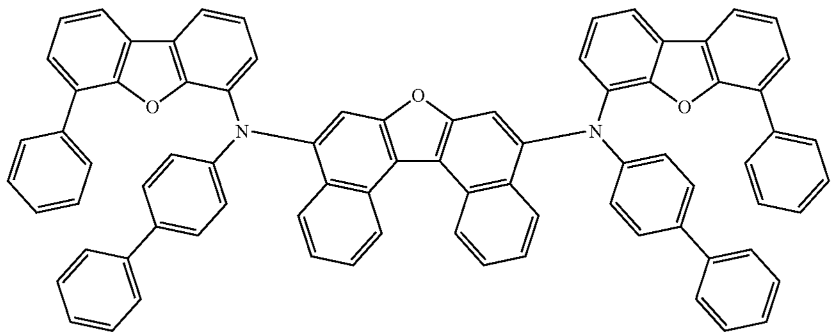
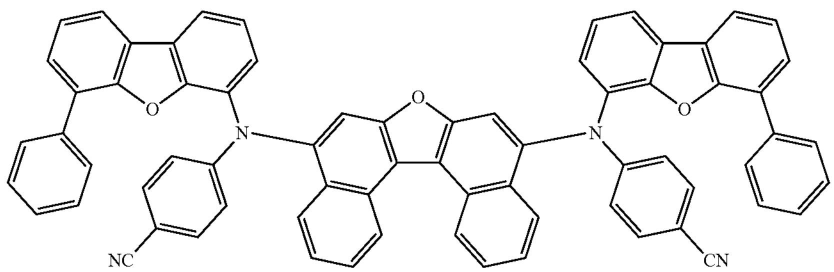
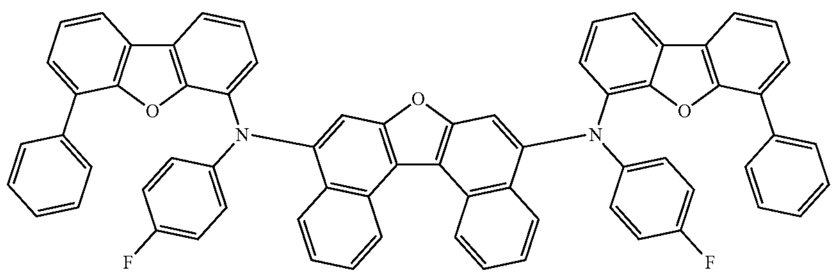
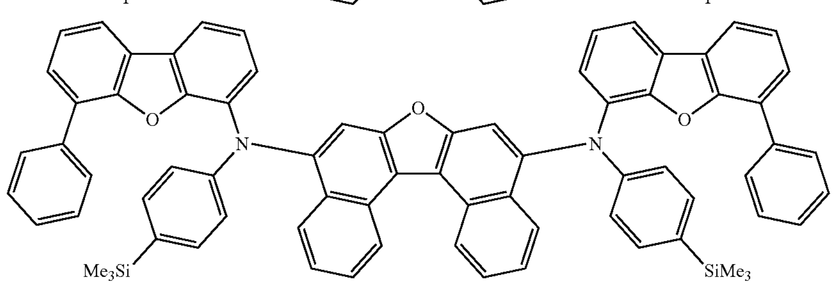
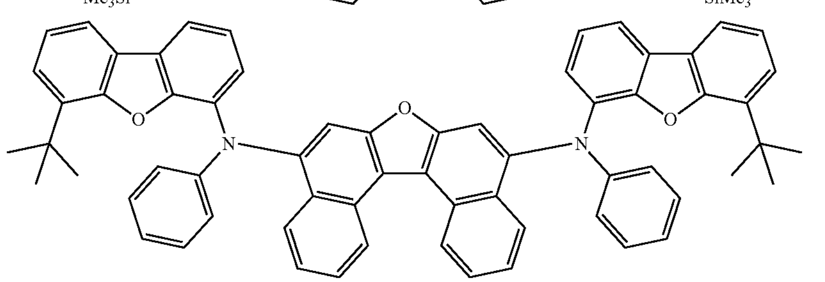
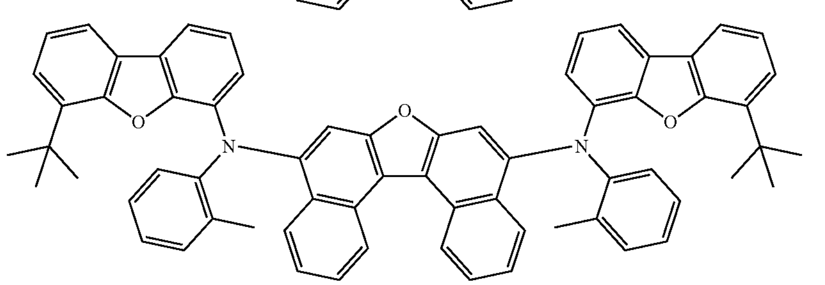

-continued
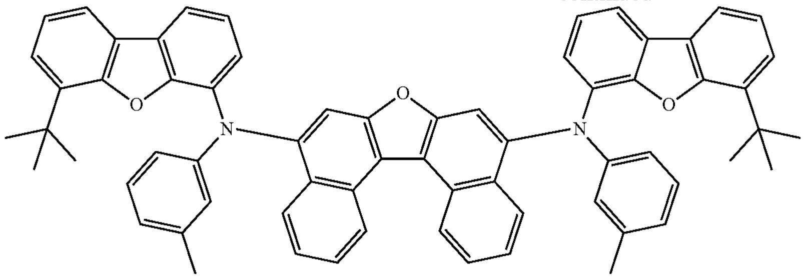
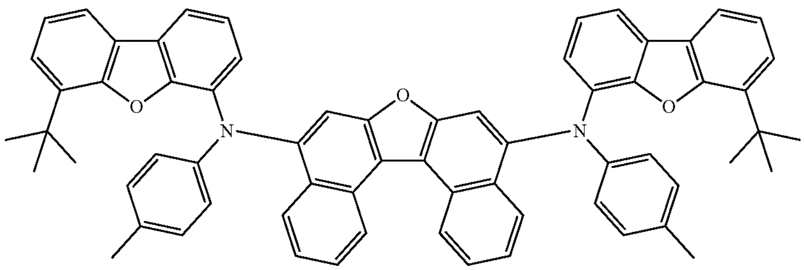
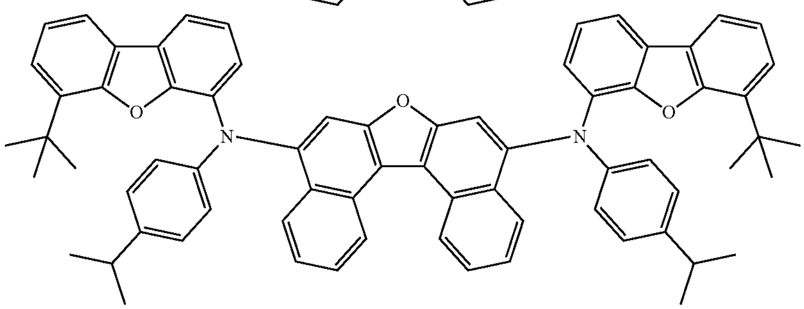
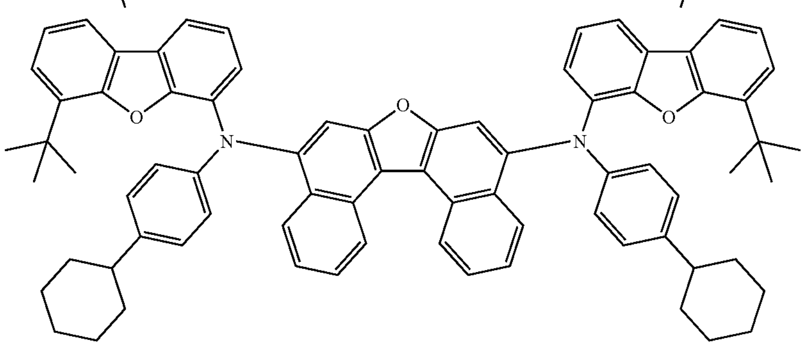
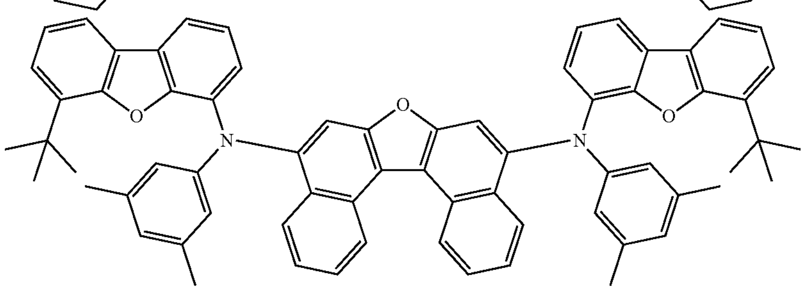
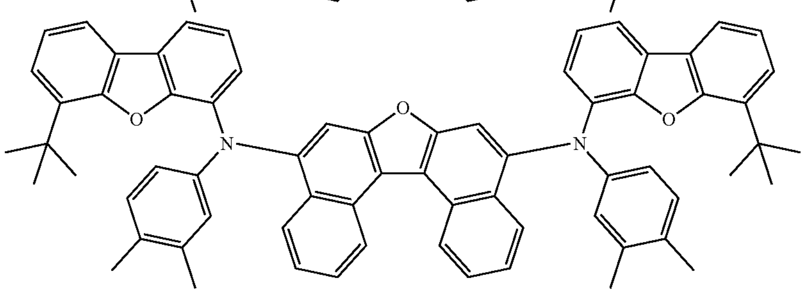

-continued
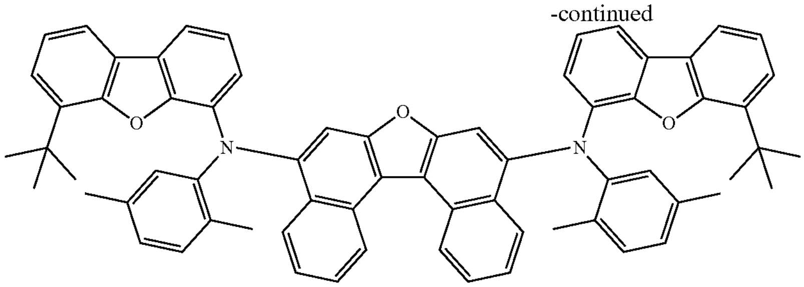
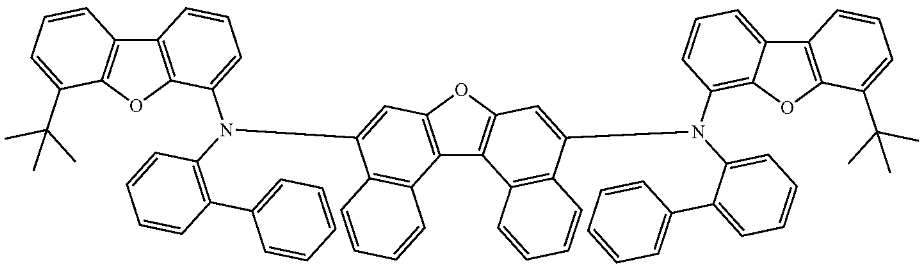
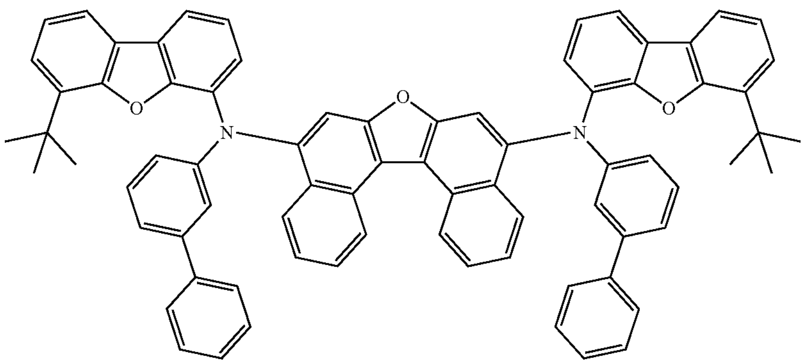
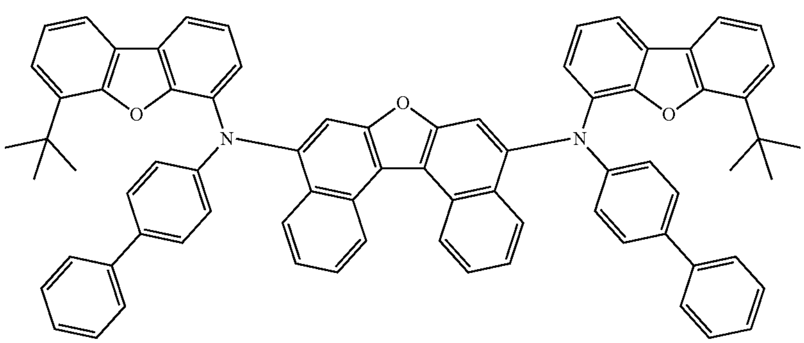
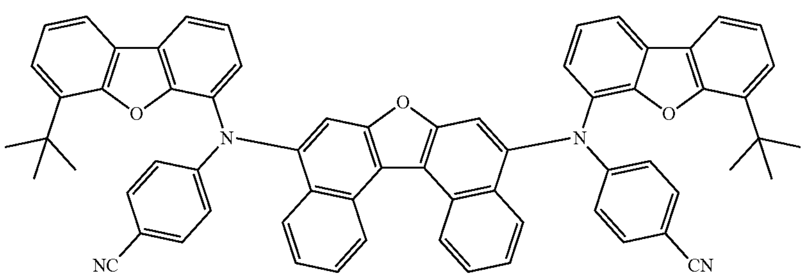

-continued
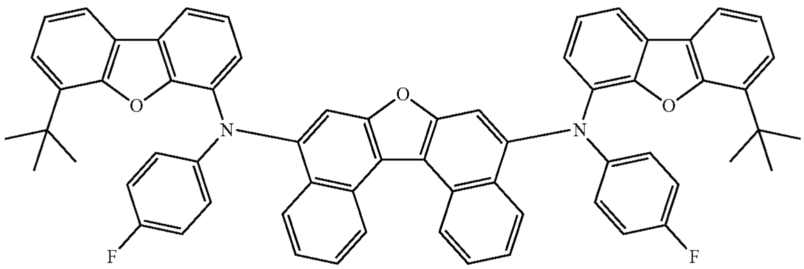
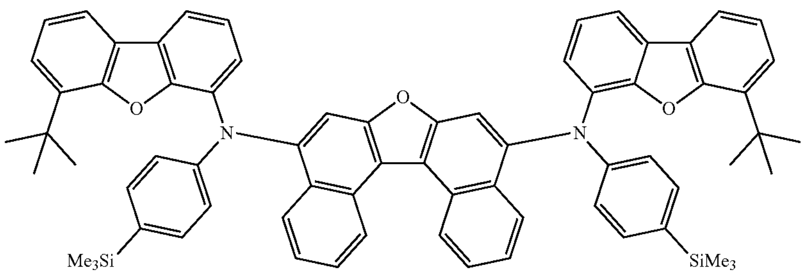
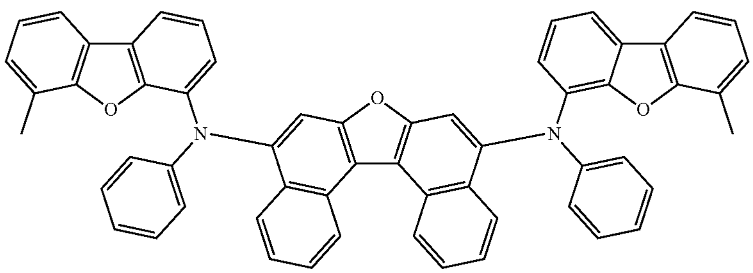
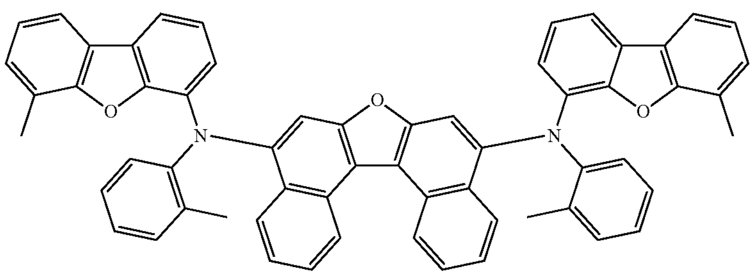
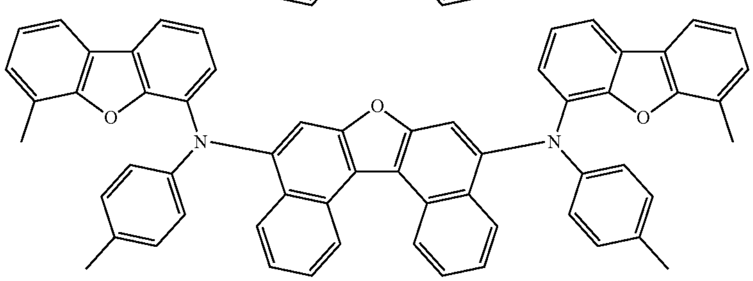
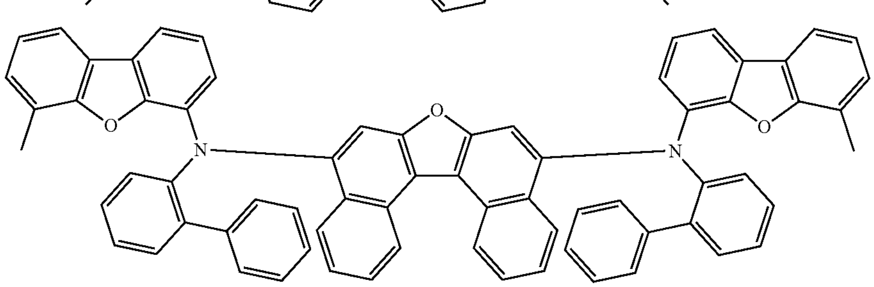

-continued
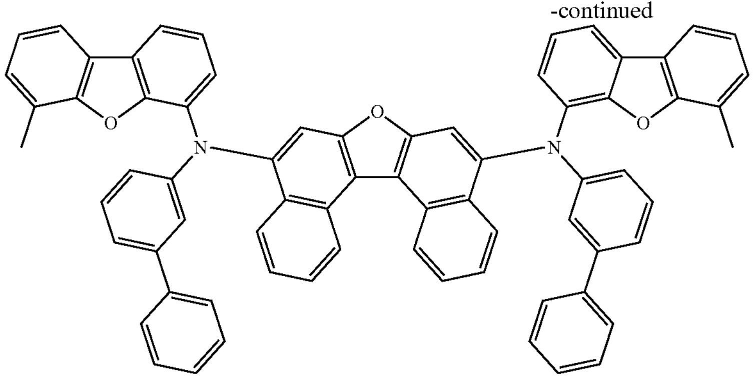
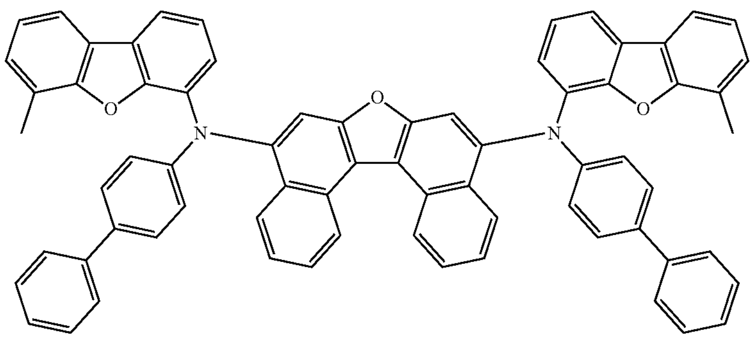
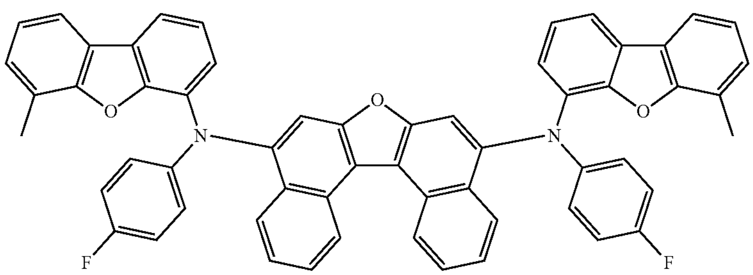
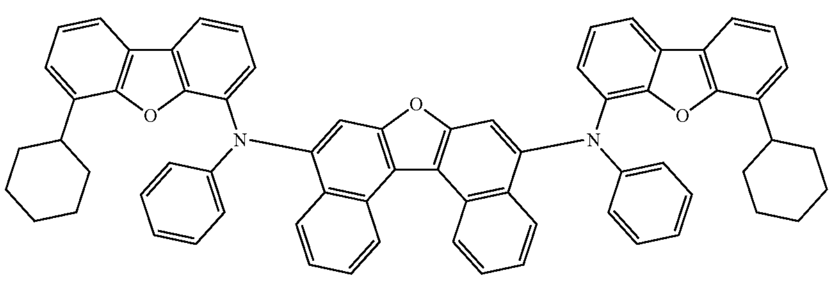
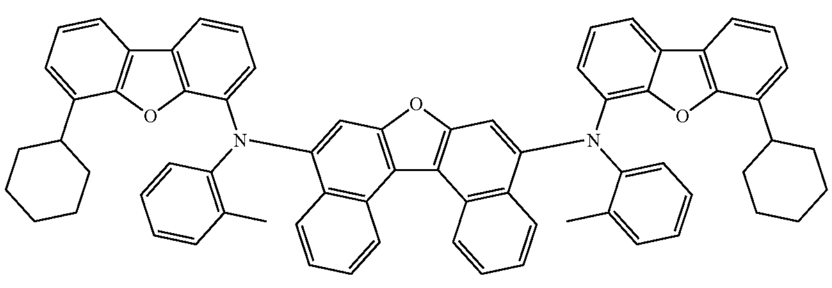

-continued
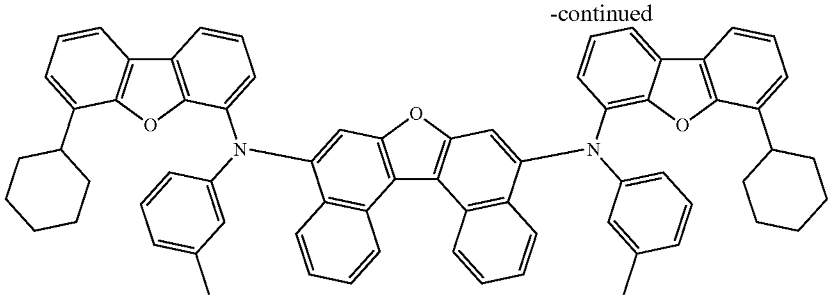
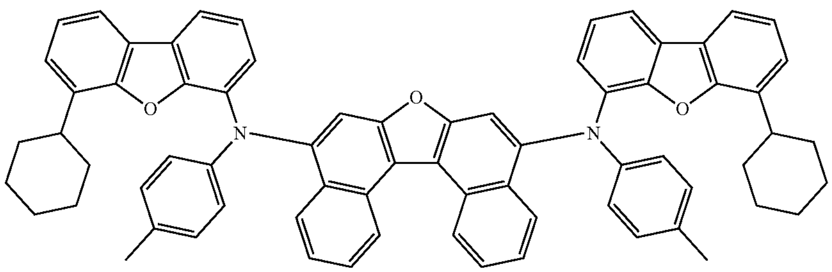
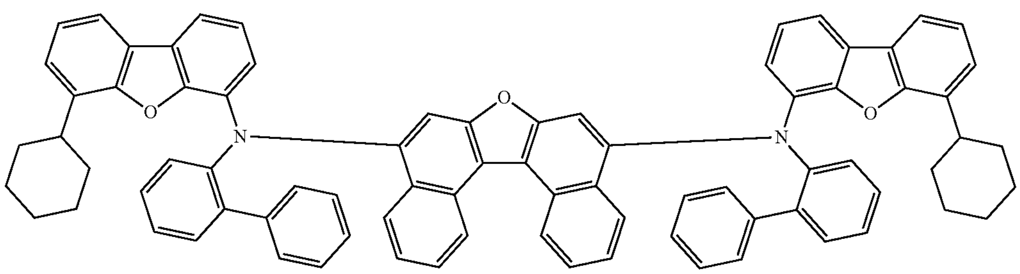
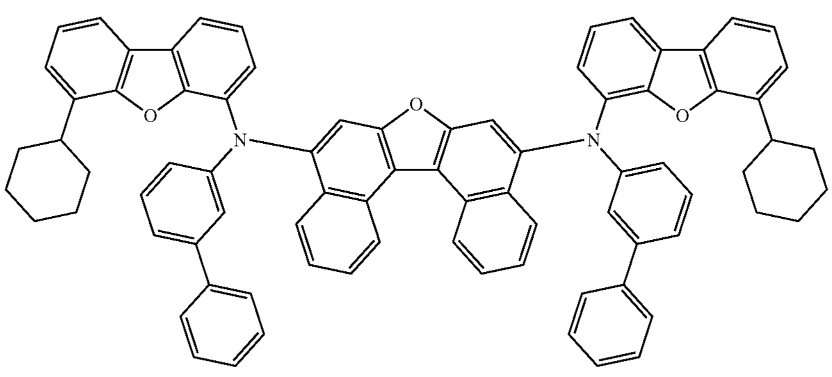
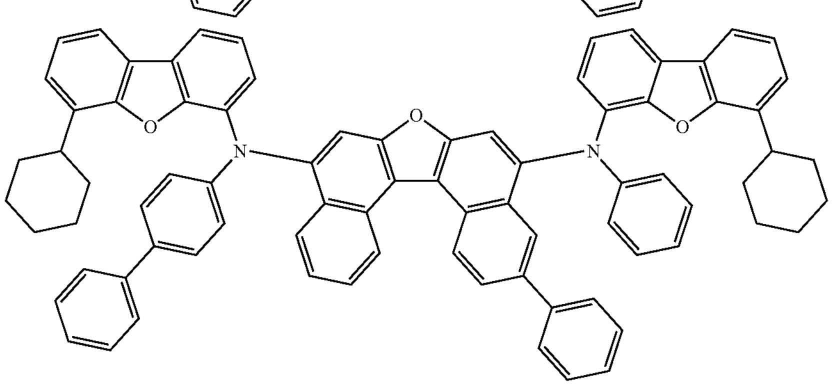

-continued
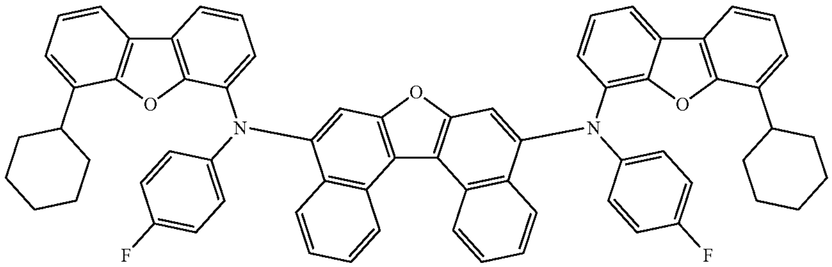
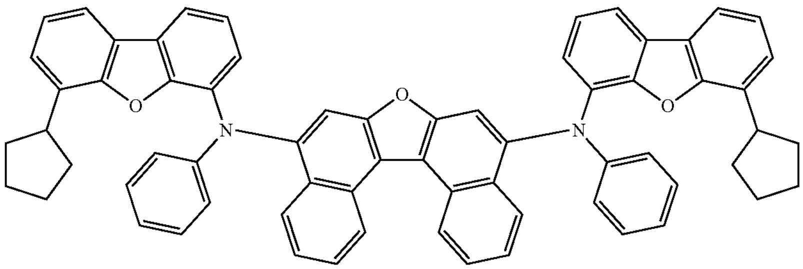
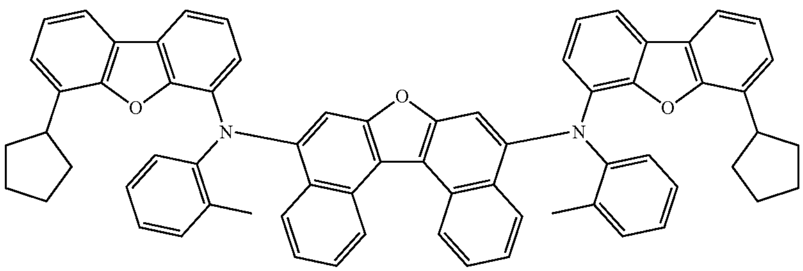
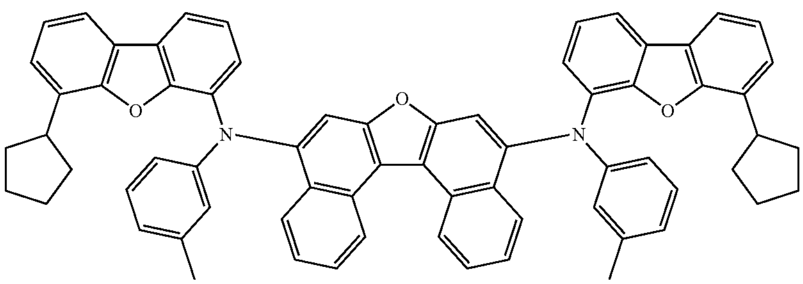
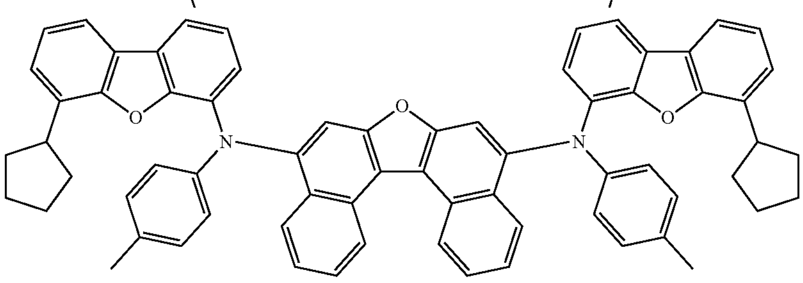
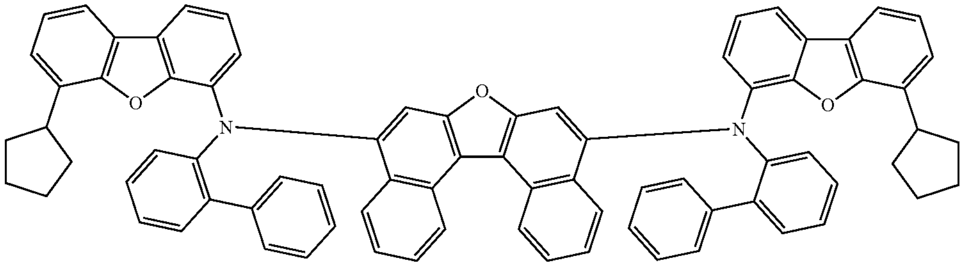

-continued
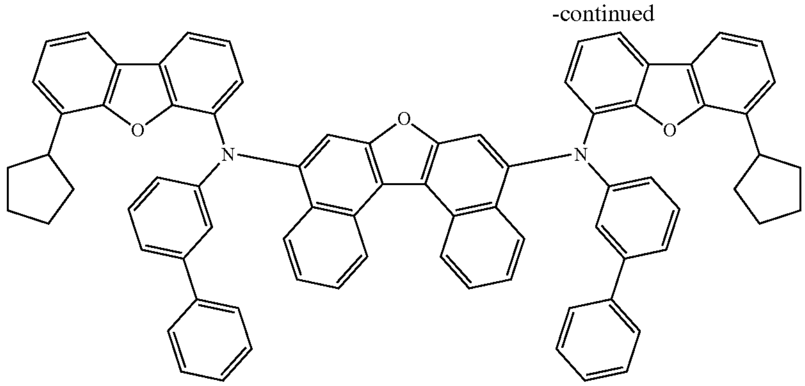
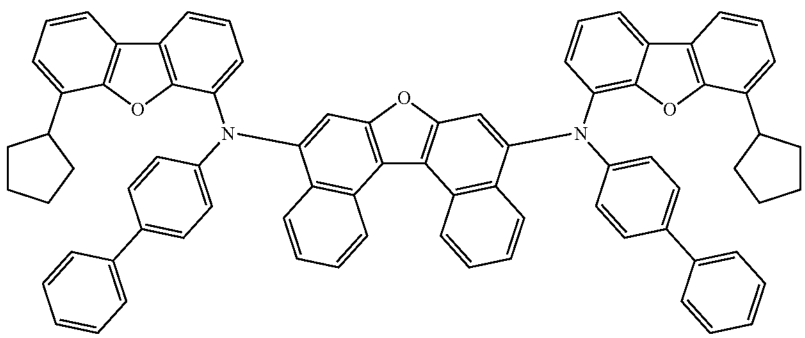
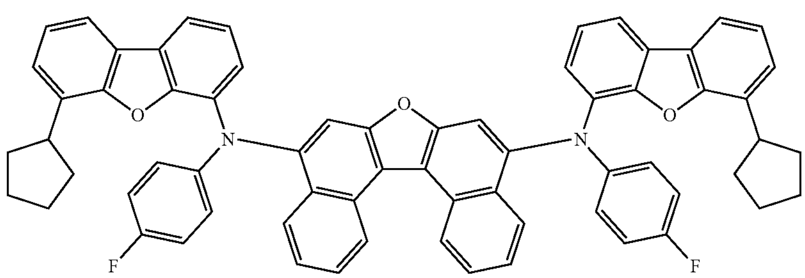
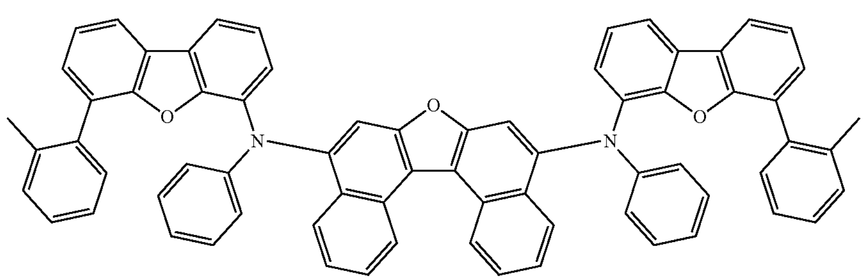
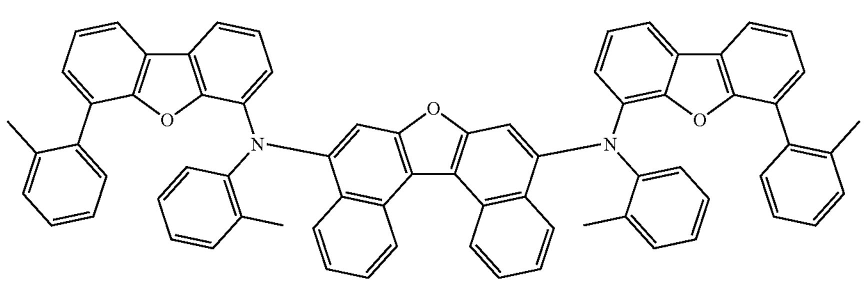

-continued
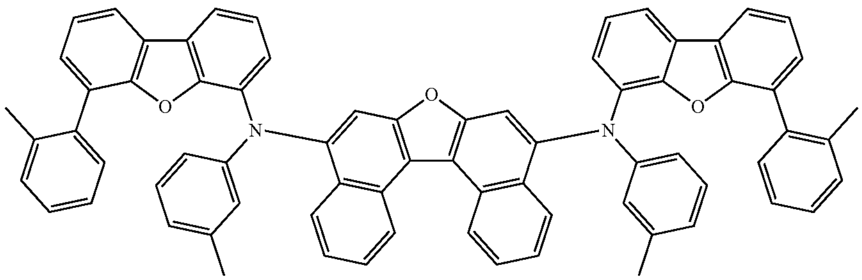
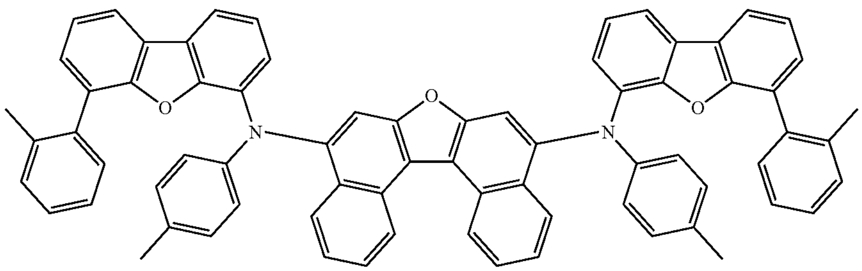
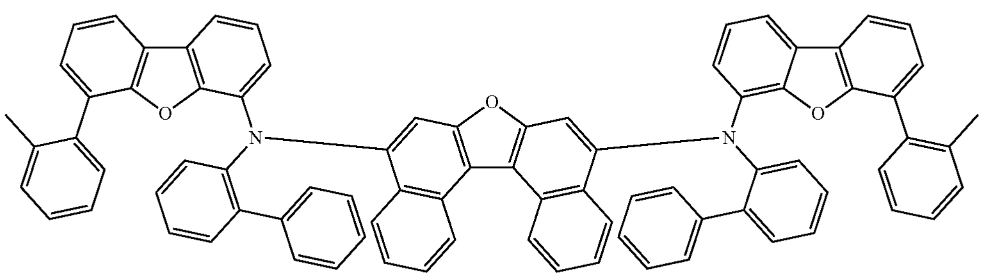
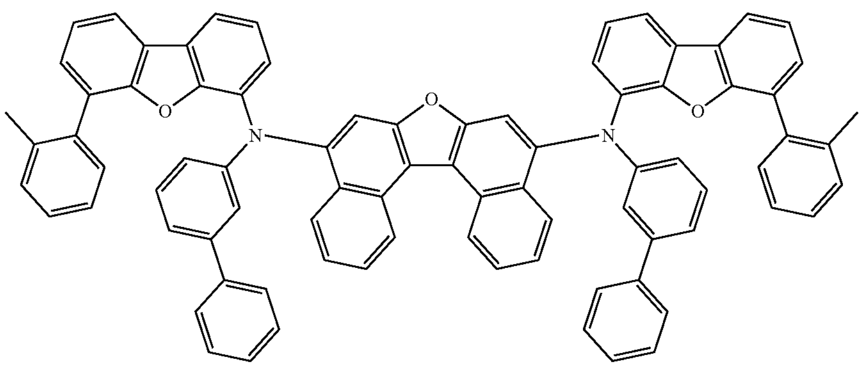
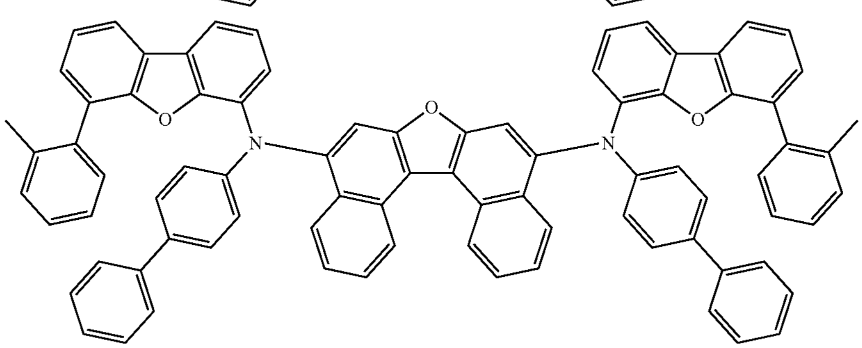

-continued
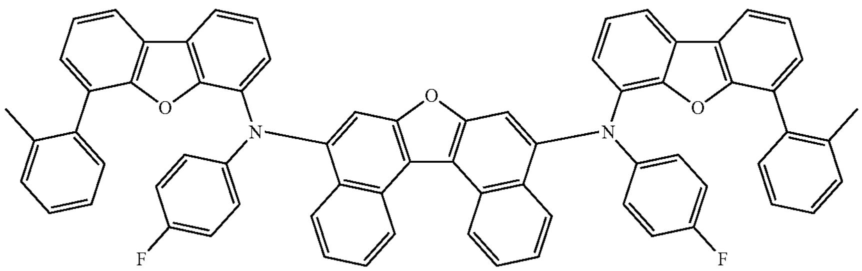
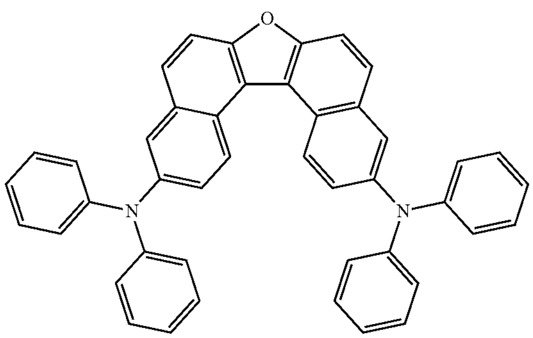
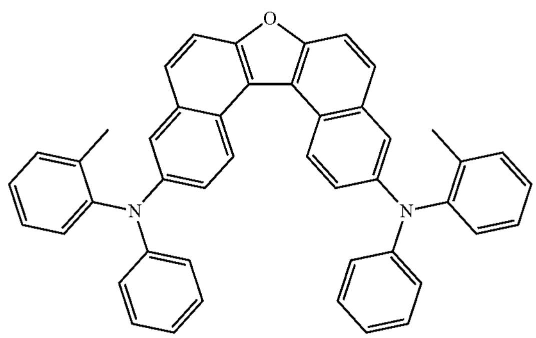
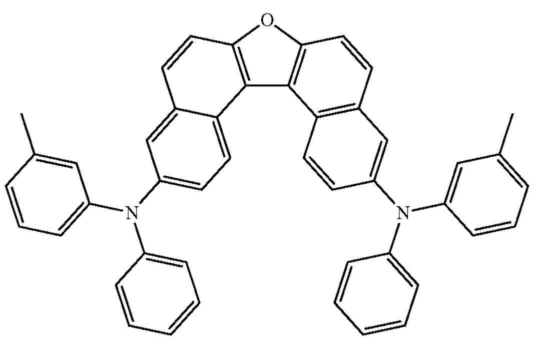
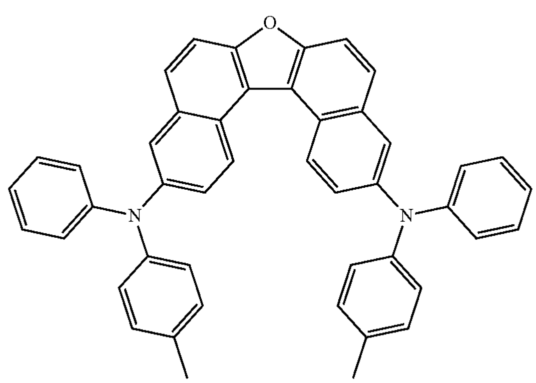
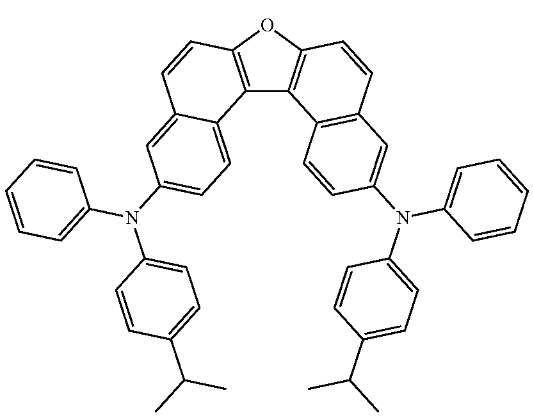
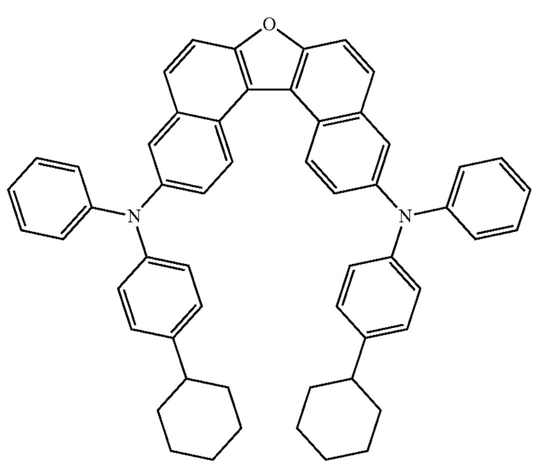

-continued
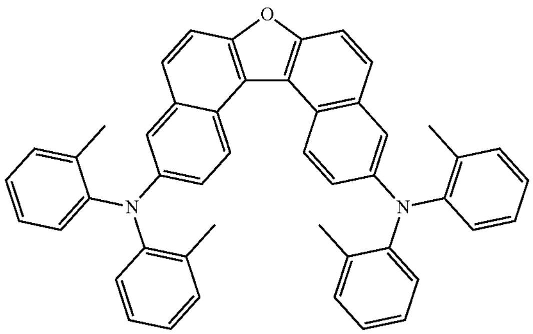
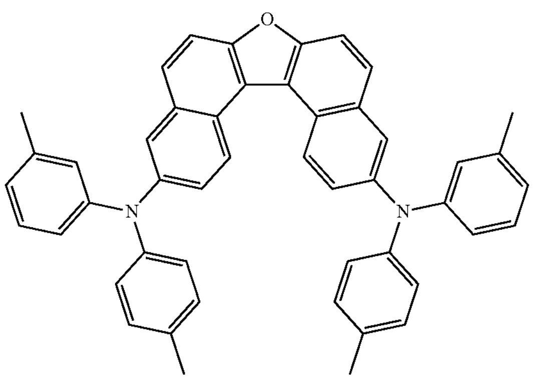
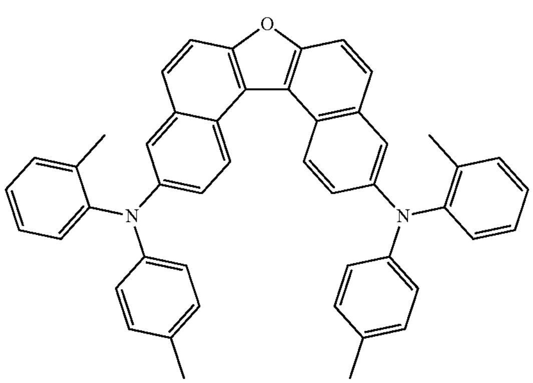
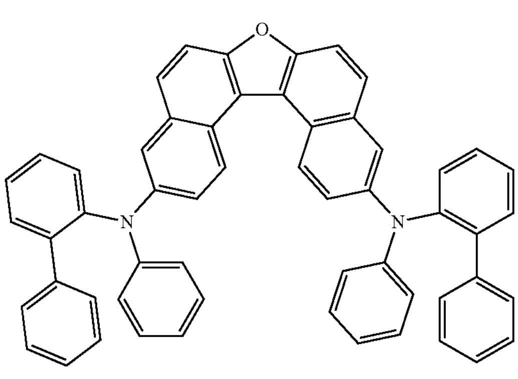
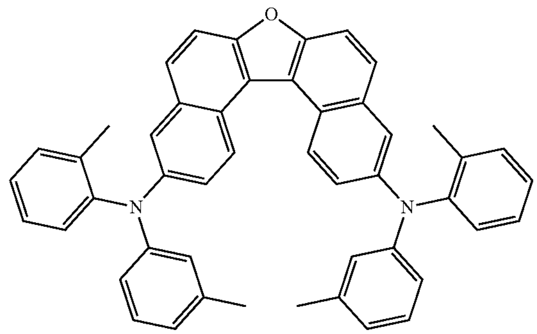
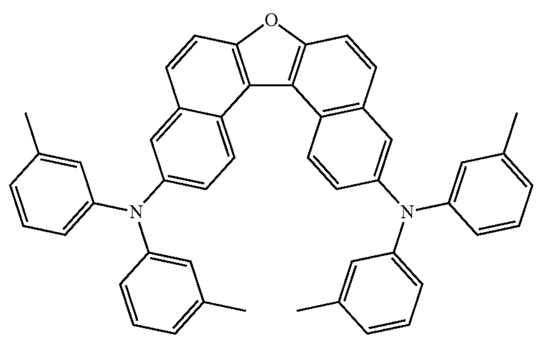
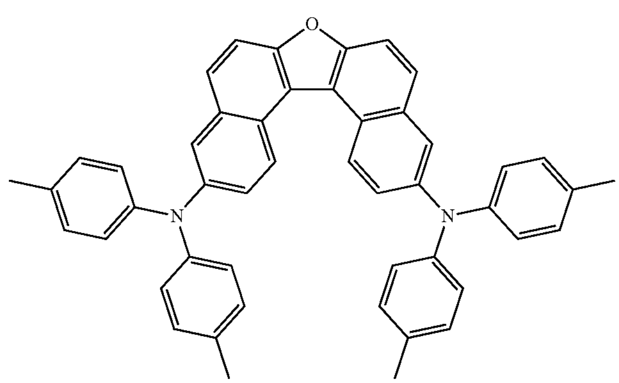
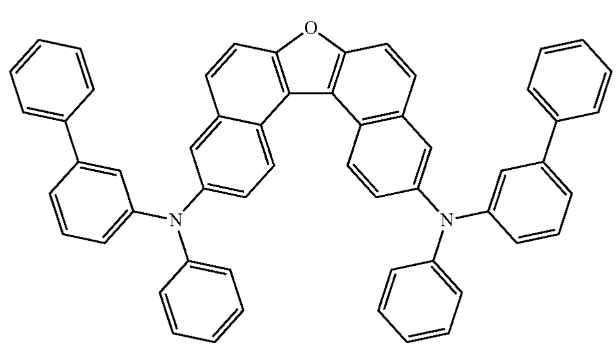

-continued
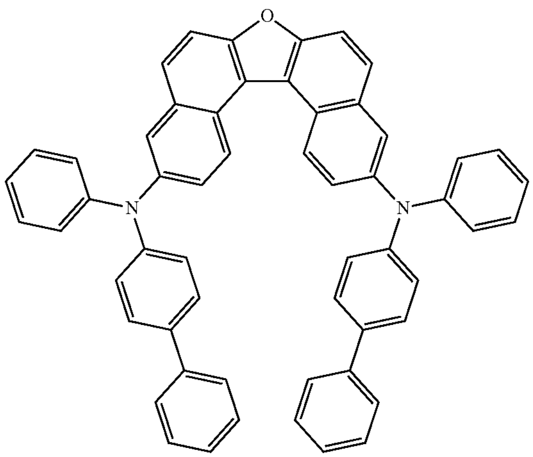
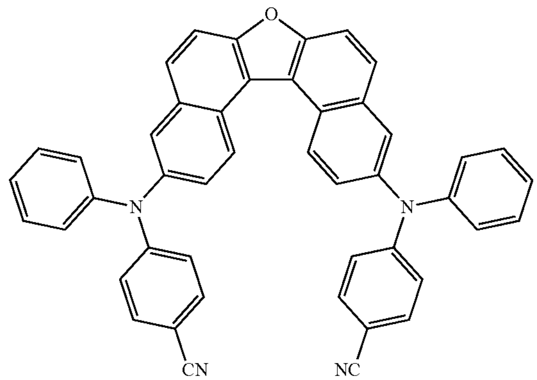
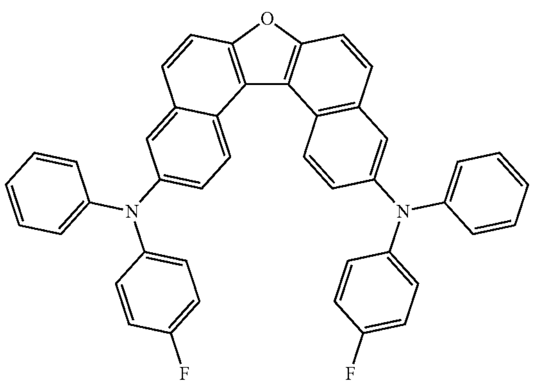
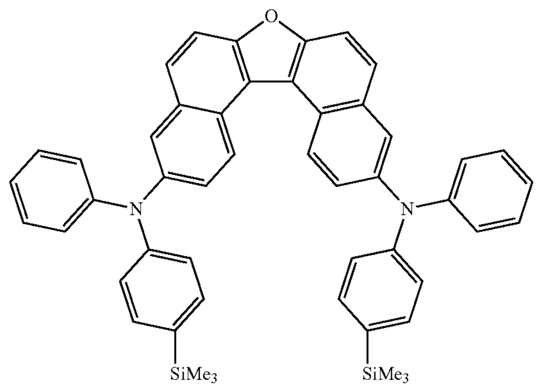
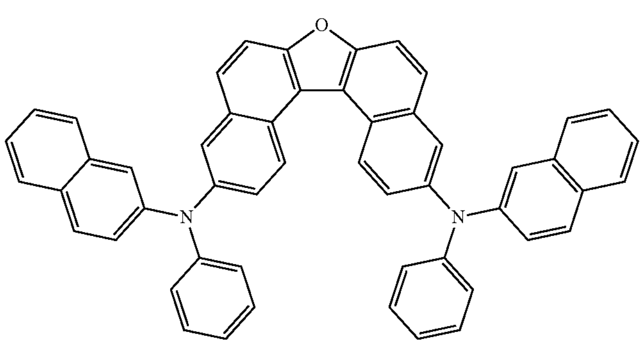
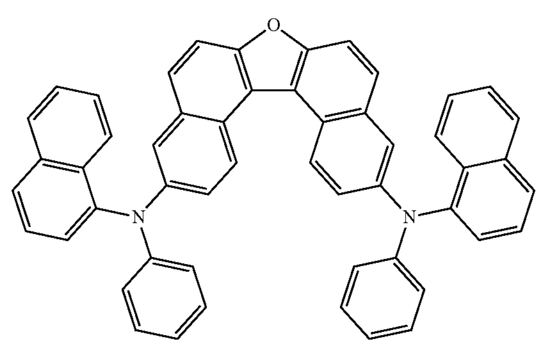
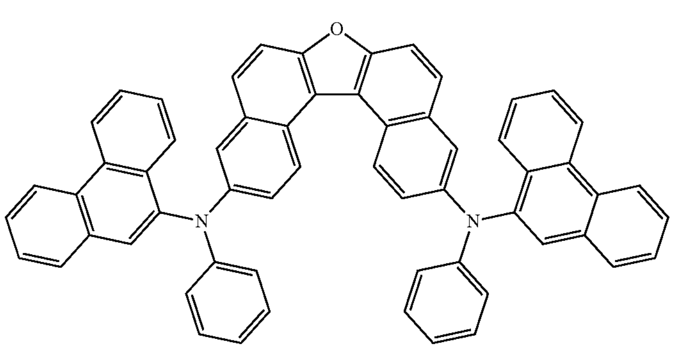

-continued
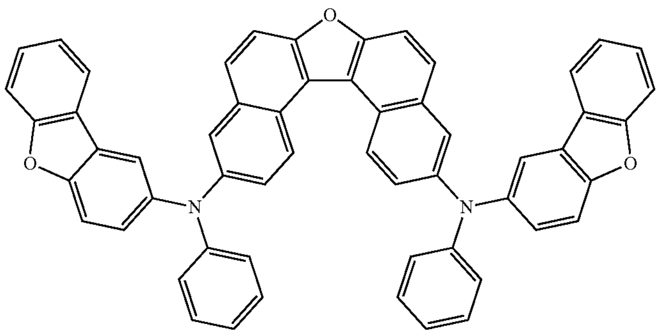
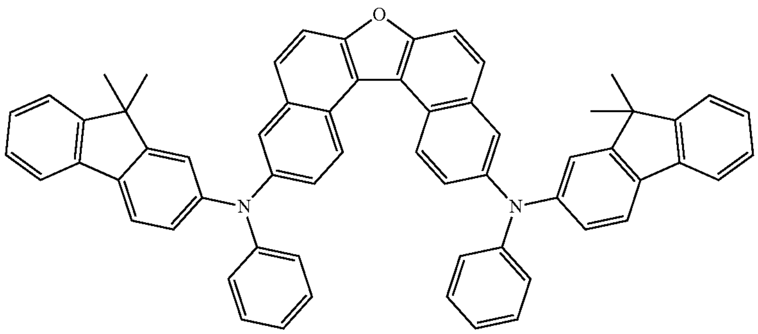
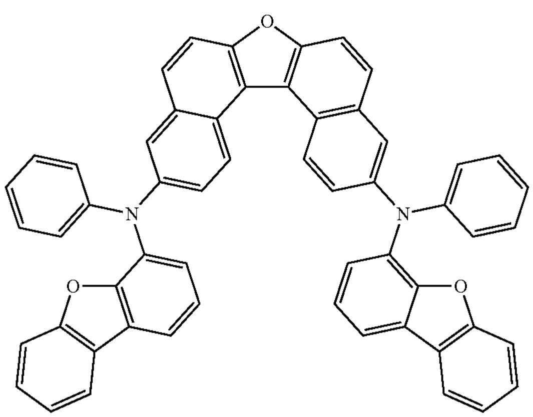
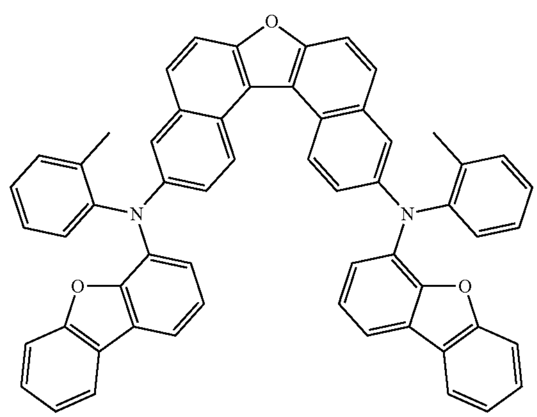
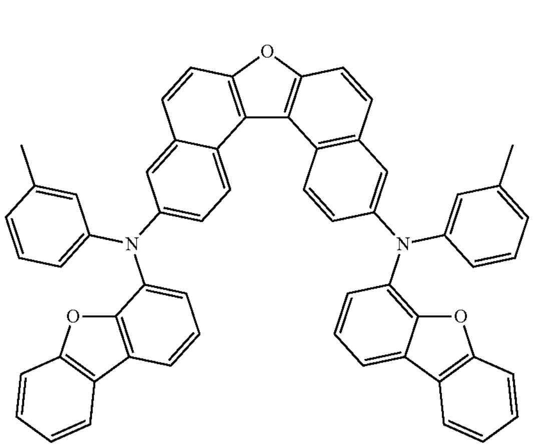
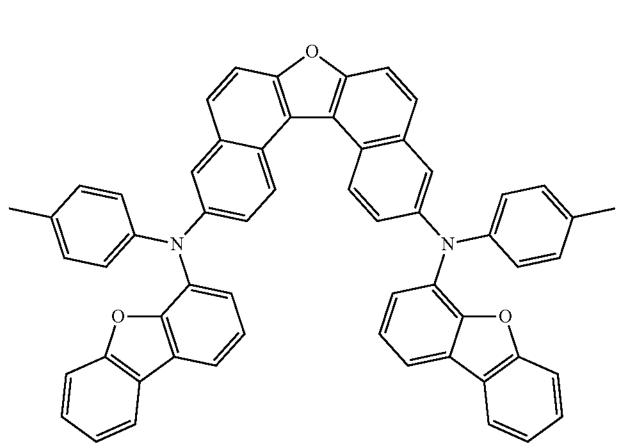

-continued
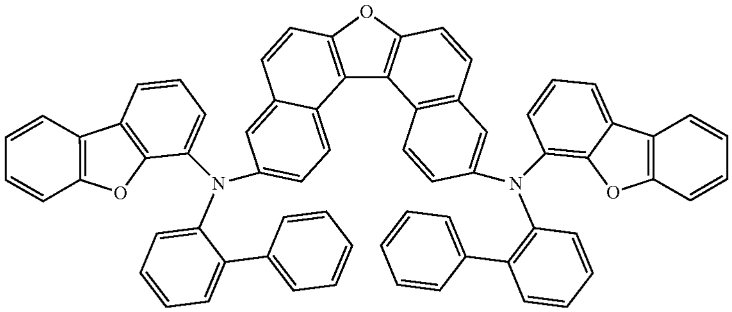
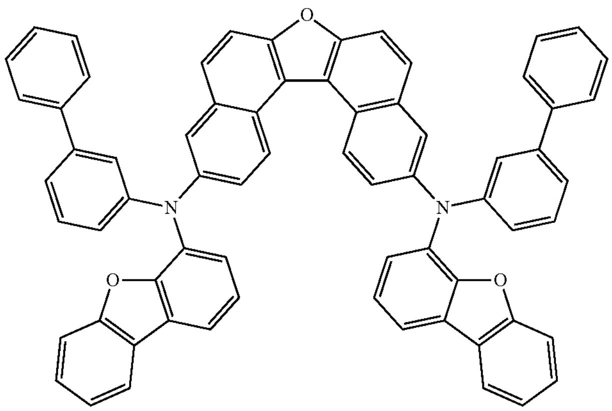
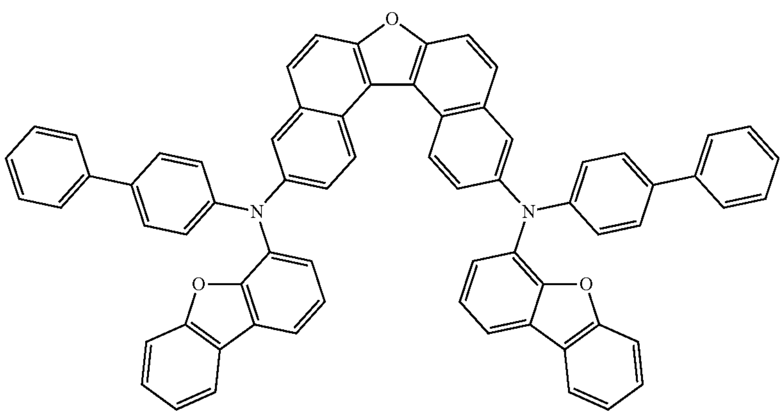
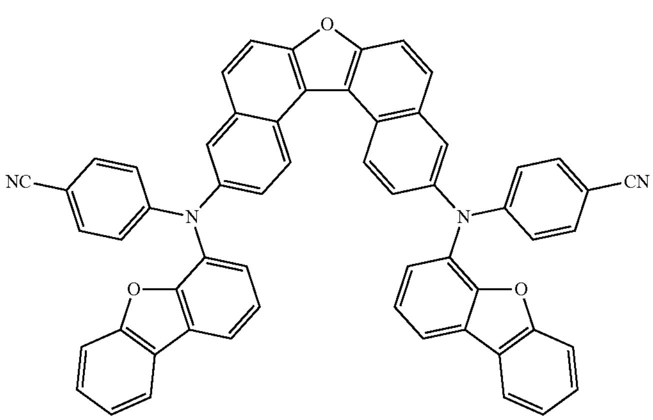

-continued
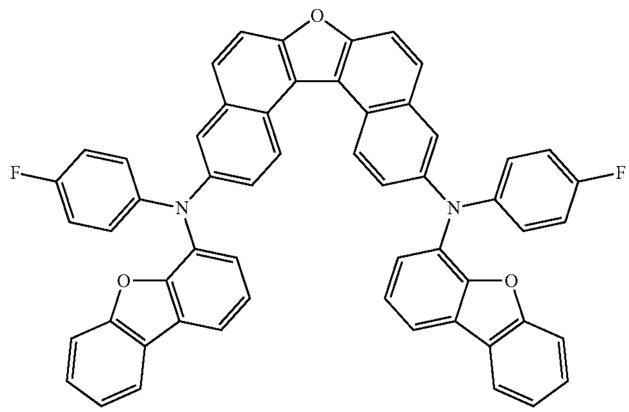
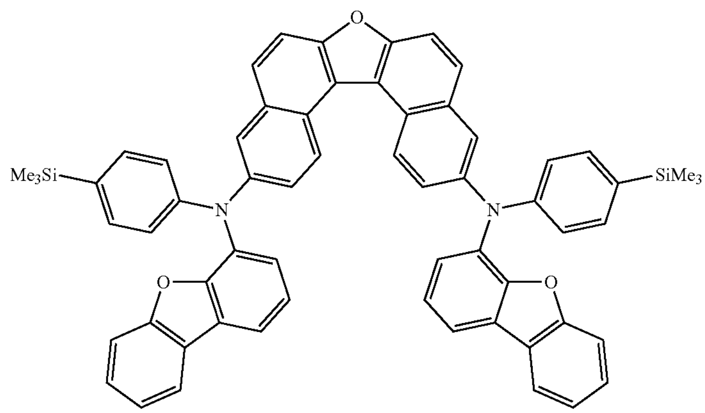
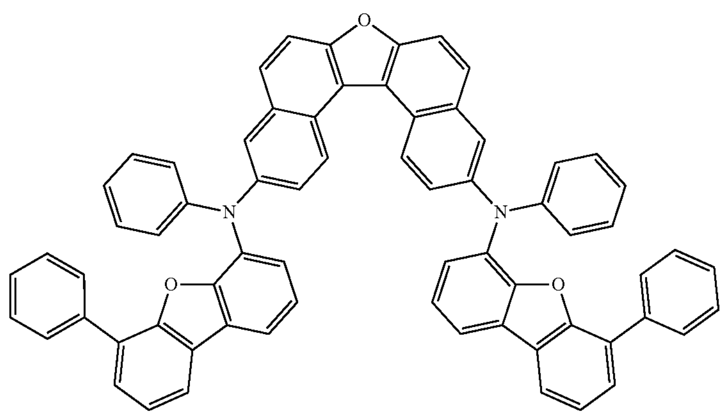
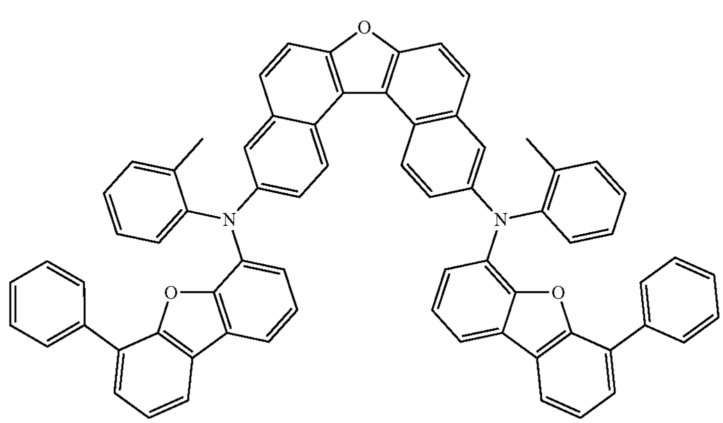

-continued
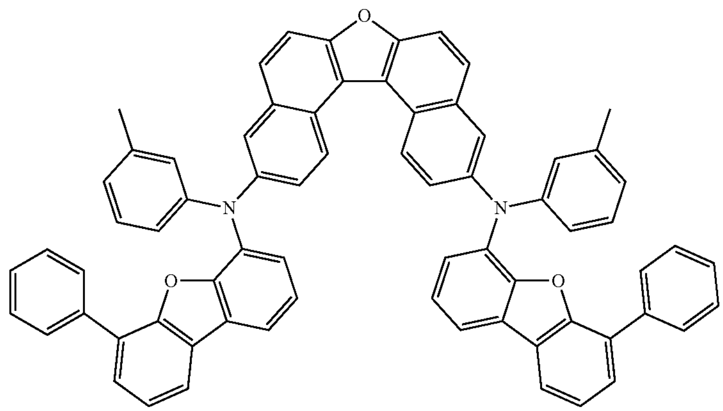
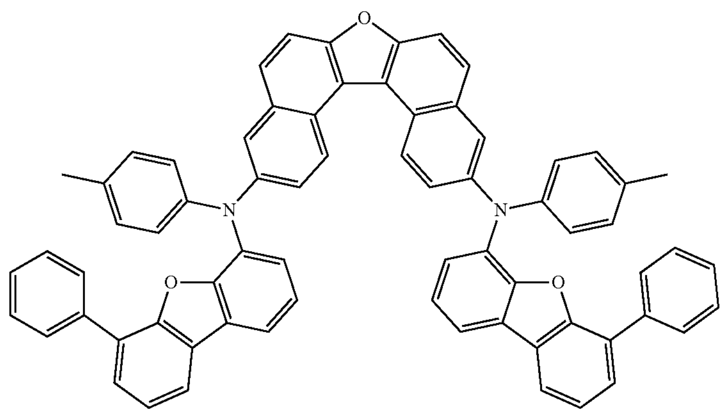
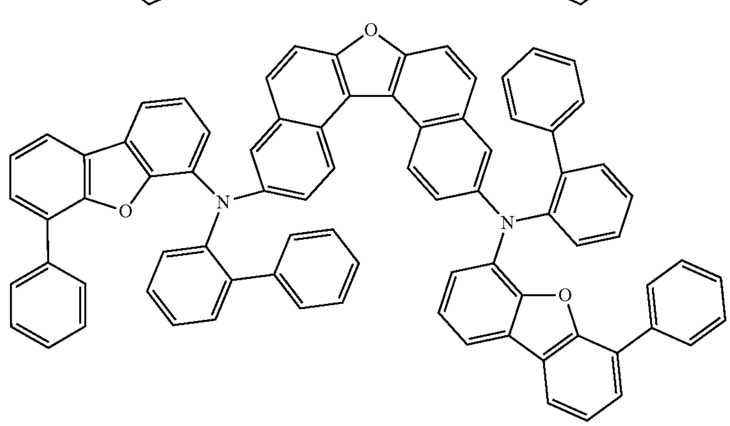
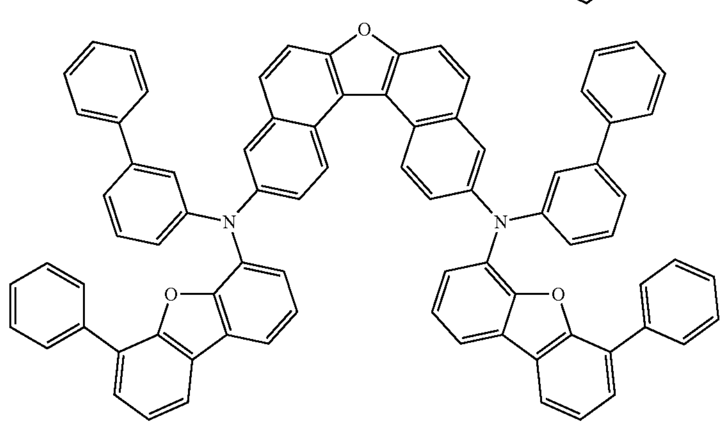

-continued
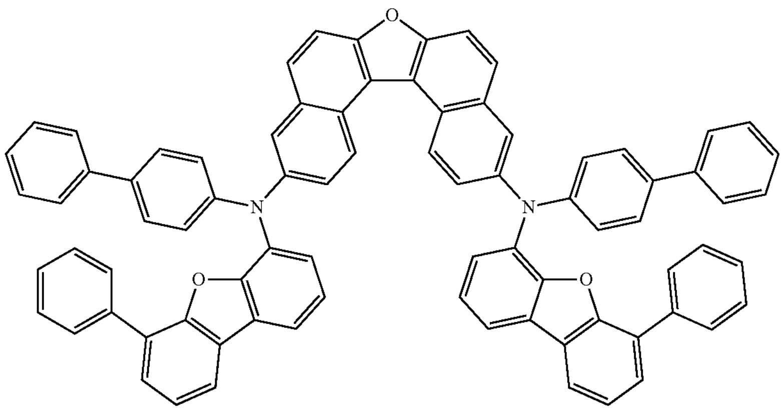
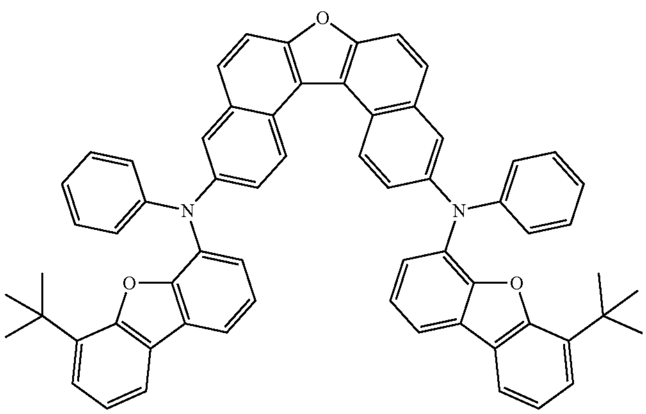
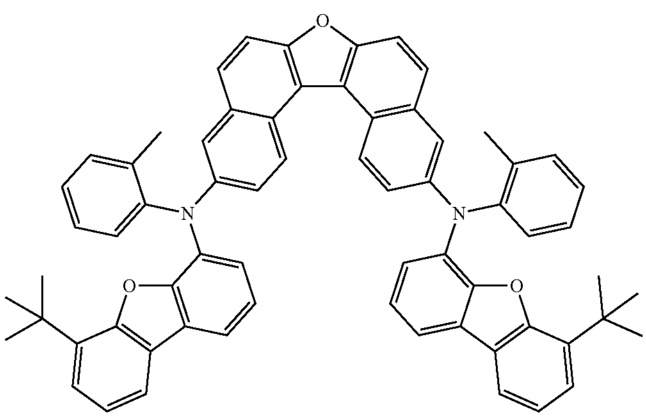
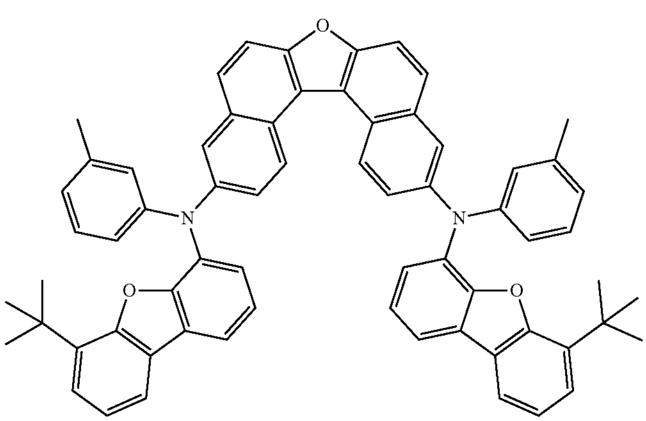

-continued
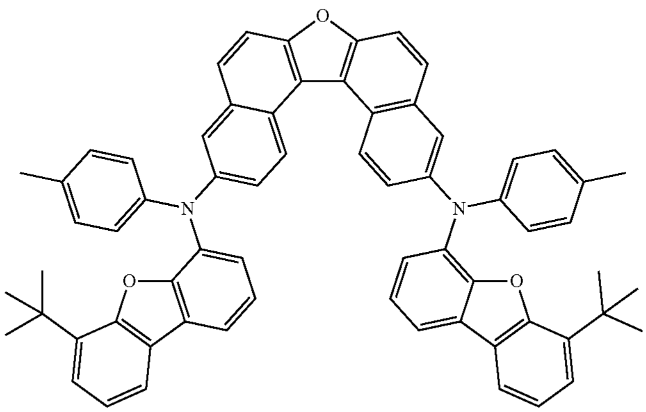
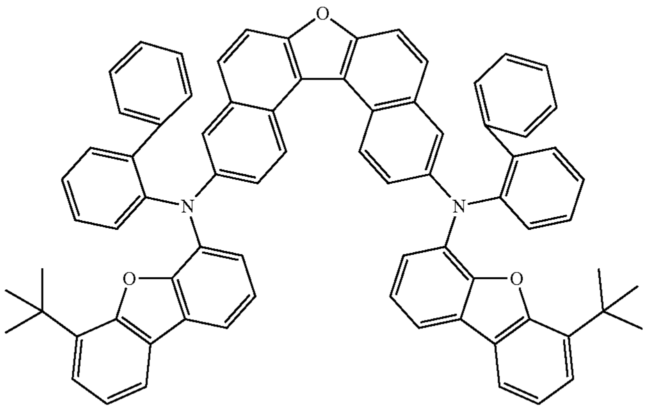
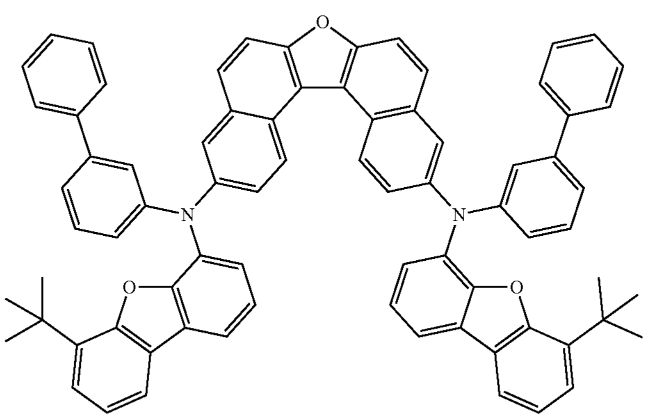
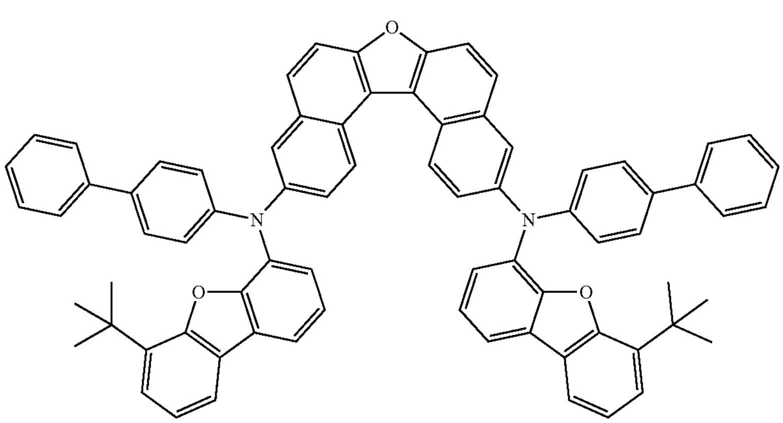

-continued
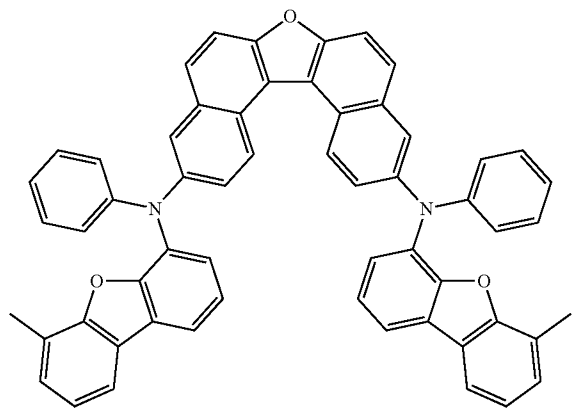
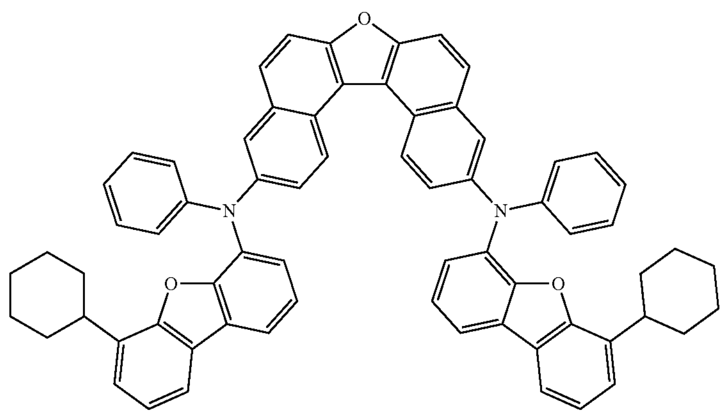
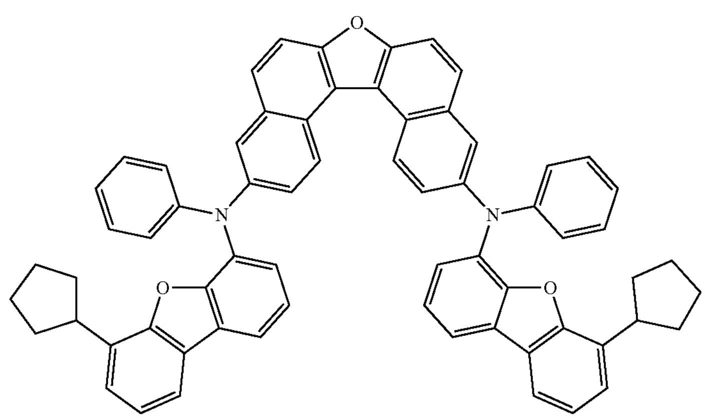
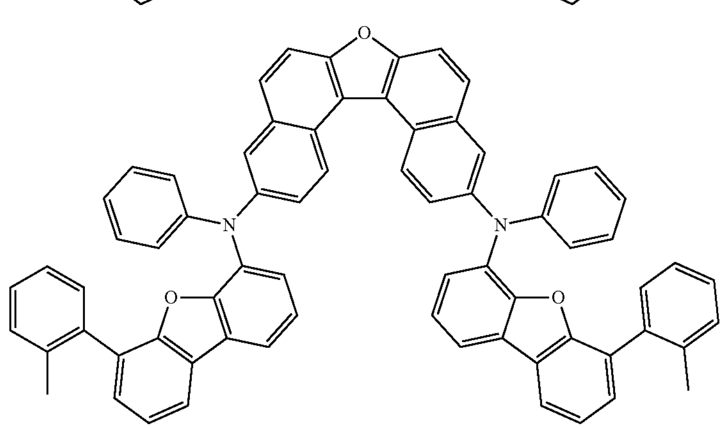

-continued
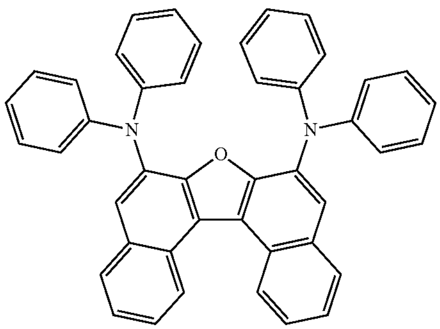
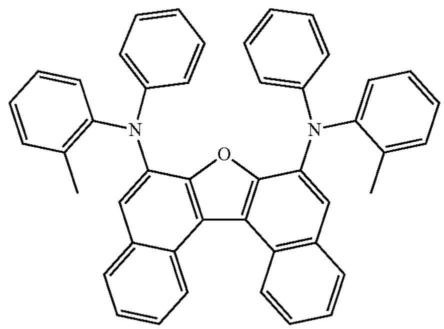
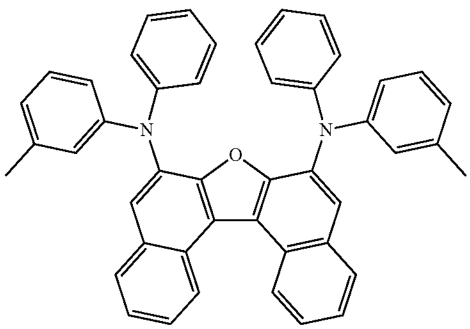
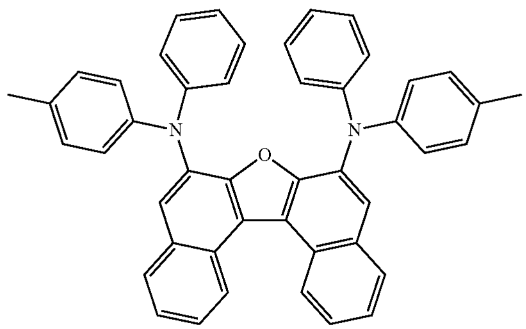
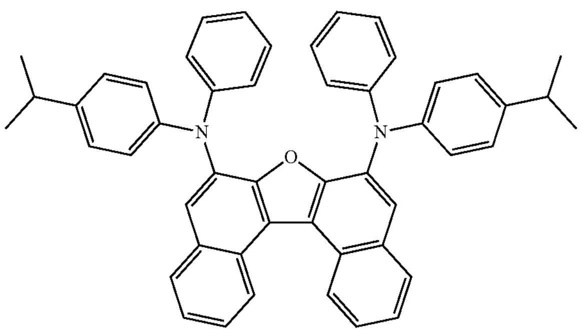
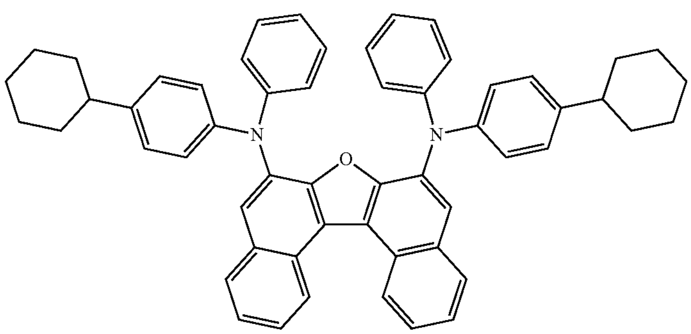
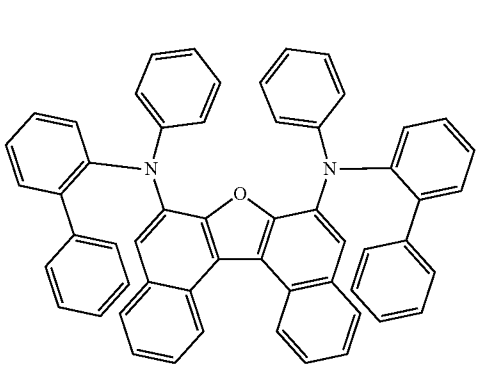
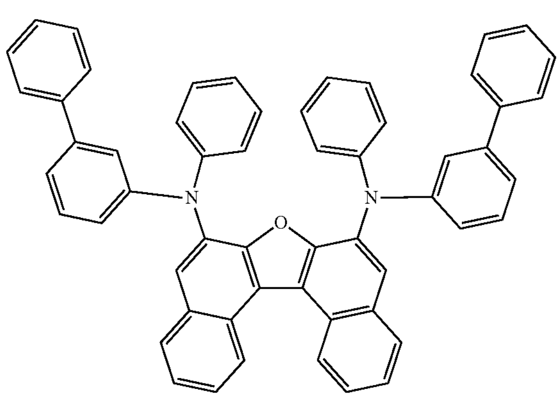

-continued
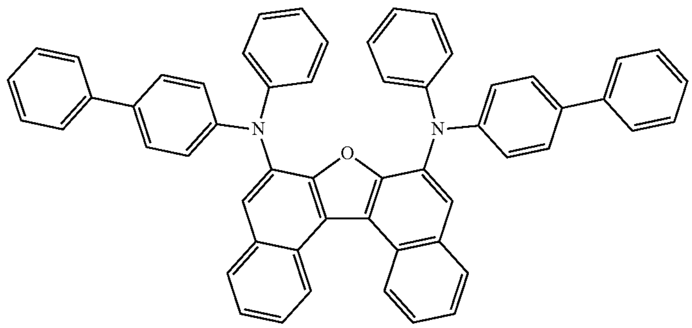
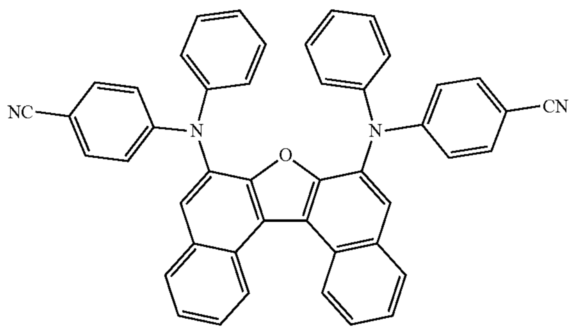
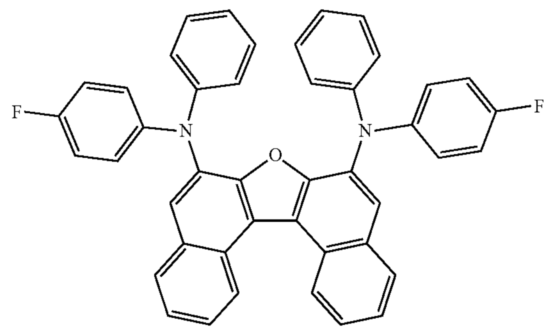
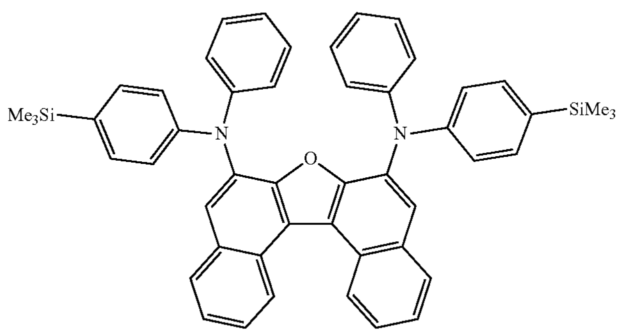
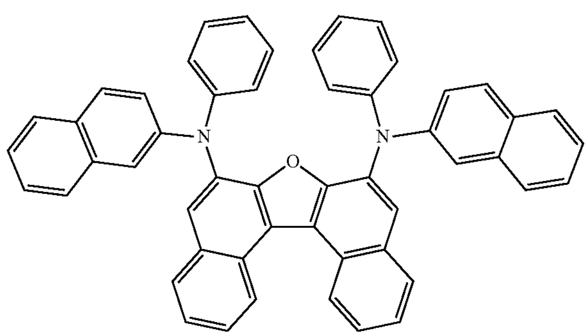
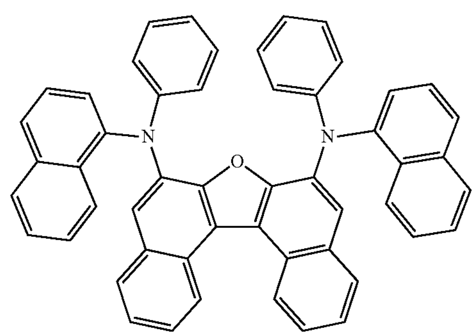
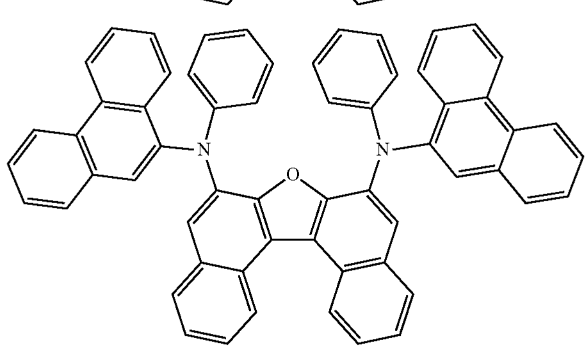

-continued
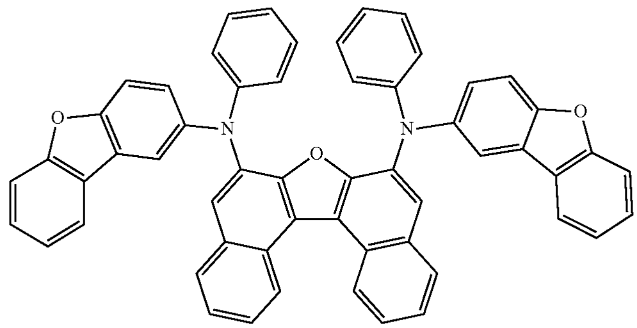
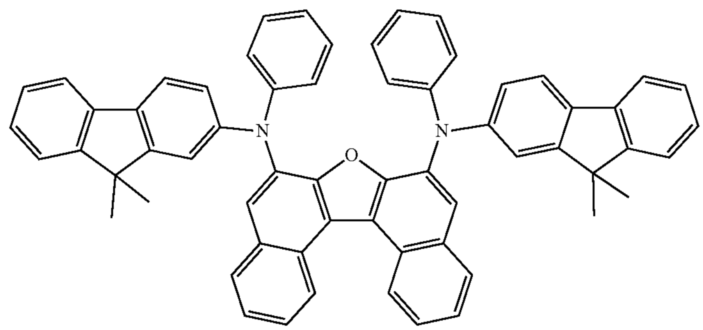
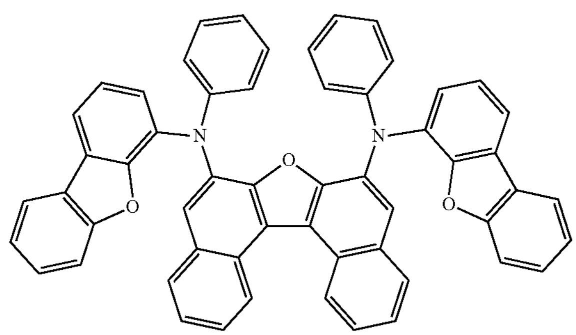
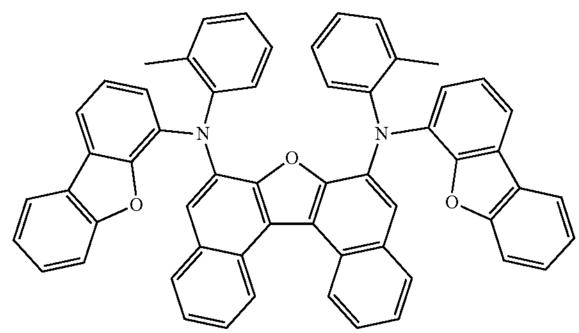
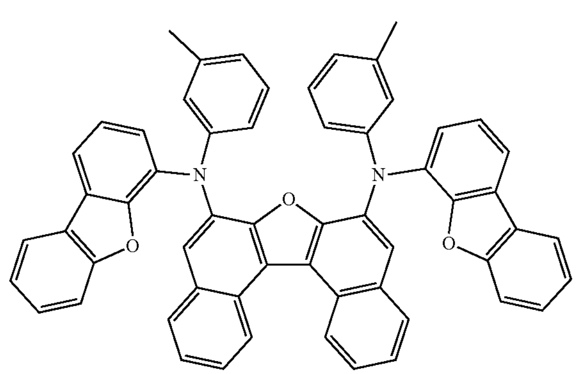
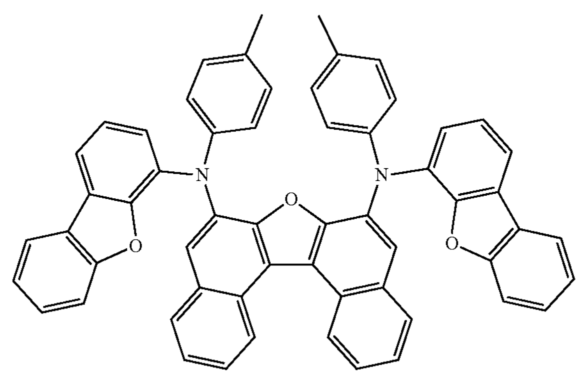

-continued
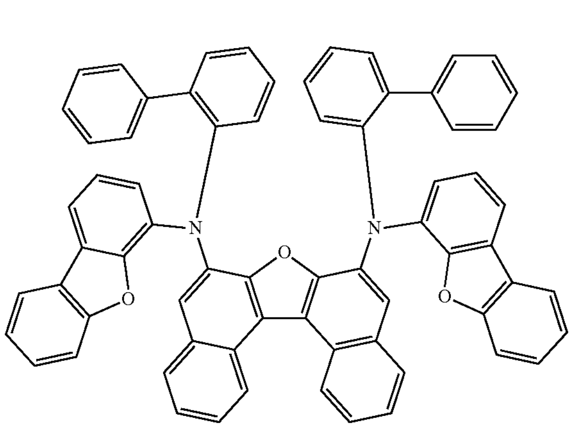
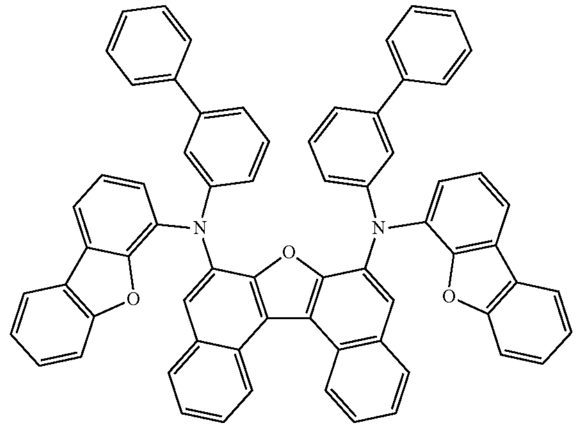
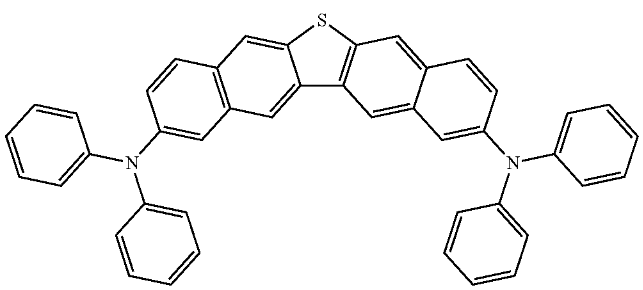
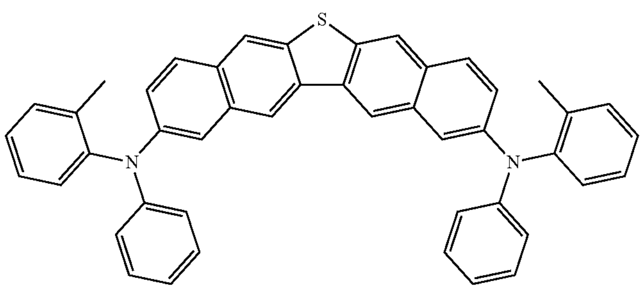
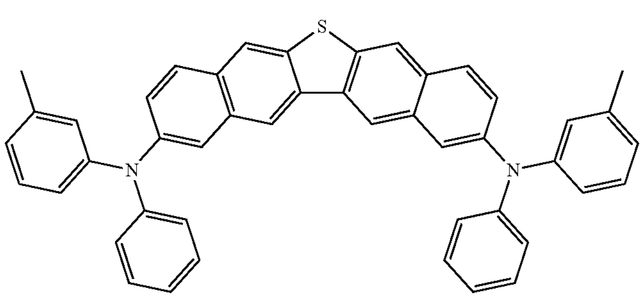
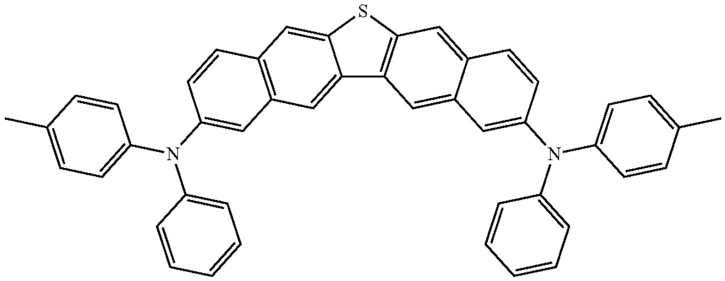

-continued
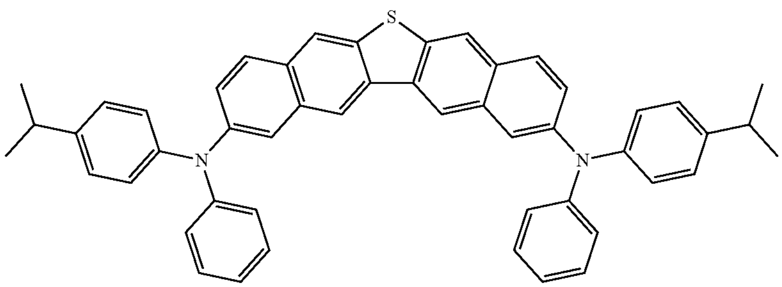
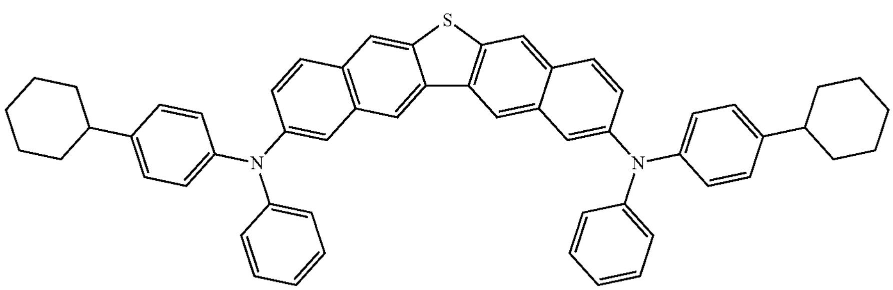
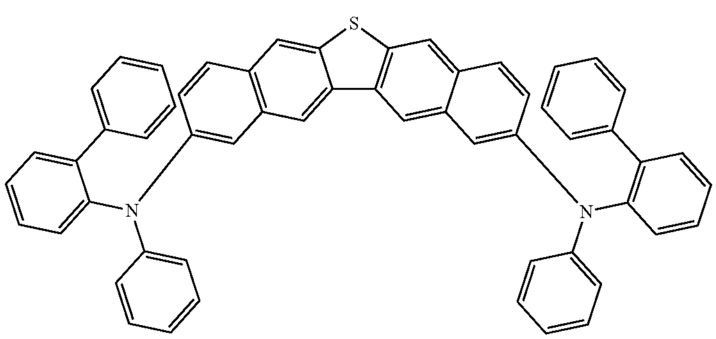
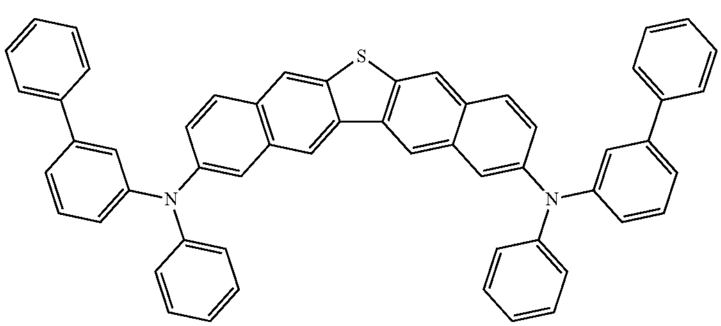
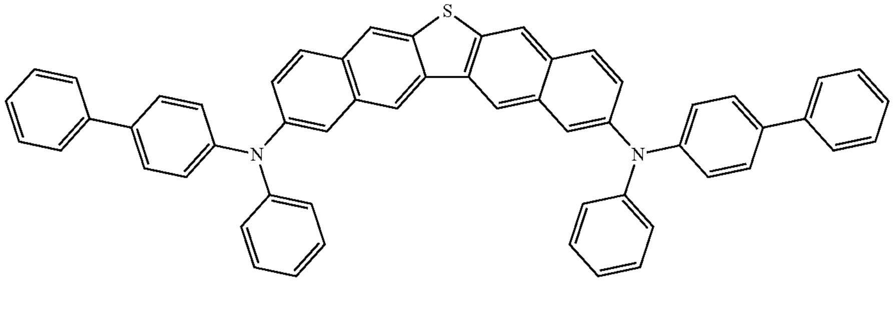

-continued
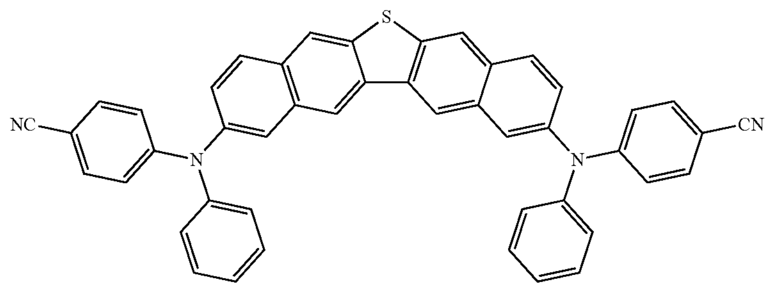
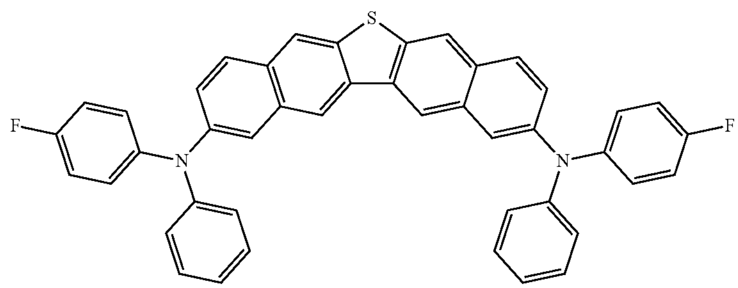
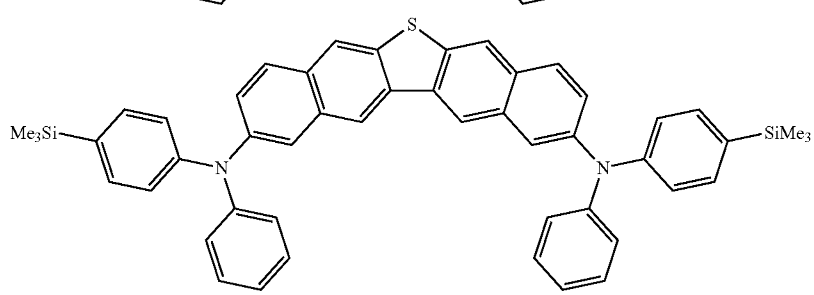
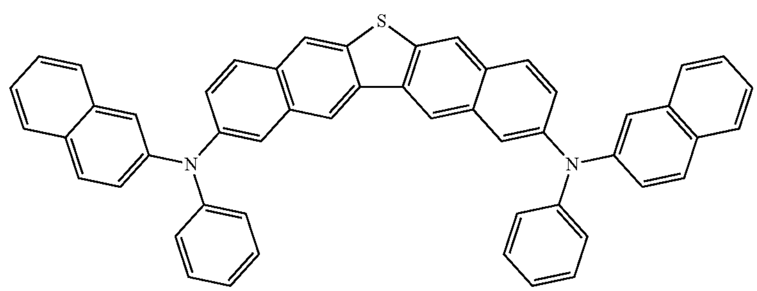
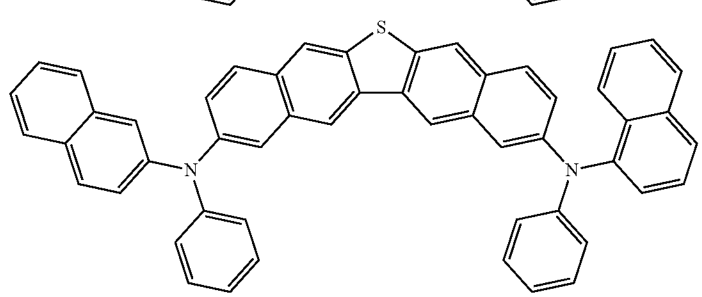
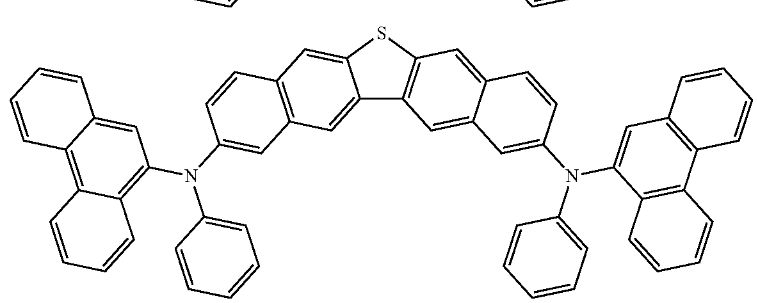

-continued
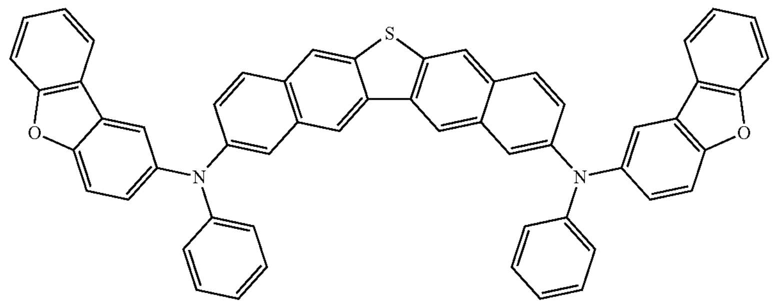
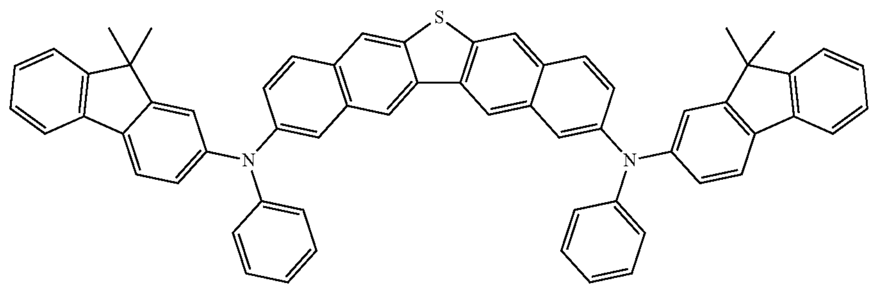
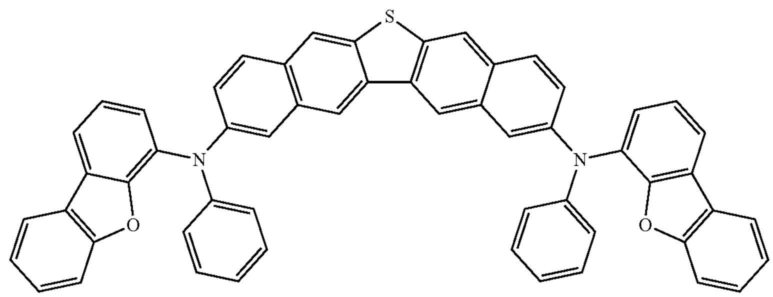
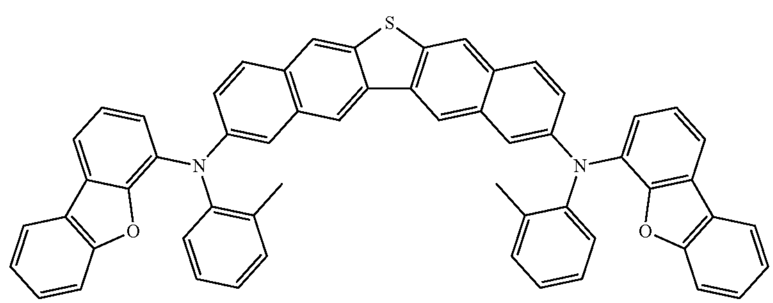
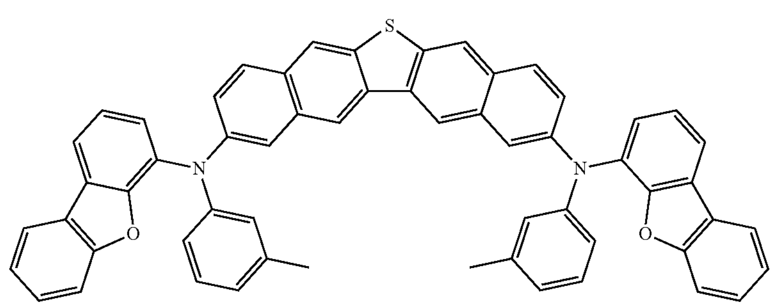

-continued
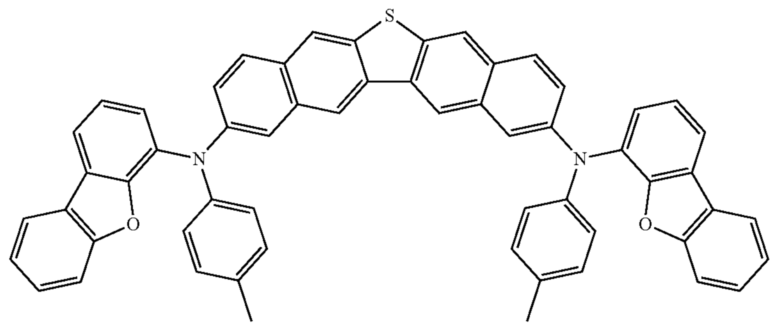
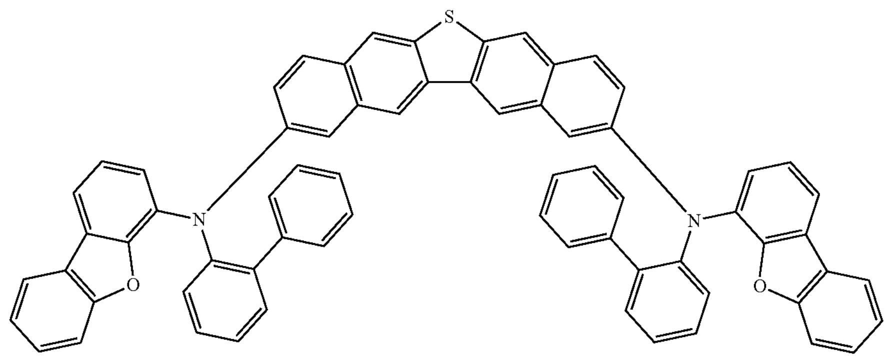
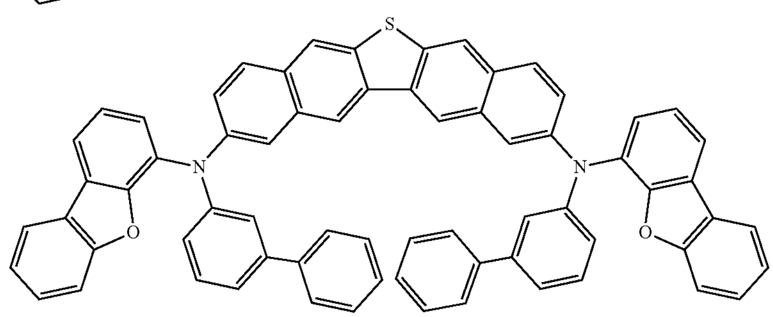
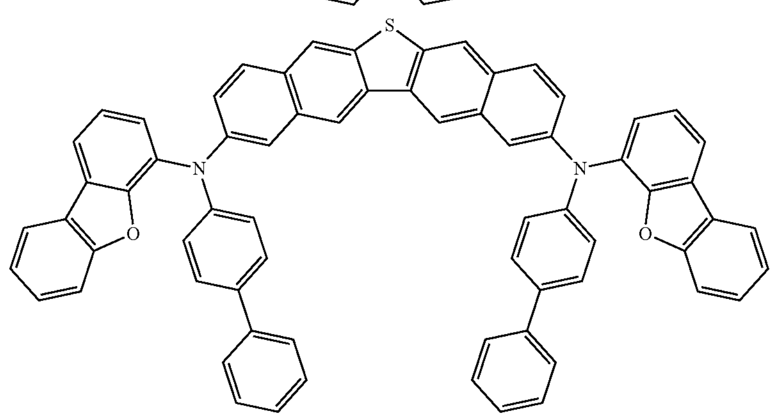
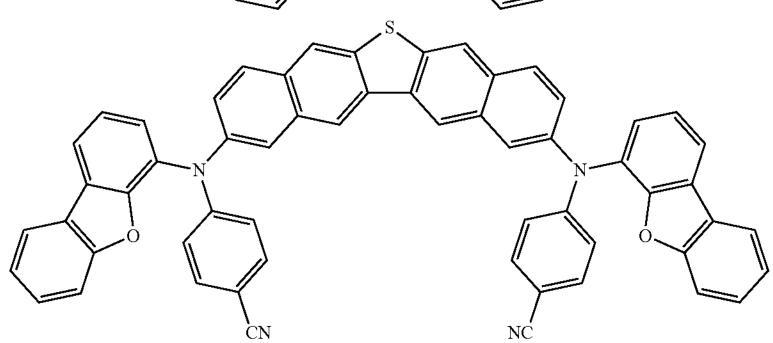

-continued
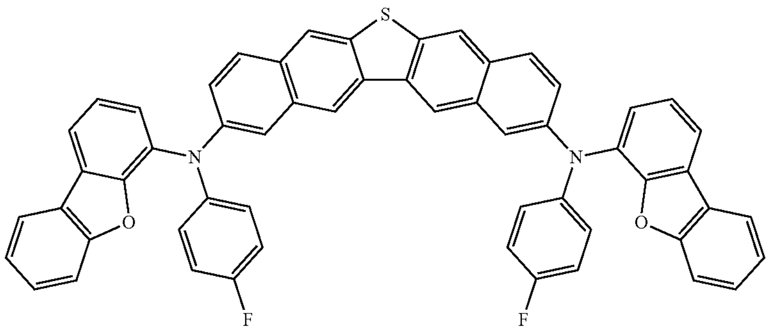
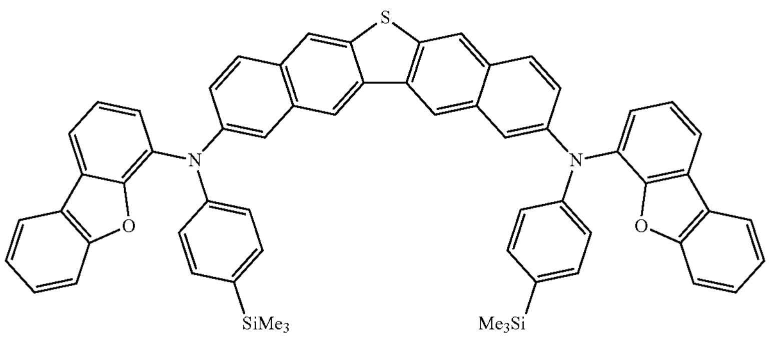
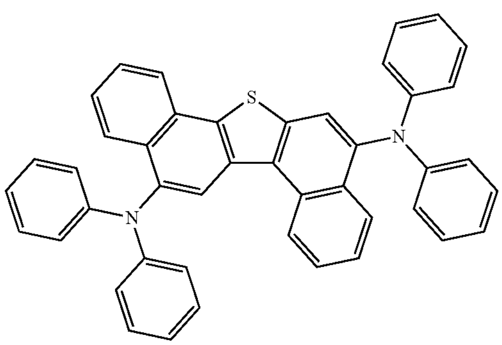
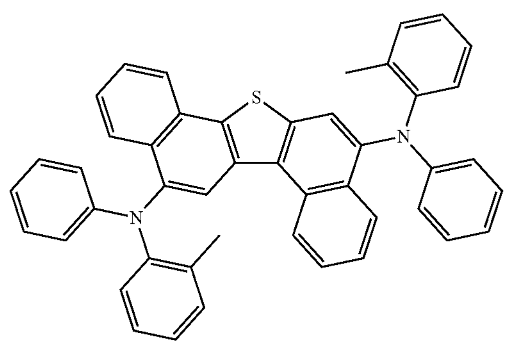
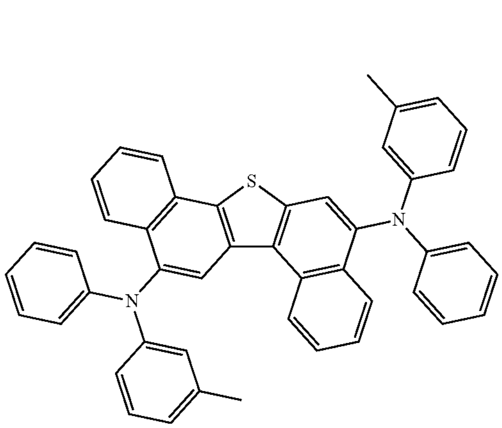
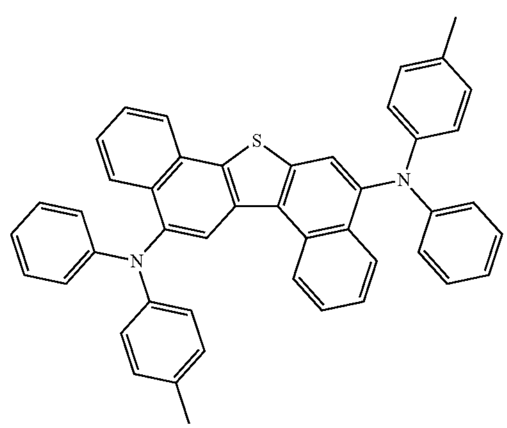

-continued
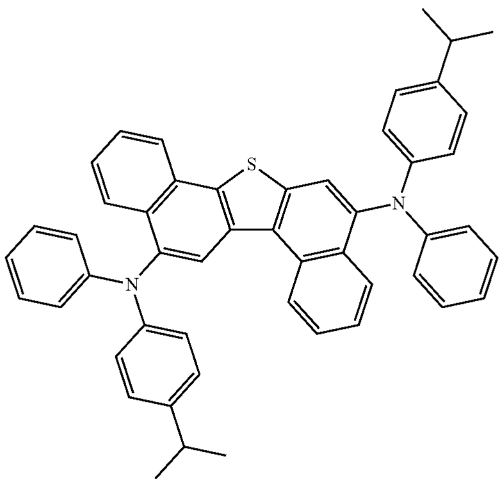
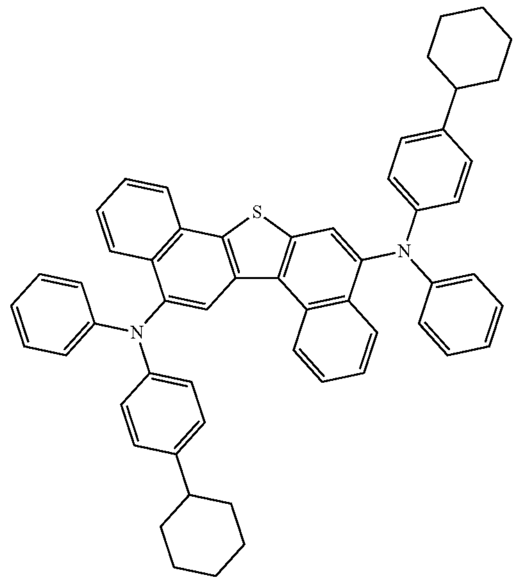
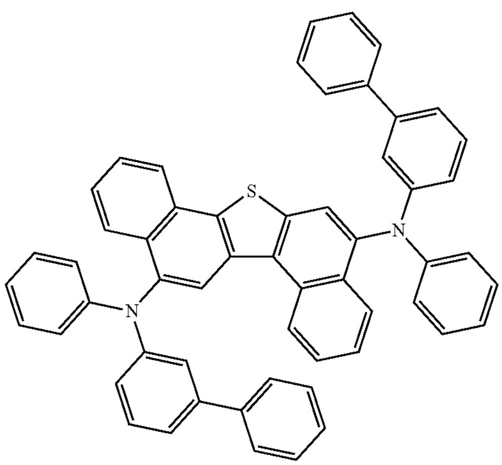
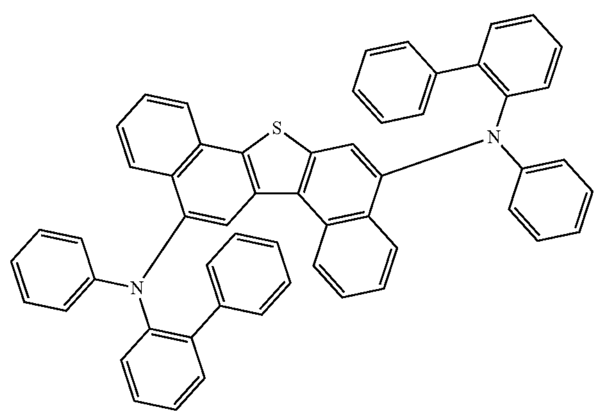
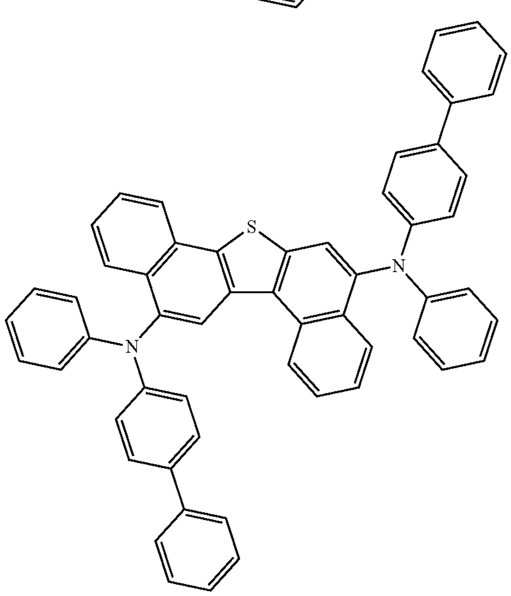
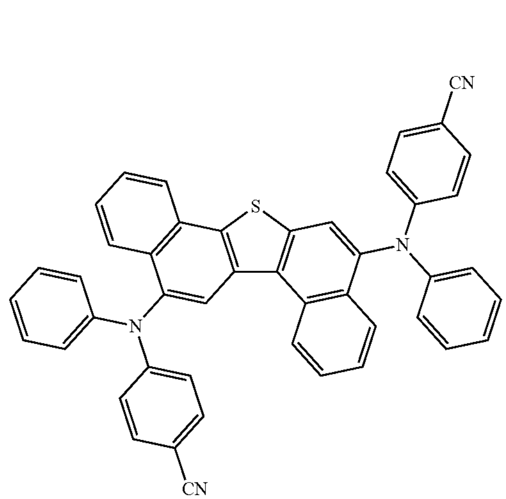

-continued
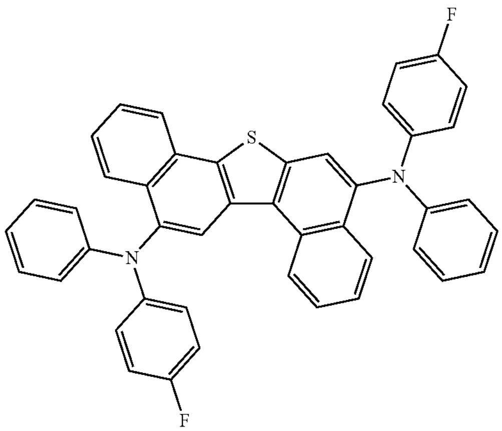
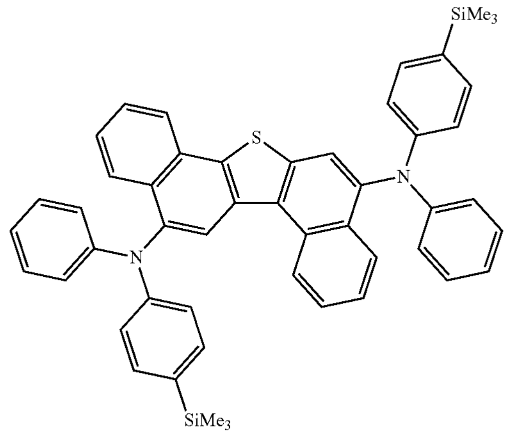
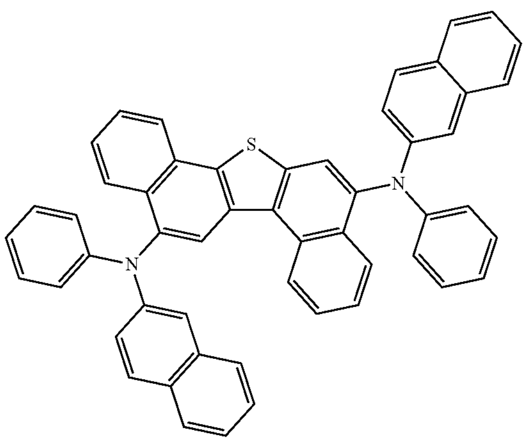
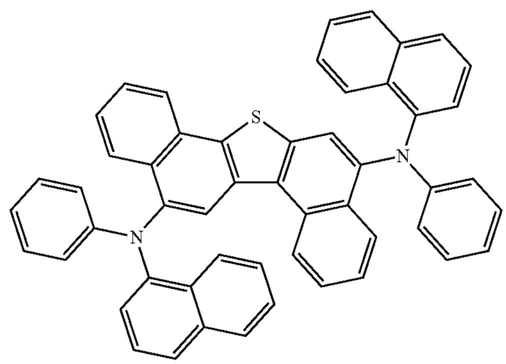
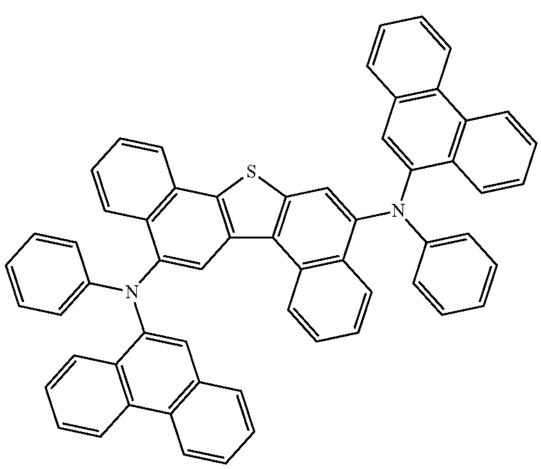

-continued
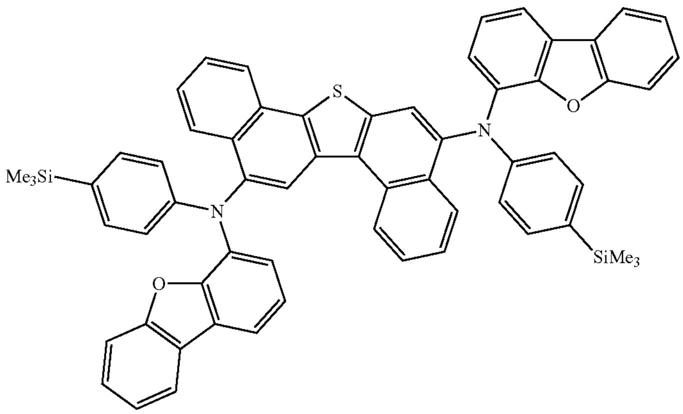
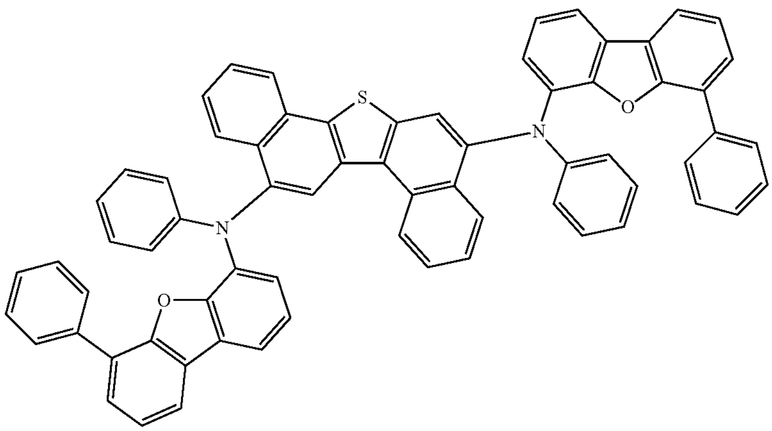
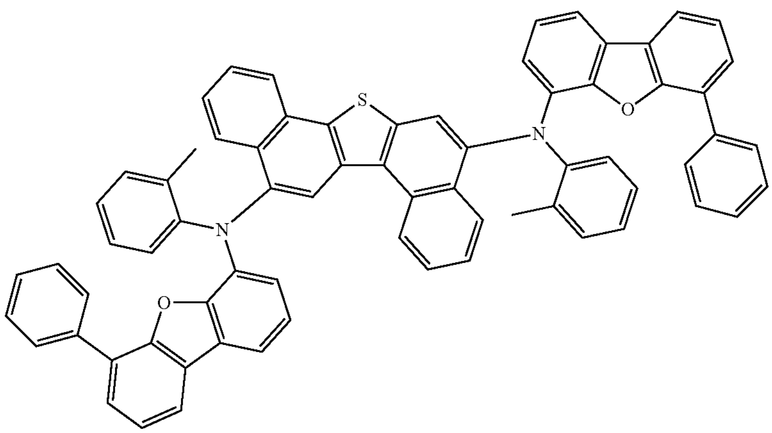
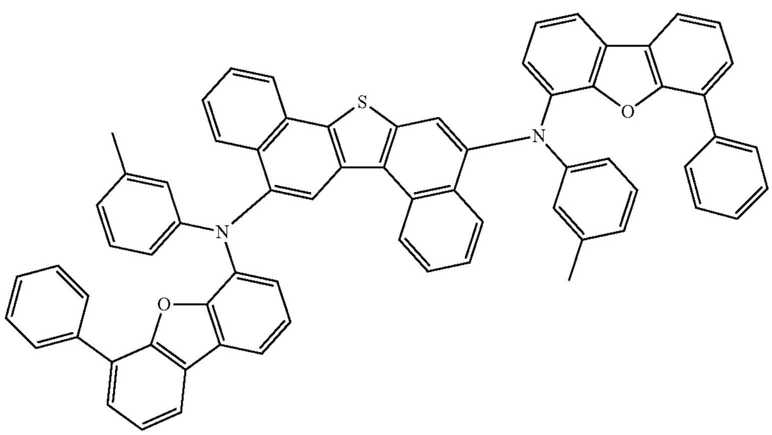

-continued
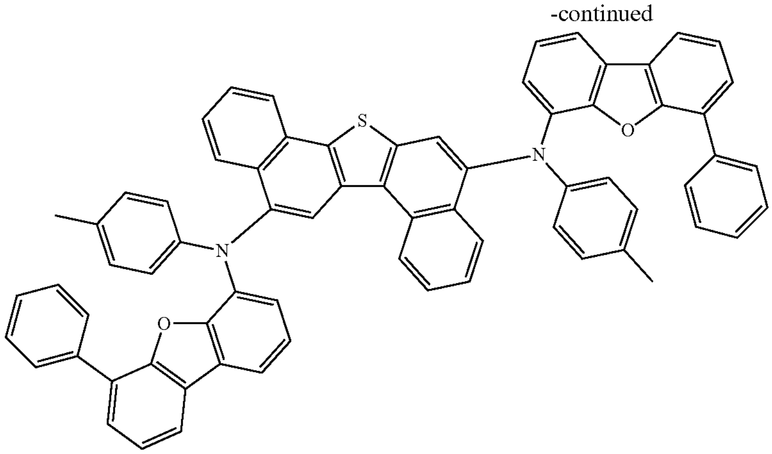
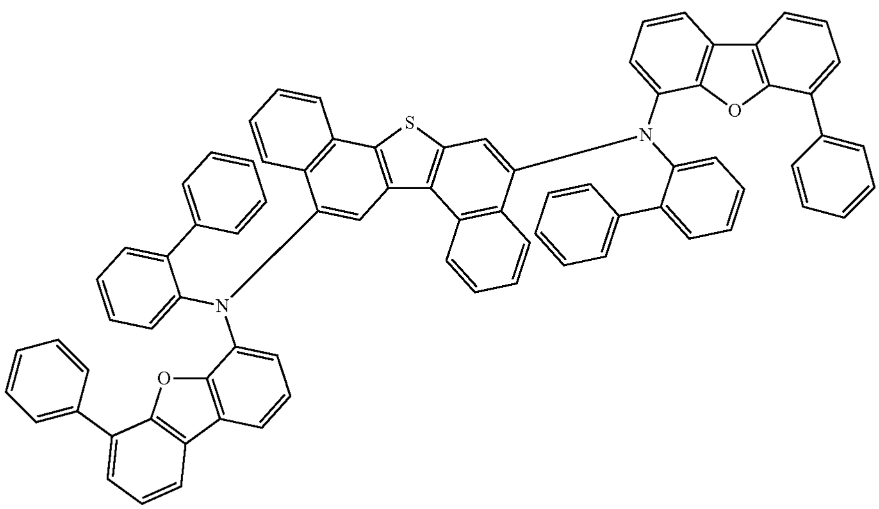
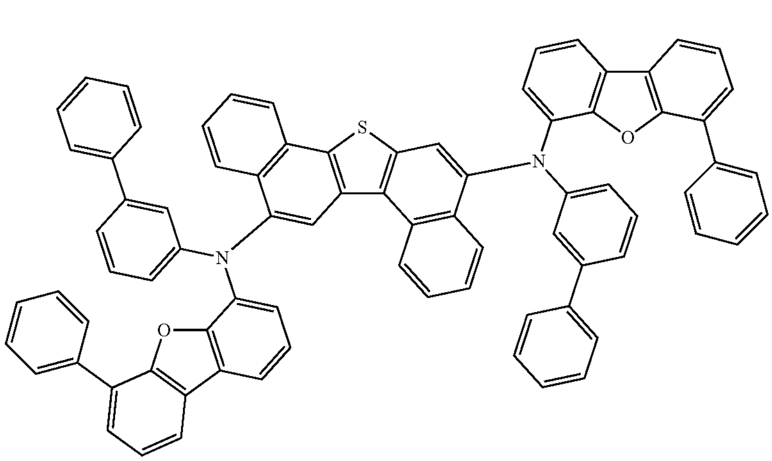

-continued
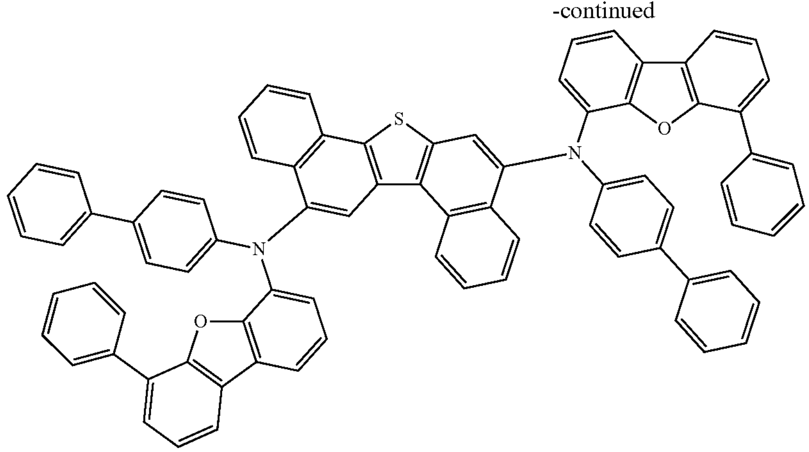
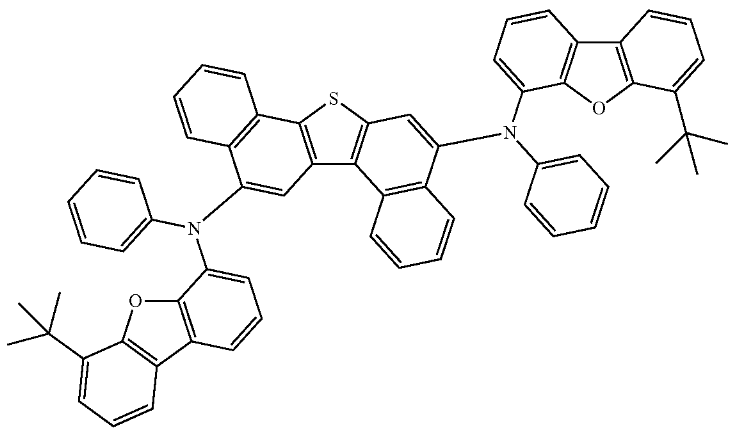
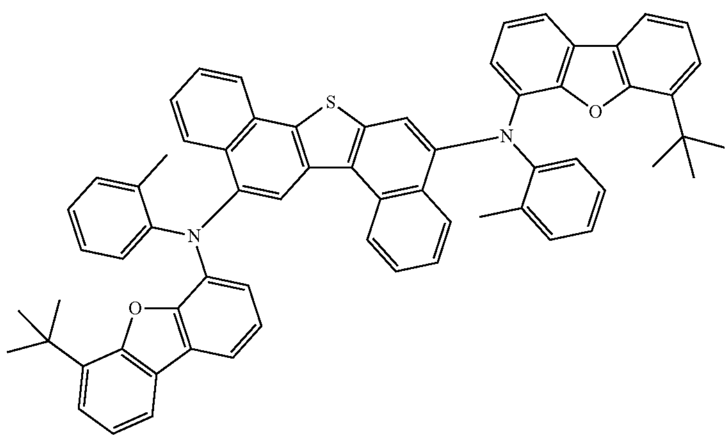
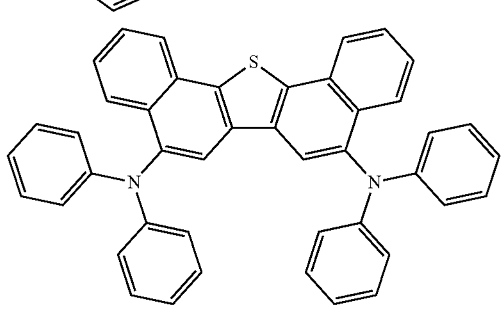
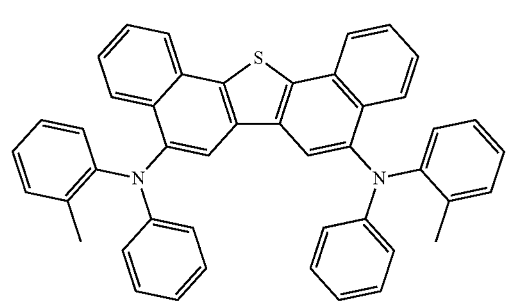

-continued
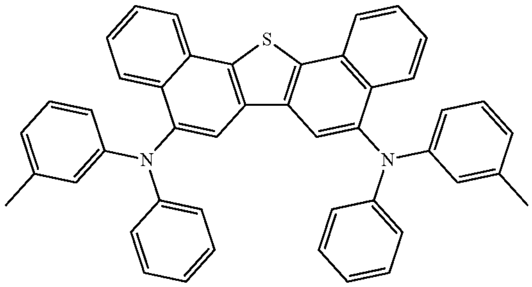
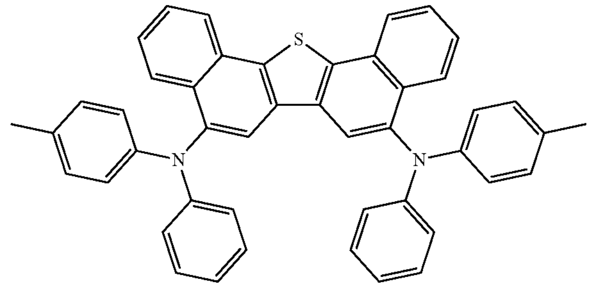
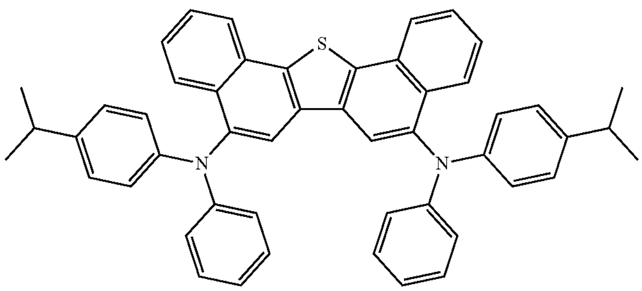
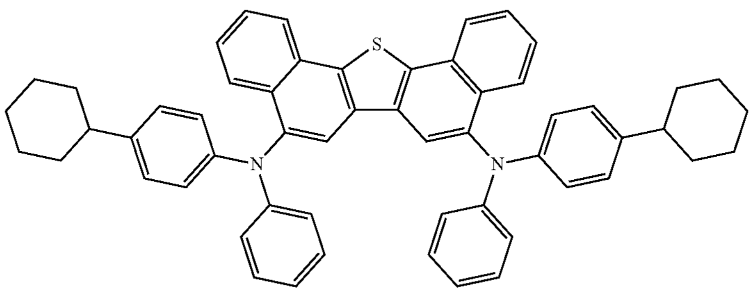
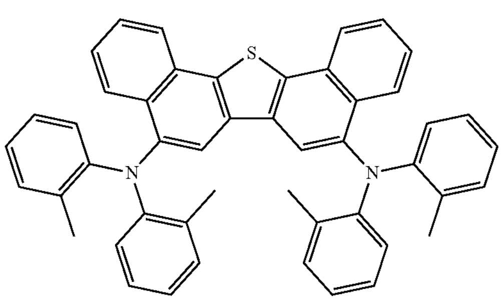
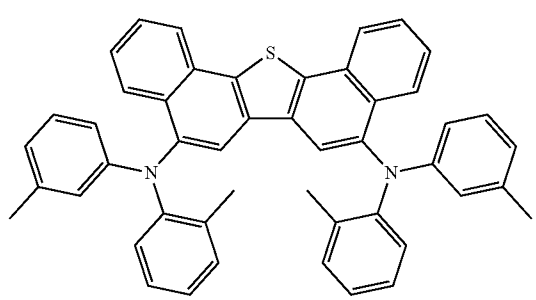
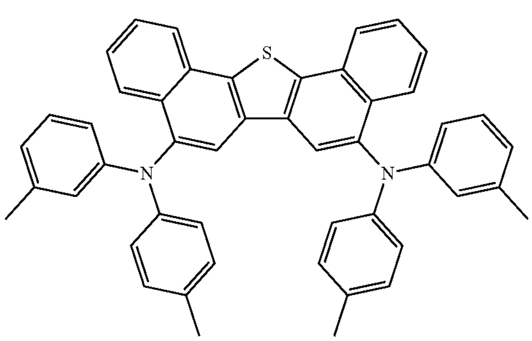
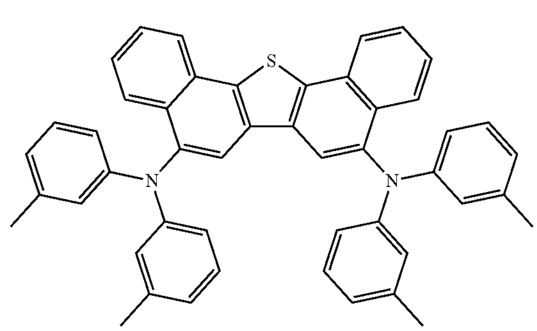

-continued
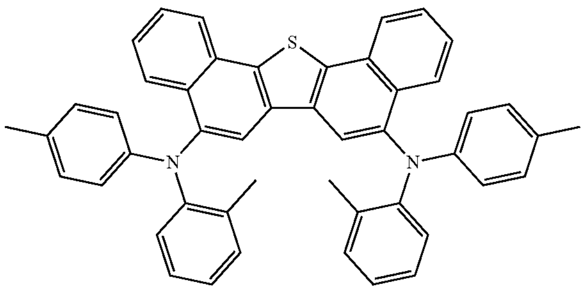
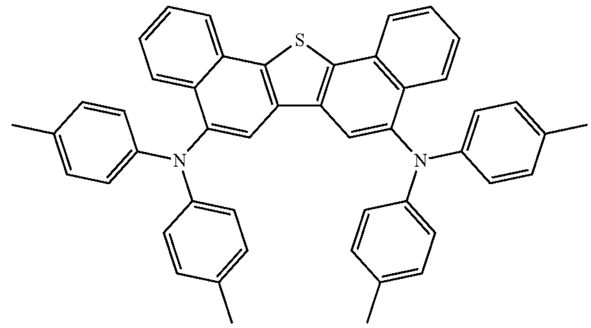
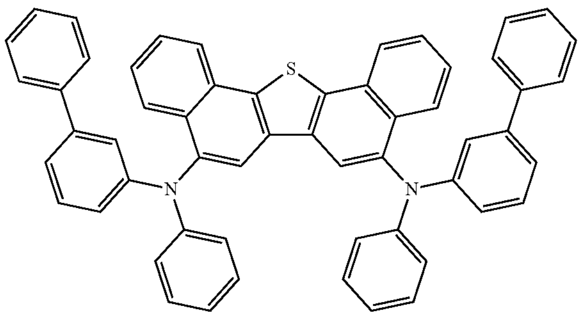
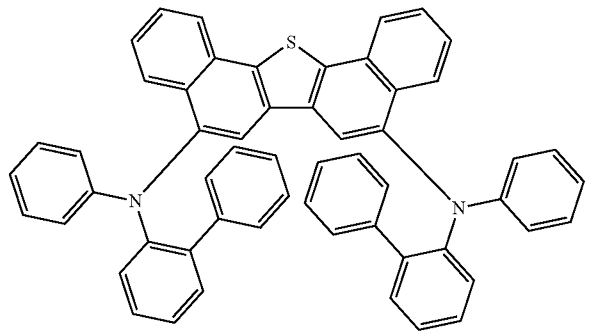
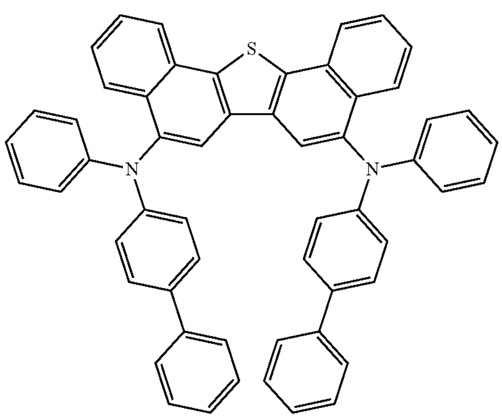
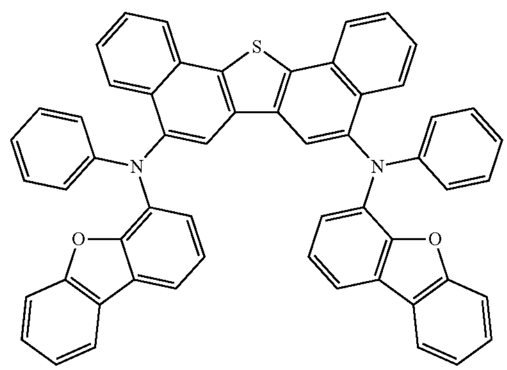
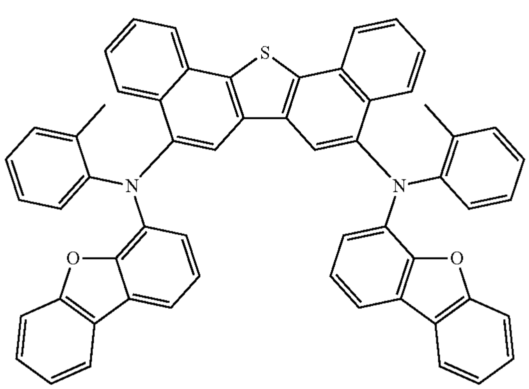
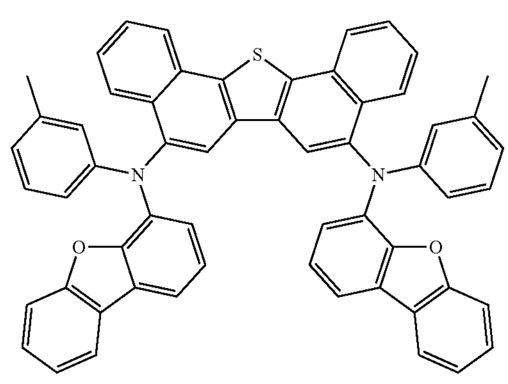

-continued
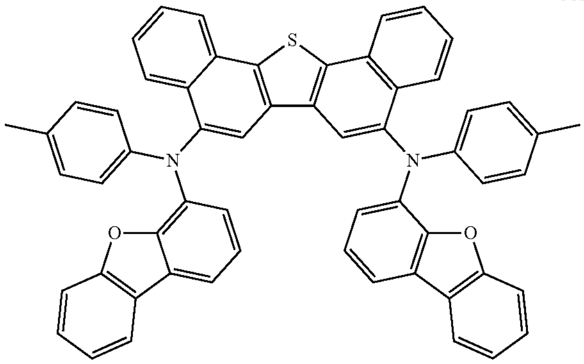
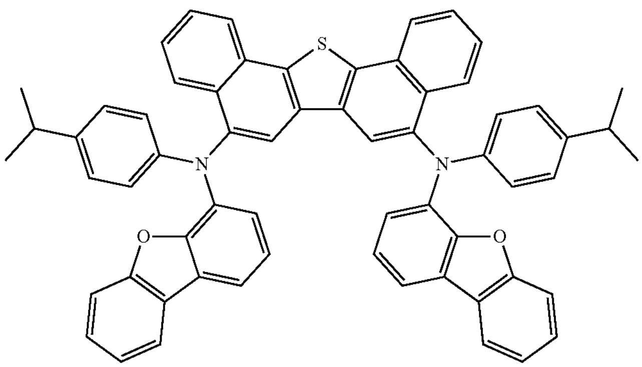
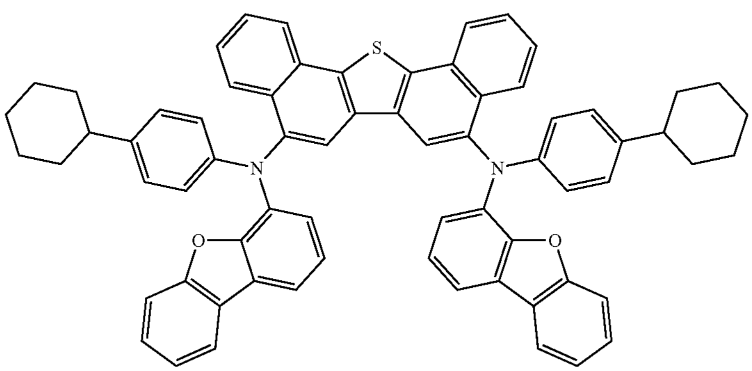
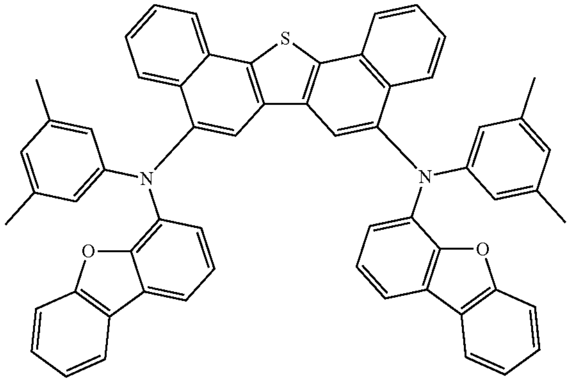

-continued
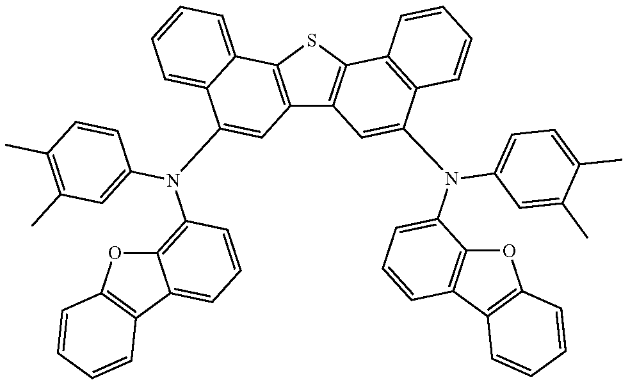
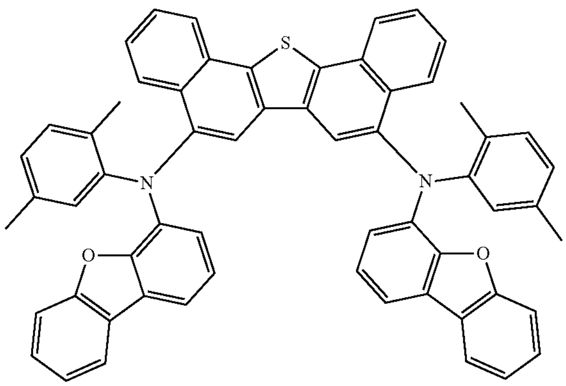
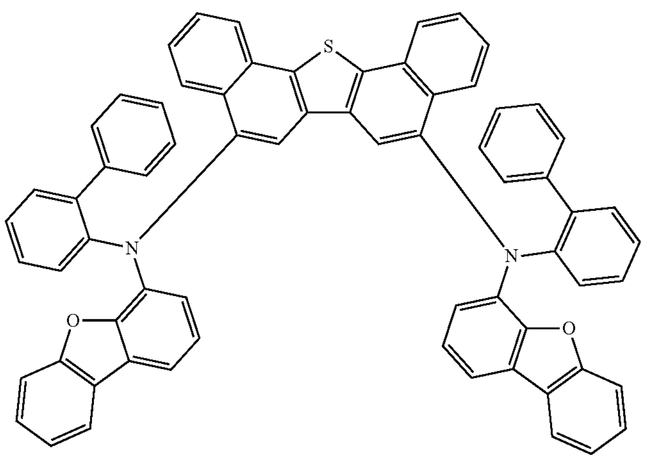
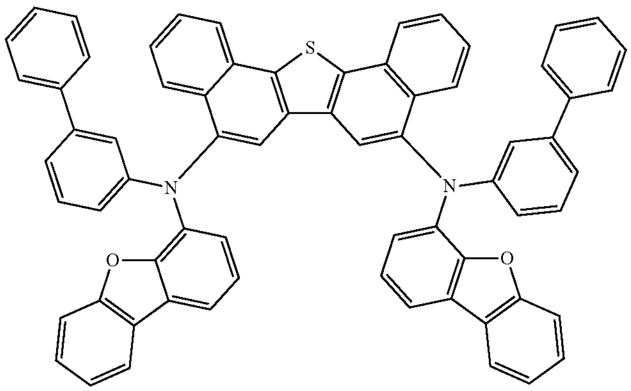

-continued
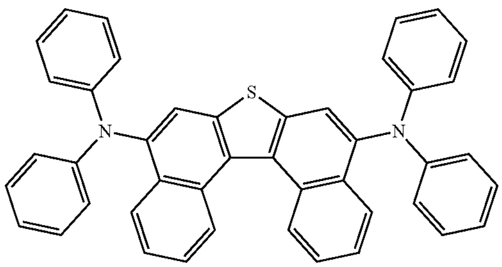
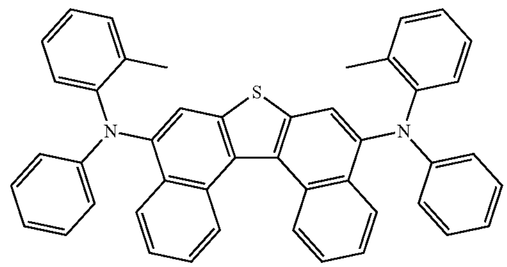
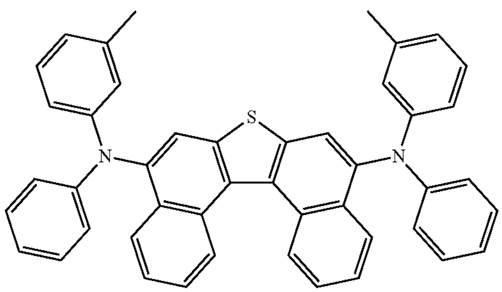
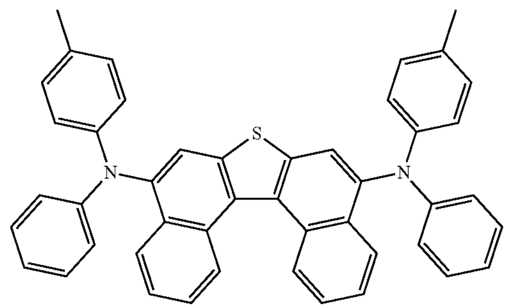
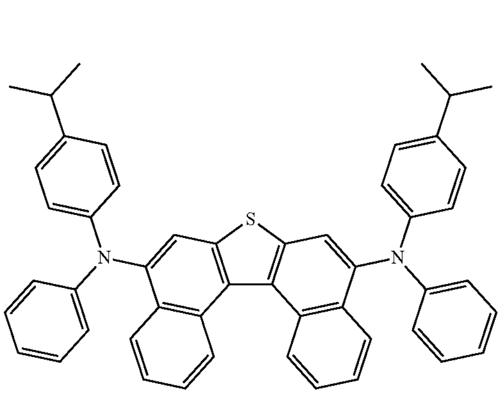
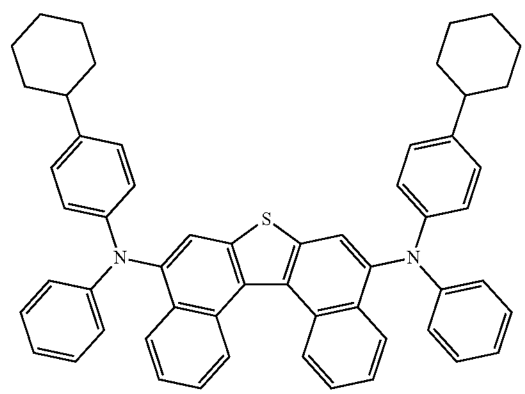
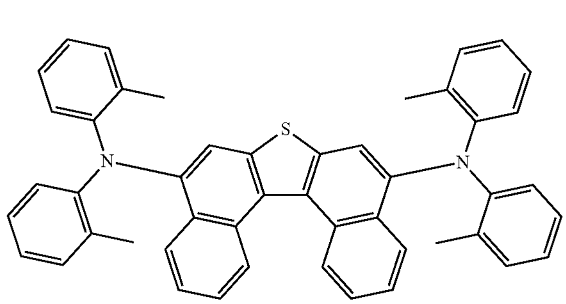
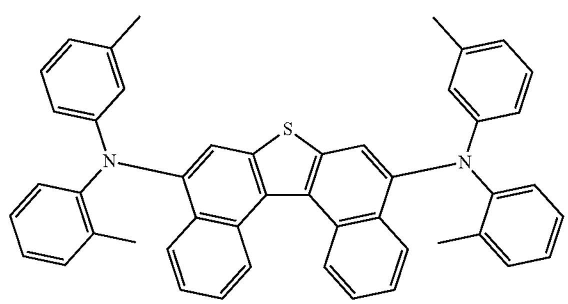
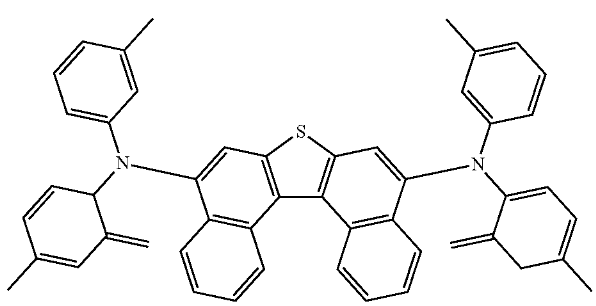

-continued
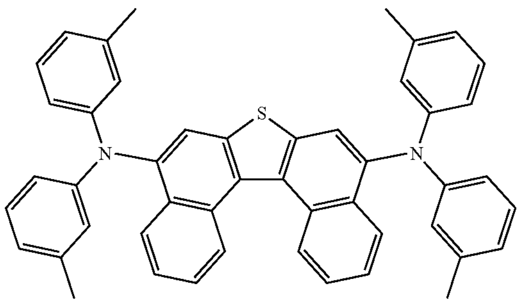
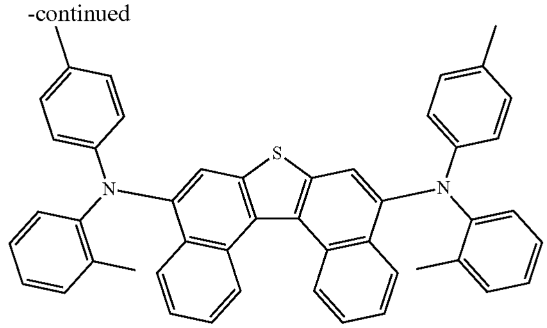
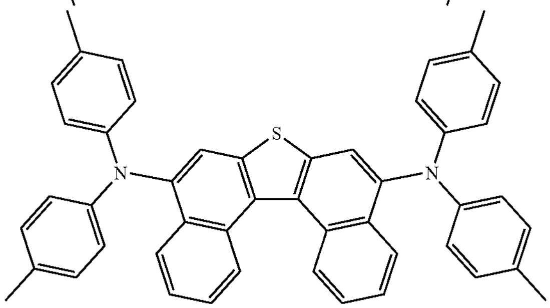
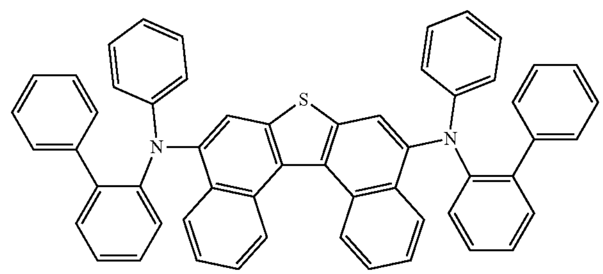
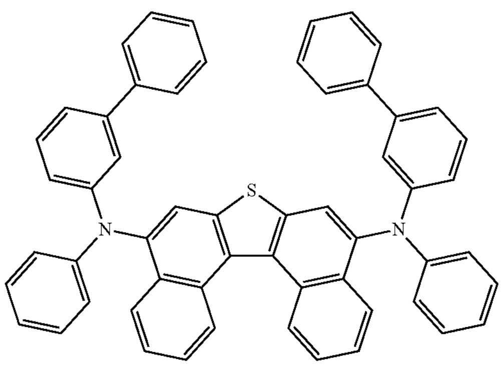
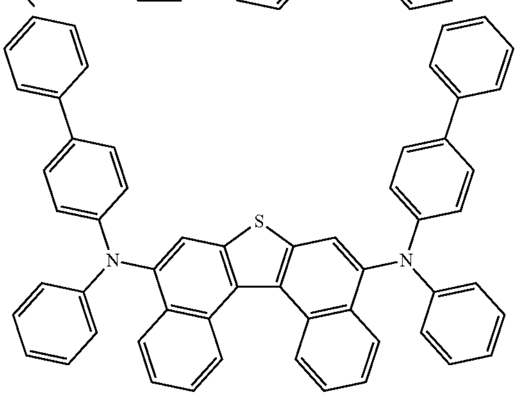
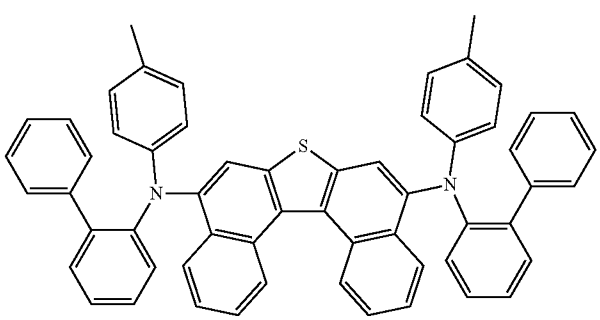
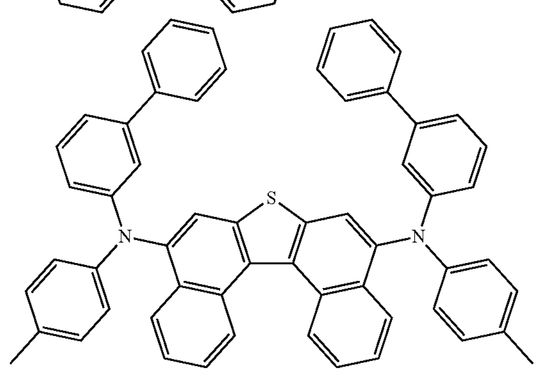
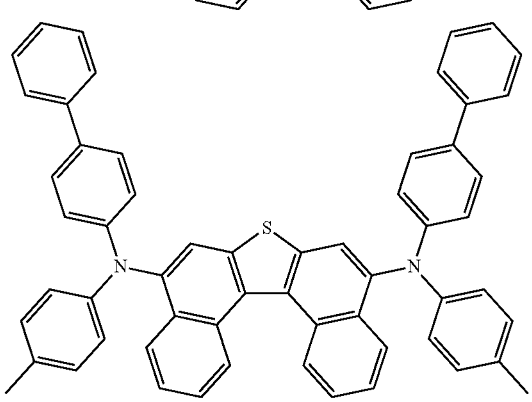

-continued
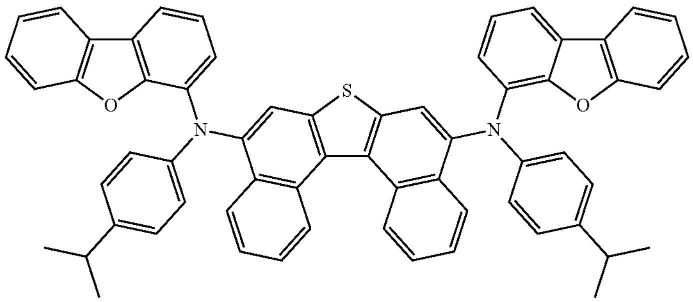
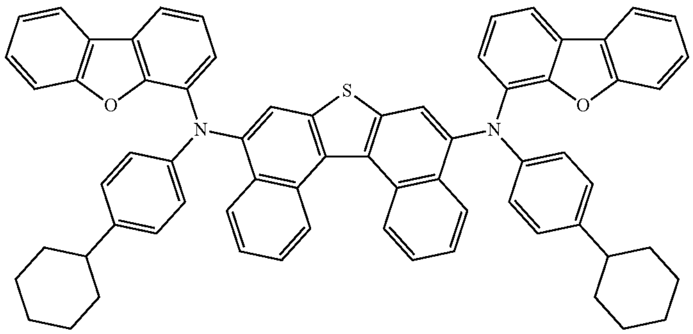
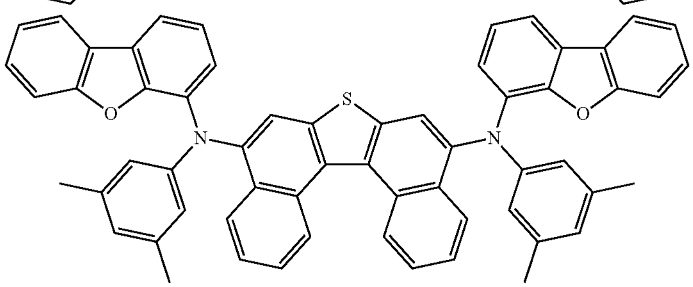
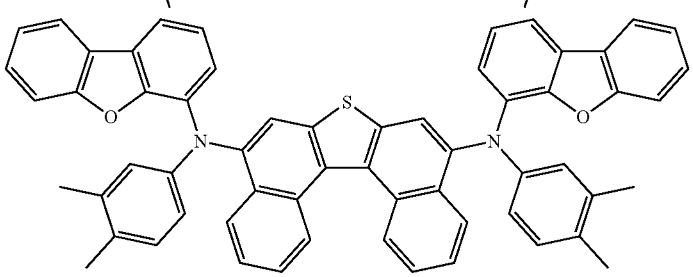
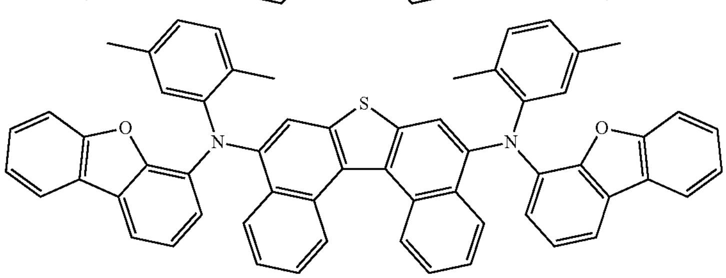
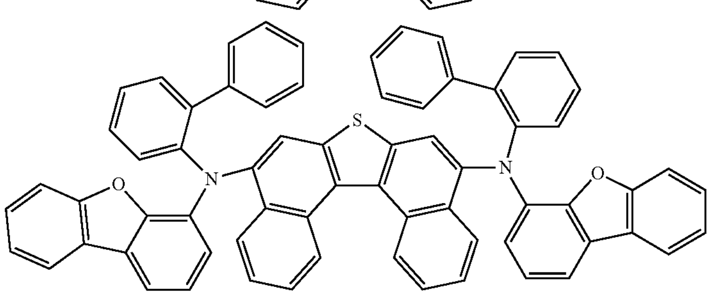

-continued
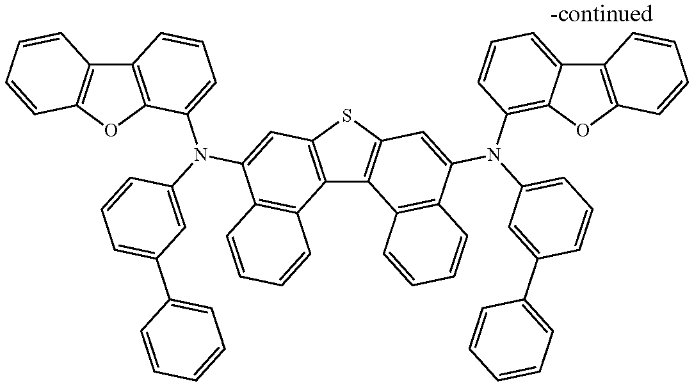
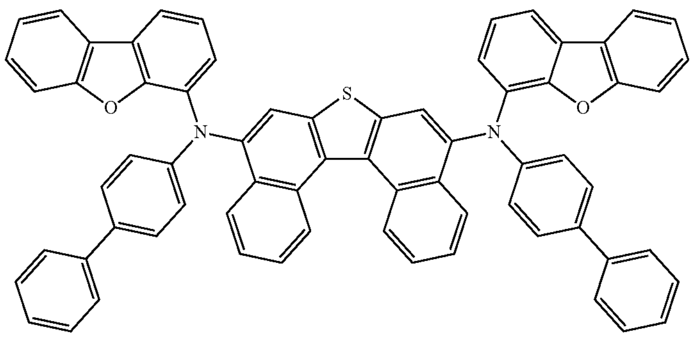
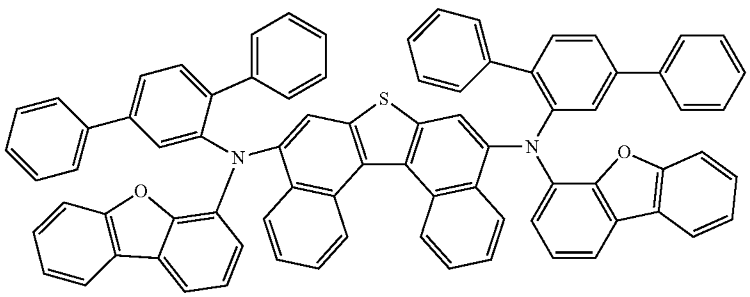
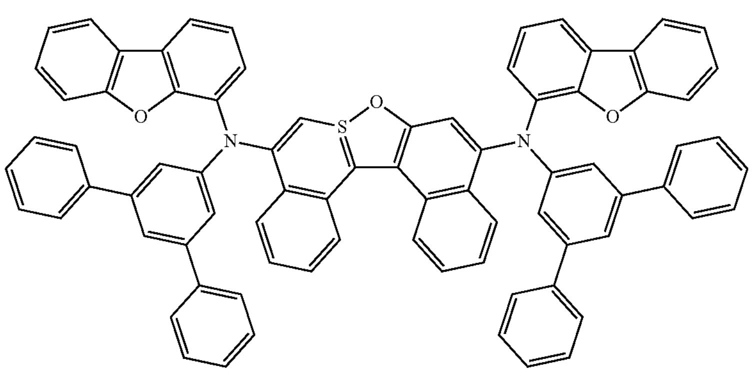
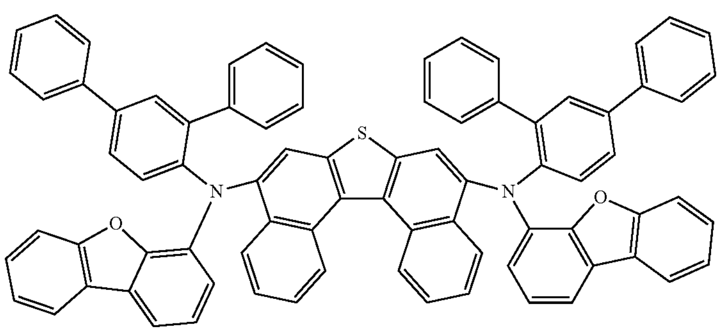

-continued
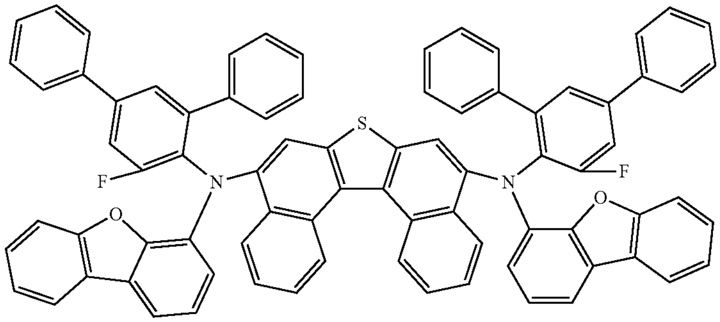
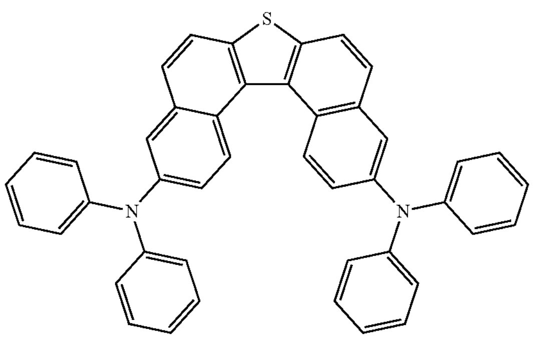
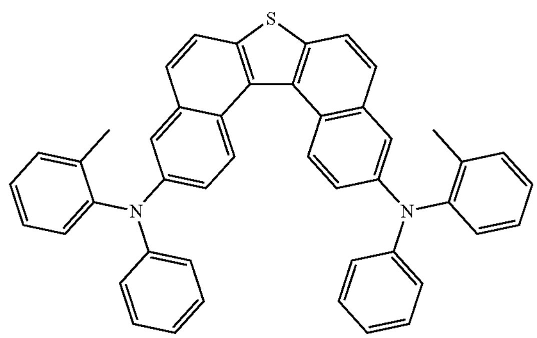
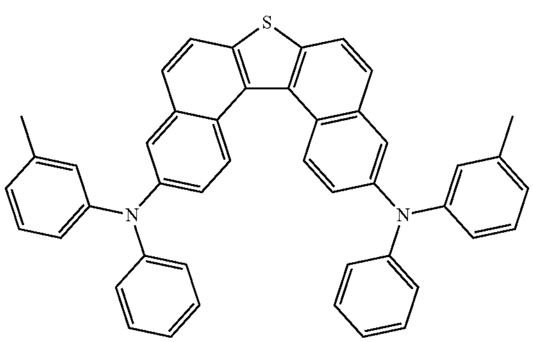
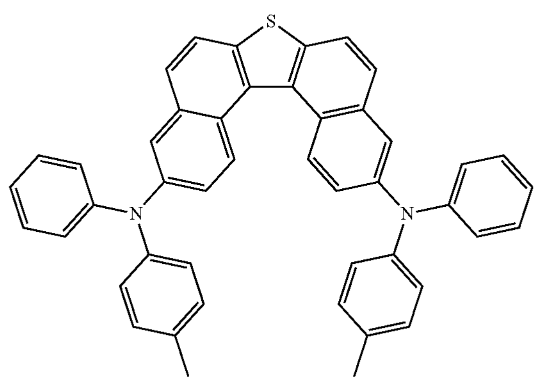
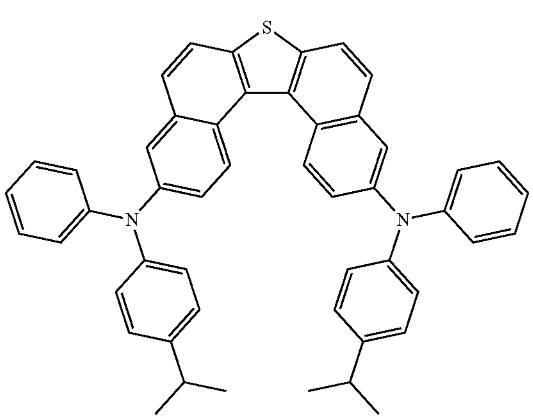
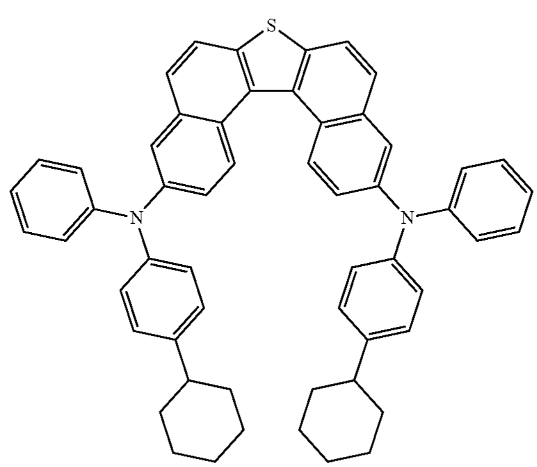

-continued
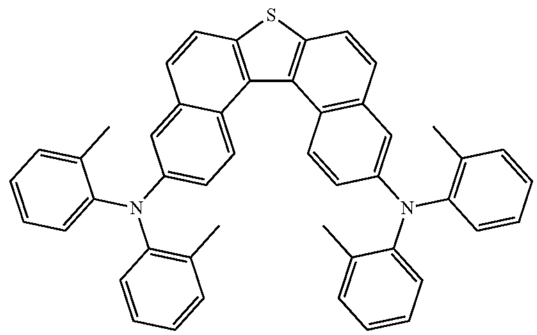
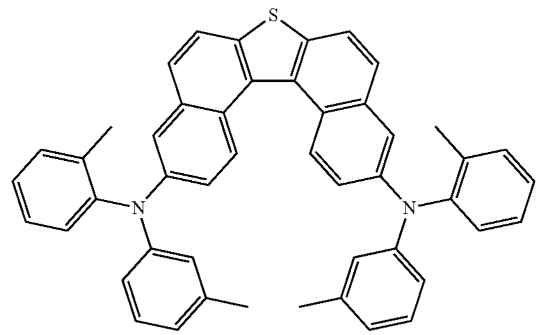
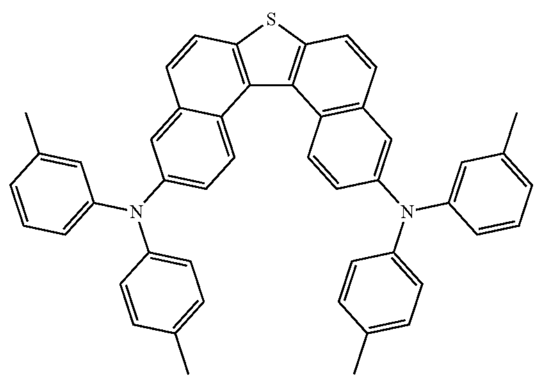
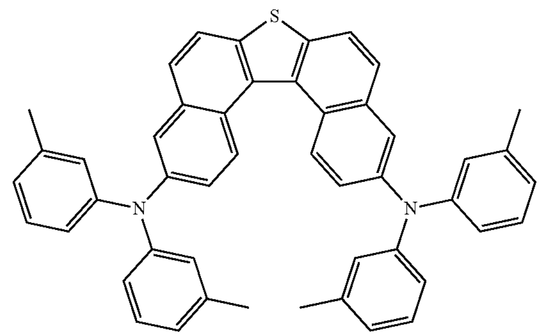
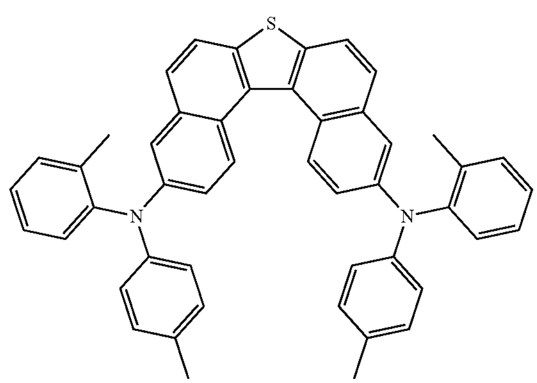
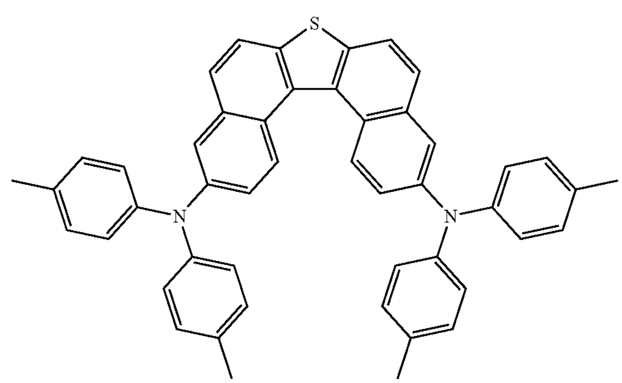
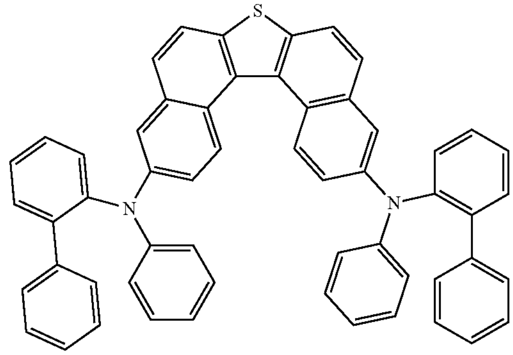
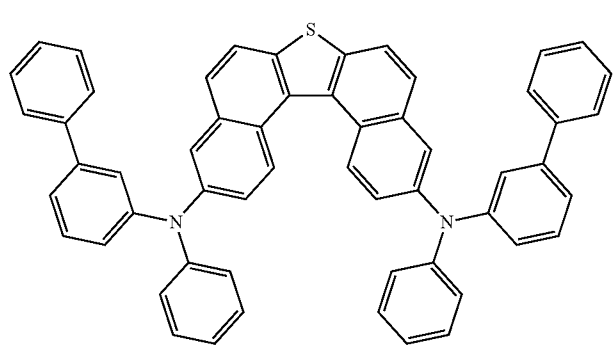

-continued
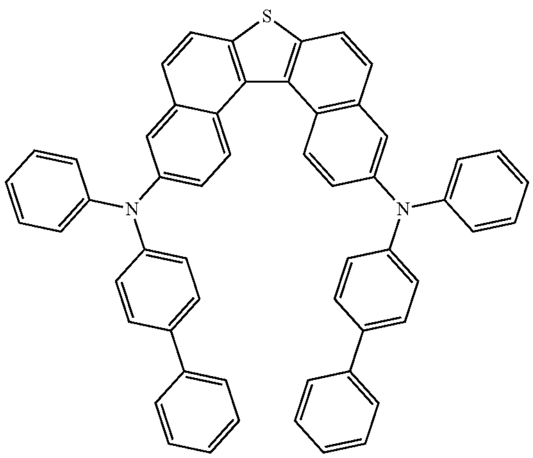
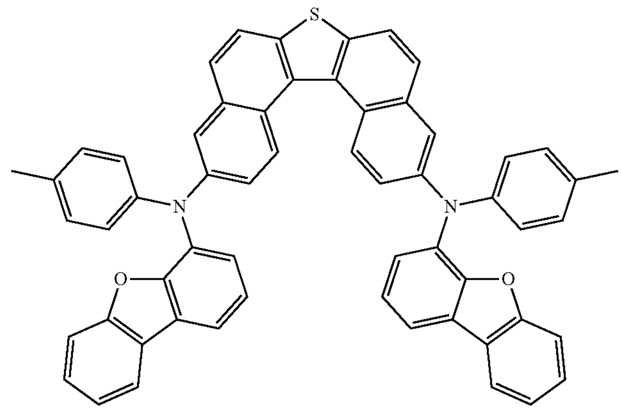
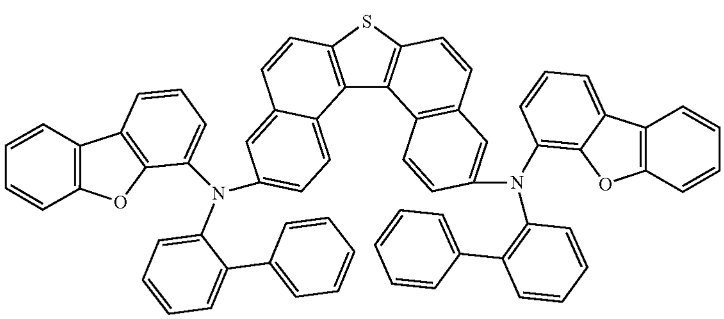
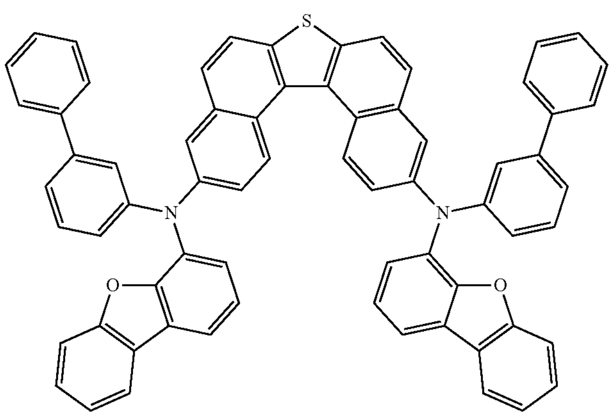
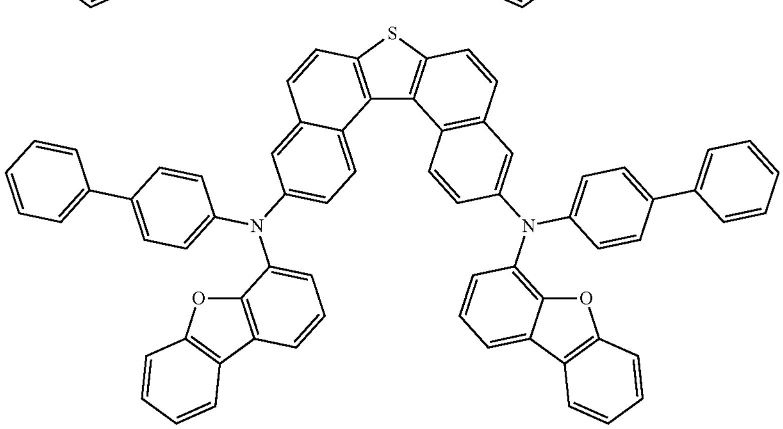

-continued
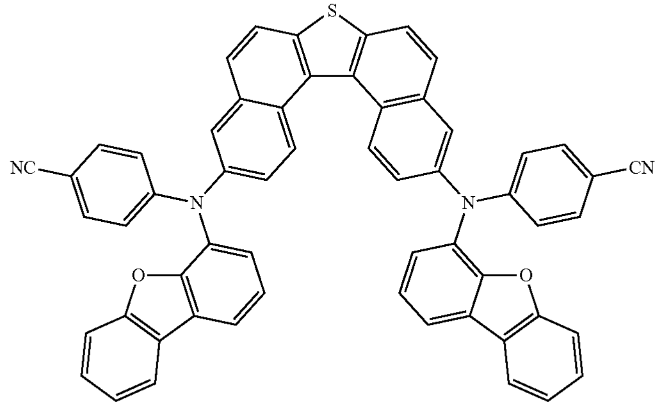
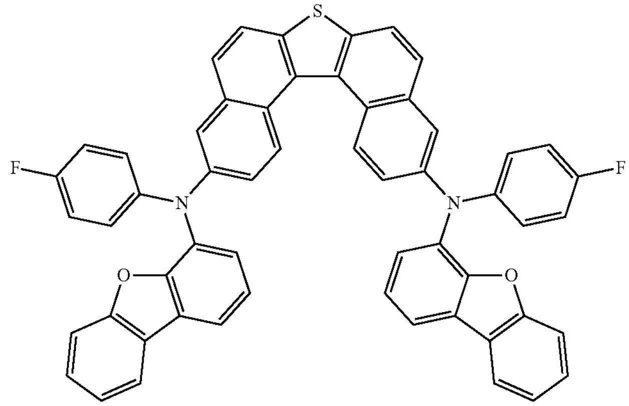
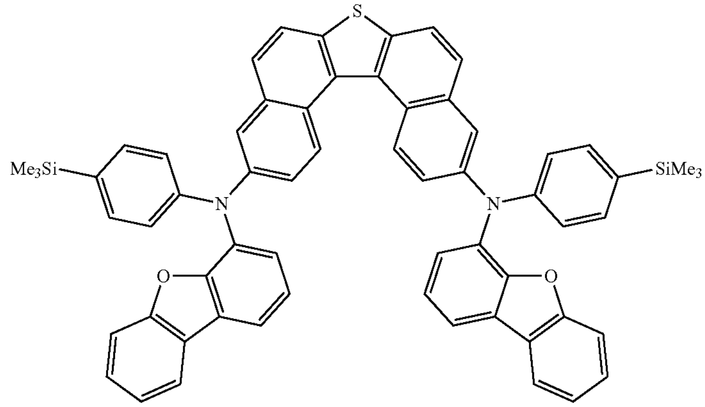
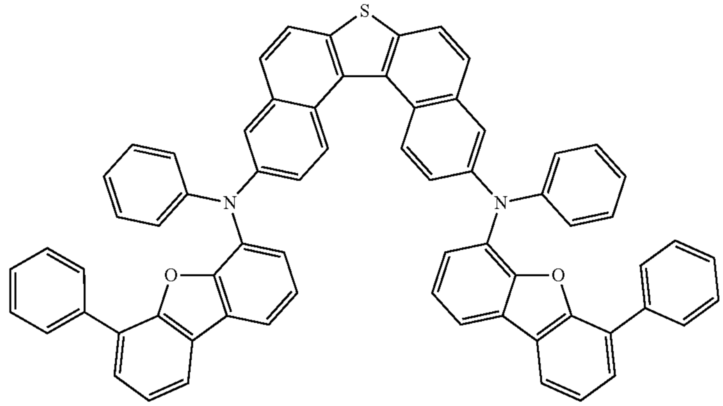

-continued
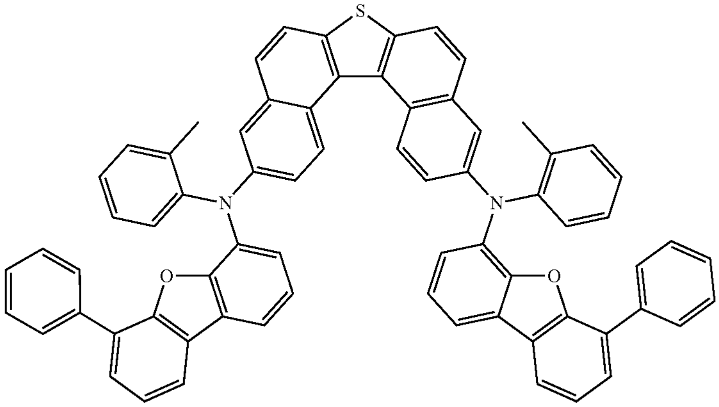
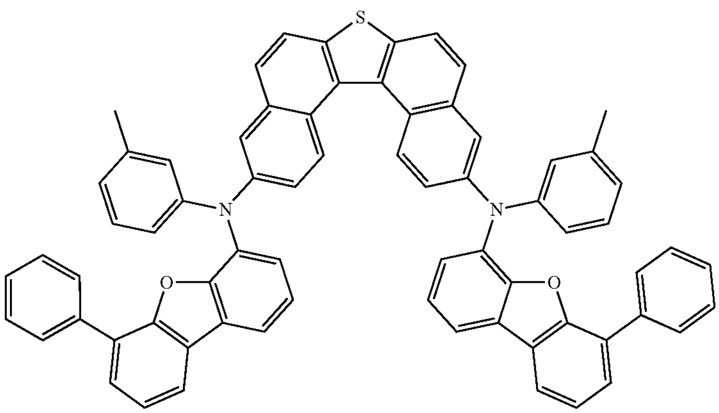
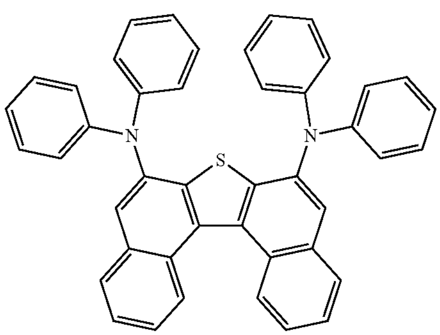
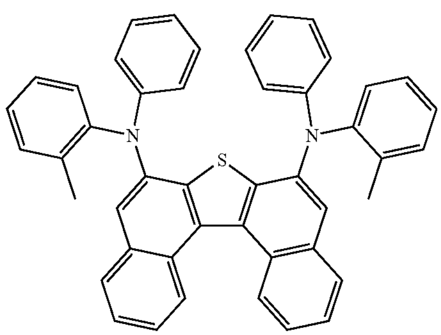
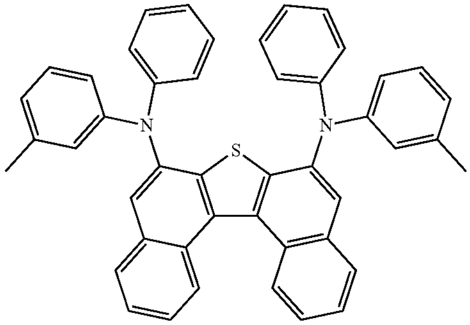
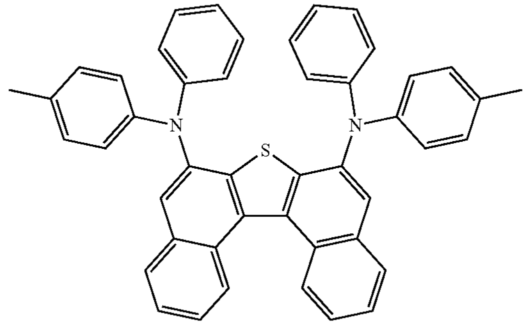

-continued
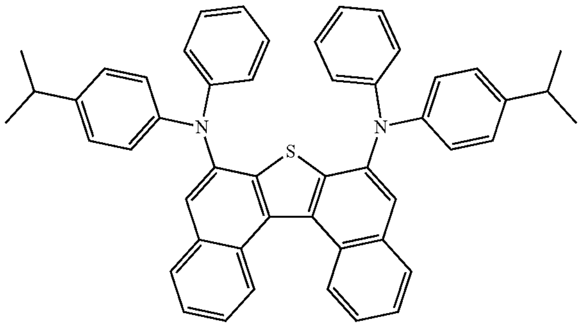
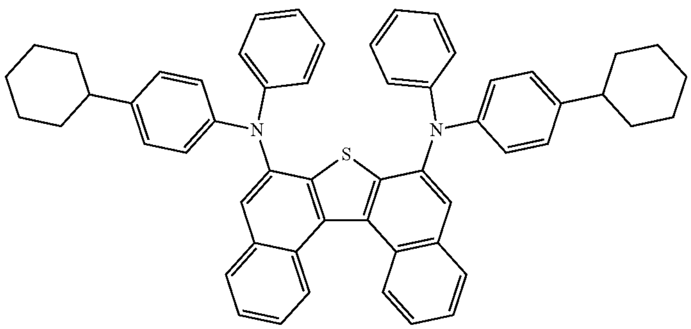
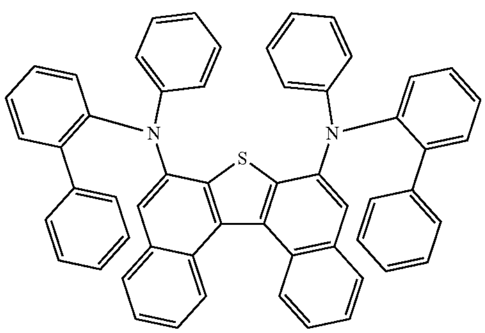
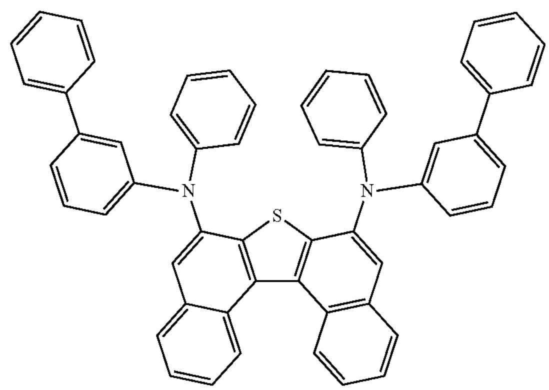
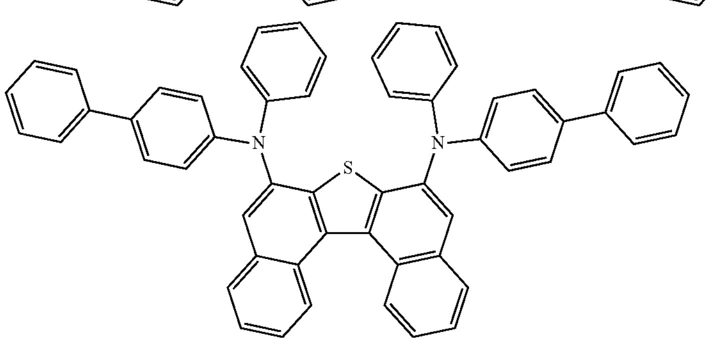
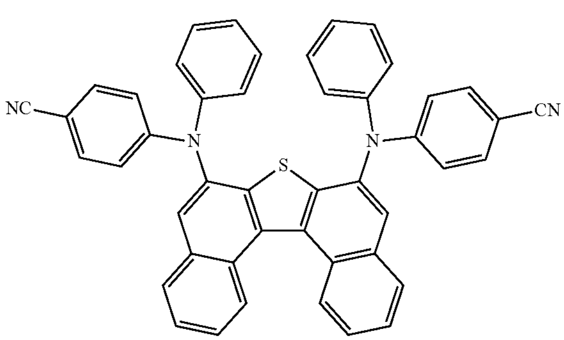
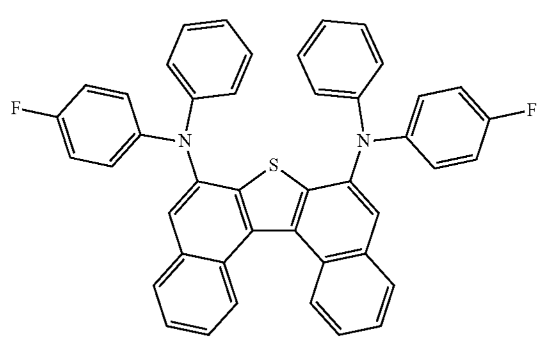

-continued
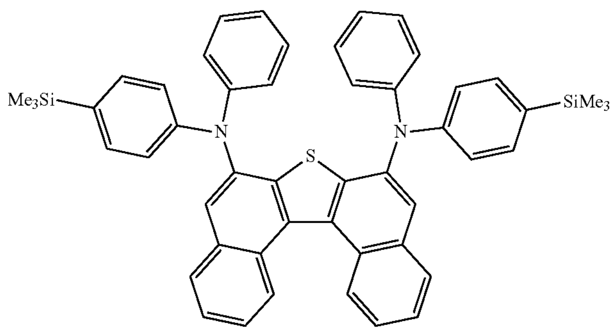
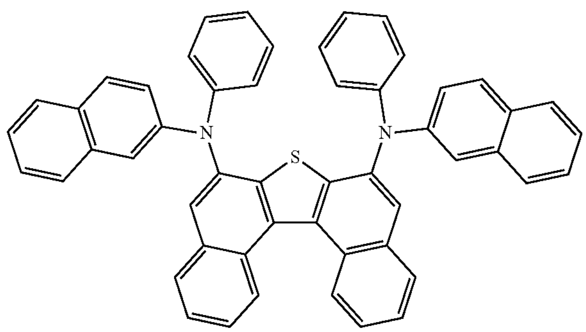
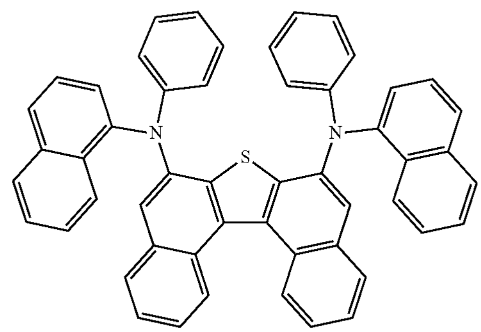
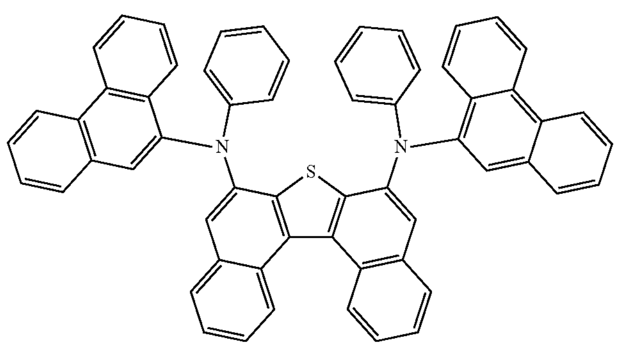
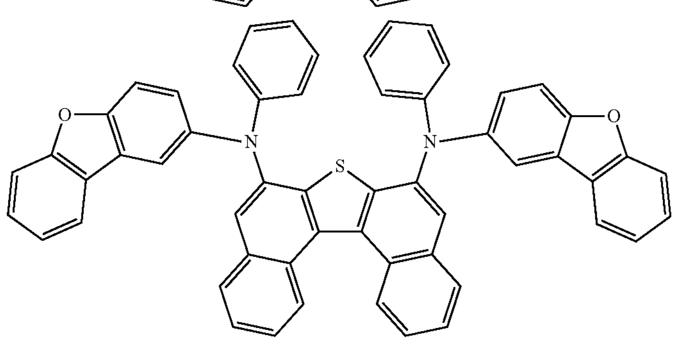
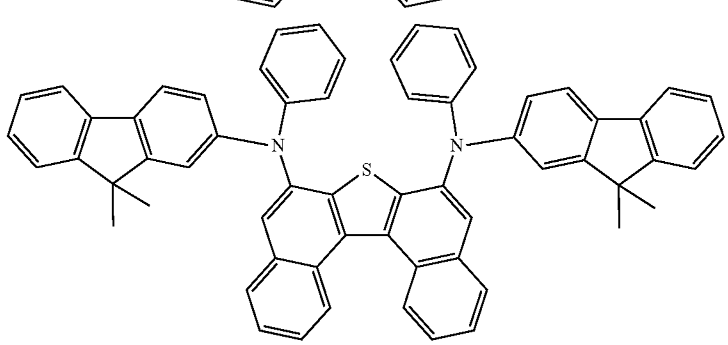

-continued

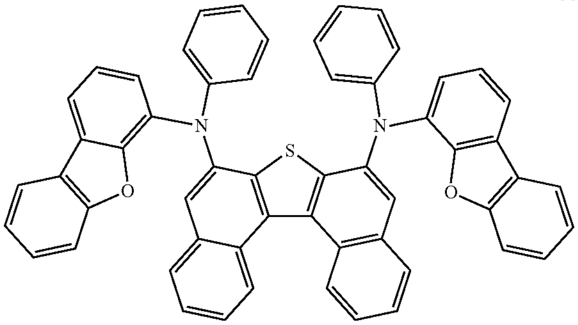

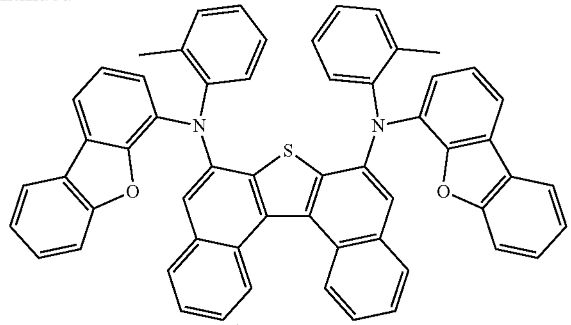

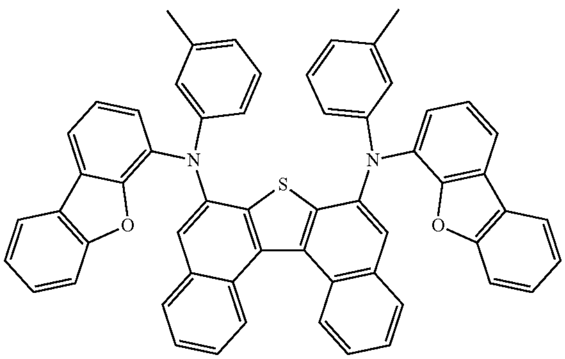

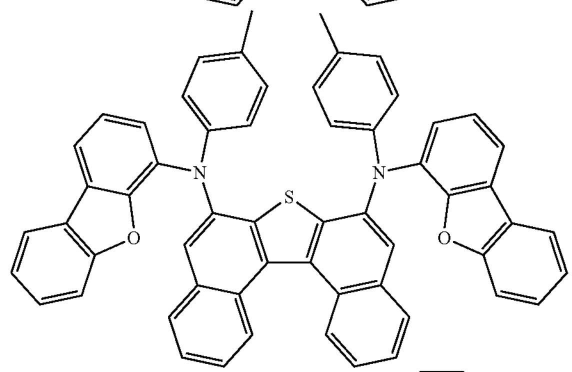

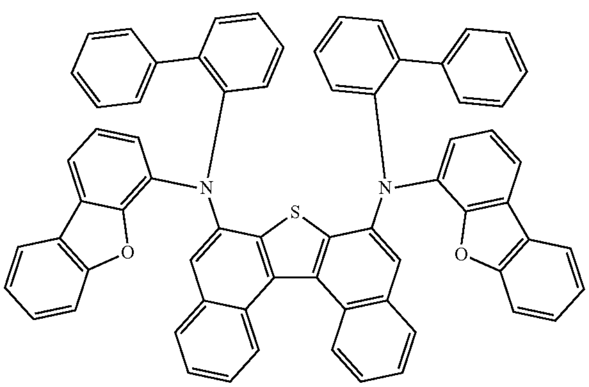

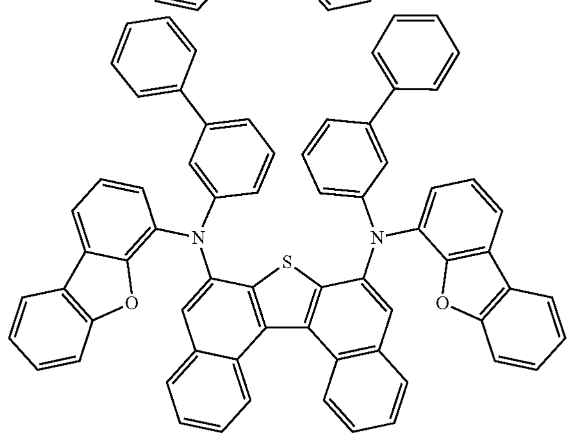

(Compound Represented by the Formula (71))

A compound represented by the formula (71) will be described.

(71)

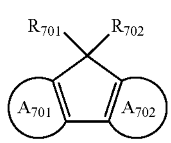

In the formula (71), a ring $A_{701}$ and a ring $A_{702}$ are independently a substituted or unsubstituted aromatic hydrocarbon ring including 6 to 50 ring carbon atoms, or a substituted or unsubstituted heterocyclic ring including 5 to 50 ring atoms.

One or more selected from the group consisting of the ring $A_{701}$ and the ring $A_{702}$ are bonded with "*" in the structure represented by the following formula (72).

(72)

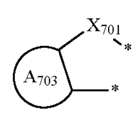

In the formula (72), a ring $A_{703}$ is a substituted or unsubstituted aromatic hydrocarbon ring including 6 to 50 ring carbon atoms, or a substituted or unsubstituted heterocyclic ring including 5 to 50 ring atoms.

$X_{701}$ is $NR_{703}$, $C(R_{704})(R_{705})$, $Si(R_{706})(R_{707})$, $Ge(R_{708})(R_{709})$, O, S, or Se.

$R_{701}$ and $R_{702}$ form a substituted or unsubstituted, saturated or unsaturated ring by bonding with each other, or do not form a substituted or unsubstituted, saturated or unsaturated ring.

$R_{701}$ and $R_{702}$ which do not form the substituted or unsubstituted, saturated or unsaturated ring, and $R_{703}$ to $R_{709}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms.

$R_{901}$ to $R_{907}$ are as defined in the formula (1).

One or more selected from the group consisting of the ring $A_{701}$ and the ring $A_{702}$ are bonded with in the structure represented by the formula (72). In other words, in one embodiment, ring carbon atoms of the aromatic hydrocarbon ring or ring atoms of the heterocyclic ring of the ring $A_{701}$ is bonded with in the structure represented by the formula (72). In addition, in one embodiment, ring carbon atoms of the aromatic hydrocarbon ring or ring atoms of the heterocyclic ring of the ring $A_{702}$ is bonded with in the structure represented by the formula (72).

In one embodiment, a group represented by the following formula (73) is bonded with either or both of the ring $A_{701}$ and the ring $A_{702}$.

(73)

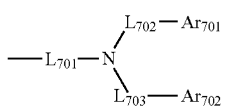

In the formula (73), $Ar_{701}$ and $Ar_{702}$ are independently a substituted or unsubstituted aryl group including 6 to 50 ring carbon atoms, or a substituted or unsubstituted monovalent heterocyclic group including 5 to 50 ring atoms.

$L_{701}$ to $L_{703}$ are independently a single bond, a substituted or unsubstituted arylene group including 6 to 30 ring carbon atoms, a substituted or unsubstituted divalent heterocyclic group including 5 to 30 ring atoms, or a divalent linking group formed by bonding two to four of these.

In one embodiment, in addition to the ring $A_{701}$, ring carbon atoms of the aromatic hydrocarbon ring or ring atoms of the heterocyclic ring of the ring $A_{702}$ is bonded with in the structure represented by the formula (72). In this case, the structures represented by the formula (72) may be the same or different.

In one embodiment, $R_{701}$ and $R_{702}$ are independently and a substituted or unsubstituted aryl group including 6 to 50 ring carbon atoms.

In one embodiment, $R_{701}$ and $R_{702}$ form a fluorene structure by bonding with each other.

In one embodiment, the ring $A_{701}$ and the ring $A_{702}$ are substituted or unsubstituted aromatic hydrocarbon rings including 6 to 50 ring carbon atoms, and for example, substituted or unsubstituted benzene rings.

In one embodiment, the ring $A_{703}$ is a substituted or unsubstituted aromatic hydrocarbon ring including 6 to 50 ring carbon atoms, and for example, a substituted or unsubstituted benzene ring. In one embodiment, $X_{701}$ is O or S.

Specific examples of the compound represented by the formula (71) include the following compounds. In the following specific examples, "Me" represents a methyl group.

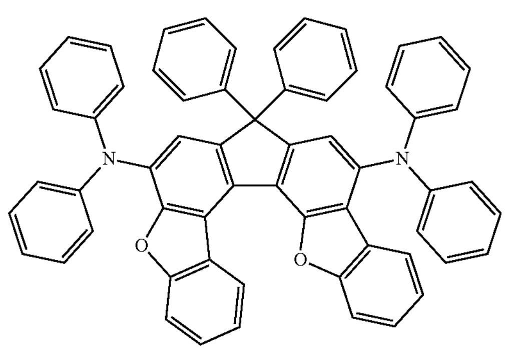

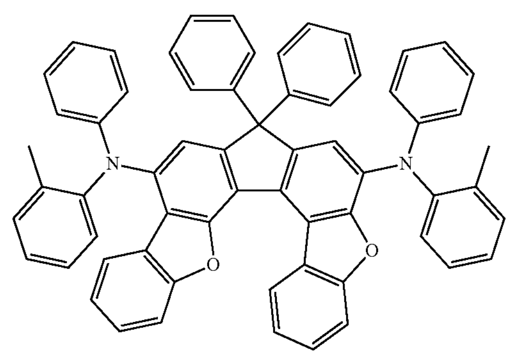

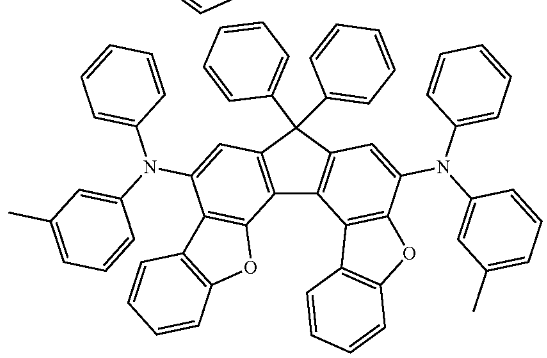

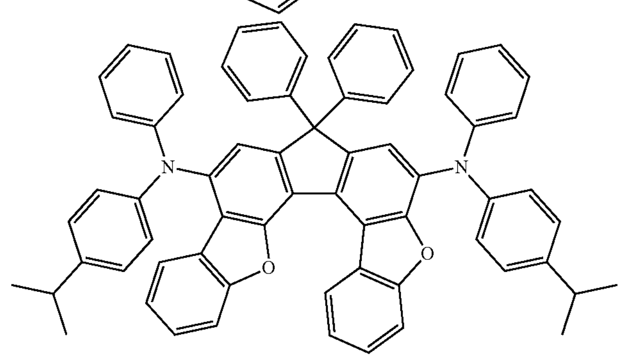

-continued
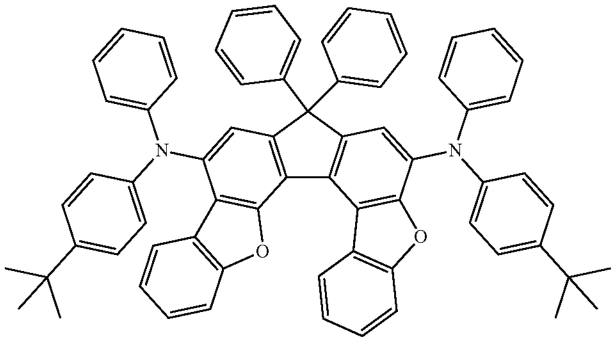
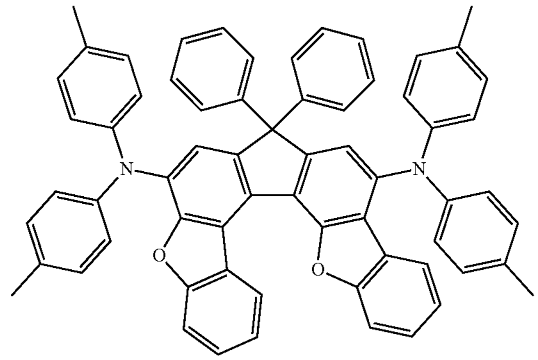
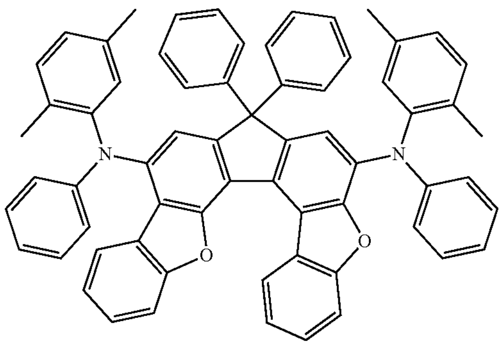
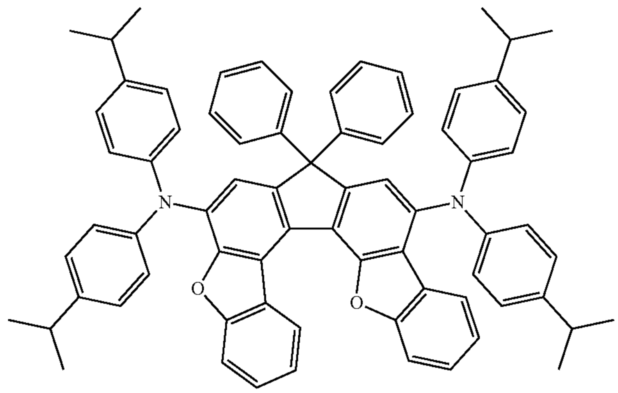
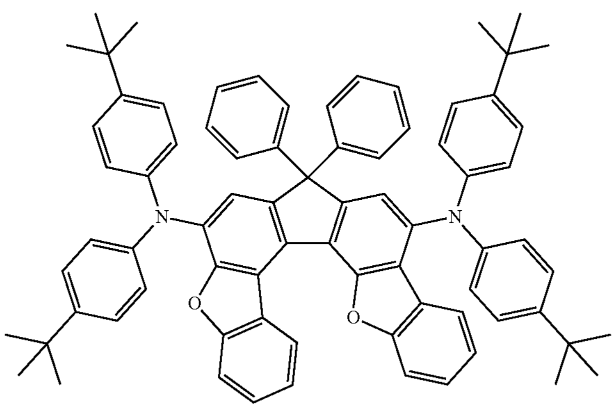
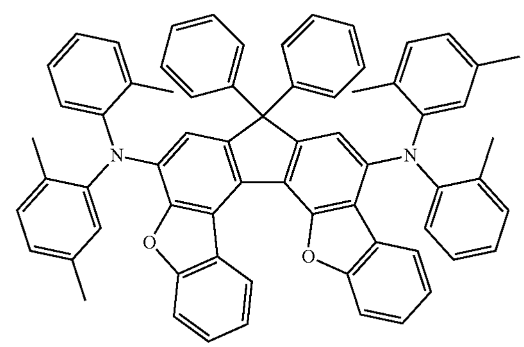
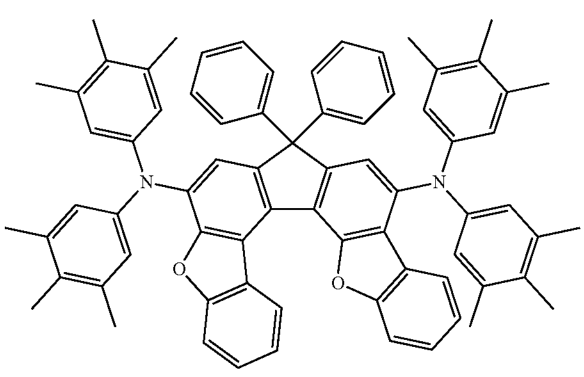

-continued
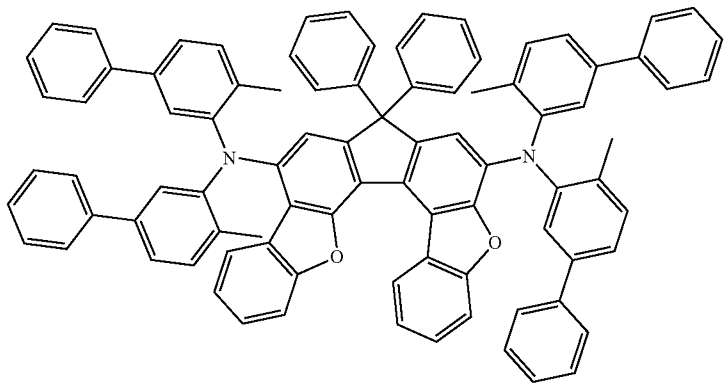
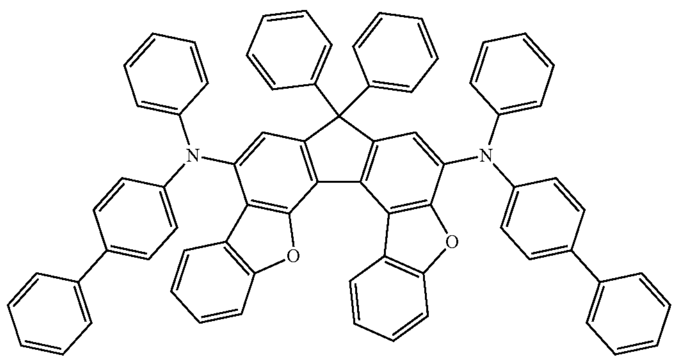
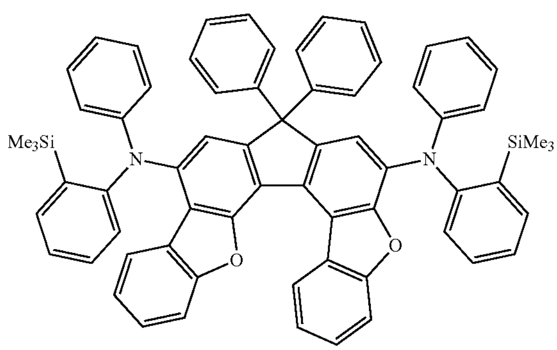
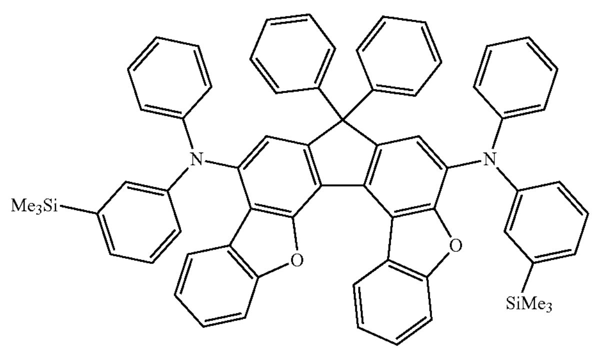
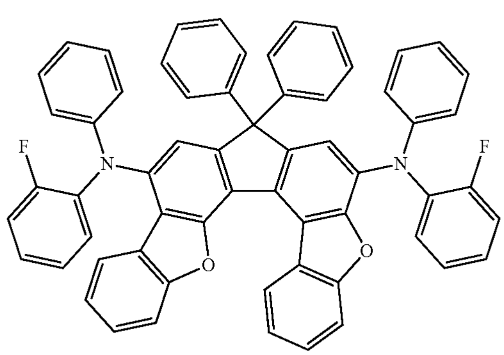
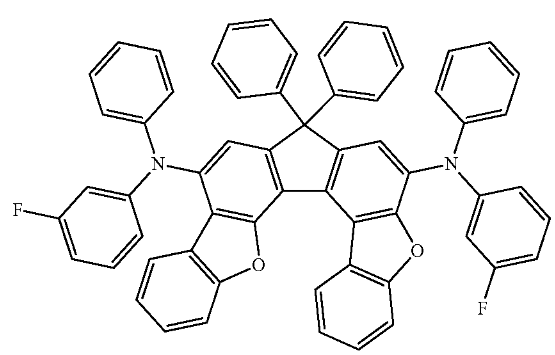

-continued
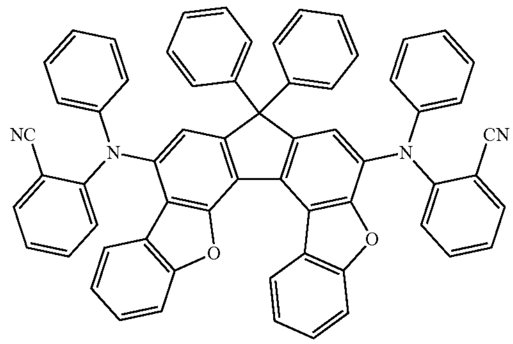
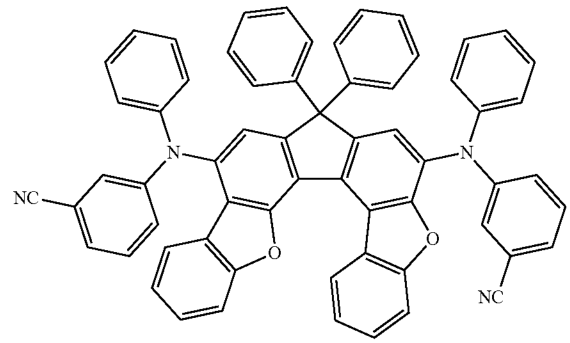
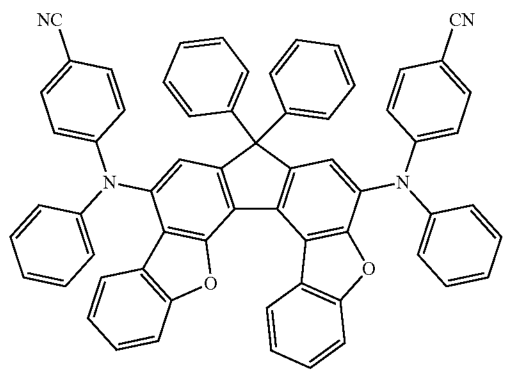
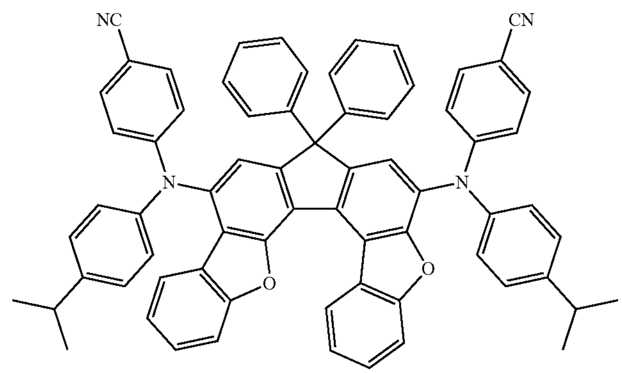
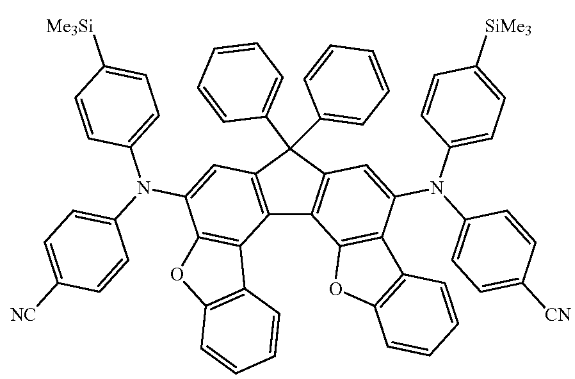
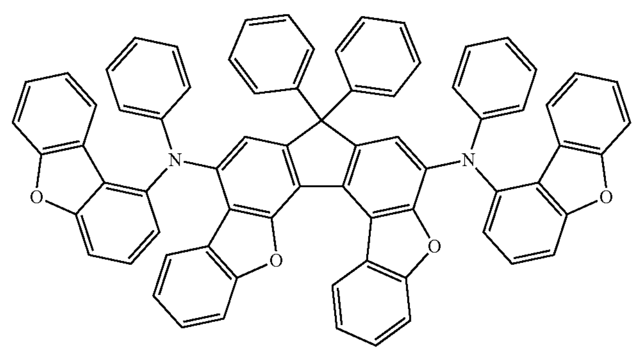
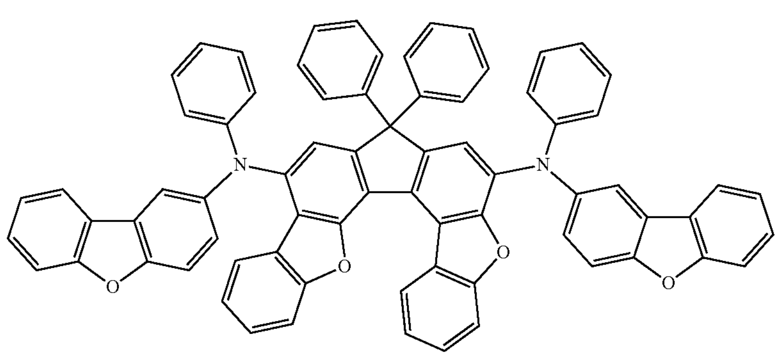

-continued
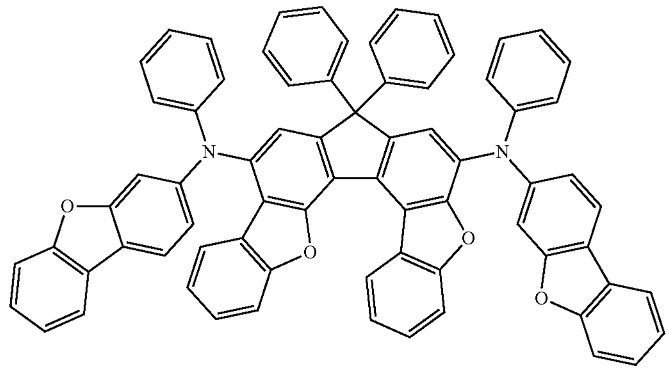
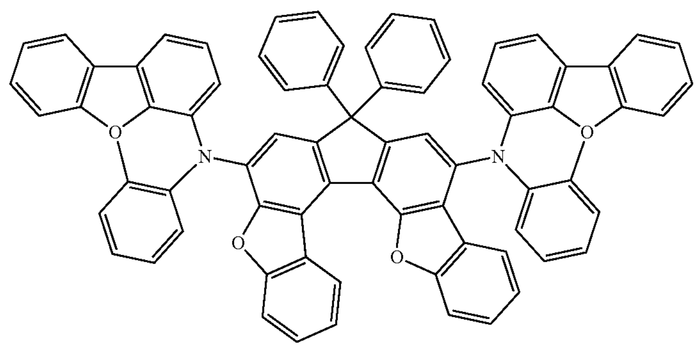
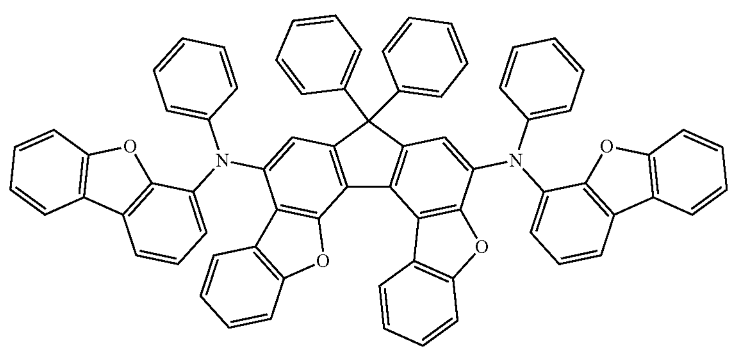
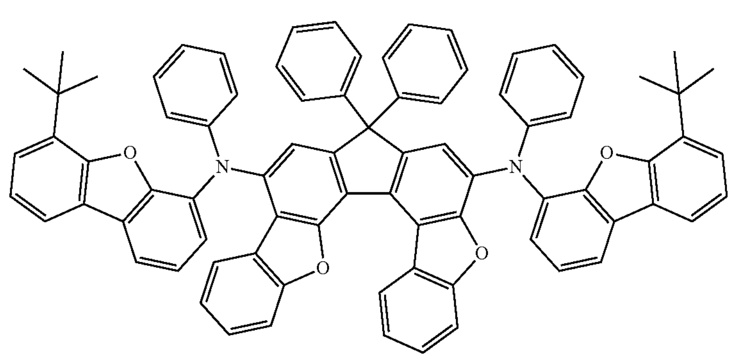

-continued
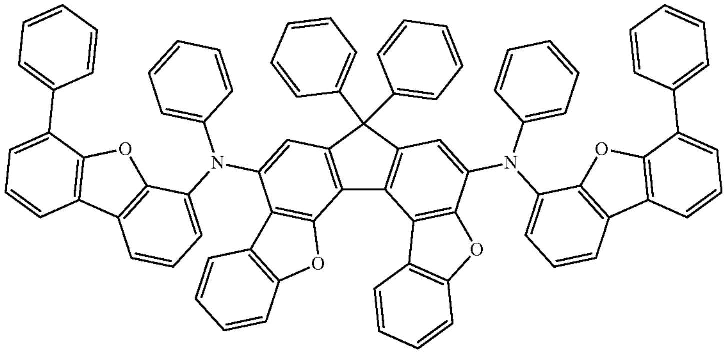
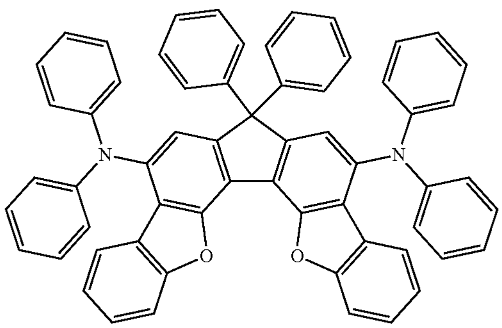
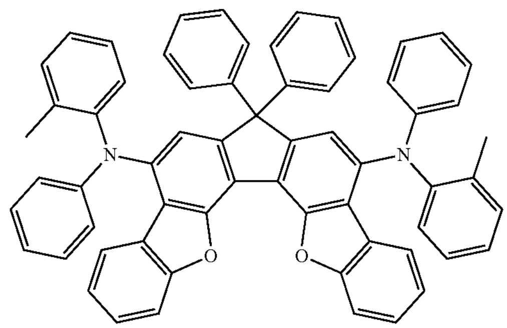
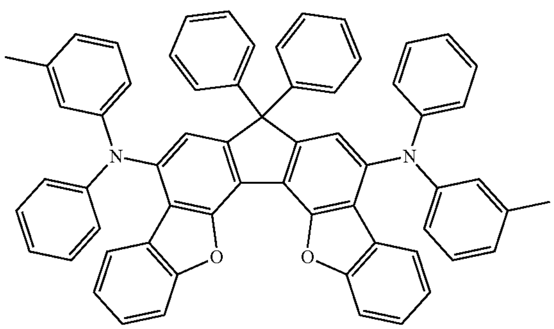
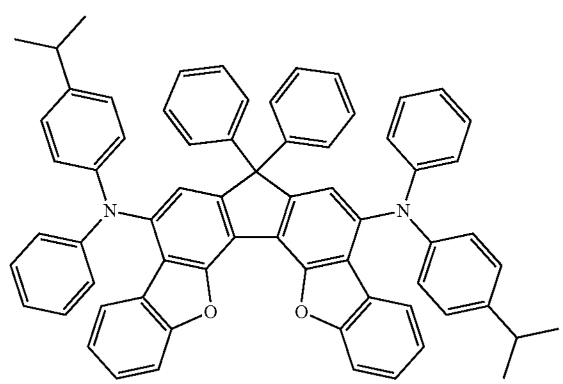
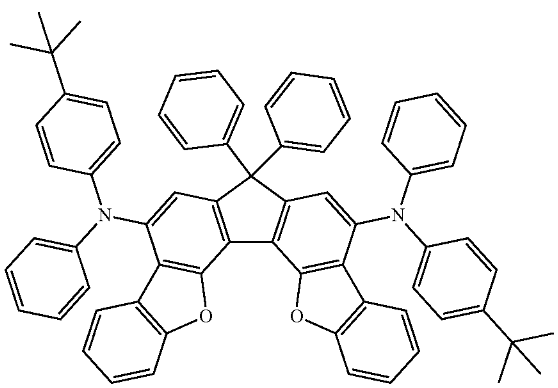
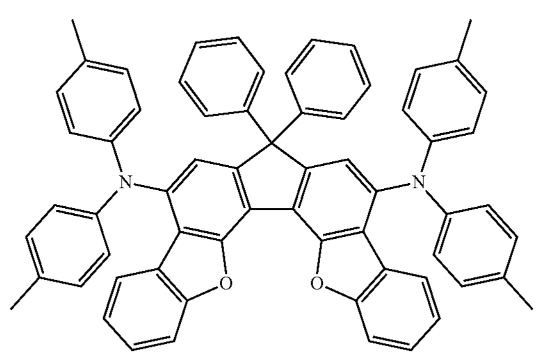

-continued
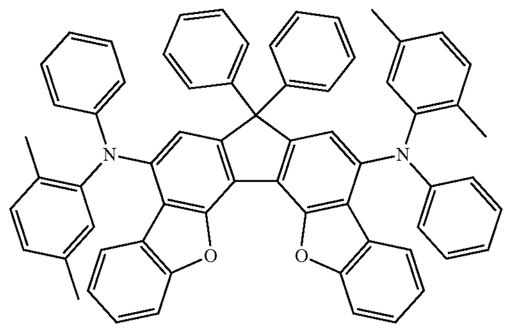
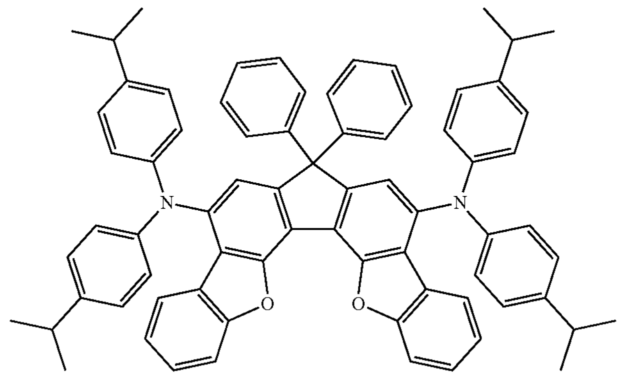
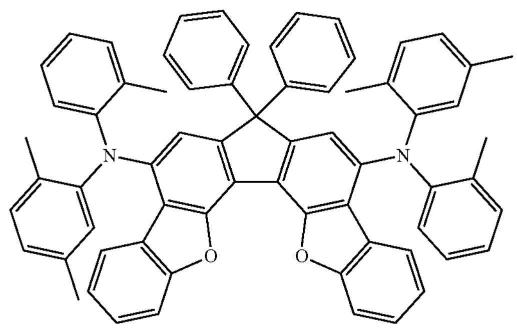
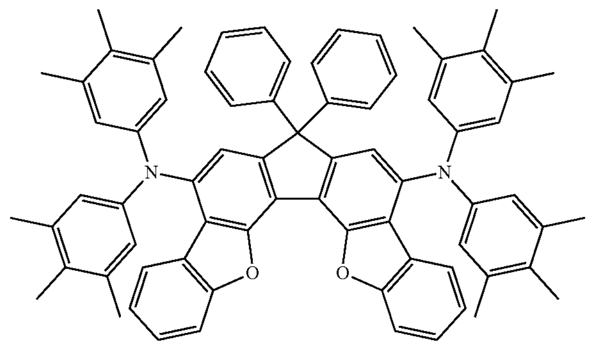
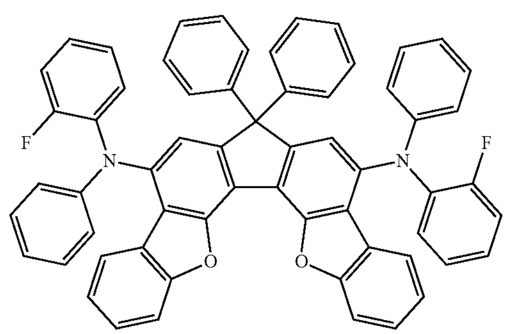
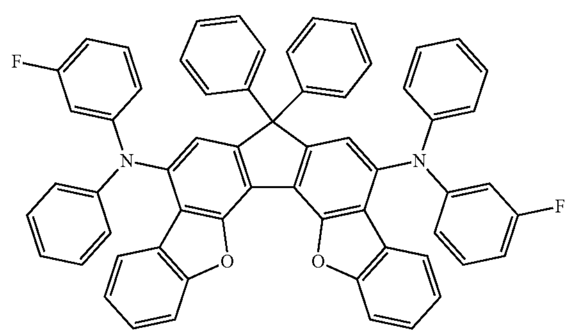
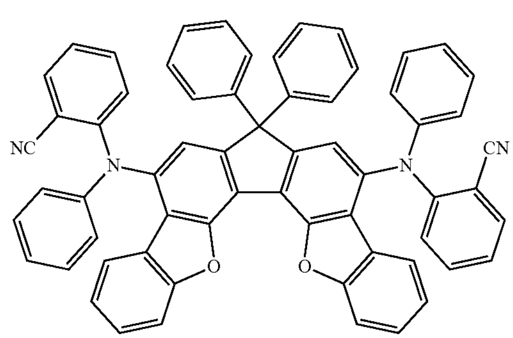
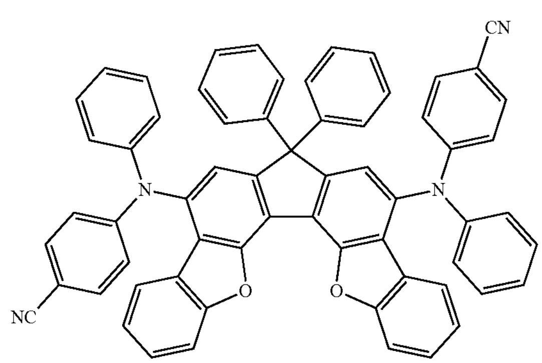

-continued
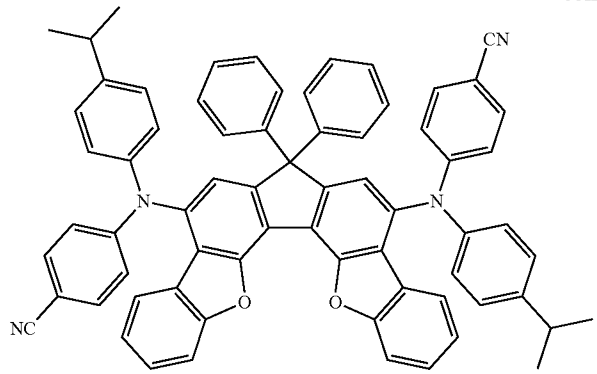
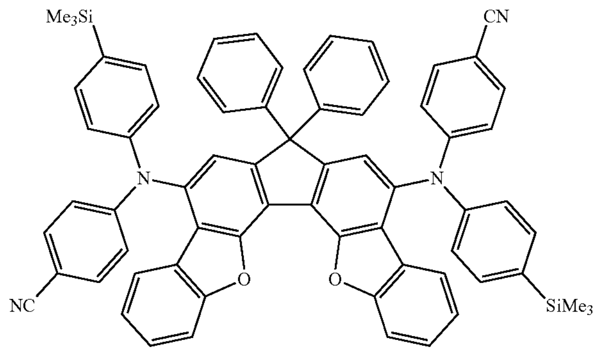
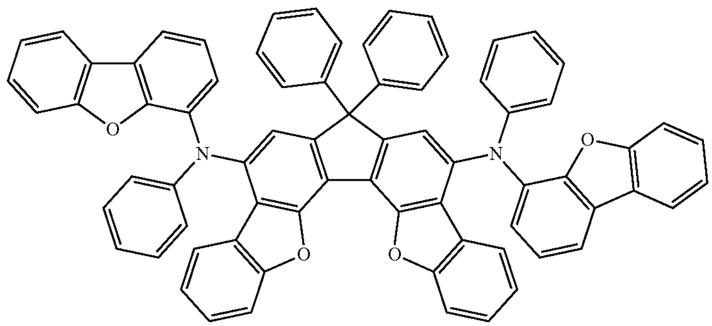
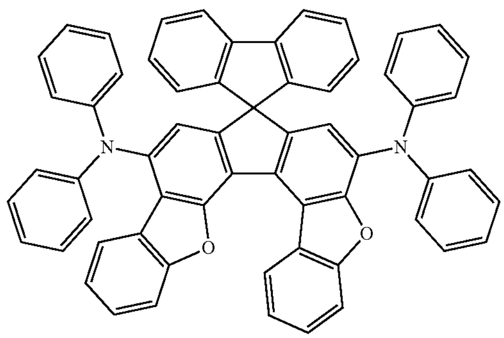
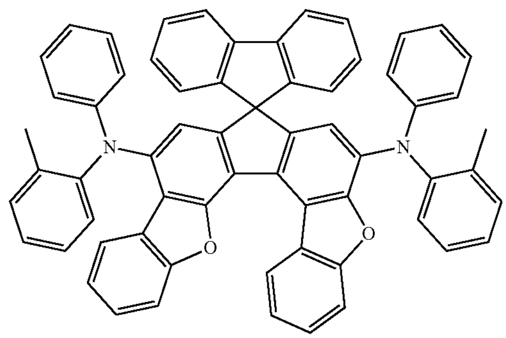
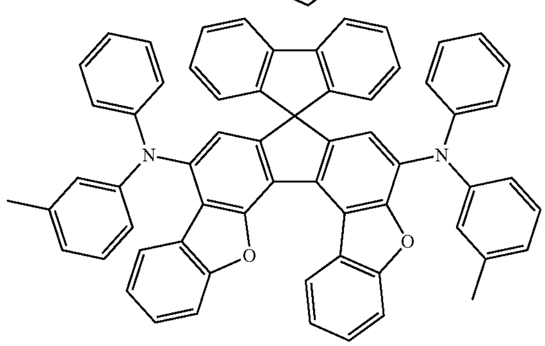
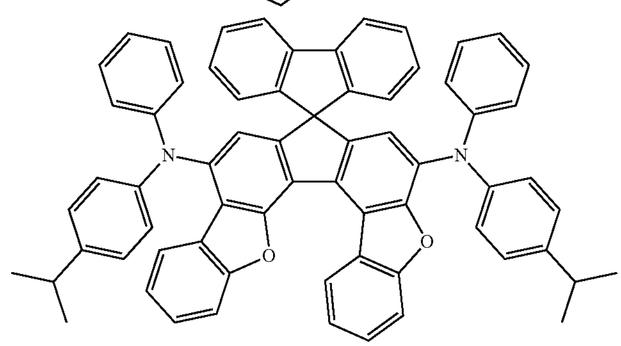
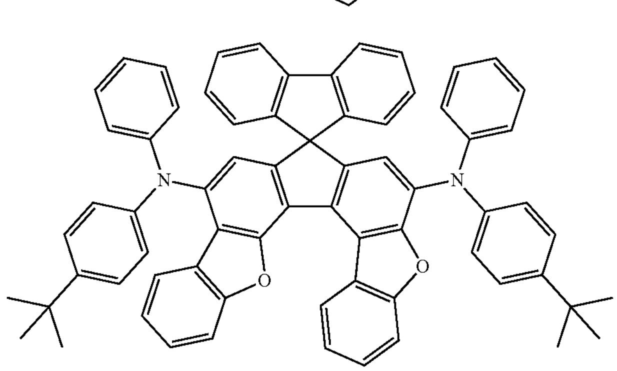
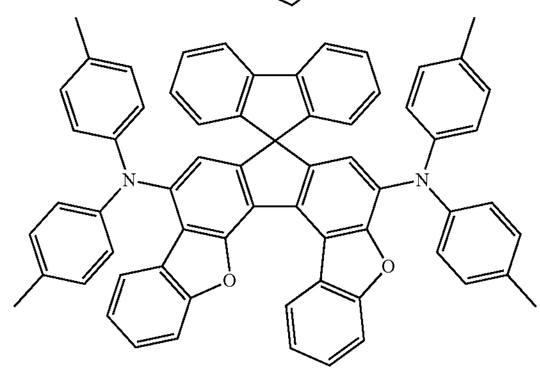

-continued
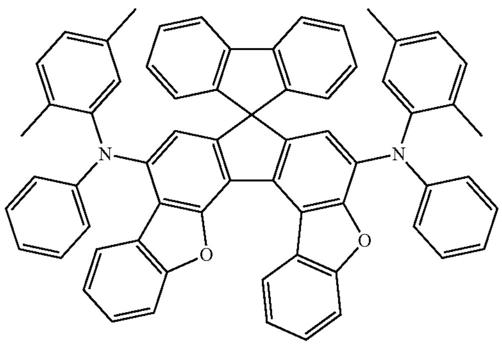
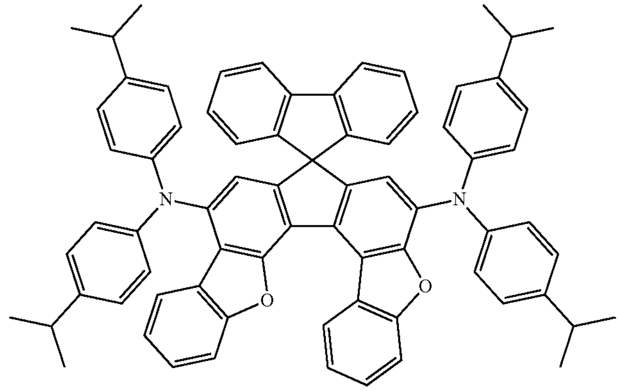
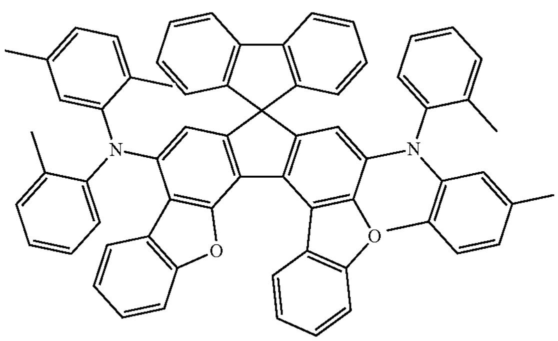
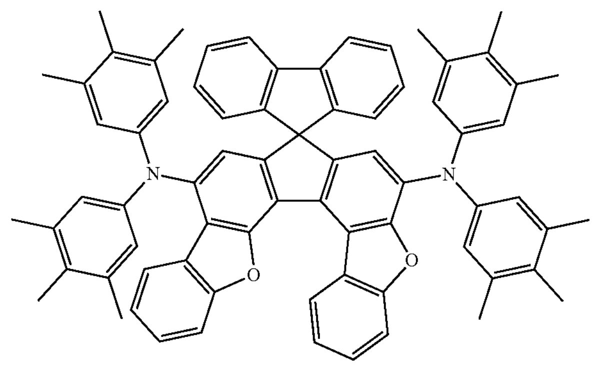
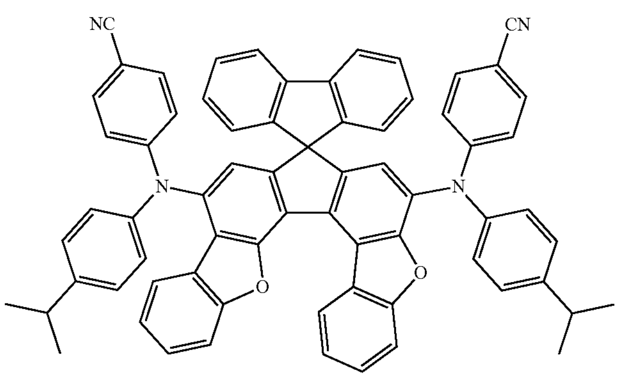
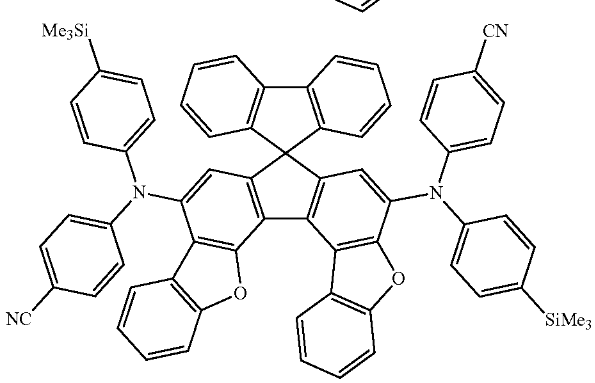

-continued
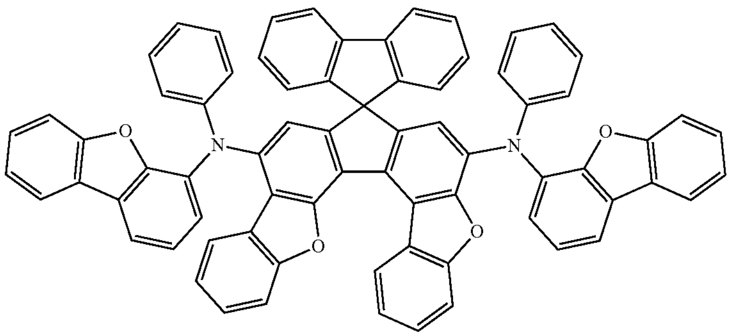
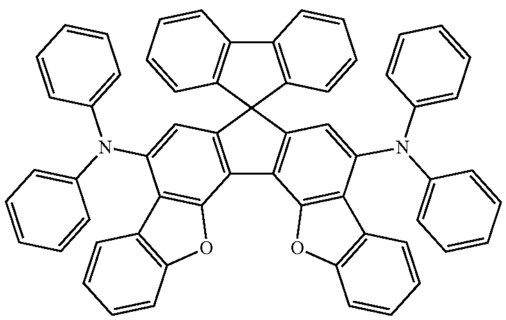
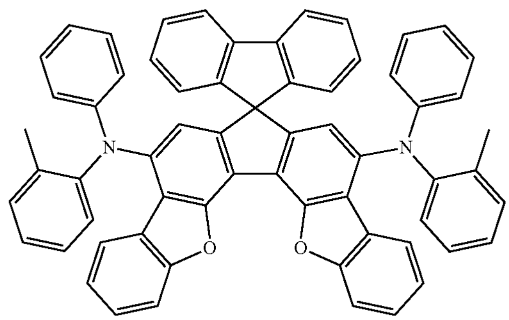
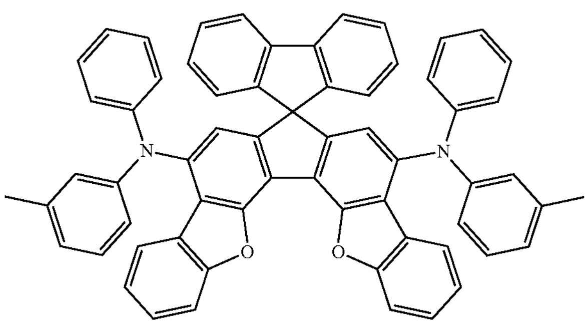
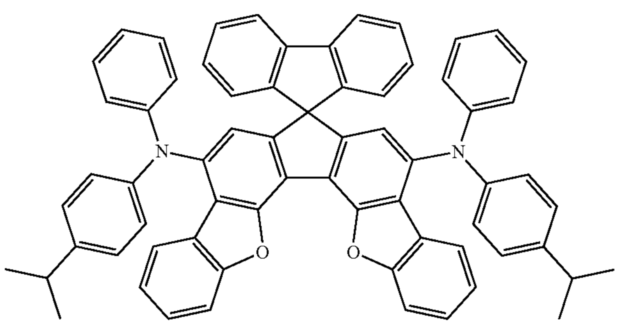
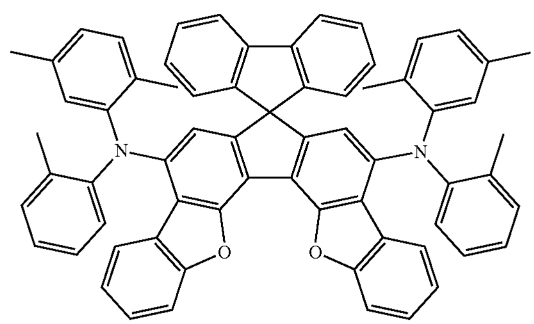
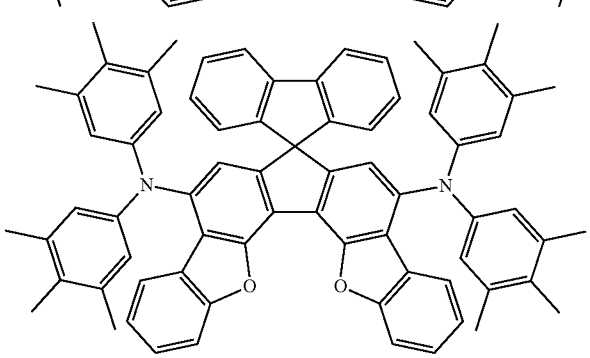
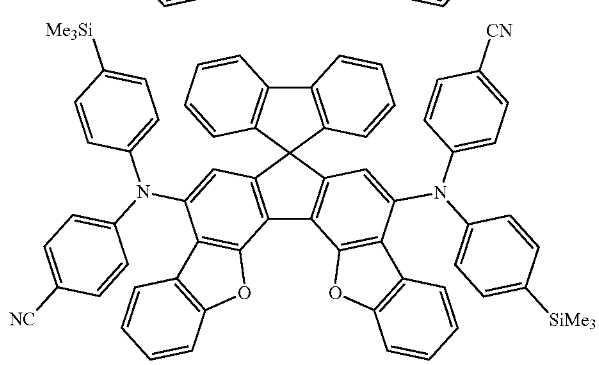

-continued

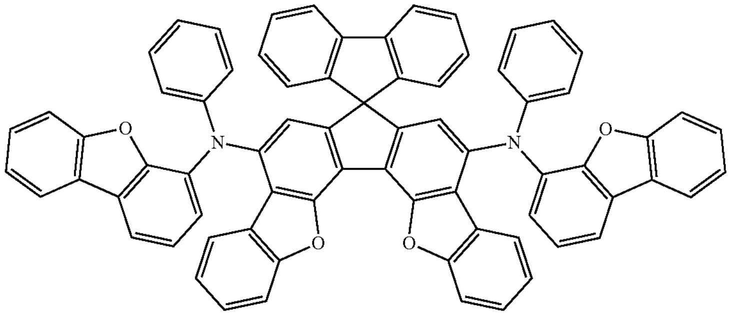 [SMILES: c1ccc(N(c2cccc3c2oc2ccccc23)c2cc3c(c4oc5ccccc5c24)-c2c(cc(N(c4ccccc4)c4cccc5c4oc4ccccc45)c4c2oc2ccccc24)C32c3ccccc3-c3ccccc32)cc1]

(Compound Represented by the Formula (81))

A compound represented by the formula (81) will be described.

(81)

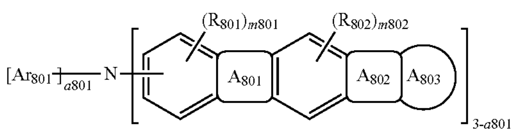

(82)

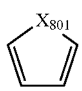

(83)

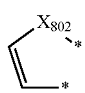

In the formula (81), a ring $Ar_{801}$ is a ring represented by the formula (82) which is fused with the adjacent ring at an arbitrary position.

A ring $Ar_{802}$ is a ring represented by the formula (83) which is fused with the adjacent ring at an arbitrary position. The two of "*" are bonded with the ring $A_{803}$ at arbitrary positions.

$X_{801}$ and $X_{802}$ are independently $C(R_{803})(R_{804})$, $Si(R_{805})(R_{806})$, an oxygen atom, a sulfur atom.

The ring $A_{803}$ is a substituted or unsubstituted aromatic hydrocarbon ring including 6 to 50 ring carbon atoms or a substituted or unsubstituted heterocyclic ring including 5 to 50 ring atoms.

$Ar_{801}$ is a substituted or unsubstituted aryl group including 6 to 50 ring carbon atoms, or a substituted or unsubstituted monovalent heterocyclic group including 5 to 50 ring atoms.

$R_{801}$ to $R_{806}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{9013})$ $(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

m801 and m802 are independently an integer of 0 to 2. When m801 and m802 are 2, the plurality of each of $R_{801}$ or $R_{802}$ may be the same as or different from each other.

a801 is an integer of 0 to 2. When a801 is 0 or 1, the structures in parentheses, which exist in number indicated by "3-a801 (3 subtract a801)" may be the same as or different from each other. When a801 is 2, $Ar_{801}$ may be the same as or different from each other.

In one embodiment, $Ar_{801}$ is a substituted or unsubstituted aryl group including 6 to 50 ring carbon atoms.

In one embodiment, the ring $A_{803}$ is a substituted or unsubstituted aromatic hydrocarbon ring including 6 to 50 ring carbon atoms, and is, for example, a substituted or unsubstituted benzene ring, a substituted or unsubstituted naphthalene ring, or a substituted or unsubstituted anthracene ring.

In one embodiment, $R_{803}$ and $R_{804}$ are independently a substituted or unsubstituted alkyl group including 1 to 50 carbon atoms.

In one embodiment, a801 is 1.

Specific examples of the compound represented by the formula (81) include the following compounds.

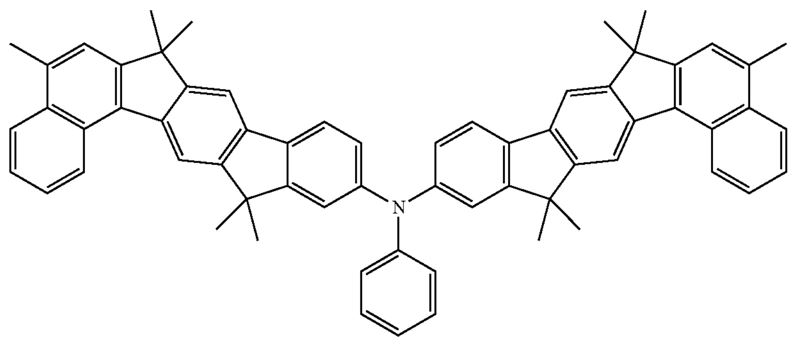
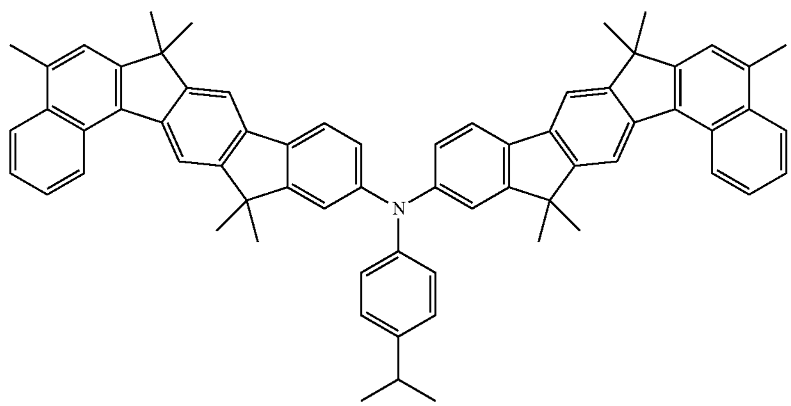
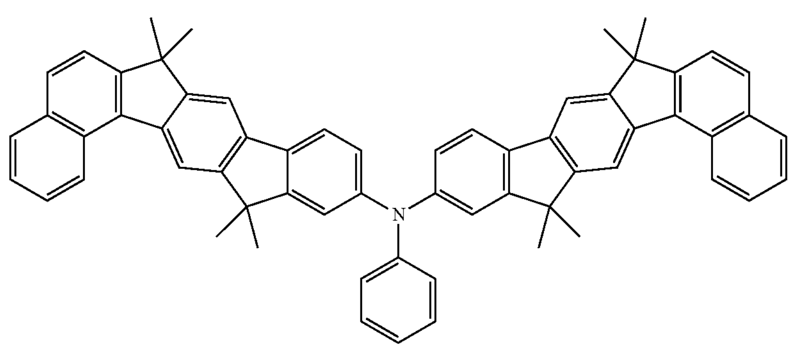
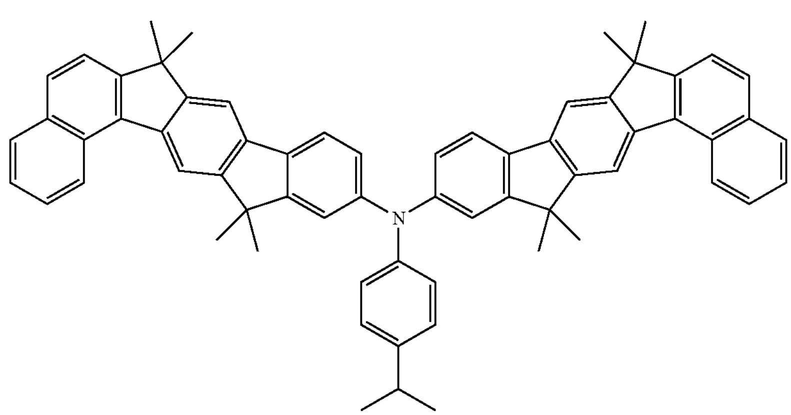

-continued
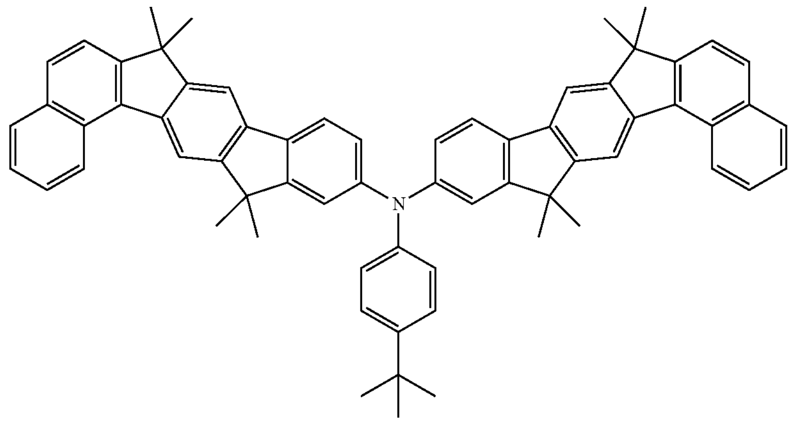
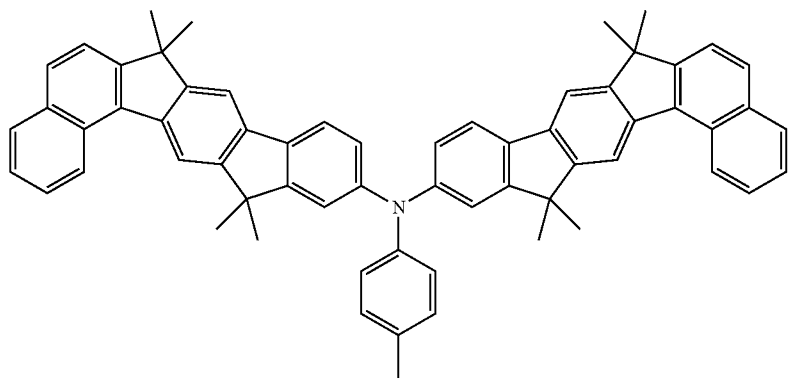
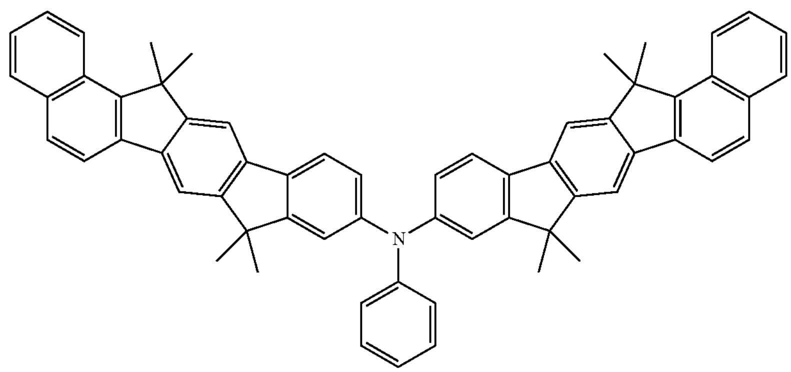
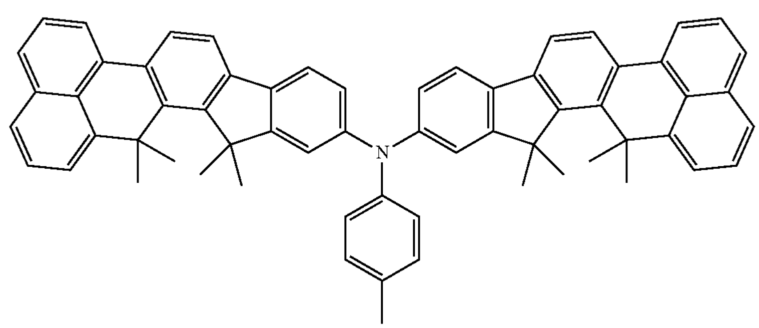

-continued
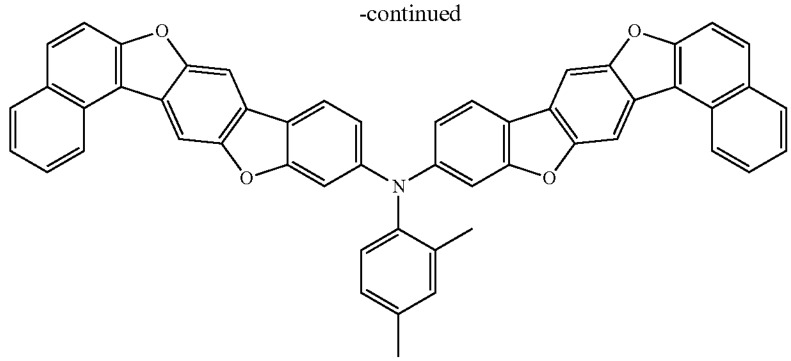
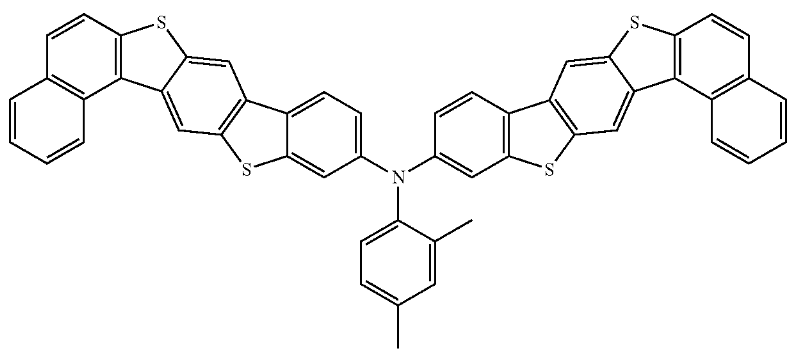
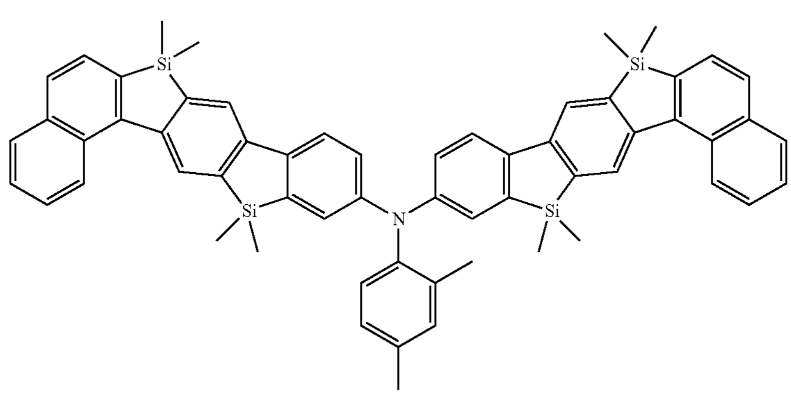

Specific examples of the above groups are as described in the section of [Definitions] of this specification.

(Compound Represented by the Formula (91))

A compound represented by formula (91) will be described.

(91)

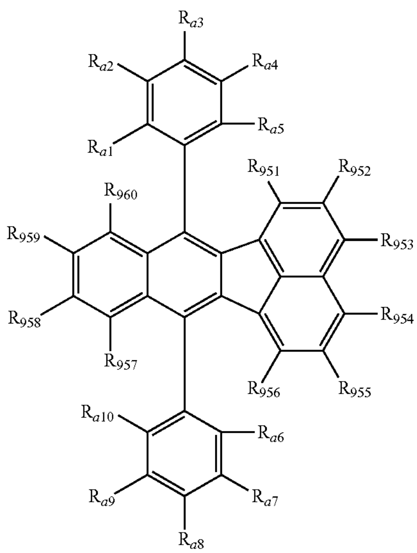

In the formula (91), any one or more sets selected from the group consisting of:

one or more sets of adjacent two or more of $R_{951}$ to $R_{960}$, one or more sets of adjacent two or more of $R_{a1}$ to $R_{a5}$, and one or more sets of adjacent two or more of $R_{a6}$ to $R_{a10}$ form a substituted or unsubstituted, saturated or unsaturated ring including 3 to 30 ring atoms.

$R_{951}$ to $R_{960}$, $R_{a1}$ to $R_{a5}$, and $R_{a6}$ to $R_{a10}$ which are not involved in ring formation are independently a hydrogen atom, a substituted or unsubstituted alkyl group including 1 to 30 carbon atoms, a substituted or unsubstituted cycloalkyl group including 3 to 30 ring carbon atoms, a substituted or unsubstituted alkoxy group including 1 to 30 carbon atoms, a substituted or unsubstituted alkylthio group including 1 to 30 carbon atoms, a substituted or unsubstituted amino group, a substituted or unsubstituted aryl group including 6 to 30 ring carbon atoms, a substituted or unsubstituted heterocyclic group including 5 to 30 ring atoms, a substituted or unsubstituted alkenyl group including 2 to 30 carbon atoms, a substituted or unsubstituted aryloxy group including 6 to 30 ring carbon atoms, a substituted or unsubstituted arylthio group including 6 to 30 ring carbon atoms, a substituted or unsubstituted phosphanyl group, a substituted or unsubstituted phosphoryl group, a substituted or unsubstituted silyl group, a substituted or unsubstituted arylcarbonyl group including 6 to 30 ring carbon atoms, a cyano group, a nitro group, a carboxyl group, or a halogen atom.

At least one set of adjacent two or more of $R_{951}$ to $R_{956}$, $R_{957}$ to $R_{960}$, $R_{a1}$ to $R_{a5}$, and $R_{a6}$ to $R_{a10}$ form a ring by bonding with each other.

Specific examples are described in which "one or more sets of adjacent two or more of $R_{951}$ to $R_{960}$, one or more sets of adjacent two or more of $R_{a1}$ to $R_{a5}$, and one or more sets of adjacent two or more of $R_{a6}$ to $R_{a10}$" form a substituted or unsubstituted, saturated or unsaturated ring including 3 to 30 ring atoms.

A specific example in which adjacent two or more forms a ring by bonding with each other, for example, includes the following substructure, by taking $R_{957}$ to $R_{960}$ in the formula (91) as an example. In the following partial structure, adjacent three of $R_{958}$ and $R_{959}$ and $R_{960}$ form a ring by bonding with each other.

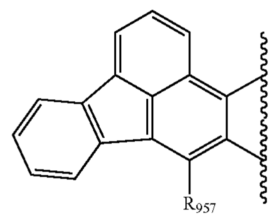

A specific example in which "one or more sets of adjacent two or more" forms a ring by bonding with each other, for example, includes the following substructure, by taking $R_{951}$ to $R_{956}$ in the formula (91) as an example. In the following partial structure, two sets of $R_{952}$ and $R_{953}$, and $R_{954}$ and $R_{955}$ form two separate rings by bonding with each other.

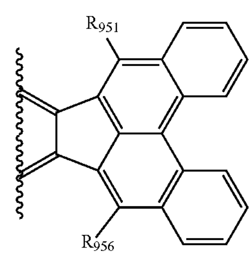

In one embodiment, $R_{952}$ and $R_{953}$ in the formula (91) form a substituted or unsubstituted, saturated or unsaturated ring including 3 to 30 ring atoms by bonding with each other.

In one embodiment, the compound represented by the formula (91) is a compound represented by the following formula (91-1).

(91-1)

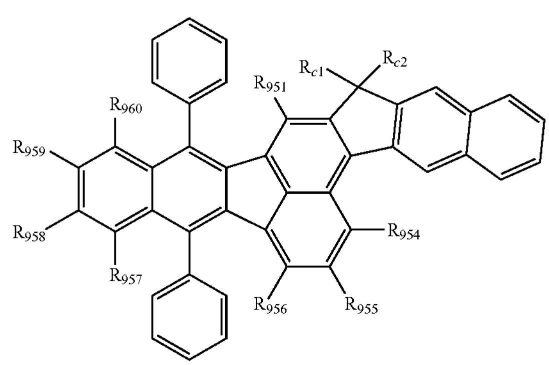

In the formula (91-1), $R_{951}$, and $R_{954}$ to $R_{960}$ are as defined in the formula (91).

$R_{c1}$ and $R_{c2}$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$) ($R_{907}$), a halogen atom, a cyano group, a nitro group, an unsubstituted aryl group including 6 to 50 ring carbon atoms, or an unsubstituted monovalent heterocyclic group including 5 to 50 ring atoms.

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

When two or more of each of $R_{901}$ to $R_{907}$ are present, the two or more of each of $R_{901}$ to $R_{907}$ may be the same as or different from each other.

In one embodiment, two or more of $R_{958}$ to $R_{960}$ in the formula (91) form a substituted or unsubstituted, saturated or unsaturated ring including 3 to 30 ring atoms by bonding with each other.

In one embodiment, the compound represented by the formula (91) is a compound represented by the following formula (91-2).

(91-2)

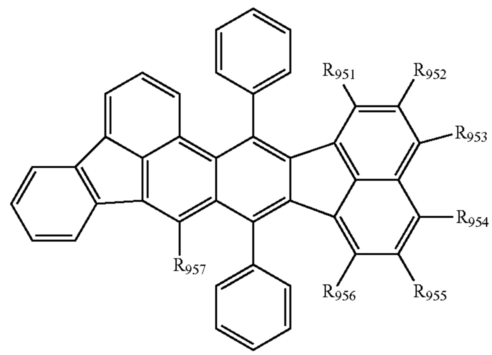

In the formula (91-2), $R_{951}$ to $R_{957}$ are as defined in the formula (91).

In one embodiment, $R_{951}$ to $R_{960}$, $R_{a1}$ to $R_{a5}$, and $R_{a6}$ to $R_{a10}$ which are not involved in ring formation in the formula (91) are independently a hydrogen atom, an unsubstituted aryl group including 6 to 50 ring carbon atoms, or an unsubstituted monovalent heterocyclic group including 5 to 50 ring atoms.

Hereinafter, specific examples of the compound represented by the formula (91) will be described, but are illustrative only, and the compound represented by the formula (91) is not limited to the following specific examples.

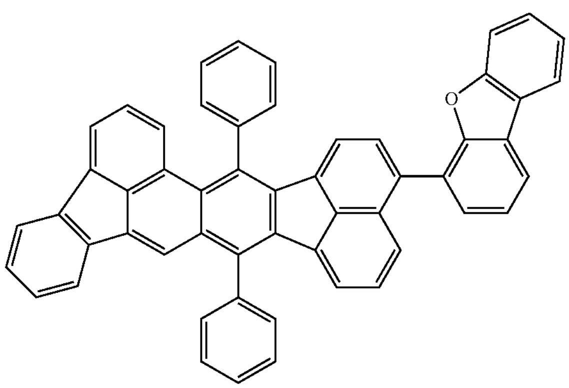

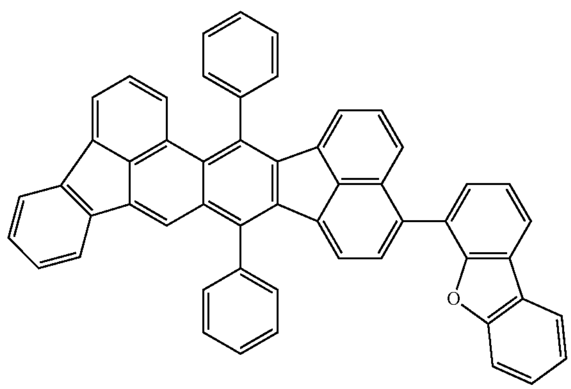

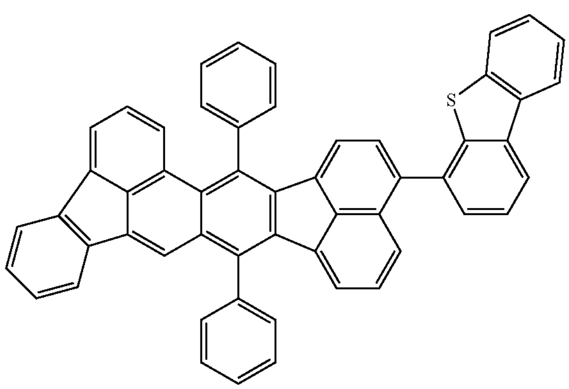

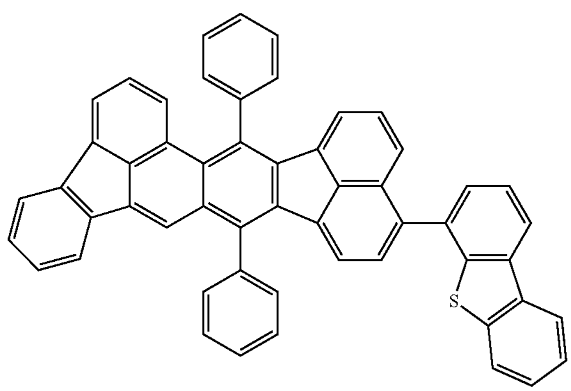

-continued
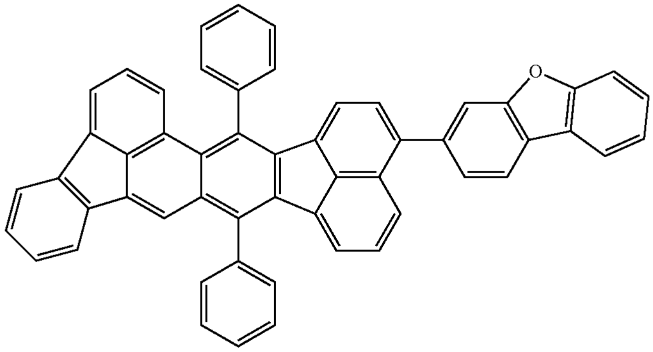
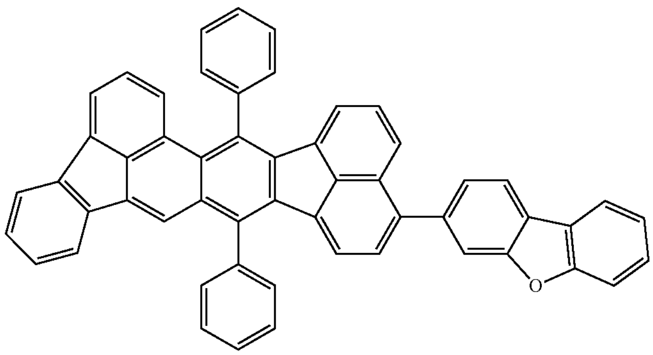
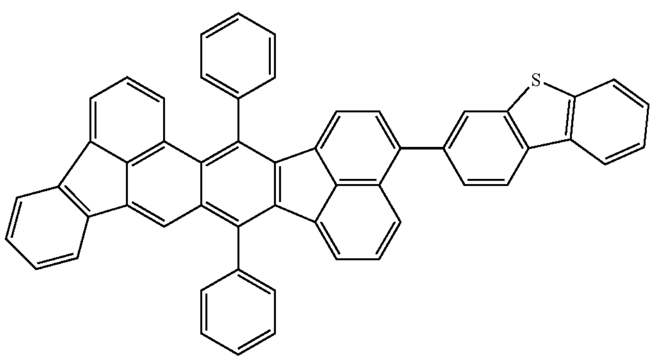
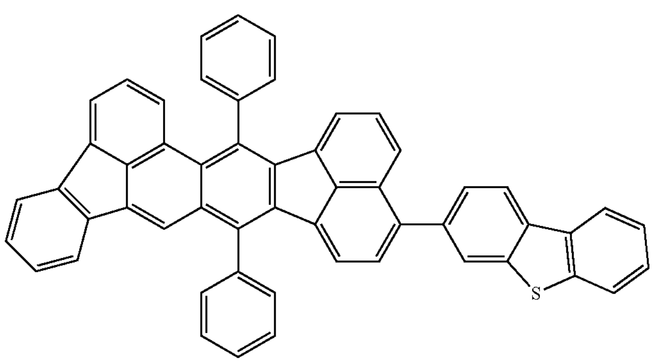

-continued
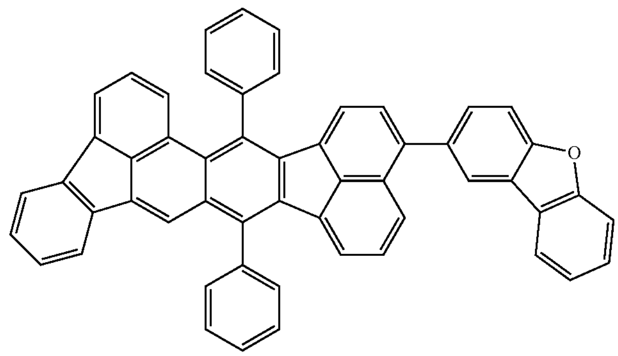
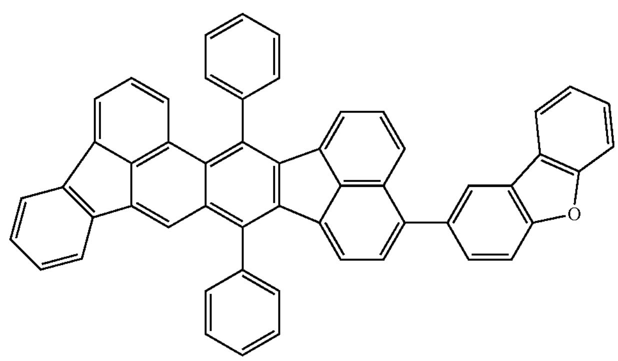
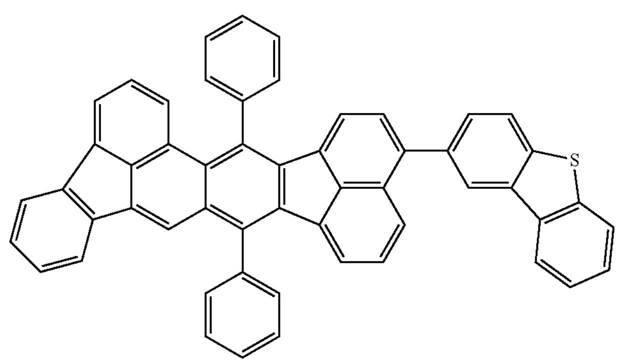
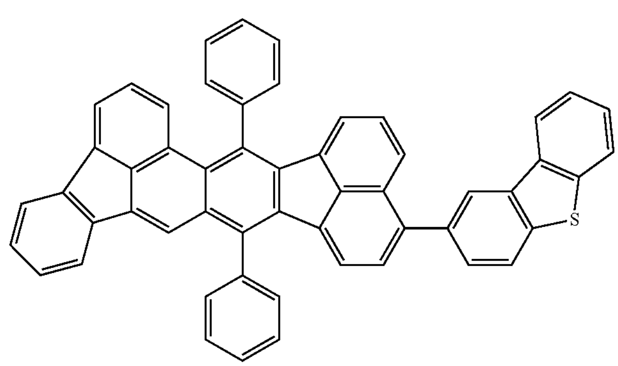

-continued
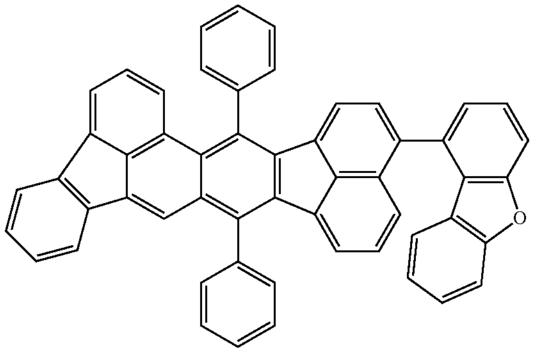
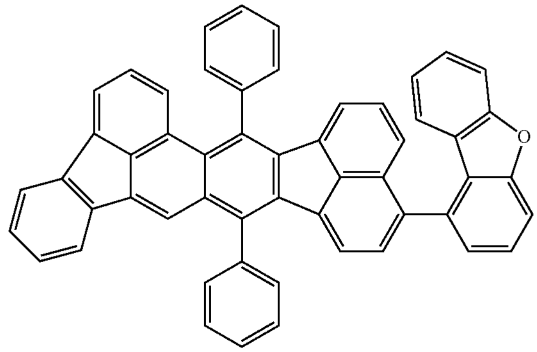
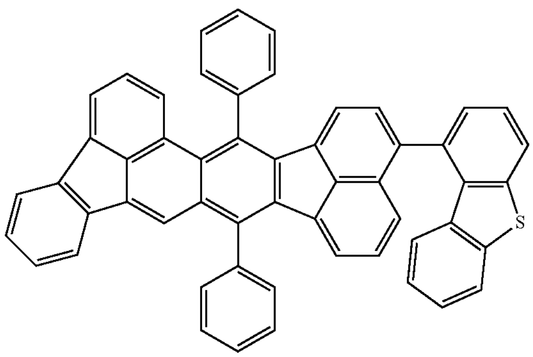
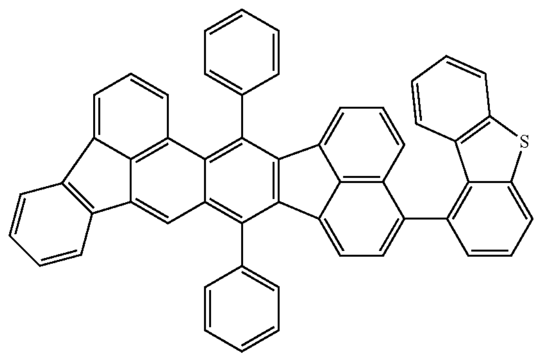
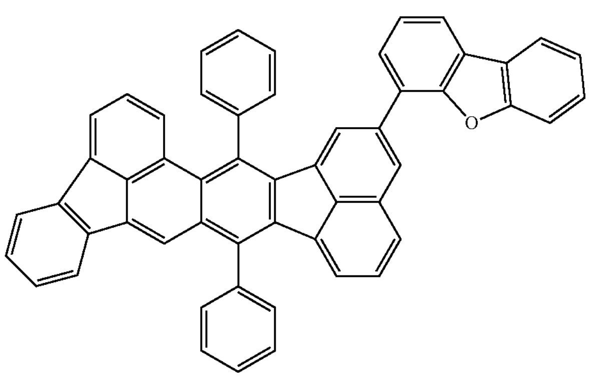
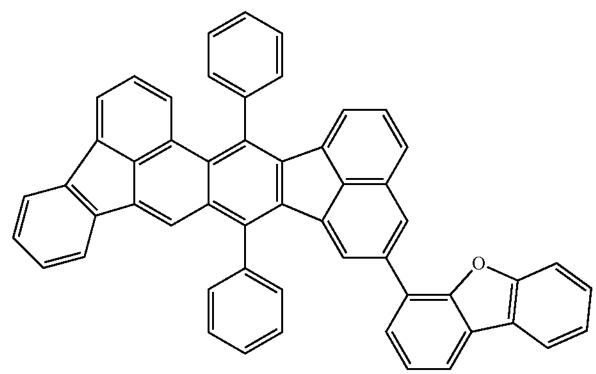
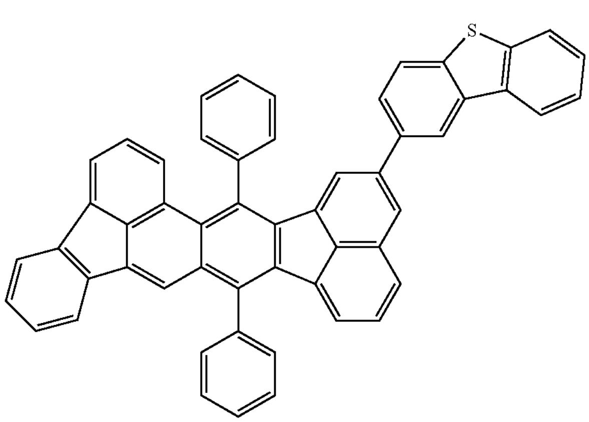
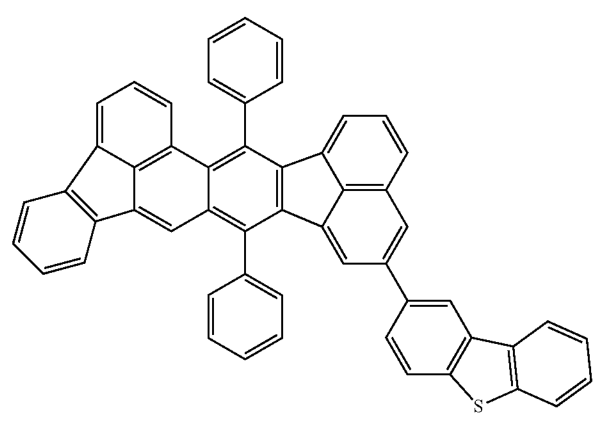

-continued
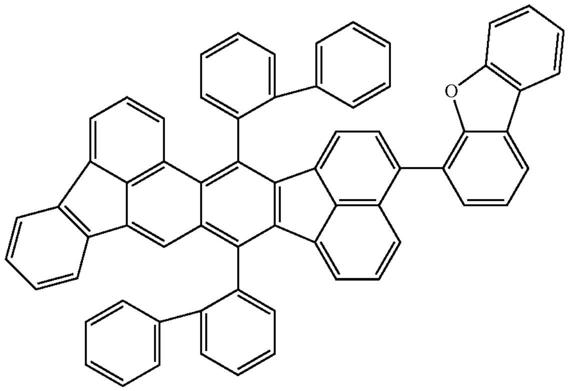
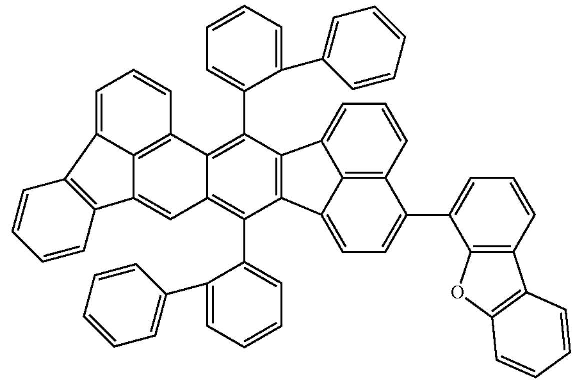
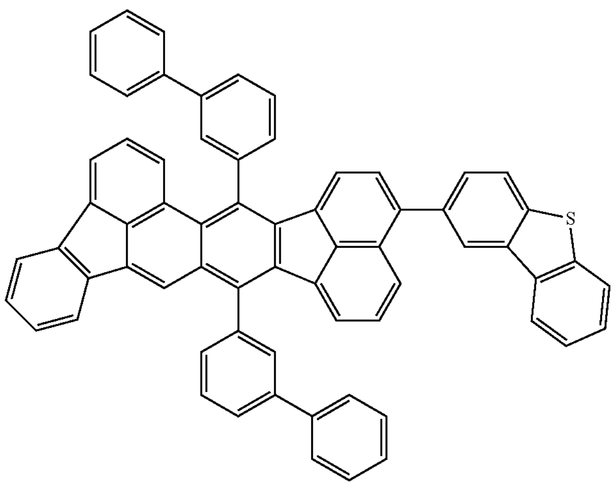
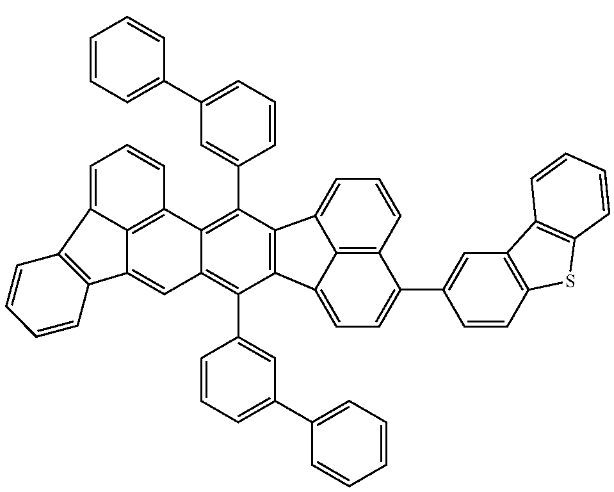
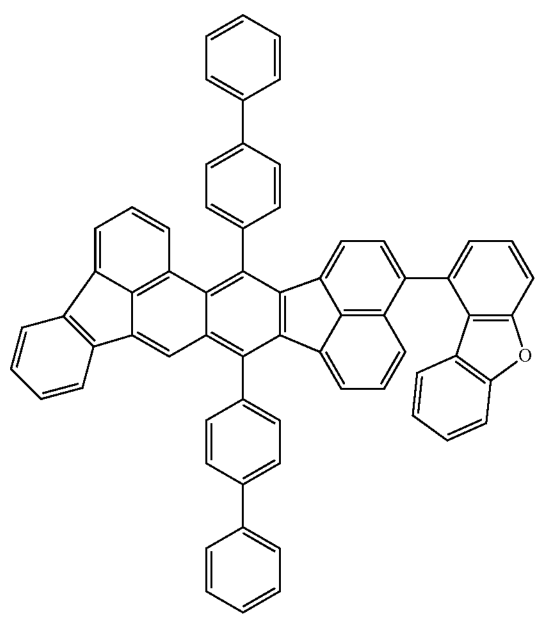

-continued
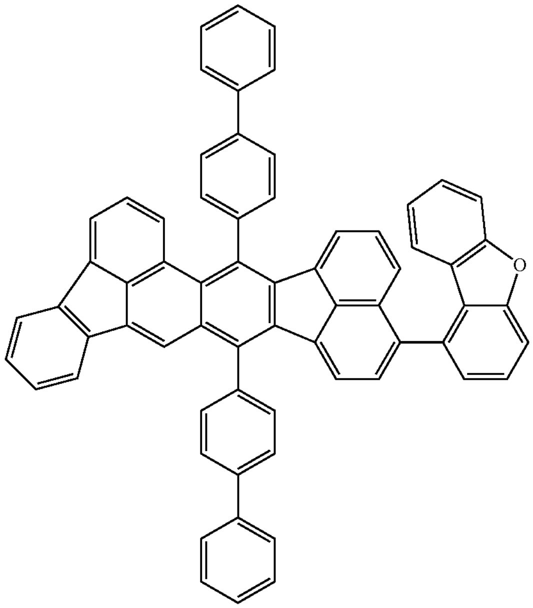
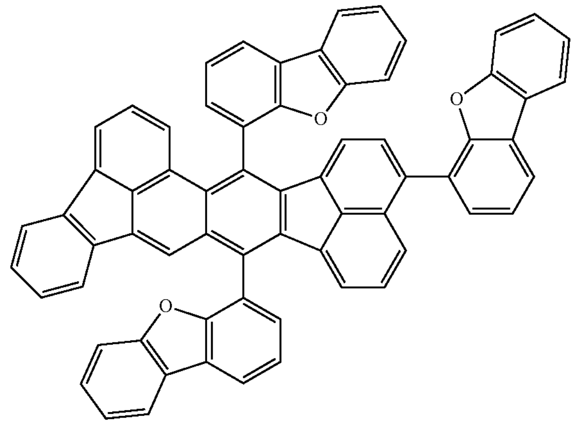
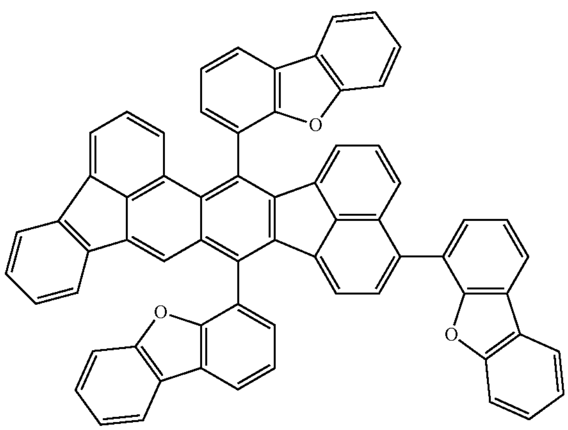
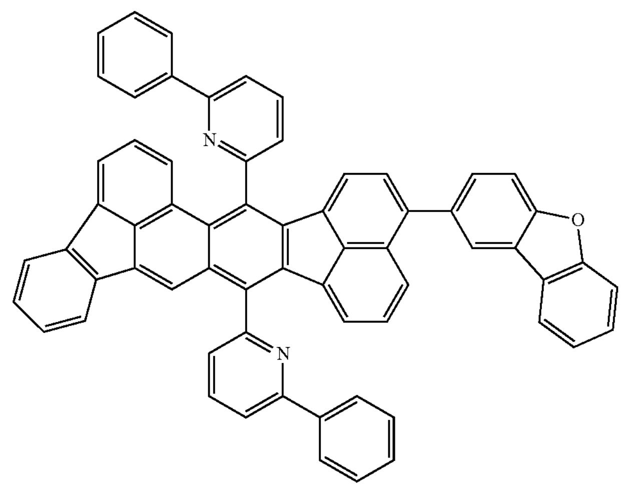
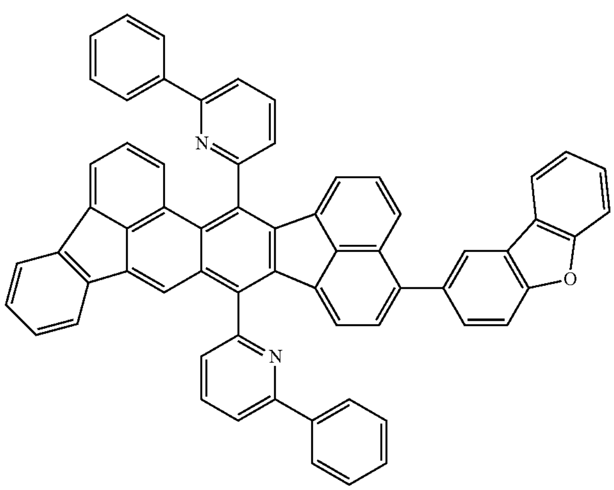
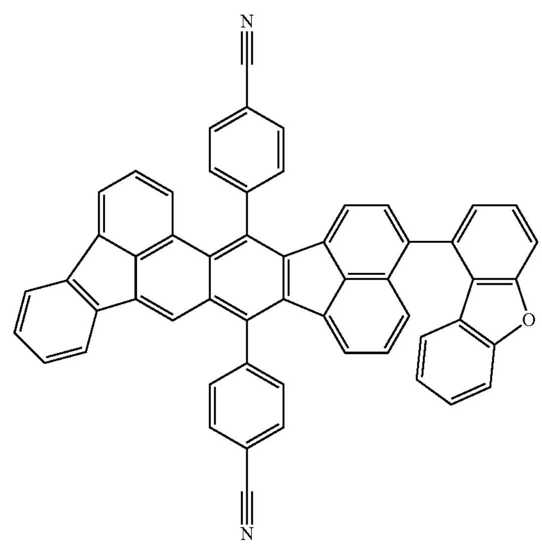

-continued
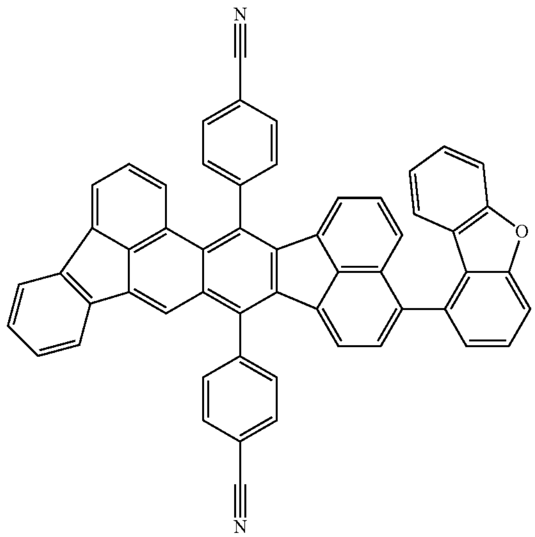
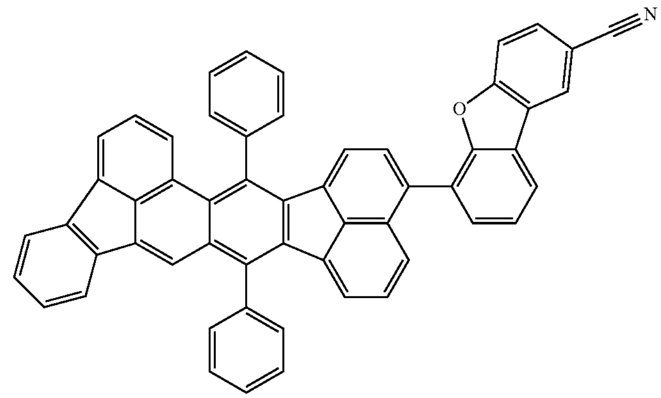
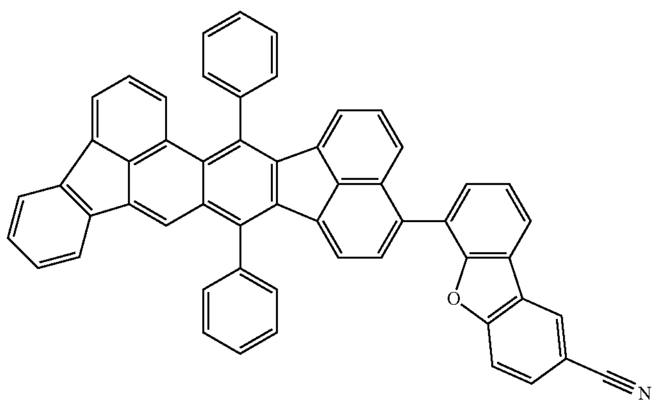
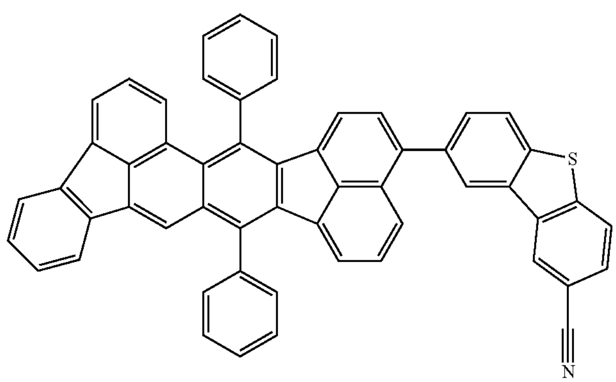
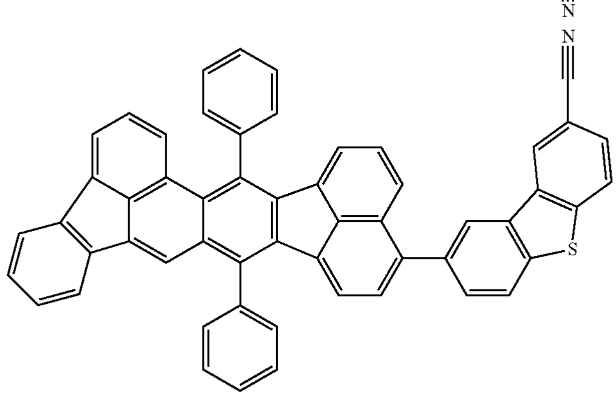

-continued
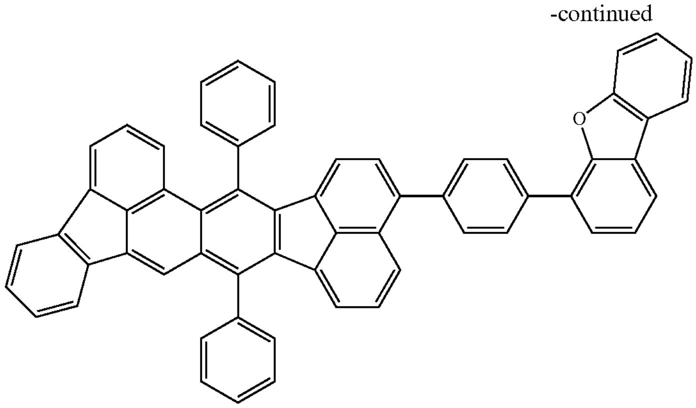
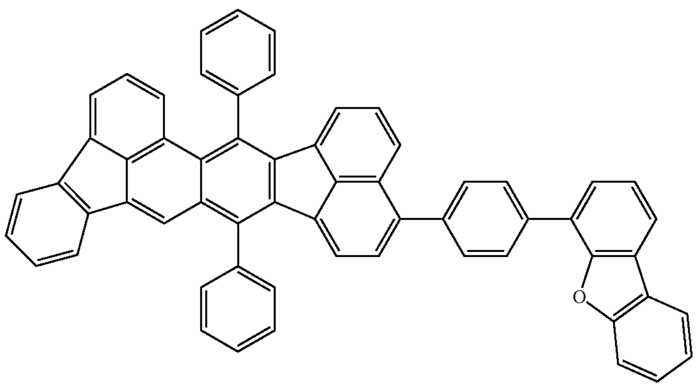
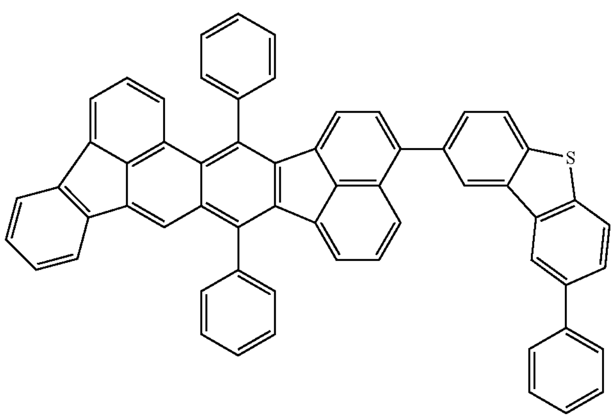
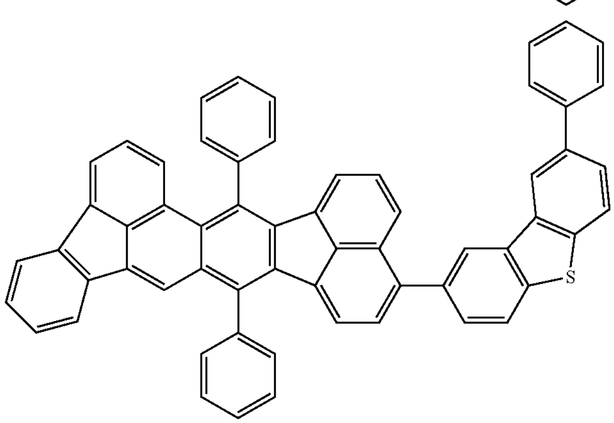

-continued
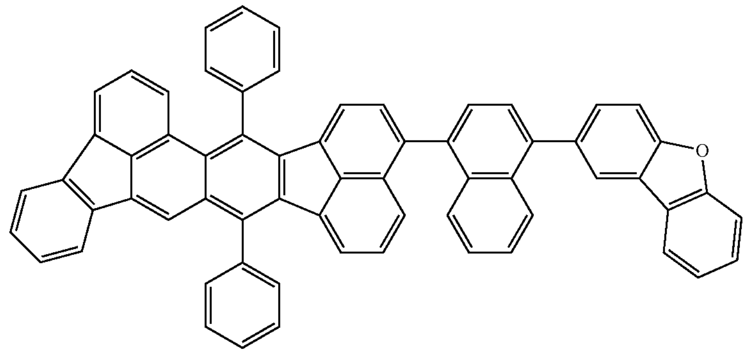
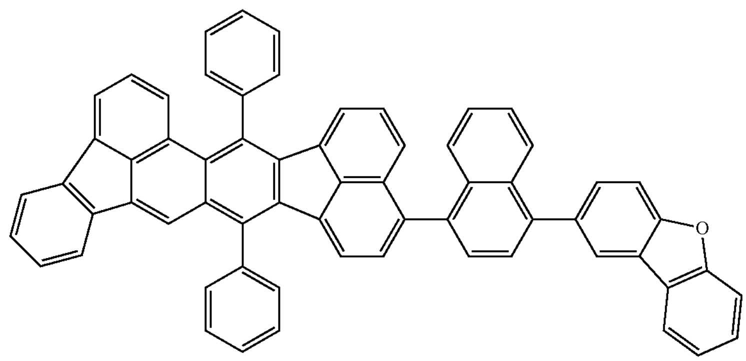
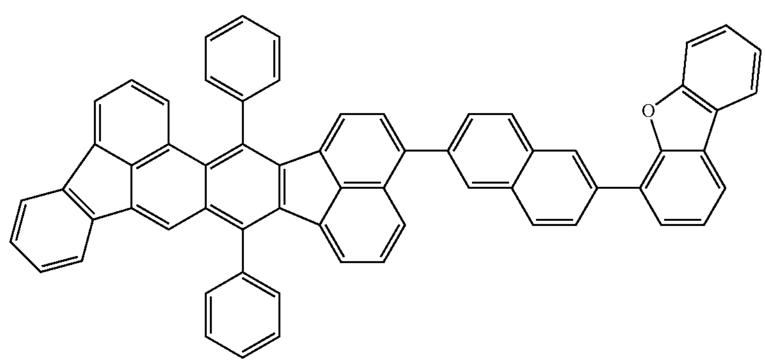
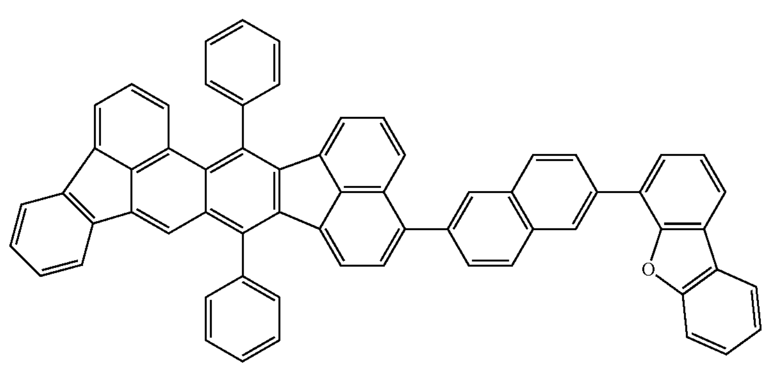

-continued
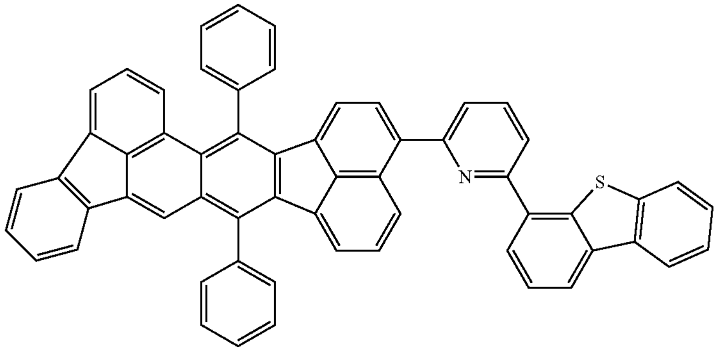
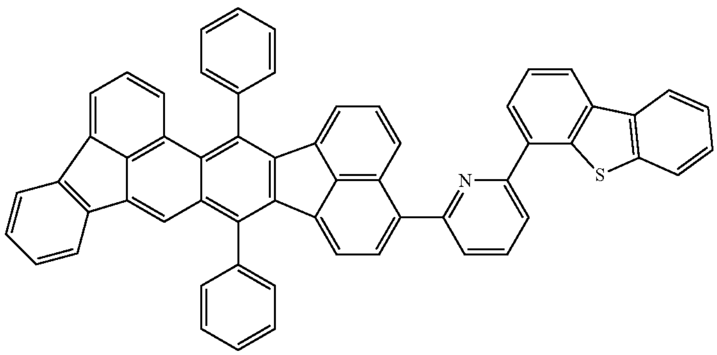
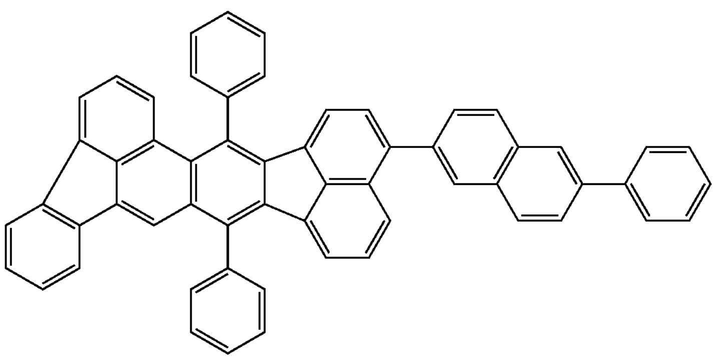
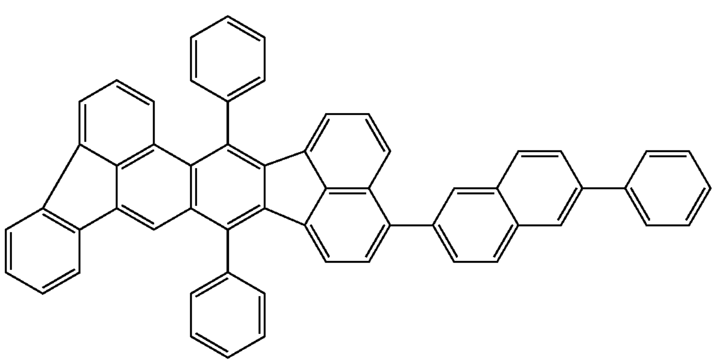

-continued
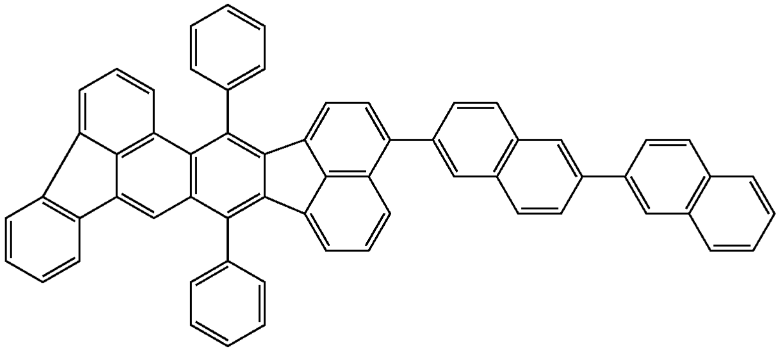
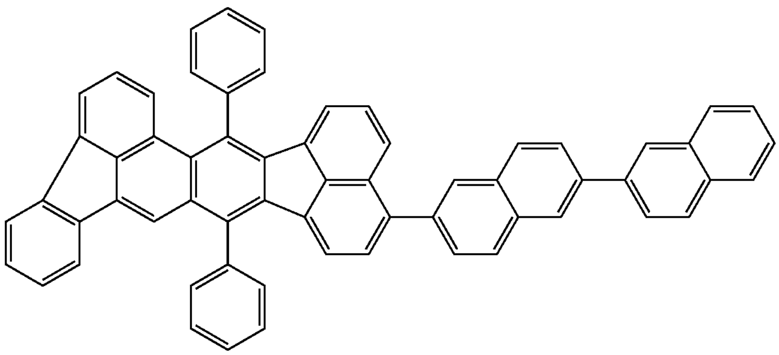
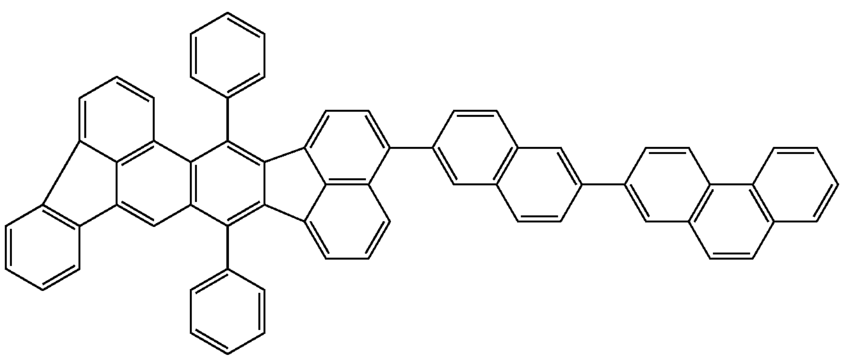
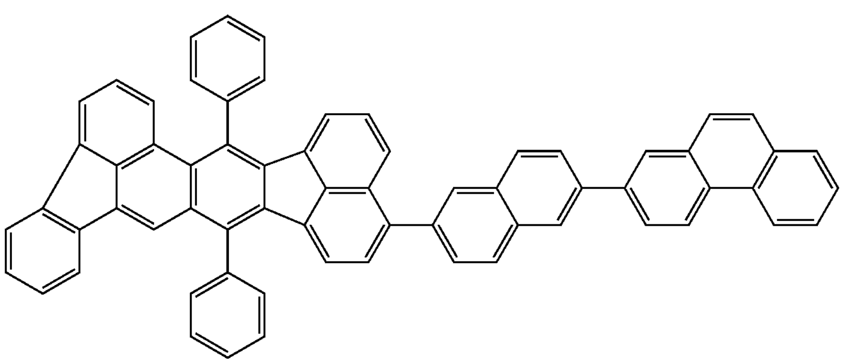

-continued
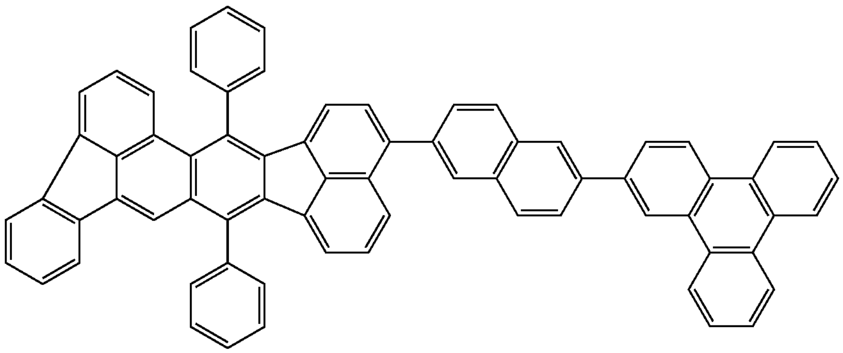
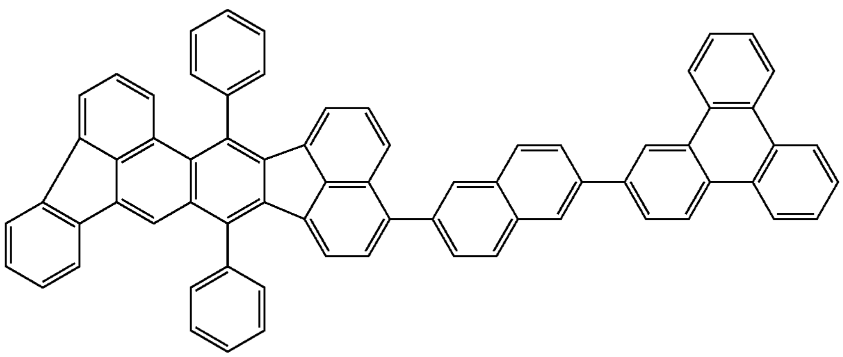
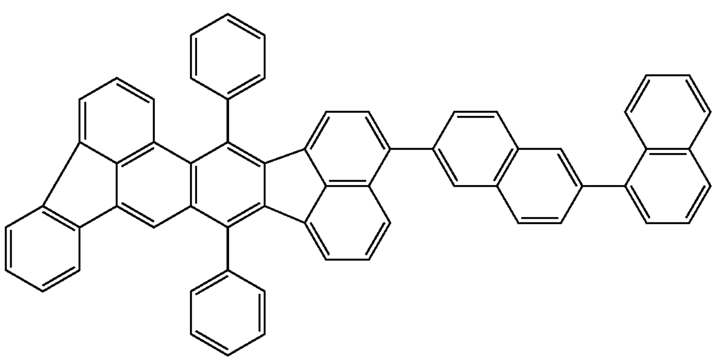
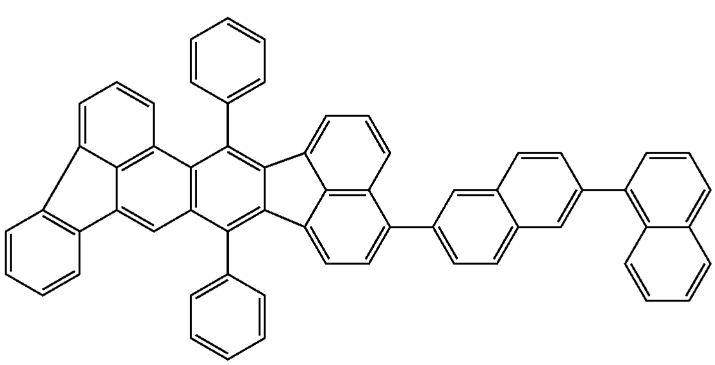

-continued
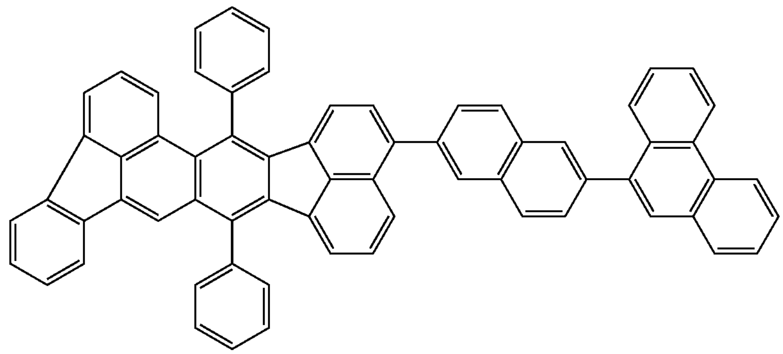
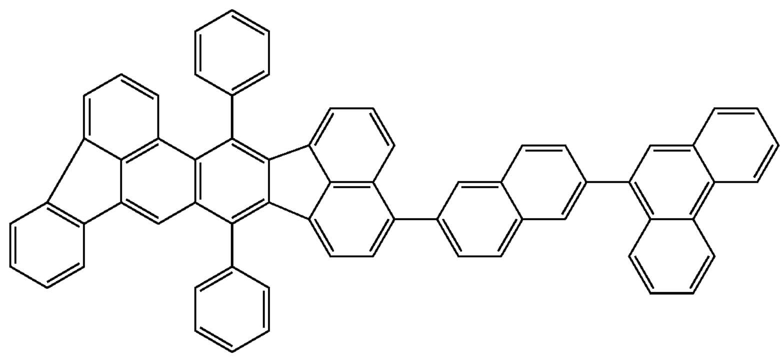
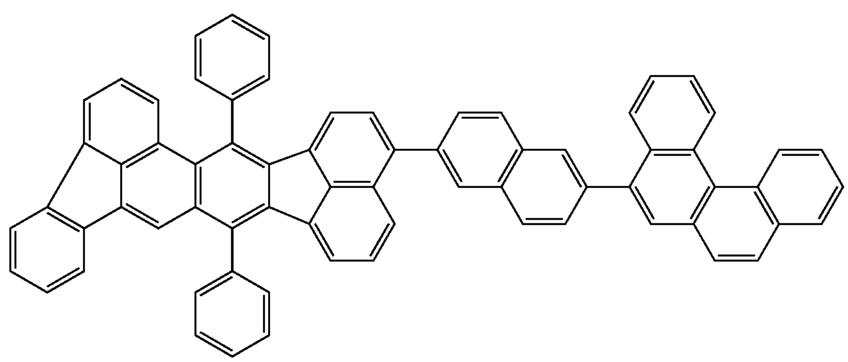
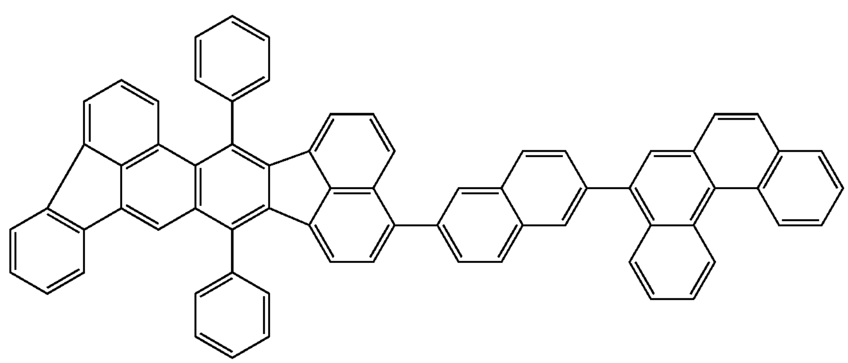

-continued
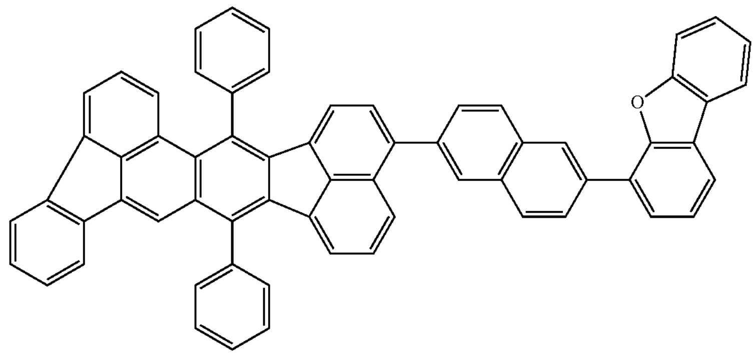
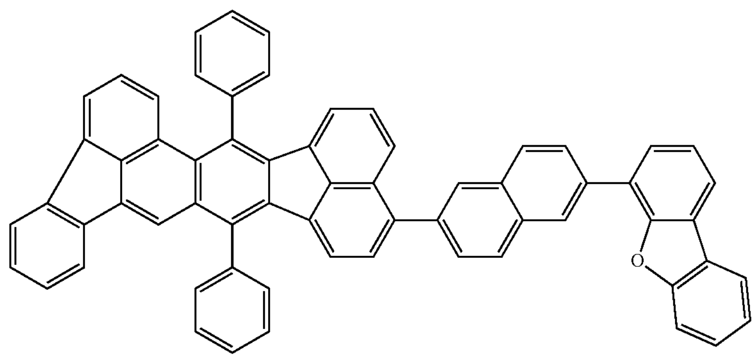
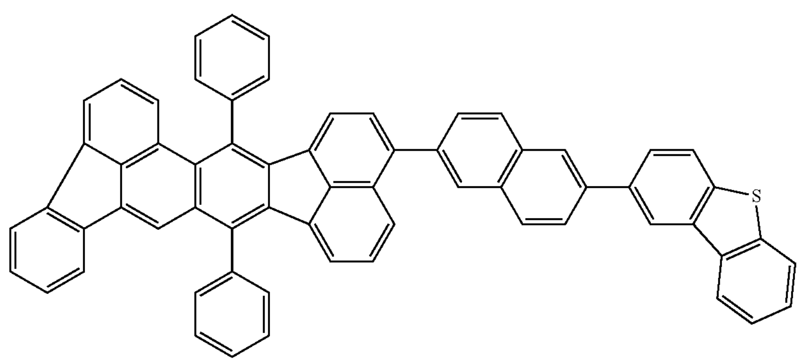
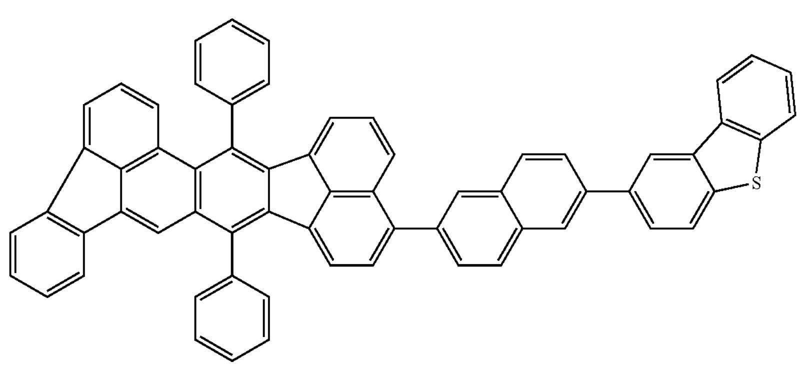

-continued
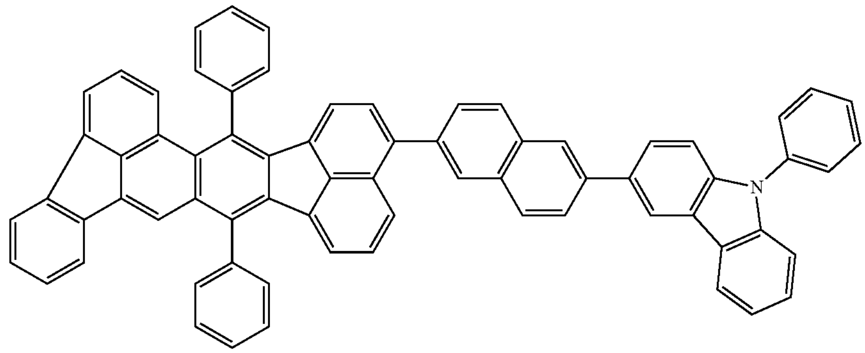
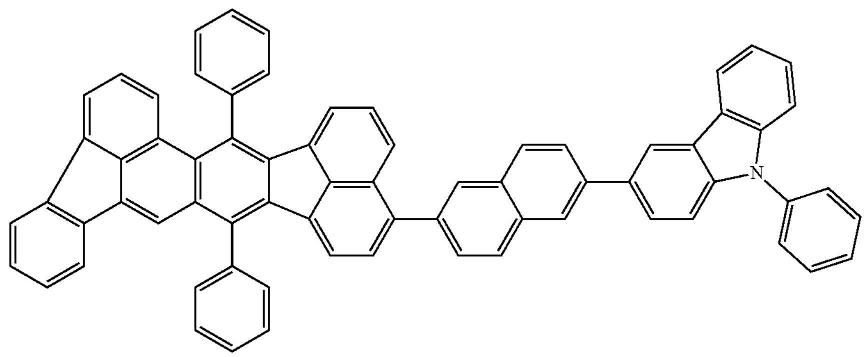
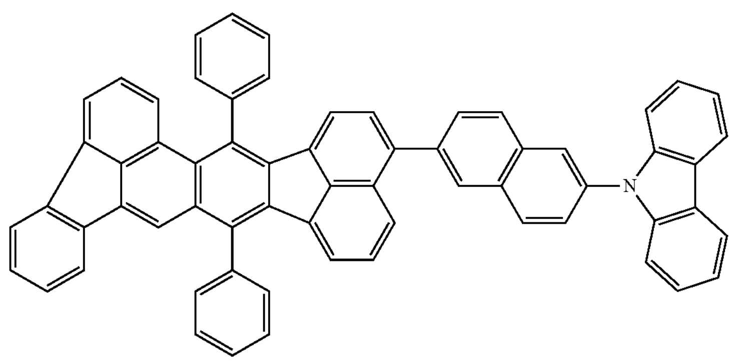
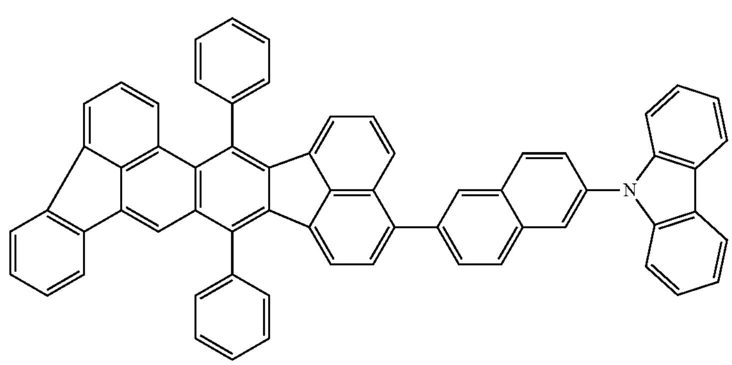

-continued
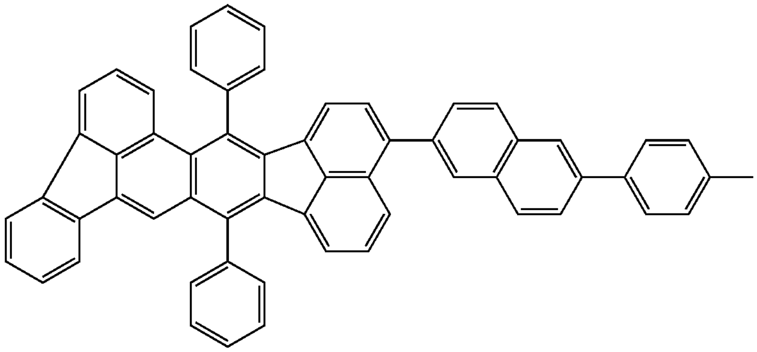
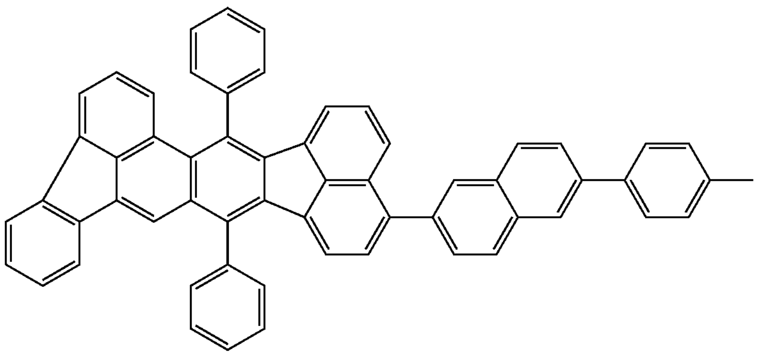
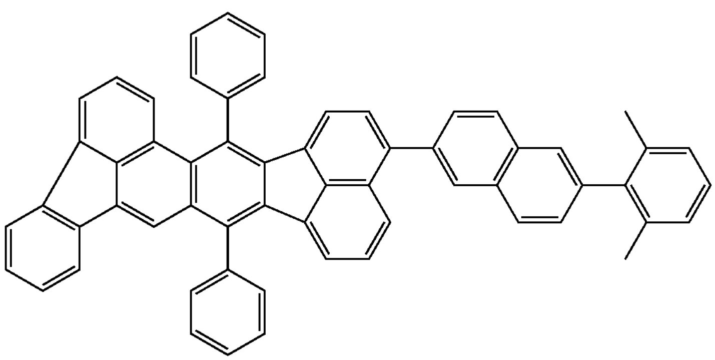
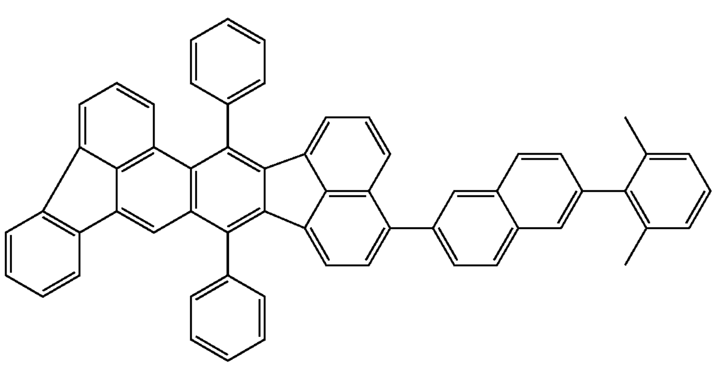

-continued
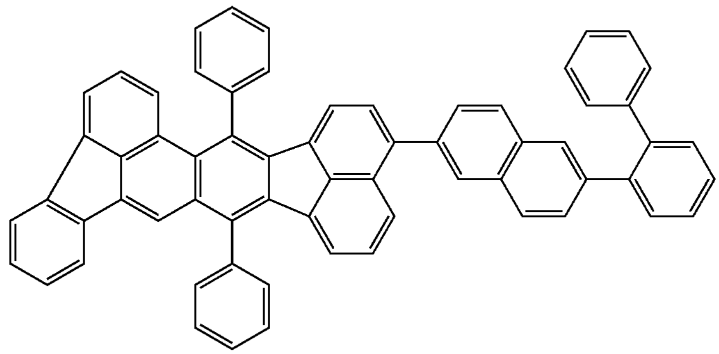
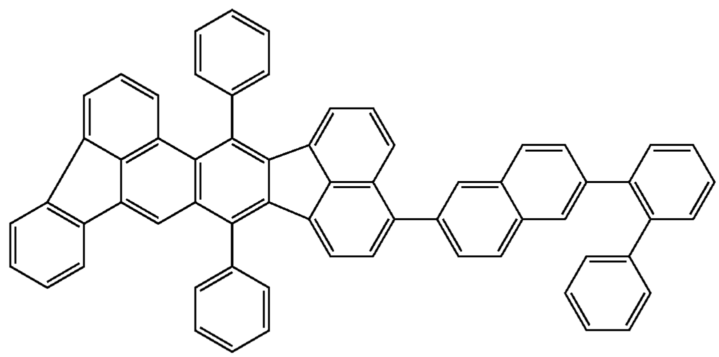
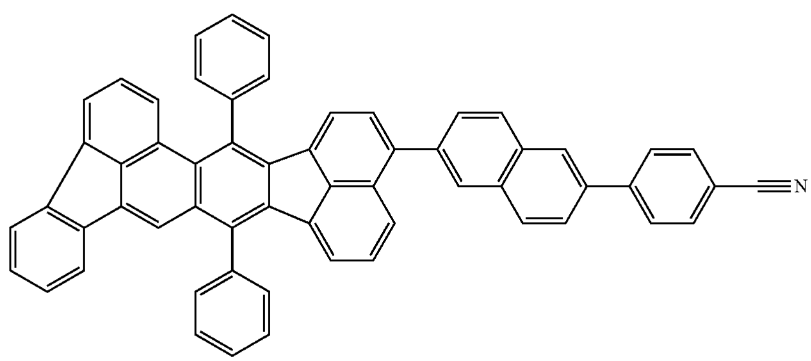
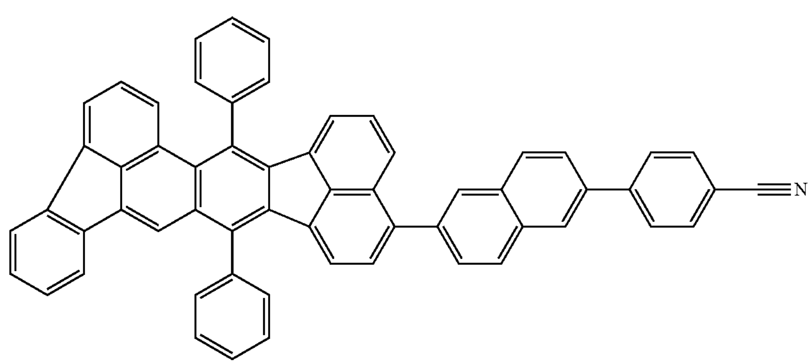

-continued
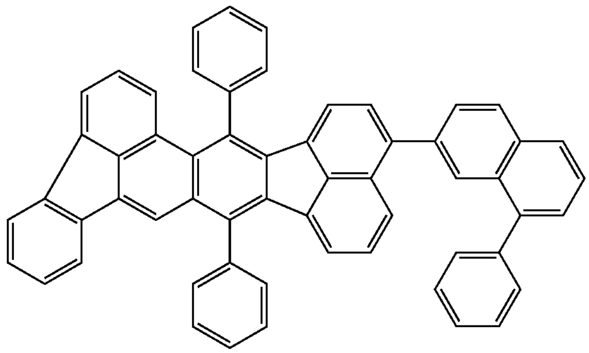
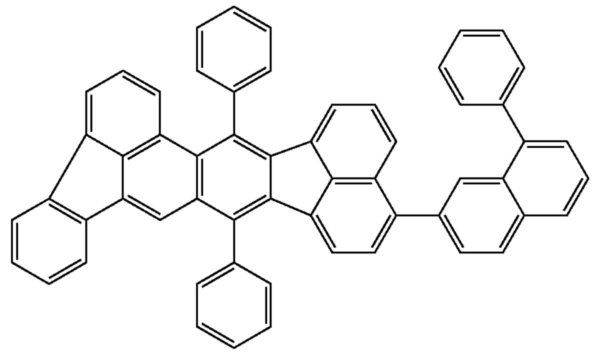
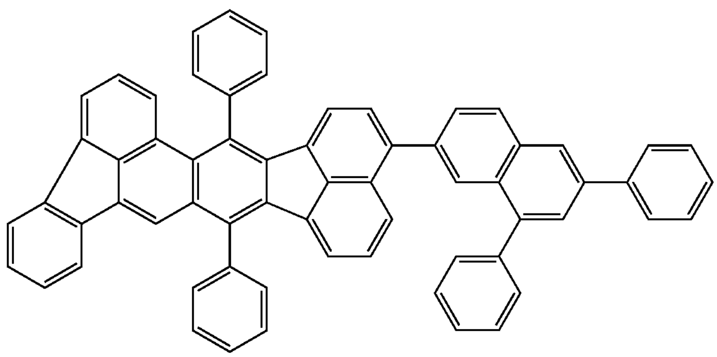
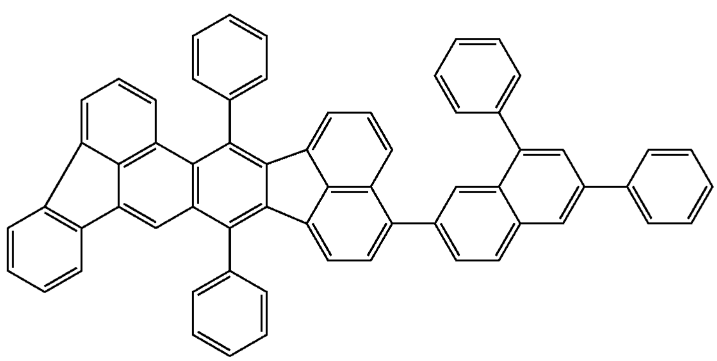
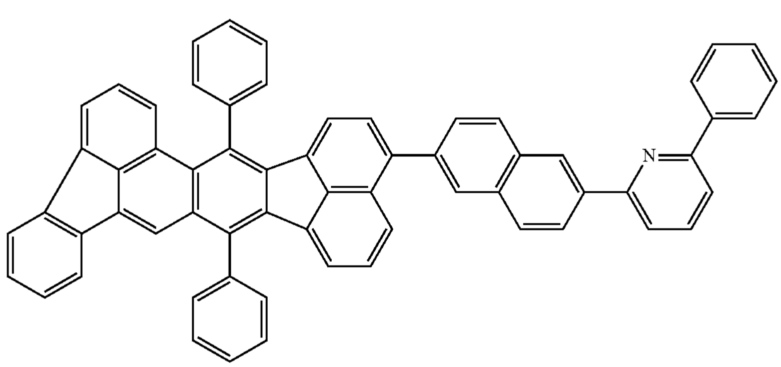

-continued
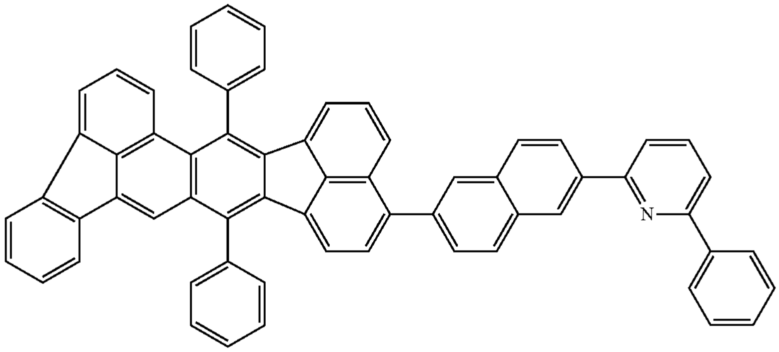
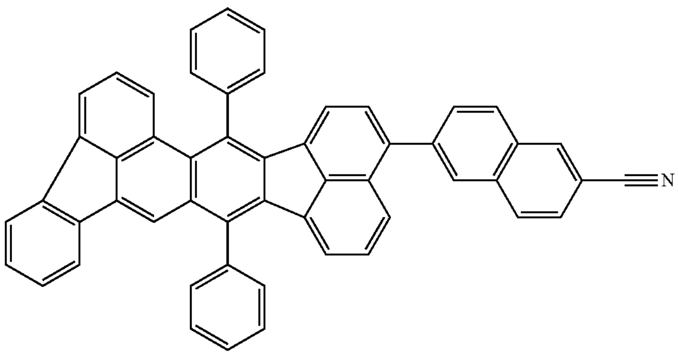
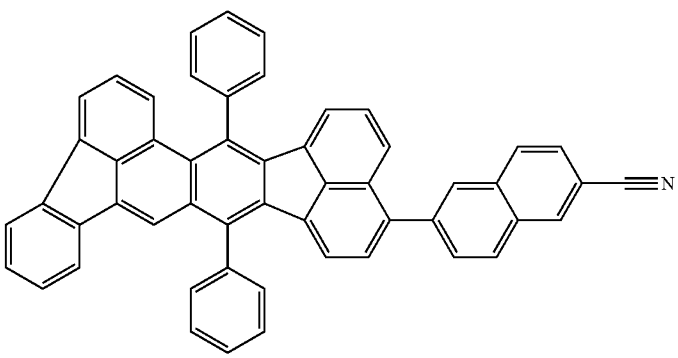
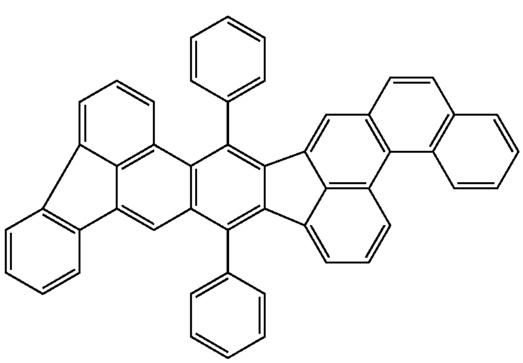
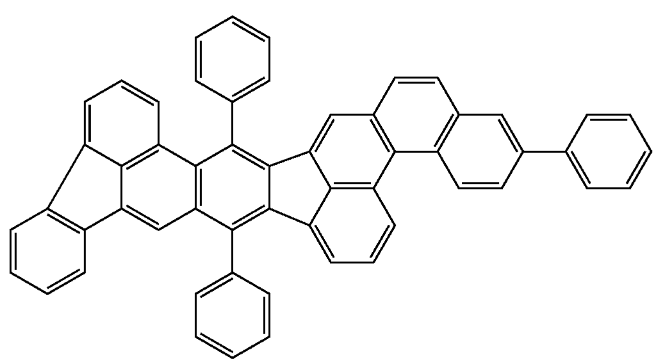

-continued
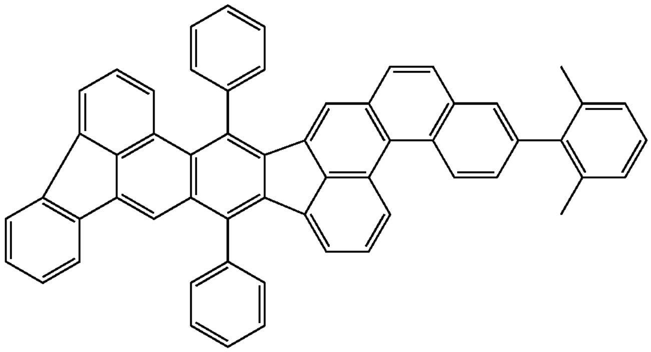
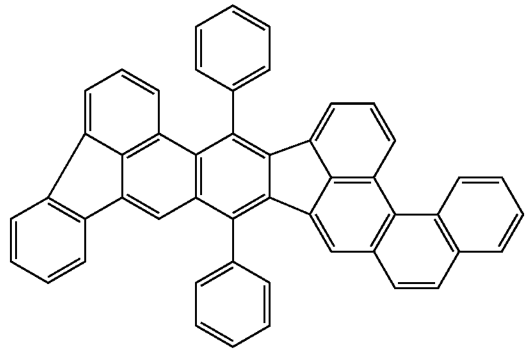
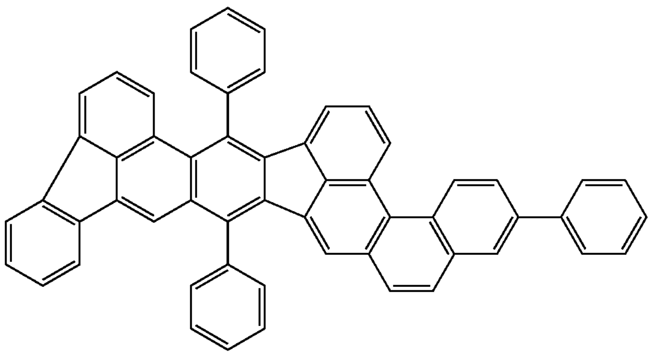
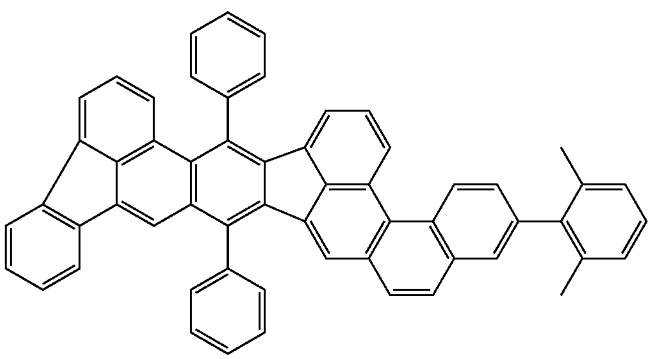
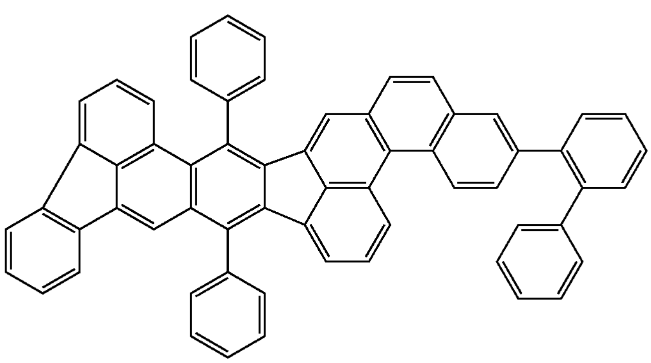

-continued
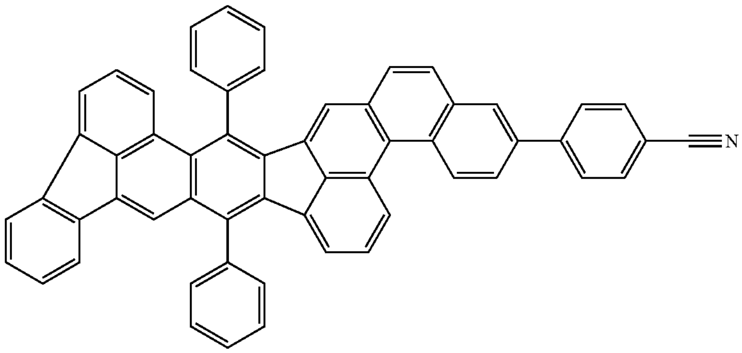
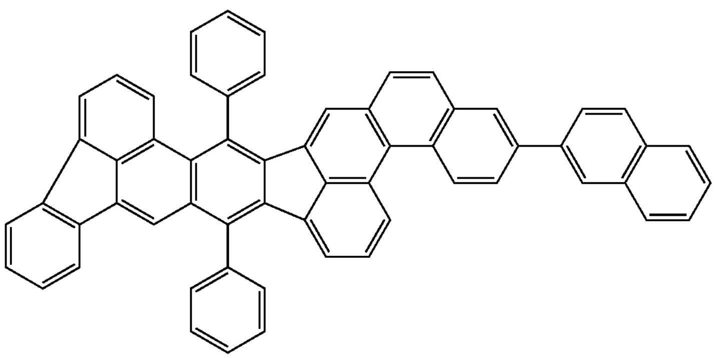
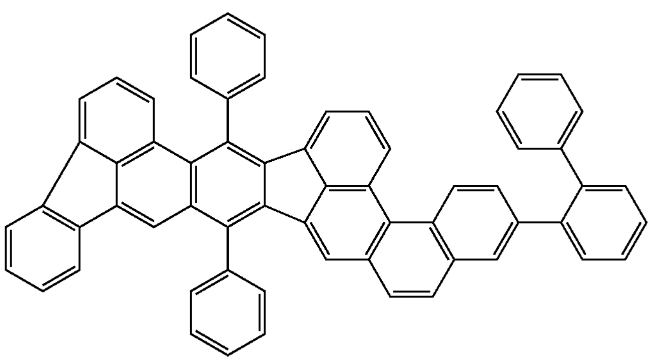
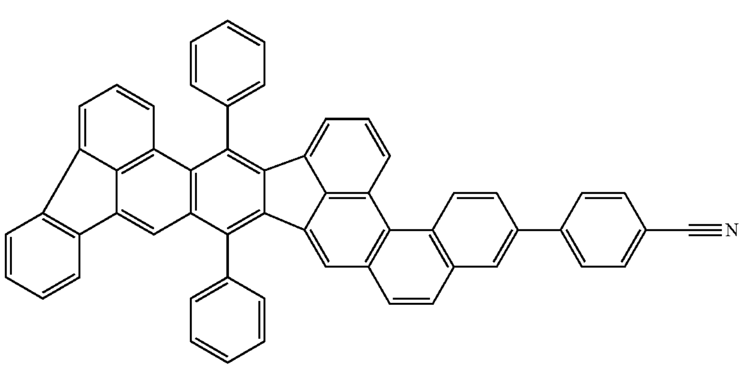

-continued
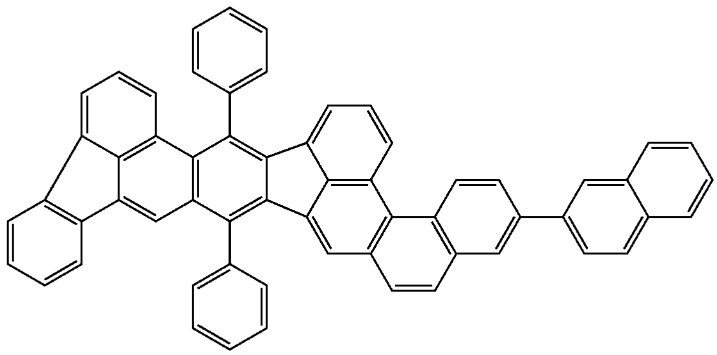
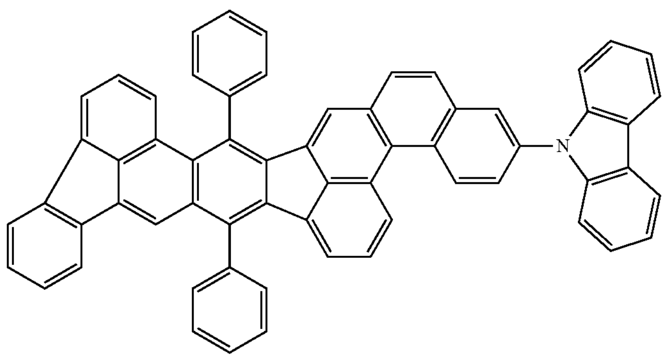
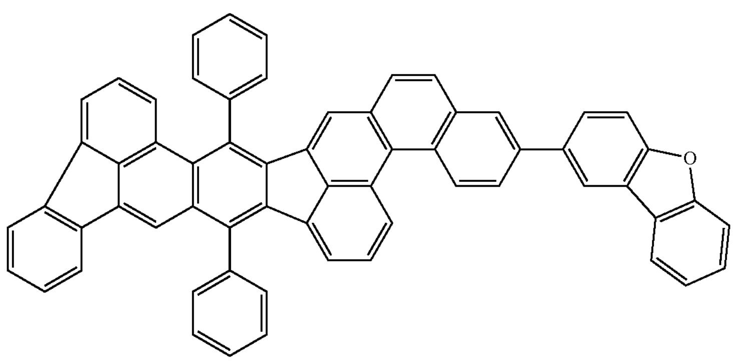
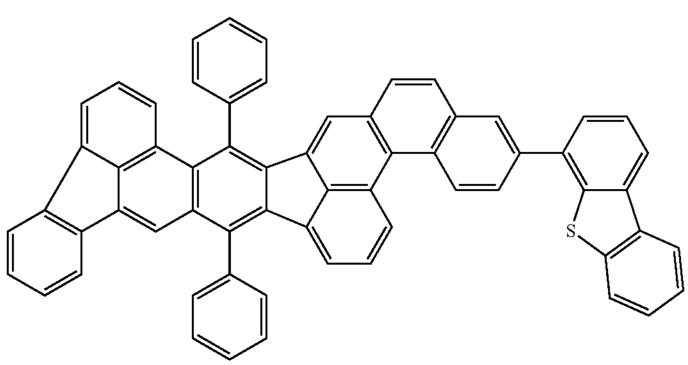

-continued
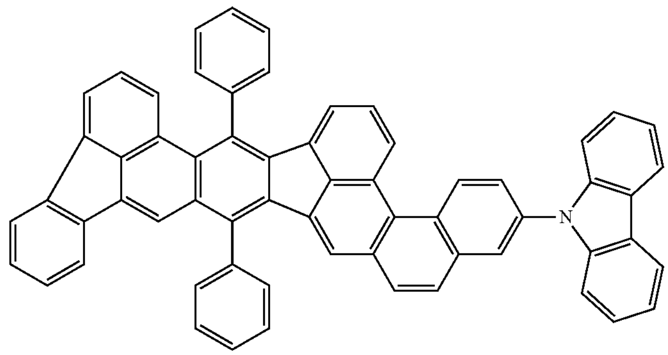
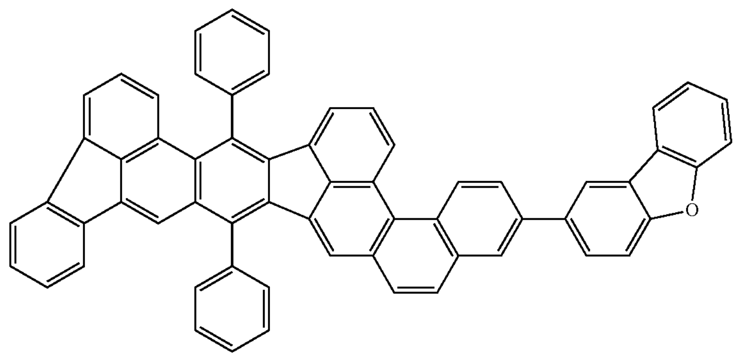
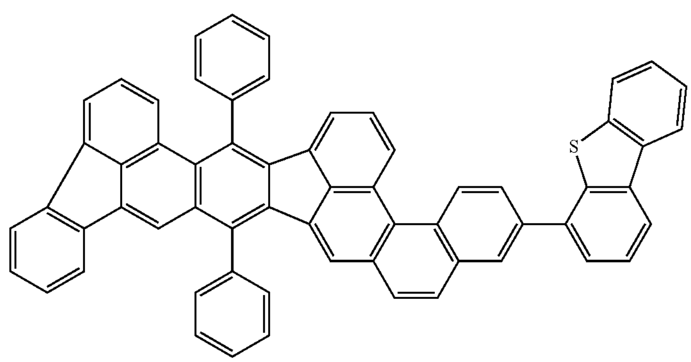
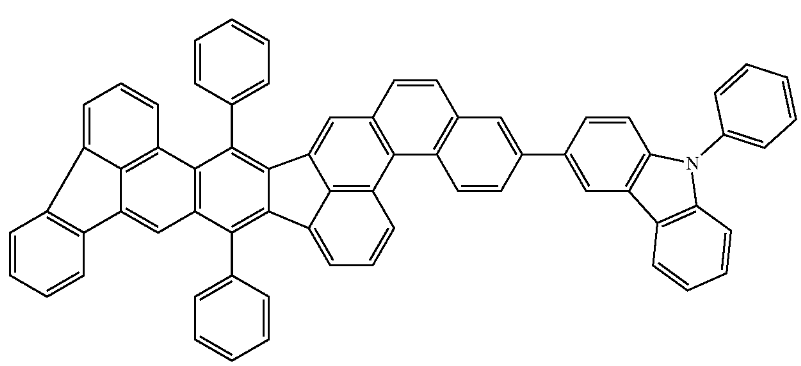

-continued
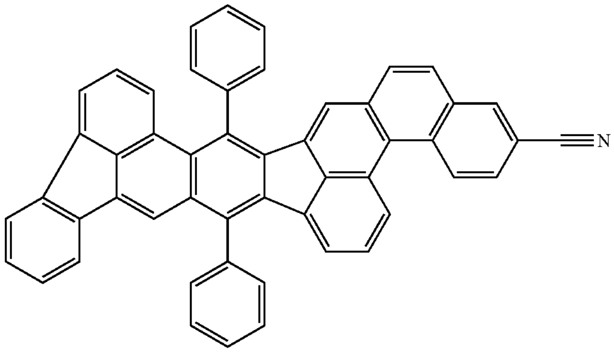
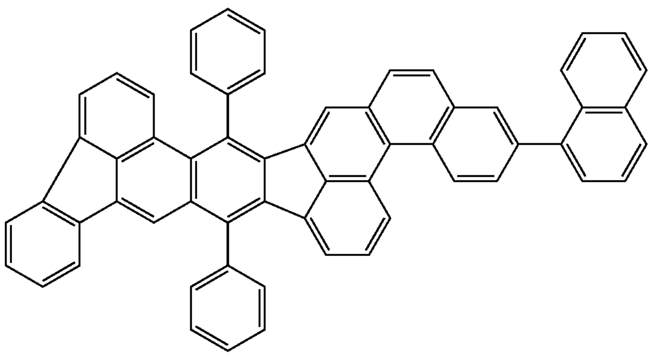
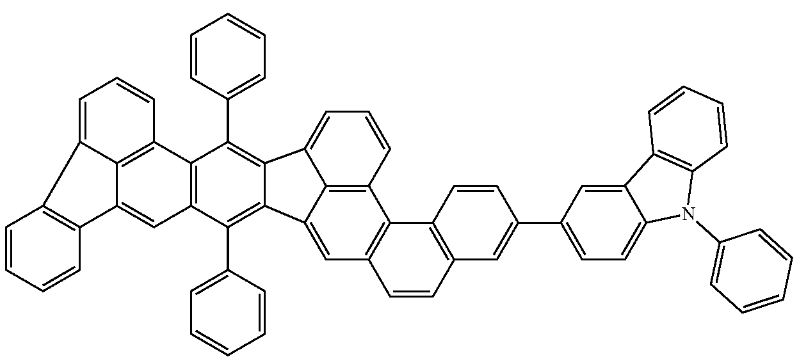
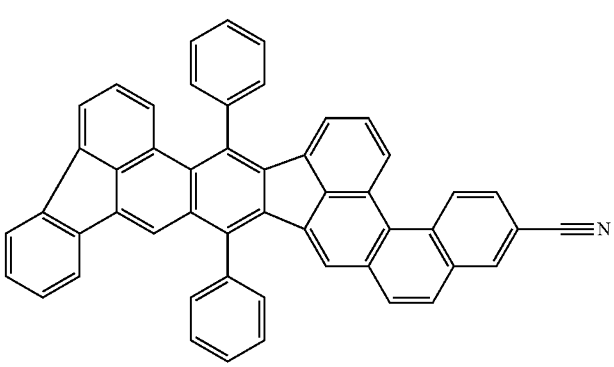

-continued
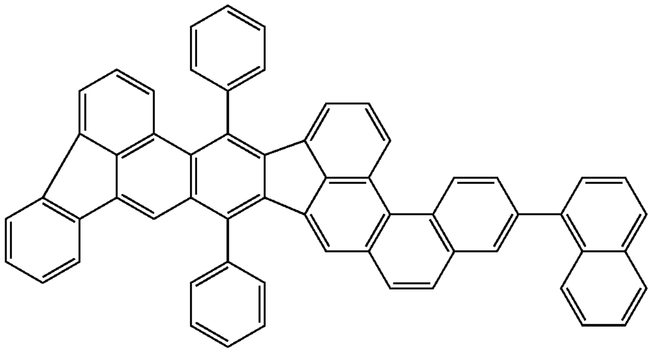
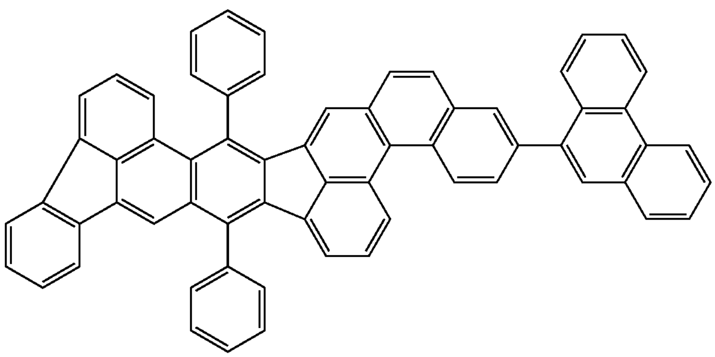
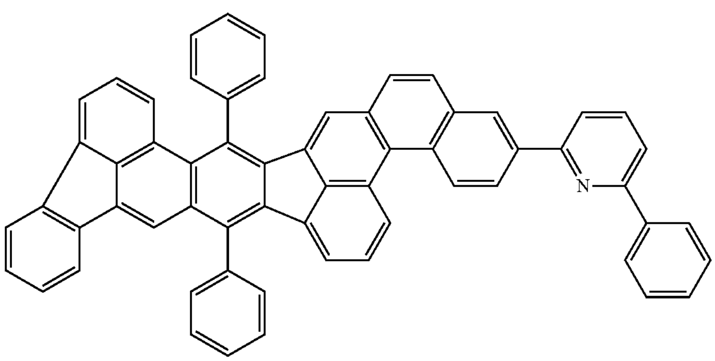
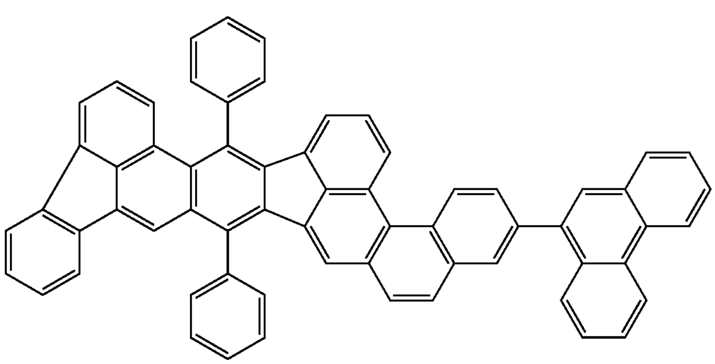

-continued
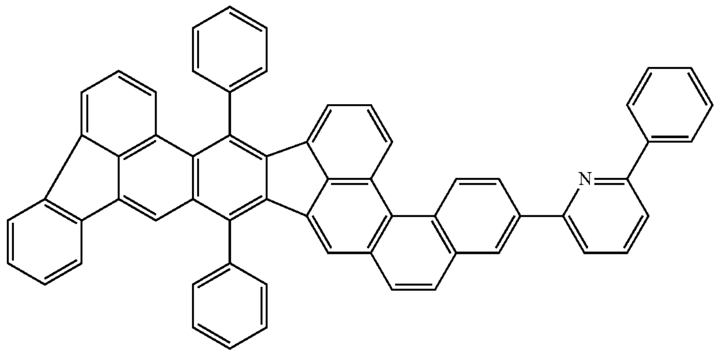
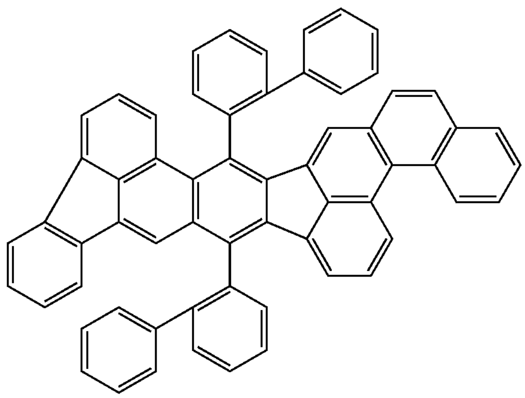
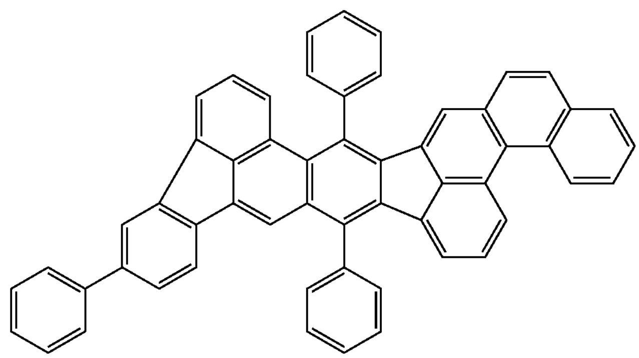
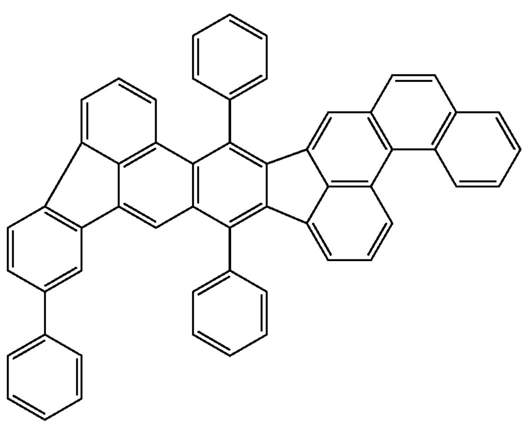
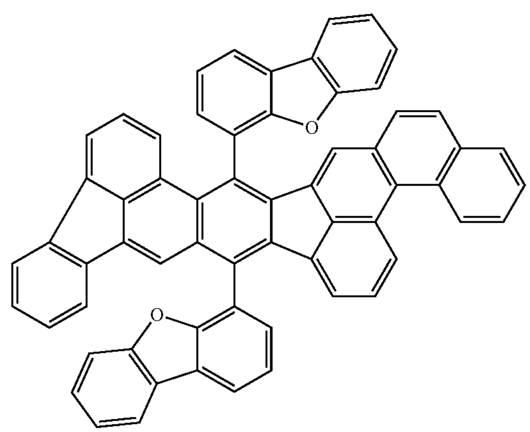
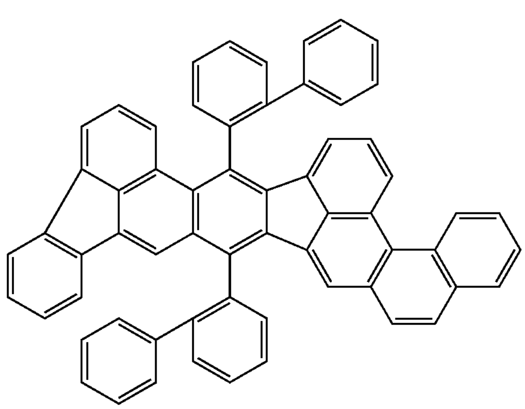
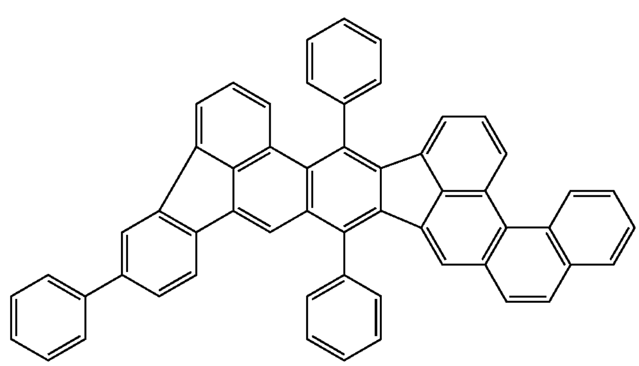

-continued
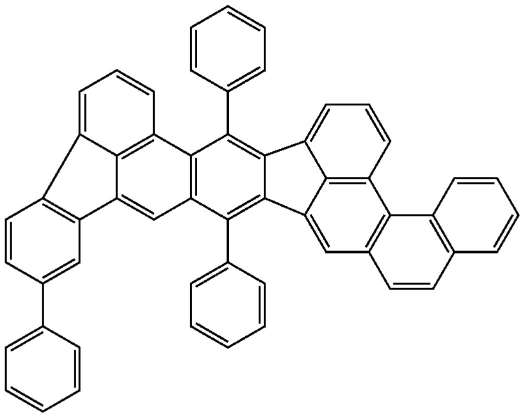
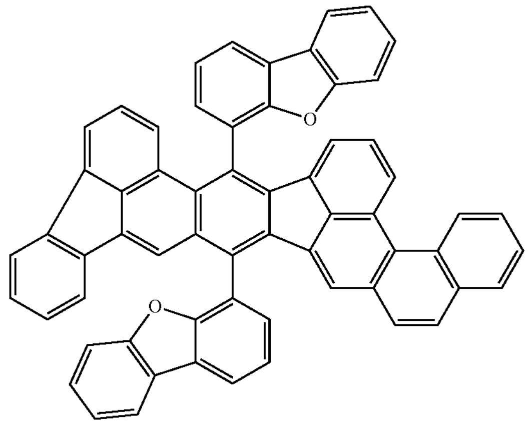
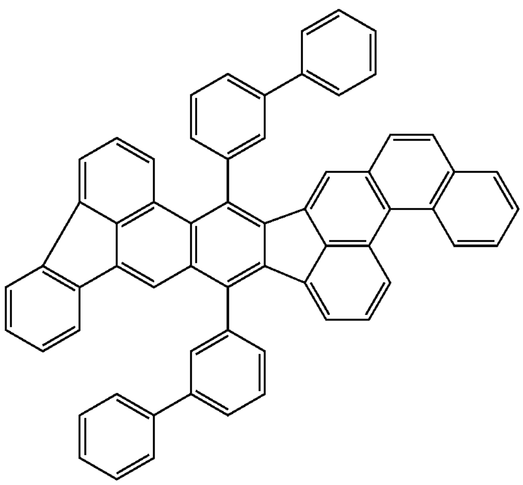
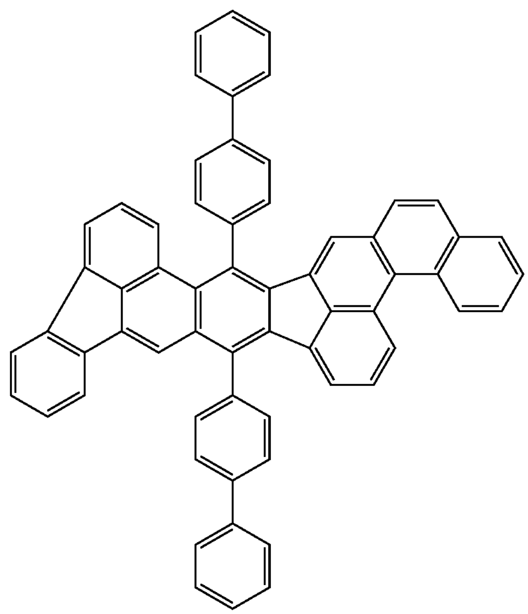
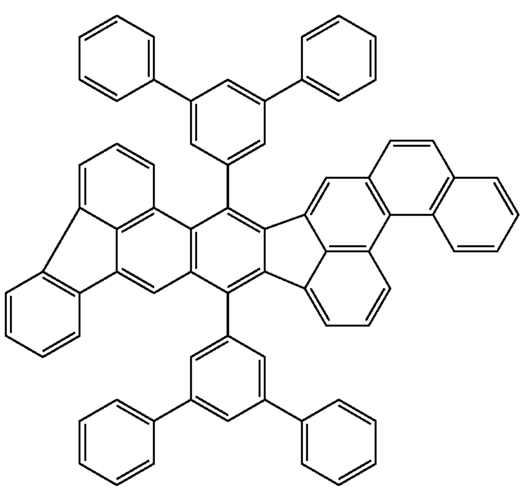
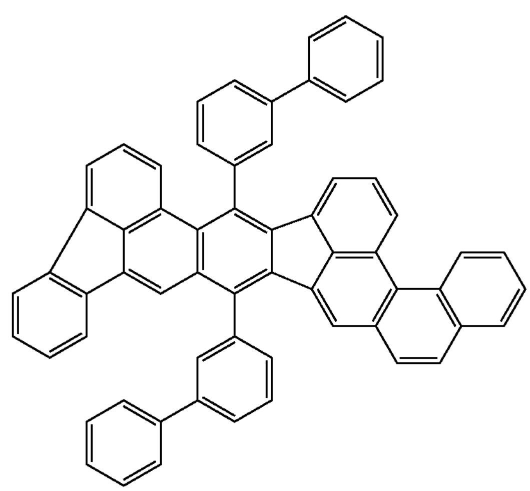

-continued
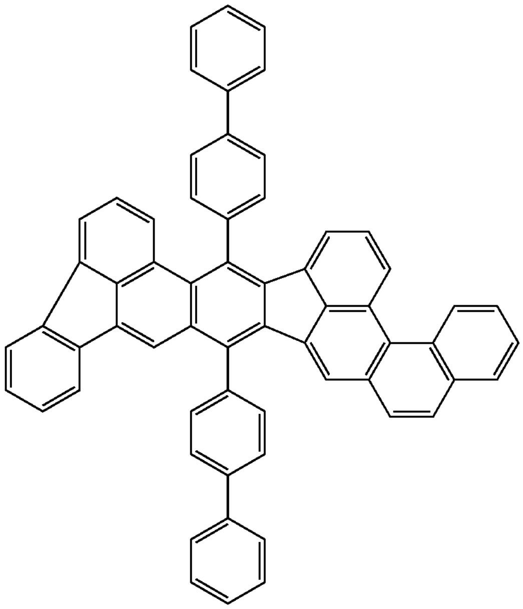
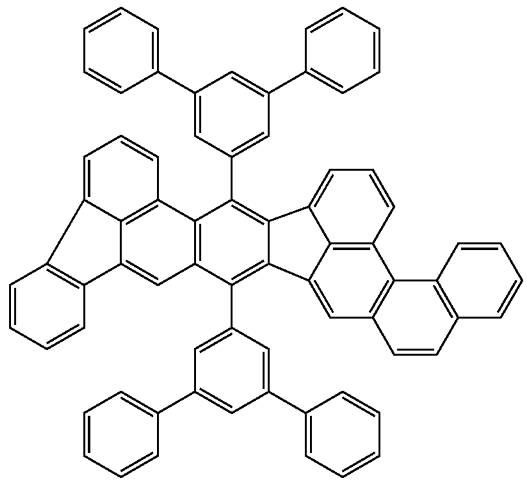
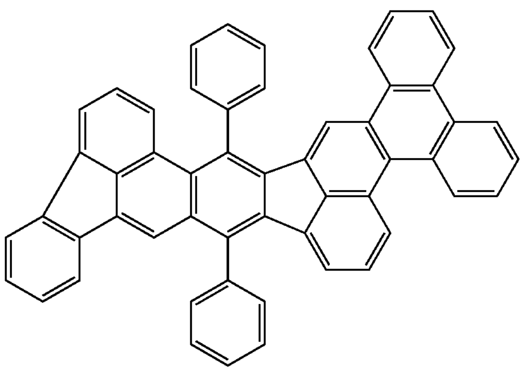
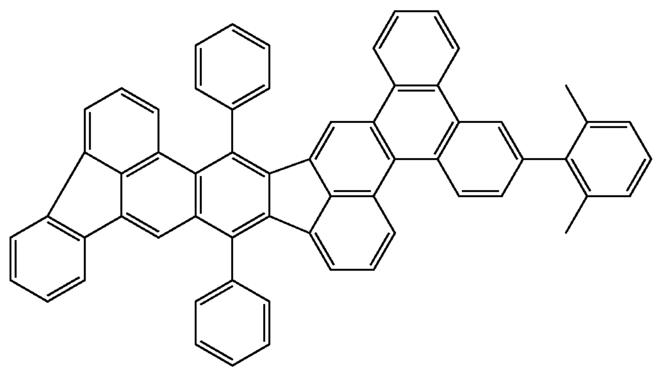
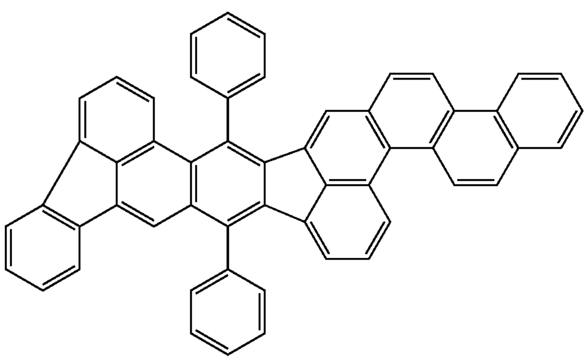
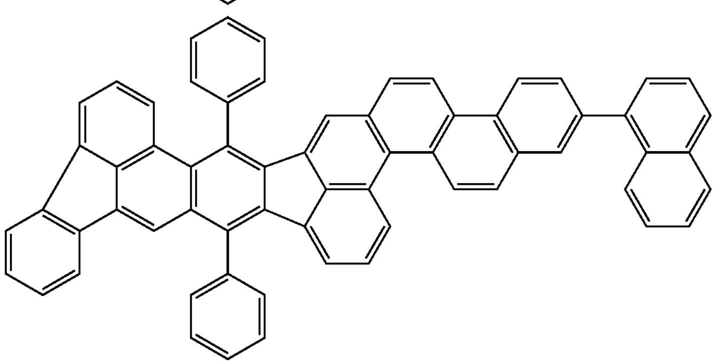

-continued
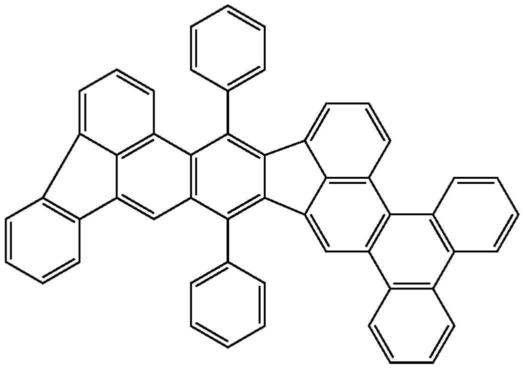
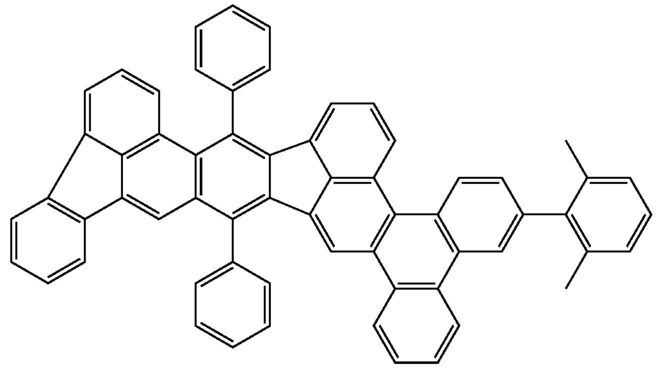
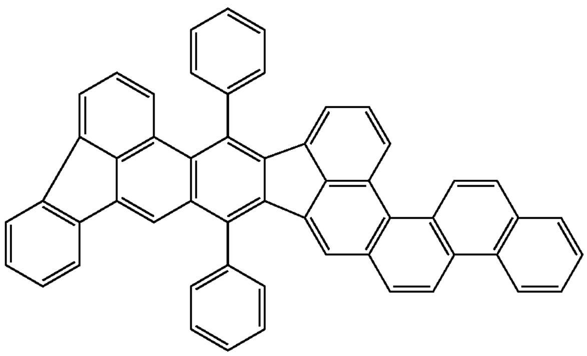
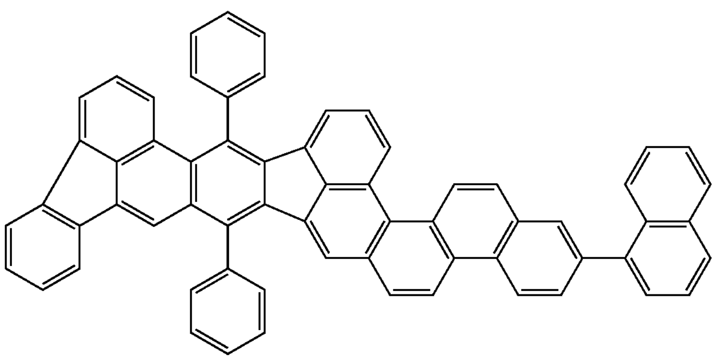
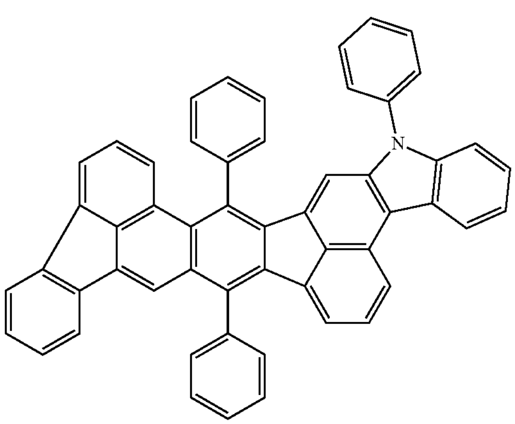
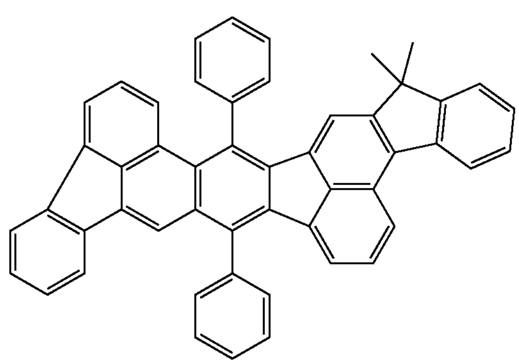

-continued
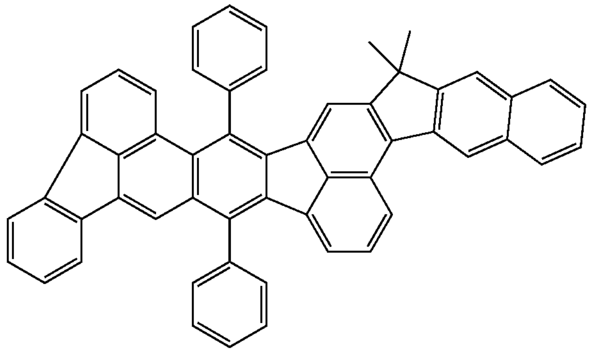
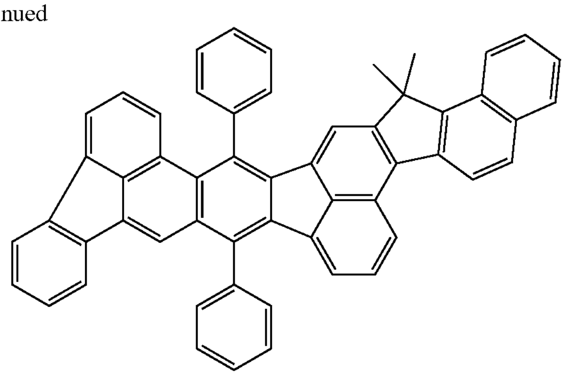
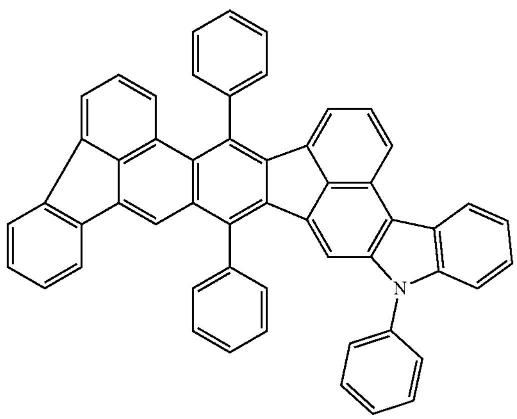
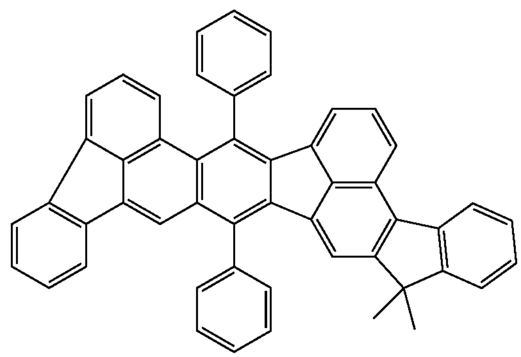
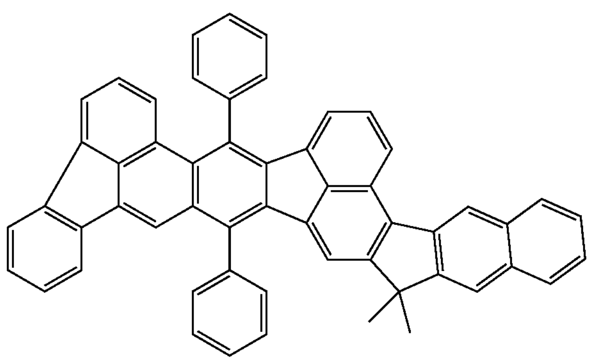
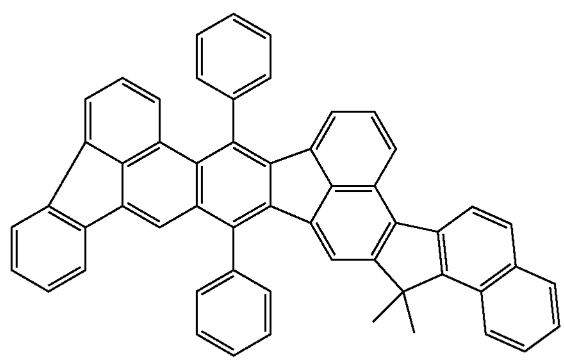
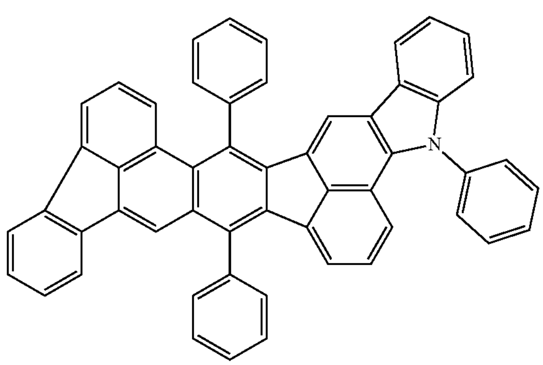
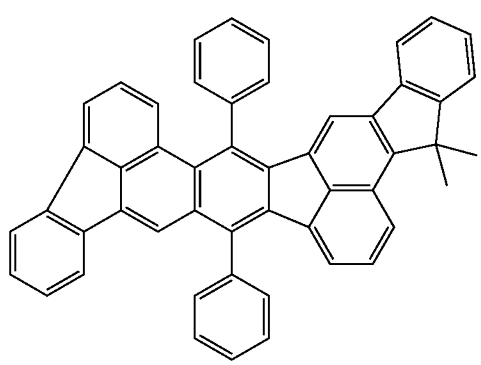

-continued
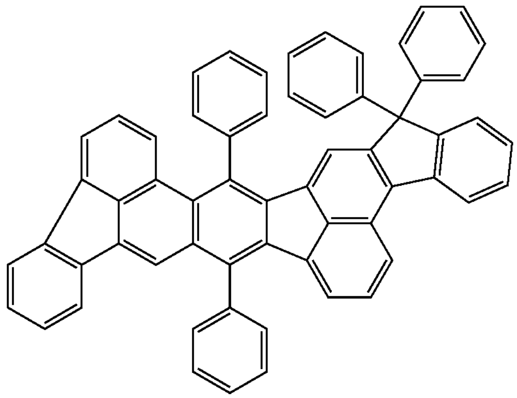
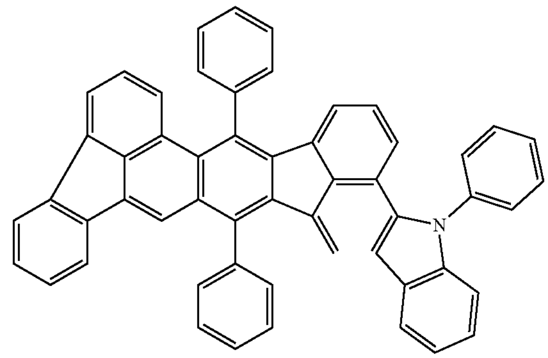
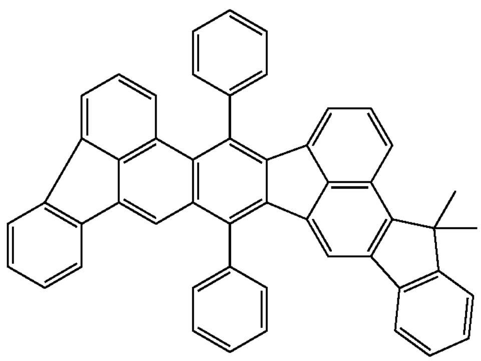
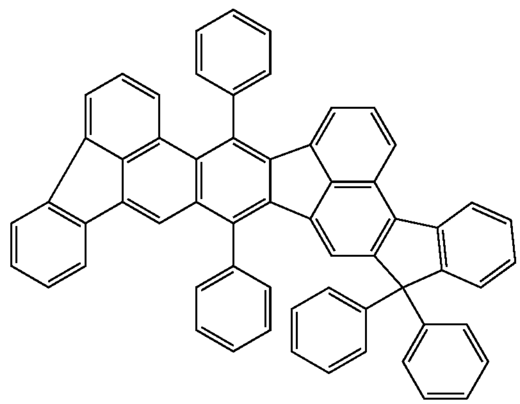
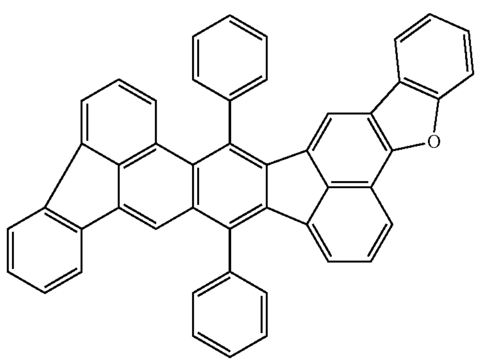
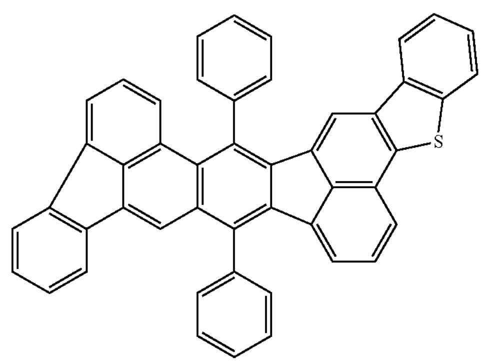
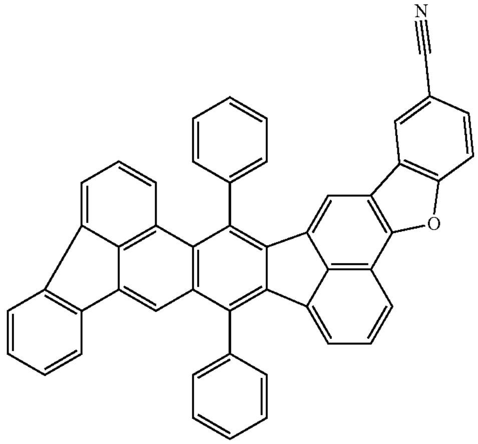
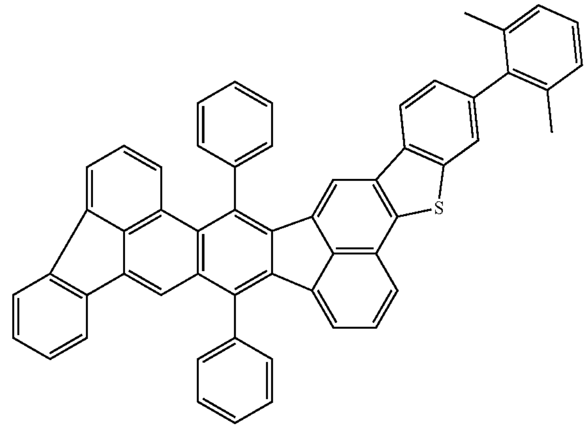

-continued
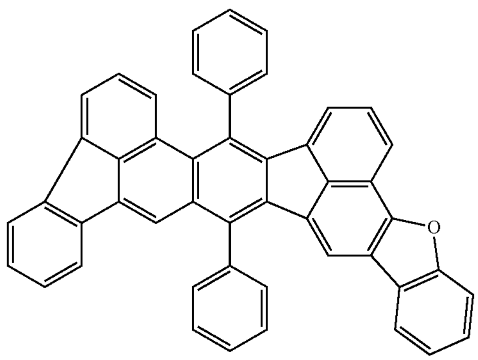
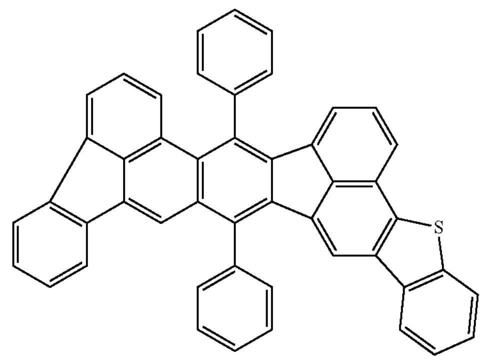
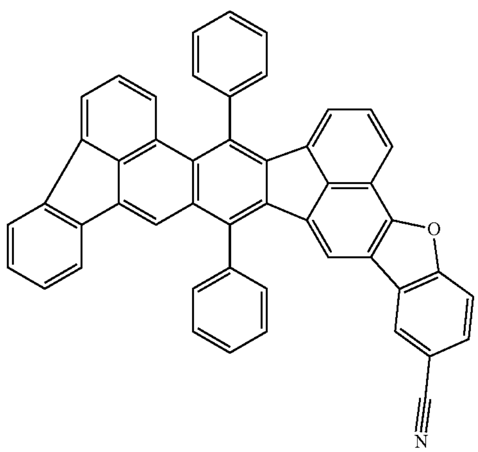
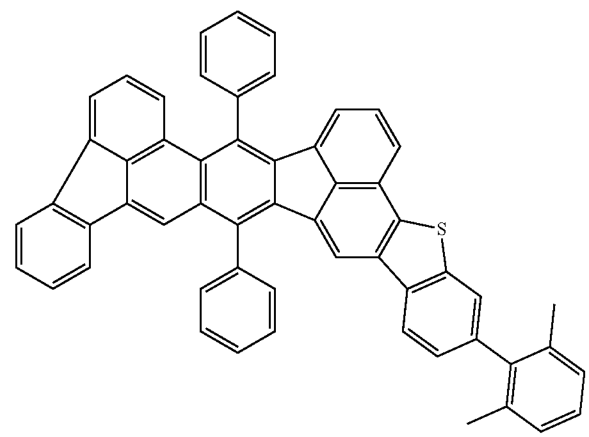
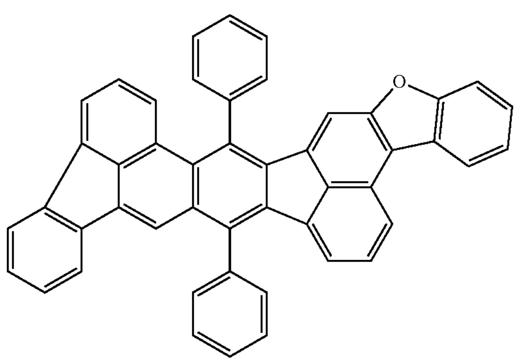
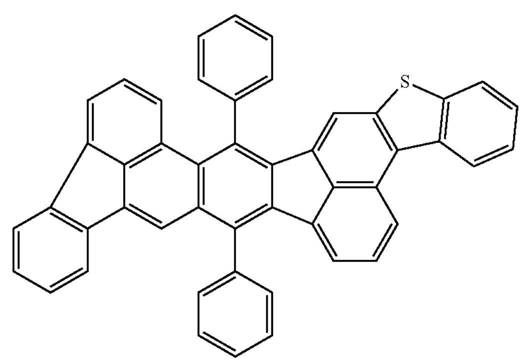
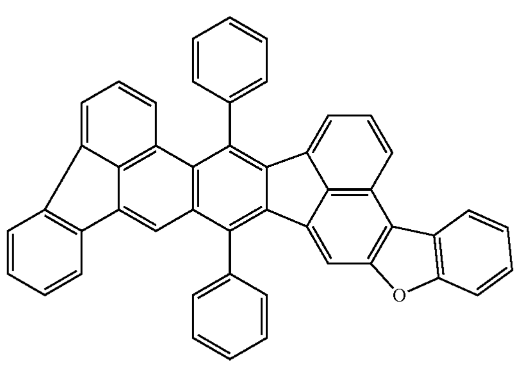
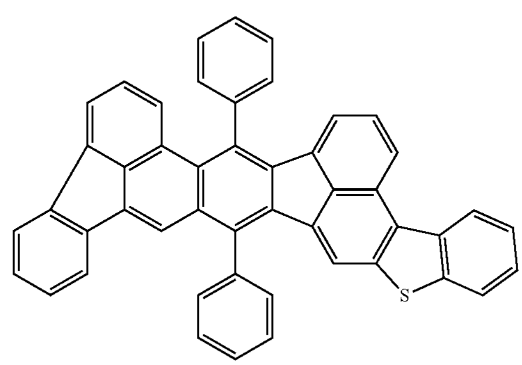

-continued
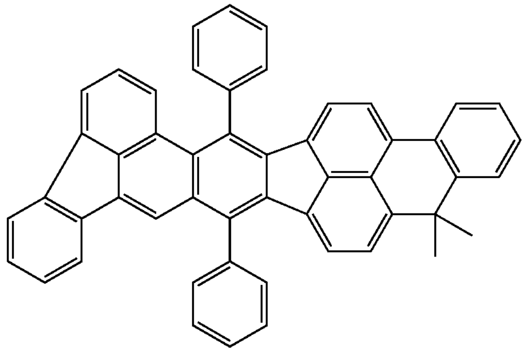
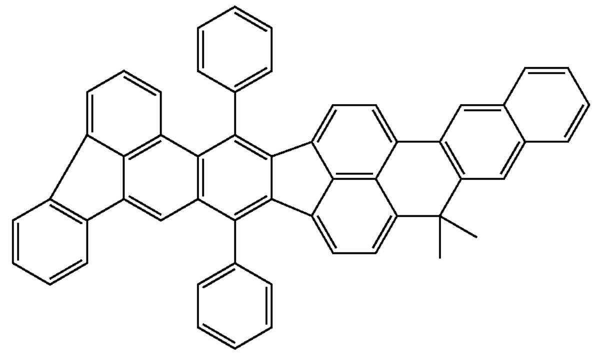
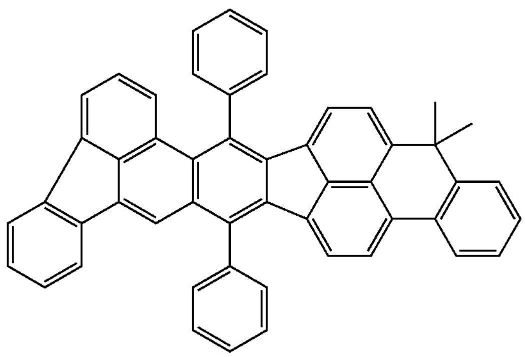
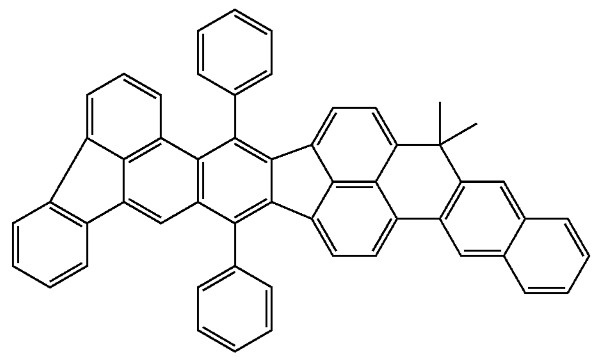
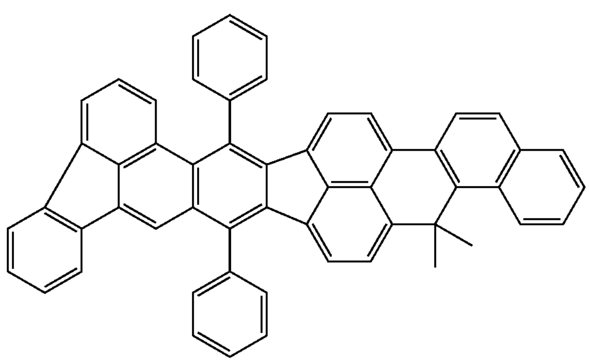
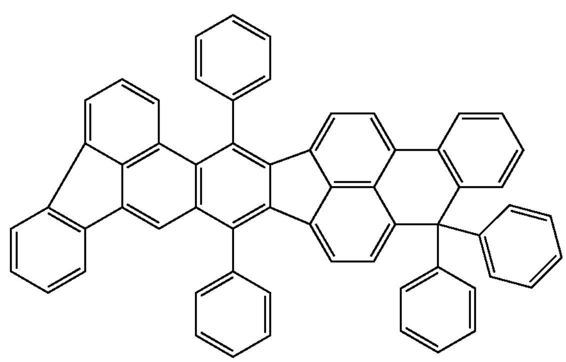
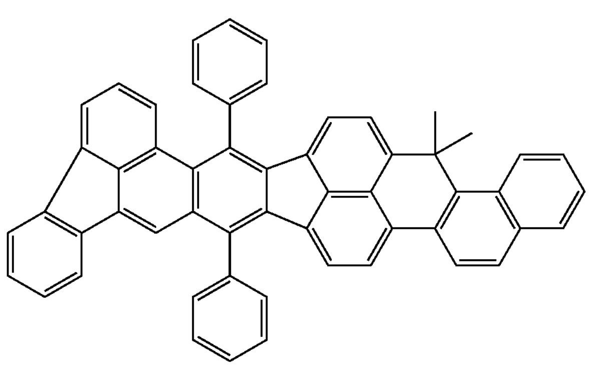
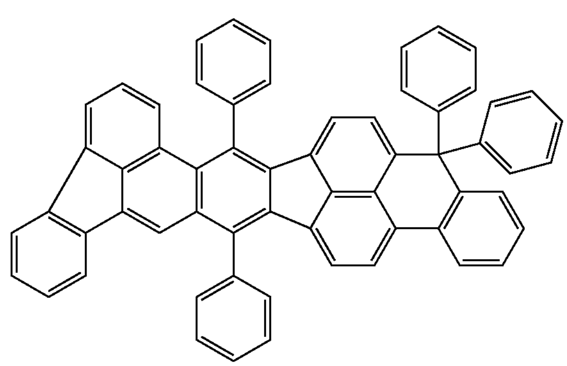

-continued
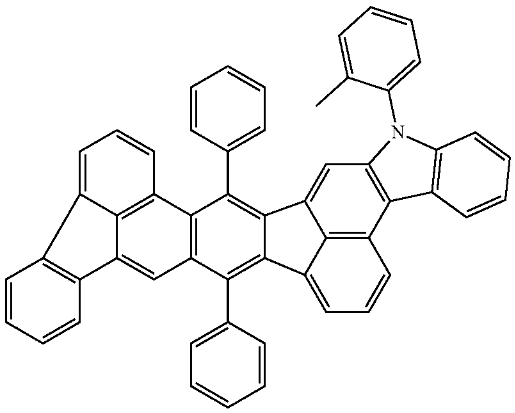
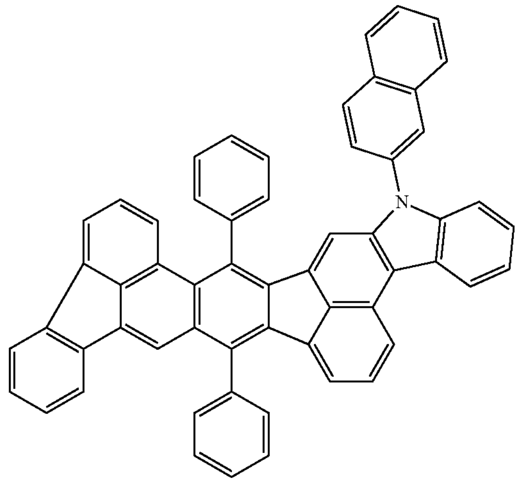
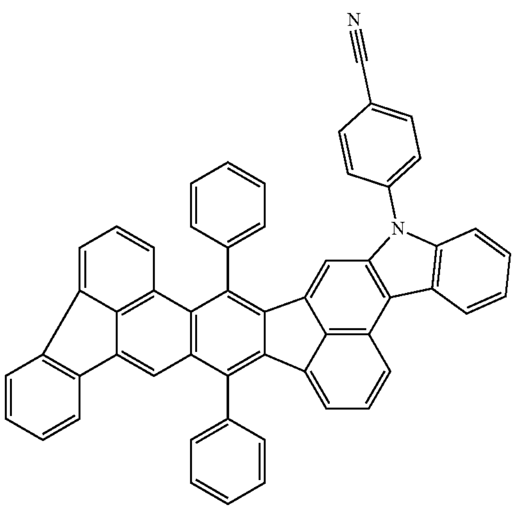
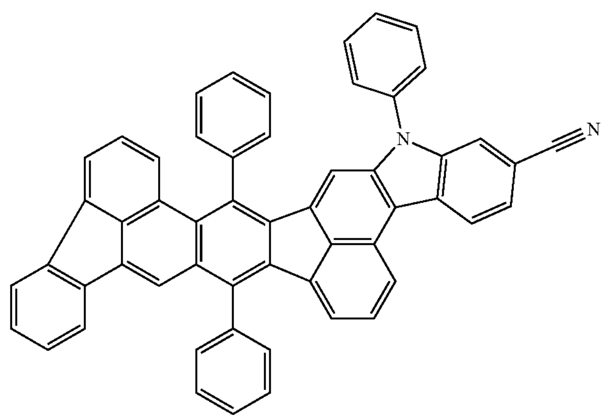
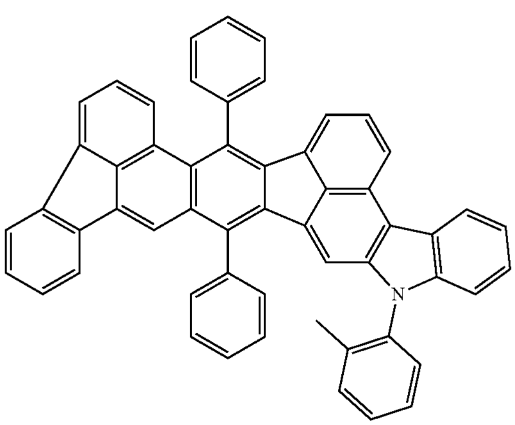
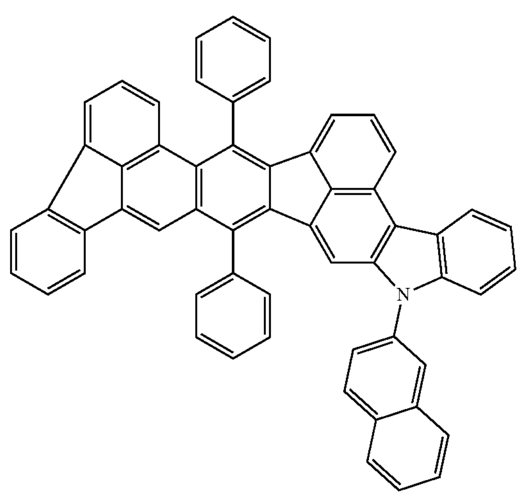

-continued
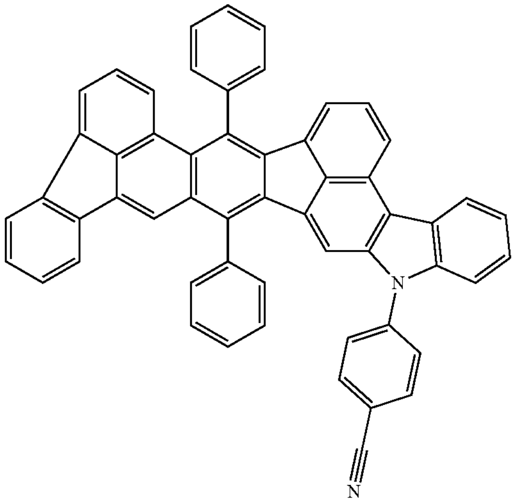
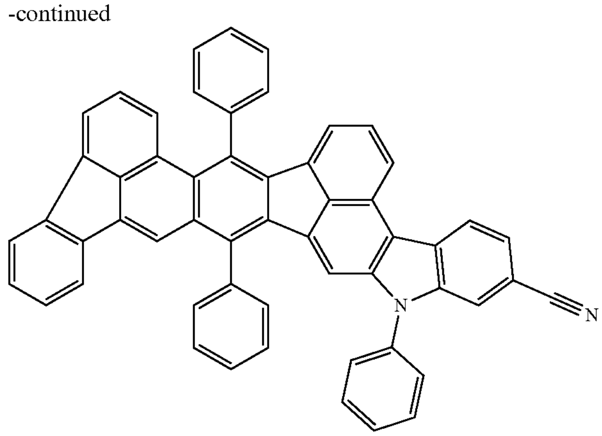
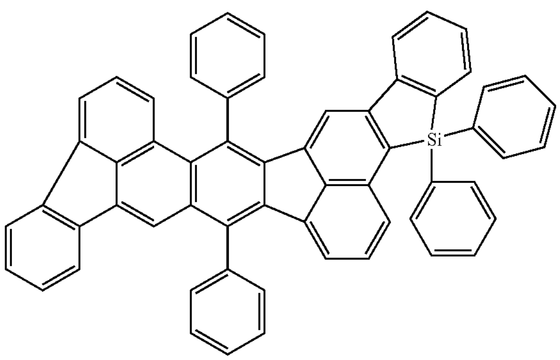
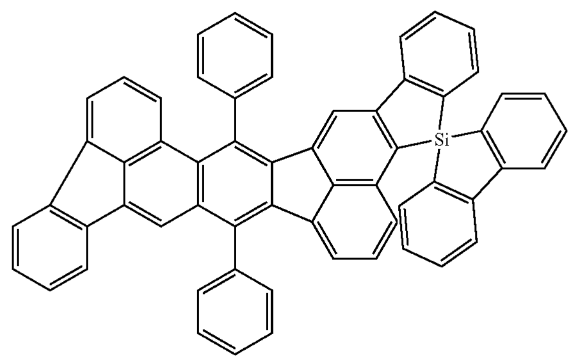
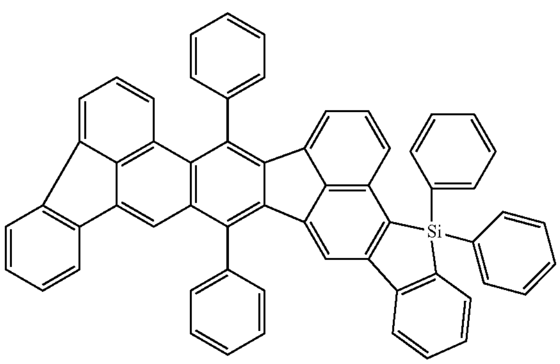
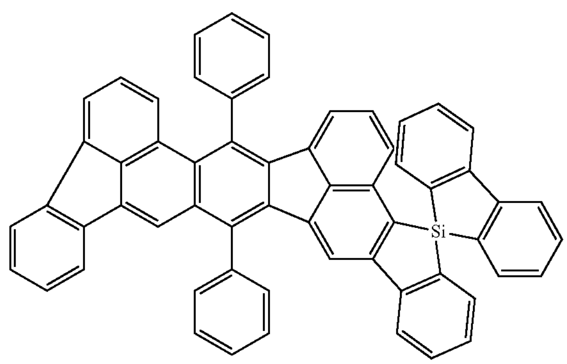
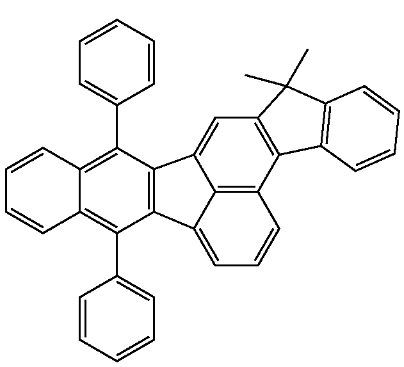
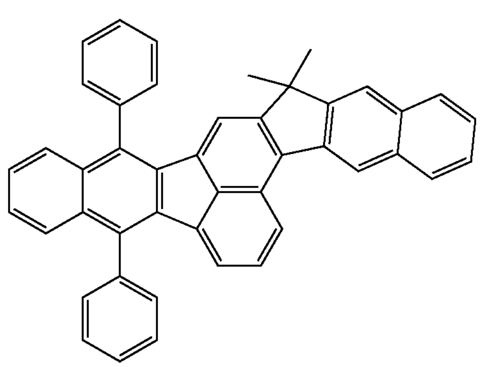

-continued
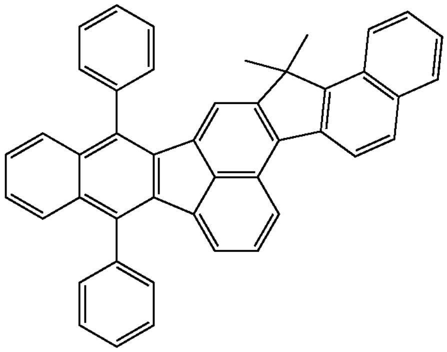
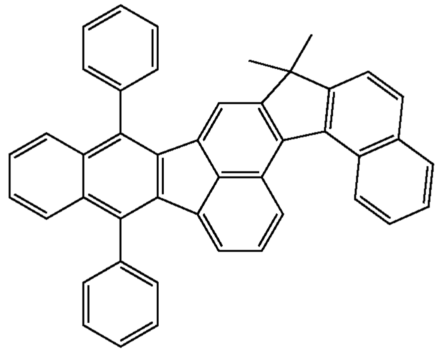
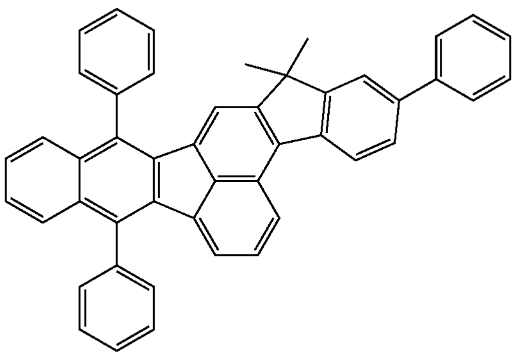
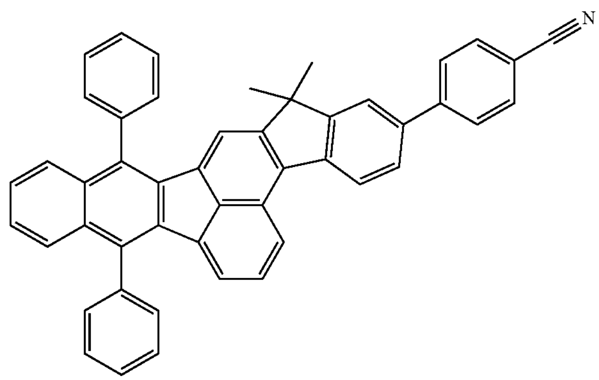
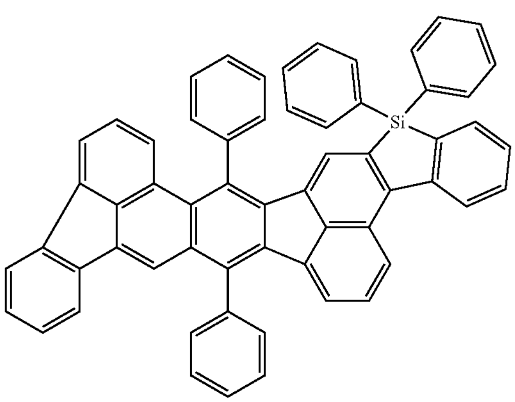
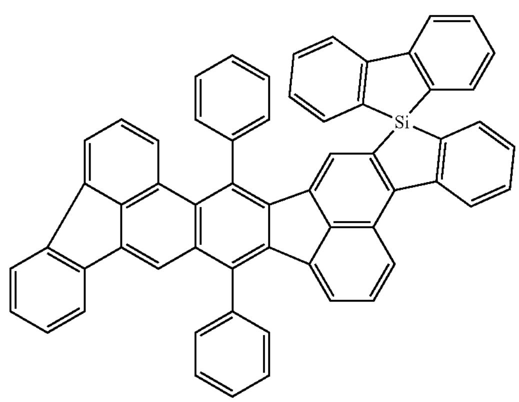
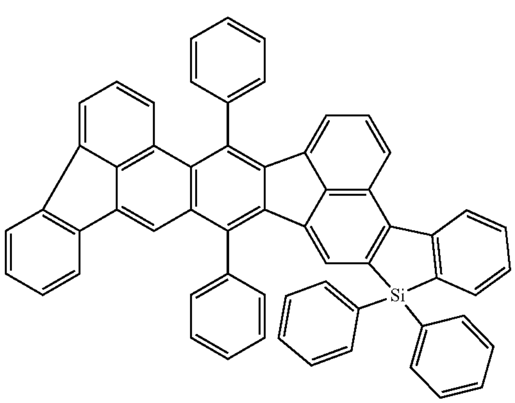
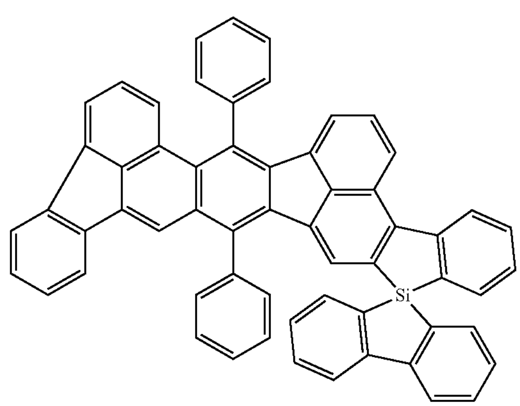

-continued
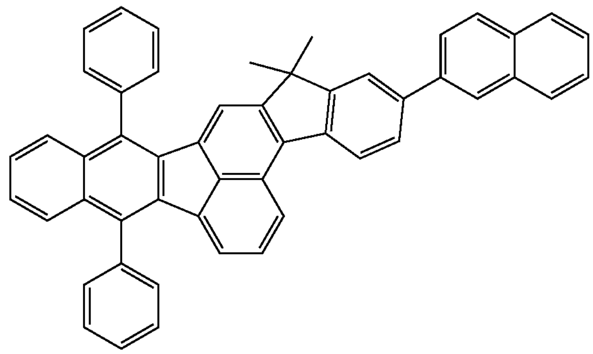
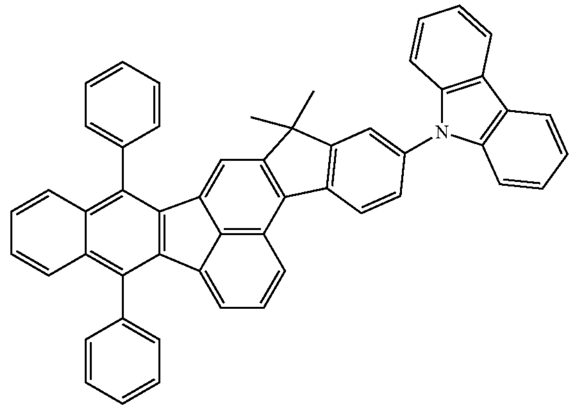
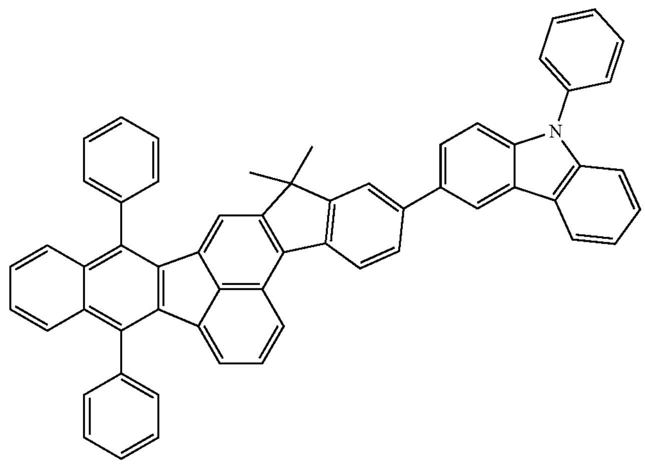
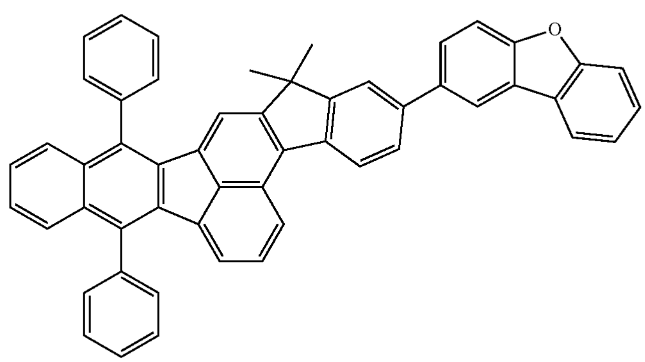
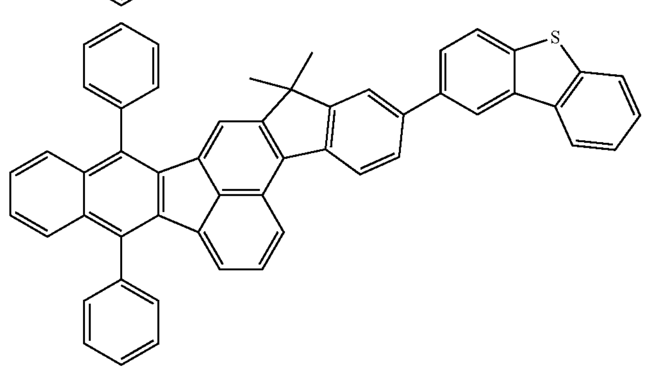

-continued
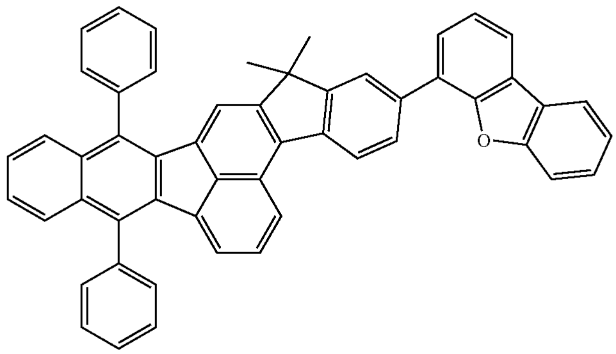
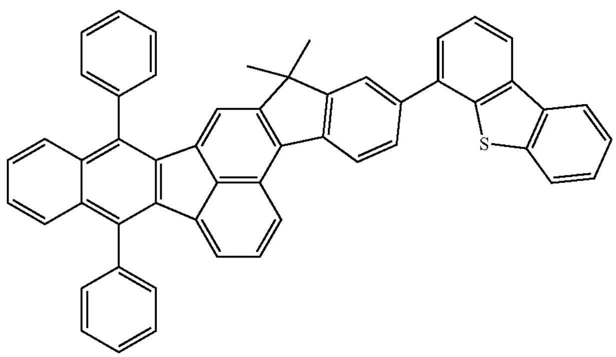
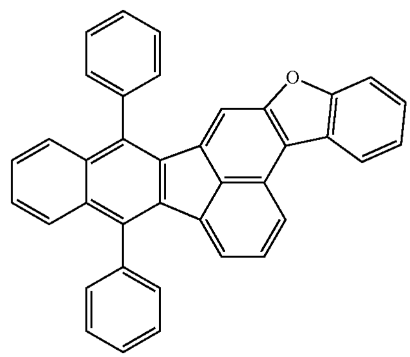
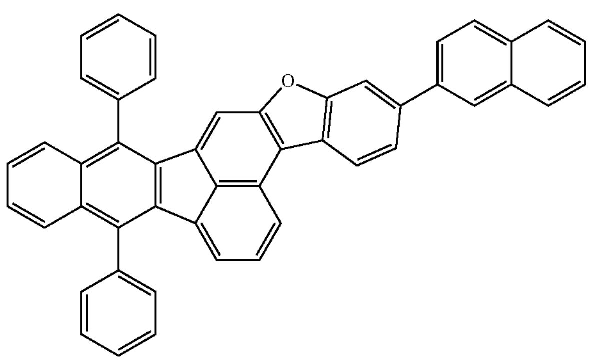
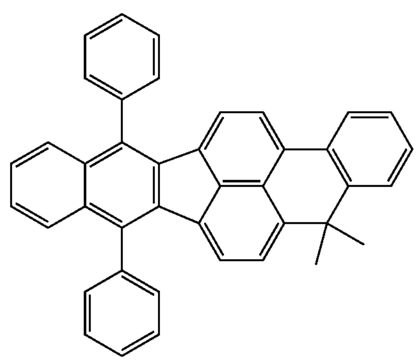
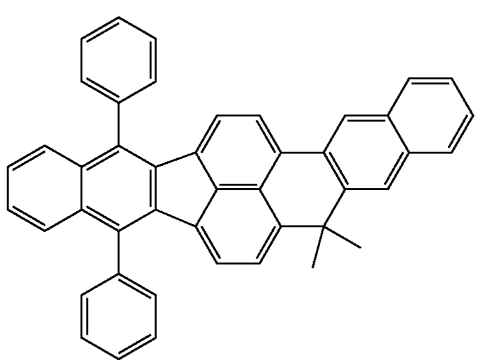
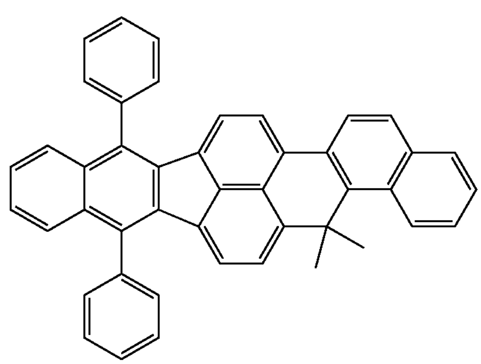

-continued
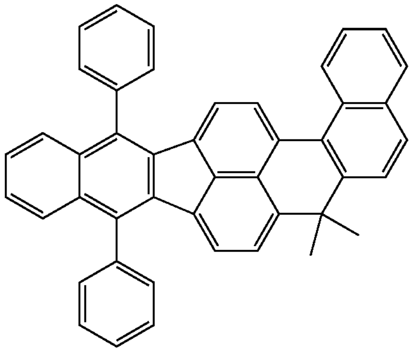
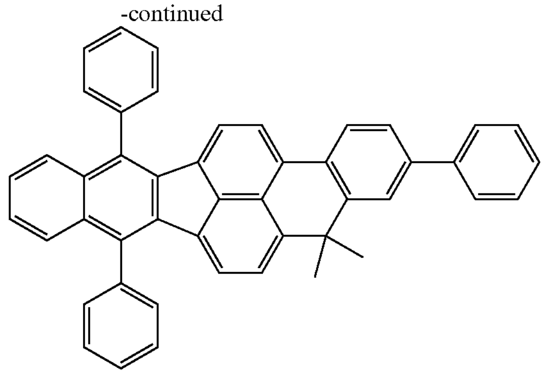
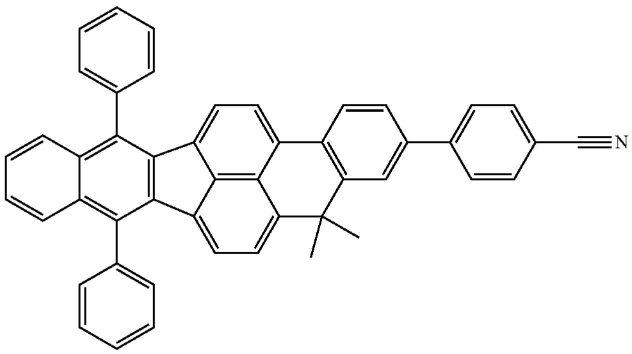
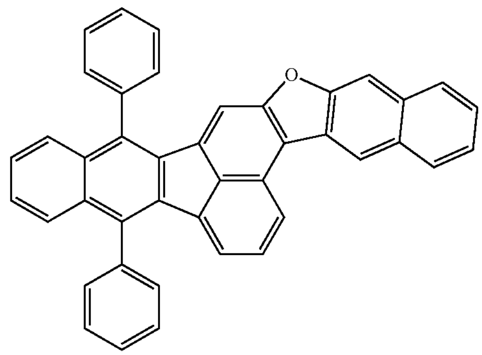
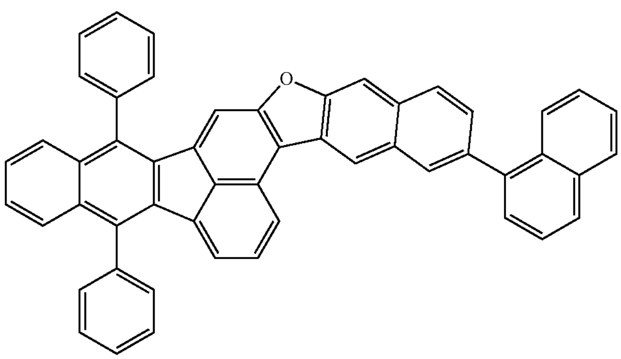
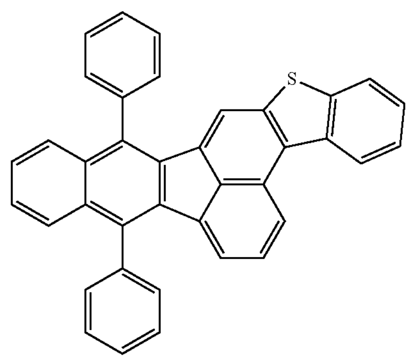
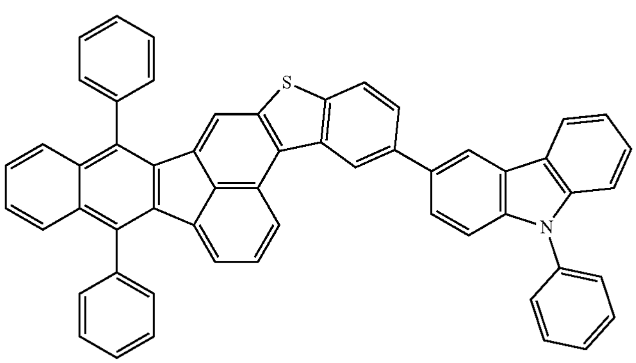
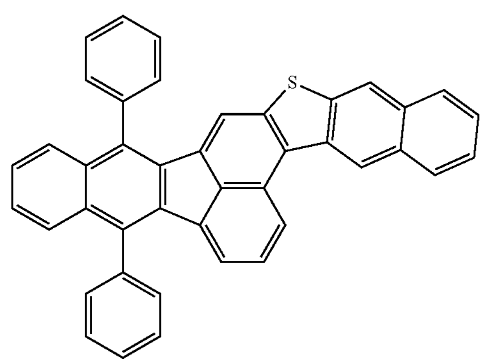

-continued
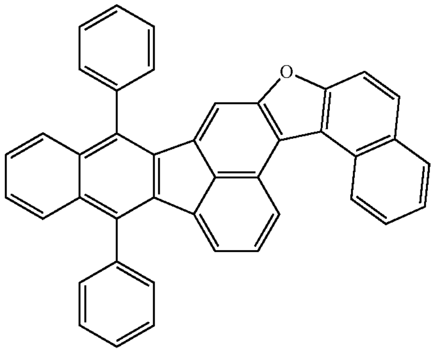
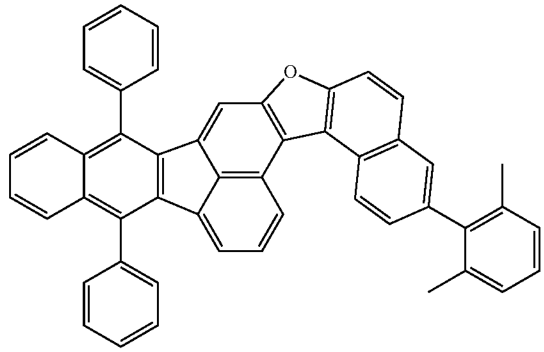
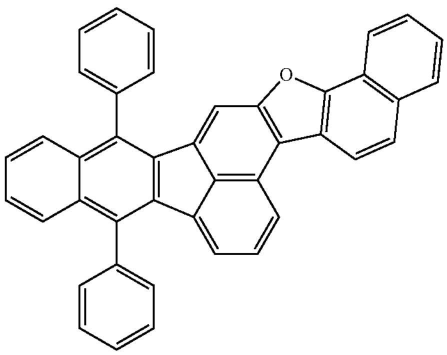
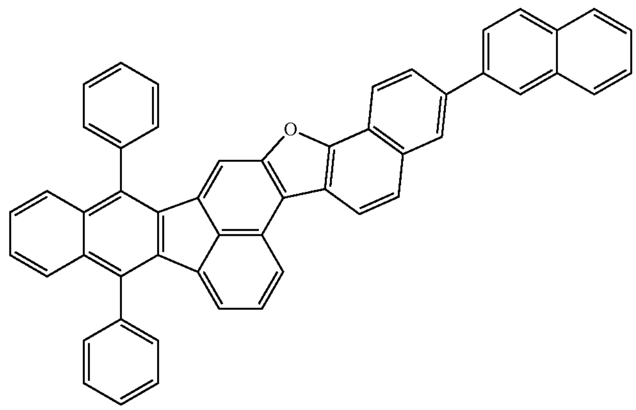
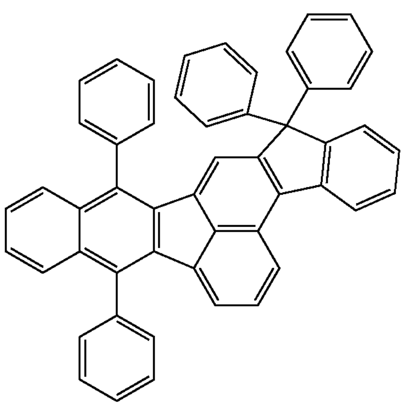
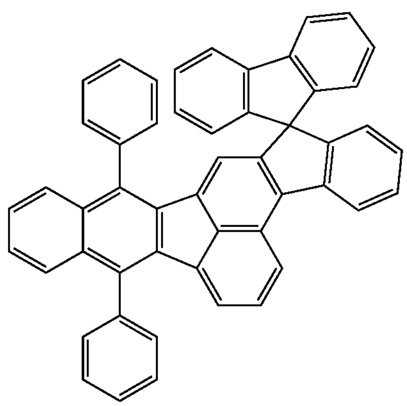
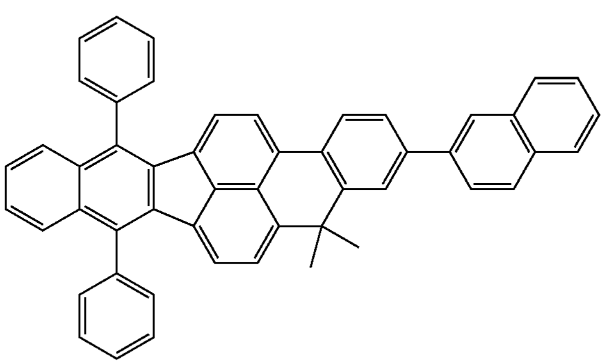
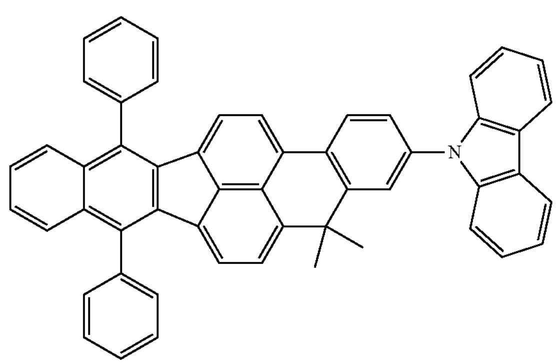

-continued
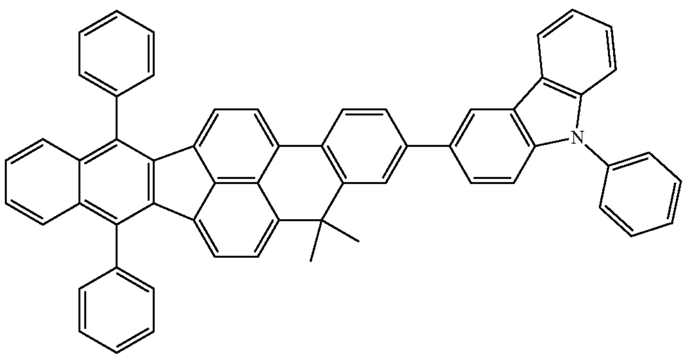
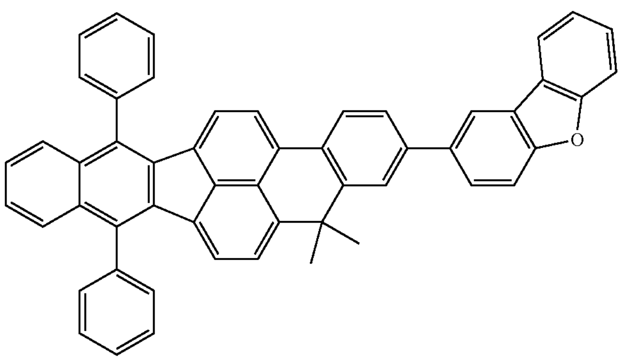
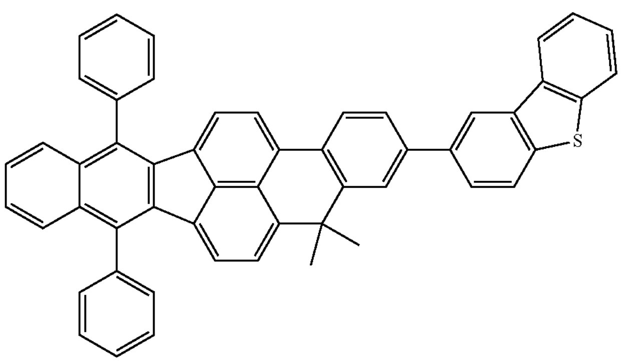
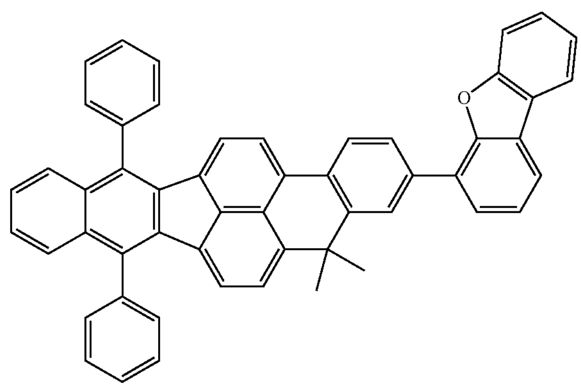
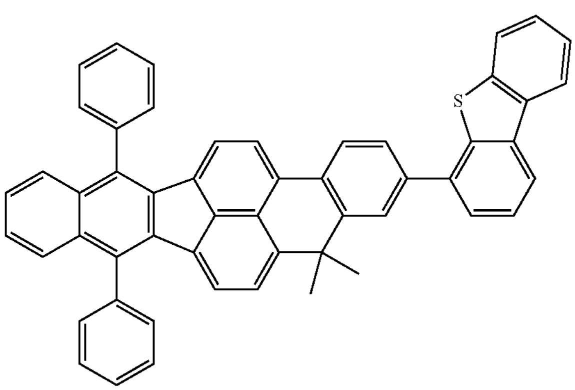
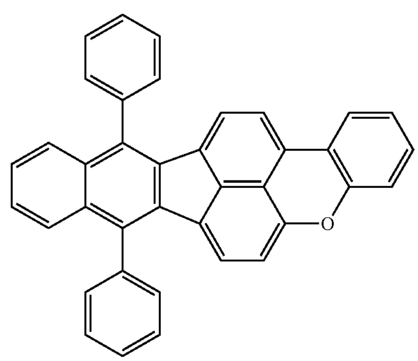

-continued
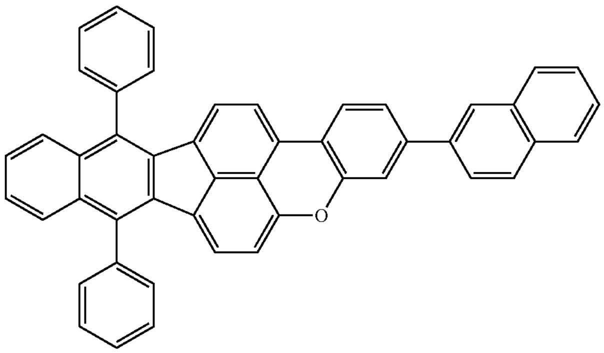
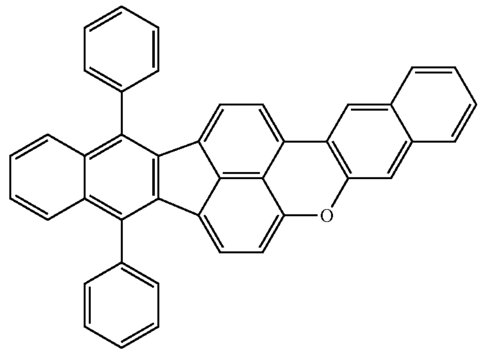
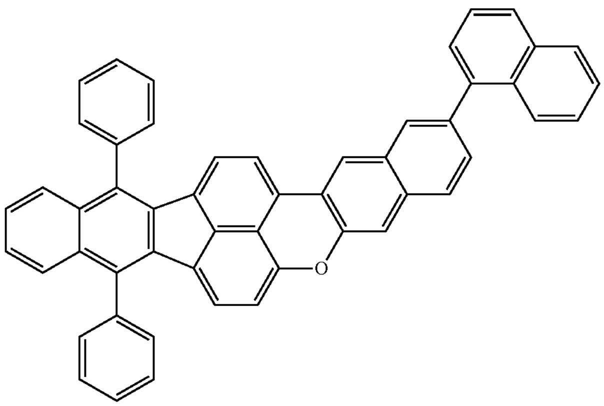
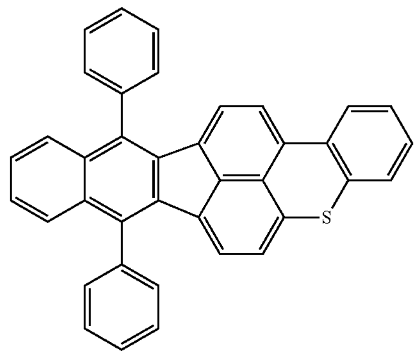
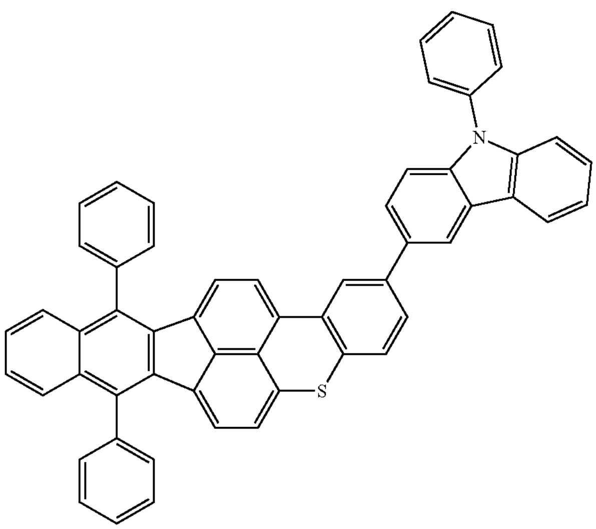
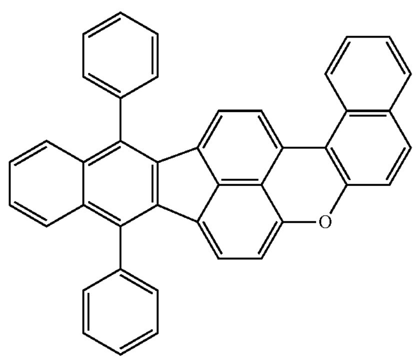
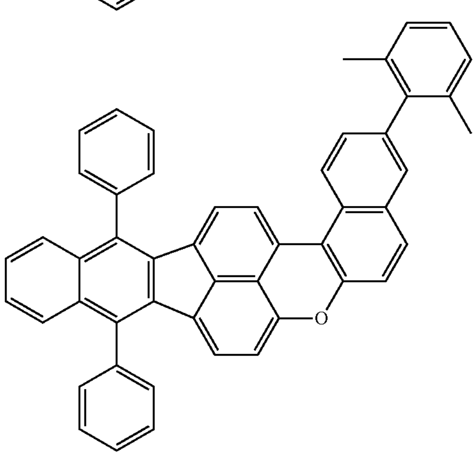
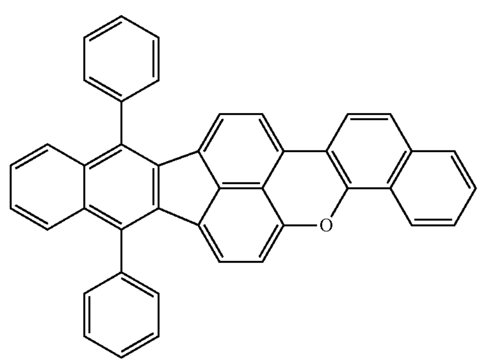

-continued
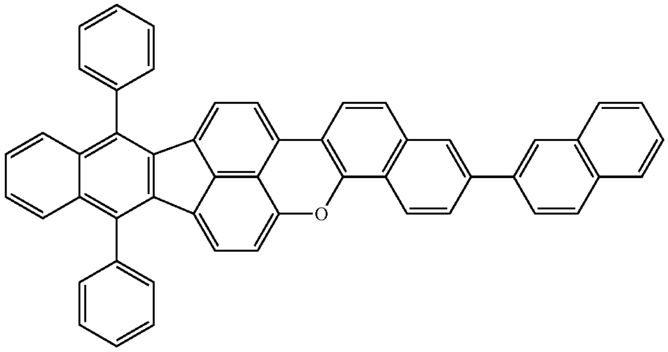
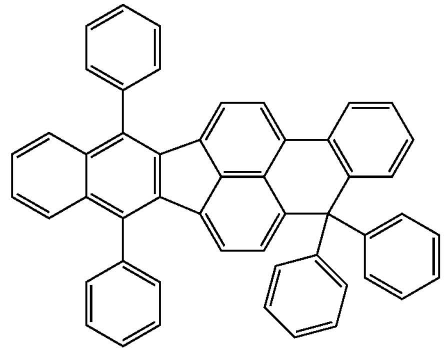
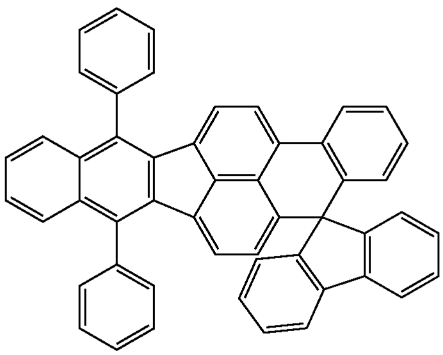
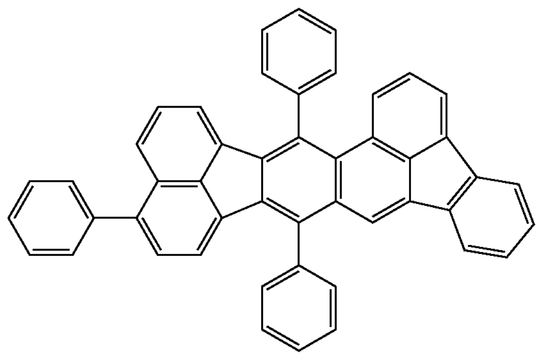
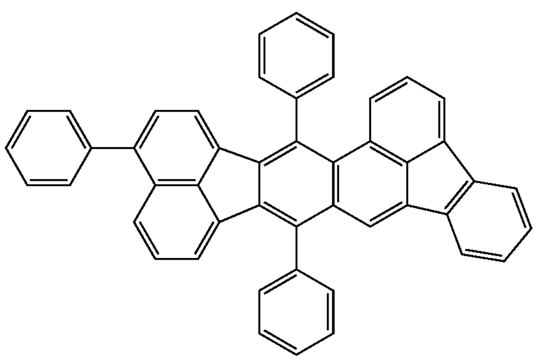
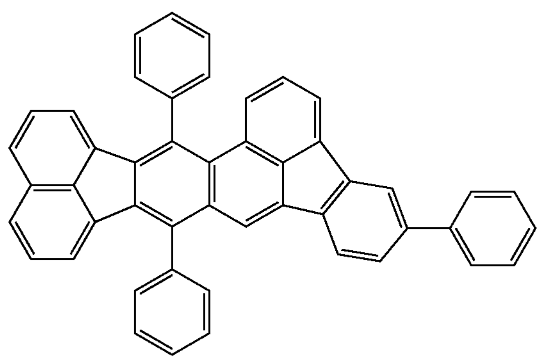
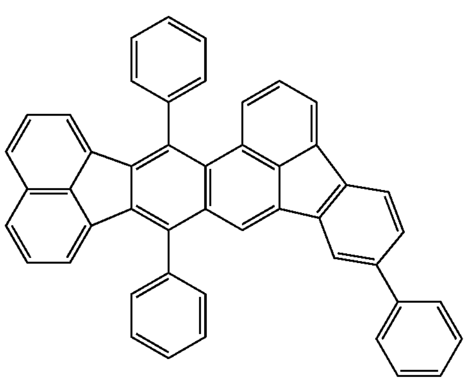
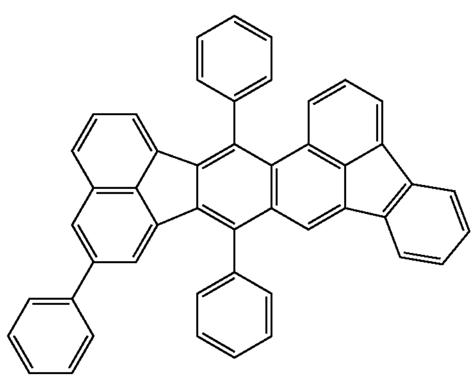

-continued
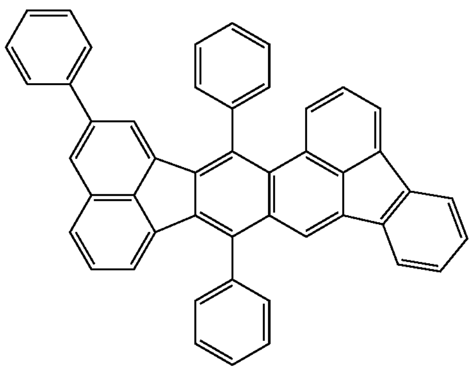
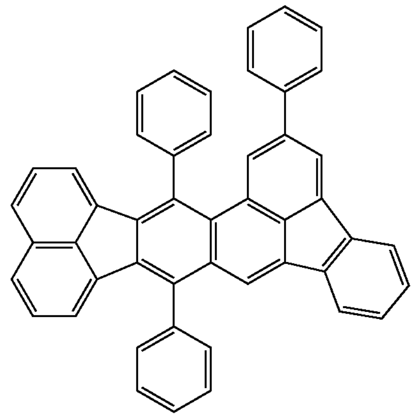
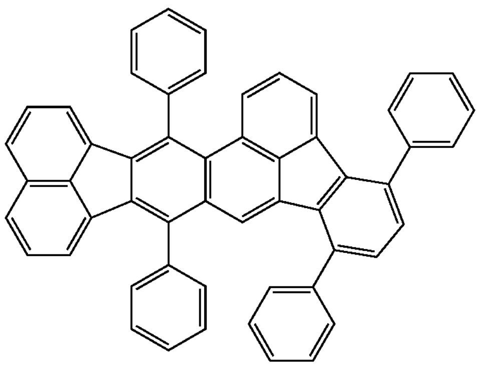
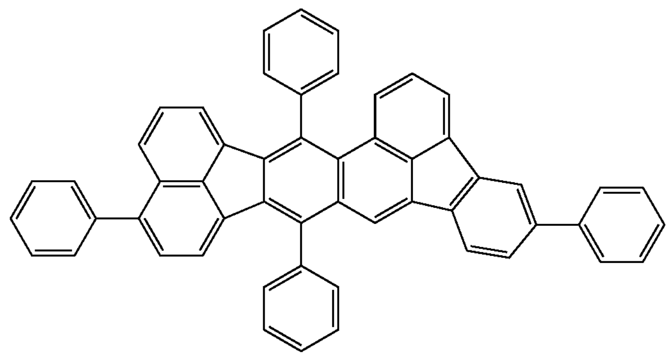
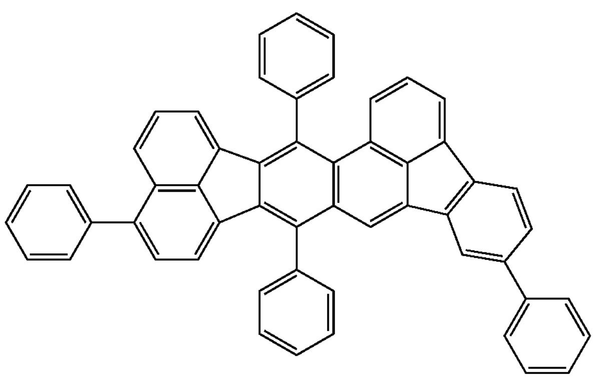
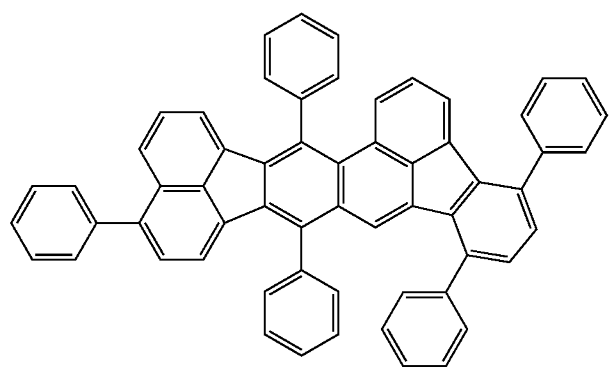
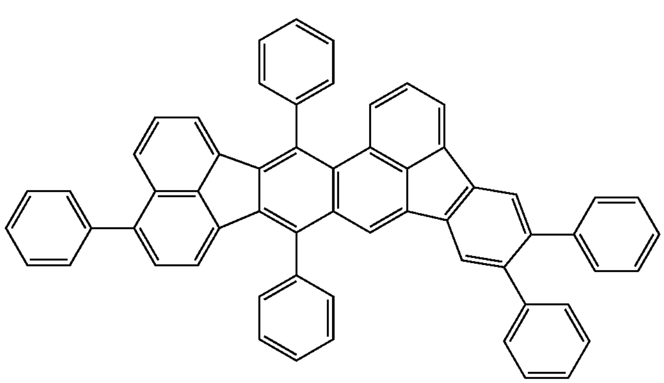

-continued
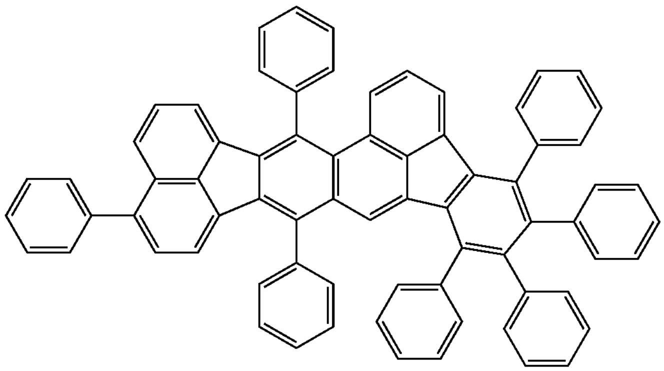
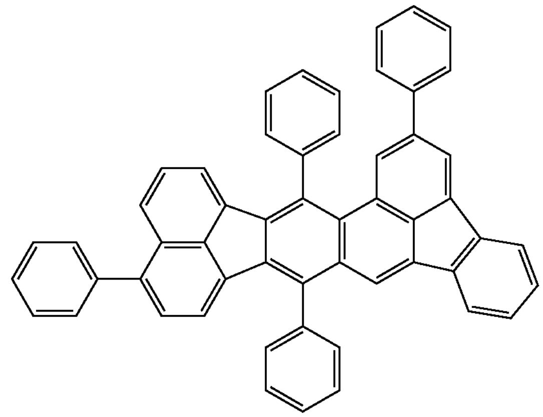
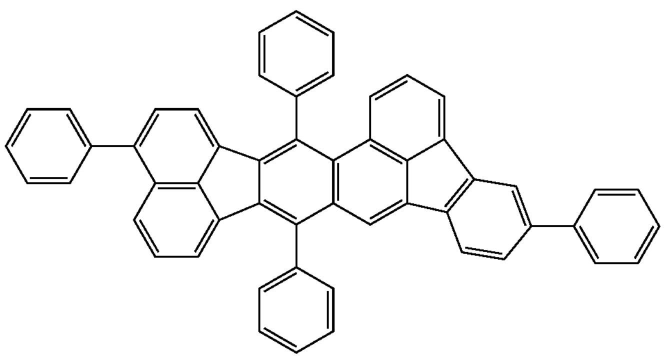
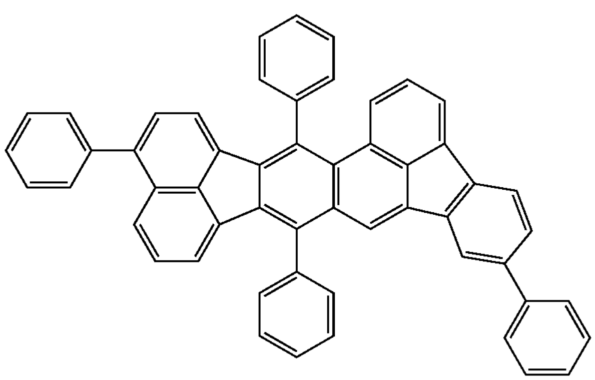
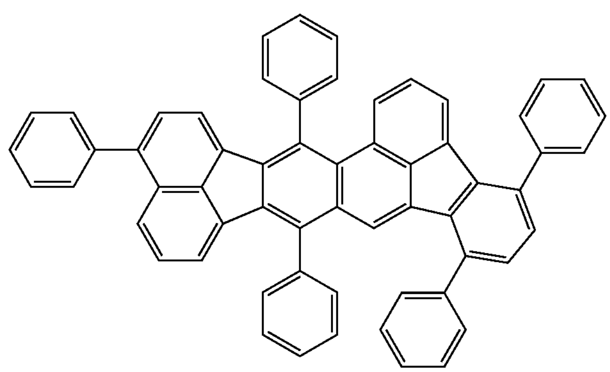
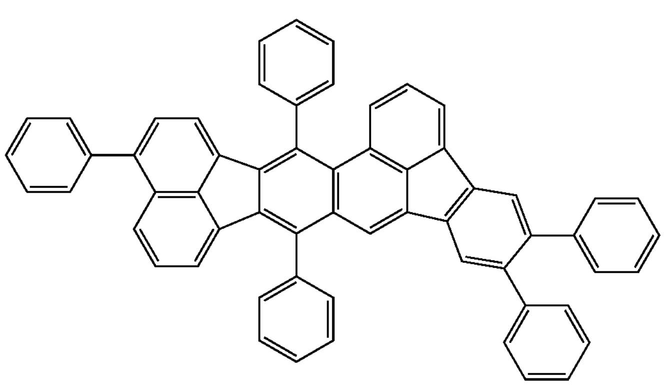
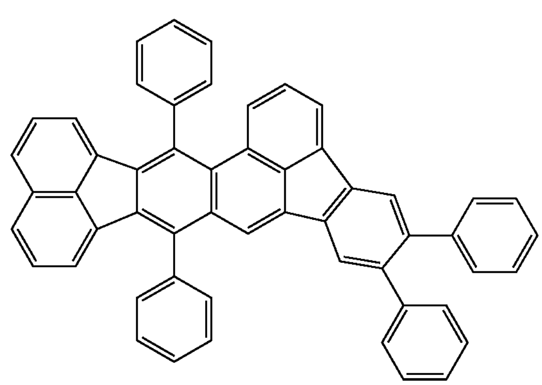

-continued
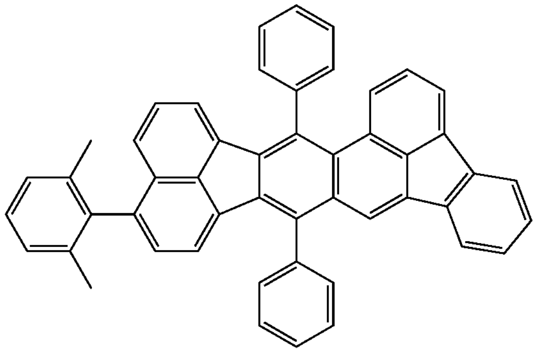
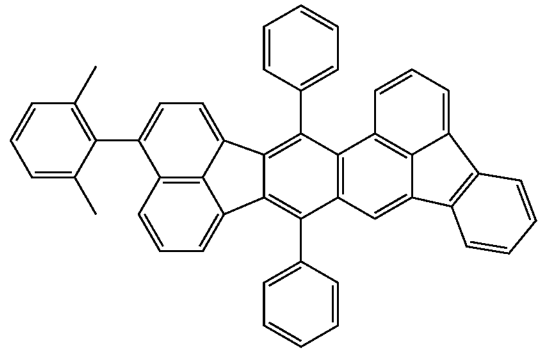
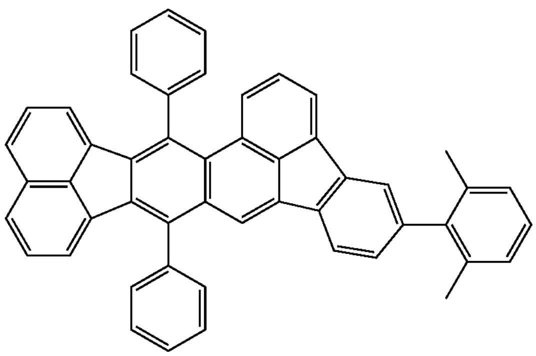
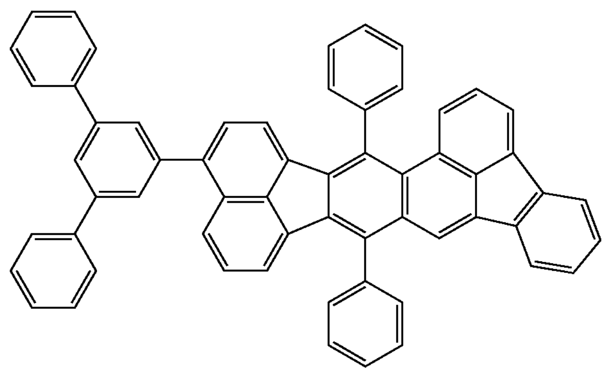
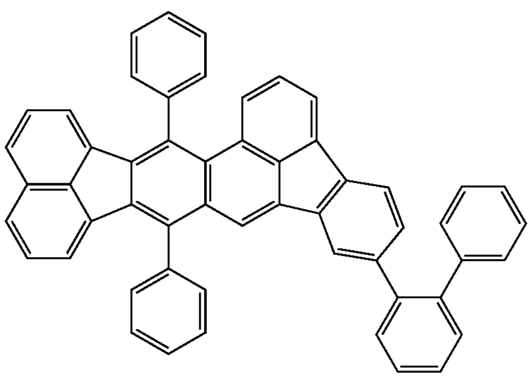
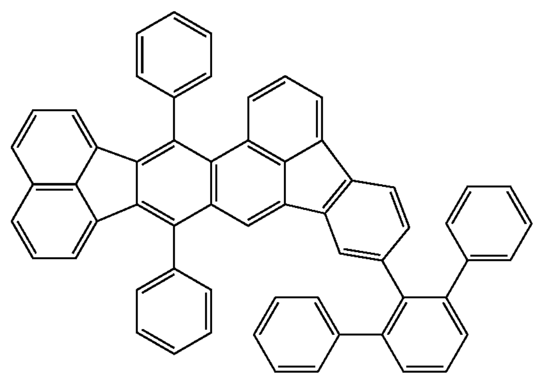
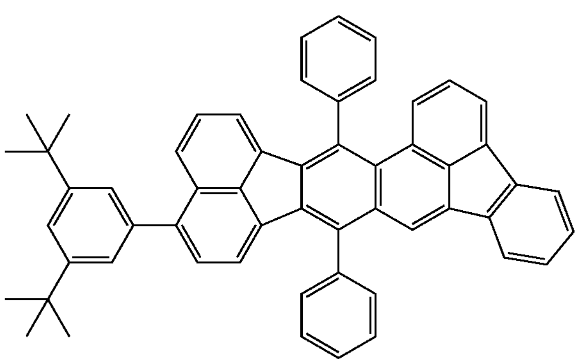
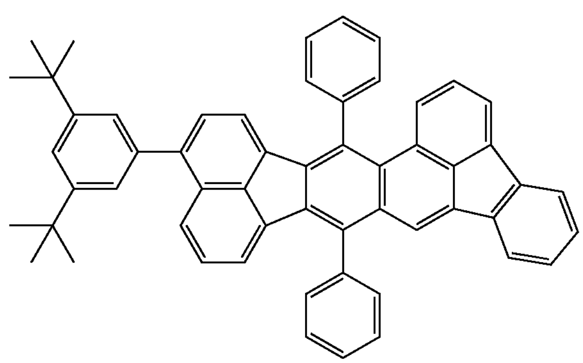

-continued
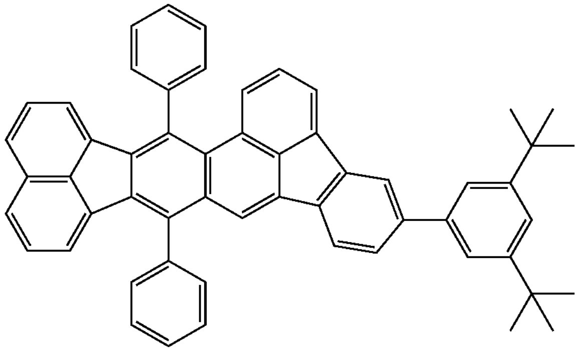
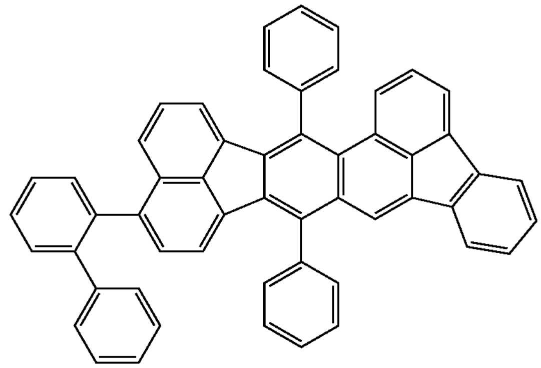
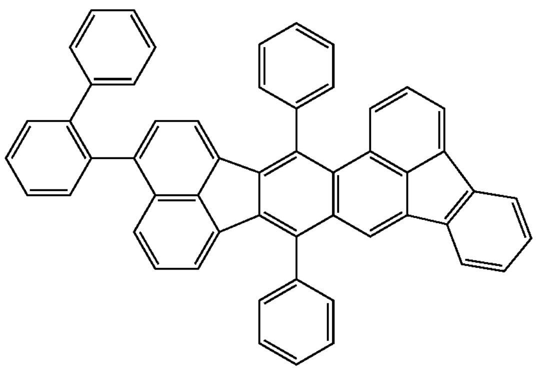
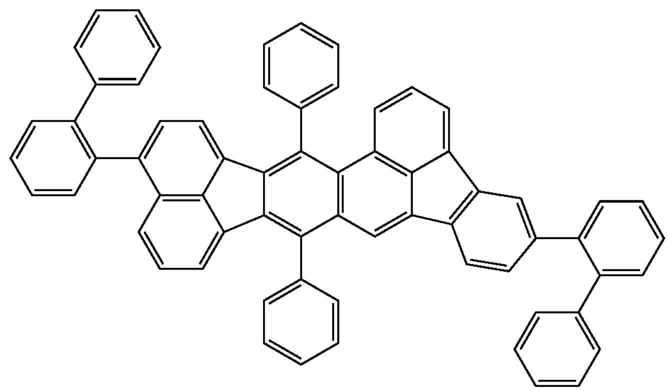
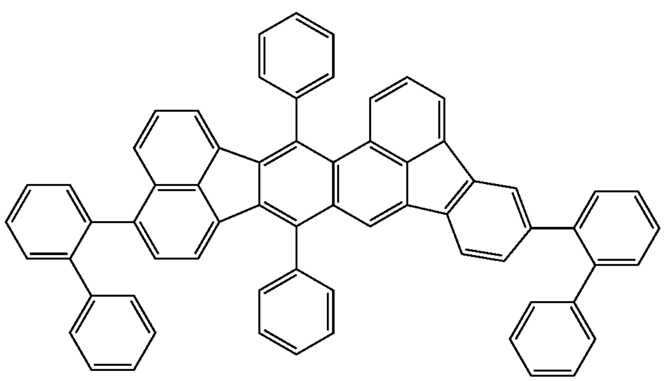
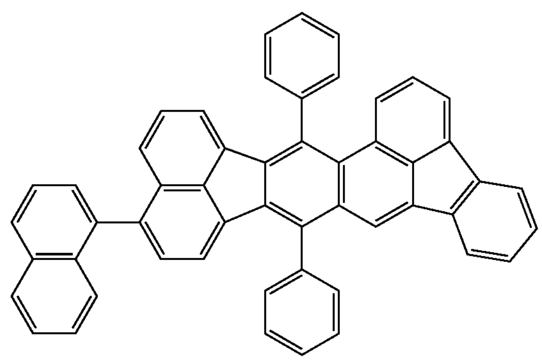
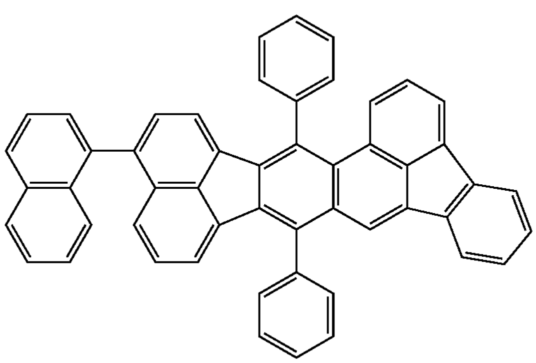
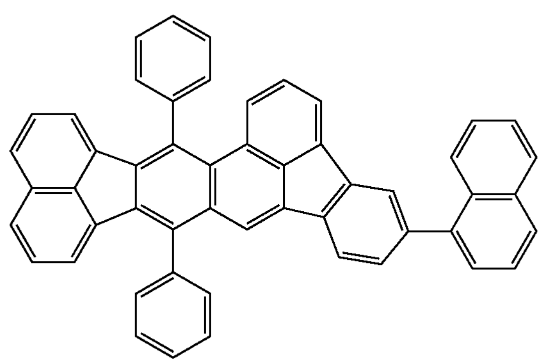

-continued
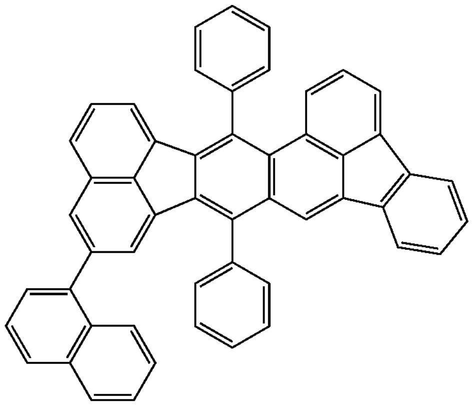
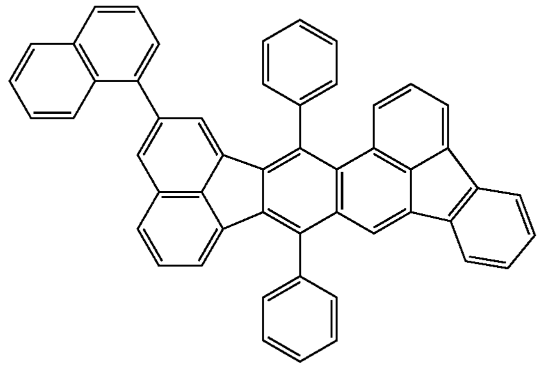
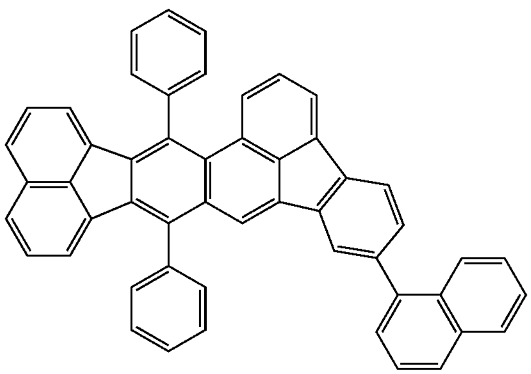
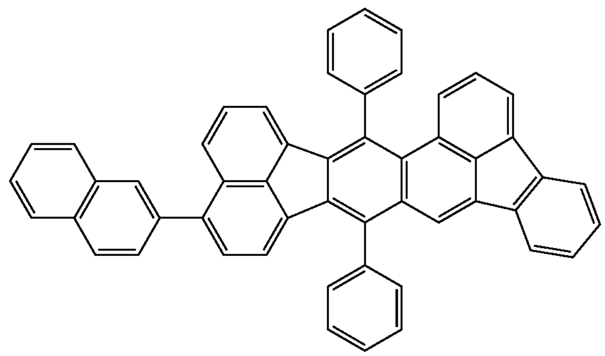
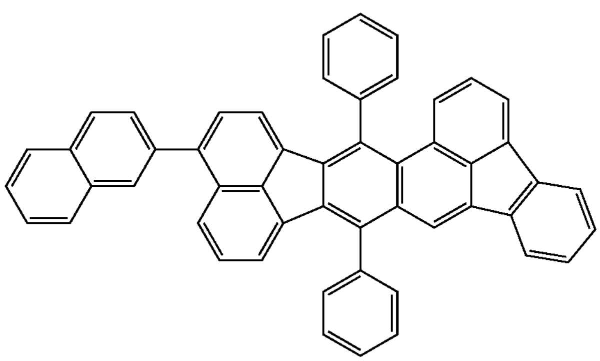
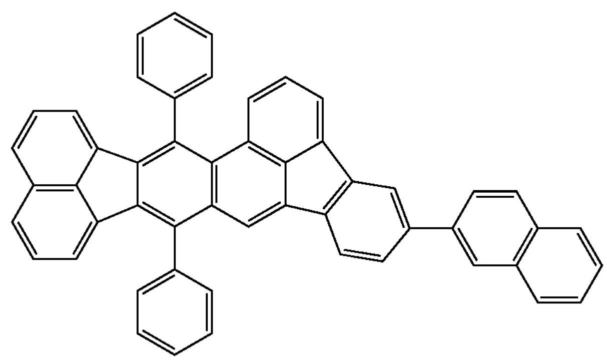
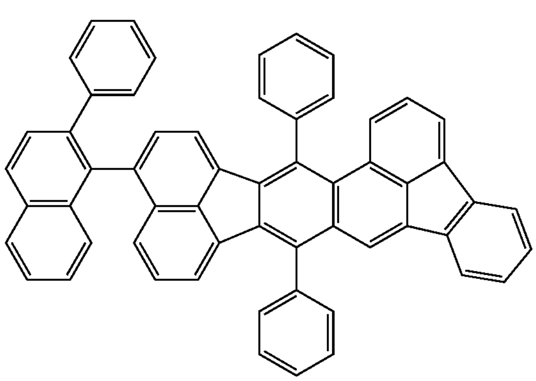
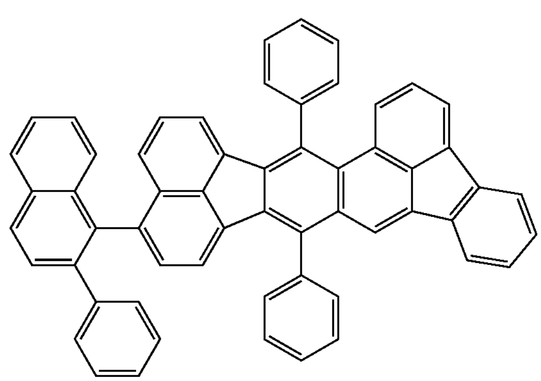

-continued
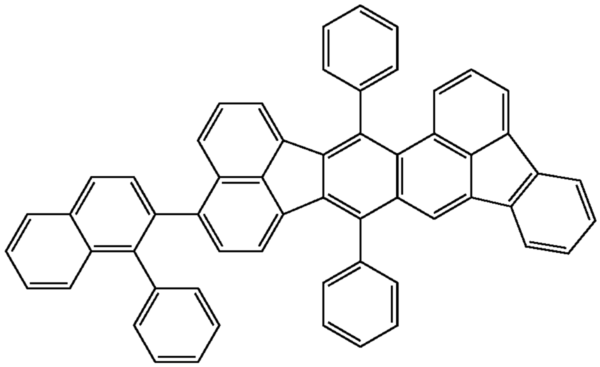
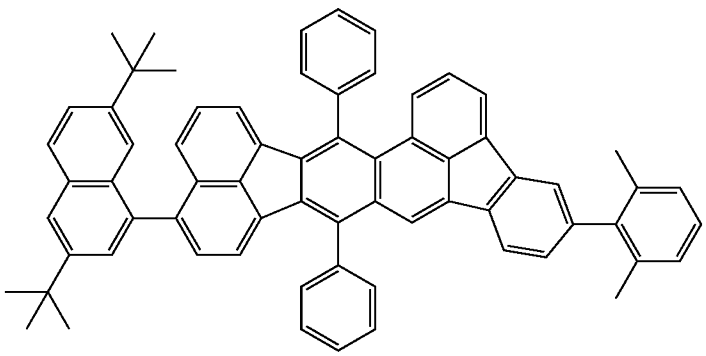
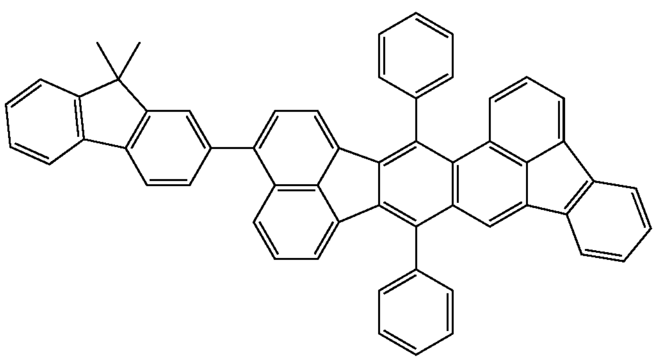
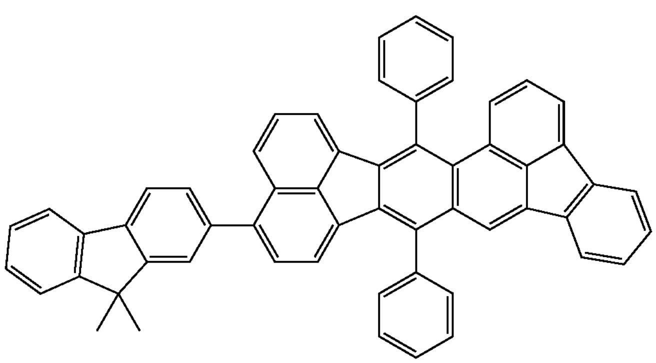

-continued
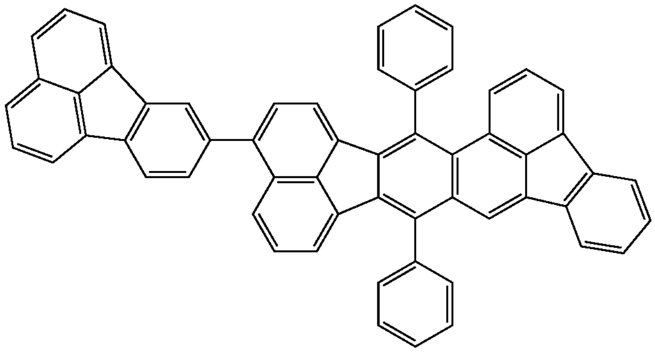
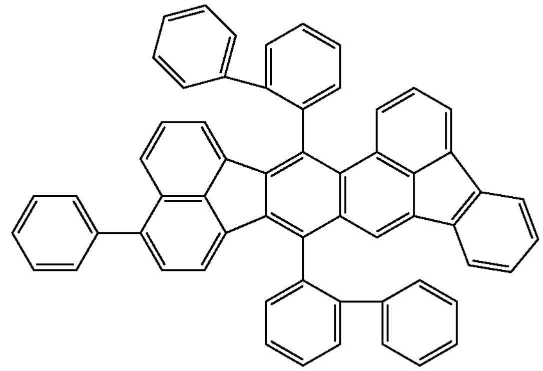
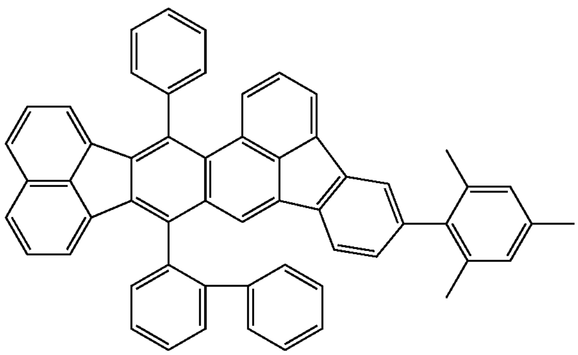
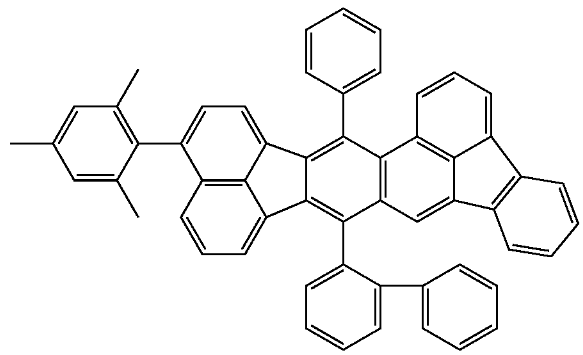
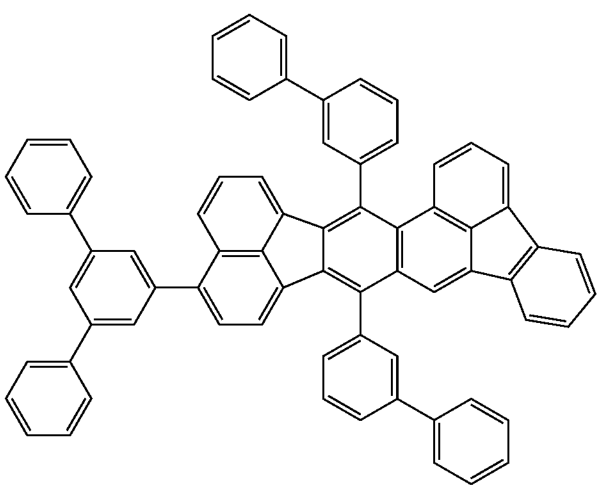
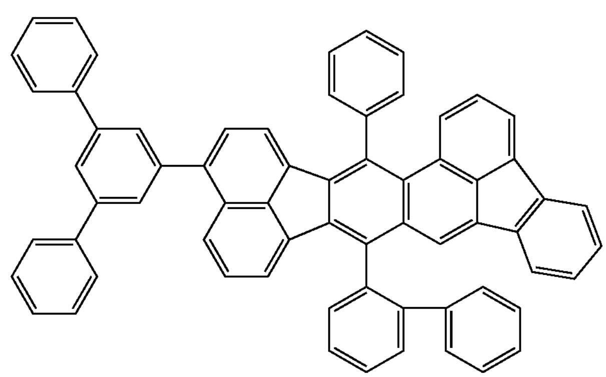
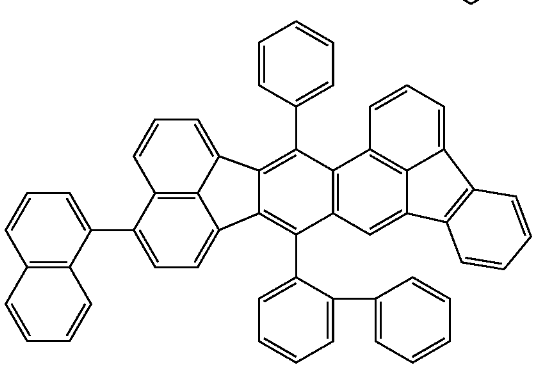
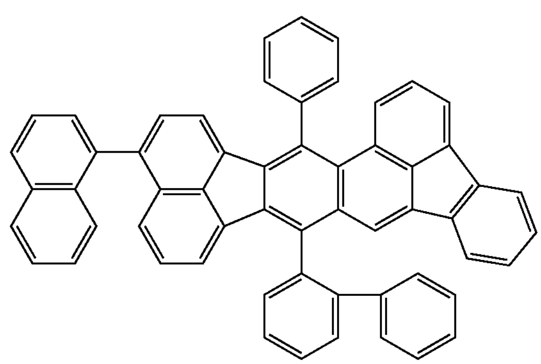

-continued
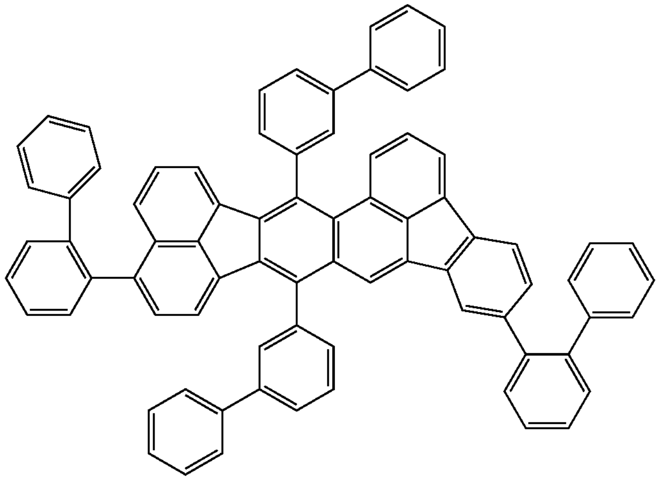
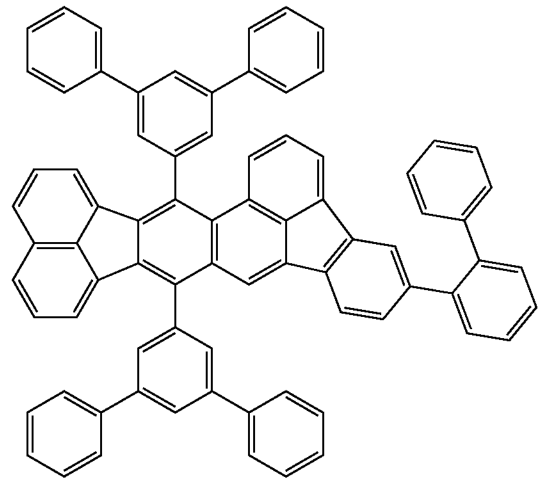
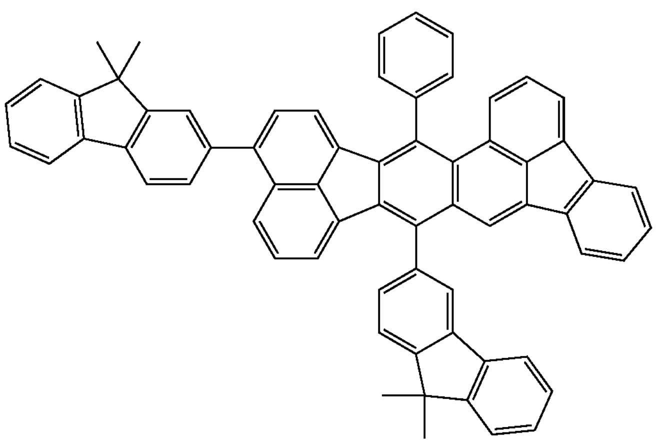
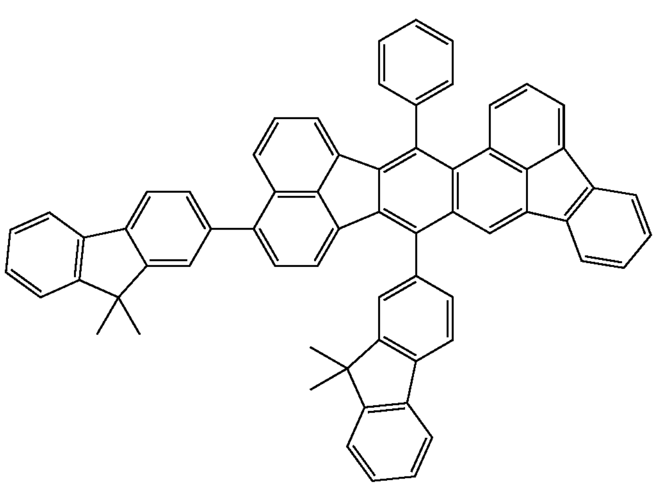
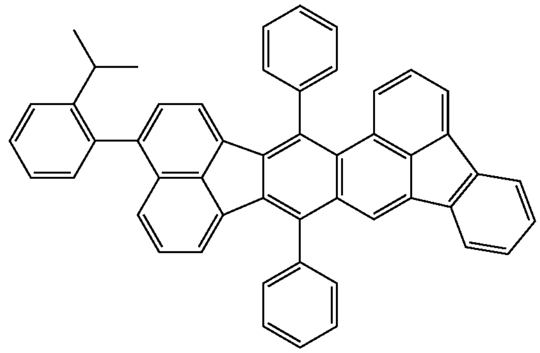

-continued
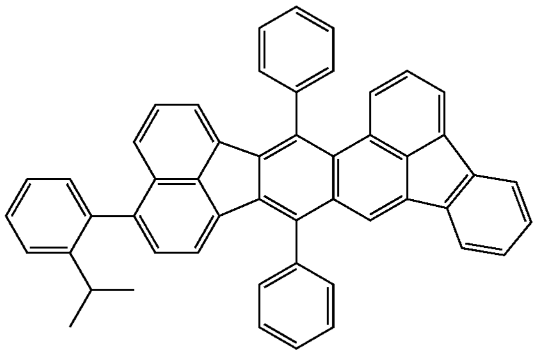
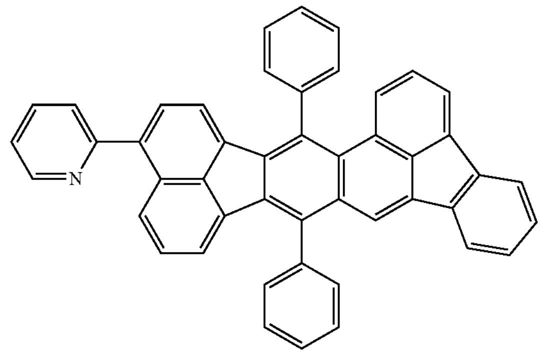
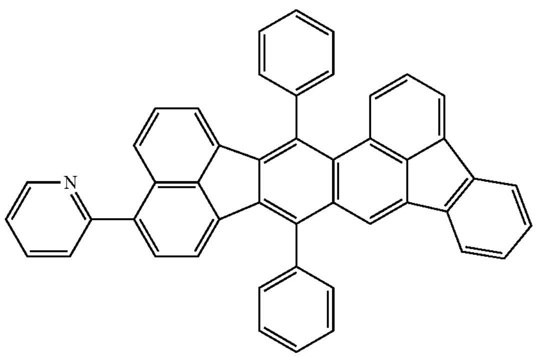
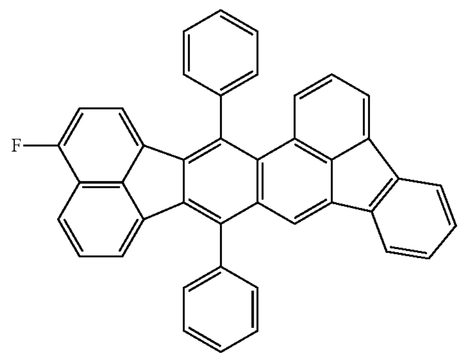
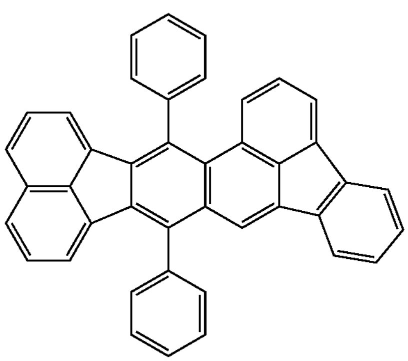
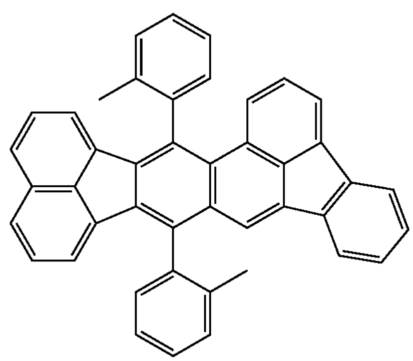
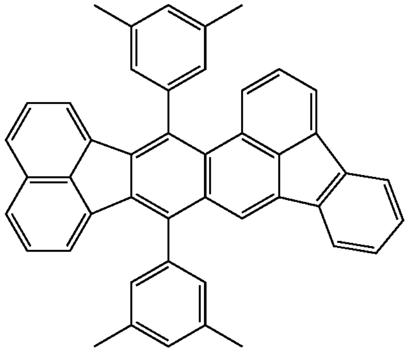
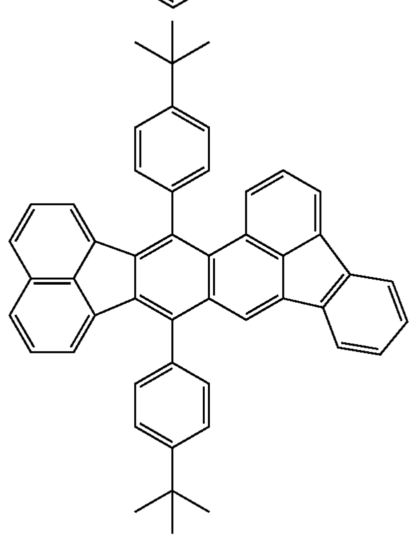

-continued
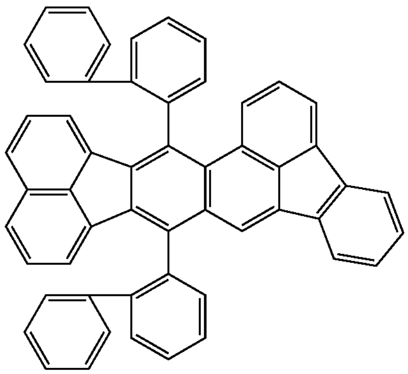
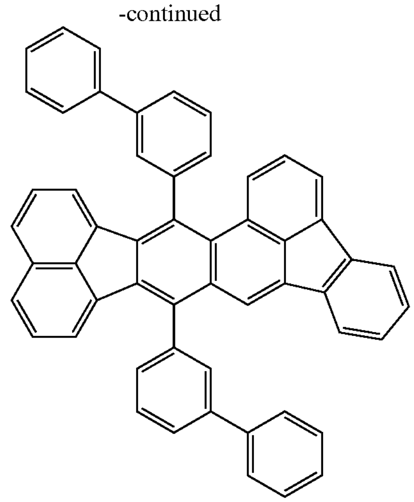
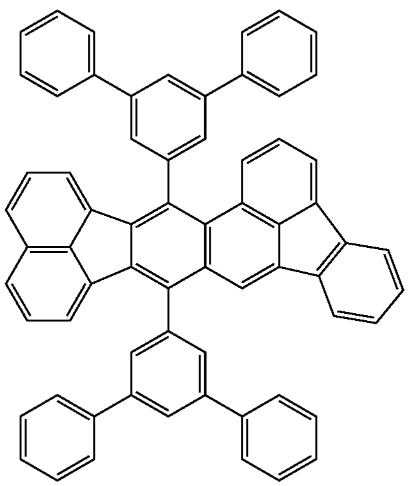
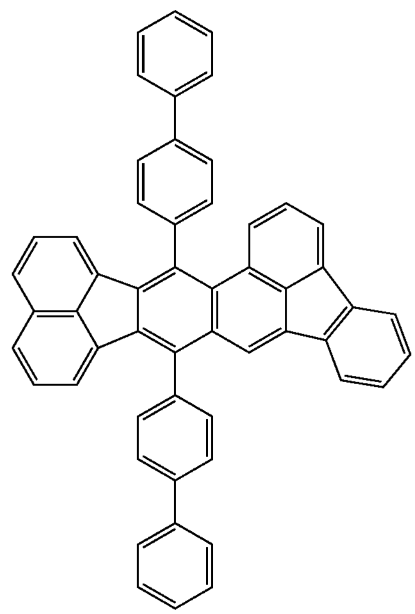
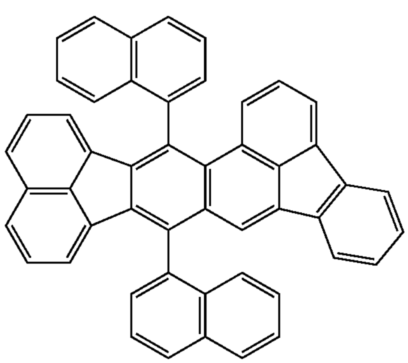
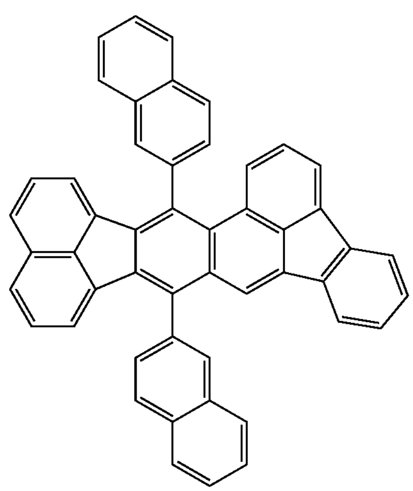

-continued
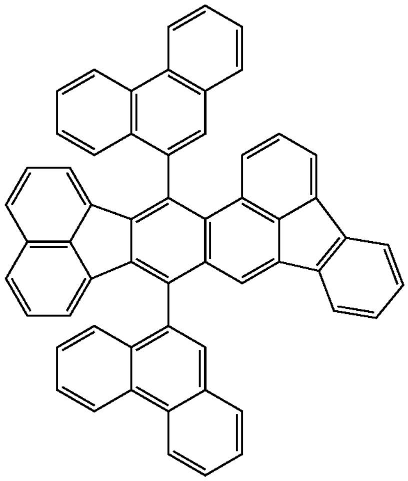
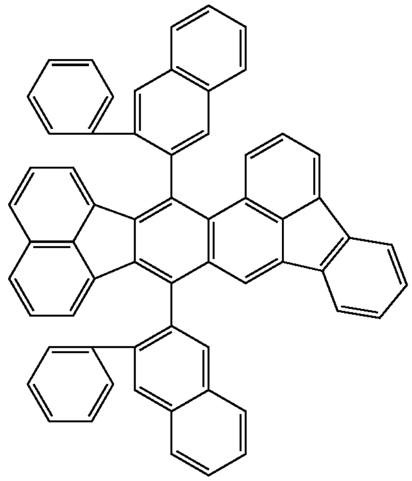
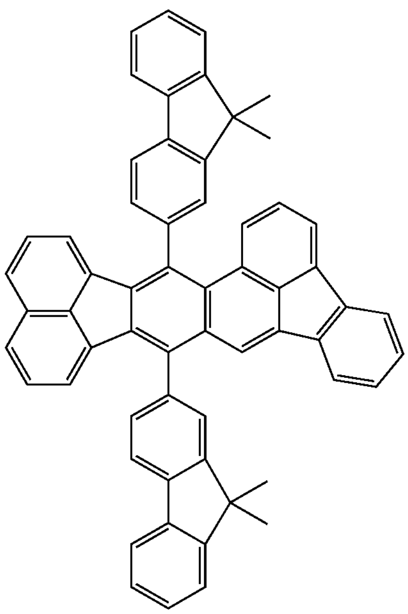
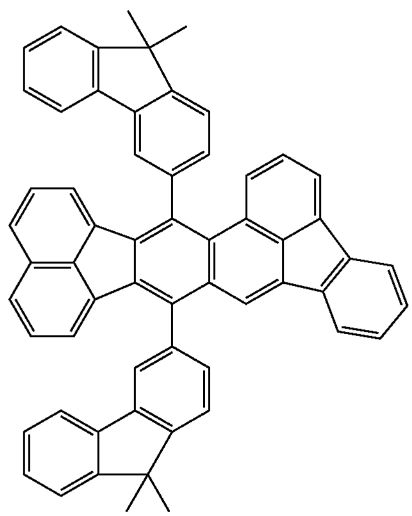
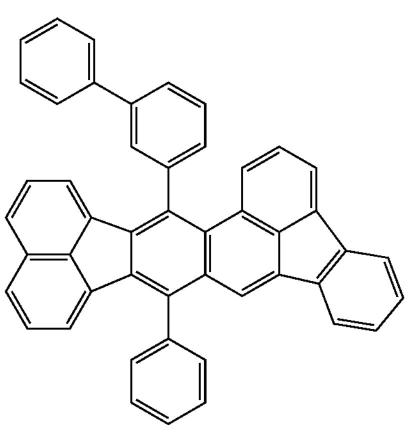
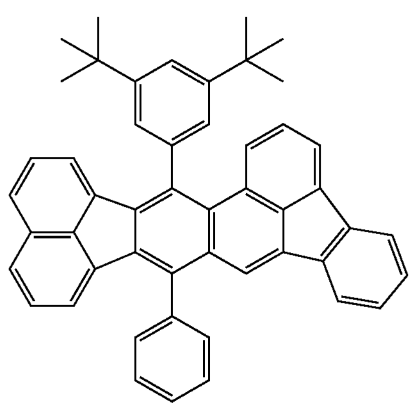

-continued
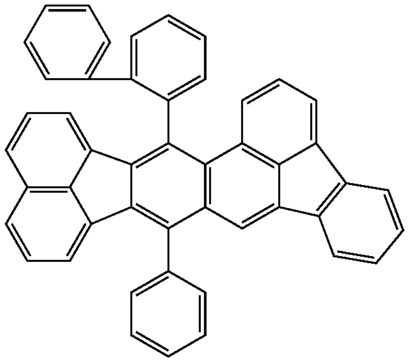
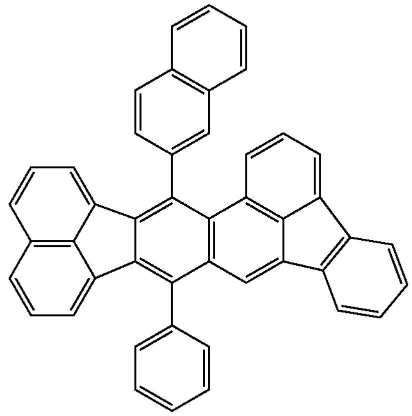
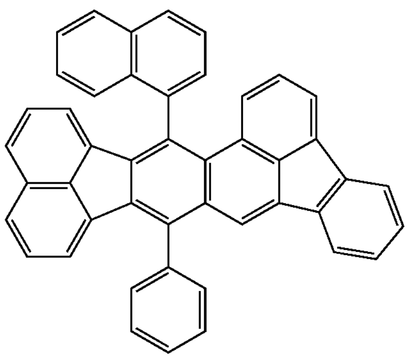
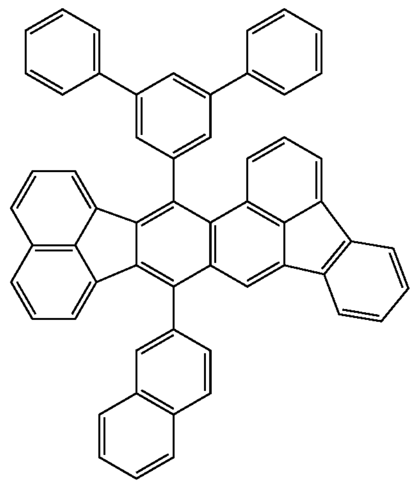
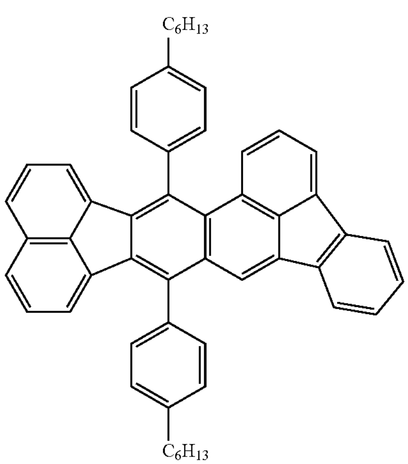
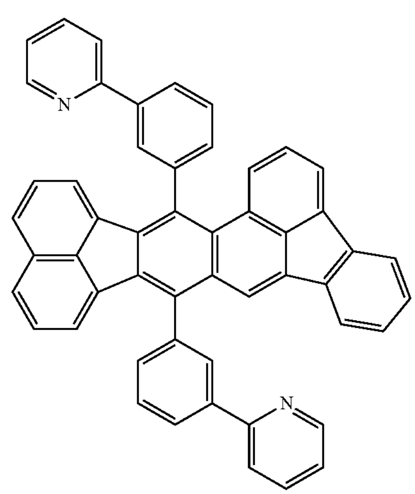

-continued
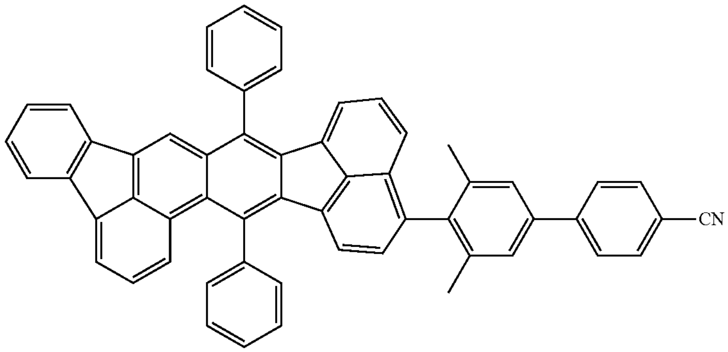
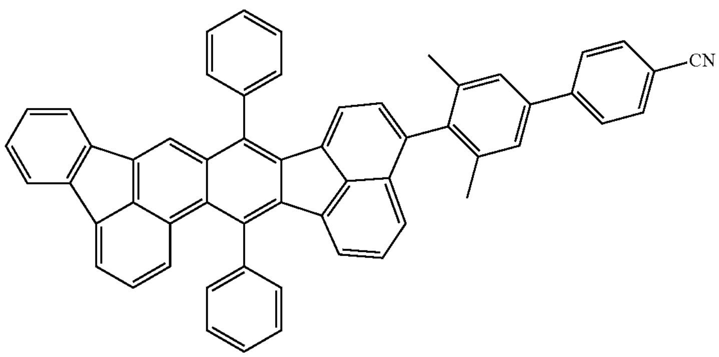
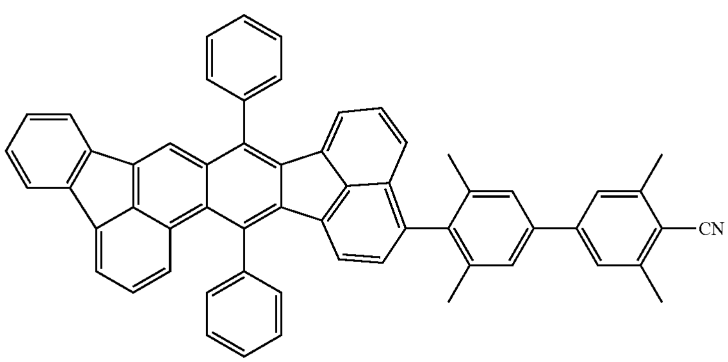
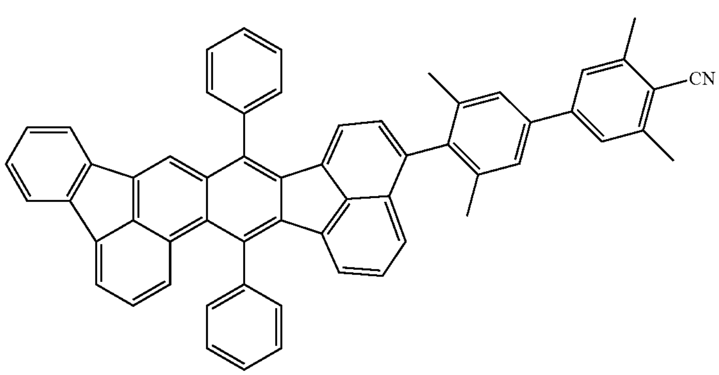

-continued
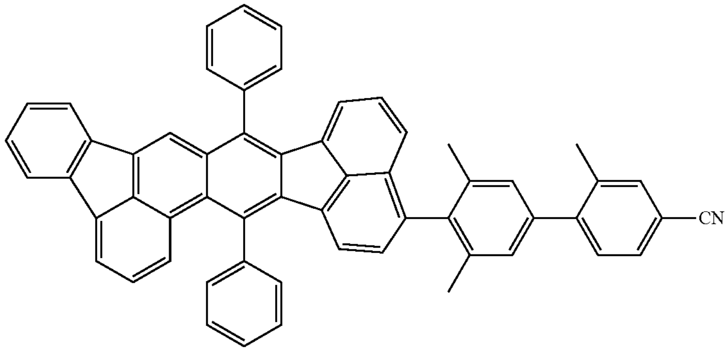
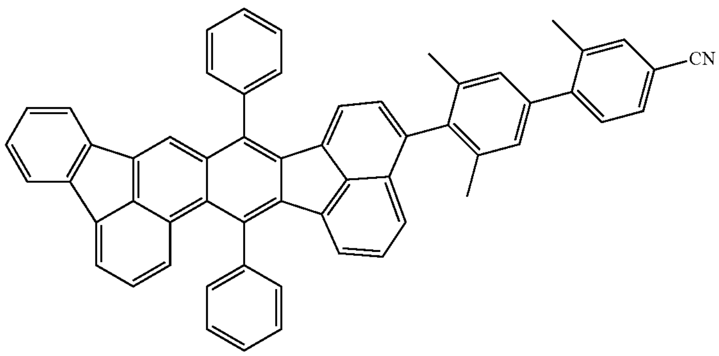
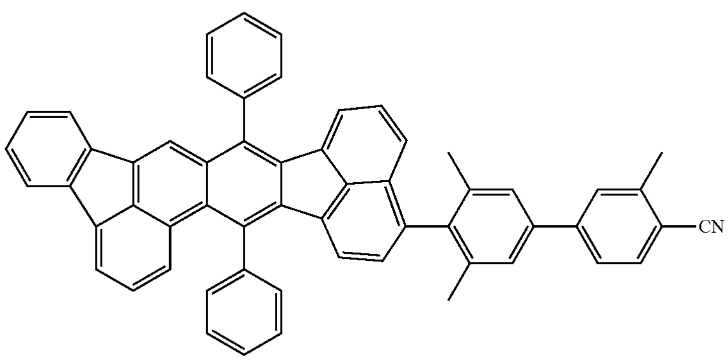
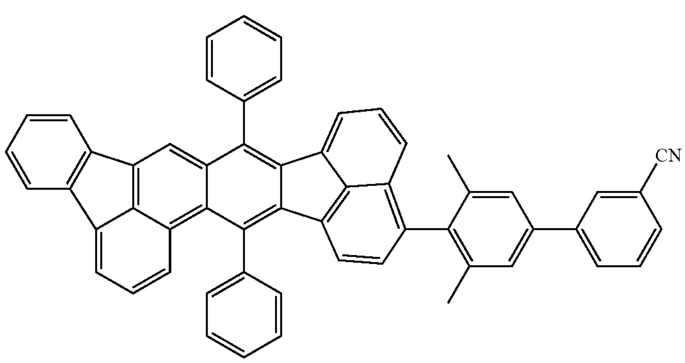

-continued

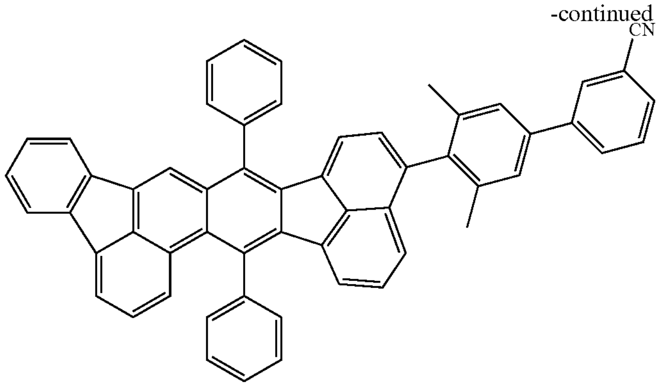

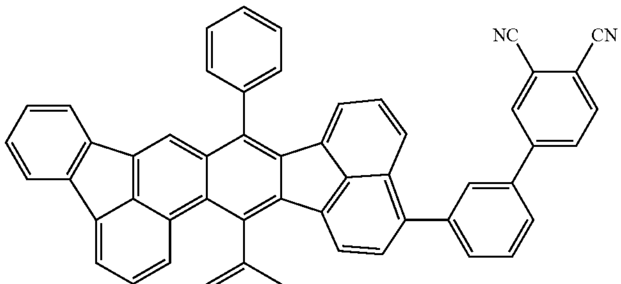

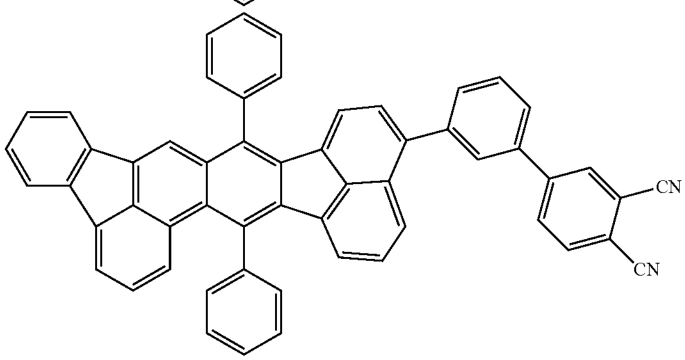

Known materials and device configurations may be applied to the organic EL device according to an aspect of the invention, as long as the organic EL device has the following constitutions and the effect of the invention is not impaired, the organic EL device including an anode, and a cathode, and an emitting region between the anode and the cathode, wherein the emitting region includes a first emitting layer and a second emitting layer, the first emitting layer and the second emitting layer are directly adjacent to each other, and one of the first emitting layer and the second emitting layer contains a compound having at least one deuterium atom.

Hereinafter, a layer configuration of the organic EL device according to an aspect of the invention will be described.

The organic EL device according to an aspect of the invention has an organic layer between a pair of electrodes that are the cathode and the anode. The organic layer is formed by stacking a plurality of layers containing an organic compound. The organic layer may have a layer consisting only of one or a plurality of organic compounds. The organic layer may have a layer containing an organic compound and an inorganic compound together. The organic layer may have a layer consisting only of one or a plurality of inorganic compounds.

Examples of the layers that may be employed in the layer configuration of the organic EL device include, but are not limited to, a hole-transporting region (e.g., a hole-transporting layer, a hole-injecting layer, an electron-blocking layer, an exciton-blocking layer, etc.) disposed between an anode and an emitting layer, an emitting layer, a space layer, and an electron-transporting region (e.g., an electron-transporting layer, an electron-injecting layer, a hole-blocking layer, etc.) disposed between a cathode and an emitting layer.

The organic EL device according to an aspect of the invention may be, for example, a monochromatic emitting device of a fluorescent or phosphorescent type, or a white emitting device of a fluorescent/phosphorescent hybrid type. In addition, it may be a simple type including a single light emitting unit or a tandem type including a plurality of light emitting units.

The "emitting unit" refers to the smallest unit which includes organic layers, in which at least one of the organic layers is an emitting layer, and which emits light by recombination of injected holes and electrons.

The "emitting layer" described in this specification is an organic layer having an emitting function. The emitting layer is, for example, a phosphorescent emitting layer, a fluorescent emitting layer, or the like, and may be a single layer or a plurality of layers.

The light-emitting unit may be of a stacked type including a plurality of a phosphorescent emitting layer and a fluorescent emitting layer, and in this case, for example, it may include a spacing layer between each emitting layer for preventing excitons generated by the phosphorescent emitting layer from diffusing into the fluorescent emitting layer.

As the simple type organic EL device, for example, an organic EL device having a device configuration such as anode/emitting unit/cathode may be mentioned.

Typical layer configurations of the emitting unit are shown below. The layers in parentheses are optional layers.

(c) (hole-injecting layer/) hole-transporting layer/first fluorescent emitting layer/second fluorescent emitting layer (/electron-transporting layer/electron-injecting layer)

(d) (hole-injecting layer/) hole-transporting layer/first phosphorescent emitting layer/second phosphorescent emitting layer (/electron-transporting layer/electron-injecting layer)

(f) (hole-injecting layer/) hole-transporting layer/first phosphorescent emitting layer/second phosphorescent emitting layer/spacing layer/fluorescent emitting layer (/electron-transporting layer/electron-injecting layer)

(h) (hole-injecting layer/) hole-transporting layer/phosphorescent emitting layer/spacing layer/first fluorescent emitting layer/second fluorescent emitting layer (/electron-transporting layer/electron-injecting layer)

(i) (hole-injecting layer/) hole-transporting layer/electron-blocking layer/fluorescent emitting layer/fluorescent emitting layer (/electron-transporting layer/electron-injecting layer)

(j) (hole-injecting layer/) hole-transporting layer/electron-blocking layer/phosphorescent emitting layer/phosphorescent emitting layer (/electron-transporting layer/electron-injecting layer)

(k) (hole-injecting layer/) hole-transporting layer/exciton-blocking layer/fluorescent emitting layer/fluorescent emitting layer (/electron-transporting layer/electron-injecting layer)

(l) (hole-injecting layer/) hole-transporting layer/exciton-blocking layer/phosphorescent emitting layer/fluorescent emitting layer (/electron-transporting layer/electron-injecting layer)

(m) (hole-injecting layer/) first hole-transporting layer/second hole-transporting layer/fluorescent emitting layer/fluorescent emitting layer (/electron-transporting layer/electron-injecting layer)

(n) (hole-injecting layer/) first hole-transporting layer/second hole-transporting layer/fluorescent emitting layer/fluorescent emitting layer (/first electron-transporting layer/second electron-transporting layer/electron-injecting layer)

(o) (hole-injecting layer/) first hole-transporting layer/second hole-transporting layer/phosphorescent emitting layer/phosphorescent emitting layer (/electron-transporting layer/electron-injecting layer)

(p) (hole-injecting layer/) first hole-transporting layer/second hole-transporting layer/phosphorescent emitting layer/phosphorescent emitting layer (/first electron-transporting layer/second electron-transporting layer/electron-injecting layer)

(q) (hole-injecting layer/) hole-transporting layer/fluorescent emitting layer/fluorescent emitting layer/hole-blocking layer (/electron-transporting layer/electron-injecting layer)

(r) (hole-injecting layer/) hole-transporting layer/phosphorescent emitting layer/phosphorescent emitting layer/hole-blocking layer (/electron-transporting layer/electron-injecting layer)

(s) (hole-injecting layer/) hole-transporting layer/fluorescent emitting layer/fluorescent emitting layer/exciton-blocking layer (/electron-transporting layer/electron-injecting layer)

(t) (hole-injecting layer/) hole-transporting layer/phosphorescent emitting layer/phosphorescent emitting layer/exciton-blocking layer (/electron-transporting layer/electron-injecting layer)

However, the layer configuration of the organic EL device according to one aspect of the invention is not limited thereto. For example, when the organic EL device has a hole-injecting layer and a hole-transporting layer, it is preferred that a hole-injecting layer be provided between the hole-transporting layer and the anode. Further, when the organic EL device has an electron-injecting layer and an electron-transporting layer, it is preferred that an electron-injecting layer be provided between the electron-transporting layer and the cathode. Further, each of the hole-injecting layer, the hole-transporting layer, the electron-transporting layer and the electron-injecting layer may be constituted of a single layer or of a plurality of layers.

The plurality of phosphorescent emitting layers, and the plurality of the phosphorescent emitting layer and the fluorescent emitting layer may be emitting layers that emit mutually different colors. For example, the emitting unit (f) may contain a hole-transporting layer/first phosphorescent layer (red light emission)/second phosphorescent emitting layer (green light emission)/spacing layer/fluorescent emitting layer (blue light emission)/electron-transporting layer.

An electron-blocking layer may be provided between each light emitting layer and the hole-transporting layer or the spacing layer. Further, a hole-blocking layer may be provided between each emitting layer and the electron-transporting layer. By providing the electron-blocking layer or the hole-blocking layer, it is possible to confine electrons or holes in the emitting layer, thereby to improve the recombination probability of carriers in the emitting layer, and to improve luminous efficiency.

As a representative device configuration of a tandem type organic EL device, for example, a device configuration such as anode/first emitting unit/intermediate layer/second emitting unit/cathode can be given.

The first emitting unit and the second emitting unit are independently selected from the above-mentioned emitting units, for example.

The intermediate layer is also generally referred to as an intermediate electrode, an intermediate conductive layer, a charge generating layer, an electron withdrawing layer, a connecting layer, a connector layer, or an intermediate insulating layer. The intermediate layer is a layer that supplies electrons to the first emitting unit and holes to the second emitting unit, and can be formed of known materials.

Hereinbelow, an explanation will be made on function, materials, etc. of each layer constituting the organic EL device described in this specification.

(Substrate)

The substrate is used as a support of the organic EL device. The substrate preferably has a light transmittance of 50% or more in the visible light region within a wavelength of 400 to 700 nm, and a smooth substrate is preferable. Examples of the material of the substrate include soda-lime glass, aluminosilicate glass, quartz glass, plastic and the like. As the substrate, a flexible substrate can be used. The flexible substrate means a substrate that can be bent (flexible), and examples thereof include a plastic substrate and the like. Specific examples of the material for forming the plastic substrate include polycarbonate, polyallylate, polyether sulfone, polypropylene, polyester, polyvinyl fluoride, polyvinyl chloride, polyimide, polyethylene naphthalate and the like. Also, an inorganic vapor deposited film can be used.

(Anode)

As the anode, for example, it is preferable to use a metal, an alloy, a conductive compound, a mixture thereof or the like, which has a high work function (specifically, 4.0 eV or more). Specific examples of the material of the anode include indium oxide-tin oxide (ITO: Indium Tin Oxide), indium oxide-tin oxide containing silicon or silicon oxide, indium oxide-zinc oxide, indium oxide containing tungsten oxide or zinc oxide, graphene and the like. In addition, it is possible to use gold, silver, platinum, nickel, tungsten, chromium, molybdenum, iron, cobalt, copper, palladium, titanium, nitrides of these metals (e.g. titanium nitride) and the like.

The anode is normally formed by depositing these materials on the substrate by a sputtering method. For example, indium oxide-zinc oxide can be formed by a sputtering method by using a target in which 1 to 10 mass % zinc oxide is added to indium oxide. Further, indium oxide containing tungsten oxide or zinc oxide can be formed by a sputtering method by using a target in which 0.5 to 5 mass % of tungsten oxide or 0.1 to 1 mass % of zinc oxide is added to indium oxide.

As the other methods for forming the anode, a vacuum deposition method, a coating method, an inkjet method, a spin coating method or the like can be given. When silver paste or the like is used, it is possible to use a coating method, an inkjet method or the like.

The hole-injecting layer formed in contact with the anode is formed by using a material that allows easy hole injection regardless of the work function of the anode. For this reason, in the anode, it is possible to use a common electrode material, for example, a metal, an alloy, a conductive compound and a mixture thereof. Specifically, materials having a small work function such as alkaline metals such as lithium and cesium; magnesium; alkaline earth metals such as calcium and strontium; alloys containing these metals (for example, magnesium-silver and aluminum-lithium); rare earth metals such as europium and ytterbium; and an alloy containing rare earth metals can also be used for the anode.

(Hole-Injecting Layer)

A hole-injecting layer is a layer that contains a substance having a high hole-injecting property and has a function of injecting holes from the anode to the organic layer. As the substance having a high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, an electron-attracting (acceptor) compound, a polymeric compound (oligomer, dendrimer, polymer, etc.) and the like can be given. Among these, an aromatic amine compound and an acceptor compound are preferable, with an acceptor compound being more preferable.

Specific examples of the aromatic amine compound include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

The acceptor compound is preferably, for example, a heterocyclic ring derivative having an electron-attracting group, a quinone derivative having an electron-attracting group, an arylborane derivative, a heteroarylborane derivative, and the like, and specific examples include hexacyanohexaazatriphenylene, 2,3,5,6-tetrafluoro-7,7,8,8-tetracyanoquinodimethane (abbreviation: F4TCNQ), 1,2,3-tris[(cyano)(4-cyano-2,3,5,6-tetrafluorophenyl)methylene]cyclopropane, and the like.

When the acceptor compound is used, it is preferred that the hole-injecting layer further comprise a matrix material. As the matrix material, a material known as the material for an organic EL device can be used. For example, an electron-donating (donor) compound is preferable.

(Hole-Transporting Layer)

The hole-transporting layer is a layer that comprises a high hole-transporting properly, and has a function of transporting holes from the anode to the organic layer.

As the substance having a high hole-transporting property, a substance having a hole mobility of $10^{-6}$ $cm^2/(V\cdot s)$ or more is preferable. For example, an aromatic amine compound, a carbazole derivative, an anthracene derivative, a polymeric compound, and the like can be given.

Specific examples of the aromatic amine compound include 4,4-bis[N-(1-naphthyl)-N-phenylamino]biphenyl (abbreviation: NPB), N,N'-bis(3-methylphenyl)-N,N'-diphenyl-[1,1'-biphenyl]-4,4-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like.

Specific examples of the carbazole derivative include 4,4'-di(9-carbazolyl)biphenyl (abbreviation: CBP), 9-[4-(9-carbazolyl)phenyl]-10-phenylanthracene (abbreviation: CzPA), 9-phenyl-3-[4-(10-phenyl-9-anthryl)phenyl]-9H-carbazole (abbreviation: PCzPA) and the like.

Specific examples of the anthracene derivative include 2-t-butyl-9,10-di(2-naphthyl)anthracene (t-BuDNA), 9,10-di(2-naphthyl)anthracene (DNA), 9,10-diphenylanthracene (DPAnth), and the like.

Specific examples of the polymeric compound include poly(N-vinylcarbazole) (abbreviation: PVK), poly(4-vinyltriphenylamine) (abbreviation: PVTPA) and the like.

As long as a compound other than those mentioned above, that has a higher hole-transporting property as compared with electron-transporting property, such a compound can be used for the hole-transporting layer.

The hole-transporting layer may be a single layer or may be a stacked layer of two or more layers. In this case, it is preferred to arrange a layer that contains a substance having a larger energy gap among substances having a higher hole-transporting property, on a side nearer to the emitting layer.

(Emitting Layer)

The emitting layer is a layer containing a substance having a high emitting property (dopant material). As the dopant material, various types of material can be used. For example, a fluorescent emitting compound (fluorescent dopant), a phosphorescent emitting compound (phosphorescent dopant) or the like can be used. A fluorescent emitting compound is a compound capable of emitting light from the singlet excited state, and an emitting layer containing a fluorescent emitting compound is called as a fluorescent emitting layer. Further, a phosphorescent emitting compound is a compound capable of emitting light from the triplet excited state, and an emitting layer containing a phosphorescent emitting compound is called as a phosphorescent emitting layer.

The emitting layer normally contains a dopant material and a host material that allows the dopant material to emit light efficiently. In some literatures, a dopant material may be called as a guest material, an emitter, or an emitting material. In some literatures, a host material is called as a matrix material.

A single emitting layer may include a plurality of dopant materials and a plurality of host materials. Further, a plurality of emitting layers may be present.

In this specification, a host material combined with the fluorescent dopant is referred to as a "fluorescent host" and a host material combined with the phosphorescent dopant is referred to as the "phosphorescent host". Note that the fluorescent host and the phosphorescent host are not classified only by the molecular structure. The phosphorescent host is a material for forming a phosphorescent emitting layer containing a phosphorescent dopant, but it does not mean that it cannot be used as a material for forming a fluorescent emitting layer. The same can be applied to the fluorescent host.

The content of the dopant material in the emitting layer is not particularly limited, but from the viewpoint of adequate luminescence and concentration quenching, it is preferable, for example, to be 0.1 to 70 mass %, more preferably 0.1 to 30 mass %, more preferably 1 to 30 mass %, still more preferably 1 to 20 mass %, and particularly preferably 1 to 10 mass %.

<Fluorescent Dopant>

As the fluorescent dopant, a fused polycyclic aromatic derivative, a styrylamine derivative, a fused ring amine derivative, a boron-containing compound, a pyrrole derivative, an indole derivative, a carbazole derivative can be given, for example. Among these, a fused ring amine derivative, a boron-containing compound, and a carbazole derivative are preferable.

As the fused ring amine derivative, a diaminopyrene derivative, a diaminochrysene derivative, a diaminoanthracene derivative, a diaminofluorene derivative, a diaminofluorene derivative with which one or more benzofuro skeletons are fused, and the like can be given.

As the boron-containing compound, a pyrromethene derivative, a triphenylborane derivative and the like can be given.

Examples of the blue fluorescent dopant include a pyrene derivative, a styrylamine derivative, a chrysene derivative, a fluoranthene derivative, a fluorene derivative, a diamine derivative, a triarylamine derivative, and the like. Specifically, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA) and the like can be given.

As the green fluorescent dopant, an aromatic amine derivative and the like can be given, for example. Specifically, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), and the like can be given.

As the red fluorescent dopant, a tetracene derivative, a diamine derivative or the like can be given. Specifically, N,N,N',N'-tetrakis(4-methylphenyl)tetracen-5,11-diamine (abbreviation: p-mPhTD), 7,14-diphenyl-N,N,N',N'-tetrakis(4-methylphenyl)acenaphtho[1,2-a]fluoranthen-3,10-diamine (abbreviation: p-mPhAFD) and the like can be given.

<Phosphorescent Dopant>

As the phosphorescent dopant, a phosphorescent light-emitting heavy metal complex and a phosphorescent light-emitting rare earth metal complex can be given.

As the heavy metal complex, an iridium complex, an osmium complex, a platinum complex and the like can be given. As the heavy metal complex, an ortho-metalated complex of a metal selected from iridium, osmium and platinum.

As the rare earth metal complexes include a terbium complex, a europium complex and the like. Specifically, tris(acetylacetonate)(monophenanthroline)terbium (III) (abbreviation: $Tb(acac)_3(Phen)$), tris(1,3-diphenyl-1,3-propandionate)(monophenanthroline)europium (III) (abbreviation: $Eu(DBM)_3(Phen)$), tris[1-(2-thenoyl)-3,3,3-trifluoroacetonate](monophenanthroline)europium (III) (abbreviation: $Eu(TTA)_3(Phen)$) and the like can be given. These rare earth metal complexes are preferable as phosphorescent dopants since rare earth metal ions emit light due to electronic transition between different multiplicity.

As the blue phosphorescent dopant, an iridium complex, an osmium complex, a platinum complex, or the like can be given, for example. Specific examples include bis[2-(4',6'-difluorophenyl)pyridinato-N,C2']iridium (III) tetrakis(1-pyrazolyl)borate (abbreviation: Flr6), bis[2-(4',6'-difluorophenyl)pyridinato-N,C2']iridium (III) picolinate (abbreviation: Flrpic), bis[2-(3',5'-bistrofluoromethylphenyl)pyridinato-N,C2']iridium (III) picolinate (abbreviation: $Ir(CF_3ppy)_2(pic)$), bis[2-(4',6'-difluorophenyl)pyridinato-N,C2']iridium (III) acetylacetonate (abbreviation: Flracac), and the like.

As the green phosphorescent dopant, an iridium complex or the like can be given, for example. Specific examples include tris(2-phenylpyridinato-N,C2')iridium (III) (abbreviation: $Ir(ppy)_3$), bis(2-phenylpyridinato-N,C2')iridium (III) acetylacetonate (abbreviation: $Ir(ppy)_2(acac)$), bis(1,2-diphenyl-1H benzimidazolate)iridium (III) acetylacetonate (abbreviation: $Ir(pbi)_2(acac)$), bis(benzo[h]quinolinato) iridium (III) acetylacetonate (abbreviation: $Ir(bzq)_2(acac)$), and the like.

As the red phosphorescent dopant, an iridium complex, a platinum complex, a terbium complex, a europium complex and the like can be given. Specifically, bis[2-(2'-benzo[4,5-a] thienyl)pyridinato-N,C3']iridium (III) acetylacetonate (abbreviation: $Ir(btp)_2(acac)$), bis(1-phenylisoquinolinato-N,C2')iridium (III) acetylacetonate (abbreviation: $Ir(piq)_2(acac)$), (acetylacetonate)bis[2,3-bis(4-fluorophenyl)quinoxalinato]iridium (III) (abbreviation: $Ir(Fdpq)_2(acac)$), 2,3,7,8,12,13,17,18-octaethyl-21H,23H-porphyrin platinum (II) (abbreviation: PtOEP), and the like.

<Host Material>

Examples of the host material include metal complexes such as an aluminum complex, a beryllium complex, and a zinc complex; heterocyclic compounds such as an indole derivative, a pyridine derivative, a pyrimidine derivative, a triazine derivative, a quinoline derivative, an isoquinoline derivative, a quinazoline derivative, a dibenzofuran derivative, a dibenzothiophene derivative, an oxadiazole derivative, a benzimidazole derivative, a phenanthroline derivative; fused aromatic compounds such as a naphthalene derivative, a triphenylene derivative, a carbazole derivative, an anthracene derivative, a phenanthrene derivative, a pyrene derivative, a chrysene derivative, a naphthacene derivative, and a fluoranthene derivative; and aromatic amine compounds such as a triarylamine derivative, and a fused polycyclic aromatic amine derivative, and the like. Plural types of host materials can be used in combination.

Specific examples of the metal complex include tris(8-quinolinolato)aluminum(III) (abbreviation: Alq), tris(4-methyl-8-quinolinolato)aluminum(III) (abbreviation: Almq3), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl) phenolato]zinc(II) (abbreviation: ZnBTZ), and the like.

Specific examples of the heterocyclic compound include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2', 2"-(1,3,5-benzenetriyl)tris(1-phenyl-1H-benzimidazole) (abbreviation: TPBI), bathophenanthroline (abbreviation: BPhen), bathocuproine (abbreviation: BCP), and the like.

Specific examples of the fused aromatic compound include 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3', 3"-(benzene-1,3,5-triyl)tripyrene (abbreviation: TPB3), 9,10-diphenylanthracene (abbreviation: DPAnth), 6,12-dimethoxy-5,11-diphenylchrysene, and the like.

Specific examples of the aromatic amine compound include N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4-bis[N-(9,9-dimethylfluoren-2-yl)-N-phenylamino]biphenyl (abbreviation: DFLDPBi), 4,4-bis[N-(spiro-9,9-bifluoren-2-yl)-N-phenylamino]biphenyl (abbreviation: BSPB), and the like.

As the fluorescent host material, a compound having a higher singlet energy level as compared with a fluorescent dopant is preferable. For example, a heterocyclic compound, a fused aromatic compound, and the like can be given. As fused aromatic compounds, for example, anthracene derivatives, pyrene derivatives, chrysene derivatives, and naphthacene derivatives are preferred.

As the phosphorescent host, a compound having a higher triplet energy level as compared with a phosphorescent dopant is preferable. For example, a metal complex, a heterocyclic compound, a fused aromatic compound and the like can be given. Among these, an indole derivative, a carbazole derivative, a pyridine derivative, a pyrimidine derivative, a triazine derivative, a quinoline derivative, an isoquinoline derivative, a quinazoline derivative, a dibenzofuran derivative, a dibenzothiophene derivative, a naphthalene derivative, a triphenylene derivative, a phenanthrene derivative, a fluoranthene derivative and the like are preferable.

(Electron-Transporting Layer)

An electron-transporting layer is a layer that comprises a substance having a high electron-transporting property. As the substance having a high electron-transporting property, a substance having an electron mobility of $10^{-6}$ $cm^2/Vs$ or more is preferable. For example, a metal complex, an aromatic heterocyclic compound, an aromatic hydrocarbon compound, a polymeric compound and the like can be given.

As the metal complex, an aluminum complex, a beryllium complex, a zinc complex and the like can be given. Specific examples of the metal complex include tris(8-quinolinolato) aluminum (III) (abbreviation: Alq), tris(4-methyl-8-quinolinolato)aluminum (abbreviation: Almq3), bis(10-hydroxybenzo[h]quinolinato)beryllium (abbreviation: BeBq2), bis(2-methyl-8-quinolinolato)(4-phenylphenolato)aluminum (III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl) phenolato] zinc(II) (abbreviation: ZnBTZ), and the like.

As the aromatic heterocyclic compound, imidazole derivatives such as a benzimidazole derivative, an imidazopyridine derivative and a benzimidazophenanthridine derivative; azine derivatives such as a pyrimidine derivative and a triazine derivative; compounds having a nitrogen-containing 6-membered ring structure such as a quinoline derivative, an isoquinoline derivative, and a phenanthroline derivative (also including one having a phosphine oxide-based substituent on the heterocyclic ring) and the like can be given. Specifically, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4-bis(5-methylbenzoxazol-2-yl)stilbene (abbreviation: BzOs), and the like can be given.

As the aromatic hydrocarbon compound, an anthracene derivative, a fluoranthene derivative and the like can be given, for example.

As specific examples of the polymeric compound, poly [(9,9-dihexylfluoren-2,7-diyl)-co-(pyridine-3,5-diyl)] (abbreviation: PF-Py), poly[(9,9-dioctylfluoren-2,7-diyl)-co-(2,2'-bipyridin-6,6'-diyl)] (abbreviation: PF-BPy) and the like can be given.

As long as a compound other than those mentioned above, that has a higher electron-transporting property as compared with hole-transporting property, such a compound may be used in the electron-transporting layer.

The electron-transporting layer may be a single layer, or a stacked layer of two or more layers. In this case, it is preferable to arrange a layer that contains a substance having a larger energy gap, among substances having a high electron-transporting property, on the side nearer to the emitting layer.

The electron-transporting layer may contain a metal such as an alkali metal, magnesium, an alkaline earth metal, or an alloy containing two or more of these metals; a metal compound such as an alkali metal compound such as 8-quinolinolato lithium (Liq), or an alkaline earth metal compound. When a metal such as an alkali metal, magnesium, an alkaline earth metal, or an alloy containing two or more of these metals is contained in the electron-transporting layer, the content of the metal is not particularly limited, but is preferably from 0.1 to 50 mass %, more preferably from 0.1 to 20 mass %, further preferably from 1 to 10 mass %.

When a metal compound such as an alkali metal compound or an alkaline earth metal compound is contained in the electron-transporting layer, the content of the metal compound is preferably from 1 to 99 mass %, more preferably from 10 to 90 mass %. When plural electron-transporting layers are provided, the layer on the emitting layer side can be formed only from the metal compound as mentioned above.

(Electron-Injecting Layer)

The electron-injecting layer is a layer that contains a substance having a high electron-injecting property, and has the function of efficiently injecting electrons from a cathode to an emitting layer. Examples of the substance that has a high electron-injecting property include an alkali metal, magnesium, an alkaline earth metal, a compound thereof, and the like. Specific examples thereof include lithium, cesium, calcium, lithium fluoride, cesium fluoride, calcium fluoride, lithium oxide, and the like. In addition, a material in which an alkali metal, magnesium, an alkaline earth metal, or a compound thereof is incorporated to an electron-transporting substance having an electron-transporting properly, for example, Alq incorporated with magnesium, may also be used.

Alternatively, a composite material that includes an organic compound and a donor compound may also be used in the electron-injecting layer. Such a composite material is excellent in the electron-injecting property and the electron-transporting property since the organic compound receives electrons from the donor compound.

The organic compound is preferably a substance excellent in transporting property of the received electrons, and specifically, for example, the metal complex, the aromatic heterocyclic compound, and the like, which are a substance that has a high electron-transporting properly as mentioned above, can be used.

Any material capable of donating electrons to an organic compound can be used as the donor compound. Examples thereof include an alkali metal, magnesium, an alkaline earth metal, a rare earth metal and the like. Specific examples thereof include lithium, cesium, magnesium, calcium, erbium, ytterbium, and the like. Further, an alkali metal oxide and an alkaline earth metal oxide are preferred, and examples thereof include lithium oxide, calcium oxide, barium oxide, and the like. Lewis bases such as magnesium oxide can also be used. Alternatively, an organic compound such as tetrathiafulvalene (abbreviation: TTF) can be used.

(Cathode)

For the cathode, a metal, an alloy, an electrically conductive compound, and a mixture thereof, each having a small work function (specifically, a work function of 3.8 eV or less) are preferably used. Specific examples of the material for the cathode include alkali metals such as lithium and cesium; magnesium; alkaline earth metals such as calcium, and strontium; alloys containing these metals (for example, magnesium-silver, and aluminum-lithium); rare earth metals such as europium and ytterbium; alloys containing a rare earth metal, and the like.

The cathode is usually formed by a vacuum vapor deposition or a sputtering method. Further, in the case of using a silver paste or the like, a coating method, an inkjet method, or the like can be employed.

In the case where the electron-injecting layer is provided, a cathode can be formed from a substance selected from various electrically conductive materials such as aluminum, silver, ITO, graphene, indium oxide-tin oxide containing silicon or silicon oxide, regardless of the work function value. These electrically conductive materials are made into films by using a sputtering method, an inkjet method, a spin coating method, or the like.

(Insulating Layer)

In the organic EL device, pixel defects based on leakage or a short circuit are easily generated since an electric field is applied to a thin film. In order to prevent this, an insulating thin layer may be inserted between a pair of electrodes.

Examples of substances used for the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, vanadium oxide, and the like. A mixture thereof may be used in the insulating layer, and a stacked body of a plurality of layers that include these substances can be also used for the insulating layer.

(Spacing Layer)

The spacing layer is a layer provided between a fluorescent emitting layer and a phosphorescent emitting layer when the fluorescent emitting layer and the phosphorescent emitting layer are stacked, in order to prevent diffusion of excitons generated in the phosphorescent emitting layer to the fluorescent emitting layer or in order to adjust the carrier balance. Further, the spacing layer can be provided between plural phosphorescent emitting layers.

Since the spacing layer is provided between the emitting layers, the material used for the spacing layer is preferably a substance that has both electron-transporting property and hole-transporting property. In order to prevent diffusion of the triplet energy in adjacent phosphorescent emitting layers, it is preferred that the material used for the spacing layer have a triplet energy of 2.6 eV or more.

As the material used for the spacing layer, the same materials as those used in the above-mentioned hole-transporting layer can be given.

(Electron-Blocking Layer, Hole-Blocking Layer, Exciton-Blocking Layer)

An electron-blocking layer, a hole-blocking layer, an exciton (triplet)-blocking layer, and the like may be provided in adjacent to the emitting layer.

The electron-blocking layer has a function of preventing leakage of electrons from the emitting layer to the hole-transporting layer. The hole-blocking layer has a function of preventing leakage of holes from the emitting layer to the electron-transporting layer. The exciton-blocking layer has a function of preventing diffusion of excitons generated in the emitting layer to the adjacent layers to confine the excitons within the emitting layer.

(Intermediate Layer)

In tandem-type organic EL device, an intermediate layer is provided.

(Method for Forming a Layer)

The method for forming each layer of the organic EL device is not particularly limited unless otherwise specified. As the film forming method, a known film-forming method such as a dry film-forming method, a wet film-forming method or the like can be used. Specific examples of the dry film-forming method include a vacuum deposition method, a sputtering method, a plasma method, an ion plating method, and the like. Specific examples of the wet film-forming method include various coating methods such as a spin coating method, a dipping method, a flow coating method, and an inkjet method.

(Film Thickness)

(Film Thickness)

The film thickness of each layer of the organic EL device is not particularly limited unless otherwise specified. If the film thickness is too small, defects such as pinholes are likely to occur to make it difficult to obtain an enough luminance. On the other hand, if the film thickness is too large, a high driving voltage is required to be applied, leading to a lowering in efficiency. In this respect, the film thickness is preferably 1 nm to 10 μm, and more preferably 1 nm to 0.2 μm.

[Electronic Apparatus]

The electronic apparatus according to one aspect of the invention includes the above-described organic EL device according to one aspect of the invention. Examples of the electronic apparatus include display parts such as an organic EL panel module; display devices of television sets, mobile phones, smart phones, personal computers, and the like; and emitting devices of a lighting device and a vehicle lighting device.

EXAMPLES

Next, the invention will be described in more detail by referring to Examples and Comparative Examples, but the invention is not limited in any way to the description of these Examples.

<Compounds>

The compounds represented by the formula (1) having a deuterium atom (host materials), which were used for fabricating the organic EL device of Examples 1 to 42 are as follows:

D-BH-1

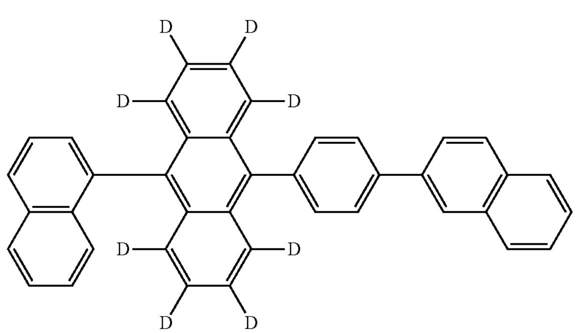

-continued

D-BH-2

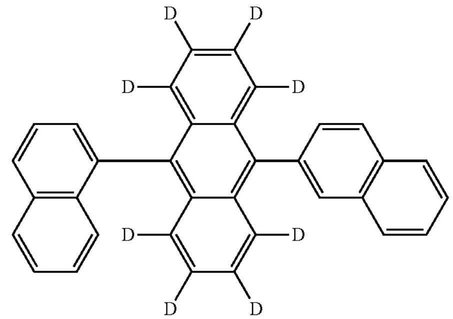

D-BH-4

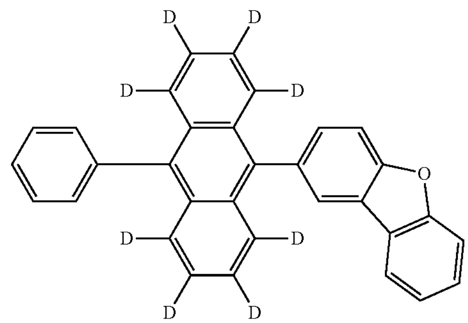

The compounds having no deuterium atom (host materials), which were used for fabricating the organic EL devices of Examples 1 to 42 and Comparative Examples 1 to 15 are as follows:

BH-1

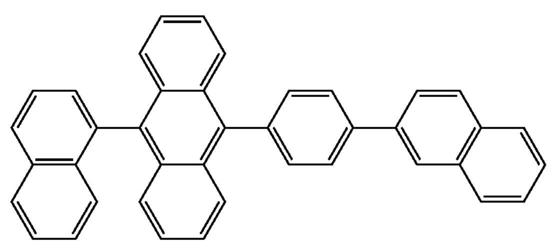

BH-2

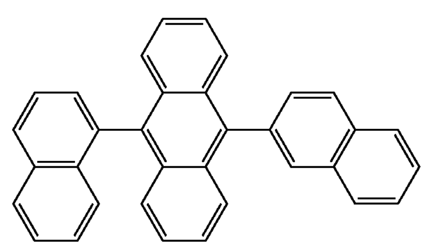

-continued
BH-3
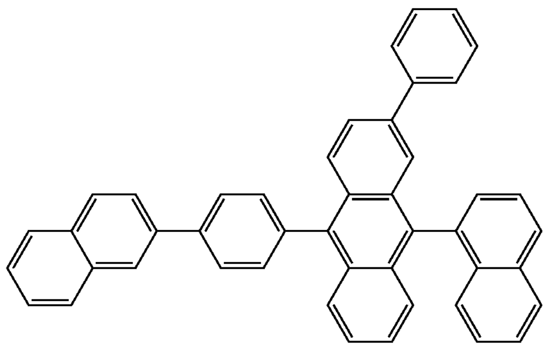
BH-4
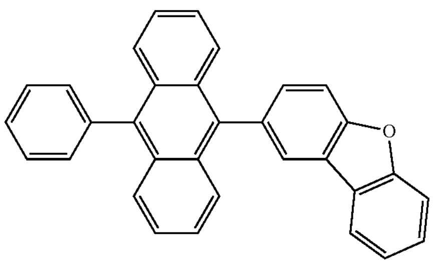
The dopant materials used for fabricating the organic EL devices of Examples 1 to 42 and Comparative Examples 1 to 15 are shown below.
BD-1
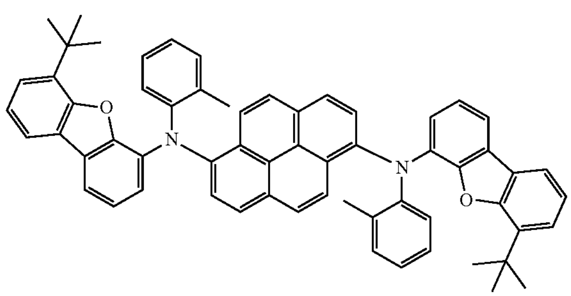
BD-2
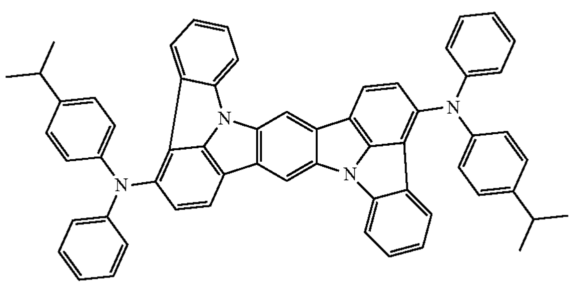
-continued
BD-3
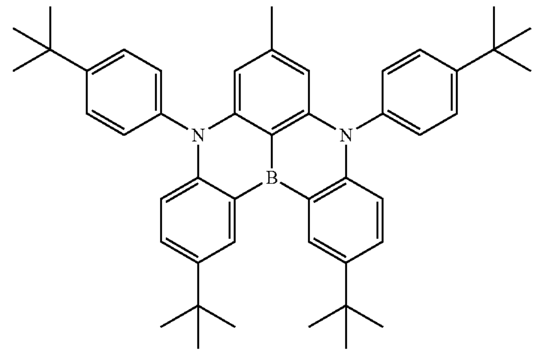
Other compounds used for fabricating the organic EL devices of Examples 1 to 42 and Comparative Examples 1 to 15 are shown below.
HI
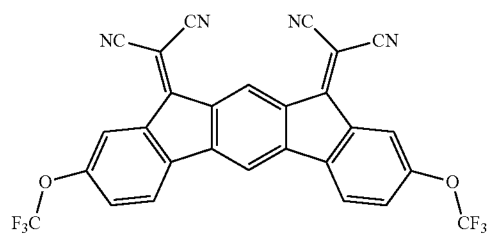
HA1
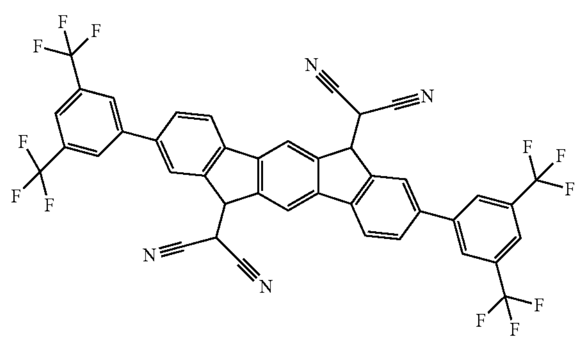
HT
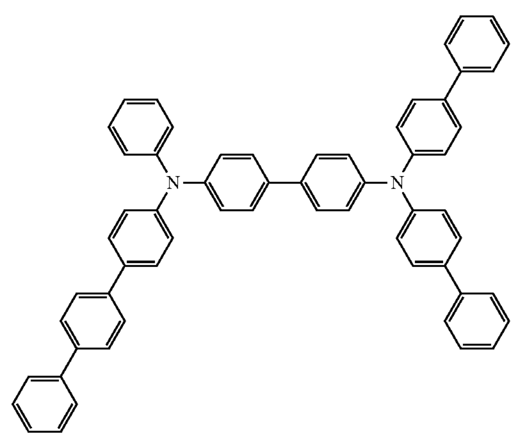

-continued
HT1
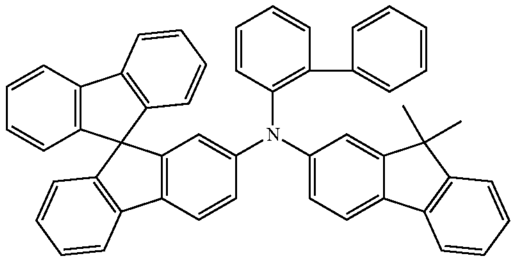
HT2
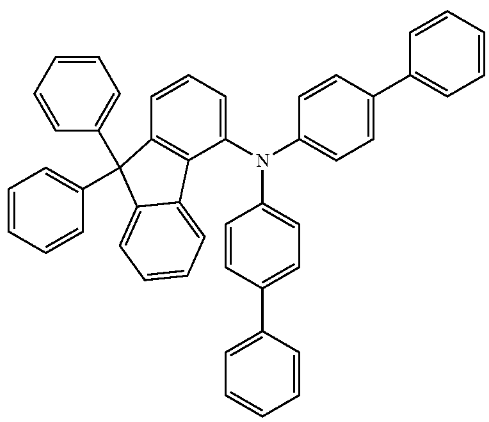
EBL
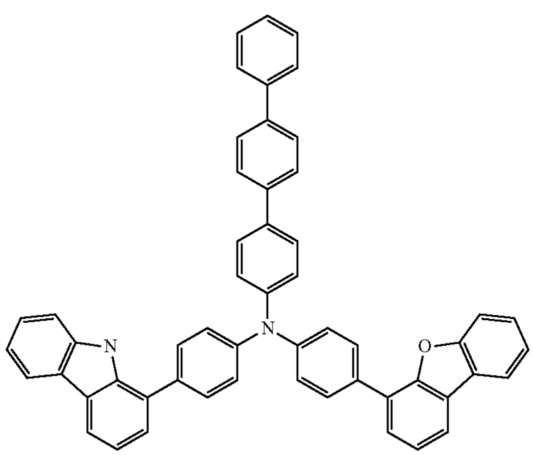
-continued
EBL-2
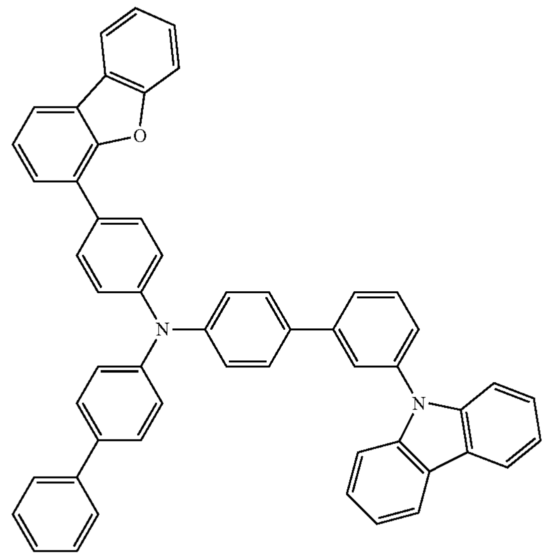
HBL
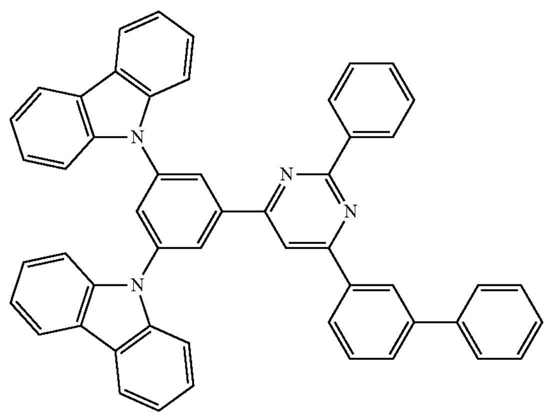
HBL-2
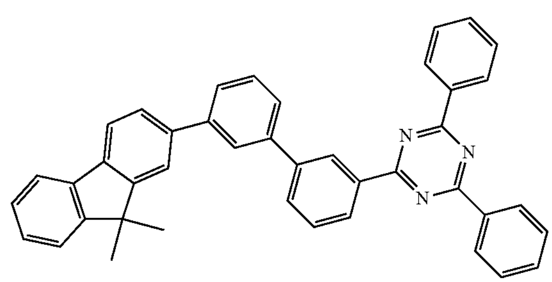
ET
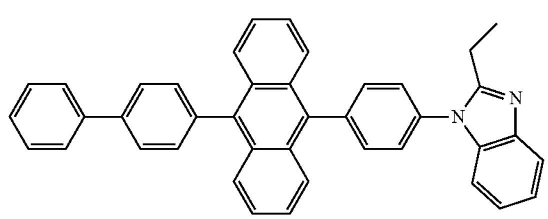

-continued

ET1

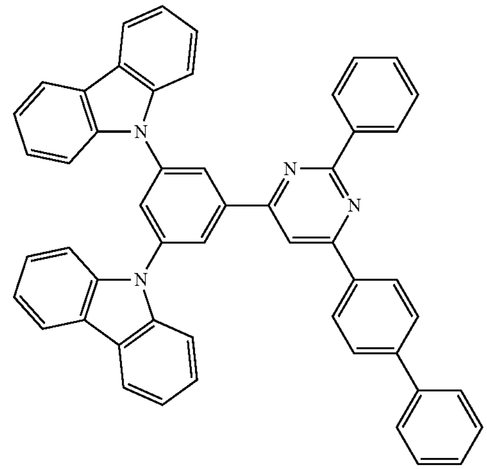

nCGL

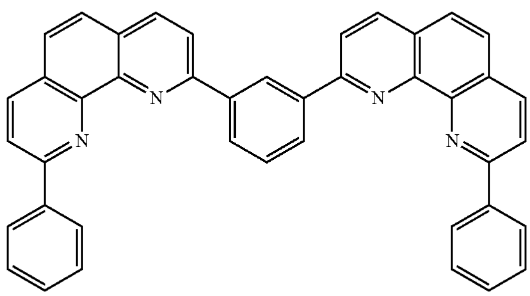

<Fabrication 1 of Organic EL Device>

An organic EL device was fabricated and evaluated as follows.

Example 1

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form a compound HI film having a thickness of 5 nm. This HI film functions as a hole-injecting layer.

Following the formation of the HI film, a compound HT was deposited to form a HT film having a thickness of 80 nm on the HI film. The HT film functions as a first hole-transporting layer.

Following the formation of the HT film, a compound EBL was deposited to form an EBL film having a thickness of 10 nm on the HT film. The EBL film functions as a second hole-transporting layer.

D-BH-1 (host material) and BD-1 (dopant material) were co-deposited on the EBL film so as to be 4% in a proportion (mass ratio) of BD-1 to form a first emitting layer having a thickness of 7.5 nm.

BH-1 (host material) and BD-1 (dopant material) were co-deposited on the first emitting layer to be 4% in a proportion (mass ratio) of BD-1 to form a second emitting layer having a thickness of 17.5 nm.

HBL was deposited on the second emitting layer to form an electron-transporting layer having a thickness of 10 nm. ET as an electron-injecting material was deposited on the electron-transporting layer to form an electron-injecting layer having a thickness of 15 nm. LiF was deposited on the electron-injecting layer to form a LiF film having a thickness of 1 nm. Al metal was deposited on the LiF film to form a metal cathode having a thickness of 80 nm.

As described above, an organic EL device was fabricated. The layer configuration of the device is as follows.

ITO(130 nm)/HI(5 nm)/HT(80 nm)/EBL(10 nm)/D-BH-1:BD-1(7.5 nm: 4%)/BH-1:BD-1(17.5 nm: 4%)/HBL(10 nm)/ET(15 nm)/LiF(1 nm)/Al(80 nm)

In parentheses, the numerical values in percentage indicate the proportion (% by mass) of the dopant material in the emitting layer.

(Evaluation 1 of Organic EL Device)

A voltage was applied to the obtained organic EL device so that the current density became 50 mA/cm$^2$, and the time until the luminance became 90% of the initial luminance (LT90 (unit: hours)) was measured. The results are shown in Table 1.

A voltage was applied to the obtained organic EL device so that the current density became 50 mA/cm$^2$, and the time until the luminance became 90% of the initial luminance (LT90 (unit: hours)) was measured. The results are shown in Table 1.

Comparative Example 1

The organic EL device was fabricated and evaluated in the same manner as in Example 1 except that the compounds shown in Table 1 were used as the host materials of the emitting layer. The results are shown in Table 1.

TABLE 1

| | First emitting layer (Thickness; nm) | Second emitting layer (Thickness; nm) | LT90 (h) |
|---|---|---|---|
| Example 1 | D-BH-1 (7.5) | BH-1 (17.5) | 335 |
| Comp. Ex. 1 | BH-1 (25) | | 291 |

Example 2 and Comparative Example 2

The organic EL devices were fabricated and evaluated in the same manner as in Example 1 except that the compounds shown in Table 2 were used as the host materials of the emitting layer. The results are shown in Table 2.

TABLE 2

| | First emitting layer (Thickness; nm) | Second emitting layer (Thickness; nm) | LT90 (h) |
|---|---|---|---|
| Example 2 | D-BH-2 (7.5) | BH-2 (17.5) | 398 |
| Comp. Ex. 2 | BH-2 (25) | | 299 |

From the results in Tables 1 and 2, it can be seen that the devices of Examples 1 and 2, in which the first emitting layer containing a host material having a deuterium atom and the second emitting layer containing a host material having no deuterium atom are stacked in the emitting region, have increased lifetime compared to the devices of Comparative Examples 1 and 2, which have a single emitting layer containing a host material having no deuterium atom.

The emitting layers of Examples 1 and 2 and the emitting layers of Comparative Examples 1 and 2 have the same thickness as the entire emitting layer. This indicates that even if D-BH-1 or D-BH-2, which are host materials having a deuterium atom is not contained in the entire emitting region, D-BH-1 or D-BH-2, which are host materials having a deuterium atom is contained in an emitting layer of a part of the emitting region, the lifetime of the device is increased.

<Fabrication 2 of Organic EL Device>

Example 3

A 25 mm×75 mm×1.1 mm-thick glass substrate with an ITO (Indium Tin Oxide) transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO transparent electrode was 130 nm.

The glass substrate with the transparent electrode after being cleaned was mounted onto a substrate holder in a vacuum vapor deposition apparatus. First, a compound HA1 was deposited on a surface on the side on which the transparent electrode was formed so as to cover the transparent electrode to form a hole-injecting layer (HI) having a thickness of 5 nm.

Following the formation of the hole-injecting layer, a compound HT1 was deposited to form a first hole-transporting layer (HT) having a thickness of 80 nm.

Following the formation of the first hole-transporting layer, a compound HT2 was deposited to form a second hole-transporting layer (also referred to as an electron barrier layer) (EBL) having a thickness of 10 nm.

A compound D-BH-1 (first host material (BH)) and a compound BD-2 (dopant material (BD)) were co-deposited on the second hole-transporting layer so as to be 4% by mass in a proportion of BD-2 to form a first emitting layer having a thickness of 10 nm.

A compound BH-3 (second host material (BH)) and a compound BD-2 (dopant material (BD)) were co-deposited on the first emitting layer so as to be 2% by mass in a proportion of BD-2 to form a second emitting layer having a thickness of 15 nm.

A compound ET-1 was deposited on the second emitting layer to form an electron-transporting layer having a thickness of 10 nm.

A compound nCGL and metal $L_1$ were co-deposited on the electron-transporting layer so as to be 4% by mass in a proportion of metal $L_1$ to form an electron-injecting layer having a thickness of 30 nm.

Metal Al was deposited on the electron-injecting layer to form a metal cathode having a thickness of 50 nm.

The schematic layer configuration of the device of Example 3 is as follows.

ITO(130)/HA1 (5)/HT1 (80)/HT2(10)/D-BH-1:BD-2(10, 98%:2%)/BH-3:BD-2(15,98%:2%)/ET1 (10)/nCGL:Li(30, 96%:4%)/Al(50))

The numerical values in parentheses indicate the thickness of the film (unit: nm).

Likewise, in parentheses, the numerical values in percentage (98%:2%) indicate the proportions (% by mass) of the first host material (compound BH1 or compound BH2) and compound BD1 in the first emitting layer and the second emitting layer, and the numerical values in percentage (96%:4%) indicate the proportion (% by mass) of compound nCGL and metal Li in the hole-injecting layer. The same notation is used below.

Example 4

The organic EL device of Example 4 was fabricated in the same manner as in Example 3 except that the compounds and the thicknesses of the first emitting layer and the second emitting layer of Example 3 are changed to those shown in Table 3.

Comparative Example 3

The organic EL device of Comparative Example 3 was fabricated in the same manner as in Example 3, except that the first emitting layer as described in Table 3 was formed.

(Evaluation 2 of Organic EL Device)

A voltage was applied to the organic EL devices obtained in Examples 3 to 4 and Comparative Example 3 so that the current density became 50 mA/cm$^2$, and the time until the luminance became 95% of the initial luminance (LT95 (unit: hours)) was measured. The results are shown in Table 3.

TABLE 3

| | First emitting layer | | | Second emitting layer | | | |
|---|---|---|---|---|---|---|---|
| | Host material | Dopant material | Thickness [nm] | Host material | Dopant material | Thickness [nm] | LT95 [hr] |
| Example 3 | D-BH-1 | BD-2 | 5 | BH-3 | BD-2 | 20 | 100 |
| Example 4 | D-BH-1 | BD-2 | 10 | BH-3 | BD-2 | 15 | 87 |
| Comp. Ex. 3 | BH-1 | BD-2 | 10 | BH-3 | BD-2 | 15 | 75 |

From the contrast between Example 4 and Comparative Example 3 in Table 3, which differ only in whether the host material in the first emitting layer has a deuterium atom or not, it can be seen that the device of Example 4 has an increased lifetime compared to the device of Comparative Example 3.

<Fabrication 3 of Organic EL Device>

Example 5

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form a compound HI film having a thickness of 5 nm. This HI film functions as a hole-injecting layer.

Following the formation of the HI film, a compound HT was deposited to form a HT film having a thickness of 80 nm on the HI film. The HT film functions as a first hole-transporting layer.

Following the formation of the HT film, a compound EBL-2 was deposited to form a EBL-2 film having a thickness of 10 nm on the HT film. The EBL-2 film functions as a second hole-transporting layer.

D-BH-1 (host material) and BD-1 (dopant material) were co-deposited on the EBL-2 film so as to be 4% in a proportion (mass ratio) of BD-1 to form a first emitting layer having a thickness of 7.5 nm.

BH-1 (host material) and BD-1 (dopant material) were co-deposited on the first emitting layer so as to be 4% in a proportion (mass ratio) of BD-1 to form a second emitting layer having a thickness of 17.5 nm.

HBL-2 was deposited on the second emitting layer to form an electron-transporting layer having a thickness of 10 nm. ET as an electron-injecting material was deposited on the electron-transporting layer to form an electron-injecting layer having a thickness of 15 nm. LiF was deposited on the electron-injecting layer to form a LiF film having a thickness of 1 nm. Metal Al was deposited on the LiF film to form a metal cathode having a thickness of 80 nm.

As described above, an organic EL device was fabricated. The layer configuration of the device is as follows.

ITO(130 nm)/HI(5 nm)/HT(80 nm)/EBL-2(10 nm)/D-BH-1:BD-1 (7.5 nm:4%)/BH-1:BD-1(17.5 nm:4%)/HBL-2(10 nm)/ET(15 nm)/LiF(1 nm)/Al(80 nm)

In parentheses, the numerical values in percentage indicate the proportion (% by mass) of the dopant material in the emitting layer.

Examples 6 to 11, and Comparative Examples 4 and 5

The organic EL devices were fabricated in the same manner as in Example 5 except that the compounds shown in Table 4 were used as the host material of the emitting layer and the thickness of each emitting layer were changed as shown in Table 4.

(Evaluation 3 of Organic EL Device)

A voltage was applied to the obtained organic EL device so that the current density became 50 mA/cm$^2$, and the time until the luminance became 90% of the initial luminance (LT90 (unit: hours)) was measured. With the value of LT90 of the device of Comparative Example 4 which has a single emitting layer containing a host material having no deuterium atom as 1, the relative values of LT90 of Examples and Comparative Examples are shown in Table 4.

TABLE 4

| | First emitting layer Host material: D-BH-1 Thickness (nm) | Second emitting layer Host material: BH-1 Thickness (nm) | Relative value LT90 |
|---|---|---|---|
| Example 5 | 7.5 | 17.5 | 1.11 |
| Example 6 | 10 | 15 | 1.14 |
| Example 7 | 12.5 | 12.5 | 1.14 |
| Example 8 | 15 | 10 | 1.14 |
| Example 9 | 17.5 | 7.5 | 1.14 |
| Example 10 | 20 | 5 | 1.14 |
| Example 11 | 22.5 | 2.5 | 1.14 |
| Comp. Ex. 4 | 0 | 25 | 1.00 |
| Comp. Ex. 5 | 25 | 0 | 1.14 |

From the results shown in Table 4, it can be seen that the devices of Examples 5 to 11 in which the first emitting layer containing the host material D-BH-1 having a deuterium atom and the second emitting layer containing the host material BH-1 having no deuterium atom are stacked in the emitting region have increased lifetime compared with the device of Comparative Example 4 in which a single emitting layer containing the host material BH-1 having no deuterium atom is provided.

In addition, it can be seen that the devices of Examples 6 to 11 have a lifetime equivalent to that of the device of Comparative Example 5 having a single emitting layer containing the host material D-BH-1 having a deuterium atom.

Example 12

The organic EL device was fabricated in the same manner as in Example 5 except that the host material of the first emitting layer was changed to D-BH-2, the host material of the second emitting layer was changed to BH-2, and the thickness of each emitting layer was set to the thickness shown in Table 5, and evaluated in the same manner as in Example 5. The results are shown in Table 5.

The layer configuration of the device fabricated as described above is as follows. ITO(130 nm)/HI(5 nm)/HT (80 nm)/EBL-2(10 nm)/D-BH-2:BD-1(2.5 nm:4%)/BH-2:BD-1(22.5 nm:4%)/HBL-2(10 nm)/ET(15 nm)/LiF(1 nm)/Al(80 nm)

In parentheses, the numerical values in percentage indicate the proportion (% by mass) of the dopant material in the emitting layer.

Examples 13 to 20, and Comparative Examples 6 and 7

The organic EL devices were fabricated in the same manner as in Example 12, except that the compounds shown in Table 5 were used as the host materials for the emitting layers and the thickness of each emitting layer was set to the thickness shown in Table 5, and evaluated in the same manner as in Example 5. The results are shown in Table 5.

TABLE 5

| | First emitting layer Host material: D-BH-2 Thickness (nm) | Second emitting layer Host material: BH-2 Thickness (nm) | Relative value LT90 |
|---|---|---|---|
| Example 12 | 2.5 | 22.5 | 1.1 |
| Example 13 | 5 | 20 | 1.14 |
| Example 14 | 7.5 | 17.5 | 1.25 |
| Example 15 | 10 | 15 | 1.25 |
| Example 16 | 12.5 | 12.5 | 1.25 |
| Example 17 | 15 | 10 | 1.25 |
| Example 18 | 17.5 | 7.5 | 1.25 |
| Example 19 | 20 | 5 | 1.25 |
| Example 20 | 22.5 | 2.5 | 1.25 |
| Comp. Ex. 6 | 0 | 25 | 1.00 |
| Comp. Ex. 7 | 25 | 0 | 1.25 |

From the results in Table 5, it can be seen that the devices of Examples 12 to 20, in which the first emitting layer containing the host material D-BH-2 having a deuterium atom and the second emitting layer containing the host material BH-2 having no deuterium atom are stacked in the emitting region, have an increased lifetime compared to the device of Comparative Example 6 having a single emitting layer containing the host material BH-2 having no deuterium atom.

It can also be seen that the devices of Examples 14 to 20 have the same lifetime as the device of Comparative Example 7 having a single emitting layer containing the host material D-BH-2 having a deuterium atom.

Example 21

The organic EL device was fabricated in the same manner as in Example 1, except that the dopant materials in the first and second emitting layers were changed to BD-2, the proportion of BD-2 was changed to 2% by mass, and the thickness of each emitting layer was set to the thickness shown in Table 6, and evaluated in the same manner as in Example 5. The results are shown in Table 6.

The layer configuration of the device fabricated as described above is as follows.

ITO(130 nm)/HI(5 nm)/HT(80 nm)/EBL (10 nm)/D-BH-1: BD-2(5 nm:2%)/BH-1:BD-2(20 nm:2%)/HBL (10 nm)/ET (15 nm)/LiF(1 nm)/Al(80 nm)

In parentheses, the numerical values in percentage indicate the proportion (% by mass) of the dopant material in the emitting layer.

Examples 22 to 28 and Comparative Example 8

The organic EL devices were fabricated and evaluated in the same manner as in Example 21, except that the compounds shown in Table 6 were used as host materials for the emitting layers and the thickness of each emitting layer was set to the thickness shown in Table 6. The results are shown in Table 6.

TABLE 6

| | First emitting layer Host material: D-BH-1 Thickness (nm) | Second emitting layer Host material: BH-1 Thickness (nm) | Relative value LT90 |
|---|---|---|---|
| Example 21 | 5 | 20 | 1.10 |
| Example 22 | 7.5 | 17.5 | 1.10 |
| Example 23 | 10 | 15 | 1.10 |
| Example 24 | 12.5 | 12.5 | 1.10 |
| Example 25 | 15 | 10 | 1.13 |
| Example 26 | 17.5 | 7.5 | 1.13 |
| Example 27 | 20 | 5 | 1.13 |
| Example 28 | 22.5 | 2.5 | 1.13 |
| Comp. Ex. 8 | 0 | 25 | 1.00 |

From the results in Table 6, it can be seen that even when the dopant material of the emitting layer is changed to BD-2, the devices of Examples 21 to 28, in which the first emitting layer containing the host material D-BH-1 having a deuterium atom and the second emitting layer containing the host material BH-1 having no deuterium atom are stacked, have an increased lifetime compared to the device of Comparative Example 8, which has a single emitting layer containing the host material BH-1 having no deuterium atom.

Example 29

The organic EL device was fabricated in the same manner as in Example 1, except that the dopant materials in the first and second emitting layers were changed to BD-3, the proportion of BD-3 was changed to 2% by mass, and the thickness of each emitting layer was set to the thickness shown in Table 7, and evaluated in the same manner as in Example 5. The results are shown in Table 7.

The layer configuration of the device fabricated as described above is as follows.

ITO(130 nm)/HI(5 nm)/HT(80 nm)/EBL (10 nm)/D-BH-1: BD-3(5 nm:2%)/BH-1:BD-3(20 nm:2%)/HBL (10 nm)/ET (15 nm)/LiF(1 nm)/Al(80 nm)

In parentheses, the numerical values in percentage indicate the proportion (% by mass) of the dopant material in the emitting layer.

Examples 30 to 36 and Comparative Example 9

The organic EL devices were fabricated and evaluated in the same manner as in Example 29, except that the compounds shown in Table 7 were used as the host materials for the emitting layers and the thickness of each emitting layer was set to the thickness shown in Table 7. The results are shown in Table 7.

TABLE 7

| | First emitting layer Host material: D-BH-1 Thickness (nm) | Second emitting layer Host material: BH-1 Thickness (nm) | Relative value LT90 |
|---|---|---|---|
| Example 29 | 5 | 20 | 1.11 |
| Example 30 | 7.5 | 17.5 | 1.11 |
| Example 31 | 10 | 15 | 1.11 |
| Example 32 | 12.5 | 12.5 | 1.11 |
| Example 33 | 15 | 10 | 1.14 |
| Example 34 | 17.5 | 7.5 | 1.14 |
| Example 35 | 20 | 5 | 1.14 |
| Example 36 | 22.5 | 2.5 | 1.14 |
| Comp. Ex. 9 | 0 | 25 | 1.00 |

From the results in Table 7, it can be seen that even when the dopant material of the emitting layer is changed to BD-3, the devices of Examples 29 to 36, in which the first emitting layer containing the host material D-BH-1 having a deuterium atom and the second emitting layer containing the host material BH-1 having no deuterium atom are stacked, have an increased lifetime compared to the device of Comparative Example 9, which has a single emitting layer containing the host material BH-1 having no deuterium atom.

Example 37

The organic EL device was fabricated in the same manner as in Example 1, except that the host material of the second emitting layer was changed to BH-2 and the thicknesses of the first and second emitting layers was each set to 12.5 nm, and evaluated in the same manner as in Example 5. The results are shown in Table 8.

The layer configuration of the device fabricated as described above is as follows.

ITO(130 nm)/HI(5 nm)/HT(80 nm)/EBL(10 nm)/D-BH-1: BD-1(12.5 nm:4%)/BH-2:BD-1(12.5 nm:4%)/HBL(10 nm)/ET(15 nm)/LiF(1 nm)/Al(80 nm)

In parentheses, the numerical values in percentage indicate the proportion (% by mass) of the dopant material in the emitting layer.

Comparative Examples 10 and 11

The organic EL devices were fabricated and evaluated in the same manner as in Example 37, except that the compounds shown in Table 8 were used as the host materials for the emitting layers. The results are shown in Table 8.

TABLE 8

| | Host material of First emitting layer (Thickness: 12.5 nm) | Host material of Second emitting layer (Thickness: 12.5 nm) | Relative value LT90 |
|---|---|---|---|
| Example 37 | D-BH-1 | BH-2 | 1.14 |
| Comp. Ex. 10 | BH-1 | BH-2 | 1.00 |
| Comp. Ex. 11 | D-BH-1 | D-BH-2 | 1.14 |

From the results shown in Table 8, it can be seen that the device of Example 37 in which the first emitting layer contains the host material D-BH-1 having a deuterium atom and the second emitting layer contains a host material BH-2 having a different structure from that of the host material D-BH-1 of the first emitting layer, has an increased lifetime compared to the device of Comparative Example 10, in which the first emitting layer contains the host material BH-1 having no deuterium atom and the second emitting layer contains the host material BH-2.

It can also be seen that the device of Example 37 has a device lifetime equivalent to that of Comparative Example 11 in which the first and second emitting layers contain the host materials D-BH-1 and D-BH-2 having a deuterium atom, respectively.

Example 38

The organic EL device was fabricated in the same manner as in Example 1, except that the host material of the first emitting layer was changed to D-BH-2 and the thicknesses of the first and second emitting layers were each set to 12.5 nm, and evaluated in the same manner as in Example 5. The results are shown in Table 9.

The layer configuration of the device fabricated as described above is as follows.

ITO(130 nm)/HI(5 nm)/HT(80 nm)/EBL(10 nm)/D-BH-2:BD-1(12.5 nm:4%)/BH-1:BD-1(12.5 nm:4%)/HBL(10 nm)/ET(15 nm)/LiF(1 nm)/Al(80 nm)

In parentheses, the numerical values in percentage indicate the proportion (% by mass) of the dopant material in the emitting layer.

Comparative Examples 12 and 13

The organic EL devices were fabricated and evaluated in the same manner as in Example 38, except that the compounds shown in Table 9 were used as the host materials for the emitting layer. The results are shown in Table 9.

TABLE 9

| | Host material of First emitting layer (Thickness: 12.5 nm) | Host material of Second emitting layer (Thickness: 12.5 nm) | Relative value LT90 |
|---|---|---|---|
| Example 38 | D-BH-2 | BH-1 | 1.27 |
| Comp. Ex. 12 | BH-2 | BH-1 | 1.00 |
| Comp. Ex. 13 | D-BH-2 | D-BH-1 | 1.27 |

From the results shown in Table 9, it can be seen that the device of Example 38, in which the first emitting layer contains the host material D-BH-2 having a deuterium atom and the second emitting layer contains the host material BH-1 having a different structure from the host material D-BH-2 of the first emitting layer, has an increased lifetime compared to the device of Comparative Example 12, in which the first emitting layer contains the host material BH-2 having no deuterium atom and the second emitting layer contains the host material BH-1.

It can also be seen that the device of Example 38 has a device lifetime equivalent to that of Comparative Example 13 in which the first and second emitting layers contain the host materials D-BH-2 and D-BH-1 having a deuterium atom, respectively.

Example 39

The organic EL devices were fabricated in the same manner as in Example 5, except that the host material of the first emitting layer was changed to D-BH-4, the host material of the second emitting layer was changed to BH-2, and the thicknesses of the first and second emitting layers were each set to 12.5 nm, and evaluated in the same manner as in Example 5. The results are shown in Table 10.

The layer configuration of the device fabricated as described above is as follows.

ITO(130 nm)/HI(5 nm)/HT(80 nm)/EBL-2 (10 nm)/D-BH-4:BD-1(12.5 nm:4%)/BH-2:BD-1(12.5 nm:4%)/HBL-2 (10 nm)/ET(15 nm)/LiF(1 nm)/Al(80 nm)

In parentheses, the numerical values in percentage indicate the proportion (% by mass) of the dopant material in the emitting layer.

Example 40 and Comparative Example 14

The organic EL devices were fabricated and evaluated in the same manner as in Example 39, except that the compounds shown in Table 10 were used as the host materials for the emitting layers.

The results are shown in Table 10.

TABLE 10

| | Host material of First emitting layer (Thickness: 12.5 nm) | Host material of Second emitting layer (Thickness: 12.5 nm) | Relative value LT90 |
|---|---|---|---|
| Example 39 | D-BH-4 | BH-2 | 1.18 |
| Example 40 | BH-4 | D-BH-2 | 1.15 |
| Comp. Ex. 14 | BH-4 | BH-2 | 1.00 |

From the results in Table 10, it can be seen that the device of Example 39, in which the first emitting layer contains a host material D-BH-4 having a deuterium atom and the second emitting layer contains a host material BH-2 having a different structure from that of the host material D-BH-4 in the first emitting layer, has an increased lifetime compared to the device of Comparative Example 14, in which the first emitting layer contains the host material BH-4 having no deuterium atom and the second emitting layer contains the host material BH-2.

It can also be seen that the device of Example 40, which contains host material BH-4 having no deuterium atom in the first emitting layer and host material D-BH-2 having deuterium atoms in the second emitting layer, has an increased lifetime compared to the device of Comparative Example 14.

Example 41

The organic EL device was fabricated in the same manner as in Example 5, except that the host material of the second emitting layer was changed to BH-4 and the thicknesses of the first and second emitting layers were each set to 12.5 nm, and evaluated in the same manner as in Example 5. The results are shown in Table 11.

The layer configuration of the device fabricated as described above is as follows.

ITO(130 nm)/HI(5 nm)/HT(80 nm)/EBL-2 (10 nm)/D-BH-1:BD-1(12.5 nm:4%)/BH-4:BD-1(12.5 nm:4%)/HBL-2 (10 nm)/ET(15 nm)/LiF(1 nm)/Al(80 nm)

In parentheses, the numerical values in percentage indicate the proportion (% by mass) of the dopant material in the emitting layer.

Example 42 and Comparative Example 15

The organic EL devices were fabricated and evaluated in the same way as in Example 41, except that the compounds shown in Table 11 were used as the host materials for the emitting layer. The results are shown in Table 11.

TABLE 11

| | Host material of First emitting layer (Thickness: 12.5 nm) | Host material of Second emitting layer (Thickness: 12.5 nm) | Relative value LT90 |
|---|---|---|---|
| Example 41 | D-BH-1 | BH-4 | 1.13 |
| Example 42 | BH-1 | D-BH-4 | 1.09 |
| Comp. Ex. 15 | BH-1 | BH-4 | 1.00 |

From the results in Table 11, it can be seen that the device of Example 41, in which the first emitting layer contains the host material D-BH-1 having a deuterium atom and the second emitting layer contains the host material BH-4 having a different structure from that of the host material D-BH-1 of the first emitting layer, has an increased lifetime compared to the device of Comparative Example 15, which contains the host material BH-1 having no deuterium atom in the first emitting layer and a host material BH-4 in the second emitting layer.

It can also be seen that the device of Example 42, in which the first emitting layer contains the host material BH-1 having no deuterium atom and the second emitting layer contains the host material D-BH-4 having a deuterium atom, has an increased lifetime compared to the device of Comparative Example 15.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The invention claimed is:

1. An organic electroluminescence device comprising:
an anode,
a cathode, and
an emitting region between the anode and the cathode, wherein
the emitting region comprises a first emitting layer and a second emitting layer,
the first emitting layer is between the anode and the second emitting layer, and
one of the first emitting layer and the second emitting layer comprises a compound represented by the following formula (1) having at least one deuterium atom, and the other of the first emitting layer and the second emitting layer comprises a compound represented by the following formula (1'):

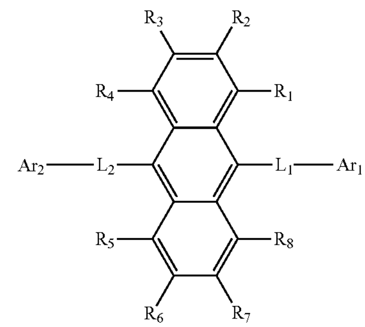

(1)

wherein in the formula (1),
$R_1$ to $R_8$ are independently
a hydrogen atom,
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—$Si(R_{901})(R_{902})(R_{903})$,
—O—$(R_{904})$,
—S—$(R_{905})$,
—$N(R_{906})(R_{907})$,
a halogen atom, a cyano group, or a nitro group,
$R_{901}$ to $R_{907}$ are independently
a hydrogen atom,
an unsubstituted alkyl group including 1 to 50 carbon atoms,
an unsubstituted cycloalkyl group including 3 to 50 ring carbon atoms,
an unsubstituted aryl group including 6 to 50 ring carbon atoms, or
an unsubstituted monovalent heterocyclic group including 5 to 50 ring atoms;
when two or more of each of $R_{901}$ to $R_{907}$ are present, the two or more of each of $R_{901}$ to $R_{907}$ are the same as or different from each other,
adjacent two or more of $R_1$ to $R_4$, and adjacent two or more of $R_5$ to $R_8$ do not form a ring by bonding with each other,
$L_1$ and $L_2$ are independently
a single bond,
an unsubstituted arylene group including 6 to 30 ring carbon atoms, or
an unsubstituted divalent heterocyclic group including 5 to 30 ring atoms,
$Ar_1$ and $Ar_2$ are independently
an unsubstituted phenyl group,
an unsubstituted biphenyl group,
an unsubstituted naphthyl group, or
an unsubstituted dibenzofuranyl group,
and
at least one hydrogen atom selected from the following is a deuterium atom:
hydrogen atoms of $R_1$ to $R_8$ in the case where they are hydrogen atoms, and
hydrogen atoms possessed by one or more groups selected from $R_1$ to $R_8$ which are not hydrogen atoms, $L_1$ which is not a single bond, $L_2$ which is not a single bond, and $Ar_1$ and $Ar_2$; and

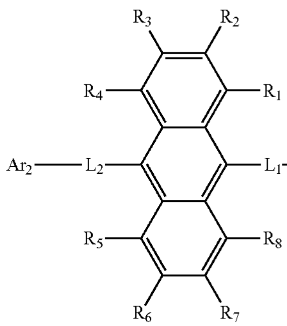

(1')

wherein in the formula (1'), $R_1$ to $R_8$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, and a nitro group, $R_{901}$ to $R_{907}$ are independently a hydrogen atom, an unsubstituted alkyl group including 1 to 50 carbon atoms, an unsubstituted cycloalkyl group including 3 to 50 ring carbon atoms, an unsubstituted aryl group including 6 to 50 ring carbon atoms, or an unsubstituted monovalent heterocyclic group including 5 to 50 ring atoms, when two or more of each of $R_{901}$ to $R_{907}$ are present, the two or more of each of $R_{901}$ to $R_{907}$ are the same as or different from each other, adjacent two or more of $R_1$ to $R_4$, and adjacent two or more of $R_5$ to $R_8$ do not form a ring by bonding with each other, $L_1$ and $L_2$ are independently a single bond, an unsubstituted arylene group including 6 to 30 ring carbon atoms, or an unsubstituted divalent heterocyclic group including 5 to 30 ring atoms, and $Ar_1$ and $Ar_2$ are independently an unsubstituted phenyl group, an unsubstituted biphenyl group, an unsubstituted naphthyl group, or an unsubstituted dibenzofuranyl group wherein the compound represented by formula (1') substantially has no deuterium atom, and $L_1$-$Ar_1$ in the compound represented by the formula (1) has the same chemical structure as $L_1$-$Ar_1$ in the compound represented by the formula (1') except that when $L_1$-$Ar_1$ in the compound represented by the formula (1) comprises at least one deuterium atom, each of such at least one deuterium atom in $L_1$-$Ar_1$ of the compound represented by the formula (1) is replaced by a protium atom in $L_1$-$Ar_1$ of the compound represented by the formula (1').

2. The organic electroluminescence device according to claim 1, wherein the first emitting layer and the second emitting layer are directly adjacent to each other.

3. The organic electroluminescence device according to claim 1, wherein the compounds represented by each of the formulas (1) and (1') are host materials.

4. The organic electroluminescence device according to claim 1, wherein the first emitting layer and the second emitting layer independently comprise a dopant material.

5. The organic electroluminescence device according to claim 1, wherein at least one of the hydrogen atoms bonded to the carbon atom on the anthracene skeleton in the formula (1) is a deuterium atom.

6. The organic electroluminescence device according to claim 2, wherein at least one of the hydrogen atoms bonded to carbon atoms other than the carbon atom on the anthracene skeleton is a deuterium atom.

7. The organic electroluminescence device according to claim 1, wherein the first emitting layer comprises the compound represented by the formula (1), and the second emitting layer comprises the compound represented by the formula (1').

8. The organic electroluminescence device according to claim 1, wherein the chemical structure when deuterium atoms of the compound represented by the formula (1) are replaced with protium atoms is the same as the chemical structure of the compound represented by the formula (1').

9. The organic electroluminescence device according to claim 2, wherein at least one of the first emitting layer and the second emitting layer is an emitting layer comprising two or more kinds of a host material.

10. The organic electroluminescence device according to claim 1, wherein both of the first emitting layer and the second emitting layer are fluorescent emitting layers.

11. The organic electroluminescence device according to claim 1, wherein the emitting region further comprises another emitting region via a charge generation layer.

12. The organic electroluminescence device according to claim 11, wherein the another emitting region comprises a third emitting layer and a fourth emitting layer, the third emitting layer is between the anode and the fourth emitting layer, one of the third emitting layer and the fourth emitting layer comprises the compound represented by the following formula (1) having at least one deuterium atom, and another comprises the compound represented by the following formula (1').

13. The organic electroluminescence device according to claim 12, wherein the third emitting layer and the fourth emitting layer are directly adjacent to each other.

14. The organic electroluminescence device according to claim 1, wherein in the formulas (1) and (1'), each $L_1$ is a single bond, and each $Ar_1$ is an unsubstituted phenyl group, an unsubstituted biphenyl group, or an unsubstituted naphthyl group.

15. The organic electroluminescence device according to claim 1, wherein in the formulas (1) and (1'), each $L_1$ is an unsubstituted phenylene group or an unsubstituted naphthylene group, and each $Ar_1$ is an unsubstituted phenyl group or an unsubstituted naphthyl group.

16. The organic electroluminescence device according to claim 1, wherein in the formula (1), all of the following hydrogen atoms are deuterium atoms:

hydrogen atoms of $R_1$ to $R_8$ in the case where they are hydrogen atoms, and hydrogen atoms possessed by the groups of $R_1$ to $R_8$ which are not hydrogen atoms, $L_1$ which is not a single bond, $L_2$ which is not a single bond, and $Ar_1$ and $Ar_2$.

17. The organic electroluminescence device according to claim 1, wherein the compound represented by the formula (1) and the compound represented by the formula (1') are independently a compound having a skeleton selected from the following skeletons:

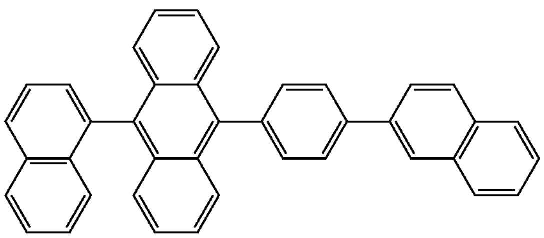

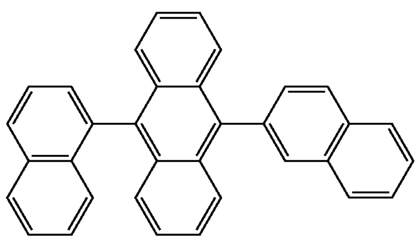

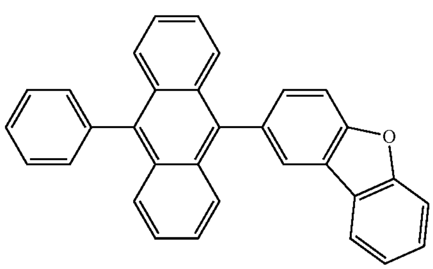

.

18. The organic electroluminescence device according to claim wherein the compound represented by the formula (1) is one or more compounds selected from the group consisting of:

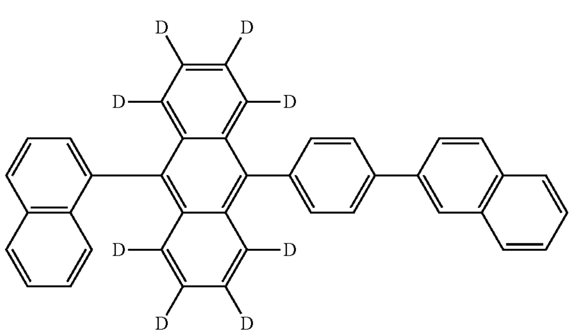

-continued

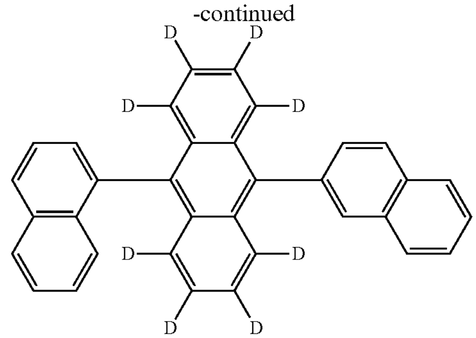

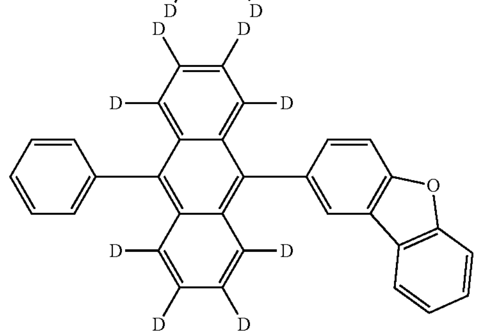

wherein "D" represents a deuterium atom, and the compound represented by the formula (1') is one or more compounds selected from the group consisting of:

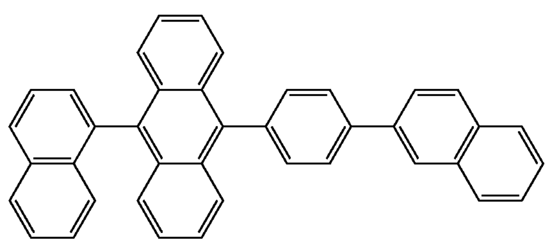

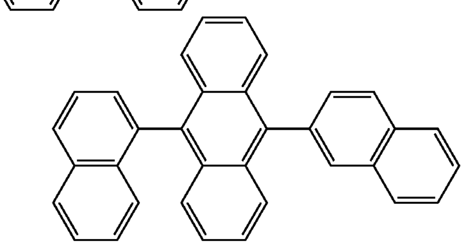

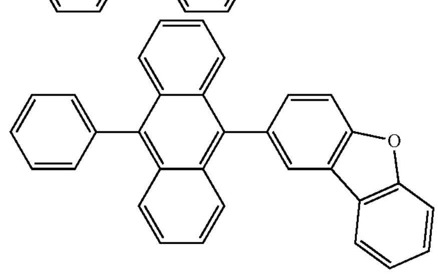

.

19. The organic electroluminescence device according to claim 4, wherein the dopant material is a fluorescent dopant material.

20. The organic electroluminescence device according to claim 4, wherein the dopant material is selected from the group consisting of compounds represented by each of the following formulas (11), (21), (31), (41), (51), (61), (71), (81), and (91):

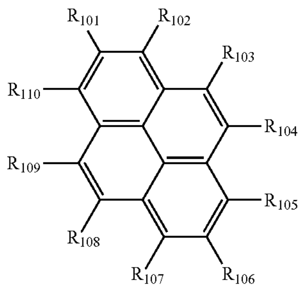

(11)

wherein in the formula (11), one or more sets of adjacent two or more of $R_{101}$ to $R_{110}$ form an unsubstituted, saturated or unsaturated ring by bonding with each other, or do not form an unsubstituted, saturated or unsaturated ring, at least one of $R_{101}$ to $R_{110}$ is a monovalent group represented by the following formula (12), $R_{101}$ to $R_{110}$ which do not form an unsubstituted, saturated or unsaturated ring, and are not a monovalent group represented by the following formula (12) are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, $R_{901}$ to $R_{907}$ are as defined in the formula (1),

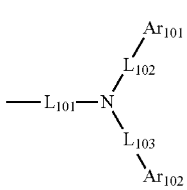

(12)

wherein in the formula (12), $Ar_{101}$ and $Ar_{102}$ are independently an unsubstituted aryl group including 6 to 50 ring carbon atoms, or an unsubstituted monovalent heterocyclic group including 5 to 50 ring atoms, and $L_{101}$ to $L_{103}$ are independently a single bond, an unsubstituted arylene group including 6 to 30 ring carbon atoms, or an unsubstituted divalent heterocyclic group including 5 to 30 ring atoms;

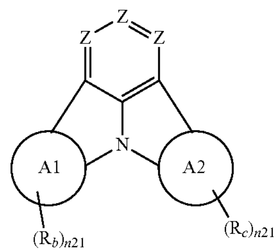

(21)

wherein in the formula (21),

Z's are independently $CR_a$ or N, ring A1 and ring A2 are independently an unsubstituted aromatic hydrocarbon ring including 6 to 50 ring carbon atoms, or an unsubstituted heterocyclic ring including 5 to 50 ring atoms, when a plurality of $R_a$'s are present, one or more sets of adjacent two or more of the plurality of $R_a$'s form an unsubstituted, saturated or unsaturated ring by bonding with each other, or do not form an unsubstituted, saturated or unsaturated ring, when a plurality of $R_b$'s are present, one or more sets of adjacent two or more of the plurality of $R_b$'s form an unsubstituted, saturated or unsaturated ring by bonding with each other, or do not form an unsubstituted, saturated or unsaturated ring, when a plurality of $R_c$'s are present, one or more sets of adjacent two or more of the plurality of $R_c$'s form an unsubstituted, saturated or unsaturated ring by bonding with each other, or do not form an unsubstituted, saturated or unsaturated ring, n21 and n22 are independently an integer of 0 to 4, $R_a$ to $R_c$ which do not form the unsubstituted, saturated or unsaturated ring are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, and $R_{901}$ to $R_{907}$ are as defined in the formula (1);

(31)

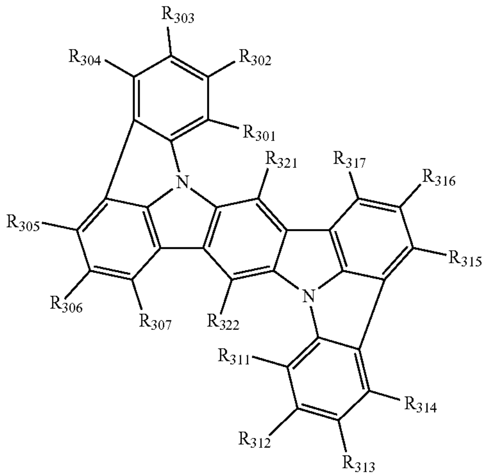

wherein in the formula (31), one or more sets of adjacent two or more of $R_{301}$ to $R_{307}$ and $R_{311}$ to $R_{317}$ form an unsubstituted, saturated or unsaturated ring, or do not form an unsubstituted, saturated or unsaturated ring, $R_{301}$ to $R_{307}$ and $R_{311}$ to $R_{317}$ which do not form the unsubstituted, saturated or unsaturated ring are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, $R_{321}$ and $R_{322}$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, and $R_{901}$ to $R_{907}$ are as defined in the formula (1);

(41)

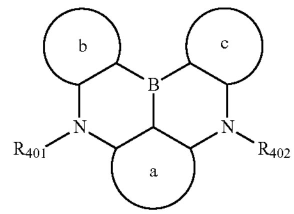

wherein in the formula (41), ring a, ring b and ring c are independently an unsubstituted aromatic hydrocarbon ring including 6 to 50 ring carbon atoms, or an unsubstituted heterocyclic ring including 5 to 50 ring atoms, $R_{401}$ and $R_{402}$ independently form an unsubstituted heterocyclic ring by bonding with the ring a, the ring b, or the ring c, or do not form an unsubstituted heterocyclic ring, and $R_{401}$ and $R_{402}$ which do not form the unsubstituted heterocyclic ring are independently an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, an unsubstituted aryl group including 6 to 50 ring carbon atoms, or an unsubstituted monovalent heterocyclic group including 5 to 50 ring atoms;

(51)

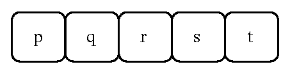

(52)

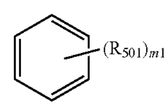

(53)

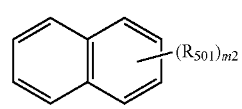

(54)

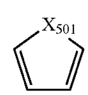

(55)

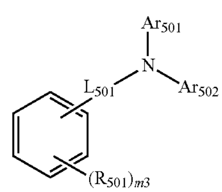

(56)

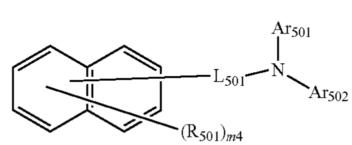

wherein in the formula (51), a ring r is a ring represented by the formula (52) or formula (53) which is fused with an adjacent ring at an arbitrary position, a ring q and a ring s are independently a ring represented by the formula (54) which is fused with an adjacent ring at an arbitrary position, a ring p and a ring t are independently a structure represented by the formula (55) or the formula (56) which is fused with an adjacent ring at an arbitrary position, when a plurality of $R_{501}$'s are present, the plurality of adjacent $R_{501}$'s form an unsubstituted, saturated or unsaturated ring by bonding with each other, or do not form an unsubstituted saturated or unsaturated ring, $X_{501}$ is an oxygen atom, a sulfur atom, or $NR_{502}$, $R_{501}$ and $R_{502}$ which do not form the unsubstituted, saturated or unsaturated ring are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, $R_{901}$ to $R_{907}$ are as defined in the formula (1), $Ar_{501}$ and $Ar_{502}$ are independently an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, an unsubstituted aryl group including 6 to 50 ring carbon atoms, or an unsubstituted monovalent heterocyclic group including 5 to 50 ring atoms, $L_{501}$ is an unsubstituted alkylene group including 1 to 50 carbon atoms, an unsubstituted alkenylene group including 2 to 50 carbon atoms, an unsubstituted alkynylene group including 2 to 50 carbon atoms, an unsubstituted cycloalkylene group including 3 to 50 ring carbon atoms, an unsubstituted arylene group including 6 to 50 ring carbon atoms, or an unsubstituted divalent heterocyclic group including 5 to 50 ring atoms, m1's are independently an integer of 0 to 2, m2's are independently an integer of 0 to 4, m3's are independently an integer of 0 to 3, m4's are independently an integer of 0 to 5, and when a plurality of $R_{500}$'s are present, the plurality of $R_{501}$'s may be the same as or different from each other;

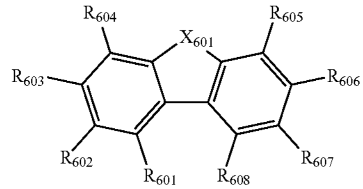

(61)

wherein in the formula (61), at least one set of $R_{601}$ and $R_{602}$, $R_{602}$ and $R_{603}$, and $R_{603}$ and $R_{604}$ forms a divalent group represented by the following formula (62) by bonding with each other, at least one set of $R_{605}$ and $R_{606}$, $R_{606}$ and $R_{607}$, and $R_{607}$ and $R_{608}$ forms a divalent group represented by the following formula (63) by bonding with each other,

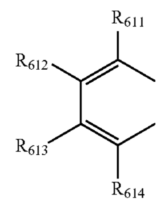

(62)

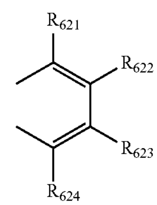

(63)

at least one of $R_{601}$ to $R_{604}$ which do not form a divalent group represented by the formula (62), and $R_{611}$ to $R_{614}$ is a monovalent group represented by the following formula (64), at least one of $R_{605}$ to $R_{608}$ which do not form a divalent group represented by the formula (63), and $R_{621}$ to $R_{624}$ is a monovalent group represented by the following formula (64), $X_{601}$ is an oxygen atom, a sulfur atom, or $NR_{609}$, $R_{601}$ to $R_{608}$ which do not form a divalent group represented by any of the formulas (62) and (63) and which are not a monovalent group represented by the formula (64), $R_{611}$ to $R_{614}$ and $R_{621}$ to $R_{624}$ which are not a monovalent group represented by the formula (64), and $R_{609}$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, $R_{901}$ to $R_{907}$ are as defined in the formula (1),

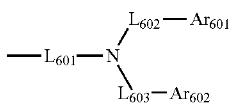

(64)

wherein in the formula (64), $Ar_{601}$ and $Ar_{602}$ are independently an unsubstituted aryl group including 6 to 50 ring carbon atoms, or an unsubstituted monovalent heterocyclic group including 5 to 50 ring atoms, and $L_{601}$ to $L_{603}$ are independently a single bond, an unsubstituted arylene group including 6 to 30 ring carbon atoms, an unsubstituted divalent heterocyclic group including 5 to 30 ring atoms, or a divalent linking group formed by bonding two to four of these;

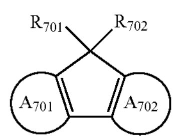

(71)

wherein in the formula (71), a ring $A_{701}$ and a ring $A_{702}$ are independently an unsubstituted aromatic hydrocarbon ring including 6 to 50 ring carbon atoms, or an unsubstituted heterocyclic ring including 5 to 50 ring atoms, one or more selected from the group consisting of the ring $A_{701}$ and the ring $A_{702}$ are bonded with "*" in the structure represented by the following formula (72),

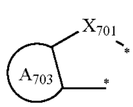

(72)

wherein in the formula (72), a ring $A_{703}$ is an unsubstituted aromatic hydrocarbon ring including 6 to 50 ring carbon atoms, or an unsubstituted heterocyclic ring including 5 to 50 ring atoms, $X_{701}$ is $NR_{703}$, C($R_{704}$)($R_{705}$), Si($R_{706}$)($R_{707}$), Ge($R_{708}$)($R_{709}$), O, S, or Se, $R_{701}$ and $R_{702}$ form an unsubstituted, saturated or unsaturated ring by bonding with each other, or do not form an unsubstituted, saturated or unsaturated ring, $R_{701}$ and $R_{702}$ which do not form the unsubstituted, saturated or unsaturated ring, and $R_{703}$ to $R_{709}$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, or an unsubstituted monovalent heterocyclic group including 5 to 50 ring atoms, and $R_{901}$ to $R_{907}$ are as defined in the formula (1);

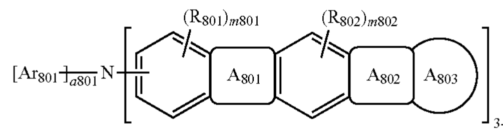

(81)

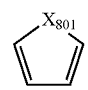

(82)

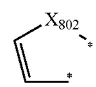

(83)

wherein in the formula (81), a ring $A_{801}$ is a ring represented by the formula (82) which is fused with the adjacent ring at an arbitrary position, a ring $A_{802}$ is a ring represented by the formula (83) which is fused with the adjacent ring at an arbitrary position, the two of "*" are bonded with the ring $A_{803}$ at arbitrary positions, $X_{801}$ and $X_{802}$ are independently C($R_{803}$)($R_{804}$), Si($R_{805}$)($R_{806}$), an oxygen atom, a sulfur atom, the ring $A_{803}$ is an unsubstituted aromatic hydrocarbon ring including 6 to 50 ring carbon atoms or an unsubstituted heterocyclic ring including 5 to 50 ring atoms, $Ar_{801}$ is an unsubstituted aryl group including 6 to 50 ring carbon atoms, or an unsubstituted monovalent heterocyclic group including 5 to 50 ring atoms, $R_{801}$ to $R_{806}$ are independently a hydrogen atom, an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—$N(R_{906})(R_{907})$,
a halogen atom, a cyano group, a nitro group,
an unsubstituted aryl group including 6 to 50 ring carbon atoms, or
an unsubstituted monovalent heterocyclic group including 5 to 50 ring atoms,
$R_{901}$ to $R_{907}$ are as defined in the formula (1),
m801 and m802 are independently an integer of 0 to 2,
when m801 and m802 are 2, the plurality of each of $R_{801}$ or $R_{802}$ may be the same as or different from each other,
a801 is an integer of 0 to 2,
when a801 is 0 or 1, the structures in parentheses, which exist in number indicated by "3-a801 (3 subtract a801)" may be the same as or different from each other, and
when a801 is 2, $Ar_{801}$ may be the same as or different from each other; and (91)

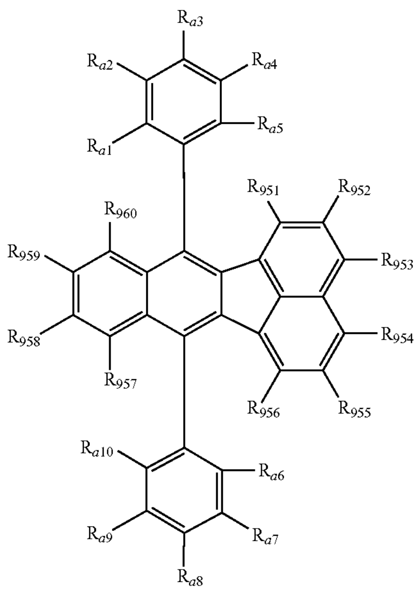

wherein in the formula (91),
any one or more sets selected from the group consisting of:
one or more sets of adjacent two or more of $R_{951}$ to $R_{960}$,
one or more sets of adjacent two or more of $R_{a1}$ to $R_{a5}$, and
one or more sets of adjacent two or more of $R_{a6}$ to $R_{a10}$
form an unsubstituted, saturated or unsaturated ring including 3 to 30 ring atoms, and
$R_{951}$ to $R_{960}$, $R_{a1}$ to $R_{a5}$, and $R_{a6}$ to $R_{a10}$ which are not involved in ring formation are independently
a hydrogen atom,
an unsubstituted alkyl group including 1 to 30 carbon atoms,
an unsubstituted cycloalkyl group including 3 to 30 ring carbon atoms,
an unsubstituted alkoxy group including 1 to 30 carbon atoms,
an unsubstituted alkylthio group including 1 to 30 carbon atoms,
an unsubstituted amino group,
an unsubstituted aryl group including 6 to 30 ring carbon atoms, an unsubstituted heterocyclic group including 5 to 30 ring atoms,
an unsubstituted alkenyl group including 2 to 30 carbon atoms,
an unsubstituted aryloxy group including 6 to 30 ring carbon atoms,
an unsubstituted arylthio group including 6 to 30 ring carbon atoms,
an unsubstituted phosphanyl group,
an unsubstituted phosphoryl group,
an unsubstituted silyl group,
an unsubstituted arylcarbonyl group including 6 to 30 ring carbon atoms,
a cyano group, a nitro group, a carboxyl group, or
a halogen atom.

21. The organic electroluminescence device according to claim 4, wherein the dopant material is selected from the group consisting of compounds represented by each of the following formulas (15), (32), and (43):

(15)

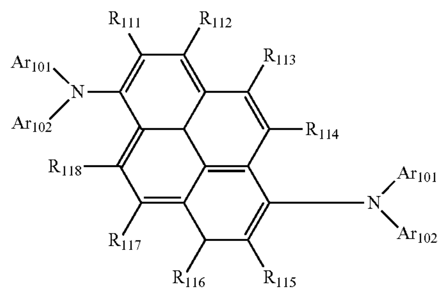

wherein in the formula (15),
one or more sets of adjacent two or more of $R_{111}$ to $R_{118}$ form an unsubstituted, saturated or unsaturated ring by bonding with each other, or do not form an unsubstituted, saturated or unsaturated ring,
$R_{111}$ to $R_{118}$ are not a monovalent group represented by the following formula (12):

(12)

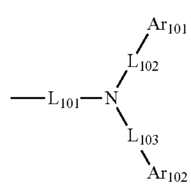

wherein in the formula (12),
$Ar_{101}$ and $Ar_{102}$ are independently
an unsubstituted aryl group including 6 to 50 ring carbon atoms, or
an unsubstituted monovalent heterocyclic group including 5 to 50 ring atoms,
$L_{101}$ to $L_{103}$ are independently
a single bond,
an unsubstituted arylene group including 6 to 30 ring carbon atoms, or
an unsubstituted divalent heterocyclic group including 5 to 30 ring atoms;
$R_{111}$ to $R_{118}$ which do not form a substituted or unsubstituted, saturated or unsaturated ring, and are not a monovalent group represented by the formula (12) are independently a hydrogen atom,
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—$Si(R_{901})(R_{902})(R_{903})$,
—O—$(R_{904})$,
—S—$(R_{905})$,
—$N(R_{906})(R_{907})$,
a halogen atom, a cyano group, a nitro group,
an unsubstituted aryl group including 6 to 50 ring carbon atoms, or
an unsubstituted monovalent heterocyclic group including 5 to 50 ring atoms, $R_{901}$ to $R_{907}$ are as defined in the formula (1),
$Ar_{101}$ and $Ar_{102}$ are independently
an unsubstituted aryl group including 6 to 50 ring carbon atoms, or
an unsubstituted monovalent heterocyclic group including 5 to 50 ring atoms, and
$L_{101}$ to $L_{103}$ are independently
a single bond,
an unsubstituted arylene group including 6 to 30 ring carbon atoms, or
an unsubstituted divalent heterocyclic group including 5 to 30 ring atoms;

(32)

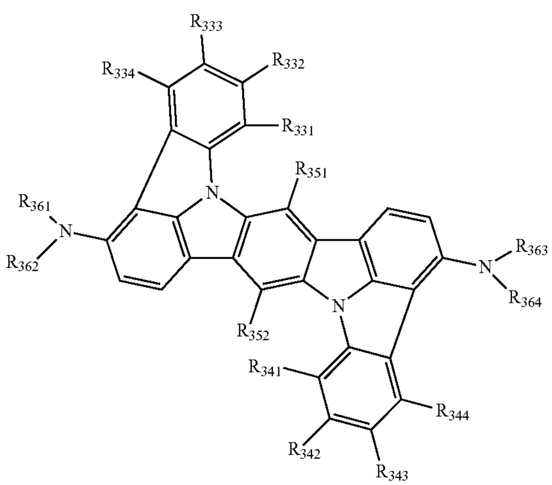

wherein in the formula (32),
one or more sets of adjacent two or more of $R_{331}$ to $R_{334}$ and $R_{341}$ to $R_{344}$ form an unsubstituted, saturated or unsaturated ring, or do not form an unsubstituted, saturated or unsaturated ring,
$R_{331}$ to $R_{334}$ and $R_{341}$ to $R_{344}$ which do not form the unsubstituted, saturated or unsaturated ring, and $R_{351}$ and $R_{352}$ are independently
a hydrogen atom,
an unsubstituted aryl group including 6 to 50 ring carbon atoms, or
an unsubstituted monovalent heterocyclic group including 5 to 50 ring atoms, and
$R_{361}$ to $R_{364}$ are independently
an unsubstituted aryl group including 6 to 50 ring carbon atoms, or
an unsubstituted monovalent heterocyclic group including 5 to 50 ring atoms; and (43)

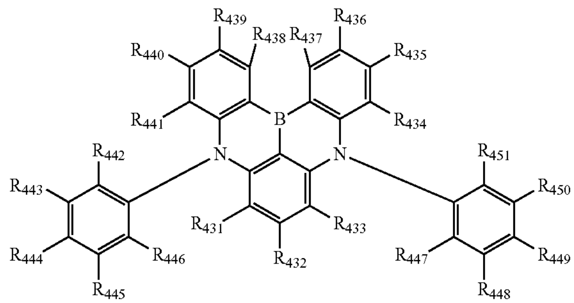

wherein in the formula (43),
$R_{431}$ forms an unsubstituted heterocyclic ring by bonding with $R_{446}$, or does not form an unsubstituted heterocyclic ring,
$R_{433}$ forms an unsubstituted heterocyclic ring by bonding with $R_{447}$, or does not form an unsubstituted heterocyclic ring,
$R_{434}$ forms an unsubstituted heterocyclic ring by bonding with $R_{451}$, or does not form an unsubstituted heterocyclic ring,
$R_{441}$ forms an unsubstituted heterocyclic ring by bonding with $R_{442}$, or does not form an unsubstituted heterocyclic ring,
one or more sets of adjacent two or more of $R_{431}$ to $R_{451}$ form an unsubstituted, saturated or unsaturated ring by bonding with each other, or do not form an unsubstituted, saturated or unsaturated ring,
$R_{431}$ to $R_{451}$ which do not form the unsubstituted heterocyclic ring or the unsubstituted, saturated or unsaturated ring are independently
a hydrogen atom,
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—$Si(R_{901})(R_{902})(R_{903})$,
—O—$(R_{904})$,
—S—$(R_{905})$,
—$N(R_{906})(R_{907})$,
a halogen atom, a cyano group, a nitro group,
an unsubstituted aryl group including 6 to 50 ring carbon atoms, or
an unsubstituted monovalent heterocyclic group including 5 to 50 ring atoms, and
$R_{901}$ to $R_{907}$ are as defined in the formula (1).

22. The organic electroluminescence device according to claim 4, wherein the dopant material is selected from the group consisting of:

(17)

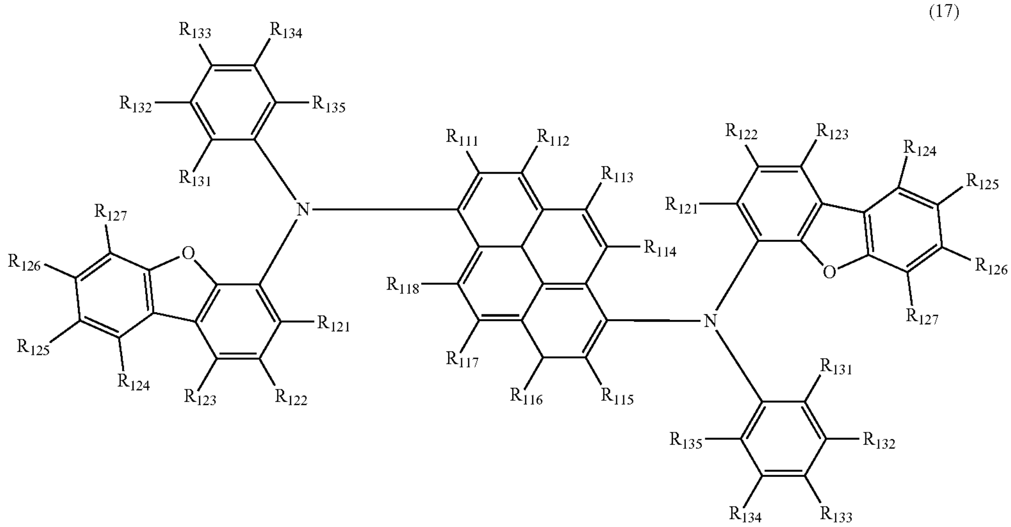

wherein in the formula (17), one or more sets of adjacent two or more of $R_{111}$ to $R_{118}$ form an unsubstituted, saturated or unsaturated ring by bonding with each other, or do not form an unsubstituted, saturated or unsaturated ring, $R_{111}$ to $R_{118}$ are not a monovalent group represented by the following formula (12):

(12)

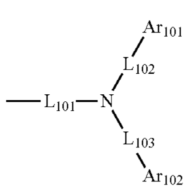

wherein in the formula (12), $Ar_{101}$ and $Ar_{102}$ are independently
- an unsubstituted aryl group including 6 to 50 ring carbon atoms, or
- an unsubstituted monovalent heterocyclic group including 5 to 50 ring atoms, $L_{101}$ to $L_{103}$ are independently
- a single bond,
- an unsubstituted arylene group including 6 to 30 ring carbon atoms, or
- an unsubstituted divalent heterocyclic group including 5 to 30 ring atoms;

$R_{111}$ to $R_{118}$ which do not form an unsubstituted, saturated or unsaturated ring, and are not a monovalent group represented by the formula (12) are independently
- a hydrogen atom,
- an unsubstituted alkyl group including 1 to 50 carbon atoms,
- an unsubstituted alkenyl group including 2 to 50 carbon atoms,
- an unsubstituted alkynyl group including 2 to 50 carbon atoms,
- an unsubstituted cycloalkyl group including 3 to 50 ring carbon atoms,
- —Si($R_{901}$)($R_{902}$)($R_{903}$),
- —O—($R_{904}$),
- —S—($R_{905}$),
- —N($R_{906}$)($R_{907}$),
- a halogen atom, a cyano group, a nitro group,
- an unsubstituted aryl group including 6 to 50 ring carbon atoms, or
- an unsubstituted monovalent heterocyclic group including 5 to 50 ring atoms, $R_{901}$ to $R_{907}$ are as defined in the formula (1), one or more sets of adjacent two or more of $R_{121}$ to $R_{127}$ form an unsubstituted, saturated or unsaturated ring by bonding with each other, or do not form an unsubstituted, saturated or unsaturated ring, $R_{121}$ to $R_{127}$ which do not form the unsubstituted, saturated or unsaturated ring are independently
- a hydrogen atom,
- an unsubstituted alkyl group including 1 to 50 carbon atoms,
- an unsubstituted alkenyl group including 2 to 50 carbon atoms,
- an unsubstituted alkynyl group including 2 to 50 carbon atoms,
- an unsubstituted cycloalkyl group including 3 to 50 ring carbon atoms,
- —Si($R_{901}$)($R_{902}$)($R_{903}$),
- —O—($R_{904}$),
- —S—($R_{905}$),
- —N($R_{906}$)($R_{907}$),
- a halogen atom, a cyano group, a nitro group,
- an unsubstituted aryl group including 6 to 50 ring carbon atoms, or
- an unsubstituted monovalent heterocyclic group including 5 to 50 ring atoms, $R_{901}$ to $R_{907}$ are as defined in the formula (1), $R_{131}$ to $R_{135}$ are independently
- a hydrogen atom,
- an unsubstituted alkyl group including 1 to 50 carbon atoms,
- an unsubstituted alkenyl group including 2 to 50 carbon atoms,
- an unsubstituted alkynyl group including 2 to 50 carbon atoms, an unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
an unsubstituted aryl group including 6 to 50 ring carbon atoms, or
an unsubstituted monovalent heterocyclic group including 5 to 50 ring atoms, and $R_{901}$ to $R_{907}$ are as defined in the formula (1);

(33)

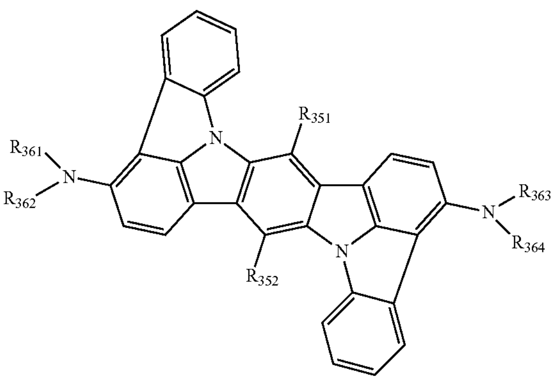

wherein in the formula (33), $R_{351}$ and $R_{352}$ are independently
a hydrogen atom,
an unsubstituted aryl group including 6 to 50 ring carbon atoms, or
an unsubstituted monovalent heterocyclic group including 5 to 50 ring atoms, and $R_{361}$ to $R_{364}$ are independently
an unsubstituted aryl group including 6 to 50 ring carbon atoms, or
an unsubstituted monovalent heterocyclic group including 5 to 50 ring atoms;

(43A)

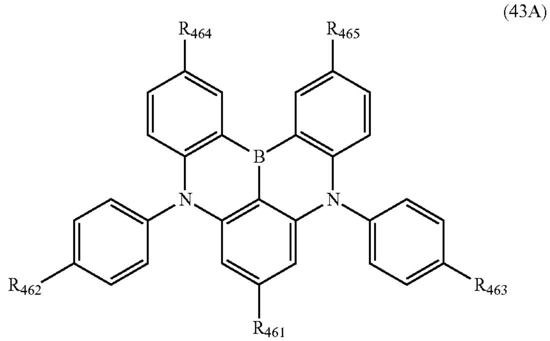

wherein in the formula (43A), $R_{461}$ is
a hydrogen atom,
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms, or
an unsubstituted aryl group including 6 to 50 ring carbon atoms, and $R_{462}$ to $R_{465}$ are independently
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms, or
an unsubstituted aryl group including 6 to 50 ring carbon atoms.

23. The organic electroluminescence device according to claim 4, wherein the dopant material is one or more compounds selected from the group consisting of:

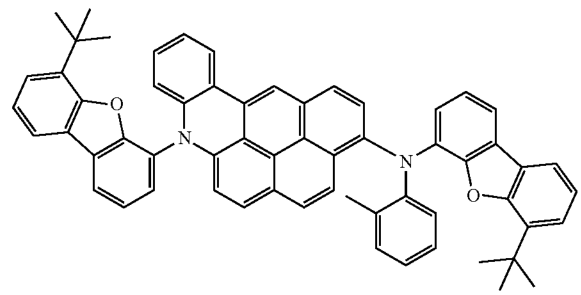

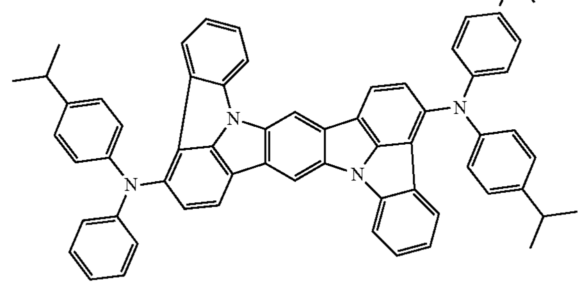

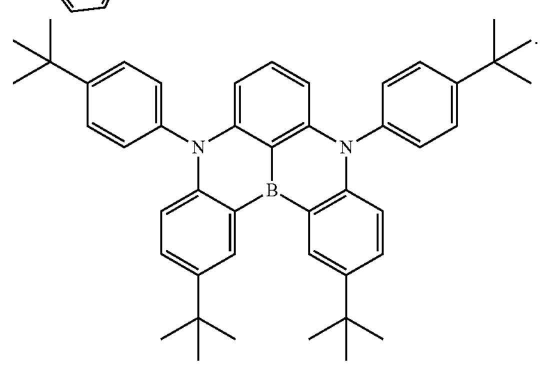

24. An electronic apparatus equipped with the organic electroluminescence device according to claim 1.

25. The organic electroluminescence device according to claim 1, wherein the chemical structure when deuterium atoms of the compound represented by the formula (1) are replaced with protium atoms is different from the chemical structure of the compound represented by the formula (1').

* * * * *